US010862055B2

(12) United States Patent
Boudreault et al.

(10) Patent No.: US 10,862,055 B2
(45) Date of Patent: Dec. 8, 2020

(54) ORGANIC ELECTROLUMINESCENT MATERIALS AND DEVICES

(71) Applicant: Universal Display Corporation, Ewing, NJ (US)

(72) Inventors: Pierre-Luc T. Boudreault, Pennington, NJ (US); Harvey Wendt, Medford Lakes, NJ (US); Bert Alleyne, Newtown, PA (US); Bin Ma, Ewing, NJ (US); Scott Joseph, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 330 days.

(21) Appl. No.: 15/928,666

(22) Filed: Mar. 22, 2018

(65) Prior Publication Data

US 2018/0323382 A1 Nov. 8, 2018

Related U.S. Application Data

(60) Provisional application No. 62/501,906, filed on May 5, 2017.

(51) Int. Cl.

| | |
|---|---|
| ***H01L 51/00*** | (2006.01) |
| ***C07F 15/00*** | (2006.01) |
| ***C09K 11/06*** | (2006.01) |
| *H01L 51/50* | (2006.01) |

(52) U.S. Cl.

CPC ...... *H01L 51/0085* (2013.01); *C07F 15/0033* (2013.01); *C09K 11/06* (2013.01); *C09K 2211/1044* (2013.01); *C09K 2211/185* (2013.01); *H01L 51/5012* (2013.01); *H01L 51/5016* (2013.01); *H01L 51/5024* (2013.01)

(58) Field of Classification Search

None

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |

(Continued)

FOREIGN PATENT DOCUMENTS

| | | |
|---|---|---|
| CN | 103965255 | 8/2014 |
| CN | 103965261 | 8/2014 |

(Continued)

OTHER PUBLICATIONS

Hansch et al. "A Survey of Hammett Substituent Constants and Resonance and Field Parameters" Chem. Rev. 1991, 91, 165-195. (Year: 1991).*

(Continued)

*Primary Examiner* — Robert S Loewe

(74) *Attorney, Agent, or Firm* — Duane Morris LLP

(57) ABSTRACT

Novel ligands for cyclometalated complexes that provide near-infrared emission are disclosed. The ligands contain strong electron-donating side chains such as alkoxy or alkylamine on a phenyl or naphthyl moiety which is linked by a covalent bond to the metal. This combination provides a significant red shift of the emission of the emitter.

20 Claims, 3 Drawing Sheets

(56) References Cited

U.S. PATENT DOCUMENTS

| | | | |
|---|---|---|---|
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0104472 A1 | 4/2009 | Je et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0181905 A1* | 7/2010 | Inoue | H05B 33/14 313/504 |
| 2012/0119190 A1* | 5/2012 | Alleyne | C09K 11/06 257/40 |
| 2014/0367662 A1* | 12/2014 | Inoue | H01L 51/0085 257/40 |
| 2015/0236277 A1 | 8/2015 | Boudreault et al. | |

FOREIGN PATENT DOCUMENTS

| | | |
|---|---|---|
| CN | 104140440 | 11/2014 |
| CN | 104140441 | 11/2014 |
| CN | 104140446 | 11/2014 |
| CN | 104140447 | 11/2014 |
| CN | 104193783 | 12/2014 |
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2010031738 | 3/2010 |
| WO | 2011114095 | 9/2011 |
| WO | 2012064499 | 5/2012 |

OTHER PUBLICATIONS

Santoro, A. et al. "Emissive Metallomesogens Based on 2-Phenylpyridine Complexes of Iridium (III)" Journal of the American Chemical Society, 2011, 133, pp. 5248-5251.

Extended European Search Report dated Aug. 24, 2018 for corresponding European Patent Application No. 18170637.5.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

(56) References Cited

OTHER PUBLICATIONS

Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato)beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic LIght-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSLYKE, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/501,906, filed May 5, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

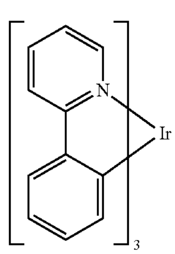

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Disclosed herein are novel ligands for metal complexes. The ligands provide near-infrared emission in cyclometalated complexes. The ligands contain strong electron-donating side chains such as alkoxy or alkylamine on a phenyl or naphthyl moiety which is linked by a covalent bond to the metal. This combination provides a significant red shift of the emission of the emitter.

A compound having a formula $M(L_A)_x(L_B)_y(L_C)_z$ is disclosed. In the formula $M(L_A)_x(L_B)_y(L_C)_z$, the ligand $L_A$ is selected from the group consisting of

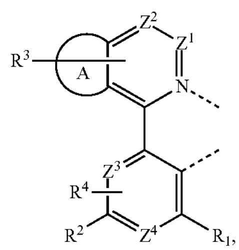

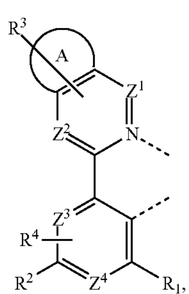

and

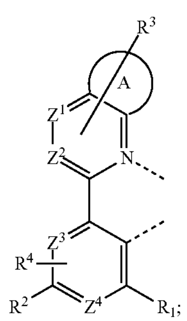

the ligand $L_B$ is

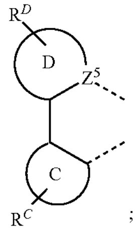

the ligand $L_C$ is

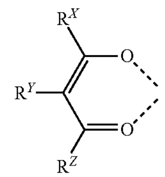

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen.

A first device comprising a first OLED that comprises an anode, a cathode, and an organic layer, disposed between the anode and the cathode, where the organic layer comprises the compound having the formula $M(L_A)_x(L_B)_y(L_C)_z$ is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s).

The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
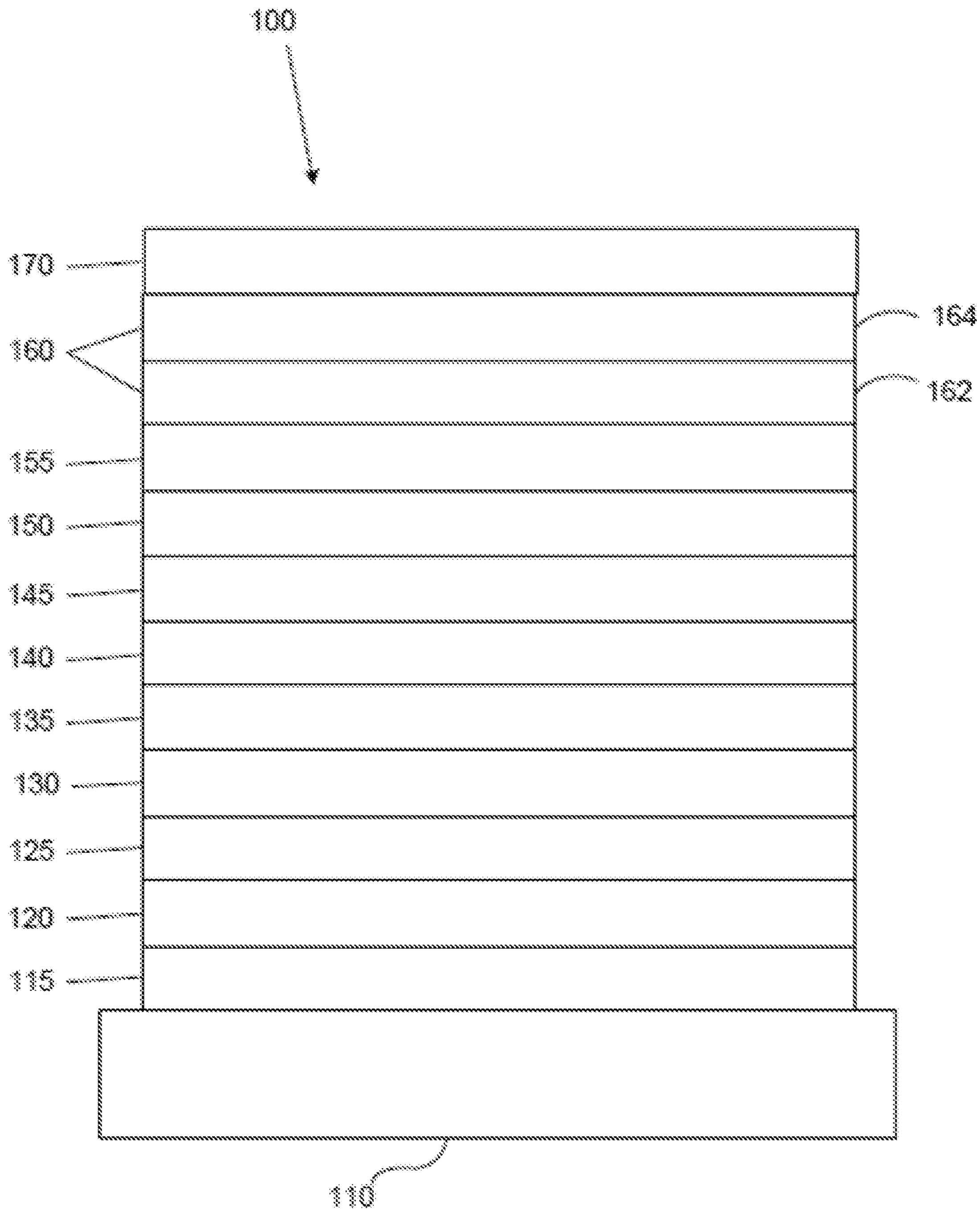
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
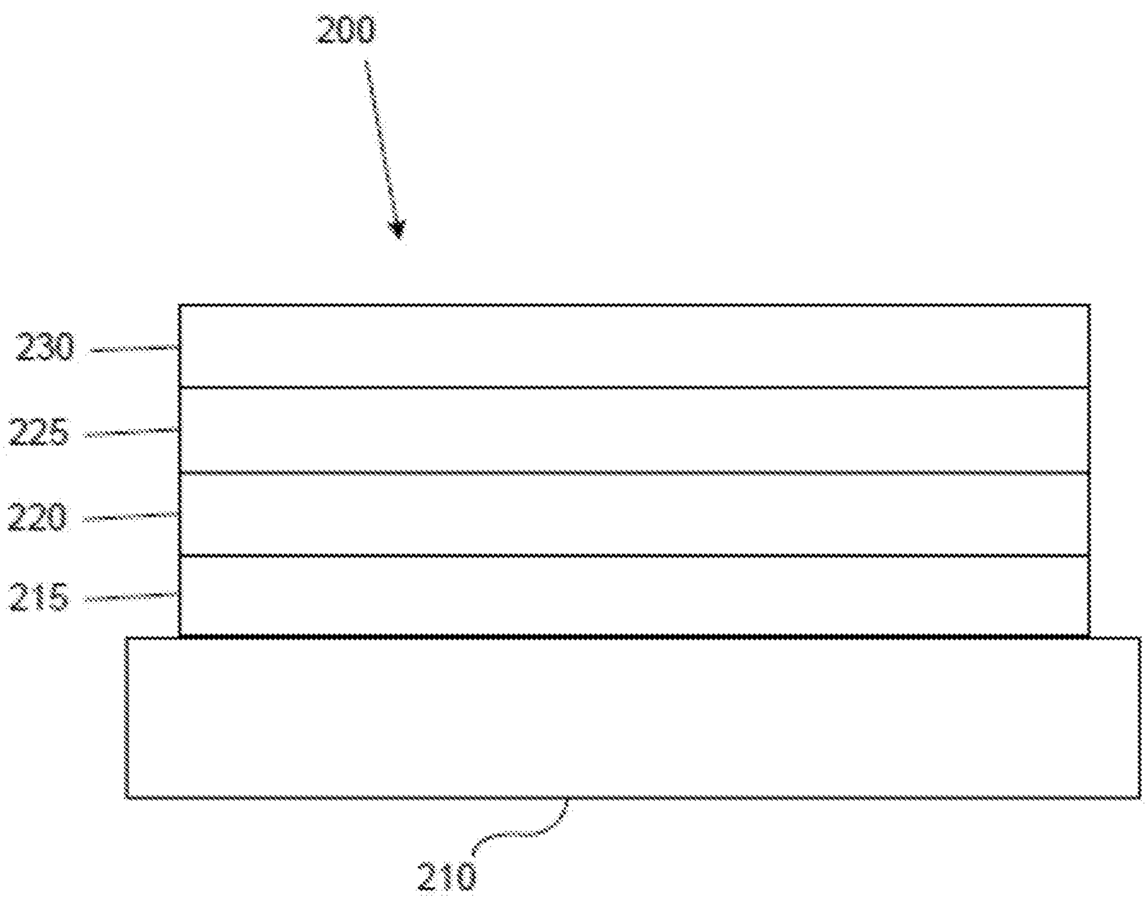
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ represents mono-substituted, then one $R^1$ must be other than H. Similarly, where $R^1$ represents di-substituted, then two of $R^1$ must be other than H. Similarly, where $R^1$ is unsubstituted, $R^1$ is hydrogen for all available positions. The maximum number of substitutions possible in a structure (for example, a particular ring) will depend on the number of atoms with available valencies.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Disclosed herein are phosphorescent metal complexes containing ligands substituted with electron-donating side chains on the aromatic ring linked covalently to the metal center. The aromatic unit contains at least one electron-donating chain and contains at least two side substitutions (ortho and para to the metal). Inventors have discovered that the electron-donating properties of the chains result in a significant red shift in the color of the emission of the final metal complexes. The electron-donating ability of a substituent at ortho and para position can be characterized by its Hammett constant $\sigma_P$, see C. Hansch, et. al. Chem. Rev. 1991, 91, 165-195 for detail. The other part of the ligand is preferably a fused aromatic group containing at least two nitrogen atoms on its core. This effects further red shift in the color of the emission. Inventors discovered that the combination of these two parts of the ligands allow near-infrared emission from the resulting complex.

A compound having a formula $M(L_A)_x(L_B)_y(L_C)_z$ is disclosed. In the formula $M(L_A)_x(L_B)_y(L_C)_z$, the ligand $L_A$ is selected from the group consisting of

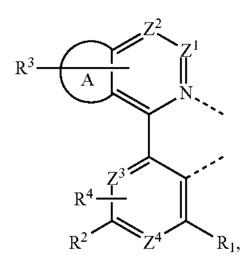

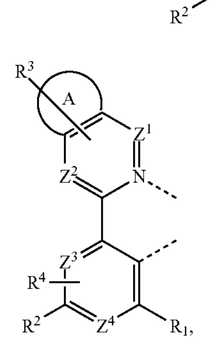

and

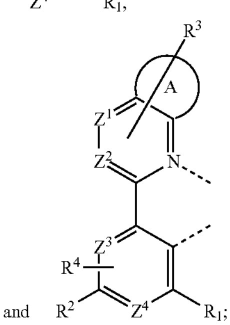

the ligand $L_B$ is

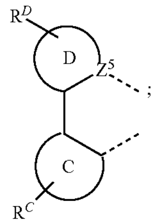

the ligand $L_C$ is

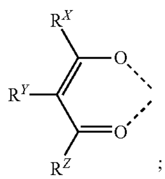

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen.

In some embodiments of the compound, one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments of the compound, $R^2$ is an electron donating group having Hammett constant $\sigma_p$ less than 0, $R^1$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments of the compound, $R^3$, $R^4$, $R^C$, $R^D$, $R^X$, $R^Y$, and $R^Z$ are independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

Inn some embodiments of the compound, M is selected from the group consisting of Ir, Rh, Re, Ru, Os, Pt, Au, and Cu. In some embodiments, M is Ir.

In some embodiments of the compound, the compound has the formula $M(L_A)_2(L_C)$.

In some embodiments, the compound has the formula $M(L_A)(L_B)_2$.

In some embodiments of the compound, $Z^2$ is nitrogen.

In some embodiments of the compound, ring A is a 5-membered aromatic ring. In some embodiments, ring A is a 6-membered aromatic ring.

In some embodiments of the compound, $R^1$ is the same as $R^2$. In some embodiments, $R^1$ is different from $R^2$. In some embodiments, the electron donating group is selected from the group consisting of NRR' and OR, wherein each of R and R' is independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof and wherein any plurality of R, R' are optionally joined or fused into a ring. In a preferred embodiment, each of R and R' is independently selected from the group consisting of alkyl, cycloalkyl, heteroalkyl, aryl, heteroaryl, and combinations thereof.

In some embodiments of the compound, the ligand $L_A$ is selected from the group consisting of:

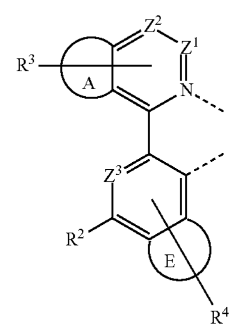

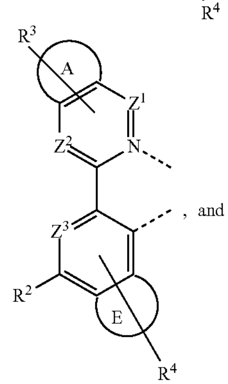

-continued
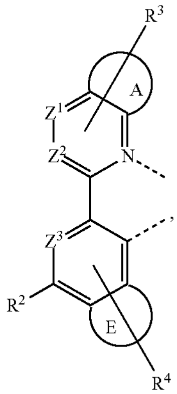
wherein ring E is a 5 or 6-membered carbocyclic or heterocyclic ring.
In some embodiments of the compound, the electron donating group is selected from the group consisting of:
$R^{C1}$
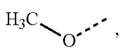
$R^{C2}$
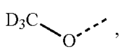
$R^{C3}$
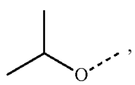
$R^{C4}$
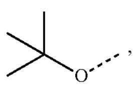
$R^{C5}$
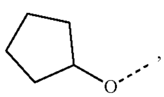
$R^{C6}$
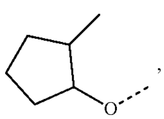
$R^{C7}$
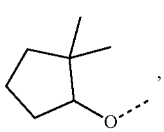
$R^{C8}$
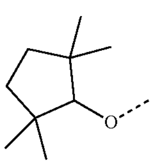
$R^{C9}$
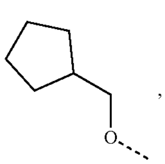
-continued
$R^{C10}$
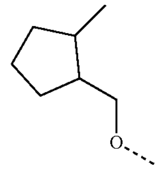
$R^{C11}$
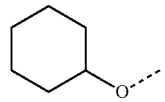
$R^{C12}$
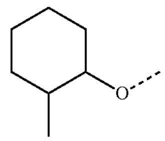
$R^{C13}$
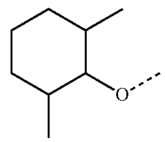
$R^{C14}$
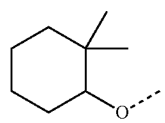
$R^{C15}$
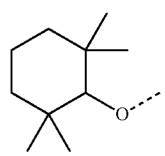
$R^{C16}$
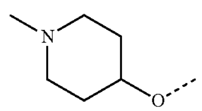
$R^{C17}$
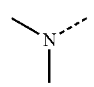
$R^{C18}$
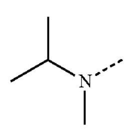
$R^{C19}$
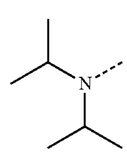

-continued $R^{C20}$

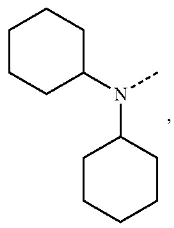

$R^{C21}$

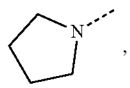

$R^{C22}$

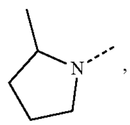

$R^{C23}$

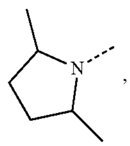

$R^{C24}$

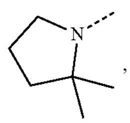

$R^{C25}$

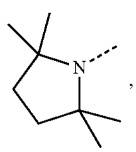

$R^{C26}$

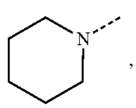

$R^{C27}$

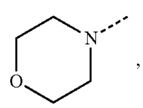

$R^{C28}$

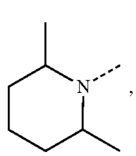

$R^{C29}$

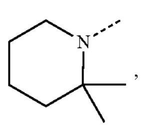

$R^{C30}$

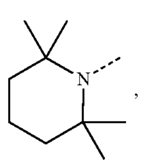

-continued $R^{C31}$

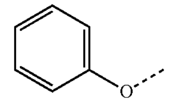

and $R^{C32}$

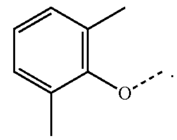

In some embodiments of the compound, $L_C$ has the formula

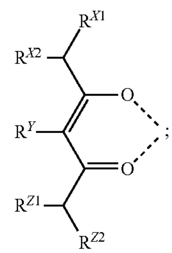

wherein $R^{X1}$, $R^{X2}$, $R^{Z1}$, and $R^{Z2}$ are independently selected from group consisting of alkyl, cycloalkyl, aryl, and heteroaryl; and wherein at least one of $R^{X1}$, $R^{X2}$, $R^{Z1}$, and $R^{Z2}$ has at least two carbon atoms.

In some embodiments of the compound, each of $R^3$, $R^4$, $R^C$, and $R^D$, $R^X$, $R^Y$, and $R^Z$ are independently selected from the group consisting of hydrogen, deuterium, alkyl, cycloalkyl, and combinations thereof.

In some embodiments of the compound, $R^Y$ is hydrogen.

In some embodiments of the compound, ring C is benzene, and ring D is pyridine of which $Z^5$ is N.

In some embodiments of the compound, the ligand $L_A$ is selected from the group consisting of:

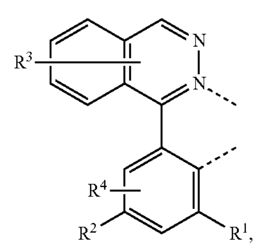

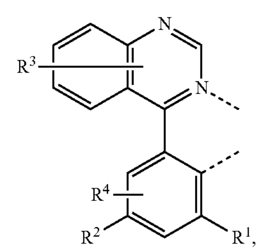

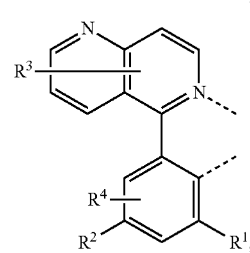

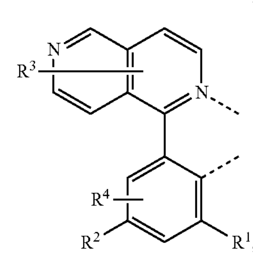

-continued
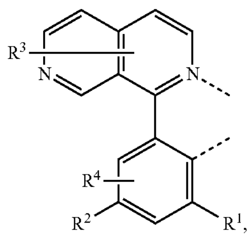
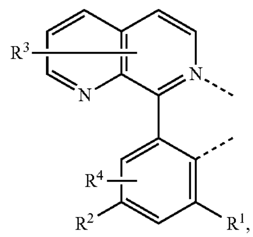
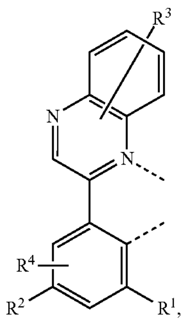
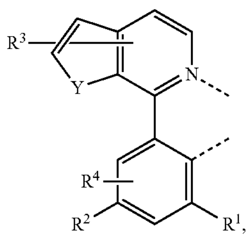
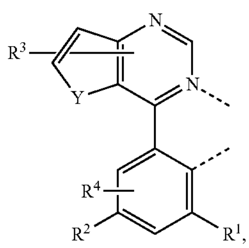
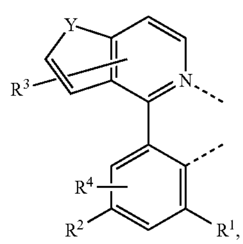
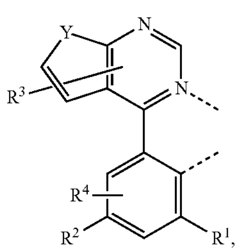
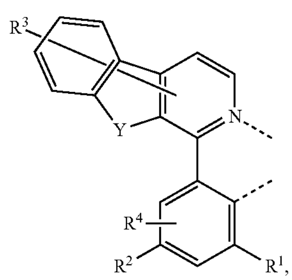
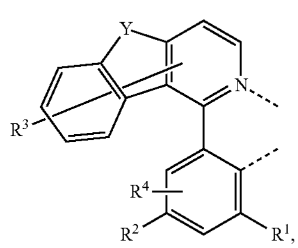
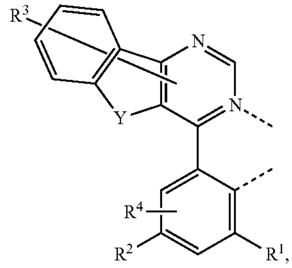
-continued
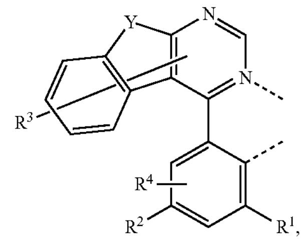
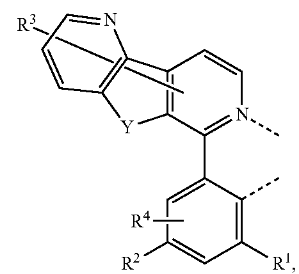
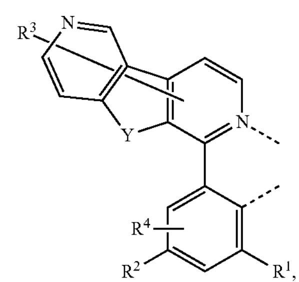
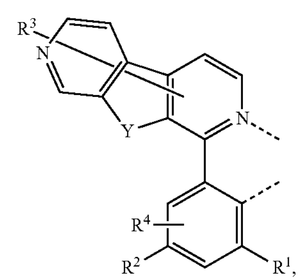
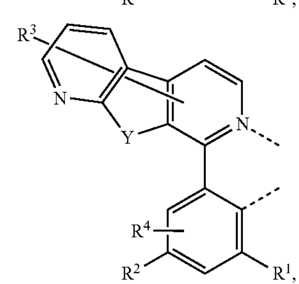
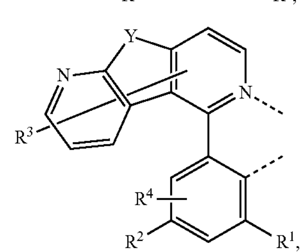

-continued

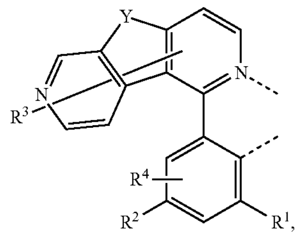

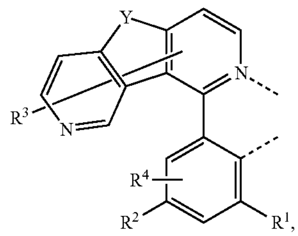

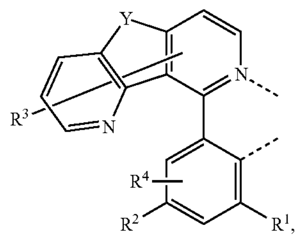

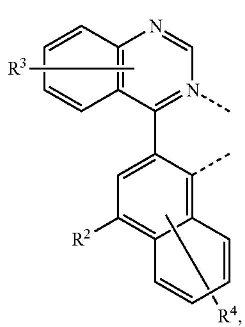

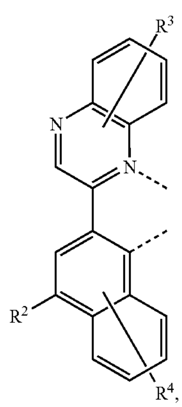

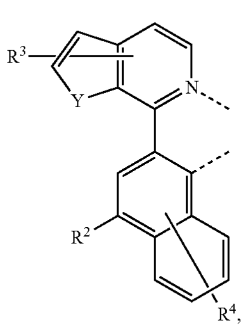

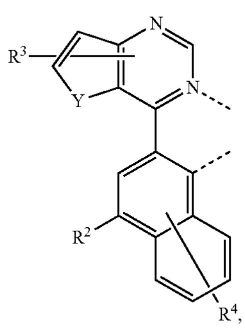

-continued

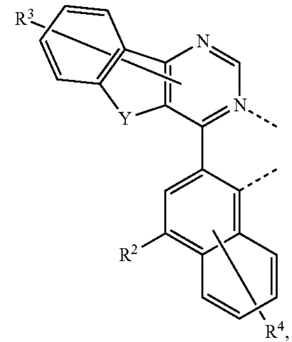

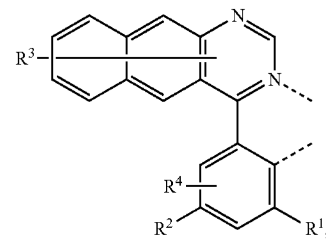

and

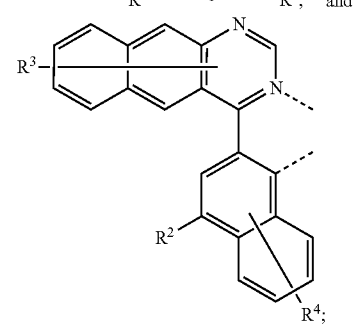

wherein Y is selected from the group consisting of S, O, Se, and $N(CH_3)_2$.

In some embodiments of the compound, the ligand $L_A$ is selected from the group consisting of:

$L_{A1}$ through $L_{A306}$ that are based on a structure of Formula I,

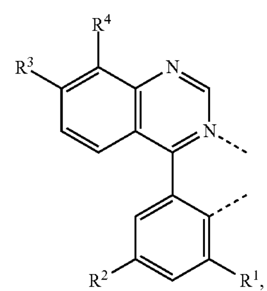

in which $R^1$, $R^2$, $R^3$, and $R^4$ are defined as follows:

| Ligand | $R^1$ | $R^2$ | $R^3$ | $R^4$ |
|---|---|---|---|---|
| $L_{A1}$ | $R^{C1}$ | $R^{C1}$ | H | H |
| $L_{A2}$ | $R^{C1}$ | $R^{C1}$ | $R^{B1}$ | H |
| $L_{A3}$ | $R^{C1}$ | $R^{C1}$ | $R^{B3}$ | H |
| $L_{A4}$ | $R^{C1}$ | $R^{C1}$ | $R^{B4}$ | H |
| $L_{A5}$ | $R^{C1}$ | $R^{C1}$ | $R^{B7}$ | H |
| $L_{A6}$ | $R^{C1}$ | $R^{C1}$ | $R^{B12}$ | H |

-continued

| Ligand | $R^1$ | $R^2$ | $R^3$ | $R^4$ |
|---|---|---|---|---|
| $L_{A47}$ | $R^{C1}$ | $R^{C1}$ | $R^{B18}$ | H |
| $L_{A48}$ | $R^{C1}$ | $R^{C1}$ | $R^{A3}$ | H |
| $L_{A49}$ | $R^{C1}$ | $R^{C1}$ | $R^{A34}$ | H |
| $L_{A10}$ | $R^{C3}$ | $R^{C3}$ | H | H |
| $L_{A11}$ | $R^{C3}$ | $R^{C3}$ | $R^{B1}$ | H |
| $L_{A12}$ | $R^{C3}$ | $R^{C3}$ | $R^{B3}$ | H |
| $L_{A13}$ | $R^{C3}$ | $R^{C3}$ | $R^{B4}$ | H |
| $L_{A14}$ | $R^{C3}$ | $R^{C3}$ | $R^{B7}$ | H |
| $L_{A15}$ | $R^{C3}$ | $R^{C3}$ | $R^{B12}$ | H |
| $L_{A16}$ | $R^{C3}$ | $R^{C3}$ | $R^{B18}$ | H |
| $L_{A17}$ | $R^{C3}$ | $R^{C3}$ | $R^{A3}$ | H |
| $L_{A18}$ | $R^{C3}$ | $R^{C3}$ | $R^{A34}$ | H |
| $L_{A19}$ | $R^{C5}$ | $R^{C5}$ | H | H |
| $L_{A20}$ | $R^{C5}$ | $R^{C5}$ | $R^{B1}$ | H |
| $L_{A21}$ | $R^{C5}$ | $R^{C5}$ | $R^{B3}$ | H |
| $L_{A22}$ | $R^{C5}$ | $R^{C5}$ | $R^{B4}$ | H |
| $L_{A23}$ | $R^{C5}$ | $R^{C5}$ | $R^{B7}$ | H |
| $L_{A24}$ | $R^{C5}$ | $R^{C5}$ | $R^{B12}$ | H |
| $L_{A25}$ | $R^{C5}$ | $R^{C5}$ | $R^{B18}$ | H |
| $L_{A26}$ | $R^{C5}$ | $R^{C5}$ | $R^{A3}$ | H |
| $L_{A27}$ | $R^{C5}$ | $R^{C5}$ | $R^{A34}$ | H |
| $L_{A28}$ | $R^{C17}$ | $R^{C17}$ | H | H |
| $L_{A29}$ | $R^{C17}$ | $R^{C17}$ | $R^{B1}$ | H |
| $L_{A30}$ | $R^{C17}$ | $R^{C17}$ | $R^{B3}$ | H |
| $L_{A31}$ | $R^{C17}$ | $R^{C17}$ | $R^{B4}$ | H |
| $L_{A32}$ | $R^{C17}$ | $R^{C17}$ | $R^{B7}$ | H |
| $L_{A33}$ | $R^{C17}$ | $R^{C17}$ | $R^{B12}$ | H |
| $L_{A34}$ | $R^{C17}$ | $R^{C17}$ | $R^{B18}$ | H |
| $L_{A35}$ | $R^{C17}$ | $R^{C17}$ | $R^{A3}$ | H |
| $L_{A36}$ | $R^{C17}$ | $R^{C17}$ | $R^{A34}$ | H |
| $L_{A37}$ | $R^{C19}$ | $R^{C19}$ | H | H |
| $L_{A38}$ | $R^{C19}$ | $R^{C19}$ | $R^{B1}$ | H |
| $L_{A39}$ | $R^{C19}$ | $R^{C19}$ | $R^{B3}$ | H |
| $L_{A40}$ | $R^{C19}$ | $R^{C19}$ | $R^{B4}$ | H |
| $L_{A41}$ | $R^{C19}$ | $R^{C19}$ | $R^{B7}$ | H |
| $L_{A42}$ | $R^{C19}$ | $R^{C19}$ | $R^{B12}$ | H |
| $L_{A43}$ | $R^{C19}$ | $R^{C19}$ | $R^{B18}$ | H |
| $L_{A44}$ | $R^{C19}$ | $R^{C19}$ | $R^{A3}$ | H |
| $L_{A45}$ | $R^{C19}$ | $R^{C19}$ | $R^{A34}$ | H |
| $L_{A46}$ | $R^{C21}$ | $R^{C21}$ | H | H |
| $L_{A47}$ | $R^{C21}$ | $R^{C21}$ | $R^{B1}$ | H |
| $L_{A48}$ | $R^{C21}$ | $R^{C21}$ | $R^{B3}$ | H |
| $L_{A49}$ | $R^{C21}$ | $R^{C21}$ | $R^{B4}$ | H |
| $L_{A50}$ | $R^{C21}$ | $R^{C21}$ | $R^{B7}$ | H |
| $L_{A51}$ | $R^{C21}$ | $R^{C21}$ | $R^{B12}$ | H |
| $L_{A52}$ | $R^{C21}$ | $R^{C21}$ | $R^{B18}$ | H |
| $L_{A53}$ | $R^{C21}$ | $R^{C21}$ | $R^{A3}$ | H |
| $L_{A54}$ | $R^{C21}$ | $R^{C21}$ | $R^{A34}$ | H |
| $L_{A55}$ | $R^{B1}$ | $R^{C1}$ | H | H |
| $L_{A56}$ | $R^{B1}$ | $R^{C1}$ | $R^{B1}$ | H |
| $L_{A57}$ | $R^{B1}$ | $R^{C1}$ | $R^{B3}$ | H |
| $L_{A58}$ | $R^{B1}$ | $R^{C1}$ | $R^{B4}$ | H |
| $L_{A59}$ | $R^{B1}$ | $R^{C1}$ | $R^{B7}$ | H |
| $L_{A60}$ | $R^{B1}$ | $R^{C1}$ | $R^{B12}$ | H |
| $L_{A61}$ | $R^{B1}$ | $R^{C1}$ | $R^{B18}$ | H |
| $L_{A62}$ | $R^{B1}$ | $R^{C1}$ | $R^{A3}$ | H |
| $L_{A63}$ | $R^{B1}$ | $R^{C1}$ | $R^{A34}$ | H |
| $L_{A64}$ | $R^{B1}$ | $R^{C3}$ | H | H |
| $L_{A65}$ | $R^{B1}$ | $R^{C3}$ | $R^{B1}$ | H |
| $L_{A66}$ | $R^{B1}$ | $R^{C3}$ | $R^{B3}$ | H |
| $L_{A67}$ | $R^{B1}$ | $R^{C3}$ | $R^{B4}$ | H |
| $L_{A68}$ | $R^{B1}$ | $R^{C3}$ | $R^{B7}$ | H |
| $L_{A69}$ | $R^{B1}$ | $R^{C3}$ | $R^{B12}$ | H |
| $L_{A70}$ | $R^{B1}$ | $R^{C3}$ | $R^{B18}$ | H |
| $L_{A71}$ | $R^{B1}$ | $R^{C3}$ | $R^{A3}$ | H |
| $L_{A72}$ | $R^{B1}$ | $R^{C3}$ | $R^{A34}$ | H |
| $L_{A73}$ | $R^{B1}$ | $R^{C5}$ | H | H |
| $L_{A74}$ | $R^{B1}$ | $R^{C5}$ | $R^{B1}$ | H |
| $L_{A75}$ | $R^{B1}$ | $R^{C5}$ | $R^{B3}$ | H |
| $L_{A76}$ | $R^{B1}$ | $R^{C5}$ | $R^{B4}$ | H |
| $L_{A77}$ | $R^{B1}$ | $R^{C5}$ | $R^{B7}$ | H |
| $L_{A78}$ | $R^{B1}$ | $R^{C5}$ | $R^{B12}$ | H |
| $L_{A79}$ | $R^{B1}$ | $R^{C5}$ | $R^{B18}$ | H |
| $L_{A80}$ | $R^{B1}$ | $R^{C5}$ | $R^{A3}$ | H |
| $L_{A81}$ | $R^{B1}$ | $R^{C5}$ | $R^{A34}$ | H |
| $L_{A82}$ | $R^{B1}$ | $R^{C17}$ | H | H |
| $L_{A83}$ | $R^{B1}$ | $R^{C17}$ | $R^{B1}$ | H |
| $L_{A84}$ | $R^{B1}$ | $R^{C17}$ | $R^{B3}$ | H |
| $L_{A85}$ | $R^{B1}$ | $R^{C17}$ | $R^{B4}$ | H |
| $L_{A86}$ | $R^{B1}$ | $R^{C17}$ | $R^{B7}$ | H |
| $L_{A87}$ | $R^{B1}$ | $R^{C17}$ | $R^{B12}$ | H |
| $L_{A88}$ | $R^{B1}$ | $R^{C17}$ | $R^{B18}$ | H |
| $L_{A89}$ | $R^{B1}$ | $R^{C17}$ | $R^{A3}$ | H |
| $L_{A90}$ | $R^{B1}$ | $R^{C17}$ | $R^{A34}$ | H |
| $L_{A91}$ | $R^{B1}$ | $R^{C19}$ | H | H |
| $L_{A92}$ | $R^{B1}$ | $R^{C19}$ | $R^{B1}$ | H |
| $L_{A93}$ | $R^{B1}$ | $R^{C19}$ | $R^{B3}$ | H |
| $L_{A94}$ | $R^{B1}$ | $R^{C19}$ | $R^{B4}$ | H |
| $L_{A95}$ | $R^{B1}$ | $R^{C19}$ | $R^{B7}$ | H |
| $L_{A96}$ | $R^{B1}$ | $R^{C19}$ | $R^{B12}$ | H |
| $L_{A97}$ | $R^{B1}$ | $R^{C19}$ | $R^{B18}$ | H |
| $L_{A98}$ | $R^{B1}$ | $R^{C19}$ | $R^{A3}$ | H |
| $L_{A99}$ | $R^{B1}$ | $R^{C19}$ | $R^{A34}$ | H |
| $L_{A100}$ | $R^{B1}$ | $R^{C21}$ | H | H |
| $L_{A101}$ | $R^{B1}$ | $R^{C21}$ | $R^{B1}$ | H |
| $L_{A102}$ | $R^{B1}$ | $R^{C21}$ | $R^{B3}$ | H |
| $L_{A103}$ | $R^{B1}$ | $R^{C21}$ | $R^{B4}$ | H |
| $L_{A104}$ | $R^{B1}$ | $R^{C21}$ | $R^{B7}$ | H |
| $L_{A105}$ | $R^{B1}$ | $R^{C21}$ | $R^{B12}$ | H |
| $L_{A106}$ | $R^{B1}$ | $R^{C21}$ | $R^{B18}$ | H |
| $L_{A107}$ | $R^{B1}$ | $R^{C21}$ | $R^{A3}$ | H |
| $L_{A108}$ | $R^{B1}$ | $R^{C21}$ | $R^{A34}$ | H |
| $L_{A109}$ | $R^{B2}$ | $R^{C1}$ | H | H |
| $L_{A110}$ | $R^{B2}$ | $R^{C1}$ | $R^{B1}$ | H |
| $L_{A111}$ | $R^{B2}$ | $R^{C1}$ | $R^{B3}$ | H |
| $L_{A112}$ | $R^{B2}$ | $R^{C1}$ | $R^{B4}$ | H |
| $L_{A113}$ | $R^{B2}$ | $R^{C1}$ | $R^{B7}$ | H |
| $L_{A114}$ | $R^{B2}$ | $R^{C1}$ | $R^{B12}$ | H |
| $L_{A115}$ | $R^{B2}$ | $R^{C1}$ | $R^{B18}$ | H |
| $L_{A116}$ | $R^{B2}$ | $R^{C1}$ | $R^{A3}$ | H |
| $L_{A117}$ | $R^{B2}$ | $R^{C1}$ | $R^{A34}$ | H |
| $L_{A118}$ | $R^{B2}$ | $R^{C3}$ | H | H |
| $L_{A119}$ | $R^{B2}$ | $R^{C3}$ | $R^{B1}$ | H |
| $L_{A120}$ | $R^{B2}$ | $R^{C3}$ | $R^{B3}$ | H |
| $L_{A121}$ | $R^{B2}$ | $R^{C3}$ | $R^{B4}$ | H |
| $L_{A122}$ | $R^{B2}$ | $R^{C3}$ | $R^{B7}$ | H |
| $L_{A123}$ | $R^{B2}$ | $R^{C3}$ | $R^{B12}$ | H |
| $L_{A124}$ | $R^{B2}$ | $R^{C3}$ | $R^{B18}$ | H |
| $L_{A125}$ | $R^{B2}$ | $R^{C3}$ | $R^{A3}$ | H |
| $L_{A126}$ | $R^{B2}$ | $R^{C3}$ | $R^{A34}$ | H |
| $L_{A127}$ | $R^{B2}$ | $R^{C5}$ | H | H |
| $L_{A128}$ | $R^{B2}$ | $R^{C5}$ | $R^{B1}$ | H |
| $L_{A129}$ | $R^{B2}$ | $R^{C5}$ | $R^{B3}$ | H |
| $L_{A130}$ | $R^{B2}$ | $R^{C5}$ | $R^{B4}$ | H |
| $L_{A131}$ | $R^{B2}$ | $R^{C5}$ | $R^{B7}$ | H |
| $L_{A132}$ | $R^{B2}$ | $R^{C5}$ | $R^{B12}$ | H |
| $L_{A133}$ | $R^{B2}$ | $R^{C5}$ | $R^{B18}$ | H |
| $L_{A134}$ | $R^{B2}$ | $R^{C5}$ | $R^{A3}$ | H |
| $L_{A135}$ | $R^{B2}$ | $R^{C5}$ | $R^{A34}$ | H |
| $L_{A136}$ | $R^{B2}$ | $R^{C17}$ | H | H |
| $L_{A137}$ | $R^{B2}$ | $R^{C17}$ | $R^{B1}$ | H |
| $L_{A138}$ | $R^{B2}$ | $R^{C17}$ | $R^{B3}$ | H |
| $L_{A139}$ | $R^{B2}$ | $R^{C17}$ | $R^{B4}$ | H |
| $L_{A140}$ | $R^{B2}$ | $R^{C17}$ | $R^{B7}$ | H |
| $L_{A141}$ | $R^{B2}$ | $R^{C17}$ | $R^{B12}$ | H |
| $L_{A142}$ | $R^{B2}$ | $R^{C17}$ | $R^{B18}$ | H |
| $L_{A143}$ | $R^{B2}$ | $R^{C17}$ | $R^{A3}$ | H |
| $L_{A144}$ | $R^{B2}$ | $R^{C17}$ | $R^{A34}$ | H |
| $L_{A145}$ | $R^{B2}$ | $R^{C19}$ | H | H |
| $L_{A146}$ | $R^{B2}$ | $R^{C19}$ | $R^{B1}$ | H |
| $L_{A147}$ | $R^{B2}$ | $R^{C19}$ | $R^{B3}$ | H |
| $L_{A148}$ | $R^{B2}$ | $R^{C19}$ | $R^{B4}$ | H |
| $L_{A149}$ | $R^{B2}$ | $R^{C19}$ | $R^{B7}$ | H |
| $L_{A150}$ | $R^{B2}$ | $R^{C19}$ | $R^{B12}$ | H |
| $L_{A151}$ | $R^{B2}$ | $R^{C19}$ | $R^{B18}$ | H |
| $L_{A152}$ | $R^{B2}$ | $R^{C19}$ | $R^{A3}$ | H |
| $L_{A153}$ | $R^{B2}$ | $R^{C19}$ | $R^{A34}$ | H |
| $L_{A154}$ | $R^{B2}$ | $R^{C21}$ | H | H |
| $L_{A155}$ | $R^{B2}$ | $R^{C21}$ | $R^{B1}$ | H |
| $L_{A156}$ | $R^{B2}$ | $R^{C21}$ | $R^{B3}$ | H |
| $L_{A157}$ | $R^{B2}$ | $R^{C21}$ | $R^{B4}$ | H |
| $L_{A158}$ | $R^{B2}$ | $R^{C21}$ | $R^{B7}$ | H |
| $L_{A159}$ | $R^{B2}$ | $R^{C21}$ | $R^{B12}$ | H |
| $L_{A160}$ | $R^{B2}$ | $R^{C21}$ | $R^{B18}$ | H |

| Ligand | $R^1$ | $R^2$ | $R^3$ | $R^4$ |
|---|---|---|---|---|
| $L_{A161}$ | $R^{B2}$ | $R^{C21}$ | $R^{A3}$ | H |
| $L_{A162}$ | $R^{B2}$ | $R^{C21}$ | $R^{A34}$ | H |
| $L_{A163}$ | $R^{C1}$ | $R^{C1}$ | H | $R^{B1}$ |
| $L_{A164}$ | $R^{C1}$ | $R^{C1}$ | H | $R^{B3}$ |
| $L_{A165}$ | $R^{C1}$ | $R^{C1}$ | H | $R^{B4}$ |
| $L_{A166}$ | $R^{C1}$ | $R^{C1}$ | H | $R^{B7}$ |
| $L_{A167}$ | $R^{C1}$ | $R^{C1}$ | H | $R^{B12}$ |
| $L_{A168}$ | $R^{C1}$ | $R^{C1}$ | H | $R^{B18}$ |
| $L_{A169}$ | $R^{C1}$ | $R^{C1}$ | H | $R^{A3}$ |
| $L_{A170}$ | $R^{C1}$ | $R^{C1}$ | H | $R^{A34}$ |
| $L_{A171}$ | $R^{C3}$ | $R^{C3}$ | H | $R^{B1}$ |
| $L_{A172}$ | $R^{C3}$ | $R^{C3}$ | H | $R^{B3}$ |
| $L_{A173}$ | $R^{C3}$ | $R^{C3}$ | H | $R^{B4}$ |
| $L_{A174}$ | $R^{C3}$ | $R^{C3}$ | H | $R^{B7}$ |
| $L_{A175}$ | $R^{C3}$ | $R^{C3}$ | H | $R^{B12}$ |
| $L_{A176}$ | $R^{C3}$ | $R^{C3}$ | H | $R^{B18}$ |
| $L_{A177}$ | $R^{C3}$ | $R^{C3}$ | H | $R^{A3}$ |
| $L_{A178}$ | $R^{C3}$ | $R^{C3}$ | H | $R^{A34}$ |
| $L_{A179}$ | $R^{C5}$ | $R^{C5}$ | H | $R^{B1}$ |
| $L_{A180}$ | $R^{C5}$ | $R^{C5}$ | H | $R^{B3}$ |
| $L_{A181}$ | $R^{C5}$ | $R^{C5}$ | H | $R^{B4}$ |
| $L_{A182}$ | $R^{C5}$ | $R^{C5}$ | H | $R^{B7}$ |
| $L_{A183}$ | $R^{C5}$ | $R^{C5}$ | H | $R^{B12}$ |
| $L_{A184}$ | $R^{C5}$ | $R^{C5}$ | H | $R^{B18}$ |
| $L_{A185}$ | $R^{C5}$ | $R^{C5}$ | H | $R^{A3}$ |
| $L_{A186}$ | $R^{C5}$ | $R^{C5}$ | H | $R^{A34}$ |
| $L_{A187}$ | $R^{C17}$ | $R^{C17}$ | H | $R^{B1}$ |
| $L_{A188}$ | $R^{C17}$ | $R^{C17}$ | H | $R^{B3}$ |
| $L_{A189}$ | $R^{C17}$ | $R^{C17}$ | H | $R^{B4}$ |
| $L_{A190}$ | $R^{C17}$ | $R^{C17}$ | H | $R^{B7}$ |
| $L_{A191}$ | $R^{C17}$ | $R^{C17}$ | H | $R^{B12}$ |
| $L_{A192}$ | $R^{C17}$ | $R^{C17}$ | H | $R^{B18}$ |
| $L_{A193}$ | $R^{C17}$ | $R^{C17}$ | H | $R^{A3}$ |
| $L_{A194}$ | $R^{C17}$ | $R^{C17}$ | H | $R^{A34}$ |
| $L_{A195}$ | $R^{C19}$ | $R^{C19}$ | H | $R^{B1}$ |
| $L_{A196}$ | $R^{C19}$ | $R^{C19}$ | H | $R^{B3}$ |
| $L_{A197}$ | $R^{C19}$ | $R^{C19}$ | H | $R^{B4}$ |
| $L_{A198}$ | $R^{C19}$ | $R^{C19}$ | H | $R^{B7}$ |
| $L_{A199}$ | $R^{C19}$ | $R^{C19}$ | H | $R^{B12}$ |
| $L_{A200}$ | $R^{C19}$ | $R^{C19}$ | H | $R^{B18}$ |
| $L_{A201}$ | $R^{C19}$ | $R^{C19}$ | H | $R^{A3}$ |
| $L_{A202}$ | $R^{C19}$ | $R^{C19}$ | H | $R^{A34}$ |
| $L_{A203}$ | $R^{C21}$ | $R^{C21}$ | H | $R^{B1}$ |
| $L_{A204}$ | $R^{C21}$ | $R^{C21}$ | H | $R^{B3}$ |
| $L_{A205}$ | $R^{C21}$ | $R^{C21}$ | H | $R^{B4}$ |
| $L_{A206}$ | $R^{C21}$ | $R^{C21}$ | H | $R^{B7}$ |
| $L_{A207}$ | $R^{C21}$ | $R^{C21}$ | H | $R^{B12}$ |
| $L_{A208}$ | $R^{C21}$ | $R^{C21}$ | H | $R^{B18}$ |
| $L_{A209}$ | $R^{C21}$ | $R^{C21}$ | H | $R^{A3}$ |
| $L_{A210}$ | $R^{C21}$ | $R^{C21}$ | H | $R^{A34}$ |
| $L_{A211}$ | $R^{B1}$ | $R^{C1}$ | H | $R^{B1}$ |
| $L_{A212}$ | $R^{B1}$ | $R^{C1}$ | H | $R^{B3}$ |
| $L_{A213}$ | $R^{B1}$ | $R^{C1}$ | H | $R^{B4}$ |
| $L_{A214}$ | $R^{B1}$ | $R^{C1}$ | H | $R^{B7}$ |
| $L_{A215}$ | $R^{B1}$ | $R^{C1}$ | H | $R^{B12}$ |
| $L_{A216}$ | $R^{B1}$ | $R^{C1}$ | H | $R^{B18}$ |
| $L_{A217}$ | $R^{B1}$ | $R^{C1}$ | H | $R^{A3}$ |
| $L_{A218}$ | $R^{B1}$ | $R^{C1}$ | H | $R^{A34}$ |
| $L_{A219}$ | $R^{B1}$ | $R^{C3}$ | H | $R^{B1}$ |
| $L_{A220}$ | $R^{B1}$ | $R^{C3}$ | H | $R^{B3}$ |
| $L_{A221}$ | $R^{B1}$ | $R^{C3}$ | H | $R^{B4}$ |
| $L_{A222}$ | $R^{B1}$ | $R^{C3}$ | H | $R^{B7}$ |
| $L_{A223}$ | $R^{B1}$ | $R^{C3}$ | H | $R^{B12}$ |
| $L_{A224}$ | $R^{B1}$ | $R^{C3}$ | H | $R^{B18}$ |
| $L_{A225}$ | $R^{B1}$ | $R^{C3}$ | H | $R^{A3}$ |
| $L_{A226}$ | $R^{B1}$ | $R^{C3}$ | H | $R^{A34}$ |
| $L_{A227}$ | $R^{B1}$ | $R^{C5}$ | H | $R^{B1}$ |
| $L_{A228}$ | $R^{B1}$ | $R^{C5}$ | H | $R^{B3}$ |
| $L_{A229}$ | $R^{B1}$ | $R^{C5}$ | H | $R^{B4}$ |
| $L_{A230}$ | $R^{B1}$ | $R^{C5}$ | H | $R^{B7}$ |
| $L_{A231}$ | $R^{B1}$ | $R^{C5}$ | H | $R^{B12}$ |
| $L_{A232}$ | $R^{B1}$ | $R^{C5}$ | H | $R^{B18}$ |
| $L_{A233}$ | $R^{B1}$ | $R^{C5}$ | H | $R^{A3}$ |
| $L_{A234}$ | $R^{B1}$ | $R^{C5}$ | H | $R^{A34}$ |
| $L_{A235}$ | $R^{B1}$ | $R^{C17}$ | H | $R^{B1}$ |
| $L_{A236}$ | $R^{B1}$ | $R^{C17}$ | H | $R^{B3}$ |
| $L_{A237}$ | $R^{B1}$ | $R^{C17}$ | H | $R^{B4}$ |

| Ligand | $R^1$ | $R^2$ | $R^3$ | $R^4$ |
|---|---|---|---|---|
| $L_{A238}$ | $R^{B1}$ | $R^{C17}$ | H | $R^{B7}$ |
| $L_{A239}$ | $R^{B1}$ | $R^{C17}$ | H | $R^{B12}$ |
| $L_{A240}$ | $R^{B1}$ | $R^{C17}$ | H | $R^{B18}$ |
| $L_{A241}$ | $R^{B1}$ | $R^{C17}$ | H | $R^{A3}$ |
| $L_{A242}$ | $R^{B1}$ | $R^{C17}$ | H | $R^{A34}$ |
| $L_{A243}$ | $R^{B1}$ | $R^{C19}$ | H | $R^{B1}$ |
| $L_{A244}$ | $R^{B1}$ | $R^{C19}$ | H | $R^{B3}$ |
| $L_{A245}$ | $R^{B1}$ | $R^{C19}$ | H | $R^{B4}$ |
| $L_{A246}$ | $R^{B1}$ | $R^{C19}$ | H | $R^{B7}$ |
| $L_{A247}$ | $R^{B1}$ | $R^{C19}$ | H | $R^{B12}$ |
| $L_{A248}$ | $R^{B1}$ | $R^{C19}$ | H | $R^{B18}$ |
| $L_{A249}$ | $R^{B1}$ | $R^{C19}$ | H | $R^{A3}$ |
| $L_{A250}$ | $R^{B1}$ | $R^{C19}$ | H | $R^{A34}$ |
| $L_{A251}$ | $R^{B1}$ | $R^{C21}$ | H | $R^{B1}$ |
| $L_{A252}$ | $R^{B1}$ | $R^{C21}$ | H | $R^{B3}$ |
| $L_{A253}$ | $R^{B1}$ | $R^{C21}$ | H | $R^{B4}$ |
| $L_{A254}$ | $R^{B1}$ | $R^{C21}$ | H | $R^{B7}$ |
| $L_{A255}$ | $R^{B1}$ | $R^{C21}$ | H | $R^{B12}$ |
| $L_{A256}$ | $R^{B1}$ | $R^{C21}$ | H | $R^{B18}$ |
| $L_{A257}$ | $R^{B1}$ | $R^{C21}$ | H | $R^{A3}$ |
| $L_{A258}$ | $R^{B1}$ | $R^{C21}$ | H | $R^{A34}$ |
| $L_{A259}$ | $R^{B2}$ | $R^{C1}$ | H | $R^{B1}$ |
| $L_{A260}$ | $R^{B2}$ | $R^{C1}$ | H | $R^{B3}$ |
| $L_{A261}$ | $R^{B2}$ | $R^{C1}$ | H | $R^{B4}$ |
| $L_{A262}$ | $R^{B2}$ | $R^{C1}$ | H | $R^{B7}$ |
| $L_{A263}$ | $R^{B2}$ | $R^{C1}$ | H | $R^{B12}$ |
| $L_{A264}$ | $R^{B2}$ | $R^{C1}$ | H | $R^{B18}$ |
| $L_{A265}$ | $R^{B2}$ | $R^{C1}$ | H | $R^{A3}$ |
| $L_{A266}$ | $R^{B2}$ | $R^{C1}$ | H | $R^{A34}$ |
| $L_{A267}$ | $R^{B2}$ | $R^{C3}$ | H | $R^{B1}$ |
| $L_{A268}$ | $R^{B2}$ | $R^{C3}$ | H | $R^{B3}$ |
| $L_{A269}$ | $R^{B2}$ | $R^{C3}$ | H | $R^{B4}$ |
| $L_{A270}$ | $R^{B2}$ | $R^{C3}$ | H | $R^{B7}$ |
| $L_{A271}$ | $R^{B2}$ | $R^{C3}$ | H | $R^{B12}$ |
| $L_{A272}$ | $R^{B2}$ | $R^{C3}$ | H | $R^{B18}$ |
| $L_{A273}$ | $R^{B2}$ | $R^{C3}$ | H | $R^{A3}$ |
| $L_{A274}$ | $R^{B2}$ | $R^{C3}$ | H | $R^{A34}$ |
| $L_{A275}$ | $R^{B2}$ | $R^{C5}$ | H | $R^{B1}$ |
| $L_{A276}$ | $R^{B2}$ | $R^{C5}$ | H | $R^{B3}$ |
| $L_{A277}$ | $R^{B2}$ | $R^{C5}$ | H | $R^{B4}$ |
| $L_{A278}$ | $R^{B2}$ | $R^{C5}$ | H | $R^{B7}$ |
| $L_{A279}$ | $R^{B2}$ | $R^{C5}$ | H | $R^{B12}$ |
| $L_{A280}$ | $R^{B2}$ | $R^{C5}$ | H | $R^{B18}$ |
| $L_{A281}$ | $R^{B2}$ | $R^{C5}$ | H | $R^{A3}$ |
| $L_{A282}$ | $R^{B2}$ | $R^{C5}$ | H | $R^{A34}$ |
| $L_{A283}$ | $R^{B2}$ | $R^{C17}$ | H | $R^{B1}$ |
| $L_{A284}$ | $R^{B2}$ | $R^{C17}$ | H | $R^{B3}$ |
| $L_{A285}$ | $R^{B2}$ | $R^{C17}$ | H | $R^{B4}$ |
| $L_{A286}$ | $R^{B2}$ | $R^{C17}$ | H | $R^{B7}$ |
| $L_{A287}$ | $R^{B2}$ | $R^{C17}$ | H | $R^{B12}$ |
| $L_{A288}$ | $R^{B2}$ | $R^{C17}$ | H | $R^{B18}$ |
| $L_{A289}$ | $R^{B2}$ | $R^{C17}$ | H | $R^{A3}$ |
| $L_{A290}$ | $R^{B2}$ | $R^{C17}$ | H | $R^{A34}$ |
| $L_{A291}$ | $R^{B2}$ | $R^{C19}$ | H | $R^{B1}$ |
| $L_{A292}$ | $R^{B2}$ | $R^{C19}$ | H | $R^{B3}$ |
| $L_{A293}$ | $R^{B2}$ | $R^{C19}$ | H | $R^{B4}$ |
| $L_{A294}$ | $R^{B2}$ | $R^{C19}$ | H | $R^{B7}$ |
| $L_{A295}$ | $R^{B2}$ | $R^{C19}$ | H | $R^{B12}$ |
| $L_{A296}$ | $R^{B2}$ | $R^{C19}$ | H | $R^{B18}$ |
| $L_{A297}$ | $R^{B2}$ | $R^{C19}$ | H | $R^{A3}$ |
| $L_{A298}$ | $R^{B2}$ | $R^{C19}$ | H | $R^{A34}$ |
| $L_{A299}$ | $R^{B2}$ | $R^{C21}$ | H | $R^{B1}$ |
| $L_{A300}$ | $R^{B2}$ | $R^{C21}$ | H | $R^{B3}$ |
| $L_{A301}$ | $R^{B2}$ | $R^{C21}$ | H | $R^{B4}$ |
| $L_{A302}$ | $R^{B2}$ | $R^{C21}$ | H | $R^{B7}$ |
| $L_{A303}$ | $R^{B2}$ | $R^{C21}$ | H | $R^{B12}$ |
| $L_{A304}$ | $R^{B2}$ | $R^{C21}$ | H | $R^{B18}$ |
| $L_{A305}$ | $R^{B2}$ | $R^{C21}$ | H | $R^{A3}$ |
| $L_{A306}$ | $R^{B2}$ | $R^{C21}$ | H | $R^{A34}$ |

$L_{A307}$ through $L_{A612}$ that are based on a structure of Formula II,

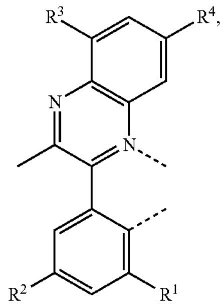

in which $R^1$, $R^2$, $R^3$, and $R^4$ are defined as follows:

| Ligand | $R^1$ | $R^2$ | $R^3$ | $R^4$ |
|---|---|---|---|---|
| $L_{A4307}$ | $R^{C1}$ | $R^{C1}$ | H | H |
| $L_{A4308}$ | $R^{C1}$ | $R^{C1}$ | $R^{B1}$ | H |
| $L_{A4309}$ | $R^{C1}$ | $R^{C1}$ | $R^{B3}$ | H |
| $L_{A4310}$ | $R^{C1}$ | $R^{C1}$ | $R^{B4}$ | H |
| $L_{A4311}$ | $R^{C1}$ | $R^{C1}$ | $R^{B7}$ | H |
| $L_{A4312}$ | $R^{C1}$ | $R^{C1}$ | $R^{B12}$ | H |
| $L_{A4313}$ | $R^{C1}$ | $R^{C1}$ | $R^{B18}$ | H |
| $L_{A4314}$ | $R^{C1}$ | $R^{C1}$ | $R^{A3}$ | H |
| $L_{A4315}$ | $R^{C1}$ | $R^{C1}$ | $R^{A34}$ | H |
| $L_{A4316}$ | $R^{C3}$ | $R^{C3}$ | H | H |
| $L_{A4317}$ | $R^{C3}$ | $R^{C3}$ | $R^{B1}$ | H |
| $L_{A4318}$ | $R^{C3}$ | $R^{C3}$ | $R^{B3}$ | H |
| $L_{A4319}$ | $R^{C3}$ | $R^{C3}$ | $R^{B4}$ | H |
| $L_{A4320}$ | $R^{C3}$ | $R^{C3}$ | $R^{B7}$ | H |
| $L_{A4321}$ | $R^{C3}$ | $R^{C3}$ | $R^{B12}$ | H |
| $L_{A4322}$ | $R^{C3}$ | $R^{C3}$ | $R^{B18}$ | H |
| $L_{A4323}$ | $R^{C3}$ | $R^{C3}$ | $R^{A3}$ | H |
| $L_{A4324}$ | $R^{C3}$ | $R^{C3}$ | $R^{A34}$ | H |
| $L_{A4325}$ | $R^{C5}$ | $R^{C5}$ | H | H |
| $L_{A4326}$ | $R^{C5}$ | $R^{C5}$ | $R^{B1}$ | H |
| $L_{A4327}$ | $R^{C5}$ | $R^{C5}$ | $R^{B3}$ | H |
| $L_{A4328}$ | $R^{C5}$ | $R^{C5}$ | $R^{B4}$ | H |
| $L_{A4329}$ | $R^{C5}$ | $R^{C5}$ | $R^{B7}$ | H |
| $L_{A4330}$ | $R^{C5}$ | $R^{C5}$ | $R^{B12}$ | H |
| $L_{A4331}$ | $R^{C5}$ | $R^{C5}$ | $R^{B18}$ | H |
| $L_{A4332}$ | $R^{C5}$ | $R^{C5}$ | $R^{A3}$ | H |
| $L_{A4333}$ | $R^{C5}$ | $R^{C5}$ | $R^{A34}$ | H |
| $L_{A4334}$ | $R^{C17}$ | $R^{C17}$ | H | H |
| $L_{A4335}$ | $R^{C17}$ | $R^{C17}$ | $R^{B1}$ | H |
| $L_{A4336}$ | $R^{C17}$ | $R^{C17}$ | $R^{B3}$ | H |
| $L_{A4337}$ | $R^{C17}$ | $R^{C17}$ | $R^{B4}$ | H |
| $L_{A4338}$ | $R^{C17}$ | $R^{C17}$ | $R^{B7}$ | H |
| $L_{A4339}$ | $R^{C17}$ | $R^{C17}$ | $R^{B12}$ | H |
| $L_{A4340}$ | $R^{C17}$ | $R^{C17}$ | $R^{B18}$ | H |
| $L_{A4341}$ | $R^{C17}$ | $R^{C17}$ | $R^{A3}$ | H |
| $L_{A4342}$ | $R^{C17}$ | $R^{C17}$ | $R^{A34}$ | H |
| $L_{A4343}$ | $R^{C19}$ | $R^{C19}$ | H | H |
| $L_{A4344}$ | $R^{C19}$ | $R^{C19}$ | $R^{B1}$ | H |
| $L_{A4345}$ | $R^{C19}$ | $R^{C19}$ | $R^{B3}$ | H |
| $L_{A4346}$ | $R^{C19}$ | $R^{C19}$ | $R^{B4}$ | H |
| $L_{A4347}$ | $R^{C19}$ | $R^{C19}$ | $R^{B7}$ | H |
| $L_{A4348}$ | $R^{C19}$ | $R^{C19}$ | $R^{B12}$ | H |
| $L_{A4349}$ | $R^{C19}$ | $R^{C19}$ | $R^{B18}$ | H |
| $L_{A4350}$ | $R^{C19}$ | $R^{C19}$ | $R^{A3}$ | H |
| $L_{A4351}$ | $R^{C19}$ | $R^{C19}$ | $R^{A34}$ | H |
| $L_{A4352}$ | $R^{C21}$ | $R^{C21}$ | H | H |
| $L_{A4353}$ | $R^{C21}$ | $R^{C21}$ | $R^{B1}$ | H |
| $L_{A4354}$ | $R^{C21}$ | $R^{C21}$ | $R^{B3}$ | H |
| $L_{A4355}$ | $R^{C21}$ | $R^{C21}$ | $R^{B4}$ | H |
| $L_{A4356}$ | $R^{C21}$ | $R^{C21}$ | $R^{B7}$ | H |
| $L_{A4357}$ | $R^{C21}$ | $R^{C21}$ | $R^{B12}$ | H |
| $L_{A4358}$ | $R^{C21}$ | $R^{C21}$ | $R^{B18}$ | H |
| $L_{A4359}$ | $R^{C21}$ | $R^{C21}$ | $R^{A3}$ | H |
| $L_{A4360}$ | $R^{C21}$ | $R^{C21}$ | $R^{A34}$ | H |
| $L_{A4361}$ | $R^{B1}$ | $R^{C1}$ | H | H |
| $L_{A4362}$ | $R^{B1}$ | $R^{C1}$ | $R^{B1}$ | H |
| $L_{A4363}$ | $R^{B1}$ | $R^{C1}$ | $R^{B3}$ | H |
| $L_{A4364}$ | $R^{B1}$ | $R^{C1}$ | $R^{B4}$ | H |
| $L_{A4365}$ | $R^{B1}$ | $R^{C1}$ | $R^{B7}$ | H |

-continued

| Ligand | $R^1$ | $R^2$ | $R^3$ | $R^4$ |
|---|---|---|---|---|
| $L_{A4366}$ | $R^{B1}$ | $R^{C1}$ | $R^{B12}$ | H |
| $L_{A4367}$ | $R^{B1}$ | $R^{C1}$ | $R^{B18}$ | H |
| $L_{A4368}$ | $R^{B1}$ | $R^{C1}$ | $R^{A3}$ | H |
| $L_{A4369}$ | $R^{B1}$ | $R^{C1}$ | $R^{A34}$ | H |
| $L_{A4370}$ | $R^{B1}$ | $R^{C3}$ | H | H |
| $L_{A4371}$ | $R^{B1}$ | $R^{C3}$ | $R^{B1}$ | H |
| $L_{A4372}$ | $R^{B1}$ | $R^{C3}$ | $R^{B3}$ | H |
| $L_{A4373}$ | $R^{B1}$ | $R^{C3}$ | $R^{B4}$ | H |
| $L_{A4374}$ | $R^{B1}$ | $R^{C3}$ | $R^{B7}$ | H |
| $L_{A4375}$ | $R^{B1}$ | $R^{C3}$ | $R^{B12}$ | H |
| $L_{A4376}$ | $R^{B1}$ | $R^{C3}$ | $R^{B18}$ | H |
| $L_{A4377}$ | $R^{B1}$ | $R^{C3}$ | $R^{A3}$ | H |
| $L_{A4378}$ | $R^{B1}$ | $R^{C3}$ | $R^{A34}$ | H |
| $L_{A4379}$ | $R^{B1}$ | $R^{C5}$ | H | H |
| $L_{A4380}$ | $R^{B1}$ | $R^{C5}$ | $R^{B1}$ | H |
| $L_{A4381}$ | $R^{B1}$ | $R^{C5}$ | $R^{B3}$ | H |
| $L_{A4382}$ | $R^{B1}$ | $R^{C5}$ | $R^{B4}$ | H |
| $L_{A4383}$ | $R^{B1}$ | $R^{C5}$ | $R^{B7}$ | H |
| $L_{A4384}$ | $R^{B1}$ | $R^{C5}$ | $R^{B12}$ | H |
| $L_{A4385}$ | $R^{B1}$ | $R^{C5}$ | $R^{B18}$ | H |
| $L_{A4386}$ | $R^{B1}$ | $R^{C5}$ | $R^{A3}$ | H |
| $L_{A4387}$ | $R^{B1}$ | $R^{C5}$ | $R^{A34}$ | H |
| $L_{A4388}$ | $R^{B1}$ | $R^{C17}$ | H | H |
| $L_{A4389}$ | $R^{B1}$ | $R^{C17}$ | $R^{B1}$ | H |
| $L_{A4390}$ | $R^{B1}$ | $R^{C17}$ | $R^{B3}$ | H |
| $L_{A4391}$ | $R^{B1}$ | $R^{C17}$ | $R^{B4}$ | H |
| $L_{A4392}$ | $R^{B1}$ | $R^{C17}$ | $R^{B7}$ | H |
| $L_{A4393}$ | $R^{B1}$ | $R^{C17}$ | $R^{B12}$ | H |
| $L_{A4394}$ | $R^{B1}$ | $R^{C17}$ | $R^{B18}$ | H |
| $L_{A4395}$ | $R^{B1}$ | $R^{C17}$ | $R^{A3}$ | H |
| $L_{A4396}$ | $R^{B1}$ | $R^{C17}$ | $R^{A34}$ | H |
| $L_{A4397}$ | $R^{B1}$ | $R^{C19}$ | H | H |
| $L_{A4398}$ | $R^{B1}$ | $R^{C19}$ | $R^{B1}$ | H |
| $L_{A4399}$ | $R^{B1}$ | $R^{C19}$ | $R^{B3}$ | H |
| $L_{A4400}$ | $R^{B1}$ | $R^{C19}$ | $R^{B4}$ | H |
| $L_{A4401}$ | $R^{B1}$ | $R^{C19}$ | $R^{B7}$ | H |
| $L_{A4402}$ | $R^{B1}$ | $R^{C19}$ | $R^{B12}$ | H |
| $L_{A4403}$ | $R^{B1}$ | $R^{C19}$ | $R^{B18}$ | H |
| $L_{A4404}$ | $R^{B1}$ | $R^{C19}$ | $R^{A3}$ | H |
| $L_{A4405}$ | $R^{B1}$ | $R^{C19}$ | $R^{A34}$ | H |
| $L_{A4406}$ | $R^{B1}$ | $R^{C21}$ | H | H |
| $L_{A4407}$ | $R^{B1}$ | $R^{C21}$ | $R^{B1}$ | H |
| $L_{A4408}$ | $R^{B1}$ | $R^{C21}$ | $R^{B3}$ | H |
| $L_{A4409}$ | $R^{B1}$ | $R^{C21}$ | $R^{B4}$ | H |
| $L_{A4410}$ | $R^{B1}$ | $R^{C21}$ | $R^{B7}$ | H |
| $L_{A4411}$ | $R^{B1}$ | $R^{C21}$ | $R^{B12}$ | H |
| $L_{A4412}$ | $R^{B1}$ | $R^{C21}$ | $R^{B18}$ | H |
| $L_{A4413}$ | $R^{B1}$ | $R^{C21}$ | $R^{A3}$ | H |
| $L_{A4414}$ | $R^{B1}$ | $R^{C21}$ | $R^{A34}$ | H |
| $L_{A4415}$ | $R^{B2}$ | $R^{C1}$ | H | H |
| $L_{A4416}$ | $R^{B2}$ | $R^{C1}$ | $R^{B1}$ | H |
| $L_{A4417}$ | $R^{B2}$ | $R^{C1}$ | $R^{B3}$ | H |
| $L_{A4418}$ | $R^{B2}$ | $R^{C1}$ | $R^{B4}$ | H |
| $L_{A4419}$ | $R^{B2}$ | $R^{C1}$ | $R^{B7}$ | H |
| $L_{A4420}$ | $R^{B2}$ | $R^{C1}$ | $R^{B12}$ | H |
| $L_{A4421}$ | $R^{B2}$ | $R^{C1}$ | $R^{B18}$ | H |
| $L_{A4422}$ | $R^{B2}$ | $R^{C1}$ | $R^{A3}$ | H |
| $L_{A4423}$ | $R^{B2}$ | $R^{C1}$ | $R^{A34}$ | H |
| $L_{A4424}$ | $R^{B2}$ | $R^{C3}$ | H | H |
| $L_{A4425}$ | $R^{B2}$ | $R^{C3}$ | $R^{B1}$ | H |
| $L_{A4426}$ | $R^{B2}$ | $R^{C3}$ | $R^{B3}$ | H |
| $L_{A4427}$ | $R^{B2}$ | $R^{C3}$ | $R^{B4}$ | H |
| $L_{A4428}$ | $R^{B2}$ | $R^{C3}$ | $R^{B7}$ | H |
| $L_{A4429}$ | $R^{B2}$ | $R^{C3}$ | $R^{B12}$ | H |
| $L_{A4430}$ | $R^{B2}$ | $R^{C3}$ | $R^{B18}$ | H |
| $L_{A4431}$ | $R^{B2}$ | $R^{C3}$ | $R^{A3}$ | H |
| $L_{A4432}$ | $R^{B2}$ | $R^{C3}$ | $R^{A34}$ | H |
| $L_{A4433}$ | $R^{B2}$ | $R^{C5}$ | H | H |
| $L_{A4434}$ | $R^{B2}$ | $R^{C5}$ | $R^{B1}$ | H |
| $L_{A4435}$ | $R^{B2}$ | $R^{C5}$ | $R^{B3}$ | H |
| $L_{A4436}$ | $R^{B2}$ | $R^{C5}$ | $R^{B4}$ | H |
| $L_{A4437}$ | $R^{B2}$ | $R^{C5}$ | $R^{B7}$ | H |
| $L_{A4438}$ | $R^{B2}$ | $R^{C5}$ | $R^{B12}$ | H |
| $L_{A4439}$ | $R^{B2}$ | $R^{C5}$ | $R^{B18}$ | H |
| $L_{A4440}$ | $R^{B2}$ | $R^{C5}$ | $R^{A3}$ | H |
| $L_{A4441}$ | $R^{B2}$ | $R^{C5}$ | $R^{A34}$ | H |
| $L_{A4442}$ | $R^{B2}$ | $R^{C17}$ | H | H |

-continued

| Ligand | $R^1$ | $R^2$ | $R^3$ | $R^4$ |
|---|---|---|---|---|
| $L_{A443}$ | $R^{B2}$ | $R^{C17}$ | $R^{B1}$ | H |
| $L_{A444}$ | $R^{B2}$ | $R^{C17}$ | $R^{B3}$ | H |
| $L_{A445}$ | $R^{B2}$ | $R^{C17}$ | $R^{B4}$ | H |
| $L_{A446}$ | $R^{B2}$ | $R^{C17}$ | $R^{B7}$ | H |
| $L_{A447}$ | $R^{B2}$ | $R^{C17}$ | $R^{B12}$ | H |
| $L_{A448}$ | $R^{B2}$ | $R^{C17}$ | $R^{B18}$ | H |
| $L_{A449}$ | $R^{B2}$ | $R^{C17}$ | $R^{A3}$ | H |
| $L_{A450}$ | $R^{B2}$ | $R^{C17}$ | $R^{A34}$ | H |
| $L_{A451}$ | $R^{B2}$ | $R^{C19}$ | H | H |
| $L_{A452}$ | $R^{B2}$ | $R^{C19}$ | $R^{B1}$ | H |
| $L_{A453}$ | $R^{B2}$ | $R^{C19}$ | $R^{B3}$ | H |
| $L_{A454}$ | $R^{B2}$ | $R^{C19}$ | $R^{B4}$ | H |
| $L_{A455}$ | $R^{B2}$ | $R^{C19}$ | $R^{B7}$ | H |
| $L_{A456}$ | $R^{B2}$ | $R^{C19}$ | $R^{B12}$ | H |
| $L_{A457}$ | $R^{B2}$ | $R^{C19}$ | $R^{B18}$ | H |
| $L_{A458}$ | $R^{B2}$ | $R^{C19}$ | $R^{A3}$ | H |
| $L_{A459}$ | $R^{B2}$ | $R^{C19}$ | $R^{A34}$ | H |
| $L_{A460}$ | $R^{B2}$ | $R^{C21}$ | H | H |
| $L_{A461}$ | $R^{B2}$ | $R^{C21}$ | $R^{B1}$ | H |
| $L_{A462}$ | $R^{B2}$ | $R^{C21}$ | $R^{B3}$ | H |
| $L_{A463}$ | $R^{B2}$ | $R^{C21}$ | $R^{B4}$ | H |
| $L_{A464}$ | $R^{B2}$ | $R^{C21}$ | $R^{B7}$ | H |
| $L_{A465}$ | $R^{B2}$ | $R^{C21}$ | $R^{B12}$ | H |
| $L_{A466}$ | $R^{B2}$ | $R^{C21}$ | $R^{B18}$ | H |
| $L_{A467}$ | $R^{B2}$ | $R^{C21}$ | $R^{A3}$ | H |
| $L_{A468}$ | $R^{B2}$ | $R^{C21}$ | $R^{A34}$ | H |
| $L_{A469}$ | $R^{C1}$ | $R^{C1}$ | H | $R^{B1}$ |
| $L_{A470}$ | $R^{C1}$ | $R^{C1}$ | H | $R^{B3}$ |
| $L_{A471}$ | $R^{C1}$ | $R^{C1}$ | H | $R^{B4}$ |
| $L_{A472}$ | $R^{C1}$ | $R^{C1}$ | H | $R^{B7}$ |
| $L_{A473}$ | $R^{C1}$ | $R^{C1}$ | H | $R^{B12}$ |
| $L_{A474}$ | $R^{C1}$ | $R^{C1}$ | H | $R^{B18}$ |
| $L_{A475}$ | $R^{C1}$ | $R^{C1}$ | H | $R^{A3}$ |
| $L_{A476}$ | $R^{C1}$ | $R^{C1}$ | H | $R^{A34}$ |
| $L_{A477}$ | $R^{C3}$ | $R^{C3}$ | H | $R^{B1}$ |
| $L_{A478}$ | $R^{C3}$ | $R^{C3}$ | H | $R^{B3}$ |
| $L_{A479}$ | $R^{C3}$ | $R^{C3}$ | H | $R^{B4}$ |
| $L_{A480}$ | $R^{C3}$ | $R^{C3}$ | H | $R^{B7}$ |
| $L_{A481}$ | $R^{C3}$ | $R^{C3}$ | H | $R^{B12}$ |
| $L_{A482}$ | $R^{C3}$ | $R^{C3}$ | H | $R^{B18}$ |
| $L_{A483}$ | $R^{C3}$ | $R^{C3}$ | H | $R^{A3}$ |
| $L_{A484}$ | $R^{C3}$ | $R^{C3}$ | H | $R^{A34}$ |
| $L_{A485}$ | $R^{C5}$ | $R^{C5}$ | H | $R^{B1}$ |
| $L_{A486}$ | $R^{C5}$ | $R^{C5}$ | H | $R^{B3}$ |
| $L_{A487}$ | $R^{C5}$ | $R^{C5}$ | H | $R^{B4}$ |
| $L_{A488}$ | $R^{C5}$ | $R^{C5}$ | H | $R^{B7}$ |
| $L_{A489}$ | $R^{C5}$ | $R^{C5}$ | H | $R^{B12}$ |
| $L_{A490}$ | $R^{C5}$ | $R^{C5}$ | H | $R^{B18}$ |
| $L_{A491}$ | $R^{C5}$ | $R^{C5}$ | H | $R^{A3}$ |
| $L_{A492}$ | $R^{C5}$ | $R^{C5}$ | H | $R^{A34}$ |
| $L_{A493}$ | $R^{C17}$ | $R^{C17}$ | H | $R^{B1}$ |
| $L_{A494}$ | $R^{C17}$ | $R^{C17}$ | H | $R^{B3}$ |
| $L_{A495}$ | $R^{C17}$ | $R^{C17}$ | H | $R^{B4}$ |
| $L_{A496}$ | $R^{C17}$ | $R^{C17}$ | H | $R^{B7}$ |
| $L_{A497}$ | $R^{C17}$ | $R^{C17}$ | H | $R^{B12}$ |
| $L_{A498}$ | $R^{C17}$ | $R^{C17}$ | H | $R^{B18}$ |
| $L_{A499}$ | $R^{C17}$ | $R^{C17}$ | H | $R^{A3}$ |
| $L_{A500}$ | $R^{C17}$ | $R^{C17}$ | H | $R^{A34}$ |
| $L_{A501}$ | $R^{C19}$ | $R^{C19}$ | H | $R^{B1}$ |
| $L_{A502}$ | $R^{C19}$ | $R^{C19}$ | H | $R^{B3}$ |
| $L_{A503}$ | $R^{C19}$ | $R^{C19}$ | H | $R^{B4}$ |
| $L_{A504}$ | $R^{C19}$ | $R^{C19}$ | H | $R^{B7}$ |
| $L_{A505}$ | $R^{C19}$ | $R^{C19}$ | H | $R^{B12}$ |
| $L_{A506}$ | $R^{C19}$ | $R^{C19}$ | H | $R^{B18}$ |
| $L_{A507}$ | $R^{C19}$ | $R^{C19}$ | H | $R^{A3}$ |
| $L_{A508}$ | $R^{C19}$ | $R^{C19}$ | H | $R^{A34}$ |
| $L_{A509}$ | $R^{C21}$ | $R^{C21}$ | H | $R^{B1}$ |
| $L_{A510}$ | $R^{C21}$ | $R^{C21}$ | H | $R^{B3}$ |
| $L_{A511}$ | $R^{C21}$ | $R^{C21}$ | H | $R^{B4}$ |
| $L_{A512}$ | $R^{C21}$ | $R^{C21}$ | H | $R^{B7}$ |
| $L_{A513}$ | $R^{C21}$ | $R^{C21}$ | H | $R^{B12}$ |
| $L_{A514}$ | $R^{C21}$ | $R^{C21}$ | H | $R^{B18}$ |
| $L_{A515}$ | $R^{C21}$ | $R^{C21}$ | H | $R^{A3}$ |
| $L_{A516}$ | $R^{C21}$ | $R^{C21}$ | H | $R^{A34}$ |
| $L_{A517}$ | $R^{B1}$ | $R^{C1}$ | H | $R^{B1}$ |
| $L_{A518}$ | $R^{B1}$ | $R^{C1}$ | H | $R^{B3}$ |
| $L_{A519}$ | $R^{B1}$ | $R^{C1}$ | H | $R^{B4}$ |

-continued

| Ligand | $R^1$ | $R^2$ | $R^3$ | $R^4$ |
|---|---|---|---|---|
| $L_{A520}$ | $R^{B1}$ | $R^{C1}$ | H | $R^{B7}$ |
| $L_{A521}$ | $R^{B1}$ | $R^{C1}$ | H | $R^{B12}$ |
| $L_{A522}$ | $R^{B1}$ | $R^{C1}$ | H | $R^{B18}$ |
| $L_{A523}$ | $R^{B1}$ | $R^{C1}$ | H | $R^{A3}$ |
| $L_{A524}$ | $R^{B1}$ | $R^{C1}$ | H | $R^{A34}$ |
| $L_{A525}$ | $R^{B1}$ | $R^{C3}$ | H | $R^{B1}$ |
| $L_{A526}$ | $R^{B1}$ | $R^{C3}$ | H | $R^{B3}$ |
| $L_{A527}$ | $R^{B1}$ | $R^{C3}$ | H | $R^{B4}$ |
| $L_{A528}$ | $R^{B1}$ | $R^{C3}$ | H | $R^{B7}$ |
| $L_{A529}$ | $R^{B1}$ | $R^{C3}$ | H | $R^{B12}$ |
| $L_{A530}$ | $R^{B1}$ | $R^{C3}$ | H | $R^{B18}$ |
| $L_{A531}$ | $R^{B1}$ | $R^{C3}$ | H | $R^{A3}$ |
| $L_{A532}$ | $R^{B1}$ | $R^{C3}$ | H | $R^{A34}$ |
| $L_{A533}$ | $R^{B1}$ | $R^{C5}$ | H | $R^{B1}$ |
| $L_{A534}$ | $R^{B1}$ | $R^{C5}$ | H | $R^{B3}$ |
| $L_{A535}$ | $R^{B1}$ | $R^{C5}$ | H | $R^{B4}$ |
| $L_{A536}$ | $R^{B1}$ | $R^{C5}$ | H | $R^{B7}$ |
| $L_{A537}$ | $R^{B1}$ | $R^{C5}$ | H | $R^{B12}$ |
| $L_{A538}$ | $R^{B1}$ | $R^{C5}$ | H | $R^{B18}$ |
| $L_{A539}$ | $R^{B1}$ | $R^{C5}$ | H | $R^{A3}$ |
| $L_{A540}$ | $R^{B1}$ | $R^{C5}$ | H | $R^{A34}$ |
| $L_{A541}$ | $R^{B1}$ | $R^{C17}$ | H | $R^{B1}$ |
| $L_{A542}$ | $R^{B1}$ | $R^{C17}$ | H | $R^{B3}$ |
| $L_{A543}$ | $R^{B1}$ | $R^{C17}$ | H | $R^{B4}$ |
| $L_{A544}$ | $R^{B1}$ | $R^{C17}$ | H | $R^{B7}$ |
| $L_{A545}$ | $R^{B1}$ | $R^{C17}$ | H | $R^{B12}$ |
| $L_{A546}$ | $R^{B1}$ | $R^{C17}$ | H | $R^{B18}$ |
| $L_{A547}$ | $R^{B1}$ | $R^{C17}$ | H | $R^{A3}$ |
| $L_{A548}$ | $R^{B1}$ | $R^{C17}$ | H | $R^{A34}$ |
| $L_{A549}$ | $R^{B1}$ | $R^{C19}$ | H | $R^{B1}$ |
| $L_{A550}$ | $R^{B1}$ | $R^{C19}$ | H | $R^{B3}$ |
| $L_{A551}$ | $R^{B1}$ | $R^{C19}$ | H | $R^{B4}$ |
| $L_{A552}$ | $R^{B1}$ | $R^{C19}$ | H | $R^{B7}$ |
| $L_{A553}$ | $R^{B1}$ | $R^{C19}$ | H | $R^{B12}$ |
| $L_{A554}$ | $R^{B1}$ | $R^{C19}$ | H | $R^{B18}$ |
| $L_{A555}$ | $R^{B1}$ | $R^{C19}$ | H | $R^{A3}$ |
| $L_{A556}$ | $R^{B1}$ | $R^{C19}$ | H | $R^{A34}$ |
| $L_{A557}$ | $R^{B1}$ | $R^{C21}$ | H | $R^{B1}$ |
| $L_{A558}$ | $R^{B1}$ | $R^{C21}$ | H | $R^{B3}$ |
| $L_{A559}$ | $R^{B1}$ | $R^{C21}$ | H | $R^{B4}$ |
| $L_{A560}$ | $R^{B1}$ | $R^{C21}$ | H | $R^{B7}$ |
| $L_{A561}$ | $R^{B1}$ | $R^{C21}$ | H | $R^{B12}$ |
| $L_{A562}$ | $R^{B1}$ | $R^{C21}$ | H | $R^{B18}$ |
| $L_{A563}$ | $R^{B1}$ | $R^{C21}$ | H | $R^{A3}$ |
| $L_{A564}$ | $R^{B1}$ | $R^{C21}$ | H | $R^{A34}$ |
| $L_{A565}$ | $R^{B1}$ | $R^{C1}$ | H | $R^{B1}$ |
| $L_{A566}$ | $R^{B1}$ | $R^{C1}$ | H | $R^{B3}$ |
| $L_{A567}$ | $R^{B1}$ | $R^{C1}$ | H | $R^{B4}$ |
| $L_{A568}$ | $R^{B2}$ | $R^{C1}$ | H | $R^{B7}$ |
| $L_{A569}$ | $R^{B2}$ | $R^{C1}$ | H | $R^{B12}$ |
| $L_{A570}$ | $R^{B2}$ | $R^{C1}$ | H | $R^{B18}$ |
| $L_{A571}$ | $R^{B2}$ | $R^{C1}$ | H | $R^{A3}$ |
| $L_{A572}$ | $R^{B2}$ | $R^{C1}$ | H | $R^{A34}$ |
| $L_{A573}$ | $R^{B2}$ | $R^{C1}$ | H | $R^{B1}$ |
| $L_{A574}$ | $R^{B2}$ | $R^{C3}$ | H | $R^{B3}$ |
| $L_{A575}$ | $R^{B2}$ | $R^{C3}$ | H | $R^{B4}$ |
| $L_{A576}$ | $R^{B2}$ | $R^{C3}$ | H | $R^{B7}$ |
| $L_{A577}$ | $R^{B2}$ | $R^{C3}$ | H | $R^{B12}$ |
| $L_{A578}$ | $R^{B2}$ | $R^{C3}$ | H | $R^{B18}$ |
| $L_{A579}$ | $R^{B2}$ | $R^{C3}$ | H | $R^{A3}$ |
| $L_{A580}$ | $R^{B2}$ | $R^{C3}$ | H | $R^{A34}$ |
| $L_{A581}$ | $R^{B2}$ | $R^{C5}$ | H | $R^{B1}$ |
| $L_{A582}$ | $R^{B2}$ | $R^{C5}$ | H | $R^{B3}$ |
| $L_{A583}$ | $R^{B2}$ | $R^{C5}$ | H | $R^{B4}$ |
| $L_{A584}$ | $R^{B2}$ | $R^{C5}$ | H | $R^{B7}$ |
| $L_{A585}$ | $R^{B2}$ | $R^{C5}$ | H | $R^{B12}$ |
| $L_{A586}$ | $R^{B2}$ | $R^{C5}$ | H | $R^{B18}$ |
| $L_{A587}$ | $R^{B2}$ | $R^{C5}$ | H | $R^{A3}$ |
| $L_{A588}$ | $R^{B2}$ | $R^{C5}$ | H | $R^{A34}$ |
| $L_{A589}$ | $R^{B2}$ | $R^{C17}$ | H | $R^{B1}$ |
| $L_{A590}$ | $R^{B2}$ | $R^{C17}$ | H | $R^{B3}$ |
| $L_{A591}$ | $R^{B2}$ | $R^{C17}$ | H | $R^{B4}$ |
| $L_{A592}$ | $R^{B2}$ | $R^{C17}$ | H | $R^{B7}$ |
| $L_{A593}$ | $R^{B2}$ | $R^{C17}$ | H | $R^{B12}$ |
| $L_{A594}$ | $R^{B2}$ | $R^{C17}$ | H | $R^{B18}$ |
| $L_{A595}$ | $R^{B2}$ | $R^{C17}$ | H | $R^{A3}$ |
| $L_{A596}$ | $R^{B2}$ | $R^{C17}$ | H | $R^{A34}$ |

-continued

| Ligand | $R^1$ | $R^2$ | $R^3$ | $R^4$ |
|---|---|---|---|---|
| $L_{A4597}$ | $R^{B2}$ | $R^{C19}$ | H | $R^{B1}$ |
| $L_{A4598}$ | $R^{B2}$ | $R^{C19}$ | H | $R^{B3}$ |
| $L_{A4599}$ | $R^{B2}$ | $R^{C19}$ | H | $R^{B4}$ |
| $L_{A4600}$ | $R^{B2}$ | $R^{C19}$ | H | $R^{B7}$ |
| $L_{A4601}$ | $R^{B2}$ | $R^{C19}$ | H | $R^{B12}$ |
| $L_{A4602}$ | $R^{B2}$ | $R^{C19}$ | H | $R^{B18}$ |
| $L_{A4603}$ | $R^{B2}$ | $R^{C19}$ | H | $R^{A3}$ |
| $L_{A4604}$ | $R^{B2}$ | $R^{C19}$ | H | $R^{A34}$ |
| $L_{A4605}$ | $R^{B2}$ | $R^{C21}$ | H | $R^{B1}$ |
| $L_{A4606}$ | $R^{B2}$ | $R^{C21}$ | H | $R^{B3}$ |
| $L_{A4607}$ | $R^{B2}$ | $R^{C21}$ | H | $R^{B4}$ |
| $L_{A4608}$ | $R^{B2}$ | $R^{C21}$ | H | $R^{B7}$ |
| $L_{A4609}$ | $R^{B2}$ | $R^{C21}$ | H | $R^{B12}$ |
| $L_{A4610}$ | $R^{B2}$ | $R^{C21}$ | H | $R^{B18}$ |
| $L_{A4611}$ | $R^{B2}$ | $R^{C21}$ | H | $R^{A3}$ |
| $L_{A4612}$ | $R^{B2}$ | $R^{C21}$ | H | $R^{A34}$ |

$L_{A4613}$ through $L_{A4918}$ that are based on a structure of Formula III,

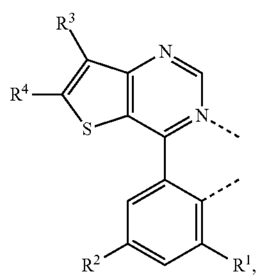

in which $R^1$, $R^2$, $R^3$, and $R^4$ are defined as follows:

| Ligand | $R^1$ | $R^2$ | $R^3$ | $R^4$ |
|---|---|---|---|---|
| $L_{A4613}$ | $R^{C1}$ | $R^{C1}$ | H | H |
| $L_{A4614}$ | $R^{C1}$ | $R^{C1}$ | $R^{B1}$ | H |
| $L_{A4615}$ | $R^{C1}$ | $R^{C1}$ | $R^{B3}$ | H |
| $L_{A4616}$ | $R^{C1}$ | $R^{C1}$ | $R^{B4}$ | H |
| $L_{A4617}$ | $R^{C1}$ | $R^{C1}$ | $R^{B7}$ | H |
| $L_{A4618}$ | $R^{C1}$ | $R^{C1}$ | $R^{B12}$ | H |
| $L_{A4619}$ | $R^{C1}$ | $R^{C1}$ | $R^{B18}$ | H |
| $L_{A4620}$ | $R^{C1}$ | $R^{C1}$ | $R^{A3}$ | H |
| $L_{A4621}$ | $R^{C1}$ | $R^{C1}$ | $R^{A34}$ | H |
| $L_{A4622}$ | $R^{C3}$ | $R^{C3}$ | H | H |
| $L_{A4623}$ | $R^{C3}$ | $R^{C3}$ | $R^{B1}$ | H |
| $L_{A4624}$ | $R^{C3}$ | $R^{C3}$ | $R^{B3}$ | H |
| $L_{A4625}$ | $R^{C3}$ | $R^{C3}$ | $R^{B4}$ | H |
| $L_{A4626}$ | $R^{C3}$ | $R^{C3}$ | $R^{B7}$ | H |
| $L_{A4627}$ | $R^{C3}$ | $R^{C3}$ | $R^{B12}$ | H |
| $L_{A4628}$ | $R^{C3}$ | $R^{C3}$ | $R^{B18}$ | H |
| $L_{A4629}$ | $R^{C3}$ | $R^{C3}$ | $R^{A3}$ | H |
| $L_{A4630}$ | $R^{C3}$ | $R^{C3}$ | $R^{A34}$ | H |
| $L_{A4631}$ | $R^{C5}$ | $R^{C5}$ | H | H |
| $L_{A4632}$ | $R^{C5}$ | $R^{C5}$ | $R^{B1}$ | H |
| $L_{A4633}$ | $R^{C5}$ | $R^{C5}$ | $R^{B3}$ | H |
| $L_{A4634}$ | $R^{C5}$ | $R^{C5}$ | $R^{B4}$ | H |
| $L_{A4635}$ | $R^{C5}$ | $R^{C5}$ | $R^{B7}$ | H |
| $L_{A4636}$ | $R^{C5}$ | $R^{C5}$ | $R^{B12}$ | H |
| $L_{A4637}$ | $R^{C5}$ | $R^{C5}$ | $R^{B18}$ | H |
| $L_{A4638}$ | $R^{C5}$ | $R^{C5}$ | $R^{A3}$ | H |
| $L_{A4639}$ | $R^{C5}$ | $R^{C5}$ | $R^{A34}$ | H |
| $L_{A4640}$ | $R^{C17}$ | $R^{C17}$ | H | H |
| $L_{A4641}$ | $R^{C17}$ | $R^{C17}$ | $R^{B1}$ | H |
| $L_{A4642}$ | $R^{C17}$ | $R^{C17}$ | $R^{B3}$ | H |
| $L_{A4643}$ | $R^{C17}$ | $R^{C17}$ | $R^{B4}$ | H |
| $L_{A4644}$ | $R^{C17}$ | $R^{C17}$ | $R^{B7}$ | H |
| $L_{A4645}$ | $R^{C17}$ | $R^{C17}$ | $R^{B12}$ | H |
| $L_{A4646}$ | $R^{C17}$ | $R^{C17}$ | $R^{B18}$ | H |
| $L_{A4647}$ | $R^{C17}$ | $R^{C17}$ | $R^{A3}$ | H |

-continued

| Ligand | $R^1$ | $R^2$ | $R^3$ | $R^4$ |
|---|---|---|---|---|
| $L_{A4648}$ | $R^{C17}$ | $R^{C17}$ | $R^{A34}$ | H |
| $L_{A4649}$ | $R^{C19}$ | $R^{C19}$ | H | H |
| $L_{A4650}$ | $R^{C19}$ | $R^{C19}$ | $R^{B1}$ | H |
| $L_{A4651}$ | $R^{C19}$ | $R^{C19}$ | $R^{B3}$ | H |
| $L_{A4652}$ | $R^{C19}$ | $R^{C19}$ | $R^{B4}$ | H |
| $L_{A4653}$ | $R^{C19}$ | $R^{C19}$ | $R^{B7}$ | H |
| $L_{A4654}$ | $R^{C19}$ | $R^{C19}$ | $R^{B12}$ | H |
| $L_{A4655}$ | $R^{C19}$ | $R^{C19}$ | $R^{B18}$ | H |
| $L_{A4656}$ | $R^{C19}$ | $R^{C19}$ | $R^{A3}$ | H |
| $L_{A4657}$ | $R^{C19}$ | $R^{C19}$ | $R^{A34}$ | H |
| $L_{A4658}$ | $R^{C21}$ | $R^{C21}$ | H | H |
| $L_{A4659}$ | $R^{C21}$ | $R^{C21}$ | $R^{B1}$ | H |
| $L_{A4660}$ | $R^{C21}$ | $R^{C21}$ | $R^{B3}$ | H |
| $L_{A4661}$ | $R^{C21}$ | $R^{C21}$ | $R^{B4}$ | H |
| $L_{A4662}$ | $R^{C21}$ | $R^{C21}$ | $R^{B7}$ | H |
| $L_{A4663}$ | $R^{C21}$ | $R^{C21}$ | $R^{B12}$ | H |
| $L_{A4664}$ | $R^{C21}$ | $R^{C21}$ | $R^{B18}$ | H |
| $L_{A4665}$ | $R^{C21}$ | $R^{C21}$ | $R^{A3}$ | H |
| $L_{A4666}$ | $R^{C21}$ | $R^{C21}$ | $R^{A34}$ | H |
| $L_{A4667}$ | $R^{B1}$ | $R^{C1}$ | H | H |
| $L_{A4668}$ | $R^{B1}$ | $R^{C1}$ | $R^{B1}$ | H |
| $L_{A4669}$ | $R^{B1}$ | $R^{C1}$ | $R^{B3}$ | H |
| $L_{A4670}$ | $R^{B1}$ | $R^{C1}$ | $R^{B4}$ | H |
| $L_{A4671}$ | $R^{B1}$ | $R^{C1}$ | $R^{B7}$ | H |
| $L_{A4672}$ | $R^{B1}$ | $R^{C1}$ | $R^{B12}$ | H |
| $L_{A4673}$ | $R^{B1}$ | $R^{C1}$ | $R^{B18}$ | H |
| $L_{A4674}$ | $R^{B1}$ | $R^{C1}$ | $R^{A3}$ | H |
| $L_{A4675}$ | $R^{B1}$ | $R^{C1}$ | $R^{A34}$ | H |
| $L_{A4676}$ | $R^{B1}$ | $R^{C3}$ | H | H |
| $L_{A4677}$ | $R^{B1}$ | $R^{C3}$ | $R^{B1}$ | H |
| $L_{A4678}$ | $R^{B1}$ | $R^{C3}$ | $R^{B3}$ | H |
| $L_{A4679}$ | $R^{B1}$ | $R^{C3}$ | $R^{B4}$ | H |
| $L_{A4680}$ | $R^{B1}$ | $R^{C3}$ | $R^{B7}$ | H |
| $L_{A4681}$ | $R^{B1}$ | $R^{C3}$ | $R^{B12}$ | H |
| $L_{A4682}$ | $R^{B1}$ | $R^{C3}$ | $R^{B18}$ | H |
| $L_{A4683}$ | $R^{B1}$ | $R^{C3}$ | $R^{A3}$ | H |
| $L_{A4684}$ | $R^{B1}$ | $R^{C3}$ | $R^{A34}$ | H |
| $L_{A4685}$ | $R^{B1}$ | $R^{C5}$ | H | H |
| $L_{A4686}$ | $R^{B1}$ | $R^{C5}$ | $R^{B1}$ | H |
| $L_{A4687}$ | $R^{B1}$ | $R^{C5}$ | $R^{B3}$ | H |
| $L_{A4688}$ | $R^{B1}$ | $R^{C5}$ | $R^{B4}$ | H |
| $L_{A4689}$ | $R^{B1}$ | $R^{C5}$ | $R^{B7}$ | H |
| $L_{A4690}$ | $R^{B1}$ | $R^{C5}$ | $R^{B12}$ | H |
| $L_{A4691}$ | $R^{B1}$ | $R^{C5}$ | $R^{B18}$ | H |
| $L_{A4692}$ | $R^{B1}$ | $R^{C5}$ | $R^{A3}$ | H |
| $L_{A4693}$ | $R^{B1}$ | $R^{C5}$ | $R^{A34}$ | H |
| $L_{A4694}$ | $R^{B1}$ | $R^{C17}$ | H | H |
| $L_{A4695}$ | $R^{B1}$ | $R^{C17}$ | $R^{B1}$ | H |
| $L_{A4696}$ | $R^{B1}$ | $R^{C17}$ | $R^{B3}$ | H |
| $L_{A4697}$ | $R^{B1}$ | $R^{C17}$ | $R^{B4}$ | H |
| $L_{A4698}$ | $R^{B1}$ | $R^{C17}$ | $R^{B7}$ | H |
| $L_{A4699}$ | $R^{B1}$ | $R^{C17}$ | $R^{B12}$ | H |
| $L_{A4700}$ | $R^{B1}$ | $R^{C17}$ | $R^{B18}$ | H |
| $L_{A4701}$ | $R^{B1}$ | $R^{C17}$ | $R^{A3}$ | H |
| $L_{A4702}$ | $R^{B1}$ | $R^{C17}$ | $R^{A34}$ | H |
| $L_{A4703}$ | $R^{B1}$ | $R^{C19}$ | H | H |
| $L_{A4704}$ | $R^{B1}$ | $R^{C19}$ | $R^{B1}$ | H |
| $L_{A4705}$ | $R^{B1}$ | $R^{C19}$ | $R^{B3}$ | H |
| $L_{A4706}$ | $R^{B1}$ | $R^{C19}$ | $R^{B4}$ | H |
| $L_{A4707}$ | $R^{B1}$ | $R^{C19}$ | $R^{B7}$ | H |
| $L_{A4708}$ | $R^{B1}$ | $R^{C19}$ | $R^{B12}$ | H |
| $L_{A4709}$ | $R^{B1}$ | $R^{C19}$ | $R^{B18}$ | H |
| $L_{A4710}$ | $R^{B1}$ | $R^{C19}$ | $R^{A3}$ | H |
| $L_{A4711}$ | $R^{B1}$ | $R^{C19}$ | $R^{A34}$ | H |
| $L_{A4712}$ | $R^{B1}$ | $R^{C21}$ | H | H |
| $L_{A4713}$ | $R^{B1}$ | $R^{C21}$ | $R^{B1}$ | H |
| $L_{A4714}$ | $R^{B1}$ | $R^{C21}$ | $R^{B3}$ | H |
| $L_{A4715}$ | $R^{B1}$ | $R^{C21}$ | $R^{B4}$ | H |
| $L_{A4716}$ | $R^{B1}$ | $R^{C21}$ | $R^{B7}$ | H |
| $L_{A4717}$ | $R^{B1}$ | $R^{C21}$ | $R^{B12}$ | H |
| $L_{A4718}$ | $R^{B1}$ | $R^{C21}$ | $R^{B18}$ | H |
| $L_{A4719}$ | $R^{B1}$ | $R^{C21}$ | $R^{A3}$ | H |
| $L_{A4720}$ | $R^{B1}$ | $R^{C21}$ | $R^{A34}$ | H |
| $L_{A4721}$ | $R^{B2}$ | $R^{C1}$ | H | H |
| $L_{A4722}$ | $R^{B2}$ | $R^{C1}$ | $R^{B1}$ | H |
| $L_{A4723}$ | $R^{B2}$ | $R^{C1}$ | $R^{B3}$ | H |
| $L_{A4724}$ | $R^{B2}$ | $R^{C1}$ | $R^{B4}$ | H |

-continued

| Ligand | $R^1$ | $R^2$ | $R^3$ | $R^4$ |
|---|---|---|---|---|
| $L_{A725}$ | $R^{B2}$ | $R^{C1}$ | $R^{B7}$ | H |
| $L_{A726}$ | $R^{B2}$ | $R^{C1}$ | $R^{B12}$ | H |
| $L_{A727}$ | $R^{B2}$ | $R^{C1}$ | $R^{B18}$ | H |
| $L_{A728}$ | $R^{B2}$ | $R^{C1}$ | $R^{A3}$ | H |
| $L_{A729}$ | $R^{B2}$ | $R^{C1}$ | $R^{A34}$ | H |
| $L_{A730}$ | $R^{B2}$ | $R^{C3}$ | H | H |
| $L_{A731}$ | $R^{B2}$ | $R^{C3}$ | $R^{B1}$ | H |
| $L_{A732}$ | $R^{B2}$ | $R^{C3}$ | $R^{B3}$ | H |
| $L_{A733}$ | $R^{B2}$ | $R^{C3}$ | $R^{B4}$ | H |
| $L_{A734}$ | $R^{B2}$ | $R^{C3}$ | $R^{B7}$ | H |
| $L_{A735}$ | $R^{B2}$ | $R^{C3}$ | $R^{B12}$ | H |
| $L_{A736}$ | $R^{B2}$ | $R^{C3}$ | $R^{B18}$ | H |
| $L_{A737}$ | $R^{B2}$ | $R^{C3}$ | $R^{A3}$ | H |
| $L_{A738}$ | $R^{B2}$ | $R^{C3}$ | $R^{A34}$ | H |
| $L_{A739}$ | $R^{B2}$ | $R^{C5}$ | H | H |
| $L_{A740}$ | $R^{B2}$ | $R^{C5}$ | $R^{B1}$ | H |
| $L_{A741}$ | $R^{B2}$ | $R^{C5}$ | $R^{B3}$ | H |
| $L_{A742}$ | $R^{B2}$ | $R^{C5}$ | $R^{B4}$ | H |
| $L_{A743}$ | $R^{B2}$ | $R^{C5}$ | $R^{B7}$ | H |
| $L_{A744}$ | $R^{B2}$ | $R^{C5}$ | $R^{B12}$ | H |
| $L_{A745}$ | $R^{B2}$ | $R^{C5}$ | $R^{B18}$ | H |
| $L_{A746}$ | $R^{B2}$ | $R^{C5}$ | $R^{A3}$ | H |
| $L_{A747}$ | $R^{B2}$ | $R^{C5}$ | $R^{A34}$ | H |
| $L_{A748}$ | $R^{B2}$ | $R^{C17}$ | H | H |
| $L_{A749}$ | $R^{B2}$ | $R^{C17}$ | $R^{B1}$ | H |
| $L_{A750}$ | $R^{B2}$ | $R^{C17}$ | $R^{B3}$ | H |
| $L_{A751}$ | $R^{B2}$ | $R^{C17}$ | $R^{B4}$ | H |
| $L_{A752}$ | $R^{B2}$ | $R^{C17}$ | $R^{B7}$ | H |
| $L_{A753}$ | $R^{B2}$ | $R^{C17}$ | $R^{B12}$ | H |
| $L_{A754}$ | $R^{B2}$ | $R^{C17}$ | $R^{B18}$ | H |
| $L_{A755}$ | $R^{B2}$ | $R^{C17}$ | $R^{A3}$ | H |
| $L_{A756}$ | $R^{B2}$ | $R^{C17}$ | $R^{A34}$ | H |
| $L_{A757}$ | $R^{B2}$ | $R^{C19}$ | H | H |
| $L_{A758}$ | $R^{B2}$ | $R^{C19}$ | $R^{B1}$ | H |
| $L_{A759}$ | $R^{B2}$ | $R^{C19}$ | $R^{B3}$ | H |
| $L_{A760}$ | $R^{B2}$ | $R^{C19}$ | $R^{B4}$ | H |
| $L_{A761}$ | $R^{B2}$ | $R^{C19}$ | $R^{B7}$ | H |
| $L_{A762}$ | $R^{B2}$ | $R^{C19}$ | $R^{B12}$ | H |
| $L_{A763}$ | $R^{B2}$ | $R^{C19}$ | $R^{B18}$ | H |
| $L_{A764}$ | $R^{B2}$ | $R^{C19}$ | $R^{A3}$ | H |
| $L_{A765}$ | $R^{B2}$ | $R^{C19}$ | $R^{A34}$ | H |
| $L_{A766}$ | $R^{B2}$ | $R^{C21}$ | H | H |
| $L_{A767}$ | $R^{B2}$ | $R^{C21}$ | $R^{B1}$ | H |
| $L_{A768}$ | $R^{B2}$ | $R^{C21}$ | $R^{B3}$ | H |
| $L_{A769}$ | $R^{B2}$ | $R^{C21}$ | $R^{B4}$ | H |
| $L_{A770}$ | $R^{B2}$ | $R^{C21}$ | $R^{B7}$ | H |
| $L_{A771}$ | $R^{B2}$ | $R^{C21}$ | $R^{B12}$ | H |
| $L_{A772}$ | $R^{B2}$ | $R^{C21}$ | $R^{B18}$ | H |
| $L_{A773}$ | $R^{B2}$ | $R^{C21}$ | $R^{A3}$ | H |
| $L_{A774}$ | $R^{B2}$ | $R^{C21}$ | $R^{A34}$ | H |
| $L_{A775}$ | $R^{C1}$ | $R^{C1}$ | H | $R^{B1}$ |
| $L_{A776}$ | $R^{C1}$ | $R^{C1}$ | H | $R^{B3}$ |
| $L_{A777}$ | $R^{C1}$ | $R^{C1}$ | H | $R^{B4}$ |
| $L_{A778}$ | $R^{C1}$ | $R^{C1}$ | H | $R^{B7}$ |
| $L_{A779}$ | $R^{C1}$ | $R^{C1}$ | H | $R^{B12}$ |
| $L_{A780}$ | $R^{C1}$ | $R^{C1}$ | H | $R^{B18}$ |
| $L_{A781}$ | $R^{C1}$ | $R^{C1}$ | H | $R^{A3}$ |
| $L_{A782}$ | $R^{C1}$ | $R^{C1}$ | H | $R^{A34}$ |
| $L_{A783}$ | $R^{C3}$ | $R^{C3}$ | H | $R^{B1}$ |
| $L_{A784}$ | $R^{C3}$ | $R^{C3}$ | H | $R^{B3}$ |
| $L_{A785}$ | $R^{C3}$ | $R^{C3}$ | H | $R^{B4}$ |
| $L_{A786}$ | $R^{C3}$ | $R^{C3}$ | H | $R^{B7}$ |
| $L_{A787}$ | $R^{C3}$ | $R^{C3}$ | H | $R^{B12}$ |
| $L_{A788}$ | $R^{C3}$ | $R^{C3}$ | H | $R^{B18}$ |
| $L_{A789}$ | $R^{C3}$ | $R^{C3}$ | H | $R^{A3}$ |
| $L_{A790}$ | $R^{C3}$ | $R^{C3}$ | H | $R^{A34}$ |
| $L_{A791}$ | $R^{C5}$ | $R^{C5}$ | H | $R^{B1}$ |
| $L_{A792}$ | $R^{C5}$ | $R^{C5}$ | H | $R^{B3}$ |
| $L_{A793}$ | $R^{C5}$ | $R^{C5}$ | H | $R^{B4}$ |
| $L_{A794}$ | $R^{C5}$ | $R^{C5}$ | H | $R^{B7}$ |
| $L_{A795}$ | $R^{C5}$ | $R^{C5}$ | H | $R^{B12}$ |
| $L_{A796}$ | $R^{C5}$ | $R^{C5}$ | H | $R^{B18}$ |
| $L_{A797}$ | $R^{C5}$ | $R^{C5}$ | H | $R^{A3}$ |
| $L_{A798}$ | $R^{C5}$ | $R^{C5}$ | H | $R^{A34}$ |
| $L_{A799}$ | $R^{C17}$ | $R^{C17}$ | H | $R^{B1}$ |
| $L_{A800}$ | $R^{C17}$ | $R^{C17}$ | H | $R^{B3}$ |
| $L_{A801}$ | $R^{C17}$ | $R^{C17}$ | H | $R^{B4}$ |

-continued

| Ligand | $R^1$ | $R^2$ | $R^3$ | $R^4$ |
|---|---|---|---|---|
| $L_{A802}$ | $R^{C17}$ | $R^{C17}$ | H | $R^{B7}$ |
| $L_{A803}$ | $R^{C17}$ | $R^{C17}$ | H | $R^{B12}$ |
| $L_{A804}$ | $R^{C17}$ | $R^{C17}$ | H | $R^{B18}$ |
| $L_{A805}$ | $R^{C17}$ | $R^{C17}$ | H | $R^{A3}$ |
| $L_{A806}$ | $R^{C17}$ | $R^{C17}$ | H | $R^{A34}$ |
| $L_{A807}$ | $R^{C19}$ | $R^{C19}$ | H | $R^{B1}$ |
| $L_{A808}$ | $R^{C19}$ | $R^{C19}$ | H | $R^{B3}$ |
| $L_{A809}$ | $R^{C19}$ | $R^{C19}$ | H | $R^{B4}$ |
| $L_{A810}$ | $R^{C19}$ | $R^{C19}$ | H | $R^{B7}$ |
| $L_{A811}$ | $R^{C19}$ | $R^{C19}$ | H | $R^{B12}$ |
| $L_{A812}$ | $R^{C19}$ | $R^{C19}$ | H | $R^{B18}$ |
| $L_{A813}$ | $R^{C19}$ | $R^{C19}$ | H | $R^{A3}$ |
| $L_{A814}$ | $R^{C19}$ | $R^{C19}$ | H | $R^{A34}$ |
| $L_{A815}$ | $R^{C21}$ | $R^{C21}$ | H | $R^{B1}$ |
| $L_{A816}$ | $R^{C21}$ | $R^{C21}$ | H | $R^{B3}$ |
| $L_{A817}$ | $R^{C21}$ | $R^{C21}$ | H | $R^{B4}$ |
| $L_{A818}$ | $R^{C21}$ | $R^{C21}$ | H | $R^{B7}$ |
| $L_{A819}$ | $R^{C21}$ | $R^{C21}$ | H | $R^{B12}$ |
| $L_{A820}$ | $R^{C21}$ | $R^{C21}$ | H | $R^{B18}$ |
| $L_{A821}$ | $R^{C21}$ | $R^{C21}$ | H | $R^{A3}$ |
| $L_{A822}$ | $R^{C21}$ | $R^{C21}$ | H | $R^{A34}$ |
| $L_{A823}$ | $R^{B1}$ | $R^{C1}$ | H | $R^{B1}$ |
| $L_{A824}$ | $R^{B1}$ | $R^{C1}$ | H | $R^{B3}$ |
| $L_{A825}$ | $R^{B1}$ | $R^{C1}$ | H | $R^{B4}$ |
| $L_{A826}$ | $R^{B1}$ | $R^{C1}$ | H | $R^{B7}$ |
| $L_{A827}$ | $R^{B1}$ | $R^{C1}$ | H | $R^{B12}$ |
| $L_{A828}$ | $R^{B1}$ | $R^{C1}$ | H | $R^{B18}$ |
| $L_{A829}$ | $R^{B1}$ | $R^{C1}$ | H | $R^{A3}$ |
| $L_{A830}$ | $R^{B1}$ | $R^{C1}$ | H | $R^{A34}$ |
| $L_{A831}$ | $R^{B1}$ | $R^{C3}$ | H | $R^{B1}$ |
| $L_{A832}$ | $R^{B1}$ | $R^{C3}$ | H | $R^{B3}$ |
| $L_{A833}$ | $R^{B1}$ | $R^{C3}$ | H | $R^{B4}$ |
| $L_{A834}$ | $R^{B1}$ | $R^{C3}$ | H | $R^{B7}$ |
| $L_{A835}$ | $R^{B1}$ | $R^{C3}$ | H | $R^{B12}$ |
| $L_{A836}$ | $R^{B1}$ | $R^{C3}$ | H | $R^{B18}$ |
| $L_{A837}$ | $R^{B1}$ | $R^{C3}$ | H | $R^{A3}$ |
| $L_{A838}$ | $R^{B1}$ | $R^{C3}$ | H | $R^{A34}$ |
| $L_{A839}$ | $R^{B1}$ | $R^{C5}$ | H | $R^{B1}$ |
| $L_{A840}$ | $R^{B1}$ | $R^{C5}$ | H | $R^{B3}$ |
| $L_{A841}$ | $R^{B1}$ | $R^{C5}$ | H | $R^{B4}$ |
| $L_{A842}$ | $R^{B1}$ | $R^{C5}$ | H | $R^{B7}$ |
| $L_{A843}$ | $R^{B1}$ | $R^{C5}$ | H | $R^{B12}$ |
| $L_{A844}$ | $R^{B1}$ | $R^{C5}$ | H | $R^{B18}$ |
| $L_{A845}$ | $R^{B1}$ | $R^{C5}$ | H | $R^{A3}$ |
| $L_{A846}$ | $R^{B1}$ | $R^{C5}$ | H | $R^{A34}$ |
| $L_{A847}$ | $R^{B1}$ | $R^{C17}$ | H | $R^{B1}$ |
| $L_{A848}$ | $R^{B1}$ | $R^{C17}$ | H | $R^{B3}$ |
| $L_{A849}$ | $R^{B1}$ | $R^{C17}$ | H | $R^{B4}$ |
| $L_{A850}$ | $R^{B1}$ | $R^{C17}$ | H | $R^{B7}$ |
| $L_{A851}$ | $R^{B1}$ | $R^{C17}$ | H | $R^{B12}$ |
| $L_{A852}$ | $R^{B1}$ | $R^{C17}$ | H | $R^{B18}$ |
| $L_{A853}$ | $R^{B1}$ | $R^{C17}$ | H | $R^{A3}$ |
| $L_{A854}$ | $R^{B1}$ | $R^{C17}$ | H | $R^{A34}$ |
| $L_{A855}$ | $R^{B1}$ | $R^{C19}$ | H | $R^{B1}$ |
| $L_{A856}$ | $R^{B1}$ | $R^{C19}$ | H | $R^{B3}$ |
| $L_{A857}$ | $R^{B1}$ | $R^{C19}$ | H | $R^{B4}$ |
| $L_{A858}$ | $R^{B1}$ | $R^{C19}$ | H | $R^{B7}$ |
| $L_{A859}$ | $R^{B1}$ | $R^{C19}$ | H | $R^{B12}$ |
| $L_{A860}$ | $R^{B1}$ | $R^{C19}$ | H | $R^{B18}$ |
| $L_{A861}$ | $R^{B1}$ | $R^{C19}$ | H | $R^{A3}$ |
| $L_{A862}$ | $R^{B1}$ | $R^{C19}$ | H | $R^{A34}$ |
| $L_{A863}$ | $R^{B1}$ | $R^{C21}$ | H | $R^{B1}$ |
| $L_{A864}$ | $R^{B1}$ | $R^{C21}$ | H | $R^{B3}$ |
| $L_{A865}$ | $R^{B1}$ | $R^{C21}$ | H | $R^{B4}$ |
| $L_{A866}$ | $R^{B1}$ | $R^{C21}$ | H | $R^{B7}$ |
| $L_{A867}$ | $R^{B1}$ | $R^{C21}$ | H | $R^{B12}$ |
| $L_{A868}$ | $R^{B1}$ | $R^{C21}$ | H | $R^{B18}$ |
| $L_{A869}$ | $R^{B1}$ | $R^{C21}$ | H | $R^{A3}$ |
| $L_{A870}$ | $R^{B1}$ | $R^{C21}$ | H | $R^{A34}$ |
| $L_{A871}$ | $R^{B2}$ | $R^{C1}$ | H | $R^{B1}$ |
| $L_{A872}$ | $R^{B2}$ | $R^{C1}$ | H | $R^{B3}$ |
| $L_{A873}$ | $R^{B2}$ | $R^{C1}$ | H | $R^{B4}$ |
| $L_{A874}$ | $R^{B2}$ | $R^{C1}$ | H | $R^{B7}$ |
| $L_{A875}$ | $R^{B2}$ | $R^{C1}$ | H | $R^{B12}$ |
| $L_{A876}$ | $R^{B2}$ | $R^{C1}$ | H | $R^{B18}$ |
| $L_{A877}$ | $R^{B2}$ | $R^{C1}$ | H | $R^{A3}$ |
| $L_{A878}$ | $R^{B2}$ | $R^{C1}$ | H | $R^{A34}$ |

-continued

| Ligand | $R^1$ | $R^2$ | $R^3$ | $R^4$ |
|---|---|---|---|---|
| $L_{A4879}$ | $R^{B2}$ | $R^{C3}$ | H | $R^{B1}$ |
| $L_{A4880}$ | $R^{B2}$ | $R^{C3}$ | H | $R^{B3}$ |
| $L_{A4881}$ | $R^{B2}$ | $R^{C3}$ | H | $R^{B4}$ |
| $L_{A4882}$ | $R^{B2}$ | $R^{C3}$ | H | $R^{B7}$ |
| $L_{A4883}$ | $R^{B2}$ | $R^{C3}$ | H | $R^{B12}$ |
| $L_{A4884}$ | $R^{B2}$ | $R^{C3}$ | H | $R_{B18}$ |
| $L_{A4885}$ | $R^{B2}$ | $R^{C3}$ | H | $R^{A3}$ |
| $L_{A4886}$ | $R^{B2}$ | $R^{C3}$ | H | $R^{A34}$ |
| $L_{A4887}$ | $R^{B2}$ | $R^{C5}$ | H | $R^{B1}$ |
| $L_{A4888}$ | $R^{B2}$ | $R^{C5}$ | H | $R^{B3}$ |
| $L_{A4889}$ | $R^{B2}$ | $R^{C5}$ | H | $R^{B4}$ |
| $L_{A4890}$ | $R^{B2}$ | $R^{C5}$ | H | $R^{B7}$ |
| $L_{A4891}$ | $R^{B2}$ | $R^{C5}$ | H | $R^{B12}$ |
| $L_{A4892}$ | $R^{B2}$ | $R^{C5}$ | H | $R^{B18}$ |
| $L_{A4893}$ | $R^{B2}$ | $R^{C5}$ | H | $R^{A3}$ |
| $L_{A4894}$ | $R^{B2}$ | $R^{C5}$ | H | $R^{A34}$ |
| $L_{A4895}$ | $R^{B2}$ | $R^{C17}$ | H | $R^{B1}$ |
| $L_{A4896}$ | $R^{B2}$ | $R^{C17}$ | H | $R^{B3}$ |
| $L_{A4897}$ | $R^{B2}$ | $R^{C17}$ | H | $R^{B4}$ |
| $L_{A4898}$ | $R^{B2}$ | $R^{C17}$ | H | $R^{B7}$ |
| $L_{A4899}$ | $R^{B2}$ | $R^{C17}$ | H | $R^{B12}$ |
| $L_{A4900}$ | $R^{B2}$ | $R^{C17}$ | H | $R^{B18}$ |
| $L_{A4901}$ | $R^{B2}$ | $R^{C17}$ | H | $R^{A3}$ |
| $L_{A4902}$ | $R^{B2}$ | $R^{C17}$ | H | $R^{A34}$ |
| $L_{A4903}$ | $R^{B2}$ | $R^{C19}$ | H | $R^{B1}$ |
| $L_{A4904}$ | $R^{B2}$ | $R^{C19}$ | H | $R^{B3}$ |
| $L_{A4905}$ | $R^{B2}$ | $R^{C19}$ | H | $R^{B4}$ |
| $L_{A4906}$ | $R^{B2}$ | $R^{C19}$ | H | $R^{B7}$ |
| $L_{A4907}$ | $R^{B2}$ | $R^{C19}$ | H | $R^{B12}$ |
| $L_{A4908}$ | $R^{B2}$ | $R^{C19}$ | H | $R^{B18}$ |
| $L_{A4909}$ | $R^{B2}$ | $R^{C19}$ | H | $R^{A3}$ |
| $L_{A4910}$ | $R^{B2}$ | $R^{C19}$ | H | $R^{A34}$ |
| $L_{A4911}$ | $R^{B2}$ | $R^{C21}$ | H | $R^{B1}$ |
| $L_{A4912}$ | $R^{B2}$ | $R^{C21}$ | H | $R^{B3}$ |
| $L_{A4913}$ | $R^{B2}$ | $R^{C21}$ | H | $R^{B4}$ |
| $L_{A4914}$ | $R^{B2}$ | $R^{C21}$ | H | $R^{B7}$ |
| $L_{A4915}$ | $R^{B2}$ | $R^{C21}$ | H | $R^{B12}$ |
| $L_{A4916}$ | $R^{B2}$ | $R^{C21}$ | H | $R^{B18}$ |
| $L_{A4917}$ | $R^{B2}$ | $R^{C21}$ | H | $R^{A3}$ |
| $L_{A4918}$ | $R^{B2}$ | $R^{C21}$ | H | $R^{A34}$ |

$L_{A919}$ through $L_{A1224}$ that are based on a structure of Formula IV,

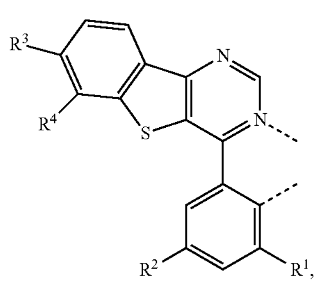

in which $R^1$, $R^2$, $R^3$, and $R^4$ are defined as:

| Ligand | $R^1$ | $R^2$ | $R^3$ | $R^4$ |
|---|---|---|---|---|
| $L_{A4919}$ | $R^{C1}$ | $R^{C1}$ | H | H |
| $L_{A4920}$ | $R^{C1}$ | $R^{C1}$ | $R^{B1}$ | H |
| $L_{A4921}$ | $R^{C1}$ | $R^{C1}$ | $R^{B3}$ | H |
| $L_{A4922}$ | $R^{C1}$ | $R^{C1}$ | $R^{B4}$ | H |
| $L_{A4923}$ | $R^{C1}$ | $R^{C1}$ | $R^{B7}$ | H |
| $L_{A4924}$ | $R^{C1}$ | $R^{C1}$ | $R^{B12}$ | H |
| $L_{A4925}$ | $R^{C1}$ | $R^{C1}$ | $R^{B18}$ | H |
| $L_{A4926}$ | $R^{C1}$ | $R^{C1}$ | $R^{A3}$ | H |
| $L_{A4927}$ | $R^{C1}$ | $R^{C1}$ | $R^{A34}$ | H |
| $L_{A4928}$ | $R^{C3}$ | $R^{C3}$ | H | H |
| $L_{A4929}$ | $R^{C3}$ | $R^{C3}$ | $R^{B1}$ | H |

-continued

| Ligand | $R^1$ | $R^2$ | $R^3$ | $R^4$ |
|---|---|---|---|---|
| $L_{A4930}$ | $R^{C3}$ | $R^{C3}$ | $R^{B3}$ | H |
| $L_{A4931}$ | $R^{C3}$ | $R^{C3}$ | $R^{B4}$ | H |
| $L_{A4932}$ | $R^{C3}$ | $R^{C3}$ | $R^{B7}$ | H |
| $L_{A4933}$ | $R^{C3}$ | $R^{C3}$ | $R^{B12}$ | H |
| $L_{A4934}$ | $R^{C3}$ | $R^{C3}$ | $R^{B18}$ | H |
| $L_{A4935}$ | $R^{C3}$ | $R^{C3}$ | $R^{A3}$ | H |
| $L_{A4936}$ | $R^{C3}$ | $R^{C3}$ | $R^{A34}$ | H |
| $L_{A4937}$ | $R^{C5}$ | $R^{C5}$ | H | H |
| $L_{A4938}$ | $R^{C5}$ | $R^{C5}$ | $R^{B1}$ | H |
| $L_{A4939}$ | $R^{C5}$ | $R^{C5}$ | $R^{B3}$ | H |
| $L_{A4940}$ | $R^{C5}$ | $R^{C5}$ | $R^{B4}$ | H |
| $L_{A4941}$ | $R^{C5}$ | $R^{C5}$ | $R^{B7}$ | H |
| $L_{A4942}$ | $R^{C5}$ | $R^{C5}$ | $R^{B12}$ | H |
| $L_{A4943}$ | $R^{C5}$ | $R^{C5}$ | $R^{B18}$ | H |
| $L_{A4944}$ | $R^{C5}$ | $R^{C5}$ | $R^{A3}$ | H |
| $L_{A4945}$ | $R^{C5}$ | $R^{C5}$ | $R^{A34}$ | H |
| $L_{A4946}$ | $R^{C17}$ | $R^{C17}$ | H | H |
| $L_{A4947}$ | $R^{C17}$ | $R^{C17}$ | $R^{B1}$ | H |
| $L_{A4948}$ | $R^{C17}$ | $R^{C17}$ | $R^{B3}$ | H |
| $L_{A4949}$ | $R^{C17}$ | $R^{C17}$ | $R^{B4}$ | H |
| $L_{A4950}$ | $R^{C17}$ | $R^{C17}$ | $R^{B7}$ | H |
| $L_{A4951}$ | $R^{C17}$ | $R^{C17}$ | $R^{B12}$ | H |
| $L_{A4952}$ | $R^{C17}$ | $R^{C17}$ | $R^{B18}$ | H |
| $L_{A4953}$ | $R^{C17}$ | $R^{C17}$ | $R^{A3}$ | H |
| $L_{A4954}$ | $R^{C17}$ | $R^{C17}$ | $R^{A34}$ | H |
| $L_{A4955}$ | $R^{C19}$ | $R^{C19}$ | H | H |
| $L_{A4956}$ | $R^{C19}$ | $R^{C19}$ | $R^{B1}$ | H |
| $L_{A4957}$ | $R^{C19}$ | $R^{C19}$ | $R^{B3}$ | H |
| $L_{A4958}$ | $R^{C19}$ | $R^{C19}$ | $R^{B4}$ | H |
| $L_{A4959}$ | $R^{C19}$ | $R^{C19}$ | $R^{B7}$ | H |
| $L_{A4960}$ | $R^{C19}$ | $R^{C19}$ | $R^{B12}$ | H |
| $L_{A4961}$ | $R^{C19}$ | $R^{C19}$ | $R^{B18}$ | H |
| $L_{A4962}$ | $R^{C19}$ | $R^{C19}$ | $R^{A3}$ | H |
| $L_{A4963}$ | $R^{C19}$ | $R^{C19}$ | $R^{A34}$ | H |
| $L_{A4964}$ | $R^{C21}$ | $R^{C21}$ | H | H |
| $L_{A4965}$ | $R^{C21}$ | $R^{C21}$ | $R^{B1}$ | H |
| $L_{A4966}$ | $R^{C21}$ | $R^{C21}$ | $R^{B3}$ | H |
| $L_{A4967}$ | $R^{C21}$ | $R^{C21}$ | $R^{B4}$ | H |
| $L_{A4968}$ | $R^{C21}$ | $R^{C21}$ | $R^{B7}$ | H |
| $L_{A4969}$ | $R^{C21}$ | $R^{C21}$ | $R^{B12}$ | H |
| $L_{A4970}$ | $R^{C21}$ | $R^{C21}$ | $R^{B18}$ | H |
| $L_{A4971}$ | $R^{C21}$ | $R^{C21}$ | $R^{A3}$ | H |
| $L_{A4972}$ | $R^{C21}$ | $R^{C21}$ | $R^{A34}$ | H |
| $L_{A4973}$ | $R^{B1}$ | $R^{C1}$ | H | H |
| $L_{A4974}$ | $R^{B1}$ | $R^{C1}$ | $R^{B1}$ | H |
| $L_{A4975}$ | $R^{B1}$ | $R^{C1}$ | $R^{B3}$ | H |
| $L_{A4976}$ | $R^{B1}$ | $R^{C1}$ | $R^{B4}$ | H |
| $L_{A4977}$ | $R^{B1}$ | $R^{C1}$ | $R^{B7}$ | H |
| $L_{A4978}$ | $R^{B1}$ | $R^{C1}$ | $R^{B12}$ | H |
| $L_{A4979}$ | $R^{B1}$ | $R^{C1}$ | $R^{B18}$ | H |
| $L_{A4980}$ | $R^{B1}$ | $R^{C1}$ | $R^{A3}$ | H |
| $L_{A4981}$ | $R^{B1}$ | $R^{C1}$ | $R^{A34}$ | H |
| $L_{A4982}$ | $R^{B1}$ | $R^{C3}$ | H | H |
| $L_{A4983}$ | $R^{B1}$ | $R^{C3}$ | $R^{B1}$ | H |
| $L_{A4984}$ | $R^{B1}$ | $R^{C3}$ | $R^{B3}$ | H |
| $L_{A4985}$ | $R^{B1}$ | $R^{C3}$ | $R^{B4}$ | H |
| $L_{A4986}$ | $R^{B1}$ | $R^{C3}$ | $R^{B7}$ | H |
| $L_{A4987}$ | $R^{B1}$ | $R^{C3}$ | $R^{B12}$ | H |
| $L_{A4988}$ | $R^{B1}$ | $R^{C3}$ | $R^{B18}$ | H |
| $L_{A4989}$ | $R^{B1}$ | $R^{C3}$ | $R^{A3}$ | H |
| $L_{A4990}$ | $R^{B1}$ | $R^{C3}$ | $R^{A34}$ | H |
| $L_{A4991}$ | $R^{B1}$ | $R^{C5}$ | H | H |
| $L_{A4992}$ | $R^{B1}$ | $R^{C5}$ | $R^{B1}$ | H |
| $L_{A4993}$ | $R^{B1}$ | $R^{C5}$ | $R^{B3}$ | H |
| $L_{A4994}$ | $R^{B1}$ | $R^{C5}$ | $R^{B4}$ | H |
| $L_{A4995}$ | $R^{B1}$ | $R^{C5}$ | $R^{B7}$ | H |
| $L_{A4996}$ | $R^{B1}$ | $R^{C5}$ | $R^{B12}$ | H |
| $L_{A4997}$ | $R^{B1}$ | $R^{C5}$ | $R^{B18}$ | H |
| $L_{A4998}$ | $R^{B1}$ | $R^{C5}$ | $R^{A3}$ | H |
| $L_{A4999}$ | $R^{B1}$ | $R^{C5}$ | $R^{A34}$ | H |
| $L_{A1000}$ | $R^{B1}$ | $R^{C17}$ | H | H |
| $L_{A1001}$ | $R^{B1}$ | $R^{C17}$ | $R^{B1}$ | H |
| $L_{A1002}$ | $R^{B1}$ | $R^{C17}$ | $R^{B3}$ | H |
| $L_{A1003}$ | $R^{B1}$ | $R^{C17}$ | $R^{B4}$ | H |
| $L_{A1004}$ | $R^{B1}$ | $R^{C17}$ | $R^{B7}$ | H |
| $L_{A1005}$ | $R^{B1}$ | $R^{C17}$ | $R^{B12}$ | H |
| $L_{A1006}$ | $R^{B1}$ | $R^{C17}$ | $R^{B18}$ | H |

-continued

| Ligand | $R^1$ | $R^2$ | $R^3$ | $R^4$ |
|---|---|---|---|---|
| $L_{A1007}$ | $R^{B1}$ | $R^{C17}$ | $R^{A3}$ | H |
| $L_{A1008}$ | $R^{B1}$ | $R^{C17}$ | $R^{A34}$ | H |
| $L_{A1009}$ | $R^{B1}$ | $R^{C19}$ | H | H |
| $L_{A1010}$ | $R^{B1}$ | $R^{C19}$ | $R^{B1}$ | H |
| $L_{A1011}$ | $R^{B1}$ | $R^{C19}$ | $R^{B3}$ | H |
| $L_{A1012}$ | $R^{B1}$ | $R^{C19}$ | $R^{B4}$ | H |
| $L_{A1013}$ | $R^{B1}$ | $R^{C19}$ | $R^{B7}$ | H |
| $L_{A1014}$ | $R^{B1}$ | $R^{C19}$ | $R^{B12}$ | H |
| $L_{A1015}$ | $R^{B1}$ | $R^{C19}$ | $R^{B18}$ | H |
| $L_{A1016}$ | $R^{B1}$ | $R^{C19}$ | $R^{A3}$ | H |
| $L_{A1017}$ | $R^{B1}$ | $R^{C19}$ | $R^{A34}$ | H |
| $L_{A1018}$ | $R^{B1}$ | $R^{C21}$ | H | H |
| $L_{A1019}$ | $R^{B1}$ | $R^{C21}$ | $R^{B1}$ | H |
| $L_{A1020}$ | $R^{B1}$ | $R^{C21}$ | $R^{B3}$ | H |
| $L_{A1021}$ | $R^{B1}$ | $R^{C21}$ | $R^{B4}$ | H |
| $L_{A1022}$ | $R^{B1}$ | $R^{C21}$ | $R^{B7}$ | H |
| $L_{A1023}$ | $R^{B1}$ | $R^{C21}$ | $R^{B12}$ | H |
| $L_{A1024}$ | $R^{B1}$ | $R^{C21}$ | $R^{B18}$ | H |
| $L_{A1025}$ | $R^{B1}$ | $R^{C21}$ | $R^{A3}$ | H |
| $L_{A1026}$ | $R^{B1}$ | $R^{C21}$ | $R^{A34}$ | H |
| $L_{A1027}$ | $R^{B2}$ | $R^{C1}$ | H | H |
| $L_{A1028}$ | $R^{B2}$ | $R^{C1}$ | $R^{B1}$ | H |
| $L_{A1029}$ | $R^{B2}$ | $R^{C1}$ | $R^{B3}$ | H |
| $L_{A1030}$ | $R^{B2}$ | $R^{C1}$ | $R^{B4}$ | H |
| $L_{A1031}$ | $R^{B2}$ | $R^{C1}$ | $R^{B7}$ | H |
| $L_{A1032}$ | $R^{B2}$ | $R^{C1}$ | $R^{B12}$ | H |
| $L_{A1033}$ | $R^{B2}$ | $R^{C1}$ | $R^{B18}$ | H |
| $L_{A1034}$ | $R^{B2}$ | $R^{C1}$ | $R^{A3}$ | H |
| $L_{A1035}$ | $R^{B2}$ | $R^{C1}$ | $R^{A34}$ | H |
| $L_{A1036}$ | $R^{B2}$ | $R^{C3}$ | H | H |
| $L_{A1037}$ | $R^{B2}$ | $R^{C3}$ | $R^{B1}$ | H |
| $L_{A1038}$ | $R^{B2}$ | $R^{C3}$ | $R^{B3}$ | H |
| $L_{A1039}$ | $R^{B2}$ | $R^{C3}$ | $R^{B4}$ | H |
| $L_{A1040}$ | $R^{B2}$ | $R^{C3}$ | $R^{B7}$ | H |
| $L_{A1041}$ | $R^{B2}$ | $R^{C3}$ | $R^{B12}$ | H |
| $L_{A1042}$ | $R^{B2}$ | $R^{C3}$ | $R^{B18}$ | H |
| $L_{A1043}$ | $R^{B2}$ | $R^{C3}$ | $R^{A3}$ | H |
| $L_{A1044}$ | $R^{B2}$ | $R^{C3}$ | $R^{A34}$ | H |
| $L_{A1045}$ | $R^{B2}$ | $R^{C5}$ | H | H |
| $L_{A1046}$ | $R^{B2}$ | $R^{C5}$ | $R^{B1}$ | H |
| $L_{A1047}$ | $R^{B2}$ | $R^{C5}$ | $R^{B3}$ | H |
| $L_{A1048}$ | $R^{B2}$ | $R^{C5}$ | $R^{B4}$ | H |
| $L_{A1049}$ | $R^{B2}$ | $R^{C5}$ | $R^{B7}$ | H |
| $L_{A1050}$ | $R^{B2}$ | $R^{C5}$ | $R^{B12}$ | H |
| $L_{A1051}$ | $R^{B2}$ | $R^{C5}$ | $R^{B18}$ | H |
| $L_{A1052}$ | $R^{B2}$ | $R^{C5}$ | $R^{A3}$ | H |
| $L_{A1053}$ | $R^{B2}$ | $R^{C5}$ | $R^{A34}$ | H |
| $L_{A1054}$ | $R^{B2}$ | $R^{C17}$ | H | H |
| $L_{A1055}$ | $R^{B2}$ | $R^{C17}$ | $R^{B1}$ | H |
| $L_{A1056}$ | $R^{B2}$ | $R^{C17}$ | $R^{B3}$ | H |
| $L_{A1057}$ | $R^{B2}$ | $R^{C17}$ | $R^{B4}$ | H |
| $L_{A1058}$ | $R^{B2}$ | $R^{C17}$ | $R^{B7}$ | H |
| $L_{A1059}$ | $R^{B2}$ | $R^{C17}$ | $R^{B12}$ | H |
| $L_{A1060}$ | $R^{B2}$ | $R^{C17}$ | $R^{B18}$ | H |
| $L_{A1061}$ | $R^{B2}$ | $R^{C17}$ | $R^{A3}$ | H |
| $L_{A1062}$ | $R^{B2}$ | $R^{C17}$ | $R^{A34}$ | H |
| $L_{A1063}$ | $R^{B2}$ | $R^{C19}$ | H | H |
| $L_{A1064}$ | $R^{B2}$ | $R^{C19}$ | $R^{B1}$ | H |
| $L_{A1065}$ | $R^{B2}$ | $R^{C19}$ | $R^{B3}$ | H |
| $L_{A1066}$ | $R^{B2}$ | $R^{C19}$ | $R^{B4}$ | H |
| $L_{A1067}$ | $R^{B2}$ | $R^{C19}$ | $R^{B7}$ | H |
| $L_{A1068}$ | $R^{B2}$ | $R^{C19}$ | $R^{B12}$ | H |
| $L_{A1069}$ | $R^{B2}$ | $R^{C19}$ | $R^{B18}$ | H |
| $L_{A1070}$ | $R^{B2}$ | $R^{C19}$ | $R^{A3}$ | H |
| $L_{A1071}$ | $R^{B2}$ | $R^{C19}$ | $R^{A34}$ | H |
| $L_{A1072}$ | $R^{B2}$ | $R^{C21}$ | H | H |
| $L_{A1073}$ | $R^{B2}$ | $R^{C21}$ | $R^{B1}$ | H |
| $L_{A1074}$ | $R^{B2}$ | $R^{C21}$ | $R^{B3}$ | H |
| $L_{A1075}$ | $R^{B2}$ | $R^{C21}$ | $R^{B4}$ | H |
| $L_{A1076}$ | $R^{B2}$ | $R^{C21}$ | $R^{B7}$ | H |
| $L_{A1077}$ | $R^{B2}$ | $R^{C21}$ | $R^{B12}$ | H |
| $L_{A1078}$ | $R^{B2}$ | $R^{C21}$ | $R^{B18}$ | H |
| $L_{A1079}$ | $R^{B2}$ | $R^{C21}$ | $R^{A3}$ | H |
| $L_{A1080}$ | $R^{B2}$ | $R^{C21}$ | $R^{A34}$ | H |
| $L_{A1081}$ | $R^{C1}$ | $R^{C1}$ | H | $R^{B1}$ |
| $L_{A1082}$ | $R^{C1}$ | $R^{C1}$ | H | $R^{B3}$ |
| $L_{A1083}$ | $R^{C1}$ | $R^{C1}$ | H | $R^{B4}$ |

-continued

| Ligand | $R^1$ | $R^2$ | $R^3$ | $R^4$ |
|---|---|---|---|---|
| $L_{A1084}$ | $R^{C1}$ | $R^{C1}$ | H | $R^{B7}$ |
| $L_{A1085}$ | $R^{C1}$ | $R^{C1}$ | H | $R^{B12}$ |
| $L_{A1086}$ | $R^{C1}$ | $R^{C1}$ | H | $R^{B18}$ |
| $L_{A1087}$ | $R^{C1}$ | $R^{C1}$ | H | $R^{A3}$ |
| $L_{A1088}$ | $R^{C1}$ | $R^{C1}$ | H | $R^{A34}$ |
| $L_{A1089}$ | $R^{C3}$ | $R^{C3}$ | H | $R^{B1}$ |
| $L_{A1090}$ | $R^{C3}$ | $R^{C3}$ | H | $R^{B3}$ |
| $L_{A1091}$ | $R^{C3}$ | $R^{C3}$ | H | $R^{B4}$ |
| $L_{A1092}$ | $R^{C3}$ | $R^{C3}$ | H | $R^{B7}$ |
| $L_{A1093}$ | $R^{C3}$ | $R^{C3}$ | H | $R^{B12}$ |
| $L_{A1094}$ | $R^{C3}$ | $R^{C3}$ | H | $R^{B18}$ |
| $L_{A1095}$ | $R^{C3}$ | $R^{C3}$ | H | $R^{A3}$ |
| $L_{A1096}$ | $R^{C3}$ | $R^{C3}$ | H | $R^{A34}$ |
| $L_{A1097}$ | $R^{C5}$ | $R^{C5}$ | H | $R^{B1}$ |
| $L_{A1098}$ | $R^{C5}$ | $R^{C5}$ | H | $R^{B3}$ |
| $L_{A1099}$ | $R^{C5}$ | $R^{C5}$ | H | $R^{B4}$ |
| $L_{A1100}$ | $R^{C5}$ | $R^{C5}$ | H | $R^{B7}$ |
| $L_{A1101}$ | $R^{C5}$ | $R^{C5}$ | H | $R^{B12}$ |
| $L_{A1102}$ | $R^{C5}$ | $R^{C5}$ | H | $R^{B18}$ |
| $L_{A1103}$ | $R^{C5}$ | $R^{C5}$ | H | $R^{A3}$ |
| $L_{A1104}$ | $R^{C5}$ | $R^{C5}$ | H | $R^{A34}$ |
| $L_{A1105}$ | $R^{C17}$ | $R^{C17}$ | H | $R^{B1}$ |
| $L_{A1106}$ | $R^{C17}$ | $R^{C17}$ | H | $R^{B3}$ |
| $L_{A1107}$ | $R^{C17}$ | $R^{C17}$ | H | $R^{B4}$ |
| $L_{A1108}$ | $R^{C17}$ | $R^{C17}$ | H | $R^{B7}$ |
| $L_{A1109}$ | $R^{C17}$ | $R^{C17}$ | H | $R^{B12}$ |
| $L_{A1110}$ | $R^{C17}$ | $R^{C17}$ | H | $R^{B18}$ |
| $L_{A1111}$ | $R^{C17}$ | $R^{C17}$ | H | $R^{A3}$ |
| $L_{A1112}$ | $R^{C17}$ | $R^{C17}$ | H | $R^{A34}$ |
| $L_{A1113}$ | $R^{C19}$ | $R^{C19}$ | H | $R^{B1}$ |
| $L_{A1114}$ | $R^{C19}$ | $R^{C19}$ | H | $R^{B3}$ |
| $L_{A1115}$ | $R^{C19}$ | $R^{C19}$ | H | $R^{B4}$ |
| $L_{A1116}$ | $R^{C19}$ | $R^{C19}$ | H | $R^{B7}$ |
| $L_{A1117}$ | $R^{C19}$ | $R^{C19}$ | H | $R^{B12}$ |
| $L_{A1118}$ | $R^{C19}$ | $R^{C19}$ | H | $R^{B18}$ |
| $L_{A1119}$ | $R^{C19}$ | $R^{C19}$ | H | $R^{A3}$ |
| $L_{A1120}$ | $R^{C19}$ | $R^{C19}$ | H | $R^{A34}$ |
| $L_{A1121}$ | $R^{C21}$ | $R^{C21}$ | H | $R^{B1}$ |
| $L_{A1122}$ | $R^{C21}$ | $R^{C21}$ | H | $R^{B3}$ |
| $L_{A1123}$ | $R^{C21}$ | $R^{C21}$ | H | $R^{B4}$ |
| $L_{A1124}$ | $R^{C21}$ | $R^{C21}$ | H | $R^{B7}$ |
| $L_{A1125}$ | $R^{C21}$ | $R^{C21}$ | H | $R^{B12}$ |
| $L_{A1126}$ | $R^{C21}$ | $R^{C21}$ | H | $R^{B18}$ |
| $L_{A1127}$ | $R^{C21}$ | $R^{C21}$ | H | $R^{A3}$ |
| $L_{A1128}$ | $R^{C21}$ | $R^{C21}$ | H | $R^{A34}$ |
| $L_{A1129}$ | $R^{B1}$ | $R^{C1}$ | H | $R^{B1}$ |
| $L_{A1130}$ | $R^{B1}$ | $R^{C1}$ | H | $R^{B3}$ |
| $L_{A1131}$ | $R^{B1}$ | $R^{C1}$ | H | $R^{B4}$ |
| $L_{A1132}$ | $R^{B1}$ | $R^{C1}$ | H | $R^{B7}$ |
| $L_{A1133}$ | $R^{B1}$ | $R^{C1}$ | H | $R^{B12}$ |
| $L_{A1134}$ | $R^{B1}$ | $R^{C1}$ | H | $R^{B18}$ |
| $L_{A1135}$ | $R^{B1}$ | $R^{C1}$ | H | $R^{A3}$ |
| $L_{A1136}$ | $R^{B1}$ | $R^{C1}$ | H | $R^{A34}$ |
| $L_{A1137}$ | $R^{B1}$ | $R^{C3}$ | H | $R^{B1}$ |
| $L_{A1138}$ | $R^{B1}$ | $R^{C3}$ | H | $R^{B3}$ |
| $L_{A1139}$ | $R^{B1}$ | $R^{C3}$ | H | $R^{B4}$ |
| $L_{A1140}$ | $R^{B1}$ | $R^{C3}$ | H | $R^{B7}$ |
| $L_{A1141}$ | $R^{B1}$ | $R^{C3}$ | H | $R^{B12}$ |
| $L_{A1142}$ | $R^{B1}$ | $R^{C3}$ | H | $R^{B18}$ |
| $L_{A1143}$ | $R^{B1}$ | $R^{C3}$ | H | $R^{A3}$ |
| $L_{A1144}$ | $R^{B1}$ | $R^{C3}$ | H | $R^{A34}$ |
| $L_{A1145}$ | $R^{B1}$ | $R^{C5}$ | H | $R^{B1}$ |
| $L_{A1146}$ | $R^{B1}$ | $R^{C5}$ | H | $R^{B3}$ |
| $L_{A1147}$ | $R^{B1}$ | $R^{C5}$ | H | $R^{B4}$ |
| $L_{A1148}$ | $R^{B1}$ | $R^{C5}$ | H | $R^{B7}$ |
| $L_{A1149}$ | $R^{B1}$ | $R^{C5}$ | H | $R^{B12}$ |
| $L_{A1150}$ | $R^{B1}$ | $R^{C5}$ | H | $R^{B18}$ |
| $L_{A1151}$ | $R^{B1}$ | $R^{C5}$ | H | $R^{A3}$ |
| $L_{A1152}$ | $R^{B1}$ | $R^{C5}$ | H | $R^{A34}$ |
| $L_{A1153}$ | $R^{B1}$ | $R^{C17}$ | H | $R^{B1}$ |
| $L_{A1154}$ | $R^{B1}$ | $R^{C17}$ | H | $R^{B3}$ |
| $L_{A1155}$ | $R^{B1}$ | $R^{C17}$ | H | $R^{B4}$ |
| $L_{A1156}$ | $R^{B1}$ | $R^{C17}$ | H | $R^{B7}$ |
| $L_{A1157}$ | $R^{B1}$ | $R^{C17}$ | H | $R^{B12}$ |
| $L_{A1158}$ | $R^{B1}$ | $R^{C17}$ | H | $R^{B18}$ |
| $L_{A1159}$ | $R^{B1}$ | $R^{C17}$ | H | $R^{A3}$ |
| $L_{A1160}$ | $R^{B1}$ | $R^{C17}$ | H | $R^{A34}$ |

-continued

| Ligand | $R^1$ | $R^2$ | $R^3$ | $R^4$ |
|---|---|---|---|---|
| $L_{A1161}$ | $R^{B1}$ | $R^{C19}$ | H | $R^{B1}$ |
| $L_{A1162}$ | $R^{B1}$ | $R^{C19}$ | H | $R^{B3}$ |
| $L_{A1163}$ | $R^{B1}$ | $R^{C19}$ | H | $R^{B4}$ |
| $L_{A1164}$ | $R^{B1}$ | $R^{C19}$ | H | $R^{B7}$ |
| $L_{A1165}$ | $R^{B1}$ | $R^{C19}$ | H | $R^{B12}$ |
| $L_{A1166}$ | $R^{B1}$ | $R^{C19}$ | H | $R^{B18}$ |
| $L_{A1167}$ | $R^{B1}$ | $R^{C19}$ | H | $R^{A3}$ |
| $L_{A1168}$ | $R^{B1}$ | $R^{C19}$ | H | $R^{A34}$ |
| $L_{A1169}$ | $R^{B1}$ | $R^{C21}$ | H | $R^{B1}$ |
| $L_{A1170}$ | $R^{B1}$ | $R^{C21}$ | H | $R^{B3}$ |
| $L_{A1171}$ | $R^{B1}$ | $R^{C21}$ | H | $R^{B4}$ |
| $L_{A1172}$ | $R^{B1}$ | $R^{C21}$ | H | $R^{B7}$ |
| $L_{A1173}$ | $R^{B1}$ | $R^{C21}$ | H | $R^{B12}$ |
| $L_{A1174}$ | $R^{B1}$ | $R^{C21}$ | H | $R^{B18}$ |
| $L_{A1175}$ | $R^{B1}$ | $R^{C21}$ | H | $R^{A3}$ |
| $L_{A1176}$ | $R^{B1}$ | $R^{C21}$ | H | $R^{A34}$ |
| $L_{A1177}$ | $R^{B2}$ | $R^{C1}$ | H | $R^{B1}$ |
| $L_{A1178}$ | $R^{B2}$ | $R^{C1}$ | H | $R^{B3}$ |
| $L_{A1179}$ | $R^{B2}$ | $R^{C1}$ | H | $R^{B4}$ |
| $L_{A1180}$ | $R^{B2}$ | $R^{C1}$ | H | $R^{B7}$ |
| $L_{A1181}$ | $R^{B2}$ | $R^{C1}$ | H | $R^{B12}$ |
| $L_{A1182}$ | $R^{B2}$ | $R^{C1}$ | H | $R^{B18}$ |
| $L_{A1183}$ | $R^{B2}$ | $R^{C1}$ | H | $R^{A3}$ |
| $L_{A1184}$ | $R^{B2}$ | $R^{C1}$ | H | $R^{A34}$ |
| $L_{A1185}$ | $R^{B2}$ | $R^{C3}$ | H | $R^{B1}$ |
| $L_{A1186}$ | $R^{B2}$ | $R^{C3}$ | H | $R^{B3}$ |
| $L_{A1187}$ | $R^{B2}$ | $R^{C3}$ | H | $R^{B4}$ |
| $L_{A1188}$ | $R^{B2}$ | $R^{C3}$ | H | $R^{B7}$ |
| $L_{A1189}$ | $R^{B2}$ | $R^{C3}$ | H | $R^{B12}$ |
| $L_{A1190}$ | $R^{B2}$ | $R^{C3}$ | H | $R^{B18}$ |
| $L_{A1191}$ | $R^{B2}$ | $R^{C3}$ | H | $R^{A3}$ |
| $L_{A1192}$ | $R^{B2}$ | $R^{C3}$ | H | $R^{A34}$ |
| $L_{A1193}$ | $R^{B2}$ | $R^{C5}$ | H | $R^{B1}$ |
| $L_{A1194}$ | $R^{B2}$ | $R^{C5}$ | H | $R^{B3}$ |
| $L_{A1195}$ | $R^{B2}$ | $R^{C5}$ | H | $R^{B4}$ |
| $L_{A1196}$ | $R^{B2}$ | $R^{C5}$ | H | $R^{B7}$ |
| $L_{A1197}$ | $R^{B2}$ | $R^{C5}$ | H | $R^{B12}$ |
| $L_{A1198}$ | $R^{B2}$ | $R^{C5}$ | H | $R^{B18}$ |
| $L_{A1199}$ | $R^{B2}$ | $R^{C5}$ | H | $R^{A3}$ |
| $L_{A1200}$ | $R^{B2}$ | $R^{C5}$ | H | $R^{A34}$ |
| $L_{A1201}$ | $R^{B2}$ | $R^{C17}$ | H | $R^{B1}$ |
| $L_{A1202}$ | $R^{B2}$ | $R^{C17}$ | H | $R^{B3}$ |
| $L_{A1203}$ | $R^{B2}$ | $R^{C17}$ | H | $R^{B4}$ |
| $L_{A1204}$ | $R^{B2}$ | $R^{C17}$ | H | $R^{B7}$ |
| $L_{A1205}$ | $R^{B2}$ | $R^{C17}$ | H | $R^{B12}$ |
| $L_{A1206}$ | $R^{B2}$ | $R^{C17}$ | H | $R^{B18}$ |
| $L_{A1207}$ | $R^{B2}$ | $R^{C17}$ | H | $R^{A3}$ |
| $L_{A1208}$ | $R^{B2}$ | $R^{C17}$ | H | $R^{A34}$ |
| $L_{A1209}$ | $R^{B2}$ | $R^{C19}$ | H | $R^{B1}$ |
| $L_{A1210}$ | $R^{B2}$ | $R^{C19}$ | H | $R^{B3}$ |
| $L_{A1211}$ | $R^{B2}$ | $R^{C19}$ | H | $R^{B4}$ |
| $L_{A1212}$ | $R^{B2}$ | $R^{C19}$ | H | $R^{B7}$ |
| $L_{A1213}$ | $R^{B2}$ | $R^{C19}$ | H | $R^{B12}$ |
| $L_{A1214}$ | $R^{B2}$ | $R^{C19}$ | H | $R^{B18}$ |
| $L_{A1215}$ | $R^{B2}$ | $R^{C19}$ | H | $R^{A3}$ |
| $L_{A1216}$ | $R^{B2}$ | $R^{C19}$ | H | $R^{A34}$ |
| $L_{A1217}$ | $R^{B2}$ | $R^{C21}$ | H | $R^{B1}$ |
| $L_{A1218}$ | $R^{B2}$ | $R^{C21}$ | H | $R^{B3}$ |
| $L_{A1219}$ | $R^{B2}$ | $R^{C21}$ | H | $R^{B4}$ |
| $L_{A1220}$ | $R^{B2}$ | $R^{C21}$ | H | $R^{B7}$ |
| $L_{A1221}$ | $R^{B2}$ | $R^{C21}$ | H | $R^{B12}$ |
| $L_{A1222}$ | $R^{B2}$ | $R^{C21}$ | H | $R^{B18}$ |
| $L_{A1223}$ | $R^{B2}$ | $R^{C21}$ | H | $R^{A3}$ |
| $L_{A1224}$ | $R^{B2}$ | $R^{C21}$ | H | $R^{A34}$ |

$L_{A1225}$ through $L_{A1326}$ that are based on a structure of Formula V,

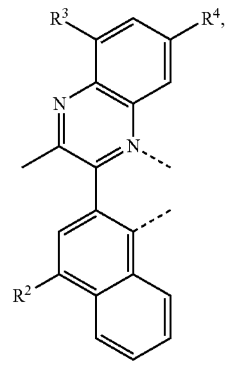

in which $R^2$, $R^3$, and $R^4$ are defined as:

| Ligand | $R^2$ | $R^3$ | $R^4$ |
|---|---|---|---|
| $L_{A1225}$ | $R^{C1}$ | H | H |
| $L_{A1226}$ | $R^{C1}$ | $R^{B1}$ | H |
| $L_{A1227}$ | $R^{C1}$ | $R^{B3}$ | H |
| $L_{A1228}$ | $R^{C1}$ | $R^{B4}$ | H |
| $L_{A1229}$ | $R^{C1}$ | $R^{B7}$ | H |
| $L_{A1230}$ | $R^{C1}$ | $R^{B12}$ | H |
| $L_{A1231}$ | $R^{C1}$ | $R^{B18}$ | H |
| $L_{A1232}$ | $R^{C1}$ | $R^{A3}$ | H |
| $L_{A1233}$ | $R^{C1}$ | $R^{A34}$ | H |
| $L_{A1234}$ | $R^{C3}$ | H | H |
| $L_{A1235}$ | $R^{C3}$ | $R^{B1}$ | H |
| $L_{A1236}$ | $R^{C3}$ | $R^{B3}$ | H |
| $L_{A1237}$ | $R^{C3}$ | $R^{B4}$ | H |
| $L_{A1238}$ | $R^{C3}$ | $R^{B7}$ | H |
| $L_{A1239}$ | $R^{C3}$ | $R^{B12}$ | H |
| $L_{A1240}$ | $R^{C3}$ | $R^{B18}$ | H |
| $L_{A1241}$ | $R^{C3}$ | $R^{A3}$ | H |
| $L_{A1242}$ | $R^{C3}$ | $R^{A34}$ | H |
| $L_{A1243}$ | $R^{C5}$ | H | H |
| $L_{A1244}$ | $R^{C5}$ | $R^{B1}$ | H |
| $L_{A1245}$ | $R^{C5}$ | $R^{B3}$ | H |
| $L_{A1246}$ | $R^{C5}$ | $R^{B4}$ | H |
| $L_{A1247}$ | $R^{C5}$ | $R^{B7}$ | H |
| $L_{A1248}$ | $R^{C5}$ | $R^{B12}$ | H |
| $L_{A1249}$ | $R^{C5}$ | $R^{B18}$ | H |
| $L_{A1250}$ | $R^{C5}$ | $R^{A3}$ | H |
| $L_{A1251}$ | $R^{C5}$ | $R^{A34}$ | H |
| $L_{A1252}$ | $R^{C17}$ | H | H |
| $L_{A1253}$ | $R^{C17}$ | $R^{B1}$ | H |
| $L_{A1254}$ | $R^{C17}$ | $R^{B3}$ | H |
| $L_{A1255}$ | $R^{C17}$ | $R^{B4}$ | H |
| $L_{A1256}$ | $R^{C17}$ | $R^{B7}$ | H |
| $L_{A1257}$ | $R^{C17}$ | $R^{B12}$ | H |
| $L_{A1258}$ | $R^{C17}$ | $R^{B18}$ | H |
| $L_{A1259}$ | $R^{C17}$ | $R^{A3}$ | H |
| $L_{A1260}$ | $R^{C17}$ | $R^{A34}$ | H |
| $L_{A1261}$ | $R^{C19}$ | H | H |
| $L_{A1262}$ | $R^{C19}$ | $R^{B1}$ | H |
| $L_{A1263}$ | $R^{C19}$ | $R^{B3}$ | H |
| $L_{A1264}$ | $R^{C19}$ | $R^{B4}$ | H |
| $L_{A1265}$ | $R^{C19}$ | $R^{B7}$ | H |
| $L_{A1266}$ | $R^{C19}$ | $R^{B12}$ | H |
| $L_{A1267}$ | $R^{C19}$ | $R^{B18}$ | H |
| $L_{A1268}$ | $R^{C19}$ | $R^{A3}$ | H |
| $L_{A1269}$ | $R^{C19}$ | $R^{A34}$ | H |
| $L_{A1270}$ | $R^{C21}$ | H | H |
| $L_{A1271}$ | $R^{C21}$ | $R^{B1}$ | H |
| $L_{A1272}$ | $R^{C21}$ | $R^{B3}$ | H |
| $L_{A1273}$ | $R^{C21}$ | $R^{B4}$ | H |
| $L_{A1274}$ | $R^{C21}$ | $R^{B7}$ | H |
| $L_{A1275}$ | $R^{C21}$ | $R^{B12}$ | H |
| $L_{A1276}$ | $R^{C21}$ | $R^{B18}$ | H |
| $L_{A1277}$ | $R^{C21}$ | $R^{A3}$ | H |
| $L_{A1278}$ | $R^{C21}$ | $R^{A34}$ | H |
| $L_{A1279}$ | $R^{C1}$ | $R^{B1}$ | H |
| $L_{A1280}$ | $R^{C1}$ | $R^{B3}$ | H |

| Ligand | $R^2$ | $R^3$ | $R^4$ |
|---|---|---|---|
| $L_{A1281}$ | $R^{C1}$ | $R^{B4}$ | H |
| $L_{A1282}$ | $R^{C1}$ | $R^{B7}$ | H |
| $L_{A1283}$ | $R^{C1}$ | $R^{B12}$ | H |
| $L_{A1284}$ | $R^{C1}$ | $R^{B18}$ | H |
| $L_{A1285}$ | $R^{C1}$ | $R^{A3}$ | H |
| $L_{A1286}$ | $R^{C1}$ | $R^{A34}$ | H |
| $L_{A1287}$ | $R^{C3}$ | $R^{B1}$ | H |
| $L_{A1288}$ | $R^{C3}$ | $R^{B3}$ | H |
| $L_{A1289}$ | $R^{C3}$ | $R^{B4}$ | H |
| $L_{A1290}$ | $R^{C3}$ | $R^{B7}$ | H |
| $L_{A1291}$ | $R^{C3}$ | $R^{B12}$ | H |
| $L_{A1292}$ | $R^{C3}$ | $R^{B18}$ | H |
| $L_{A1293}$ | $R^{C3}$ | $R^{A3}$ | H |
| $L_{A1294}$ | $R^{C3}$ | $R^{A34}$ | H |
| $L_{A1295}$ | $R^{C5}$ | $R^{B1}$ | H |
| $L_{A1296}$ | $R^{C5}$ | $R^{B3}$ | H |
| $L_{A1297}$ | $R^{C5}$ | $R^{B4}$ | H |
| $L_{A1298}$ | $R^{C5}$ | $R^{B7}$ | H |
| $L_{A1299}$ | $R^{C5}$ | $R^{B12}$ | H |
| $L_{A1300}$ | $R^{C5}$ | $R^{B18}$ | H |
| $L_{A1301}$ | $R^{C5}$ | $R^{A3}$ | H |
| $L_{A1302}$ | $R^{C5}$ | $R^{A34}$ | H |
| $L_{A1303}$ | $R^{C17}$ | $R^{B1}$ | H |
| $L_{A1304}$ | $R^{C17}$ | $R^{B3}$ | H |
| $L_{A1305}$ | $R^{C17}$ | $R^{B4}$ | H |
| $L_{A1306}$ | $R^{C17}$ | $R^{B7}$ | H |
| $L_{A1307}$ | $R^{C17}$ | $R^{B12}$ | H |
| $L_{A1308}$ | $R^{C17}$ | $R^{B18}$ | H |
| $L_{A1309}$ | $R^{C17}$ | $R^{A3}$ | H |
| $L_{A1310}$ | $R^{C17}$ | $R^{A34}$ | H |
| $L_{A1311}$ | $R^{C19}$ | $R^{B1}$ | H |
| $L_{A1312}$ | $R^{C19}$ | $R^{B3}$ | H |
| $L_{A1313}$ | $R^{C19}$ | $R^{B4}$ | H |
| $L_{A1314}$ | $R^{C19}$ | $R^{B7}$ | H |
| $L_{A1315}$ | $R^{C19}$ | $R^{B12}$ | H |
| $L_{A1316}$ | $R^{C19}$ | $R^{B18}$ | H |
| $L_{A1317}$ | $R^{C19}$ | $R^{A3}$ | H |
| $L_{A1318}$ | $R^{C19}$ | $R^{A34}$ | H |
| $L_{A1319}$ | $R^{C21}$ | $R^{B1}$ | H |
| $L_{A1320}$ | $R^{C21}$ | $R^{B3}$ | H |
| $L_{A1321}$ | $R^{C21}$ | $R^{B4}$ | H |
| $L_{A1322}$ | $R^{C21}$ | $R^{B7}$ | H |
| $L_{A1323}$ | $R^{C21}$ | $R^{B12}$ | H |
| $L_{A1324}$ | $R^{C21}$ | $R^{B18}$ | H |
| $L_{A1325}$ | $R^{C21}$ | $R^{A3}$ | H |
| $L_{A1326}$ | $R^{C21}$ | $R^{A34}$ | H |

$L_{A1327}$ through $L_{A1428}$ that are based on a structure of Formula VI,

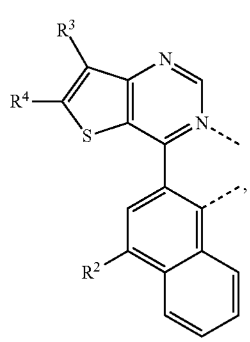

in which $R^2$, $R^3$, and $R^4$ are defined as:

| Ligand | $R^2$ | $R^3$ | $R^4$ |
|---|---|---|---|
| $L_{A1327}$ | $R^{C1}$ | H | H |
| $L_{A1328}$ | $R^{C1}$ | $R^{B1}$ | H |

| Ligand | $R^2$ | $R^3$ | $R^4$ |
|---|---|---|---|
| $L_{A1329}$ | $R^{C1}$ | $R^{B3}$ | H |
| $L_{A1330}$ | $R^{C1}$ | $R^{B4}$ | H |
| $L_{A1331}$ | $R^{C1}$ | $R^{B7}$ | H |
| $L_{A1332}$ | $R^{C1}$ | $R^{B12}$ | H |
| $L_{A1333}$ | $R^{C1}$ | $R^{B18}$ | H |
| $L_{A1334}$ | $R^{C1}$ | $R^{A3}$ | H |
| $L_{A1335}$ | $R^{C1}$ | $R^{A34}$ | H |
| $L_{A1336}$ | $R^{C3}$ | H | H |
| $L_{A1337}$ | $R^{C3}$ | $R^{B1}$ | H |
| $L_{A1338}$ | $R^{C3}$ | $R^{B3}$ | H |
| $L_{A1339}$ | $R^{C3}$ | $R^{B4}$ | H |
| $L_{A1340}$ | $R^{C3}$ | $R^{B7}$ | H |
| $L_{A1341}$ | $R^{C3}$ | $R^{B12}$ | H |
| $L_{A1342}$ | $R^{C3}$ | $R^{B18}$ | H |
| $L_{A1343}$ | $R^{C3}$ | $R^{A3}$ | H |
| $L_{A1344}$ | $R^{C3}$ | $R^{A34}$ | H |
| $L_{A1345}$ | $R^{C5}$ | H | H |
| $L_{A1346}$ | $R^{C5}$ | $R^{B1}$ | H |
| $L_{A1347}$ | $R^{C5}$ | $R^{B3}$ | H |
| $L_{A1348}$ | $R^{C5}$ | $R^{B4}$ | H |
| $L_{A1349}$ | $R^{C5}$ | $R^{B7}$ | H |
| $L_{A1350}$ | $R^{C5}$ | $R^{B12}$ | H |
| $L_{A1351}$ | $R^{C5}$ | $R^{B18}$ | H |
| $L_{A1352}$ | $R^{C5}$ | $R^{A3}$ | H |
| $L_{A1353}$ | $R^{C5}$ | $R^{A34}$ | H |
| $L_{A1354}$ | $R^{C17}$ | H | H |
| $L_{A1355}$ | $R^{C17}$ | $R^{B1}$ | H |
| $L_{A1356}$ | $R^{C17}$ | $R^{B3}$ | H |
| $L_{A1357}$ | $R^{C17}$ | $R^{B4}$ | H |
| $L_{A1358}$ | $R^{C17}$ | $R^{B7}$ | H |
| $L_{A1359}$ | $R^{C17}$ | $R^{B12}$ | H |
| $L_{A1360}$ | $R^{C17}$ | $R^{B18}$ | H |
| $L_{A1361}$ | $R^{C17}$ | $R^{A3}$ | H |
| $L_{A1362}$ | $R^{C17}$ | $R^{A34}$ | H |
| $L_{A1363}$ | $R^{C19}$ | H | H |
| $L_{A1364}$ | $R^{C19}$ | $R^{B1}$ | H |
| $L_{A1365}$ | $R^{C19}$ | $R^{B3}$ | H |
| $L_{A1366}$ | $R^{C19}$ | $R^{B4}$ | H |
| $L_{A1367}$ | $R^{C19}$ | $R^{B7}$ | H |
| $L_{A1368}$ | $R^{C19}$ | $R^{B12}$ | H |
| $L_{A1369}$ | $R^{C19}$ | $R^{B18}$ | H |
| $L_{A1370}$ | $R^{C19}$ | $R^{A3}$ | H |
| $L_{A1371}$ | $R^{C19}$ | $R^{A34}$ | H |
| $L_{A1372}$ | $R^{C21}$ | H | H |
| $L_{A1373}$ | $R^{C21}$ | $R^{B1}$ | H |
| $L_{A1374}$ | $R^{C21}$ | $R^{B3}$ | H |
| $L_{A1375}$ | $R^{C21}$ | $R^{B4}$ | H |
| $L_{A1376}$ | $R^{C21}$ | $R^{B7}$ | H |
| $L_{A1377}$ | $R^{C21}$ | $R^{B12}$ | H |
| $L_{A1378}$ | $R^{C21}$ | $R^{B18}$ | H |
| $L_{A1379}$ | $R^{C21}$ | $R^{A3}$ | H |
| $L_{A1380}$ | $R^{C21}$ | $R^{A34}$ | H |
| $L_{A1381}$ | $R^{C1}$ | $R^{B1}$ | H |
| $L_{A1382}$ | $R^{C1}$ | $R^{B3}$ | H |
| $L_{A1383}$ | $R^{C1}$ | $R^{B4}$ | H |
| $L_{A1384}$ | $R^{C1}$ | $R^{B7}$ | H |
| $L_{A1385}$ | $R^{C1}$ | $R^{B12}$ | H |
| $L_{A1386}$ | $R^{C1}$ | $R^{B18}$ | H |
| $L_{A1387}$ | $R^{C1}$ | $R^{A3}$ | H |
| $L_{A1388}$ | $R^{C1}$ | $R^{A34}$ | H |
| $L_{A1389}$ | $R^{C3}$ | $R^{B1}$ | H |
| $L_{A1390}$ | $R^{C3}$ | $R^{B3}$ | H |
| $L_{A1391}$ | $R^{C3}$ | $R^{B4}$ | H |
| $L_{A1392}$ | $R^{C3}$ | $R^{B7}$ | H |
| $L_{A1393}$ | $R^{C3}$ | $R^{B12}$ | H |
| $L_{A1394}$ | $R^{C3}$ | $R^{B18}$ | H |
| $L_{A1395}$ | $R^{C3}$ | $R^{A3}$ | H |
| $L_{A1396}$ | $R^{C3}$ | $R^{A34}$ | H |
| $L_{A1397}$ | $R^{C5}$ | $R^{B1}$ | H |
| $L_{A1398}$ | $R^{C5}$ | $R^{B3}$ | H |
| $L_{A1399}$ | $R^{C5}$ | $R^{B4}$ | H |
| $L_{A1400}$ | $R^{C5}$ | $R^{B7}$ | H |
| $L_{A1401}$ | $R^{C5}$ | $R^{B12}$ | H |
| $L_{A1402}$ | $R^{C5}$ | $R^{B18}$ | H |
| $L_{A1403}$ | $R^{C5}$ | $R^{A3}$ | H |
| $L_{A1404}$ | $R^{C5}$ | $R^{A34}$ | H |
| $L_{A1405}$ | $R^{C17}$ | $R^{B1}$ | H |

-continued

| Ligand | $R^2$ | $R^3$ | $R^4$ |
|---|---|---|---|
| $L_{A1406}$ | $R^{C17}$ | $R^{B3}$ | H |
| $L_{A1407}$ | $R^{C17}$ | $R^{B4}$ | H |
| $L_{A1408}$ | $R^{C17}$ | $R^{B7}$ | H |
| $L_{A1409}$ | $R^{C17}$ | $R^{B12}$ | H |
| $L_{A1410}$ | $R^{C17}$ | $R^{B18}$ | H |
| $L_{A1411}$ | $R^{C17}$ | $R^{A3}$ | H |
| $L_{A1412}$ | $R^{C17}$ | $R^{A34}$ | H |
| $L_{A1413}$ | $R^{C19}$ | $R^{B1}$ | H |
| $L_{A1414}$ | $R^{C19}$ | $R^{B3}$ | H |
| $L_{A1415}$ | $R^{C19}$ | $R^{B4}$ | H |
| $L_{A1416}$ | $R^{C19}$ | $R^{B7}$ | H |
| $L_{A1417}$ | $R^{C19}$ | $R^{B12}$ | H |
| $L_{A1418}$ | $R^{C19}$ | $R^{B18}$ | H |
| $L_{A1419}$ | $R^{C19}$ | $R^{A3}$ | H |
| $L_{A1420}$ | $R^{C19}$ | $R^{A34}$ | H |
| $L_{A1421}$ | $R^{C21}$ | $R^{B1}$ | H |
| $L_{A1422}$ | $R^{C21}$ | $R^{B3}$ | H |
| $L_{A1423}$ | $R^{C21}$ | $R^{B4}$ | H |
| $L_{A1424}$ | $R^{C21}$ | $R^{B7}$ | H |
| $L_{A1425}$ | $R^{C21}$ | $R^{B12}$ | H |
| $L_{A1426}$ | $R^{C21}$ | $R^{B18}$ | H |
| $L_{A1427}$ | $R^{C21}$ | $R^{A3}$ | H |
| $L_{A1428}$ | $R^{C21}$ | $R^{A34}$ | H |

$L_{A1429}$ through $L_{A1530}$ that are based on a structure of Formula VII,

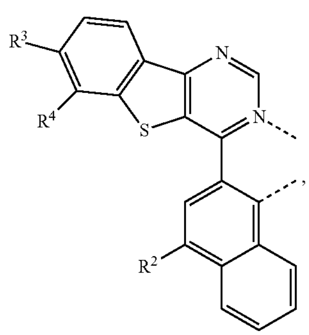

in which $R^2$, $R^3$, and $R^4$ are defined as:

| Ligand | $R^2$ | $R^3$ | $R^4$ |
|---|---|---|---|
| $L_{A1429}$ | $R^{C1}$ | H | H |
| $L_{A1430}$ | $R^{C1}$ | $R^{B1}$ | H |
| $L_{A1431}$ | $R^{C1}$ | $R^{B3}$ | H |
| $L_{A1432}$ | $R^{C1}$ | $R^{B4}$ | H |
| $L_{A1433}$ | $R^{C1}$ | $R^{B7}$ | H |
| $L_{A1434}$ | $R^{C1}$ | $R^{B12}$ | H |
| $L_{A1435}$ | $R^{C1}$ | $R^{B18}$ | H |
| $L_{A1436}$ | $R^{C1}$ | $R^{A3}$ | H |
| $L_{A1437}$ | $R^{C1}$ | $R^{A34}$ | H |
| $L_{A1438}$ | $R^{C3}$ | H | H |
| $L_{A1439}$ | $R^{C3}$ | $R^{B1}$ | H |
| $L_{A1440}$ | $R^{C3}$ | $R^{B3}$ | H |
| $L_{A1441}$ | $R^{C3}$ | $R^{B4}$ | H |
| $L_{A1442}$ | $R^{C3}$ | $R^{B7}$ | H |
| $L_{A1443}$ | $R^{C3}$ | $R^{B12}$ | H |
| $L_{A1444}$ | $R^{C3}$ | $R^{B18}$ | H |
| $L_{A1445}$ | $R^{C3}$ | $R^{A3}$ | H |
| $L_{A1446}$ | $R^{C3}$ | $R^{A34}$ | H |
| $L_{A1447}$ | $R^{C5}$ | H | H |
| $L_{A1448}$ | $R^{C5}$ | $R^{B1}$ | H |
| $L_{A1449}$ | $R^{C5}$ | $R^{B3}$ | H |
| $L_{A1450}$ | $R^{C5}$ | $R^{B4}$ | H |
| $L_{A1451}$ | $R^{C5}$ | $R^{B7}$ | H |
| $L_{A1452}$ | $R^{C5}$ | $R^{B12}$ | H |
| $L_{A1453}$ | $R^{C5}$ | $R^{B18}$ | H |
| $L_{A1454}$ | $R^{C5}$ | $R^{A3}$ | H |
| $L_{A1455}$ | $R^{C5}$ | $R^{A34}$ | H |
| $L_{A1456}$ | $R^{C17}$ | H | H |

-continued

| Ligand | $R^2$ | $R^3$ | $R^4$ |
|---|---|---|---|
| $L_{A1457}$ | $R^{C17}$ | $R^{B1}$ | H |
| $L_{A1458}$ | $R^{C17}$ | $R^{B3}$ | H |
| $L_{A1459}$ | $R^{C17}$ | $R^{B4}$ | H |
| $L_{A1460}$ | $R^{C17}$ | $R^{B7}$ | H |
| $L_{A1461}$ | $R^{C17}$ | $R^{B12}$ | H |
| $L_{A1462}$ | $R^{C17}$ | $R^{B18}$ | H |
| $L_{A1463}$ | $R^{C17}$ | $R^{A3}$ | H |
| $L_{A1464}$ | $R^{C17}$ | $R^{A34}$ | H |
| $L_{A1465}$ | $R^{C19}$ | H | H |
| $L_{A1466}$ | $R^{C19}$ | $R^{B1}$ | H |
| $L_{A1467}$ | $R^{C19}$ | $R^{B3}$ | H |
| $L_{A1468}$ | $R^{C19}$ | $R^{B4}$ | H |
| $L_{A1469}$ | $R^{C19}$ | $R^{B7}$ | H |
| $L_{A1470}$ | $R^{C19}$ | $R^{B12}$ | H |
| $L_{A1471}$ | $R^{C19}$ | $R^{B18}$ | H |
| $L_{A1472}$ | $R^{C19}$ | $R^{A3}$ | H |
| $L_{A1473}$ | $R^{C19}$ | $R^{A34}$ | H |
| $L_{A1474}$ | $R^{C21}$ | H | H |
| $L_{A1475}$ | $R^{C21}$ | $R^{B1}$ | H |
| $L_{A1476}$ | $R^{C21}$ | $R^{B3}$ | H |
| $L_{A1477}$ | $R^{C21}$ | $R^{B4}$ | H |
| $L_{A1478}$ | $R^{C21}$ | $R^{B7}$ | H |
| $L_{A1479}$ | $R^{C21}$ | $R^{B12}$ | H |
| $L_{A1480}$ | $R^{C21}$ | $R^{B18}$ | H |
| $L_{A1481}$ | $R^{C21}$ | $R^{A3}$ | H |
| $L_{A1482}$ | $R^{C21}$ | $R^{A34}$ | H |
| $L_{A1483}$ | $R^{C1}$ | $R^{B1}$ | H |
| $L_{A1484}$ | $R^{C1}$ | $R^{B3}$ | H |
| $L_{A1485}$ | $R^{C1}$ | $R^{B4}$ | H |
| $L_{A1486}$ | $R^{C1}$ | $R^{B7}$ | H |
| $L_{A1487}$ | $R^{C1}$ | $R^{B12}$ | H |
| $L_{A1488}$ | $R^{C1}$ | $R^{B18}$ | H |
| $L_{A1489}$ | $R^{C1}$ | $R^{A3}$ | H |
| $L_{A1490}$ | $R^{C1}$ | $R^{A34}$ | H |
| $L_{A1491}$ | $R^{C3}$ | $R^{B1}$ | H |
| $L_{A1492}$ | $R^{C3}$ | $R^{B3}$ | H |
| $L_{A1493}$ | $R^{C3}$ | $R^{B4}$ | H |
| $L_{A1494}$ | $R^{C3}$ | $R^{B7}$ | H |
| $L_{A1495}$ | $R^{C3}$ | $R^{B12}$ | H |
| $L_{A1496}$ | $R^{C3}$ | $R^{B18}$ | H |
| $L_{A1497}$ | $R^{C3}$ | $R^{A3}$ | H |
| $L_{A1498}$ | $R^{C3}$ | $R^{A34}$ | H |
| $L_{A1499}$ | $R^{C5}$ | $R^{B1}$ | H |
| $L_{A1500}$ | $R^{C5}$ | $R^{B3}$ | H |
| $L_{A1501}$ | $R^{C5}$ | $R^{B4}$ | H |
| $L_{A1502}$ | $R^{C5}$ | $R^{B7}$ | H |
| $L_{A1503}$ | $R^{C5}$ | $R^{B12}$ | H |
| $L_{A1504}$ | $R^{C5}$ | $R^{B18}$ | H |
| $L_{A1505}$ | $R^{C5}$ | $R^{A3}$ | H |
| $L_{A1506}$ | $R^{C5}$ | $R^{A34}$ | H |
| $L_{A1507}$ | $R^{C17}$ | $R^{B1}$ | H |
| $L_{A1508}$ | $R^{C17}$ | $R^{B3}$ | H |
| $L_{A1509}$ | $R^{C17}$ | $R^{B4}$ | H |
| $L_{A1510}$ | $R^{C17}$ | $R^{B7}$ | H |
| $L_{A1511}$ | $R^{C17}$ | $R^{B12}$ | H |
| $L_{A1512}$ | $R^{C17}$ | $R^{B18}$ | H |
| $L_{A1513}$ | $R^{C17}$ | $R^{A3}$ | H |
| $L_{A1514}$ | $R^{C17}$ | $R^{A34}$ | H |
| $L_{A1515}$ | $R^{C19}$ | $R^{B1}$ | H |
| $L_{A1516}$ | $R^{C19}$ | $R^{B3}$ | H |
| $L_{A1517}$ | $R^{C19}$ | $R^{B4}$ | H |
| $L_{A1518}$ | $R^{C19}$ | $R^{B7}$ | H |
| $L_{A1519}$ | $R^{C19}$ | $R^{B12}$ | H |
| $L_{A1520}$ | $R^{C19}$ | $R^{B18}$ | H |
| $L_{A1521}$ | $R^{C19}$ | $R^{A3}$ | H |
| $L_{A1522}$ | $R^{C19}$ | $R^{A34}$ | H |
| $L_{A1523}$ | $R^{C21}$ | $R^{B1}$ | H |
| $L_{A1524}$ | $R^{C21}$ | $R^{B3}$ | H |
| $L_{A1525}$ | $R^{C21}$ | $R^{B4}$ | H |
| $L_{A1526}$ | $R^{C21}$ | $R^{B7}$ | H |
| $L_{A1527}$ | $R^{C21}$ | $R^{B12}$ | H |
| $L_{A1528}$ | $R^{C21}$ | $R^{B18}$ | H |
| $L_{A1529}$ | $R^{C21}$ | $R^{A3}$ | H |
| $L_{A1530}$ | $R^{C21}$ | $R^{A34}$ | H |

$L_{A1531}$ through $L_{A1836}$ that are based on a structure of Formula VIII,

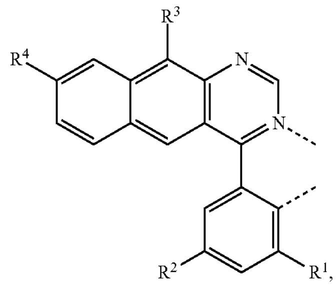

in which $R^1$, $R^2$, $R^3$, and $R^4$ are defined as:

| Ligand | $R^1$ | $R^2$ | $R^3$ | $R^4$ |
|---|---|---|---|---|
| $L_{A1531}$ | $R^{C1}$ | $R^{C1}$ | H | H |
| $L_{A1532}$ | $R^{C1}$ | $R^{C1}$ | $R^{B1}$ | H |
| $L_{A1533}$ | $R^{C1}$ | $R^{C1}$ | $R^{B3}$ | H |
| $L_{A1534}$ | $R^{C1}$ | $R^{C1}$ | $R^{B4}$ | H |
| $L_{A1535}$ | $R^{C1}$ | $R^{C1}$ | $R^{B7}$ | H |
| $L_{A1536}$ | $R^{C1}$ | $R^{C1}$ | $R^{B12}$ | H |
| $L_{A1537}$ | $R^{C1}$ | $R^{C1}$ | $R^{B18}$ | H |
| $L_{A1538}$ | $R^{C1}$ | $R^{C1}$ | $R^{A3}$ | H |
| $L_{A1539}$ | $R^{C1}$ | $R^{C1}$ | $R^{A34}$ | H |
| $L_{A1540}$ | $R^{C3}$ | $R^{C3}$ | H | H |
| $L_{A1541}$ | $R^{C3}$ | $R^{C3}$ | $R^{B1}$ | H |
| $L_{A1542}$ | $R^{C3}$ | $R^{C3}$ | $R^{B3}$ | H |
| $L_{A1543}$ | $R^{C3}$ | $R^{C3}$ | $R^{B4}$ | H |
| $L_{A1544}$ | $R^{C3}$ | $R^{C3}$ | $R^{B7}$ | H |
| $L_{A1545}$ | $R^{C3}$ | $R^{C3}$ | $R^{B12}$ | H |
| $L_{A1546}$ | $R^{C3}$ | $R^{C3}$ | $R^{B18}$ | H |
| $L_{A1547}$ | $R^{C3}$ | $R^{C3}$ | $R^{A3}$ | H |
| $L_{A1548}$ | $R^{C3}$ | $R^{C3}$ | $R^{A34}$ | H |
| $L_{A1549}$ | $R^{C5}$ | $R^{C5}$ | H | H |
| $L_{A1550}$ | $R^{C5}$ | $R^{C5}$ | $R^{B1}$ | H |
| $L_{A1551}$ | $R^{C5}$ | $R^{C5}$ | $R^{B3}$ | H |
| $L_{A1552}$ | $R^{C5}$ | $R^{C5}$ | $R^{B4}$ | H |
| $L_{A1553}$ | $R^{C5}$ | $R^{C5}$ | $R^{B7}$ | H |
| $L_{A1554}$ | $R^{C5}$ | $R^{C5}$ | $R^{B12}$ | H |
| $L_{A1555}$ | $R^{C5}$ | $R^{C5}$ | $R^{B18}$ | H |
| $L_{A1556}$ | $R^{C5}$ | $R^{C5}$ | $R^{A3}$ | H |
| $L_{A1557}$ | $R^{C5}$ | $R^{C5}$ | $R^{A34}$ | H |
| $L_{A1558}$ | $R^{C17}$ | $R^{C17}$ | H | H |
| $L_{A1559}$ | $R^{C17}$ | $R^{C17}$ | $R^{B1}$ | H |
| $L_{A1560}$ | $R^{C17}$ | $R^{C17}$ | $R^{B3}$ | H |
| $L_{A1561}$ | $R^{C17}$ | $R^{C17}$ | $R^{B4}$ | H |
| $L_{A1562}$ | $R^{C17}$ | $R^{C17}$ | $R^{B7}$ | H |
| $L_{A1563}$ | $R^{C17}$ | $R^{C17}$ | $R^{B12}$ | H |
| $L_{A1564}$ | $R^{C17}$ | $R^{C17}$ | $R^{B18}$ | H |
| $L_{A1565}$ | $R^{C17}$ | $R^{C17}$ | $R^{A3}$ | H |
| $L_{A1566}$ | $R^{C17}$ | $R^{C17}$ | $R^{A34}$ | H |
| $L_{A1567}$ | $R^{C19}$ | $R^{C19}$ | H | H |
| $L_{A1568}$ | $R^{C19}$ | $R^{C19}$ | $R^{B1}$ | H |
| $L_{A1569}$ | $R^{C19}$ | $R^{C19}$ | $R^{B3}$ | H |
| $L_{A1570}$ | $R^{C19}$ | $R^{C19}$ | $R^{B4}$ | H |
| $L_{A1571}$ | $R^{C19}$ | $R^{C19}$ | $R^{B7}$ | H |
| $L_{A1572}$ | $R^{C19}$ | $R^{C19}$ | $R^{B12}$ | H |
| $L_{A1573}$ | $R^{C19}$ | $R^{C19}$ | $R^{B18}$ | H |
| $L_{A1574}$ | $R^{C19}$ | $R^{C19}$ | $R^{A3}$ | H |
| $L_{A1575}$ | $R^{C19}$ | $R^{C19}$ | $R^{A34}$ | H |
| $L_{A1576}$ | $R^{C21}$ | $R^{C21}$ | H | H |
| $L_{A1577}$ | $R^{C21}$ | $R^{C21}$ | $R^{B1}$ | H |
| $L_{A1578}$ | $R^{C21}$ | $R^{C21}$ | $R^{B3}$ | H |
| $L_{A1579}$ | $R^{C21}$ | $R^{C21}$ | $R^{B4}$ | H |
| $L_{A1580}$ | $R^{C21}$ | $R^{C21}$ | $R^{B7}$ | H |
| $L_{A1581}$ | $R^{C21}$ | $R^{C21}$ | $R^{B12}$ | H |
| $L_{A1582}$ | $R^{C21}$ | $R^{C21}$ | $R^{B18}$ | H |
| $L_{A1583}$ | $R^{C21}$ | $R^{C21}$ | $R^{A3}$ | H |
| $L_{A1584}$ | $R^{C21}$ | $R^{C21}$ | $R^{A34}$ | H |
| $L_{A1585}$ | $R^{B1}$ | $R^{C1}$ | H | H |
| $L_{A1586}$ | $R^{B1}$ | $R^{C1}$ | $R^{B1}$ | H |
| $L_{A1587}$ | $R^{B1}$ | $R^{C1}$ | $R^{B3}$ | H |
| $L_{A1588}$ | $R^{B1}$ | $R^{C1}$ | $R^{B4}$ | H |
| $L_{A1589}$ | $R^{B1}$ | $R^{C1}$ | $R^{B7}$ | H |
| $L_{A1590}$ | $R^{B1}$ | $R^{C1}$ | $R^{B12}$ | H |

-continued

| Ligand | $R^1$ | $R^2$ | $R^3$ | $R^4$ |
|---|---|---|---|---|
| $L_{A1591}$ | $R^{B1}$ | $R^{C1}$ | $R^{B18}$ | H |
| $L_{A1592}$ | $R^{B1}$ | $R^{C1}$ | $R^{A3}$ | H |
| $L_{A1593}$ | $R^{B1}$ | $R^{C1}$ | $R^{A34}$ | H |
| $L_{A1594}$ | $R^{B1}$ | $R^{C3}$ | H | H |
| $L_{A1595}$ | $R^{B1}$ | $R^{C3}$ | $R^{B1}$ | H |
| $L_{A1596}$ | $R^{B1}$ | $R^{C3}$ | $R^{B3}$ | H |
| $L_{A1597}$ | $R^{B1}$ | $R^{C3}$ | $R^{B4}$ | H |
| $L_{A1598}$ | $R^{B1}$ | $R^{C3}$ | $R^{B7}$ | H |
| $L_{A1599}$ | $R^{B1}$ | $R^{C3}$ | $R^{B12}$ | H |
| $L_{A1600}$ | $R^{B1}$ | $R^{C3}$ | $R^{B18}$ | H |
| $L_{A1601}$ | $R^{B1}$ | $R^{C3}$ | $R^{A3}$ | H |
| $L_{A1602}$ | $R^{B1}$ | $R^{C3}$ | $R^{A34}$ | H |
| $L_{A1603}$ | $R^{B1}$ | $R^{C5}$ | H | H |
| $L_{A1604}$ | $R^{B1}$ | $R^{C5}$ | $R^{B1}$ | H |
| $L_{A1605}$ | $R^{B1}$ | $R^{C5}$ | $R^{B3}$ | H |
| $L_{A1606}$ | $R^{B1}$ | $R^{C5}$ | $R^{B4}$ | H |
| $L_{A1607}$ | $R^{B1}$ | $R^{C5}$ | $R^{B7}$ | H |
| $L_{A1608}$ | $R^{B1}$ | $R^{C5}$ | $R^{B12}$ | H |
| $L_{A1609}$ | $R^{B1}$ | $R^{C5}$ | $R^{B18}$ | H |
| $L_{A1610}$ | $R^{B1}$ | $R^{C5}$ | $R^{A3}$ | H |
| $L_{A1611}$ | $R^{B1}$ | $R^{C5}$ | $R^{A34}$ | H |
| $L_{A1612}$ | $R^{B1}$ | $R^{C17}$ | H | H |
| $L_{A1613}$ | $R^{B1}$ | $R^{C17}$ | $R^{B1}$ | H |
| $L_{A1614}$ | $R^{B1}$ | $R^{C17}$ | $R^{B3}$ | H |
| $L_{A1615}$ | $R^{B1}$ | $R^{C17}$ | $R^{B4}$ | H |
| $L_{A1616}$ | $R^{B1}$ | $R^{C17}$ | $R^{B7}$ | H |
| $L_{A1617}$ | $R^{B1}$ | $R^{C17}$ | $R^{B12}$ | H |
| $L_{A1618}$ | $R^{B1}$ | $R^{C17}$ | $R^{B18}$ | H |
| $L_{A1619}$ | $R^{B1}$ | $R^{C17}$ | $R^{A3}$ | H |
| $L_{A1620}$ | $R^{B1}$ | $R^{C17}$ | $R^{A34}$ | H |
| $L_{A1621}$ | $R^{B1}$ | $R^{C19}$ | H | H |
| $L_{A1622}$ | $R^{B1}$ | $R^{C19}$ | $R^{B1}$ | H |
| $L_{A1623}$ | $R^{B1}$ | $R^{C19}$ | $R^{B3}$ | H |
| $L_{A1624}$ | $R^{B1}$ | $R^{C19}$ | $R^{B4}$ | H |
| $L_{A1625}$ | $R^{B1}$ | $R^{C19}$ | $R^{B7}$ | H |
| $L_{A1626}$ | $R^{B1}$ | $R^{C19}$ | $R^{B12}$ | H |
| $L_{A1627}$ | $R^{B1}$ | $R^{C19}$ | $R^{B18}$ | H |
| $L_{A1628}$ | $R^{B1}$ | $R^{C19}$ | $R^{A3}$ | H |
| $L_{A1629}$ | $R^{B1}$ | $R^{C19}$ | $R^{A34}$ | H |
| $L_{A1630}$ | $R^{B1}$ | $R^{C21}$ | H | H |
| $L_{A1631}$ | $R^{B1}$ | $R^{C21}$ | $R^{B1}$ | H |
| $L_{A1632}$ | $R^{B1}$ | $R^{C21}$ | $R^{B3}$ | H |
| $L_{A1633}$ | $R^{B1}$ | $R^{C21}$ | $R^{B4}$ | H |
| $L_{A1634}$ | $R^{B1}$ | $R^{C21}$ | $R^{B7}$ | H |
| $L_{A1635}$ | $R^{B1}$ | $R^{C21}$ | $R^{B12}$ | H |
| $L_{A1636}$ | $R^{B1}$ | $R^{C21}$ | $R^{B18}$ | H |
| $L_{A1637}$ | $R^{B1}$ | $R^{C21}$ | $R^{A3}$ | H |
| $L_{A1638}$ | $R^{B1}$ | $R^{C21}$ | $R^{A34}$ | H |
| $L_{A1639}$ | $R^{B2}$ | $R^{C1}$ | H | H |
| $L_{A1640}$ | $R^{B2}$ | $R^{C1}$ | $R^{B1}$ | H |
| $L_{A1641}$ | $R^{B2}$ | $R^{C1}$ | $R^{B3}$ | H |
| $L_{A1642}$ | $R^{B2}$ | $R^{C1}$ | $R^{B4}$ | H |
| $L_{A1643}$ | $R^{B2}$ | $R^{C1}$ | $R^{B7}$ | H |
| $L_{A1644}$ | $R^{B2}$ | $R^{C1}$ | $R^{B12}$ | H |
| $L_{A1645}$ | $R^{B2}$ | $R^{C1}$ | $R^{B18}$ | H |
| $L_{A1646}$ | $R^{B2}$ | $R^{C1}$ | $R^{A3}$ | H |
| $L_{A1647}$ | $R^{B2}$ | $R^{C1}$ | $R^{A34}$ | H |
| $L_{A1648}$ | $R^{B2}$ | $R^{C3}$ | H | H |
| $L_{A1649}$ | $R^{B2}$ | $R^{C3}$ | $R^{B1}$ | H |
| $L_{A1650}$ | $R^{B2}$ | $R^{C3}$ | $R^{B3}$ | H |
| $L_{A1651}$ | $R^{B2}$ | $R^{C3}$ | $R^{B4}$ | H |
| $L_{A1652}$ | $R^{B2}$ | $R^{C3}$ | $R^{B7}$ | H |
| $L_{A1653}$ | $R^{B2}$ | $R^{C3}$ | $R^{B12}$ | H |
| $L_{A1654}$ | $R^{B2}$ | $R^{C3}$ | $R^{B18}$ | H |
| $L_{A1655}$ | $R^{B2}$ | $R^{C3}$ | $R^{A3}$ | H |
| $L_{A1656}$ | $R^{B2}$ | $R^{C3}$ | $R^{A34}$ | H |
| $L_{A1657}$ | $R^{B2}$ | $R^{C5}$ | H | H |
| $L_{A1658}$ | $R^{B2}$ | $R^{C5}$ | $R^{B1}$ | H |
| $L_{A1659}$ | $R^{B2}$ | $R^{C5}$ | $R^{B3}$ | H |
| $L_{A1660}$ | $R^{B2}$ | $R^{C5}$ | $R^{B4}$ | H |
| $L_{A1661}$ | $R^{B2}$ | $R^{C5}$ | $R^{B7}$ | H |
| $L_{A1662}$ | $R^{B2}$ | $R^{C5}$ | $R^{B12}$ | H |
| $L_{A1663}$ | $R^{B2}$ | $R^{C5}$ | $R^{B18}$ | H |
| $L_{A1664}$ | $R^{B2}$ | $R^{C5}$ | $R^{A3}$ | H |
| $L_{A1665}$ | $R^{B2}$ | $R^{C5}$ | $R^{A34}$ | H |
| $L_{A1666}$ | $R^{B2}$ | $R^{C17}$ | H | H |
| $L_{A1667}$ | $R^{B2}$ | $R^{C17}$ | $R^{B1}$ | H |

-continued

| Ligand | $R^1$ | $R^2$ | $R^3$ | $R^4$ |
|---|---|---|---|---|
| $L_{A1668}$ | $R^{B2}$ | $R^{C17}$ | $R^{B3}$ | H |
| $L_{A1669}$ | $R^{B2}$ | $R^{C17}$ | $R^{B4}$ | H |
| $L_{A1670}$ | $R^{B2}$ | $R^{C17}$ | $R^{B7}$ | H |
| $L_{A1671}$ | $R^{B2}$ | $R^{C17}$ | $R^{B12}$ | H |
| $L_{A1672}$ | $R^{B2}$ | $R^{C17}$ | $R^{B18}$ | H |
| $L_{A1673}$ | $R^{B2}$ | $R^{C17}$ | $R^{A3}$ | H |
| $L_{A1674}$ | $R^{B2}$ | $R^{C17}$ | $R^{A34}$ | H |
| $L_{A1675}$ | $R^{B2}$ | $R^{C19}$ | H | H |
| $L_{A1676}$ | $R^{B2}$ | $R^{C19}$ | $R^{B1}$ | H |
| $L_{A1677}$ | $R^{B2}$ | $R^{C19}$ | $R^{B3}$ | H |
| $L_{A1678}$ | $R^{B2}$ | $R^{C19}$ | $R^{B4}$ | H |
| $L_{A1679}$ | $R^{B2}$ | $R^{C19}$ | $R^{B7}$ | H |
| $L_{A1680}$ | $R^{B2}$ | $R^{C19}$ | $R^{B12}$ | H |
| $L_{A1681}$ | $R^{B2}$ | $R^{C19}$ | $R^{B18}$ | H |
| $L_{A1682}$ | $R^{B2}$ | $R^{C19}$ | $R^{A3}$ | H |
| $L_{A1683}$ | $R^{B2}$ | $R^{C19}$ | $R^{A34}$ | H |
| $L_{A1684}$ | $R^{B2}$ | $R^{C21}$ | H | H |
| $L_{A1685}$ | $R^{B2}$ | $R^{C21}$ | $R^{B1}$ | H |
| $L_{A1686}$ | $R^{B2}$ | $R^{C21}$ | $R^{B3}$ | H |
| $L_{A1687}$ | $R^{B2}$ | $R^{C21}$ | $R^{B4}$ | H |
| $L_{A1688}$ | $R^{B2}$ | $R^{C21}$ | $R^{B7}$ | H |
| $L_{A1689}$ | $R^{B2}$ | $R^{C21}$ | $R^{B12}$ | H |
| $L_{A1690}$ | $R^{B2}$ | $R^{C21}$ | $R^{B18}$ | H |
| $L_{A1691}$ | $R^{B2}$ | $R^{C21}$ | $R^{A3}$ | H |
| $L_{A1692}$ | $R^{B2}$ | $R^{C21}$ | $R^{A34}$ | H |
| $L_{A1693}$ | $R^{C1}$ | $R^{C1}$ | H | $R^{B1}$ |
| $L_{A1694}$ | $R^{C1}$ | $R^{C1}$ | H | $R^{B3}$ |
| $L_{A1695}$ | $R^{C1}$ | $R^{C1}$ | H | $R^{B4}$ |
| $L_{A1696}$ | $R^{C1}$ | $R^{C1}$ | H | $R^{B7}$ |
| $L_{A1697}$ | $R^{C1}$ | $R^{C1}$ | H | $R^{B12}$ |
| $L_{A1698}$ | $R^{C1}$ | $R^{C1}$ | H | $R^{B18}$ |
| $L_{A1699}$ | $R^{C1}$ | $R^{C1}$ | H | $R^{A3}$ |
| $L_{A1700}$ | $R^{C1}$ | $R^{C1}$ | H | $R^{A34}$ |
| $L_{A1701}$ | $R^{C3}$ | $R^{C3}$ | H | $R^{B1}$ |
| $L_{A1702}$ | $R^{C3}$ | $R^{C3}$ | H | $R^{B3}$ |
| $L_{A1703}$ | $R^{C3}$ | $R^{C3}$ | H | $R^{B4}$ |
| $L_{A1704}$ | $R^{C3}$ | $R^{C3}$ | H | $R^{B7}$ |
| $L_{A1705}$ | $R^{C3}$ | $R^{C3}$ | H | $R^{B12}$ |
| $L_{A1706}$ | $R^{C3}$ | $R^{C3}$ | H | $R^{B18}$ |
| $L_{A1707}$ | $R^{C3}$ | $R^{C3}$ | H | $R^{A3}$ |
| $L_{A1708}$ | $R^{C3}$ | $R^{C3}$ | H | $R^{A34}$ |
| $L_{A1709}$ | $R^{C5}$ | $R^{C5}$ | H | $R^{B1}$ |
| $L_{A1710}$ | $R^{C5}$ | $R^{C5}$ | H | $R^{B3}$ |
| $L_{A1711}$ | $R^{C5}$ | $R^{C5}$ | H | $R^{B4}$ |
| $L_{A1712}$ | $R^{C5}$ | $R^{C5}$ | H | $R^{B7}$ |
| $L_{A1713}$ | $R^{C5}$ | $R^{C5}$ | H | $R^{B12}$ |
| $L_{A1714}$ | $R^{C5}$ | $R^{C5}$ | H | $R^{B18}$ |
| $L_{A1715}$ | $R^{C5}$ | $R^{C5}$ | H | $R^{A3}$ |
| $L_{A1716}$ | $R^{C5}$ | $R^{C5}$ | H | $R^{A34}$ |
| $L_{A1717}$ | $R^{C17}$ | $R^{C17}$ | H | $R^{B1}$ |
| $L_{A1718}$ | $R^{C17}$ | $R^{C17}$ | H | $R^{B3}$ |
| $L_{A1719}$ | $R^{C17}$ | $R^{C17}$ | H | $R^{B4}$ |
| $L_{A1720}$ | $R^{C17}$ | $R^{C17}$ | H | $R^{B7}$ |
| $L_{A1721}$ | $R^{C17}$ | $R^{C17}$ | H | $R^{B12}$ |
| $L_{A1722}$ | $R^{C17}$ | $R^{C17}$ | H | $R^{B18}$ |
| $L_{A1723}$ | $R^{C17}$ | $R^{C17}$ | H | $R^{A3}$ |
| $L_{A1724}$ | $R^{C17}$ | $R^{C17}$ | H | $R^{A34}$ |
| $L_{A1725}$ | $R^{C19}$ | $R^{C19}$ | H | $R^{B1}$ |
| $L_{A1726}$ | $R^{C19}$ | $R^{C19}$ | H | $R^{B3}$ |
| $L_{A1727}$ | $R^{C19}$ | $R^{C19}$ | H | $R^{B4}$ |
| $L_{A1728}$ | $R^{C19}$ | $R^{C19}$ | H | $R^{B7}$ |
| $L_{A1729}$ | $R^{C19}$ | $R^{C19}$ | H | $R^{B12}$ |
| $L_{A1730}$ | $R^{C19}$ | $R^{C19}$ | H | $R^{B18}$ |
| $L_{A1731}$ | $R^{C19}$ | $R^{C19}$ | H | $R^{A3}$ |
| $L_{A1732}$ | $R^{C19}$ | $R^{C19}$ | H | $R^{A34}$ |
| $L_{A1733}$ | $R^{C21}$ | $R^{C21}$ | H | $R^{B1}$ |
| $L_{A1734}$ | $R^{C21}$ | $R^{C21}$ | H | $R^{B3}$ |
| $L_{A1735}$ | $R^{C21}$ | $R^{C21}$ | H | $R^{B4}$ |
| $L_{A1736}$ | $R^{C21}$ | $R^{C21}$ | H | $R^{B7}$ |
| $L_{A1737}$ | $R^{C21}$ | $R^{C21}$ | H | $R^{B12}$ |
| $L_{A1738}$ | $R^{C21}$ | $R^{C21}$ | H | $R^{B18}$ |
| $L_{A1739}$ | $R^{C21}$ | $R^{C21}$ | H | $R^{A3}$ |
| $L_{A1740}$ | $R^{C21}$ | $R^{C21}$ | H | $R^{A34}$ |
| $L_{A1741}$ | $R^{B1}$ | $R^{C1}$ | H | $R^{B1}$ |
| $L_{A1742}$ | $R^{B1}$ | $R^{C1}$ | H | $R^{B3}$ |
| $L_{A1743}$ | $R^{B1}$ | $R^{C1}$ | H | $R^{B4}$ |
| $L_{A1744}$ | $R^{B1}$ | $R^{C1}$ | H | $R^{B7}$ |

-continued

| Ligand | $R^1$ | $R^2$ | $R^3$ | $R^4$ |
|---|---|---|---|---|
| $L_{A1745}$ | $R^{B1}$ | $R^{C1}$ | H | $R^{B12}$ |
| $L_{A1746}$ | $R^{B1}$ | $R^{C1}$ | H | $R^{B18}$ |
| $L_{A1747}$ | $R^{B1}$ | $R^{C1}$ | H | $R^{A3}$ |
| $L_{A1748}$ | $R^{B1}$ | $R^{C1}$ | H | $R^{A34}$ |
| $L_{A1749}$ | $R^{B1}$ | $R^{C3}$ | H | $R^{B1}$ |
| $L_{A1750}$ | $R^{B1}$ | $R^{C3}$ | H | $R^{B3}$ |
| $L_{A1751}$ | $R^{B1}$ | $R^{C3}$ | H | $R^{B4}$ |
| $L_{A1752}$ | $R^{B1}$ | $R^{C3}$ | H | $R^{B7}$ |
| $L_{A1753}$ | $R^{B1}$ | $R^{C3}$ | H | $R^{B12}$ |
| $L_{A1754}$ | $R^{B1}$ | $R^{C3}$ | H | $R^{B18}$ |
| $L_{A1755}$ | $R^{B1}$ | $R^{C3}$ | H | $R^{A3}$ |
| $L_{A1756}$ | $R^{B1}$ | $R^{C3}$ | H | $R^{A34}$ |
| $L_{A1757}$ | $R^{B1}$ | $R^{C5}$ | H | $R^{B1}$ |
| $L_{A1758}$ | $R^{B1}$ | $R^{C5}$ | H | $R^{B3}$ |
| $L_{A1759}$ | $R^{B1}$ | $R^{C5}$ | H | $R^{B4}$ |
| $L_{A1760}$ | $R^{B1}$ | $R^{C5}$ | H | $R^{B7}$ |
| $L_{A1761}$ | $R^{B1}$ | $R^{C5}$ | H | $R^{B12}$ |
| $L_{A1762}$ | $R^{B1}$ | $R^{C5}$ | H | $R^{B18}$ |
| $L_{A1763}$ | $R^{B1}$ | $R^{C5}$ | H | $R^{A3}$ |
| $L_{A1764}$ | $R^{B1}$ | $R^{C5}$ | H | $R^{A34}$ |
| $L_{A1765}$ | $R^{B1}$ | $R^{C17}$ | H | $R^{B1}$ |
| $L_{A1766}$ | $R^{B1}$ | $R^{C17}$ | H | $R^{B3}$ |
| $L_{A1767}$ | $R^{B1}$ | $R^{C17}$ | H | $R^{B4}$ |
| $L_{A1768}$ | $R^{B1}$ | $R^{C17}$ | H | $R^{B7}$ |
| $L_{A1769}$ | $R^{B1}$ | $R^{C17}$ | H | $R^{B12}$ |
| $L_{A1770}$ | $R^{B1}$ | $R^{C17}$ | H | $R^{B18}$ |
| $L_{A1771}$ | $R^{B1}$ | $R^{C17}$ | H | $R^{A3}$ |
| $L_{A1772}$ | $R^{B1}$ | $R^{C17}$ | H | $R^{A34}$ |
| $L_{A1773}$ | $R^{B1}$ | $R^{C19}$ | H | $R^{B1}$ |
| $L_{A1774}$ | $R^{B1}$ | $R^{C19}$ | H | $R^{B3}$ |
| $L_{A1775}$ | $R^{B1}$ | $R^{C19}$ | H | $R^{B4}$ |
| $L_{A1776}$ | $R^{B1}$ | $R^{C19}$ | H | $R^{B7}$ |
| $L_{A1777}$ | $R^{B1}$ | $R^{C19}$ | H | $R^{B12}$ |
| $L_{A1778}$ | $R^{B1}$ | $R^{C19}$ | H | $R^{B18}$ |
| $L_{A1779}$ | $R^{B1}$ | $R^{C19}$ | H | $R^{A3}$ |
| $L_{A1780}$ | $R^{B1}$ | $R^{C19}$ | H | $R^{A34}$ |
| $L_{A1781}$ | $R^{B1}$ | $R^{C21}$ | H | $R^{B1}$ |
| $L_{A1782}$ | $R^{B1}$ | $R^{C21}$ | H | $R^{B3}$ |
| $L_{A1783}$ | $R^{B1}$ | $R^{C21}$ | H | $R^{B4}$ |
| $L_{A1784}$ | $R^{B1}$ | $R^{C21}$ | H | $R^{B7}$ |
| $L_{A1785}$ | $R^{B1}$ | $R^{C21}$ | H | $R^{B12}$ |
| $L_{A1786}$ | $R^{B1}$ | $R^{C21}$ | H | $R^{B18}$ |
| $L_{A1787}$ | $R^{B1}$ | $R^{C21}$ | H | $R^{A3}$ |
| $L_{A1788}$ | $R^{B1}$ | $R^{C21}$ | H | $R^{A34}$ |
| $L_{A1789}$ | $R^{B2}$ | $R^{C1}$ | H | $R^{B1}$ |
| $L_{A1790}$ | $R^{B2}$ | $R^{C1}$ | H | $R^{B3}$ |
| $L_{A1791}$ | $R^{B2}$ | $R^{C1}$ | H | $R^{B4}$ |
| $L_{A1792}$ | $R^{B2}$ | $R^{C1}$ | H | $R^{B7}$ |
| $L_{A1793}$ | $R^{B2}$ | $R^{C1}$ | H | $R^{B12}$ |
| $L_{A1794}$ | $R^{B2}$ | $R^{C1}$ | H | $R^{B18}$ |
| $L_{A1795}$ | $R^{B2}$ | $R^{C1}$ | H | $R^{A3}$ |
| $L_{A1796}$ | $R^{B2}$ | $R^{C1}$ | H | $R^{A34}$ |
| $L_{A1797}$ | $R^{B2}$ | $R^{C3}$ | H | $R^{B1}$ |
| $L_{A1798}$ | $R^{B2}$ | $R^{C3}$ | H | $R^{B3}$ |
| $L_{A1799}$ | $R^{B2}$ | $R^{C3}$ | H | $R^{B4}$ |
| $L_{A1800}$ | $R^{B2}$ | $R^{C3}$ | H | $R^{B7}$ |
| $L_{A1801}$ | $R^{B2}$ | $R^{C3}$ | H | $R^{B12}$ |
| $L_{A1802}$ | $R^{B2}$ | $R^{C3}$ | H | $R^{B18}$ |
| $L_{A1803}$ | $R^{B2}$ | $R^{C3}$ | H | $R^{A3}$ |
| $L_{A1804}$ | $R^{B2}$ | $R^{C3}$ | H | $R^{A34}$ |
| $L_{A1805}$ | $R^{B2}$ | $R^{C5}$ | H | $R^{B1}$ |
| $L_{A1806}$ | $R^{B2}$ | $R^{C5}$ | H | $R^{B3}$ |
| $L_{A1807}$ | $R^{B2}$ | $R^{C5}$ | H | $R^{B4}$ |
| $L_{A1808}$ | $R^{B2}$ | $R^{C5}$ | H | $R^{B7}$ |
| $L_{A1809}$ | $R^{B2}$ | $R^{C5}$ | H | $R^{B12}$ |
| $L_{A1810}$ | $R^{B2}$ | $R^{C5}$ | H | $R^{B18}$ |
| $L_{A1811}$ | $R^{B2}$ | $R^{C5}$ | H | $R^{A3}$ |
| $L_{A1812}$ | $R^{B2}$ | $R^{C5}$ | H | $R^{A34}$ |
| $L_{A1813}$ | $R^{B2}$ | $R^{C17}$ | H | $R^{B1}$ |
| $L_{A1814}$ | $R^{B2}$ | $R^{C17}$ | H | $R^{B3}$ |
| $L_{A1815}$ | $R^{B2}$ | $R^{C17}$ | H | $R^{B4}$ |
| $L_{A1816}$ | $R^{B2}$ | $R^{C17}$ | H | $R^{B7}$ |
| $L_{A1817}$ | $R^{B2}$ | $R^{C17}$ | H | $R^{B12}$ |
| $L_{A1818}$ | $R^{B2}$ | $R^{C17}$ | H | $R^{B18}$ |
| $L_{A1819}$ | $R^{B2}$ | $R^{C17}$ | H | $R^{A3}$ |
| $L_{A1820}$ | $R^{B2}$ | $R^{C17}$ | H | $R^{A34}$ |
| $L_{A1821}$ | $R^{B2}$ | $R^{C19}$ | H | $R^{B1}$ |

-continued

| Ligand | $R^1$ | $R^2$ | $R^3$ | $R^4$ |
|---|---|---|---|---|
| $L_{A1822}$ | $R^{B2}$ | $R^{C19}$ | H | $R^{B3}$ |
| $L_{A1823}$ | $R^{B2}$ | $R^{C19}$ | H | $R^{B4}$ |
| $L_{A1824}$ | $R^{B2}$ | $R^{C19}$ | H | $R^{B7}$ |
| $L_{A1825}$ | $R^{B2}$ | $R^{C19}$ | H | $R^{B12}$ |
| $L_{A1826}$ | $R^{B2}$ | $R^{C19}$ | H | $R^{B18}$ |
| $L_{A1827}$ | $R^{B2}$ | $R^{C19}$ | H | $R^{A3}$ |
| $L_{A1828}$ | $R^{B2}$ | $R^{C19}$ | H | $R^{A34}$ |
| $L_{A1829}$ | $R^{B2}$ | $R^{C21}$ | H | $R^{B1}$ |
| $L_{A1830}$ | $R^{B2}$ | $R^{C21}$ | H | $R^{B3}$ |
| $L_{A1831}$ | $R^{B2}$ | $R^{C21}$ | H | $R^{B4}$ |
| $L_{A1832}$ | $R^{B2}$ | $R^{C21}$ | H | $R^{B7}$ |
| $L_{A1833}$ | $R^{B2}$ | $R^{C21}$ | H | $R^{B12}$ |
| $L_{A1834}$ | $R^{B2}$ | $R^{C21}$ | H | $R^{B18}$ |
| $L_{A1835}$ | $R^{B2}$ | $R^{C21}$ | H | $R^{A3}$ |
| $L_{A1836}$ | $R^{B2}$ | $R^{C21}$ | H | $R^{A34}$ |

$L_{A1837}$ through $L_{A1938}$ that are based on a structure of Formula IX,

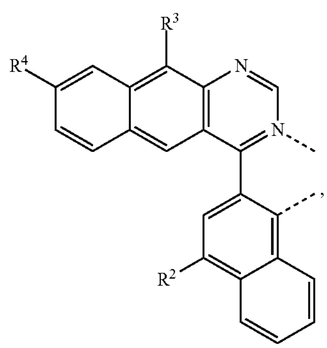

in which $R^1$, $R^2$, $R^3$, and $R^4$ are defined as:

| Ligand | $R^2$ | $R^3$ | $R^4$ |
|---|---|---|---|
| $L_{A1837}$ | $R^{C1}$ | H | H |
| $L_{A1838}$ | $R^{C1}$ | $R^{B1}$ | H |
| $L_{A1839}$ | $R^{C1}$ | $R^{B3}$ | H |
| $L_{A1840}$ | $R^{C1}$ | $R^{B4}$ | H |
| $L_{A1841}$ | $R^{C1}$ | $R^{B7}$ | H |
| $L_{A1842}$ | $R^{C1}$ | $R^{B12}$ | H |
| $L_{A1843}$ | $R^{C1}$ | $R^{B18}$ | H |
| $L_{A1844}$ | $R^{C1}$ | $R^{A3}$ | H |
| $L_{A1845}$ | $R^{C1}$ | $R^{A34}$ | H |
| $L_{A1846}$ | $R^{C3}$ | H | H |
| $L_{A1847}$ | $R^{C3}$ | $R^{B1}$ | H |
| $L_{A1848}$ | $R^{C3}$ | $R^{B3}$ | H |
| $L_{A1849}$ | $R^{C3}$ | $R^{B4}$ | H |
| $L_{A1850}$ | $R^{C3}$ | $R^{B7}$ | H |
| $L_{A1851}$ | $R^{C3}$ | $R^{B12}$ | H |
| $L_{A1852}$ | $R^{C3}$ | $R^{B18}$ | H |
| $L_{A1853}$ | $R^{C3}$ | $R^{A3}$ | H |
| $L_{A1854}$ | $R^{C3}$ | $R^{A34}$ | H |
| $L_{A1855}$ | $R^{C5}$ | H | H |
| $L_{A1856}$ | $R^{C5}$ | $R^{B1}$ | H |
| $L_{A1857}$ | $R^{C5}$ | $R^{B3}$ | H |
| $L_{A1858}$ | $R^{C5}$ | $R^{B4}$ | H |
| $L_{A1859}$ | $R^{C5}$ | $R^{B7}$ | H |
| $L_{A1860}$ | $R^{C5}$ | $R^{B12}$ | H |
| $L_{A1861}$ | $R^{C5}$ | $R^{B18}$ | H |
| $L_{A1862}$ | $R^{C5}$ | $R^{A3}$ | H |
| $L_{A1863}$ | $R^{C5}$ | $R^{A34}$ | H |
| $L_{A1864}$ | $R^{C17}$ | H | H |
| $L_{A1865}$ | $R^{C17}$ | $R^{B1}$ | H |
| $L_{A1866}$ | $R^{C17}$ | $R^{B3}$ | H |
| $L_{A1867}$ | $R^{C17}$ | $R^{B4}$ | H |
| $L_{A1868}$ | $R^{C17}$ | $R^{B7}$ | H |
| $L_{A1869}$ | $R^{C17}$ | $R^{B12}$ | H |
| $L_{A1870}$ | $R^{C17}$ | $R^{B18}$ | H |
| $L_{A1871}$ | $R^{C17}$ | $R^{A3}$ | H |
| $L_{A1872}$ | $R^{C17}$ | $R^{A34}$ | H |
| $L_{A1873}$ | $R^{C19}$ | H | H |
| $L_{A1874}$ | $R^{C19}$ | $R^{B1}$ | H |
| $L_{A1875}$ | $R^{C19}$ | $R^{B3}$ | H |
| $L_{A1876}$ | $R^{C19}$ | $R^{B4}$ | H |
| $L_{A1877}$ | $R^{C19}$ | $R^{B7}$ | H |
| $L_{A1878}$ | $R^{C19}$ | $R^{B12}$ | H |
| $L_{A1879}$ | $R^{C19}$ | $R^{B18}$ | H |
| $L_{A1880}$ | $R^{C19}$ | $R^{A3}$ | H |
| $L_{A1881}$ | $R^{C19}$ | $R^{A34}$ | H |
| $L_{A1882}$ | $R^{C21}$ | H | H |
| $L_{A1883}$ | $R^{C21}$ | $R^{B1}$ | H |
| $L_{A1884}$ | $R^{C21}$ | $R^{B3}$ | H |
| $L_{A1885}$ | $R^{C21}$ | $R^{B4}$ | H |
| $L_{A1886}$ | $R^{C21}$ | $R^{B7}$ | H |
| $L_{A1887}$ | $R^{C21}$ | $R^{B12}$ | H |
| $L_{A1888}$ | $R^{C21}$ | $R^{B18}$ | H |
| $L_{A1889}$ | $R^{C21}$ | $R^{A3}$ | H |
| $L_{A1890}$ | $R^{C21}$ | $R^{A34}$ | H |
| $L_{A1891}$ | $R^{C1}$ | $R^{B1}$ | H |
| $L_{A1892}$ | $R^{C1}$ | $R^{B3}$ | H |
| $L_{A1893}$ | $R^{C1}$ | $R^{B4}$ | H |
| $L_{A1894}$ | $R^{C1}$ | $R^{B7}$ | H |
| $L_{A1895}$ | $R^{C1}$ | $R^{B12}$ | H |
| $L_{A1896}$ | $R^{C1}$ | $R^{B18}$ | H |
| $L_{A1897}$ | $R^{C1}$ | $R^{A3}$ | H |
| $L_{A1898}$ | $R^{C1}$ | $R^{A34}$ | H |
| $L_{A1899}$ | $R^{C1}$ | $R^{B1}$ | H |
| $L_{A1900}$ | $R^{C3}$ | $R^{B3}$ | H |
| $L_{A1901}$ | $R^{C3}$ | $R^{B4}$ | H |
| $L_{A1902}$ | $R^{C3}$ | $R^{B7}$ | H |
| $L_{A1903}$ | $R^{C3}$ | $R^{B12}$ | H |
| $L_{A1904}$ | $R^{C3}$ | $R^{B18}$ | H |
| $L_{A1905}$ | $R^{C3}$ | $R^{A3}$ | H |
| $L_{A1906}$ | $R^{C3}$ | $R^{A34}$ | H |
| $L_{A1907}$ | $R^{C5}$ | $R^{B1}$ | H |
| $L_{A1908}$ | $R^{C5}$ | $R^{B3}$ | H |
| $L_{A1909}$ | $R^{C5}$ | $R^{B4}$ | H |
| $L_{A1910}$ | $R^{C5}$ | $R^{B7}$ | H |
| $L_{A1911}$ | $R^{C5}$ | $R^{B12}$ | H |
| $L_{A1912}$ | $R^{C5}$ | $R^{B18}$ | H |
| $L_{A1913}$ | $R^{C5}$ | $R^{A3}$ | H |
| $L_{A1914}$ | $R^{C5}$ | $R^{A34}$ | H |
| $L_{A1915}$ | $R^{C17}$ | $R^{B1}$ | H |
| $L_{A1916}$ | $R^{C17}$ | $R^{B3}$ | H |
| $L_{A1917}$ | $R^{C17}$ | $R^{B4}$ | H |
| $L_{A1918}$ | $R^{C17}$ | $R^{B7}$ | H |
| $L_{A1919}$ | $R^{C17}$ | $R^{B12}$ | H |
| $L_{A1920}$ | $R^{C17}$ | $R^{B18}$ | H |
| $L_{A1921}$ | $R^{C17}$ | $R^{A3}$ | H |
| $L_{A1922}$ | $R^{C17}$ | $R^{A34}$ | H |
| $L_{A1923}$ | $R^{C19}$ | $R^{B1}$ | H |
| $L_{A1924}$ | $R^{C19}$ | $R^{B3}$ | H |
| $L_{A1925}$ | $R^{C19}$ | $R^{B4}$ | H |
| $L_{A1926}$ | $R^{C19}$ | $R^{B7}$ | H |
| $L_{A1927}$ | $R^{C19}$ | $R^{B12}$ | H |
| $L_{A1928}$ | $R^{C19}$ | $R^{B18}$ | H |
| $L_{A1929}$ | $R^{C19}$ | $R^{A3}$ | H |
| $L_{A1930}$ | $R^{C19}$ | $R^{A34}$ | H |
| $L_{A1931}$ | $R^{C21}$ | $R^{B1}$ | H |
| $L_{A1932}$ | $R^{C21}$ | $R^{B3}$ | H |
| $L_{A1933}$ | $R^{C21}$ | $R^{B4}$ | H |
| $L_{A1934}$ | $R^{C21}$ | $R^{B7}$ | H |
| $L_{A1935}$ | $R^{C21}$ | $R^{B12}$ | H |
| $L_{A1936}$ | $R^{C21}$ | $R^{B18}$ | H |
| $L_{A1937}$ | $R^{C21}$ | $R^{A3}$ | H |
| $L_{A1938}$ | $R^{C21}$ | $R^{A34}$ | H |

$L_{A1939}$ through $L_{A2778}$ that are based on a structure of Formula X,

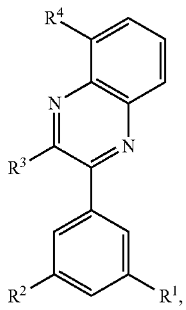

in which $R^1$, $R^2$, $R^3$, and $R^4$ are defined as:

-continued

| Ligand | $R^1$ | $R^2$ | $R^3$ | $R^4$ |
|---|---|---|---|---|
| $L_{A1939}$ | $R^{C1}$ | $R^{C1}$ | $R^{B3}$ | H |
| $L_{A1940}$ | $R^{C1}$ | $R^{C1}$ | $R^{B6}$ | H |
| $L_{A1941}$ | $R^{C1}$ | $R^{C1}$ | $R^{B7}$ | H |
| $L_{A1942}$ | $R^{C1}$ | $R^{C1}$ | $R^{B12}$ | H |
| $L_{A1943}$ | $R^{C1}$ | $R^{C1}$ | $R^{B20}$ | H |
| $L_{A1944}$ | $R^{C1}$ | $R^{C1}$ | $R^{B25}$ | H |
| $L_{A1945}$ | $R^{C1}$ | $R^{C1}$ | $R^{B29}$ | H |
| $L_{A1946}$ | $R^{C1}$ | $R^{C1}$ | $R^{A37}$ | H |
| $L_{A1947}$ | $R^{C1}$ | $R^{C1}$ | $R^{A43}$ | H |
| $L_{A1948}$ | $R^{C1}$ | $R^{C1}$ | $R^{E1}$ | H |
| $L_{A1949}$ | $R^{C1}$ | $R^{C1}$ | $R^{E2}$ | H |
| $L_{A1950}$ | $R^{C1}$ | $R^{C1}$ | $R^{E3}$ | H |
| $L_{A1951}$ | $R^{C1}$ | $R^{C1}$ | $R^{E4}$ | H |
| $L_{A1952}$ | $R^{C1}$ | $R^{C1}$ | $R^{E5}$ | H |
| $L_{A1953}$ | $R^{C1}$ | $R^{C1}$ | $R^{E6}$ | H |
| $L_{A1954}$ | $R^{C1}$ | $R^{C1}$ | $R^{E7}$ | H |
| $L_{A1955}$ | $R^{C1}$ | $R^{C1}$ | $R^{E8}$ | H |
| $L_{A1956}$ | $R^{C1}$ | $R^{C1}$ | $R^{E9}$ | H |
| $L_{A1957}$ | $R^{C1}$ | $R^{C1}$ | $R^{E10}$ | H |
| $L_{A1958}$ | $R^{C1}$ | $R^{C1}$ | $R^{E11}$ | H |
| $L_{A1959}$ | $R^{C1}$ | $R^{C1}$ | $R^{E12}$ | H |
| $L_{A1960}$ | $R^{C1}$ | $R^{C1}$ | $R^{E13}$ | H |
| $L_{A1961}$ | $R^{C1}$ | $R^{C1}$ | $R^{E14}$ | H |
| $L_{A1962}$ | $R^{C1}$ | $R^{C1}$ | $R^{E15}$ | H |
| $L_{A1963}$ | $R^{C1}$ | $R^{C1}$ | $R^{E16}$ | H |
| $L_{A1964}$ | $R^{C1}$ | $R^{C1}$ | $R^{E17}$ | H |
| $L_{A1965}$ | $R^{C1}$ | $R^{C1}$ | $R^{E18}$ | H |
| $L_{A1966}$ | $R^{C1}$ | $R^{C1}$ | $R^{E19}$ | H |
| $L_{A1967}$ | $R^{C1}$ | $R^{C1}$ | $R^{E20}$ | H |
| $L_{A1968}$ | $R^{C1}$ | $R^{C1}$ | $R^{E21}$ | H |
| $L_{A1969}$ | $R^{C1}$ | $R^{C1}$ | $R^{B3}$ | $R^{B3}$ |
| $L_{A1970}$ | $R^{C1}$ | $R^{C1}$ | $R^{B6}$ | $R^{B3}$ |
| $L_{A1971}$ | $R^{C1}$ | $R^{C1}$ | $R^{B7}$ | $R^{B3}$ |
| $L_{A1972}$ | $R^{C1}$ | $R^{C1}$ | $R^{B12}$ | $R^{B3}$ |
| $L_{A1973}$ | $R^{C1}$ | $R^{C1}$ | $R^{B20}$ | $R^{B3}$ |
| $L_{A1974}$ | $R^{C1}$ | $R^{C1}$ | $R^{B25}$ | $R^{B3}$ |
| $L_{A1975}$ | $R^{C1}$ | $R^{C1}$ | $R^{B29}$ | $R^{B3}$ |
| $L_{A1976}$ | $R^{C1}$ | $R^{C1}$ | $R^{A37}$ | $R^{B3}$ |
| $L_{A1977}$ | $R^{C1}$ | $R^{C1}$ | $R^{A43}$ | $R^{B3}$ |
| $L_{A1978}$ | $R^{C1}$ | $R^{C1}$ | $R^{E1}$ | $R^{B3}$ |
| $L_{A1979}$ | $R^{C1}$ | $R^{C1}$ | $R^{E2}$ | $R^{B3}$ |
| $L_{A1980}$ | $R^{C1}$ | $R^{C1}$ | $R^{E3}$ | $R^{B3}$ |
| $L_{A1981}$ | $R^{C1}$ | $R^{C1}$ | $R^{E4}$ | $R^{B3}$ |
| $L_{A1982}$ | $R^{C1}$ | $R^{C1}$ | $R^{E5}$ | $R^{B3}$ |
| $L_{A1983}$ | $R^{C1}$ | $R^{C1}$ | $R^{E6}$ | $R^{B3}$ |
| $L_{A1984}$ | $R^{C1}$ | $R^{C1}$ | $R^{E7}$ | $R^{B3}$ |
| $L_{A1985}$ | $R^{C1}$ | $R^{C1}$ | $R^{E8}$ | $R^{B3}$ |
| $L_{A1986}$ | $R^{C1}$ | $R^{C1}$ | $R^{E9}$ | $R^{B3}$ |
| $L_{A1987}$ | $R^{C1}$ | $R^{C1}$ | $R^{E10}$ | $R^{B3}$ |
| $L_{A1988}$ | $R^{C1}$ | $R^{C1}$ | $R^{E11}$ | $R^{B3}$ |
| $L_{A1989}$ | $R^{C1}$ | $R^{C1}$ | $R^{E12}$ | $R^{B3}$ |
| $L_{A1990}$ | $R^{C1}$ | $R^{C1}$ | $R^{E13}$ | $R^{B3}$ |
| $L_{A1991}$ | $R^{C1}$ | $R^{C1}$ | $R^{E14}$ | $R^{B3}$ |
| $L_{A1992}$ | $R^{C1}$ | $R^{C1}$ | $R^{E15}$ | $R^{B3}$ |
| $L_{A1993}$ | $R^{C1}$ | $R^{C1}$ | $R^{E16}$ | $R^{B3}$ |
| $L_{A1994}$ | $R^{C1}$ | $R^{C1}$ | $R^{E17}$ | $R^{B3}$ |
| $L_{A1995}$ | $R^{C1}$ | $R^{C1}$ | $R^{E18}$ | $R^{B3}$ |
| $L_{A1996}$ | $R^{C1}$ | $R^{C1}$ | $R^{E19}$ | $R^{B3}$ |
| $L_{A1997}$ | $R^{C1}$ | $R^{C1}$ | $R^{E20}$ | $R^{B3}$ |
| $L_{A1998}$ | $R^{C1}$ | $R^{C1}$ | $R^{E21}$ | $R^{B3}$ |
| $L_{A1999}$ | $R^{C1}$ | $R^{C1}$ | $R^{B3}$ | $R^{B4}$ |
| $L_{A2000}$ | $R^{C1}$ | $R^{C1}$ | $R^{B6}$ | $R^{B4}$ |
| $L_{A2001}$ | $R^{C1}$ | $R^{C1}$ | $R^{B7}$ | $R^{B4}$ |
| $L_{A2002}$ | $R^{C1}$ | $R^{C1}$ | $R^{B12}$ | $R^{B4}$ |
| $L_{A2003}$ | $R^{C1}$ | $R^{C1}$ | $R^{B20}$ | $R^{B4}$ |
| $L_{A2004}$ | $R^{C1}$ | $R^{C1}$ | $R^{B25}$ | $R^{B4}$ |
| $L_{A2005}$ | $R^{C1}$ | $R^{C1}$ | $R^{B29}$ | $R^{B4}$ |
| $L_{A2006}$ | $R^{C1}$ | $R^{C1}$ | $R^{A37}$ | $R^{B4}$ |
| $L_{A2007}$ | $R^{C1}$ | $R^{C1}$ | $R^{A43}$ | $R^{B4}$ |
| $L_{A2008}$ | $R^{C1}$ | $R^{C1}$ | $R^{E1}$ | $R^{B4}$ |
| $L_{A2009}$ | $R^{C1}$ | $R^{C1}$ | $R^{E2}$ | $R^{B4}$ |
| $L_{A2010}$ | $R^{C1}$ | $R^{C1}$ | $R^{E3}$ | $R^{B4}$ |
| $L_{A2011}$ | $R^{C1}$ | $R^{C1}$ | $R^{B4}$ | $R^{B4}$ |
| $L_{A2012}$ | $R^{C1}$ | $R^{C1}$ | $R^{E5}$ | $R^{B4}$ |
| $L_{A2013}$ | $R^{C1}$ | $R^{C1}$ | $R^{E6}$ | $R^{B4}$ |
| $L_{A2014}$ | $R^{C1}$ | $R^{C1}$ | $R^{E7}$ | $R^{B4}$ |
| $L_{A2015}$ | $R^{C1}$ | $R^{C1}$ | $R^{E8}$ | $R^{B4}$ |
| $L_{A2016}$ | $R^{C1}$ | $R^{C1}$ | $R^{E9}$ | $R^{B4}$ |
| $L_{A2017}$ | $R^{C1}$ | $R^{C1}$ | $R^{E10}$ | $R^{B4}$ |
| $L_{A2018}$ | $R^{C1}$ | $R^{C1}$ | $R^{E11}$ | $R^{B4}$ |
| $L_{A2019}$ | $R^{C1}$ | $R^{C1}$ | $R^{E12}$ | $R^{B4}$ |
| $L_{A2020}$ | $R^{C1}$ | $R^{C1}$ | $R^{E13}$ | $R^{B4}$ |
| $L_{A2021}$ | $R^{C1}$ | $R^{C1}$ | $R^{E14}$ | $R^{B4}$ |
| $L_{A2022}$ | $R^{C1}$ | $R^{C1}$ | $R^{E15}$ | $R^{B4}$ |
| $L_{A2023}$ | $R^{C1}$ | $R^{C1}$ | $R^{E16}$ | $R^{B4}$ |
| $L_{A2024}$ | $R^{C1}$ | $R^{C1}$ | $R^{E17}$ | $R^{B4}$ |
| $L_{A2025}$ | $R^{C1}$ | $R^{C1}$ | $R^{E18}$ | $R^{B4}$ |
| $L_{A2026}$ | $R^{C1}$ | $R^{C1}$ | $R^{E19}$ | $R^{B4}$ |
| $L_{A2027}$ | $R^{C1}$ | $R^{C1}$ | $R^{E20}$ | $R^{B4}$ |
| $L_{A2028}$ | $R^{C1}$ | $R^{C1}$ | $R^{E21}$ | $R^{B4}$ |
| $L_{A2029}$ | $R^{C1}$ | $R^{C1}$ | $R^{B3}$ | $R^{B18}$ |
| $L_{A2030}$ | $R^{C1}$ | $R^{C1}$ | $R^{B6}$ | $R^{B18}$ |
| $L_{A2031}$ | $R^{C1}$ | $R^{C1}$ | $R^{B7}$ | $R^{B18}$ |
| $L_{A2032}$ | $R^{C1}$ | $R^{C1}$ | $R^{B2}$ | $R^{B18}$ |
| $L_{A2033}$ | $R^{C1}$ | $R^{C1}$ | $R^{B20}$ | $R^{B18}$ |
| $L_{A2034}$ | $R^{C1}$ | $R^{C1}$ | $R^{B25}$ | $R^{B18}$ |
| $L_{A2035}$ | $R^{C1}$ | $R^{C1}$ | $R^{B29}$ | $R^{B18}$ |
| $L_{A2036}$ | $R^{C1}$ | $R^{C1}$ | $R^{A37}$ | $R^{B18}$ |
| $L_{A2037}$ | $R^{C1}$ | $R^{C1}$ | $R^{A43}$ | $R^{B18}$ |
| $L_{A2038}$ | $R^{C1}$ | $R^{C1}$ | $R^{E1}$ | $R^{B18}$ |
| $L_{A2039}$ | $R^{C1}$ | $R^{C1}$ | $R^{E2}$ | $R^{B18}$ |
| $L_{A2040}$ | $R^{C1}$ | $R^{C1}$ | $R^{E3}$ | $R^{B18}$ |
| $L_{A2041}$ | $R^{C1}$ | $R^{C1}$ | $R^{E4}$ | $R^{B18}$ |
| $L_{A2042}$ | $R^{C1}$ | $R^{C1}$ | $R^{E5}$ | $R^{B18}$ |
| $L_{A2043}$ | $R^{C1}$ | $R^{C1}$ | $R^{E6}$ | $R^{B18}$ |
| $L_{A2044}$ | $R^{C1}$ | $R^{C1}$ | $R^{E7}$ | $R^{B18}$ |
| $L_{A2045}$ | $R^{C1}$ | $R^{C1}$ | $R^{E8}$ | $R^{B18}$ |
| $L_{A2046}$ | $R^{C1}$ | $R^{C1}$ | $R^{E9}$ | $R^{B18}$ |
| $L_{A2047}$ | $R^{C1}$ | $R^{C1}$ | $R^{E10}$ | $R^{B18}$ |
| $L_{A2048}$ | $R^{C1}$ | $R^{C1}$ | $R^{E11}$ | $R^{B18}$ |
| $L_{A2049}$ | $R^{C1}$ | $R^{C1}$ | $R^{E12}$ | $R^{B18}$ |
| $L_{A2050}$ | $R^{C1}$ | $R^{C1}$ | $R^{E13}$ | $R^{B18}$ |
| $L_{A2051}$ | $R^{C1}$ | $R^{C1}$ | $R^{E14}$ | $R^{B18}$ |
| $L_{A2052}$ | $R^{C1}$ | $R^{C1}$ | $R^{E15}$ | $R^{B18}$ |
| $L_{A2053}$ | $R^{C1}$ | $R^{C1}$ | $R^{E16}$ | $R^{B18}$ |
| $L_{A2054}$ | $R^{C1}$ | $R^{C1}$ | $R^{E17}$ | $R^{B18}$ |
| $L_{A2055}$ | $R^{C1}$ | $R^{C1}$ | $R^{E18}$ | $R^{B18}$ |
| $L_{A2056}$ | $R^{C1}$ | $R^{C1}$ | $R^{E19}$ | $R^{B18}$ |
| $L_{A2057}$ | $R^{C1}$ | $R^{C1}$ | $R^{E20}$ | $R^{B18}$ |
| $L_{A2058}$ | $R^{C1}$ | $R^{C1}$ | $R^{E21}$ | $R^{B18}$ |
| $L_{A2059}$ | $R^{C1}$ | $R^{C1}$ | $R^{B3}$ | $R^{A3}$ |
| $L_{A2060}$ | $R^{C1}$ | $R^{C1}$ | $R^{B6}$ | $R^{A3}$ |
| $L_{A2061}$ | $R^{C1}$ | $R^{C1}$ | $R^{B7}$ | $R^{A3}$ |
| $L_{A2062}$ | $R^{C1}$ | $R^{C1}$ | $R^{B12}$ | $R^{A3}$ |
| $L_{A2063}$ | $R^{C1}$ | $R^{C1}$ | $R^{B20}$ | $R^{A3}$ |
| $L_{A2064}$ | $R^{C1}$ | $R^{C1}$ | $R^{B25}$ | $R^{A3}$ |
| $L_{A2065}$ | $R^{C1}$ | $R^{C1}$ | $R^{B29}$ | $R^{A3}$ |
| $L_{20666}$ | $R^{C1}$ | $R^{C1}$ | $R^{A37}$ | $R^{A3}$ |
| $L_{A2067}$ | $R^{C1}$ | $R^{C1}$ | $R^{A43}$ | $R^{A3}$ |
| $L_{A2068}$ | $R^{C1}$ | $R^{C1}$ | $R^{E1}$ | $R^{A3}$ |
| $L_{A2069}$ | $R^{C1}$ | $R^{C1}$ | $R^{E2}$ | $R^{A3}$ |
| $L_{A2070}$ | $R^{C1}$ | $R^{C1}$ | $R^{E3}$ | $R^{A3}$ |
| $L_{A2071}$ | $R^{C1}$ | $R^{C1}$ | $R^{E4}$ | $R^{A3}$ |
| $L_{A2072}$ | $R^{C1}$ | $R^{C1}$ | $R^{E5}$ | $R^{A3}$ |
| $L_{A2073}$ | $R^{C1}$ | $R^{C1}$ | $R^{E6}$ | $R^{A3}$ |
| $L_{A2074}$ | $R^{C1}$ | $R^{C1}$ | $R^{E7}$ | $R^{A3}$ |

-continued

| Ligand | $R^1$ | $R^2$ | $R^3$ | $R^4$ |
|---|---|---|---|---|
| $L_{A2075}$ | $R^{C1}$ | $R^{C1}$ | $R^{E8}$ | $R^{A3}$ |
| $L_{A2076}$ | $R^{C1}$ | $R^{C1}$ | $R^{E9}$ | $R^{A3}$ |
| $L_{A2077}$ | $R^{C1}$ | $R^{C1}$ | $R^{E10}$ | $R^{A3}$ |
| $L_{A2078}$ | $R^{C1}$ | $R^{C1}$ | $R^{E11}$ | $R^{A3}$ |
| $L_{A2079}$ | $R^{C1}$ | $R^{C1}$ | $R^{E12}$ | $R^{A3}$ |
| $L_{A2080}$ | $R^{C1}$ | $R^{C1}$ | $R^{E11}$ | $R^{A3}$ |
| $L_{A2081}$ | $R^{C1}$ | $R^{C1}$ | $R^{E14}$ | $R^{A3}$ |
| $L_{A2082}$ | $R^{C1}$ | $R^{C1}$ | $R^{E15}$ | $R^{A3}$ |
| $L_{A2083}$ | $R^{C1}$ | $R^{C1}$ | $R^{E16}$ | $R^{A3}$ |
| $L_{A2084}$ | $R^{C1}$ | $R^{C1}$ | $R^{E17}$ | $R^{A3}$ |
| $L_{A2085}$ | $R^{C1}$ | $R^{C1}$ | $R^{E18}$ | $R^{A3}$ |
| $L_{A2086}$ | $R^{C1}$ | $R^{C1}$ | $R^{E19}$ | $R^{A3}$ |
| $L_{A2087}$ | $R^{C1}$ | $R^{C1}$ | $R^{E20}$ | $R^{A3}$ |
| $L_{A2088}$ | $R^{C1}$ | $R^{C1}$ | $R^{E21}$ | $R^{A3}$ |
| $L_{A2089}$ | $R^{C1}$ | $R^{C1}$ | $R^{B3}$ | $R^{A34}$ |
| $L_{A2090}$ | $R^{C1}$ | $R^{C1}$ | $R^{B6}$ | $R^{A34}$ |
| $L_{A2091}$ | $R^{C1}$ | $R^{C1}$ | $R^{B7}$ | $R^{A34}$ |
| $L_{A2092}$ | $R^{C1}$ | $R^{C1}$ | $R^{B12}$ | $R^{A34}$ |
| $L_{A2093}$ | $R^{C1}$ | $R^{C1}$ | $R^{B20}$ | $R^{A34}$ |
| $L_{A2094}$ | $R^{C1}$ | $R^{C1}$ | $R^{B25}$ | $R^{A34}$ |
| $L_{A2095}$ | $R^{C1}$ | $R^{C1}$ | $R^{B29}$ | $R^{A34}$ |
| $L_{A2096}$ | $R^{C1}$ | $R^{C1}$ | $R^{A37}$ | $R^{A34}$ |
| $L_{A2097}$ | $R^{C1}$ | $R^{C1}$ | $R^{A43}$ | $R^{A34}$ |
| $L_{A2098}$ | $R^{C1}$ | $R^{C1}$ | $R^{E1}$ | $R^{A34}$ |
| $L_{A2099}$ | $R^{C1}$ | $R^{C1}$ | $R^{E2}$ | $R^{A34}$ |
| $L_{A2100}$ | $R^{C1}$ | $R^{C1}$ | $R^{E3}$ | $R^{A34}$ |
| $L_{A2101}$ | $R^{C1}$ | $R^{C1}$ | $R^{E4}$ | $R^{A34}$ |
| $L_{A2112}$ | $R^{C1}$ | $R^{C1}$ | $R^{E5}$ | $R^{A34}$ |
| $L_{A2103}$ | $R^{C1}$ | $R^{C1}$ | $R^{E6}$ | $R^{A34}$ |
| $L_{A2104}$ | $R^{C1}$ | $R^{C1}$ | $R^{E7}$ | $R^{A34}$ |
| $L_{A2105}$ | $R^{C1}$ | $R^{C1}$ | $R^{E8}$ | $R^{A34}$ |
| $L_{A2106}$ | $R^{C1}$ | $R^{C1}$ | $R^{E9}$ | $R^{A34}$ |
| $L_{A2107}$ | $R^{C1}$ | $R^{C1}$ | $R^{E10}$ | $R^{A34}$ |
| $L_{A2108}$ | $R^{C1}$ | $R^{C1}$ | $R^{E11}$ | $R^{A34}$ |
| $L_{A2109}$ | $R^{C1}$ | $R^{C1}$ | $R^{E12}$ | $R^{A34}$ |
| $L_{A2110}$ | $R^{C1}$ | $R^{C1}$ | $R^{E13}$ | $R^{A34}$ |
| $L_{A2111}$ | $R^{C1}$ | $R^{C1}$ | $R^{E14}$ | $R^{A34}$ |
| $L_{A2112}$ | $R^{C1}$ | $R^{C1}$ | $R^{E15}$ | $R^{A34}$ |
| $L_{A2113}$ | $R^{C1}$ | $R^{C1}$ | $R^{E16}$ | $R^{A34}$ |
| $L_{A2114}$ | $R^{C1}$ | $R^{C1}$ | $R^{E17}$ | $R^{A34}$ |
| $L_{A2115}$ | $R^{C1}$ | $R^{C1}$ | $R^{E18}$ | $R^{A34}$ |
| $L_{A2116}$ | $R^{C1}$ | $R^{C1}$ | $R^{E19}$ | $R^{A34}$ |
| $L_{A2117}$ | $R^{C1}$ | $R^{C1}$ | $R^{E20}$ | $R^{A34}$ |
| $L_{A2118}$ | $R^{C1}$ | $R^{C1}$ | $R^{E21}$ | $R^{A34}$ |
| $L_{A2119}$ | $R^{C1}$ | $R^{C1}$ | $R^{B3}$ | $R^{A52}$ |
| $L_{A2120}$ | $R^{C1}$ | $R^{C1}$ | $R^{B6}$ | $R^{A52}$ |
| $L_{A2121}$ | $R^{C1}$ | $R^{C1}$ | $R^{B7}$ | $R^{A52}$ |
| $L_{A2122}$ | $R^{C1}$ | $R^{C1}$ | $R^{B12}$ | $R^{A52}$ |
| $L_{A2123}$ | $R^{C1}$ | $R^{C1}$ | $R^{B20}$ | $R^{A52}$ |
| $L_{A2124}$ | $R^{C1}$ | $R^{C1}$ | $R^{B25}$ | $R^{A52}$ |
| $L_{A2125}$ | $R^{C1}$ | $R^{C1}$ | $R^{B29}$ | $R^{A52}$ |
| $L_{A2126}$ | $R^{C1}$ | $R^{C1}$ | $R^{A37}$ | $R^{A52}$ |
| $L_{A2127}$ | $R^{C1}$ | $R^{C1}$ | $R^{A43}$ | $R^{A52}$ |
| $L_{A2128}$ | $R^{C1}$ | $R^{C1}$ | $R^{E1}$ | $R^{A52}$ |
| $L_{A2129}$ | $R^{C1}$ | $R^{C1}$ | $R^{E2}$ | $R^{A52}$ |
| $L_{A2130}$ | $R^{C1}$ | $R^{C1}$ | $R^{E3}$ | $R^{A52}$ |
| $L_{A2131}$ | $R^{C1}$ | $R^{C1}$ | $R^{E4}$ | $R^{A52}$ |
| $L_{A2132}$ | $R^{C1}$ | $R^{C1}$ | $R^{E5}$ | $R^{A52}$ |
| $L_{A2133}$ | $R^{C1}$ | $R^{C1}$ | $R^{E6}$ | $R^{A52}$ |
| $L_{A2134}$ | $R^{C1}$ | $R^{C1}$ | $R^{E7}$ | $R^{A52}$ |
| $L_{A2135}$ | $R^{C1}$ | $R^{C1}$ | $R^{E8}$ | $R^{A52}$ |
| $L_{A2136}$ | $R^{C1}$ | $R^{C1}$ | $R^{E9}$ | $R^{A52}$ |
| $L_{A2137}$ | $R^{C1}$ | $R^{C1}$ | $R^{E10}$ | $R^{A52}$ |
| $L_{A2138}$ | $R^{C1}$ | $R^{C1}$ | $R^{E11}$ | $R^{A52}$ |
| $L_{A2139}$ | $R^{C1}$ | $R^{C1}$ | $R^{E12}$ | $R^{A52}$ |
| $L_{A2140}$ | $R^{C1}$ | $R^{C1}$ | $R^{E13}$ | $R^{A52}$ |
| $L_{A2141}$ | $R^{C1}$ | $R^{C1}$ | $R^{E14}$ | $R^{A52}$ |
| $L_{A2142}$ | $R^{C1}$ | $R^{C1}$ | $R^{E15}$ | $R^{A52}$ |
| $L_{A2143}$ | $R^{C1}$ | $R^{C1}$ | $R^{E16}$ | $R^{A52}$ |
| $L_{A2144}$ | $R^{C1}$ | $R^{C1}$ | $R^{E17}$ | $R^{A52}$ |
| $L_{A2145}$ | $R^{C1}$ | $R^{C1}$ | $R^{E18}$ | $R^{A52}$ |
| $L_{A2146}$ | $R^{C1}$ | $R^{C1}$ | $R^{E19}$ | $R^{A52}$ |
| $L_{A2147}$ | $R^{C1}$ | $R^{C1}$ | $R^{E20}$ | $R^{A52}$ |
| $L_{A2148}$ | $R^{C1}$ | $R^{C1}$ | $R^{E21}$ | $R^{A52}$ |
| $L_{A2149}$ | $R^{B1}$ | $R^{C3}$ | $R^{B3}$ | H |
| $L_{A2150}$ | $R^{B1}$ | $R^{C3}$ | $R^{B6}$ | H |
| $L_{A2151}$ | $R^{B1}$ | $R^{C3}$ | $R^{B7}$ | H |
| $L_{A2152}$ | $R^{B1}$ | $R^{C3}$ | $R^{B12}$ | H |
| $L_{A2153}$ | $R^{B1}$ | $R^{C3}$ | $R^{B20}$ | H |
| $L_{A2154}$ | $R^{B1}$ | $R^{C3}$ | $R^{B25}$ | H |
| $L_{A2155}$ | $R^{B1}$ | $R^{C3}$ | $R^{B29}$ | H |
| $L_{A2156}$ | $R^{B1}$ | $R^{C3}$ | $R^{A37}$ | H |
| $L_{A2157}$ | $R^{B1}$ | $R^{C3}$ | $R^{A43}$ | H |
| $L_{A2158}$ | $R^{B1}$ | $R^{C3}$ | $R^{E1}$ | H |
| $L_{A2159}$ | $R^{B1}$ | $R^{C3}$ | $R^{E2}$ | H |
| $L_{A2160}$ | $R^{B1}$ | $R^{C3}$ | $R^{E3}$ | H |
| $L_{A2161}$ | $R^{B1}$ | $R^{C3}$ | $R^{E4}$ | H |
| $L_{A2162}$ | $R^{B1}$ | $R^{C3}$ | $R^{E5}$ | H |
| $L_{A2163}$ | $R^{B1}$ | $R^{C3}$ | $R^{E6}$ | H |
| $L_{A2164}$ | $R^{B1}$ | $R^{C3}$ | $R^{E7}$ | H |
| $L_{A2165}$ | $R^{B1}$ | $R^{C3}$ | $R^{E8}$ | H |
| $L_{A2166}$ | $R^{B1}$ | $R^{C3}$ | $R^{E9}$ | H |
| $L_{A2167}$ | $R^{B1}$ | $R^{C3}$ | $R^{E10}$ | H |
| $L_{A2168}$ | $R^{B1}$ | $R^{C3}$ | $R^{E11}$ | H |
| $L_{A2169}$ | $R^{B1}$ | $R^{C3}$ | $R^{E12}$ | H |
| $L_{A2170}$ | $R^{B1}$ | $R^{C3}$ | $R^{E13}$ | H |
| $L_{A2171}$ | $R^{B1}$ | $R^{C3}$ | $R^{E14}$ | H |
| $L_{A2172}$ | $R^{B1}$ | $R^{C3}$ | $R^{E15}$ | H |
| $L_{A2173}$ | $R^{B1}$ | $R^{C3}$ | $R^{E16}$ | H |
| $L_{A2174}$ | $R^{B1}$ | $R^{C3}$ | $R^{E17}$ | H |
| $L_{A2175}$ | $R^{B1}$ | $R^{C3}$ | $R^{E18}$ | H |
| $L_{A2176}$ | $R^{B1}$ | $R^{C3}$ | $R^{E19}$ | H |
| $L_{A2177}$ | $R^{B1}$ | $R^{C3}$ | $R^{E20}$ | H |
| $L_{A2178}$ | $R^{B1}$ | $R^{C3}$ | $R^{E21}$ | H |
| $L_{A2179}$ | $R^{B1}$ | $R^{C3}$ | $R^{B3}$ | $R^{B3}$ |
| $L_{A2180}$ | $R^{B1}$ | $R^{C3}$ | $R^{B6}$ | $R^{B3}$ |
| $L_{A2181}$ | $R^{B1}$ | $R^{C3}$ | $R^{B7}$ | $R^{B3}$ |
| $L_{A2182}$ | $R^{B1}$ | $R^{C3}$ | $R^{B12}$ | $R^{B3}$ |
| $L_{A2183}$ | $R^{B1}$ | $R^{C3}$ | $R^{B20}$ | $R^{B3}$ |
| $L_{A2184}$ | $R^{B1}$ | $R^{C3}$ | $R^{B25}$ | $R^{B3}$ |
| $L_{A2185}$ | $R^{B1}$ | $R^{C3}$ | $R^{B29}$ | $R^{B3}$ |
| $L_{A2186}$ | $R^{B1}$ | $R^{C3}$ | $R^{A37}$ | $R^{B3}$ |
| $L_{A2187}$ | $R^{B1}$ | $R^{C3}$ | $R^{A43}$ | $R^{B3}$ |
| $L_{A2188}$ | $R^{B1}$ | $R^{C3}$ | $R^{E1}$ | $R^{B3}$ |
| $L_{A2189}$ | $R^{B1}$ | $R^{C3}$ | $R^{E2}$ | $R^{B3}$ |
| $L_{A2190}$ | $R^{B1}$ | $R^{C3}$ | $R^{E3}$ | $R^{B3}$ |
| $L_{A2191}$ | $R^{B1}$ | $R^{C3}$ | $R^{E4}$ | $R^{B3}$ |
| $L_{A2192}$ | $R^{B1}$ | $R^{C3}$ | $R^{E5}$ | $R^{B3}$ |
| $L_{A2193}$ | $R^{B1}$ | $R^{C3}$ | $R^{E6}$ | $R^{B3}$ |
| $L_{A2194}$ | $R^{B1}$ | $R^{C3}$ | $R^{E7}$ | $R^{B3}$ |
| $L_{A2195}$ | $R^{B1}$ | $R^{C3}$ | $R^{E8}$ | $R^{B3}$ |
| $L_{A2196}$ | $R^{B1}$ | $R^{C3}$ | $R^{E9}$ | $R^{B3}$ |
| $L_{A2197}$ | $R^{B1}$ | $R^{C3}$ | $R^{E10}$ | $R^{B3}$ |
| $L_{A2198}$ | $R^{B1}$ | $R^{C3}$ | $R^{E11}$ | $R^{B3}$ |
| $L_{A2199}$ | $R^{B1}$ | $R^{C3}$ | $R^{E12}$ | $R^{B3}$ |
| $L_{A2200}$ | $R^{B1}$ | $R^{C3}$ | $R^{E13}$ | $R^{B3}$ |
| $L_{A2201}$ | $R^{B1}$ | $R^{C3}$ | $R^{E14}$ | $R^{B3}$ |
| $L_{A2202}$ | $R^{B1}$ | $R^{C3}$ | $R^{E15}$ | $R^{B3}$ |
| $L_{A2203}$ | $R^{B1}$ | $R^{C3}$ | $R^{E16}$ | $R^{B3}$ |
| $L_{A2204}$ | $R^{B1}$ | $R^{C3}$ | $R^{E17}$ | $R^{B3}$ |
| $L_{A2205}$ | $R^{B1}$ | $R^{C3}$ | $R^{E18}$ | $R^{B3}$ |
| $L_{A2206}$ | $R^{B1}$ | $R^{C3}$ | $R^{E19}$ | $R^{B3}$ |
| $L_{A2207}$ | $R^{B1}$ | $R^{C3}$ | $R^{E20}$ | $R^{B3}$ |
| $L_{A2208}$ | $R^{B1}$ | $R^{C3}$ | $R^{E21}$ | $R^{B3}$ |
| $L_{A2209}$ | $R^{B1}$ | $R^{C3}$ | $R^{B3}$ | $R^{B4}$ |
| $L_{A2210}$ | $R^{B1}$ | $R^{C3}$ | $R^{B6}$ | $R^{B4}$ |
| $L_{A2211}$ | $R^{B1}$ | $R^{C3}$ | $R^{B7}$ | $R^{B4}$ |
| $L_{A2212}$ | $R^{B1}$ | $R^{C3}$ | $R^{B12}$ | $R^{B4}$ |
| $L_{A2213}$ | $R^{B1}$ | $R^{C3}$ | $R^{B20}$ | $R^{B4}$ |
| $L_{A2214}$ | $R^{B1}$ | $R^{C3}$ | $R^{B25}$ | $R^{B4}$ |
| $L_{A2215}$ | $R^{B1}$ | $R^{C3}$ | $R^{B29}$ | $R^{B4}$ |
| $L_{A2216}$ | $R^{B1}$ | $R^{C3}$ | $R^{A37}$ | $R^{B4}$ |
| $L_{A2217}$ | $R^{B1}$ | $R^{C3}$ | $R^{A43}$ | $R^{B4}$ |
| $L_{A2218}$ | $R^{B1}$ | $R^{C3}$ | $R^{E1}$ | $R^{B4}$ |
| $L_{A2219}$ | $R^{B1}$ | $R^{C3}$ | $R^{E2}$ | $R^{B4}$ |
| $L_{A2220}$ | $R^{B1}$ | $R^{C3}$ | $R^{E3}$ | $R^{B4}$ |
| $L_{A2221}$ | $R^{B1}$ | $R^{C3}$ | $R^{E4}$ | $R^{B4}$ |
| $L_{A2222}$ | $R^{B1}$ | $R^{C3}$ | $R^{E5}$ | $R^{B4}$ |
| $L_{A2223}$ | $R^{B1}$ | $R^{C3}$ | $R^{E6}$ | $R^{B4}$ |
| $L_{A2224}$ | $R^{B1}$ | $R^{C3}$ | $R^{E7}$ | $R^{B4}$ |
| $L_{A2225}$ | $R^{B1}$ | $R^{C3}$ | $R^{E8}$ | $R^{B4}$ |
| $L_{A2226}$ | $R^{B1}$ | $R^{C3}$ | $R^{E9}$ | $R^{B4}$ |
| $L_{A2227}$ | $R^{B1}$ | $R^{C3}$ | $R^{E10}$ | $R^{B4}$ |
| $L_{A2228}$ | $R^{B1}$ | $R^{C3}$ | $R^{E11}$ | $R^{B4}$ |

-continued

| Ligand | $R^1$ | $R^2$ | $R^3$ | $R^4$ |
|---|---|---|---|---|
| $L_{42229}$ | $R^{B1}$ | $R^{C3}$ | $R^{E12}$ | $R^{B4}$ |
| $L_{42230}$ | $R^{B1}$ | $R^{C3}$ | $R^{E13}$ | $R^{B4}$ |
| $L_{42231}$ | $R^{B1}$ | $R^{C3}$ | $R^{E14}$ | $R^{B4}$ |
| $L_{42232}$ | $R^{B1}$ | $R^{C3}$ | $R^{E15}$ | $R^{B4}$ |
| $L_{42233}$ | $R^{B1}$ | $R^{C3}$ | $R^{E16}$ | $R^{B4}$ |
| $L_{42234}$ | $R^{B1}$ | $R^{C3}$ | $R^{E17}$ | $R^{B4}$ |
| $L_{42235}$ | $R^{B1}$ | $R^{C3}$ | $R^{E18}$ | $R^{B4}$ |
| $L_{42236}$ | $R^{B1}$ | $R^{C3}$ | $R^{E19}$ | $R^{B4}$ |
| $L_{42237}$ | $R^{B1}$ | $R^{C3}$ | $R^{E20}$ | $R^{B4}$ |
| $L_{42238}$ | $R^{B1}$ | $R^{C3}$ | $R^{E21}$ | $R^{B4}$ |
| $L_{42239}$ | $R^{B1}$ | $R^{C3}$ | $R^{B3}$ | $R^{B18}$ |
| $L_{42240}$ | $R^{B1}$ | $R^{C3}$ | $R^{B6}$ | $R^{B18}$ |
| $L_{42241}$ | $R^{B1}$ | $R^{C3}$ | $R^{B7}$ | $R^{B18}$ |
| $L_{42242}$ | $R^{B1}$ | $R^{C3}$ | $R^{B12}$ | $R^{B18}$ |
| $L_{42243}$ | $R^{B1}$ | $R^{C3}$ | $R^{B20}$ | $R^{B18}$ |
| $L_{42244}$ | $R^{B1}$ | $R^{C3}$ | $R^{B25}$ | $R^{B18}$ |
| $L_{42245}$ | $R^{B1}$ | $R^{C3}$ | $R^{B29}$ | $R^{B18}$ |
| $L_{42246}$ | $R^{B1}$ | $R^{C3}$ | $R^{A37}$ | $R^{B18}$ |
| $L_{42247}$ | $R^{B1}$ | $R^{C3}$ | $R^{A43}$ | $R^{B18}$ |
| $L_{42248}$ | $R^{B1}$ | $R^{C3}$ | $R^{E1}$ | $R^{B18}$ |
| $L_{42249}$ | $R^{B1}$ | $R^{C3}$ | $R^{E2}$ | $R^{B18}$ |
| $L_{42250}$ | $R^{B1}$ | $R^{C3}$ | $R^{E3}$ | $R^{B18}$ |
| $L_{42251}$ | $R^{B1}$ | $R^{C3}$ | $R^{E4}$ | $R^{B18}$ |
| $L_{42252}$ | $R^{B1}$ | $R^{C3}$ | $R^{E5}$ | $R^{B18}$ |
| $L_{42253}$ | $R^{B1}$ | $R^{C3}$ | $R^{E6}$ | $R^{B18}$ |
| $L_{42254}$ | $R^{B1}$ | $R^{C3}$ | $R^{E7}$ | $R^{B18}$ |
| $L_{42255}$ | $R^{B1}$ | $R^{C3}$ | $R^{E8}$ | $R^{B18}$ |
| $L_{42256}$ | $R^{B1}$ | $R^{C3}$ | $R^{E9}$ | $R^{B18}$ |
| $L_{42257}$ | $R^{B1}$ | $R^{C3}$ | $R^{E10}$ | $R^{B18}$ |
| $L_{42258}$ | $R^{B1}$ | $R^{C3}$ | $R^{E11}$ | $R^{B18}$ |
| $L_{42259}$ | $R^{B1}$ | $R^{C3}$ | $R^{E12}$ | $R^{B18}$ |
| $L_{42260}$ | $R^{B1}$ | $R^{C3}$ | $R^{E13}$ | $R^{B18}$ |
| $L_{42261}$ | $R^{B1}$ | $R^{C3}$ | $R^{E14}$ | $R^{B18}$ |
| $L_{42262}$ | $R^{B1}$ | $R^{C3}$ | $R^{E15}$ | $R^{B18}$ |
| $L_{42263}$ | $R^{B1}$ | $R^{C3}$ | $R^{E16}$ | $R^{B18}$ |
| $L_{42264}$ | $R^{B1}$ | $R^{C3}$ | $R^{E17}$ | $R^{B18}$ |
| $L_{42265}$ | $R^{B1}$ | $R^{C3}$ | $R^{E18}$ | $R^{B18}$ |
| $L_{42266}$ | $R^{B1}$ | $R^{C3}$ | $R^{E19}$ | $R^{B18}$ |
| $L_{42267}$ | $R^{B1}$ | $R^{C3}$ | $R^{E20}$ | $R^{B18}$ |
| $L_{42268}$ | $R^{B1}$ | $R^{C3}$ | $R^{E21}$ | $R^{B18}$ |
| $L_{42269}$ | $R^{B1}$ | $R^{C3}$ | $R^{B3}$ | $R^{A3}$ |
| $L_{42270}$ | $R^{B1}$ | $R^{C3}$ | $R^{B6}$ | $R^{A3}$ |
| $L_{42271}$ | $R^{B1}$ | $R^{C3}$ | $R^{B7}$ | $R^{A3}$ |
| $L_{42272}$ | $R^{B1}$ | $R^{C3}$ | $R^{B12}$ | $R^{A3}$ |
| $L_{42273}$ | $R^{B1}$ | $R^{C3}$ | $R^{B20}$ | $R^{A3}$ |
| $L_{42274}$ | $R^{B1}$ | $R^{C3}$ | $R^{B25}$ | $R^{A3}$ |
| $L_{42275}$ | $R^{B1}$ | $R^{C3}$ | $R^{B29}$ | $R^{A3}$ |
| $L_{42276}$ | $R^{B1}$ | $R^{C3}$ | $R^{A37}$ | $R^{A3}$ |
| $L_{42277}$ | $R^{B1}$ | $R^{C3}$ | $R^{A43}$ | $R^{A3}$ |
| $L_{42278}$ | $R^{B1}$ | $R^{C3}$ | $R^{E1}$ | $R^{A3}$ |
| $L_{42279}$ | $R^{B1}$ | $R^{C3}$ | $R^{E2}$ | $R^{A3}$ |
| $L_{42280}$ | $R^{B1}$ | $R^{C3}$ | $R^{E3}$ | $R^{A3}$ |
| $L_{42281}$ | $R^{B1}$ | $R^{C3}$ | $R^{E4}$ | $R^{A3}$ |
| $L_{42282}$ | $R^{B1}$ | $R^{C3}$ | $R^{E5}$ | $R^{A3}$ |
| $L_{42283}$ | $R^{B1}$ | $R^{C3}$ | $R^{E6}$ | $R^{A3}$ |
| $L_{42284}$ | $R^{B1}$ | $R^{C3}$ | $R^{E7}$ | $R^{A3}$ |
| $L_{42285}$ | $R^{B1}$ | $R^{C3}$ | $R^{E8}$ | $R^{A3}$ |
| $L_{42286}$ | $R^{B1}$ | $R^{C3}$ | $R^{E9}$ | $R^{A3}$ |
| $L_{42287}$ | $R^{B1}$ | $R^{C3}$ | $R^{E10}$ | $R^{A3}$ |
| $L_{42288}$ | $R^{B1}$ | $R^{C3}$ | $R^{E11}$ | $R^{A3}$ |
| $L_{42289}$ | $R^{B1}$ | $R^{C3}$ | $R^{E12}$ | $R^{A3}$ |
| $L_{42290}$ | $R^{B1}$ | $R^{C3}$ | $R^{E13}$ | $R^{A3}$ |
| $L_{42291}$ | $R^{B1}$ | $R^{C3}$ | $R^{E14}$ | $R^{A3}$ |
| $L_{42292}$ | $R^{B1}$ | $R^{C3}$ | $R^{E15}$ | $R^{A3}$ |
| $L_{42293}$ | $R^{B1}$ | $R^{C3}$ | $R^{E16}$ | $R^{A3}$ |
| $L_{42294}$ | $R^{B1}$ | $R^{C3}$ | $R^{E17}$ | $R^{A3}$ |
| $L_{42295}$ | $R^{B1}$ | $R^{C3}$ | $R^{E18}$ | $R^{A3}$ |
| $L_{42296}$ | $R^{B1}$ | $R^{C3}$ | $R^{E19}$ | $R^{A3}$ |
| $L_{42297}$ | $R^{B1}$ | $R^{C3}$ | $R^{E20}$ | $R^{A3}$ |
| $L_{42298}$ | $R^{B1}$ | $R^{C3}$ | $R^{E21}$ | $R^{A3}$ |
| $L_{42299}$ | $R^{B1}$ | $R^{C3}$ | $R^{B3}$ | $R^{A34}$ |
| $L_{42300}$ | $R^{B1}$ | $R^{C3}$ | $R^{B6}$ | $R^{A34}$ |
| $L_{42301}$ | $R^{B1}$ | $R^{C3}$ | $R^{B7}$ | $R^{A34}$ |
| $L_{42302}$ | $R^{B1}$ | $R^{C3}$ | $R^{B12}$ | $R^{A34}$ |
| $L_{42303}$ | $R^{B1}$ | $R^{C3}$ | $R^{B20}$ | $R^{A34}$ |
| $L_{42304}$ | $R^{B1}$ | $R^{C3}$ | $R^{B25}$ | $R^{A34}$ |
| $L_{42305}$ | $R^{B1}$ | $R^{C3}$ | $R^{B29}$ | $R^{A34}$ |

-continued

| Ligand | $R^1$ | $R^2$ | $R^3$ | $R^4$ |
|---|---|---|---|---|
| $L_{42306}$ | $R^{B1}$ | $R^{C3}$ | $R^{A37}$ | $R^{A34}$ |
| $L_{42307}$ | $R^{B1}$ | $R^{C3}$ | $R^{A43}$ | $R^{A34}$ |
| $L_{42308}$ | $R^{B1}$ | $R^{C3}$ | $R^{E1}$ | $R^{A34}$ |
| $L_{42309}$ | $R^{B1}$ | $R^{C3}$ | $R^{E2}$ | $R^{A34}$ |
| $L_{42310}$ | $R^{B1}$ | $R^{C3}$ | $R^{E3}$ | $R^{A34}$ |
| $L_{42311}$ | $R^{B1}$ | $R^{C3}$ | $R^{E4}$ | $R^{A34}$ |
| $L_{42312}$ | $R^{B1}$ | $R^{C3}$ | $R^{E5}$ | $R^{A34}$ |
| $L_{42313}$ | $R^{B1}$ | $R^{C3}$ | $R^{E6}$ | $R^{A34}$ |
| $L_{42314}$ | $R^{B1}$ | $R^{C3}$ | $R^{E7}$ | $R^{A34}$ |
| $L_{42315}$ | $R^{B1}$ | $R^{C3}$ | $R^{E8}$ | $R^{A34}$ |
| $L_{42316}$ | $R^{B1}$ | $R^{C3}$ | $R^{E9}$ | $R^{A34}$ |
| $L_{42317}$ | $R^{B1}$ | $R^{C3}$ | $R^{E10}$ | $R^{A34}$ |
| $L_{42318}$ | $R^{B1}$ | $R^{C3}$ | $R^{E11}$ | $R^{A34}$ |
| $L_{42319}$ | $R^{B1}$ | $R^{C3}$ | $R^{E12}$ | $R^{A34}$ |
| $L_{42320}$ | $R^{B1}$ | $R^{C3}$ | $R^{E13}$ | $R^{A34}$ |
| $L_{42321}$ | $R^{B1}$ | $R^{C3}$ | $R^{E14}$ | $R^{A34}$ |
| $L_{42322}$ | $R^{B1}$ | $R^{C3}$ | $R^{E15}$ | $R^{A34}$ |
| $L_{42323}$ | $R^{B1}$ | $R^{C3}$ | $R^{E16}$ | $R^{A34}$ |
| $L_{42324}$ | $R^{B1}$ | $R^{C3}$ | $R^{E17}$ | $R^{A34}$ |
| $L_{42325}$ | $R^{B1}$ | $R^{C3}$ | $R^{E18}$ | $R^{A34}$ |
| $L_{42326}$ | $R^{B1}$ | $R^{C3}$ | $R^{E19}$ | $R^{A34}$ |
| $L_{42327}$ | $R^{B1}$ | $R^{C3}$ | $R^{E20}$ | $R^{A34}$ |
| $L_{42328}$ | $R^{B1}$ | $R^{C3}$ | $R^{E21}$ | $R^{A34}$ |
| $L_{42329}$ | $R^{B1}$ | $R^{C3}$ | $R^{B3}$ | $R^{A52}$ |
| $L_{42330}$ | $R^{B1}$ | $R^{C3}$ | $R^{B6}$ | $R^{A52}$ |
| $L_{42331}$ | $R^{B1}$ | $R^{C3}$ | $R^{B7}$ | $R^{A52}$ |
| $L_{42332}$ | $R^{B1}$ | $R^{C3}$ | $R^{B12}$ | $R^{A52}$ |
| $L_{42333}$ | $R^{B1}$ | $R^{C3}$ | $R^{B20}$ | $R^{A52}$ |
| $L_{42334}$ | $R^{B1}$ | $R^{C3}$ | $R^{B25}$ | $R^{A52}$ |
| $L_{42335}$ | $R^{B1}$ | $R^{C3}$ | $R^{B29}$ | $R^{A52}$ |
| $L_{42336}$ | $R^{B1}$ | $R^{C3}$ | $R^{A37}$ | $R^{A52}$ |
| $L_{42337}$ | $R^{B1}$ | $R^{C3}$ | $R^{A43}$ | $R^{A52}$ |
| $L_{42338}$ | $R^{B1}$ | $R^{C3}$ | $R^{E1}$ | $R^{A52}$ |
| $L_{42339}$ | $R^{B1}$ | $R^{C3}$ | $R^{E2}$ | $R^{A52}$ |
| $L_{42340}$ | $R^{B1}$ | $R^{C3}$ | $R^{E3}$ | $R^{A52}$ |
| $L_{42341}$ | $R^{B1}$ | $R^{C3}$ | $R^{E4}$ | $R^{A52}$ |
| $L_{42342}$ | $R^{B1}$ | $R^{C3}$ | $R^{E5}$ | $R^{A52}$ |
| $L_{42343}$ | $R^{B1}$ | $R^{C3}$ | $R^{E6}$ | $R^{A52}$ |
| $L_{42344}$ | $R^{B1}$ | $R^{C3}$ | $R^{E7}$ | $R^{A52}$ |
| $L_{42345}$ | $R^{B1}$ | $R^{C3}$ | $R^{E8}$ | $R^{A52}$ |
| $L_{42346}$ | $R^{B1}$ | $R^{C3}$ | $R^{E9}$ | $R^{A52}$ |
| $L_{42347}$ | $R^{B1}$ | $R^{C3}$ | $R^{E10}$ | $R^{A52}$ |
| $L_{42348}$ | $R^{B1}$ | $R^{C3}$ | $R^{E11}$ | $R^{A52}$ |
| $L_{42349}$ | $R^{B1}$ | $R^{C3}$ | $R^{E12}$ | $R^{A52}$ |
| $L_{42350}$ | $R^{B1}$ | $R^{C3}$ | $R^{E13}$ | $R^{A52}$ |
| $L_{42351}$ | $R^{B1}$ | $R^{C3}$ | $R^{E14}$ | $R^{A52}$ |
| $L_{42352}$ | $R^{B1}$ | $R^{C3}$ | $R^{E15}$ | $R^{A52}$ |
| $L_{42353}$ | $R^{B1}$ | $R^{C3}$ | $R^{E16}$ | $R^{A52}$ |
| $L_{42354}$ | $R^{B1}$ | $R^{C3}$ | $R^{E17}$ | $R^{A52}$ |
| $L_{42355}$ | $R^{B1}$ | $R^{C3}$ | $R^{E18}$ | $R^{A52}$ |
| $L_{42356}$ | $R^{B1}$ | $R^{C3}$ | $R^{E19}$ | $R^{A52}$ |
| $L_{42357}$ | $R^{B1}$ | $R^{C3}$ | $R^{E20}$ | $R^{A52}$ |
| $L_{42358}$ | $R^{B1}$ | $R^{C3}$ | $R^{E21}$ | $R^{A52}$ |
| $L_{42359}$ | $R^{B1}$ | $R^{C17}$ | $R^{B3}$ | H |
| $L_{42360}$ | $R^{B1}$ | $R^{C17}$ | $R^{B6}$ | H |
| $L_{42361}$ | $R^{B1}$ | $R^{C17}$ | $R^{B7}$ | H |
| $L_{42362}$ | $R^{B1}$ | $R^{C17}$ | $R^{B12}$ | H |
| $L_{42363}$ | $R^{B1}$ | $R^{C17}$ | $R^{B20}$ | H |
| $L_{42364}$ | $R^{B1}$ | $R^{C17}$ | $R^{B25}$ | H |
| $L_{42365}$ | $R^{B1}$ | $R^{C17}$ | $R^{B29}$ | H |
| $L_{42366}$ | $R^{B1}$ | $R^{C17}$ | $R^{A37}$ | H |
| $L_{42367}$ | $R^{B1}$ | $R^{C17}$ | $R^{A43}$ | H |
| $L_{42368}$ | $R^{B1}$ | $R^{C17}$ | $R^{E1}$ | H |
| $L_{42369}$ | $R^{B1}$ | $R^{C17}$ | $R^{E2}$ | H |
| $L_{42370}$ | $R^{B1}$ | $R^{C17}$ | $R^{E3}$ | H |
| $L_{42371}$ | $R^{B1}$ | $R^{C17}$ | $R^{E4}$ | H |
| $L_{42372}$ | $R^{B1}$ | $R^{C17}$ | $R^{E5}$ | H |
| $L_{42373}$ | $R^{B1}$ | $R^{C17}$ | $R^{E6}$ | H |
| $L_{42374}$ | $R^{B1}$ | $R^{C17}$ | $R^{E7}$ | H |
| $L_{42375}$ | $R^{B1}$ | $R^{C17}$ | $R^{E8}$ | H |
| $L_{42376}$ | $R^{B1}$ | $R^{C17}$ | $R^{E9}$ | H |
| $L_{42377}$ | $R^{B1}$ | $R^{C17}$ | $R^{E10}$ | H |
| $L_{42378}$ | $R^{B1}$ | $R^{C17}$ | $R^{E11}$ | H |
| $L_{42379}$ | $R^{B1}$ | $R^{C17}$ | $R^{E12}$ | H |
| $L_{42380}$ | $R^{B1}$ | $R^{C17}$ | $R^{E13}$ | H |
| $L_{42381}$ | $R^{B1}$ | $R^{C17}$ | $R^{E14}$ | H |
| $L_{42382}$ | $R^{B1}$ | $R^{C17}$ | $R^{E15}$ | H |

-continued

| Ligand | $R^1$ | $R^2$ | $R^3$ | $R^4$ |
|---|---|---|---|---|
| $L_{42383}$ | $R^{B1}$ | $R^{C17}$ | $R^{E16}$ | H |
| $L_{42384}$ | $R^{B1}$ | $R^{C17}$ | $R^{E17}$ | H |
| $L_{42385}$ | $R^{B1}$ | $R^{C17}$ | $R^{E18}$ | H |
| $L_{42386}$ | $R^{B1}$ | $R^{C17}$ | $R^{E19}$ | H |
| $L_{42387}$ | $R^{B1}$ | $R^{C17}$ | $R^{E20}$ | H |
| $L_{42388}$ | $R^{B1}$ | $R^{C17}$ | $R^{E21}$ | H |
| $L_{42389}$ | $R^{B1}$ | $R^{C17}$ | $R^{B3}$ | $R^{B3}$ |
| $L_{42390}$ | $R^{B1}$ | $R^{C17}$ | $R^{B6}$ | $R^{B3}$ |
| $L_{42391}$ | $R^{B1}$ | $R^{C17}$ | $R^{B7}$ | $R^{B3}$ |
| $L_{42392}$ | $R^{B1}$ | $R^{C17}$ | $R^{B12}$ | $R^{B3}$ |
| $L_{42393}$ | $R^{B1}$ | $R^{C17}$ | $R^{B20}$ | $R^{B3}$ |
| $L_{42394}$ | $R^{B1}$ | $R^{C17}$ | $R^{B25}$ | $R^{B3}$ |
| $L_{42395}$ | $R^{B1}$ | $R^{C17}$ | $R^{B29}$ | $R^{B3}$ |
| $L_{42396}$ | $R^{B1}$ | $R^{C17}$ | $R^{A37}$ | $R^{B3}$ |
| $L_{42397}$ | $R^{B1}$ | $R^{C17}$ | $R^{A43}$ | $R^{B3}$ |
| $L_{42398}$ | $R^{B1}$ | $R^{C17}$ | $R^{E1}$ | $R^{B3}$ |
| $L_{42399}$ | $R^{B1}$ | $R^{C17}$ | $R^{E2}$ | $R^{B3}$ |
| $L_{42400}$ | $R^{B1}$ | $R^{C17}$ | $R^{E3}$ | $R^{B3}$ |
| $L_{42401}$ | $R^{B1}$ | $R^{C17}$ | $R^{E4}$ | $R^{B3}$ |
| $L_{42402}$ | $R^{B1}$ | $R^{C17}$ | $R^{E5}$ | $R^{B3}$ |
| $L_{42403}$ | $R^{B1}$ | $R^{C17}$ | $R^{E6}$ | $R^{B3}$ |
| $L_{42404}$ | $R^{B1}$ | $R^{C17}$ | $R^{E7}$ | $R^{B3}$ |
| $L_{42405}$ | $R^{B1}$ | $R^{C17}$ | $R^{E8}$ | $R^{B3}$ |
| $L_{42406}$ | $R^{B1}$ | $R^{C17}$ | $R^{E9}$ | $R^{B3}$ |
| $L_{42407}$ | $R^{B1}$ | $R^{C17}$ | $R^{E10}$ | $R^{B3}$ |
| $L_{42408}$ | $R^{B1}$ | $R^{C17}$ | $R^{E11}$ | $R^{B3}$ |
| $L_{42409}$ | $R^{B1}$ | $R^{C17}$ | $R^{E12}$ | $R^{B3}$ |
| $L_{42410}$ | $R^{B1}$ | $R^{C17}$ | $R^{E13}$ | $R^{B3}$ |
| $L_{42411}$ | $R^{B1}$ | $R^{C17}$ | $R^{E14}$ | $R^{B3}$ |
| $L_{42412}$ | $R^{B1}$ | $R^{C17}$ | $R^{E15}$ | $R^{B3}$ |
| $L_{42413}$ | $R^{B1}$ | $R^{C17}$ | $R^{E6}$ | $R^{B3}$ |
| $L_{42414}$ | $R^{B1}$ | $R^{C17}$ | $R^{E17}$ | $R^{B3}$ |
| $L_{42415}$ | $R^{B1}$ | $R^{C17}$ | $R^{E18}$ | $R^{B3}$ |
| $L_{42416}$ | $R^{B1}$ | $R^{C17}$ | $R^{E19}$ | $R^{B3}$ |
| $L_{42417}$ | $R^{B1}$ | $R^{C17}$ | $R^{E20}$ | $R^{B3}$ |
| $L_{42418}$ | $R^{B1}$ | $R^{C17}$ | $R^{E21}$ | $R^{B3}$ |
| $L_{42419}$ | $R^{B1}$ | $R^{C17}$ | $R^{B3}$ | $R^{B4}$ |
| $L_{42420}$ | $R^{B1}$ | $R^{C17}$ | $R^{B6}$ | $R^{B4}$ |
| $L_{42421}$ | $R^{B1}$ | $R^{C17}$ | $R^{B7}$ | $R^{B4}$ |
| $L_{42422}$ | $R^{B1}$ | $R^{C17}$ | $R^{B12}$ | $R^{B4}$ |
| $L_{42423}$ | $R^{B1}$ | $R^{C17}$ | $R^{B20}$ | $R^{B4}$ |
| $L_{42424}$ | $R^{B1}$ | $R^{C17}$ | $R^{B25}$ | $R^{B4}$ |
| $L_{42425}$ | $R^{B1}$ | $R^{C17}$ | $R^{B29}$ | $R^{B4}$ |
| $L_{42426}$ | $R^{B1}$ | $R^{C17}$ | $R^{A37}$ | $R^{B4}$ |
| $L_{42427}$ | $R^{B1}$ | $R^{C17}$ | $R^{A43}$ | $R^{B4}$ |
| $L_{42428}$ | $R^{B1}$ | $R^{C17}$ | $R^{E1}$ | $R^{B4}$ |
| $L_{42429}$ | $R^{B1}$ | $R^{C17}$ | $R^{E2}$ | $R^{B4}$ |
| $L_{42430}$ | $R^{B1}$ | $R^{C17}$ | $R^{E3}$ | $R^{B4}$ |
| $L_{42431}$ | $R^{B1}$ | $R^{C17}$ | $R^{E4}$ | $R^{B4}$ |
| $L_{42432}$ | $R^{B1}$ | $R^{C17}$ | $R^{E5}$ | $R^{B4}$ |
| $L_{42433}$ | $R^{B1}$ | $R^{C17}$ | $R^{E6}$ | $R^{B4}$ |
| $L_{42434}$ | $R^{B1}$ | $R^{C17}$ | $R^{E7}$ | $R^{B4}$ |
| $L_{42435}$ | $R^{B1}$ | $R^{C17}$ | $R^{E8}$ | $R^{B4}$ |
| $L_{42436}$ | $R^{B1}$ | $R^{C17}$ | $R^{E9}$ | $R^{B4}$ |
| $L_{42437}$ | $R^{B1}$ | $R^{C17}$ | $R^{E10}$ | $R^{B4}$ |
| $L_{42438}$ | $R^{B1}$ | $R^{C17}$ | $R^{E11}$ | $R^{B4}$ |
| $L_{42439}$ | $R^{B1}$ | $R^{C17}$ | $R^{E12}$ | $R^{B4}$ |
| $L_{42440}$ | $R^{B1}$ | $R^{C17}$ | $R^{E13}$ | $R^{B4}$ |
| $L_{42441}$ | $R^{B1}$ | $R^{C17}$ | $R^{E14}$ | $R^{B4}$ |
| $L_{42442}$ | $R^{B1}$ | $R^{C17}$ | $R^{E15}$ | $R^{B4}$ |
| $L_{42443}$ | $R^{B1}$ | $R^{C17}$ | $R^{E16}$ | $R^{B4}$ |
| $L_{42444}$ | $R^{B1}$ | $R^{C17}$ | $R^{E17}$ | $R^{B4}$ |
| $L_{42445}$ | $R^{B1}$ | $R^{C17}$ | $R^{E18}$ | $R^{B4}$ |
| $L_{42446}$ | $R^{B1}$ | $R^{C17}$ | $R^{E19}$ | $R^{B4}$ |
| $L_{42447}$ | $R^{B1}$ | $R^{C17}$ | $R^{E20}$ | $R^{B4}$ |
| $L_{42448}$ | $R^{B1}$ | $R^{C17}$ | $R^{E21}$ | $R^{B4}$ |
| $L_{42449}$ | $R^{B1}$ | $R^{C17}$ | $R^{B3}$ | $R^{B18}$ |
| $L_{42450}$ | $R^{B1}$ | $R^{C17}$ | $R^{B6}$ | $R^{B18}$ |
| $L_{42451}$ | $R^{B1}$ | $R^{C17}$ | $R^{B7}$ | $R^{B18}$ |
| $L_{42452}$ | $R^{B1}$ | $R^{C17}$ | $R^{B12}$ | $R^{B18}$ |
| $L_{42453}$ | $R^{B1}$ | $R^{C17}$ | $R^{B20}$ | $R^{B18}$ |
| $L_{42454}$ | $R^{B1}$ | $R^{C17}$ | $R^{B25}$ | $R^{B18}$ |
| $L_{42455}$ | $R^{B1}$ | $R^{C17}$ | $R^{B29}$ | $R^{B18}$ |
| $L_{42456}$ | $R^{B1}$ | $R^{C17}$ | $R^{A37}$ | $R^{B18}$ |
| $L_{42457}$ | $R^{B1}$ | $R^{C17}$ | $R^{A43}$ | $R^{B18}$ |
| $L_{42458}$ | $R^{B1}$ | $R^{C17}$ | $R^{E1}$ | $R^{B18}$ |
| $L_{42459}$ | $R^{B1}$ | $R^{C17}$ | $R^{E2}$ | $R^{B18}$ |
| $L_{42460}$ | $R^{B1}$ | $R^{C17}$ | $R^{E3}$ | $R^{B18}$ |
| $L_{42461}$ | $R^{B1}$ | $R^{C17}$ | $R^{E4}$ | $R^{B18}$ |
| $L_{42462}$ | $R^{B1}$ | $R^{C17}$ | $R^{E5}$ | $R^{B18}$ |
| $L_{42463}$ | $R^{B1}$ | $R^{C17}$ | $R^{E6}$ | $R^{B18}$ |
| $L_{42464}$ | $R^{B1}$ | $R^{C17}$ | $R^{E7}$ | $R^{B18}$ |
| $L_{42465}$ | $R^{B1}$ | $R^{C17}$ | $R^{E8}$ | $R^{B18}$ |
| $L_{42466}$ | $R^{B1}$ | $R^{C17}$ | $R^{E9}$ | $R^{B18}$ |
| $L_{42467}$ | $R^{B1}$ | $R^{C17}$ | $R^{E10}$ | $R^{B18}$ |
| $L_{42468}$ | $R^{B1}$ | $R^{C17}$ | $R^{E11}$ | $R^{B18}$ |
| $L_{42469}$ | $R^{B1}$ | $R^{C17}$ | $R^{E12}$ | $R^{B18}$ |
| $L_{42470}$ | $R^{B1}$ | $R^{C17}$ | $R^{E13}$ | $R^{B18}$ |
| $L_{42471}$ | $R^{B1}$ | $R^{C17}$ | $R^{E14}$ | $R^{B18}$ |
| $L_{42472}$ | $R^{B1}$ | $R^{C17}$ | $R^{E15}$ | $R^{B18}$ |
| $L_{42473}$ | $R^{B1}$ | $R^{C17}$ | $R^{E16}$ | $R^{B18}$ |
| $L_{42474}$ | $R^{B1}$ | $R^{C17}$ | $R^{E17}$ | $R^{B18}$ |
| $L_{42475}$ | $R^{B1}$ | $R^{C17}$ | $R^{E18}$ | $R^{B18}$ |
| $L_{42476}$ | $R^{B1}$ | $R^{C17}$ | $R^{E19}$ | $R^{B18}$ |
| $L_{42477}$ | $R^{B1}$ | $R^{C17}$ | $R^{E20}$ | $R^{B18}$ |
| $L_{42478}$ | $R^{B1}$ | $R^{C17}$ | $R^{E21}$ | $R^{B18}$ |
| $L_{42479}$ | $R^{B1}$ | $R^{C17}$ | $R^{B3}$ | $R^{A3}$ |
| $L_{42480}$ | $R^{B1}$ | $R^{C17}$ | $R^{B6}$ | $R^{A3}$ |
| $L_{42481}$ | $R^{B1}$ | $R^{C17}$ | $R^{B7}$ | $R^{A3}$ |
| $L_{42482}$ | $R^{B1}$ | $R^{C17}$ | $R^{B12}$ | $R^{A3}$ |
| $L_{42483}$ | $R^{B1}$ | $R^{C17}$ | $R^{B20}$ | $R^{A3}$ |
| $L_{42484}$ | $R^{B1}$ | $R^{C17}$ | $R^{B25}$ | $R^{A3}$ |
| $L_{42485}$ | $R^{B1}$ | $R^{C17}$ | $R^{B29}$ | $R^{A3}$ |
| $L_{42486}$ | $R^{B1}$ | $R^{C17}$ | $R^{A37}$ | $R^{A3}$ |
| $L_{42487}$ | $R^{B1}$ | $R^{C17}$ | $R^{A43}$ | $R^{A3}$ |
| $L_{42488}$ | $R^{B1}$ | $R^{C17}$ | $R^{E1}$ | $R^{A3}$ |
| $L_{42489}$ | $R^{B1}$ | $R^{C17}$ | $R^{E2}$ | $R^{A3}$ |
| $L_{42490}$ | $R^{B1}$ | $R^{C17}$ | $R^{E3}$ | $R^{A3}$ |
| $L_{42491}$ | $R^{B1}$ | $R^{C17}$ | $R^{E4}$ | $R^{A3}$ |
| $L_{42492}$ | $R^{B1}$ | $R^{C17}$ | $R^{E5}$ | $R^{A3}$ |
| $L_{42493}$ | $R^{B1}$ | $R^{C17}$ | $R^{E6}$ | $R^{A3}$ |
| $L_{42494}$ | $R^{B1}$ | $R^{C17}$ | $R^{E7}$ | $R^{A3}$ |
| $L_{42495}$ | $R^{B1}$ | $R^{C17}$ | $R^{E8}$ | $R^{A3}$ |
| $L_{42496}$ | $R^{B1}$ | $R^{C17}$ | $R^{E9}$ | $R^{A3}$ |
| $L_{42497}$ | $R^{B1}$ | $R^{C17}$ | $R^{E10}$ | $R^{A3}$ |
| $L_{42498}$ | $R^{B1}$ | $R^{C17}$ | $R^{E11}$ | $R^{A3}$ |
| $L_{42499}$ | $R^{B1}$ | $R^{C17}$ | $R^{E12}$ | $R^{A3}$ |
| $L_{42500}$ | $R^{B1}$ | $R^{C17}$ | $R^{E13}$ | $R^{A3}$ |
| $L_{42501}$ | $R^{B1}$ | $R^{C17}$ | $R^{E14}$ | $R^{A3}$ |
| $L_{42502}$ | $R^{B1}$ | $R^{C17}$ | $R^{E15}$ | $R^{A3}$ |
| $L_{42503}$ | $R^{B1}$ | $R^{C17}$ | $R^{E16}$ | $R^{A3}$ |
| $L_{42504}$ | $R^{B1}$ | $R^{C17}$ | $R^{C17}$ | $R^{A3}$ |
| $L_{42505}$ | $R^{B1}$ | $R^{C17}$ | $R^{E18}$ | $R^{A3}$ |
| $L_{42506}$ | $R^{B1}$ | $R^{C17}$ | $R^{E19}$ | $R^{A3}$ |
| $L_{42507}$ | $R^{B1}$ | $R^{C17}$ | $R^{E20}$ | $R^{A3}$ |
| $L_{42508}$ | $R^{B1}$ | $R^{C17}$ | $R^{E21}$ | $R^{A3}$ |
| $L_{42509}$ | $R^{B1}$ | $R^{C17}$ | $R^{B3}$ | $R^{A34}$ |
| $L_{42510}$ | $R^{B1}$ | $R^{C17}$ | $R^{B6}$ | $R^{A34}$ |
| $L_{42511}$ | $R^{B1}$ | $R^{C17}$ | $R^{B7}$ | $R^{A34}$ |
| $L_{42512}$ | $R^{B1}$ | $R^{C17}$ | $R^{B12}$ | $R^{A34}$ |
| $L_{42513}$ | $R^{B1}$ | $R^{C17}$ | $R^{B20}$ | $R^{A34}$ |
| $L_{42514}$ | $R^{B1}$ | $R^{C17}$ | $R^{B25}$ | $R^{A34}$ |
| $L_{42515}$ | $R^{B1}$ | $R^{C17}$ | $R^{B29}$ | $R^{A34}$ |
| $L_{42516}$ | $R^{B1}$ | $R^{C17}$ | $R^{A37}$ | $R^{A34}$ |
| $L_{42517}$ | $R^{B1}$ | $R^{C17}$ | $R^{A43}$ | $R^{A34}$ |
| $L_{42518}$ | $R^{B1}$ | $R^{C17}$ | $R^{E1}$ | $R^{A34}$ |
| $L_{42519}$ | $R^{B1}$ | $R^{C17}$ | $R^{E2}$ | $R^{A34}$ |
| $L_{42520}$ | $R^{B1}$ | $R^{C17}$ | $R^{E3}$ | $R^{A34}$ |
| $L_{42521}$ | $R^{B1}$ | $R^{C17}$ | $R^{E4}$ | $R^{A34}$ |
| $L_{42522}$ | $R^{B1}$ | $R^{C17}$ | $R^{E5}$ | $R^{A34}$ |
| $L_{42523}$ | $R^{B1}$ | $R^{C17}$ | $R^{E6}$ | $R^{A34}$ |
| $L_{42524}$ | $R^{B1}$ | $R^{C17}$ | $R^{E7}$ | $R^{A34}$ |
| $L_{42525}$ | $R^{B1}$ | $R^{C17}$ | $R^{E8}$ | $R^{A34}$ |
| $L_{42526}$ | $R^{B1}$ | $R^{C17}$ | $R^{E9}$ | $R^{A34}$ |
| $L_{42527}$ | $R^{B1}$ | $R^{C17}$ | $R^{E10}$ | $R^{A34}$ |
| $L_{42528}$ | $R^{B1}$ | $R^{C17}$ | $R^{E11}$ | $R^{A34}$ |
| $L_{42529}$ | $R^{B1}$ | $R^{C17}$ | $R^{E12}$ | $R^{A34}$ |
| $L_{42530}$ | $R^{B1}$ | $R^{C17}$ | $R^{E13}$ | $R^{A34}$ |
| $L_{42531}$ | $R^{B1}$ | $R^{C17}$ | $R^{E14}$ | $R^{A34}$ |
| $L_{42532}$ | $R^{B1}$ | $R^{C17}$ | $R^{E15}$ | $R^{A34}$ |
| $L_{42533}$ | $R^{B1}$ | $R^{C17}$ | $R^{E16}$ | $R^{A34}$ |
| $L_{42534}$ | $R^{B1}$ | $R^{C17}$ | $R^{E17}$ | $R^{A34}$ |
| $L_{42535}$ | $R^{B1}$ | $R^{C17}$ | $R^{E18}$ | $R^{A34}$ |
| $L_{42536}$ | $R^{B1}$ | $R^{C17}$ | $R^{E19}$ | $R^{A34}$ |

-continued

| Ligand | $R^1$ | $R^2$ | $R^3$ | $R^4$ |
|---|---|---|---|---|
| $L_{A2537}$ | $R^{B1}$ | $R^{C17}$ | $R^{E20}$ | $R^{A34}$ |
| $L_{A2538}$ | $R^{B1}$ | $R^{C17}$ | $R^{E21}$ | $R^{A34}$ |
| $L_{A2539}$ | $R^{B1}$ | $R^{C17}$ | $R^{B3}$ | $R^{A52}$ |
| $L_{A2540}$ | $R^{B1}$ | $R^{C17}$ | $R^{B6}$ | $R^{A52}$ |
| $L_{A2541}$ | $R^{B1}$ | $R^{C17}$ | $R^{B7}$ | $R^{A52}$ |
| $L_{A2542}$ | $R^{B1}$ | $R^{C17}$ | $R^{B12}$ | $R^{A52}$ |
| $L_{A2543}$ | $R^{B1}$ | $R^{C17}$ | $R^{B20}$ | $R^{A52}$ |
| $L_{A2544}$ | $R^{B1}$ | $R^{C17}$ | $R^{B25}$ | $R^{A52}$ |
| $L_{A2545}$ | $R^{B1}$ | $R^{C17}$ | $R^{B29}$ | $R^{A52}$ |
| $L_{A2546}$ | $R^{B1}$ | $R^{C17}$ | $R^{A37}$ | $R^{A52}$ |
| $L_{A2547}$ | $R^{B1}$ | $R^{C17}$ | $R^{A43}$ | $R^{A52}$ |
| $L_{A2548}$ | $R^{B1}$ | $R^{C17}$ | $R^{E1}$ | $R^{A52}$ |
| $L_{A2549}$ | $R^{B1}$ | $R^{C17}$ | $R^{E2}$ | $R^{A52}$ |
| $L_{A2550}$ | $R^{B1}$ | $R^{C17}$ | $R^{E3}$ | $R^{A52}$ |
| $L_{A2551}$ | $R^{B1}$ | $R^{C17}$ | $R^{E4}$ | $R^{A52}$ |
| $L_{A2552}$ | $R^{B1}$ | $R^{C17}$ | $R^{E5}$ | $R^{A52}$ |
| $L_{A2553}$ | $R^{B1}$ | $R^{C17}$ | $R^{E6}$ | $R^{A52}$ |
| $L_{A2554}$ | $R^{B1}$ | $R^{C17}$ | $R^{E7}$ | $R^{A52}$ |
| $L_{A2555}$ | $R^{B1}$ | $R^{C17}$ | $R^{E8}$ | $R^{A52}$ |
| $L_{A2556}$ | $R^{B1}$ | $R^{C17}$ | $R^{E9}$ | $R^{A52}$ |
| $L_{A2557}$ | $R^{B1}$ | $R^{C17}$ | $R^{E10}$ | $R^{A52}$ |
| $L_{A2558}$ | $R^{B1}$ | $R^{C17}$ | $R^{E11}$ | $R^{A52}$ |
| $L_{A2559}$ | $R^{B1}$ | $R^{C17}$ | $R^{E12}$ | $R^{A52}$ |
| $L_{A2560}$ | $R^{B1}$ | $R^{C17}$ | $R^{E13}$ | $R^{A52}$ |
| $L_{A2561}$ | $R^{B1}$ | $R^{C17}$ | $R^{E14}$ | $R^{A52}$ |
| $L_{A2562}$ | $R^{B1}$ | $R^{C17}$ | $R^{E15}$ | $R^{A52}$ |
| $L_{A2563}$ | $R^{B1}$ | $R^{C17}$ | $R^{E16}$ | $R^{A52}$ |
| $L_{A2564}$ | $R^{B1}$ | $R^{C17}$ | $R^{E17}$ | $R^{A52}$ |
| $L_{A2565}$ | $R^{B1}$ | $R^{C17}$ | $R^{E18}$ | $R^{A52}$ |
| $L_{A2566}$ | $R^{B1}$ | $R^{C17}$ | $R^{E19}$ | $R^{A52}$ |
| $L_{A2567}$ | $R^{B1}$ | $R^{C17}$ | $R^{E20}$ | $R^{A52}$ |
| $L_{A2568}$ | $R^{B1}$ | $R^{C17}$ | $R^{E21}$ | $R^{A52}$ |
| $L_{A2569}$ | $R^{B1}$ | $R^{C30}$ | $R^{B3}$ | H |
| $L_{A2570}$ | $R^{B1}$ | $R^{C30}$ | $R^{B6}$ | H |
| $L_{A2571}$ | $R^{B1}$ | $R^{C30}$ | $R^{B7}$ | H |
| $L_{A2572}$ | $R^{B1}$ | $R^{C30}$ | $R^{B12}$ | H |
| $L_{A2573}$ | $R^{B1}$ | $R^{C30}$ | $R^{B20}$ | H |
| $L_{A2574}$ | $R^{B1}$ | $R^{C30}$ | $R^{B25}$ | H |
| $L_{A2575}$ | $R^{B1}$ | $R^{C30}$ | $R^{B29}$ | H |
| $L_{A2576}$ | $R^{B1}$ | $R^{C30}$ | $R^{A37}$ | H |
| $L_{A2577}$ | $R^{B1}$ | $R^{C30}$ | $R^{A43}$ | H |
| $L_{A2578}$ | $R^{B1}$ | $R^{C30}$ | $R^{E1}$ | H |
| $L_{A2579}$ | $R^{B1}$ | $R^{C30}$ | $R^{E2}$ | H |
| $L_{A2580}$ | $R^{B1}$ | $R^{C30}$ | $R^{E3}$ | H |
| $L_{A2581}$ | $R^{B1}$ | $R^{C30}$ | $R^{E4}$ | H |
| $L_{A2582}$ | $R^{B1}$ | $R^{C30}$ | $R^{E5}$ | H |
| $L_{A2583}$ | $R^{B1}$ | $R^{C30}$ | $R^{E6}$ | H |
| $L_{A2584}$ | $R^{B1}$ | $R^{C30}$ | $R^{E7}$ | H |
| $L_{A2585}$ | $R^{B1}$ | $R^{C30}$ | $R^{E8}$ | H |
| $L_{A2586}$ | $R^{B1}$ | $R^{C30}$ | $R^{E9}$ | H |
| $L_{A2587}$ | $R^{B1}$ | $R^{C30}$ | $R^{E10}$ | H |
| $L_{A2588}$ | $R^{B1}$ | $R^{C30}$ | $R^{E11}$ | H |
| $L_{A2589}$ | $R^{B1}$ | $R^{C30}$ | $R^{E12}$ | H |
| $L_{A2590}$ | $R^{B1}$ | $R^{C30}$ | $R^{E13}$ | H |
| $L_{A2591}$ | $R^{B1}$ | $R^{C30}$ | $R^{E14}$ | H |
| $L_{A2592}$ | $R^{B1}$ | $R^{C30}$ | $R^{E15}$ | H |
| $L_{A2593}$ | $R^{B1}$ | $R^{C30}$ | $R^{E16}$ | H |
| $L_{A2594}$ | $R^{B1}$ | $R^{C30}$ | $R^{E17}$ | H |
| $L_{A2595}$ | $R^{B1}$ | $R^{C30}$ | $R^{E18}$ | H |
| $L_{A2596}$ | $R^{B1}$ | $R^{C30}$ | $R^{E19}$ | H |
| $L_{A2597}$ | $R^{B1}$ | $R^{C30}$ | $R^{E20}$ | H |
| $L_{A2598}$ | $R^{B1}$ | $R^{C30}$ | $R^{E21}$ | H |
| $L_{A2599}$ | $R^{B1}$ | $R^{C30}$ | $R^{B3}$ | $R^{B3}$ |
| $L_{A2600}$ | $R^{B1}$ | $R^{C30}$ | $R^{B6}$ | $R^{B3}$ |
| $L_{A2601}$ | $R^{B1}$ | $R^{C30}$ | $R^{B7}$ | $R^{B3}$ |
| $L_{A2602}$ | $R^{B1}$ | $R^{C30}$ | $R^{B12}$ | $R^{B3}$ |
| $L_{A2603}$ | $R^{B1}$ | $R^{C30}$ | $R^{B20}$ | $R^{B3}$ |
| $L_{A2604}$ | $R^{B1}$ | $R^{C30}$ | $R^{B25}$ | $R^{B3}$ |
| $L_{A2605}$ | $R^{B1}$ | $R^{C30}$ | $R^{B29}$ | $R^{B3}$ |
| $L_{A2606}$ | $R^{B1}$ | $R^{C30}$ | $R^{A37}$ | $R^{B3}$ |
| $L_{A2607}$ | $R^{B1}$ | $R^{C30}$ | $R^{A43}$ | $R^{B3}$ |
| $L_{A2608}$ | $R^{B1}$ | $R^{C30}$ | $R^{E1}$ | $R^{B3}$ |
| $L_{A2609}$ | $R^{B1}$ | $R^{C30}$ | $R^{E2}$ | $R^{B3}$ |
| $L_{A2610}$ | $R^{B1}$ | $R^{C30}$ | $R^{E3}$ | $R^{B3}$ |
| $L_{A2611}$ | $R^{B1}$ | $R^{C30}$ | $R^{E4}$ | $R^{B3}$ |
| $L_{A2612}$ | $R^{B1}$ | $R^{C30}$ | $R^{E5}$ | $R^{B3}$ |
| $L_{A2613}$ | $R^{B1}$ | $R^{C30}$ | $R^{E6}$ | $R^{B3}$ |

-continued

| Ligand | $R^1$ | $R^2$ | $R^3$ | $R^4$ |
|---|---|---|---|---|
| $L_{A2614}$ | $R^{B1}$ | $R^{C30}$ | $R^{E7}$ | $R^{B3}$ |
| $L_{A2615}$ | $R^{B1}$ | $R^{C30}$ | $R^{E8}$ | $R^{B3}$ |
| $L_{A2616}$ | $R^{B1}$ | $R^{C30}$ | $R^{E9}$ | $R^{B3}$ |
| $L_{A2617}$ | $R^{B1}$ | $R^{C30}$ | $R^{E10}$ | $R^{B3}$ |
| $L_{A2618}$ | $R^{B1}$ | $R^{C30}$ | $R^{E11}$ | $R^{B3}$ |
| $L_{A2619}$ | $R^{B1}$ | $R^{C30}$ | $R^{E12}$ | $R^{B3}$ |
| $L_{A2620}$ | $R^{B1}$ | $R^{C30}$ | $R^{E13}$ | $R^{B3}$ |
| $L_{A2621}$ | $R^{B1}$ | $R^{C30}$ | $R^{E14}$ | $R^{B3}$ |
| $L_{A2622}$ | $R^{B1}$ | $R^{C30}$ | $R^{E15}$ | $R^{B3}$ |
| $L_{A2623}$ | $R^{B1}$ | $R^{C30}$ | $R^{E16}$ | $R^{B3}$ |
| $L_{A2624}$ | $R^{B1}$ | $R^{C30}$ | $R^{E17}$ | $R^{B3}$ |
| $L_{A2625}$ | $R^{B1}$ | $R^{C30}$ | $R^{E18}$ | $R^{B3}$ |
| $L_{A2626}$ | $R^{B1}$ | $R^{C30}$ | $R^{E19}$ | $R^{B3}$ |
| $L_{A2627}$ | $R^{B1}$ | $R^{C30}$ | $R^{E20}$ | $R^{B3}$ |
| $L_{A2628}$ | $R^{B1}$ | $R^{C30}$ | $R^{E21}$ | $R^{B3}$ |
| $L_{A2629}$ | $R^{B1}$ | $R^{C30}$ | $R^{B3}$ | $R^{B4}$ |
| $L_{A2630}$ | $R^{B1}$ | $R^{C30}$ | $R^{B6}$ | $R^{B4}$ |
| $L_{A2631}$ | $R^{B1}$ | $R^{C30}$ | $R^{B7}$ | $R^{B4}$ |
| $L_{A2632}$ | $R^{B1}$ | $R^{C30}$ | $R^{B12}$ | $R^{B4}$ |
| $L_{A2633}$ | $R^{B1}$ | $R^{C30}$ | $R^{B20}$ | $R^{B4}$ |
| $L_{A2634}$ | $R^{B1}$ | $R^{C30}$ | $R^{B25}$ | $R^{B4}$ |
| $L_{A2635}$ | $R^{B1}$ | $R^{C30}$ | $R^{B29}$ | $R^{B4}$ |
| $L_{A2636}$ | $R^{B1}$ | $R^{C30}$ | $R^{A37}$ | $R^{B4}$ |
| $L_{A2637}$ | $R^{B1}$ | $R^{C30}$ | $R^{A43}$ | $R^{B4}$ |
| $L_{A2638}$ | $R^{B1}$ | $R^{C30}$ | $R^{E1}$ | $R^{B4}$ |
| $L_{A2639}$ | $R^{B1}$ | $R^{C30}$ | $R^{E2}$ | $R^{B4}$ |
| $L_{A2540}$ | $R^{B1}$ | $R^{C30}$ | $R^{E3}$ | $R^{B4}$ |
| $L_{A2541}$ | $R^{B1}$ | $R^{C30}$ | $R^{E4}$ | $R^{B4}$ |
| $L_{A2642}$ | $R^{B1}$ | $R^{C30}$ | $R^{E5}$ | $R^{B4}$ |
| $L_{A2643}$ | $R^{B1}$ | $R^{C30}$ | $R^{E6}$ | $R^{B4}$ |
| $L_{A2644}$ | $R^{B1}$ | $R^{C30}$ | $R^{E7}$ | $R^{B4}$ |
| $L_{A2645}$ | $R^{B1}$ | $R^{C30}$ | $R^{E8}$ | $R^{B4}$ |
| $L_{A2646}$ | $R^{B1}$ | $R^{C30}$ | $R^{E9}$ | $R^{B4}$ |
| $L_{A2647}$ | $R^{B1}$ | $R^{C30}$ | $R^{E10}$ | $R^{B4}$ |
| $L_{A2648}$ | $R^{B1}$ | $R^{C30}$ | $R^{E11}$ | $R^{B4}$ |
| $L_{A2649}$ | $R^{B1}$ | $R^{C30}$ | $R^{E12}$ | $R^{B4}$ |
| $L_{A2650}$ | $R^{B1}$ | $R^{C30}$ | $R^{E13}$ | $R^{B4}$ |
| $L_{A2651}$ | $R^{B1}$ | $R^{C30}$ | $R^{E14}$ | $R^{B4}$ |
| $L_{A2652}$ | $R^{B1}$ | $R^{C30}$ | $R^{E15}$ | $R^{B4}$ |
| $L_{A2653}$ | $R^{B1}$ | $R^{C30}$ | $R^{E16}$ | $R^{B4}$ |
| $L_{A2654}$ | $R^{B1}$ | $R^{C30}$ | $R^{E17}$ | $R^{B4}$ |
| $L_{A2655}$ | $R^{B1}$ | $R^{C30}$ | $R^{E18}$ | $R^{B4}$ |
| $L_{A2656}$ | $R^{B1}$ | $R^{C30}$ | $R^{E19}$ | $R^{B4}$ |
| $L_{A2657}$ | $R^{B1}$ | $R^{C30}$ | $R^{E20}$ | $R^{B4}$ |
| $L_{A2658}$ | $R^{B1}$ | $R^{C30}$ | $R^{E21}$ | $R^{B4}$ |
| $L_{A2659}$ | $R^{B1}$ | $R^{C30}$ | $R^{B3}$ | $R^{B18}$ |
| $L_{A2660}$ | $R^{B1}$ | $R^{C30}$ | $R^{B6}$ | $R^{B18}$ |
| $L_{A2661}$ | $R^{B1}$ | $R^{C30}$ | $R^{B7}$ | $R^{B18}$ |
| $L_{A2662}$ | $R^{B1}$ | $R^{C30}$ | $R^{B12}$ | $R^{B18}$ |
| $L_{A2663}$ | $R^{B1}$ | $R^{C30}$ | $R^{B20}$ | $R^{B18}$ |
| $L_{A2664}$ | $R^{B1}$ | $R^{C30}$ | $R^{B25}$ | $R^{B18}$ |
| $L_{A2665}$ | $R^{B1}$ | $R^{C30}$ | $R^{B29}$ | $R^{B18}$ |
| $L_{A2666}$ | $R^{B1}$ | $R^{C30}$ | $R^{A37}$ | $R^{B18}$ |
| $L_{A2667}$ | $R^{B1}$ | $R^{C30}$ | $R^{A43}$ | $R^{B18}$ |
| $L_{A2668}$ | $R^{B1}$ | $R^{C30}$ | $R^{E1}$ | $R^{B18}$ |
| $L_{A2669}$ | $R^{B1}$ | $R^{C30}$ | $R^{E2}$ | $R^{B18}$ |
| $L_{A2670}$ | $R^{B1}$ | $R^{C30}$ | $R^{E3}$ | $R^{B18}$ |
| $L_{A2671}$ | $R^{B1}$ | $R^{C30}$ | $R^{E4}$ | $R^{B18}$ |
| $L_{A2672}$ | $R^{B1}$ | $R^{C30}$ | $R^{E5}$ | $R^{B18}$ |
| $L_{A2673}$ | $R^{B1}$ | $R^{C30}$ | $R^{E6}$ | $R^{B18}$ |
| $L_{A2674}$ | $R^{B1}$ | $R^{C30}$ | $R^{E7}$ | $R^{B18}$ |
| $L_{A2675}$ | $R^{B1}$ | $R^{C30}$ | $R^{E8}$ | $R^{B18}$ |
| $L_{A2676}$ | $R^{B1}$ | $R^{C30}$ | $R^{E9}$ | $R^{B18}$ |
| $L_{A2677}$ | $R^{B1}$ | $R^{C30}$ | $R^{E10}$ | $R^{B18}$ |
| $L_{A2678}$ | $R^{B1}$ | $R^{C30}$ | $R^{E11}$ | $R^{B18}$ |
| $L_{A2679}$ | $R^{B1}$ | $R^{C30}$ | $R^{E12}$ | $R^{B18}$ |
| $L_{A2680}$ | $R^{B1}$ | $R^{C30}$ | $R^{E13}$ | $R^{B18}$ |
| $L_{A2681}$ | $R^{B1}$ | $R^{C30}$ | $R^{E14}$ | $R^{B18}$ |
| $L_{A2682}$ | $R^{B1}$ | $R^{C30}$ | $R^{E15}$ | $R^{B18}$ |
| $L_{A2683}$ | $R^{B1}$ | $R^{C30}$ | $R^{E16}$ | $R^{B18}$ |
| $L_{A2684}$ | $R^{B1}$ | $R^{C30}$ | $R^{E17}$ | $R^{B18}$ |
| $L_{A2685}$ | $R^{B1}$ | $R^{C30}$ | $R^{E18}$ | $R^{B18}$ |
| $L_{A2686}$ | $R^{B1}$ | $R^{C30}$ | $R^{E19}$ | $R^{B18}$ |
| $L_{A2687}$ | $R^{B1}$ | $R^{C30}$ | $R^{E20}$ | $R^{B18}$ |
| $L_{A2688}$ | $R^{B1}$ | $R^{C30}$ | $R^{E21}$ | $R^{B18}$ |
| $L_{A2689}$ | $R^{B1}$ | $R^{C30}$ | $R^{B3}$ | $R^{A3}$ |
| $L_{A2690}$ | $R^{B1}$ | $R^{C30}$ | $R^{B6}$ | $R^{A3}$ |

-continued

| Ligand | $R^1$ | $R^2$ | $R^3$ | $R^4$ |
|---|---|---|---|---|
| $L_{A2691}$ | $R^{B1}$ | $R^{C30}$ | $R^{B7}$ | $R^{A3}$ |
| $L_{A2692}$ | $R^{B1}$ | $R^{C30}$ | $R^{B12}$ | $R^{A3}$ |
| $L_{A2693}$ | $R^{B1}$ | $R^{C30}$ | $R^{B20}$ | $R^{A3}$ |
| $L_{A2694}$ | $R^{B1}$ | $R^{C30}$ | $R^{B25}$ | $R^{A3}$ |
| $L_{A2695}$ | $R^{B1}$ | $R^{C30}$ | $R^{B29}$ | $R^{A3}$ |
| $L_{A2696}$ | $R^{B1}$ | $R^{C30}$ | $R^{A37}$ | $R^{A3}$ |
| $L_{A2697}$ | $R^{B1}$ | $R^{C30}$ | $R^{A43}$ | $R^{A3}$ |
| $L_{A2698}$ | $R^{B1}$ | $R^{C30}$ | $R^{E1}$ | $R^{A3}$ |
| $L_{A2699}$ | $R^{B1}$ | $R^{C30}$ | $R^{E2}$ | $R^{A3}$ |
| $L_{A2700}$ | $R^{B1}$ | $R^{C30}$ | $R^{E3}$ | $R^{A3}$ |
| $L_{A2701}$ | $R^{B1}$ | $R^{C30}$ | $R^{E4}$ | $R^{A3}$ |
| $L_{A2702}$ | $R^{B1}$ | $R^{C30}$ | $R^{E5}$ | $R^{A3}$ |
| $L_{A2703}$ | $R^{B1}$ | $R^{C30}$ | $R^{E6}$ | $R^{A3}$ |
| $L_{A2704}$ | $R^{B1}$ | $R^{C30}$ | $R^{E7}$ | $R^{A3}$ |
| $L_{A2705}$ | $R^{B1}$ | $R^{C30}$ | $R^{E8}$ | $R^{A3}$ |
| $L_{A2706}$ | $R^{B1}$ | $R^{C30}$ | $R^{E9}$ | $R^{A3}$ |
| $L_{A2707}$ | $R^{B1}$ | $R^{C30}$ | $R^{E10}$ | $R^{A3}$ |
| $L_{A2708}$ | $R^{B1}$ | $R^{C30}$ | $R^{E11}$ | $R^{A3}$ |
| $L_{A2709}$ | $R^{B1}$ | $R^{C30}$ | $R^{E12}$ | $R^{A3}$ |
| $L_{A2710}$ | $R^{B1}$ | $R^{C30}$ | $R^{E13}$ | $R^{A3}$ |
| $L_{A2711}$ | $R^{B1}$ | $R^{C30}$ | $R^{E14}$ | $R^{A3}$ |
| $L_{A2712}$ | $R^{B1}$ | $R^{C30}$ | $R^{E15}$ | $R^{A3}$ |
| $L_{A2713}$ | $R^{B1}$ | $R^{C30}$ | $R^{E16}$ | $R^{A3}$ |
| $L_{A2714}$ | $R^{B1}$ | $R^{C30}$ | $R^{E17}$ | $R^{A3}$ |
| $L_{A2715}$ | $R^{B1}$ | $R^{C30}$ | $R^{E18}$ | $R^{A3}$ |
| $L_{A2716}$ | $R^{B1}$ | $R^{C30}$ | $R^{E19}$ | $R^{A3}$ |
| $L_{A2717}$ | $R^{B1}$ | $R^{C30}$ | $R^{E20}$ | $R^{A3}$ |
| $L_{A2718}$ | $R^{B1}$ | $R^{C30}$ | $R^{E21}$ | $R^{A3}$ |
| $L_{A2719}$ | $R^{B1}$ | $R^{C30}$ | $R^{B3}$ | $R^{A34}$ |
| $L_{A2720}$ | $R^{B1}$ | $R^{C30}$ | $R^{B6}$ | $R^{A34}$ |
| $L_{A2721}$ | $R^{B1}$ | $R^{C30}$ | $R^{B7}$ | $R^{A34}$ |
| $L_{A2722}$ | $R^{B1}$ | $R^{C30}$ | $R^{B12}$ | $R^{A34}$ |
| $L_{A2723}$ | $R^{B1}$ | $R^{C30}$ | $R^{B20}$ | $R^{A34}$ |
| $L_{A2724}$ | $R^{B1}$ | $R^{C30}$ | $R^{B25}$ | $R^{A34}$ |
| $L_{A2725}$ | $R^{B1}$ | $R^{C30}$ | $R^{B29}$ | $R^{A34}$ |
| $L_{A2726}$ | $R^{B1}$ | $R^{C30}$ | $R^{A37}$ | $R^{A34}$ |
| $L_{A2727}$ | $R^{B1}$ | $R^{C30}$ | $R^{A43}$ | $R^{A34}$ |
| $L_{A2728}$ | $R^{B1}$ | $R^{C30}$ | $R^{E1}$ | $R^{A34}$ |
| $L_{A2729}$ | $R^{B1}$ | $R^{C30}$ | $R^{E2}$ | $R^{A34}$ |
| $L_{A2730}$ | $R^{B1}$ | $R^{C30}$ | $R^{E3}$ | $R^{A34}$ |
| $L_{A2731}$ | $R^{B1}$ | $R^{C30}$ | $R^{E4}$ | $R^{A34}$ |
| $L_{A2732}$ | $R^{B1}$ | $R^{C30}$ | $R^{E5}$ | $R^{A34}$ |
| $L_{A2733}$ | $R^{B1}$ | $R^{C30}$ | $R^{E6}$ | $R^{A34}$ |
| $L_{A2734}$ | $R^{B1}$ | $R^{C30}$ | $R^{E7}$ | $R^{A34}$ |
| $L_{A2735}$ | $R^{B1}$ | $R^{C30}$ | $R^{E8}$ | $R^{A34}$ |
| $L_{A2736}$ | $R^{B1}$ | $R^{C30}$ | $R^{E9}$ | $R^{A34}$ |
| $L_{A2737}$ | $R^{B1}$ | $R^{C30}$ | $R^{E10}$ | $R^{A34}$ |
| $L_{A2738}$ | $R^{B1}$ | $R^{C30}$ | $R^{E11}$ | $R^{A34}$ |
| $L_{A2739}$ | $R^{B1}$ | $R^{C30}$ | $R^{E12}$ | $R^{A34}$ |
| $L_{A2740}$ | $R^{B1}$ | $R^{C30}$ | $R^{E13}$ | $R^{A34}$ |
| $L_{A2741}$ | $R^{B1}$ | $R^{C30}$ | $R^{E14}$ | $R^{A34}$ |
| $L_{A2742}$ | $R^{B1}$ | $R^{C30}$ | $R^{E15}$ | $R^{A34}$ |
| $L_{A2743}$ | $R^{B1}$ | $R^{C30}$ | $R^{E16}$ | $R^{A34}$ |
| $L_{A2744}$ | $R^{B1}$ | $R^{C30}$ | $R^{E17}$ | $R^{A34}$ |
| $L_{A2745}$ | $R^{B1}$ | $R^{C30}$ | $R^{E18}$ | $R^{A34}$ |
| $L_{A2746}$ | $R^{B1}$ | $R^{C30}$ | $R^{E19}$ | $R^{A34}$ |
| $L_{A2747}$ | $R^{B1}$ | $R^{C30}$ | $R^{E20}$ | $R^{A34}$ |
| $L_{A2748}$ | $R^{B1}$ | $R^{C30}$ | $R^{E21}$ | $R^{A34}$ |
| $L_{A2749}$ | $R^{B1}$ | $R^{C30}$ | $R^{B3}$ | $R^{A52}$ |
| $L_{A2750}$ | $R^{B1}$ | $R^{C30}$ | $R^{B6}$ | $R^{A52}$ |
| $L_{A2751}$ | $R^{B1}$ | $R^{C30}$ | $R^{B7}$ | $R^{A52}$ |
| $L_{A2752}$ | $R^{B1}$ | $R^{C30}$ | $R^{B12}$ | $R^{A52}$ |
| $L_{A2753}$ | $R^{B1}$ | $R^{C30}$ | $R^{B20}$ | $R^{A52}$ |
| $L_{A2754}$ | $R^{B1}$ | $R^{C30}$ | $R^{B25}$ | $R^{A52}$ |
| $L_{A2755}$ | $R^{B1}$ | $R^{C30}$ | $R^{B29}$ | $R^{A52}$ |
| $L_{A2756}$ | $R^{B1}$ | $R^{C30}$ | $R^{A37}$ | $R^{A52}$ |
| $L_{A2757}$ | $R^{B1}$ | $R^{C30}$ | $R^{A43}$ | $R^{A52}$ |
| $L_{A2758}$ | $R^{B1}$ | $R^{C30}$ | $R^{E1}$ | $R^{A52}$ |
| $L_{A2759}$ | $R^{B1}$ | $R^{C30}$ | $R^{E2}$ | $R^{A52}$ |
| $L_{A2760}$ | $R^{B1}$ | $R^{C30}$ | $R^{E3}$ | $R^{A52}$ |
| $L_{A2761}$ | $R^{B1}$ | $R^{C30}$ | $R^{E4}$ | $R^{A52}$ |
| $L_{A2762}$ | $R^{B1}$ | $R^{C30}$ | $R^{E5}$ | $R^{A52}$ |
| $L_{A2763}$ | $R^{B1}$ | $R^{C30}$ | $R^{E6}$ | $R^{A52}$ |
| $L_{A2764}$ | $R^{B1}$ | $R^{C30}$ | $R^{E7}$ | $R^{A52}$ |
| $L_{A2765}$ | $R^{B1}$ | $R^{C30}$ | $R^{E8}$ | $R^{A52}$ |
| $L_{A2766}$ | $R^{B1}$ | $R^{C30}$ | $R^{E9}$ | $R^{A52}$ |
| $L_{A2767}$ | $R^{B1}$ | $R^{C30}$ | $R^{E10}$ | $R^{A52}$ |

-continued

| Ligand | $R^1$ | $R^2$ | $R^3$ | $R^4$ |
|---|---|---|---|---|
| $L_{A2768}$ | $R^{B1}$ | $R^{C30}$ | $R^{E11}$ | $R^{A52}$ |
| $L_{A2769}$ | $R^{B1}$ | $R^{C30}$ | $R^{E12}$ | $R^{A52}$ |
| $L_{A2770}$ | $R^{B1}$ | $R^{C30}$ | $R^{E13}$ | $R^{A52}$ |
| $L_{A2771}$ | $R^{B1}$ | $R^{C30}$ | $R^{E14}$ | $R^{A52}$ |
| $L_{A2772}$ | $R^{B1}$ | $R^{C30}$ | $R^{E15}$ | $R^{A52}$ |
| $L_{A2773}$ | $R^{B1}$ | $R^{C30}$ | $R^{E16}$ | $R^{A52}$ |
| $L_{A2774}$ | $R^{B1}$ | $R^{C30}$ | $R^{E17}$ | $R^{A52}$ |
| $L_{A2775}$ | $R^{B1}$ | $R^{C30}$ | $R^{E18}$ | $R^{A52}$ |
| $L_{A2776}$ | $R^{B1}$ | $R^{C30}$ | $R^{E19}$ | $R^{A52}$ |
| $L_{A2777}$ | $R^{B1}$ | $R^{C30}$ | $R^{E20}$ | $R^{A52}$ |
| $L_{A2778}$ | $R^{B1}$ | $R^{C30}$ | $R^{E21}$ | $R^{A52}$ |

$L_{A2779}$ through $L_{A4038}$ that are based on a structure of Formula XI,

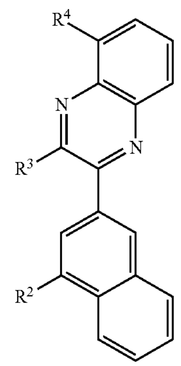

in which $R^2$, $R^3$, and $R^4$ are defined as:

| Ligand | $R^2$ | $R^3$ | $R^4$ |
|---|---|---|---|
| $L_{A2779}$ | $R^{C1}$ | $R^{B3}$ | H |
| $L_{A2780}$ | $R^{C1}$ | $R^{B6}$ | H |
| $L_{A2781}$ | $R^{C1}$ | $R^{B7}$ | H |
| $L_{A2782}$ | $R^{C1}$ | $R^{B12}$ | H |
| $L_{A2783}$ | $R^{C1}$ | $R^{B20}$ | H |
| $L_{A2784}$ | $R^{C1}$ | $R^{B25}$ | H |
| $L_{A2785}$ | $R^{C1}$ | $R^{B29}$ | H |
| $L_{A2786}$ | $R^{C1}$ | $R^{A37}$ | H |
| $L_{A2787}$ | $R^{C1}$ | $R^{A43}$ | H |
| $L_{A2788}$ | $R^{C1}$ | $R^{E1}$ | H |
| $L_{A2789}$ | $R^{C1}$ | $R^{E2}$ | H |
| $L_{A2790}$ | $R^{C1}$ | $R^{E3}$ | H |
| $L_{A2791}$ | $R^{C1}$ | $R^{E4}$ | H |
| $L_{A2792}$ | $R^{C1}$ | $R^{E5}$ | H |
| $L_{A2793}$ | $R^{C1}$ | $R^{E6}$ | H |
| $L_{A2794}$ | $R^{C1}$ | $R^{E7}$ | H |
| $L_{A2795}$ | $R^{C1}$ | $R^{E8}$ | H |
| $L_{A2796}$ | $R^{C1}$ | $R^{E9}$ | H |
| $L_{A2797}$ | $R^{C1}$ | $R^{E10}$ | H |
| $L_{A2798}$ | $R^{C1}$ | $R^{E11}$ | H |
| $L_{A2799}$ | $R^{C1}$ | $R^{E12}$ | H |
| $L_{A2800}$ | $R^{C1}$ | $R^{E13}$ | H |
| $L_{A2801}$ | $R^{C1}$ | $R^{E14}$ | H |
| $L_{A2802}$ | $R^{C1}$ | $R^{E15}$ | H |
| $L_{A2803}$ | $R^{C1}$ | $R^{E16}$ | H |
| $L_{A2804}$ | $R^{C1}$ | $R^{E17}$ | H |
| $L_{A2805}$ | $R^{C1}$ | $R^{E18}$ | H |
| $L_{A2806}$ | $R^{C1}$ | $R^{E19}$ | H |
| $L_{A2807}$ | $R^{C1}$ | $R^{E20}$ | H |
| $L_{A2808}$ | $R^{C1}$ | $R^{E21}$ | H |
| $L_{A2809}$ | $R^{C1}$ | $R^{B3}$ | $R^{B3}$ |
| $L_{A2810}$ | $R^{C1}$ | $R^{B6}$ | $R^{B3}$ |
| $L_{A2811}$ | $R^{C1}$ | $R^{B7}$ | $R^{B3}$ |
| $L_{A2812}$ | $R^{C1}$ | $R^{B12}$ | $R^{B3}$ |
| $L_{A2813}$ | $R^{C1}$ | $R^{B20}$ | $R^{B3}$ |

-continued

| Ligand | $R^2$ | $R^3$ | $R^4$ |
|---|---|---|---|
| $L_{A2814}$ | $R^{C1}$ | $R^{B25}$ | $R^{B3}$ |
| $L_{A2815}$ | $R^{C1}$ | $R^{B29}$ | $R^{B3}$ |
| $L_{A2816}$ | $R^{C1}$ | $R^{A37}$ | $R^{B3}$ |
| $L_{A2817}$ | $R^{C1}$ | $R^{A43}$ | $R^{B3}$ |
| $L_{A2818}$ | $R^{C1}$ | $R^{E1}$ | $R^{B3}$ |
| $L_{A2819}$ | $R^{C1}$ | $R^{E2}$ | $R^{B3}$ |
| $L_{A2820}$ | $R^{C1}$ | $R^{E3}$ | $R^{B3}$ |
| $L_{A2821}$ | $R^{C1}$ | $R^{E4}$ | $R^{B3}$ |
| $L_{A2822}$ | $R^{C1}$ | $R^{E5}$ | $R^{B3}$ |
| $L_{A2823}$ | $R^{C1}$ | $R^{E6}$ | $R^{B3}$ |
| $L_{A2824}$ | $R^{C1}$ | $R^{E7}$ | $R^{B3}$ |
| $L_{A2825}$ | $R^{C1}$ | $R^{E8}$ | $R^{B3}$ |
| $L_{A2826}$ | $R^{C1}$ | $R^{E9}$ | $R^{B3}$ |
| $L_{A2827}$ | $R^{C1}$ | $R^{E10}$ | $R^{B3}$ |
| $L_{A2828}$ | $R^{C1}$ | $R^{E11}$ | $R^{B3}$ |
| $L_{A2829}$ | $R^{C1}$ | $R^{E12}$ | $R^{B3}$ |
| $L_{A2830}$ | $R^{C1}$ | $R^{E13}$ | $R^{B3}$ |
| $L_{A2831}$ | $R^{C1}$ | $R^{E14}$ | $R^{B3}$ |
| $L_{A2832}$ | $R^{C1}$ | $R^{E15}$ | $R^{B3}$ |
| $L_{A2833}$ | $R^{C1}$ | $R^{E16}$ | $R^{B3}$ |
| $L_{A2834}$ | $R^{C1}$ | $R^{E17}$ | $R^{B3}$ |
| $L_{A2835}$ | $R^{C1}$ | $R^{E18}$ | $R^{B3}$ |
| $L_{A2836}$ | $R^{C1}$ | $R^{E19}$ | $R^{B3}$ |
| $L_{A2837}$ | $R^{C1}$ | $R^{E20}$ | $R^{B3}$ |
| $L_{A2838}$ | $R^{C1}$ | $R^{E21}$ | $R^{B3}$ |
| $L_{A2839}$ | $R^{C1}$ | $R^{B3}$ | $R^{B4}$ |
| $L_{A2840}$ | $R^{C1}$ | $R^{B6}$ | $R^{B4}$ |
| $L_{A2841}$ | $R^{C1}$ | $R^{B7}$ | $R^{B4}$ |
| $L_{A2842}$ | $R^{C1}$ | $R^{B12}$ | $R^{B4}$ |
| $L_{A2843}$ | $R^{C1}$ | $R^{B20}$ | $R^{B4}$ |
| $L_{A2844}$ | $R^{C1}$ | $R^{B25}$ | $R^{B4}$ |
| $L_{A2845}$ | $R^{C1}$ | $R^{B29}$ | $R^{B4}$ |
| $L_{A2846}$ | $R^{C1}$ | $R^{A37}$ | $R^{B4}$ |
| $L_{A2847}$ | $R^{C1}$ | $R^{A43}$ | $R^{B4}$ |
| $L_{A2848}$ | $R^{C1}$ | $R^{E1}$ | $R^{B4}$ |
| $L_{A2849}$ | $R^{C1}$ | $R^{E2}$ | $R^{B4}$ |
| $L_{A2850}$ | $R^{C1}$ | $R^{E3}$ | $R^{B4}$ |
| $L_{A2851}$ | $R^{C1}$ | $R^{E4}$ | $R^{B4}$ |
| $L_{A2852}$ | $R^{C1}$ | $R^{E5}$ | $R^{B4}$ |
| $L_{A2853}$ | $R^{C1}$ | $R^{E6}$ | $R^{B4}$ |
| $L_{A2854}$ | $R^{C1}$ | $R^{E7}$ | $R^{B4}$ |
| $L_{A2855}$ | $R^{C1}$ | $R^{E8}$ | $R^{B4}$ |
| $L_{A2856}$ | $R^{C1}$ | $R^{E9}$ | $R^{B4}$ |
| $L_{A2857}$ | $R^{C1}$ | $R^{E10}$ | $R^{B4}$ |
| $L_{A2858}$ | $R^{C1}$ | $R^{E11}$ | $R^{B4}$ |
| $L_{A2859}$ | $R^{C1}$ | $R^{E12}$ | $R^{B4}$ |
| $L_{A2860}$ | $R^{C1}$ | $R^{E13}$ | $R^{B4}$ |
| $L_{A2861}$ | $R^{C1}$ | $R^{E14}$ | $R^{B4}$ |
| $L_{A2862}$ | $R^{C1}$ | $R^{E15}$ | $R^{B4}$ |
| $L_{A2863}$ | $R^{C1}$ | $R^{E16}$ | $R^{B4}$ |
| $L_{A2864}$ | $R^{C1}$ | $R^{E17}$ | $R^{B4}$ |
| $L_{A2865}$ | $R^{C1}$ | $R^{E18}$ | $R^{B4}$ |
| $L_{A2866}$ | $R^{C1}$ | $R^{E19}$ | $R^{B4}$ |
| $L_{A2867}$ | $R^{C1}$ | $R^{E20}$ | $R^{B4}$ |
| $L_{A2868}$ | $R^{C1}$ | $R^{E21}$ | $R^{B4}$ |
| $L_{A2869}$ | $R^{C1}$ | $R^{B3}$ | $R^{B18}$ |
| $L_{A2870}$ | $R^{C1}$ | $R^{B6}$ | $R^{B18}$ |
| $L_{A2871}$ | $R^{C1}$ | $R^{B7}$ | $R^{B18}$ |
| $L_{A2872}$ | $R^{C1}$ | $R^{B12}$ | $R^{B18}$ |
| $L_{A2873}$ | $R^{C1}$ | $R^{B20}$ | $R^{B18}$ |
| $L_{A2874}$ | $R^{C1}$ | $R^{B25}$ | $R^{B18}$ |
| $L_{A2875}$ | $R^{C1}$ | $R^{B29}$ | $R^{B18}$ |
| $L_{A2876}$ | $R^{C1}$ | $R^{A37}$ | $R^{B18}$ |
| $L_{A2877}$ | $R^{C1}$ | $R^{A43}$ | $R^{B18}$ |
| $L_{A2878}$ | $R^{C1}$ | $R^{E1}$ | $R^{B18}$ |
| $L_{A2879}$ | $R^{C1}$ | $R^{E2}$ | $R^{B18}$ |
| $L_{A2880}$ | $R^{C1}$ | $R^{E3}$ | $R^{B18}$ |
| $L_{A2881}$ | $R^{C1}$ | $R^{E4}$ | $R^{B18}$ |
| $L_{A2882}$ | $R^{C1}$ | $R^{E5}$ | $R^{B18}$ |
| $L_{A2883}$ | $R^{C1}$ | $R^{E6}$ | $R^{B18}$ |
| $L_{A2884}$ | $R^{C1}$ | $R^{E7}$ | $R^{B18}$ |
| $L_{A2885}$ | $R^{C1}$ | $R^{E8}$ | $R^{B18}$ |
| $L_{A2886}$ | $R^{C1}$ | $R^{E9}$ | $R^{B18}$ |
| $L_{A2887}$ | $R^{C1}$ | $R^{E10}$ | $R^{B18}$ |
| $L_{A2888}$ | $R^{C1}$ | $R^{E11}$ | $R^{B18}$ |
| $L_{A2889}$ | $R^{C1}$ | $R^{E12}$ | $R^{B18}$ |
| $L_{A2890}$ | $R^{C1}$ | $R^{E13}$ | $R^{B18}$ |

-continued

| Ligand | $R^2$ | $R^3$ | $R^4$ |
|---|---|---|---|
| $L_{A2891}$ | $R^{C1}$ | $R^{E14}$ | $R^{B18}$ |
| $L_{A2892}$ | $R^{C1}$ | $R^{E15}$ | $R^{B18}$ |
| $L_{A2893}$ | $R^{C1}$ | $R^{E16}$ | $R^{B18}$ |
| $L_{A2894}$ | $R^{C1}$ | $R^{E17}$ | $R^{B18}$ |
| $L_{A2895}$ | $R^{C1}$ | $R^{E18}$ | $R^{B18}$ |
| $L_{A2896}$ | $R^{C1}$ | $R^{E19}$ | $R^{B18}$ |
| $L_{A2897}$ | $R^{C1}$ | $R^{E20}$ | $R^{B18}$ |
| $L_{A2898}$ | $R^{C1}$ | $R^{E21}$ | $R^{B18}$ |
| $L_{A2899}$ | $R^{C1}$ | $R^{B3}$ | $R^{A3}$ |
| $L_{A2900}$ | $R^{C1}$ | $R^{B6}$ | $R^{A3}$ |
| $L_{A2901}$ | $R^{C1}$ | $R^{B7}$ | $R^{A3}$ |
| $L_{A2902}$ | $R^{C1}$ | $R^{B12}$ | $R^{A3}$ |
| $L_{A2903}$ | $R^{C1}$ | $R^{B20}$ | $R^{A3}$ |
| $L_{A2904}$ | $R^{C1}$ | $R^{B25}$ | $R^{A3}$ |
| $L_{A2905}$ | $R^{C1}$ | $R^{B29}$ | $R^{A3}$ |
| $L_{A2906}$ | $R^{C1}$ | $R^{A37}$ | $R^{A3}$ |
| $L_{A2907}$ | $R^{C1}$ | $R^{A43}$ | $R^{A3}$ |
| $L_{A2908}$ | $R^{C1}$ | $R^{E1}$ | $R^{A3}$ |
| $L_{A2909}$ | $R^{C1}$ | $R^{E2}$ | $R^{A3}$ |
| $L_{A2910}$ | $R^{C1}$ | $R^{E3}$ | $R^{A3}$ |
| $L_{A2911}$ | $R^{C1}$ | $R^{E4}$ | $R^{A3}$ |
| $L_{A2912}$ | $R^{C1}$ | $R^{E5}$ | $R^{A3}$ |
| $L_{A2913}$ | $R^{C1}$ | $R^{E6}$ | $R^{A3}$ |
| $L_{A2914}$ | $R^{C1}$ | $R^{E7}$ | $R^{A3}$ |
| $L_{A2915}$ | $R^{C1}$ | $R^{E8}$ | $R^{A3}$ |
| $L_{A2916}$ | $R^{C1}$ | $R^{E9}$ | $R^{A3}$ |
| $L_{A2917}$ | $R^{C1}$ | $R^{E10}$ | $R^{A3}$ |
| $L_{A2918}$ | $R^{C1}$ | $R^{E11}$ | $R^{A3}$ |
| $L_{A2919}$ | $R^{C1}$ | $R^{E12}$ | $R^{A3}$ |
| $L_{A2920}$ | $R^{C1}$ | $R^{E13}$ | $R^{A3}$ |
| $L_{A2921}$ | $R^{C1}$ | $R^{E14}$ | $R^{A3}$ |
| $L_{29222}$ | $R^{C1}$ | $R^{E15}$ | $R^{A3}$ |
| $L_{A2923}$ | $R^{C1}$ | $R^{E16}$ | $R^{A3}$ |
| $L_{A2924}$ | $R^{C1}$ | $R^{E17}$ | $R^{A3}$ |
| $L_{A2925}$ | $R^{C1}$ | $R^{E18}$ | $R^{A3}$ |
| $L_{A2926}$ | $R^{C1}$ | $R^{E19}$ | $R^{A3}$ |
| $L_{A2927}$ | $R^{C1}$ | $R^{E20}$ | $R^{A3}$ |
| $L_{A2928}$ | $R^{C1}$ | $R^{E21}$ | $R^{A3}$ |
| $L_{A2929}$ | $R^{C1}$ | $R^{B3}$ | $R^{A34}$ |
| $L_{A2930}$ | $R^{C1}$ | $R^{B6}$ | $R^{A34}$ |
| $L_{A2931}$ | $R^{C1}$ | $R^{B7}$ | $R^{A34}$ |
| $L_{A2932}$ | $R^{C1}$ | $R^{B12}$ | $R^{A34}$ |
| $L_{A2933}$ | $R^{C1}$ | $R^{B20}$ | $R^{A34}$ |
| $L_{A2934}$ | $R^{C1}$ | $R^{B25}$ | $R^{A34}$ |
| $L_{A2935}$ | $R^{C1}$ | $R^{B29}$ | $R^{A34}$ |
| $L_{A2936}$ | $R^{C1}$ | $R^{A37}$ | $R^{A34}$ |
| $L_{A2937}$ | $R^{C1}$ | $R^{A43}$ | $R^{A34}$ |
| $L_{A2938}$ | $R^{C1}$ | $R^{E1}$ | $R^{A34}$ |
| $L_{A2939}$ | $R^{C1}$ | $R^{E2}$ | $R^{A34}$ |
| $L_{A2940}$ | $R^{C1}$ | $R^{E3}$ | $R^{A34}$ |
| $L_{A2941}$ | $R^{C1}$ | $R^{E4}$ | $R^{A34}$ |
| $L_{A2942}$ | $R^{C1}$ | $R^{E5}$ | $R^{A34}$ |
| $L_{A2943}$ | $R^{C1}$ | $R^{E6}$ | $R^{A34}$ |
| $L_{A2944}$ | $R^{C1}$ | $R^{E7}$ | $R^{A34}$ |
| $L_{A2945}$ | $R^{C1}$ | $R^{E8}$ | $R^{A34}$ |
| $L_{A2946}$ | $R^{C1}$ | $R^{E9}$ | $R^{A34}$ |
| $L_{A2947}$ | $R^{C1}$ | $R^{E10}$ | $R^{A34}$ |
| $L_{A2948}$ | $R^{C1}$ | $R^{E11}$ | $R^{A34}$ |
| $L_{A2949}$ | $R^{C1}$ | $R^{E12}$ | $R^{A34}$ |
| $L_{A2950}$ | $R^{C1}$ | $R^{E13}$ | $R^{A34}$ |
| $L_{A2951}$ | $R^{C1}$ | $R^{E14}$ | $R^{A34}$ |
| $L_{A2952}$ | $R^{C1}$ | $R^{E15}$ | $R^{A34}$ |
| $L_{A2953}$ | $R^{C1}$ | $R^{E16}$ | $R^{A34}$ |
| $L_{A2954}$ | $R^{C1}$ | $R^{E17}$ | $R^{A34}$ |
| $L_{A2955}$ | $R^{C1}$ | $R^{E18}$ | $R^{A34}$ |
| $L_{A2956}$ | $R^{C1}$ | $R^{E19}$ | $R^{A34}$ |
| $L_{A2957}$ | $R^{C1}$ | $R^{E20}$ | $R^{A34}$ |
| $L_{A2958}$ | $R^{C1}$ | $R^{E21}$ | $R^{A34}$ |
| $L_{A2959}$ | $R^{C1}$ | $R^{B3}$ | $R^{A52}$ |
| $L_{A2960}$ | $R^{C1}$ | $R^{B6}$ | $R^{A52}$ |
| $L_{A2961}$ | $R^{C1}$ | $R^{B7}$ | $R^{A52}$ |
| $L_{A2962}$ | $R^{C1}$ | $R^{B12}$ | $R^{A52}$ |
| $L_{A2963}$ | $R^{C1}$ | $R^{B20}$ | $R^{A52}$ |
| $L_{A2964}$ | $R^{C1}$ | $R^{B25}$ | $R^{A52}$ |
| $L_{A2965}$ | $R^{C1}$ | $R^{B29}$ | $R^{A52}$ |
| $L_{A2966}$ | $R^{C1}$ | $R^{A37}$ | $R^{A52}$ |
| $L_{A2967}$ | $R^{C1}$ | $R^{A43}$ | $R^{A52}$ |

| Ligand | $R^2$ | $R^3$ | $R^4$ |
|---|---|---|---|
| $L_{A2968}$ | $R^{C1}$ | $R^{E1}$ | $R^{A52}$ |
| $L_{A2969}$ | $R^{C1}$ | $R^{E2}$ | $R^{A52}$ |
| $L_{A2970}$ | $R^{C1}$ | $R^{E3}$ | $R^{A52}$ |
| $L_{A2971}$ | $R^{C1}$ | $R^{E4}$ | $R^{A52}$ |
| $L_{A2972}$ | $R^{C1}$ | $R^{E5}$ | $R^{A52}$ |
| $L_{A2973}$ | $R^{C1}$ | $R^{E6}$ | $R^{A52}$ |
| $L_{A2974}$ | $R^{C1}$ | $R^{E7}$ | $R^{A52}$ |
| $L_{A2975}$ | $R^{C1}$ | $R^{E8}$ | $R^{A52}$ |
| $L_{A2976}$ | $R^{C1}$ | $R^{E9}$ | $R^{A52}$ |
| $L_{A2977}$ | $R^{C1}$ | $R^{E10}$ | $R^{A52}$ |
| $L_{A2978}$ | $R^{C1}$ | $R^{E11}$ | $R^{A52}$ |
| $L_{A2979}$ | $R^{C1}$ | $R^{E12}$ | $R^{A52}$ |
| $L_{A2980}$ | $R^{C1}$ | $R^{E13}$ | $R^{A52}$ |
| $L_{A2981}$ | $R^{C1}$ | $R^{E14}$ | $R^{A52}$ |
| $L_{A2982}$ | $R^{C1}$ | $R^{E15}$ | $R^{A52}$ |
| $L_{A2983}$ | $R^{C1}$ | $R^{E16}$ | $R^{A52}$ |
| $L_{A2984}$ | $R^{C1}$ | $R^{E17}$ | $R^{A52}$ |
| $L_{A2985}$ | $R^{C1}$ | $R^{E18}$ | $R^{A52}$ |
| $L_{A2986}$ | $R^{C1}$ | $R^{E19}$ | $R^{A52}$ |
| $L_{A2987}$ | $R^{C1}$ | $R^{E20}$ | $R^{A52}$ |
| $L_{A2988}$ | $R^{C1}$ | $R^{E21}$ | $R^{A52}$ |
| $L_{A2989}$ | $R^{C3}$ | $R^{B3}$ | H |
| $L_{A2990}$ | $R^{C3}$ | $R^{B6}$ | H |
| $L_{A2991}$ | $R^{C3}$ | $R^{B7}$ | H |
| $L_{A2992}$ | $R^{C3}$ | $R^{B12}$ | H |
| $L_{A2993}$ | $R^{C3}$ | $R^{B20}$ | H |
| $L_{A2994}$ | $R^{C3}$ | $R^{B25}$ | H |
| $L_{A2995}$ | $R^{C3}$ | $R^{B29}$ | H |
| $L_{A2996}$ | $R^{C3}$ | $R^{A37}$ | H |
| $L_{A2997}$ | $R^{C3}$ | $R^{A43}$ | H |
| $L_{A2998}$ | $R^{C3}$ | $R^{E1}$ | H |
| $L_{A2999}$ | $R^{C3}$ | $R^{E2}$ | H |
| $L_{A3000}$ | $R^{C3}$ | $R^{E3}$ | H |
| $L_{A3001}$ | $R^{C3}$ | $R^{E4}$ | H |
| $L_{A3002}$ | $R^{C3}$ | $R^{E5}$ | H |
| $L_{A3003}$ | $R^{C3}$ | $R^{E6}$ | H |
| $L_{A3004}$ | $R^{C3}$ | $R^{E7}$ | H |
| $L_{A3005}$ | $R^{C3}$ | $R^{E8}$ | H |
| $L_{A3006}$ | $R^{C3}$ | $R^{E9}$ | H |
| $L_{A3007}$ | $R^{C3}$ | $R^{E10}$ | H |
| $L_{A3008}$ | $R^{C3}$ | $R^{E11}$ | H |
| $L_{A3009}$ | $R^{C3}$ | $R^{E12}$ | H |
| $L_{A3010}$ | $R^{C3}$ | $R^{E13}$ | H |
| $L_{A3011}$ | $R^{C3}$ | $R^{E14}$ | H |
| $L_{A3012}$ | $R^{C3}$ | $R^{E15}$ | H |
| $L_{A3013}$ | $R^{C3}$ | $R^{E16}$ | H |
| $L_{A3014}$ | $R^{C3}$ | $R^{E17}$ | H |
| $L_{A3015}$ | $R^{C3}$ | $R^{E18}$ | H |
| $L_{A3016}$ | $R^{C3}$ | $R^{E19}$ | H |
| $L_{A3017}$ | $R^{C3}$ | $R^{E20}$ | H |
| $L_{A3018}$ | $R^{C3}$ | $R^{E21}$ | H |
| $L_{A3019}$ | $R^{C3}$ | $R^{B3}$ | $R^{B3}$ |
| $L_{A3020}$ | $R^{C3}$ | $R^{B6}$ | $R^{B3}$ |
| $L_{A3021}$ | $R^{C3}$ | $R^{B7}$ | $R^{B3}$ |
| $L_{A3022}$ | $R^{C3}$ | $R^{B12}$ | $R^{B3}$ |
| $L_{A3023}$ | $R^{C3}$ | $R^{B20}$ | $R^{B3}$ |
| $L_{A3024}$ | $R^{C3}$ | $R^{B25}$ | $R^{B3}$ |
| $L_{A3025}$ | $R^{C3}$ | $R^{B29}$ | $R^{B3}$ |
| $L_{A3026}$ | $R^{C3}$ | $R^{A37}$ | $R^{B3}$ |
| $L_{A3027}$ | $R^{C3}$ | $R^{A43}$ | $R^{B3}$ |
| $L_{A3028}$ | $R^{C3}$ | $R^{E1}$ | $R^{B3}$ |
| $L_{A3029}$ | $R^{C3}$ | $R^{E2}$ | $R^{B3}$ |
| $L_{A3030}$ | $R^{C3}$ | $R^{E3}$ | $R^{B3}$ |
| $L_{A3031}$ | $R^{C3}$ | $R^{E4}$ | $R^{B3}$ |
| $L_{A3032}$ | $R^{C3}$ | $R^{E5}$ | $R^{B3}$ |
| $L_{A3033}$ | $R^{C3}$ | $R^{E6}$ | $R^{B3}$ |
| $L_{A3034}$ | $R^{C3}$ | $R^{E7}$ | $R^{B3}$ |
| $L_{A3035}$ | $R^{C3}$ | $R^{E8}$ | $R^{B3}$ |
| $L_{A3036}$ | $R^{C3}$ | $R^{E9}$ | $R^{B3}$ |
| $L_{A3037}$ | $R^{C3}$ | $R^{E10}$ | $R^{B3}$ |
| $L_{A3038}$ | $R^{C3}$ | $R^{E11}$ | $R^{B3}$ |
| $L_{A3039}$ | $R^{C3}$ | $R^{E12}$ | $R^{B3}$ |
| $L_{A3040}$ | $R^{C3}$ | $R^{E13}$ | $R^{B3}$ |
| $L_{A3041}$ | $R^{C3}$ | $R^{E14}$ | $R^{B3}$ |
| $L_{A3042}$ | $R^{C3}$ | $R^{E15}$ | $R^{B3}$ |
| $L_{A3043}$ | $R^{C3}$ | $R^{E16}$ | $R^{B3}$ |
| $L_{A3044}$ | $R^{C3}$ | $R^{E17}$ | $R^{B3}$ |

| Ligand | $R^2$ | $R^3$ | $R^4$ |
|---|---|---|---|
| $L_{A3045}$ | $R^{C3}$ | $R^{E18}$ | $R^{B3}$ |
| $L_{A3046}$ | $R^{C3}$ | $R^{E19}$ | $R^{B3}$ |
| $L_{A3047}$ | $R^{C3}$ | $R^{E20}$ | $R^{B3}$ |
| $L_{A3048}$ | $R^{C3}$ | $R^{E21}$ | $R^{B3}$ |
| $L_{A3049}$ | $R^{C3}$ | $R^{B3}$ | $R^{B4}$ |
| $L_{A3050}$ | $R^{C3}$ | $R^{B6}$ | $R^{B4}$ |
| $L_{A3051}$ | $R^{C3}$ | $R^{B7}$ | $R^{B4}$ |
| $L_{A3052}$ | $R^{C3}$ | $R^{B12}$ | $R^{B4}$ |
| $L_{A3053}$ | $R^{C3}$ | $R^{B20}$ | $R^{B4}$ |
| $L_{A3054}$ | $R^{C3}$ | $R^{B25}$ | $R^{B4}$ |
| $L_{A3055}$ | $R^{C3}$ | $R^{B29}$ | $R^{B4}$ |
| $L_{A3056}$ | $R^{C3}$ | $R^{A37}$ | $R^{B4}$ |
| $L_{A3057}$ | $R^{C3}$ | $R^{A43}$ | $R^{B4}$ |
| $L_{A3058}$ | $R^{C3}$ | $R^{E1}$ | $R^{B4}$ |
| $L_{A3059}$ | $R^{C3}$ | $R^{E2}$ | $R^{B4}$ |
| $L_{A3060}$ | $R^{C3}$ | $R^{E3}$ | $R^{B4}$ |
| $L_{A3061}$ | $R^{C3}$ | $R^{E4}$ | $R^{B4}$ |
| $L_{A3062}$ | $R^{C3}$ | $R^{E5}$ | $R^{B4}$ |
| $L_{A3063}$ | $R^{C3}$ | $R^{E6}$ | $R^{B4}$ |
| $L_{A3064}$ | $R^{C3}$ | $R^{E7}$ | $R^{B4}$ |
| $L_{A3065}$ | $R^{C3}$ | $R^{E8}$ | $R^{B4}$ |
| $L_{A3066}$ | $R^{C3}$ | $R^{E9}$ | $R^{B4}$ |
| $L_{A3067}$ | $R^{C3}$ | $R^{E10}$ | $R^{B4}$ |
| $L_{A3068}$ | $R^{C3}$ | $R^{E11}$ | $R^{B4}$ |
| $L_{A3069}$ | $R^{C3}$ | $R^{E12}$ | $R^{B4}$ |
| $L_{A3070}$ | $R^{C3}$ | $R^{E13}$ | $R^{B4}$ |
| $L_{A3071}$ | $R^{C3}$ | $R^{E14}$ | $R^{B4}$ |
| $L_{A3072}$ | $R^{C3}$ | $R^{E15}$ | $R^{B4}$ |
| $L_{A3073}$ | $R^{C3}$ | $R^{E16}$ | $R^{B4}$ |
| $L_{A3074}$ | $R^{C3}$ | $R^{E17}$ | $R^{B4}$ |
| $L_{A3075}$ | $R^{C3}$ | $R^{E18}$ | $R^{B4}$ |
| $L_{A3076}$ | $R^{C3}$ | $R^{E19}$ | $R^{B4}$ |
| $L_{A3077}$ | $R^{C3}$ | $R^{E20}$ | $R^{B4}$ |
| $L_{A3078}$ | $R^{C3}$ | $R^{E21}$ | $R^{B4}$ |
| $L_{A3079}$ | $R^{C3}$ | $R^{B3}$ | $R^{B18}$ |
| $L_{A3080}$ | $R^{C3}$ | $R^{B6}$ | $R^{B18}$ |
| $L_{A3081}$ | $R^{C3}$ | $R^{B7}$ | $R^{B18}$ |
| $L_{A3082}$ | $R^{C3}$ | $R^{B12}$ | $R^{B18}$ |
| $L_{A3083}$ | $R^{C3}$ | $R^{B20}$ | $R^{B18}$ |
| $L_{A3084}$ | $R^{C3}$ | $R^{B25}$ | $R^{B18}$ |
| $L_{A3085}$ | $R^{C3}$ | $R^{B29}$ | $R^{B18}$ |
| $L_{A3086}$ | $R^{C3}$ | $R^{A37}$ | $R^{B18}$ |
| $L_{A3087}$ | $R^{C3}$ | $R^{A43}$ | $R^{B18}$ |
| $L_{A3088}$ | $R^{C3}$ | $R^{E1}$ | $R^{B18}$ |
| $L_{A3089}$ | $R^{C3}$ | $R^{E2}$ | $R^{B18}$ |
| $L_{A3090}$ | $R^{C3}$ | $R^{E3}$ | $R^{B18}$ |
| $L_{A3091}$ | $R^{C3}$ | $R^{E4}$ | $R^{B18}$ |
| $L_{A3092}$ | $R^{C3}$ | $R^{E5}$ | $R^{B18}$ |
| $L_{A3093}$ | $R^{C3}$ | $R^{E6}$ | $R^{B18}$ |
| $L_{A3094}$ | $R^{C3}$ | $R^{E7}$ | $R^{B18}$ |
| $L_{A3095}$ | $R^{C3}$ | $R^{E8}$ | $R^{B18}$ |
| $L_{A3096}$ | $R^{C3}$ | $R^{E9}$ | $R^{B18}$ |
| $L_{A3097}$ | $R^{C3}$ | $R^{E10}$ | $R^{B18}$ |
| $L_{A3098}$ | $R^{C3}$ | $R^{E11}$ | $R^{B18}$ |
| $L_{A3099}$ | $R^{C3}$ | $R^{E12}$ | $R^{B18}$ |
| $L_{A3100}$ | $R^{C3}$ | $R^{E13}$ | $R^{B18}$ |
| $L_{A3101}$ | $R^{C3}$ | $R^{E14}$ | $R^{B18}$ |
| $L_{A3102}$ | $R^{C3}$ | $R^{E15}$ | $R^{B18}$ |
| $L_{A3103}$ | $R^{C3}$ | $R^{E16}$ | $R^{B18}$ |
| $L_{A3104}$ | $R^{C3}$ | $R^{E17}$ | $R^{B18}$ |
| $L_{A3105}$ | $R^{C3}$ | $R^{E18}$ | $R^{B18}$ |
| $L_{A3106}$ | $R^{C3}$ | $R^{E19}$ | $R^{B18}$ |
| $L_{A3107}$ | $R^{C3}$ | $R^{E20}$ | $R^{B18}$ |
| $L_{A3108}$ | $R^{C3}$ | $R^{E21}$ | $R^{B18}$ |
| $L_{A3109}$ | $R^{C3}$ | $R^{B3}$ | $R^{A3}$ |
| $L_{A3110}$ | $R^{C3}$ | $R^{B6}$ | $R^{A3}$ |
| $L_{A3111}$ | $R^{C3}$ | $R^{B7}$ | $R^{A3}$ |
| $L_{A3112}$ | $R^{C3}$ | $R^{B12}$ | $R^{A3}$ |
| $L_{A3113}$ | $R^{C3}$ | $R^{B20}$ | $R^{A3}$ |
| $L_{A3114}$ | $R^{C3}$ | $R^{B25}$ | $R^{A3}$ |
| $L_{A3115}$ | $R^{C3}$ | $R^{B29}$ | $R^{A3}$ |
| $L_{A3116}$ | $R^{C3}$ | $R^{A37}$ | $R^{A3}$ |
| $L_{A3117}$ | $R^{C3}$ | $R^{A43}$ | $R^{A3}$ |
| $L_{A3118}$ | $R^{C3}$ | $R^{E1}$ | $R^{A3}$ |
| $L_{A3119}$ | $R^{C3}$ | $R^{E2}$ | $R^{A3}$ |
| $L_{A3120}$ | $R^{C3}$ | $R^{E3}$ | $R^{A3}$ |
| $L_{A3121}$ | $R^{C3}$ | $R^{E4}$ | $R^{A3}$ |

| Ligand | $R^2$ | $R^3$ | $R^4$ |
|---|---|---|---|
| $L_{A3122}$ | $R^{C3}$ | $R^{E5}$ | $R^{A3}$ |
| $L_{A3123}$ | $R^{C3}$ | $R^{E6}$ | $R^{A3}$ |
| $L_{A3124}$ | $R^{C3}$ | $R^{E7}$ | $R^{A3}$ |
| $L_{A3125}$ | $R^{C3}$ | $R^{E8}$ | $R^{A3}$ |
| $L_{A3126}$ | $R^{C3}$ | $R^{E9}$ | $R^{A3}$ |
| $L_{A3127}$ | $R^{C3}$ | $R^{E10}$ | $R^{A3}$ |
| $L_{A3128}$ | $R^{C3}$ | $R^{E11}$ | $R^{A3}$ |
| $L_{A3129}$ | $R^{C3}$ | $R^{E12}$ | $R^{A3}$ |
| $L_{A3130}$ | $R^{C3}$ | $R^{E13}$ | $R^{A3}$ |
| $L_{A3131}$ | $R^{C3}$ | $R^{E14}$ | $R^{A3}$ |
| $L_{A3132}$ | $R^{C3}$ | $R^{E15}$ | $R^{A3}$ |
| $L_{A3133}$ | $R^{C3}$ | $R^{E16}$ | $R^{A3}$ |
| $L_{A3134}$ | $R^{C3}$ | $R^{E17}$ | $R^{A3}$ |
| $L_{A3135}$ | $R^{C3}$ | $R^{E18}$ | $R^{A3}$ |
| $L_{A3136}$ | $R^{C3}$ | $R^{E19}$ | $R^{A3}$ |
| $L_{A3137}$ | $R^{C3}$ | $R^{E20}$ | $R^{A3}$ |
| $L_{A3138}$ | $R^{C3}$ | $R^{E21}$ | $R^{A3}$ |
| $L_{A3139}$ | $R^{C3}$ | $R^{B3}$ | $R^{A34}$ |
| $L_{A3140}$ | $R^{C3}$ | $R^{B6}$ | $R^{A34}$ |
| $L_{A3141}$ | $R^{C3}$ | $R^{B7}$ | $R^{A34}$ |
| $L_{A3142}$ | $R^{C3}$ | $R^{B12}$ | $R^{A34}$ |
| $L_{A3143}$ | $R^{C3}$ | $R^{B20}$ | $R^{A34}$ |
| $L_{A3144}$ | $R^{C3}$ | $R^{B25}$ | $R^{A34}$ |
| $L_{A3145}$ | $R^{C3}$ | $R^{B29}$ | $R^{A34}$ |
| $L_{A3146}$ | $R^{C3}$ | $R^{A37}$ | $R^{A34}$ |
| $L_{A3147}$ | $R^{C3}$ | $R^{A43}$ | $R^{A34}$ |
| $L_{A3148}$ | $R^{C3}$ | $R^{E1}$ | $R^{A34}$ |
| $L_{A3149}$ | $R^{C3}$ | $R^{E2}$ | $R^{A34}$ |
| $L_{A3150}$ | $R^{C3}$ | $R^{E3}$ | $R^{A34}$ |
| $L_{A3151}$ | $R^{C3}$ | $R^{E4}$ | $R^{A34}$ |
| $L_{A3152}$ | $R^{C3}$ | $R^{E5}$ | $R^{A34}$ |
| $L_{A3153}$ | $R^{C3}$ | $R^{E6}$ | $R^{A34}$ |
| $L_{A3154}$ | $R^{C3}$ | $R^{E7}$ | $R^{A34}$ |
| $L_{A3155}$ | $R^{C3}$ | $R^{E8}$ | $R^{A34}$ |
| $L_{A3156}$ | $R^{C3}$ | $R^{E9}$ | $R^{A34}$ |
| $L_{A3157}$ | $R^{C3}$ | $R^{E10}$ | $R^{A34}$ |
| $L_{A3158}$ | $R^{C3}$ | $R^{E11}$ | $R^{A34}$ |
| $L_{A3159}$ | $R^{C3}$ | $R^{E12}$ | $R^{A34}$ |
| $L_{A3160}$ | $R^{C3}$ | $R^{E13}$ | $R^{A34}$ |
| $L_{A3161}$ | $R^{C3}$ | $R^{E14}$ | $R^{A34}$ |
| $L_{A3162}$ | $R^{C3}$ | $R^{E15}$ | $R^{A34}$ |
| $L_{A3163}$ | $R^{C3}$ | $R^{E16}$ | $R^{A34}$ |
| $L_{A3164}$ | $R^{C3}$ | $R^{E17}$ | $R^{A34}$ |
| $L_{A3165}$ | $R^{C3}$ | $R^{E18}$ | $R^{A34}$ |
| $L_{A3166}$ | $R^{C3}$ | $R^{E19}$ | $R^{A34}$ |
| $L_{A3167}$ | $R^{C3}$ | $R^{E20}$ | $R^{A34}$ |
| $L_{A3168}$ | $R^{C3}$ | $R^{E21}$ | $R^{A34}$ |
| $L_{A3169}$ | $R^{C3}$ | $R^{B3}$ | $R^{A52}$ |
| $L_{A3170}$ | $R^{C3}$ | $R^{B6}$ | $R^{A52}$ |
| $L_{A3171}$ | $R^{C3}$ | $R^{B7}$ | $R^{A52}$ |
| $L_{A3172}$ | $R^{C3}$ | $R^{B12}$ | $R^{A52}$ |
| $L_{A3173}$ | $R^{C3}$ | $R^{B20}$ | $R^{A52}$ |
| $L_{A3174}$ | $R^{C3}$ | $R^{B25}$ | $R^{A52}$ |
| $L_{A3175}$ | $R^{C3}$ | $R^{B29}$ | $R^{A52}$ |
| $L_{A3176}$ | $R^{C3}$ | $R^{A37}$ | $R^{A52}$ |
| $L_{A3177}$ | $R^{C3}$ | $R^{A43}$ | $R^{A52}$ |
| $L_{A3178}$ | $R^{C3}$ | $R^{E1}$ | $R^{A52}$ |
| $L_{A3179}$ | $R^{C3}$ | $R^{E2}$ | $R^{A52}$ |
| $L_{A3180}$ | $R^{C3}$ | $R^{E3}$ | $R^{A52}$ |
| $L_{A3181}$ | $R^{C3}$ | $R^{E4}$ | $R^{A52}$ |
| $L_{A3182}$ | $R^{C3}$ | $R^{E5}$ | $R^{A52}$ |
| $L_{A3183}$ | $R^{C3}$ | $R^{E6}$ | $R^{A52}$ |
| $L_{A3184}$ | $R^{C3}$ | $R^{E7}$ | $R^{A52}$ |
| $L_{A3185}$ | $R^{C3}$ | $R^{E8}$ | $R^{A52}$ |
| $L_{A3186}$ | $R^{C3}$ | $R^{E9}$ | $R^{A52}$ |
| $L_{A3187}$ | $R^{C3}$ | $R^{E10}$ | $R^{A52}$ |
| $L_{A3188}$ | $R^{C3}$ | $R^{E11}$ | $R^{A52}$ |
| $L_{A3189}$ | $R^{C3}$ | $R^{E12}$ | $R^{A52}$ |
| $L_{A3190}$ | $R^{C3}$ | $R^{E13}$ | $R^{A52}$ |
| $L_{A3191}$ | $R^{C3}$ | $R^{E14}$ | $R^{A52}$ |
| $L_{A3192}$ | $R^{C3}$ | $R^{E15}$ | $R^{A52}$ |
| $L_{A3193}$ | $R^{C3}$ | $R^{E16}$ | $R^{A52}$ |
| $L_{A3194}$ | $R^{C3}$ | $R^{E17}$ | $R^{A52}$ |
| $L_{A3195}$ | $R^{C3}$ | $R^{E18}$ | $R^{A52}$ |
| $L_{A3196}$ | $R^{C3}$ | $R^{E19}$ | $R^{A52}$ |
| $L_{A3197}$ | $R^{C3}$ | $R^{E20}$ | $R^{A52}$ |
| $L_{A3198}$ | $R^{C3}$ | $R^{E21}$ | $R^{A52}$ |

| Ligand | $R^2$ | $R^3$ | $R^4$ |
|---|---|---|---|
| $L_{A3199}$ | $R^{C31}$ | $R^{B3}$ | H |
| $L_{A3200}$ | $R^{C31}$ | $R^{B6}$ | H |
| $L_{A3201}$ | $R^{C31}$ | $R^{B7}$ | H |
| $L_{A3202}$ | $R^{C31}$ | $R^{B12}$ | H |
| $L_{A3203}$ | $R^{C31}$ | $R^{B20}$ | H |
| $L_{A3204}$ | $R^{C31}$ | $R^{B25}$ | H |
| $L_{A3205}$ | $R^{C31}$ | $R^{B29}$ | H |
| $L_{A3206}$ | $R^{C31}$ | $R^{A37}$ | H |
| $L_{A3207}$ | $R^{C31}$ | $R^{A43}$ | H |
| $L_{A3208}$ | $R^{C31}$ | $R^{E1}$ | H |
| $L_{A3209}$ | $R^{C31}$ | $R^{E2}$ | H |
| $L_{A3210}$ | $R^{C31}$ | $R^{E3}$ | H |
| $L_{A3211}$ | $R^{C31}$ | $R^{E4}$ | H |
| $L_{A3212}$ | $R^{C31}$ | $R^{E5}$ | H |
| $L_{A3213}$ | $R^{C31}$ | $R^{E6}$ | H |
| $L_{A3214}$ | $R^{C31}$ | $R^{E7}$ | H |
| $L_{A3215}$ | $R^{C31}$ | $R^{E8}$ | H |
| $L_{A3216}$ | $R^{C31}$ | $R^{E9}$ | H |
| $L_{A3217}$ | $R^{C31}$ | $R^{E10}$ | H |
| $L_{A3218}$ | $R^{C31}$ | $R^{E11}$ | H |
| $L_{A3219}$ | $R^{C31}$ | $R^{E12}$ | H |
| $L_{A3220}$ | $R^{C31}$ | $R^{E13}$ | H |
| $L_{A3221}$ | $R^{C31}$ | $R^{E14}$ | H |
| $L_{A3222}$ | $R^{C31}$ | $R^{E15}$ | H |
| $L_{A3223}$ | $R^{C31}$ | $R^{E16}$ | H |
| $L_{A3224}$ | $R^{C31}$ | $R^{E17}$ | H |
| $L_{A3225}$ | $R^{C31}$ | $R^{E18}$ | H |
| $L_{A3226}$ | $R^{C31}$ | $R^{E19}$ | H |
| $L_{A3227}$ | $R^{C31}$ | $R^{E20}$ | H |
| $L_{A3228}$ | $R^{C31}$ | $R^{E21}$ | H |
| $L_{A3229}$ | $R^{C31}$ | $R^{B3}$ | $R^{B3}$ |
| $L_{A3230}$ | $R^{C31}$ | $R^{B6}$ | $R^{B3}$ |
| $L_{A3231}$ | $R^{C31}$ | $R^{B7}$ | $R^{B3}$ |
| $L_{A3232}$ | $R^{C31}$ | $R^{B12}$ | $R^{B3}$ |
| $L_{A3233}$ | $R^{C31}$ | $R^{B20}$ | $R^{B3}$ |
| $L_{A3234}$ | $R^{C31}$ | $R^{B25}$ | $R^{B3}$ |
| $L_{A3235}$ | $R^{C31}$ | $R^{B29}$ | $R^{B3}$ |
| $L_{A3236}$ | $R^{C31}$ | $R^{A37}$ | $R^{B3}$ |
| $L_{A3237}$ | $R^{C31}$ | $R^{A43}$ | $R^{B3}$ |
| $L_{A3238}$ | $R^{C31}$ | $R^{E1}$ | $R^{B3}$ |
| $L_{A3239}$ | $R^{C31}$ | $R^{E2}$ | $R^{B3}$ |
| $L_{A3240}$ | $R^{C31}$ | $R^{E3}$ | $R^{B3}$ |
| $L_{A3241}$ | $R^{C31}$ | $R^{E4}$ | $R^{B3}$ |
| $L_{A3242}$ | $R^{C31}$ | $R^{E5}$ | $R^{B3}$ |
| $L_{A3243}$ | $R^{C31}$ | $R^{E6}$ | $R^{B3}$ |
| $L_{A3244}$ | $R^{C31}$ | $R^{E7}$ | $R^{B3}$ |
| $L_{A3245}$ | $R^{C31}$ | $R^{E8}$ | $R^{B3}$ |
| $L_{A3246}$ | $R^{C31}$ | $R^{E9}$ | $R^{B3}$ |
| $L_{A3247}$ | $R^{C31}$ | $R^{E10}$ | $R^{B3}$ |
| $L_{A3248}$ | $R^{C31}$ | $R^{E11}$ | $R^{B3}$ |
| $L_{A3249}$ | $R^{C31}$ | $R^{E12}$ | $R^{B3}$ |
| $L_{A3250}$ | $R^{C31}$ | $R^{E13}$ | $R^{B3}$ |
| $L_{A3251}$ | $R^{C31}$ | $R^{E14}$ | $R^{B3}$ |
| $L_{A3252}$ | $R^{C31}$ | $R^{E15}$ | $R^{B3}$ |
| $L_{A3253}$ | $R^{C31}$ | $R^{E16}$ | $R^{B3}$ |
| $L_{A3254}$ | $R^{C31}$ | $R^{E17}$ | $R^{B3}$ |
| $L_{A3255}$ | $R^{C31}$ | $R^{E18}$ | $R^{B3}$ |
| $L_{A3256}$ | $R^{C31}$ | $R^{E19}$ | $R^{B3}$ |
| $L_{A3257}$ | $R^{C31}$ | $R^{E20}$ | $R^{B3}$ |
| $L_{A3258}$ | $R^{C31}$ | $R^{E21}$ | $R^{B3}$ |
| $L_{A3259}$ | $R^{C31}$ | $R^{B3}$ | $R^{B4}$ |
| $L_{A3260}$ | $R^{C31}$ | $R^{B6}$ | $R^{B4}$ |
| $L_{A3261}$ | $R^{C31}$ | $R^{B7}$ | $R^{B4}$ |
| $L_{A3262}$ | $R^{C31}$ | $R^{B12}$ | $R^{B4}$ |
| $L_{A3263}$ | $R^{C31}$ | $R^{B20}$ | $R^{B4}$ |
| $L_{A3264}$ | $R^{C31}$ | $R^{B25}$ | $R^{B4}$ |
| $L_{A3265}$ | $R^{C31}$ | $R^{B29}$ | $R^{B4}$ |
| $L_{A3266}$ | $R^{C31}$ | $R^{A37}$ | $R^{B4}$ |
| $L_{A3267}$ | $R^{C31}$ | $R^{A43}$ | $R^{B4}$ |
| $L_{A3268}$ | $R^{C31}$ | $R^{E1}$ | $R^{B4}$ |
| $L_{A3269}$ | $R^{C31}$ | $R^{E2}$ | $R^{B4}$ |
| $L_{A3270}$ | $R^{C31}$ | $R^{E3}$ | $R^{B4}$ |
| $L_{A3271}$ | $R^{C31}$ | $R^{E4}$ | $R^{B4}$ |
| $L_{A3272}$ | $R^{C31}$ | $R^{E5}$ | $R^{B4}$ |
| $L_{A3273}$ | $R^{C31}$ | $R^{E6}$ | $R^{B4}$ |
| $L_{A3274}$ | $R^{C31}$ | $R^{E7}$ | $R^{B4}$ |
| $L_{A3275}$ | $R^{C31}$ | $R^{E8}$ | $R^{B4}$ |

| Ligand | $R^2$ | $R^3$ | $R^4$ |
|---|---|---|---|
| $L_{A3276}$ | $R^{C31}$ | $R^{E9}$ | $R^{B4}$ |
| $L_{A3277}$ | $R^{C31}$ | $R^{E10}$ | $R^{B4}$ |
| $L_{A3278}$ | $R^{C31}$ | $R^{E11}$ | $R^{B4}$ |
| $L_{A3279}$ | $R^{C31}$ | $R^{E12}$ | $R^{B4}$ |
| $L_{A3280}$ | $R^{C31}$ | $R^{E13}$ | $R^{B4}$ |
| $L_{A3281}$ | $R^{C31}$ | $R^{E14}$ | $R^{B4}$ |
| $L_{A3282}$ | $R^{C31}$ | $R^{E15}$ | $R^{B4}$ |
| $L_{A3283}$ | $R^{C31}$ | $R^{E16}$ | $R^{B4}$ |
| $L_{A3284}$ | $R^{C31}$ | $R^{E17}$ | $R^{B4}$ |
| $L_{A3285}$ | $R^{C31}$ | $R^{E18}$ | $R^{B4}$ |
| $L_{A3286}$ | $R^{C31}$ | $R^{E19}$ | $R^{B4}$ |
| $L_{A3287}$ | $R^{C31}$ | $R^{E20}$ | $R^{B4}$ |
| $L_{A3288}$ | $R^{C31}$ | $R^{E21}$ | $R^{B4}$ |
| $L_{A3289}$ | $R^{C31}$ | $R^{B3}$ | $R^{B18}$ |
| $L_{A3290}$ | $R^{C31}$ | $R^{B6}$ | $R^{B18}$ |
| $L_{A3291}$ | $R^{C31}$ | $R^{B7}$ | $R^{B18}$ |
| $L_{A3292}$ | $R^{C31}$ | $R^{B12}$ | $R^{B18}$ |
| $L_{A3293}$ | $R^{C31}$ | $R^{B20}$ | $R^{B18}$ |
| $L_{A3294}$ | $R^{C31}$ | $R^{B25}$ | $R^{B18}$ |
| $L_{A3295}$ | $R^{C31}$ | $R^{B29}$ | $R^{B18}$ |
| $L_{A3296}$ | $R^{C31}$ | $R^{A37}$ | $R^{B18}$ |
| $L_{A3297}$ | $R^{C31}$ | $R^{A43}$ | $R^{B18}$ |
| $L_{A3298}$ | $R^{C31}$ | $R^{E1}$ | $R^{B18}$ |
| $L_{A3299}$ | $R^{C31}$ | $R^{E2}$ | $R^{B18}$ |
| $L_{A3300}$ | $R^{C31}$ | $R^{E3}$ | $R^{B18}$ |
| $L_{A3301}$ | $R^{C31}$ | $R^{E4}$ | $R^{B18}$ |
| $L_{A3302}$ | $R^{C31}$ | $R^{E5}$ | $R^{B18}$ |
| $L_{A3303}$ | $R^{C31}$ | $R^{E6}$ | $R^{B18}$ |
| $L_{A3304}$ | $R^{C31}$ | $R^{E7}$ | $R^{B18}$ |
| $L_{A3305}$ | $R^{C31}$ | $R^{E8}$ | $R^{B18}$ |
| $L_{A3306}$ | $R^{C31}$ | $R^{E9}$ | $R^{B18}$ |
| $L_{A3307}$ | $R^{C31}$ | $R^{E10}$ | $R^{B18}$ |
| $L_{A3308}$ | $R^{C31}$ | $R^{E11}$ | $R^{B18}$ |
| $L_{A3309}$ | $R^{C31}$ | $R^{E12}$ | $R^{B18}$ |
| $L_{A3310}$ | $R^{C31}$ | $R^{E13}$ | $R^{B18}$ |
| $L_{A3311}$ | $R^{C31}$ | $R^{E14}$ | $R^{B18}$ |
| $L_{A3312}$ | $R^{C31}$ | $R^{E15}$ | $R^{B18}$ |
| $L_{A3313}$ | $R^{C31}$ | $R^{E16}$ | $R^{B18}$ |
| $L_{A3314}$ | $R^{C31}$ | $R^{E17}$ | $R^{B18}$ |
| $L_{A3315}$ | $R^{C31}$ | $R^{E18}$ | $R^{B18}$ |
| $L_{A3316}$ | $R^{C31}$ | $R^{E19}$ | $R^{B18}$ |
| $L_{A3317}$ | $R^{C31}$ | $R^{E20}$ | $R^{B18}$ |
| $L_{A3318}$ | $R^{C31}$ | $R^{E21}$ | $R^{B18}$ |
| $L_{A3319}$ | $R^{C31}$ | $R^{B3}$ | $R^{A3}$ |
| $L_{A3320}$ | $R^{C31}$ | $R^{B6}$ | $R^{A3}$ |
| $L_{A3321}$ | $R^{C31}$ | $R^{B7}$ | $R^{A3}$ |
| $L_{A3322}$ | $R^{C31}$ | $R^{B12}$ | $R^{A3}$ |
| $L_{A3323}$ | $R^{C31}$ | $R^{B20}$ | $R^{A3}$ |
| $L_{A3324}$ | $R^{C31}$ | $R^{B25}$ | $R^{A3}$ |
| $L_{A3325}$ | $R^{C31}$ | $R^{B29}$ | $R^{A3}$ |
| $L_{A3326}$ | $R^{C31}$ | $R^{A37}$ | $R^{A3}$ |
| $L_{A3327}$ | $R^{C31}$ | $R^{A43}$ | $R^{A3}$ |
| $L_{A3328}$ | $R^{C31}$ | $R^{E1}$ | $R^{A3}$ |
| $L_{A3329}$ | $R^{C31}$ | $R^{E2}$ | $R^{A3}$ |
| $L_{A3330}$ | $R^{C31}$ | $R^{E3}$ | $R^{A3}$ |
| $L_{A3331}$ | $R^{C31}$ | $R^{E4}$ | $R^{A3}$ |
| $L_{A3332}$ | $R^{C31}$ | $R^{E5}$ | $R^{A3}$ |
| $L_{A3333}$ | $R^{C31}$ | $R^{E6}$ | $R^{A3}$ |
| $L_{A3334}$ | $R^{C31}$ | $R^{E7}$ | $R^{A3}$ |
| $L_{A3335}$ | $R^{C31}$ | $R^{E8}$ | $R^{A3}$ |
| $L_{A3336}$ | $R^{C31}$ | $R^{E9}$ | $R^{A3}$ |
| $L_{A3337}$ | $R^{C31}$ | $R^{E10}$ | $R^{A3}$ |
| $L_{A3338}$ | $R^{C31}$ | $R^{E11}$ | $R^{A3}$ |
| $L_{A3339}$ | $R^{C31}$ | $R^{E12}$ | $R^{A3}$ |
| $L_{A3340}$ | $R^{C31}$ | $R^{E13}$ | $R^{A3}$ |
| $L_{A3341}$ | $R^{C31}$ | $R^{E14}$ | $R^{A3}$ |
| $L_{A3342}$ | $R^{C31}$ | $R^{E15}$ | $R^{A3}$ |
| $L_{A3343}$ | $R^{C31}$ | $R^{E16}$ | $R^{A3}$ |
| $L_{A3344}$ | $R^{C31}$ | $R^{E17}$ | $R^{A3}$ |
| $L_{A3345}$ | $R^{C31}$ | $R^{E18}$ | $R^{A3}$ |
| $L_{A3346}$ | $R^{C31}$ | $R^{E19}$ | $R^{A3}$ |
| $L_{A3347}$ | $R^{C31}$ | $R^{E20}$ | $R^{A3}$ |
| $L_{A3348}$ | $R^{C31}$ | $R^{E21}$ | $R^{A3}$ |
| $L_{A3349}$ | $R^{C31}$ | $R^{B3}$ | $R^{A34}$ |
| $L_{A3350}$ | $R^{C31}$ | $R^{B6}$ | $R^{A34}$ |
| $L_{A3351}$ | $R^{C31}$ | $R^{B7}$ | $R^{A34}$ |
| $L_{A3352}$ | $R^{C31}$ | $R^{B12}$ | $R^{A34}$ |

| Ligand | $R^2$ | $R^3$ | $R^4$ |
|---|---|---|---|
| $L_{A3353}$ | $R^{C31}$ | $R^{B20}$ | $R^{A34}$ |
| $L_{A3354}$ | $R^{C31}$ | $R^{B25}$ | $R^{A34}$ |
| $L_{A3355}$ | $R^{C31}$ | $R^{B29}$ | $R^{A34}$ |
| $L_{A3356}$ | $R^{C31}$ | $R^{A37}$ | $R^{A34}$ |
| $L_{A3357}$ | $R^{C31}$ | $R^{A43}$ | $R^{A34}$ |
| $L_{A3358}$ | $R^{C31}$ | $R^{E1}$ | $R^{A34}$ |
| $L_{A3359}$ | $R^{C31}$ | $R^{E2}$ | $R^{A34}$ |
| $L_{A3360}$ | $R^{C31}$ | $R^{E3}$ | $R^{A34}$ |
| $L_{A3361}$ | $R^{C31}$ | $R^{E4}$ | $R^{A34}$ |
| $L_{A3362}$ | $R^{C31}$ | $R^{E5}$ | $R^{A34}$ |
| $L_{A3363}$ | $R^{C31}$ | $R^{E6}$ | $R^{A34}$ |
| $L_{A3364}$ | $R^{C31}$ | $R^{E7}$ | $R^{A34}$ |
| $L_{A3365}$ | $R^{C31}$ | $R^{E8}$ | $R^{A34}$ |
| $L_{A3366}$ | $R^{C31}$ | $R^{E9}$ | $R^{A34}$ |
| $L_{A3367}$ | $R^{C31}$ | $R^{E10}$ | $R^{A34}$ |
| $L_{A3368}$ | $R^{C31}$ | $R^{E11}$ | $R^{A34}$ |
| $L_{A3369}$ | $R^{C31}$ | $R^{E12}$ | $R^{A34}$ |
| $L_{A3370}$ | $R^{C31}$ | $R^{E13}$ | $R^{A34}$ |
| $L_{A3371}$ | $R^{C31}$ | $R^{E14}$ | $R^{A34}$ |
| $L_{A3372}$ | $R^{C31}$ | $R^{E15}$ | $R^{A34}$ |
| $L_{A3373}$ | $R^{C31}$ | $R^{E16}$ | $R^{A34}$ |
| $L_{A3374}$ | $R^{C31}$ | $R^{E17}$ | $R^{A34}$ |
| $L_{A3375}$ | $R^{C31}$ | $R^{E18}$ | $R^{A34}$ |
| $L_{A3376}$ | $R^{C31}$ | $R^{E19}$ | $R^{A34}$ |
| $L_{A3377}$ | $R^{C31}$ | $R^{E20}$ | $R^{A34}$ |
| $L_{A3378}$ | $R^{C31}$ | $R^{E21}$ | $R^{A34}$ |
| $L_{A3379}$ | $R^{C31}$ | $R^{B3}$ | $R^{A52}$ |
| $L_{A3380}$ | $R^{C31}$ | $R^{B6}$ | $R^{A52}$ |
| $L_{A3381}$ | $R^{C31}$ | $R^{B7}$ | $R^{A52}$ |
| $L_{A3382}$ | $R^{C31}$ | $R^{B12}$ | $R^{A52}$ |
| $L_{A3383}$ | $R^{C31}$ | $R^{B20}$ | $R^{A52}$ |
| $L_{A3384}$ | $R^{C31}$ | $R^{B25}$ | $R^{A52}$ |
| $L_{A3385}$ | $R^{C31}$ | $R^{B29}$ | $R^{A52}$ |
| $L_{A3386}$ | $R^{C31}$ | $R^{A37}$ | $R^{A52}$ |
| $L_{A3387}$ | $R^{C31}$ | $R^{A43}$ | $R^{A52}$ |
| $L_{A3388}$ | $R^{C31}$ | $R^{E1}$ | $R^{A52}$ |
| $L_{A3389}$ | $R^{C31}$ | $R^{E2}$ | $R^{A52}$ |
| $L_{A3390}$ | $R^{C31}$ | $R^{E3}$ | $R^{A52}$ |
| $L_{A3391}$ | $R^{C31}$ | $R^{E4}$ | $R^{A52}$ |
| $L_{A3392}$ | $R^{C31}$ | $R^{E5}$ | $R^{A52}$ |
| $L_{A3393}$ | $R^{C31}$ | $R^{E6}$ | $R^{A52}$ |
| $L_{A3394}$ | $R^{C31}$ | $R^{E7}$ | $R^{A52}$ |
| $L_{A3395}$ | $R^{C31}$ | $R^{E8}$ | $R^{A52}$ |
| $L_{A3396}$ | $R^{C31}$ | $R^{E9}$ | $R^{A52}$ |
| $L_{A3397}$ | $R^{C31}$ | $R^{E10}$ | $R^{A52}$ |
| $L_{A3398}$ | $R^{C31}$ | $R^{E11}$ | $R^{A52}$ |
| $L_{A3399}$ | $R^{C31}$ | $R^{E12}$ | $R^{A52}$ |
| $L_{A3400}$ | $R^{C31}$ | $R^{E13}$ | $R^{A52}$ |
| $L_{A3401}$ | $R^{C31}$ | $R^{E14}$ | $R^{A52}$ |
| $L_{A3402}$ | $R^{C31}$ | $R^{E15}$ | $R^{A52}$ |
| $L_{A3403}$ | $R^{C31}$ | $R^{E16}$ | $R^{A52}$ |
| $L_{A3404}$ | $R^{C31}$ | $R^{E17}$ | $R^{A52}$ |
| $L_{A3405}$ | $R^{C31}$ | $R^{E18}$ | $R^{A52}$ |
| $L_{A3406}$ | $R^{C31}$ | $R^{E19}$ | $R^{A52}$ |
| $L_{A3407}$ | $R^{C31}$ | $R^{E20}$ | $R^{A52}$ |
| $L_{A3408}$ | $R^{C31}$ | $R^{E21}$ | $R^{A52}$ |
| $L_{A3409}$ | $R^{C17}$ | $R^{B3}$ | H |
| $L_{A3410}$ | $R^{C17}$ | $R^{B6}$ | H |
| $L_{A3411}$ | $R^{C17}$ | $R^{B7}$ | H |
| $L_{A3412}$ | $R^{C17}$ | $R^{B12}$ | H |
| $L_{A3413}$ | $R^{C17}$ | $R^{B20}$ | H |
| $L_{A3414}$ | $R^{C17}$ | $R^{B25}$ | H |
| $L_{A3415}$ | $R^{C17}$ | $R^{B29}$ | H |
| $L_{A3416}$ | $R^{C17}$ | $R^{A37}$ | H |
| $L_{A3417}$ | $R^{C17}$ | $R^{A43}$ | H |
| $L_{A3418}$ | $R^{C17}$ | $R^{E1}$ | H |
| $L_{A3419}$ | $R^{C17}$ | $R^{E2}$ | H |
| $L_{A3420}$ | $R^{C17}$ | $R^{E3}$ | H |
| $L_{A3421}$ | $R^{C17}$ | $R^{E4}$ | H |
| $L_{A3422}$ | $R^{C17}$ | $R^{E5}$ | H |
| $L_{A3423}$ | $R^{C17}$ | $R^{E6}$ | H |
| $L_{A3424}$ | $R^{C17}$ | $R^{E7}$ | H |
| $L_{A3425}$ | $R^{C17}$ | $R^{E8}$ | H |
| $L_{A3426}$ | $R^{C17}$ | $R^{E9}$ | H |
| $L_{A3427}$ | $R^{C17}$ | $R^{E10}$ | H |
| $L_{A3428}$ | $R^{C17}$ | $R^{E11}$ | H |
| $L_{A3429}$ | $R^{C17}$ | $R^{E12}$ | H |

-continued

| Ligand | $R^2$ | $R^3$ | $R^4$ |
|---|---|---|---|
| $L_{A3430}$ | $R^{C17}$ | $R^{E13}$ | H |
| $L_{A3431}$ | $R^{C17}$ | $R^{E14}$ | H |
| $L_{A3432}$ | $R^{C17}$ | $R^{E15}$ | H |
| $L_{A3433}$ | $R^{C17}$ | $R^{E16}$ | H |
| $L_{A3434}$ | $R^{C17}$ | $R^{E17}$ | H |
| $L_{A3435}$ | $R^{C17}$ | $R^{E18}$ | H |
| $L_{A3436}$ | $R^{C17}$ | $R^{E19}$ | H |
| $L_{A3437}$ | $R^{C17}$ | $R^{E20}$ | H |
| $L_{A3438}$ | $R^{C17}$ | $R^{E21}$ | H |
| $L_{A3439}$ | $R^{C17}$ | $R^{B3}$ | $R^{B3}$ |
| $L_{A3440}$ | $R^{C17}$ | $R^{B6}$ | $R^{B3}$ |
| $L_{A3441}$ | $R^{C17}$ | $R^{B7}$ | $R^{B3}$ |
| $L_{A3442}$ | $R^{C17}$ | $R^{B12}$ | $R^{B3}$ |
| $L_{A3443}$ | $R^{C17}$ | $R^{B20}$ | $R^{B3}$ |
| $L_{A3444}$ | $R^{C17}$ | $R^{B25}$ | $R^{B3}$ |
| $L_{A3445}$ | $R^{C17}$ | $R^{B29}$ | $R^{B3}$ |
| $L_{A3446}$ | $R^{C17}$ | $R^{A37}$ | $R^{B3}$ |
| $L_{A3447}$ | $R^{C17}$ | $R^{A43}$ | $R^{B3}$ |
| $L_{A3448}$ | $R^{C17}$ | $R^{E1}$ | $R^{B3}$ |
| $L_{A3449}$ | $R^{C17}$ | $R^{E2}$ | $R^{B3}$ |
| $L_{A3450}$ | $R^{C17}$ | $R^{E3}$ | $R^{B3}$ |
| $L_{A3451}$ | $R^{C17}$ | $R^{E4}$ | $R^{B3}$ |
| $L_{A3452}$ | $R^{C17}$ | $R^{E5}$ | $R^{B3}$ |
| $L_{A3453}$ | $R^{C17}$ | $R^{E6}$ | $R^{B3}$ |
| $L_{A3454}$ | $R^{C17}$ | $R^{E7}$ | $R^{B3}$ |
| $L_{A3455}$ | $R^{C17}$ | $R^{E8}$ | $R^{B3}$ |
| $L_{A3456}$ | $R^{C17}$ | $R^{E9}$ | $R^{B3}$ |
| $L_{A3457}$ | $R^{C17}$ | $R^{E10}$ | $R^{B3}$ |
| $L_{A3458}$ | $R^{C17}$ | $R^{E11}$ | $R^{B3}$ |
| $L_{A3459}$ | $R^{C17}$ | $R^{E12}$ | $R^{B3}$ |
| $L_{A3460}$ | $R^{C17}$ | $R^{E13}$ | $R^{B3}$ |
| $L_{A3461}$ | $R^{C17}$ | $R^{E14}$ | $R^{B3}$ |
| $L_{A3462}$ | $R^{C17}$ | $R^{E15}$ | $R^{B3}$ |
| $L_{A3463}$ | $R^{C17}$ | $R^{E16}$ | $R^{B3}$ |
| $L_{A3464}$ | $R^{C17}$ | $R^{E17}$ | $R^{B3}$ |
| $L_{A3465}$ | $R^{C17}$ | $R^{E18}$ | $R^{B3}$ |
| $L_{A3466}$ | $R^{C17}$ | $R^{E19}$ | $R^{B3}$ |
| $L_{A3467}$ | $R^{C17}$ | $R^{E20}$ | $R^{B3}$ |
| $L_{A3468}$ | $R^{C17}$ | $R^{E21}$ | $R^{B3}$ |
| $L_{A3469}$ | $R^{C17}$ | $R^{B3}$ | $R^{B4}$ |
| $L_{A3470}$ | $R^{C17}$ | $R^{B6}$ | $R^{B4}$ |
| $L_{A3471}$ | $R^{C17}$ | $R^{B7}$ | $R^{B4}$ |
| $L_{A3472}$ | $R^{C17}$ | $R^{B12}$ | $R^{B4}$ |
| $L_{A3473}$ | $R^{C17}$ | $R^{B20}$ | $R^{B4}$ |
| $L_{A3474}$ | $R^{C17}$ | $R^{B25}$ | $R^{B4}$ |
| $L_{A3475}$ | $R^{C17}$ | $R^{B29}$ | $R^{B4}$ |
| $L_{A3476}$ | $R^{C17}$ | $R^{A37}$ | $R^{B4}$ |
| $L_{A3477}$ | $R^{C17}$ | $R^{A43}$ | $R^{B4}$ |
| $L_{A3478}$ | $R^{C17}$ | $R^{E1}$ | $R^{B4}$ |
| $L_{A3479}$ | $R^{C17}$ | $R^{E2}$ | $R^{B4}$ |
| $L_{A3480}$ | $R^{C17}$ | $R^{E3}$ | $R^{B4}$ |
| $L_{A3481}$ | $R^{C17}$ | $R^{E4}$ | $R^{B4}$ |
| $L_{A3482}$ | $R^{C17}$ | $R^{E5}$ | $R^{B4}$ |
| $L_{A3483}$ | $R^{C17}$ | $R^{E6}$ | $R^{B4}$ |
| $L_{A3484}$ | $R^{C17}$ | $R^{E7}$ | $R^{B4}$ |
| $L_{A3485}$ | $R^{C17}$ | $R^{E8}$ | $R^{B4}$ |
| $L_{A3486}$ | $R^{C17}$ | $R^{E9}$ | $R^{B4}$ |
| $L_{A3487}$ | $R^{C17}$ | $R^{E10}$ | $R^{B4}$ |
| $L_{A3488}$ | $R^{C17}$ | $R^{E11}$ | $R^{B4}$ |
| $L_{A3489}$ | $R^{C17}$ | $R^{E12}$ | $R^{B4}$ |
| $L_{A3490}$ | $R^{C17}$ | $R^{E13}$ | $R^{B4}$ |
| $L_{A3491}$ | $R^{C17}$ | $R^{E14}$ | $R^{B4}$ |
| $L_{A3492}$ | $R^{C17}$ | $R^{E15}$ | $R^{B4}$ |
| $L_{A3493}$ | $R^{C17}$ | $R^{E16}$ | $R^{B4}$ |
| $L_{A3494}$ | $R^{C17}$ | $R^{E17}$ | $R^{B4}$ |
| $L_{A3495}$ | $R^{C17}$ | $R^{E18}$ | $R^{B4}$ |
| $L_{A3496}$ | $R^{C17}$ | $R^{E19}$ | $R^{B4}$ |
| $L_{A3497}$ | $R^{C17}$ | $R^{E20}$ | $R^{B4}$ |
| $L_{A3498}$ | $R^{C17}$ | $R^{E21}$ | $R^{B4}$ |
| $L_{A3499}$ | $R^{C17}$ | $R^{B3}$ | $R^{B18}$ |
| $L_{A3500}$ | $R^{C17}$ | $R^{B6}$ | $R^{B18}$ |
| $L_{A3501}$ | $R^{C17}$ | $R^{B7}$ | $R^{B18}$ |
| $L_{A3502}$ | $R^{C17}$ | $R^{B12}$ | $R^{B18}$ |
| $L_{A3503}$ | $R^{C17}$ | $R^{B20}$ | $R^{B18}$ |
| $L_{A3504}$ | $R^{C17}$ | $R^{B25}$ | $R^{B18}$ |
| $L_{A3505}$ | $R^{C17}$ | $R^{B29}$ | $R^{B18}$ |
| $L_{A3506}$ | $R^{C17}$ | $R^{A37}$ | $R^{B18}$ |

-continued

| Ligand | $R^2$ | $R^3$ | $R^4$ |
|---|---|---|---|
| $L_{A3507}$ | $R^{C17}$ | $R^{A43}$ | $R^{B18}$ |
| $L_{A3508}$ | $R^{C17}$ | $R^{E1}$ | $R^{B18}$ |
| $L_{A3509}$ | $R^{C17}$ | $R^{E2}$ | $R^{B18}$ |
| $L_{A3510}$ | $R^{C17}$ | $R^{E3}$ | $R^{B18}$ |
| $L_{A3511}$ | $R^{C17}$ | $R^{E4}$ | $R^{B18}$ |
| $L_{A3512}$ | $R^{C17}$ | $R^{E5}$ | $R^{B18}$ |
| $L_{A3513}$ | $R^{C17}$ | $R^{E6}$ | $R^{B18}$ |
| $L_{A3514}$ | $R^{C17}$ | $R^{E7}$ | $R^{B18}$ |
| $L_{A3515}$ | $R^{C17}$ | $R^{E8}$ | $R^{B18}$ |
| $L_{A3516}$ | $R^{C17}$ | $R^{E9}$ | $R^{B18}$ |
| $L_{A3517}$ | $R^{C17}$ | $R^{E10}$ | $R^{B18}$ |
| $L_{A3518}$ | $R^{C17}$ | $R^{E11}$ | $R^{B18}$ |
| $L_{A3519}$ | $R^{C17}$ | $R^{E12}$ | $R^{B18}$ |
| $L_{A3520}$ | $R^{C17}$ | $R^{E13}$ | $R^{B18}$ |
| $L_{A3521}$ | $R^{C17}$ | $R^{E14}$ | $R^{B18}$ |
| $L_{A3522}$ | $R^{C17}$ | $R^{E15}$ | $R^{B18}$ |
| $L_{A3523}$ | $R^{C17}$ | $R^{E16}$ | $R^{B18}$ |
| $L_{A3524}$ | $R^{C17}$ | $R^{E17}$ | $R^{B18}$ |
| $L_{A3525}$ | $R^{C17}$ | $R^{E18}$ | $R^{B18}$ |
| $L_{A3526}$ | $R^{C17}$ | $R^{E19}$ | $R^{B18}$ |
| $L_{A3527}$ | $R^{C17}$ | $R^{E20}$ | $R^{B18}$ |
| $L_{A3528}$ | $R^{C17}$ | $R^{E21}$ | $R^{B18}$ |
| $L_{A3529}$ | $R^{C17}$ | $R^{B3}$ | $R^{A3}$ |
| $L_{A3530}$ | $R^{C17}$ | $R^{B6}$ | $R^{A3}$ |
| $L_{A3531}$ | $R^{C17}$ | $R^{B7}$ | $R^{A3}$ |
| $L_{A3532}$ | $R^{C17}$ | $R^{B12}$ | $R^{A3}$ |
| $L_{A3533}$ | $R^{C17}$ | $R^{B20}$ | $R^{A3}$ |
| $L_{A3534}$ | $R^{C17}$ | $R^{B25}$ | $R^{A3}$ |
| $L_{A3535}$ | $R^{C17}$ | $R^{B29}$ | $R^{A3}$ |
| $L_{A3536}$ | $R^{C17}$ | $R^{A37}$ | $R^{A3}$ |
| $L_{A3537}$ | $R^{C17}$ | $R^{A43}$ | $R^{A3}$ |
| $L_{A3538}$ | $R^{C17}$ | $R^{E1}$ | $R^{A3}$ |
| $L_{A3539}$ | $R^{C17}$ | $R^{E2}$ | $R^{A3}$ |
| $L_{A3540}$ | $R^{C17}$ | $R^{E3}$ | $R^{A3}$ |
| $L_{A3541}$ | $R^{C17}$ | $R^{E4}$ | $R^{A3}$ |
| $L_{A3542}$ | $R^{C17}$ | $R^{E5}$ | $R^{A3}$ |
| $L_{A3543}$ | $R^{C17}$ | $R^{E6}$ | $R^{A3}$ |
| $L_{A3544}$ | $R^{C17}$ | $R^{E7}$ | $R^{A3}$ |
| $L_{A3545}$ | $R^{C17}$ | $R^{E8}$ | $R^{A3}$ |
| $L_{A3546}$ | $R^{C17}$ | $R^{E9}$ | $R^{A3}$ |
| $L_{A3547}$ | $R^{C17}$ | $R^{E10}$ | $R^{A3}$ |
| $L_{A3548}$ | $R^{C17}$ | $R^{E11}$ | $R^{A3}$ |
| $L_{A3549}$ | $R^{C17}$ | $R^{E12}$ | $R^{A3}$ |
| $L_{A3550}$ | $R^{C17}$ | $R^{E13}$ | $R^{A3}$ |
| $L_{A3551}$ | $R^{C17}$ | $R^{E14}$ | $R^{A3}$ |
| $L_{A3552}$ | $R^{C17}$ | $R^{E15}$ | $R^{A3}$ |
| $L_{A3553}$ | $R^{C17}$ | $R^{E16}$ | $R^{A3}$ |
| $L_{A3554}$ | $R^{C17}$ | $R^{E17}$ | $R^{A3}$ |
| $L_{A3555}$ | $R^{C17}$ | $R^{E18}$ | $R^{A3}$ |
| $L_{A3556}$ | $R^{C17}$ | $R^{E19}$ | $R^{A3}$ |
| $L_{A3557}$ | $R^{C17}$ | $R^{E20}$ | $R^{A3}$ |
| $L_{A3558}$ | $R^{C17}$ | $R^{E21}$ | $R^{A3}$ |
| $L_{A3559}$ | $R^{C17}$ | $R^{B3}$ | $R^{A34}$ |
| $L_{A3560}$ | $R^{C17}$ | $R^{B6}$ | $R^{A34}$ |
| $L_{A3561}$ | $R^{C17}$ | $R^{B7}$ | $R^{A34}$ |
| $L_{A3562}$ | $R^{C17}$ | $R^{B12}$ | $R^{A34}$ |
| $L_{A3563}$ | $R^{C17}$ | $R^{B20}$ | $R^{A34}$ |
| $L_{A3564}$ | $R^{C17}$ | $R^{B25}$ | $R^{A34}$ |
| $L_{A3565}$ | $R^{C17}$ | $R^{B29}$ | $R^{A34}$ |
| $L_{A3566}$ | $R^{C17}$ | $R^{A37}$ | $R^{A34}$ |
| $L_{A3567}$ | $R^{C17}$ | $R^{A43}$ | $R^{A34}$ |
| $L_{A3568}$ | $R^{C17}$ | $R^{E1}$ | $R^{A34}$ |
| $L_{A3569}$ | $R^{C17}$ | $R^{E2}$ | $R^{A34}$ |
| $L_{A3570}$ | $R^{C17}$ | $R^{E3}$ | $R^{A34}$ |
| $L_{A3571}$ | $R^{C17}$ | $R^{E4}$ | $R^{A34}$ |
| $L_{A3572}$ | $R^{C17}$ | $R^{E5}$ | $R^{A34}$ |
| $L_{A3573}$ | $R^{C17}$ | $R^{E6}$ | $R^{A34}$ |
| $L_{A3574}$ | $R^{C17}$ | $R^{E7}$ | $R^{A34}$ |
| $L_{A3575}$ | $R^{C17}$ | $R^{E8}$ | $R^{A34}$ |
| $L_{A3576}$ | $R^{C17}$ | $R^{E9}$ | $R^{A34}$ |
| $L_{A3577}$ | $R^{C17}$ | $R^{E10}$ | $R^{A34}$ |
| $L_{A3578}$ | $R^{C17}$ | $R^{E11}$ | $R^{A34}$ |
| $L_{A3579}$ | $R^{C17}$ | $R^{E12}$ | $R^{A34}$ |
| $L_{A3580}$ | $R^{C17}$ | $R^{E13}$ | $R^{A34}$ |
| $L_{A3581}$ | $R^{C17}$ | $R^{E14}$ | $R^{A34}$ |
| $L_{A3582}$ | $R^{C17}$ | $R^{E15}$ | $R^{A34}$ |
| $L_{A3583}$ | $R^{C17}$ | $R^{E16}$ | $R^{A34}$ |

-continued

| Ligand | $R^2$ | $R^3$ | $R^4$ |
|---|---|---|---|
| $L_{A3584}$ | $R^{C17}$ | $R^{E17}$ | $R^{A34}$ |
| $L_{A3585}$ | $R^{C17}$ | $R^{E18}$ | $R^{A34}$ |
| $L_{A3586}$ | $R^{C17}$ | $R^{E19}$ | $R^{A34}$ |
| $L_{A3587}$ | $R^{C17}$ | $R^{E20}$ | $R^{A34}$ |
| $L_{A3588}$ | $R^{C17}$ | $R^{E21}$ | $R^{A34}$ |
| $L_{A3589}$ | $R^{C17}$ | $R^{B3}$ | $R^{A52}$ |
| $L_{A3590}$ | $R^{C17}$ | $R^{B6}$ | $R^{A52}$ |
| $L_{A3591}$ | $R^{C17}$ | $R^{B7}$ | $R^{A52}$ |
| $L_{A3592}$ | $R^{C17}$ | $R^{B12}$ | $R^{A52}$ |
| $L_{A3593}$ | $R^{C17}$ | $R^{B20}$ | $R^{A52}$ |
| $L_{A3594}$ | $R^{C17}$ | $R^{B25}$ | $R^{A52}$ |
| $L_{A3595}$ | $R^{C17}$ | $R^{B29}$ | $R^{A52}$ |
| $L_{A3596}$ | $R^{C17}$ | $R^{A37}$ | $R^{A52}$ |
| $L_{A3597}$ | $R^{C17}$ | $R^{A43}$ | $R^{A52}$ |
| $L_{A3598}$ | $R^{C17}$ | $R^{E1}$ | $R^{A52}$ |
| $L_{A3599}$ | $R^{C17}$ | $R^{E2}$ | $R^{A52}$ |
| $L_{A3600}$ | $R^{C17}$ | $R^{E3}$ | $R^{A52}$ |
| $L_{A3601}$ | $R^{C17}$ | $R^{E4}$ | $R^{A52}$ |
| $L_{A3602}$ | $R^{C17}$ | $R^{E5}$ | $R^{A52}$ |
| $L_{A3603}$ | $R^{C17}$ | $R^{E6}$ | $R^{A52}$ |
| $L_{A3604}$ | $R^{C17}$ | $R^{E7}$ | $R^{A52}$ |
| $L_{A3605}$ | $R^{C17}$ | $R^{E8}$ | $R^{A52}$ |
| $L_{A3606}$ | $R^{C17}$ | $R^{E9}$ | $R^{A52}$ |
| $L_{A3607}$ | $R^{C17}$ | $R^{E10}$ | $R^{A52}$ |
| $L_{A3608}$ | $R^{C17}$ | $R^{E11}$ | $R^{A52}$ |
| $L_{A3609}$ | $R^{C7}$ | $R^{E12}$ | $R^{A52}$ |
| $L_{A3610}$ | $R^{C17}$ | $R^{E13}$ | $R^{A52}$ |
| $L_{A3611}$ | $R^{C17}$ | $R^{E14}$ | $R^{A52}$ |
| $L_{A3612}$ | $R^{C17}$ | $R^{E15}$ | $R^{A52}$ |
| $L_{A3613}$ | $R^{C17}$ | $R^{E16}$ | $R^{A52}$ |
| $L_{A3614}$ | $R^{C17}$ | $R^{E17}$ | $R^{A52}$ |
| $L_{A3615}$ | $R^{C17}$ | $R^{E18}$ | $R^{A52}$ |
| $L_{A3616}$ | $R^{C17}$ | $R^{E19}$ | $R^{A52}$ |
| $L_{A3617}$ | $R^{C17}$ | $R^{E20}$ | $R^{A52}$ |
| $L_{A3618}$ | $R^{C17}$ | $R^{E21}$ | $R^{A52}$ |
| $L_{A3619}$ | $R^{C19}$ | $R^{B3}$ | H |
| $L_{A3620}$ | $R^{C19}$ | $R^{B6}$ | H |
| $L_{A3621}$ | $R^{C19}$ | $R^{B7}$ | H |
| $L_{A3622}$ | $R^{C19}$ | $R^{B12}$ | H |
| $L_{A3623}$ | $R^{C19}$ | $R^{B20}$ | H |
| $L_{A3624}$ | $R^{C19}$ | $R^{B25}$ | H |
| $L_{A3625}$ | $R^{C19}$ | $R^{B29}$ | H |
| $L_{A3626}$ | $R^{C19}$ | $R^{A37}$ | H |
| $L_{A3627}$ | $R^{C19}$ | $R^{A43}$ | H |
| $L_{A3628}$ | $R^{C19}$ | $R^{E1}$ | H |
| $L_{A3629}$ | $R^{C19}$ | $R^{E2}$ | H |
| $L_{A3630}$ | $R^{C19}$ | $R^{E3}$ | H |
| $L_{A3631}$ | $R^{C19}$ | $R^{E4}$ | H |
| $L_{A3632}$ | $R^{C19}$ | $R^{E5}$ | H |
| $L_{A3633}$ | $R^{C19}$ | $R^{E6}$ | H |
| $L_{A3634}$ | $R^{C19}$ | $R^{E7}$ | H |
| $L_{A3635}$ | $R^{C19}$ | $R^{E8}$ | H |
| $L_{A3636}$ | $R^{C19}$ | $R^{E9}$ | H |
| $L_{A3637}$ | $R^{C19}$ | $R^{E10}$ | H |
| $L_{A3638}$ | $R^{C19}$ | $R^{E11}$ | H |
| $L_{A3639}$ | $R^{C19}$ | $R^{E12}$ | H |
| $L_{A3640}$ | $R^{C19}$ | $R^{E13}$ | H |
| $L_{A3641}$ | $R^{C19}$ | $R^{E14}$ | H |
| $L_{A3642}$ | $R^{C19}$ | $R^{E15}$ | H |
| $L_{A3643}$ | $R^{C19}$ | $R^{E16}$ | H |
| $L_{A3644}$ | $R^{C19}$ | $R^{E17}$ | H |
| $L_{A3645}$ | $R^{C19}$ | $R^{E18}$ | H |
| $L_{A3646}$ | $R^{C19}$ | $R^{E19}$ | H |
| $L_{A3647}$ | $R^{C19}$ | $R^{E20}$ | H |
| $L_{A3648}$ | $R^{C19}$ | $R^{E21}$ | H |
| $L_{A3649}$ | $R^{C19}$ | $R^{B3}$ | $R^{B3}$ |
| $L_{A3650}$ | $R^{C19}$ | $R^{B6}$ | $R^{B3}$ |
| $L_{A3651}$ | $R^{C19}$ | $R^{B7}$ | $R^{B3}$ |
| $L_{A3652}$ | $R^{C19}$ | $R^{B12}$ | $R^{B3}$ |
| $L_{A3653}$ | $R^{C19}$ | $R^{B20}$ | $R^{B3}$ |
| $L_{A3654}$ | $R^{C19}$ | $R^{B25}$ | $R^{B3}$ |
| $L_{A3655}$ | $R^{C19}$ | $R^{B29}$ | $R^{B3}$ |
| $L_{A3656}$ | $R^{C19}$ | $R^{A37}$ | $R^{B3}$ |
| $L_{A3657}$ | $R^{C19}$ | $R^{A43}$ | $R^{B3}$ |
| $L_{A3658}$ | $R^{C19}$ | $R^{E1}$ | $R^{B3}$ |
| $L_{A3659}$ | $R^{C19}$ | $R^{E2}$ | $R^{B3}$ |
| $L_{A3660}$ | $R^{C19}$ | $R^{E3}$ | $R^{B3}$ |

-continued

| Ligand | $R^2$ | $R^3$ | $R^4$ |
|---|---|---|---|
| $L_{A3661}$ | $R^{C19}$ | $R^{E4}$ | $R^{B3}$ |
| $L_{A3662}$ | $R^{C19}$ | $R^{E5}$ | $R^{B3}$ |
| $L_{A3663}$ | $R^{C19}$ | $R^{E6}$ | $R^{B3}$ |
| $L_{A3664}$ | $R^{C19}$ | $R^{E7}$ | $R^{B3}$ |
| $L_{A3665}$ | $R^{C19}$ | $R^{E8}$ | $R^{B3}$ |
| $L_{A3666}$ | $R^{C19}$ | $R^{E9}$ | $R^{B3}$ |
| $L_{A3667}$ | $R^{C19}$ | $R^{E10}$ | $R^{B3}$ |
| $L_{A3668}$ | $R^{C19}$ | $R^{E11}$ | $R^{B3}$ |
| $L_{A3669}$ | $R^{C19}$ | $R^{E12}$ | $R^{B3}$ |
| $L_{A3670}$ | $R^{C19}$ | $R^{E13}$ | $R^{B3}$ |
| $L_{A3671}$ | $R^{C19}$ | $R^{E14}$ | $R^{B3}$ |
| $L_{A3672}$ | $R^{C19}$ | $R^{E15}$ | $R^{B3}$ |
| $L_{A3673}$ | $R^{C19}$ | $R^{E16}$ | $R^{B3}$ |
| $L_{A3674}$ | $R^{C19}$ | $R^{E17}$ | $R^{B3}$ |
| $L_{A3675}$ | $R^{C19}$ | $R^{E18}$ | $R^{B3}$ |
| $L_{A3676}$ | $R^{C19}$ | $R^{E19}$ | $R^{B3}$ |
| $L_{A3677}$ | $R^{C19}$ | $R^{E20}$ | $R^{B3}$ |
| $L_{A3678}$ | $R^{C19}$ | $R^{E21}$ | $R^{B3}$ |
| $L_{A3679}$ | $R^{C19}$ | $R^{B3}$ | $R^{B4}$ |
| $L_{A3680}$ | $R^{C19}$ | $R^{B6}$ | $R^{B4}$ |
| $L_{A3681}$ | $R^{C19}$ | $R^{B7}$ | $R^{B4}$ |
| $L_{A3682}$ | $R^{C19}$ | $R^{B12}$ | $R^{B4}$ |
| $L_{A3683}$ | $R^{C19}$ | $R^{B20}$ | $R^{B4}$ |
| $L_{A3684}$ | $R^{C19}$ | $R^{B25}$ | $R^{B4}$ |
| $L_{A3685}$ | $R^{C19}$ | $R^{B29}$ | $R^{B4}$ |
| $L_{A3686}$ | $R^{C19}$ | $R^{A37}$ | $R^{B4}$ |
| $L_{A3687}$ | $R^{C19}$ | $R^{A43}$ | $R^{B4}$ |
| $L_{A3688}$ | $R^{C19}$ | $R^{E1}$ | $R^{B4}$ |
| $L_{A3689}$ | $R^{C19}$ | $R^{E2}$ | $R^{B4}$ |
| $L_{A3690}$ | $R^{C19}$ | $R^{E3}$ | $R^{B4}$ |
| $L_{A3691}$ | $R^{C19}$ | $R^{E4}$ | $R^{B4}$ |
| $L_{A3692}$ | $R^{C19}$ | $R^{E5}$ | $R^{B4}$ |
| $L_{A3693}$ | $R^{C19}$ | $R^{E6}$ | $R^{B4}$ |
| $L_{A3694}$ | $R^{C19}$ | $R^{E7}$ | $R^{B4}$ |
| $L_{A3695}$ | $R^{C19}$ | $R^{E8}$ | $R^{B4}$ |
| $L_{A3696}$ | $R^{C19}$ | $R^{E9}$ | $R^{B4}$ |
| $L_{A3697}$ | $R^{C19}$ | $R^{E10}$ | $R^{B4}$ |
| $L_{A3698}$ | $R^{C19}$ | $R^{E11}$ | $R^{B4}$ |
| $L_{A3699}$ | $R^{C19}$ | $R^{E12}$ | $R^{B4}$ |
| $L_{A3700}$ | $R^{C19}$ | $R^{E13}$ | $R^{B4}$ |
| $L_{A3701}$ | $R^{C19}$ | $R^{E14}$ | $R^{B4}$ |
| $L_{A3702}$ | $R^{C19}$ | $R^{E15}$ | $R^{B4}$ |
| $L_{A3703}$ | $R^{C19}$ | $R^{E16}$ | $R^{B4}$ |
| $L_{A3704}$ | $R^{C19}$ | $R^{E17}$ | $R^{B4}$ |
| $L_{A3705}$ | $R^{C19}$ | $R^{E18}$ | $R^{B4}$ |
| $L_{A3706}$ | $R^{C19}$ | $R^{E19}$ | $R^{B4}$ |
| $L_{A3707}$ | $R^{C19}$ | $R^{E20}$ | $R^{B4}$ |
| $L_{A3708}$ | $R^{C19}$ | $R^{E21}$ | $R^{B4}$ |
| $L_{A3709}$ | $R^{C19}$ | $R^{B3}$ | $R^{B8}$ |
| $L_{A3710}$ | $R^{C19}$ | $R^{B6}$ | $R^{B18}$ |
| $L_{A3711}$ | $R^{C19}$ | $R^{B7}$ | $R^{B18}$ |
| $L_{A3712}$ | $R^{C19}$ | $R^{B12}$ | $R^{B18}$ |
| $L_{A3713}$ | $R^{C19}$ | $R^{B20}$ | $R^{B18}$ |
| $L_{A3714}$ | $R^{C19}$ | $R^{B25}$ | $R^{B18}$ |
| $L_{A3715}$ | $R^{C19}$ | $R^{B29}$ | $R^{B18}$ |
| $L_{A3716}$ | $R^{C19}$ | $R^{A37}$ | $R^{B18}$ |
| $L_{A3717}$ | $R^{C19}$ | $R^{A43}$ | $R^{B18}$ |
| $L_{A3718}$ | $R^{C19}$ | $R^{E1}$ | $R^{B18}$ |
| $L_{A3719}$ | $R^{C19}$ | $R^{E2}$ | $R^{B18}$ |
| $L_{A3720}$ | $R^{C19}$ | $R^{E3}$ | $R^{B18}$ |
| $L_{A3721}$ | $R^{C19}$ | $R^{E4}$ | $R^{B18}$ |
| $L_{A3722}$ | $R^{C19}$ | $R^{E5}$ | $R^{B18}$ |
| $L_{A3723}$ | $R^{C19}$ | $R^{E6}$ | $R^{B18}$ |
| $L_{A3724}$ | $R^{C19}$ | $R^{E7}$ | $R^{B18}$ |
| $L_{A3725}$ | $R^{C19}$ | $R^{E8}$ | $R^{B18}$ |
| $L_{A3726}$ | $R^{C19}$ | $R^{E9}$ | $R^{B18}$ |
| $L_{A3727}$ | $R^{C19}$ | $R^{E10}$ | $R^{B18}$ |
| $L_{A3728}$ | $R^{C19}$ | $R^{E11}$ | $R^{B18}$ |
| $L_{A3729}$ | $R^{C19}$ | $R^{E12}$ | $R^{B18}$ |
| $L_{A3730}$ | $R^{C19}$ | $R^{E13}$ | $R^{B18}$ |
| $L_{A3731}$ | $R^{C19}$ | $R^{E14}$ | $R^{B18}$ |
| $L_{A3732}$ | $R^{C19}$ | $R^{E15}$ | $R^{B18}$ |
| $L_{A3733}$ | $R^{C19}$ | $R^{E16}$ | $R^{B18}$ |
| $L_{A3734}$ | $R^{C19}$ | $R^{E17}$ | $R^{B18}$ |
| $L_{A3735}$ | $R^{C19}$ | $R^{E18}$ | $R^{B18}$ |
| $L_{A3736}$ | $R^{C19}$ | $R^{E19}$ | $R^{B18}$ |
| $L_{A3737}$ | $R^{C19}$ | $R^{E20}$ | $R^{B18}$ |

-continued

| Ligand | $R^2$ | $R^3$ | $R^4$ |
|---|---|---|---|
| $L_{A3738}$ | $R^{C19}$ | $R^{E21}$ | $R^{B18}$ |
| $L_{A3739}$ | $R^{C19}$ | $R^{B3}$ | $R^{A3}$ |
| $L_{A3740}$ | $R^{C19}$ | $R^{B6}$ | $R^{A3}$ |
| $L_{A3741}$ | $R^{C19}$ | $R^{B7}$ | $R^{A3}$ |
| $L_{A3742}$ | $R^{C19}$ | $R^{B12}$ | $R^{A3}$ |
| $L_{A3743}$ | $R^{C19}$ | $R^{B20}$ | $R^{A3}$ |
| $L_{A3744}$ | $R^{C19}$ | $R^{B25}$ | $R^{A3}$ |
| $L_{A3745}$ | $R^{C19}$ | $R^{B29}$ | $R^{A3}$ |
| $L_{A3746}$ | $R^{C19}$ | $R^{A37}$ | $R^{A3}$ |
| $L_{A3747}$ | $R^{C19}$ | $R^{A43}$ | $R^{A3}$ |
| $L_{A3748}$ | $R^{C19}$ | $R^{E1}$ | $R^{A3}$ |
| $L_{A3749}$ | $R^{C19}$ | $R^{E2}$ | $R^{A3}$ |
| $L_{A3750}$ | $R^{C19}$ | $R^{E3}$ | $R^{A3}$ |
| $L_{A3751}$ | $R^{C19}$ | $R^{E4}$ | $R^{A3}$ |
| $L_{A3752}$ | $R^{C19}$ | $R^{E5}$ | $R^{A3}$ |
| $L_{A3753}$ | $R^{C19}$ | $R^{E6}$ | $R^{A3}$ |
| $L_{A3754}$ | $R^{C19}$ | $R^{E7}$ | $R^{A3}$ |
| $L_{A3755}$ | $R^{C19}$ | $R^{E8}$ | $R^{A3}$ |
| $L_{A3756}$ | $R^{C19}$ | $R^{E9}$ | $R^{A3}$ |
| $L_{A3757}$ | $R^{C19}$ | $R^{E10}$ | $R^{A3}$ |
| $L_{A3758}$ | $R^{C19}$ | $R^{E11}$ | $R^{A3}$ |
| $L_{A3759}$ | $R^{C19}$ | $R^{E12}$ | $R^{A3}$ |
| $L_{A3760}$ | $R^{C19}$ | $R^{E13}$ | $R^{A3}$ |
| $L_{A3761}$ | $R^{C19}$ | $R^{E14}$ | $R^{A3}$ |
| $L_{A3762}$ | $R^{C19}$ | $R^{E15}$ | $R^{A3}$ |
| $L_{A3763}$ | $R^{C19}$ | $R^{E16}$ | $R^{A3}$ |
| $L_{A3764}$ | $R^{C19}$ | $R^{E17}$ | $R^{A3}$ |
| $L_{A3765}$ | $R^{C19}$ | $R^{E18}$ | $R^{A3}$ |
| $L_{A3766}$ | $R^{C19}$ | $R^{E19}$ | $R^{A3}$ |
| $L_{A3767}$ | $R^{C19}$ | $R^{E20}$ | $R^{A3}$ |
| $L_{A3768}$ | $R^{C19}$ | $R^{E21}$ | $R^{A3}$ |
| $L_{A3769}$ | $R^{C19}$ | $R^{B3}$ | $R^{A34}$ |
| $L_{A3770}$ | $R^{C19}$ | $R^{B6}$ | $R^{A34}$ |
| $L_{A3771}$ | $R^{C19}$ | $R^{B7}$ | $R^{A34}$ |
| $L_{A3772}$ | $R^{C19}$ | $R^{B12}$ | $R^{A34}$ |
| $L_{A3773}$ | $R^{C19}$ | $R^{B20}$ | $R^{A34}$ |
| $L_{A3774}$ | $R^{C19}$ | $R^{B25}$ | $R^{A34}$ |
| $L_{A3775}$ | $R^{C19}$ | $R^{B29}$ | $R^{A34}$ |
| $L_{A3776}$ | $R^{C19}$ | $R^{A37}$ | $R^{A34}$ |
| $L_{A3777}$ | $R^{C19}$ | $R^{A43}$ | $R^{A34}$ |
| $L_{A3778}$ | $R^{C19}$ | $R^{E1}$ | $R^{A34}$ |
| $L_{A3779}$ | $R^{C19}$ | $R^{E2}$ | $R^{A34}$ |
| $L_{A3780}$ | $R^{C19}$ | $R^{E3}$ | $R^{A34}$ |
| $L_{A3781}$ | $R^{C19}$ | $R^{E4}$ | $R^{A34}$ |
| $L_{A3782}$ | $R^{C19}$ | $R^{E5}$ | $R^{A34}$ |
| $L_{A3783}$ | $R^{C19}$ | $R^{E6}$ | $R^{A34}$ |
| $L_{A3784}$ | $R^{C19}$ | $R^{E7}$ | $R^{A34}$ |
| $L_{A3785}$ | $R^{C19}$ | $R^{E8}$ | $R^{A34}$ |
| $L_{A3786}$ | $R^{C19}$ | $R^{E9}$ | $R^{A34}$ |
| $L_{A3787}$ | $R^{C19}$ | $R^{E10}$ | $R^{A34}$ |
| $L_{A3788}$ | $R^{C19}$ | $R^{E11}$ | $R^{A34}$ |
| $L_{A3789}$ | $R^{C19}$ | $R^{E12}$ | $R^{A4}$ |
| $L_{A3790}$ | $R^{C19}$ | $R^{E13}$ | $R^{A34}$ |
| $L_{A3791}$ | $R^{C19}$ | $R^{E14}$ | $R^{A34}$ |
| $L_{A3792}$ | $R^{C19}$ | $R^{E15}$ | $R^{A34}$ |
| $L_{A3793}$ | $R^{C19}$ | $R^{E16}$ | $R^{A34}$ |
| $L_{A3794}$ | $R^{C19}$ | $R^{E17}$ | $R^{A34}$ |
| $L_{A3795}$ | $R^{C19}$ | $R^{E18}$ | $R^{A34}$ |
| $L_{A3796}$ | $R^{C19}$ | $R^{E19}$ | $R^{A34}$ |
| $L_{A3797}$ | $R^{C19}$ | $R^{E20}$ | $R^{A34}$ |
| $L_{A3798}$ | $R^{C19}$ | $R^{E21}$ | $R^{A34}$ |
| $L_{A3799}$ | $R^{C19}$ | $R^{B3}$ | $R^{A52}$ |
| $L_{A3800}$ | $R^{C19}$ | $R^{B6}$ | $R^{A52}$ |
| $L_{A3801}$ | $R^{C19}$ | $R^{B7}$ | $R^{A52}$ |
| $L_{A3802}$ | $R^{C19}$ | $R^{B12}$ | $R^{A52}$ |
| $L_{A3803}$ | $R^{C19}$ | $R^{B20}$ | $R^{A52}$ |
| $L_{A3804}$ | $R^{C19}$ | $R^{B25}$ | $R^{A52}$ |
| $L_{A3805}$ | $R^{C19}$ | $R^{B29}$ | $R^{A52}$ |
| $L_{A3806}$ | $R^{C19}$ | $R^{A37}$ | $R^{A52}$ |
| $L_{A3807}$ | $R^{C19}$ | $R^{A43}$ | $R^{A52}$ |
| $L_{A3808}$ | $R^{C19}$ | $R^{E1}$ | $R^{A52}$ |
| $L_{A3809}$ | $R^{C19}$ | $R^{E2}$ | $R^{A52}$ |
| $L_{A3810}$ | $R^{C19}$ | $R^{E3}$ | $R^{A52}$ |
| $L_{A3811}$ | $R^{C19}$ | $R^{E4}$ | $R^{A52}$ |
| $L_{A3812}$ | $R^{C19}$ | $R^{E5}$ | $R^{A52}$ |
| $L_{A3813}$ | $R^{C19}$ | $R^{E6}$ | $R^{A52}$ |
| $L_{A3814}$ | $R^{C19}$ | $R^{E7}$ | $R^{A52}$ |

-continued

| Ligand | $R^2$ | $R^3$ | $R^4$ |
|---|---|---|---|
| $L_{A3815}$ | $R^{C19}$ | $R^{E8}$ | $R^{A52}$ |
| $L_{A3816}$ | $R^{C19}$ | $R^{E9}$ | $R^{A52}$ |
| $L_{A3817}$ | $R^{C19}$ | $R^{E10}$ | $R^{A52}$ |
| $L_{A3818}$ | $R^{C19}$ | $R^{E11}$ | $R^{A52}$ |
| $L_{A3819}$ | $R^{C19}$ | $R^{E12}$ | $R^{A52}$ |
| $L_{A3820}$ | $R^{C19}$ | $R^{E13}$ | $R^{A52}$ |
| $L_{A3821}$ | $R^{C19}$ | $R^{E14}$ | $R^{A52}$ |
| $L_{A3822}$ | $R^{C19}$ | $R^{E15}$ | $R^{A52}$ |
| $L_{A3823}$ | $R^{C19}$ | $R^{E16}$ | $R^{A52}$ |
| $L_{A3824}$ | $R^{C19}$ | $R^{E17}$ | $R^{A52}$ |
| $L_{A3825}$ | $R^{C19}$ | $R^{E18}$ | $R^{A52}$ |
| $L_{A3826}$ | $R^{C19}$ | $R^{E19}$ | $R^{A52}$ |
| $L_{A3827}$ | $R^{C19}$ | $R^{E20}$ | $R^{A52}$ |
| $L_{A3828}$ | $R^{C19}$ | $R^{E21}$ | $R^{A52}$ |
| $L_{A3829}$ | $R^{C30}$ | $R^{B3}$ | H |
| $L_{A3830}$ | $R^{C30}$ | $R^{B6}$ | H |
| $L_{A3831}$ | $R^{C30}$ | $R^{B7}$ | H |
| $L_{A3832}$ | $R^{C30}$ | $R^{B12}$ | H |
| $L_{A3833}$ | $R^{C30}$ | $R^{B20}$ | H |
| $L_{A3834}$ | $R^{C30}$ | $R^{B25}$ | H |
| $L_{A3835}$ | $R^{C30}$ | $R^{B29}$ | H |
| $L_{A3836}$ | $R^{C30}$ | $R^{A37}$ | H |
| $L_{A3837}$ | $R^{C30}$ | $R^{A43}$ | H |
| $L_{A3838}$ | $R^{C30}$ | $R^{E1}$ | H |
| $L_{A3839}$ | $R^{C30}$ | $R^{E2}$ | H |
| $L_{A3840}$ | $R^{C30}$ | $R^{E3}$ | H |
| $L_{A3841}$ | $R^{C30}$ | $R^{E4}$ | H |
| $L_{A3842}$ | $R^{C30}$ | $R^{E5}$ | H |
| $L_{A3843}$ | $R^{C30}$ | $R^{E6}$ | H |
| $L_{A3844}$ | $R^{C30}$ | $R^{E7}$ | H |
| $L_{A3845}$ | $R^{C30}$ | $R^{E8}$ | H |
| $L_{A3846}$ | $R^{C30}$ | $R^{E9}$ | H |
| $L_{A3847}$ | $R^{C30}$ | $R^{E10}$ | H |
| $L_{A3848}$ | $R^{C30}$ | $R^{E11}$ | H |
| $L_{A3849}$ | $R^{C30}$ | $R^{E12}$ | H |
| $L_{A3850}$ | $R^{C30}$ | $R^{E13}$ | H |
| $L_{A3851}$ | $R^{C30}$ | $R^{E14}$ | H |
| $L_{A3852}$ | $R^{C30}$ | $R^{E15}$ | H |
| $L_{A3853}$ | $R^{C30}$ | $R^{E16}$ | H |
| $L_{A3854}$ | $R^{C30}$ | $R^{E17}$ | H |
| $L_{A3855}$ | $R^{C30}$ | $R^{E18}$ | H |
| $L_{A3856}$ | $R^{C30}$ | $R^{E19}$ | H |
| $L_{A3857}$ | $R^{C30}$ | $R^{E20}$ | H |
| $L_{A3858}$ | $R^{C30}$ | $R^{E21}$ | H |
| $L_{A3859}$ | $R^{C30}$ | $R^{B3}$ | $R^{B3}$ |
| $L_{A3860}$ | $R^{C30}$ | $R^{B6}$ | $R^{B3}$ |
| $L_{A3861}$ | $R^{C30}$ | $R^{B7}$ | $R^{B3}$ |
| $L_{A3862}$ | $R^{C30}$ | $R^{B12}$ | $R^{B3}$ |
| $L_{A3863}$ | $R^{C30}$ | $R^{B20}$ | $R^{B3}$ |
| $L_{A3864}$ | $R^{C30}$ | $R^{B25}$ | $R^{B3}$ |
| $L_{A3865}$ | $R^{C30}$ | $R^{B29}$ | $R^{B3}$ |
| $L_{A3866}$ | $R^{C30}$ | $R^{A37}$ | $R^{B3}$ |
| $L_{A3867}$ | $R^{C30}$ | $R^{A43}$ | $R^{B3}$ |
| $L_{A3868}$ | $R^{C30}$ | $R^{E1}$ | $R^{B3}$ |
| $L_{A3869}$ | $R^{C30}$ | $R^{E2}$ | $R^{B3}$ |
| $L_{A3870}$ | $R^{C30}$ | $R^{E3}$ | $R^{B3}$ |
| $L_{A3871}$ | $R^{C30}$ | $R^{E4}$ | $R^{B3}$ |
| $L_{A3872}$ | $R^{C30}$ | $R^{E5}$ | $R^{B3}$ |
| $L_{A3873}$ | $R^{C30}$ | $R^{E6}$ | $R^{B3}$ |
| $L_{A3874}$ | $R^{C30}$ | $R^{E7}$ | $R^{B3}$ |
| $L_{A3875}$ | $R^{C30}$ | $R^{E8}$ | $R^{B3}$ |
| $L_{A3876}$ | $R^{C30}$ | $R^{E9}$ | $R^{B3}$ |
| $L_{A3877}$ | $R^{C30}$ | $R^{E10}$ | $R^{B3}$ |
| $L_{A3878}$ | $R^{C30}$ | $R^{E11}$ | $R^{B3}$ |
| $L_{A3879}$ | $R^{C30}$ | $R^{E12}$ | $R^{B3}$ |
| $L_{A3880}$ | $R^{C30}$ | $R^{E13}$ | $R^{B3}$ |
| $L_{A3881}$ | $R^{C30}$ | $R^{E14}$ | $R^{B3}$ |
| $L_{A3882}$ | $R^{C30}$ | $R^{E15}$ | $R^{B3}$ |
| $L_{A3883}$ | $R^{C30}$ | $R^{E16}$ | $R^{B3}$ |
| $L_{A3884}$ | $R^{C30}$ | $R^{E17}$ | $R^{B3}$ |
| $L_{A3885}$ | $R^{C30}$ | $R^{E18}$ | $R^{B3}$ |
| $L_{A3886}$ | $R^{C30}$ | $R^{E19}$ | $R^{B3}$ |
| $L_{A3887}$ | $R^{C30}$ | $R^{E20}$ | $R^{B3}$ |
| $L_{A3888}$ | $R^{C30}$ | $R^{E21}$ | $R^{B3}$ |
| $L_{A3889}$ | $R^{C30}$ | $R^{B3}$ | $R^{B4}$ |
| $L_{A3890}$ | $R^{C30}$ | $R^{B6}$ | $R^{B4}$ |
| $L_{A3891}$ | $R^{C30}$ | $R^{B7}$ | $R^{B4}$ |

-continued

| Ligand | $R^2$ | $R^3$ | $R^4$ |
|---|---|---|---|
| $L_{A43892}$ | $R^{C30}$ | $R^{B12}$ | $R^{B4}$ |
| $L_{A43893}$ | $R^{C30}$ | $R^{B20}$ | $R^{B4}$ |
| $L_{A43894}$ | $R^{C30}$ | $R^{B25}$ | $R^{B4}$ |
| $L_{A43895}$ | $R^{C30}$ | $R^{B29}$ | $R^{B4}$ |
| $L_{A43896}$ | $R^{C30}$ | $R^{A37}$ | $R^{B4}$ |
| $L_{A43897}$ | $R^{C30}$ | $R^{A43}$ | $R^{B4}$ |
| $L_{A43898}$ | $R^{C30}$ | $R^{E1}$ | $R^{B4}$ |
| $L_{A43899}$ | $R^{C30}$ | $R^{E2}$ | $R^{B4}$ |
| $L_{A43900}$ | $R^{C30}$ | $R^{E3}$ | $R^{B4}$ |
| $L_{A43901}$ | $R^{C30}$ | $R^{E4}$ | $R^{B4}$ |
| $L_{A43902}$ | $R^{C30}$ | $R^{E5}$ | $R^{B4}$ |
| $L_{A43903}$ | $R^{C30}$ | $R^{E6}$ | $R^{B4}$ |
| $L_{A43904}$ | $R^{C30}$ | $R^{E7}$ | $R^{B4}$ |
| $L_{A43905}$ | $R^{C30}$ | $R^{E8}$ | $R^{B4}$ |
| $L_{A43906}$ | $R^{C30}$ | $R^{E9}$ | $R^{B4}$ |
| $L_{A43907}$ | $R^{C30}$ | $R^{E10}$ | $R^{B4}$ |
| $L_{A43908}$ | $R^{C30}$ | $R^{E11}$ | $R^{B4}$ |
| $L_{A43909}$ | $R^{C30}$ | $R^{E12}$ | $R^{B4}$ |
| $L_{A43910}$ | $R^{C30}$ | $R^{E13}$ | $R^{B4}$ |
| $L_{A43911}$ | $R^{C30}$ | $R^{E14}$ | $R^{B4}$ |
| $L_{A43912}$ | $R^{C30}$ | $R^{E15}$ | $R^{B4}$ |
| $L_{A43913}$ | $R^{C30}$ | $R^{E16}$ | $R^{B4}$ |
| $L_{A43914}$ | $R^{C30}$ | $R^{E17}$ | $R^{B4}$ |
| $L_{A43915}$ | $R^{C30}$ | $R^{E18}$ | $R^{B4}$ |
| $L_{A43916}$ | $R^{C30}$ | $R^{E19}$ | $R^{B4}$ |
| $L_{A43917}$ | $R^{C30}$ | $R^{E20}$ | $R^{B4}$ |
| $L_{A43918}$ | $R^{C30}$ | $R^{E21}$ | $R^{B4}$ |
| $L_{A43919}$ | $R^{C30}$ | $R^{B3}$ | $R^{B18}$ |
| $L_{A43920}$ | $R^{C30}$ | $R^{B6}$ | $R^{B18}$ |
| $L_{A43921}$ | $R^{C30}$ | $R^{B7}$ | $R^{B18}$ |
| $L_{A43922}$ | $R^{C30}$ | $R^{B12}$ | $R^{B18}$ |
| $L_{A43923}$ | $R^{C30}$ | $R^{B20}$ | $R^{B18}$ |
| $L_{A43924}$ | $R^{C30}$ | $R^{B25}$ | $R^{B18}$ |
| $L_{A43925}$ | $R^{C30}$ | $R^{B29}$ | $R^{B18}$ |
| $L_{A43926}$ | $R^{C30}$ | $R^{A37}$ | $R^{B18}$ |
| $L_{A43927}$ | $R^{C30}$ | $R^{A43}$ | $R^{B18}$ |
| $L_{A43928}$ | $R^{C30}$ | $R^{E1}$ | $R^{B18}$ |
| $L_{A43929}$ | $R^{C30}$ | $R^{E2}$ | $R^{B18}$ |
| $L_{A43930}$ | $R^{C30}$ | $R^{E3}$ | $R^{B18}$ |
| $L_{A43931}$ | $R^{C30}$ | $R^{E4}$ | $R^{B18}$ |
| $L_{A43932}$ | $R^{C30}$ | $R^{E5}$ | $R^{B18}$ |
| $L_{A43933}$ | $R^{C30}$ | $R^{E6}$ | $R^{B18}$ |
| $L_{A43934}$ | $R^{C30}$ | $R^{E7}$ | $R^{B18}$ |
| $L_{A43935}$ | $R^{C30}$ | $R^{E8}$ | $R^{B18}$ |
| $L_{A43936}$ | $R^{C30}$ | $R^{E9}$ | $R^{B18}$ |
| $L_{A43937}$ | $R^{C30}$ | $R^{E10}$ | $R^{B18}$ |
| $L_{A43938}$ | $R^{C30}$ | $R^{E11}$ | $R^{B18}$ |
| $L_{A43939}$ | $R^{C30}$ | $R^{E12}$ | $R^{B18}$ |
| $L_{A43940}$ | $R^{C30}$ | $R^{E13}$ | $R^{B18}$ |
| $L_{A43941}$ | $R^{C30}$ | $R^{E14}$ | $R^{B18}$ |
| $L_{A43942}$ | $R^{C30}$ | $R^{E15}$ | $R^{B18}$ |
| $L_{A43943}$ | $R^{C30}$ | $R^{E16}$ | $R^{B18}$ |
| $L_{A43944}$ | $R^{C30}$ | $R^{E17}$ | $R^{B18}$ |
| $L_{A43945}$ | $R^{C30}$ | $R^{E18}$ | $R^{B18}$ |
| $L_{A43946}$ | $R^{C30}$ | $R^{E19}$ | $R^{B18}$ |
| $L_{A43947}$ | $R^{C30}$ | $R^{E20}$ | $R^{B18}$ |
| $L_{A43948}$ | $R^{C30}$ | $R^{E21}$ | $R^{B18}$ |
| $L_{A43949}$ | $R^{C30}$ | $R^{B3}$ | $R^{A3}$ |
| $L_{A43950}$ | $R^{C30}$ | $R^{B6}$ | $R^{A3}$ |
| $L_{A43951}$ | $R^{C30}$ | $R^{B7}$ | $R^{A3}$ |
| $L_{A43952}$ | $R^{C30}$ | $R^{B12}$ | $R^{A3}$ |
| $L_{A43953}$ | $R^{C30}$ | $R^{B20}$ | $R^{A3}$ |
| $L_{A43954}$ | $R^{C30}$ | $R^{B25}$ | $R^{A3}$ |
| $L_{A43955}$ | $R^{C30}$ | $R^{B29}$ | $R^{A3}$ |
| $L_{A43956}$ | $R^{C30}$ | $R^{A37}$ | $R^{A3}$ |
| $L_{A43957}$ | $R^{C30}$ | $R^{A43}$ | $R^{A3}$ |
| $L_{A43958}$ | $R^{C30}$ | $R^{E1}$ | $R^{A3}$ |
| $L_{A43959}$ | $R^{C30}$ | $R^{E2}$ | $R^{A3}$ |
| $L_{A43960}$ | $R^{C30}$ | $R^{E3}$ | $R^{A3}$ |
| $L_{A43961}$ | $R^{C30}$ | $R^{E4}$ | $R^{A3}$ |
| $L_{A43962}$ | $R^{C30}$ | $R^{E5}$ | $R^{A3}$ |
| $L_{A43963}$ | $R^{C30}$ | $R^{E6}$ | $R^{A3}$ |
| $L_{A43964}$ | $R^{C30}$ | $R^{E7}$ | $R^{A3}$ |
| $L_{A43965}$ | $R^{C30}$ | $R^{E8}$ | $R^{A3}$ |
| $L_{A43966}$ | $R^{C30}$ | $R^{E9}$ | $R^{A3}$ |
| $L_{A43967}$ | $R^{C30}$ | $R^{E10}$ | $R^{A3}$ |
| $L_{A43968}$ | $R^{C30}$ | $R^{E11}$ | $R^{A3}$ |
| $L_{A43969}$ | $R^{C30}$ | $R^{E12}$ | $R^{A3}$ |
| $L_{A43970}$ | $R^{C30}$ | $R^{E13}$ | $R^{A3}$ |
| $L_{A43971}$ | $R^{C30}$ | $R^{E14}$ | $R^{A3}$ |
| $L_{A43972}$ | $R^{C30}$ | $R^{E15}$ | $R^{A3}$ |
| $L_{A43973}$ | $R^{C30}$ | $R^{E16}$ | $R^{A3}$ |
| $L_{A43974}$ | $R^{C30}$ | $R^{E17}$ | $R^{A3}$ |
| $L_{A43975}$ | $R^{C30}$ | $R^{E18}$ | $R^{A3}$ |
| $L_{A43976}$ | $R^{C30}$ | $R^{E19}$ | $R^{A3}$ |
| $L_{A43977}$ | $R^{C30}$ | $R^{E20}$ | $R^{A3}$ |
| $L_{A43978}$ | $R^{C30}$ | $R^{E21}$ | $R^{A3}$ |
| $L_{A43979}$ | $R^{C30}$ | $R^{B3}$ | $R^{A34}$ |
| $L_{A43980}$ | $R^{C30}$ | $R^{B6}$ | $R^{A34}$ |
| $L_{A43981}$ | $R^{C30}$ | $R^{B7}$ | $R^{A34}$ |
| $L_{A43982}$ | $R^{C30}$ | $R^{B12}$ | $R^{A34}$ |
| $L_{A43983}$ | $R^{C30}$ | $R^{B20}$ | $R^{A34}$ |
| $L_{A43984}$ | $R^{C30}$ | $R^{B25}$ | $R^{A34}$ |
| $L_{A43985}$ | $R^{C30}$ | $R^{B29}$ | $R^{A34}$ |
| $L_{A43986}$ | $R^{C30}$ | $R^{A37}$ | $R^{A34}$ |
| $L_{A43987}$ | $R^{C30}$ | $R^{A43}$ | $R^{A34}$ |
| $L_{A43988}$ | $R^{C30}$ | $R^{E1}$ | $R^{A34}$ |
| $L_{A43989}$ | $R^{C30}$ | $R^{E2}$ | $R^{A34}$ |
| $L_{A43990}$ | $R^{C30}$ | $R^{E3}$ | $R^{A34}$ |
| $L_{A43991}$ | $R^{C30}$ | $R^{E4}$ | $R^{A34}$ |
| $L_{A43992}$ | $R^{C30}$ | $R^{E5}$ | $R^{A34}$ |
| $L_{A43993}$ | $R^{C30}$ | $R^{E6}$ | $R^{A34}$ |
| $L_{A43994}$ | $R^{C30}$ | $R^{E7}$ | $R^{A34}$ |
| $L_{A43995}$ | $R^{C30}$ | $R^{E8}$ | $R^{A34}$ |
| $L_{A43996}$ | $R^{C30}$ | $R^{E9}$ | $R^{A34}$ |
| $L_{A43997}$ | $R^{C30}$ | $R^{E10}$ | $R^{A34}$ |
| $L_{A43998}$ | $R^{C30}$ | $R^{E11}$ | $R^{A34}$ |
| $L_{A43999}$ | $R^{C30}$ | $R^{E12}$ | $R^{A34}$ |
| $L_{A44000}$ | $R^{C30}$ | $R^{E13}$ | $R^{A34}$ |
| $L_{A44001}$ | $R^{C30}$ | $R^{E14}$ | $R^{A34}$ |
| $L_{A44002}$ | $R^{C30}$ | $R^{E15}$ | $R^{A34}$ |
| $L_{A44003}$ | $R^{C30}$ | $R^{E16}$ | $R^{A34}$ |
| $L_{A44004}$ | $R^{C30}$ | $R^{E17}$ | $R^{A34}$ |
| $L_{A44005}$ | $R^{C30}$ | $R^{E18}$ | $R^{A34}$ |
| $L_{A44006}$ | $R^{C30}$ | $R^{E19}$ | $R^{A34}$ |
| $L_{A44007}$ | $R^{C30}$ | $R^{E20}$ | $R^{A34}$ |
| $L_{A44008}$ | $R^{C30}$ | $R^{E21}$ | $R^{A34}$ |
| $L_{A44009}$ | $R^{C30}$ | $R^{B3}$ | $R^{A52}$ |
| $L_{A44010}$ | $R^{C30}$ | $R^{B6}$ | $R^{A52}$ |
| $L_{A44011}$ | $R^{C30}$ | $R^{B7}$ | $R^{A52}$ |
| $L_{A44012}$ | $R^{C30}$ | $R^{B12}$ | $R^{A52}$ |
| $L_{A44013}$ | $R^{C30}$ | $R^{B20}$ | $R^{A52}$ |
| $L_{A44014}$ | $R^{C30}$ | $R^{B25}$ | $R^{A52}$ |
| $L_{A44015}$ | $R^{C30}$ | $R^{B29}$ | $R^{A52}$ |
| $L_{A44016}$ | $R^{C30}$ | $R^{A37}$ | $R^{A52}$ |
| $L_{A44017}$ | $R^{C30}$ | $R^{A43}$ | $R^{A52}$ |
| $L_{A44018}$ | $R^{C30}$ | $R^{E1}$ | $R^{A52}$ |
| $L_{A44019}$ | $R^{C30}$ | $R^{E2}$ | $R^{A52}$ |
| $L_{A44020}$ | $R^{C30}$ | $R^{E3}$ | $R^{A52}$ |
| $L_{A44021}$ | $R^{C30}$ | $R^{E4}$ | $R^{A52}$ |
| $L_{A44022}$ | $R^{C30}$ | $R^{E5}$ | $R^{A52}$ |
| $L_{A44023}$ | $R^{C30}$ | $R^{E6}$ | $R^{A52}$ |
| $L_{A44024}$ | $R^{C30}$ | $R^{E7}$ | $R^{A52}$ |
| $L_{A44025}$ | $R^{C30}$ | $R^{E8}$ | $R^{A52}$ |
| $L_{A44026}$ | $R^{C30}$ | $R^{E9}$ | $R^{A52}$ |
| $L_{A44027}$ | $R^{C30}$ | $R^{E10}$ | $R^{A52}$ |
| $L_{A44028}$ | $R^{C30}$ | $R^{E11}$ | $R^{A52}$ |
| $L_{A44029}$ | $R^{C30}$ | $R^{E12}$ | $R^{A52}$ |
| $L_{A44030}$ | $R^{C30}$ | $R^{E13}$ | $R^{A52}$ |
| $L_{A44031}$ | $R^{C30}$ | $R^{E14}$ | $R^{A52}$ |
| $L_{A44032}$ | $R^{C30}$ | $R^{E15}$ | $R^{A52}$ |
| $L_{A44033}$ | $R^{C30}$ | $R^{E16}$ | $R^{A52}$ |
| $L_{A44034}$ | $R^{C30}$ | $R^{E17}$ | $R^{A52}$ |
| $L_{A44035}$ | $R^{C30}$ | $R^{E18}$ | $R^{A52}$ |
| $L_{A44036}$ | $R^{C30}$ | $R^{E19}$ | $R^{A52}$ |
| $L_{A44037}$ | $R^{C30}$ | $R^{E20}$ | $R^{A52}$ |
| $L_{A44038}$ | $R^{C30}$ | $R^{E21}$ | $R^{A52}$ |

$L_{A44039}$ through $L_{A44878}$ that are based on a structure of Formula XII,

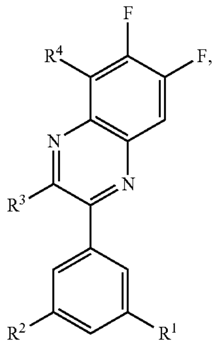

in which $R^1$, $R^2$, $R^3$, and $R^4$ are defined as:

| Ligand | $R^1$ | $R^2$ | $R^3$ | $R^4$ |
|---|---|---|---|---|
| $L_{A4039}$ | $R^{C1}$ | $R^{C1}$ | $R^{B3}$ | H |
| $L_{A4040}$ | $R^{C1}$ | $R^{C1}$ | $R^{B6}$ | H |
| $L_{A4041}$ | $R^{C1}$ | $R^{C1}$ | $R^{B7}$ | H |
| $L_{A4042}$ | $R^{C1}$ | $R^{C1}$ | $R^{B12}$ | H |
| $L_{A4043}$ | $R^{C1}$ | $R^{C1}$ | $R^{B20}$ | H |
| $L_{A4044}$ | $R^{C1}$ | $R^{C1}$ | $R^{B25}$ | H |
| $L_{A4045}$ | $R^{C1}$ | $R^{C1}$ | $R^{B29}$ | H |
| $L_{A4046}$ | $R^{C1}$ | $R^{C1}$ | $R^{A37}$ | H |
| $L_{A4047}$ | $R^{C1}$ | $R^{C1}$ | $R^{A43}$ | H |
| $L_{A4048}$ | $R^{C1}$ | $R^{C1}$ | $R^{E1}$ | H |
| $L_{A4049}$ | $R^{C1}$ | $R^{C1}$ | $R^{E2}$ | H |
| $L_{A4050}$ | $R^{C1}$ | $R^{C1}$ | $R^{E3}$ | H |
| $L_{A4051}$ | $R^{C1}$ | $R^{C1}$ | $R^{E4}$ | H |
| $L_{A4052}$ | $R^{C1}$ | $R^{C1}$ | $R^{E5}$ | H |
| $L_{A4053}$ | $R^{C1}$ | $R^{C1}$ | $R^{E6}$ | H |
| $L_{A4054}$ | $R^{C1}$ | $R^{C1}$ | $R^{E7}$ | H |
| $L_{A4055}$ | $R^{C1}$ | $R^{C1}$ | $R^{E8}$ | H |
| $L_{A4056}$ | $R^{C1}$ | $R^{C1}$ | $R^{E9}$ | H |
| $L_{A4057}$ | $R^{C1}$ | $R^{C1}$ | $R^{E10}$ | H |
| $L_{A4058}$ | $R^{C1}$ | $R^{C1}$ | $R^{E11}$ | H |
| $L_{A4059}$ | $R^{C1}$ | $R^{C1}$ | $R^{E12}$ | H |
| $L_{A4060}$ | $R^{C1}$ | $R^{C1}$ | $R^{E13}$ | H |
| $L_{A4061}$ | $R^{C1}$ | $R^{C1}$ | $R^{E14}$ | H |
| $L_{A4062}$ | $R^{C1}$ | $R^{C1}$ | $R^{E15}$ | H |
| $L_{A4063}$ | $R^{C1}$ | $R^{C1}$ | $R^{E16}$ | H |
| $L_{A4064}$ | $R^{C1}$ | $R^{C1}$ | $R^{E17}$ | H |
| $L_{A4065}$ | $R^{C1}$ | $R^{C1}$ | $R^{E18}$ | H |
| $L_{A4066}$ | $R^{C1}$ | $R^{C1}$ | $R^{E19}$ | H |
| $L_{A4067}$ | $R^{C1}$ | $R^{C1}$ | $R^{E20}$ | H |
| $L_{A4068}$ | $R^{C1}$ | $R^{C1}$ | $R^{E21}$ | H |
| $L_{A4069}$ | $R^{C1}$ | $R^{C1}$ | $R^{B3}$ | $R^{B3}$ |
| $L_{A4070}$ | $R^{C1}$ | $R^{C1}$ | $R^{B6}$ | $R^{B3}$ |
| $L_{A4071}$ | $R^{C1}$ | $R^{C1}$ | $R^{B7}$ | $R^{B3}$ |
| $L_{A4072}$ | $R^{C1}$ | $R^{C1}$ | $R^{B12}$ | $R^{B3}$ |
| $L_{A4073}$ | $R^{C1}$ | $R^{C1}$ | $R^{B20}$ | $R^{B3}$ |
| $L_{A4074}$ | $R^{C1}$ | $R^{C1}$ | $R^{B25}$ | $R^{B3}$ |
| $L_{A4075}$ | $R^{C1}$ | $R^{C1}$ | $R^{B29}$ | $R^{B3}$ |
| $L_{A4076}$ | $R^{C1}$ | $R^{C1}$ | $R^{A37}$ | $R^{B3}$ |
| $L_{A4077}$ | $R^{C1}$ | $R^{C1}$ | $R^{A43}$ | $R^{B3}$ |
| $L_{A4078}$ | $R^{C1}$ | $R^{C1}$ | $R^{E1}$ | $R^{B3}$ |
| $L_{A4079}$ | $R^{C1}$ | $R^{C1}$ | $R^{E2}$ | $R^{B3}$ |
| $L_{A4080}$ | $R^{C1}$ | $R^{C1}$ | $R^{E3}$ | $R^{B3}$ |
| $L_{A4081}$ | $R^{C1}$ | $R^{C1}$ | $R^{E4}$ | $R^{B3}$ |
| $L_{A4082}$ | $R^{C1}$ | $R^{C1}$ | $R^{E5}$ | $R^{B3}$ |
| $L_{A4083}$ | $R^{C1}$ | $R^{C1}$ | $R^{E6}$ | $R^{B3}$ |
| $L_{A4084}$ | $R^{C1}$ | $R^{C1}$ | $R^{E7}$ | $R^{B3}$ |
| $L_{A4085}$ | $R^{C1}$ | $R^{C1}$ | $R^{E8}$ | $R^{B3}$ |
| $L_{A4086}$ | $R^{C1}$ | $R^{C1}$ | $R^{E9}$ | $R^{B3}$ |
| $L_{A4087}$ | $R^{C1}$ | $R^{C1}$ | $R^{E10}$ | $R^{B3}$ |
| $L_{A4088}$ | $R^{C1}$ | $R^{C1}$ | $R^{E11}$ | $R^{B3}$ |
| $L_{A4089}$ | $R^{C1}$ | $R^{C1}$ | $R^{E12}$ | $R^{B3}$ |
| $L_{A4090}$ | $R^{C1}$ | $R^{C1}$ | $R^{E13}$ | $R^{B3}$ |
| $L_{A4091}$ | $R^{C1}$ | $R^{C1}$ | $R^{E14}$ | $R^{B3}$ |
| $L_{A4092}$ | $R^{C1}$ | $R^{C1}$ | $R^{E15}$ | $R^{B3}$ |
| $L_{A4093}$ | $R^{C1}$ | $R^{C1}$ | $R^{E16}$ | $R^{B3}$ |
| $L_{A4094}$ | $R^{C1}$ | $R^{C1}$ | $R^{E17}$ | $R^{B3}$ |
| $L_{A4095}$ | $R^{C1}$ | $R^{C1}$ | $R^{E18}$ | $R^{B3}$ |

-continued

| Ligand | $R^1$ | $R^2$ | $R^3$ | $R^4$ |
|---|---|---|---|---|
| $L_{A4096}$ | $R^{C1}$ | $R^{C1}$ | $R^{E19}$ | $R^{B3}$ |
| $L_{A4097}$ | $R^{C1}$ | $R^{C1}$ | $R^{E20}$ | $R^{B3}$ |
| $L_{A4098}$ | $R^{C1}$ | $R^{C1}$ | $R^{E21}$ | $R^{B3}$ |
| $L_{A4099}$ | $R^{C1}$ | $R^{C1}$ | $R^{B3}$ | $R^{B4}$ |
| $L_{A4100}$ | $R^{C1}$ | $R^{C1}$ | $R^{B6}$ | $R^{B4}$ |
| $L_{A4101}$ | $R^{C1}$ | $R^{C1}$ | $R^{B7}$ | $R^{B4}$ |
| $L_{A4102}$ | $R^{C1}$ | $R^{C1}$ | $R^{B12}$ | $R^{B4}$ |
| $L_{A4103}$ | $R^{C1}$ | $R^{C1}$ | $R^{B20}$ | $R^{B4}$ |
| $L_{A4104}$ | $R^{C1}$ | $R^{C1}$ | $R^{B25}$ | $R^{B4}$ |
| $L_{A4105}$ | $R^{C1}$ | $R^{C1}$ | $R^{B29}$ | $R^{B4}$ |
| $L_{A4106}$ | $R^{C1}$ | $R^{C1}$ | $R^{A37}$ | $R^{B4}$ |
| $L_{A4107}$ | $R^{C1}$ | $R^{C1}$ | $R^{A43}$ | $R^{B4}$ |
| $L_{A4108}$ | $R^{C1}$ | $R^{C1}$ | $R^{E1}$ | $R^{B4}$ |
| $L_{A4109}$ | $R^{C1}$ | $R^{C1}$ | $R^{E2}$ | $R^{B4}$ |
| $L_{A4110}$ | $R^{C1}$ | $R^{C1}$ | $R^{E3}$ | $R^{B4}$ |
| $L_{A4111}$ | $R^{C1}$ | $R^{C1}$ | $R^{E4}$ | $R^{B4}$ |
| $L_{A4112}$ | $R^{C1}$ | $R^{C1}$ | $R^{E5}$ | $R^{B4}$ |
| $L_{A4113}$ | $R^{C1}$ | $R^{C1}$ | $R^{E6}$ | $R^{B4}$ |
| $L_{A4114}$ | $R^{C1}$ | $R^{C1}$ | $R^{E7}$ | $R^{B4}$ |
| $L_{A4115}$ | $R^{C1}$ | $R^{C1}$ | $R^{E8}$ | $R^{B4}$ |
| $L_{A4116}$ | $R^{C1}$ | $R^{C1}$ | $R^{E9}$ | $R^{B4}$ |
| $L_{A4117}$ | $R^{C1}$ | $R^{C1}$ | $R^{E10}$ | $R^{B4}$ |
| $L_{A4118}$ | $R^{C1}$ | $R^{C1}$ | $R^{E11}$ | $R^{B4}$ |
| $L_{A4119}$ | $R^{C1}$ | $R^{C1}$ | $R^{E12}$ | $R^{B4}$ |
| $L_{A4120}$ | $R^{C1}$ | $R^{C1}$ | $R^{E13}$ | $R^{B4}$ |
| $L_{A4121}$ | $R^{C1}$ | $R^{C1}$ | $R^{E14}$ | $R^{B4}$ |
| $L_{A4122}$ | $R^{C1}$ | $R^{C1}$ | $R^{E15}$ | $R^{B4}$ |
| $L_{A4123}$ | $R^{C1}$ | $R^{C1}$ | $R^{E16}$ | $R^{B4}$ |
| $L_{A4124}$ | $R^{C1}$ | $R^{C1}$ | $R^{E17}$ | $R^{B4}$ |
| $L_{A4125}$ | $R^{C1}$ | $R^{C1}$ | $R^{E18}$ | $R^{B4}$ |
| $L_{A4126}$ | $R^{C1}$ | $R^{C1}$ | $R^{E19}$ | $R^{B4}$ |
| $L_{A4127}$ | $R^{C1}$ | $R^{C1}$ | $R^{E20}$ | $R^{B4}$ |
| $L_{A4128}$ | $R^{C1}$ | $R^{C1}$ | $R^{E21}$ | $R^{B4}$ |
| $L_{A4129}$ | $R^{C1}$ | $R^{C1}$ | $R^{B3}$ | $R^{B18}$ |
| $L_{A4130}$ | $R^{C1}$ | $R^{C1}$ | $R^{B6}$ | $R^{B18}$ |
| $L_{A4131}$ | $R^{C1}$ | $R^{C1}$ | $R^{B7}$ | $R^{B18}$ |
| $L_{A4132}$ | $R^{C1}$ | $R^{C1}$ | $R^{B12}$ | $R^{B18}$ |
| $L_{A4133}$ | $R^{C1}$ | $R^{C1}$ | $R^{B20}$ | $R^{B18}$ |
| $L_{A4134}$ | $R^{C1}$ | $R^{C1}$ | $R^{B25}$ | $R^{B18}$ |
| $L_{A4135}$ | $R^{C1}$ | $R^{C1}$ | $R^{B29}$ | $R^{B18}$ |
| $L_{A4136}$ | $R^{C1}$ | $R^{C1}$ | $R^{A37}$ | $R^{B18}$ |
| $L_{A4137}$ | $R^{C1}$ | $R^{C1}$ | $R^{A43}$ | $R^{B18}$ |
| $L_{A4138}$ | $R^{C1}$ | $R^{C1}$ | $R^{E1}$ | $R^{B18}$ |
| $L_{A4139}$ | $R^{C1}$ | $R^{C1}$ | $R^{E2}$ | $R^{B18}$ |
| $L_{A4140}$ | $R^{C1}$ | $R^{C1}$ | $R^{E3}$ | $R^{B18}$ |
| $L_{A4141}$ | $R^{C1}$ | $R^{C1}$ | $R^{E4}$ | $R^{B18}$ |
| $L_{A4142}$ | $R^{C1}$ | $R^{C1}$ | $R^{E5}$ | $R^{B18}$ |
| $L_{A4143}$ | $R^{C1}$ | $R^{C1}$ | $R^{E6}$ | $R^{B18}$ |
| $L_{A4144}$ | $R^{C1}$ | $R^{C1}$ | $R^{E7}$ | $R^{B18}$ |
| $L_{A4145}$ | $R^{C1}$ | $R^{C1}$ | $R^{E8}$ | $R^{B18}$ |
| $L_{A4146}$ | $R^{C1}$ | $R^{C1}$ | $R^{E9}$ | $R^{B18}$ |
| $L_{A4147}$ | $R^{C1}$ | $R^{C1}$ | $R^{E10}$ | $R^{B18}$ |
| $L_{A4148}$ | $R^{C1}$ | $R^{C1}$ | $R^{E11}$ | $R^{B18}$ |
| $L_{A4149}$ | $R^{C1}$ | $R^{C1}$ | $R^{E12}$ | $R^{B18}$ |
| $L_{A4150}$ | $R^{C1}$ | $R^{C1}$ | $R^{E13}$ | $R^{B18}$ |
| $L_{A4151}$ | $R^{C1}$ | $R^{C1}$ | $R^{E14}$ | $R^{B18}$ |
| $L_{A4152}$ | $R^{C1}$ | $R^{C1}$ | $R^{E15}$ | $R^{B18}$ |
| $L_{A4153}$ | $R^{C1}$ | $R^{C1}$ | $R^{E16}$ | $R^{B18}$ |
| $L_{A4154}$ | $R^{C1}$ | $R^{C1}$ | $R^{E17}$ | $R^{B18}$ |
| $L_{A4155}$ | $R^{C1}$ | $R^{C1}$ | $R^{E18}$ | $R^{B18}$ |
| $L_{A4156}$ | $R^{C1}$ | $R^{C1}$ | $R^{E19}$ | $R^{B18}$ |
| $L_{A4157}$ | $R^{C1}$ | $R^{C1}$ | $R^{E20}$ | $R^{B18}$ |
| $L_{A4158}$ | $R^{C1}$ | $R^{C1}$ | $R^{E21}$ | $R^{B18}$ |
| $L_{A4159}$ | $R^{C1}$ | $R^{C1}$ | $R^{B3}$ | $R^{A3}$ |
| $L_{A4160}$ | $R^{C1}$ | $R^{C1}$ | $R^{B6}$ | $R^{A3}$ |
| $L_{A4161}$ | $R^{C1}$ | $R^{C1}$ | $R^{B7}$ | $R^{A3}$ |
| $L_{A4162}$ | $R^{C1}$ | $R^{C1}$ | $R^{B12}$ | $R^{A3}$ |
| $L_{A4163}$ | $R^{C1}$ | $R^{C1}$ | $R^{B20}$ | $R^{A3}$ |
| $L_{A4164}$ | $R^{C1}$ | $R^{C1}$ | $R^{B25}$ | $R^{A3}$ |
| $L_{A4165}$ | $R^{C1}$ | $R^{C1}$ | $R^{B29}$ | $R^{A3}$ |
| $L_{A4166}$ | $R^{C1}$ | $R^{C1}$ | $R^{A37}$ | $R^{A3}$ |
| $L_{A4167}$ | $R^{C1}$ | $R^{C1}$ | $R^{A43}$ | $R^{A3}$ |
| $L_{A4168}$ | $R^{C1}$ | $R^{C1}$ | $R^{E1}$ | $R^{A3}$ |
| $L_{A4169}$ | $R^{C1}$ | $R^{C1}$ | $R^{E2}$ | $R^{A3}$ |
| $L_{A4170}$ | $R^{C1}$ | $R^{C1}$ | $R^{E3}$ | $R^{A3}$ |
| $L_{A4171}$ | $R^{C1}$ | $R^{C1}$ | $R^{E4}$ | $R^{A3}$ |
| $L_{A4172}$ | $R^{C1}$ | $R^{C1}$ | $R^{E5}$ | $R^{A3}$ |

-continued

| Ligand | $R^1$ | $R^2$ | $R^3$ | $R^4$ |
|---|---|---|---|---|
| $L_{44173}$ | $R^{C1}$ | $R^{C1}$ | $R^{E6}$ | $R^{A3}$ |
| $L_{44174}$ | $R^{C1}$ | $R^{C1}$ | $R^{E7}$ | $R^{A3}$ |
| $L_{44175}$ | $R^{C1}$ | $R^{C1}$ | $R^{E8}$ | $R^{A3}$ |
| $L_{44176}$ | $R^{C1}$ | $R^{C1}$ | $R^{E9}$ | $R^{A3}$ |
| $L_{44177}$ | $R^{C1}$ | $R^{C1}$ | $R^{E10}$ | $R^{A3}$ |
| $L_{44178}$ | $R^{C1}$ | $R^{C1}$ | $R^{E11}$ | $R^{A3}$ |
| $L_{44179}$ | $R^{C1}$ | $R^{C1}$ | $R^{E12}$ | $R^{A3}$ |
| $L_{44180}$ | $R^{C1}$ | $R^{C1}$ | $R^{E13}$ | $R^{A3}$ |
| $L_{44181}$ | $R^{C1}$ | $R^{C1}$ | $R^{E14}$ | $R^{A3}$ |
| $L_{44182}$ | $R^{C1}$ | $R^{C1}$ | $R^{E15}$ | $R^{A3}$ |
| $L_{44183}$ | $R^{C1}$ | $R^{C1}$ | $R^{E16}$ | $R^{A3}$ |
| $L_{44184}$ | $R^{C1}$ | $R^{C1}$ | $R^{E17}$ | $R^{A3}$ |
| $L_{44185}$ | $R^{C1}$ | $R^{C1}$ | $R^{E18}$ | $R^{A3}$ |
| $L_{44186}$ | $R^{C1}$ | $R^{C1}$ | $R^{E19}$ | $R^{A3}$ |
| $L_{44187}$ | $R^{C1}$ | $R^{C1}$ | $R^{E20}$ | $R^{A3}$ |
| $L_{44188}$ | $R^{C1}$ | $R^{C1}$ | $R^{E21}$ | $R^{A3}$ |
| $L_{44189}$ | $R^{C1}$ | $R^{C1}$ | $R^{B3}$ | $R^{A34}$ |
| $L_{44190}$ | $R^{C1}$ | $R^{C1}$ | $R^{B6}$ | $R^{A34}$ |
| $L_{44191}$ | $R^{C1}$ | $R^{C1}$ | $R^{B7}$ | $R^{A34}$ |
| $L_{44192}$ | $R^{C1}$ | $R^{C1}$ | $R^{B12}$ | $R^{A34}$ |
| $L_{44193}$ | $R^{C1}$ | $R^{C1}$ | $R^{B20}$ | $R^{A34}$ |
| $L_{44194}$ | $R^{C1}$ | $R^{C1}$ | $R^{B25}$ | $R^{A34}$ |
| $L_{44195}$ | $R^{C1}$ | $R^{C1}$ | $R^{B29}$ | $R^{A34}$ |
| $L_{44196}$ | $R^{C1}$ | $R^{C1}$ | $R^{A37}$ | $R^{A34}$ |
| $L_{44197}$ | $R^{C1}$ | $R^{C1}$ | $R^{A43}$ | $R^{A34}$ |
| $L_{44198}$ | $R^{C1}$ | $R^{C1}$ | $R^{E1}$ | $R^{A34}$ |
| $L_{44199}$ | $R^{C1}$ | $R^{C1}$ | $R^{E2}$ | $R^{A34}$ |
| $L_{44200}$ | $R^{C1}$ | $R^{C1}$ | $R^{E3}$ | $R^{A34}$ |
| $L_{44201}$ | $R^{C1}$ | $R^{C1}$ | $R^{E4}$ | $R^{A34}$ |
| $L_{44202}$ | $R^{C1}$ | $R^{C1}$ | $R^{E5}$ | $R^{A34}$ |
| $L_{44203}$ | $R^{C1}$ | $R^{C1}$ | $R^{E6}$ | $R^{A34}$ |
| $L_{44204}$ | $R^{C1}$ | $R^{C1}$ | $R^{E7}$ | $R^{A34}$ |
| $L_{44205}$ | $R^{C1}$ | $R^{C1}$ | $R^{E8}$ | $R^{A34}$ |
| $L_{44206}$ | $R^{C1}$ | $R^{C1}$ | $R^{E9}$ | $R^{A34}$ |
| $L_{44207}$ | $R^{C1}$ | $R^{C1}$ | $R^{E10}$ | $R^{A34}$ |
| $L_{44208}$ | $R^{C1}$ | $R^{C1}$ | $R^{E11}$ | $R^{A34}$ |
| $L_{44209}$ | $R^{C1}$ | $R^{C1}$ | $R^{E12}$ | $R^{A34}$ |
| $L_{44210}$ | $R^{C1}$ | $R^{C1}$ | $R^{E13}$ | $R^{A34}$ |
| $L_{44211}$ | $R^{C1}$ | $R^{C1}$ | $R^{E14}$ | $R^{A34}$ |
| $L_{44212}$ | $R^{C1}$ | $R^{C1}$ | $R^{E15}$ | $R^{A34}$ |
| $L_{44213}$ | $R^{C1}$ | $R^{C1}$ | $R^{E16}$ | $R^{A34}$ |
| $L_{44214}$ | $R^{C1}$ | $R^{C1}$ | $R^{E17}$ | $R^{A34}$ |
| $L_{44215}$ | $R^{C1}$ | $R^{C1}$ | $R^{E18}$ | $R^{A34}$ |
| $L_{44216}$ | $R^{C1}$ | $R^{C1}$ | $R^{E19}$ | $R^{A34}$ |
| $L_{44217}$ | $R^{C1}$ | $R^{C1}$ | $R^{E20}$ | $R^{A34}$ |
| $L_{44218}$ | $R^{C1}$ | $R^{C1}$ | $R^{E21}$ | $R^{A34}$ |
| $L_{44219}$ | $R^{C1}$ | $R^{C1}$ | $R^{B3}$ | $R^{A52}$ |
| $L_{44220}$ | $R^{C1}$ | $R^{C1}$ | $R^{B6}$ | $R^{A52}$ |
| $L_{44221}$ | $R^{C1}$ | $R^{C1}$ | $R^{B7}$ | $R^{A52}$ |
| $L_{44222}$ | $R^{C1}$ | $R^{C1}$ | $R^{B12}$ | $R^{A52}$ |
| $L_{44223}$ | $R^{C1}$ | $R^{C1}$ | $R^{B20}$ | $R^{A52}$ |
| $L_{44224}$ | $R^{C1}$ | $R^{C1}$ | $R^{B25}$ | $R^{A52}$ |
| $L_{44225}$ | $R^{C1}$ | $R^{C1}$ | $R^{B29}$ | $R^{A52}$ |
| $L_{44226}$ | $R^{C1}$ | $R^{C1}$ | $R^{A37}$ | $R^{A52}$ |
| $L_{44227}$ | $R^{C1}$ | $R^{C1}$ | $R^{A43}$ | $R^{A52}$ |
| $L_{44228}$ | $R^{C1}$ | $R^{C1}$ | $R^{E1}$ | $R^{A52}$ |
| $L_{44229}$ | $R^{C1}$ | $R^{C1}$ | $R^{E2}$ | $R^{A52}$ |
| $L_{44230}$ | $R^{C1}$ | $R^{C1}$ | $R^{E3}$ | $R^{A52}$ |
| $L_{44231}$ | $R^{C1}$ | $R^{C1}$ | $R^{E4}$ | $R^{A52}$ |
| $L_{44232}$ | $R^{C1}$ | $R^{C1}$ | $R^{E5}$ | $R^{A52}$ |
| $L_{44233}$ | $R^{C1}$ | $R^{C1}$ | $R^{E6}$ | $R^{A52}$ |
| $L_{44234}$ | $R^{C1}$ | $R^{C1}$ | $R^{E7}$ | $R^{A52}$ |
| $L_{44235}$ | $R^{C1}$ | $R^{C1}$ | $R^{E8}$ | $R^{A52}$ |
| $L_{44236}$ | $R^{C1}$ | $R^{C1}$ | $R^{E9}$ | $R^{A52}$ |
| $L_{44237}$ | $R^{C1}$ | $R^{C1}$ | $R^{E10}$ | $R^{A52}$ |
| $L_{44238}$ | $R^{C1}$ | $R^{C1}$ | $R^{E11}$ | $R^{A52}$ |
| $L_{44239}$ | $R^{C1}$ | $R^{C1}$ | $R^{E12}$ | $R^{A52}$ |
| $L_{44240}$ | $R^{C1}$ | $R^{C1}$ | $R^{E13}$ | $R^{A52}$ |
| $L_{44241}$ | $R^{C1}$ | $R^{C1}$ | $R^{E14}$ | $R^{A52}$ |
| $L_{44242}$ | $R^{C1}$ | $R^{C1}$ | $R^{E15}$ | $R^{A52}$ |
| $L_{44243}$ | $R^{C1}$ | $R^{C1}$ | $R^{E16}$ | $R^{A52}$ |
| $L_{44244}$ | $R^{C1}$ | $R^{C1}$ | $R^{E17}$ | $R^{A52}$ |
| $L_{44245}$ | $R^{C1}$ | $R^{C1}$ | $R^{E18}$ | $R^{A52}$ |
| $L_{44246}$ | $R^{C1}$ | $R^{C1}$ | $R^{E19}$ | $R^{A52}$ |
| $L_{44247}$ | $R^{C1}$ | $R^{C1}$ | $R^{E20}$ | $R^{A52}$ |
| $L_{44248}$ | $R^{C1}$ | $R^{C1}$ | $R^{E21}$ | $R^{A52}$ |
| $L_{44249}$ | $R^{B1}$ | $R^{C3}$ | $R^{B3}$ | H |

-continued

| Ligand | $R^1$ | $R^2$ | $R^3$ | $R^4$ |
|---|---|---|---|---|
| $L_{44250}$ | $R^{B1}$ | $R^{C3}$ | $R^{B6}$ | H |
| $L_{44251}$ | $R^{B1}$ | $R^{C3}$ | $R^{B7}$ | H |
| $L_{44252}$ | $R^{B1}$ | $R^{C3}$ | $R^{B12}$ | H |
| $L_{44253}$ | $R^{B1}$ | $R^{C3}$ | $R^{B20}$ | H |
| $L_{44254}$ | $R^{B1}$ | $R^{C3}$ | $R^{B25}$ | H |
| $L_{44255}$ | $R^{B1}$ | $R^{C3}$ | $R^{B29}$ | H |
| $L_{44256}$ | $R^{B1}$ | $R^{C3}$ | $R^{A37}$ | H |
| $L_{44257}$ | $R^{B1}$ | $R^{C3}$ | $R^{A43}$ | H |
| $L_{44258}$ | $R^{B1}$ | $R^{C3}$ | $R^{E1}$ | H |
| $L_{44259}$ | $R^{B1}$ | $R^{C3}$ | $R^{E2}$ | H |
| $L_{44260}$ | $R^{B1}$ | $R^{C3}$ | $R^{E3}$ | H |
| $L_{44261}$ | $R^{B1}$ | $R^{C3}$ | $R^{E4}$ | H |
| $L_{44262}$ | $R^{B1}$ | $R^{C3}$ | $R^{E5}$ | H |
| $L_{44263}$ | $R^{B1}$ | $R^{C3}$ | $R^{E6}$ | H |
| $L_{44264}$ | $R^{B1}$ | $R^{C3}$ | $R^{E7}$ | H |
| $L_{44265}$ | $R^{B1}$ | $R^{C3}$ | $R^{E8}$ | H |
| $L_{44266}$ | $R^{B1}$ | $R^{C3}$ | $R^{E9}$ | H |
| $L_{44267}$ | $R^{B1}$ | $R^{C3}$ | $R^{E10}$ | H |
| $L_{44268}$ | $R^{B1}$ | $R^{C3}$ | $R^{E11}$ | H |
| $L_{44269}$ | $R^{B1}$ | $R^{C3}$ | $R^{E12}$ | H |
| $L_{44270}$ | $R^{B1}$ | $R^{C3}$ | $R^{E13}$ | H |
| $L_{44271}$ | $R^{B1}$ | $R^{C3}$ | $R^{E14}$ | H |
| $L_{44272}$ | $R^{B1}$ | $R^{C3}$ | $R^{E15}$ | H |
| $L_{44273}$ | $R^{B1}$ | $R^{C3}$ | $R^{E16}$ | H |
| $L_{44274}$ | $R^{B1}$ | $R^{C3}$ | $R^{E17}$ | H |
| $L_{44275}$ | $R^{B1}$ | $R^{C3}$ | $R^{E18}$ | H |
| $L_{44276}$ | $R^{B1}$ | $R^{C3}$ | $R^{E19}$ | H |
| $L_{44277}$ | $R^{B1}$ | $R^{C3}$ | $R^{E20}$ | H |
| $L_{44278}$ | $R^{B1}$ | $R^{C3}$ | $R^{E21}$ | H |
| $L_{44279}$ | $R^{B1}$ | $R^{C3}$ | $R^{B3}$ | $R^{B3}$ |
| $L_{44280}$ | $R^{B1}$ | $R^{C3}$ | $R^{B6}$ | $R^{B3}$ |
| $L_{44281}$ | $R^{B1}$ | $R^{C3}$ | $R^{B7}$ | $R^{B3}$ |
| $L_{44282}$ | $R^{B1}$ | $R^{C3}$ | $R^{B12}$ | $R^{B3}$ |
| $L_{44283}$ | $R^{B1}$ | $R^{C3}$ | $R^{B20}$ | $R^{B3}$ |
| $L_{44284}$ | $R^{B1}$ | $R^{C3}$ | $R^{B25}$ | $R^{B3}$ |
| $L_{44285}$ | $R^{B1}$ | $R^{C3}$ | $R^{B29}$ | $R^{B3}$ |
| $L_{44286}$ | $R^{B1}$ | $R^{C3}$ | $R^{A37}$ | $R^{B3}$ |
| $L_{44287}$ | $R^{B1}$ | $R^{C3}$ | $R^{A43}$ | $R^{B3}$ |
| $L_{44288}$ | $R^{B1}$ | $R^{C3}$ | $R^{E1}$ | $R^{B3}$ |
| $L_{44289}$ | $R^{B1}$ | $R^{C3}$ | $R^{E2}$ | $R^{B3}$ |
| $L_{44290}$ | $R^{B1}$ | $R^{C3}$ | $R^{E3}$ | $R^{B3}$ |
| $L_{44291}$ | $R^{B1}$ | $R^{C3}$ | $R^{E4}$ | $R^{B3}$ |
| $L_{44292}$ | $R^{B1}$ | $R^{C3}$ | $R^{E5}$ | $R^{B3}$ |
| $L_{44293}$ | $R^{B1}$ | $R^{C3}$ | $R^{E6}$ | $R^{B3}$ |
| $L_{44294}$ | $R^{B1}$ | $R^{C3}$ | $R^{E7}$ | $R^{B3}$ |
| $L_{44295}$ | $R^{B1}$ | $R^{C3}$ | $R^{E8}$ | $R^{B3}$ |
| $L_{44296}$ | $R^{B1}$ | $R^{C3}$ | $R^{E9}$ | $R^{B3}$ |
| $L_{44297}$ | $R^{B1}$ | $R^{C3}$ | $R^{E10}$ | $R^{B3}$ |
| $L_{44298}$ | $R^{B1}$ | $R^{C3}$ | $R^{E11}$ | $R^{B3}$ |
| $L_{44299}$ | $R^{B1}$ | $R^{C3}$ | $R^{E12}$ | $R^{B3}$ |
| $L_{44300}$ | $R^{B1}$ | $R^{C3}$ | $R^{E13}$ | $R^{B3}$ |
| $L_{44301}$ | $R^{B1}$ | $R^{C3}$ | $R^{E14}$ | $R^{B3}$ |
| $L_{44302}$ | $R^{B1}$ | $R^{C3}$ | $R^{E15}$ | $R^{B3}$ |
| $L_{44303}$ | $R^{B1}$ | $R^{C3}$ | $R^{E16}$ | $R^{B3}$ |
| $L_{44304}$ | $R^{B1}$ | $R^{C3}$ | $R^{E17}$ | $R^{B3}$ |
| $L_{44305}$ | $R^{B1}$ | $R^{C3}$ | $R^{E18}$ | $R^{B3}$ |
| $L_{44306}$ | $R^{B1}$ | $R^{C3}$ | $R^{E19}$ | $R^{B3}$ |
| $L_{44307}$ | $R^{B1}$ | $R^{C3}$ | $R^{E20}$ | $R^{B3}$ |
| $L_{44308}$ | $R^{B1}$ | $R^{C3}$ | $R^{E21}$ | $R^{B3}$ |
| $L_{44309}$ | $R^{B1}$ | $R^{C3}$ | $R^{B3}$ | $R^{B4}$ |
| $L_{44310}$ | $R^{B1}$ | $R^{C3}$ | $R^{B6}$ | $R^{B4}$ |
| $L_{44311}$ | $R^{B1}$ | $R^{C3}$ | $R^{B7}$ | $R^{B4}$ |
| $L_{44312}$ | $R^{B1}$ | $R^{C3}$ | $R^{B12}$ | $R^{B4}$ |
| $L_{44313}$ | $R^{B1}$ | $R^{C3}$ | $R^{B20}$ | $R^{B4}$ |
| $L_{44314}$ | $R^{B1}$ | $R^{C3}$ | $R^{B25}$ | $R^{B4}$ |
| $L_{44315}$ | $R^{B1}$ | $R^{C3}$ | $R^{B29}$ | $R^{B4}$ |
| $L_{44316}$ | $R^{B1}$ | $R^{C3}$ | $R^{A37}$ | $R^{B4}$ |
| $L_{44317}$ | $R^{B1}$ | $R^{C3}$ | $R^{A43}$ | $R^{B4}$ |
| $L_{44318}$ | $R^{B1}$ | $R^{C3}$ | $R^{E1}$ | $R^{B4}$ |
| $L_{44319}$ | $R^{B1}$ | $R^{C3}$ | $R^{E2}$ | $R^{B4}$ |
| $L_{44320}$ | $R^{B1}$ | $R^{C3}$ | $R^{E3}$ | $R^{B4}$ |
| $L_{44321}$ | $R^{B1}$ | $R^{C3}$ | $R^{E4}$ | $R^{B4}$ |
| $L_{44322}$ | $R^{B1}$ | $R^{C3}$ | $R^{E5}$ | $R^{B4}$ |
| $L_{44323}$ | $R^{B1}$ | $R^{C3}$ | $R^{E6}$ | $R^{B4}$ |
| $L_{44324}$ | $R^{B1}$ | $R^{C3}$ | $R^{E7}$ | $R^{B4}$ |
| $L_{44325}$ | $R^{B1}$ | $R^{C3}$ | $R^{E8}$ | $R^{B4}$ |
| $L_{44326}$ | $R^{B1}$ | $R^{C3}$ | $R^{E9}$ | $R^{B4}$ |

-continued

| Ligand | $R^1$ | $R^2$ | $R^3$ | $R^4$ |
|---|---|---|---|---|
| $L_{44327}$ | $R^{B1}$ | $R^{C3}$ | $R^{E10}$ | $R^{B4}$ |
| $L_{44328}$ | $R^{B1}$ | $R^{C3}$ | $R^{E11}$ | $R^{B4}$ |
| $L_{44329}$ | $R^{B1}$ | $R^{C3}$ | $R^{E12}$ | $R^{B4}$ |
| $L_{44330}$ | $R^{B1}$ | $R^{C3}$ | $R^{E13}$ | $R^{B4}$ |
| $L_{44331}$ | $R^{B1}$ | $R^{C3}$ | $R^{E14}$ | $R^{B4}$ |
| $L_{44332}$ | $R^{B1}$ | $R^{C3}$ | $R^{E15}$ | $R^{B4}$ |
| $L_{44333}$ | $R^{B1}$ | $R^{C3}$ | $R^{E16}$ | $R^{B4}$ |
| $L_{44334}$ | $R^{B1}$ | $R^{C3}$ | $R^{E17}$ | $R^{B4}$ |
| $L_{44335}$ | $R^{B1}$ | $R^{C3}$ | $R^{E18}$ | $R^{B4}$ |
| $L_{44336}$ | $R^{B1}$ | $R^{C3}$ | $R^{E19}$ | $R^{B4}$ |
| $L_{44337}$ | $R^{B1}$ | $R^{C3}$ | $R^{E20}$ | $R^{B4}$ |
| $L_{44338}$ | $R^{B1}$ | $R^{C3}$ | $R^{E21}$ | $R^{B4}$ |
| $L_{44339}$ | $R^{B1}$ | $R^{C3}$ | $R^{B3}$ | $R^{B18}$ |
| $L_{44340}$ | $R^{B1}$ | $R^{C3}$ | $R^{B6}$ | $R^{B18}$ |
| $L_{44341}$ | $R^{B1}$ | $R^{C3}$ | $R^{B7}$ | $R^{B18}$ |
| $L_{44342}$ | $R^{B1}$ | $R^{C3}$ | $R^{B12}$ | $R^{B18}$ |
| $L_{44343}$ | $R^{B1}$ | $R^{C3}$ | $R^{B20}$ | $R^{B18}$ |
| $L_{44344}$ | $R^{B1}$ | $R^{C3}$ | $R^{B25}$ | $R^{B18}$ |
| $L_{44345}$ | $R^{B1}$ | $R^{C3}$ | $R^{B29}$ | $R^{B18}$ |
| $L_{44346}$ | $R^{B1}$ | $R^{C3}$ | $R^{A37}$ | $R^{B18}$ |
| $L_{44347}$ | $R^{B1}$ | $R^{C3}$ | $R^{A43}$ | $R^{B18}$ |
| $L_{44348}$ | $R^{B1}$ | $R^{C3}$ | $R^{E1}$ | $R^{B18}$ |
| $L_{44349}$ | $R^{B1}$ | $R^{C3}$ | $R^{E2}$ | $R^{B18}$ |
| $L_{44350}$ | $R^{B1}$ | $R^{C3}$ | $R^{E3}$ | $R^{B18}$ |
| $L_{44351}$ | $R^{B1}$ | $R^{C3}$ | $R^{E4}$ | $R^{B18}$ |
| $L_{44352}$ | $R^{B1}$ | $R^{C3}$ | $R^{E5}$ | $R^{B18}$ |
| $L_{44353}$ | $R^{B1}$ | $R^{C3}$ | $R^{E6}$ | $R^{B18}$ |
| $L_{44354}$ | $R^{B1}$ | $R^{C3}$ | $R^{E7}$ | $R^{B18}$ |
| $L_{44355}$ | $R^{B1}$ | $R^{C3}$ | $R^{E8}$ | $R^{B18}$ |
| $L_{44356}$ | $R^{B1}$ | $R^{C3}$ | $R^{E9}$ | $R^{B18}$ |
| $L_{44357}$ | $R^{B1}$ | $R^{C3}$ | $R^{E10}$ | $R^{B18}$ |
| $L_{44358}$ | $R^{B1}$ | $R^{C3}$ | $R^{E11}$ | $R^{B18}$ |
| $L_{44359}$ | $R^{B1}$ | $R^{C3}$ | $R^{E12}$ | $R^{B18}$ |
| $L_{44360}$ | $R^{B1}$ | $R^{C3}$ | $R^{E13}$ | $R^{B18}$ |
| $L_{44361}$ | $R^{B1}$ | $R^{C3}$ | $R^{E14}$ | $R^{B18}$ |
| $L_{44362}$ | $R^{B1}$ | $R^{C3}$ | $R^{E15}$ | $R^{B18}$ |
| $L_{44363}$ | $R^{B1}$ | $R^{C3}$ | $R^{E16}$ | $R^{B18}$ |
| $L_{44364}$ | $R^{B1}$ | $R^{C3}$ | $R^{E17}$ | $R^{B18}$ |
| $L_{44365}$ | $R^{B1}$ | $R^{C3}$ | $R^{E18}$ | $R^{B18}$ |
| $L_{44366}$ | $R^{B1}$ | $R^{C3}$ | $R^{E19}$ | $R^{B18}$ |
| $L_{44367}$ | $R^{B1}$ | $R^{C3}$ | $R^{E20}$ | $R^{B18}$ |
| $L_{44368}$ | $R^{B1}$ | $R^{C3}$ | $R^{E21}$ | $R^{B18}$ |
| $L_{44369}$ | $R^{B1}$ | $R^{C3}$ | $R^{B3}$ | $R^{A3}$ |
| $L_{44370}$ | $R^{B1}$ | $R^{C3}$ | $R^{B6}$ | $R^{A3}$ |
| $L_{44371}$ | $R^{B1}$ | $R^{C3}$ | $R^{B7}$ | $R^{A3}$ |
| $L_{44372}$ | $R^{B1}$ | $R^{C3}$ | $R^{B12}$ | $R^{A3}$ |
| $L_{44373}$ | $R^{B1}$ | $R^{C3}$ | $R^{B20}$ | $R^{A3}$ |
| $L_{44374}$ | $R^{B1}$ | $R^{C3}$ | $R^{B25}$ | $R^{A3}$ |
| $L_{44375}$ | $R^{B1}$ | $R^{C3}$ | $R^{B29}$ | $R^{A3}$ |
| $L_{44376}$ | $R^{B1}$ | $R^{C3}$ | $R^{A37}$ | $R^{A3}$ |
| $L_{44377}$ | $R^{B1}$ | $R^{C3}$ | $R^{A43}$ | $R^{A3}$ |
| $L_{44378}$ | $R^{B1}$ | $R^{C3}$ | $R^{E1}$ | $R^{A3}$ |
| $L_{44379}$ | $R^{B1}$ | $R^{C3}$ | $R^{E2}$ | $R^{A3}$ |
| $L_{44380}$ | $R^{B1}$ | $R^{C3}$ | $R^{E3}$ | $R^{A3}$ |
| $L_{44381}$ | $R^{B1}$ | $R^{C3}$ | $R^{E4}$ | $R^{A3}$ |
| $L_{44382}$ | $R^{B1}$ | $R^{C3}$ | $R^{E5}$ | $R^{A3}$ |
| $L_{44383}$ | $R^{B1}$ | $R^{C3}$ | $R^{E6}$ | $R^{A3}$ |
| $L_{44384}$ | $R^{B1}$ | $R^{C3}$ | $R^{E7}$ | $R^{A3}$ |
| $L_{44385}$ | $R^{B1}$ | $R^{C3}$ | $R^{E8}$ | $R^{A3}$ |
| $L_{44386}$ | $R^{B1}$ | $R^{C3}$ | $R^{E9}$ | $R^{A3}$ |
| $L_{44387}$ | $R^{B1}$ | $R^{C3}$ | $R^{E10}$ | $R^{A3}$ |
| $L_{44388}$ | $R^{B1}$ | $R^{C3}$ | $R^{E11}$ | $R^{A3}$ |
| $L_{44389}$ | $R^{B1}$ | $R^{C3}$ | $R^{E12}$ | $R^{A3}$ |
| $L_{44390}$ | $R^{B1}$ | $R^{C3}$ | $R^{E13}$ | $R^{A3}$ |
| $L_{44391}$ | $R^{B1}$ | $R^{C3}$ | $R^{E14}$ | $R^{A3}$ |
| $L_{44392}$ | $R^{B1}$ | $R^{C3}$ | $R^{E15}$ | $R^{A3}$ |
| $L_{44393}$ | $R^{B1}$ | $R^{C3}$ | $R^{E16}$ | $R^{A3}$ |
| $L_{44394}$ | $R^{B1}$ | $R^{C3}$ | $R^{E17}$ | $R^{A3}$ |
| $L_{44395}$ | $R^{B1}$ | $R^{C3}$ | $R^{E18}$ | $R^{A3}$ |
| $L_{44396}$ | $R^{B1}$ | $R^{C3}$ | $R^{E19}$ | $R^{A3}$ |
| $L_{44397}$ | $R^{B1}$ | $R^{C3}$ | $R^{E20}$ | $R^{A3}$ |
| $L_{44398}$ | $R^{B1}$ | $R^{C3}$ | $R^{E21}$ | $R^{A3}$ |
| $L_{44399}$ | $R^{B1}$ | $R^{C3}$ | $R^{B3}$ | $R^{A34}$ |
| $L_{44400}$ | $R^{B1}$ | $R^{C3}$ | $R^{B6}$ | $R^{A34}$ |
| $L_{44401}$ | $R^{B1}$ | $R^{C3}$ | $R^{B7}$ | $R^{A34}$ |
| $L_{44402}$ | $R^{B1}$ | $R^{C3}$ | $R^{B12}$ | $R^{A34}$ |
| $L_{44403}$ | $R^{B1}$ | $R^{C3}$ | $R^{B20}$ | $R^{A34}$ |

-continued

| Ligand | $R^1$ | $R^2$ | $R^3$ | $R^4$ |
|---|---|---|---|---|
| $L_{44404}$ | $R^{B1}$ | $R^{C3}$ | $R^{B25}$ | $R^{A34}$ |
| $L_{44405}$ | $R^{B1}$ | $R^{C3}$ | $R^{B29}$ | $R^{A34}$ |
| $L_{44406}$ | $R^{B1}$ | $R^{C3}$ | $R^{A37}$ | $R^{A34}$ |
| $L_{44407}$ | $R^{B1}$ | $R^{C3}$ | $R^{A43}$ | $R^{A34}$ |
| $L_{44408}$ | $R^{B1}$ | $R^{C3}$ | $R^{E1}$ | $R^{A34}$ |
| $L_{44409}$ | $R^{B1}$ | $R^{C3}$ | $R^{E2}$ | $R^{A34}$ |
| $L_{44410}$ | $R^{B1}$ | $R^{C3}$ | $R^{E3}$ | $R^{A34}$ |
| $L_{44411}$ | $R^{B1}$ | $R^{C3}$ | $R^{E4}$ | $R^{A34}$ |
| $L_{44412}$ | $R^{B1}$ | $R^{C3}$ | $R^{E5}$ | $R^{A34}$ |
| $L_{44413}$ | $R^{B1}$ | $R^{C3}$ | $R^{E6}$ | $R^{A34}$ |
| $L_{44414}$ | $R^{B1}$ | $R^{C3}$ | $R^{E7}$ | $R^{A34}$ |
| $L_{44415}$ | $R^{B1}$ | $R^{C3}$ | $R^{E8}$ | $R^{A34}$ |
| $L_{44416}$ | $R^{B1}$ | $R^{C3}$ | $R^{E9}$ | $R^{A34}$ |
| $L_{44417}$ | $R^{B1}$ | $R^{C3}$ | $R^{E10}$ | $R^{A34}$ |
| $L_{44418}$ | $R^{B1}$ | $R^{C3}$ | $R^{E11}$ | $R^{A34}$ |
| $L_{44419}$ | $R^{B1}$ | $R^{C3}$ | $R^{E12}$ | $R^{A34}$ |
| $L_{44420}$ | $R^{B1}$ | $R^{C3}$ | $R^{E13}$ | $R^{A34}$ |
| $L_{44421}$ | $R^{B1}$ | $R^{C3}$ | $R^{E14}$ | $R^{A34}$ |
| $L_{44422}$ | $R^{B1}$ | $R^{C3}$ | $R^{E15}$ | $R^{A34}$ |
| $L_{44423}$ | $R^{B1}$ | $R^{C3}$ | $R^{E16}$ | $R^{A34}$ |
| $L_{44424}$ | $R^{B1}$ | $R^{C3}$ | $R^{E17}$ | $R^{A34}$ |
| $L_{44425}$ | $R^{B1}$ | $R^{C3}$ | $R^{E18}$ | $R^{A34}$ |
| $L_{44426}$ | $R^{B1}$ | $R^{C3}$ | $R^{E19}$ | $R^{A34}$ |
| $L_{44427}$ | $R^{B1}$ | $R^{C3}$ | $R^{E20}$ | $R^{A34}$ |
| $L_{44428}$ | $R^{B1}$ | $R^{C3}$ | $R^{E21}$ | $R^{A34}$ |
| $L_{44429}$ | $R^{B1}$ | $R^{C3}$ | $R^{B3}$ | $R^{A52}$ |
| $L_{44430}$ | $R^{B1}$ | $R^{C3}$ | $R^{B6}$ | $R^{A52}$ |
| $L_{44431}$ | $R^{B1}$ | $R^{C3}$ | $R^{B7}$ | $R^{A52}$ |
| $L_{44432}$ | $R^{B1}$ | $R^{C3}$ | $R^{B12}$ | $R^{A52}$ |
| $L_{44433}$ | $R^{B1}$ | $R^{C3}$ | $R^{B20}$ | $R^{A52}$ |
| $L_{44434}$ | $R^{B1}$ | $R^{C3}$ | $R^{B25}$ | $R^{A52}$ |
| $L_{44435}$ | $R^{B1}$ | $R^{C3}$ | $R^{B29}$ | $R^{A52}$ |
| $L_{44436}$ | $R^{B1}$ | $R^{C3}$ | $R^{A37}$ | $R^{A52}$ |
| $L_{44437}$ | $R^{B1}$ | $R^{C3}$ | $R^{A43}$ | $R^{A52}$ |
| $L_{44438}$ | $R^{B1}$ | $R^{C3}$ | $R^{E1}$ | $R^{A52}$ |
| $L_{44439}$ | $R^{B1}$ | $R^{C3}$ | $R^{E2}$ | $R^{A52}$ |
| $L_{44440}$ | $R^{B1}$ | $R^{C3}$ | $R^{E3}$ | $R^{A52}$ |
| $L_{44441}$ | $R^{B1}$ | $R^{C3}$ | $R^{E4}$ | $R^{A52}$ |
| $L_{44442}$ | $R^{B1}$ | $R^{C3}$ | $R^{E5}$ | $R^{A52}$ |
| $L_{44443}$ | $R^{B1}$ | $R^{C3}$ | $R^{E6}$ | $R^{A52}$ |
| $L_{44444}$ | $R^{B1}$ | $R^{C3}$ | $R^{E7}$ | $R^{A52}$ |
| $L_{44445}$ | $R^{B1}$ | $R^{C3}$ | $R^{E8}$ | $R^{A52}$ |
| $L_{44446}$ | $R^{B1}$ | $R^{C3}$ | $R^{E9}$ | $R^{A52}$ |
| $L_{44447}$ | $R^{B1}$ | $R^{C3}$ | $R^{E10}$ | $R^{A52}$ |
| $L_{44448}$ | $R^{B1}$ | $R^{C3}$ | $R^{E11}$ | $R^{A52}$ |
| $L_{44449}$ | $R^{B1}$ | $R^{C3}$ | $R^{E12}$ | $R^{A52}$ |
| $L_{44450}$ | $R^{B1}$ | $R^{C3}$ | $R^{E13}$ | $R^{A52}$ |
| $L_{44451}$ | $R^{B1}$ | $R^{C3}$ | $R^{E14}$ | $R^{A52}$ |
| $L_{44452}$ | $R^{B1}$ | $R^{C3}$ | $R^{E15}$ | $R^{A52}$ |
| $L_{44453}$ | $R^{B1}$ | $R^{C3}$ | $R^{E16}$ | $R^{A52}$ |
| $L_{44454}$ | $R^{B1}$ | $R^{C3}$ | $R^{E17}$ | $R^{A52}$ |
| $L_{44455}$ | $R^{B1}$ | $R^{C3}$ | $R^{E18}$ | $R^{A52}$ |
| $L_{44456}$ | $R^{B1}$ | $R^{C3}$ | $R^{E19}$ | $R^{A52}$ |
| $L_{44457}$ | $R^{B1}$ | $R^{C3}$ | $R^{E20}$ | $R^{A52}$ |
| $L_{44458}$ | $R^{B1}$ | $R^{C3}$ | $R^{E21}$ | $R^{A52}$ |
| $L_{44459}$ | $R^{B1}$ | $R^{C17}$ | $R^{B3}$ | H |
| $L_{44460}$ | $R^{B1}$ | $R^{C17}$ | $R^{B6}$ | H |
| $L_{44461}$ | $R^{B1}$ | $R^{C17}$ | $R^{B7}$ | H |
| $L_{44462}$ | $R^{B1}$ | $R^{C17}$ | $R^{B12}$ | H |
| $L_{44463}$ | $R^{B1}$ | $R^{C17}$ | $R^{B20}$ | H |
| $L_{44464}$ | $R^{B1}$ | $R^{C17}$ | $R^{B25}$ | H |
| $L_{44465}$ | $R^{B1}$ | $R^{C17}$ | $R^{B29}$ | H |
| $L_{44466}$ | $R^{B1}$ | $R^{C17}$ | $R^{A37}$ | H |
| $L_{44467}$ | $R^{B1}$ | $R^{C17}$ | $R^{A43}$ | H |
| $L_{44468}$ | $R^{B1}$ | $R^{C17}$ | $R^{E1}$ | H |
| $L_{44469}$ | $R^{B1}$ | $R^{C17}$ | $R^{E2}$ | H |
| $L_{44470}$ | $R^{B1}$ | $R^{C17}$ | $R^{E3}$ | H |
| $L_{44471}$ | $R^{B1}$ | $R^{C17}$ | $R^{E4}$ | H |
| $L_{44472}$ | $R^{B1}$ | $R^{C17}$ | $R^{E5}$ | H |
| $L_{44473}$ | $R^{B1}$ | $R^{C17}$ | $R^{E6}$ | H |
| $L_{44474}$ | $R^{B1}$ | $R^{C17}$ | $R^{E7}$ | H |
| $L_{44475}$ | $R^{B1}$ | $R^{C17}$ | $R^{E8}$ | H |
| $L_{44476}$ | $R^{B1}$ | $R^{C17}$ | $R^{E9}$ | H |
| $L_{44477}$ | $R^{B1}$ | $R^{C17}$ | $R^{E10}$ | H |
| $L_{44478}$ | $R^{B1}$ | $R^{C17}$ | $R^{E11}$ | H |
| $L_{44479}$ | $R^{B1}$ | $R^{C17}$ | $R^{E12}$ | H |
| $L_{44480}$ | $R^{B1}$ | $R^{C17}$ | $R^{E13}$ | H |

-continued

| Ligand | $R^1$ | $R^2$ | $R^3$ | $R^4$ |
|---|---|---|---|---|
| $L_{44481}$ | $R^{B1}$ | $R^{C17}$ | $R^{E14}$ | H |
| $L_{44482}$ | $R^{B1}$ | $R^{C17}$ | $R^{E15}$ | H |
| $L_{44483}$ | $R^{B1}$ | $R^{C17}$ | $R^{E16}$ | H |
| $L_{44484}$ | $R^{B1}$ | $R^{C17}$ | $R^{E17}$ | H |
| $L_{44485}$ | $R^{B1}$ | $R^{C17}$ | $R^{E18}$ | H |
| $L_{44486}$ | $R^{B1}$ | $R^{C17}$ | $R^{E19}$ | H |
| $L_{44487}$ | $R^{B1}$ | $R^{C17}$ | $R^{E20}$ | H |
| $L_{44488}$ | $R^{B1}$ | $R^{C17}$ | $R^{E21}$ | H |
| $L_{44489}$ | $R^{B1}$ | $R^{C17}$ | $R^{B3}$ | $R^{B3}$ |
| $L_{44490}$ | $R^{B1}$ | $R^{C17}$ | $R^{B6}$ | $R^{B3}$ |
| $L_{44491}$ | $R^{B1}$ | $R^{C17}$ | $R^{B7}$ | $R^{B3}$ |
| $L_{44492}$ | $R^{B1}$ | $R^{C17}$ | $R^{B12}$ | $R^{B3}$ |
| $L_{44493}$ | $R^{B1}$ | $R^{C17}$ | $R^{B20}$ | $R^{B3}$ |
| $L_{44494}$ | $R^{B1}$ | $R^{C17}$ | $R^{B25}$ | $R^{B3}$ |
| $L_{44495}$ | $R^{B1}$ | $R^{C17}$ | $R^{B29}$ | $R^{B3}$ |
| $L_{44496}$ | $R^{B1}$ | $R^{C17}$ | $R^{A37}$ | $R^{B3}$ |
| $L_{44497}$ | $R^{B1}$ | $R^{C17}$ | $R^{A43}$ | $R^{B3}$ |
| $L_{44498}$ | $R^{B1}$ | $R^{C17}$ | $R^{E1}$ | $R^{B3}$ |
| $L_{44499}$ | $R^{B1}$ | $R^{C17}$ | $R^{E2}$ | $R^{B3}$ |
| $L_{44500}$ | $R^{B1}$ | $R^{C17}$ | $R^{E3}$ | $R^{B3}$ |
| $L_{44501}$ | $R^{B1}$ | $R^{C17}$ | $R^{E4}$ | $R^{B3}$ |
| $L_{44502}$ | $R^{B1}$ | $R^{C17}$ | $R^{E5}$ | $R^{B3}$ |
| $L_{44503}$ | $R^{B1}$ | $R^{C17}$ | $R^{E6}$ | $R^{B3}$ |
| $L_{44504}$ | $R^{B1}$ | $R^{C17}$ | $R^{E7}$ | $R^{B3}$ |
| $L_{44505}$ | $R^{B1}$ | $R^{C17}$ | $R^{E8}$ | $R^{B3}$ |
| $L_{44506}$ | $R^{B1}$ | $R^{C17}$ | $R^{E9}$ | $R^{B3}$ |
| $L_{44507}$ | $R^{B1}$ | $R^{C17}$ | $R^{E10}$ | $R^{B3}$ |
| $L_{44508}$ | $R^{B1}$ | $R^{C17}$ | $R^{E11}$ | $R^{B3}$ |
| $L_{44509}$ | $R^{B1}$ | $R^{C17}$ | $R^{E12}$ | $R^{B3}$ |
| $L_{44510}$ | $R^{B1}$ | $R^{C17}$ | $R^{E13}$ | $R^{B3}$ |
| $L_{44511}$ | $R^{B1}$ | $R^{C17}$ | $R^{E14}$ | $R^{B3}$ |
| $L_{44512}$ | $R^{B1}$ | $R^{C17}$ | $R^{E15}$ | $R^{B3}$ |
| $L_{44513}$ | $R^{B1}$ | $R^{C17}$ | $R^{E16}$ | $R^{B3}$ |
| $L_{44514}$ | $R^{B1}$ | $R^{C17}$ | $R^{E17}$ | $R^{B3}$ |
| $L_{44515}$ | $R^{B1}$ | $R^{C17}$ | $R^{E18}$ | $R^{B3}$ |
| $L_{44516}$ | $R^{B1}$ | $R^{C17}$ | $R^{E19}$ | $R^{B3}$ |
| $L_{44517}$ | $R^{B1}$ | $R^{C17}$ | $R^{E20}$ | $R^{B3}$ |
| $L_{44518}$ | $R^{B1}$ | $R^{C17}$ | $R^{E21}$ | $R^{B3}$ |
| $L_{44519}$ | $R^{B1}$ | $R^{C17}$ | $R^{B3}$ | $R^{B4}$ |
| $L_{44520}$ | $R^{B1}$ | $R^{C17}$ | $R^{B6}$ | $R^{B4}$ |
| $L_{44521}$ | $R^{B1}$ | $R^{C17}$ | $R^{B7}$ | $R^{B4}$ |
| $L_{44522}$ | $R^{B1}$ | $R^{C17}$ | $R^{B12}$ | $R^{B4}$ |
| $L_{44523}$ | $R^{B1}$ | $R^{C17}$ | $R^{B20}$ | $R^{B4}$ |
| $L_{44524}$ | $R^{B1}$ | $R^{C17}$ | $R^{B25}$ | $R^{B4}$ |
| $L_{44525}$ | $R^{B1}$ | $R^{C17}$ | $R^{B29}$ | $R^{B4}$ |
| $L_{44526}$ | $R^{B1}$ | $R^{C17}$ | $R^{A37}$ | $R^{B4}$ |
| $L_{44527}$ | $R^{B1}$ | $R^{C17}$ | $R^{A43}$ | $R^{B4}$ |
| $L_{44528}$ | $R^{B1}$ | $R^{C17}$ | $R^{E1}$ | $R^{B4}$ |
| $L_{44529}$ | $R^{B1}$ | $R^{C17}$ | $R^{E2}$ | $R^{B4}$ |
| $L_{44530}$ | $R^{B1}$ | $R^{C17}$ | $R^{E3}$ | $R^{B4}$ |
| $L_{44531}$ | $R^{B1}$ | $R^{C17}$ | $R^{E4}$ | $R^{B4}$ |
| $L_{44532}$ | $R^{B1}$ | $R^{C17}$ | $R^{E5}$ | $R^{B4}$ |
| $L_{44533}$ | $R^{B1}$ | $R^{C17}$ | $R^{E6}$ | $R^{B4}$ |
| $L_{44534}$ | $R^{B1}$ | $R^{C17}$ | $R^{E7}$ | $R^{B4}$ |
| $L_{44535}$ | $R^{B1}$ | $R^{C17}$ | $R^{E8}$ | $R^{B4}$ |
| $L_{44536}$ | $R^{B1}$ | $R^{C17}$ | $R^{E9}$ | $R^{B4}$ |
| $L_{44537}$ | $R^{B1}$ | $R^{C17}$ | $R^{E10}$ | $R^{B4}$ |
| $L_{44538}$ | $R^{B1}$ | $R^{C17}$ | $R^{E11}$ | $R^{B4}$ |
| $L_{44539}$ | $R^{B1}$ | $R^{C17}$ | $R^{E12}$ | $R^{B4}$ |
| $L_{44540}$ | $R^{B1}$ | $R^{C17}$ | $R^{E13}$ | $R^{B4}$ |
| $L_{44541}$ | $R^{B1}$ | $R^{C17}$ | $R^{E14}$ | $R^{B4}$ |
| $L_{44542}$ | $R^{B1}$ | $R^{C17}$ | $R^{E15}$ | $R^{B4}$ |
| $L_{44543}$ | $R^{B1}$ | $R^{C17}$ | $R^{E16}$ | $R^{B4}$ |
| $L_{44544}$ | $R^{B1}$ | $R^{C17}$ | $R^{E17}$ | $R^{B4}$ |
| $L_{44545}$ | $R^{B1}$ | $R^{C17}$ | $R^{E18}$ | $R^{B4}$ |
| $L_{44546}$ | $R^{B1}$ | $R^{C17}$ | $R^{E19}$ | $R^{B4}$ |
| $L_{44547}$ | $R^{B1}$ | $R^{C17}$ | $R^{E20}$ | $R^{B4}$ |
| $L_{44548}$ | $R^{B1}$ | $R^{C17}$ | $R^{E21}$ | $R^{B4}$ |
| $L_{44549}$ | $R^{B1}$ | $R^{C17}$ | $R^{B3}$ | $R^{B18}$ |
| $L_{44550}$ | $R^{B1}$ | $R^{C17}$ | $R^{B6}$ | $R^{B18}$ |
| $L_{44551}$ | $R^{B1}$ | $R^{C17}$ | $R^{B7}$ | $R^{B18}$ |
| $L_{44552}$ | $R^{B1}$ | $R^{C17}$ | $R^{B12}$ | $R^{B18}$ |
| $L_{44553}$ | $R^{B1}$ | $R^{C17}$ | $R^{B20}$ | $R^{B18}$ |
| $L_{44554}$ | $R^{B1}$ | $R^{C17}$ | $R^{B25}$ | $R^{B18}$ |
| $L_{44555}$ | $R^{B1}$ | $R^{C17}$ | $R^{B29}$ | $R^{B18}$ |
| $L_{44556}$ | $R^{B1}$ | $R^{C17}$ | $R^{A37}$ | $R^{B18}$ |
| $L_{44557}$ | $R^{B1}$ | $R^{C17}$ | $R^{A43}$ | $R^{B18}$ |

-continued

| Ligand | $R^1$ | $R^2$ | $R^3$ | $R^4$ |
|---|---|---|---|---|
| $L_{44558}$ | $R^{B1}$ | $R^{C17}$ | $R^{E1}$ | $R^{B18}$ |
| $L_{44559}$ | $R^{B1}$ | $R^{C17}$ | $R^{E2}$ | $R^{B18}$ |
| $L_{44560}$ | $R^{B1}$ | $R^{C17}$ | $R^{E3}$ | $R^{B18}$ |
| $L_{44561}$ | $R^{B1}$ | $R^{C17}$ | $R^{E4}$ | $R^{B18}$ |
| $L_{44562}$ | $R^{B1}$ | $R^{C17}$ | $R^{E5}$ | $R^{B18}$ |
| $L_{44563}$ | $R^{B1}$ | $R^{C17}$ | $R^{E6}$ | $R^{B18}$ |
| $L_{44564}$ | $R^{B1}$ | $R^{C17}$ | $R^{E7}$ | $R^{B18}$ |
| $L_{44565}$ | $R^{B1}$ | $R^{C17}$ | $R^{E8}$ | $R^{B18}$ |
| $L_{44566}$ | $R^{B1}$ | $R^{C17}$ | $R^{E9}$ | $R^{B18}$ |
| $L_{44567}$ | $R^{B1}$ | $R^{C17}$ | $R^{E10}$ | $R^{B18}$ |
| $L_{44568}$ | $R^{B1}$ | $R^{C17}$ | $R^{E11}$ | $R^{B18}$ |
| $L_{44569}$ | $R^{B1}$ | $R^{C17}$ | $R^{E12}$ | $R^{B18}$ |
| $L_{44570}$ | $R^{B1}$ | $R^{C17}$ | $R^{E13}$ | $R^{B18}$ |
| $L_{44571}$ | $R^{B1}$ | $R^{C17}$ | $R^{E14}$ | $R^{B18}$ |
| $L_{44572}$ | $R^{B1}$ | $R^{C17}$ | $R^{E15}$ | $R^{B18}$ |
| $L_{44573}$ | $R^{B1}$ | $R^{C17}$ | $R^{E16}$ | $R^{B18}$ |
| $L_{44574}$ | $R^{B1}$ | $R^{C17}$ | $R^{E17}$ | $R^{B18}$ |
| $L_{44575}$ | $R^{B1}$ | $R^{C17}$ | $R^{E18}$ | $R^{B18}$ |
| $L_{44576}$ | $R^{B1}$ | $R^{C17}$ | $R^{E19}$ | $R^{B18}$ |
| $L_{44577}$ | $R^{B1}$ | $R^{C17}$ | $R^{E20}$ | $R^{B18}$ |
| $L_{44578}$ | $R^{B1}$ | $R^{C17}$ | $R^{E21}$ | $R^{B18}$ |
| $L_{44579}$ | $R^{B1}$ | $R^{C17}$ | $R^{B3}$ | $R^{A3}$ |
| $L_{44580}$ | $R^{B1}$ | $R^{C17}$ | $R^{B6}$ | $R^{A3}$ |
| $L_{44581}$ | $R^{B1}$ | $R^{C17}$ | $R^{B7}$ | $R^{A3}$ |
| $L_{44582}$ | $R^{B1}$ | $R^{C17}$ | $R^{B12}$ | $R^{A3}$ |
| $L_{44583}$ | $R^{B1}$ | $R^{C17}$ | $R^{B20}$ | $R^{A3}$ |
| $L_{44584}$ | $R^{B1}$ | $R^{C17}$ | $R^{B25}$ | $R^{A3}$ |
| $L_{44585}$ | $R^{B1}$ | $R^{C17}$ | $R^{B29}$ | $R^{A3}$ |
| $L_{44586}$ | $R^{B1}$ | $R^{C17}$ | $R^{A37}$ | $R^{A3}$ |
| $L_{44587}$ | $R^{B1}$ | $R^{C17}$ | $R^{A43}$ | $R^{A3}$ |
| $L_{44588}$ | $R^{B1}$ | $R^{C17}$ | $R^{E1}$ | $R^{A3}$ |
| $L_{44589}$ | $R^{B1}$ | $R^{C17}$ | $R^{E2}$ | $R^{A3}$ |
| $L_{44590}$ | $R^{B1}$ | $R^{C17}$ | $R^{E3}$ | $R^{A3}$ |
| $L_{44591}$ | $R^{B1}$ | $R^{C17}$ | $R^{E4}$ | $R^{A3}$ |
| $L_{44592}$ | $R^{B1}$ | $R^{C17}$ | $R^{E5}$ | $R^{A3}$ |
| $L_{44593}$ | $R^{B1}$ | $R^{C17}$ | $R^{E6}$ | $R^{A3}$ |
| $L_{44594}$ | $R^{B1}$ | $R^{C17}$ | $R^{E7}$ | $R^{A3}$ |
| $L_{44595}$ | $R^{B1}$ | $R^{C17}$ | $R^{E8}$ | $R^{A3}$ |
| $L_{44596}$ | $R^{B1}$ | $R^{C17}$ | $R^{E9}$ | $R^{A3}$ |
| $L_{44597}$ | $R^{B1}$ | $R^{C17}$ | $R^{E10}$ | $R^{A3}$ |
| $L_{44598}$ | $R^{B1}$ | $R^{C17}$ | $R^{E11}$ | $R^{A3}$ |
| $L_{44599}$ | $R^{B1}$ | $R^{C17}$ | $R^{E12}$ | $R^{A3}$ |
| $L_{44600}$ | $R^{B1}$ | $R^{C17}$ | $R^{E13}$ | $R^{A3}$ |
| $L_{44601}$ | $R^{B1}$ | $R^{C17}$ | $R^{E14}$ | $R^{A3}$ |
| $L_{44602}$ | $R^{B1}$ | $R^{C17}$ | $R^{E15}$ | $R^{A3}$ |
| $L_{44603}$ | $R^{B1}$ | $R^{C17}$ | $R^{E16}$ | $R^{A3}$ |
| $L_{44604}$ | $R^{B1}$ | $R^{C17}$ | $R^{E17}$ | $R^{A3}$ |
| $L_{44605}$ | $R^{B1}$ | $R^{C17}$ | $R^{E18}$ | $R^{A3}$ |
| $L_{44606}$ | $R^{B1}$ | $R^{C17}$ | $R^{E19}$ | $R^{A3}$ |
| $L_{44607}$ | $R^{B1}$ | $R^{C17}$ | $R^{E20}$ | $R^{A3}$ |
| $L_{44608}$ | $R^{B1}$ | $R^{C17}$ | $R^{E21}$ | $R^{A3}$ |
| $L_{44609}$ | $R^{B1}$ | $R^{C17}$ | $R^{B3}$ | $R^{A34}$ |
| $L_{44610}$ | $R^{B1}$ | $R^{C17}$ | $R^{B6}$ | $R^{A34}$ |
| $L_{44611}$ | $R^{B1}$ | $R^{C17}$ | $R^{B7}$ | $R^{A34}$ |
| $L_{44612}$ | $R^{B1}$ | $R^{C17}$ | $R^{B12}$ | $R^{A34}$ |
| $L_{44613}$ | $R^{B1}$ | $R^{C17}$ | $R^{B20}$ | $R^{A34}$ |
| $L_{44614}$ | $R^{B1}$ | $R^{C17}$ | $R^{B25}$ | $R^{A34}$ |
| $L_{44615}$ | $R^{B1}$ | $R^{C17}$ | $R^{B29}$ | $R^{A34}$ |
| $L_{44616}$ | $R^{B1}$ | $R^{C17}$ | $R^{A37}$ | $R^{A34}$ |
| $L_{44617}$ | $R^{B1}$ | $R^{C17}$ | $R^{A43}$ | $R^{A34}$ |
| $L_{44618}$ | $R^{B1}$ | $R^{C17}$ | $R^{E1}$ | $R^{A34}$ |
| $L_{44619}$ | $R^{B1}$ | $R^{C17}$ | $R^{E2}$ | $R^{A34}$ |
| $L_{44620}$ | $R^{B1}$ | $R^{C17}$ | $R^{E3}$ | $R^{A34}$ |
| $L_{44621}$ | $R^{B1}$ | $R^{C17}$ | $R^{E4}$ | $R^{A34}$ |
| $L_{44622}$ | $R^{B1}$ | $R^{C17}$ | $R^{E5}$ | $R^{A34}$ |
| $L_{44623}$ | $R^{B1}$ | $R^{C17}$ | $R^{E6}$ | $R^{A34}$ |
| $L_{44624}$ | $R^{B1}$ | $R^{C17}$ | $R^{E7}$ | $R^{A34}$ |
| $L_{44625}$ | $R^{B1}$ | $R^{C17}$ | $R^{E8}$ | $R^{A34}$ |
| $L_{44626}$ | $R^{B1}$ | $R^{C17}$ | $R^{E9}$ | $R^{A34}$ |
| $L_{44627}$ | $R^{B1}$ | $R^{C17}$ | $R^{E10}$ | $R^{A34}$ |
| $L_{44628}$ | $R^{B1}$ | $R^{C17}$ | $R^{E11}$ | $R^{A34}$ |
| $L_{44629}$ | $R^{B1}$ | $R^{C17}$ | $R^{E12}$ | $R^{A34}$ |
| $L_{44630}$ | $R^{B1}$ | $R^{C17}$ | $R^{E13}$ | $R^{A34}$ |
| $L_{44631}$ | $R^{B1}$ | $R^{C17}$ | $R^{E14}$ | $R^{A34}$ |
| $L_{44632}$ | $R^{B1}$ | $R^{C17}$ | $R^{E15}$ | $R^{A34}$ |
| $L_{44633}$ | $R^{B1}$ | $R^{C17}$ | $R^{E16}$ | $R^{A34}$ |
| $L_{44634}$ | $R^{B1}$ | $R^{C17}$ | $R^{E17}$ | $R^{A34}$ |

-continued

| Ligand | $R^1$ | $R^2$ | $R^3$ | $R^4$ |
|---|---|---|---|---|
| $L_{A4635}$ | $R^{B1}$ | $R^{C17}$ | $R^{E18}$ | $R^{A34}$ |
| $L_{A4636}$ | $R^{B1}$ | $R^{C17}$ | $R^{E19}$ | $R^{A34}$ |
| $L_{A4637}$ | $R^{B1}$ | $R^{C17}$ | $R^{E20}$ | $R^{A34}$ |
| $L_{A4638}$ | $R^{B1}$ | $R^{C17}$ | $R^{E21}$ | $R^{A34}$ |
| $L_{A4639}$ | $R^{B1}$ | $R^{C17}$ | $R^{B3}$ | $R^{A52}$ |
| $L_{A4640}$ | $R^{B1}$ | $R^{C17}$ | $R^{B6}$ | $R^{A52}$ |
| $L_{A4641}$ | $R^{B1}$ | $R^{C17}$ | $R^{B7}$ | $R^{A52}$ |
| $L_{A4642}$ | $R^{B1}$ | $R^{C17}$ | $R^{B12}$ | $R^{A52}$ |
| $L_{A4643}$ | $R^{B1}$ | $R^{C17}$ | $R^{B20}$ | $R^{A52}$ |
| $L_{A4644}$ | $R^{B1}$ | $R^{C17}$ | $R^{B25}$ | $R^{A52}$ |
| $L_{A4645}$ | $R^{B1}$ | $R^{C17}$ | $R^{B29}$ | $R^{A52}$ |
| $L_{A4646}$ | $R^{B1}$ | $R^{C17}$ | $R^{A37}$ | $R^{A52}$ |
| $L_{A4647}$ | $R^{B1}$ | $R^{C17}$ | $R^{A43}$ | $R^{A52}$ |
| $L_{A4648}$ | $R^{B1}$ | $R^{C17}$ | $R^{E1}$ | $R^{A52}$ |
| $L_{A4649}$ | $R^{B1}$ | $R^{C17}$ | $R^{E2}$ | $R^{A52}$ |
| $L_{A4650}$ | $R^{B1}$ | $R^{C17}$ | $R^{E3}$ | $R^{A52}$ |
| $L_{A4651}$ | $R^{B1}$ | $R^{C17}$ | $R^{E4}$ | $R^{A52}$ |
| $L_{A4652}$ | $R^{B1}$ | $R^{C17}$ | $R^{E5}$ | $R^{A52}$ |
| $L_{A4653}$ | $R^{B1}$ | $R^{C17}$ | $R^{E6}$ | $R^{A52}$ |
| $L_{A4654}$ | $R^{B1}$ | $R^{C17}$ | $R^{E7}$ | $R^{A52}$ |
| $L_{A4655}$ | $R^{B1}$ | $R^{C17}$ | $R^{E8}$ | $R^{A52}$ |
| $L_{A4656}$ | $R^{B1}$ | $R^{C17}$ | $R^{E9}$ | $R^{A52}$ |
| $L_{A4657}$ | $R^{B1}$ | $R^{C17}$ | $R^{E10}$ | $R^{A52}$ |
| $L_{A4658}$ | $R^{B1}$ | $R^{C17}$ | $R^{E11}$ | $R^{A52}$ |
| $L_{A4659}$ | $R^{B1}$ | $R^{C17}$ | $R^{E12}$ | $R^{A52}$ |
| $L_{A4660}$ | $R^{B1}$ | $R^{C17}$ | $R^{E13}$ | $R^{A52}$ |
| $L_{A4661}$ | $R^{B1}$ | $R^{C17}$ | $R^{E14}$ | $R^{A52}$ |
| $L_{A4662}$ | $R^{B1}$ | $R^{C17}$ | $R^{E15}$ | $R^{A52}$ |
| $L_{A4663}$ | $R^{B1}$ | $R^{C17}$ | $R^{E16}$ | $R^{A52}$ |
| $L_{A4664}$ | $R^{B1}$ | $R^{C17}$ | $R^{E17}$ | $R^{A52}$ |
| $L_{A4665}$ | $R^{B1}$ | $R^{C17}$ | $R^{E18}$ | $R^{A52}$ |
| $L_{A4666}$ | $R^{B1}$ | $R^{C17}$ | $R^{E19}$ | $R^{A52}$ |
| $L_{A4667}$ | $R^{B1}$ | $R^{C17}$ | $R^{E20}$ | $R^{A52}$ |
| $L_{A4668}$ | $R^{B1}$ | $R^{C17}$ | $R^{E21}$ | $R^{A52}$ |
| $L_{A4669}$ | $R^{B1}$ | $R^{C30}$ | $R^{B3}$ | H |
| $L_{A4670}$ | $R^{B1}$ | $R^{C30}$ | $R^{B6}$ | H |
| $L_{A4671}$ | $R^{B1}$ | $R^{C30}$ | $R^{B7}$ | H |
| $L_{A4672}$ | $R^{B1}$ | $R^{C30}$ | $R^{B12}$ | H |
| $L_{A4673}$ | $R^{B1}$ | $R^{C30}$ | $R^{B20}$ | H |
| $L_{A4674}$ | $R^{B1}$ | $R^{C30}$ | $R^{B25}$ | H |
| $L_{A4675}$ | $R^{B1}$ | $R^{C30}$ | $R^{B29}$ | H |
| $L_{A4676}$ | $R^{B1}$ | $R^{C30}$ | $R^{A37}$ | H |
| $L_{A4677}$ | $R^{B1}$ | $R^{C30}$ | $R^{A43}$ | H |
| $L_{A4678}$ | $R^{B1}$ | $R^{C30}$ | $R^{E1}$ | H |
| $L_{A4679}$ | $R^{B1}$ | $R^{C30}$ | $R^{E2}$ | H |
| $L_{A4680}$ | $R^{B1}$ | $R^{C30}$ | $R^{E3}$ | H |
| $L_{A4681}$ | $R^{B1}$ | $R^{C30}$ | $R^{E4}$ | H |
| $L_{A4682}$ | $R^{B1}$ | $R^{C30}$ | $R^{E5}$ | H |
| $L_{A4683}$ | $R^{B1}$ | $R^{C30}$ | $R^{E6}$ | H |
| $L_{A4684}$ | $R^{B1}$ | $R^{C30}$ | $R^{E7}$ | H |
| $L_{A4685}$ | $R^{B1}$ | $R^{C30}$ | $R^{E8}$ | H |
| $L_{A4686}$ | $R^{B1}$ | $R^{C30}$ | $R^{E9}$ | H |
| $L_{A4687}$ | $R^{B1}$ | $R^{C30}$ | $R^{E10}$ | H |
| $L_{A4688}$ | $R^{B1}$ | $R^{C30}$ | $R^{E11}$ | H |
| $L_{A4689}$ | $R^{B1}$ | $R^{C30}$ | $R^{E12}$ | H |
| $L_{A4690}$ | $R^{B1}$ | $R^{C30}$ | $R^{E13}$ | H |
| $L_{A4691}$ | $R^{B1}$ | $R^{C30}$ | $R^{E14}$ | H |
| $L_{A4692}$ | $R^{B1}$ | $R^{C30}$ | $R^{E15}$ | H |
| $L_{A4693}$ | $R^{B1}$ | $R^{C30}$ | $R^{E16}$ | H |
| $L_{A4694}$ | $R^{B1}$ | $R^{C30}$ | $R^{E17}$ | H |
| $L_{A4695}$ | $R^{B1}$ | $R^{C30}$ | $R^{E18}$ | H |
| $L_{A4696}$ | $R^{B1}$ | $R^{C30}$ | $R^{E19}$ | H |
| $L_{A4697}$ | $R^{B1}$ | $R^{C30}$ | $R^{E20}$ | H |
| $L_{A4698}$ | $R^{B1}$ | $R^{C30}$ | $R^{E21}$ | H |
| $L_{A4699}$ | $R^{B1}$ | $R^{C30}$ | $R^{B3}$ | $R^{B3}$ |
| $L_{A4700}$ | $R^{B1}$ | $R^{C30}$ | $R^{B6}$ | $R^{B3}$ |
| $L_{A4701}$ | $R^{B1}$ | $R^{C30}$ | $R^{B7}$ | $R^{B3}$ |
| $L_{A4702}$ | $R^{B1}$ | $R^{C30}$ | $R^{B12}$ | $R^{B3}$ |
| $L_{A4703}$ | $R^{B1}$ | $R^{C30}$ | $R^{B20}$ | $R^{B3}$ |
| $L_{A4704}$ | $R^{B1}$ | $R^{C30}$ | $R^{B25}$ | $R^{B3}$ |
| $L_{A4705}$ | $R^{B1}$ | $R^{C30}$ | $R^{B29}$ | $R^{B3}$ |
| $L_{A4706}$ | $R^{B1}$ | $R^{C30}$ | $R^{A37}$ | $R^{B3}$ |
| $L_{A4707}$ | $R^{B1}$ | $R^{C30}$ | $R^{A43}$ | $R^{B3}$ |
| $L_{A4708}$ | $R^{B1}$ | $R^{C30}$ | $R^{E1}$ | $R^{B3}$ |
| $L_{A4709}$ | $R^{B1}$ | $R^{C30}$ | $R^{E2}$ | $R^{B3}$ |
| $L_{A4710}$ | $R^{B1}$ | $R^{C30}$ | $R^{E3}$ | $R^{B3}$ |
| $L_{A4711}$ | $R^{B1}$ | $R^{C30}$ | $R^{E4}$ | $R^{B3}$ |

-continued

| Ligand | $R^1$ | $R^2$ | $R^3$ | $R^4$ |
|---|---|---|---|---|
| $L_{A4712}$ | $R^{B1}$ | $R^{C30}$ | $R^{E5}$ | $R^{B3}$ |
| $L_{A4713}$ | $R^{B1}$ | $R^{C30}$ | $R^{E6}$ | $R^{B3}$ |
| $L_{A4714}$ | $R^{B1}$ | $R^{C30}$ | $R^{E7}$ | $R^{B3}$ |
| $L_{A4715}$ | $R^{B1}$ | $R^{C30}$ | $R^{E8}$ | $R^{B3}$ |
| $L_{A4716}$ | $R^{B1}$ | $R^{C30}$ | $R^{E9}$ | $R^{B3}$ |
| $L_{A4717}$ | $R^{B1}$ | $R^{C30}$ | $R^{E10}$ | $R^{B3}$ |
| $L_{A4718}$ | $R^{B1}$ | $R^{C30}$ | $R^{E11}$ | $R^{B3}$ |
| $L_{A4719}$ | $R^{B1}$ | $R^{C30}$ | $R^{E12}$ | $R^{B3}$ |
| $L_{A4720}$ | $R^{B1}$ | $R^{C30}$ | $R^{E13}$ | $R^{B3}$ |
| $L_{A4721}$ | $R^{B1}$ | $R^{C30}$ | $R^{E14}$ | $R^{B3}$ |
| $L_{A4722}$ | $R^{B1}$ | $R^{C30}$ | $R^{E15}$ | $R^{B3}$ |
| $L_{A4723}$ | $R^{B1}$ | $R^{C30}$ | $R^{E16}$ | $R^{B3}$ |
| $L_{A4724}$ | $R^{B1}$ | $R^{C30}$ | $R^{E17}$ | $R^{B3}$ |
| $L_{A4725}$ | $R^{B1}$ | $R^{C30}$ | $R^{E18}$ | $R^{B3}$ |
| $L_{A4726}$ | $R^{B1}$ | $R^{C30}$ | $R^{E19}$ | $R^{B3}$ |
| $L_{A4727}$ | $R^{B1}$ | $R^{C30}$ | $R^{E20}$ | $R^{B3}$ |
| $L_{A4728}$ | $R^{B1}$ | $R^{C30}$ | $R^{E21}$ | $R^{B3}$ |
| $L_{A4729}$ | $R^{B1}$ | $R^{C30}$ | $R^{B3}$ | $R^{B4}$ |
| $L_{A4730}$ | $R^{B1}$ | $R^{C30}$ | $R^{B6}$ | $R^{B4}$ |
| $L_{A4731}$ | $R^{B1}$ | $R^{C30}$ | $R^{B7}$ | $R^{B4}$ |
| $L_{A4732}$ | $R^{B1}$ | $R^{C30}$ | $R^{B12}$ | $R^{B4}$ |
| $L_{A4733}$ | $R^{B1}$ | $R^{C30}$ | $R^{B20}$ | $R^{B4}$ |
| $L_{A4734}$ | $R^{B1}$ | $R^{C30}$ | $R^{B25}$ | $R^{B4}$ |
| $L_{A4735}$ | $R^{B1}$ | $R^{C30}$ | $R^{B29}$ | $R^{B4}$ |
| $L_{A4736}$ | $R^{B1}$ | $R^{C30}$ | $R^{A37}$ | $R^{B4}$ |
| $L_{A4737}$ | $R^{B1}$ | $R^{C30}$ | $R^{A43}$ | $R^{B4}$ |
| $L_{A4738}$ | $R^{B1}$ | $R^{C30}$ | $R^{E1}$ | $R^{B4}$ |
| $L_{A4739}$ | $R^{B1}$ | $R^{C30}$ | $R^{E2}$ | $R^{B4}$ |
| $L_{A4740}$ | $R^{B1}$ | $R^{C30}$ | $R^{E3}$ | $R^{B4}$ |
| $L_{A4741}$ | $R^{B1}$ | $R^{C30}$ | $R^{E4}$ | $R^{B4}$ |
| $L_{A4742}$ | $R^{B1}$ | $R^{C30}$ | $R^{E5}$ | $R^{B4}$ |
| $L_{A4743}$ | $R^{B1}$ | $R^{C30}$ | $R^{E6}$ | $R^{B4}$ |
| $L_{A4744}$ | $R^{B1}$ | $R^{C30}$ | $R^{E7}$ | $R^{B4}$ |
| $L_{A4745}$ | $R^{B1}$ | $R^{C30}$ | $R^{E8}$ | $R^{B4}$ |
| $L_{A4746}$ | $R^{B1}$ | $R^{C30}$ | $R^{E9}$ | $R^{B4}$ |
| $L_{A4747}$ | $R^{B1}$ | $R^{C30}$ | $R^{E10}$ | $R^{B4}$ |
| $L_{A4748}$ | $R^{B1}$ | $R^{C30}$ | $R^{E11}$ | $R^{B4}$ |
| $L_{A4749}$ | $R^{B1}$ | $R^{C30}$ | $R^{E12}$ | $R^{B4}$ |
| $L_{A4750}$ | $R^{B1}$ | $R^{C30}$ | $R^{E13}$ | $R^{B4}$ |
| $L_{A4751}$ | $R^{B1}$ | $R^{C30}$ | $R^{E14}$ | $R^{B4}$ |
| $L_{A4752}$ | $R^{B1}$ | $R^{C30}$ | $R^{E15}$ | $R^{B4}$ |
| $L_{A4753}$ | $R^{B1}$ | $R^{C30}$ | $R^{E16}$ | $R^{B4}$ |
| $L_{A4754}$ | $R^{B1}$ | $R^{C30}$ | $R^{E17}$ | $R^{B4}$ |
| $L_{A4755}$ | $R^{B1}$ | $R^{C30}$ | $R^{E18}$ | $R^{B4}$ |
| $L_{A4756}$ | $R^{B1}$ | $R^{C30}$ | $R^{E19}$ | $R^{B4}$ |
| $L_{A4757}$ | $R^{B1}$ | $R^{C30}$ | $R^{E20}$ | $R^{B4}$ |
| $L_{A4758}$ | $R^{B1}$ | $R^{C30}$ | $R^{E21}$ | $R^{B4}$ |
| $L_{A4759}$ | $R^{B1}$ | $R^{C30}$ | $R^{B3}$ | $R^{B18}$ |
| $L_{A4760}$ | $R^{B1}$ | $R^{C30}$ | $R^{B6}$ | $R^{B18}$ |
| $L_{A4761}$ | $R^{B1}$ | $R^{C30}$ | $R^{B7}$ | $R^{B18}$ |
| $L_{A4762}$ | $R^{B1}$ | $R^{C30}$ | $R^{B12}$ | $R^{B18}$ |
| $L_{A4763}$ | $R^{B1}$ | $R^{C30}$ | $R^{B20}$ | $R^{B18}$ |
| $L_{A4764}$ | $R^{B1}$ | $R^{C30}$ | $R^{B25}$ | $R^{B18}$ |
| $L_{A4765}$ | $R^{B1}$ | $R^{C30}$ | $R^{B29}$ | $R^{B18}$ |
| $L_{A4766}$ | $R^{B1}$ | $R^{C30}$ | $R^{A37}$ | $R^{B18}$ |
| $L_{A4767}$ | $R^{B1}$ | $R^{C30}$ | $R^{A43}$ | $R^{B18}$ |
| $L_{A4768}$ | $R^{B1}$ | $R^{C30}$ | $R^{E1}$ | $R^{B18}$ |
| $L_{A4769}$ | $R^{B1}$ | $R^{C30}$ | $R^{E2}$ | $R^{B18}$ |
| $L_{A4770}$ | $R^{B1}$ | $R^{C30}$ | $R^{E3}$ | $R^{B18}$ |
| $L_{A4771}$ | $R^{B1}$ | $R^{C30}$ | $R^{E4}$ | $R^{B18}$ |
| $L_{A4772}$ | $R^{B1}$ | $R^{C30}$ | $R^{E5}$ | $R^{B18}$ |
| $L_{A4773}$ | $R^{B1}$ | $R^{C30}$ | $R^{E6}$ | $R^{B18}$ |
| $L_{A4774}$ | $R^{B1}$ | $R^{C30}$ | $R^{E7}$ | $R^{B18}$ |
| $L_{A4775}$ | $R^{B1}$ | $R^{C30}$ | $R^{E8}$ | $R^{B18}$ |
| $L_{A4776}$ | $R^{B1}$ | $R^{C30}$ | $R^{E9}$ | $R^{B18}$ |
| $L_{A4777}$ | $R^{B1}$ | $R^{C30}$ | $R^{E10}$ | $R^{B18}$ |
| $L_{A4778}$ | $R^{B1}$ | $R^{C30}$ | $R^{E11}$ | $R^{B18}$ |
| $L_{A4779}$ | $R^{B1}$ | $R^{C30}$ | $R^{E12}$ | $R^{B18}$ |
| $L_{A4780}$ | $R^{B1}$ | $R^{C30}$ | $R^{E13}$ | $R^{B18}$ |
| $L_{A4781}$ | $R^{B1}$ | $R^{C30}$ | $R^{E14}$ | $R^{B18}$ |
| $L_{A4782}$ | $R^{B1}$ | $R^{C30}$ | $R^{E15}$ | $R^{B18}$ |
| $L_{A4783}$ | $R^{B1}$ | $R^{C30}$ | $R^{E16}$ | $R^{B18}$ |
| $L_{A4784}$ | $R^{B1}$ | $R^{C30}$ | $R^{E17}$ | $R^{B18}$ |
| $L_{A4785}$ | $R^{B1}$ | $R^{C30}$ | $R^{E18}$ | $R^{B18}$ |
| $L_{A4786}$ | $R^{B1}$ | $R^{C30}$ | $R^{E19}$ | $R^{B18}$ |
| $L_{A4787}$ | $R^{B1}$ | $R^{C30}$ | $R^{E20}$ | $R^{B18}$ |
| $L_{A4788}$ | $R^{B1}$ | $R^{C30}$ | $R^{E21}$ | $R^{B18}$ |

-continued

| Ligand | $R^1$ | $R^2$ | $R^3$ | $R^4$ |
|---|---|---|---|---|
| $L_{A4789}$ | $R^{B1}$ | $R^{C30}$ | $R^{B3}$ | $R^{A3}$ |
| $L_{A4790}$ | $R^{B1}$ | $R^{C30}$ | $R^{B6}$ | $R^{A3}$ |
| $L_{A4791}$ | $R^{B1}$ | $R^{C30}$ | $R^{B7}$ | $R^{A3}$ |
| $L_{A4792}$ | $R^{B1}$ | $R^{C30}$ | $R^{B12}$ | $R^{A3}$ |
| $L_{A4793}$ | $R^{B1}$ | $R^{C30}$ | $R^{B20}$ | $R^{A3}$ |
| $L_{A4794}$ | $R^{B1}$ | $R^{C30}$ | $R^{B25}$ | $R^{A3}$ |
| $L_{A4795}$ | $R^{B1}$ | $R^{C30}$ | $R^{B29}$ | $R^{A3}$ |
| $L_{A4796}$ | $R^{B1}$ | $R^{C30}$ | $R^{A37}$ | $R^{A3}$ |
| $L_{A4797}$ | $R^{B1}$ | $R^{C30}$ | $R^{A43}$ | $R^{A3}$ |
| $L_{A4798}$ | $R^{B1}$ | $R^{C30}$ | $R^{E1}$ | $R^{A3}$ |
| $L_{A4799}$ | $R^{B1}$ | $R^{C30}$ | $R^{E2}$ | $R^{A3}$ |
| $L_{A4800}$ | $R^{B1}$ | $R^{C30}$ | $R^{E3}$ | $R^{A3}$ |
| $L_{A4801}$ | $R^{B1}$ | $R^{C30}$ | $R^{E4}$ | $R^{A3}$ |
| $L_{A4802}$ | $R^{B1}$ | $R^{C30}$ | $R^{E5}$ | $R^{A3}$ |
| $L_{A4803}$ | $R^{B1}$ | $R^{C30}$ | $R^{E6}$ | $R^{A3}$ |
| $L_{A4804}$ | $R^{B1}$ | $R^{C30}$ | $R^{E7}$ | $R^{A3}$ |
| $L_{A4805}$ | $R^{B1}$ | $R^{C30}$ | $R^{E8}$ | $R^{A3}$ |
| $L_{A4806}$ | $R^{B1}$ | $R^{C30}$ | $R^{E9}$ | $R^{A3}$ |
| $L_{A4807}$ | $R^{B1}$ | $R^{C30}$ | $R^{E10}$ | $R^{A3}$ |
| $L_{A4808}$ | $R^{B1}$ | $R^{C30}$ | $R^{E11}$ | $R^{A3}$ |
| $L_{A4809}$ | $R^{B1}$ | $R^{C30}$ | $R^{E12}$ | $R^{A3}$ |
| $L_{A4810}$ | $R^{B1}$ | $R^{C30}$ | $R^{E13}$ | $R^{A3}$ |
| $L_{A4811}$ | $R^{B1}$ | $R^{C30}$ | $R^{E14}$ | $R^{A3}$ |
| $L_{A4812}$ | $R^{B1}$ | $R^{C30}$ | $R^{E15}$ | $R^{A3}$ |
| $L_{A4813}$ | $R^{B1}$ | $R^{C30}$ | $R^{E16}$ | $R^{A3}$ |
| $L_{A4814}$ | $R^{B1}$ | $R^{C30}$ | $R^{E17}$ | $R^{A3}$ |
| $L_{A4815}$ | $R^{B1}$ | $R^{C30}$ | $R^{E18}$ | $R^{A3}$ |
| $L_{A4816}$ | $R^{B1}$ | $R^{C30}$ | $R^{E19}$ | $R^{A3}$ |
| $L_{A4817}$ | $R^{B1}$ | $R^{C30}$ | $R^{E20}$ | $R^{A3}$ |
| $L_{A4818}$ | $R^{B1}$ | $R^{C30}$ | $R^{E21}$ | $R^{A3}$ |
| $L_{A4819}$ | $R^{B1}$ | $R^{C30}$ | $R^{B3}$ | $R^{A34}$ |
| $L_{A4820}$ | $R^{B1}$ | $R^{C30}$ | $R^{B6}$ | $R^{A34}$ |
| $L_{A4821}$ | $R^{B1}$ | $R^{C30}$ | $R^{B7}$ | $R^{A34}$ |
| $L_{A4822}$ | $R^{B1}$ | $R^{C30}$ | $R^{B12}$ | $R^{A34}$ |
| $L_{A4823}$ | $R^{B1}$ | $R^{C30}$ | $R^{B20}$ | $R^{A34}$ |
| $L_{A4824}$ | $R^{B1}$ | $R^{C30}$ | $R^{B25}$ | $R^{A34}$ |
| $L_{A4825}$ | $R^{B1}$ | $R^{C30}$ | $R^{B29}$ | $R^{A34}$ |
| $L_{A4826}$ | $R^{B1}$ | $R^{C30}$ | $R^{A37}$ | $R^{A34}$ |
| $L_{A4827}$ | $R^{B1}$ | $R^{C30}$ | $R^{A43}$ | $R^{A34}$ |
| $L_{A4828}$ | $R^{B1}$ | $R^{C30}$ | $R^{E1}$ | $R^{A34}$ |
| $L_{A4829}$ | $R^{B1}$ | $R^{C30}$ | $R^{E2}$ | $R^{A34}$ |
| $L_{A4830}$ | $R^{B1}$ | $R^{C30}$ | $R^{E3}$ | $R^{A34}$ |
| $L_{A4831}$ | $R^{B1}$ | $R^{C30}$ | $R^{E4}$ | $R^{A34}$ |
| $L_{A4832}$ | $R^{B1}$ | $R^{C30}$ | $R^{E5}$ | $R^{A34}$ |
| $L_{A4833}$ | $R^{B1}$ | $R^{C30}$ | $R^{E6}$ | $R^{A34}$ |
| $L_{A4834}$ | $R^{B1}$ | $R^{C30}$ | $R^{E7}$ | $R^{A34}$ |
| $L_{A4835}$ | $R^{B1}$ | $R^{C30}$ | $R^{E8}$ | $R^{A34}$ |
| $L_{A4836}$ | $R^{B1}$ | $R^{C30}$ | $R^{E9}$ | $R^{A34}$ |
| $L_{A4837}$ | $R^{B1}$ | $R^{C30}$ | $R^{E10}$ | $R^{A34}$ |
| $L_{A4838}$ | $R^{B1}$ | $R^{C30}$ | $R^{E11}$ | $R^{A34}$ |
| $L_{A4839}$ | $R^{B1}$ | $R^{C30}$ | $R^{E12}$ | $R^{A34}$ |
| $L_{A4840}$ | $R^{B1}$ | $R^{C30}$ | $R^{E13}$ | $R^{A34}$ |
| $L_{A4841}$ | $R^{B1}$ | $R^{C30}$ | $R^{E14}$ | $R^{A34}$ |
| $L_{A4842}$ | $R^{B1}$ | $R^{C30}$ | $R^{E15}$ | $R^{A34}$ |
| $L_{A4843}$ | $R^{B1}$ | $R^{C30}$ | $R^{E16}$ | $R^{A34}$ |
| $L_{A4844}$ | $R^{B1}$ | $R^{C30}$ | $R^{E17}$ | $R^{A34}$ |
| $L_{A4845}$ | $R^{B1}$ | $R^{C30}$ | $R^{E18}$ | $R^{A34}$ |
| $L_{A4846}$ | $R^{B1}$ | $R^{C30}$ | $R^{E19}$ | $R^{A34}$ |
| $L_{A4847}$ | $R^{B1}$ | $R^{C30}$ | $R^{E20}$ | $R^{A34}$ |
| $L_{A4848}$ | $R^{B1}$ | $R^{C30}$ | $R^{E21}$ | $R^{A34}$ |
| $L_{A4849}$ | $R^{B1}$ | $R^{C30}$ | $R^{B3}$ | $R^{A52}$ |
| $L_{A4850}$ | $R^{B1}$ | $R^{C30}$ | $R^{B6}$ | $R^{A52}$ |
| $L_{A4851}$ | $R^{B1}$ | $R^{C30}$ | $R^{B7}$ | $R^{A52}$ |
| $L_{A4852}$ | $R^{B1}$ | $R^{C30}$ | $R^{B12}$ | $R^{A52}$ |
| $L_{A4853}$ | $R^{B1}$ | $R^{C30}$ | $R^{B20}$ | $R^{A52}$ |
| $L_{A4854}$ | $R^{B1}$ | $R^{C30}$ | $R^{B25}$ | $R^{A52}$ |
| $L_{A4855}$ | $R^{B1}$ | $R^{C30}$ | $R^{B29}$ | $R^{A52}$ |
| $L_{A4856}$ | $R^{B1}$ | $R^{C30}$ | $R^{A37}$ | $R^{A52}$ |
| $L_{A4857}$ | $R^{B1}$ | $R^{C30}$ | $R^{A43}$ | $R^{A52}$ |
| $L_{A4858}$ | $R^{B1}$ | $R^{C30}$ | $R^{E1}$ | $R^{A52}$ |
| $L_{A4859}$ | $R^{B1}$ | $R^{C30}$ | $R^{E2}$ | $R^{A52}$ |
| $L_{A4860}$ | $R^{B1}$ | $R^{C30}$ | $R^{E3}$ | $R^{A52}$ |
| $L_{A4861}$ | $R^{B1}$ | $R^{C30}$ | $R^{E4}$ | $R^{A52}$ |
| $L_{A4862}$ | $R^{B1}$ | $R^{C30}$ | $R^{E5}$ | $R^{A52}$ |
| $L_{A4863}$ | $R^{B1}$ | $R^{C30}$ | $R^{E6}$ | $R^{A52}$ |
| $L_{A4864}$ | $R^{B1}$ | $R^{C30}$ | $R^{E7}$ | $R^{A52}$ |
| $L_{A4865}$ | $R^{B1}$ | $R^{C30}$ | $R^{E8}$ | $R^{A52}$ |

-continued

| Ligand | $R^1$ | $R^2$ | $R^3$ | $R^4$ |
|---|---|---|---|---|
| $L_{A4866}$ | $R^{B1}$ | $R^{C30}$ | $R^{E9}$ | $R^{A52}$ |
| $L_{A4867}$ | $R^{B1}$ | $R^{C30}$ | $R^{E10}$ | $R^{A52}$ |
| $L_{A4868}$ | $R^{B1}$ | $R^{C30}$ | $R^{E11}$ | $R^{A52}$ |
| $L_{A4869}$ | $R^{B1}$ | $R^{C30}$ | $R^{E12}$ | $R^{A52}$ |
| $L_{A4870}$ | $R^{B1}$ | $R^{C30}$ | $R^{E13}$ | $R^{A52}$ |
| $L_{A4871}$ | $R^{B1}$ | $R^{C30}$ | $R^{E14}$ | $R^{A52}$ |
| $L_{A4872}$ | $R^{B1}$ | $R^{C30}$ | $R^{E15}$ | $R^{A52}$ |
| $L_{A4873}$ | $R^{B1}$ | $R^{C30}$ | $R^{E16}$ | $R^{A52}$ |
| $L_{A4874}$ | $R^{B1}$ | $R^{C30}$ | $R^{E17}$ | $R^{A52}$ |
| $L_{A4875}$ | $R^{B1}$ | $R^{C30}$ | $R^{E18}$ | $R^{A52}$ |
| $L_{A4876}$ | $R^{B1}$ | $R^{C30}$ | $R^{E19}$ | $R^{A52}$ |
| $L_{A4877}$ | $R^{B1}$ | $R^{C30}$ | $R^{E20}$ | $R^{A52}$ |
| $L_{A4878}$ | $R^{B1}$ | $R^{C30}$ | $R^{E21}$ | $R^{A52}$ |

$L_{A4879}$ through $L_{A6138}$ that are based on a structure of Formula XIII,

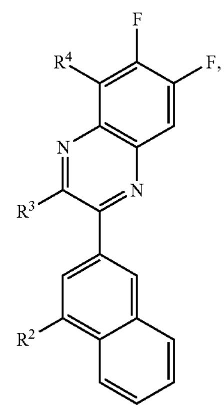

in which $R^2$, $R^3$, and $R^4$ are defined as:

| Ligand | $R^2$ | $R^3$ | $R^4$ |
|---|---|---|---|
| $L_{A4879}$ | $R^{C1}$ | $R^{B3}$ | H |
| $L_{A4880}$ | $R^{C1}$ | $R^{B6}$ | H |
| $L_{A4881}$ | $R^{C1}$ | $R^{B7}$ | H |
| $L_{A4882}$ | $R^{C1}$ | $R^{B12}$ | H |
| $L_{A4883}$ | $R^{C1}$ | $R^{B20}$ | H |
| $L_{A4884}$ | $R^{C1}$ | $R^{B25}$ | H |
| $L_{A4885}$ | $R^{C1}$ | $R^{B29}$ | H |
| $L_{A4886}$ | $R^{C1}$ | $R^{A37}$ | H |
| $L_{A4887}$ | $R^{C1}$ | $R^{A43}$ | H |
| $L_{A4888}$ | $R^{C1}$ | $R^{E1}$ | H |
| $L_{A4889}$ | $R^{C1}$ | $R^{E2}$ | H |
| $L_{A4890}$ | $R^{C1}$ | $R^{E3}$ | H |
| $L_{A4891}$ | $R^{C1}$ | $R^{E4}$ | H |
| $L_{A4892}$ | $R^{C1}$ | $R^{E5}$ | H |
| $L_{A4893}$ | $R^{C1}$ | $R^{E6}$ | H |
| $L_{A4894}$ | $R^{C1}$ | $R^{E7}$ | H |
| $L_{A4895}$ | $R^{C1}$ | $R^{E8}$ | H |
| $L_{A4896}$ | $R^{C1}$ | $R^{E9}$ | H |
| $L_{A4897}$ | $R^{C1}$ | $R^{E10}$ | H |
| $L_{A4898}$ | $R^{C1}$ | $R^{E11}$ | H |
| $L_{A4899}$ | $R^{C1}$ | $R^{E12}$ | H |
| $L_{A4900}$ | $R^{C1}$ | $R^{E13}$ | H |
| $L_{A4901}$ | $R^{C1}$ | $R^{E14}$ | H |
| $L_{A4902}$ | $R^{C1}$ | $R^{E15}$ | H |
| $L_{A4903}$ | $R^{C1}$ | $R^{E16}$ | H |
| $L_{A4904}$ | $R^{C1}$ | $R^{E17}$ | H |
| $L_{A4905}$ | $R^{C1}$ | $R^{E18}$ | H |
| $L_{A4906}$ | $R^{C1}$ | $R^{E19}$ | H |
| $L_{A4907}$ | $R^{C1}$ | $R^{E20}$ | H |
| $L_{A4908}$ | $R^{C1}$ | $R^{E21}$ | H |
| $L_{A4909}$ | $R^{C1}$ | $R^{B3}$ | $R^{B3}$ |
| $L_{A4910}$ | $R^{C1}$ | $R^{B6}$ | $R^{B3}$ |

-continued

| Ligand | $R^2$ | $R^3$ | $R^4$ |
|---|---|---|---|
| $L_{A4911}$ | $R^{C1}$ | $R^{B7}$ | $R^{B3}$ |
| $L_{A4912}$ | $R^{C1}$ | $R^{B12}$ | $R^{B3}$ |
| $L_{A4913}$ | $R^{C1}$ | $R^{B20}$ | $R^{B3}$ |
| $L_{A4914}$ | $R^{C1}$ | $R^{B25}$ | $R^{B3}$ |
| $L_{A4915}$ | $R^{C1}$ | $R^{B29}$ | $R^{B3}$ |
| $L_{A4916}$ | $R^{C1}$ | $R^{A37}$ | $R^{B3}$ |
| $L_{A4917}$ | $R^{C1}$ | $R^{A43}$ | $R^{B3}$ |
| $L_{A4918}$ | $R^{C1}$ | $R^{E1}$ | $R^{B3}$ |
| $L_{A4919}$ | $R^{C1}$ | $R^{E2}$ | $R^{B3}$ |
| $L_{A4920}$ | $R^{C1}$ | $R^{E3}$ | $R^{B3}$ |
| $L_{A4921}$ | $R^{C1}$ | $R^{E4}$ | $R^{B3}$ |
| $L_{A4922}$ | $R^{C1}$ | $R^{E5}$ | $R^{B3}$ |
| $L_{A4923}$ | $R^{C1}$ | $R^{E6}$ | $R^{B3}$ |
| $L_{A4924}$ | $R^{C1}$ | $R^{E7}$ | $R^{B3}$ |
| $L_{A4925}$ | $R^{C1}$ | $R^{E8}$ | $R^{B3}$ |
| $L_{A4926}$ | $R^{C1}$ | $R^{E9}$ | $R^{B3}$ |
| $L_{A4927}$ | $R^{C1}$ | $R^{E10}$ | $R^{B3}$ |
| $L_{A4928}$ | $R^{C1}$ | $R^{E11}$ | $R^{B3}$ |
| $L_{A4929}$ | $R^{C1}$ | $R^{E12}$ | $R^{B3}$ |
| $L_{A4930}$ | $R^{C1}$ | $R^{E13}$ | $R^{B3}$ |
| $L_{A4931}$ | $R^{C1}$ | $R^{E14}$ | $R^{B3}$ |
| $L_{A4932}$ | $R^{C1}$ | $R^{E15}$ | $R^{B3}$ |
| $L_{A4933}$ | $R^{C1}$ | $R^{E16}$ | $R^{B3}$ |
| $L_{A4934}$ | $R^{C1}$ | $R^{E17}$ | $R^{B3}$ |
| $L_{A4935}$ | $R^{C1}$ | $R^{E18}$ | $R^{B3}$ |
| $L_{A4936}$ | $R^{C1}$ | $R^{E19}$ | $R^{B3}$ |
| $L_{A4937}$ | $R^{C1}$ | $R^{E20}$ | $R^{B3}$ |
| $L_{A4938}$ | $R^{C1}$ | $R^{E21}$ | $R^{B3}$ |
| $L_{A4939}$ | $R^{C1}$ | $R^{B3}$ | $R^{B4}$ |
| $L_{A4940}$ | $R^{C1}$ | $R^{B6}$ | $R^{B4}$ |
| $L_{A4941}$ | $R^{C1}$ | $R^{B7}$ | $R^{B4}$ |
| $L_{A4942}$ | $R^{C1}$ | $R^{B12}$ | $R^{B4}$ |
| $L_{A4943}$ | $R^{C1}$ | $R^{B20}$ | $R^{B4}$ |
| $L_{A4944}$ | $R^{C1}$ | $R^{B25}$ | $R^{B4}$ |
| $L_{A4945}$ | $R^{C1}$ | $R^{B29}$ | $R^{B4}$ |
| $L_{A4946}$ | $R^{C1}$ | $R^{A37}$ | $R^{B4}$ |
| $L_{A4947}$ | $R^{C1}$ | $R^{A43}$ | $R^{B4}$ |
| $L_{A4948}$ | $R^{C1}$ | $R^{E1}$ | $R^{B4}$ |
| $L_{A4949}$ | $R^{C1}$ | $R^{E2}$ | $R^{B4}$ |
| $L_{A4950}$ | $R^{C1}$ | $R^{E3}$ | $R^{B4}$ |
| $L_{A4951}$ | $R^{C1}$ | $R^{E4}$ | $R^{B4}$ |
| $L_{A4952}$ | $R^{C1}$ | $R^{E5}$ | $R^{B4}$ |
| $L_{A4953}$ | $R^{C1}$ | $R^{E6}$ | $R^{B4}$ |
| $L_{A4954}$ | $R^{C1}$ | $R^{E7}$ | $R^{B4}$ |
| $L_{A4955}$ | $R^{C1}$ | $R^{E8}$ | $R^{B4}$ |
| $L_{A4956}$ | $R^{C1}$ | $R^{E9}$ | $R^{B4}$ |
| $L_{A4957}$ | $R^{C1}$ | $R^{E10}$ | $R^{B4}$ |
| $L_{A4958}$ | $R^{C1}$ | $R^{E11}$ | $R^{B4}$ |
| $L_{A4959}$ | $R^{C1}$ | $R^{E12}$ | $R^{B4}$ |
| $L_{A4960}$ | $R^{C1}$ | $R^{E13}$ | $R^{B4}$ |
| $L_{A4961}$ | $R^{C1}$ | $R^{E14}$ | $R^{B4}$ |
| $L_{A4962}$ | $R^{C1}$ | $R^{E15}$ | $R^{B4}$ |
| $L_{A4963}$ | $R^{C1}$ | $R^{E16}$ | $R^{B4}$ |
| $L_{A4964}$ | $R^{C1}$ | $R^{E17}$ | $R^{B4}$ |
| $L_{A4965}$ | $R^{C1}$ | $R^{E18}$ | $R^{B4}$ |
| $L_{A4966}$ | $R^{C1}$ | $R^{E19}$ | $R^{B4}$ |
| $L_{A4967}$ | $R^{C1}$ | $R^{E20}$ | $R^{B4}$ |
| $L_{A4968}$ | $R^{C1}$ | $R^{E21}$ | $R^{B4}$ |
| $L_{A4969}$ | $R^{C1}$ | $R^{B3}$ | $R^{B18}$ |
| $L_{A4970}$ | $R^{C1}$ | $R^{B6}$ | $R^{B18}$ |
| $L_{A4971}$ | $R^{C1}$ | $R^{B7}$ | $R^{B18}$ |
| $L_{A4972}$ | $R^{C1}$ | $R^{B12}$ | $R^{B18}$ |
| $L_{A4973}$ | $R^{C1}$ | $R^{B20}$ | $R^{B18}$ |
| $L_{A4974}$ | $R^{C1}$ | $R^{B25}$ | $R^{B18}$ |
| $L_{A4975}$ | $R^{C1}$ | $R^{B29}$ | $R^{B18}$ |
| $L_{A4976}$ | $R^{C1}$ | $R^{A37}$ | $R^{B18}$ |
| $L_{A4977}$ | $R^{C1}$ | $R^{A43}$ | $R^{B18}$ |
| $L_{A4978}$ | $R^{C1}$ | $R^{E1}$ | $R^{B18}$ |
| $L_{A4979}$ | $R^{C1}$ | $R^{E2}$ | $R^{B18}$ |
| $L_{A4980}$ | $R^{C1}$ | $R^{E3}$ | $R^{B18}$ |
| $L_{A4981}$ | $R^{C1}$ | $R^{E4}$ | $R^{B18}$ |
| $L_{A4982}$ | $R^{C1}$ | $R^{E5}$ | $R^{B18}$ |
| $L_{A4983}$ | $R^{C1}$ | $R^{E6}$ | $R^{B18}$ |
| $L_{A4984}$ | $R^{C1}$ | $R^{E7}$ | $R^{B18}$ |
| $L_{A4985}$ | $R^{C1}$ | $R^{E8}$ | $R^{B18}$ |
| $L_{A4986}$ | $R^{C1}$ | $R^{E9}$ | $R^{B18}$ |
| $L_{A4987}$ | $R^{C1}$ | $R^{E10}$ | $R^{B18}$ |
| $L_{A4988}$ | $R^{C1}$ | $R^{E11}$ | $R^{B18}$ |
| $L_{A4989}$ | $R^{C1}$ | $R^{E12}$ | $R^{B18}$ |
| $L_{A4990}$ | $R^{C1}$ | $R^{E13}$ | $R^{B18}$ |
| $L_{A4991}$ | $R^{C1}$ | $R^{E14}$ | $R^{B18}$ |
| $L_{A4992}$ | $R^{C1}$ | $R^{E15}$ | $R^{B18}$ |
| $L_{A4993}$ | $R^{C1}$ | $R^{E16}$ | $R^{B18}$ |
| $L_{A4994}$ | $R^{C1}$ | $R^{E17}$ | $R^{B18}$ |
| $L_{A4995}$ | $R^{C1}$ | $R^{E18}$ | $R^{B18}$ |
| $L_{A4996}$ | $R^{C1}$ | $R^{E19}$ | $R^{B18}$ |
| $L_{A4997}$ | $R^{C1}$ | $R^{E20}$ | $R^{B18}$ |
| $L_{A4998}$ | $R^{C1}$ | $R^{E21}$ | $R^{B18}$ |
| $L_{A4999}$ | $R^{C1}$ | $R^{B3}$ | $R^{A3}$ |
| $L_{A5000}$ | $R^{C1}$ | $R^{B6}$ | $R^{A3}$ |
| $L_{A5001}$ | $R^{C1}$ | $R^{B7}$ | $R^{A3}$ |
| $L_{A5002}$ | $R^{C1}$ | $R^{B12}$ | $R^{A3}$ |
| $L_{A5003}$ | $R^{C1}$ | $R^{B20}$ | $R^{A3}$ |
| $L_{A5004}$ | $R^{C1}$ | $R^{B25}$ | $R^{A3}$ |
| $L_{A5005}$ | $R^{C1}$ | $R^{B29}$ | $R^{A3}$ |
| $L_{A5006}$ | $R^{C1}$ | $R^{A37}$ | $R^{A3}$ |
| $L_{A5007}$ | $R^{C1}$ | $R^{A43}$ | $R^{A3}$ |
| $L_{A5008}$ | $R^{C1}$ | $R^{E1}$ | $R^{A3}$ |
| $L_{A5009}$ | $R^{C1}$ | $R^{E2}$ | $R^{A3}$ |
| $L_{A5010}$ | $R^{C1}$ | $R^{E3}$ | $R^{A3}$ |
| $L_{A5011}$ | $R^{C1}$ | $R^{E4}$ | $R^{A3}$ |
| $L_{A5012}$ | $R^{C1}$ | $R^{E5}$ | $R^{A3}$ |
| $L_{A5013}$ | $R^{C1}$ | $R^{E6}$ | $R^{A3}$ |
| $L_{A5014}$ | $R^{C1}$ | $R^{E7}$ | $R^{A3}$ |
| $L_{A5015}$ | $R^{C1}$ | $R^{E8}$ | $R^{A3}$ |
| $L_{A5016}$ | $R^{C1}$ | $R^{E9}$ | $R^{A3}$ |
| $L_{A5017}$ | $R^{C1}$ | $R^{E10}$ | $R^{A3}$ |
| $L_{A5018}$ | $R^{C1}$ | $R^{E11}$ | $R^{A3}$ |
| $L_{A5019}$ | $R^{C1}$ | $R^{E12}$ | $R^{A3}$ |
| $L_{A5020}$ | $R^{C1}$ | $R^{E13}$ | $R^{A3}$ |
| $L_{A5021}$ | $R^{C1}$ | $R^{E14}$ | $R^{A3}$ |
| $L_{A5022}$ | $R^{C1}$ | $R^{E15}$ | $R^{A3}$ |
| $L_{A5023}$ | $R^{C1}$ | $R^{E16}$ | $R^{A3}$ |
| $L_{A5024}$ | $R^{C1}$ | $R^{E17}$ | $R^{A3}$ |
| $L_{A5025}$ | $R^{C1}$ | $R^{E18}$ | $R^{A3}$ |
| $L_{A5026}$ | $R^{C1}$ | $R^{E19}$ | $R^{A3}$ |
| $L_{A5027}$ | $R^{C1}$ | $R^{E20}$ | $R^{A3}$ |
| $L_{A5028}$ | $R^{C1}$ | $R^{E21}$ | $R^{A3}$ |
| $L_{A5029}$ | $R^{C1}$ | $R^{B3}$ | $R^{A34}$ |
| $L_{A5030}$ | $R^{C1}$ | $R^{B6}$ | $R^{A34}$ |
| $L_{A5031}$ | $R^{C1}$ | $R^{B7}$ | $R^{A34}$ |
| $L_{A5032}$ | $R^{C1}$ | $R^{B12}$ | $R^{A34}$ |
| $L_{A5033}$ | $R^{C1}$ | $R^{B20}$ | $R^{A34}$ |
| $L_{A5034}$ | $R^{C1}$ | $R^{B25}$ | $R^{A34}$ |
| $L_{A5035}$ | $R^{C1}$ | $R^{B29}$ | $R^{A34}$ |
| $L_{A5036}$ | $R^{C1}$ | $R^{A37}$ | $R^{A34}$ |
| $L_{A5037}$ | $R^{C1}$ | $R^{A43}$ | $R^{A34}$ |
| $L_{A5038}$ | $R^{C1}$ | $R^{E1}$ | $R^{A34}$ |
| $L_{A5039}$ | $R^{C1}$ | $R^{E2}$ | $R^{A34}$ |
| $L_{A5040}$ | $R^{C1}$ | $R^{E3}$ | $R^{A34}$ |
| $L_{A5041}$ | $R^{C1}$ | $R^{E4}$ | $R^{A34}$ |
| $L_{A5042}$ | $R^{C1}$ | $R^{E5}$ | $R^{A34}$ |
| $L_{A5043}$ | $R^{C1}$ | $R^{E6}$ | $R^{A34}$ |
| $L_{A5044}$ | $R^{C1}$ | $R^{E7}$ | $R^{A34}$ |
| $L_{A5045}$ | $R^{C1}$ | $R^{E8}$ | $R^{A34}$ |
| $L_{A5046}$ | $R^{C1}$ | $R^{E9}$ | $R^{A34}$ |
| $L_{A5047}$ | $R^{C1}$ | $R^{E10}$ | $R^{A34}$ |
| $L_{A5048}$ | $R^{C1}$ | $R^{E11}$ | $R^{A34}$ |
| $L_{A5049}$ | $R^{C1}$ | $R^{E12}$ | $R^{A34}$ |
| $L_{A5050}$ | $R^{C1}$ | $R^{E13}$ | $R^{A34}$ |
| $L_{A5051}$ | $R^{C1}$ | $R^{E14}$ | $R^{A34}$ |
| $L_{A5052}$ | $R^{C1}$ | $R^{E15}$ | $R^{A34}$ |
| $L_{A5053}$ | $R^{C1}$ | $R^{E16}$ | $R^{A34}$ |
| $L_{A5054}$ | $R^{C1}$ | $R^{E17}$ | $R^{A34}$ |
| $L_{A5055}$ | $R^{C1}$ | $R^{E18}$ | $R^{A34}$ |
| $L_{A5056}$ | $R^{C1}$ | $R^{E19}$ | $R^{A34}$ |
| $L_{A5057}$ | $R^{C1}$ | $R^{E20}$ | $R^{A34}$ |
| $L_{A5058}$ | $R^{C1}$ | $R^{E21}$ | $R^{A34}$ |
| $L_{A5059}$ | $R^{C1}$ | $R^{B3}$ | $R^{A52}$ |
| $L_{A5060}$ | $R^{C1}$ | $R^{B6}$ | $R^{A52}$ |
| $L_{A5061}$ | $R^{C1}$ | $R^{B7}$ | $R^{A52}$ |
| $L_{A5062}$ | $R^{C1}$ | $R^{B12}$ | $R^{A52}$ |
| $L_{A5063}$ | $R^{C1}$ | $R^{B20}$ | $R^{A52}$ |
| $L_{A5064}$ | $R^{C1}$ | $R^{B25}$ | $R^{A52}$ |

-continued

| Ligand | $R^2$ | $R^3$ | $R^4$ |
|---|---|---|---|
| $L_{A5065}$ | $R^{C1}$ | $R^{B29}$ | $R^{A52}$ |
| $L_{A5066}$ | $R^{C1}$ | $R^{A37}$ | $R^{A52}$ |
| $L_{A5067}$ | $R^{C1}$ | $R^{A43}$ | $R^{A52}$ |
| $L_{A5068}$ | $R^{C1}$ | $R^{E1}$ | $R^{A52}$ |
| $L_{A5069}$ | $R^{C1}$ | $R^{E2}$ | $R^{A52}$ |
| $L_{A5070}$ | $R^{C1}$ | $R^{E3}$ | $R^{A52}$ |
| $L_{A5071}$ | $R^{C1}$ | $R^{E4}$ | $R^{A52}$ |
| $L_{A5072}$ | $R^{C1}$ | $R^{E5}$ | $R^{A52}$ |
| $L_{A5073}$ | $R^{C1}$ | $R^{E6}$ | $R^{A52}$ |
| $L_{A5074}$ | $R^{C1}$ | $R^{E7}$ | $R^{A52}$ |
| $L_{A5075}$ | $R^{C1}$ | $R^{E8}$ | $R^{A52}$ |
| $L_{A5076}$ | $R^{C1}$ | $R^{E9}$ | $R^{A52}$ |
| $L_{A5077}$ | $R^{C1}$ | $R^{E10}$ | $R^{A52}$ |
| $L_{A5078}$ | $R^{C1}$ | $R^{E11}$ | $R^{A52}$ |
| $L_{A5079}$ | $R^{C1}$ | $R^{E12}$ | $R^{A52}$ |
| $L_{A5080}$ | $R^{C1}$ | $R^{E13}$ | $R^{A52}$ |
| $L_{A5081}$ | $R^{C1}$ | $R^{E14}$ | $R^{A52}$ |
| $L_{A5082}$ | $R^{C1}$ | $R^{E15}$ | $R^{A52}$ |
| $L_{A5083}$ | $R^{C1}$ | $R^{E16}$ | $R^{A52}$ |
| $L_{A5084}$ | $R^{C1}$ | $R^{E17}$ | $R^{A52}$ |
| $L_{A5085}$ | $R^{C1}$ | $R^{E18}$ | $R^{A52}$ |
| $L_{A5086}$ | $R^{C1}$ | $R^{E19}$ | $R^{A52}$ |
| $L_{A5087}$ | $R^{C1}$ | $R^{E20}$ | $R^{A52}$ |
| $L_{A5088}$ | $R^{C1}$ | $R^{E21}$ | $R^{A52}$ |
| $L_{A5089}$ | $R^{C3}$ | $R^{B3}$ | H |
| $L_{A5090}$ | $R^{C3}$ | $R^{B6}$ | H |
| $L_{A5091}$ | $R^{C3}$ | $R^{B7}$ | H |
| $L_{A5092}$ | $R^{C3}$ | $R^{B12}$ | H |
| $L_{A5093}$ | $R^{C3}$ | $R^{B20}$ | H |
| $L_{A5094}$ | $R^{C3}$ | $R^{B25}$ | H |
| $L_{A5095}$ | $R^{C3}$ | $R^{B29}$ | H |
| $L_{A5096}$ | $R^{C3}$ | $R^{A37}$ | H |
| $L_{A5097}$ | $R^{C3}$ | $R^{A43}$ | H |
| $L_{A5098}$ | $R^{C3}$ | $R^{E1}$ | H |
| $L_{A5099}$ | $R^{C3}$ | $R^{E2}$ | H |
| $L_{A5100}$ | $R^{C3}$ | $R^{E3}$ | H |
| $L_{A5101}$ | $R^{C3}$ | $R^{E4}$ | H |
| $L_{A5102}$ | $R^{C3}$ | $R^{E5}$ | H |
| $L_{A5103}$ | $R^{C3}$ | $R^{E6}$ | H |
| $L_{A5104}$ | $R^{C3}$ | $R^{E7}$ | H |
| $L_{A5105}$ | $R^{C3}$ | $R^{E8}$ | H |
| $L_{A5106}$ | $R^{C3}$ | $R^{E9}$ | H |
| $L_{A5107}$ | $R^{C3}$ | $R^{E10}$ | H |
| $L_{A5108}$ | $R^{C3}$ | $R^{E11}$ | H |
| $L_{A5109}$ | $R^{C3}$ | $R^{E12}$ | H |
| $L_{A5110}$ | $R^{C3}$ | $R^{E13}$ | H |
| $L_{A5111}$ | $R^{C3}$ | $R^{E14}$ | H |
| $L_{A5112}$ | $R^{C3}$ | $R^{E15}$ | H |
| $L_{A5113}$ | $R^{C3}$ | $R^{E16}$ | H |
| $L_{A5114}$ | $R^{C3}$ | $R^{E17}$ | H |
| $L_{A5115}$ | $R^{C3}$ | $R^{E18}$ | H |
| $L_{A5116}$ | $R^{C3}$ | $R^{E19}$ | H |
| $L_{A5117}$ | $R^{C3}$ | $R^{E20}$ | H |
| $L_{A5118}$ | $R^{C3}$ | $R^{E21}$ | H |
| $L_{A5119}$ | $R^{C3}$ | $R^{B3}$ | $R^{B3}$ |
| $L_{A5120}$ | $R^{C3}$ | $R^{B6}$ | $R^{B3}$ |
| $L_{A5121}$ | $R^{C3}$ | $R^{B7}$ | $R^{B3}$ |
| $L_{A5122}$ | $R^{C3}$ | $R^{B12}$ | $R^{B3}$ |
| $L_{A5123}$ | $R^{C3}$ | $R^{B20}$ | $R^{B3}$ |
| $L_{A5124}$ | $R^{C3}$ | $R^{B25}$ | $R^{B3}$ |
| $L_{A5125}$ | $R^{C3}$ | $R^{B29}$ | $R^{B3}$ |
| $L_{A5126}$ | $R^{C3}$ | $R^{A37}$ | $R^{B3}$ |
| $L_{A5127}$ | $R^{C3}$ | $R^{A43}$ | $R^{B3}$ |
| $L_{A5128}$ | $R^{C3}$ | $R^{E1}$ | $R^{B3}$ |
| $L_{A5129}$ | $R^{C3}$ | $R^{E2}$ | $R^{B3}$ |
| $L_{A5130}$ | $R^{C3}$ | $R^{E3}$ | $R^{B3}$ |
| $L_{A5131}$ | $R^{C3}$ | $R^{E4}$ | $R^{B3}$ |
| $L_{A5132}$ | $R^{C3}$ | $R^{E5}$ | $R^{B3}$ |
| $L_{A5133}$ | $R^{C3}$ | $R^{E6}$ | $R^{B3}$ |
| $L_{A5134}$ | $R^{C3}$ | $R^{E7}$ | $R^{B3}$ |
| $L_{A5135}$ | $R^{C3}$ | $R^{E8}$ | $R^{B3}$ |
| $L_{A5136}$ | $R^{C3}$ | $R^{E9}$ | $R^{B3}$ |
| $L_{A5137}$ | $R^{C3}$ | $R^{E10}$ | $R^{B3}$ |
| $L_{A5138}$ | $R^{C3}$ | $R^{E11}$ | $R^{B3}$ |
| $L_{A5139}$ | $R^{C3}$ | $R^{E12}$ | $R^{B3}$ |
| $L_{A5140}$ | $R^{C3}$ | $R^{E13}$ | $R^{B3}$ |
| $L_{A5141}$ | $R^{C3}$ | $R^{E14}$ | $R^{B3}$ |
| $L_{A5142}$ | $R^{C3}$ | $R^{E15}$ | $R^{B3}$ |
| $L_{A5143}$ | $R^{C3}$ | $R^{E16}$ | $R^{B3}$ |
| $L_{A5144}$ | $R^{C3}$ | $R^{E17}$ | $R^{B3}$ |
| $L_{A5145}$ | $R^{C3}$ | $R^{E18}$ | $R^{B3}$ |
| $L_{A5146}$ | $R^{C3}$ | $R^{E19}$ | $R^{B3}$ |
| $L_{A5147}$ | $R^{C3}$ | $R^{E20}$ | $R^{B3}$ |
| $L_{A5148}$ | $R^{C3}$ | $R^{E21}$ | $R^{B3}$ |
| $L_{A5149}$ | $R^{C3}$ | $R^{B3}$ | $R^{B4}$ |
| $L_{A5150}$ | $R^{C3}$ | $R^{B6}$ | $R^{B4}$ |
| $L_{A5151}$ | $R^{C3}$ | $R^{B7}$ | $R^{B4}$ |
| $L_{A5152}$ | $R^{C3}$ | $R^{B12}$ | $R^{B4}$ |
| $L_{A5153}$ | $R^{C3}$ | $R^{B20}$ | $R^{B4}$ |
| $L_{A5154}$ | $R^{C3}$ | $R^{B25}$ | $R^{B4}$ |
| $L_{A5155}$ | $R^{C3}$ | $R^{B29}$ | $R^{B4}$ |
| $L_{A5156}$ | $R^{C3}$ | $R^{A37}$ | $R^{B4}$ |
| $L_{A5157}$ | $R^{C3}$ | $R^{A43}$ | $R^{B4}$ |
| $L_{A5158}$ | $R^{C3}$ | $R^{E1}$ | $R^{B4}$ |
| $L_{A5159}$ | $R^{C3}$ | $R^{E2}$ | $R^{B4}$ |
| $L_{A5160}$ | $R^{C3}$ | $R^{E3}$ | $R^{B4}$ |
| $L_{A5161}$ | $R^{C3}$ | $R^{E4}$ | $R^{B4}$ |
| $L_{A5162}$ | $R^{C3}$ | $R^{E5}$ | $R^{B4}$ |
| $L_{A5163}$ | $R^{C3}$ | $R^{E6}$ | $R^{B4}$ |
| $L_{A5164}$ | $R^{C3}$ | $R^{E7}$ | $R^{B4}$ |
| $L_{A5165}$ | $R^{C3}$ | $R^{E8}$ | $R^{B4}$ |
| $L_{A5166}$ | $R^{C3}$ | $R^{E9}$ | $R^{B4}$ |
| $L_{A5167}$ | $R^{C3}$ | $R^{E10}$ | $R^{B4}$ |
| $L_{A5168}$ | $R^{C3}$ | $R^{E11}$ | $R^{B4}$ |
| $L_{A5169}$ | $R^{C3}$ | $R^{E12}$ | $R^{B4}$ |
| $L_{A5170}$ | $R^{C3}$ | $R^{E13}$ | $R^{B4}$ |
| $L_{A5171}$ | $R^{C3}$ | $R^{E14}$ | $R^{B4}$ |
| $L_{A5172}$ | $R^{C3}$ | $R^{E15}$ | $R^{B4}$ |
| $L_{A5173}$ | $R^{C3}$ | $R^{E16}$ | $R^{B4}$ |
| $L_{A5174}$ | $R^{C3}$ | $R^{E17}$ | $R^{B4}$ |
| $L_{A5175}$ | $R^{C3}$ | $R^{E18}$ | $R^{B4}$ |
| $L_{A5176}$ | $R^{C3}$ | $R^{E19}$ | $R^{B4}$ |
| $L_{A5177}$ | $R^{C3}$ | $R^{E20}$ | $R^{B4}$ |
| $L_{A5178}$ | $R^{C3}$ | $R^{E21}$ | $R^{B4}$ |
| $L_{A5179}$ | $R^{C3}$ | $R^{B3}$ | $R^{B18}$ |
| $L_{A5180}$ | $R^{C3}$ | $R^{B6}$ | $R^{B18}$ |
| $L_{A5181}$ | $R^{C3}$ | $R^{B7}$ | $R^{B18}$ |
| $L_{A5182}$ | $R^{C3}$ | $R^{B12}$ | $R^{B18}$ |
| $L_{A5183}$ | $R^{C3}$ | $R^{B20}$ | $R^{B18}$ |
| $L_{A5184}$ | $R^{C3}$ | $R^{B25}$ | $R^{B18}$ |
| $L_{A5185}$ | $R^{C3}$ | $R^{B29}$ | $R^{B18}$ |
| $L_{A5186}$ | $R^{C3}$ | $R^{A37}$ | $R^{B18}$ |
| $L_{A5187}$ | $R^{C3}$ | $R^{A43}$ | $R^{B18}$ |
| $L_{A5188}$ | $R^{C3}$ | $R^{E1}$ | $R^{B18}$ |
| $L_{A5189}$ | $R^{C3}$ | $R^{E2}$ | $R^{B18}$ |
| $L_{A5190}$ | $R^{C3}$ | $R^{E3}$ | $R^{B18}$ |
| $L_{A5191}$ | $R^{C3}$ | $R^{E4}$ | $R^{B18}$ |
| $L_{A5192}$ | $R^{C3}$ | $R^{E5}$ | $R^{B18}$ |
| $L_{A5193}$ | $R^{C3}$ | $R^{E6}$ | $R^{B18}$ |
| $L_{A5194}$ | $R^{C3}$ | $R^{E7}$ | $R^{B18}$ |
| $L_{A5195}$ | $R^{C3}$ | $R^{E8}$ | $R^{B18}$ |
| $L_{A5196}$ | $R^{C3}$ | $R^{E9}$ | $R^{B18}$ |
| $L_{A5197}$ | $R^{C3}$ | $R^{E10}$ | $R^{B18}$ |
| $L_{A5198}$ | $R^{C3}$ | $R^{E11}$ | $R^{B18}$ |
| $L_{A5199}$ | $R^{C3}$ | $R^{E12}$ | $R^{B18}$ |
| $L_{A5200}$ | $R^{C3}$ | $R^{E13}$ | $R^{B18}$ |
| $L_{A5201}$ | $R^{C3}$ | $R^{E14}$ | $R^{B18}$ |
| $L_{A5202}$ | $R^{C3}$ | $R^{E15}$ | $R^{B18}$ |
| $L_{A5203}$ | $R^{C3}$ | $R^{E16}$ | $R^{B18}$ |
| $L_{A5204}$ | $R^{C3}$ | $R^{E17}$ | $R^{B18}$ |
| $L_{A5205}$ | $R^{C3}$ | $R^{E18}$ | $R^{B18}$ |
| $L_{A5206}$ | $R^{C3}$ | $R^{E19}$ | $R^{B18}$ |
| $L_{A5207}$ | $R^{C3}$ | $R^{E20}$ | $R^{B18}$ |
| $L_{A5208}$ | $R^{C3}$ | $R^{E21}$ | $R^{B18}$ |
| $L_{A5209}$ | $R^{C3}$ | $R^{B3}$ | $R^{A3}$ |
| $L_{A5210}$ | $R^{C3}$ | $R^{B6}$ | $R^{A3}$ |
| $L_{A5211}$ | $R^{C3}$ | $R^{B7}$ | $R^{A3}$ |
| $L_{A5212}$ | $R^{C3}$ | $R^{B12}$ | $R^{A3}$ |
| $L_{A5213}$ | $R^{C3}$ | $R^{B20}$ | $R^{A3}$ |
| $L_{A5214}$ | $R^{C3}$ | $R^{B25}$ | $R^{A3}$ |
| $L_{A5215}$ | $R^{C3}$ | $R^{B29}$ | $R^{A3}$ |
| $L_{A5216}$ | $R^{C3}$ | $R^{A37}$ | $R^{A3}$ |
| $L_{A5217}$ | $R^{C3}$ | $R^{A43}$ | $R^{A3}$ |
| $L_{A5218}$ | $R^{C3}$ | $R^{E1}$ | $R^{A3}$ |

-continued

| Ligand | $R^2$ | $R^3$ | $R^4$ |
|---|---|---|---|
| $L_{A5219}$ | $R^{C3}$ | $R^{E2}$ | $R^{A3}$ |
| $L_{A5220}$ | $R^{C3}$ | $R^{E3}$ | $R^{A3}$ |
| $L_{A5221}$ | $R^{C3}$ | $R^{E4}$ | $R^{A3}$ |
| $L_{A5222}$ | $R^{C3}$ | $R^{E5}$ | $R^{A3}$ |
| $L_{A5223}$ | $R^{C3}$ | $R^{E6}$ | $R^{A3}$ |
| $L_{A5224}$ | $R^{C3}$ | $R^{E7}$ | $R^{A3}$ |
| $L_{A5225}$ | $R^{C3}$ | $R^{E8}$ | $R^{A3}$ |
| $L_{A5226}$ | $R^{C3}$ | $R^{E9}$ | $R^{A3}$ |
| $L_{A5227}$ | $R^{C3}$ | $R^{E10}$ | $R^{A3}$ |
| $L_{A5228}$ | $R^{C3}$ | $R^{E11}$ | $R^{A3}$ |
| $L_{A5229}$ | $R^{C3}$ | $R^{E12}$ | $R^{A3}$ |
| $L_{A5230}$ | $R^{C3}$ | $R^{E13}$ | $R^{A3}$ |
| $L_{A5231}$ | $R^{C3}$ | $R^{E14}$ | $R^{A3}$ |
| $L_{A5232}$ | $R^{C3}$ | $R^{E15}$ | $R^{A3}$ |
| $L_{A5233}$ | $R^{C3}$ | $R^{E16}$ | $R^{A3}$ |
| $L_{A5234}$ | $R^{C3}$ | $R^{E17}$ | $R^{A3}$ |
| $L_{A5235}$ | $R^{C3}$ | $R^{E18}$ | $R^{A3}$ |
| $L_{A5236}$ | $R^{C3}$ | $R^{E19}$ | $R^{A3}$ |
| $L_{A5237}$ | $R^{C3}$ | $R^{E20}$ | $R^{A3}$ |
| $L_{A5238}$ | $R^{C3}$ | $R^{E21}$ | $R^{A3}$ |
| $L_{A5239}$ | $R^{C3}$ | $R^{B3}$ | $R^{A34}$ |
| $L_{A5240}$ | $R^{C3}$ | $R^{B6}$ | $R^{A34}$ |
| $L_{A5241}$ | $R^{C3}$ | $R^{B7}$ | $R^{A34}$ |
| $L_{A5242}$ | $R^{C3}$ | $R^{B12}$ | $R^{A34}$ |
| $L_{A5243}$ | $R^{C3}$ | $R^{B20}$ | $R^{A34}$ |
| $L_{A5244}$ | $R^{C3}$ | $R^{B25}$ | $R^{A34}$ |
| $L_{A5245}$ | $R^{C3}$ | $R^{B29}$ | $R^{A34}$ |
| $L_{A5246}$ | $R^{C3}$ | $R^{A37}$ | $R^{A34}$ |
| $L_{A5247}$ | $R^{C3}$ | $R^{A43}$ | $R^{A34}$ |
| $L_{A5248}$ | $R^{C3}$ | $R^{E1}$ | $R^{A34}$ |
| $L_{A5249}$ | $R^{C3}$ | $R^{E2}$ | $R^{A34}$ |
| $L_{A5250}$ | $R^{C3}$ | $R^{E3}$ | $R^{A34}$ |
| $L_{A5251}$ | $R^{C3}$ | $R^{E4}$ | $R^{A34}$ |
| $L_{A5252}$ | $R^{C3}$ | $R^{E5}$ | $R^{A34}$ |
| $L_{A5253}$ | $R^{C3}$ | $R^{E6}$ | $R^{A34}$ |
| $L_{A5254}$ | $R^{C3}$ | $R^{E7}$ | $R^{A34}$ |
| $L_{A5255}$ | $R^{C3}$ | $R^{E8}$ | $R^{A34}$ |
| $L_{A5256}$ | $R^{C3}$ | $R^{E9}$ | $R^{A34}$ |
| $L_{A5257}$ | $R^{C3}$ | $R^{E10}$ | $R^{A34}$ |
| $L_{A5258}$ | $R^{C3}$ | $R^{E11}$ | $R^{A34}$ |
| $L_{A5259}$ | $R^{C3}$ | $R^{E12}$ | $R^{A34}$ |
| $L_{A5260}$ | $R^{C3}$ | $R^{E13}$ | $R^{A34}$ |
| $L_{A5261}$ | $R^{C3}$ | $R^{E14}$ | $R^{A34}$ |
| $L_{A5262}$ | $R^{C3}$ | $R^{E15}$ | $R^{A34}$ |
| $L_{A5263}$ | $R^{C3}$ | $R^{E16}$ | $R^{A34}$ |
| $L_{A5264}$ | $R^{C3}$ | $R^{E17}$ | $R^{A34}$ |
| $L_{A5265}$ | $R^{C3}$ | $R^{E18}$ | $R^{A34}$ |
| $L_{A5266}$ | $R^{C3}$ | $R^{E19}$ | $R^{A34}$ |
| $L_{A5267}$ | $R^{C3}$ | $R^{E20}$ | $R^{A34}$ |
| $L_{A5268}$ | $R^{C3}$ | $R^{E21}$ | $R^{A34}$ |
| $L_{A5269}$ | $R^{C3}$ | $R^{B3}$ | $R^{A52}$ |
| $L_{A5270}$ | $R^{C3}$ | $R^{B6}$ | $R^{A52}$ |
| $L_{A5271}$ | $R^{C3}$ | $R^{B7}$ | $R^{A52}$ |
| $L_{A5272}$ | $R^{C3}$ | $R^{B12}$ | $R^{A52}$ |
| $L_{A5273}$ | $R^{C3}$ | $R^{B20}$ | $R^{A52}$ |
| $L_{A5274}$ | $R^{C3}$ | $R^{B25}$ | $R^{A52}$ |
| $L_{A5275}$ | $R^{C3}$ | $R^{B29}$ | $R^{A52}$ |
| $L_{A5276}$ | $R^{C3}$ | $R^{A37}$ | $R^{A52}$ |
| $L_{A5277}$ | $R^{C3}$ | $R^{A43}$ | $R^{A52}$ |
| $L_{A5278}$ | $R^{C3}$ | $R^{E1}$ | $R^{A52}$ |
| $L_{A5279}$ | $R^{C3}$ | $R^{E2}$ | $R^{A52}$ |
| $L_{A5280}$ | $R^{C3}$ | $R^{E3}$ | $R^{A52}$ |
| $L_{A5281}$ | $R^{C3}$ | $R^{E4}$ | $R^{A52}$ |
| $L_{A5282}$ | $R^{C3}$ | $R^{E5}$ | $R^{A52}$ |
| $L_{A5283}$ | $R^{C3}$ | $R^{E6}$ | $R^{A52}$ |
| $L_{A5284}$ | $R^{C3}$ | $R^{E7}$ | $R^{A52}$ |
| $L_{A5285}$ | $R^{C3}$ | $R^{E8}$ | $R^{A52}$ |
| $L_{A5286}$ | $R^{C3}$ | $R^{E9}$ | $R^{A52}$ |
| $L_{A5287}$ | $R^{C3}$ | $R^{E10}$ | $R^{A52}$ |
| $L_{A5288}$ | $R^{C3}$ | $R^{E11}$ | $R^{A52}$ |
| $L_{A5289}$ | $R^{C3}$ | $R^{E12}$ | $R^{A52}$ |
| $L_{A5290}$ | $R^{C3}$ | $R^{E13}$ | $R^{A52}$ |
| $L_{A5291}$ | $R^{C3}$ | $R^{E14}$ | $R^{A52}$ |
| $L_{A5292}$ | $R^{C3}$ | $R^{E15}$ | $R^{A52}$ |
| $L_{A5293}$ | $R^{C3}$ | $R^{E16}$ | $R^{A52}$ |
| $L_{A5294}$ | $R^{C3}$ | $R^{E17}$ | $R^{A52}$ |
| $L_{A5295}$ | $R^{C3}$ | $R^{E18}$ | $R^{A52}$ |

-continued

| Ligand | $R^2$ | $R^3$ | $R^4$ |
|---|---|---|---|
| $L_{A5296}$ | $R^{C3}$ | $R^{E19}$ | $R^{A52}$ |
| $L_{A5297}$ | $R^{C3}$ | $R^{E20}$ | $R^{A52}$ |
| $L_{A5298}$ | $R^{C3}$ | $R^{E21}$ | $R^{A52}$ |
| $L_{A5299}$ | $R^{C31}$ | $R^{B3}$ | H |
| $L_{A5300}$ | $R^{C31}$ | $R^{B6}$ | H |
| $L_{A5301}$ | $R^{C31}$ | $R^{B7}$ | H |
| $L_{A5302}$ | $R^{C31}$ | $R^{B12}$ | H |
| $L_{A5303}$ | $R^{C31}$ | $R^{B20}$ | H |
| $L_{A5304}$ | $R^{C31}$ | $R^{B25}$ | H |
| $L_{A5305}$ | $R^{C31}$ | $R^{B29}$ | H |
| $L_{A5306}$ | $R^{C31}$ | $R^{A37}$ | H |
| $L_{A5307}$ | $R^{C31}$ | $R^{A43}$ | H |
| $L_{A5308}$ | $R^{C31}$ | $R^{E1}$ | H |
| $L_{A5309}$ | $R^{C31}$ | $R^{E2}$ | H |
| $L_{A5310}$ | $R^{C31}$ | $R^{E3}$ | H |
| $L_{A5311}$ | $R^{C31}$ | $R^{E4}$ | H |
| $L_{A5312}$ | $R^{C31}$ | $R^{E5}$ | H |
| $L_{A5313}$ | $R^{C31}$ | $R^{E6}$ | H |
| $L_{A5314}$ | $R^{C31}$ | $R^{E7}$ | H |
| $L_{A5315}$ | $R^{C31}$ | $R^{E8}$ | H |
| $L_{A5316}$ | $R^{C31}$ | $R^{E9}$ | H |
| $L_{A5317}$ | $R^{C31}$ | $R^{E10}$ | H |
| $L_{A5318}$ | $R^{C31}$ | $R^{E11}$ | H |
| $L_{A5319}$ | $R^{C31}$ | $R^{E12}$ | H |
| $L_{A5320}$ | $R^{C31}$ | $R^{E13}$ | H |
| $L_{A5321}$ | $R^{C31}$ | $R^{E14}$ | H |
| $L_{A5322}$ | $R^{C31}$ | $R^{E15}$ | H |
| $L_{A5323}$ | $R^{C31}$ | $R^{E16}$ | H |
| $L_{A5324}$ | $R^{C31}$ | $R^{E17}$ | H |
| $L_{A5325}$ | $R^{C31}$ | $R^{E18}$ | H |
| $L_{A5326}$ | $R^{C31}$ | $R^{E19}$ | H |
| $L_{A5327}$ | $R^{C31}$ | $R^{E20}$ | H |
| $L_{A5328}$ | $R^{C31}$ | $R^{E21}$ | H |
| $L_{A5329}$ | $R^{C31}$ | $R^{B3}$ | $R^{B3}$ |
| $L_{A5330}$ | $R^{C31}$ | $R^{B6}$ | $R^{B3}$ |
| $L_{A5331}$ | $R^{C31}$ | $R^{B7}$ | $R^{B3}$ |
| $L_{A5332}$ | $R^{C31}$ | $R^{B12}$ | $R^{B3}$ |
| $L_{A5333}$ | $R^{C31}$ | $R^{B20}$ | $R^{B3}$ |
| $L_{A5334}$ | $R^{C31}$ | $R^{B25}$ | $R^{B3}$ |
| $L_{A5335}$ | $R^{C31}$ | $R^{B29}$ | $R^{B3}$ |
| $L_{A5336}$ | $R^{C31}$ | $R^{A37}$ | $R^{B3}$ |
| $L_{A5337}$ | $R^{C31}$ | $R^{A43}$ | $R^{B3}$ |
| $L_{A5338}$ | $R^{C31}$ | $R^{E1}$ | $R^{B3}$ |
| $L_{A5339}$ | $R^{C31}$ | $R^{E2}$ | $R^{B3}$ |
| $L_{A5340}$ | $R^{C31}$ | $R^{E3}$ | $R^{B3}$ |
| $L_{A5341}$ | $R^{C31}$ | $R^{E4}$ | $R^{B3}$ |
| $L_{A5342}$ | $R^{C31}$ | $R^{E5}$ | $R^{B3}$ |
| $L_{A5343}$ | $R^{C31}$ | $R^{E6}$ | $R^{B3}$ |
| $L_{A5344}$ | $R^{C31}$ | $R^{E7}$ | $R^{B3}$ |
| $L_{A5345}$ | $R^{C31}$ | $R^{E8}$ | $R^{B3}$ |
| $L_{A5346}$ | $R^{C31}$ | $R^{E9}$ | $R^{B3}$ |
| $L_{A5347}$ | $R^{C31}$ | $R^{E10}$ | $R^{B3}$ |
| $L_{A5348}$ | $R^{C31}$ | $R^{E11}$ | $R^{B3}$ |
| $L_{A5349}$ | $R^{C31}$ | $R^{E12}$ | $R^{B3}$ |
| $L_{A5350}$ | $R^{C31}$ | $R^{E13}$ | $R^{B3}$ |
| $L_{A5351}$ | $R^{C31}$ | $R^{E14}$ | $R^{B3}$ |
| $L_{A5352}$ | $R^{C31}$ | $R^{E15}$ | $R^{B3}$ |
| $L_{A5353}$ | $R^{C31}$ | $R^{E16}$ | $R^{B3}$ |
| $L_{A5354}$ | $R^{C31}$ | $R^{E17}$ | $R^{B3}$ |
| $L_{A5355}$ | $R^{C31}$ | $R^{E18}$ | $R^{B3}$ |
| $L_{A5356}$ | $R^{C31}$ | $R^{E19}$ | $R^{B3}$ |
| $L_{A5357}$ | $R^{C31}$ | $R^{E20}$ | $R^{B3}$ |
| $L_{A5358}$ | $R^{C31}$ | $R^{E21}$ | $R^{B3}$ |
| $L_{A5359}$ | $R^{C31}$ | $R^{B3}$ | $R^{B4}$ |
| $L_{A5360}$ | $R^{C31}$ | $R^{B6}$ | $R^{B4}$ |
| $L_{A5361}$ | $R^{C31}$ | $R^{B7}$ | $R^{B4}$ |
| $L_{A5362}$ | $R^{C31}$ | $R^{B12}$ | $R^{B4}$ |
| $L_{A5363}$ | $R^{C31}$ | $R^{B20}$ | $R^{B4}$ |
| $L_{A5364}$ | $R^{C31}$ | $R^{B25}$ | $R^{B4}$ |
| $L_{A5365}$ | $R^{C31}$ | $R^{B29}$ | $R^{B4}$ |
| $L_{A5366}$ | $R^{C31}$ | $R^{A37}$ | $R^{B4}$ |
| $L_{A5367}$ | $R^{C31}$ | $R^{A43}$ | $R^{B4}$ |
| $L_{A5368}$ | $R^{C31}$ | $R^{E1}$ | $R^{B4}$ |
| $L_{A5369}$ | $R^{C31}$ | $R^{E2}$ | $R^{B4}$ |
| $L_{A5370}$ | $R^{C31}$ | $R^{E3}$ | $R^{B4}$ |
| $L_{A5371}$ | $R^{C31}$ | $R^{E4}$ | $R^{B4}$ |
| $L_{A5372}$ | $R^{C31}$ | $R^{E5}$ | $R^{B4}$ |

-continued

| Ligand | $R^2$ | $R^3$ | $R^4$ |
|---|---|---|---|
| $L_{A5373}$ | $R^{C31}$ | $R^{E6}$ | $R^{B4}$ |
| $L_{A5374}$ | $R^{C31}$ | $R^{E7}$ | $R^{B4}$ |
| $L_{A5375}$ | $R^{C31}$ | $R^{E8}$ | $R^{B4}$ |
| $L_{A5376}$ | $R^{C31}$ | $R^{E9}$ | $R^{B4}$ |
| $L_{A5377}$ | $R^{C31}$ | $R^{E10}$ | $R^{B4}$ |
| $L_{A5378}$ | $R^{C31}$ | $R^{E11}$ | $R^{B4}$ |
| $L_{A5379}$ | $R^{C31}$ | $R^{E12}$ | $R^{B4}$ |
| $L_{A5380}$ | $R^{C31}$ | $R^{E13}$ | $R^{B4}$ |
| $L_{A5381}$ | $R^{C31}$ | $R^{E14}$ | $R^{B4}$ |
| $L_{A5382}$ | $R^{C31}$ | $R^{E15}$ | $R^{B4}$ |
| $L_{A5383}$ | $R^{C31}$ | $R^{E16}$ | $R^{B4}$ |
| $L_{A5384}$ | $R^{C31}$ | $R^{E17}$ | $R^{B4}$ |
| $L_{A5385}$ | $R^{C31}$ | $R^{E18}$ | $R^{B4}$ |
| $L_{A5386}$ | $R^{C31}$ | $R^{E19}$ | $R^{B4}$ |
| $L_{A5387}$ | $R^{C31}$ | $R^{E20}$ | $R^{B4}$ |
| $L_{A5388}$ | $R^{C31}$ | $R^{E21}$ | $R^{B4}$ |
| $L_{A5389}$ | $R^{C31}$ | $R^{B3}$ | $R^{B18}$ |
| $L_{A5390}$ | $R^{C31}$ | $R^{B6}$ | $R^{B18}$ |
| $L_{A5391}$ | $R^{C31}$ | $R^{B7}$ | $R^{B18}$ |
| $L_{A5392}$ | $R^{C31}$ | $R^{B12}$ | $R^{B18}$ |
| $L_{A5393}$ | $R^{C31}$ | $R^{B20}$ | $R^{B18}$ |
| $L_{A5394}$ | $R^{C31}$ | $R^{B25}$ | $R^{B18}$ |
| $L_{A5395}$ | $R^{C31}$ | $R^{B29}$ | $R^{B18}$ |
| $L_{A5396}$ | $R^{C31}$ | $R^{A37}$ | $R^{B18}$ |
| $L_{A5397}$ | $R^{C31}$ | $R^{A43}$ | $R^{B18}$ |
| $L_{A5398}$ | $R^{C31}$ | $R^{E1}$ | $R^{B18}$ |
| $L_{A5399}$ | $R^{C31}$ | $R^{E2}$ | $R^{B18}$ |
| $L_{A5400}$ | $R^{C31}$ | $R^{E3}$ | $R^{B18}$ |
| $L_{A5401}$ | $R^{C31}$ | $R^{E4}$ | $R^{B18}$ |
| $L_{A5402}$ | $R^{C31}$ | $R^{E5}$ | $R^{B18}$ |
| $L_{A5403}$ | $R^{C31}$ | $R^{E6}$ | $R^{B18}$ |
| $L_{A5404}$ | $R^{C31}$ | $R^{E7}$ | $R^{B18}$ |
| $L_{A5405}$ | $R^{C31}$ | $R^{E8}$ | $R^{B18}$ |
| $L_{A5406}$ | $R^{C31}$ | $R^{E9}$ | $R^{B18}$ |
| $L_{A5407}$ | $R^{C31}$ | $R^{E10}$ | $R^{B18}$ |
| $L_{A5408}$ | $R^{C31}$ | $R^{E11}$ | $R^{B18}$ |
| $L_{A5409}$ | $R^{C31}$ | $R^{E12}$ | $R^{B18}$ |
| $L_{A5410}$ | $R^{C31}$ | $R^{E13}$ | $R^{B18}$ |
| $L_{A5411}$ | $R^{C31}$ | $R^{E14}$ | $R^{B18}$ |
| $L_{A5412}$ | $R^{C31}$ | $R^{E15}$ | $R^{B18}$ |
| $L_{A5413}$ | $R^{C31}$ | $R^{E16}$ | $R^{B18}$ |
| $L_{A5414}$ | $R^{C31}$ | $R^{E17}$ | $R^{B18}$ |
| $L_{A5415}$ | $R^{C31}$ | $R^{E18}$ | $R^{B18}$ |
| $L_{A5416}$ | $R^{C31}$ | $R^{E19}$ | $R^{B18}$ |
| $L_{A5417}$ | $R^{C31}$ | $R^{E20}$ | $R^{B18}$ |
| $L_{A5418}$ | $R^{C31}$ | $R^{E21}$ | $R^{B18}$ |
| $L_{A5419}$ | $R^{C31}$ | $R^{B3}$ | $R^{A3}$ |
| $L_{A5420}$ | $R^{C31}$ | $R^{B6}$ | $R^{A3}$ |
| $L_{A5421}$ | $R^{C31}$ | $R^{B7}$ | $R^{A3}$ |
| $L_{A5422}$ | $R^{C31}$ | $R^{B12}$ | $R^{A3}$ |
| $L_{A5423}$ | $R^{C31}$ | $R^{B20}$ | $R^{A3}$ |
| $L_{A5424}$ | $R^{C31}$ | $R^{B25}$ | $R^{A3}$ |
| $L_{A5425}$ | $R^{C31}$ | $R^{B29}$ | $R^{A3}$ |
| $L_{A5426}$ | $R^{C31}$ | $R^{A37}$ | $R^{A3}$ |
| $L_{A5427}$ | $R^{C31}$ | $R^{A43}$ | $R^{A3}$ |
| $L_{A5428}$ | $R^{C31}$ | $R^{E1}$ | $R^{A3}$ |
| $L_{A5429}$ | $R^{C31}$ | $R^{E2}$ | $R^{A3}$ |
| $L_{A5430}$ | $R^{C31}$ | $R^{E3}$ | $R^{A3}$ |
| $L_{A5431}$ | $R^{C31}$ | $R^{E4}$ | $R^{A3}$ |
| $L_{A5432}$ | $R^{C31}$ | $R^{E5}$ | $R^{A3}$ |
| $L_{A5433}$ | $R^{C31}$ | $R^{E6}$ | $R^{A3}$ |
| $L_{A5434}$ | $R^{C31}$ | $R^{E7}$ | $R^{A3}$ |
| $L_{A5435}$ | $R^{C31}$ | $R^{E8}$ | $R^{A3}$ |
| $L_{A5436}$ | $R^{C31}$ | $R^{E9}$ | $R^{A3}$ |
| $L_{A5437}$ | $R^{C31}$ | $R^{E10}$ | $R^{A3}$ |
| $L_{A5438}$ | $R^{C31}$ | $R^{E11}$ | $R^{A3}$ |
| $L_{A5439}$ | $R^{C31}$ | $R^{E12}$ | $R^{A3}$ |
| $L_{A5440}$ | $R^{C31}$ | $R^{E13}$ | $R^{A3}$ |
| $L_{A5441}$ | $R^{C31}$ | $R^{E14}$ | $R^{A3}$ |
| $L_{A5442}$ | $R^{C31}$ | $R^{E15}$ | $R^{A3}$ |
| $L_{A5443}$ | $R^{C31}$ | $R^{E16}$ | $R^{A3}$ |
| $L_{A5444}$ | $R^{C31}$ | $R^{E17}$ | $R^{A3}$ |
| $L_{A5445}$ | $R^{C31}$ | $R^{E18}$ | $R^{A3}$ |
| $L_{A5446}$ | $R^{C31}$ | $R^{E19}$ | $R^{A3}$ |
| $L_{A5447}$ | $R^{C31}$ | $R^{E20}$ | $R^{A3}$ |
| $L_{A5448}$ | $R^{C31}$ | $R^{E21}$ | $R^{A3}$ |
| $L_{A5449}$ | $R^{C31}$ | $R^{B3}$ | $R^{A34}$ |

-continued

| Ligand | $R^2$ | $R^3$ | $R^4$ |
|---|---|---|---|
| $L_{A5450}$ | $R^{C31}$ | $R^{B6}$ | $R^{A34}$ |
| $L_{A5451}$ | $R^{C31}$ | $R^{B7}$ | $R^{A34}$ |
| $L_{A5452}$ | $R^{C31}$ | $R^{B12}$ | $R^{A34}$ |
| $L_{A5453}$ | $R^{C31}$ | $R^{B20}$ | $R^{A34}$ |
| $L_{A5454}$ | $R^{C31}$ | $R^{B25}$ | $R^{A34}$ |
| $L_{A5455}$ | $R^{C31}$ | $R^{B29}$ | $R^{A34}$ |
| $L_{A5456}$ | $R^{C31}$ | $R^{A37}$ | $R^{A34}$ |
| $L_{A5457}$ | $R^{C31}$ | $R^{A43}$ | $R^{A34}$ |
| $L_{A5458}$ | $R^{C31}$ | $R^{E1}$ | $R^{A34}$ |
| $L_{A5459}$ | $R^{C31}$ | $R^{E2}$ | $R^{A34}$ |
| $L_{A5460}$ | $R^{C31}$ | $R^{E3}$ | $R^{A34}$ |
| $L_{A5461}$ | $R^{C31}$ | $R^{E4}$ | $R^{A34}$ |
| $L_{A5462}$ | $R^{C31}$ | $R^{E5}$ | $R^{A34}$ |
| $L_{A5463}$ | $R^{C31}$ | $R^{E6}$ | $R^{A34}$ |
| $L_{A5464}$ | $R^{C31}$ | $R^{E7}$ | $R^{A34}$ |
| $L_{A5465}$ | $R^{C31}$ | $R^{E8}$ | $R^{A34}$ |
| $L_{A5466}$ | $R^{C31}$ | $R^{E9}$ | $R^{A34}$ |
| $L_{A5467}$ | $R^{C31}$ | $R^{E10}$ | $R^{A34}$ |
| $L_{A5468}$ | $R^{C31}$ | $R^{E11}$ | $R^{A34}$ |
| $L_{A5469}$ | $R^{C31}$ | $R^{E12}$ | $R^{A34}$ |
| $L_{A5470}$ | $R^{C31}$ | $R^{E13}$ | $R^{A34}$ |
| $L_{A5471}$ | $R^{C31}$ | $R^{E14}$ | $R^{A34}$ |
| $L_{A5472}$ | $R^{C31}$ | $R^{E15}$ | $R^{A34}$ |
| $L_{A5473}$ | $R^{C31}$ | $R^{E16}$ | $R^{A34}$ |
| $L_{A5474}$ | $R^{C31}$ | $R^{E17}$ | $R^{A34}$ |
| $L_{A5475}$ | $R^{C31}$ | $R^{E18}$ | $R^{A34}$ |
| $L_{A5476}$ | $R^{C31}$ | $R^{E19}$ | $R^{A34}$ |
| $L_{A5477}$ | $R^{C31}$ | $R^{E20}$ | $R^{A34}$ |
| $L_{A5478}$ | $R^{C31}$ | $R^{E21}$ | $R^{A34}$ |
| $L_{A5479}$ | $R^{C31}$ | $R^{B3}$ | $R^{A52}$ |
| $L_{A5480}$ | $R^{C31}$ | $R^{B6}$ | $R^{A52}$ |
| $L_{A5481}$ | $R^{C31}$ | $R^{B7}$ | $R^{A52}$ |
| $L_{A5482}$ | $R^{C31}$ | $R^{B12}$ | $R^{A52}$ |
| $L_{A5483}$ | $R^{C31}$ | $R^{B20}$ | $R^{A52}$ |
| $L_{A5484}$ | $R^{C31}$ | $R^{B25}$ | $R^{A52}$ |
| $L_{A5485}$ | $R^{C31}$ | $R^{B29}$ | $R^{A52}$ |
| $L_{A5486}$ | $R^{C31}$ | $R^{A37}$ | $R^{A52}$ |
| $L_{A5487}$ | $R^{C31}$ | $R^{A43}$ | $R^{A52}$ |
| $L_{A5488}$ | $R^{C31}$ | $R^{E1}$ | $R^{A52}$ |
| $L_{A5489}$ | $R^{C31}$ | $R^{E2}$ | $R^{A52}$ |
| $L_{A5490}$ | $R^{C31}$ | $R^{E3}$ | $R^{A52}$ |
| $L_{A5491}$ | $R^{C31}$ | $R^{E4}$ | $R^{A52}$ |
| $L_{A5492}$ | $R^{C31}$ | $R^{E5}$ | $R^{A52}$ |
| $L_{A5493}$ | $R^{C31}$ | $R^{E6}$ | $R^{A52}$ |
| $L_{A5494}$ | $R^{C31}$ | $R^{E7}$ | $R^{A52}$ |
| $L_{A5495}$ | $R^{C31}$ | $R^{E8}$ | $R^{A52}$ |
| $L_{A5496}$ | $R^{C31}$ | $R^{E9}$ | $R^{A52}$ |
| $L_{A5497}$ | $R^{C31}$ | $R^{E10}$ | $R^{A52}$ |
| $L_{A5498}$ | $R^{C31}$ | $R^{E11}$ | $R^{A52}$ |
| $L_{A5499}$ | $R^{C31}$ | $R^{E12}$ | $R^{A52}$ |
| $L_{A5500}$ | $R^{C31}$ | $R^{E13}$ | $R^{A52}$ |
| $L_{A5501}$ | $R^{C31}$ | $R^{E14}$ | $R^{A52}$ |
| $L_{A5502}$ | $R^{C31}$ | $R^{E15}$ | $R^{A52}$ |
| $L_{A5503}$ | $R^{C31}$ | $R^{E16}$ | $R^{A52}$ |
| $L_{A5504}$ | $R^{C31}$ | $R^{E17}$ | $R^{A52}$ |
| $L_{A5505}$ | $R^{C31}$ | $R^{E18}$ | $R^{A52}$ |
| $L_{A5506}$ | $R^{C31}$ | $R^{E19}$ | $R^{A52}$ |
| $L_{A5507}$ | $R^{C31}$ | $R^{E20}$ | $R^{A52}$ |
| $L_{A5508}$ | $R^{C31}$ | $R^{E21}$ | $R^{A52}$ |
| $L_{A5509}$ | $R^{C17}$ | $R^{B3}$ | H |
| $L_{A5510}$ | $R^{C17}$ | $R^{B6}$ | H |
| $L_{A5511}$ | $R^{C17}$ | $R^{B7}$ | H |
| $L_{A5512}$ | $R^{C17}$ | $R^{B12}$ | H |
| $L_{A5513}$ | $R^{C17}$ | $R^{B20}$ | H |
| $L_{A5514}$ | $R^{C17}$ | $R^{B25}$ | H |
| $L_{A5515}$ | $R^{C17}$ | $R^{B29}$ | H |
| $L_{A5516}$ | $R^{C17}$ | $R^{A37}$ | H |
| $L_{A5517}$ | $R^{C17}$ | $R^{A43}$ | H |
| $L_{A5518}$ | $R^{C17}$ | $R^{E1}$ | H |
| $L_{A5519}$ | $R^{C17}$ | $R^{E2}$ | H |
| $L_{A5520}$ | $R^{C17}$ | $R^{E3}$ | H |
| $L_{A5521}$ | $R^{C17}$ | $R^{E4}$ | H |
| $L_{A5522}$ | $R^{C17}$ | $R^{E5}$ | H |
| $L_{A5523}$ | $R^{C17}$ | $R^{E6}$ | H |
| $L_{A5524}$ | $R^{C17}$ | $R^{E7}$ | H |
| $L_{A5525}$ | $R^{C17}$ | $R^{E8}$ | H |
| $L_{A5526}$ | $R^{C17}$ | $R^{E9}$ | H |

| Ligand | $R^2$ | $R^3$ | $R^4$ |
|---|---|---|---|
| $L_{A5527}$ | $R^{C17}$ | $R^{E10}$ | H |
| $L_{A5528}$ | $R^{C17}$ | $R^{E11}$ | H |
| $L_{A5529}$ | $R^{C17}$ | $R^{E12}$ | H |
| $L_{A5530}$ | $R^{C17}$ | $R^{E13}$ | H |
| $L_{A5531}$ | $R^{C17}$ | $R^{E14}$ | H |
| $L_{A5532}$ | $R^{C17}$ | $R^{E15}$ | H |
| $L_{A5533}$ | $R^{C17}$ | $R^{E16}$ | H |
| $L_{A5534}$ | $R^{C17}$ | $R^{E17}$ | H |
| $L_{A5535}$ | $R^{C17}$ | $R^{E18}$ | H |
| $L_{A5536}$ | $R^{C17}$ | $R^{E19}$ | H |
| $L_{A5537}$ | $R^{C17}$ | $R^{E20}$ | H |
| $L_{A5538}$ | $R^{C17}$ | $R^{E21}$ | H |
| $L_{A5539}$ | $R^{C17}$ | $R^{B3}$ | $R^{B3}$ |
| $L_{A5540}$ | $R^{C17}$ | $R^{B6}$ | $R^{B3}$ |
| $L_{A5541}$ | $R^{C17}$ | $R^{B7}$ | $R^{B3}$ |
| $L_{A5542}$ | $R^{C17}$ | $R^{B12}$ | $R^{B3}$ |
| $L_{A5543}$ | $R^{C17}$ | $R^{B20}$ | $R^{B3}$ |
| $L_{A5544}$ | $R^{C17}$ | $R^{B25}$ | $R^{B3}$ |
| $L_{A5545}$ | $R^{C17}$ | $R^{B29}$ | $R^{B3}$ |
| $L_{A5546}$ | $R^{C17}$ | $R^{A37}$ | $R^{B3}$ |
| $L_{A5547}$ | $R^{C17}$ | $R^{A43}$ | $R^{B3}$ |
| $L_{A5548}$ | $R^{C17}$ | $R^{E1}$ | $R^{B3}$ |
| $L_{A5549}$ | $R^{C17}$ | $R^{E2}$ | $R^{B3}$ |
| $L_{A5550}$ | $R^{C17}$ | $R^{E3}$ | $R^{B3}$ |
| $L_{A5551}$ | $R^{C17}$ | $R^{E4}$ | $R^{B3}$ |
| $L_{A5552}$ | $R^{C17}$ | $R^{E5}$ | $R^{B3}$ |
| $L_{A5553}$ | $R^{C17}$ | $R^{E6}$ | $R^{B3}$ |
| $L_{A5554}$ | $R^{C17}$ | $R^{E7}$ | $R^{B3}$ |
| $L_{A5555}$ | $R^{C17}$ | $R^{E8}$ | $R^{B3}$ |
| $L_{A5556}$ | $R^{C17}$ | $R^{E9}$ | $R^{B3}$ |
| $L_{A5557}$ | $R^{C17}$ | $R^{E10}$ | $R^{B3}$ |
| $L_{A5558}$ | $R^{C17}$ | $R^{E11}$ | $R^{B3}$ |
| $L_{A5559}$ | $R^{C17}$ | $R^{E12}$ | $R^{B3}$ |
| $L_{A5560}$ | $R^{C17}$ | $R^{E13}$ | $R^{B3}$ |
| $L_{A5561}$ | $R^{C17}$ | $R^{E14}$ | $R^{B3}$ |
| $L_{A5562}$ | $R^{C17}$ | $R^{E15}$ | $R^{B3}$ |
| $L_{A5563}$ | $R^{C17}$ | $R^{E16}$ | $R^{B3}$ |
| $L_{A5564}$ | $R^{C17}$ | $R^{E17}$ | $R^{B3}$ |
| $L_{A5565}$ | $R^{C17}$ | $R^{E18}$ | $R^{B3}$ |
| $L_{A5566}$ | $R^{C17}$ | $R^{E19}$ | $R^{B3}$ |
| $L_{A5567}$ | $R^{C17}$ | $R^{E20}$ | $R^{B3}$ |
| $L_{A5568}$ | $R^{C17}$ | $R^{E21}$ | $R^{B3}$ |
| $L_{A5569}$ | $R^{C17}$ | $R^{B3}$ | $R^{B4}$ |
| $L_{A5570}$ | $R^{C17}$ | $R^{B6}$ | $R^{B4}$ |
| $L_{A5571}$ | $R^{C17}$ | $R^{B7}$ | $R^{B4}$ |
| $L_{A5572}$ | $R^{C17}$ | $R^{B12}$ | $R^{B4}$ |
| $L_{A5573}$ | $R^{C17}$ | $R^{B20}$ | $R^{B4}$ |
| $L_{A5574}$ | $R^{C17}$ | $R^{B25}$ | $R^{B4}$ |
| $L_{A5575}$ | $R^{C17}$ | $R^{B29}$ | $R^{B4}$ |
| $L_{A5576}$ | $R^{C17}$ | $R^{A37}$ | $R^{B4}$ |
| $L_{A5577}$ | $R^{C17}$ | $R^{A43}$ | $R^{B4}$ |
| $L_{A5578}$ | $R^{C17}$ | $R^{E1}$ | $R^{B4}$ |
| $L_{A5579}$ | $R^{C17}$ | $R^{E2}$ | $R^{B4}$ |
| $L_{A5580}$ | $R^{C17}$ | $R^{E3}$ | $R^{B4}$ |
| $L_{A5581}$ | $R^{C17}$ | $R^{E4}$ | $R^{B4}$ |
| $L_{A5582}$ | $R^{C17}$ | $R^{E5}$ | $R^{B4}$ |
| $L_{A5583}$ | $R^{C17}$ | $R^{E6}$ | $R^{B4}$ |
| $L_{A5584}$ | $R^{C17}$ | $R^{E7}$ | $R^{B4}$ |
| $L_{A5585}$ | $R^{C17}$ | $R^{E8}$ | $R^{B4}$ |
| $L_{A5586}$ | $R^{C17}$ | $R^{E9}$ | $R^{B4}$ |
| $L_{A5587}$ | $R^{C17}$ | $R^{E10}$ | $R^{B4}$ |
| $L_{A5588}$ | $R^{C17}$ | $R^{E11}$ | $R^{B4}$ |
| $L_{A5589}$ | $R^{C17}$ | $R^{E12}$ | $R^{B4}$ |
| $L_{A5590}$ | $R^{C17}$ | $R^{E13}$ | $R^{B4}$ |
| $L_{A5591}$ | $R^{C17}$ | $R^{E14}$ | $R^{B4}$ |
| $L_{A5592}$ | $R^{C17}$ | $R^{E15}$ | $R^{B4}$ |
| $L_{A5593}$ | $R^{C17}$ | $R^{E16}$ | $R^{B4}$ |
| $L_{A5594}$ | $R^{C17}$ | $R^{E17}$ | $R^{B4}$ |
| $L_{A5595}$ | $R^{C17}$ | $R^{E18}$ | $R^{B4}$ |
| $L_{A5596}$ | $R^{C17}$ | $R^{E19}$ | $R^{B4}$ |
| $L_{A5597}$ | $R^{C17}$ | $R^{E20}$ | $R^{B4}$ |
| $L_{A5598}$ | $R^{C17}$ | $R^{E21}$ | $R^{B4}$ |
| $L_{A5599}$ | $R^{C17}$ | $R^{B3}$ | $R^{B18}$ |
| $L_{A5600}$ | $R^{C17}$ | $R^{B6}$ | $R^{B18}$ |
| $L_{A5601}$ | $R^{C17}$ | $R^{B7}$ | $R^{B18}$ |
| $L_{A5602}$ | $R^{C17}$ | $R^{B12}$ | $R^{B18}$ |
| $L_{A5603}$ | $R^{C17}$ | $R^{B20}$ | $R^{B18}$ |

| Ligand | $R^2$ | $R^3$ | $R^4$ |
|---|---|---|---|
| $L_{A5604}$ | $R^{C17}$ | $R^{B25}$ | $R^{B18}$ |
| $L_{A5605}$ | $R^{C17}$ | $R^{B29}$ | $R^{B18}$ |
| $L_{A5606}$ | $R^{C17}$ | $R^{A37}$ | $R^{B18}$ |
| $L_{A5607}$ | $R^{C17}$ | $R^{A43}$ | $R^{B18}$ |
| $L_{A5608}$ | $R^{C17}$ | $R^{E1}$ | $R^{B18}$ |
| $L_{A5609}$ | $R^{C17}$ | $R^{E2}$ | $R^{B18}$ |
| $L_{A5610}$ | $R^{C17}$ | $R^{E3}$ | $R^{B18}$ |
| $L_{A5611}$ | $R^{C17}$ | $R^{E4}$ | $R^{B18}$ |
| $L_{A5612}$ | $R^{C17}$ | $R^{E5}$ | $R^{B18}$ |
| $L_{A5613}$ | $R^{C17}$ | $R^{E6}$ | $R^{B18}$ |
| $L_{A5614}$ | $R^{C17}$ | $R^{E7}$ | $R^{B18}$ |
| $L_{A5615}$ | $R^{C17}$ | $R^{E8}$ | $R^{B18}$ |
| $L_{A5616}$ | $R^{C17}$ | $R^{E9}$ | $R^{B18}$ |
| $L_{A5617}$ | $R^{C17}$ | $R^{E10}$ | $R^{B18}$ |
| $L_{A5618}$ | $R^{C17}$ | $R^{E11}$ | $R^{B18}$ |
| $L_{A5619}$ | $R^{C17}$ | $R^{E12}$ | $R^{B18}$ |
| $L_{A5620}$ | $R^{C17}$ | $R^{E13}$ | $R^{B18}$ |
| $L_{A5621}$ | $R^{C17}$ | $R^{E14}$ | $R^{B18}$ |
| $L_{A5622}$ | $R^{C17}$ | $R^{E15}$ | $R^{B18}$ |
| $L_{A5623}$ | $R^{C17}$ | $R^{E16}$ | $R^{B18}$ |
| $L_{A5624}$ | $R^{C17}$ | $R^{E17}$ | $R^{B18}$ |
| $L_{A5625}$ | $R^{C17}$ | $R^{E18}$ | $R^{B18}$ |
| $L_{A5626}$ | $R^{C17}$ | $R^{E19}$ | $R^{B18}$ |
| $L_{A5627}$ | $R^{C17}$ | $R^{E20}$ | $R^{B18}$ |
| $L_{A5628}$ | $R^{C17}$ | $R^{E21}$ | $R^{B18}$ |
| $L_{A5629}$ | $R^{C17}$ | $R^{B3}$ | $R^{A3}$ |
| $L_{A5630}$ | $R^{C17}$ | $R^{B6}$ | $R^{A3}$ |
| $L_{A5631}$ | $R^{C17}$ | $R^{B7}$ | $R^{A3}$ |
| $L_{A5632}$ | $R^{C17}$ | $R^{B12}$ | $R^{A3}$ |
| $L_{A5633}$ | $R^{C17}$ | $R^{B20}$ | $R^{A3}$ |
| $L_{A5634}$ | $R^{C17}$ | $R^{B25}$ | $R^{A3}$ |
| $L_{A5635}$ | $R^{C17}$ | $R^{B29}$ | $R^{A3}$ |
| $L_{A5636}$ | $R^{C17}$ | $R^{A37}$ | $R^{A3}$ |
| $L_{A5637}$ | $R^{C17}$ | $R^{A43}$ | $R^{A3}$ |
| $L_{A5638}$ | $R^{C17}$ | $R^{E1}$ | $R^{A3}$ |
| $L_{A5639}$ | $R^{C17}$ | $R^{E2}$ | $R^{A3}$ |
| $L_{A5640}$ | $R^{C17}$ | $R^{E3}$ | $R^{A3}$ |
| $L_{A5641}$ | $R^{C17}$ | $R^{E4}$ | $R^{A3}$ |
| $L_{A5642}$ | $R^{C17}$ | $R^{E5}$ | $R^{A3}$ |
| $L_{A5643}$ | $R^{C17}$ | $R^{E6}$ | $R^{A3}$ |
| $L_{A5644}$ | $R^{C17}$ | $R^{E7}$ | $R^{A3}$ |
| $L_{A5645}$ | $R^{C17}$ | $R^{E8}$ | $R^{A3}$ |
| $L_{A5646}$ | $R^{C17}$ | $R^{E9}$ | $R^{A3}$ |
| $L_{A5647}$ | $R^{C17}$ | $R^{E10}$ | $R^{A3}$ |
| $L_{A5648}$ | $R^{C17}$ | $R^{E11}$ | $R^{A3}$ |
| $L_{A5649}$ | $R^{C17}$ | $R^{E12}$ | $R^{A3}$ |
| $L_{A5650}$ | $R^{C17}$ | $R^{E13}$ | $R^{A3}$ |
| $L_{A5651}$ | $R^{C17}$ | $R^{E14}$ | $R^{A3}$ |
| $L_{A5652}$ | $R^{C17}$ | $R^{E15}$ | $R^{A3}$ |
| $L_{A5653}$ | $R^{C17}$ | $R^{E16}$ | $R^{A3}$ |
| $L_{A5654}$ | $R^{C17}$ | $R^{E17}$ | $R^{A3}$ |
| $L_{A5655}$ | $R^{C17}$ | $R^{E18}$ | $R^{A3}$ |
| $L_{A5656}$ | $R^{C17}$ | $R^{E19}$ | $R^{A3}$ |
| $L_{A5657}$ | $R^{C17}$ | $R^{E20}$ | $R^{A3}$ |
| $L_{A5658}$ | $R^{C17}$ | $R^{E21}$ | $R^{A3}$ |
| $L_{A5659}$ | $R^{C17}$ | $R^{B3}$ | $R^{A34}$ |
| $L_{A5660}$ | $R^{C17}$ | $R^{B6}$ | $R^{A34}$ |
| $L_{A5661}$ | $R^{C17}$ | $R^{B7}$ | $R^{A34}$ |
| $L_{A5662}$ | $R^{C17}$ | $R^{B12}$ | $R^{A34}$ |
| $L_{A5663}$ | $R^{C17}$ | $R^{B20}$ | $R^{A34}$ |
| $L_{A5664}$ | $R^{C17}$ | $R^{B25}$ | $R^{A34}$ |
| $L_{A5665}$ | $R^{C17}$ | $R^{B29}$ | $R^{A34}$ |
| $L_{A5666}$ | $R^{C17}$ | $R^{A37}$ | $R^{A34}$ |
| $L_{A5667}$ | $R^{C17}$ | $R^{A43}$ | $R^{A34}$ |
| $L_{A5668}$ | $R^{C17}$ | $R^{E1}$ | $R^{A34}$ |
| $L_{A5669}$ | $R^{C17}$ | $R^{E2}$ | $R^{A34}$ |
| $L_{A5670}$ | $R^{C17}$ | $R^{E3}$ | $R^{A34}$ |
| $L_{A5671}$ | $R^{C17}$ | $R^{E4}$ | $R^{A34}$ |
| $L_{A5672}$ | $R^{C17}$ | $R^{E5}$ | $R^{A34}$ |
| $L_{A5673}$ | $R^{C17}$ | $R^{E6}$ | $R^{A34}$ |
| $L_{A5674}$ | $R^{C17}$ | $R^{E7}$ | $R^{A34}$ |
| $L_{A5675}$ | $R^{C17}$ | $R^{E8}$ | $R^{A34}$ |
| $L_{A5676}$ | $R^{C17}$ | $R^{E9}$ | $R^{A34}$ |
| $L_{A5677}$ | $R^{C17}$ | $R^{E10}$ | $R^{A34}$ |
| $L_{A5678}$ | $R^{C17}$ | $R^{E11}$ | $R^{A34}$ |
| $L_{A5679}$ | $R^{C17}$ | $R^{E12}$ | $R^{A34}$ |
| $L_{A5680}$ | $R^{C17}$ | $R^{E13}$ | $R^{A34}$ |

-continued

| Ligand | $R^2$ | $R^3$ | $R^4$ |
|---|---|---|---|
| $L_{A5681}$ | $R^{C17}$ | $R^{E14}$ | $R^{A34}$ |
| $L_{A5682}$ | $R^{C17}$ | $R^{E15}$ | $R^{A34}$ |
| $L_{A5683}$ | $R^{C17}$ | $R^{E16}$ | $R^{A34}$ |
| $L_{A5684}$ | $R^{C17}$ | $R^{E17}$ | $R^{A34}$ |
| $L_{A5685}$ | $R^{C17}$ | $R^{E18}$ | $R^{A34}$ |
| $L_{A5686}$ | $R^{C17}$ | $R^{E19}$ | $R^{A34}$ |
| $L_{A5687}$ | $R^{C17}$ | $R^{E20}$ | $R^{A34}$ |
| $L_{A5688}$ | $R^{C17}$ | $R^{E21}$ | $R^{A34}$ |
| $L_{A5689}$ | $R^{C17}$ | $R^{B3}$ | $R^{A52}$ |
| $L_{A5690}$ | $R^{C17}$ | $R^{B6}$ | $R^{A52}$ |
| $L_{A5691}$ | $R^{C17}$ | $R^{B7}$ | $R^{A52}$ |
| $L_{A5692}$ | $R^{C17}$ | $R^{B12}$ | $R^{A52}$ |
| $L_{A5693}$ | $R^{C17}$ | $R^{B20}$ | $R^{A52}$ |
| $L_{A5694}$ | $R^{C17}$ | $R^{B25}$ | $R^{A52}$ |
| $L_{A5695}$ | $R^{C17}$ | $R^{B29}$ | $R^{A52}$ |
| $L_{A5696}$ | $R^{C17}$ | $R^{A37}$ | $R^{A52}$ |
| $L_{A5697}$ | $R^{C17}$ | $R^{A43}$ | $R^{A52}$ |
| $L_{A5698}$ | $R^{C17}$ | $R^{E1}$ | $R^{A52}$ |
| $L_{A5699}$ | $R^{C17}$ | $R^{E2}$ | $R^{A52}$ |
| $L_{A5700}$ | $R^{C17}$ | $R^{E3}$ | $R^{A52}$ |
| $L_{A5701}$ | $R^{C17}$ | $R^{E4}$ | $R^{A52}$ |
| $L_{A5702}$ | $R^{C17}$ | $R^{E5}$ | $R^{A52}$ |
| $L_{A5703}$ | $R^{C17}$ | $R^{E6}$ | $R^{A52}$ |
| $L_{A5704}$ | $R^{C17}$ | $R^{E7}$ | $R^{A52}$ |
| $L_{A5705}$ | $R^{C17}$ | $R^{E8}$ | $R^{A52}$ |
| $L_{A5706}$ | $R^{C17}$ | $R^{E9}$ | $R^{A52}$ |
| $L_{A5707}$ | $R^{C17}$ | $R^{E10}$ | $R^{A52}$ |
| $L_{A5708}$ | $R^{C17}$ | $R^{E11}$ | $R^{A52}$ |
| $L_{A5709}$ | $R^{C17}$ | $R^{E12}$ | $R^{A52}$ |
| $L_{A5710}$ | $R^{C17}$ | $R^{E13}$ | $R^{A52}$ |
| $L_{A5711}$ | $R^{C17}$ | $R^{E14}$ | $R^{A52}$ |
| $L_{A5712}$ | $R^{C17}$ | $R^{E15}$ | $R^{A52}$ |
| $L_{A5713}$ | $R^{C17}$ | $R^{E16}$ | $R^{A52}$ |
| $L_{A5714}$ | $R^{C17}$ | $R^{E17}$ | $R^{A52}$ |
| $L_{A5715}$ | $R^{C17}$ | $R^{E18}$ | $R^{A52}$ |
| $L_{A5716}$ | $R^{C17}$ | $R^{E19}$ | $R^{A52}$ |
| $L_{A5717}$ | $R^{C17}$ | $R^{E20}$ | $R^{A52}$ |
| $L_{A5718}$ | $R^{C17}$ | $R^{E21}$ | $R^{A52}$ |
| $L_{A5719}$ | $R^{C19}$ | $R^{B3}$ | H |
| $L_{A5720}$ | $R^{C19}$ | $R^{B6}$ | H |
| $L_{A5721}$ | $R^{C19}$ | $R^{B7}$ | H |
| $L_{A5722}$ | $R^{C19}$ | $R^{B12}$ | H |
| $L_{A5723}$ | $R^{C19}$ | $R^{B20}$ | H |
| $L_{A5724}$ | $R^{C19}$ | $R^{B25}$ | H |
| $L_{A5725}$ | $R^{C19}$ | $R^{B29}$ | H |
| $L_{A5726}$ | $R^{C19}$ | $R^{A37}$ | H |
| $L_{A5727}$ | $R^{C19}$ | $R^{A43}$ | H |
| $L_{A5728}$ | $R^{C19}$ | $R^{E1}$ | H |
| $L_{A5729}$ | $R^{C19}$ | $R^{E2}$ | H |
| $L_{A5730}$ | $R^{C19}$ | $R^{E3}$ | H |
| $L_{A5731}$ | $R^{C19}$ | $R^{E4}$ | H |
| $L_{A5732}$ | $R^{C19}$ | $R^{E5}$ | H |
| $L_{A5733}$ | $R^{C19}$ | $R^{E6}$ | H |
| $L_{A5734}$ | $R^{C19}$ | $R^{E7}$ | H |
| $L_{A5735}$ | $R^{C19}$ | $R^{E8}$ | H |
| $L_{A5736}$ | $R^{C19}$ | $R^{E9}$ | H |
| $L_{A5737}$ | $R^{C19}$ | $R^{E10}$ | H |
| $L_{A5738}$ | $R^{C19}$ | $R^{E11}$ | H |
| $L_{A5739}$ | $R^{C19}$ | $R^{E12}$ | H |
| $L_{A5740}$ | $R^{C19}$ | $R^{E13}$ | H |
| $L_{A5741}$ | $R^{C19}$ | $R^{E14}$ | H |
| $L_{A5742}$ | $R^{C19}$ | $R^{E15}$ | H |
| $L_{A5743}$ | $R^{C19}$ | $R^{E16}$ | H |
| $L_{A5744}$ | $R^{C19}$ | $R^{E17}$ | H |
| $L_{A5745}$ | $R^{C19}$ | $R^{E18}$ | H |
| $L_{A5746}$ | $R^{C19}$ | $R^{E19}$ | H |
| $L_{A5747}$ | $R^{C19}$ | $R^{E20}$ | H |
| $L_{A5748}$ | $R^{C19}$ | $R^{E21}$ | H |
| $L_{A5749}$ | $R^{C19}$ | $R^{B3}$ | $R^{B3}$ |
| $L_{A5750}$ | $R^{C19}$ | $R^{B6}$ | $R^{B3}$ |
| $L_{A5751}$ | $R^{C19}$ | $R^{B7}$ | $R^{B3}$ |
| $L_{A5752}$ | $R^{C19}$ | $R^{B12}$ | $R^{B3}$ |
| $L_{A5753}$ | $R^{C19}$ | $R^{B20}$ | $R^{B3}$ |
| $L_{A5754}$ | $R^{C19}$ | $R^{B25}$ | $R^{B3}$ |
| $L_{A5755}$ | $R^{C19}$ | $R^{B29}$ | $R^{B3}$ |
| $L_{A5756}$ | $R^{C19}$ | $R^{A37}$ | $R^{B3}$ |
| $L_{A5757}$ | $R^{C19}$ | $R^{A43}$ | $R^{B3}$ |

-continued

| Ligand | $R^2$ | $R^3$ | $R^4$ |
|---|---|---|---|
| $L_{A5758}$ | $R^{C19}$ | $R^{E1}$ | $R^{B3}$ |
| $L_{A5759}$ | $R^{C19}$ | $R^{E2}$ | $R^{B3}$ |
| $L_{A5760}$ | $R^{C19}$ | $R^{E3}$ | $R^{B3}$ |
| $L_{A5761}$ | $R^{C19}$ | $R^{E4}$ | $R^{B3}$ |
| $L_{A5762}$ | $R^{C19}$ | $R^{E5}$ | $R^{B3}$ |
| $L_{A5763}$ | $R^{C19}$ | $R^{E6}$ | $R^{B3}$ |
| $L_{A5764}$ | $R^{C19}$ | $R^{E7}$ | $R^{B3}$ |
| $L_{A5765}$ | $R^{C19}$ | $R^{E8}$ | $R^{B3}$ |
| $L_{A5766}$ | $R^{C19}$ | $R^{E9}$ | $R^{B3}$ |
| $L_{A5767}$ | $R^{C19}$ | $R^{E10}$ | $R^{B3}$ |
| $L_{A5768}$ | $R^{C19}$ | $R^{E11}$ | $R^{B3}$ |
| $L_{A5769}$ | $R^{C19}$ | $R^{E12}$ | $R^{B3}$ |
| $L_{A5770}$ | $R^{C19}$ | $R^{E13}$ | $R^{B3}$ |
| $L_{A5771}$ | $R^{C19}$ | $R^{E14}$ | $R^{B3}$ |
| $L_{A5772}$ | $R^{C19}$ | $R^{E15}$ | $R^{B3}$ |
| $L_{A5773}$ | $R^{C19}$ | $R^{E16}$ | $R^{B3}$ |
| $L_{A5774}$ | $R^{C19}$ | $R^{E17}$ | $R^{B3}$ |
| $L_{A5775}$ | $R^{C19}$ | $R^{E18}$ | $R^{B3}$ |
| $L_{A5776}$ | $R^{C19}$ | $R^{E19}$ | $R^{B3}$ |
| $L_{A5777}$ | $R^{C19}$ | $R^{E20}$ | $R^{B3}$ |
| $L_{A5778}$ | $R^{C19}$ | $R^{E21}$ | $R^{B3}$ |
| $L_{A5779}$ | $R^{C19}$ | $R^{B3}$ | $R^{B4}$ |
| $L_{A5780}$ | $R^{C19}$ | $R^{B6}$ | $R^{B4}$ |
| $L_{A5781}$ | $R^{C19}$ | $R^{B7}$ | $R^{B4}$ |
| $L_{A5782}$ | $R^{C19}$ | $R^{B12}$ | $R^{B4}$ |
| $L_{A5783}$ | $R^{C19}$ | $R^{B20}$ | $R^{B4}$ |
| $L_{A5784}$ | $R^{C19}$ | $R^{B25}$ | $R^{B4}$ |
| $L_{A5785}$ | $R^{C19}$ | $R^{B29}$ | $R^{B4}$ |
| $L_{A5786}$ | $R^{C19}$ | $R^{A37}$ | $R^{B4}$ |
| $L_{A5787}$ | $R^{C19}$ | $R^{A43}$ | $R^{B4}$ |
| $L_{A5788}$ | $R^{C19}$ | $R^{E1}$ | $R^{B4}$ |
| $L_{A5789}$ | $R^{C19}$ | $R^{E2}$ | $R^{B4}$ |
| $L_{A5790}$ | $R^{C19}$ | $R^{E3}$ | $R^{B4}$ |
| $L_{A5791}$ | $R^{C19}$ | $R^{E4}$ | $R^{B4}$ |
| $L_{A5792}$ | $R^{C19}$ | $R^{E5}$ | $R^{B4}$ |
| $L_{A5793}$ | $R^{C19}$ | $R^{E6}$ | $R^{B4}$ |
| $L_{A5794}$ | $R^{C19}$ | $R^{E7}$ | $R^{B4}$ |
| $L_{A5795}$ | $R^{C19}$ | $R^{E8}$ | $R^{B4}$ |
| $L_{A5796}$ | $R^{C19}$ | $R^{E9}$ | $R^{B4}$ |
| $L_{A5797}$ | $R^{C19}$ | $R^{E10}$ | $R^{B4}$ |
| $L_{A5798}$ | $R^{C19}$ | $R^{E11}$ | $R^{B4}$ |
| $L_{A5799}$ | $R^{C19}$ | $R^{E12}$ | $R^{B4}$ |
| $L_{A5800}$ | $R^{C19}$ | $R^{E13}$ | $R^{B4}$ |
| $L_{A5801}$ | $R^{C19}$ | $R^{E14}$ | $R^{B4}$ |
| $L_{A5802}$ | $R^{C19}$ | $R^{E15}$ | $R^{B4}$ |
| $L_{A5803}$ | $R^{C19}$ | $R^{E16}$ | $R^{B4}$ |
| $L_{A5804}$ | $R^{C19}$ | $R^{E17}$ | $R^{B4}$ |
| $L_{A5805}$ | $R^{C19}$ | $R^{E18}$ | $R^{B4}$ |
| $L_{A5806}$ | $R^{C19}$ | $R^{E19}$ | $R^{B4}$ |
| $L_{A5807}$ | $R^{C19}$ | $R^{E20}$ | $R^{B4}$ |
| $L_{A5808}$ | $R^{C19}$ | $R^{E21}$ | $R^{B4}$ |
| $L_{A5809}$ | $R^{C19}$ | $R^{B3}$ | $R^{B18}$ |
| $L_{A5810}$ | $R^{C19}$ | $R^{B6}$ | $R^{B18}$ |
| $L_{A5811}$ | $R^{C19}$ | $R^{B7}$ | $R^{B18}$ |
| $L_{A5812}$ | $R^{C19}$ | $R^{B12}$ | $R^{B18}$ |
| $L_{A5813}$ | $R^{C19}$ | $R^{B20}$ | $R^{B18}$ |
| $L_{A5814}$ | $R^{C19}$ | $R^{B25}$ | $R^{B18}$ |
| $L_{A5815}$ | $R^{C19}$ | $R^{B29}$ | $R^{B18}$ |
| $L_{A5816}$ | $R^{C19}$ | $R^{A37}$ | $R^{B18}$ |
| $L_{A5817}$ | $R^{C19}$ | $R^{A43}$ | $R^{B18}$ |
| $L_{A5818}$ | $R^{C19}$ | $R^{E1}$ | $R^{B18}$ |
| $L_{A5819}$ | $R^{C19}$ | $R^{E2}$ | $R^{B18}$ |
| $L_{A5820}$ | $R^{C19}$ | $R^{E3}$ | $R^{B18}$ |
| $L_{A5821}$ | $R^{C19}$ | $R^{E4}$ | $R^{B18}$ |
| $L_{A5822}$ | $R^{C19}$ | $R^{E5}$ | $R^{B18}$ |
| $L_{A5823}$ | $R^{C19}$ | $R^{E6}$ | $R^{B18}$ |
| $L_{A5824}$ | $R^{C19}$ | $R^{E7}$ | $R^{B18}$ |
| $L_{A5825}$ | $R^{C19}$ | $R^{E8}$ | $R^{B18}$ |
| $L_{A5826}$ | $R^{C19}$ | $R^{E9}$ | $R^{B18}$ |
| $L_{A5827}$ | $R^{C19}$ | $R^{E10}$ | $R^{B18}$ |
| $L_{A5828}$ | $R^{C19}$ | $R^{E11}$ | $R^{B18}$ |
| $L_{A5829}$ | $R^{C19}$ | $R^{E12}$ | $R^{B18}$ |
| $L_{A5830}$ | $R^{C19}$ | $R^{E13}$ | $R^{B18}$ |
| $L_{A5831}$ | $R^{C19}$ | $R^{E14}$ | $R^{B18}$ |
| $L_{A5832}$ | $R^{C19}$ | $R^{E15}$ | $R^{B18}$ |
| $L_{A5833}$ | $R^{C19}$ | $R^{E16}$ | $R^{B18}$ |
| $L_{A5834}$ | $R^{C19}$ | $R^{E17}$ | $R^{B18}$ |

-continued

| Ligand | $R^2$ | $R^3$ | $R^4$ |
|---|---|---|---|
| $L_{A5835}$ | $R^{C19}$ | $R^{E18}$ | $R^{B18}$ |
| $L_{A5836}$ | $R^{C19}$ | $R^{E19}$ | $R^{B18}$ |
| $L_{A5837}$ | $R^{C19}$ | $R^{E20}$ | $R^{B18}$ |
| $L_{A5838}$ | $R^{C19}$ | $R^{E21}$ | $R^{B18}$ |
| $L_{A5839}$ | $R^{C19}$ | $R^{B3}$ | $R^{A3}$ |
| $L_{A5840}$ | $R^{C19}$ | $R^{B6}$ | $R^{A3}$ |
| $L_{A5841}$ | $R^{C19}$ | $R^{B7}$ | $R^{A3}$ |
| $L_{A5842}$ | $R^{C19}$ | $R^{B12}$ | $R^{A3}$ |
| $L_{A5843}$ | $R^{C19}$ | $R^{B20}$ | $R^{A3}$ |
| $L_{A5844}$ | $R^{C19}$ | $R^{B25}$ | $R^{A3}$ |
| $L_{A5845}$ | $R^{C19}$ | $R^{B29}$ | $R^{A3}$ |
| $L_{A5846}$ | $R^{C19}$ | $R^{A37}$ | $R^{A3}$ |
| $L_{A5847}$ | $R^{C19}$ | $R^{A43}$ | $R^{A3}$ |
| $L_{A5848}$ | $R^{C19}$ | $R^{E1}$ | $R^{A3}$ |
| $L_{A5849}$ | $R^{C19}$ | $R^{E2}$ | $R^{A3}$ |
| $L_{A5850}$ | $R^{C19}$ | $R^{E3}$ | $R^{A3}$ |
| $L_{A5851}$ | $R^{C19}$ | $R^{E4}$ | $R^{A3}$ |
| $L_{A5852}$ | $R^{C19}$ | $R^{E5}$ | $R^{A3}$ |
| $L_{A5853}$ | $R^{C19}$ | $R^{E6}$ | $R^{A3}$ |
| $L_{A5854}$ | $R^{C19}$ | $R^{E7}$ | $R^{A3}$ |
| $L_{A5855}$ | $R^{C19}$ | $R^{E8}$ | $R^{A3}$ |
| $L_{A5856}$ | $R^{C19}$ | $R^{E9}$ | $R^{A3}$ |
| $L_{A5857}$ | $R^{C19}$ | $R^{E10}$ | $R^{A3}$ |
| $L_{A5858}$ | $R^{C19}$ | $R^{E11}$ | $R^{A3}$ |
| $L_{A5859}$ | $R^{C19}$ | $R^{E12}$ | $R^{A3}$ |
| $L_{A5860}$ | $R^{C19}$ | $R^{E13}$ | $R^{A3}$ |
| $L_{A5861}$ | $R^{C19}$ | $R^{E14}$ | $R^{A3}$ |
| $L_{A5862}$ | $R^{C19}$ | $R^{E15}$ | $R^{A3}$ |
| $L_{A5863}$ | $R^{C19}$ | $R^{E16}$ | $R^{A3}$ |
| $L_{A5864}$ | $R^{C19}$ | $R^{E17}$ | $R^{A3}$ |
| $L_{A5865}$ | $R^{C19}$ | $R^{E18}$ | $R^{A3}$ |
| $L_{A5866}$ | $R^{C19}$ | $R^{E19}$ | $R^{A3}$ |
| $L_{A5867}$ | $R^{C19}$ | $R^{E20}$ | $R^{A3}$ |
| $L_{A5868}$ | $R^{C19}$ | $R^{E21}$ | $R^{A3}$ |
| $L_{A5869}$ | $R^{C19}$ | $R^{B3}$ | $R^{A34}$ |
| $L_{A5870}$ | $R^{C19}$ | $R^{B6}$ | $R^{A34}$ |
| $L_{A5871}$ | $R^{C19}$ | $R^{B7}$ | $R^{A34}$ |
| $L_{A5872}$ | $R^{C19}$ | $R^{B12}$ | $R^{A34}$ |
| $L_{A5873}$ | $R^{C19}$ | $R^{B2}0$ | $R^{A34}$ |
| $L_{A5874}$ | $R^{C19}$ | $R^{B25}$ | $R^{A34}$ |
| $L_{A5875}$ | $R^{C19}$ | $R^{B29}$ | $R^{A34}$ |
| $L_{A5876}$ | $R^{C19}$ | $R^{A37}$ | $R^{A34}$ |
| $L_{A5877}$ | $R^{C19}$ | $R^{A43}$ | $R^{A34}$ |
| $L_{A5878}$ | $R^{C19}$ | $R^{E1}$ | $R^{A34}$ |
| $L_{A5879}$ | $R^{C19}$ | $R^{E2}$ | $R^{A34}$ |
| $L_{A5880}$ | $R^{C19}$ | $R^{E3}$ | $R^{A34}$ |
| $L_{A5881}$ | $R^{C19}$ | $R^{E4}$ | $R^{A34}$ |
| $L_{A5882}$ | $R^{C19}$ | $R^{E5}$ | $R^{A34}$ |
| $L_{A5883}$ | $R^{C19}$ | $R^{E6}$ | $R^{A34}$ |
| $L_{A5884}$ | $R^{C19}$ | $R^{E7}$ | $R^{A34}$ |
| $L_{A5885}$ | $R^{C19}$ | $R^{E8}$ | $R^{A34}$ |
| $L_{A5886}$ | $R^{C19}$ | $R^{E9}$ | $R^{A34}$ |
| $L_{A5887}$ | $R^{C19}$ | $R^{E10}$ | $R^{A34}$ |
| $L_{A5888}$ | $R^{C19}$ | $R^{E11}$ | $R^{A34}$ |
| $L_{A5889}$ | $R^{C19}$ | $R^{E12}$ | $R^{A34}$ |
| $L_{A5890}$ | $R^{C19}$ | $R^{E13}$ | $R^{A34}$ |
| $L_{A5891}$ | $R^{C19}$ | $R^{E14}$ | $R^{A34}$ |
| $L_{A5892}$ | $R^{C19}$ | $R^{E15}$ | $R^{A34}$ |
| $L_{A5893}$ | $R^{C19}$ | $R^{E16}$ | $R^{A34}$ |
| $L_{A5894}$ | $R^{C19}$ | $R^{E17}$ | $R^{A34}$ |
| $L_{A5895}$ | $R^{C19}$ | $R^{E18}$ | $R^{A34}$ |
| $L_{A5896}$ | $R^{C19}$ | $R^{E19}$ | $R^{A34}$ |
| $L_{A5897}$ | $R^{C19}$ | $R^{E20}$ | $R^{A34}$ |
| $L_{A5898}$ | $R^{C19}$ | $R^{E21}$ | $R^{A34}$ |
| $L_{A5899}$ | $R^{C19}$ | $R^{B3}$ | $R^{A52}$ |
| $L_{A5900}$ | $R^{C19}$ | $R^{B6}$ | $R^{A52}$ |
| $L_{A5901}$ | $R^{C19}$ | $R^{B7}$ | $R^{A52}$ |
| $L_{A5902}$ | $R^{C19}$ | $R^{B12}$ | $R^{A52}$ |
| $L_{A5903}$ | $R^{C19}$ | $R^{B20}$ | $R^{A52}$ |
| $L_{A5904}$ | $R^{C19}$ | $R^{B25}$ | $R^{A52}$ |
| $L_{A5905}$ | $R^{C19}$ | $R^{B29}$ | $R^{A52}$ |
| $L_{A5906}$ | $R^{C19}$ | $R^{A37}$ | $R^{A52}$ |
| $L_{A5907}$ | $R^{C19}$ | $R^{A43}$ | $R^{A52}$ |
| $L_{A5908}$ | $R^{C19}$ | $R^{E1}$ | $R^{A52}$ |
| $L_{A5909}$ | $R^{C19}$ | $R^{E2}$ | $R^{A52}$ |
| $L_{A5910}$ | $R^{C19}$ | $R^{E3}$ | $R^{A52}$ |
| $L_{A5911}$ | $R^{C19}$ | $R^{E4}$ | $R^{A52}$ |

-continued

| Ligand | $R^2$ | $R^3$ | $R^4$ |
|---|---|---|---|
| $L_{A5912}$ | $R^{C19}$ | $R^{E5}$ | $R^{A52}$ |
| $L_{A5913}$ | $R^{C19}$ | $R^{E6}$ | $R^{A52}$ |
| $L_{A5914}$ | $R^{C19}$ | $R^{E7}$ | $R^{A52}$ |
| $L_{A5915}$ | $R^{C19}$ | $R^{E8}$ | $R^{A52}$ |
| $L_{A5916}$ | $R^{C19}$ | $R^{E9}$ | $R^{A52}$ |
| $L_{A5917}$ | $R^{C19}$ | $R^{E10}$ | $R^{A52}$ |
| $L_{A5918}$ | $R^{C19}$ | $R^{E11}$ | $R^{A52}$ |
| $L_{A5919}$ | $R^{C19}$ | $R^{E12}$ | $R^{A52}$ |
| $L_{A5920}$ | $R^{C19}$ | $R^{E13}$ | $R^{A52}$ |
| $L_{A5921}$ | $R^{C19}$ | $R^{E14}$ | $R^{A52}$ |
| $L_{A5922}$ | $R^{C19}$ | $R^{E15}$ | $R^{A52}$ |
| $L_{A5923}$ | $R^{C19}$ | $R^{E16}$ | $R^{A52}$ |
| $L_{A5924}$ | $R^{C19}$ | $R^{E17}$ | $R^{A52}$ |
| $L_{A5925}$ | $R^{C19}$ | $R^{E18}$ | $R^{A52}$ |
| $L_{A5926}$ | $R^{C19}$ | $R^{E19}$ | $R^{A52}$ |
| $L_{A5927}$ | $R^{C19}$ | $R^{E20}$ | $R^{A52}$ |
| $L_{A5928}$ | $R^{C19}$ | $R^{E21}$ | $R^{A52}$ |
| $L_{A5929}$ | $R^{C30}$ | $R^{B3}$ | H |
| $L_{A5930}$ | $R^{C30}$ | $R^{B6}$ | H |
| $L_{A5931}$ | $R^{C30}$ | $R^{B7}$ | H |
| $L_{A5932}$ | $R^{C30}$ | $R^{B12}$ | H |
| $L_{A5933}$ | $R^{C30}$ | $R^{B20}$ | H |
| $L_{A5934}$ | $R^{C30}$ | $R^{B25}$ | H |
| $L_{A5935}$ | $R^{C30}$ | $R^{B29}$ | H |
| $L_{A5936}$ | $R^{C30}$ | $R^{A37}$ | H |
| $L_{A5937}$ | $R^{C30}$ | $R^{A43}$ | H |
| $L_{A5938}$ | $R^{C30}$ | $R^{E1}$ | H |
| $L_{A5939}$ | $R^{C30}$ | $R^{E2}$ | H |
| $L_{A5940}$ | $R^{C30}$ | $R^{E3}$ | H |
| $L_{A5941}$ | $R^{C30}$ | $R^{E4}$ | H |
| $L_{A5942}$ | $R^{C30}$ | $R^{E5}$ | H |
| $L_{A5943}$ | $R^{C30}$ | $R^{E6}$ | H |
| $L_{A5944}$ | $R^{C30}$ | $R^{E7}$ | H |
| $L_{A5945}$ | $R^{C30}$ | $R^{E8}$ | H |
| $L_{A5946}$ | $R^{C30}$ | $R^{E9}$ | H |
| $L_{A5947}$ | $R^{C30}$ | $R^{E10}$ | H |
| $L_{A5948}$ | $R^{C30}$ | $R^{E11}$ | H |
| $L_{A5949}$ | $R^{C30}$ | $R^{E12}$ | H |
| $L_{A5950}$ | $R^{C30}$ | $R^{E13}$ | H |
| $L_{A5951}$ | $R^{C30}$ | $R^{E14}$ | H |
| $L_{A5952}$ | $R^{C30}$ | $R^{E15}$ | H |
| $L_{A5953}$ | $R^{C30}$ | $R^{E16}$ | H |
| $L_{A5954}$ | $R^{C30}$ | $R^{E17}$ | H |
| $L_{A5955}$ | $R^{C30}$ | $R^{E18}$ | H |
| $L_{A5956}$ | $R^{C30}$ | $R^{E19}$ | H |
| $L_{A5957}$ | $R^{C30}$ | $R^{E20}$ | H |
| $L_{A5958}$ | $R^{C30}$ | $R^{E21}$ | H |
| $L_{A5959}$ | $R^{C30}$ | $R^{B3}$ | $R^{B3}$ |
| $L_{A5960}$ | $R^{C30}$ | $R^{B6}$ | $R^{B3}$ |
| $L_{A5961}$ | $R^{C30}$ | $R^{B7}$ | $R^{B3}$ |
| $L_{A5962}$ | $R^{C30}$ | $R^{B12}$ | $R^{B3}$ |
| $L_{A5963}$ | $R^{C30}$ | $R^{B20}$ | $R^{B3}$ |
| $L_{A5964}$ | $R^{C30}$ | $R^{B25}$ | $R^{B3}$ |
| $L_{A5965}$ | $R^{C30}$ | $R^{B29}$ | $R^{B3}$ |
| $L_{A5966}$ | $R^{C30}$ | $R^{A37}$ | $R^{B3}$ |
| $L_{A5967}$ | $R^{C30}$ | $R^{A43}$ | $R^{B3}$ |
| $L_{A5968}$ | $R^{C30}$ | $R^{E1}$ | $R^{B3}$ |
| $L_{A5969}$ | $R^{C30}$ | $R^{E2}$ | $R^{B3}$ |
| $L_{A5970}$ | $R^{C30}$ | $R^{E3}$ | $R^{B3}$ |
| $L_{A5971}$ | $R^{C30}$ | $R^{E4}$ | $R^{B3}$ |
| $L_{A5972}$ | $R^{C30}$ | $R^{E5}$ | $R^{B3}$ |
| $L_{A5973}$ | $R^{C30}$ | $R^{E6}$ | $R^{B3}$ |
| $L_{A5974}$ | $R^{C30}$ | $R^{E7}$ | $R^{B3}$ |
| $L_{A5975}$ | $R^{C30}$ | $R^{E8}$ | $R^{B3}$ |
| $L_{A5976}$ | $R^{C30}$ | $R^{E9}$ | $R^{B3}$ |
| $L_{A5977}$ | $R^{C30}$ | $R^{E10}$ | $R^{B3}$ |
| $L_{A5978}$ | $R^{C30}$ | $R^{E11}$ | $R^{B3}$ |
| $L_{A5979}$ | $R^{C30}$ | $R^{E12}$ | $R^{B3}$ |
| $L_{A5980}$ | $R^{C30}$ | $R^{E13}$ | $R^{B3}$ |
| $L_{A5981}$ | $R^{C30}$ | $R^{E14}$ | $R^{B3}$ |
| $L_{A5982}$ | $R^{C30}$ | $R^{E15}$ | $R^{B3}$ |
| $L_{A5983}$ | $R^{C30}$ | $R^{E16}$ | $R^{B3}$ |
| $L_{A5984}$ | $R^{C30}$ | $R^{E17}$ | $R^{B3}$ |
| $L_{A5985}$ | $R^{C30}$ | $R^{E18}$ | $R^{B3}$ |
| $L_{A5986}$ | $R^{C30}$ | $R^{E19}$ | $R^{B3}$ |
| $L_{A5987}$ | $R^{C30}$ | $R^{E20}$ | $R^{B3}$ |
| $L_{A5988}$ | $R^{C30}$ | $R^{E21}$ | $R^{B3}$ |

-continued

| Ligand | $R^2$ | $R^3$ | $R^4$ |
|---|---|---|---|
| $L_{A45989}$ | $R^{C30}$ | $R^{B3}$ | $R^{B4}$ |
| $L_{A45990}$ | $R^{C30}$ | $R^{B6}$ | $R^{B4}$ |
| $L_{A45991}$ | $R^{C30}$ | $R^{B7}$ | $R^{B4}$ |
| $L_{A45992}$ | $R^{C30}$ | $R^{B12}$ | $R^{B4}$ |
| $L_{A45993}$ | $R^{C30}$ | $R^{B20}$ | $R^{B4}$ |
| $L_{A45994}$ | $R^{C30}$ | $R^{B25}$ | $R^{B4}$ |
| $L_{A45995}$ | $R^{C30}$ | $R^{B29}$ | $R^{B4}$ |
| $L_{A45996}$ | $R^{C30}$ | $R^{A37}$ | $R^{B4}$ |
| $L_{A45997}$ | $R^{C30}$ | $R^{A43}$ | $R^{B4}$ |
| $L_{A45998}$ | $R^{C30}$ | $R^{E1}$ | $R^{B4}$ |
| $L_{A45999}$ | $R^{C30}$ | $R^{E2}$ | $R^{B4}$ |
| $L_{A46000}$ | $R^{C30}$ | $R^{E3}$ | $R^{B4}$ |
| $L_{A46001}$ | $R^{C30}$ | $R^{E4}$ | $R^{B4}$ |
| $L_{A46002}$ | $R^{C30}$ | $R^{E5}$ | $R^{B4}$ |
| $L_{A46003}$ | $R^{C30}$ | $R^{E6}$ | $R^{B4}$ |
| $L_{A46004}$ | $R^{C30}$ | $R^{E7}$ | $R^{B4}$ |
| $L_{A46005}$ | $R^{C30}$ | $R^{E8}$ | $R^{B4}$ |
| $L_{A46006}$ | $R^{C30}$ | $R^{E9}$ | $R^{B4}$ |
| $L_{A46007}$ | $R^{C30}$ | $R^{E10}$ | $R^{B4}$ |
| $L_{A46008}$ | $R^{C30}$ | $R^{E11}$ | $R^{B4}$ |
| $L_{A46009}$ | $R^{C30}$ | $R^{E12}$ | $R^{B4}$ |
| $L_{A46010}$ | $R^{C30}$ | $R^{E13}$ | $R^{B4}$ |
| $L_{A46011}$ | $R^{C30}$ | $R^{E14}$ | $R^{B4}$ |
| $L_{A46012}$ | $R^{C30}$ | $R^{E15}$ | $R^{B4}$ |
| $L_{A46013}$ | $R^{C30}$ | $R^{E16}$ | $R^{B4}$ |
| $L_{A46014}$ | $R^{C30}$ | $R^{E17}$ | $R^{B4}$ |
| $L_{A46015}$ | $R^{C30}$ | $R^{E18}$ | $R^{B4}$ |
| $L_{A46016}$ | $R^{C30}$ | $R^{E19}$ | $R^{B4}$ |
| $L_{A46017}$ | $R^{C30}$ | $R^{E20}$ | $R^{B4}$ |
| $L_{A46018}$ | $R^{C30}$ | $R^{E21}$ | $R^{B4}$ |
| $L_{A46019}$ | $R^{C30}$ | $R^{B3}$ | $R^{B18}$ |
| $L_{A46020}$ | $R^{C30}$ | $R^{B6}$ | $R^{B18}$ |
| $L_{A46021}$ | $R^{C30}$ | $R^{B7}$ | $R^{B18}$ |
| $L_{A46022}$ | $R^{C30}$ | $R^{B12}$ | $R^{B18}$ |
| $L_{A46023}$ | $R^{C30}$ | $R^{B20}$ | $R^{B18}$ |
| $L_{A46024}$ | $R^{C30}$ | $R^{B25}$ | $R^{B18}$ |
| $L_{A46025}$ | $R^{C30}$ | $R^{B29}$ | $R^{B18}$ |
| $L_{A46026}$ | $R^{C30}$ | $R^{A37}$ | $R^{B18}$ |
| $L_{A46027}$ | $R^{C30}$ | $R^{A43}$ | $R^{B18}$ |
| $L_{A46028}$ | $R^{C30}$ | $R^{E1}$ | $R^{B18}$ |
| $L_{A46029}$ | $R^{C30}$ | $R^{E2}$ | $R^{B18}$ |
| $L_{A46030}$ | $R^{C30}$ | $R^{E3}$ | $R^{B18}$ |
| $L_{A46031}$ | $R^{C30}$ | $R^{E4}$ | $R^{B18}$ |
| $L_{A46032}$ | $R^{C30}$ | $R^{E5}$ | $R^{B18}$ |
| $L_{A46033}$ | $R^{C30}$ | $R^{E6}$ | $R^{B18}$ |
| $L_{A46034}$ | $R^{C30}$ | $R^{E7}$ | $R^{B18}$ |
| $L_{A46035}$ | $R^{C30}$ | $R^{E8}$ | $R^{B18}$ |
| $L_{A46036}$ | $R^{C30}$ | $R^{E9}$ | $R^{B18}$ |
| $L_{A46037}$ | $R^{C30}$ | $R^{E10}$ | $R^{B18}$ |
| $L_{A46038}$ | $R^{C30}$ | $R^{E11}$ | $R^{B18}$ |
| $L_{A46039}$ | $R^{C30}$ | $R^{E12}$ | $R^{B18}$ |
| $L_{A46040}$ | $R^{C30}$ | $R^{E13}$ | $R^{B18}$ |
| $L_{A46041}$ | $R^{C30}$ | $R^{E14}$ | $R^{B18}$ |
| $L_{A46042}$ | $R^{C30}$ | $R^{E15}$ | $R^{B18}$ |
| $L_{A46043}$ | $R^{C30}$ | $R^{E16}$ | $R^{B18}$ |
| $L_{A46044}$ | $R^{C30}$ | $R^{E17}$ | $R^{B18}$ |
| $L_{A46045}$ | $R^{C30}$ | $R^{E18}$ | $R^{B18}$ |
| $L_{A46046}$ | $R^{C30}$ | $R^{E19}$ | $R^{B18}$ |
| $L_{A46047}$ | $R^{C30}$ | $R^{E20}$ | $R^{B18}$ |
| $L_{A46048}$ | $R^{C30}$ | $R^{E21}$ | $R^{B18}$ |
| $L_{A46049}$ | $R^{C30}$ | $R^{B3}$ | $R^{A3}$ |
| $L_{A46050}$ | $R^{C30}$ | $R^{B6}$ | $R^{A3}$ |
| $L_{A46051}$ | $R^{C30}$ | $R^{B7}$ | $R^{A3}$ |
| $L_{A46052}$ | $R^{C30}$ | $R^{B12}$ | $R^{A3}$ |
| $L_{A46053}$ | $R^{C30}$ | $R^{B20}$ | $R^{A3}$ |
| $L_{A46054}$ | $R^{C30}$ | $R^{B25}$ | $R^{A3}$ |
| $L_{A46055}$ | $R^{C30}$ | $R^{B29}$ | $R^{A3}$ |
| $L_{A46056}$ | $R^{C30}$ | $R^{A37}$ | $R^{A3}$ |
| $L_{A46057}$ | $R^{C30}$ | $R^{A43}$ | $R^{A3}$ |
| $L_{A46058}$ | $R^{C30}$ | $R^{E1}$ | $R^{A3}$ |
| $L_{A46059}$ | $R^{C30}$ | $R^{E2}$ | $R^{A3}$ |
| $L_{A46060}$ | $R^{C30}$ | $R^{E3}$ | $R^{A3}$ |
| $L_{A46061}$ | $R^{C30}$ | $R^{E4}$ | $R^{A3}$ |
| $L_{A46062}$ | $R^{C30}$ | $R^{E5}$ | $R^{A3}$ |
| $L_{A46063}$ | $R^{C30}$ | $R^{E6}$ | $R^{A3}$ |
| $L_{A46064}$ | $R^{C30}$ | $R^{E7}$ | $R^{A3}$ |
| $L_{A46065}$ | $R^{C30}$ | $R^{E8}$ | $R^{A3}$ |

-continued

| Ligand | $R^2$ | $R^3$ | $R^4$ |
|---|---|---|---|
| $L_{A46066}$ | $R^{C30}$ | $R^{E9}$ | $R^{A3}$ |
| $L_{A46067}$ | $R^{C30}$ | $R^{E10}$ | $R^{A3}$ |
| $L_{A46068}$ | $R^{C30}$ | $R^{E11}$ | $R^{A3}$ |
| $L_{A46069}$ | $R^{C30}$ | $R^{E12}$ | $R^{A3}$ |
| $L_{A46070}$ | $R^{C30}$ | $R^{E13}$ | $R^{A3}$ |
| $L_{A46071}$ | $R^{C30}$ | $R^{E14}$ | $R^{A3}$ |
| $L_{A46072}$ | $R^{C30}$ | $R^{E15}$ | $R^{A3}$ |
| $L_{A46073}$ | $R^{C30}$ | $R^{E16}$ | $R^{A3}$ |
| $L_{A46074}$ | $R^{C30}$ | $R^{E17}$ | $R^{A3}$ |
| $L_{A46075}$ | $R^{C30}$ | $R^{E18}$ | $R^{A3}$ |
| $L_{A46076}$ | $R^{C30}$ | $R^{E19}$ | $R^{A3}$ |
| $L_{A46077}$ | $R^{C30}$ | $R^{E20}$ | $R^{A3}$ |
| $L_{A46078}$ | $R^{C30}$ | $R^{E21}$ | $R^{A3}$ |
| $L_{A46079}$ | $R^{C30}$ | $R^{B3}$ | $R^{A34}$ |
| $L_{A46080}$ | $R^{C30}$ | $R^{B6}$ | $R^{A34}$ |
| $L_{A46081}$ | $R^{C30}$ | $R^{B7}$ | $R^{A34}$ |
| $L_{A46082}$ | $R^{C30}$ | $R^{B12}$ | $R^{A34}$ |
| $L_{A46083}$ | $R^{C30}$ | $R^{B20}$ | $R^{A34}$ |
| $L_{A46084}$ | $R^{C30}$ | $R^{B25}$ | $R^{A34}$ |
| $L_{A46085}$ | $R^{C30}$ | $R^{B29}$ | $R^{A34}$ |
| $L_{A46086}$ | $R^{C30}$ | $R^{A37}$ | $R^{A34}$ |
| $L_{A46087}$ | $R^{C30}$ | $R^{A43}$ | $R^{A34}$ |
| $L_{A46088}$ | $R^{C30}$ | $R^{E1}$ | $R^{A34}$ |
| $L_{A46089}$ | $R^{C30}$ | $R^{E2}$ | $R^{A34}$ |
| $L_{A46090}$ | $R^{C30}$ | $R^{E3}$ | $R^{A34}$ |
| $L_{A46091}$ | $R^{C30}$ | $R^{E4}$ | $R^{A34}$ |
| $L_{A46092}$ | $R^{C30}$ | $R^{E5}$ | $R^{A34}$ |
| $L_{A46093}$ | $R^{C30}$ | $R^{E6}$ | $R^{A34}$ |
| $L_{A46094}$ | $R^{C30}$ | $R^{E7}$ | $R^{A34}$ |
| $L_{A46095}$ | $R^{C30}$ | $R^{E8}$ | $R^{A34}$ |
| $L_{A46096}$ | $R^{C30}$ | $R^{E9}$ | $R^{A34}$ |
| $L_{A46097}$ | $R^{C30}$ | $R^{E10}$ | $R^{A34}$ |
| $L_{A46098}$ | $R^{C30}$ | $R^{E11}$ | $R^{A34}$ |
| $L_{A46099}$ | $R^{C30}$ | $R^{E12}$ | $R^{A34}$ |
| $L_{A46100}$ | $R^{C30}$ | $R^{E13}$ | $R^{A34}$ |
| $L_{A46101}$ | $R^{C30}$ | $R^{E14}$ | $R^{A34}$ |
| $L_{A46102}$ | $R^{C30}$ | $R^{E15}$ | $R^{A34}$ |
| $L_{A46103}$ | $R^{C30}$ | $R^{E16}$ | $R^{A34}$ |
| $L_{A46104}$ | $R^{C30}$ | $R^{E17}$ | $R^{A34}$ |
| $L_{A46105}$ | $R^{C30}$ | $R^{E18}$ | $R^{A34}$ |
| $L_{A46106}$ | $R^{C30}$ | $R^{E19}$ | $R^{A34}$ |
| $L_{A46107}$ | $R^{C30}$ | $R^{E20}$ | $R^{A34}$ |
| $L_{A46108}$ | $R^{C30}$ | $R^{E21}$ | $R^{A34}$ |
| $L_{A46109}$ | $R^{C30}$ | $R^{B3}$ | $R^{A52}$ |
| $L_{A46110}$ | $R^{C30}$ | $R^{B6}$ | $R^{A52}$ |
| $L_{A46111}$ | $R^{C30}$ | $R^{B7}$ | $R^{A52}$ |
| $L_{A46112}$ | $R^{C30}$ | $R^{B12}$ | $R^{A52}$ |
| $L_{A46113}$ | $R^{C30}$ | $R^{B20}$ | $R^{A52}$ |
| $L_{A46114}$ | $R^{C30}$ | $R^{B25}$ | $R^{A52}$ |
| $L_{A46115}$ | $R^{C30}$ | $R^{B29}$ | $R^{A52}$ |
| $L_{A46116}$ | $R^{C30}$ | $R^{A37}$ | $R^{A52}$ |
| $L_{A46117}$ | $R^{C30}$ | $R^{A43}$ | $R^{A52}$ |
| $L_{A46118}$ | $R^{C30}$ | $R^{E1}$ | $R^{A52}$ |
| $L_{A46119}$ | $R^{C30}$ | $R^{E2}$ | $R^{A52}$ |
| $L_{A46120}$ | $R^{C30}$ | $R^{E3}$ | $R^{A52}$ |
| $L_{A46121}$ | $R^{C30}$ | $R^{E4}$ | $R^{A52}$ |
| $L_{A46122}$ | $R^{C30}$ | $R^{E5}$ | $R^{A52}$ |
| $L_{A46123}$ | $R^{C30}$ | $R^{E6}$ | $R^{A52}$ |
| $L_{A46124}$ | $R^{C30}$ | $R^{E7}$ | $R^{A52}$ |
| $L_{A46125}$ | $R^{C30}$ | $R^{E8}$ | $R^{A52}$ |
| $L_{A46126}$ | $R^{C30}$ | $R^{E9}$ | $R^{A52}$ |
| $L_{A46127}$ | $R^{C30}$ | $R^{E10}$ | $R^{A52}$ |
| $L_{A46128}$ | $R^{C30}$ | $R^{E11}$ | $R^{A52}$ |
| $L_{A46129}$ | $R^{C30}$ | $R^{E12}$ | $R^{A52}$ |
| $L_{A46130}$ | $R^{C30}$ | $R^{E13}$ | $R^{A52}$ |
| $L_{A46131}$ | $R^{C30}$ | $R^{E14}$ | $R^{A52}$ |
| $L_{A46132}$ | $R^{C30}$ | $R^{E15}$ | $R^{A52}$ |
| $L_{A46133}$ | $R^{C30}$ | $R^{E16}$ | $R^{A52}$ |
| $L_{A46134}$ | $R^{C30}$ | $R^{E17}$ | $R^{A52}$ |
| $L_{A46135}$ | $R^{C30}$ | $R^{E18}$ | $R^{A52}$ |
| $L_{A46136}$ | $R^{C30}$ | $R^{E19}$ | $R^{A52}$ |
| $L_{A46137}$ | $R^{C30}$ | $R^{E20}$ | $R^{A52}$ |
| $L_{A46138}$ | $R^{C30}$ | $R^{E21}$ | $R^{A52}$ |

wherein $R^{B1}$ to $R^{B44}$ have the following structures:
$R^{B1}$
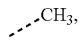
$R^{B2}$
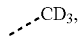
$R^{B3}$
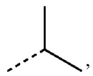
$R^{B4}$
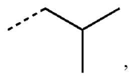
$R^{B5}$
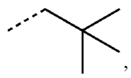
$R^{B6}$
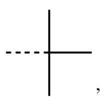
$R^{B7}$
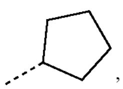
$R^{B8}$
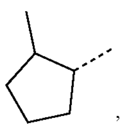
$R^{B9}$
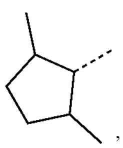
$R^{B10}$
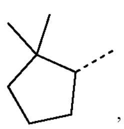
$R^{B11}$
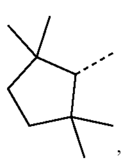
$R^{B12}$
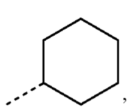
$R^{B13}$
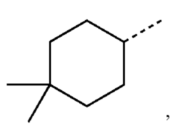
-continued
$R^{B14}$
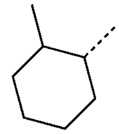
$R^{B15}$
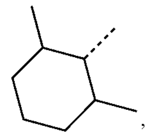
$R^{B16}$
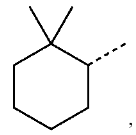
$R^{B17}$
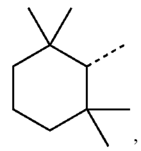
$R^{B18}$
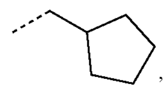
$R^{B19}$
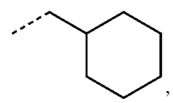
$R^{B20}$
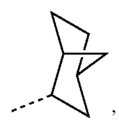
$R^{B21}$
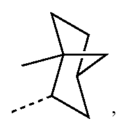
$R^{B22}$
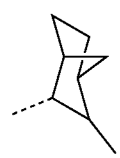
$R^{B23}$
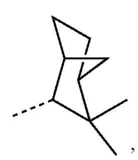
$R^{B24}$
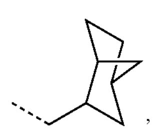

-continued
R$^{B25}$
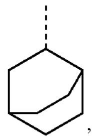
R$^{B26}$
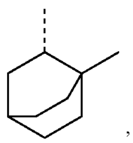
R$^{B27}$
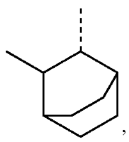
R$^{B28}$
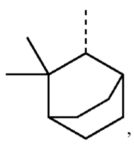
R$^{B29}$
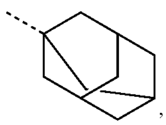
R$^{B30}$
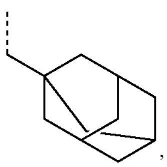
R$^{B31}$
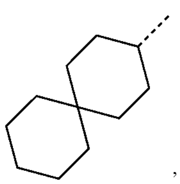
R$^{B32}$
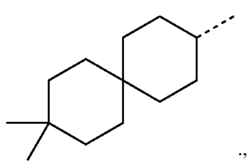
R$^{B33}$
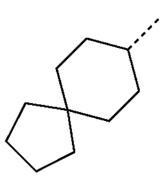
-continued
R$^{B34}$
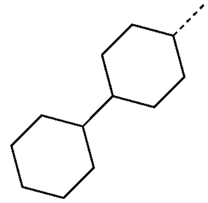
R$^{B35}$
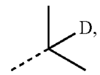
R$^{B36}$
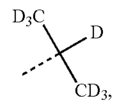
R$^{B37}$
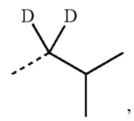
R$^{B38}$
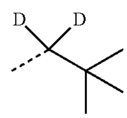
R$^{B39}$
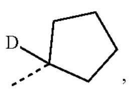
R$^{B40}$
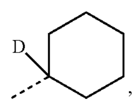
R$^{B41}$
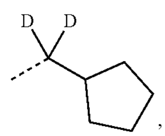
R$^{B42}$
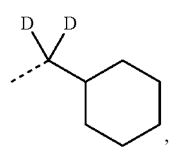
R$^{B43}$
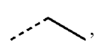
R$^{B44}$
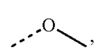
and
R$^{B45}$
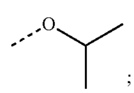
wherein R$^{A1}$ to R$^{A51}$ have the following structures:
R$^{A1}$
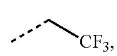

-continued
$R^{A2}$
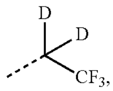
$R^{A3}$
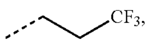
$R^{A4}$
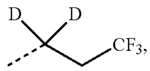
$R^{A5}$
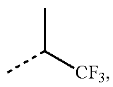
$R^{A6}$
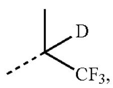
$R^{A7}$
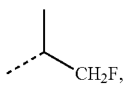
$R^{A8}$
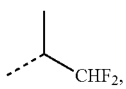
$R^{A9}$
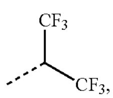
$R^{A10}$
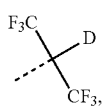
$R^{A11}$
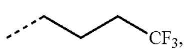
$R^{A12}$
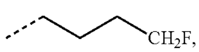
$R^{A13}$
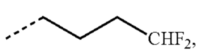
$R^{A14}$
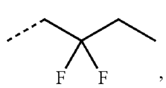
$R^{A15}$
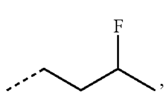
$R^{A16}$
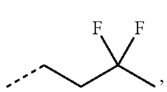
$R^{A17}$
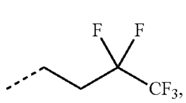
$R^{A18}$
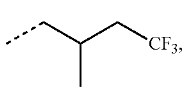
-continued
$R^{A19}$
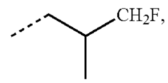
$R^{A20}$
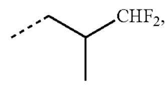
$R^{A21}$
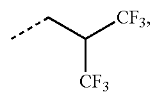
$R^{A22}$
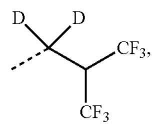
$R^{A23}$
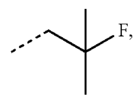
$R^{A24}$
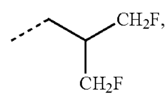
$R^{A25}$
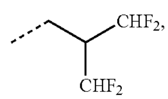
$R^{A26}$
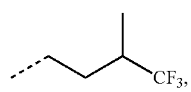
$R^{A27}$
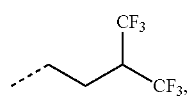
$R^{A28}$
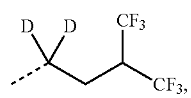
$R^{A29}$
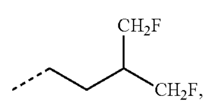
$R^{A30}$
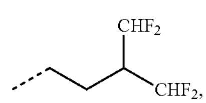
$R^{A31}$
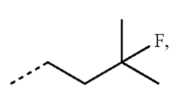
$R^{A32}$
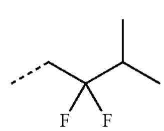

-continued
$R^{A33}$
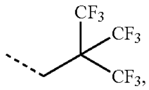
$R^{A34}$
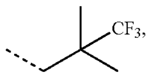
$R^{A35}$
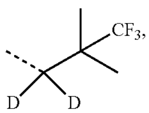
$R^{A36}$
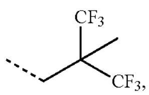
$R^{A37}$
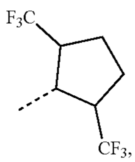
$R^{A38}$
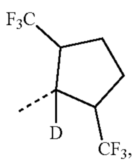
$R^{A39}$
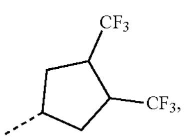
$R^{A40}$
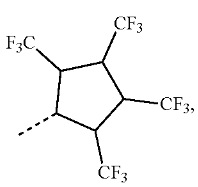
$R^{A41}$
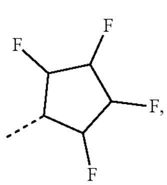
$R^{A42}$
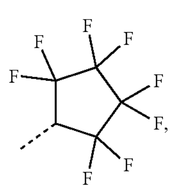
-continued
$R^{A43}$
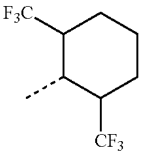
$R^{A44}$
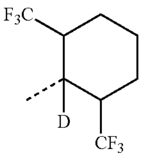
$R^{A45}$
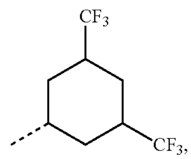
$R^{A46}$
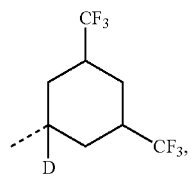
$R^{A47}$
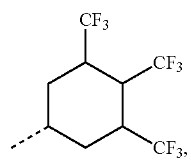
$R^{A48}$
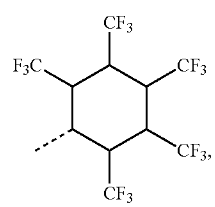
$R^{A49}$
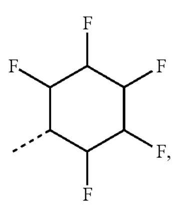
$R^{A50}$
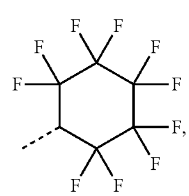
$R^{A51}$
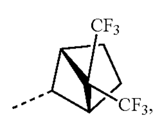
and -continued
$R^{A52}$
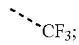
wherein $R^{E1}$ to $R^{E21}$ have the following structures:
$R^{E1}$
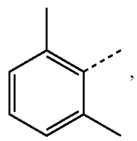
$R^{E2}$
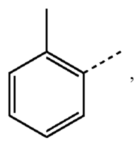
$R^{E3}$
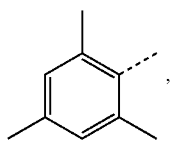
$R^{E4}$
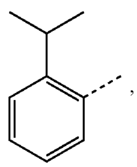
$R^{E5}$
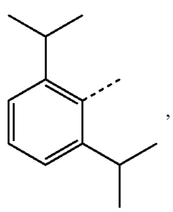
$R^{E6}$
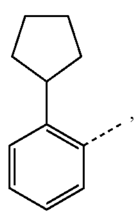
$R^{E7}$
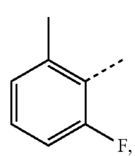
$R^{E8}$
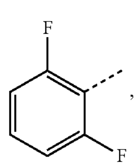
-continued
$R^{E9}$
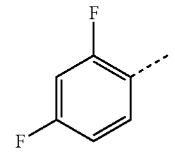
$R^{E10}$
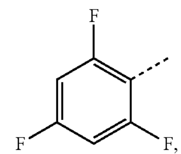
$R^{E11}$
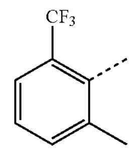
$R^{E12}$
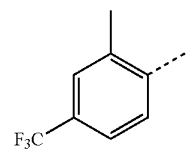
$R^{E13}$
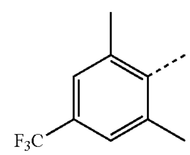
$R^{E14}$
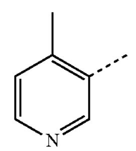
$R^{E15}$
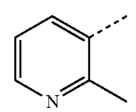
$R^{E16}$
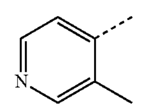
$R^{E17}$
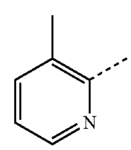
$R^{E18}$
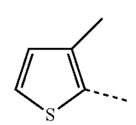
$R^{E19}$
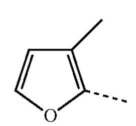

-continued
$R^{E20}$
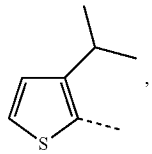
$R^{E21}$
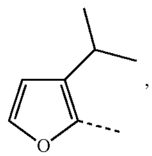
wherein $L_{6139}$ through $L_{A6154}$ have the following structures:
$L_{A6139}$
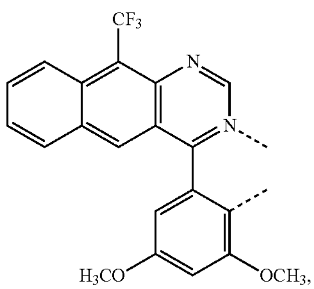
$L_{A6140}$
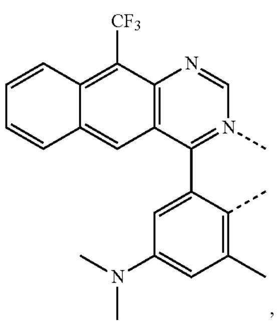
$L_{A6141}$
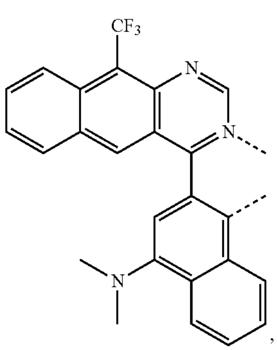
-continued
$L_{A6142}$
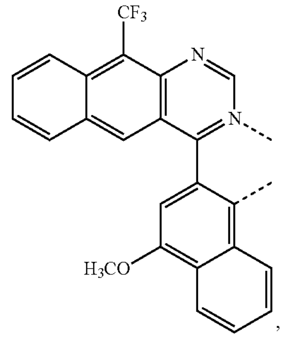
$L_{A6143}$
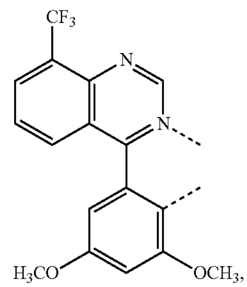
$L_{A6144}$
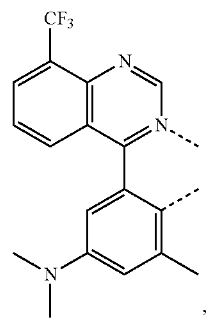
$L_{A6145}$
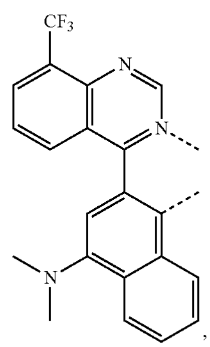
$L_{A6146}$
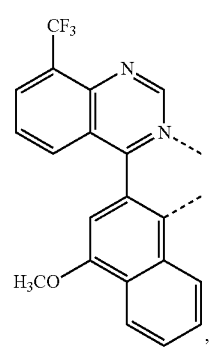

-continued
$L_{A6147}$
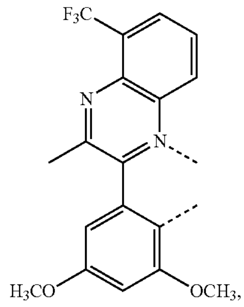
$L_{A6148}$
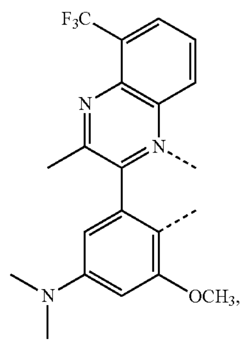
$L_{A6149}$
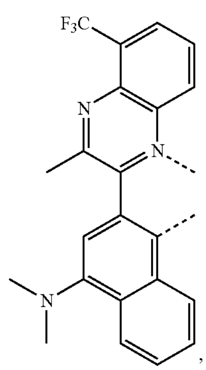
$L_{A6150}$
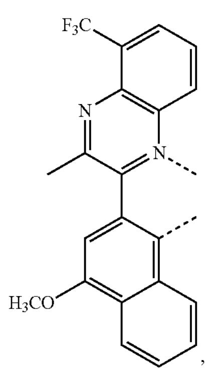
-continued
$L_{A6151}$
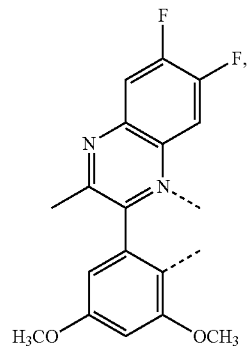
$L_{A6152}$
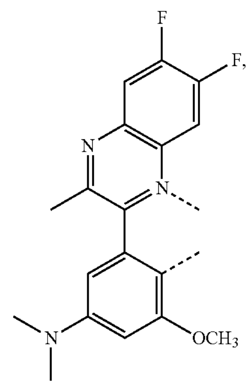
$L_{A6153}$
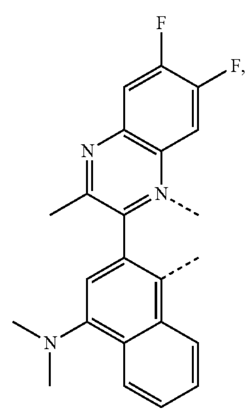
and
$L_{A6154}$
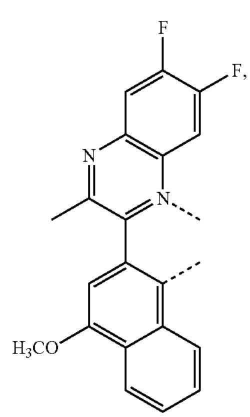
In some embodiments of the compound, the ligand $L_B$ is selected from the group consisting of:

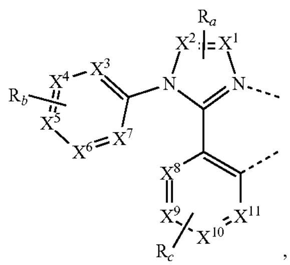
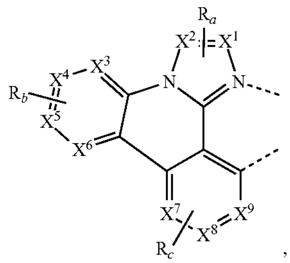
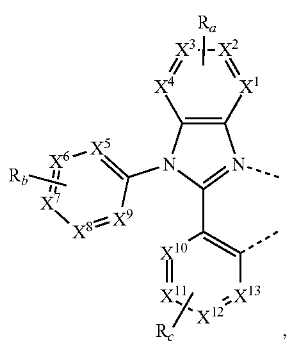
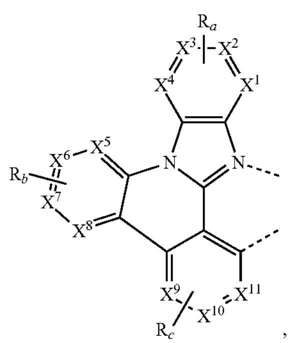
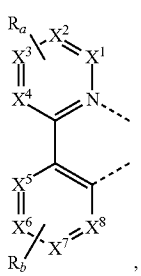
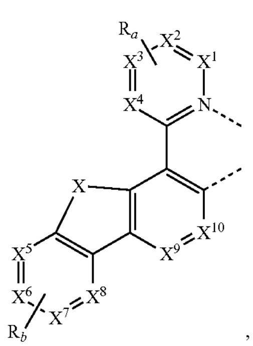
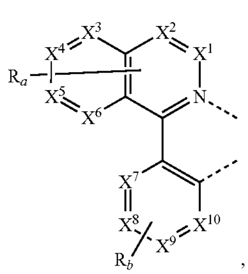
-continued
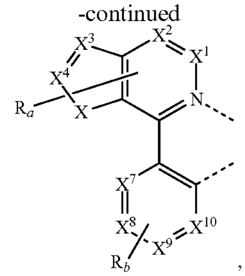
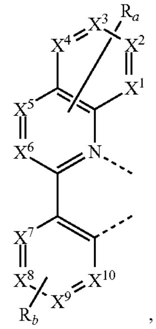
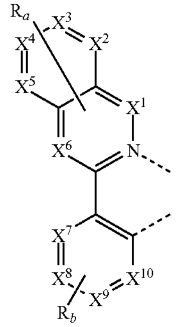
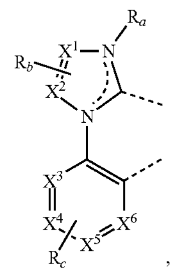
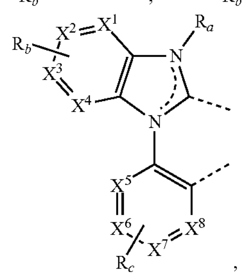
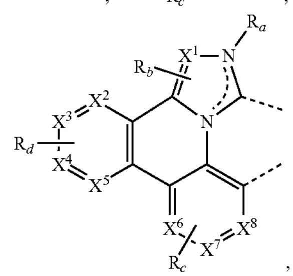
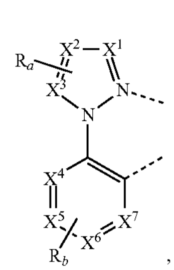
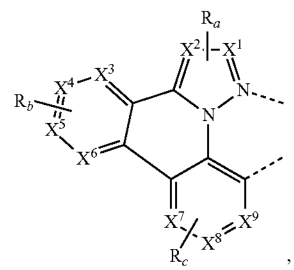
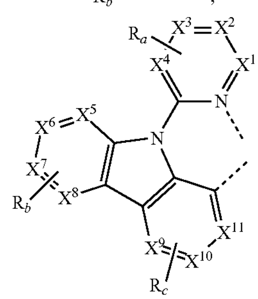
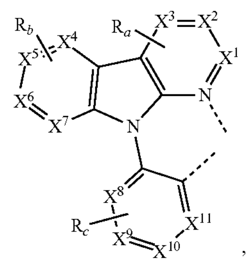
and
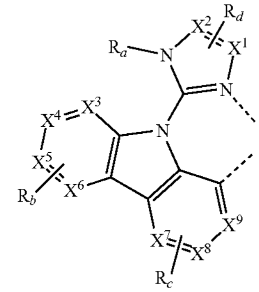
;

wherein each $X^1$ to $X^{13}$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each of $R_a$, $R_b$, $R_c$, and $R_d$ represents from a mono substitution to a maximum possible number of substitutions, or no substitution;

wherein R', R", $R_a$, $R_b$, $R_c$, and $R_d$ are each independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein any two adjacent substituents of $R_a$, $R_b$, $R_c$, and $R_d$ are optionally fused or joined to form a ring or form a multidentate ligand.

In some embodiments of the compound, the ligand $L_B$ is selected from the group consisting of:

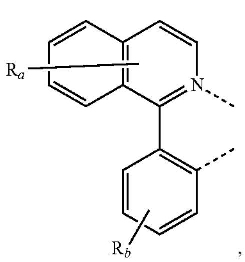
,
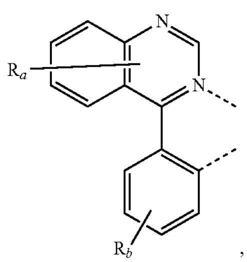
,
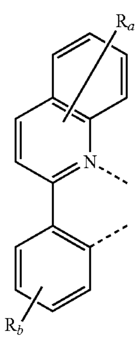
,
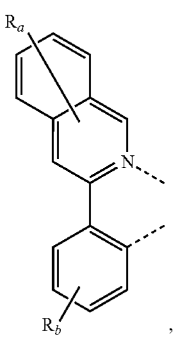
,
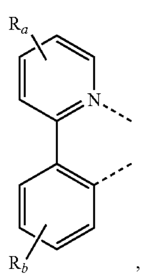
,
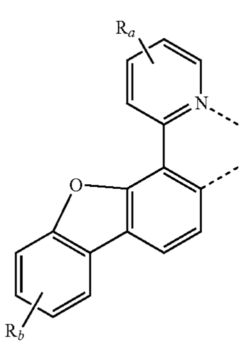
,
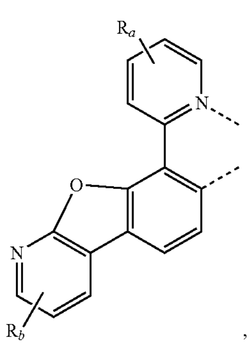
, -continued

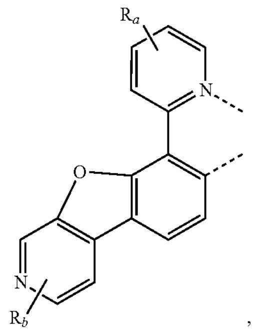
,
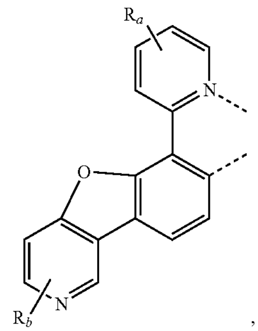
,
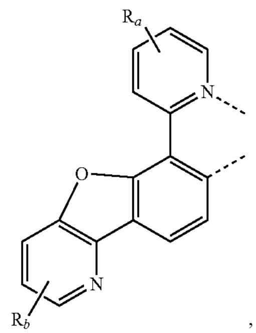
,
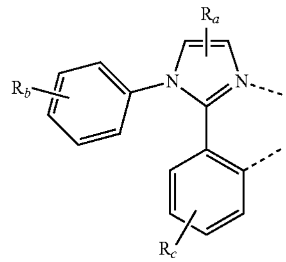
,
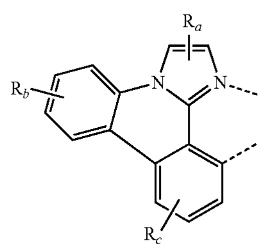
,
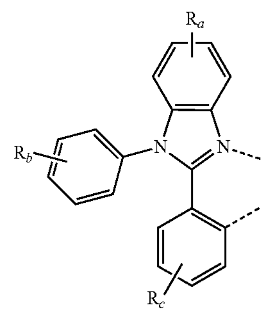
,
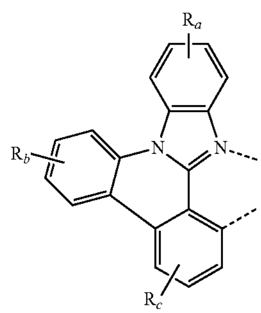
,
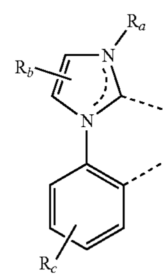
,
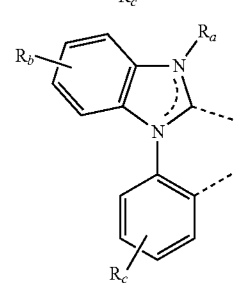
,
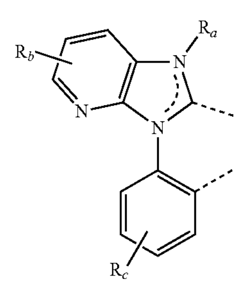
, -continued

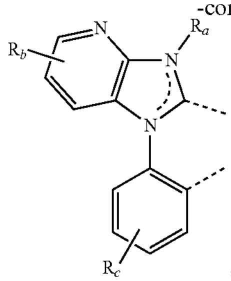,
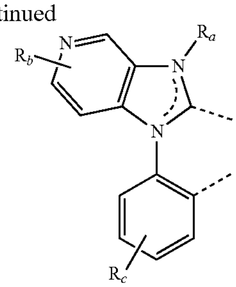,
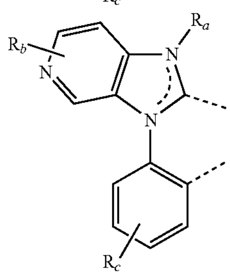,
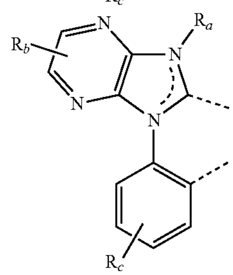,
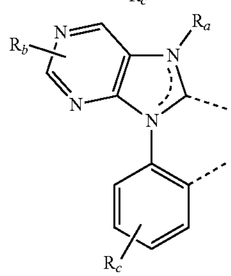, and
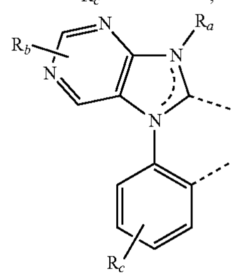.

In some embodiments of the compound, the ligand $L_C$ is selected from the group consisting of:
$L_{C1}$ through $L_{C1260}$ that are based on a structure of Formula XIV,

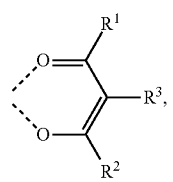

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |

-continued

| Ligand | $R^1$ | $R^2$ | $R^3$ |
|---|---|---|---|
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D13}$ | H |
| $L_{C96}$ | $R^{D2}$ | $R^{D14}$ | H |

-continued

| Ligand | $R^1$ | $R^2$ | $R^3$ |
|---|---|---|---|
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |

-continued

| Ligand | $R^1$ | $R^2$ | $R^3$ |
|---|---|---|---|
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |

-continued

| Ligand | $R^1$ | $R^2$ | $R^3$ |
|---|---|---|---|
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |

-continued

| Ligand | $R^1$ | $R^2$ | $R^3$ |
|---|---|---|---|
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |

-continued

| Ligand | $R^1$ | $R^2$ | $R^3$ |
|---|---|---|---|
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |

-continued

| Ligand | $R^1$ | $R^2$ | $R^3$ |
|---|---|---|---|
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D76}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |

-continued

| Ligand | $R^1$ | $R^2$ | $R^3$ |
|---|---|---|---|
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |

-continued

| Ligand | $R^1$ | $R^2$ | $R^3$ |
|---|---|---|---|
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |
| $L_{C680}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D1}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |

-continued

| Ligand | $R^1$ | $R^2$ | $R^3$ |
|---|---|---|---|
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |

-continued

| Ligand | $R^1$ | $R^2$ | $R^3$ |
|---|---|---|---|
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |

-continued

| Ligand | $R^1$ | $R^2$ | $R^3$ |
|---|---|---|---|
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |

-continued

| Ligand | $R^1$ | $R^2$ | $R^3$ |
|---|---|---|---|
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D18}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |

| Ligand | $R^1$ | $R^2$ | $R^3$ |
|---|---|---|---|
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |

| Ligand | $R^1$ | $R^2$ | $R^3$ |
|---|---|---|---|
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D20}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |

-continued

| Ligand | $R^1$ | $R^2$ | $R^3$ |
|---|---|---|---|
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$ |

wherein $R^{D1}$ to $R^{D81}$ has the following structures:

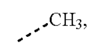

$R^{D1}$

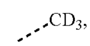

$R^{D2}$

$R^{D3}$

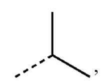

$R^{D4}$

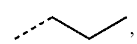

$R^{D5}$

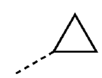

$R^{D6}$

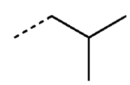

$R^{D7}$

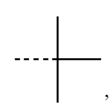

$R^{D8}$

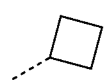

$R^{D9}$

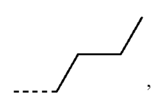

$R^{D10}$

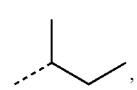

$R^{D11}$

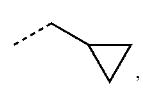

$R^{D12}$

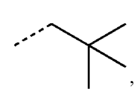

$R^{D13}$

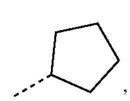

$R^{D14}$ $R^{D15}$
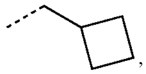
$R^{D16}$
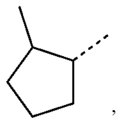
$R^{D17}$
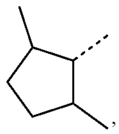
$R^{D18}$
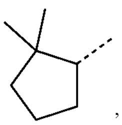
$R^{D19}$
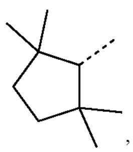
$R^{D20}$
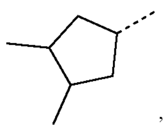
$R^{D21}$
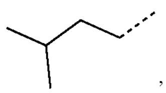
$R^{D22}$
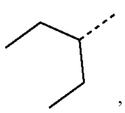
$R^{D23}$
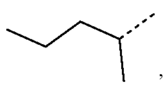
$R^{D24}$
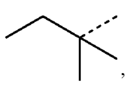
$R^{D25}$
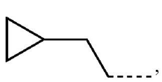
$R^{D26}$
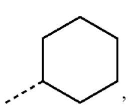
$R^{D27}$
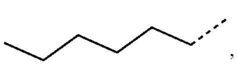
$R^{D28}$
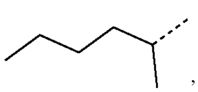
$R^{D29}$
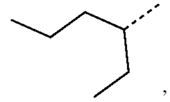
$R^{D30}$
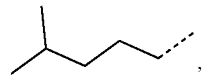
$R^{D31}$
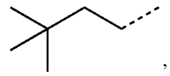
$R^{D32}$
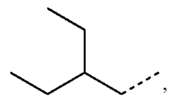
$R^{D33}$
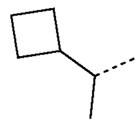
$R^{D34}$
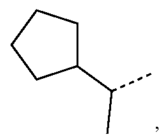
$R^{D35}$
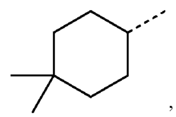
$R^{D36}$
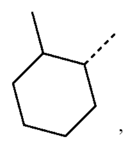
$R^{D37}$
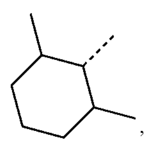
$R^{D38}$
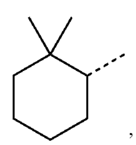
$R^{D39}$
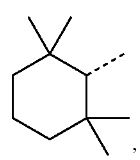
$R^{D40}$
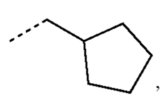

-continued
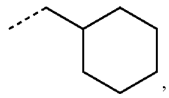
$R^{D41}$
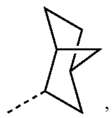
$R^{D42}$
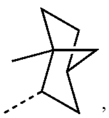
$R^{D43}$
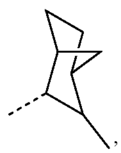
$R^{D44}$
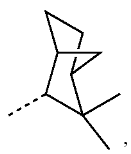
$R^{D45}$
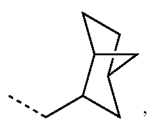
$R^{D46}$
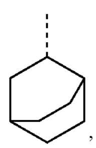
$R^{D47}$
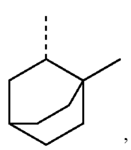
$R^{D48}$
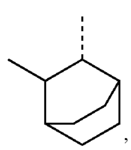
$R^{D49}$
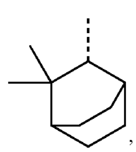
$R^{D50}$
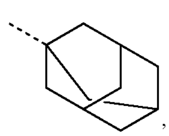
$R^{D51}$
-continued
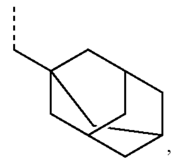
$R^{D52}$
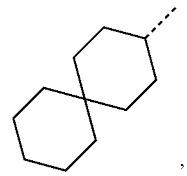
$R^{D53}$
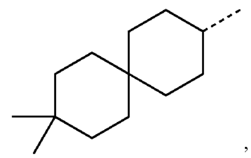
$R^{D54}$
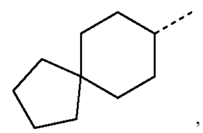
$R^{D55}$
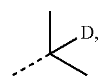
$R^{D56}$
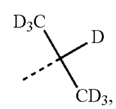
$R^{D57}$
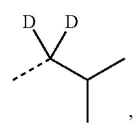
$R^{D58}$
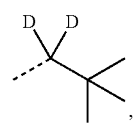
$R^{D59}$
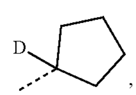
$R^{D60}$
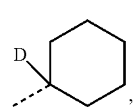
$R^{D61}$
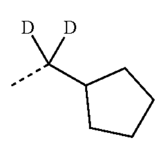
$R^{D62}$ -continued $R^{D63}$

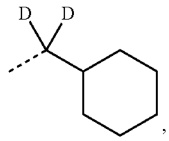

$R^{D64}$

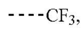

$R^{D65}$

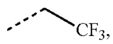

$R^{D66}$

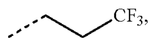

$R^{D67}$

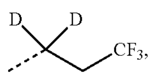

$R^{D68}$

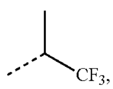

$R^{D69}$

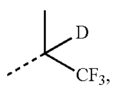

$R^{D70}$

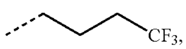

$R^{D71}$

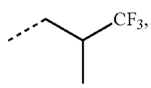

$R^{D72}$

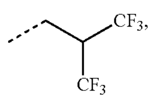

$R^{D73}$

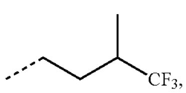

$R^{D74}$

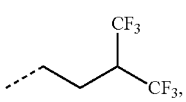

$R^{D75}$

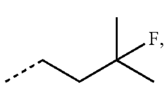

$R^{D76}$

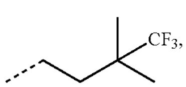

$R^{D77}$

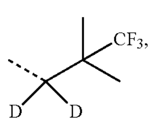

$R^{D78}$

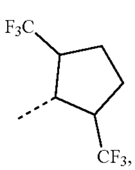

-continued $R^{D79}$

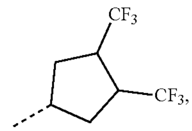

$R^{D80}$

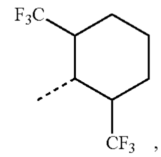

, and $R^{D81}$

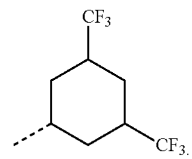

In some embodiments of the compound, the compound is selected from the group consisting of Compound x having the formula $Ir(L_{Ai})_2(L_{Cj})$; wherein x is an integer defined by x=12601+j−1260; wherein i is an integer from 1 to 7354, and j is an integer from 1 to 1260; wherein $L_{C1}$ through $L_{C1260}$ have the structures as defined above.

A first device comprising a first organic light emitting device (OLED) is also disclosed. The first OLED comprises: an anode; a cathode; and an organic layer, disposed between the anode and the cathode, comprising a compound having a formula $M(L_A)_x(L_B)_y(L_C)_z$: wherein the ligand $L_A$ is selected from the group consisting of

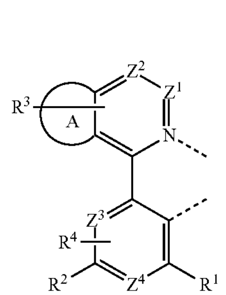

,

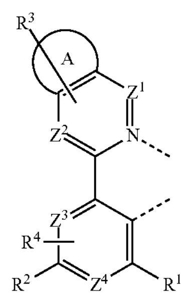

, and

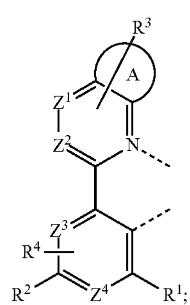

the ligand $L_B$ is

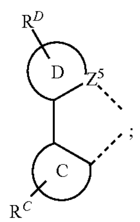

the ligand $L_C$ is

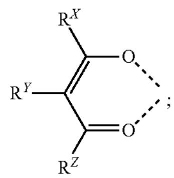

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R_D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen.

In some embodiments of the first device, one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments of the first device, $R^2$ is an electron donating group having Hammett constant $\sigma_p$ less than 0, $R^1$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments of the first device, $R^3$, $R^4$, $R^C$, $R^D$, $R^X$, $R^Y$, and $R^Z$ are independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

A consumer product comprising the OLED is also disclosed.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises a compound having a formula $M(L_A)_x(L_B)_y(L_C)_z$: wherein the ligand $L_A$ is selected from the group consisting of

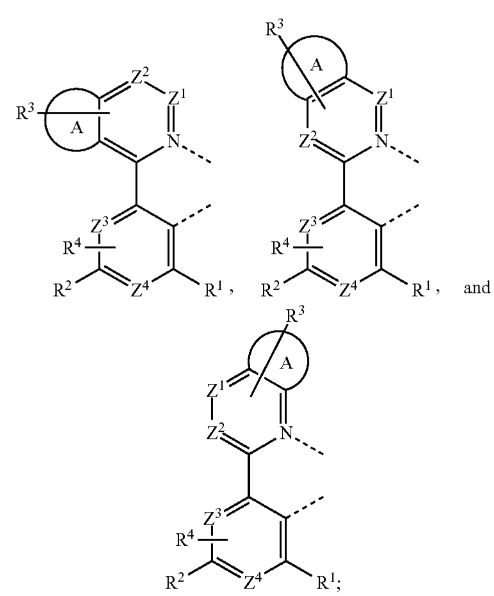

the ligand $L_B$ is

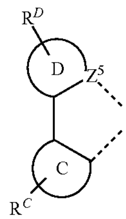

;

the ligand $L_C$ is

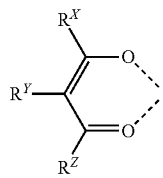

;

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen.

In some embodiments of the emissive region, the compound is an emissive dopant or a non-emissive dopant. In some embodiments of the emissive region, the emissive region further comprises a host, wherein the host comprises at least one selected from the group consisting of metal complex, triphenylene, carbazole, dibenzothiophene, dibenzofuran, dibenzoselenophene, azatriphenylene, aza-carbazole, aza-dibenzothiophene, aza-dibenzofuran, and aza-dibenzoselenophene.

In some embodiments of the emissive region, the emissive region further comprises a host selected from the group consisting of:

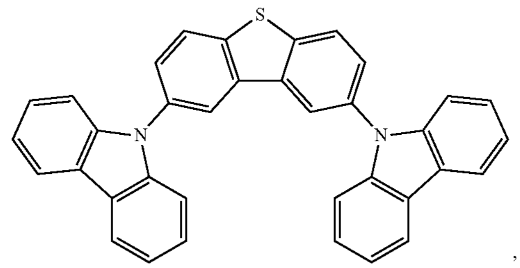

,

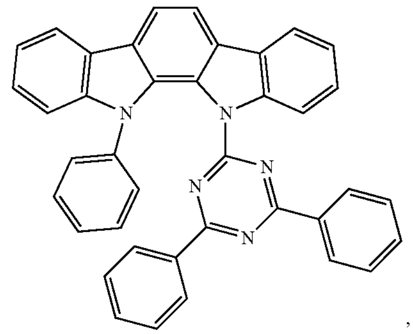

,

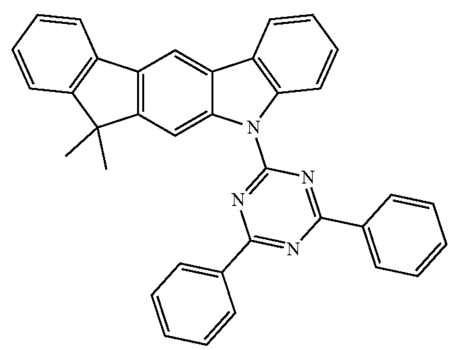

,

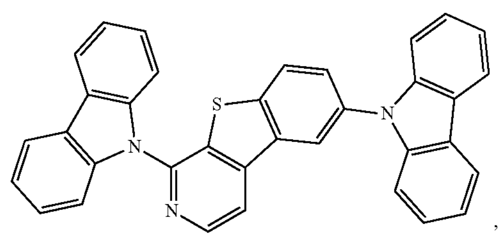

,

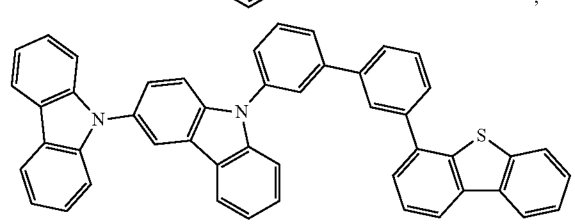

,

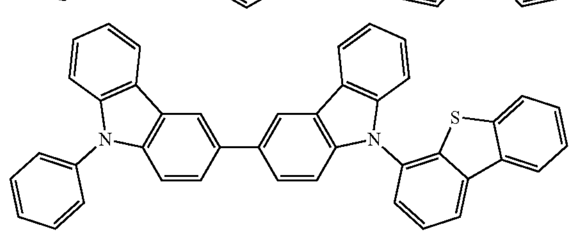

,

-continued
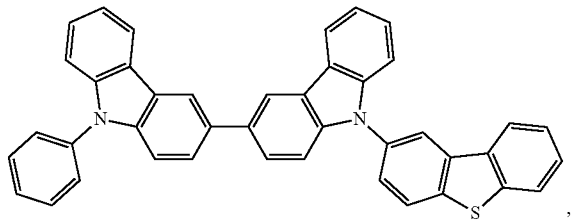
,
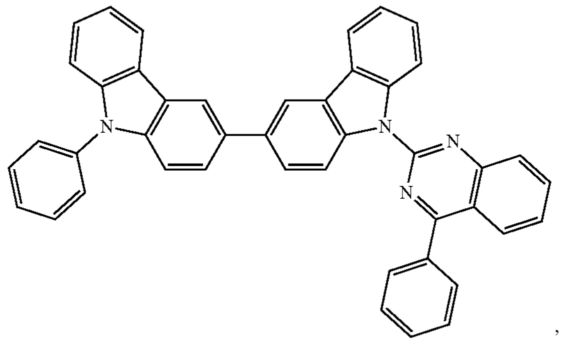
,
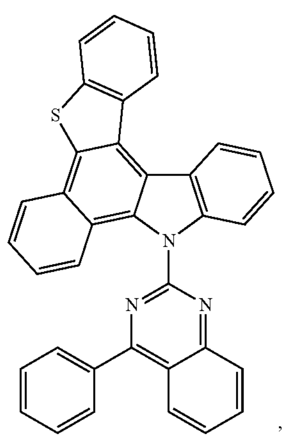
,
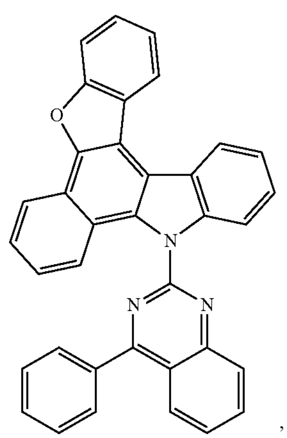
,
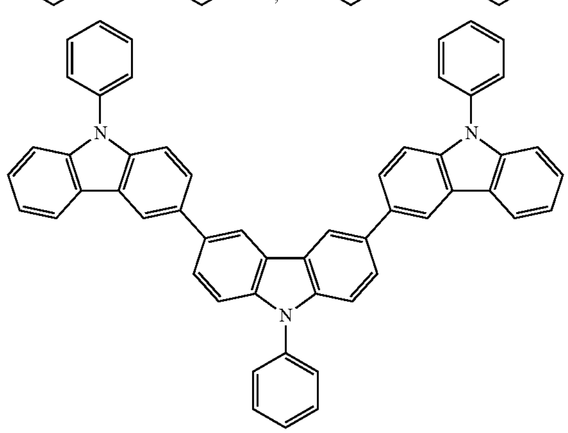
,
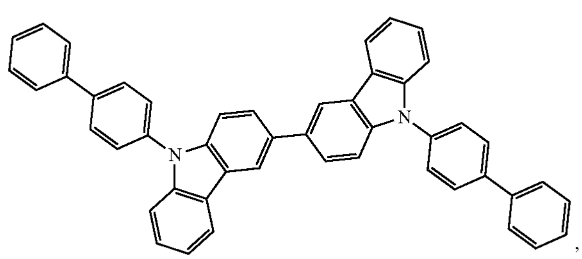
,
-continued
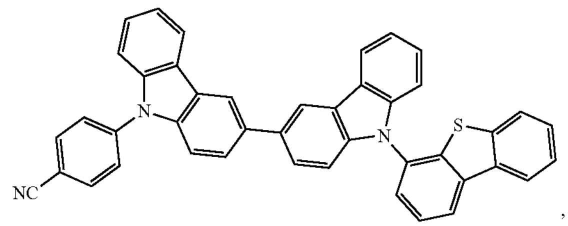
,
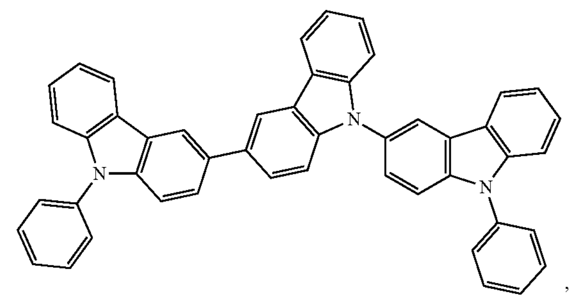
,
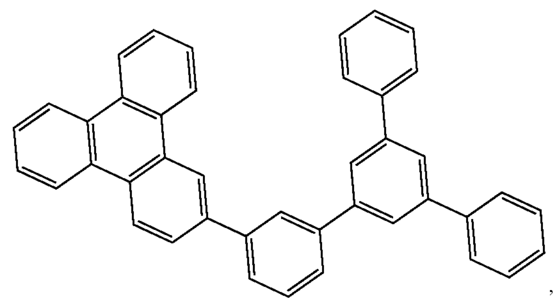
,
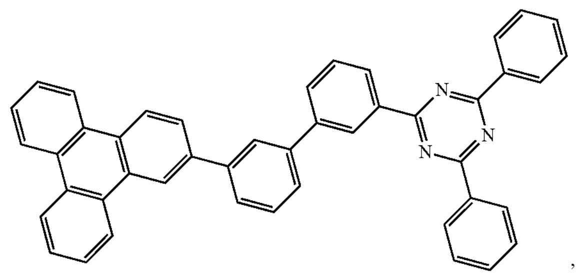
,
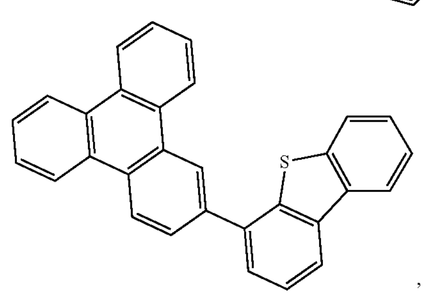
,
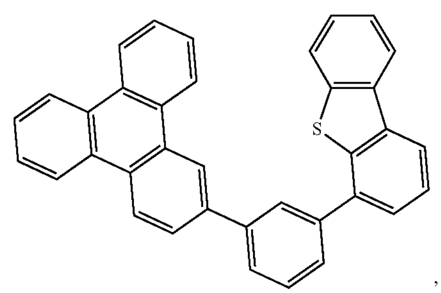
, -continued

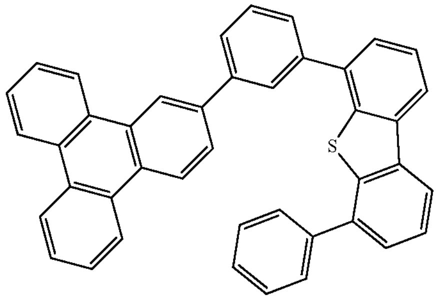

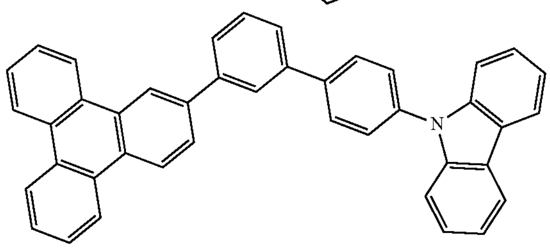

,

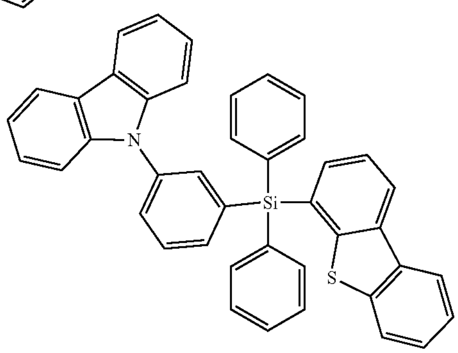

,

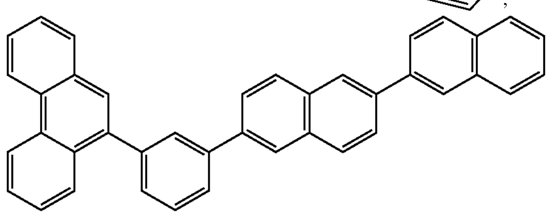

, and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

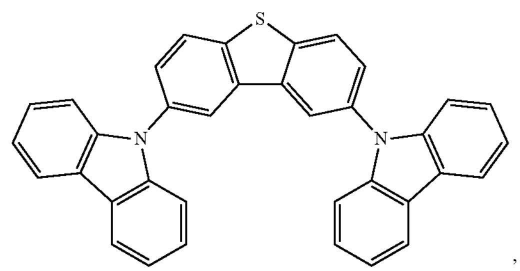

,

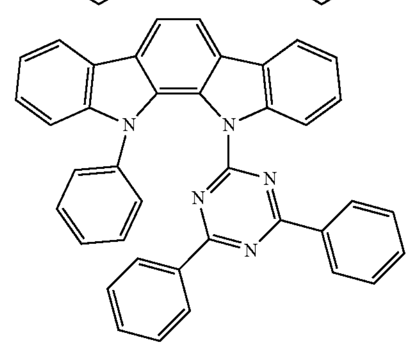

,

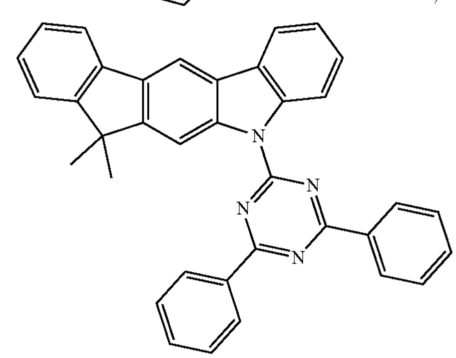

,

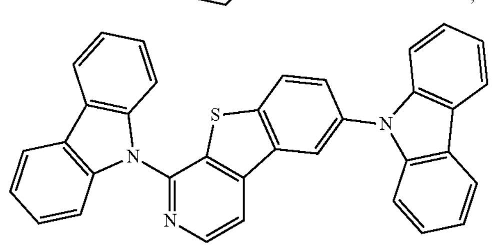

,

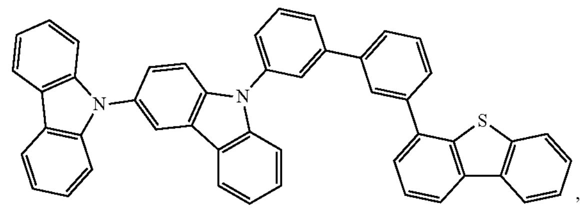
,
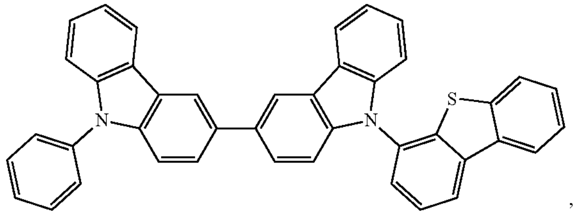
,
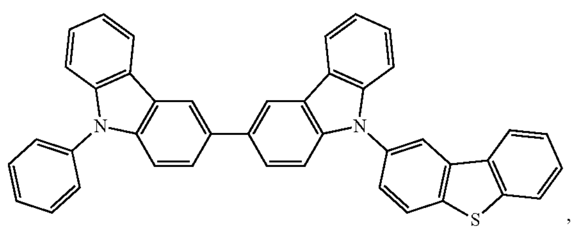
,
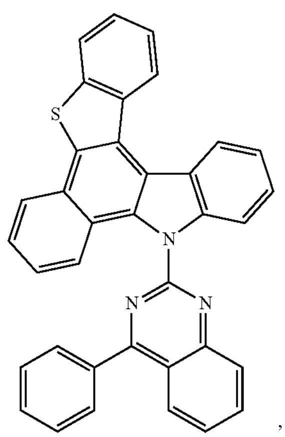
,
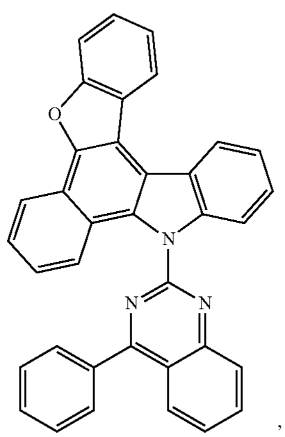
,
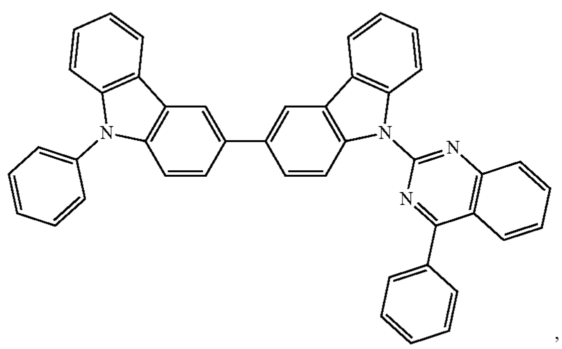
,
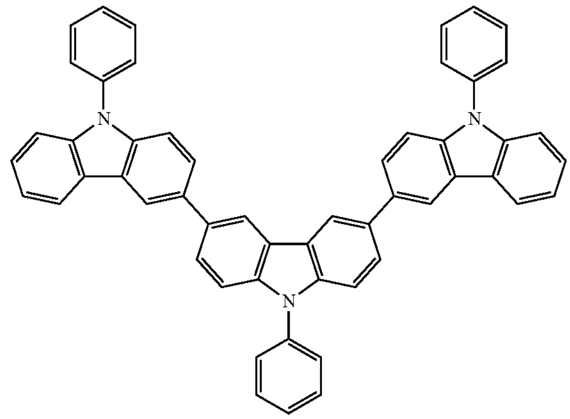
,
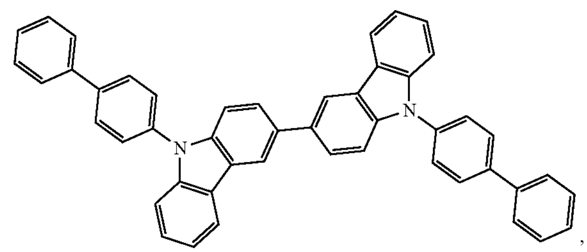
,
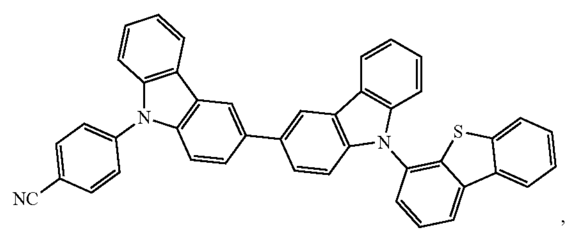
,
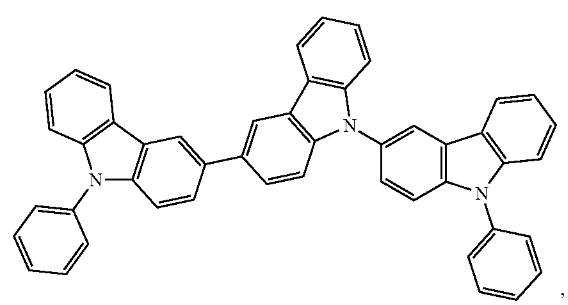
,
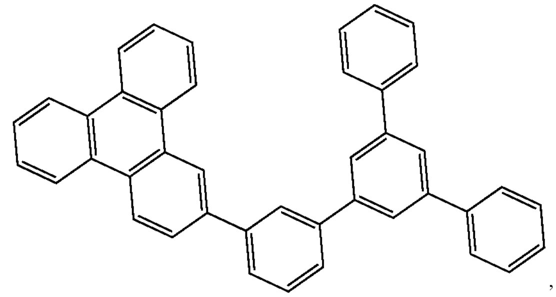
, -continued

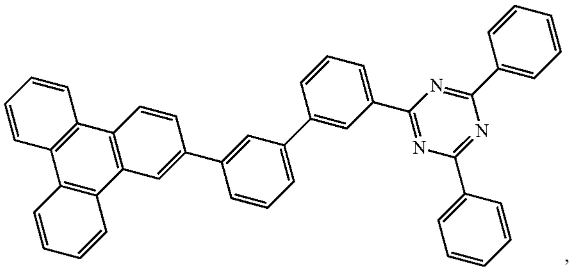

,

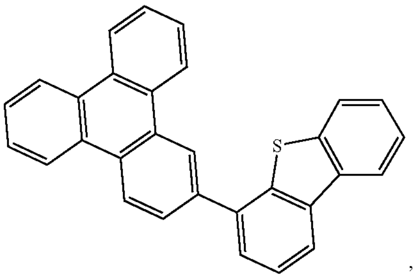

,

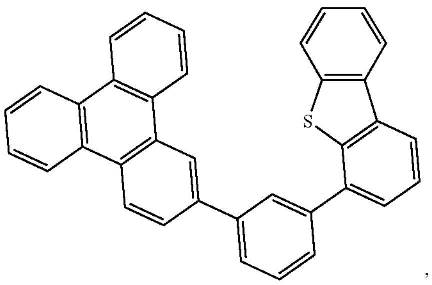

,

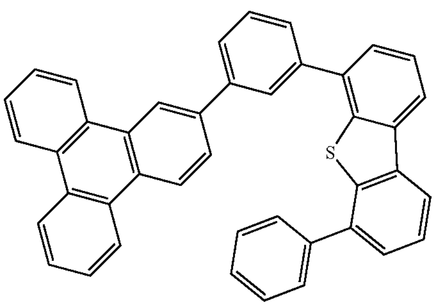

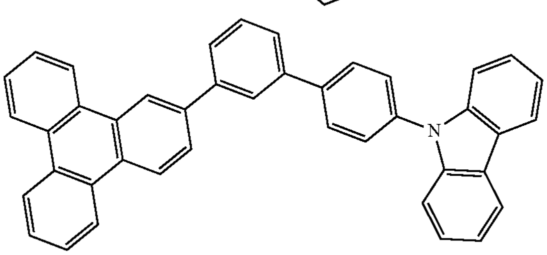

,

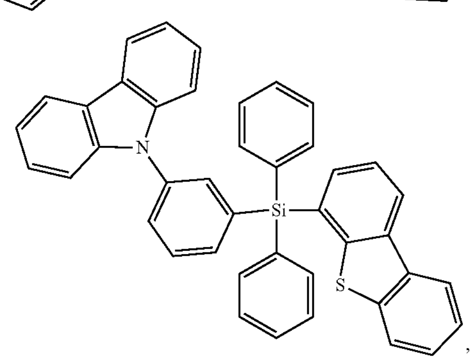

,

-continued

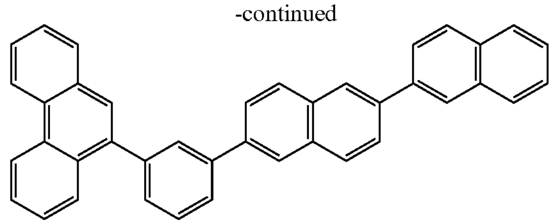

, and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

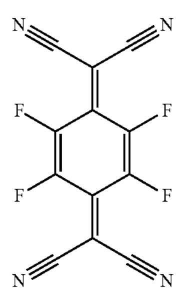

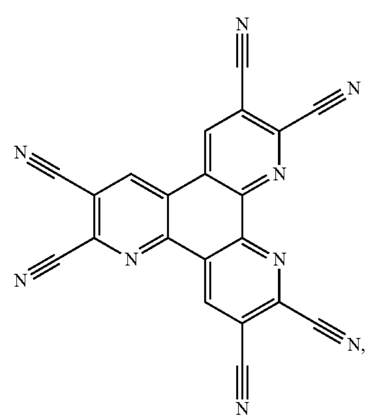

-continued

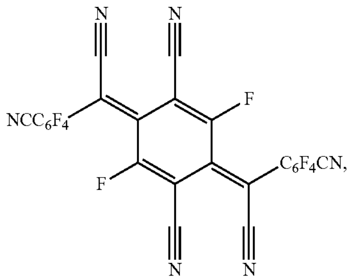

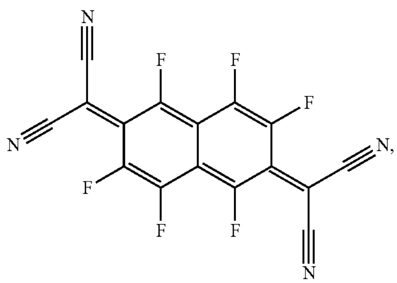

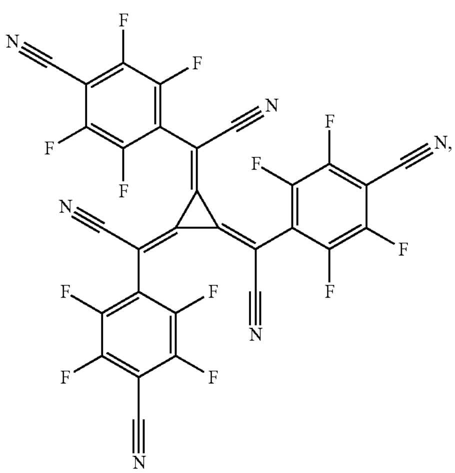

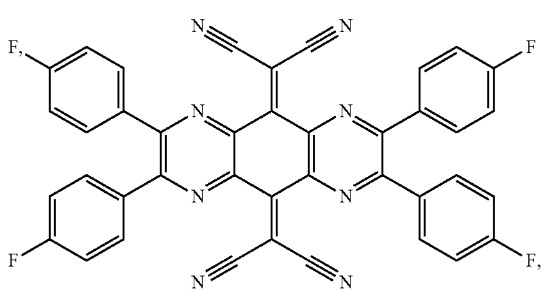

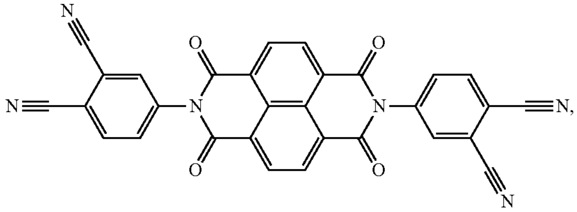

-continued

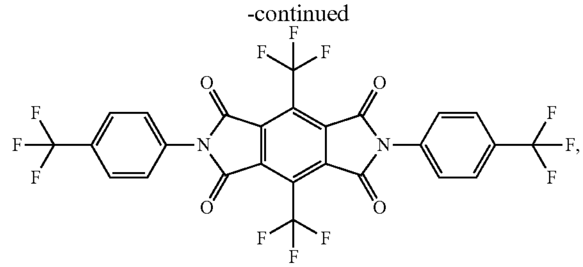

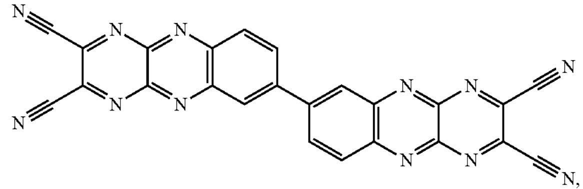

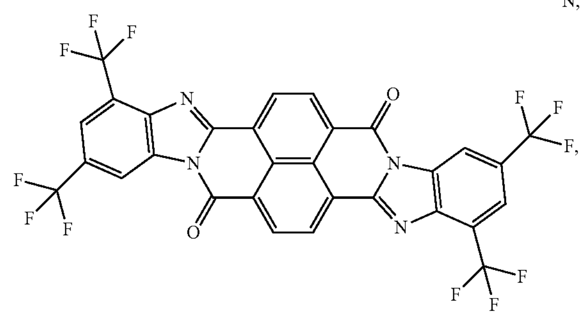

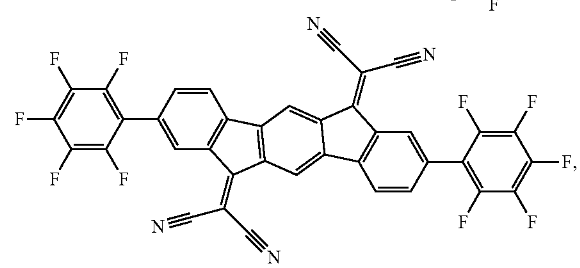

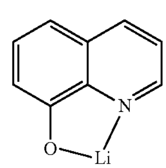

, and

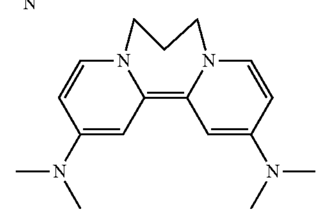

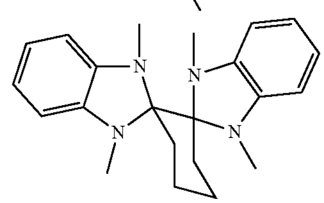

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$;

a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

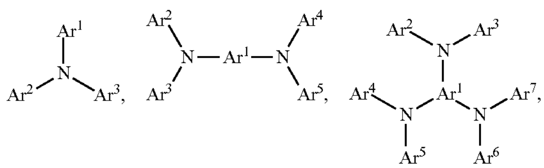

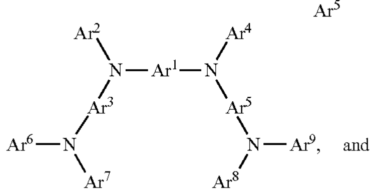

and

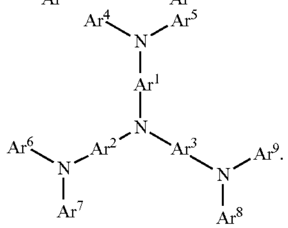

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

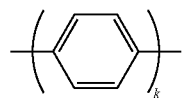,

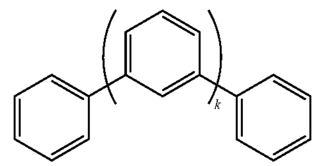,

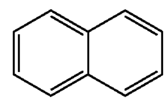,

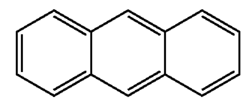,

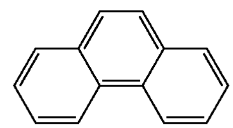,

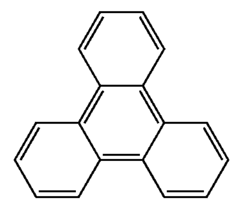,

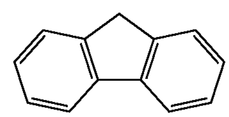, and

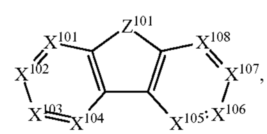

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

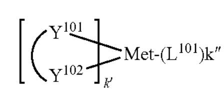

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.
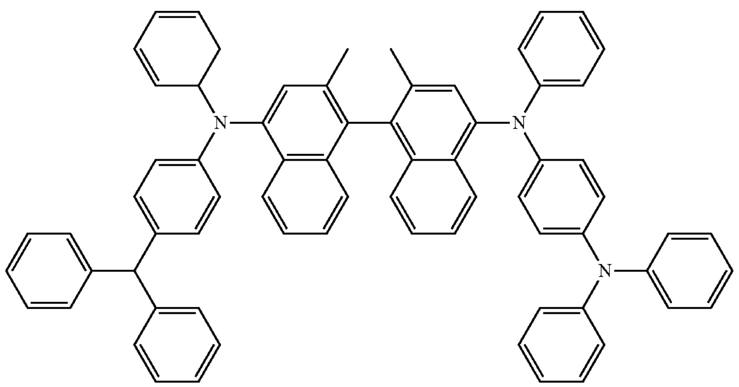
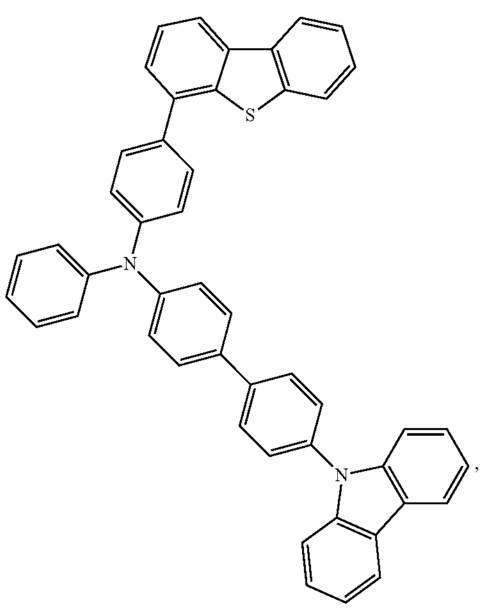

-continued
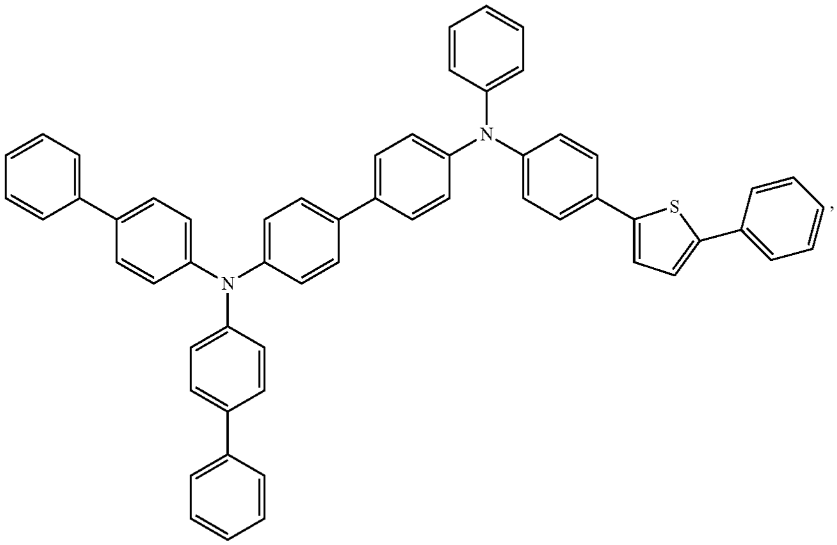,
,
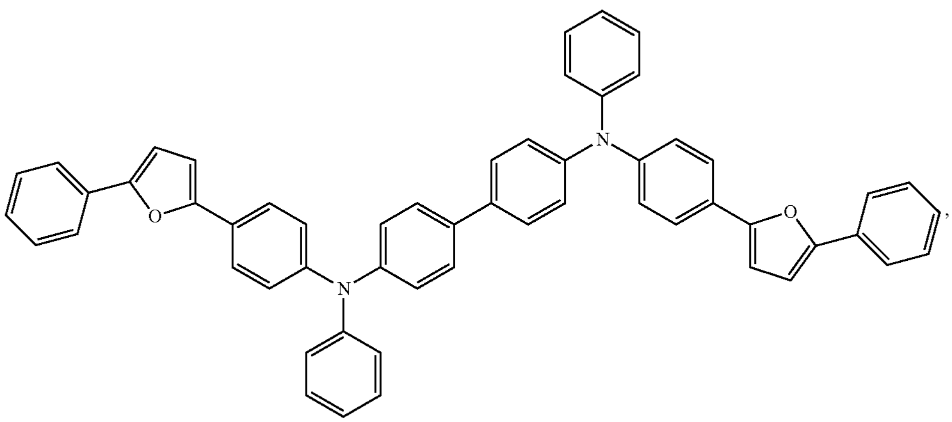,
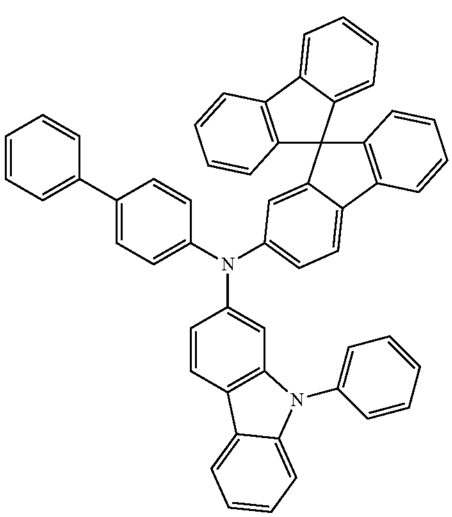,
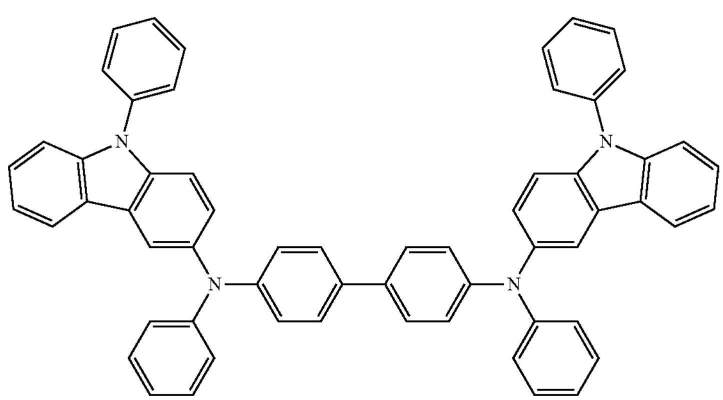,

-continued
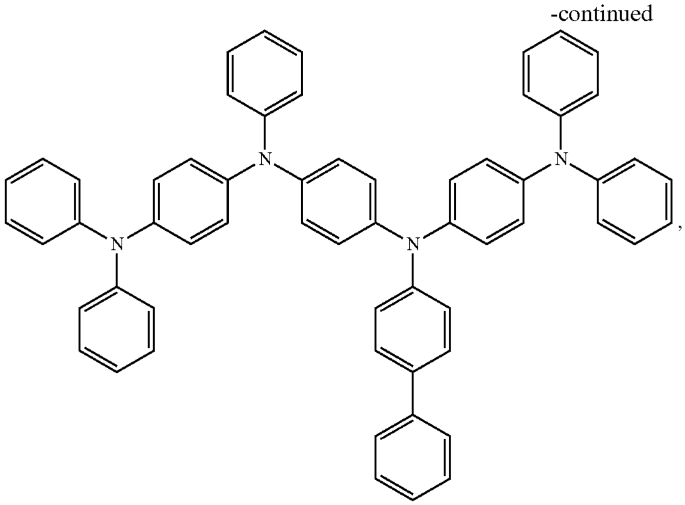
,
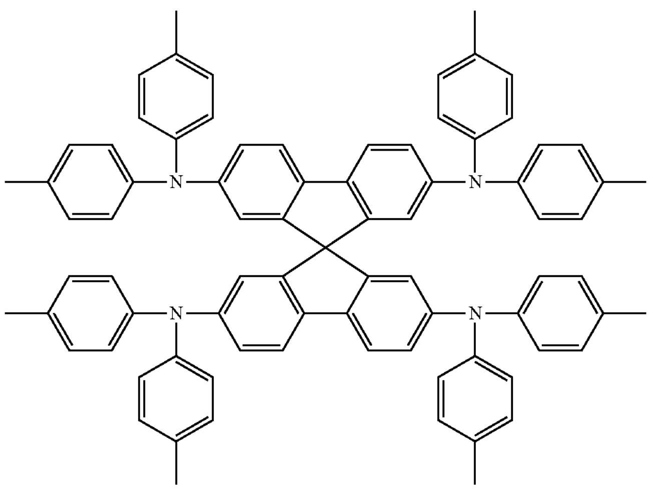
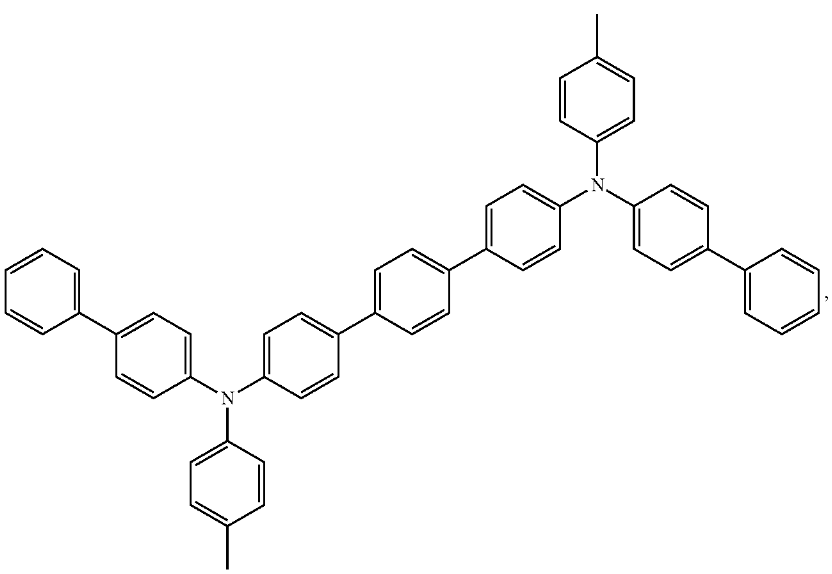
,

-continued
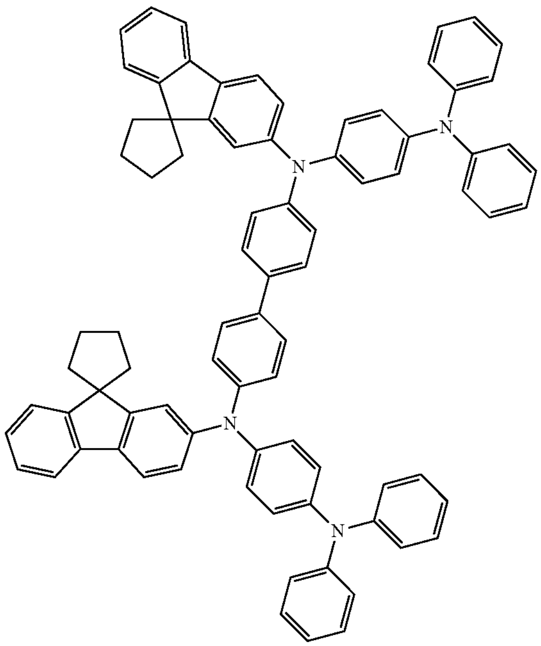
,
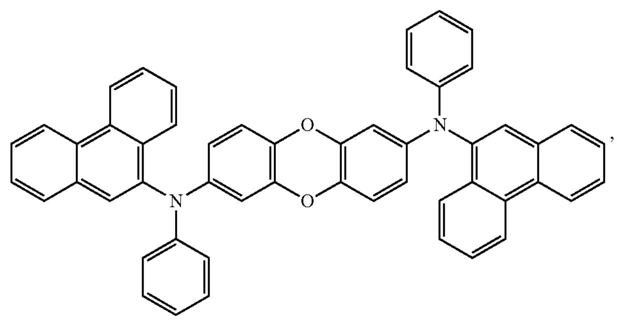
,
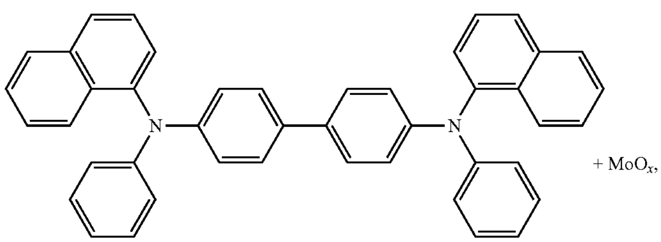
+ $MoO_x$,
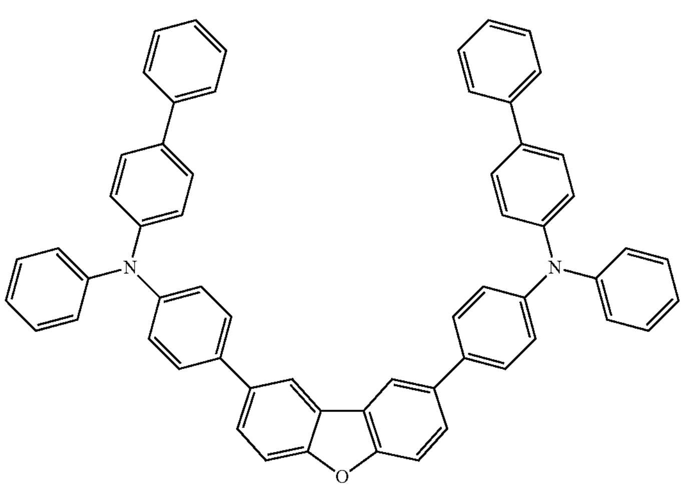
,
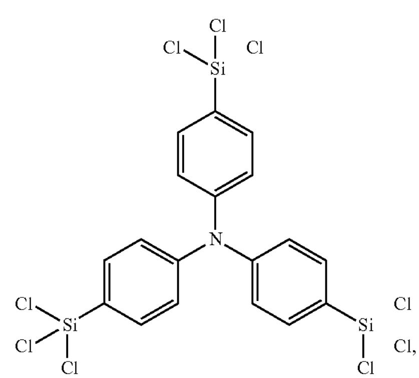

-continued
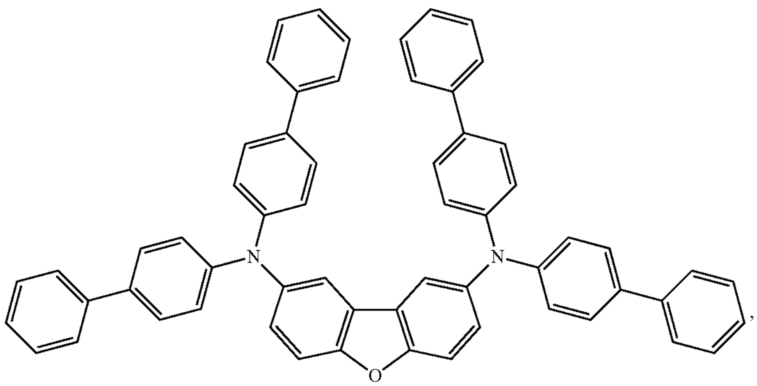,
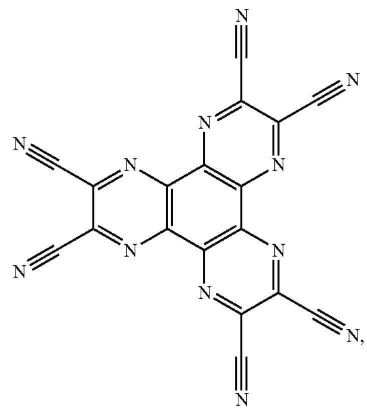
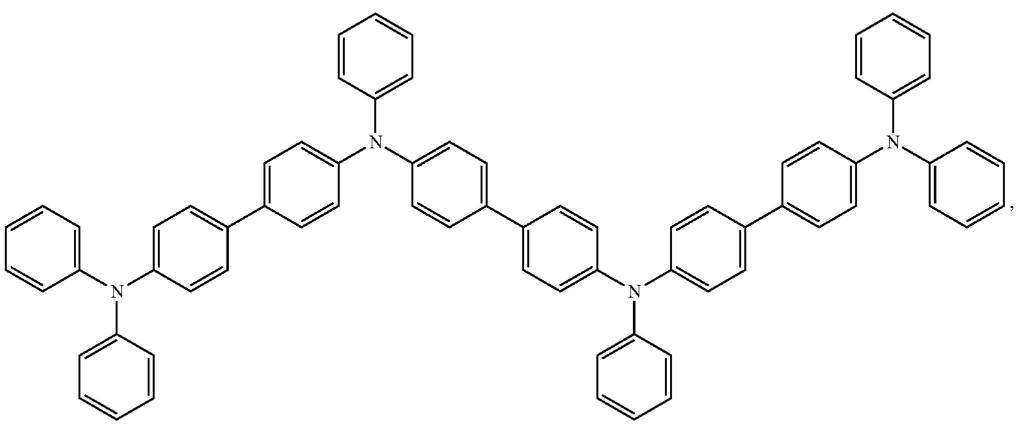,
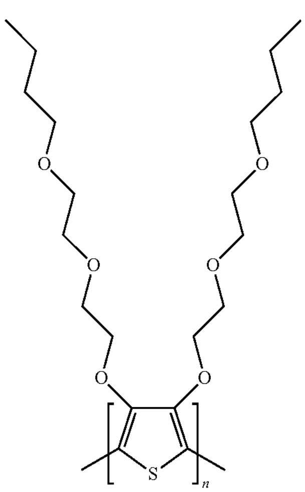,
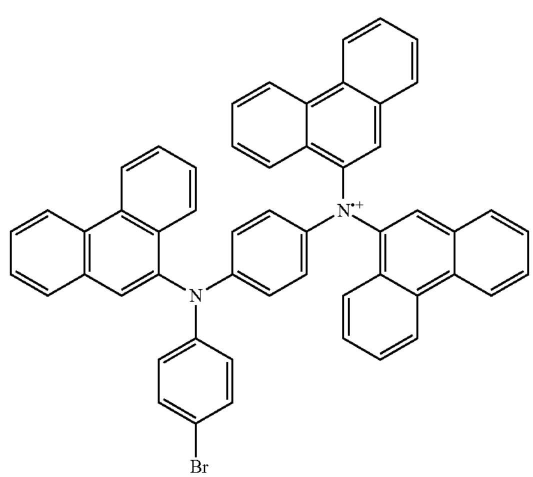,

-continued
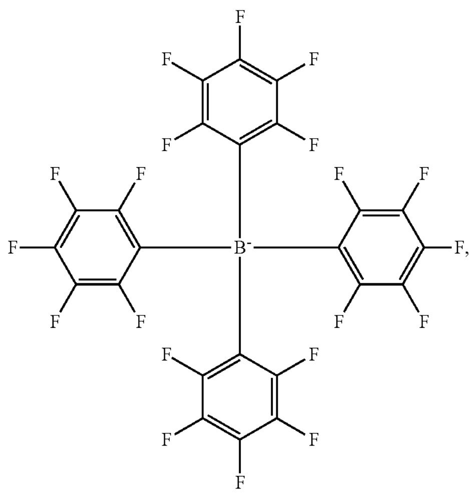
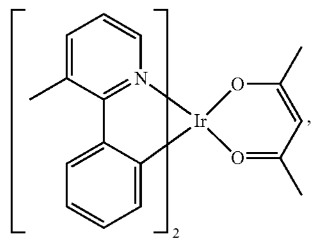
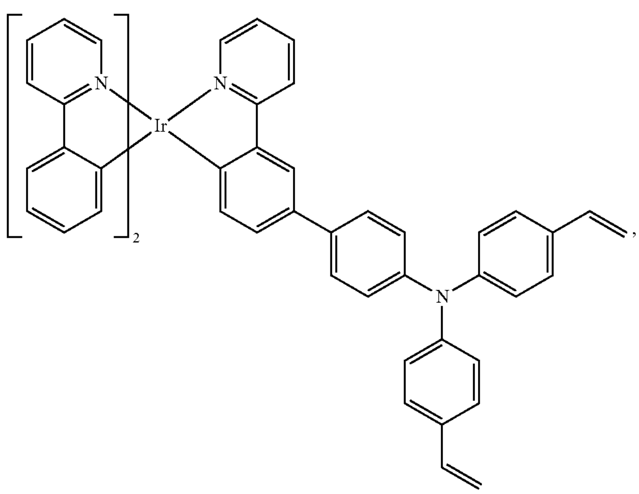
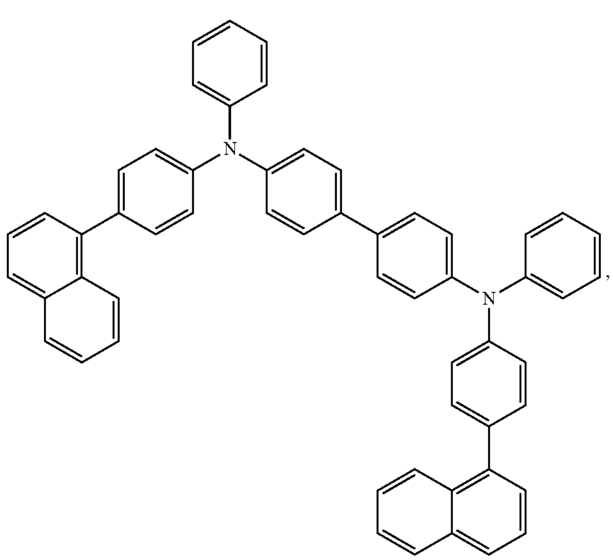

-continued
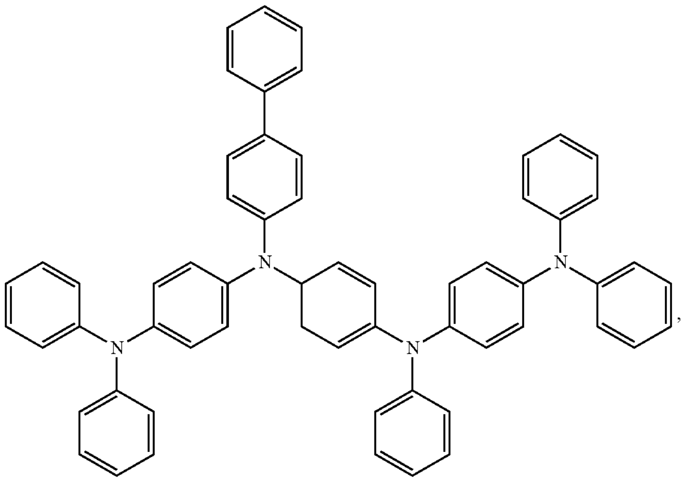
,
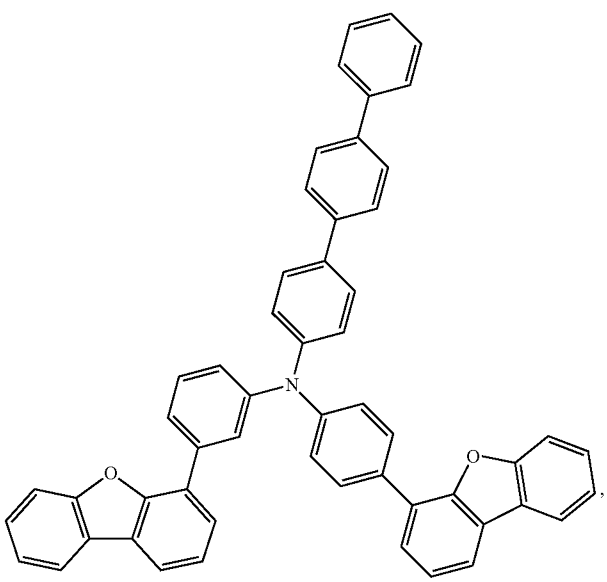
,
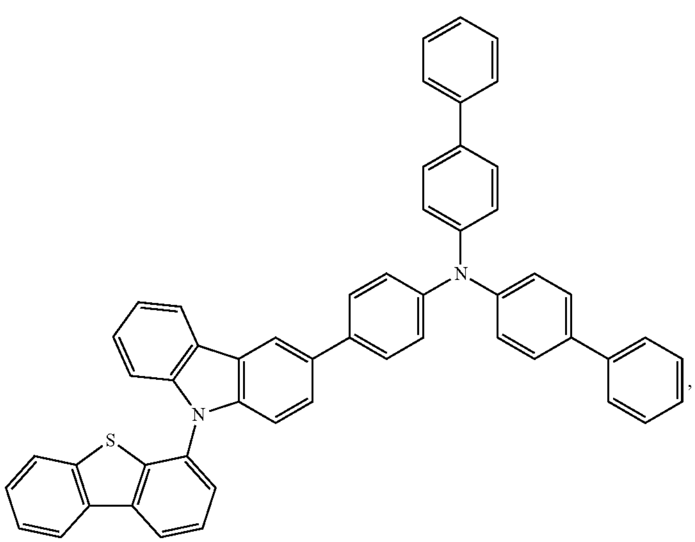
,

-continued
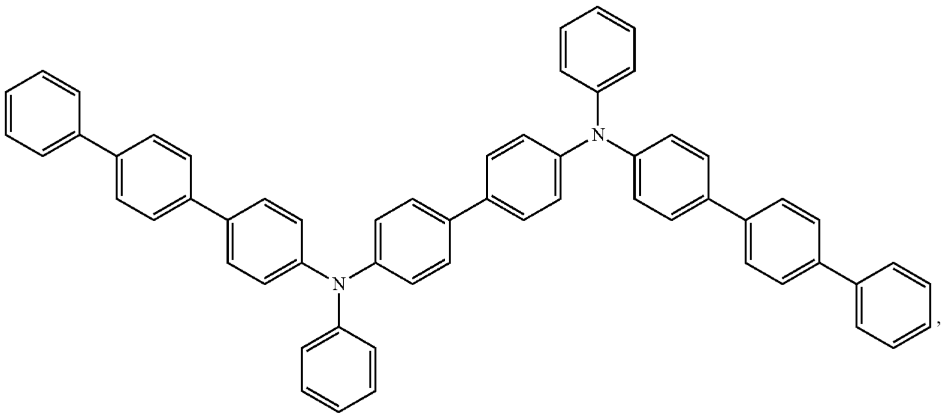
,
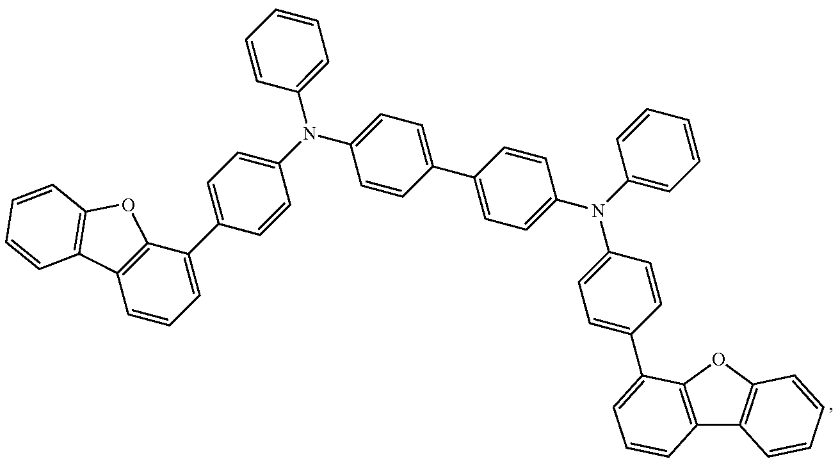
,
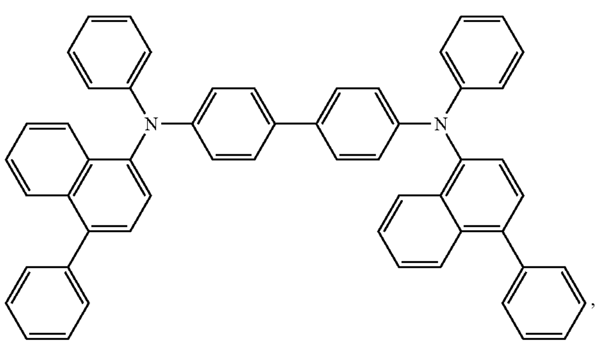
,
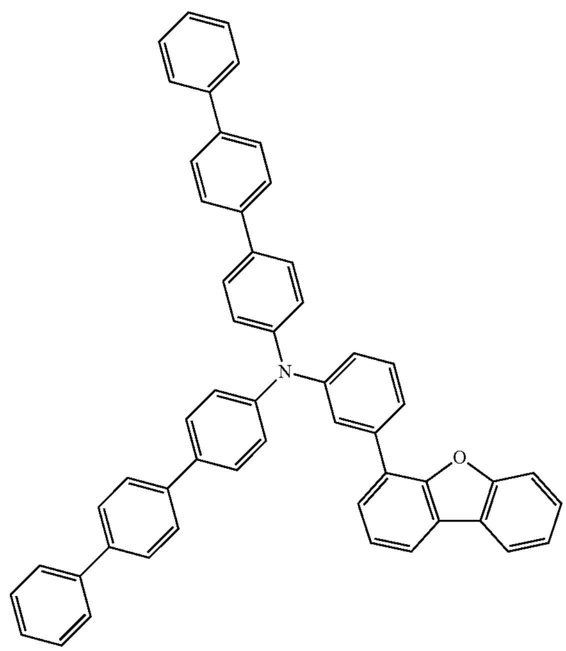
,

-continued
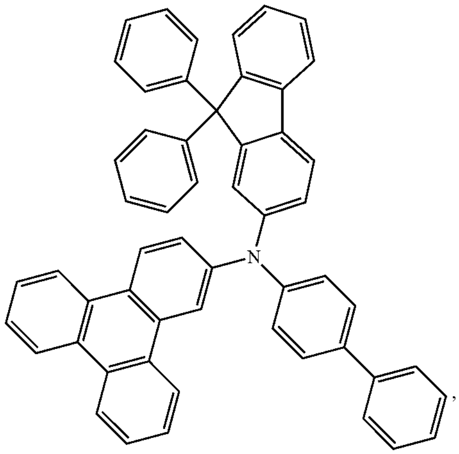
,
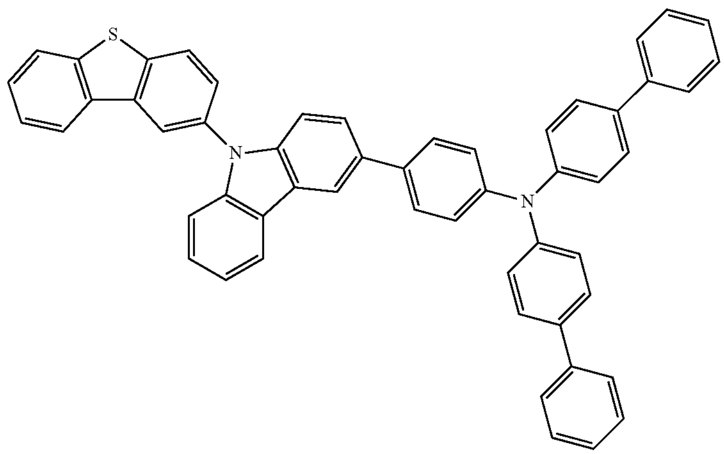
,
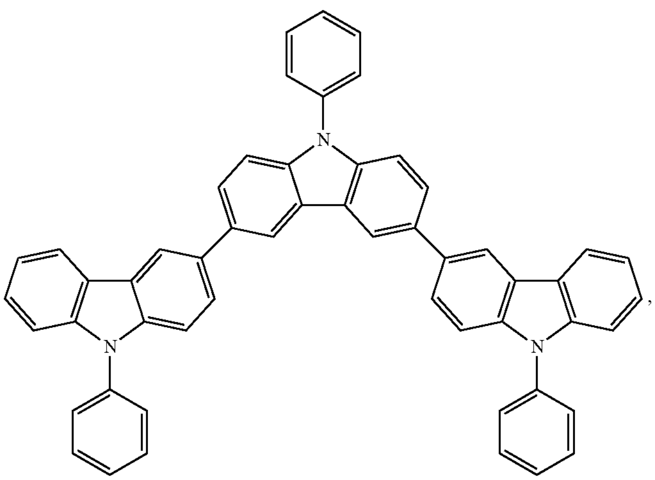
,
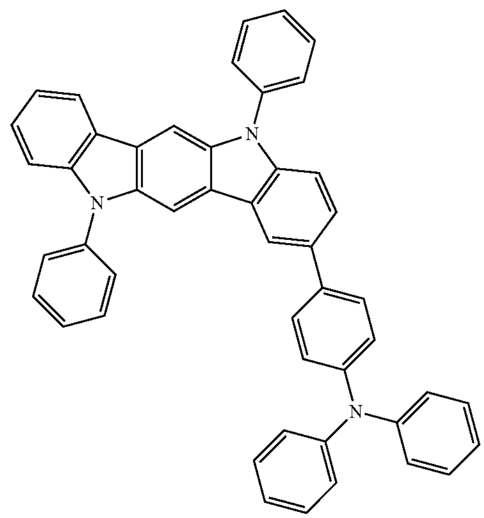
,
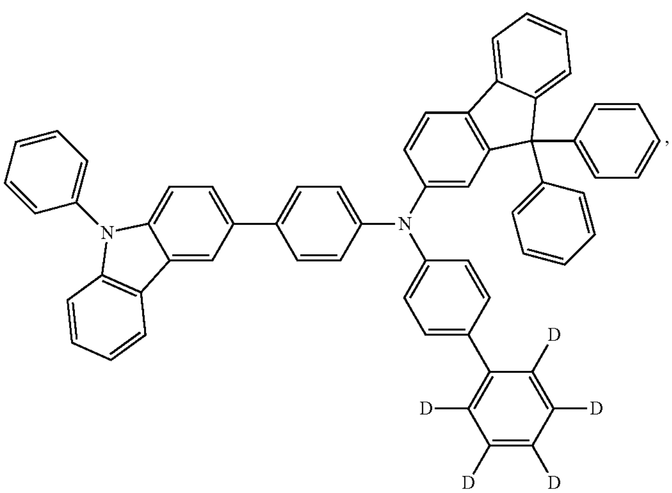
, -continued
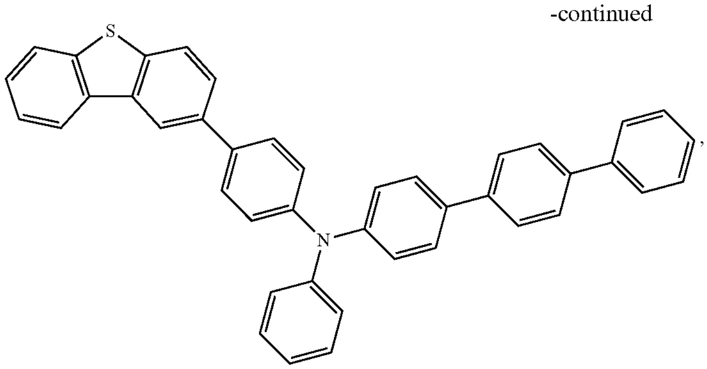,
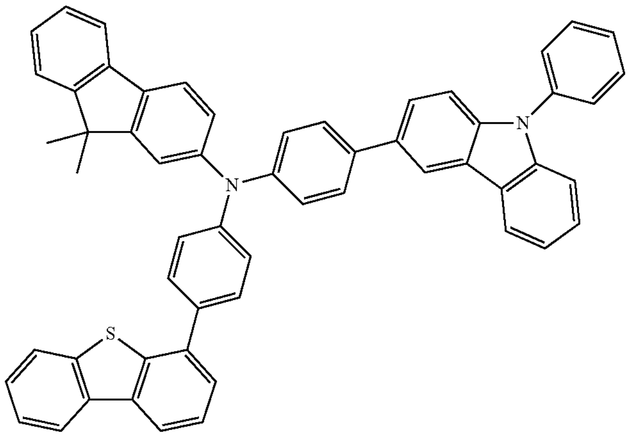,
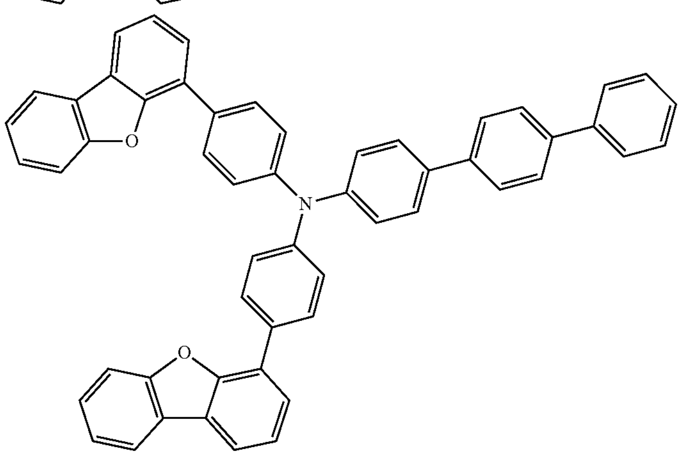,
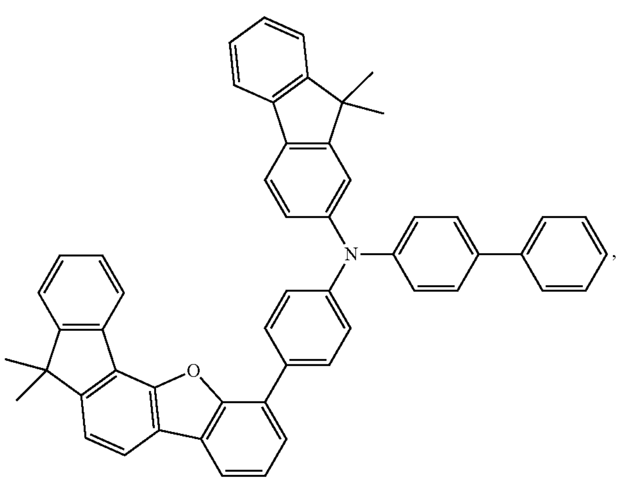,
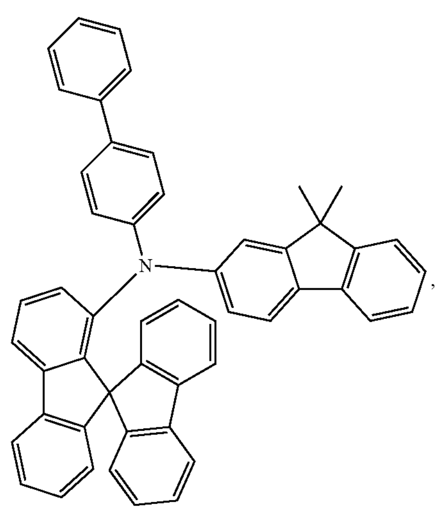, -continued
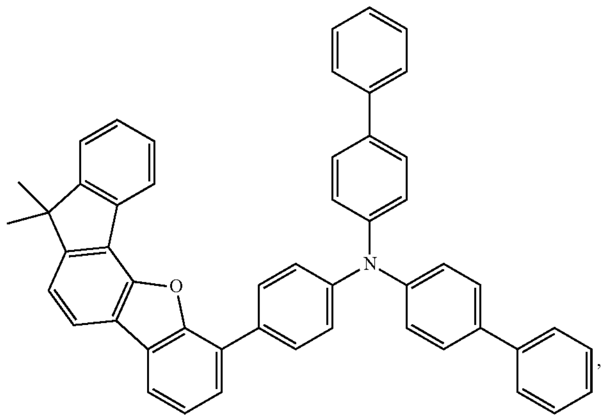
,
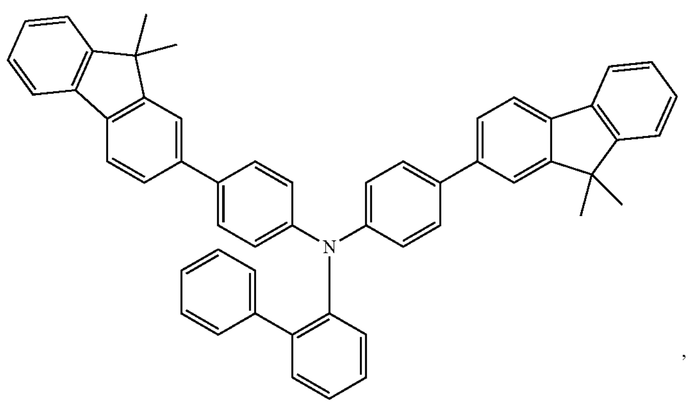
,
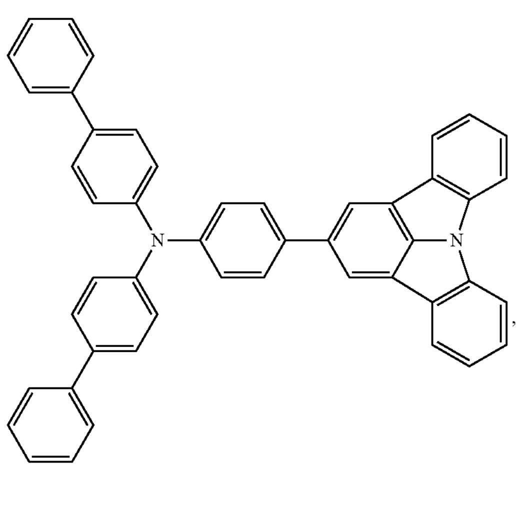
,
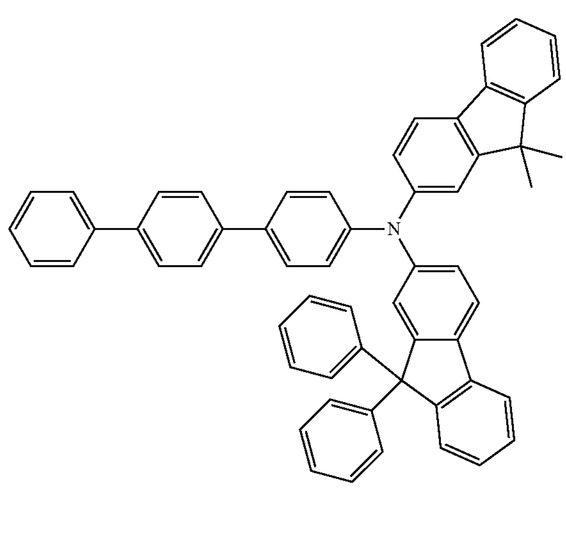
, -continued
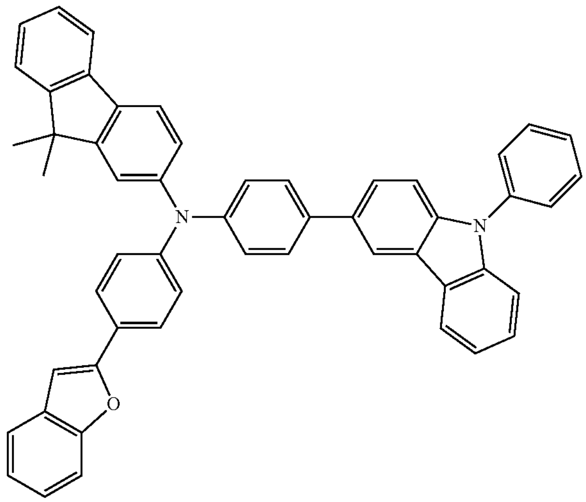
,
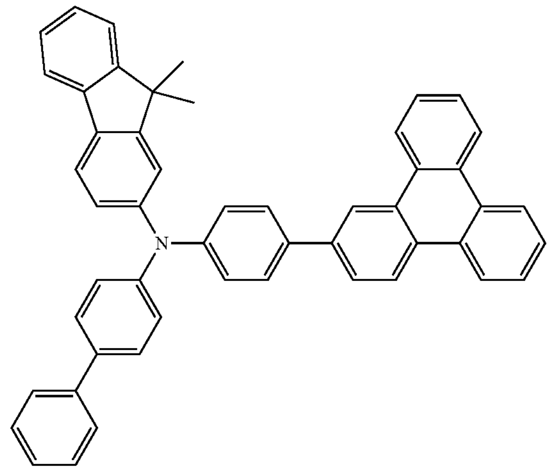
,
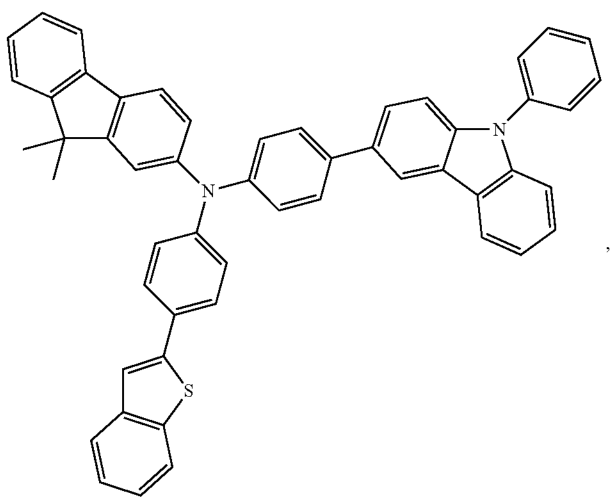
,
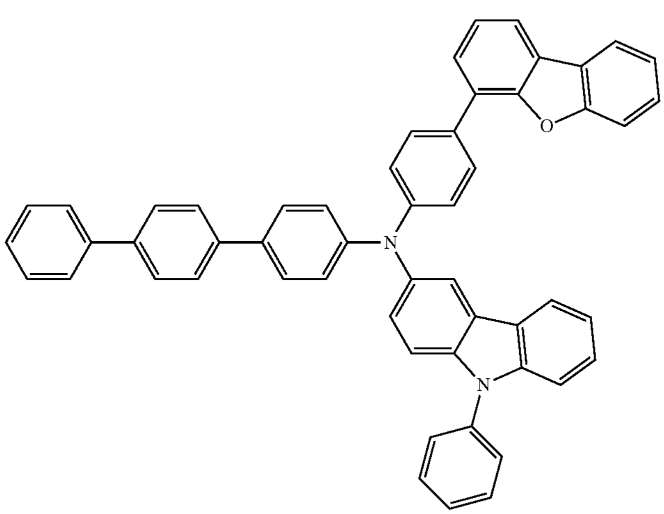
, -continued
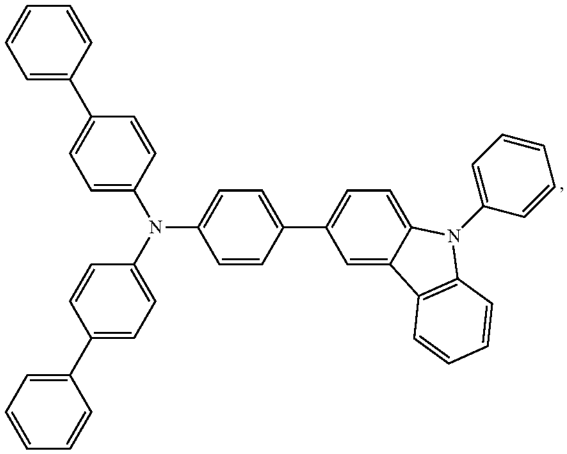
,
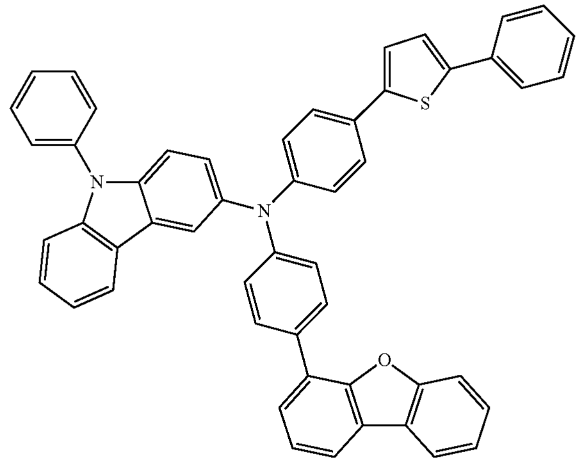
,
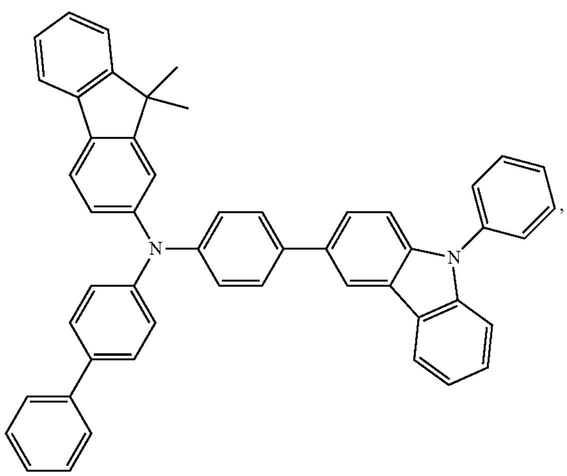
,
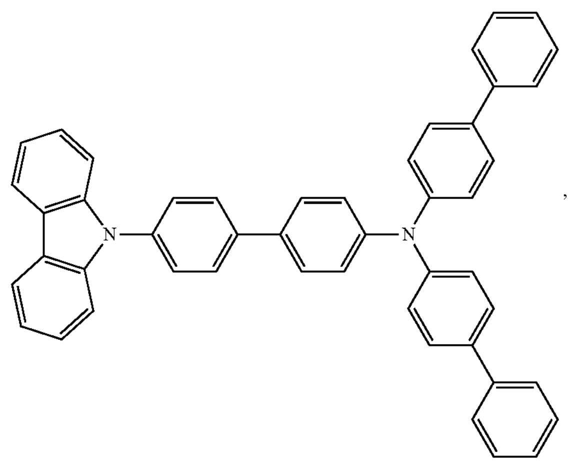
,
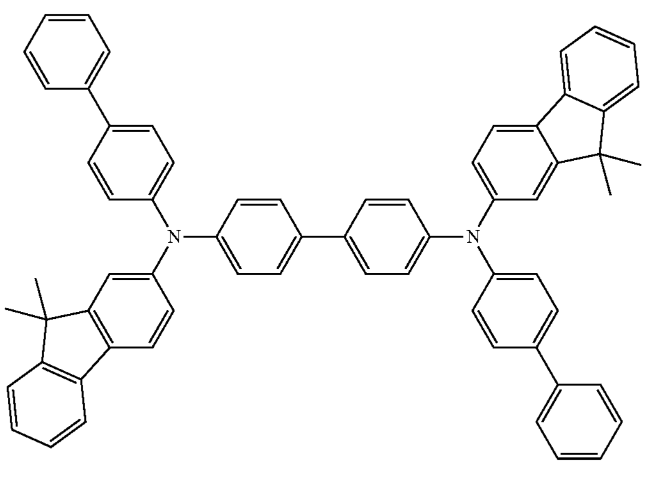
, -continued
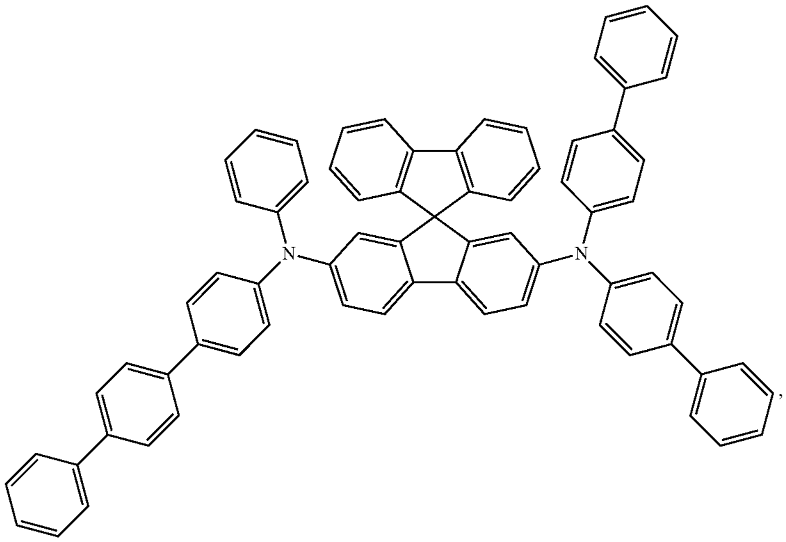
,
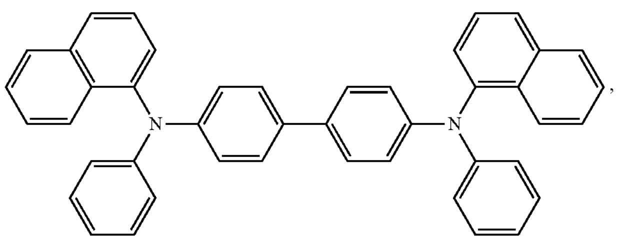
,
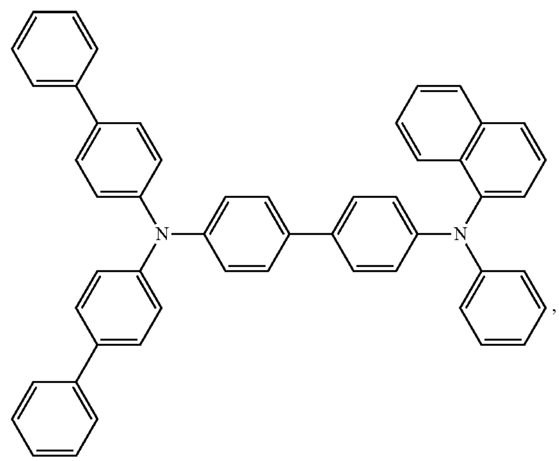
,
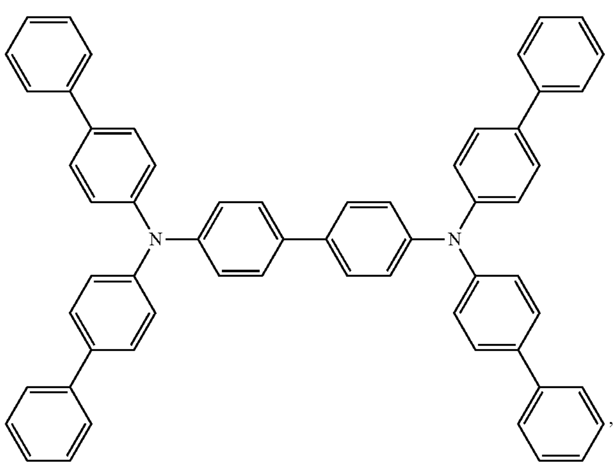
, -continued
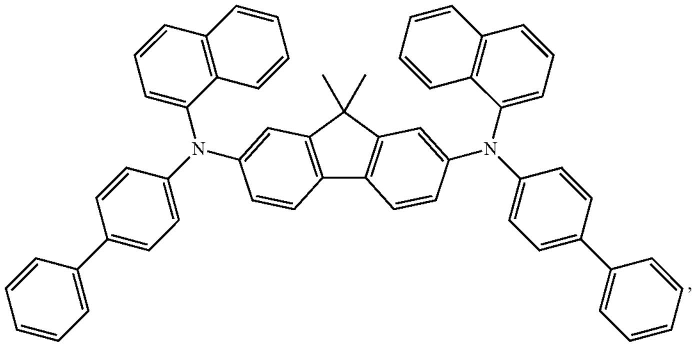,
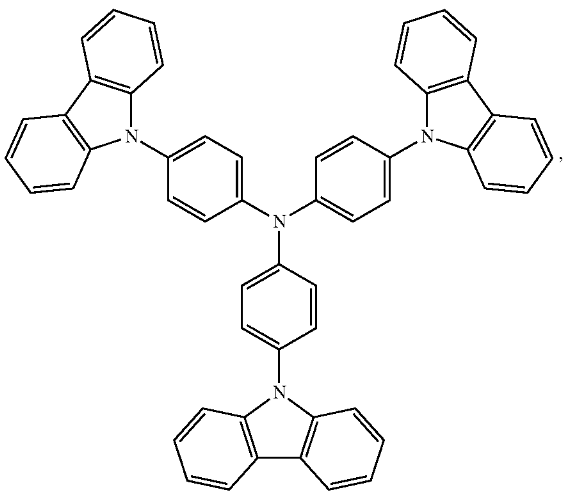,
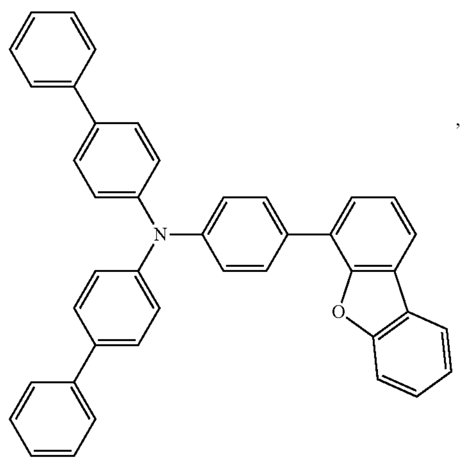,
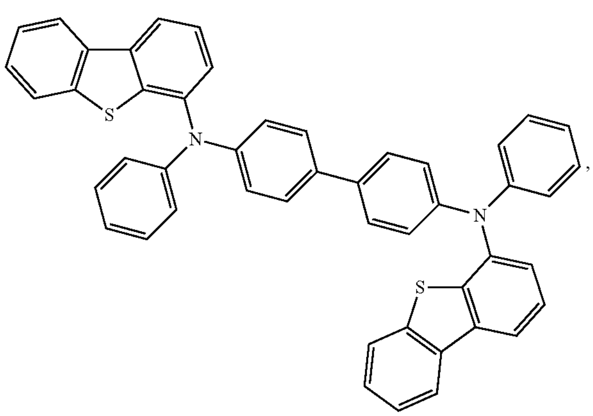,
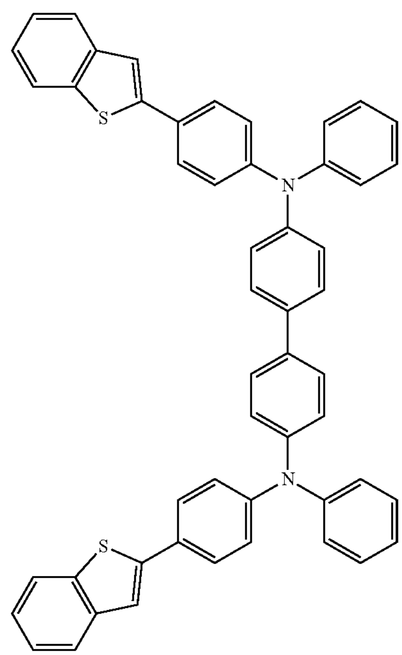, and -continued

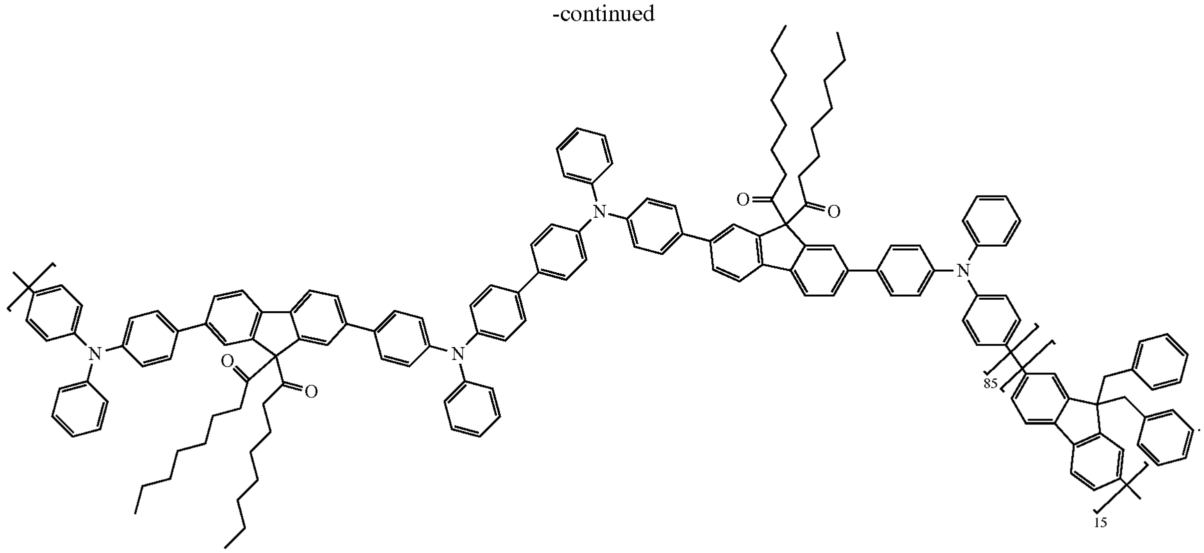

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

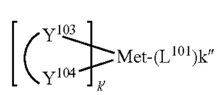

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

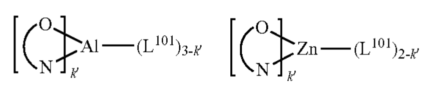

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

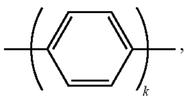,
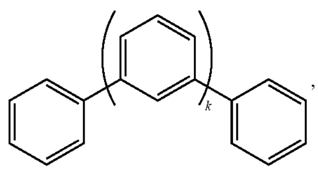,

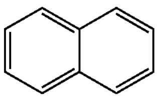,
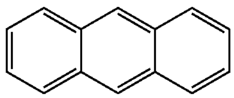,

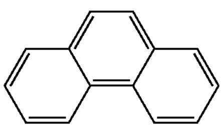,
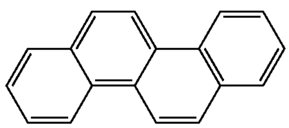,

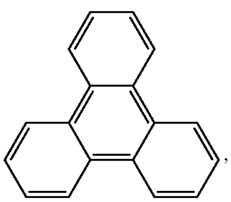,
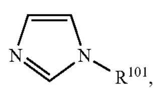,
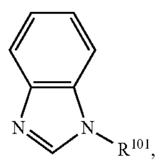,

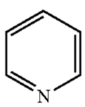,
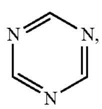,
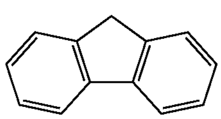,

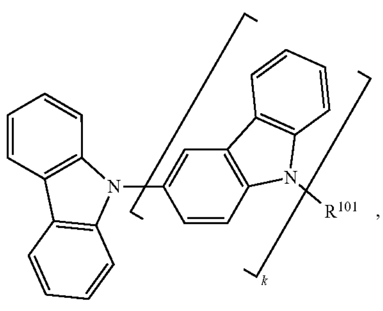,

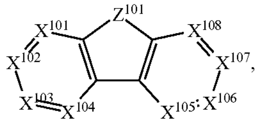

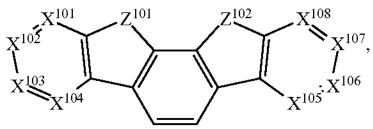

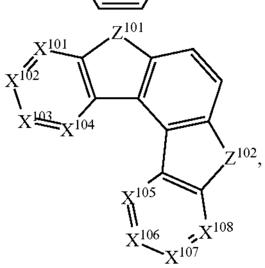

-continued

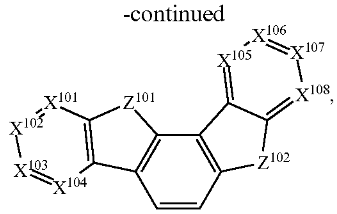

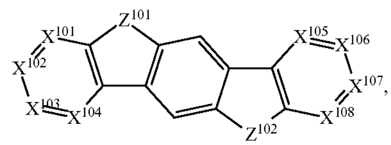
and

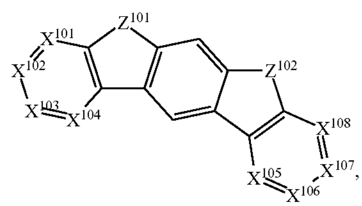

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

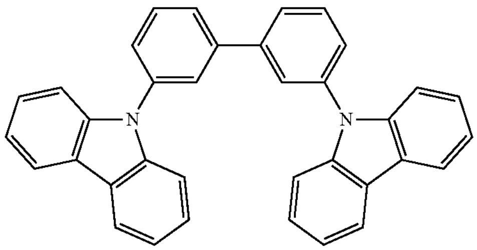
,
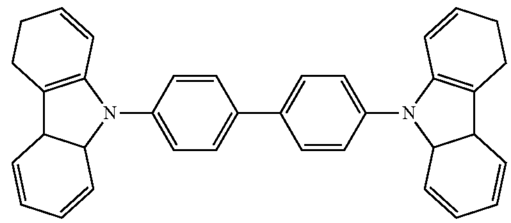
,
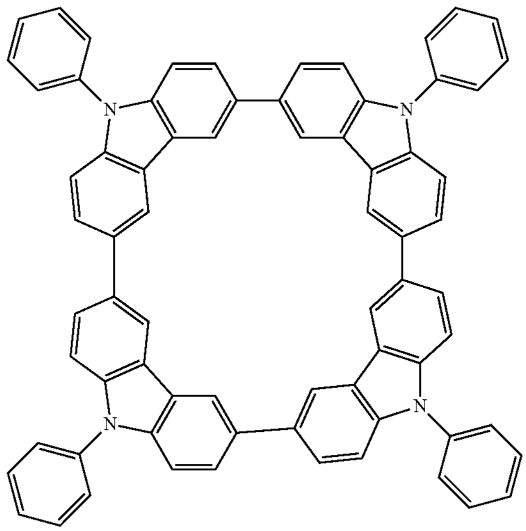
,
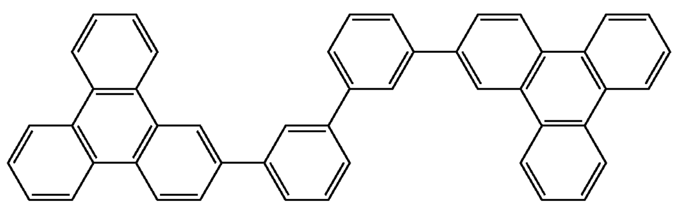
,
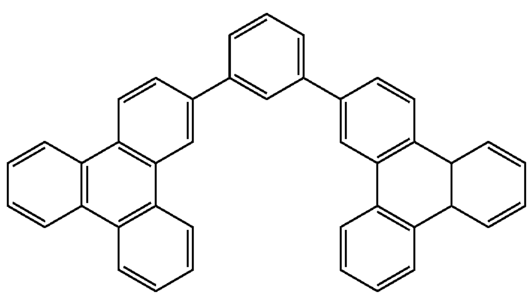
,
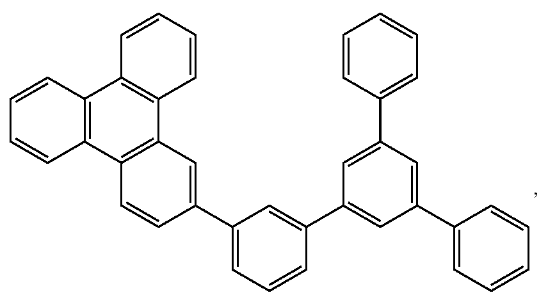
,
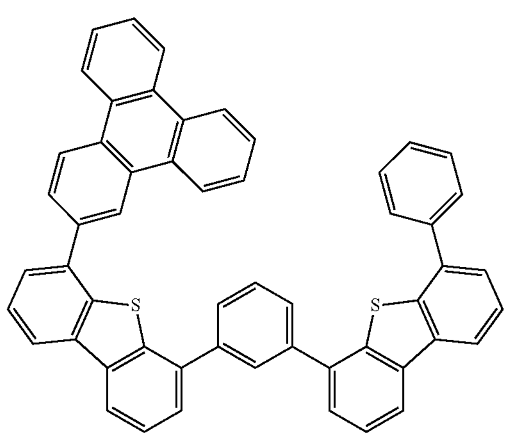
,
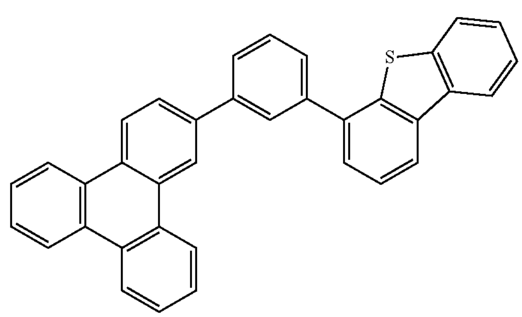
, -continued
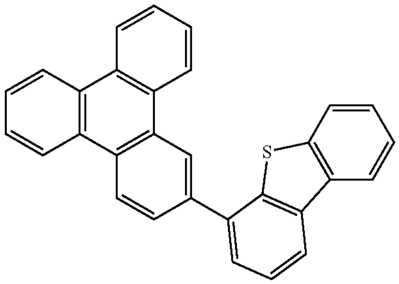,
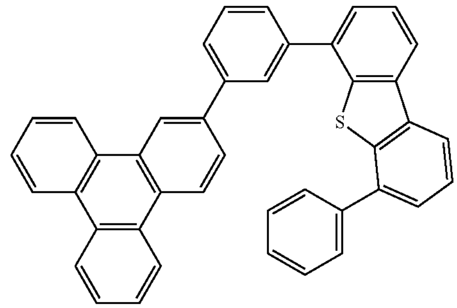,
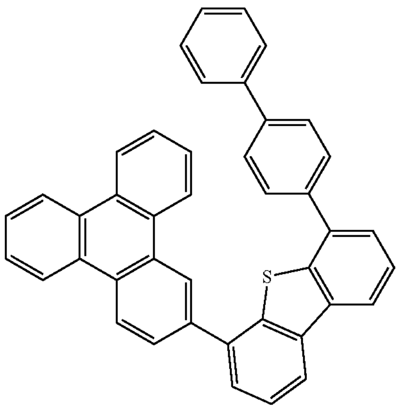,
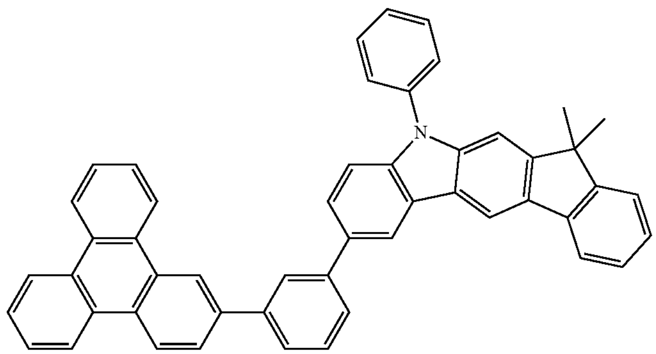,
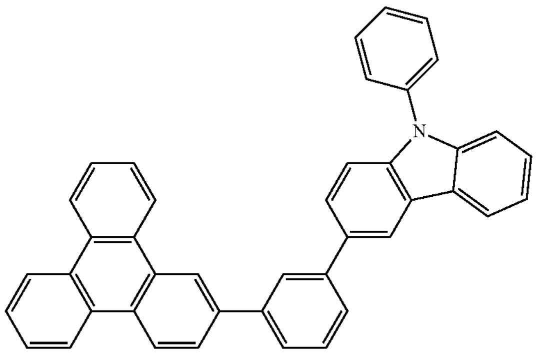,
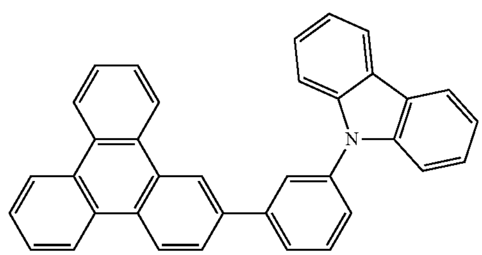,
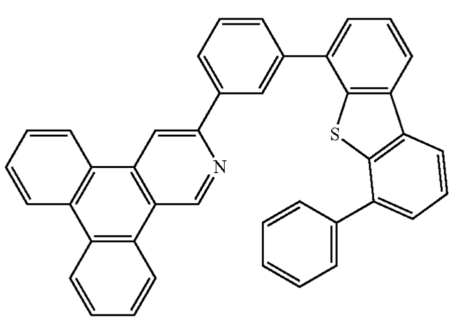,
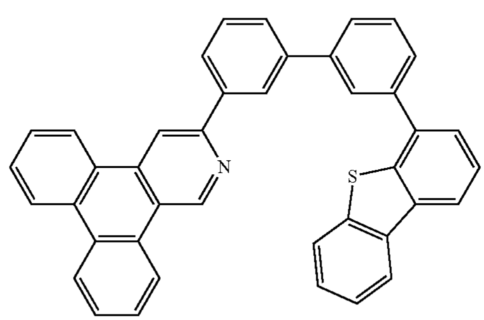,
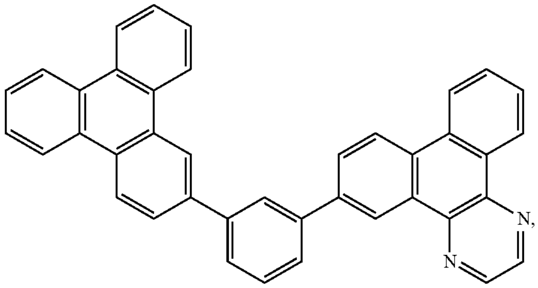
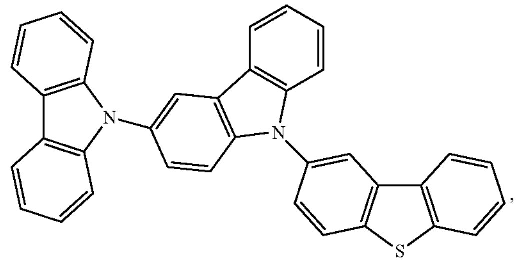, -continued
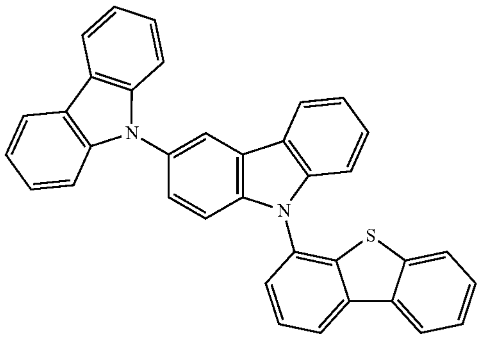
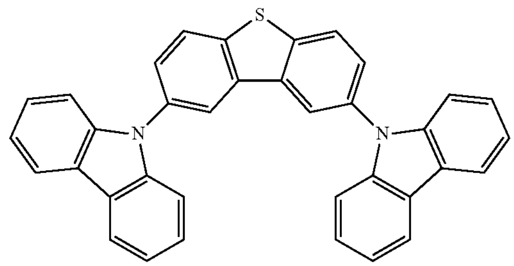
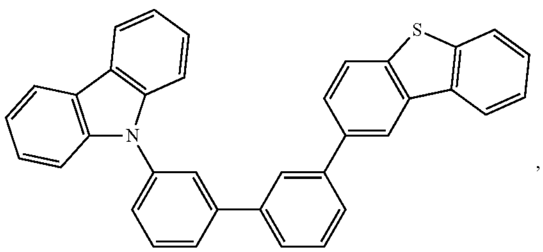
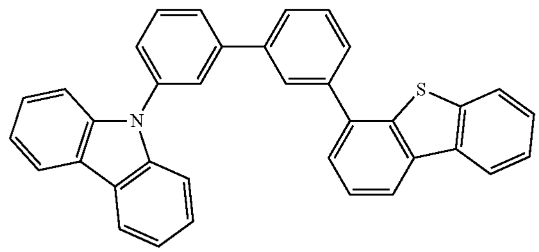
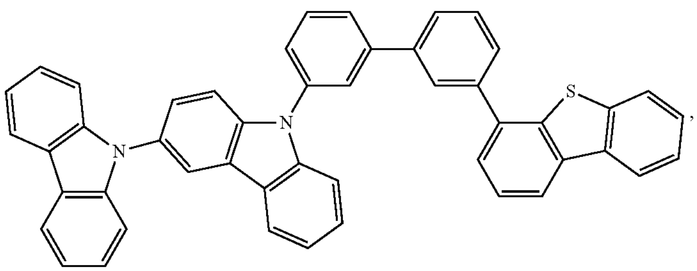
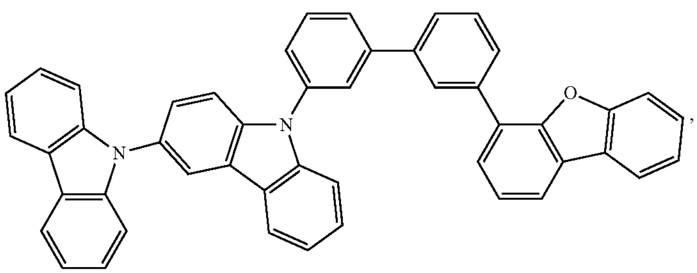
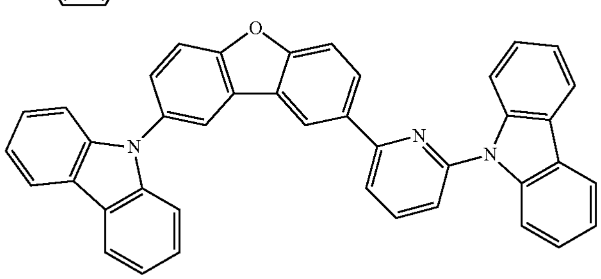
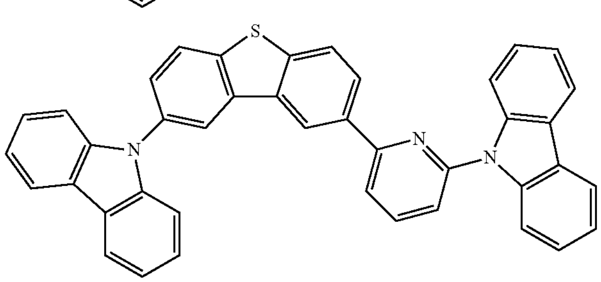

-continued
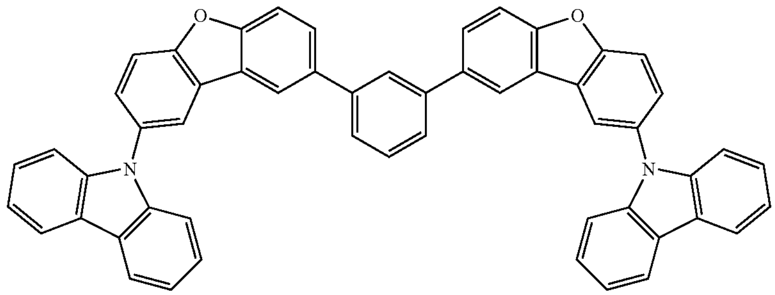
,
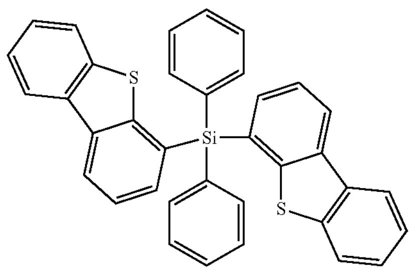
,
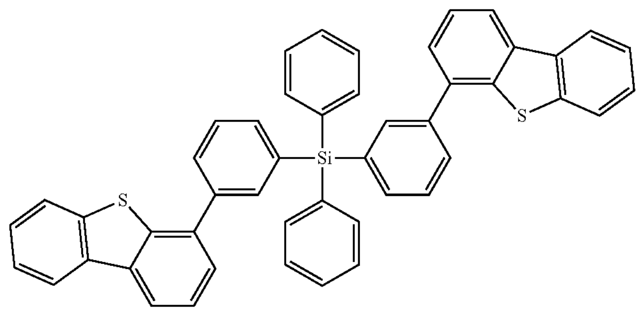
,
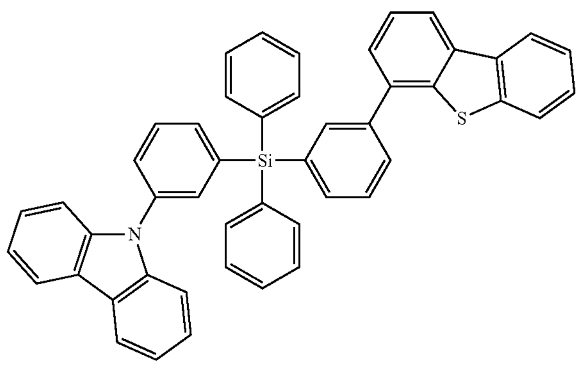
,
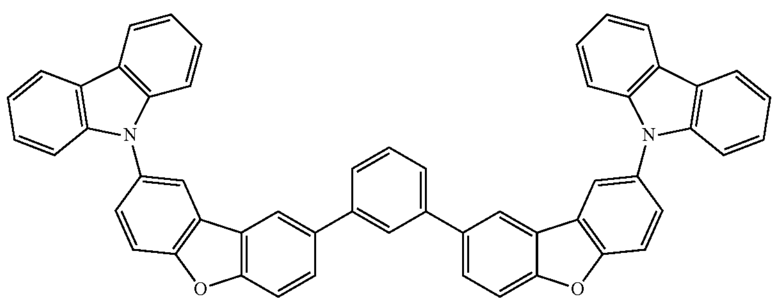
,
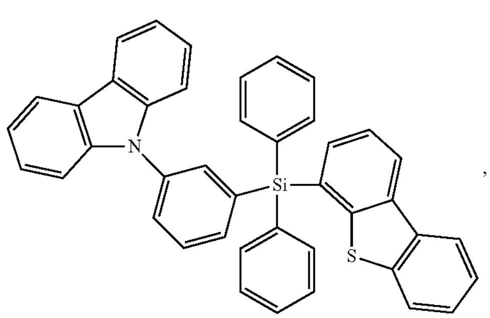
,
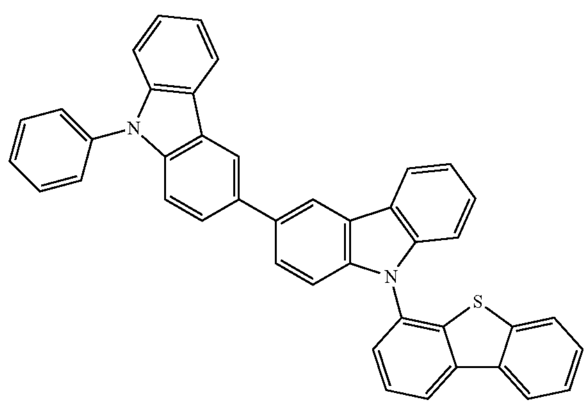
, -continued
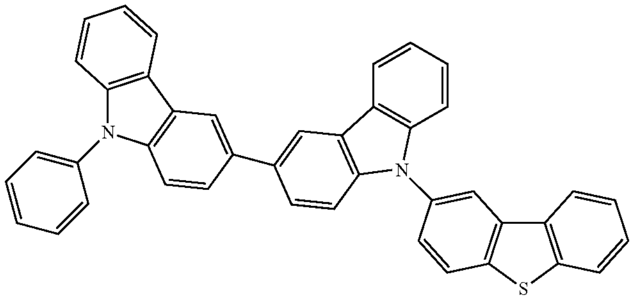
,
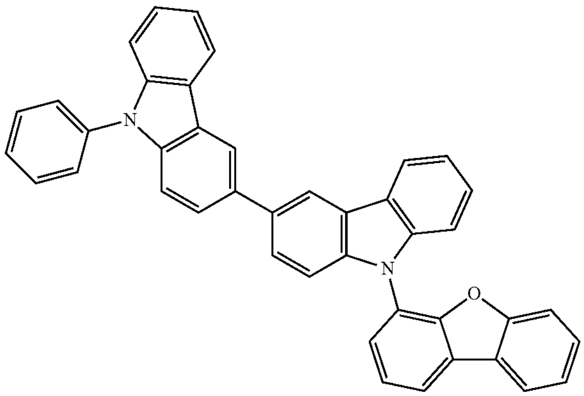
,
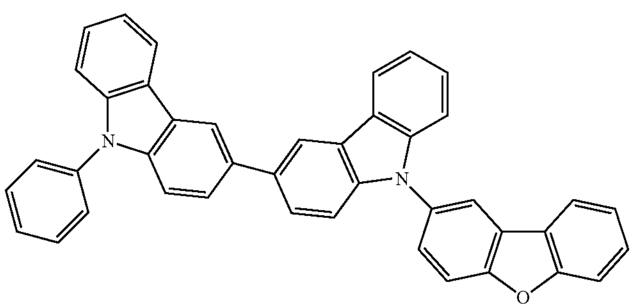
,
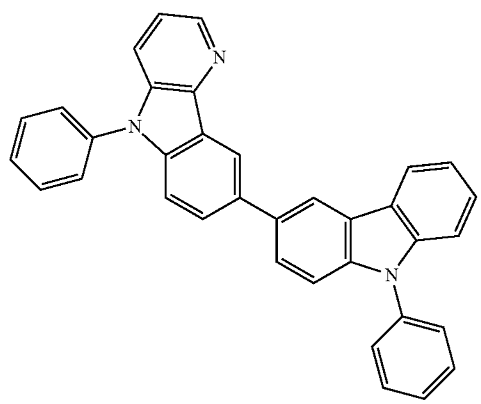
,
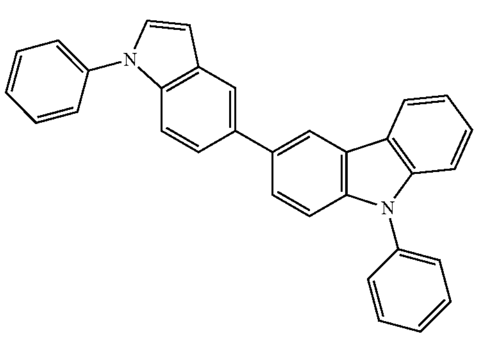
,
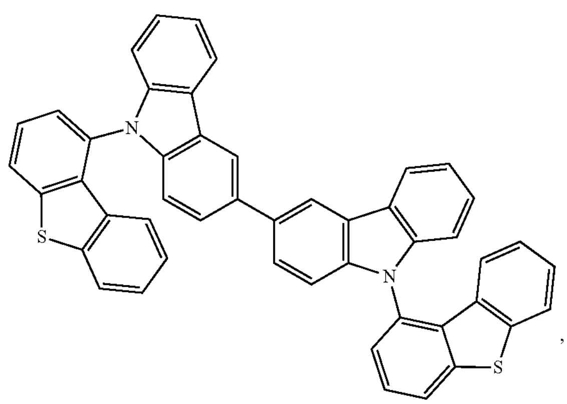
, -continued
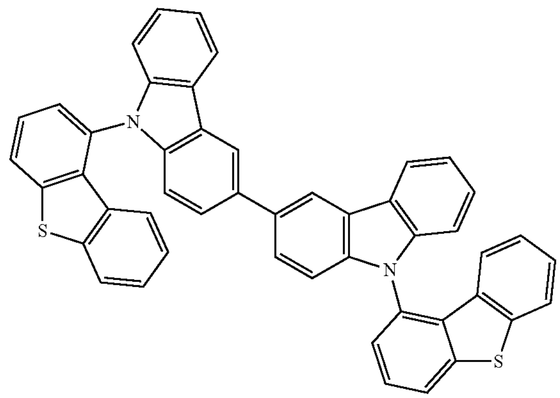
,
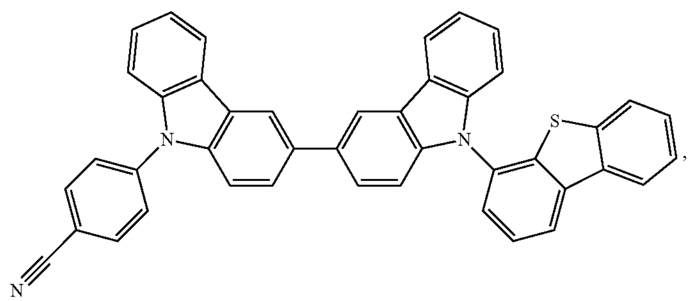
,
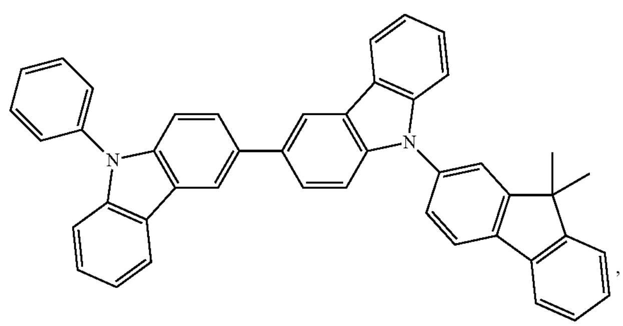
,
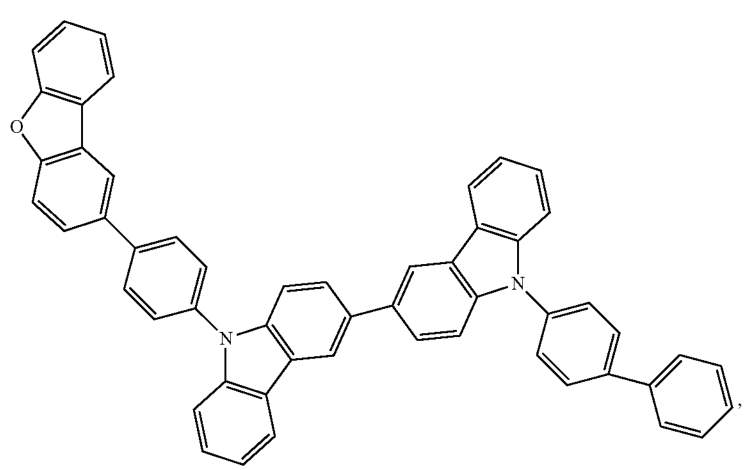
, -continued
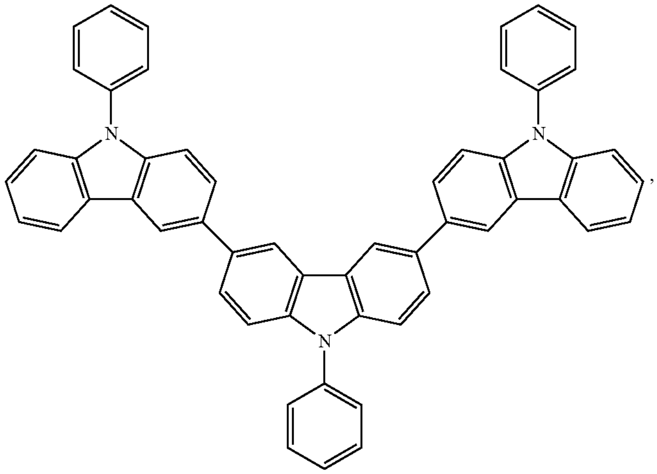
,
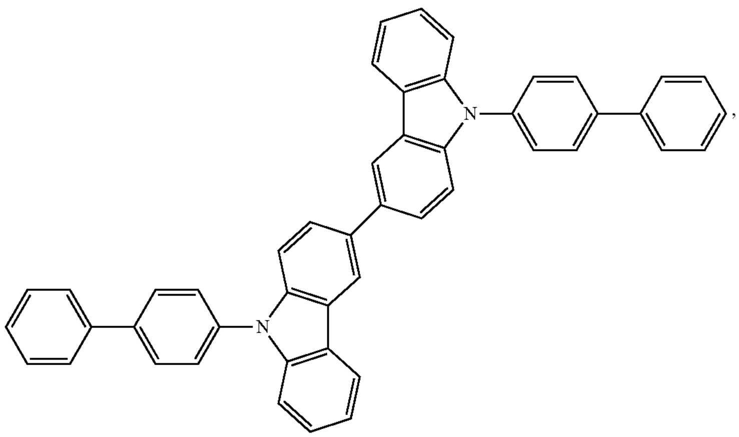
,
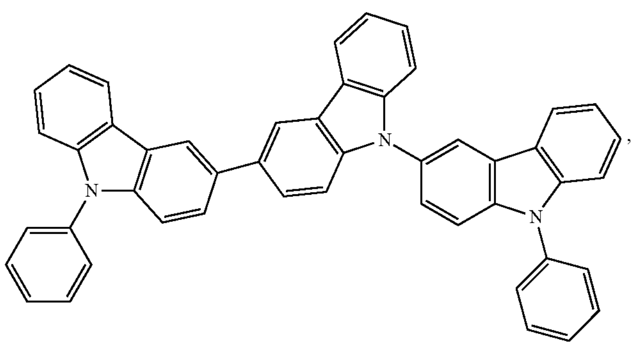
,
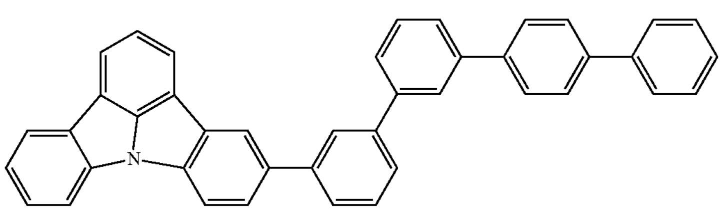
, -continued
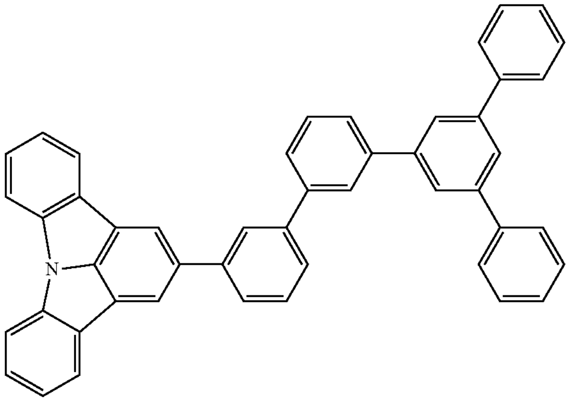,
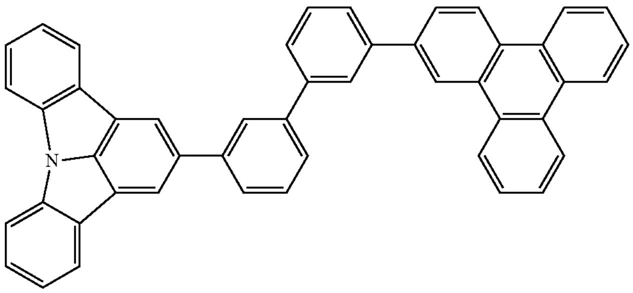,
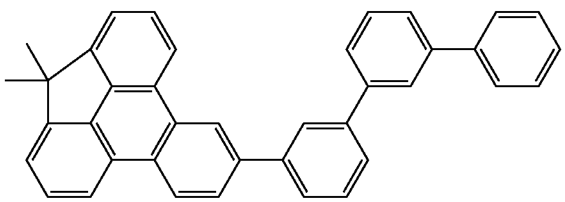, 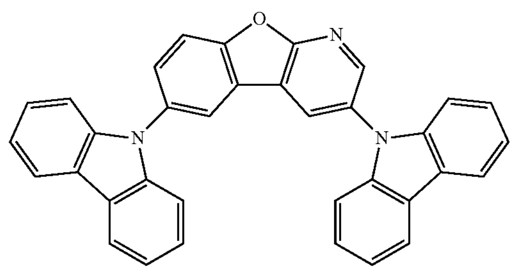,
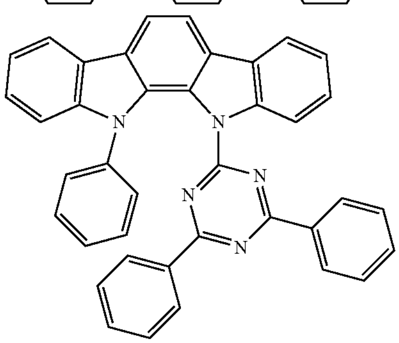, 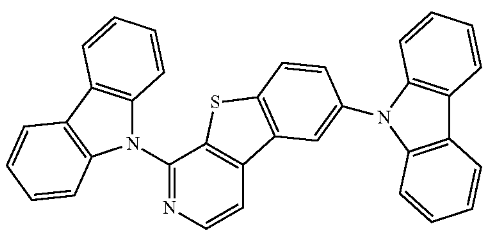,
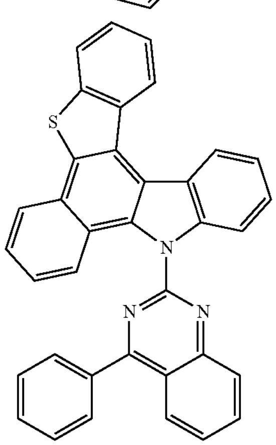, 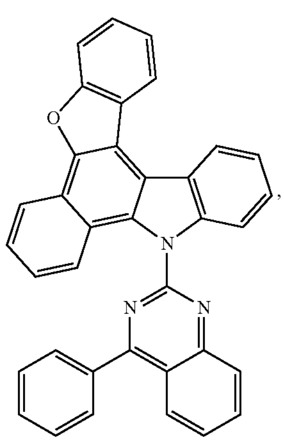, 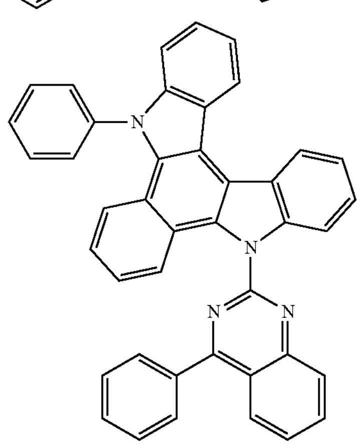, -continued
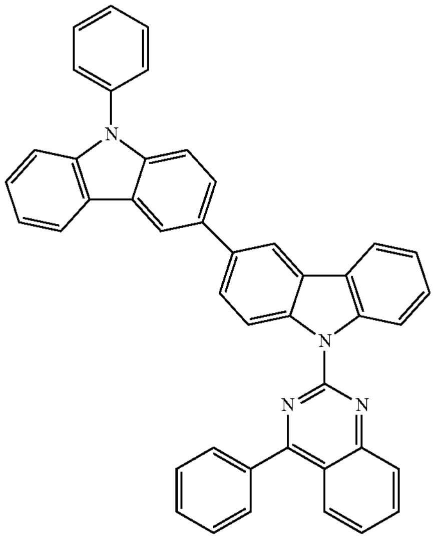
,
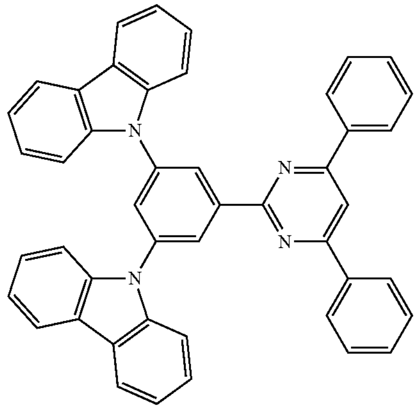
,
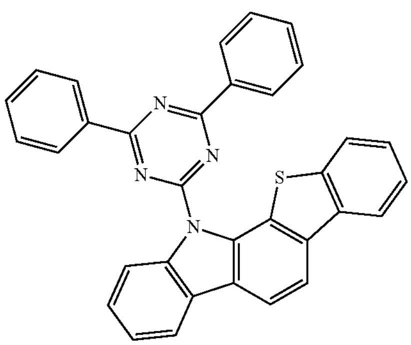
,
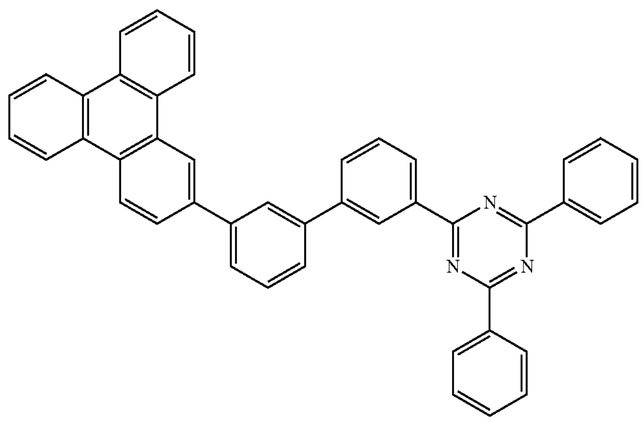
,
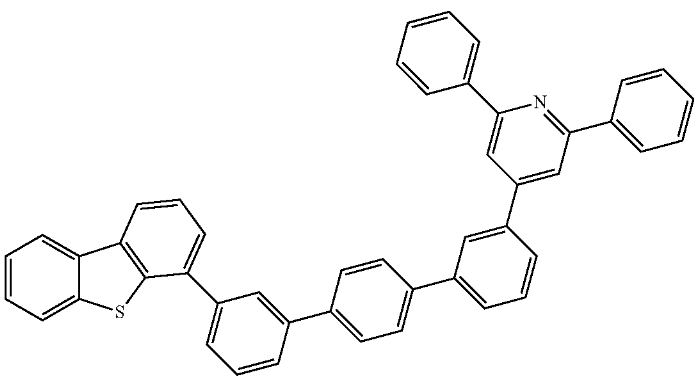
,
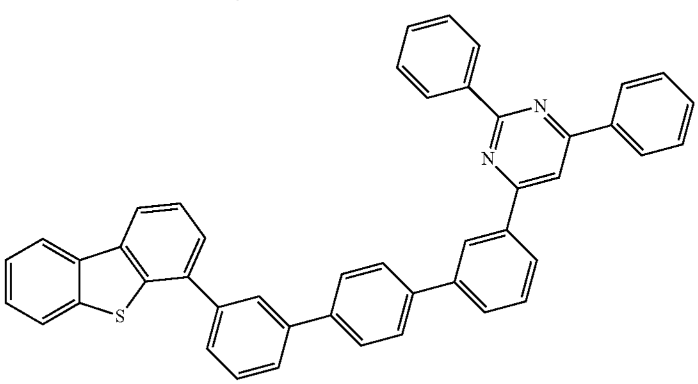
, -continued
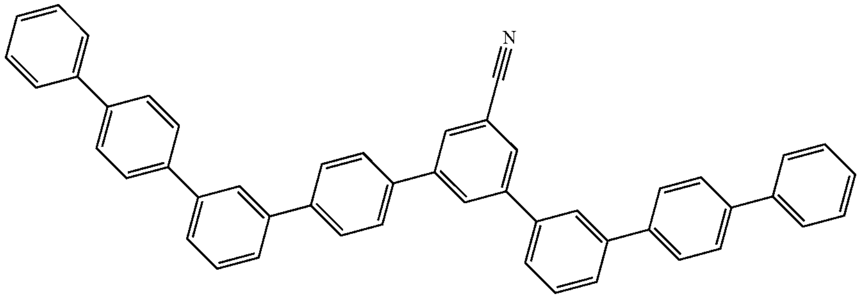
,
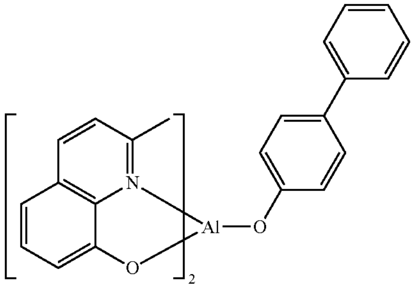
,
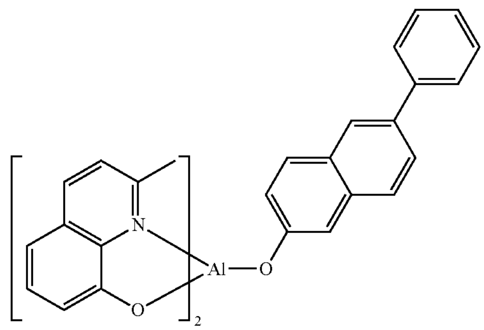
,
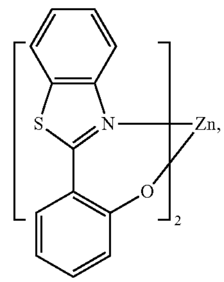
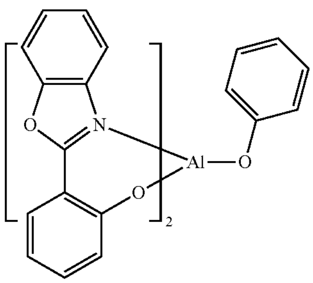
,
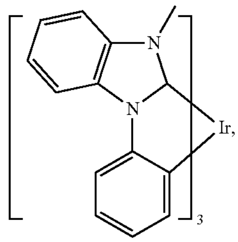
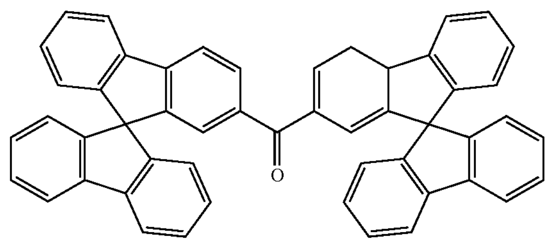
,
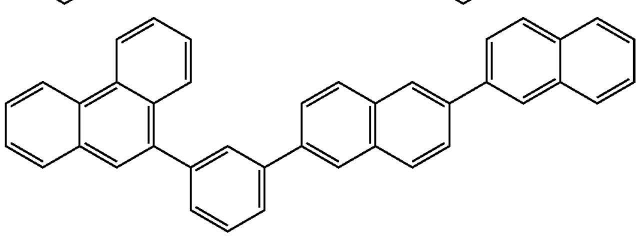
,
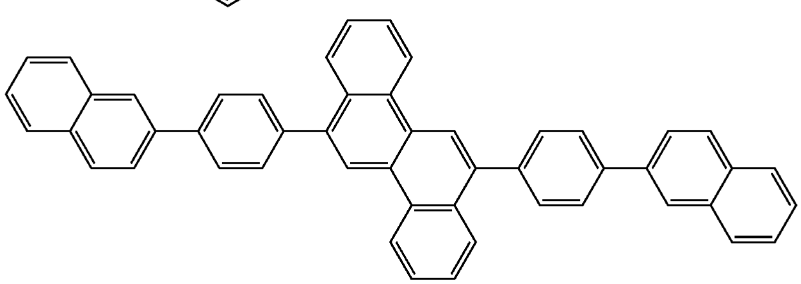
, and
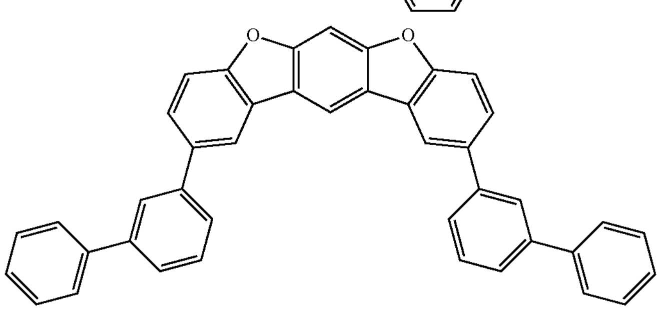
.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

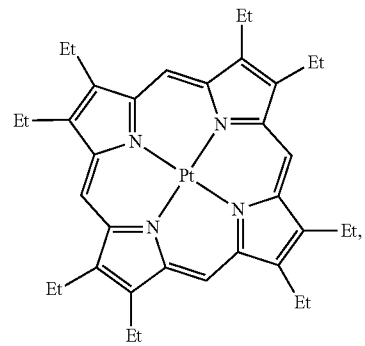

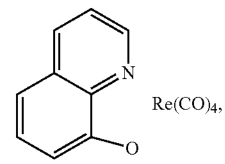

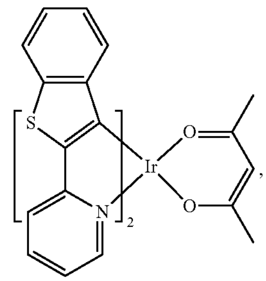

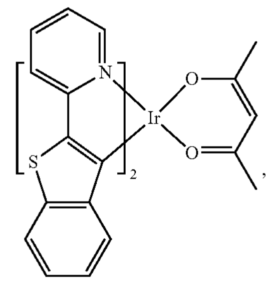

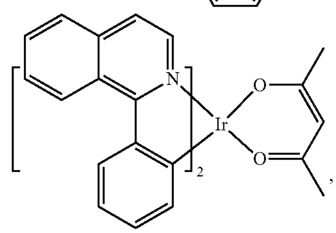

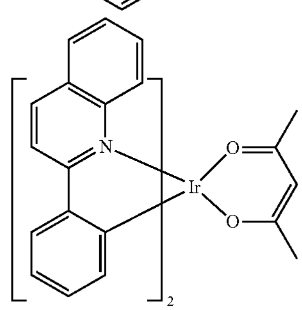

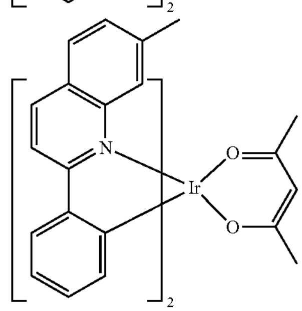

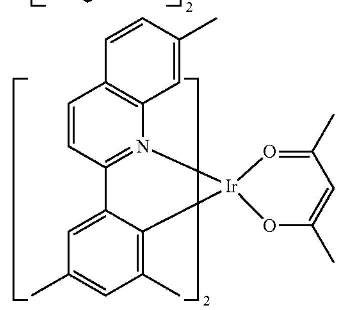

-continued
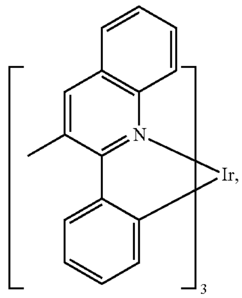
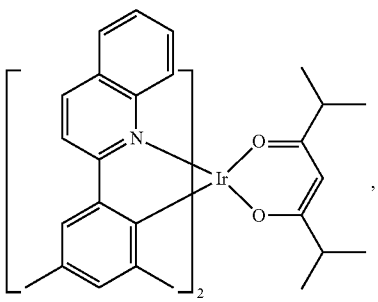
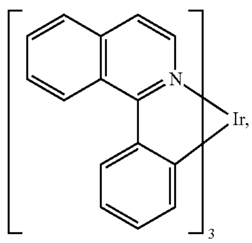
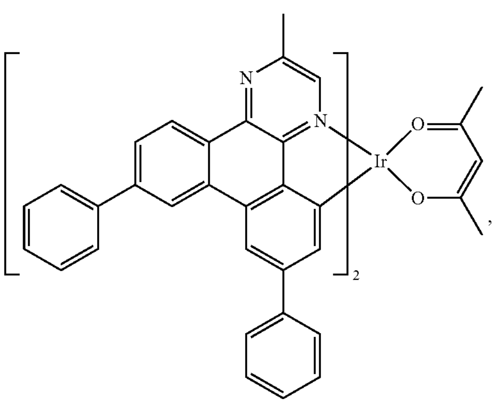
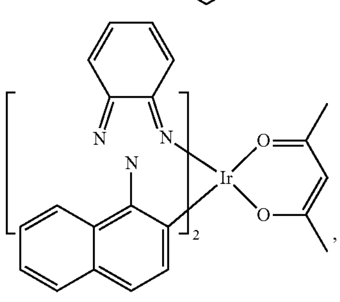
-continued
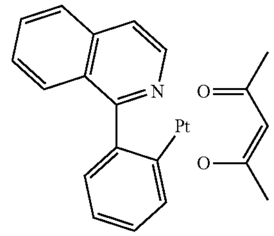
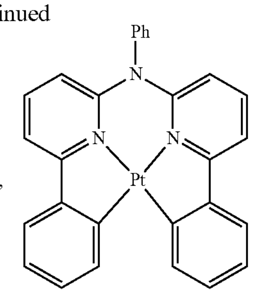
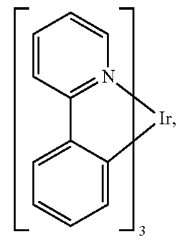
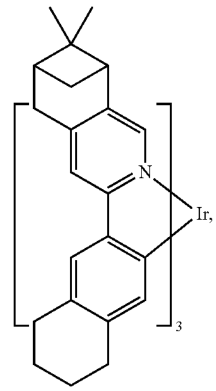
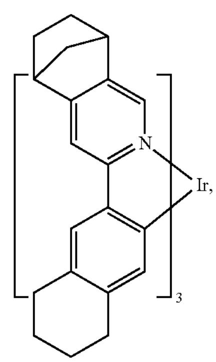
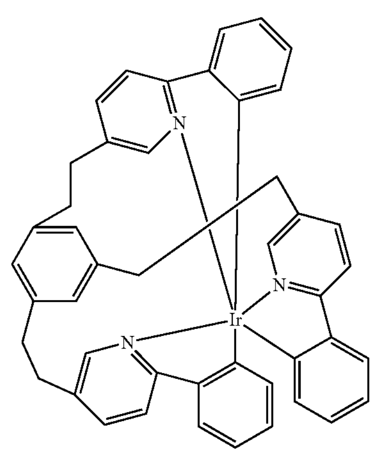

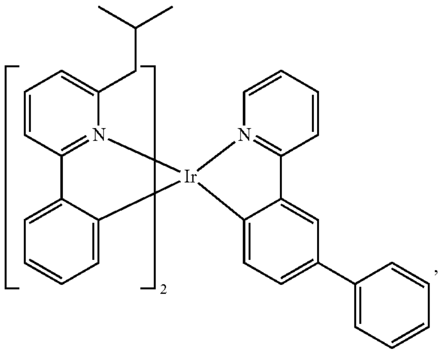
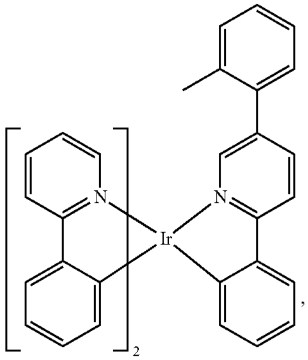
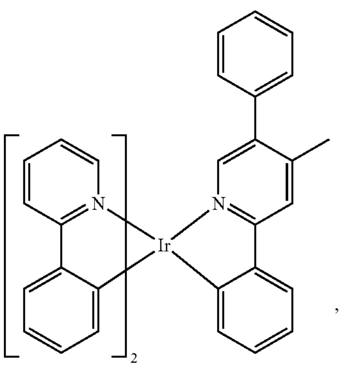
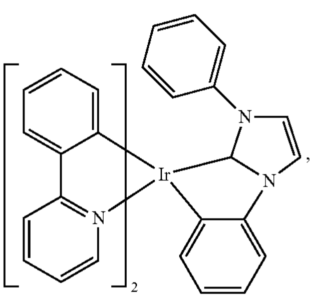
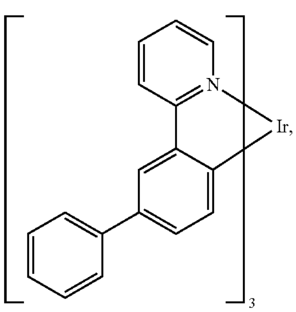
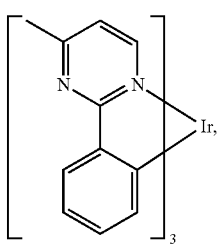
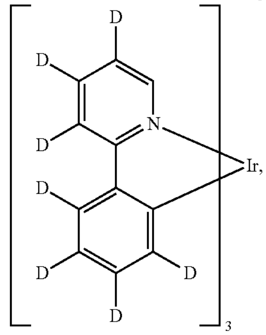
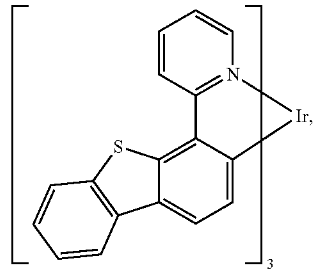
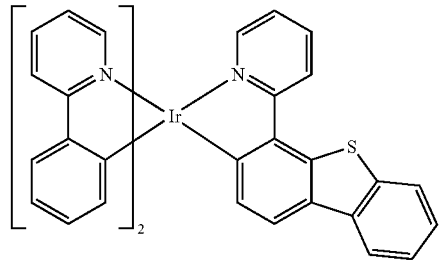
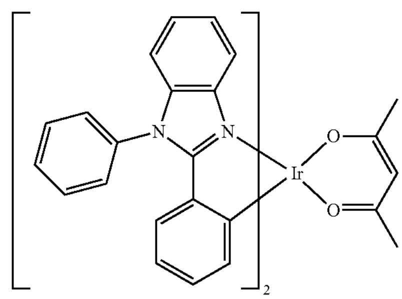
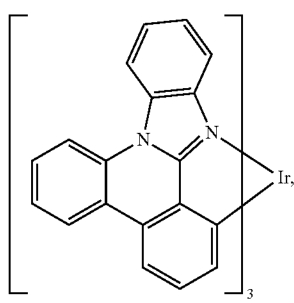
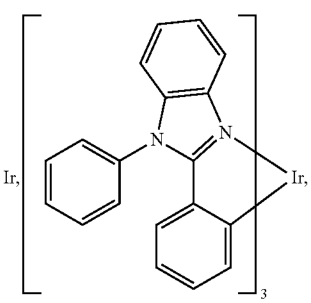
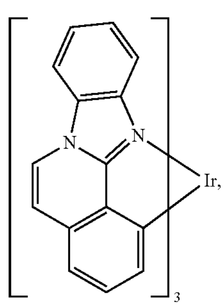
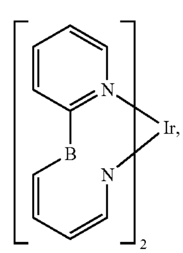

-continued
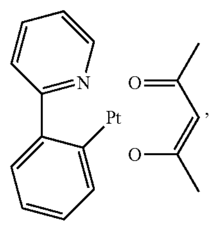
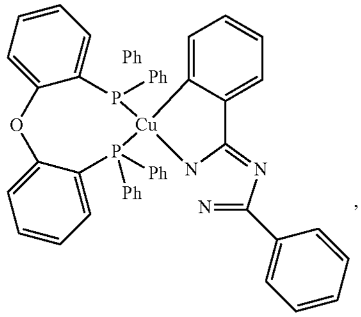
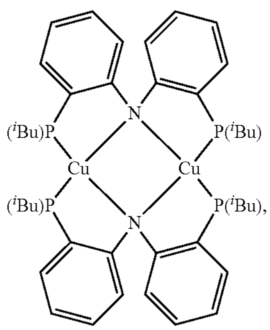
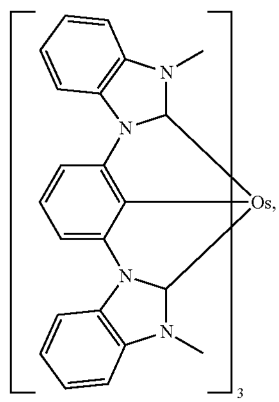
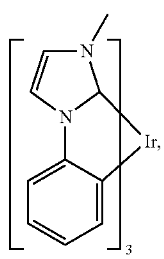
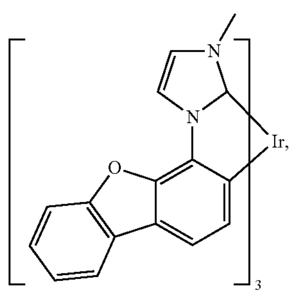
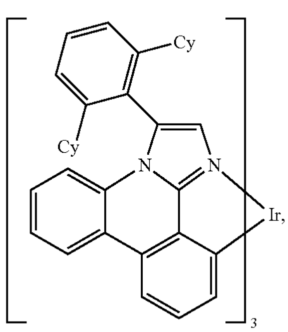
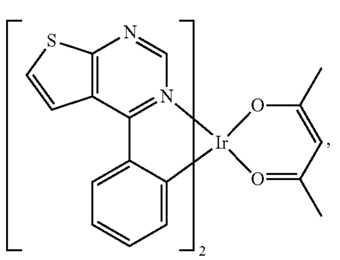
-continued
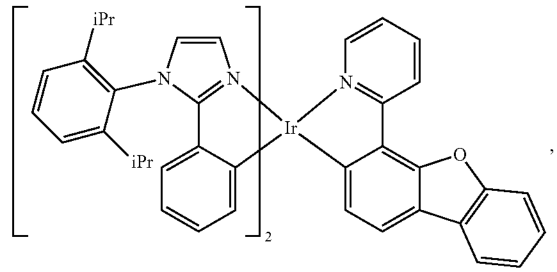
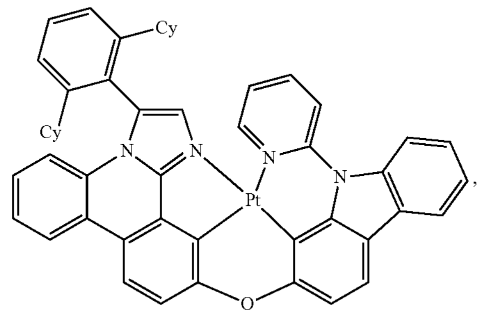
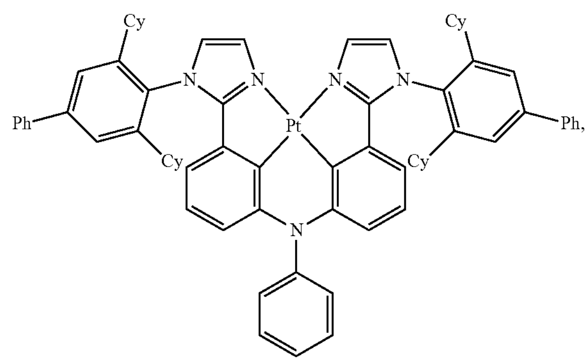
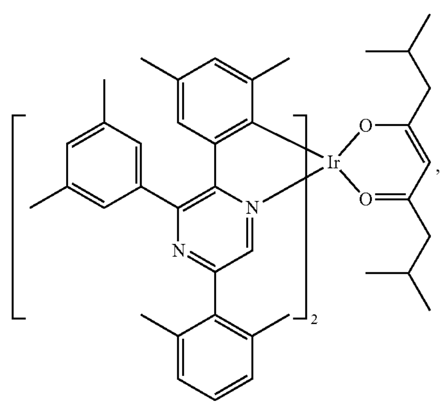
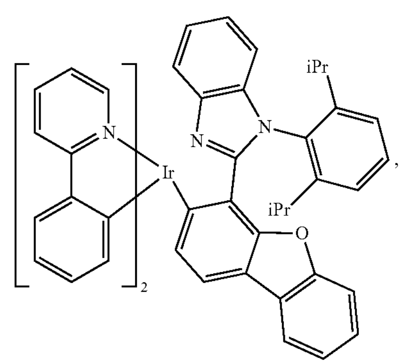

-continued
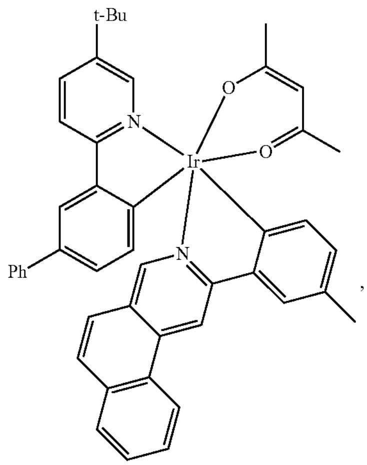
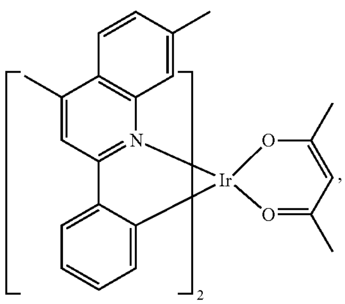
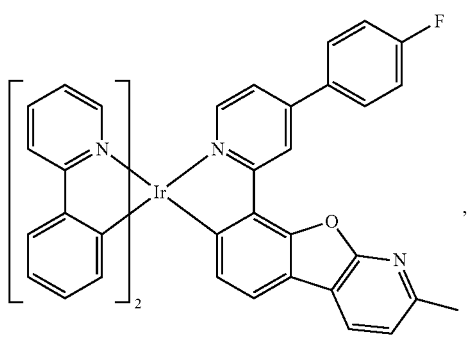
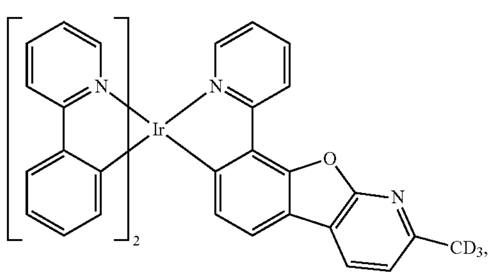
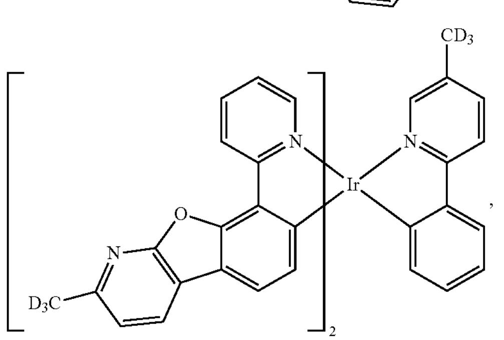
-continued
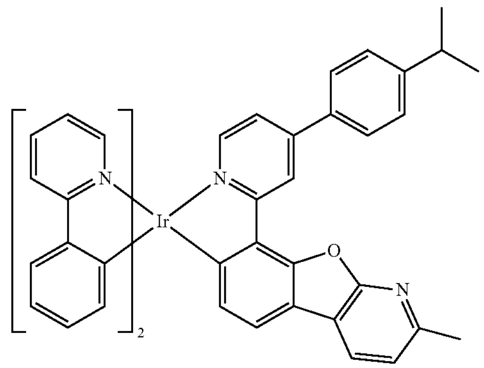
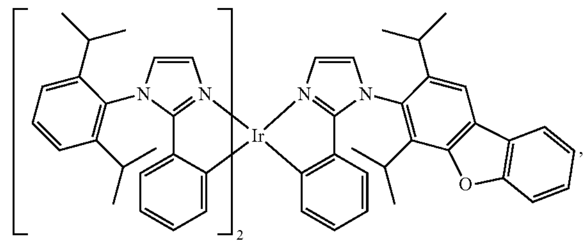
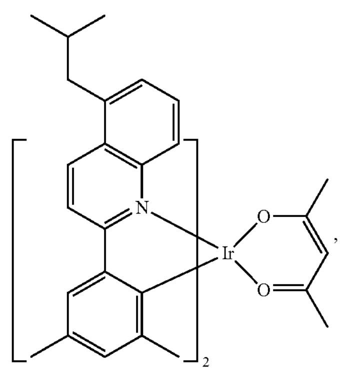
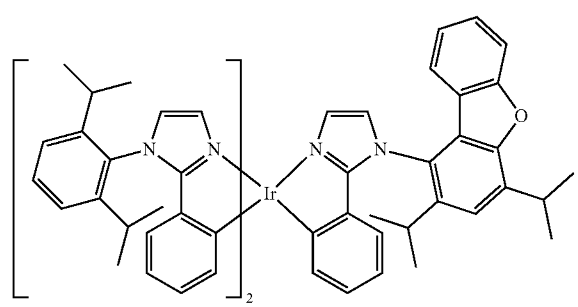
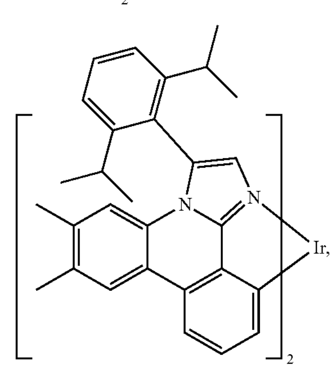

-continued
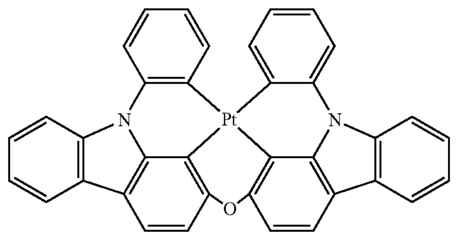
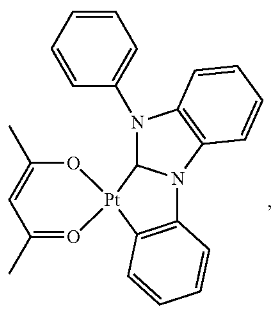
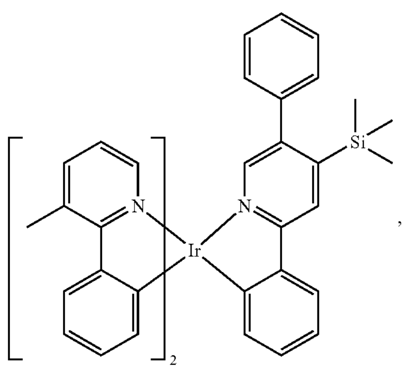
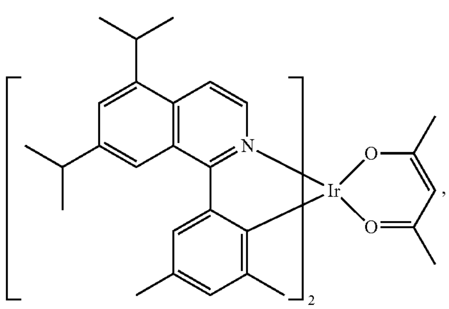
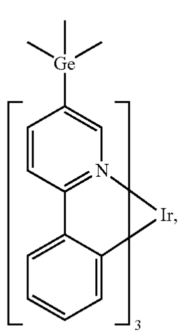
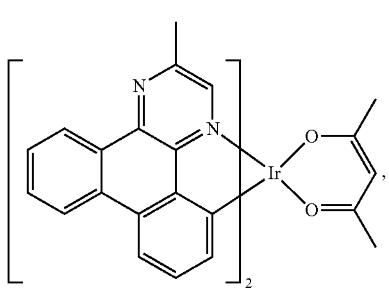
-continued
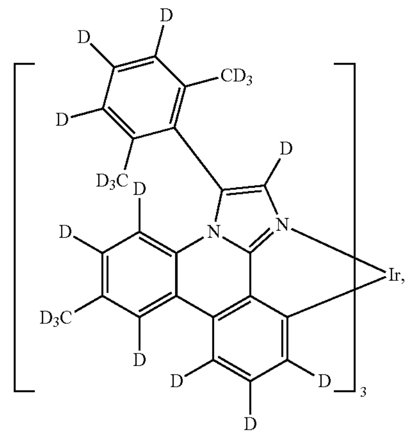
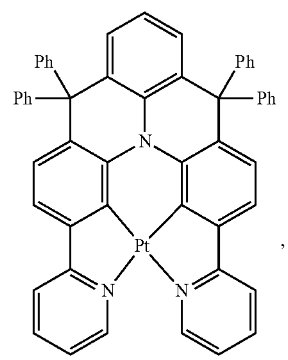
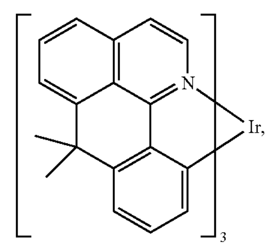
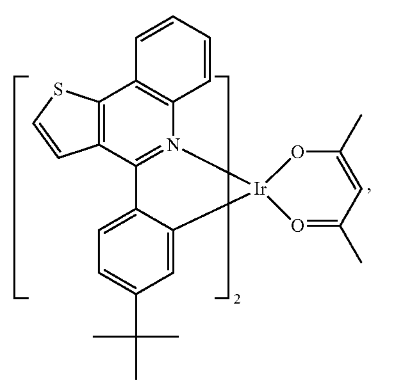
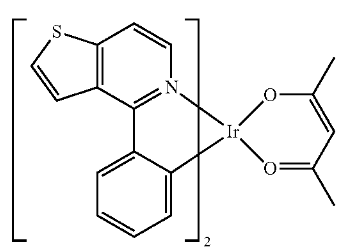

-continued
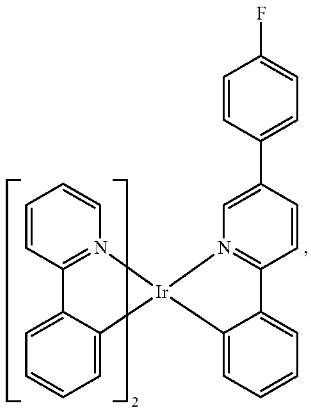
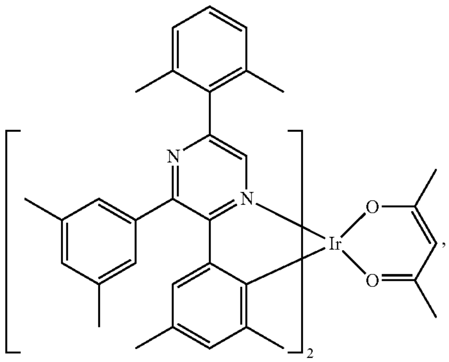
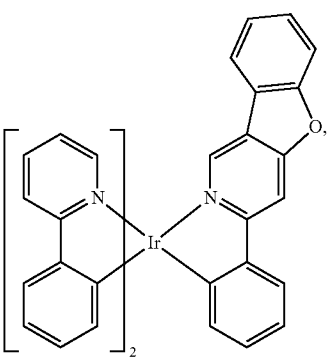
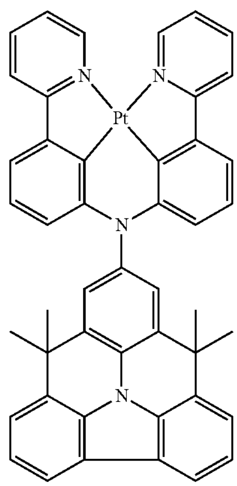
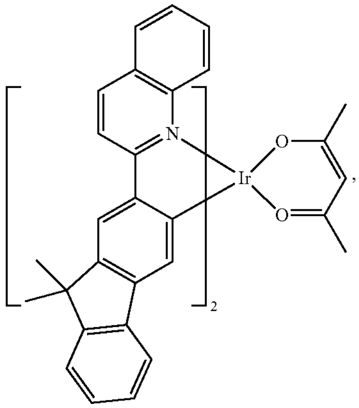
-continued
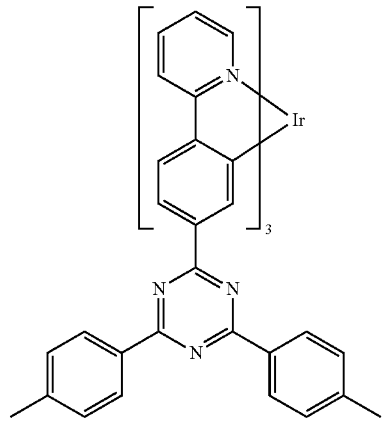
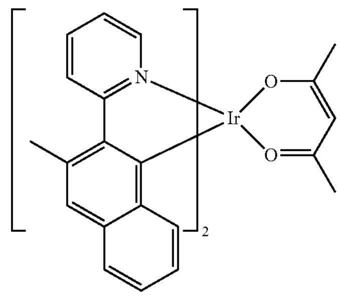
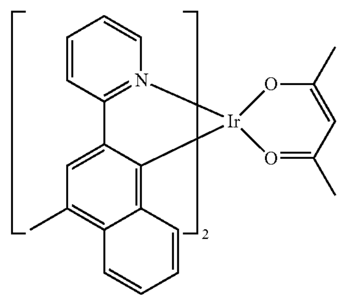
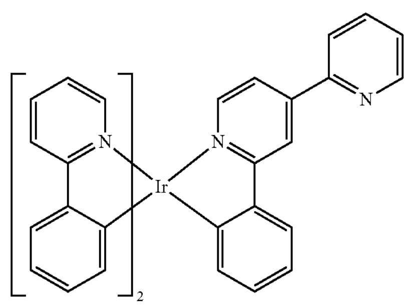
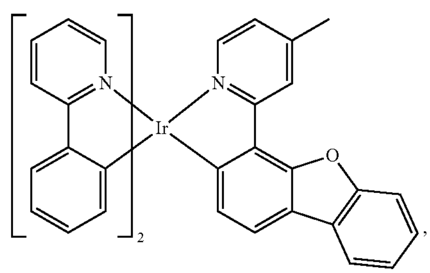

-continued
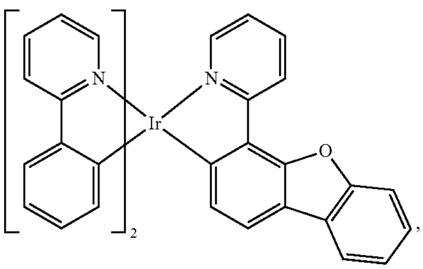
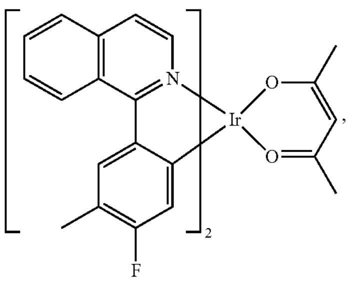
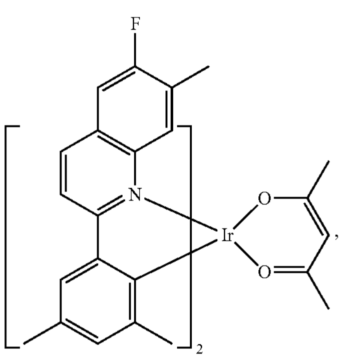
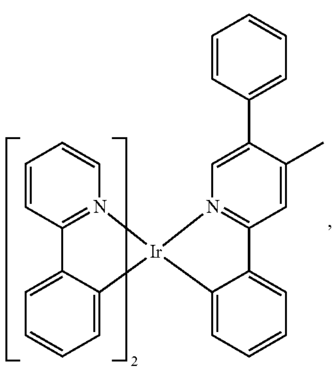
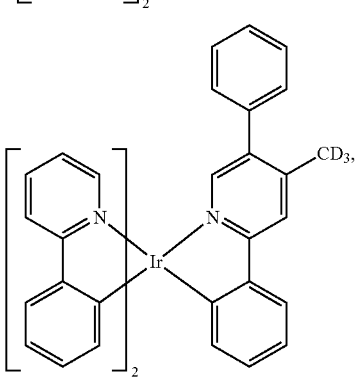
-continued
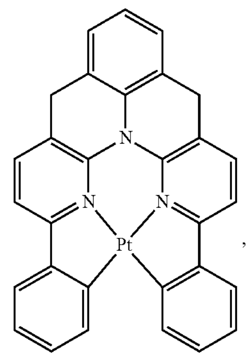
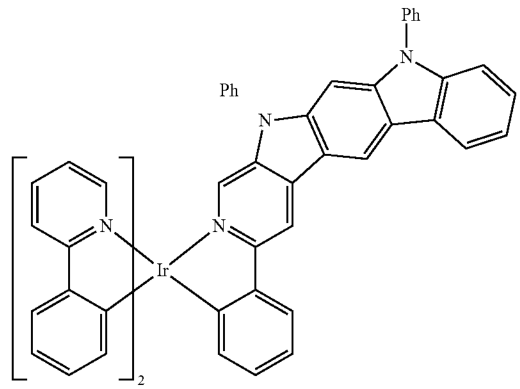
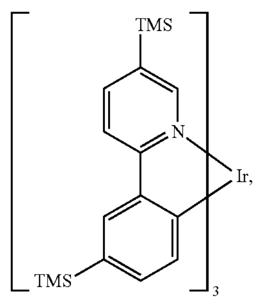
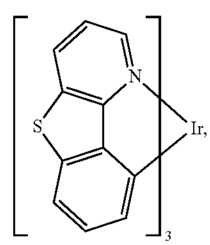
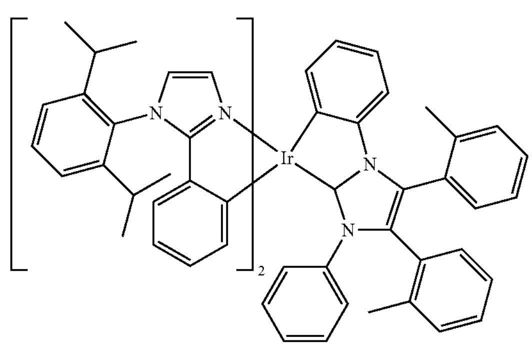
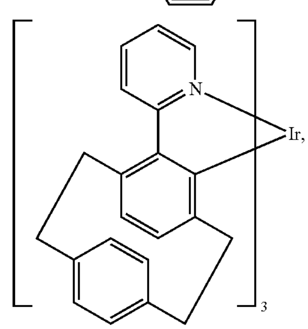

-continued
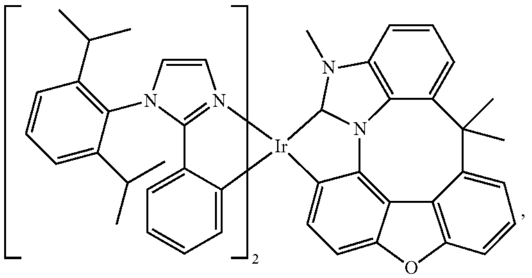
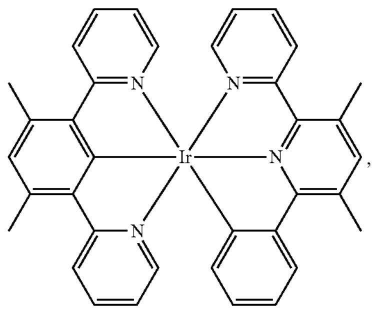
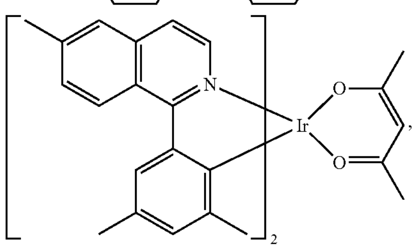
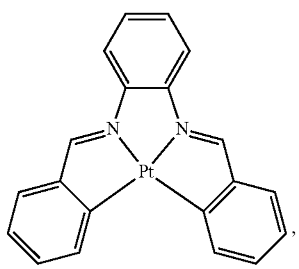
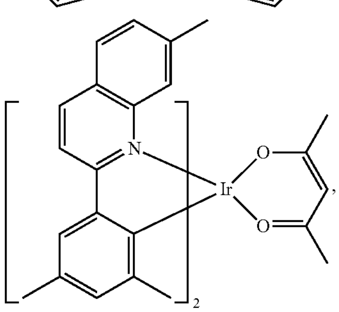
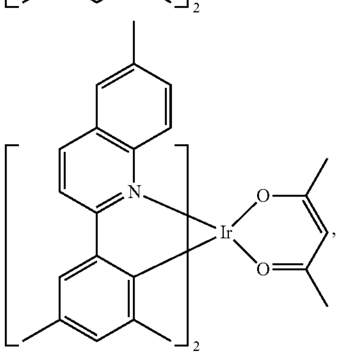
-continued
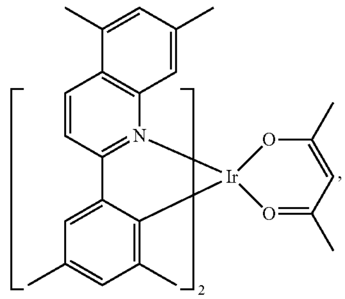
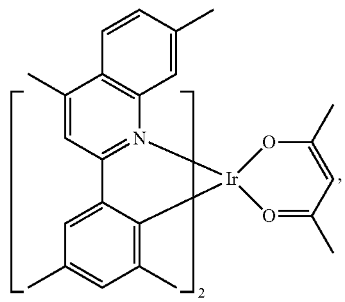
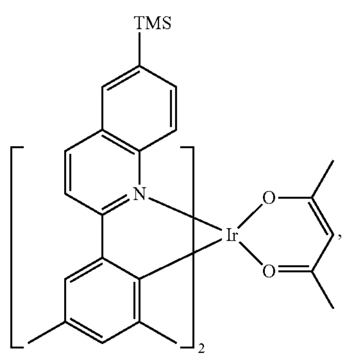
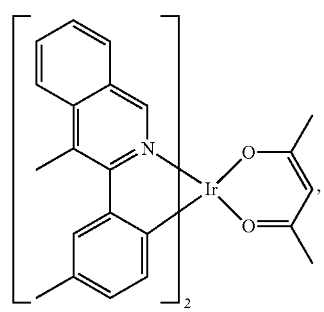
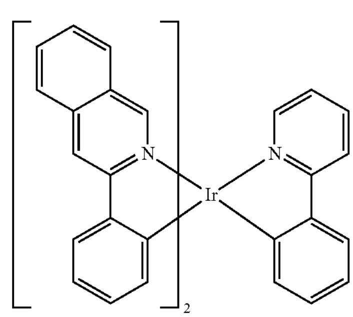

-continued
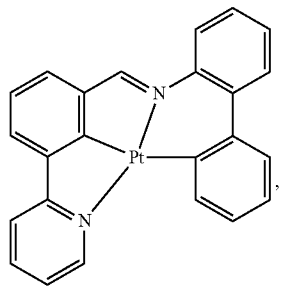
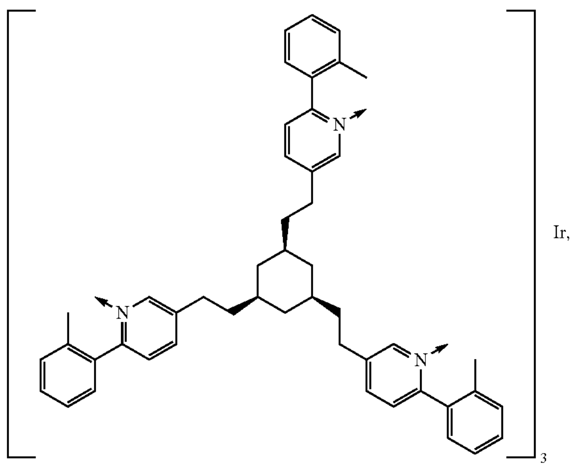
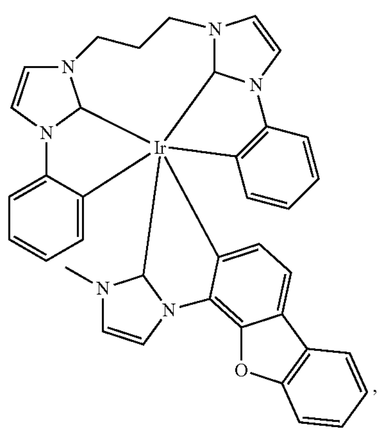
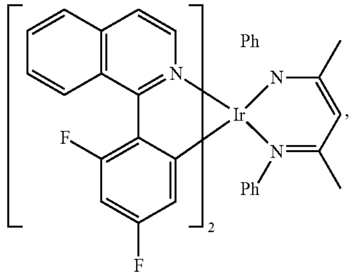
-continued
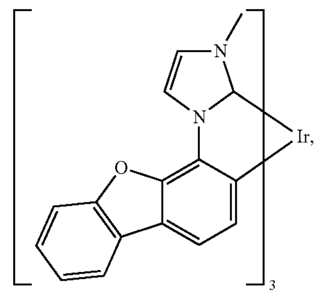
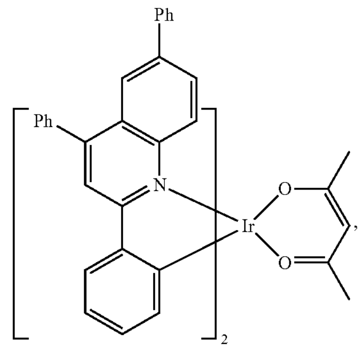
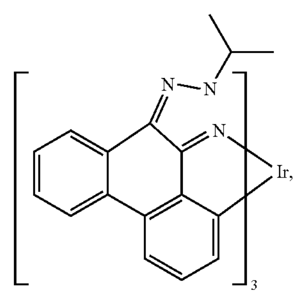
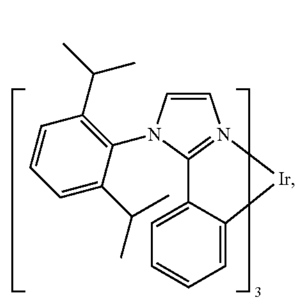
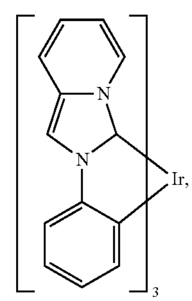
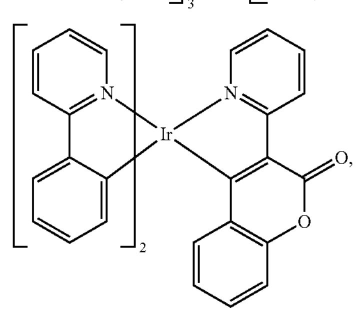

-continued

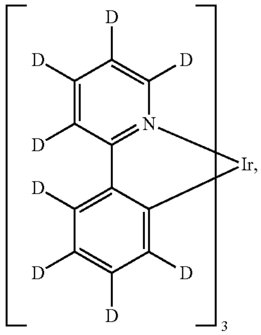

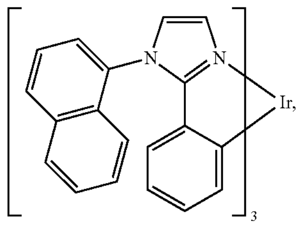

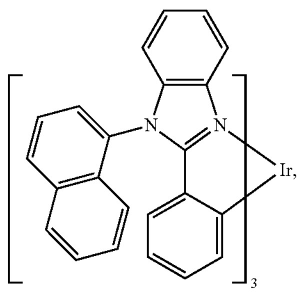

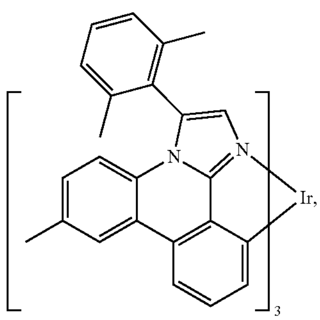

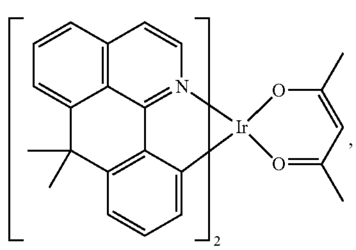

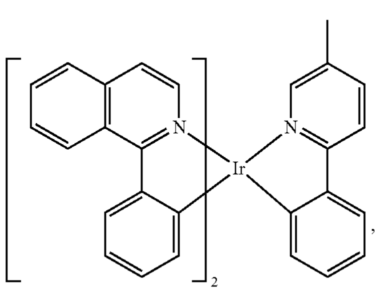

-continued

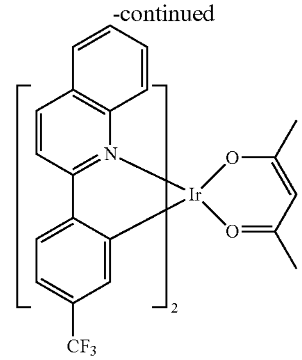

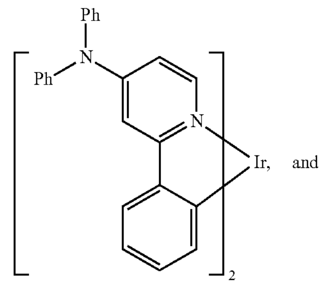

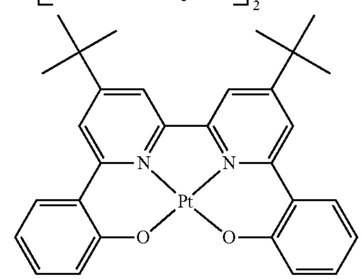

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

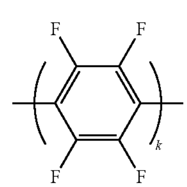

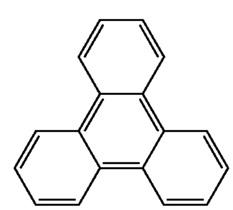

-continued

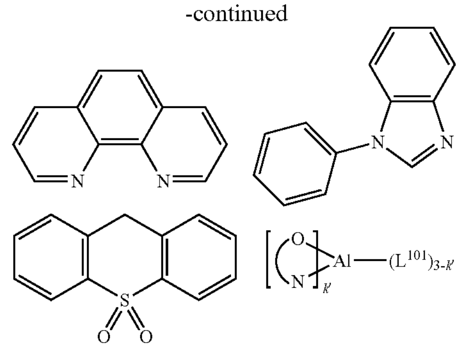

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

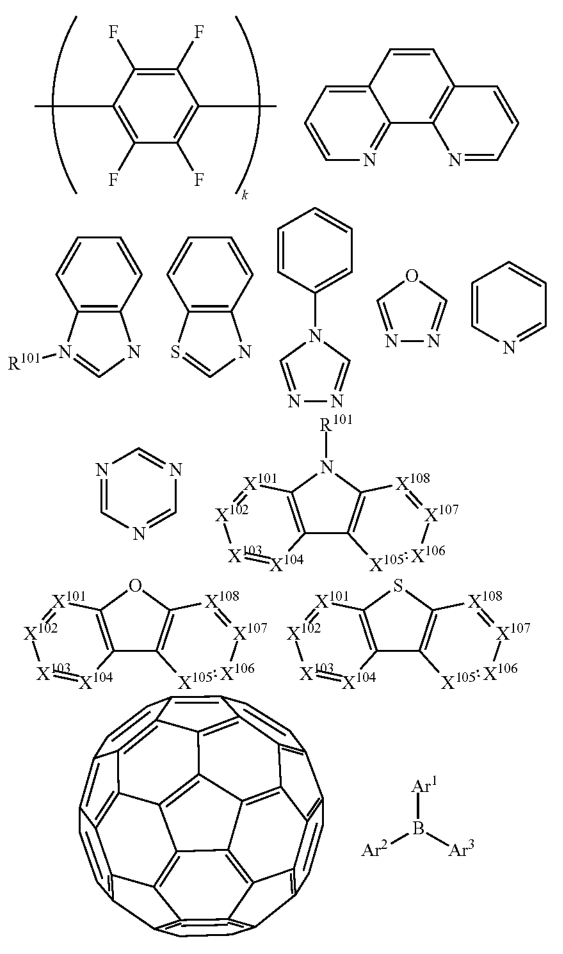

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

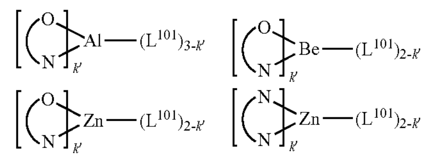

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

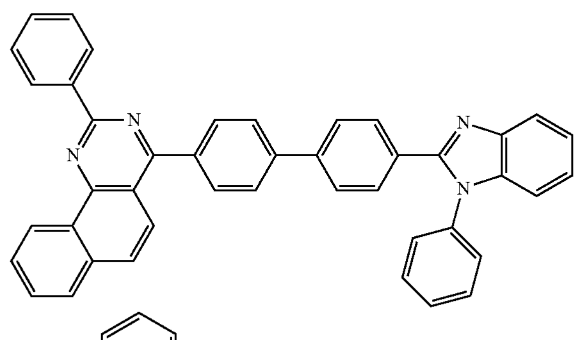

,

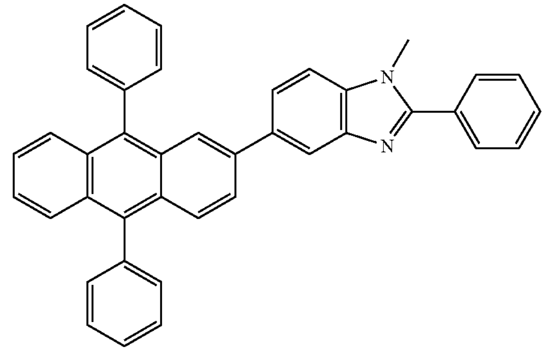

,

-continued
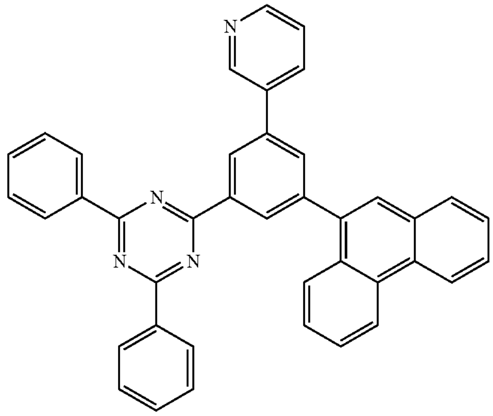
,
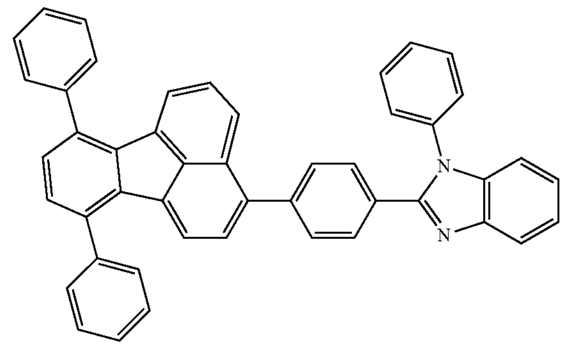
,
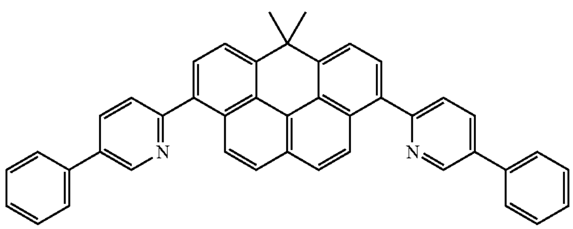
,
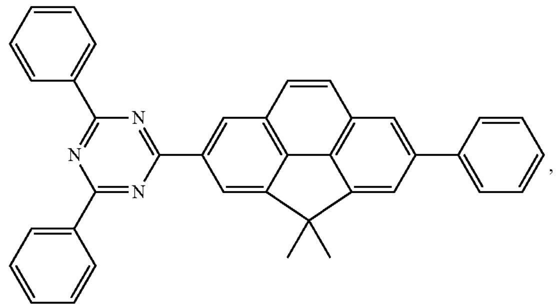
,
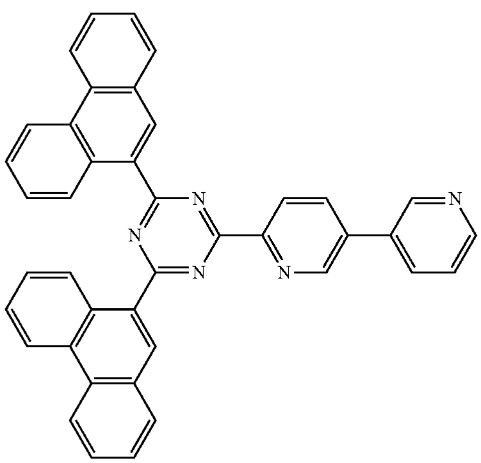
,
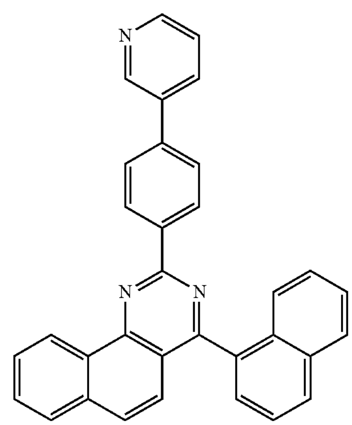
,
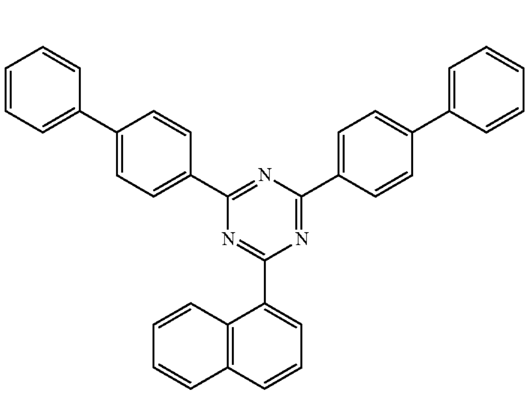
,
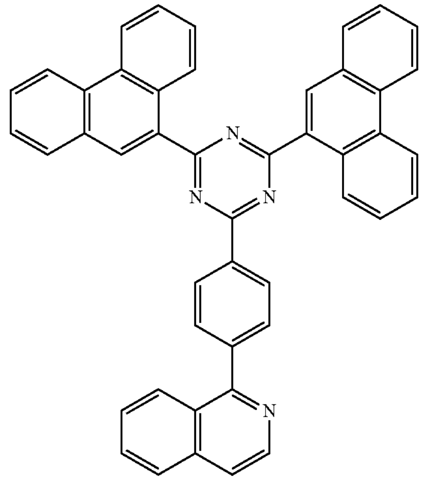
, -continued
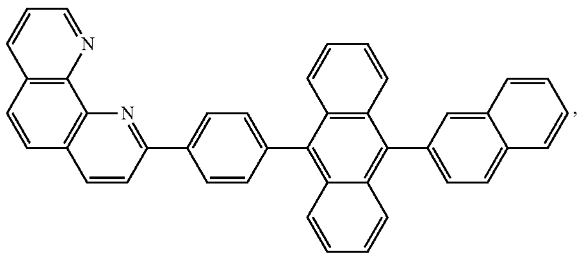
,
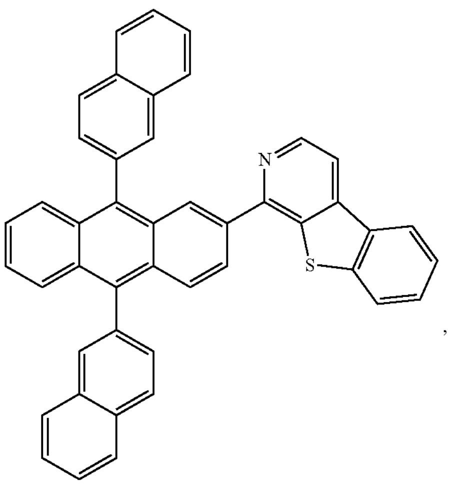
,
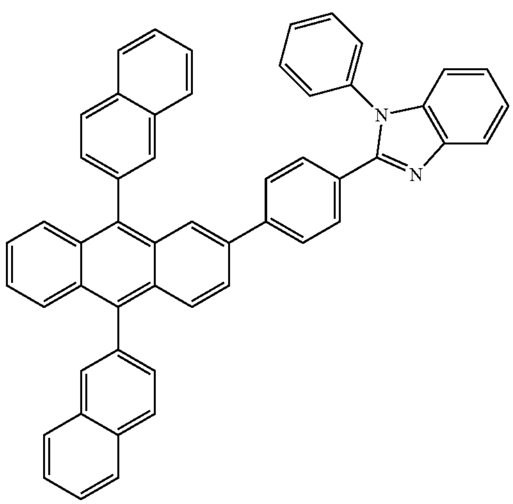
,
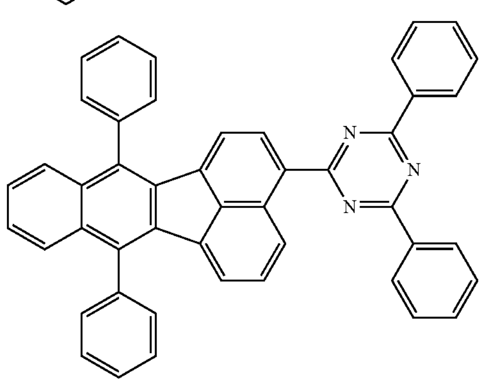
,
-continued
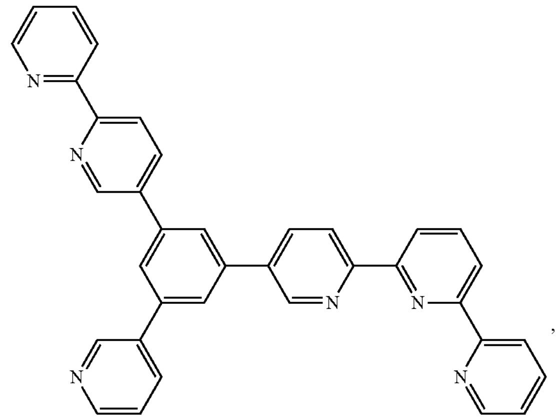
,
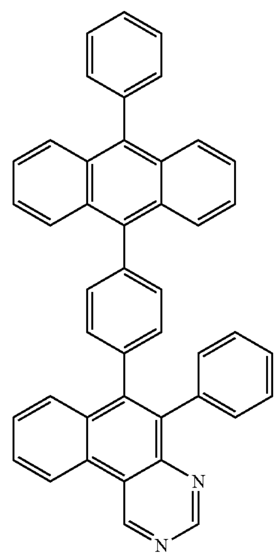
,
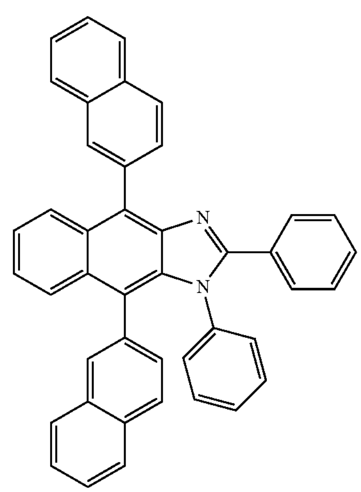
, -continued
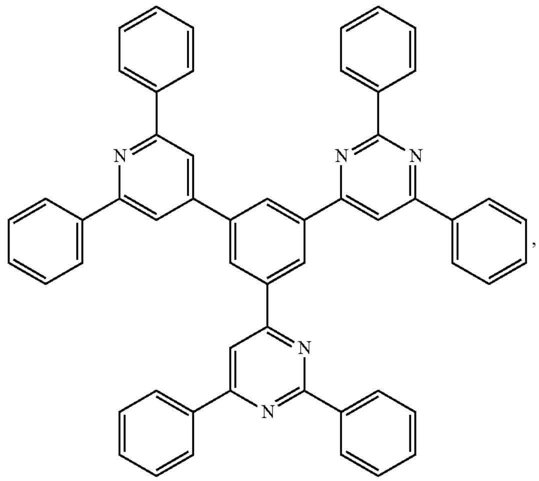
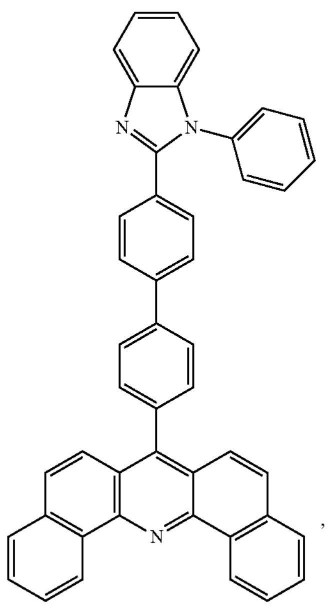
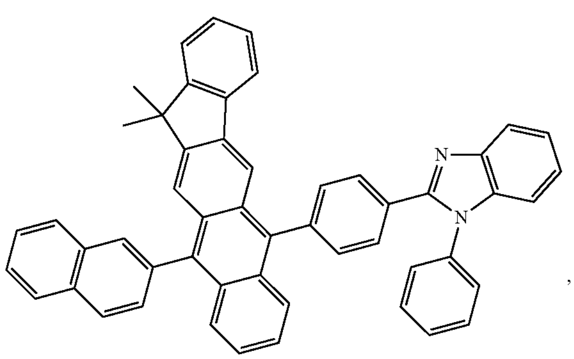
-continued
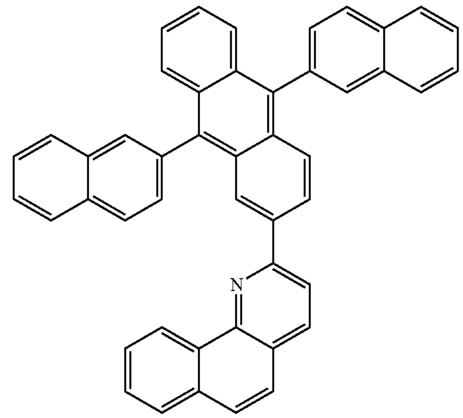
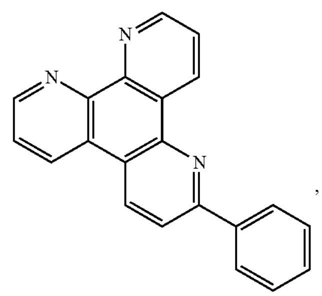
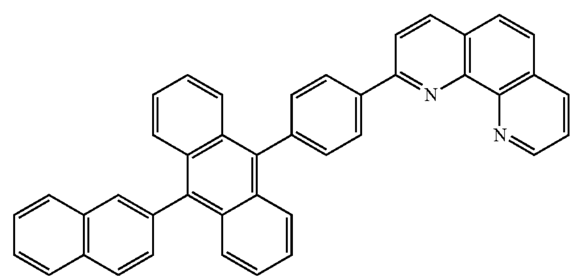
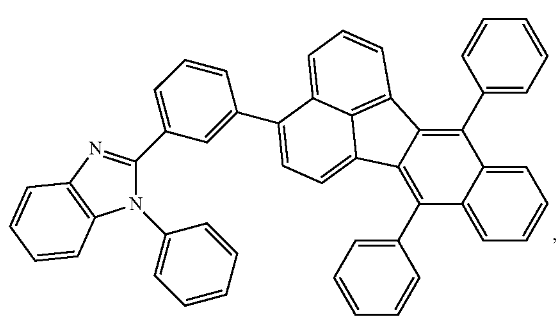

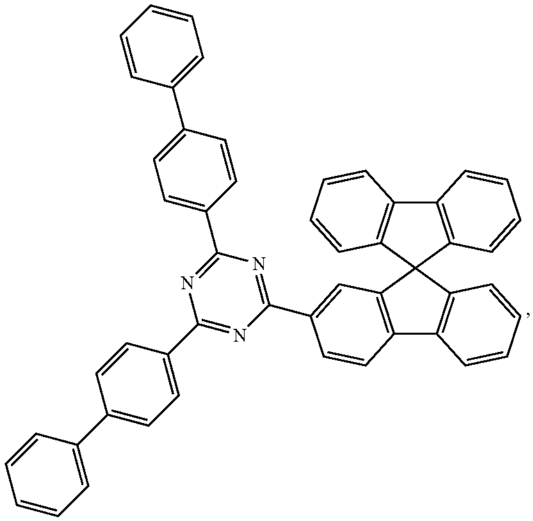
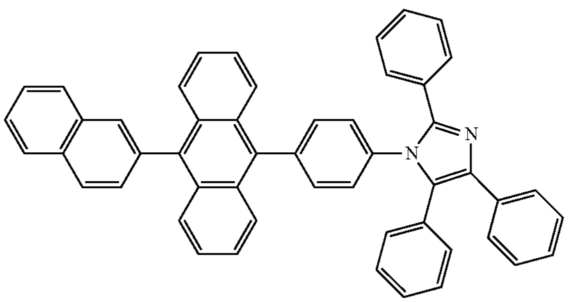
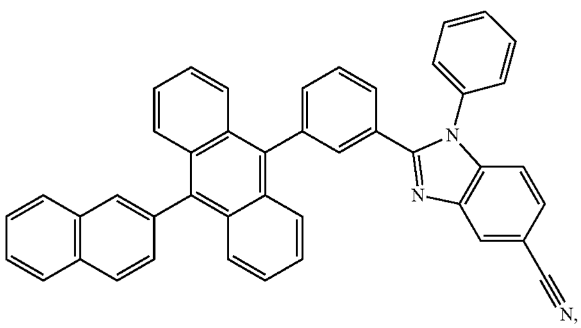
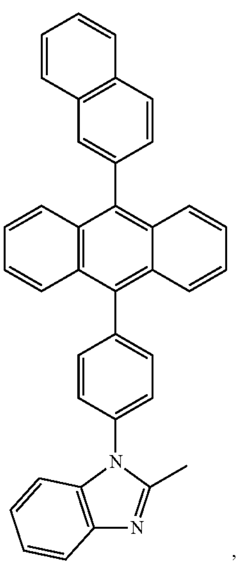
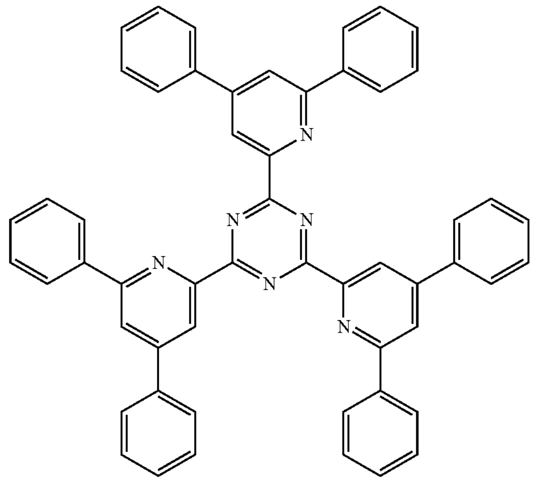
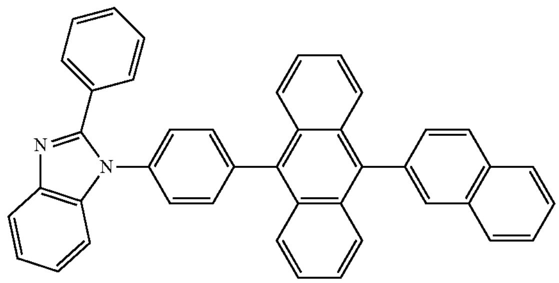
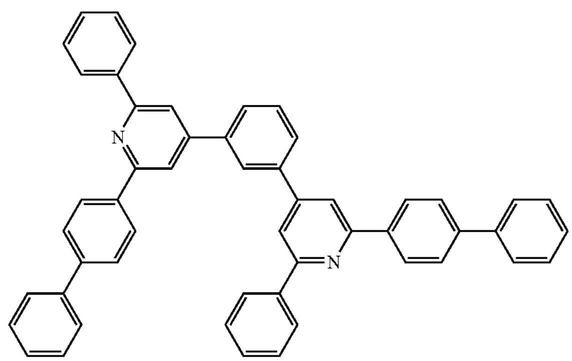
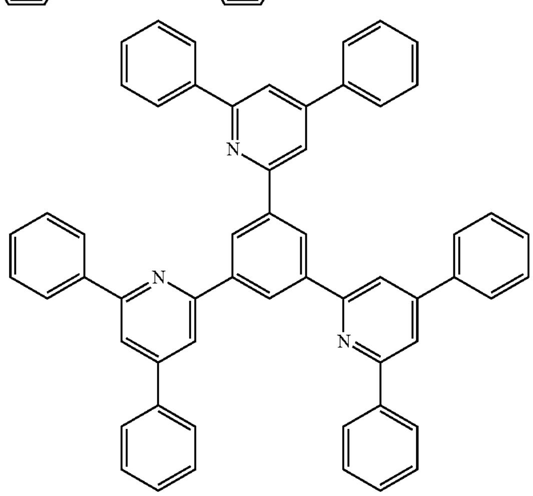

-continued

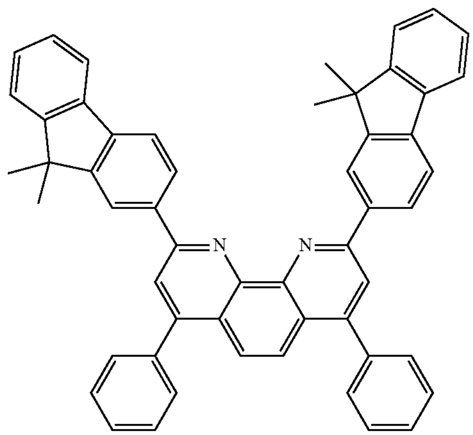

, and

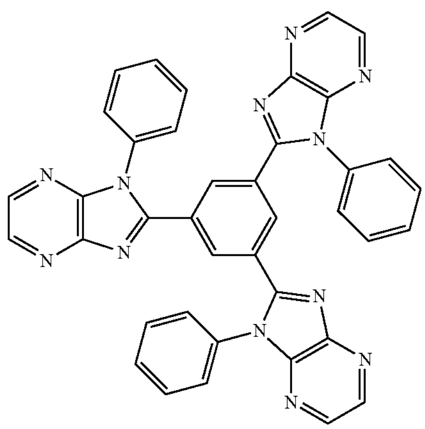

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Materials Synthesis

All reactions were carried out under nitrogen atmosphere unless specified otherwise. All solvents for reactions are anhydrous and used as received from commercial sources.

Synthesis of Compound 1,576,282 [$Ir(L_{A1252})_2(L_{C22})$]

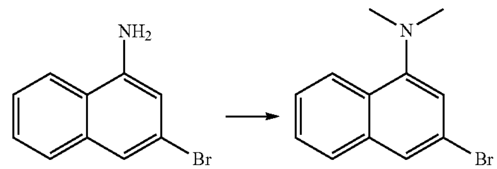

To a suspension of 3-bromonaphthalen-1-amine (10 g, 46 mmol) in acetonitrile (100 mL) were added potassium carbonate (19 g, 139 mmol) and iodomethane (29 mL, 464 mmol). The mixture was heated under reflux for 16 hrs. After cooling to room temperature, the mixture was partitioned between EtOAc (100 mL) and water (100 mL). The layers were separated and the aqueous extracted with EtOAc (2×50 mL). The combined organic extracts were dried ($Na_2SO_4$), filtered and concentrated in vacuo. The crude product was purified by column chromatography on silica gel (0-10% EtOAc/isohexane) to afford 3-bromo-N,N-dimethylnaphthalen-1-amine (10 g, 87% yield) as a pale orange oil.

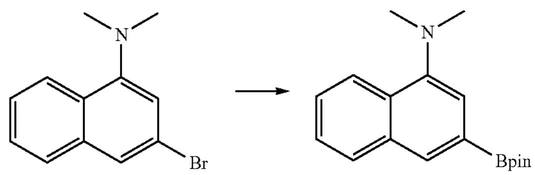

A mixture of 3-bromo-N,N-dimethylnaphthalen-1-amine (10 g, 40.8 mmol), bis(pinacolato)diboron (11.5 g, 45 mmol) and potassium acetate (10 g, 102 mmol) in 1,4-dioxane (100 mL) was degassed with nitrogen. 1,1'-bis(diphenylphosphino)ferrocene-palladium(II)dichloride dichloromethane complex (2.00 g, 2.45 mmol) was added and the mixture was heated at 80° C. for 18 hrs. After cooling to room temperature, the mixture was diluted with water (100 mL) and extracted with EtOAc (3×75 mL). The combined organic extracts were dried ($Na_2SO_4$), filtered and concentrated in vacuo. The crude material was purified by column chromatography on silica gel (0-10% MTBE/isohexane) to afford N,N-dimethyl-3-(4,4,5,5-tetramethyl-1,3,2-dioxaborolan-2-yl)naphthalen-1-amine (11.5 g, 85% yield) as a pale yellow oil, which solidified on standing to give a pale yellow, waxy solid.

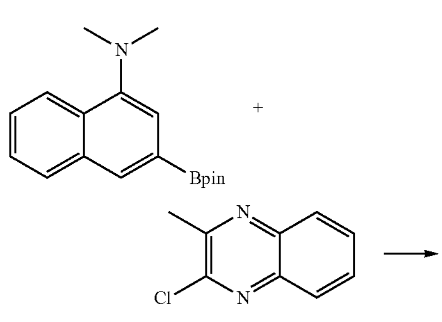

-continued

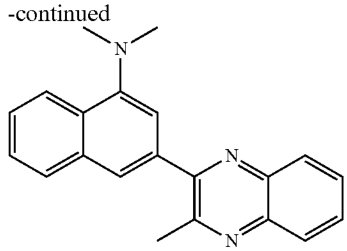

To a solution of N,N-dimethyl-3-(4,4,5,5-tetramethyl-1,3,2-dioxaborolan-2-yl)naphthalen-1-amine (4.30 g, 14.5 mmol) and 2-chloro-3-methylquinoxaline (2.70 g, 15 mmol) in 1,4-dioxane (50 mL) was added a solution of sodium carbonate (3.20 g, 30 mmol) in water (10 mL). The reaction mixture was degassed by bubbling nitrogen for 30 minutes. Tetrakis(triphenylphosphine)palladium (0.84 g, 0.72 mmol) was added and the mixture was heated at 80° C. for 17 hrs. A further portion of tetrakis(triphenylphosphine)palladium (0.84 g, 0.72 mmol) was added and heating resumed for 5 hrs. After cooling to room temperature, the mixture was partitioned between water (50 mL) and EtOAc (50 mL). The aqueous layer was extracted with EtOAc (3×50 mL). The combined organic extracts were dried ($Na_2SO_4$), filtered and concentrated in vacuo. The crude material was purified by column chromatography on silica gel (0-20% EtOAc/iso-hexane) to afford N,N-dimethyl-3-(3-methylquinoxalin-2-yl)naphthalen-1-amine (2.44 g, 54% yield) as an orange solid.

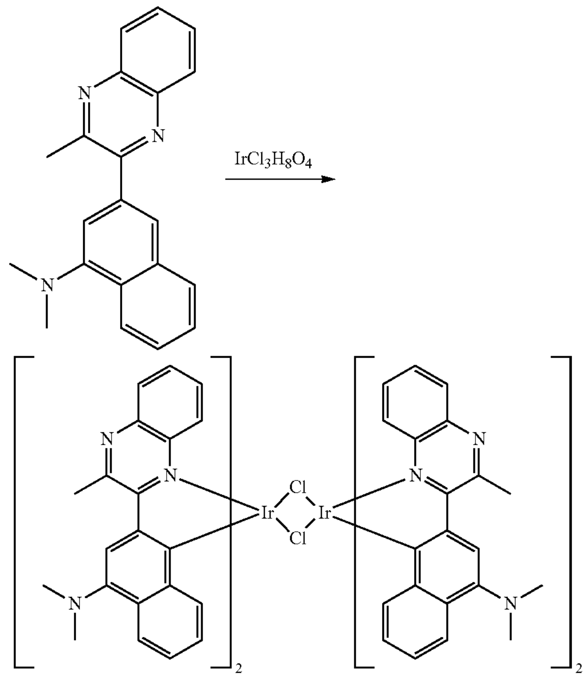

N,N-dimethyl-3-(3-methylquinoxalin-2-yl)naphthalen-1-amine (2.3 g, 7.45 mmol), 2-ethoxyethanol (45 ml) and water (15 ml) were combined in a 250 mL round bottom flask. The reaction solution was purged with nitrogen, treated with iridium(III) chloride hydrate (0.85 g, 2.3 mmol) and heated at 105° C. for 16 hrs. The solvent was removed in vacuo and the crude dimer was used as is without purification.

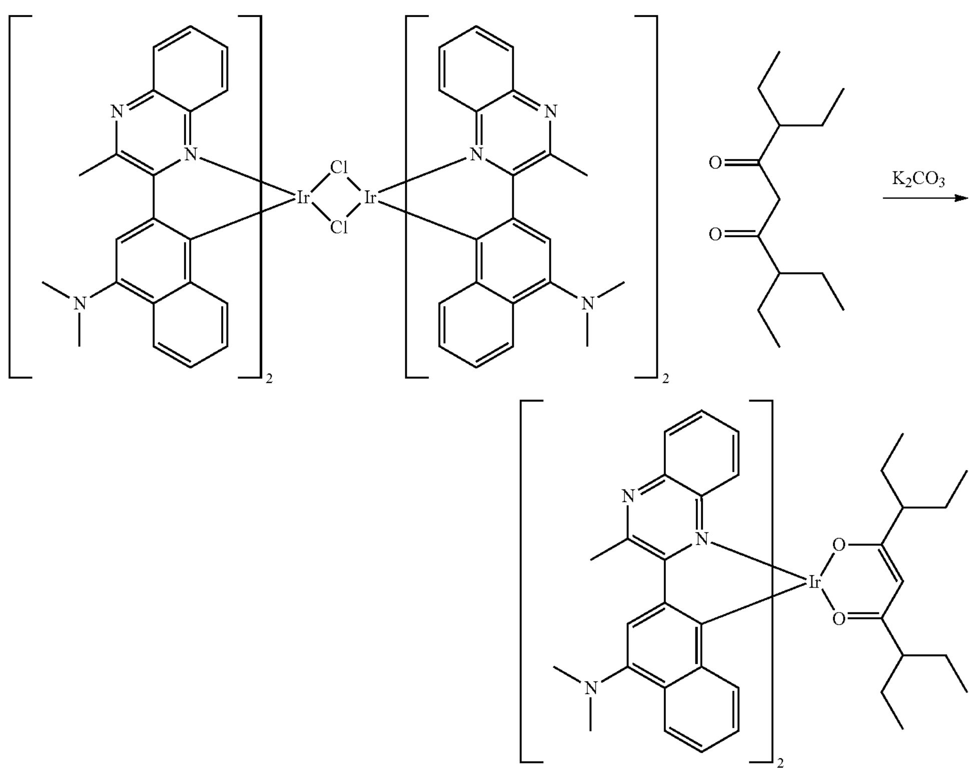

Dimer (1.90 g, 1.114 mmol), 3,7-diethylnonane-4,6-dione (2.6 ml, 11.14 mmol), and 2-ethoxyethanol (30 mL) were combined in a 250 mL round bottom flask. The reaction mixture was purged with nitrogen, treated with potassium carbonate (2.30 g, 16.72 mmol) and heated at 60° C. for 16 hrs. The solvent was removed in vacuo and the residue was suspended in MeOH and filtered through a short plug of Celite. The solids obtained were extracted with dichloromethane and purified by column chromatography in 95/5 to 90/10 (v/v) DCM/EtOAc. Fractions containing the desired product were combined and concentrated to a brown-green solid. The product was triturated twice using MeOH and dried in a desiccator oven for 16 hrs providing 0.50 g (20% yield) of the desired product as a black solid.

Synthesis of Compound 3,814,042 [Ir($L_{A3028}$)$_2$($L_{C22}$)]

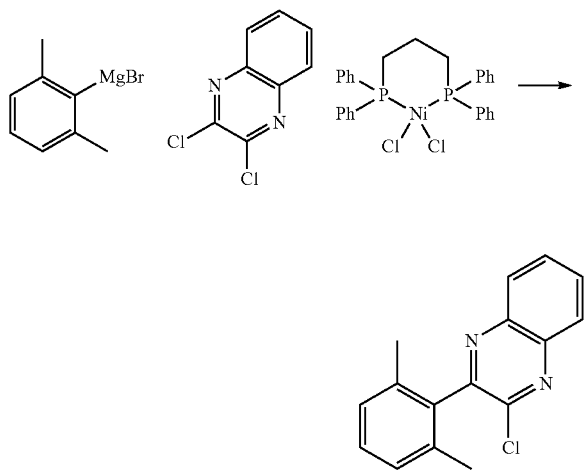

2,3-dichloroquinoxaline (9 g, 45 mmol) and Ni(dppp)$Cl_2$ (1.2 g, 2.2 mmol) were dissolved in THF (225 ml) and degassed with nitrogen. A 1M solution of 2,6-dimethylphenylmagnesium bromide (90 ml, 90 mmol) was added rapidly via syringe and the reaction was stirred at room temperature for 16 hrs. The reaction solution was quenched with saturated aqueous $NH_4Cl$ and diluted with EtOAc. The phases were separated and the organic layer was washed with brine and dried over sodium sulfate. The solvent was removed in vacuo and the crude product was purified by column chromatography in 5% EtOAc/heptanes providing 7 g (60% yield) of the desired product as white solids.

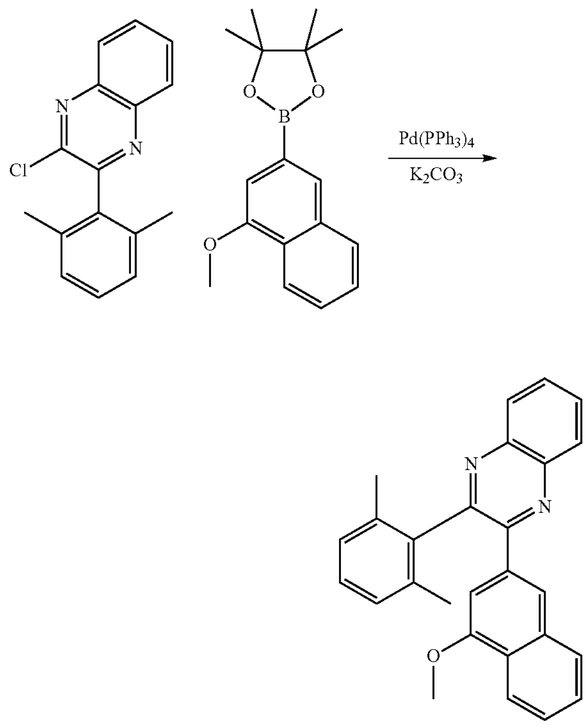

2-chloro-3-(2,6-dimethylphenyl)quinoxaline (3.30 g, 12.3 mmol), 2-(4-methoxynaphthalen-2-yl)-4,4,5,5-tetramethyl-1,3,2-dioxaborolane (3.80 g, 13.5 mmol), Pd($PPh_3$)$_4$ (0.71 g, 0.61 mmol), and potassium carbonate (3.4 g, 25 mmol) were dissolved in a mixture of DME (92 ml) and Water (31 ml) and degassed with nitrogen. The reaction mixture was heated to reflux at 100° C. for 16 hrs. The reaction was cooled to room temperature and the layers partitioned between EtOAc and water. The organic layer was washed with brine and dried over sodium sulfate. The solvent was removed in vacuo and the crude product was purified by column chromatography using 20% DCM, 0-5% EtOAc/heptanes. The product was recrystallized from EtOAc providing 3.0 g (63% yield) as pale yellow prisms.

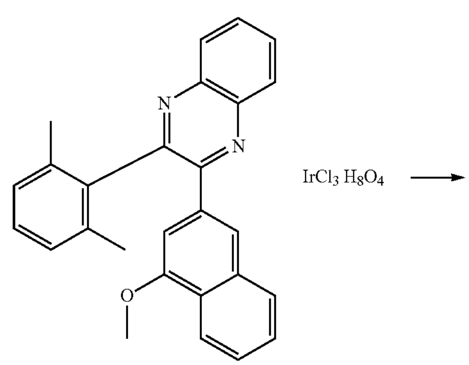

-continued

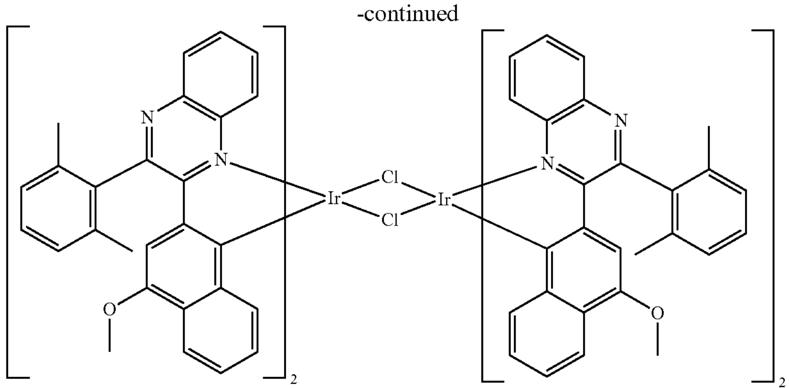

2-(2,6-dimethylphenyl)-3-(4-methoxynaphthalen-2-yl) quinoxaline (2.10 g, 5.4 mmol) and Ir(III)chloride hydrate (0.80 g, 2.1 mmol) were dissolved in a mixture of 2-EtOEtOH (27 ml) and Water (9 ml) and degassed with nitrogen. The reaction mixture was heated to reflux at 105° C. for 20 hrs. The reaction solution was cooled to room temperature, diluted with MeOH and filtered. The solids obtained were dried in vacuo providing 1.5 g (70% yield) of the desired product, which was used without purification.

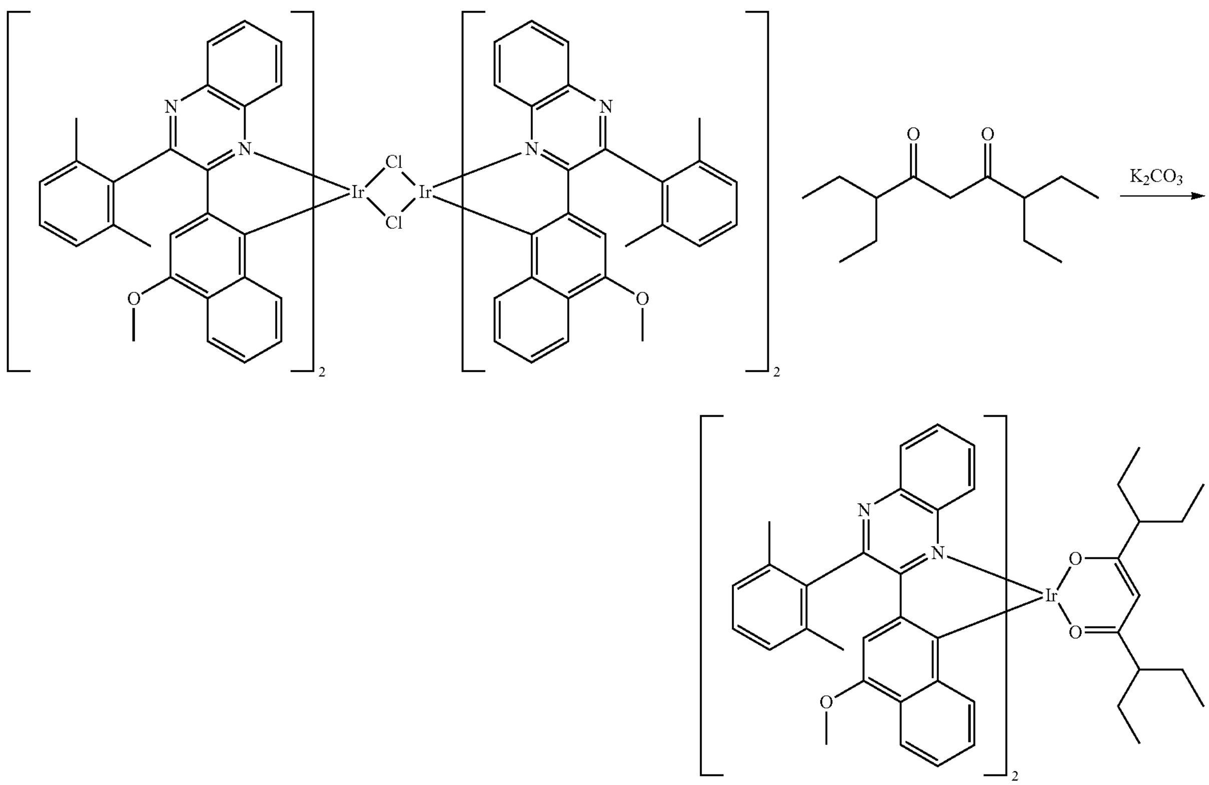

P

Dimer (1.50 g, 0.76 mmol), 2-EtOEtOH (25 ml) and 3,7-diethylnonane-4,6-dione (1.20 g, 5.70 mmol) were combined in a 100 mL RBF and degassed with nitrogen. Potassium carbonate (0.79 g, 5.70 mmol) was added and the reaction was stirred at room temperature for 16 hrs. The solvent was removed in vacuo and the crude product was loaded on Celite and purified by column chromatography using 0-15% DCM/heptanes on a TEA treated column. The product was recrystallized once from DCM/MeOH providing 0.42 g (23% yield) of the desired product as dark green solids.

Synthesis of Comparative Example

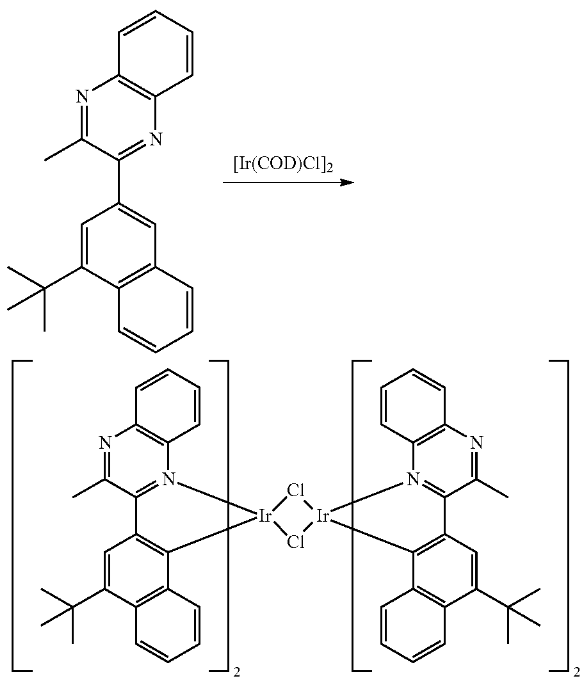

A mixture of 2-(4-(tert-butyl)naphtha en-2-yl)-3-methylquinoxaline (4.0 g, 12.2 mmol), cyclooctadieneiridium chloride dimer (1.58 g. 2.4 mmol) and 1,2-dichlorobenzene (25 mL) was stirred from 130° C.-160° C. for 7 days. The reaction mixture was used directly for the next step.

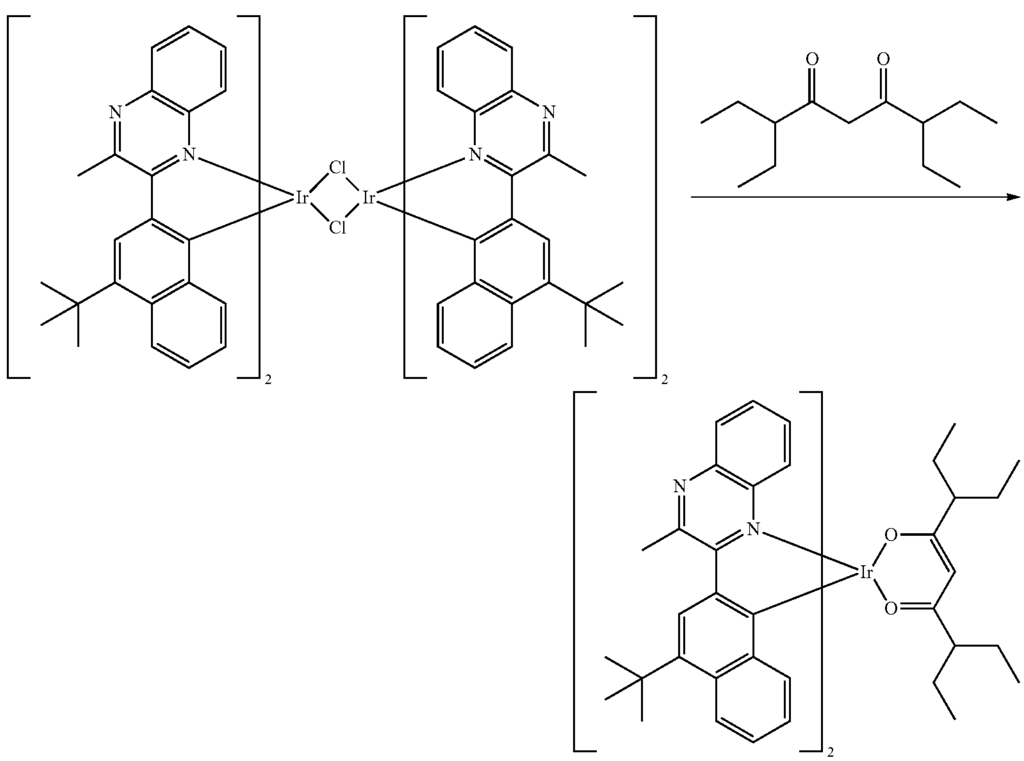

To the reaction mixture from above reaction (assumed 2.4 mmol) were added with 2-ethoxyethanol (30 mL), 3,7-diethylnonane-4,6-dione (3.8 g, 18 mmol) and potassium carbonate (2.5 g, 18 mmol). The mixture was stirred overnight at room temperature. The solvents were removed under reduced pressure and the dark residue was dry-loaded onto silica gel (20 g) then purified on an silica gel column eluting with 0-100% dichloromethane in heptanes over 60 mins to give bis[(2-(4-(tert-butyl)naphthalen-2-yl)-3-methylquinoxalinyl)](3,7-diethyl-4,6-nonanedionato-k$_2$O,O') iridium(III) 1.20 g (9% yield over two steps).

Figure 3:
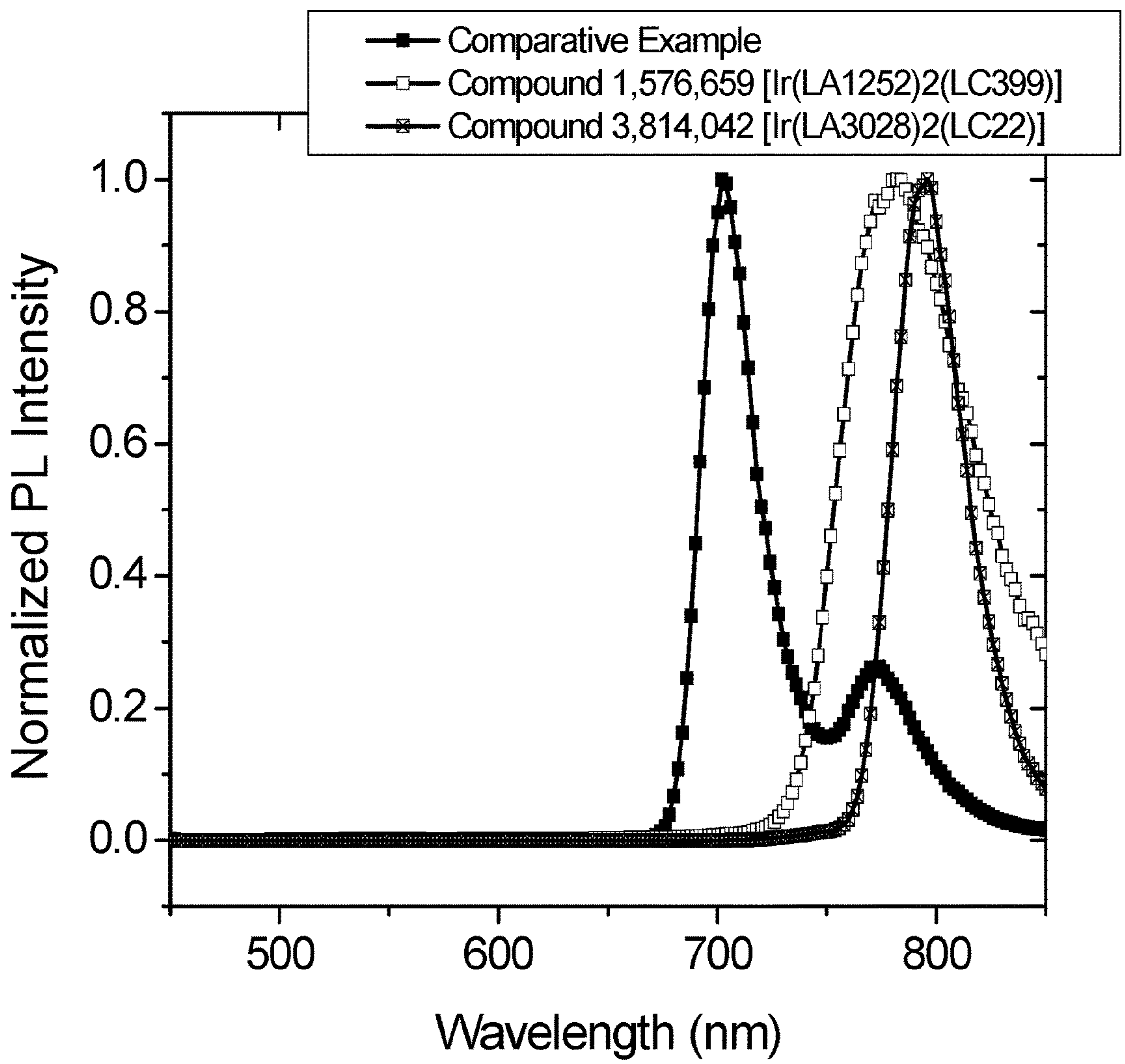
FIG. 3 shows the 77K solution emission spectra of Comparative Example, Compound 1,576,659 $[Ir(L_{A1252})_2(L_{C399})]$ and Compound 3,814,042 $[Ir(L_{A3028})2(L_{C22})]$ with normalized intensity.

FIG. 3 shows the 77K solution emission spectra of Comparative Example, Compound 1,576,659 [Ir($L_{A1252}$)$_2$($L_{C399}$)] and Compound 3,814,042 [Ir($L_{A3028}$)2($L_{C22}$)] with normalized intensity. Compound 1,576,659 [Ir($L_{A1252}$)2($L_{C399}$)] shows emission peak at 781 nm, Compound 3,814,042 [Ir($L_{A3028}$)2($L_{C22}$)] shows emission peak at 795 nm and Comparative Example shows emission peak at 702 nm. Near-infrared emission is clearly seen in Compound 1,576,659 [Ir($L_{A1252}$)2($L_{C399}$)] and Compound 3,814,042 [Ir($L_{A3028}$)2($L_{C22}$)]. Therefore, it is advantageous to have a strong electron-donating side chains on a phenyl or naphthyl moiety to provide red shift and to achieve near-infrared emission.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula $M(L_A)_x(L_B)_y(L_C)_z$:

wherein the ligand $L_A$ is selected from the group consisting of

Formula A1

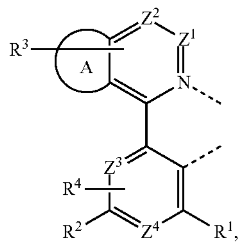

Formula A2

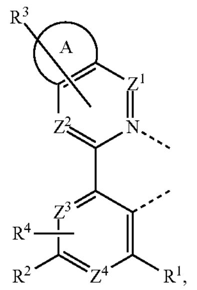

and

Formula A3

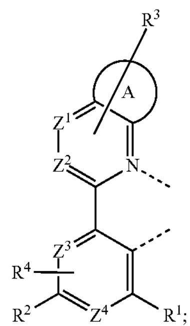

wherein the ligand $L_B$ is

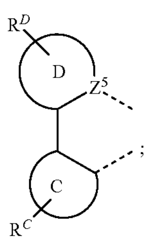

wherein the ligand $L_C$ is

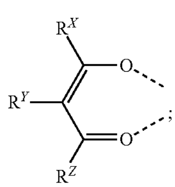

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen, and wherein at least one of the following is true:

(1) exactly one of $R^1$, $R^2$, and $R^4$ comprises a moiety selected from the group consisting of alkoxy, aryloxy, and amino;

(2) one substituent $R^4$ and either $R^1$ or $R^2$ are joined or fused into an aromatic ring, or (3)(a) at least one of $Z^1$ and $Z^2$ is N, and (b) at least one of the following is true:

(i) ring A is a substituted ring, a heteroaryl ring, a 5-membered ring, or a combination thereof, (ii) at least one $R^3$ or $R^4$ comprises halide, (iii) $L_A$ is either Formula A1 or Formula A2, or (iv) $L_A$ is Formula A3 and $Z^2$ is N.

2. The compound of claim 1, wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof, and wherein $R^3$, $R^4$, $R^C$, $R^D$, $R^X$, $R^Y$, and $R^Z$ are independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

3. The compound of claim 1, wherein $R^2$ is an electron donating group having Hammett constant $\sigma_p$ less than 0, $R^1$ is selected from the group consisting of alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

4. The compound of claim 1, wherein M is selected from the group consisting of Ir, Rh, Re, Ru, Os, Pt, Au, and Cu.

5. The compound of claim 1, wherein the compound has the formula $M(L_A)_2(L_C)$ or the formula $M(L_A)(L_B)_2$.

6. The compound of claim 1, wherein $Z^2$ is nitrogen.

7. The compound of claim 1, wherein the electron donating group is selected from the group consisting of NRR' and OR;

wherein each of R, and R' is independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein any plurality of R, R' are optionally joined or fused into a ring.

8. The compound of claim 1, wherein the ligand $L_A$ is selected from the group consisting of:

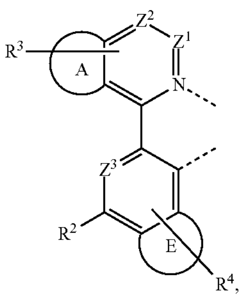

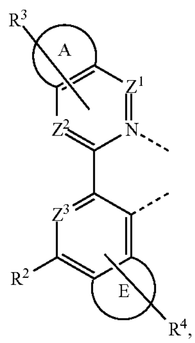

and

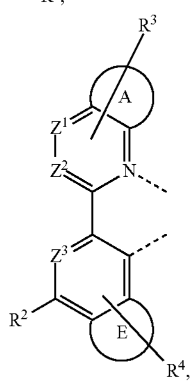

wherein ring E is a 5 or 6-membered carbocyclic or heterocyclic ring.

9. The compound of claim 1, wherein the electron donating group is selected from the group consisting of:

$R^{C1}$

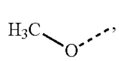

$R^{C2}$

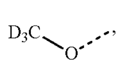

$R^{C3}$

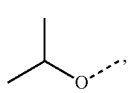

$R^{C4}$

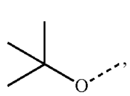

-continued $R^{C5}$

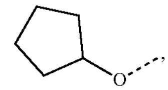

$R^{C6}$

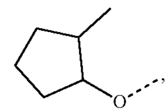

$R^{C7}$

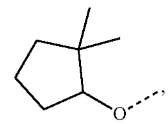

$R^{C8}$

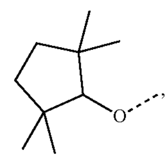

$R^{C9}$

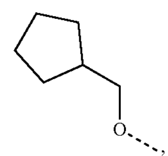

$R^{C10}$

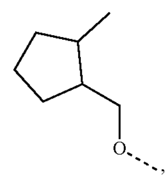

$R^{C11}$

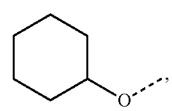

$R^{C12}$

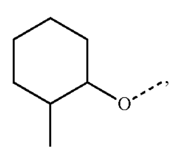

$R^{C13}$

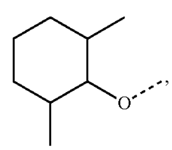

$R^{C14}$

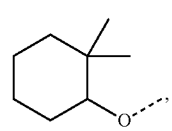

$R^{C15}$

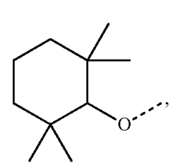

-continued $R^{C16}$

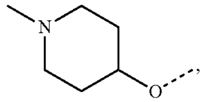

$R^{C17}$

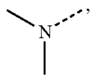

$R^{C18}$

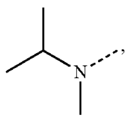

$R^{C19}$

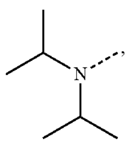

$R^{C20}$

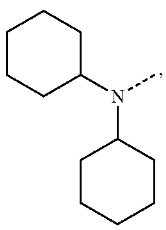

$R^{C21}$

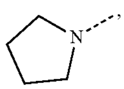

$R^{C22}$

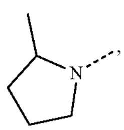

$R^{C23}$

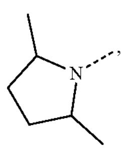

$R^{C24}$

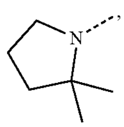

$R^{C25}$

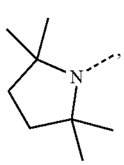

$R^{C26}$

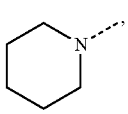

-continued $R^{C27}$

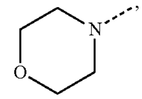

$R^{C28}$

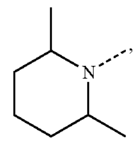

$R^{C29}$

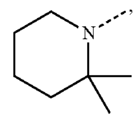

$R^{C30}$

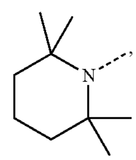

$R^{C31}$

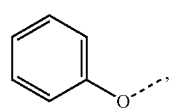

and $R^{C32}$

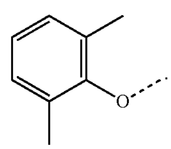

10. The compound of claim 1, wherein $L_C$ has the formula:

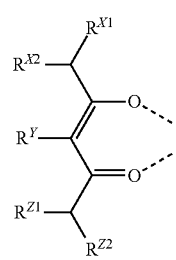

wherein $R^{X1}$, $R^{X2}$, $R^{Z1}$, and $R^{Z2}$ are independently selected from group consisting of alkyl, cycloalkyl, aryl, and heteroaryl; and wherein at least one of $R^{X1}$, $R^{X2}$, $R^{Z1}$, and $R^{Z2}$ has at least two carbon atoms.

11. The compound of claim 1, wherein the ligand $L_A$ is selected from the group consisting of:

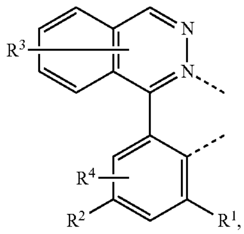
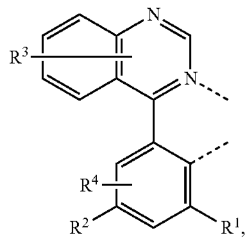
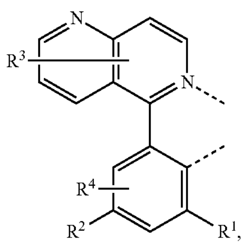
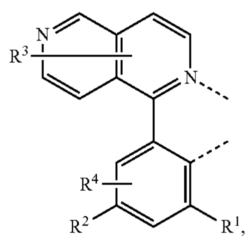
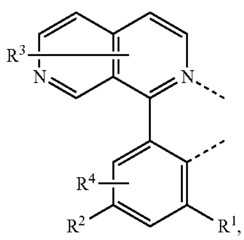
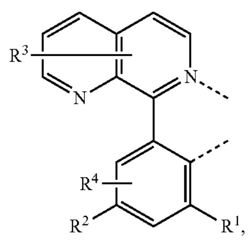
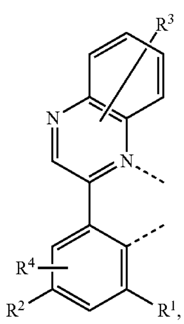
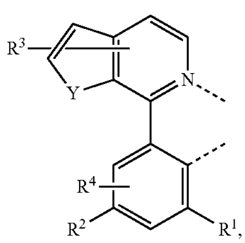
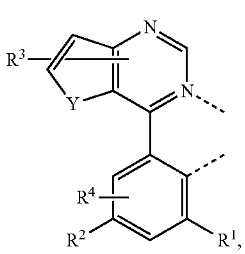
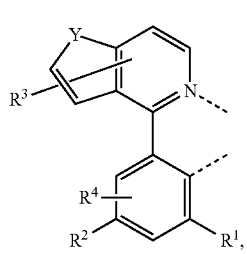
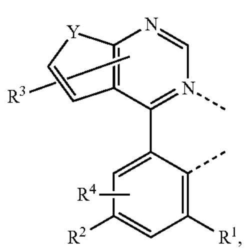
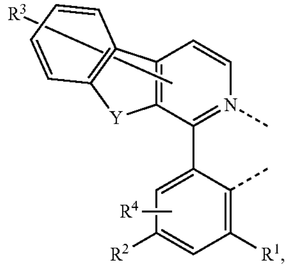
-continued
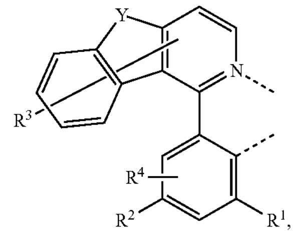
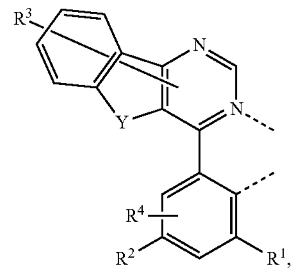
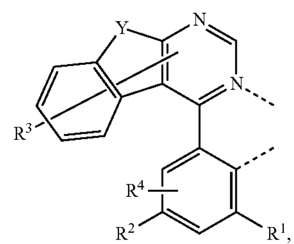
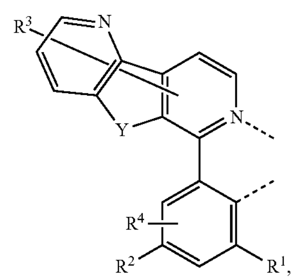
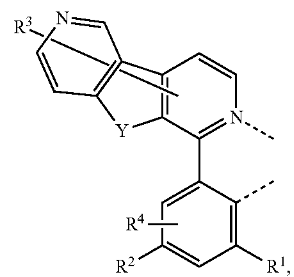
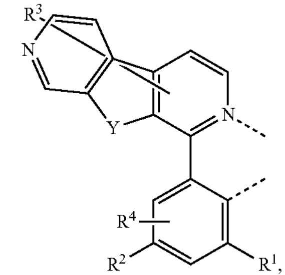

-continued

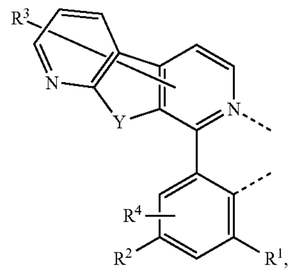
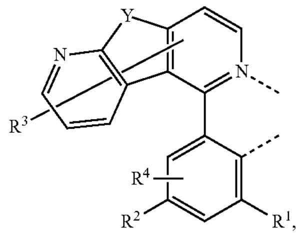
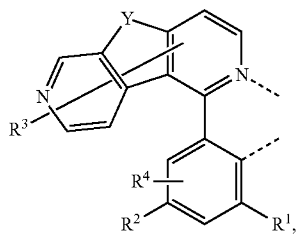
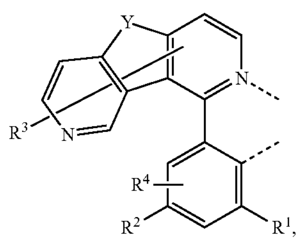
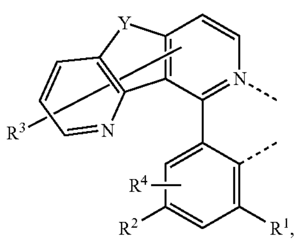
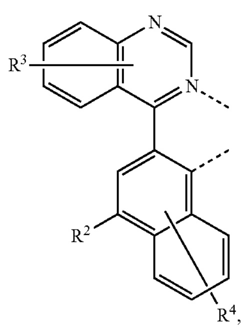
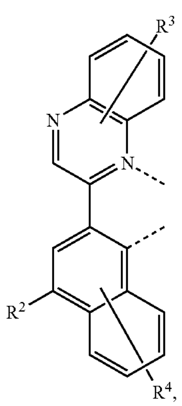
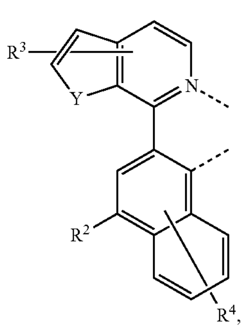

-continued

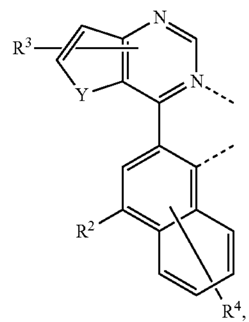
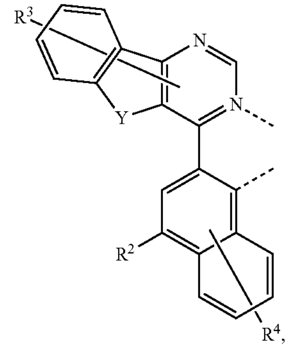
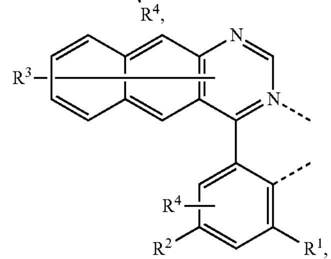

and

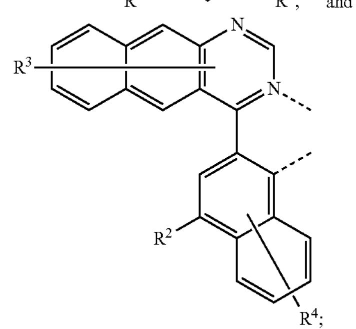

wherein Y is selected from the group consisting of S, O, Se, and $N(CH_3)_2$.

12. The compound of claim 1, wherein the ligand $L_A$ is selected from the group consisting of:

$L_{A1}$ through $L_{A306}$ that are based on a structure of Formula I,

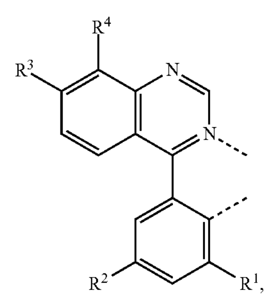

in which $R^1$, $R^2$, $R^3$, and $R^4$ are defined as:

| Ligand | $R^1$ | $R^2$ | $R^3$ | $R^4$ |
|---|---|---|---|---|
| $L_{A1}$ | $R^{C1}$ | $R^{C1}$ | H | H |
| $L_{A2}$ | $R^{C1}$ | $R^{C1}$ | $R^{B1}$ | H |
| $L_{A3}$ | $R^{C1}$ | $R^{C1}$ | $R^{B3}$ | H |
| $L_{A4}$ | $R^{C1}$ | $R^{C1}$ | $R^{B4}$ | H |
| $L_{A5}$ | $R^{C1}$ | $R^{C1}$ | $R^{B7}$ | H |
| $L_{A6}$ | $R^{C1}$ | $R^{C1}$ | $R^{B12}$ | H |

-continued

| Ligand | $R^1$ | $R^2$ | $R^3$ | $R^4$ |
|---|---|---|---|---|
| $L_{A47}$ | $R^{C1}$ | $R^{C1}$ | $R^{B18}$ | H |
| $L_{A48}$ | $R^{C1}$ | $R^{C1}$ | $R^{A3}$ | H |
| $L_{A49}$ | $R^{C1}$ | $R^{C1}$ | $R^{A34}$ | H |
| $L_{A10}$ | $R^{C3}$ | $R^{C3}$ | H | H |
| $L_{A11}$ | $R^{C3}$ | $R^{C3}$ | $R^{B1}$ | H |
| $L_{A12}$ | $R^{C3}$ | $R^{C3}$ | $R^{B3}$ | H |
| $L_{A13}$ | $R^{C3}$ | $R^{C3}$ | $R^{B4}$ | H |
| $L_{A14}$ | $R^{C3}$ | $R^{C3}$ | $R^{B7}$ | H |
| $L_{A15}$ | $R^{C3}$ | $R^{C3}$ | $R^{B12}$ | H |
| $L_{A16}$ | $R^{C3}$ | $R^{C3}$ | $R^{B18}$ | H |
| $L_{A17}$ | $R^{C3}$ | $R^{C3}$ | $R^{A3}$ | H |
| $L_{A18}$ | $R^{C3}$ | $R^{C3}$ | $R^{A34}$ | H |
| $L_{A19}$ | $R^{C5}$ | $R^{C5}$ | H | H |
| $L_{A20}$ | $R^{C5}$ | $R^{C5}$ | $R^{B1}$ | H |
| $L_{A21}$ | $R^{C5}$ | $R^{C5}$ | $R^{B3}$ | H |
| $L_{A22}$ | $R^{C5}$ | $R^{C5}$ | $R^{B4}$ | H |
| $L_{A23}$ | $R^{C5}$ | $R^{C5}$ | $R^{B7}$ | H |
| $L_{A24}$ | $R^{C5}$ | $R^{C5}$ | $R^{B12}$ | H |
| $L_{A25}$ | $R^{C5}$ | $R^{C5}$ | $R^{B18}$ | H |
| $L_{A26}$ | $R^{C5}$ | $R^{C5}$ | $R^{A3}$ | H |
| $L_{A27}$ | $R^{C5}$ | $R^{C5}$ | $R^{A34}$ | H |
| $L_{A28}$ | $R^{C17}$ | $R^{C17}$ | H | H |
| $L_{A29}$ | $R^{C17}$ | $R^{C17}$ | $R^{B1}$ | H |
| $L_{A30}$ | $R^{C17}$ | $R^{C17}$ | $R^{B3}$ | H |
| $L_{A31}$ | $R^{C17}$ | $R^{C17}$ | $R^{B4}$ | H |
| $L_{A32}$ | $R^{C17}$ | $R^{C17}$ | $R^{B7}$ | H |
| $L_{A33}$ | $R^{C17}$ | $R^{C17}$ | $R^{B12}$ | H |
| $L_{A34}$ | $R^{C17}$ | $R^{C17}$ | $R^{B18}$ | H |
| $L_{A35}$ | $R^{C17}$ | $R^{C17}$ | $R^{A3}$ | H |
| $L_{A36}$ | $R^{C17}$ | $R^{C17}$ | $R^{A34}$ | H |
| $L_{A37}$ | $R^{C19}$ | $R^{C19}$ | H | H |
| $L_{A38}$ | $R^{C19}$ | $R^{C19}$ | $R^{B1}$ | H |
| $L_{A39}$ | $R^{C19}$ | $R^{C19}$ | $R^{B3}$ | H |
| $L_{A40}$ | $R^{C19}$ | $R^{C19}$ | $R^{B4}$ | H |
| $L_{A41}$ | $R^{C19}$ | $R^{C19}$ | $R^{B7}$ | H |
| $L_{A42}$ | $R^{C19}$ | $R^{C19}$ | $R^{B12}$ | H |
| $L_{A43}$ | $R^{C19}$ | $R^{C19}$ | $R^{B18}$ | H |
| $L_{A44}$ | $R^{C19}$ | $R^{C19}$ | $R^{A3}$ | H |
| $L_{A45}$ | $R^{C19}$ | $R^{C19}$ | $R^{A34}$ | H |
| $L_{A46}$ | $R^{C21}$ | $R^{C21}$ | H | H |
| $L_{A47}$ | $R^{C21}$ | $R^{C21}$ | $R^{B1}$ | H |
| $L_{A48}$ | $R^{C21}$ | $R^{C21}$ | $R^{B3}$ | H |
| $L_{A49}$ | $R^{C21}$ | $R^{C21}$ | $R^{B4}$ | H |
| $L_{A50}$ | $R^{C21}$ | $R^{C21}$ | $R^{B7}$ | H |
| $L_{A51}$ | $R^{C21}$ | $R^{C21}$ | $R^{B12}$ | H |
| $L_{A52}$ | $R^{C21}$ | $R^{C21}$ | $R^{B18}$ | H |
| $L_{A53}$ | $R^{C21}$ | $R^{C21}$ | $R^{A3}$ | H |
| $L_{A54}$ | $R^{C21}$ | $R^{C21}$ | $R^{A34}$ | H |
| $L_{A55}$ | $R^{B1}$ | $R^{C1}$ | H | H |
| $L_{A56}$ | $R^{B1}$ | $R^{C1}$ | $R^{B1}$ | H |
| $L_{A57}$ | $R^{B1}$ | $R^{C1}$ | $R^{B3}$ | H |
| $L_{A58}$ | $R^{B1}$ | $R^{C1}$ | $R^{B4}$ | H |
| $L_{A59}$ | $R^{B1}$ | $R^{C1}$ | $R^{B7}$ | H |
| $L_{A60}$ | $R^{B1}$ | $R^{C1}$ | $R^{B12}$ | H |
| $L_{A61}$ | $R^{B1}$ | $R^{C1}$ | $R^{B18}$ | H |
| $L_{A62}$ | $R^{B1}$ | $R^{C1}$ | $R^{A3}$ | H |
| $L_{A63}$ | $R^{B1}$ | $R^{C1}$ | $R^{A34}$ | H |
| $L_{A64}$ | $R^{B1}$ | $R^{C3}$ | H | H |
| $L_{A65}$ | $R^{B1}$ | $R^{C3}$ | $R^{B1}$ | H |
| $L_{A66}$ | $R^{B1}$ | $R^{C5}$ | $R^{B3}$ | H |
| $L_{A67}$ | $R^{B1}$ | $R^{C3}$ | $R^{B4}$ | H |
| $L_{A68}$ | $R^{B1}$ | $R^{C3}$ | $R^{B7}$ | H |
| $L_{A69}$ | $R^{B1}$ | $R^{C3}$ | $R^{B12}$ | H |
| $L_{A70}$ | $R^{B1}$ | $R^{C3}$ | $R^{B18}$ | H |
| $L_{A71}$ | $R^{B1}$ | $R^{C3}$ | $R^{A3}$ | H |
| $L_{A72}$ | $R^{B1}$ | $R^{C3}$ | $R^{A34}$ | H |
| $L_{A73}$ | $R^{B1}$ | $R^{C5}$ | H | H |
| $L_{A74}$ | $R^{B1}$ | $R^{C5}$ | $R^{B1}$ | H |
| $L_{A75}$ | $R^{B1}$ | $R^{C5}$ | $R^{B3}$ | H |
| $L_{A76}$ | $R^{B1}$ | $R^{C5}$ | $R^{B4}$ | H |
| $L_{A77}$ | $R^{B1}$ | $R^{C5}$ | $R^{B7}$ | H |
| $L_{A78}$ | $R^{B1}$ | $R^{C5}$ | $R^{B12}$ | H |
| $L_{A79}$ | $R^{B1}$ | $R^{C5}$ | $R^{B18}$ | H |
| $L_{A80}$ | $R^{B1}$ | $R^{C5}$ | $R^{A3}$ | H |
| $L_{A81}$ | $R^{B1}$ | $R^{C5}$ | $R^{A34}$ | H |
| $L_{A82}$ | $R^{B1}$ | $R^{C17}$ | H | H |
| $L_{A83}$ | $R^{B1}$ | $R^{C17}$ | $R^{B1}$ | H |
| $L_{A84}$ | $R^{B1}$ | $R^{C17}$ | $R^{B3}$ | H |
| $L_{A85}$ | $R^{B1}$ | $R^{C17}$ | $R^{B4}$ | H |
| $L_{A86}$ | $R^{B1}$ | $R^{C17}$ | $R^{B7}$ | H |
| $L_{A87}$ | $R^{B1}$ | $R^{C17}$ | $R^{B12}$ | H |
| $L_{A88}$ | $R^{B1}$ | $R^{C17}$ | $R^{B18}$ | H |
| $L_{A89}$ | $R^{B1}$ | $R^{C17}$ | $R^{A3}$ | H |
| $L_{A90}$ | $R^{B1}$ | $R^{C17}$ | $R^{A34}$ | H |
| $L_{A91}$ | $R^{B1}$ | $R^{C19}$ | H | H |
| $L_{A92}$ | $R^{B1}$ | $R^{C19}$ | $R^{B1}$ | H |
| $L_{A93}$ | $R^{B1}$ | $R^{C19}$ | $R^{B3}$ | H |
| $L_{A94}$ | $R^{B1}$ | $R^{C19}$ | $R^{B4}$ | H |
| $L_{A95}$ | $R^{B1}$ | $R^{C19}$ | $R^{B7}$ | H |
| $L_{A96}$ | $R^{B1}$ | $R^{C19}$ | $R^{B12}$ | H |
| $L_{A97}$ | $R^{B1}$ | $R^{C19}$ | $R^{B18}$ | H |
| $L_{A98}$ | $R^{B1}$ | $R^{C19}$ | $R^{A3}$ | H |
| $L_{A99}$ | $R^{B1}$ | $R^{C19}$ | $R^{A34}$ | H |
| $L_{A100}$ | $R^{B1}$ | $R^{C21}$ | H | H |
| $L_{A101}$ | $R^{B1}$ | $R^{C21}$ | $R^{B1}$ | H |
| $L_{A102}$ | $R^{B1}$ | $R^{C21}$ | $R^{B3}$ | H |
| $L_{A103}$ | $R^{B1}$ | $R^{C21}$ | $R^{B4}$ | H |
| $L_{A104}$ | $R^{B1}$ | $R^{C21}$ | $R^{B7}$ | H |
| $L_{A105}$ | $R^{B1}$ | $R^{C21}$ | $R^{B12}$ | H |
| $L_{A106}$ | $R^{B1}$ | $R^{C21}$ | $R^{B18}$ | H |
| $L_{A107}$ | $R^{B1}$ | $R^{C21}$ | $R^{A3}$ | H |
| $L_{A108}$ | $R^{B1}$ | $R^{C21}$ | $R^{A34}$ | H |
| $L_{A109}$ | $R^{B2}$ | $R^{C1}$ | H | H |
| $L_{A110}$ | $R^{B2}$ | $R^{C1}$ | $R^{B1}$ | H |
| $L_{A111}$ | $R^{B2}$ | $R^{C1}$ | $R^{B3}$ | H |
| $L_{A112}$ | $R^{B2}$ | $R^{C1}$ | $R^{B4}$ | H |
| $L_{A113}$ | $R^{B2}$ | $R^{C1}$ | $R^{B7}$ | H |
| $L_{A114}$ | $R^{B2}$ | $R^{C1}$ | $R^{B12}$ | H |
| $L_{A115}$ | $R^{B2}$ | $R^{C1}$ | $R^{B18}$ | H |
| $L_{A116}$ | $R^{B2}$ | $R^{C1}$ | $R^{A3}$ | H |
| $L_{A117}$ | $R^{B2}$ | $R^{C1}$ | $R^{A34}$ | H |
| $L_{A118}$ | $R^{B2}$ | $R^{C3}$ | H | H |
| $L_{A119}$ | $R^{B2}$ | $R^{C3}$ | $R^{B1}$ | H |
| $L_{A120}$ | $R^{B2}$ | $R^{C3}$ | $R^{B3}$ | H |
| $L_{A121}$ | $R^{B2}$ | $R^{C3}$ | $R^{B4}$ | H |
| $L_{A122}$ | $R^{B2}$ | $R^{C3}$ | $R^{B7}$ | H |
| $L_{A123}$ | $R^{B2}$ | $R^{C3}$ | $R^{B12}$ | H |
| $L_{A124}$ | $R^{B2}$ | $R^{C3}$ | $R^{B18}$ | H |
| $L_{A125}$ | $R^{B2}$ | $R^{C3}$ | $R^{A3}$ | H |
| $L_{A126}$ | $R^{B2}$ | $R^{C3}$ | $R^{A34}$ | H |
| $L_{A127}$ | $R^{B2}$ | $R^{C5}$ | H | H |
| $L_{A128}$ | $R^{B2}$ | $R^{C5}$ | $R^{B1}$ | H |
| $L_{A129}$ | $R^{B2}$ | $R^{C5}$ | $R^{B3}$ | H |
| $L_{A130}$ | $R^{B2}$ | $R^{C5}$ | $R^{B4}$ | H |
| $L_{A131}$ | $R^{B2}$ | $R^{C5}$ | $R^{B7}$ | H |
| $L_{A132}$ | $R^{B2}$ | $R^{C5}$ | $R^{B12}$ | H |
| $L_{A133}$ | $R^{B2}$ | $R^{C5}$ | $R^{B18}$ | H |
| $L_{A134}$ | $R^{B2}$ | $R^{C5}$ | $R^{A3}$ | H |
| $L_{A135}$ | $R^{B2}$ | $R^{C5}$ | $R^{A34}$ | H |
| $L_{A136}$ | $R^{B2}$ | $R^{C17}$ | H | H |
| $L_{A137}$ | $R^{B2}$ | $R^{C17}$ | $R^{B1}$ | H |
| $L_{A138}$ | $R^{B2}$ | $R^{C17}$ | $R^{B3}$ | H |
| $L_{A139}$ | $R^{B2}$ | $R^{C17}$ | $R^{B4}$ | H |
| $L_{A140}$ | $R^{B2}$ | $R^{C17}$ | $R^{B7}$ | H |
| $L_{A141}$ | $R^{B2}$ | $R^{C17}$ | $R^{B12}$ | H |
| $L_{A142}$ | $R^{B2}$ | $R^{C17}$ | $R^{B18}$ | H |
| $L_{A143}$ | $R^{B2}$ | $R^{C17}$ | $R^{A3}$ | H |
| $L_{A144}$ | $R^{B2}$ | $R^{C17}$ | $R^{A34}$ | H |
| $L_{A145}$ | $R^{B2}$ | $R^{C19}$ | H | H |
| $L_{A146}$ | $R^{B2}$ | $R^{C19}$ | $R^{B1}$ | H |
| $L_{A147}$ | $R^{B2}$ | $R^{C19}$ | $R^{B3}$ | H |
| $L_{A148}$ | $R^{B2}$ | $R^{C19}$ | $R^{B4}$ | H |
| $L_{A149}$ | $R^{B2}$ | $R^{C19}$ | $R^{B7}$ | H |
| $L_{A150}$ | $R^{B2}$ | $R^{C19}$ | $R^{B12}$ | H |
| $L_{A151}$ | $R^{B2}$ | $R^{C19}$ | $R^{B18}$ | H |
| $L_{A152}$ | $R^{B2}$ | $R^{C19}$ | $R^{A3}$ | H |
| $L_{A153}$ | $R^{B2}$ | $R^{C19}$ | $R^{A34}$ | H |
| $L_{A154}$ | $R^{B2}$ | $R^{C21}$ | H | H |
| $L_{A155}$ | $R^{B2}$ | $R^{C21}$ | $R^{B1}$ | H |
| $L_{A156}$ | $R^{B2}$ | $R^{C21}$ | $R^{B3}$ | H |
| $L_{A157}$ | $R^{B2}$ | $R^{C21}$ | $R^{B4}$ | H |
| $L_{A158}$ | $R^{B2}$ | $R^{C21}$ | $R^{B7}$ | H |
| $L_{A159}$ | $R^{B2}$ | $R^{C21}$ | $R^{B12}$ | H |
| $L_{A160}$ | $R^{B2}$ | $R^{C21}$ | $R^{B18}$ | H |

-continued

| Ligand | $R^1$ | $R^2$ | $R^3$ | $R^4$ |
|---|---|---|---|---|
| $L_{A161}$ | $R^{B2}$ | $R^{C21}$ | $R^{A3}$ | H |
| $L_{A162}$ | $R^{B2}$ | $R^{C21}$ | $R^{A34}$ | H |
| $L_{A163}$ | $R^{C1}$ | $R^{C1}$ | H | $R^{B1}$ |
| $L_{A164}$ | $R^{C1}$ | $R^{C1}$ | H | $R^{B3}$ |
| $L_{A165}$ | $R^{C1}$ | $R^{C1}$ | H | $R^{B4}$ |
| $L_{A166}$ | $R^{C1}$ | $R^{C1}$ | H | $R^{B7}$ |
| $L_{A167}$ | $R^{C1}$ | $R^{C1}$ | H | $R^{B12}$ |
| $L_{A168}$ | $R^{C1}$ | $R^{C1}$ | H | $R^{B18}$ |
| $L_{A169}$ | $R^{C1}$ | $R^{C1}$ | H | $R^{A3}$ |
| $L_{A170}$ | $R^{C1}$ | $R^{C1}$ | H | $R^{A34}$ |
| $L_{A171}$ | $R^{C3}$ | $R^{C3}$ | H | $R^{B1}$ |
| $L_{A172}$ | $R^{C3}$ | $R^{C3}$ | H | $R^{B3}$ |
| $L_{A173}$ | $R^{C3}$ | $R^{C3}$ | H | $R^{B4}$ |
| $L_{A174}$ | $R^{C3}$ | $R^{C3}$ | H | $R^{B7}$ |
| $L_{A175}$ | $R^{C3}$ | $R^{C3}$ | H | $R^{B12}$ |
| $L_{A176}$ | $R^{C3}$ | $R^{C3}$ | H | $R^{B18}$ |
| $L_{A177}$ | $R^{C3}$ | $R^{C3}$ | H | $R^{A3}$ |
| $L_{A178}$ | $R^{C3}$ | $R^{C3}$ | H | $R^{A34}$ |
| $L_{A179}$ | $R^{C5}$ | $R^{C5}$ | H | $R^{B1}$ |
| $L_{A180}$ | $R^{C5}$ | $R^{C5}$ | H | $R^{B3}$ |
| $L_{A181}$ | $R^{C5}$ | $R^{C5}$ | H | $R^{B4}$ |
| $L_{A182}$ | $R^{C5}$ | $R^{C5}$ | H | $R^{B7}$ |
| $L_{A183}$ | $R^{C5}$ | $R^{C5}$ | H | $R^{B12}$ |
| $L_{A184}$ | $R^{C5}$ | $R^{C5}$ | H | $R^{B18}$ |
| $L_{A185}$ | $R^{C5}$ | $R^{C5}$ | H | $R^{A3}$ |
| $L_{A186}$ | $R^{C5}$ | $R^{C5}$ | H | $R^{A34}$ |
| $L_{A187}$ | $R^{C17}$ | $R^{C17}$ | H | $R^{B1}$ |
| $L_{A188}$ | $R^{C17}$ | $R^{C17}$ | H | $R^{B3}$ |
| $L_{A189}$ | $R^{C17}$ | $R^{C17}$ | H | $R^{B4}$ |
| $L_{A190}$ | $R^{C17}$ | $R^{C17}$ | H | $R^{B7}$ |
| $L_{A191}$ | $R^{C17}$ | $R^{C17}$ | H | $R^{B12}$ |
| $L_{A192}$ | $R^{C17}$ | $R^{C17}$ | H | $R^{B18}$ |
| $L_{A193}$ | $R^{C17}$ | $R^{C17}$ | H | $R^{A3}$ |
| $L_{A194}$ | $R^{C17}$ | $R^{C17}$ | H | $R^{A34}$ |
| $L_{A195}$ | $R^{C19}$ | $R^{C19}$ | H | $R^{B1}$ |
| $L_{A196}$ | $R^{C19}$ | $R^{C19}$ | H | $R^{B3}$ |
| $L_{A197}$ | $R^{C19}$ | $R^{C19}$ | H | $R^{B4}$ |
| $L_{A198}$ | $R^{C19}$ | $R^{C19}$ | H | $R^{B7}$ |
| $L_{A199}$ | $R^{C19}$ | $R^{C19}$ | H | $R^{B12}$ |
| $L_{A200}$ | $R^{C19}$ | $R^{C19}$ | H | $R^{B18}$ |
| $L_{A201}$ | $R^{C19}$ | $R^{C19}$ | H | $R^{A3}$ |
| $L_{A202}$ | $R^{C19}$ | $R^{C19}$ | H | $R^{A34}$ |
| $L_{A203}$ | $R^{C21}$ | $R^{C21}$ | H | $R^{B1}$ |
| $L_{A204}$ | $R^{C21}$ | $R^{C21}$ | H | $R^{B3}$ |
| $L_{A205}$ | $R^{C21}$ | $R^{C21}$ | H | $R^{B4}$ |
| $L_{A206}$ | $R^{C21}$ | $R^{C21}$ | H | $R^{B7}$ |
| $L_{A207}$ | $R^{C21}$ | $R^{C21}$ | H | $R^{B12}$ |
| $L_{A208}$ | $R^{C21}$ | $R^{C21}$ | H | $R^{B18}$ |
| $L_{A209}$ | $R^{C21}$ | $R^{C21}$ | H | $R^{A3}$ |
| $L_{A210}$ | $R^{C21}$ | $R^{C21}$ | H | $R^{A34}$ |
| $L_{A211}$ | $R^{B1}$ | $R^{C1}$ | H | $R^{B1}$ |
| $L_{A212}$ | $R^{B1}$ | $R^{C1}$ | H | $R^{B3}$ |
| $L_{A213}$ | $R^{B1}$ | $R^{C1}$ | H | $R^{B4}$ |
| $L_{A214}$ | $R^{B1}$ | $R^{C1}$ | H | $R^{B7}$ |
| $L_{A215}$ | $R^{B1}$ | $R^{C1}$ | H | $R^{B12}$ |
| $L_{A216}$ | $R^{B1}$ | $R^{C1}$ | H | $R^{B18}$ |
| $L_{A217}$ | $R^{B1}$ | $R^{C1}$ | H | $R^{A3}$ |
| $L_{A218}$ | $R^{B1}$ | $R^{C1}$ | H | $R^{A34}$ |
| $L_{A219}$ | $R^{B1}$ | $R^{C3}$ | H | $R^{B1}$ |
| $L_{A220}$ | $R^{B1}$ | $R^{C3}$ | H | $R^{B3}$ |
| $L_{A221}$ | $R^{B1}$ | $R^{C3}$ | H | $R^{B4}$ |
| $L_{A222}$ | $R^{B1}$ | $R^{C3}$ | H | $R^{B7}$ |
| $L_{A223}$ | $R^{B1}$ | $R^{C3}$ | H | $R^{B12}$ |
| $L_{A224}$ | $R^{B1}$ | $R^{C3}$ | H | $R^{B18}$ |
| $L_{A225}$ | $R^{B1}$ | $R^{C3}$ | H | $R^{A3}$ |
| $L_{A226}$ | $R^{B1}$ | $R^{C3}$ | H | $R^{A34}$ |
| $L_{A227}$ | $R^{B1}$ | $R^{C5}$ | H | $R^{B1}$ |
| $L_{A228}$ | $R^{B1}$ | $R^{C5}$ | H | $R^{B3}$ |
| $L_{A229}$ | $R^{B1}$ | $R^{C5}$ | H | $R^{B4}$ |
| $L_{A230}$ | $R^{B1}$ | $R^{C5}$ | H | $R^{B7}$ |
| $L_{A231}$ | $R^{B1}$ | $R^{C5}$ | H | $R^{B12}$ |
| $L_{A232}$ | $R^{B1}$ | $R^{C5}$ | H | $R^{B18}$ |
| $L_{A233}$ | $R^{B1}$ | $R^{C5}$ | H | $R^{A3}$ |
| $L_{A234}$ | $R^{B1}$ | $R^{C5}$ | H | $R^{A34}$ |
| $L_{A235}$ | $R^{B1}$ | $R^{C17}$ | H | $R^{B1}$ |
| $L_{A236}$ | $R^{B1}$ | $R^{C17}$ | H | $R^{B3}$ |
| $L_{C237}$ | $R^{B1}$ | $R^{C17}$ | H | $R^{B4}$ |

-continued

| Ligand | $R^1$ | $R^2$ | $R^3$ | $R^4$ |
|---|---|---|---|---|
| $L_{A238}$ | $R^{B1}$ | $R^{C17}$ | H | $R^{B7}$ |
| $L_{A239}$ | $R^{B1}$ | $R^{C17}$ | H | $R^{B12}$ |
| $L_{A240}$ | $R^{B1}$ | $R^{C17}$ | H | $R^{B18}$ |
| $L_{A241}$ | $R^{B1}$ | $R^{C17}$ | H | $R^{A3}$ |
| $L_{A242}$ | $R^{B1}$ | $R^{C17}$ | H | $R^{A34}$ |
| $L_{A243}$ | $R^{B1}$ | $R^{C19}$ | H | $R^{B1}$ |
| $L_{A244}$ | $R^{B1}$ | $R^{C19}$ | H | $R^{B3}$ |
| $L_{A245}$ | $R^{B1}$ | $R^{C19}$ | H | $R^{B4}$ |
| $L_{A246}$ | $R^{B1}$ | $R^{C19}$ | H | $R^{B7}$ |
| $L_{A247}$ | $R^{B1}$ | $R^{C19}$ | H | $R^{B12}$ |
| $L_{A248}$ | $R^{B1}$ | $R^{C19}$ | H | $R^{B18}$ |
| $L_{A249}$ | $R^{B1}$ | $R^{C19}$ | H | $R^{A3}$ |
| $L_{A250}$ | $R^{B1}$ | $R^{C19}$ | H | $R^{A34}$ |
| $L_{A251}$ | $R^{B1}$ | $R^{C21}$ | H | $R^{B1}$ |
| $L_{A252}$ | $R^{B1}$ | $R^{C21}$ | H | $R^{B3}$ |
| $L_{A253}$ | $R^{B1}$ | $R^{C21}$ | H | $R^{B4}$ |
| $L_{A254}$ | $R^{B1}$ | $R^{C21}$ | H | $R^{B7}$ |
| $L_{A255}$ | $R^{B1}$ | $R^{C21}$ | H | $R^{B12}$ |
| $L_{A256}$ | $R^{B1}$ | $R^{C21}$ | H | $R^{B18}$ |
| $L_{A257}$ | $R^{B1}$ | $R^{C21}$ | H | $R^{A3}$ |
| $L_{A258}$ | $R^{B1}$ | $R^{C21}$ | H | $R^{A34}$ |
| $L_{A259}$ | $R^{B2}$ | $R^{C1}$ | H | $R^{B1}$ |
| $L_{A260}$ | $R^{B2}$ | $R^{C1}$ | H | $R^{B3}$ |
| $L_{A261}$ | $R^{B2}$ | $R^{C1}$ | H | $R^{B4}$ |
| $L_{A262}$ | $R^{B2}$ | $R^{C1}$ | H | $R^{B7}$ |
| $L_{A263}$ | $R^{B2}$ | $R^{C1}$ | H | $R^{B12}$ |
| $L_{A264}$ | $R^{B2}$ | $R^{C1}$ | H | $R^{B18}$ |
| $L_{A265}$ | $R^{B2}$ | $R^{C1}$ | H | $R^{A3}$ |
| $L_{A266}$ | $R^{B2}$ | $R^{C1}$ | H | $R^{A34}$ |
| $L_{A267}$ | $R^{B2}$ | $R^{C3}$ | H | $R^{B1}$ |
| $L_{A268}$ | $R^{B2}$ | $R^{C3}$ | H | $R^{B3}$ |
| $L_{A269}$ | $R^{B2}$ | $R^{C3}$ | H | $R^{B4}$ |
| $L_{A270}$ | $R^{B2}$ | $R^{C3}$ | H | $R^{B7}$ |
| $L_{A271}$ | $R^{B2}$ | $R^{C3}$ | H | $R^{B12}$ |
| $L_{A272}$ | $R^{B2}$ | $R^{C3}$ | H | $R^{B18}$ |
| $L_{A273}$ | $R^{B2}$ | $R^{C3}$ | H | $R^{A3}$ |
| $L_{A274}$ | $R^{B2}$ | $R^{C3}$ | H | $R^{A34}$ |
| $L_{A275}$ | $R^{B2}$ | $R^{C5}$ | H | $R^{B1}$ |
| $L_{A276}$ | $R^{B2}$ | $R^{C5}$ | H | $R^{B3}$ |
| $L_{A277}$ | $R^{B2}$ | $R^{C5}$ | H | $R^{B4}$ |
| $L_{A278}$ | $R^{B2}$ | $R^{C5}$ | H | $R^{B7}$ |
| $L_{A279}$ | $R^{B2}$ | $R^{C5}$ | H | $R^{B12}$ |
| $L_{A280}$ | $R^{B2}$ | $R^{C5}$ | H | $R^{B18}$ |
| $L_{A281}$ | $R^{B2}$ | $R^{C5}$ | H | $R^{A3}$ |
| $L_{A282}$ | $R^{B2}$ | $R^{C5}$ | H | $R^{A34}$ |
| $L_{A283}$ | $R^{B2}$ | $R^{C17}$ | H | $R^{B1}$ |
| $L_{A284}$ | $R^{B2}$ | $R^{C17}$ | H | $R^{B3}$ |
| $L_{A285}$ | $R^{B2}$ | $R^{C17}$ | H | $R^{B4}$ |
| $L_{A286}$ | $R^{B2}$ | $R^{C17}$ | H | $R^{B7}$ |
| $L_{A287}$ | $R^{B2}$ | $R^{C17}$ | H | $R^{B12}$ |
| $L_{A288}$ | $R^{B2}$ | $R^{C17}$ | H | $R^{B18}$ |
| $L_{A289}$ | $R^{B2}$ | $R^{C17}$ | H | $R^{A3}$ |
| $L_{A290}$ | $R^{B2}$ | $R^{C17}$ | H | $R^{A34}$ |
| $L_{A291}$ | $R^{B2}$ | $R^{C19}$ | H | $R^{B1}$ |
| $L_{A292}$ | $R^{B2}$ | $R^{C19}$ | H | $R^{B3}$ |
| $L_{A293}$ | $R^{B2}$ | $R^{C19}$ | H | $R^{B4}$ |
| $L_{A294}$ | $R^{B2}$ | $R^{C19}$ | H | $R^{B7}$ |
| $L_{A295}$ | $R^{B2}$ | $R^{C19}$ | H | $R^{B12}$ |
| $L_{A296}$ | $R^{B2}$ | $R^{C19}$ | H | $R^{B18}$ |
| $L_{A297}$ | $R^{B2}$ | $R^{C19}$ | H | $R^{A3}$ |
| $L_{A298}$ | $R^{B2}$ | $R^{C19}$ | H | $R^{A34}$ |
| $L_{A299}$ | $R^{B2}$ | $R^{C21}$ | H | $R^{B1}$ |
| $L_{A300}$ | $R^{B2}$ | $R^{C21}$ | H | $R^{B3}$ |
| $L_{A301}$ | $R^{B2}$ | $R^{C21}$ | H | $R^{B4}$ |
| $L_{A302}$ | $R^{B2}$ | $R^{C21}$ | H | $R^{B7}$ |
| $L_{A303}$ | $R^{B2}$ | $R^{C21}$ | H | $R^{B12}$ |
| $L_{A304}$ | $R^{B2}$ | $R^{C21}$ | H | $R^{B18}$ |
| $L_{A305}$ | $R^{B2}$ | $R^{C21}$ | H | $R^{A3}$ |
| $L_{A306}$ | $R^{B2}$ | $R^{C21}$ | H | $R^{A34}$ |

$L_{A307}$ through $L_{A612}$ that are based on a structure of Formula II,

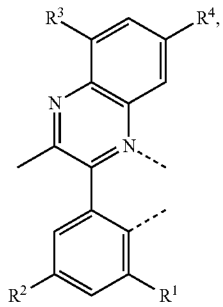

in which $R^1$, $R^2$, $R^3$, and $R^4$ are defined as:

| Ligand | $R^1$ | $R^2$ | $R^3$ | $R^4$ |
|---|---|---|---|---|
| $L_{A307}$ | $R^{C1}$ | $R^{C1}$ | H | H |
| $L_{A308}$ | $R^{C1}$ | $R^{C1}$ | $R^{B1}$ | H |
| $L_{A309}$ | $R^{C1}$ | $R^{C1}$ | $R^{B3}$ | H |
| $L_{A310}$ | $R^{C1}$ | $R^{C1}$ | $R^{B4}$ | H |
| $L_{A311}$ | $R^{C1}$ | $R^{C1}$ | $R^{B7}$ | H |
| $L_{A312}$ | $R^{C1}$ | $R^{C1}$ | $R^{B12}$ | H |
| $L_{A313}$ | $R^{C1}$ | $R^{C1}$ | $R^{B18}$ | H |
| $L_{A314}$ | $R^{C1}$ | $R^{C1}$ | $R^{A3}$ | H |
| $L_{A315}$ | $R^{C1}$ | $R^{C1}$ | $R^{A34}$ | H |
| $L_{A316}$ | $R^{C3}$ | $R^{C3}$ | H | H |
| $L_{A317}$ | $R^{C3}$ | $R^{C3}$ | $R^{B1}$ | H |
| $L_{A318}$ | $R^{C3}$ | $R^{C3}$ | $R^{B3}$ | H |
| $L_{A319}$ | $R^{C3}$ | $R^{C3}$ | $R^{B4}$ | H |
| $L_{A320}$ | $R^{C3}$ | $R^{C3}$ | $R^{B7}$ | H |
| $L_{A321}$ | $R^{C3}$ | $R^{C3}$ | $R^{B12}$ | H |
| $L_{A322}$ | $R^{C3}$ | $R^{C3}$ | $R^{B18}$ | H |
| $L_{A323}$ | $R^{C3}$ | $R^{C3}$ | $R^{A3}$ | H |
| $L_{A324}$ | $R^{C3}$ | $R^{C3}$ | $R^{A34}$ | H |
| $L_{A325}$ | $R^{C5}$ | $R^{C5}$ | H | H |
| $L_{A326}$ | $R^{C5}$ | $R^{C5}$ | $R^{B1}$ | H |
| $L_{A327}$ | $R^{C5}$ | $R^{C5}$ | $R^{B3}$ | H |
| $L_{A328}$ | $R^{C5}$ | $R^{C5}$ | $R^{B4}$ | H |
| $L_{A329}$ | $R^{C5}$ | $R^{C5}$ | $R^{B7}$ | H |
| $L_{A330}$ | $R^{C5}$ | $R^{C5}$ | $R^{B12}$ | H |
| $L_{A331}$ | $R^{C5}$ | $R^{C5}$ | $R^{B18}$ | H |
| $L_{A332}$ | $R^{C5}$ | $R^{C5}$ | $R^{A3}$ | H |
| $L_{A333}$ | $R^{C5}$ | $R^{C5}$ | $R^{A34}$ | H |
| $L_{A334}$ | $R^{C17}$ | $R^{C17}$ | H | H |
| $L_{A335}$ | $R^{C17}$ | $R^{C17}$ | $R^{B1}$ | H |
| $L_{A336}$ | $R^{C17}$ | $R^{C17}$ | $R^{B3}$ | H |
| $L_{A337}$ | $R^{C17}$ | $R^{C17}$ | $R^{B4}$ | H |
| $L_{A338}$ | $R^{C17}$ | $R^{C17}$ | $R^{B7}$ | H |
| $L_{A339}$ | $R^{C17}$ | $R^{C17}$ | $R^{B12}$ | H |
| $L_{A340}$ | $R^{C17}$ | $R^{C17}$ | $R^{B18}$ | H |
| $L_{A341}$ | $R^{C17}$ | $R^{C17}$ | $R^{A3}$ | H |
| $L_{A342}$ | $R^{C17}$ | $R^{C17}$ | $R^{A34}$ | H |
| $L_{A343}$ | $R^{C19}$ | $R^{C19}$ | H | H |
| $L_{A344}$ | $R^{C19}$ | $R^{C19}$ | $R^{B1}$ | H |
| $L_{A345}$ | $R^{C19}$ | $R^{C19}$ | $R^{B3}$ | H |
| $L_{A346}$ | $R^{C19}$ | $R^{C19}$ | $R^{B4}$ | H |
| $L_{A347}$ | $R^{C19}$ | $R^{C19}$ | $R^{B7}$ | H |
| $L_{A348}$ | $R^{C19}$ | $R^{C19}$ | $R^{B12}$ | H |
| $L_{A349}$ | $R^{C19}$ | $R^{C19}$ | $R^{B18}$ | H |
| $L_{A350}$ | $R^{C19}$ | $R^{C19}$ | $R^{A3}$ | H |
| $L_{A351}$ | $R^{C19}$ | $R^{C19}$ | $R^{A34}$ | H |
| $L_{A352}$ | $R^{C21}$ | $R^{C21}$ | H | H |
| $L_{A353}$ | $R^{C21}$ | $R^{C21}$ | $R^{B1}$ | H |
| $L_{A354}$ | $R^{C21}$ | $R^{C21}$ | $R^{B3}$ | H |
| $L_{A355}$ | $R^{C21}$ | $R^{C21}$ | $R^{B4}$ | H |
| $L_{A356}$ | $R^{C21}$ | $R^{C21}$ | $R^{B7}$ | H |
| $L_{A357}$ | $R^{C21}$ | $R^{C21}$ | $R^{B12}$ | H |
| $L_{A358}$ | $R^{C21}$ | $R^{C21}$ | $R^{B18}$ | H |
| $L_{A359}$ | $R^{C21}$ | $R^{C21}$ | $R^{A3}$ | H |
| $L_{A360}$ | $R^{C21}$ | $R^{C21}$ | $R^{A34}$ | H |
| $L_{A361}$ | $R^{B1}$ | $R^{C1}$ | H | H |
| $L_{A362}$ | $R^{B1}$ | $R^{C1}$ | $R^{B1}$ | H |
| $L_{A363}$ | $R^{B1}$ | $R^{C1}$ | $R^{B3}$ | H |
| $L_{A364}$ | $R^{B1}$ | $R^{C1}$ | $R^{B4}$ | H |
| $L_{A365}$ | $R^{B1}$ | $R^{C1}$ | $R^{B7}$ | H |

-continued

| Ligand | $R^1$ | $R^2$ | $R^3$ | $R^4$ |
|---|---|---|---|---|
| $L_{A366}$ | $R^{B1}$ | $R^{C1}$ | $R^{B12}$ | H |
| $L_{A367}$ | $R^{B1}$ | $R^{C1}$ | $R^{B18}$ | H |
| $L_{A368}$ | $R^{B1}$ | $R^{C1}$ | $R^{A3}$ | H |
| $L_{A369}$ | $R^{B1}$ | $R^{C1}$ | $R^{A34}$ | H |
| $L_{A370}$ | $R^{B1}$ | $R^{C3}$ | H | H |
| $L_{A371}$ | $R^{B1}$ | $R^{C3}$ | $R^{B1}$ | H |
| $L_{A372}$ | $R^{B1}$ | $R^{C3}$ | $R^{B3}$ | H |
| $L_{A373}$ | $R^{B1}$ | $R^{C3}$ | $R^{B4}$ | H |
| $L_{A374}$ | $R^{B1}$ | $R^{C3}$ | $R^{B7}$ | H |
| $L_{A375}$ | $R^{B1}$ | $R^{C3}$ | $R^{B12}$ | H |
| $L_{A376}$ | $R^{B1}$ | $R^{C3}$ | $R^{B18}$ | H |
| $L_{A377}$ | $R^{B1}$ | $R^{C3}$ | $R^{A3}$ | H |
| $L_{A378}$ | $R^{B1}$ | $R^{C3}$ | $R^{A34}$ | H |
| $L_{A379}$ | $R^{B1}$ | $R^{C5}$ | H | H |
| $L_{A380}$ | $R^{B1}$ | $R^{C5}$ | $R^{B1}$ | H |
| $L_{A381}$ | $R^{B1}$ | $R^{C5}$ | $R^{B3}$ | H |
| $L_{A382}$ | $R^{B1}$ | $R^{C5}$ | $R^{B4}$ | H |
| $L_{A383}$ | $R^{B1}$ | $R^{C5}$ | $R^{B7}$ | H |
| $L_{A384}$ | $R^{B1}$ | $R^{C5}$ | $R^{B12}$ | H |
| $L_{A385}$ | $R^{B1}$ | $R^{C5}$ | $R^{B18}$ | H |
| $L_{A386}$ | $R^{B1}$ | $R^{C5}$ | $R^{A3}$ | H |
| $L_{A387}$ | $R^{B1}$ | $R^{C5}$ | $R^{A34}$ | H |
| $L_{A388}$ | $R^{B1}$ | $R^{C17}$ | H | H |
| $L_{A389}$ | $R^{B1}$ | $R^{C17}$ | $R^{B1}$ | H |
| $L_{A390}$ | $R^{B1}$ | $R^{C17}$ | $R^{B3}$ | H |
| $L_{A391}$ | $R^{B1}$ | $R^{C17}$ | $R^{B4}$ | H |
| $L_{A392}$ | $R^{B1}$ | $R^{C17}$ | $R^{B7}$ | H |
| $L_{A393}$ | $R^{B1}$ | $R^{C17}$ | $R^{B12}$ | H |
| $L_{A394}$ | $R^{B1}$ | $R^{C17}$ | $R^{B18}$ | H |
| $L_{A395}$ | $R^{B1}$ | $R^{C17}$ | $R^{A3}$ | H |
| $L_{A396}$ | $R^{B1}$ | $R^{C17}$ | $R^{A34}$ | H |
| $L_{A397}$ | $R^{B1}$ | $R^{C19}$ | H | H |
| $L_{A398}$ | $R^{B1}$ | $R^{C19}$ | $R^{B1}$ | H |
| $L_{A399}$ | $R^{B1}$ | $R^{C19}$ | $R^{B3}$ | H |
| $L_{A400}$ | $R^{B1}$ | $R^{C19}$ | $R^{B4}$ | H |
| $L_{A401}$ | $R^{B1}$ | $R^{C19}$ | $R^{B7}$ | H |
| $L_{A402}$ | $R^{B1}$ | $R^{C19}$ | $R^{B12}$ | H |
| $L_{A403}$ | $R^{B1}$ | $R^{C19}$ | $R^{B18}$ | H |
| $L_{A404}$ | $R^{B1}$ | $R^{C19}$ | $R^{A3}$ | H |
| $L_{A405}$ | $R^{B1}$ | $R^{C19}$ | $R^{A34}$ | H |
| $L_{A406}$ | $R^{B1}$ | $R^{C21}$ | H | H |
| $L_{A407}$ | $R^{B1}$ | $R^{C21}$ | $R^{B1}$ | H |
| $L_{A408}$ | $R^{B1}$ | $R^{C21}$ | $R^{B3}$ | H |
| $L_{A409}$ | $R^{B1}$ | $R^{C21}$ | $R^{B4}$ | H |
| $L_{A410}$ | $R^{B1}$ | $R^{C21}$ | $R^{B7}$ | H |
| $L_{A411}$ | $R^{B1}$ | $R^{C21}$ | $R^{B12}$ | H |
| $L_{A412}$ | $R^{B1}$ | $R^{C21}$ | $R^{B18}$ | H |
| $L_{A413}$ | $R^{B1}$ | $R^{C21}$ | $R^{A3}$ | H |
| $L_{A414}$ | $R^{B1}$ | $R^{C21}$ | $R^{A34}$ | H |
| $L_{A415}$ | $R^{B2}$ | $R^{C1}$ | H | H |
| $L_{A416}$ | $R^{B2}$ | $R^{C1}$ | $R^{B1}$ | H |
| $L_{A417}$ | $R^{B2}$ | $R^{C1}$ | $R^{B3}$ | H |
| $L_{A418}$ | $R^{B2}$ | $R^{C1}$ | $R^{B4}$ | H |
| $L_{A419}$ | $R^{B2}$ | $R^{C1}$ | $R^{B7}$ | H |
| $L_{A420}$ | $R^{B2}$ | $R^{C1}$ | $R^{B12}$ | H |
| $L_{A421}$ | $R^{B2}$ | $R^{C1}$ | $R^{B18}$ | H |
| $L_{A422}$ | $R^{B2}$ | $R^{C1}$ | $R^{A3}$ | H |
| $L_{A423}$ | $R^{B2}$ | $R^{C1}$ | $R^{A34}$ | H |
| $L_{A424}$ | $R^{B2}$ | $R^{C3}$ | H | H |
| $L_{A425}$ | $R^{B2}$ | $R^{C3}$ | $R^{B1}$ | H |
| $L_{A426}$ | $R^{B2}$ | $R^{C3}$ | $R^{B3}$ | H |
| $L_{A427}$ | $R^{B2}$ | $R^{C3}$ | $R^{B4}$ | H |
| $L_{A428}$ | $R^{B2}$ | $R^{C3}$ | $R^{B7}$ | H |
| $L_{A429}$ | $R^{B2}$ | $R^{C3}$ | $R^{B12}$ | H |
| $L_{A430}$ | $R^{B2}$ | $R^{C3}$ | $R^{B18}$ | H |
| $L_{A431}$ | $R^{B2}$ | $R^{C3}$ | $R^{A3}$ | H |
| $L_{A432}$ | $R^{B2}$ | $R^{C3}$ | $R^{A34}$ | H |
| $L_{A433}$ | $R^{B2}$ | $R^{C5}$ | H | H |
| $L_{A434}$ | $R^{B2}$ | $R^{C5}$ | $R^{B1}$ | H |
| $L_{A435}$ | $R^{B2}$ | $R^{C5}$ | $R^{B3}$ | H |
| $L_{A436}$ | $R^{B2}$ | $R^{C5}$ | $R^{B4}$ | H |
| $L_{A437}$ | $R^{B2}$ | $R^{C5}$ | $R^{B7}$ | H |
| $L_{A438}$ | $R^{B2}$ | $R^{C5}$ | $R^{B12}$ | H |
| $L_{A439}$ | $R^{B2}$ | $R^{C5}$ | $R^{B18}$ | H |
| $L_{A440}$ | $R^{B2}$ | $R^{C5}$ | $R^{A3}$ | H |
| $L_{A441}$ | $R^{B2}$ | $R^{C5}$ | $R^{A34}$ | H |
| $L_{A442}$ | $R^{B2}$ | $R^{C17}$ | H | H |

-continued

| Ligand | $R^1$ | $R^2$ | $R^3$ | $R^4$ |
|---|---|---|---|---|
| $L_{A443}$ | $R^{B2}$ | $R^{C17}$ | $R^{B1}$ | H |
| $L_{A444}$ | $R^{B2}$ | $R^{C17}$ | $R^{B3}$ | H |
| $L_{A445}$ | $R^{B2}$ | $R^{C17}$ | $R^{B4}$ | H |
| $L_{A446}$ | $R^{B2}$ | $R^{C17}$ | $R^{B7}$ | H |
| $L_{A447}$ | $R^{B2}$ | $R^{C17}$ | $R^{B12}$ | H |
| $L_{A448}$ | $R^{B2}$ | $R^{C17}$ | $R^{B18}$ | H |
| $L_{A449}$ | $R^{B2}$ | $R^{C17}$ | $R^{A3}$ | H |
| $L_{A450}$ | $R^{B2}$ | $R^{C17}$ | $R^{A34}$ | H |
| $L_{A451}$ | $R^{B2}$ | $R^{C19}$ | H | H |
| $L_{A452}$ | $R^{B2}$ | $R^{C19}$ | $R^{B1}$ | H |
| $L_{A453}$ | $R^{B2}$ | $R^{C19}$ | $R^{B3}$ | H |
| $L_{A454}$ | $R^{B2}$ | $R^{C19}$ | $R^{B4}$ | H |
| $L_{A455}$ | $R^{B2}$ | $R^{C19}$ | $R^{B7}$ | H |
| $L_{A456}$ | $R^{B2}$ | $R^{C19}$ | $R^{B12}$ | H |
| $L_{A457}$ | $R^{B2}$ | $R^{C19}$ | $R^{B18}$ | H |
| $L_{A458}$ | $R^{B2}$ | $R^{C19}$ | $R^{A3}$ | H |
| $L_{A459}$ | $R^{B2}$ | $R^{C19}$ | $R^{A34}$ | H |
| $L_{A460}$ | $R^{B2}$ | $R^{C21}$ | H | H |
| $L_{A461}$ | $R^{B2}$ | $R^{C21}$ | $R^{B1}$ | H |
| $L_{A462}$ | $R^{B2}$ | $R^{C21}$ | $R^{B3}$ | H |
| $L_{A463}$ | $R^{B2}$ | $R^{C21}$ | $R^{B4}$ | H |
| $L_{A464}$ | $R^{B2}$ | $R^{C21}$ | $R^{B7}$ | H |
| $L_{A465}$ | $R^{B2}$ | $R^{C21}$ | $R^{B12}$ | H |
| $L_{A466}$ | $R^{B2}$ | $R^{C21}$ | $R^{B18}$ | H |
| $L_{A467}$ | $R^{B2}$ | $R^{C21}$ | $R^{A3}$ | H |
| $L_{A468}$ | $R^{B2}$ | $R^{C21}$ | $R^{A34}$ | H |
| $L_{A469}$ | $R^{C1}$ | $R^{C1}$ | H | $R^{B1}$ |
| $L_{A470}$ | $R^{C1}$ | $R^{C1}$ | H | $R^{B3}$ |
| $L_{A471}$ | $R^{C1}$ | $R^{C1}$ | H | $R^{B4}$ |
| $L_{A472}$ | $R^{C1}$ | $R^{C1}$ | H | $R^{B}$ |
| $L_{A473}$ | $R^{C1}$ | $R^{C1}$ | H | $R^{B12}$ |
| $L_{A474}$ | $R^{C1}$ | $R^{C1}$ | H | $R^{B18}$ |
| $L_{A475}$ | $R^{C1}$ | $R^{C1}$ | H | $R^{A3}$ |
| $L_{A476}$ | $R^{C1}$ | $R^{C1}$ | H | $R^{A34}$ |
| $L_{A477}$ | $R^{C3}$ | $R^{C3}$ | H | $R^{B1}$ |
| $L_{A478}$ | $R^{C3}$ | $R^{C3}$ | H | $R^{B3}$ |
| $L_{A479}$ | $R^{C3}$ | $R^{C3}$ | H | $R^{B4}$ |
| $L_{A480}$ | $R^{C3}$ | $R^{C3}$ | H | $R^{B7}$ |
| $L_{A481}$ | $R^{C3}$ | $R^{C3}$ | H | $R^{B12}$ |
| $L_{A482}$ | $R^{C3}$ | $R^{C3}$ | H | $R^{B18}$ |
| $L_{A483}$ | $R^{C3}$ | $R^{C3}$ | H | $R^{A3}$ |
| $L_{A484}$ | $R^{C3}$ | $R^{C3}$ | H | $R^{A34}$ |
| $L_{A485}$ | $R^{C5}$ | $R^{C5}$ | H | $R^{B1}$ |
| $L_{A486}$ | $R^{C5}$ | $R^{C5}$ | H | $R^{B3}$ |
| $L_{A487}$ | $R^{C5}$ | $R^{C5}$ | H | $R^{B4}$ |
| $L_{A488}$ | $R^{C5}$ | $R^{C5}$ | H | $R^{B7}$ |
| $L_{A489}$ | $R^{C5}$ | $R^{C5}$ | H | $R^{B12}$ |
| $L_{A490}$ | $R^{C5}$ | $R^{C5}$ | H | $R^{B18}$ |
| $L_{A491}$ | $R^{C5}$ | $R^{C5}$ | H | $R^{A3}$ |
| $L_{A492}$ | $R^{C5}$ | $R^{C5}$ | H | $R^{A34}$ |
| $L_{A493}$ | $R^{C17}$ | $R^{C17}$ | H | $R^{B1}$ |
| $L_{A494}$ | $R^{C17}$ | $R^{C17}$ | H | $R^{B3}$ |
| $L_{A495}$ | $R^{C17}$ | $R^{C17}$ | H | $R^{B4}$ |
| $L_{A496}$ | $R^{C17}$ | $R^{C17}$ | H | $R^{B7}$ |
| $L_{A497}$ | $R^{C17}$ | $R^{C17}$ | H | $R^{B12}$ |
| $L_{A498}$ | $R^{C17}$ | $R^{C17}$ | H | $R^{B18}$ |
| $L_{A499}$ | $R^{C17}$ | $R^{C17}$ | H | $R^{A3}$ |
| $L_{A500}$ | $R^{C17}$ | $R^{C17}$ | H | $R^{A34}$ |
| $L_{A501}$ | $R^{C19}$ | $R^{C19}$ | H | $R^{B1}$ |
| $L_{A502}$ | $R^{C19}$ | $R^{C19}$ | H | $R^{B3}$ |
| $L_{A503}$ | $R^{C19}$ | $R^{C19}$ | H | $R^{B4}$ |
| $L_{A504}$ | $R^{C19}$ | $R^{C19}$ | H | $R^{B7}$ |
| $L_{A505}$ | $R^{C19}$ | $R^{C19}$ | H | $R^{B12}$ |
| $L_{A506}$ | $R^{C19}$ | $R^{C19}$ | H | $R^{B18}$ |
| $L_{A507}$ | $R^{C19}$ | $R^{C19}$ | H | $R^{A3}$ |
| $L_{A508}$ | $R^{C19}$ | $R^{C19}$ | H | $R^{A34}$ |
| $L_{A509}$ | $R^{C21}$ | $R^{C21}$ | H | $R^{B1}$ |
| $L_{A510}$ | $R^{C21}$ | $R^{C21}$ | H | $R^{B3}$ |
| $L_{A511}$ | $R^{C21}$ | $R^{C21}$ | H | $R^{B4}$ |
| $L_{A512}$ | $R^{C21}$ | $R^{C21}$ | H | $R^{B7}$ |
| $L_{A513}$ | $R^{C21}$ | $R^{C21}$ | H | $R^{B12}$ |
| $L_{A514}$ | $R^{C21}$ | $R^{C21}$ | H | $R^{B18}$ |
| $L_{A515}$ | $R^{C21}$ | $R^{C21}$ | H | $R^{A3}$ |
| $L_{A516}$ | $R^{C21}$ | $R^{C21}$ | H | $R^{A34}$ |
| $L_{A517}$ | $R^{B1}$ | $R^{C1}$ | H | $R^{B1}$ |
| $L_{A518}$ | $R^{B1}$ | $R^{C1}$ | H | $R^{B3}$ |
| $L_{A519}$ | $R^{B1}$ | $R^{C1}$ | H | $R^{B4}$ |

-continued

| Ligand | $R^1$ | $R^2$ | $R^3$ | $R^4$ |
|---|---|---|---|---|
| $L_{A520}$ | $R^{B1}$ | $R^{C1}$ | H | $R^{B7}$ |
| $L_{A521}$ | $R^{B1}$ | $R^{C1}$ | H | $R^{B12}$ |
| $L_{A522}$ | $R^{B1}$ | $R^{C1}$ | H | $R^{B18}$ |
| $L_{A523}$ | $R^{B1}$ | $R^{C1}$ | H | $R^{A3}$ |
| $L_{A524}$ | $R^{B1}$ | $R^{C1}$ | H | $R^{A34}$ |
| $L_{A525}$ | $R^{B1}$ | $R^{C3}$ | H | $R^{B1}$ |
| $L_{A526}$ | $R^{B1}$ | $R^{C3}$ | H | $R^{B3}$ |
| $L_{A527}$ | $R^{B1}$ | $R^{C3}$ | H | $R^{B4}$ |
| $L_{A528}$ | $R^{B1}$ | $R^{C3}$ | H | $R^{B7}$ |
| $L_{A529}$ | $R^{B1}$ | $R^{C3}$ | H | $R^{B12}$ |
| $L_{A530}$ | $R^{B1}$ | $R^{C3}$ | H | $R^{B18}$ |
| $L_{A531}$ | $R^{B1}$ | $R^{C3}$ | H | $R^{A3}$ |
| $L_{A532}$ | $R^{B1}$ | $R^{C3}$ | H | $R^{A34}$ |
| $L_{A533}$ | $R^{B1}$ | $R^{C5}$ | H | $R^{B1}$ |
| $L_{A534}$ | $R^{B1}$ | $R^{C5}$ | H | $R^{B3}$ |
| $L_{A535}$ | $R^{B1}$ | $R^{C5}$ | H | $R^{B4}$ |
| $L_{A536}$ | $R^{B1}$ | $R^{C5}$ | H | $R^{B7}$ |
| $L_{A537}$ | $R^{B1}$ | $R^{C5}$ | H | $R^{B12}$ |
| $L_{A538}$ | $R^{B1}$ | $R^{C5}$ | H | $R^{B18}$ |
| $L_{A539}$ | $R^{B1}$ | $R^{C5}$ | H | $R^{A3}$ |
| $L_{A540}$ | $R^{B1}$ | $R^{C5}$ | H | $R^{A34}$ |
| $L_{A541}$ | $R^{B1}$ | $R^{C17}$ | H | $R^{B1}$ |
| $L_{A542}$ | $R^{B1}$ | $R^{C17}$ | H | $R^{B3}$ |
| $L_{A543}$ | $R^{B1}$ | $R^{C17}$ | H | $R^{B4}$ |
| $L_{A544}$ | $R^{B1}$ | $R^{C17}$ | H | $R^{B7}$ |
| $L_{A545}$ | $R^{B1}$ | $R^{C17}$ | H | $R^{B12}$ |
| $L_{A546}$ | $R^{B1}$ | $R^{C17}$ | H | $R^{B18}$ |
| $L_{A547}$ | $R^{B1}$ | $R^{C17}$ | H | $R^{A3}$ |
| $L_{A548}$ | $R^{B1}$ | $R^{C17}$ | H | $R^{A34}$ |
| $L_{A549}$ | $R^{B1}$ | $R^{C19}$ | H | $R^{B1}$ |
| $L_{A550}$ | $R^{B1}$ | $R^{C19}$ | H | $R^{B3}$ |
| $L_{A551}$ | $R^{B1}$ | $R^{C19}$ | H | $R^{B4}$ |
| $L_{A552}$ | $R^{B1}$ | $R^{C19}$ | H | $R^{B7}$ |
| $L_{A553}$ | $R^{B1}$ | $R^{C19}$ | H | $R^{B12}$ |
| $L_{A554}$ | $R^{B1}$ | $R^{C19}$ | H | $R^{B18}$ |
| $L_{A555}$ | $R^{B1}$ | $R^{C19}$ | H | $R^{A3}$ |
| $L_{A556}$ | $R^{B1}$ | $R^{C19}$ | H | $R^{A34}$ |
| $L_{A557}$ | $R^{B1}$ | $R^{C21}$ | H | $R^{B1}$ |
| $L_{A558}$ | $R^{B1}$ | $R^{C21}$ | H | $R^{B3}$ |
| $L_{A559}$ | $R^{B1}$ | $R^{C21}$ | H | $R^{B4}$ |
| $L_{A560}$ | $R^{B1}$ | $R^{C21}$ | H | $R^{B7}$ |
| $L_{A561}$ | $R^{B1}$ | $R^{C21}$ | H | $R^{B12}$ |
| $L_{A562}$ | $R^{B1}$ | $R^{C21}$ | H | $R^{B18}$ |
| $L_{A563}$ | $R^{B1}$ | $R^{C21}$ | H | $R^{A3}$ |
| $L_{A564}$ | $R^{B1}$ | $R^{C21}$ | H | $R^{A34}$ |
| $L_{A565}$ | $R^{B2}$ | $R^{C1}$ | H | $R^{B1}$ |
| $L_{A566}$ | $R^{B2}$ | $R^{C1}$ | H | $R^{B3}$ |
| $L_{A567}$ | $R^{B2}$ | $R^{C1}$ | H | $R^{B4}$ |
| $L_{A568}$ | $R^{B2}$ | $R^{C1}$ | H | $R^{B7}$ |
| $L_{A569}$ | $R^{B2}$ | $R^{C1}$ | H | $R^{B12}$ |
| $L_{A570}$ | $R^{B2}$ | $R^{C1}$ | H | $R^{B18}$ |
| $L_{A571}$ | $R^{B2}$ | $R^{C1}$ | H | $R^{A3}$ |
| $L_{A572}$ | $R^{B2}$ | $R^{C1}$ | H | $R^{A34}$ |
| $L_{A573}$ | $R^{B2}$ | $R^{C3}$ | H | $R^{B1}$ |
| $L_{A574}$ | $R^{B2}$ | $R^{C3}$ | H | $R^{B3}$ |
| $L_{A575}$ | $R^{B2}$ | $R^{C3}$ | H | $R^{B4}$ |
| $L_{A576}$ | $R^{B2}$ | $R^{C3}$ | H | $R^{B7}$ |
| $L_{A577}$ | $R^{B2}$ | $R^{C3}$ | H | $R^{B12}$ |
| $L_{A578}$ | $R^{B2}$ | $R^{C3}$ | H | $R^{B18}$ |
| $L_{A579}$ | $R^{B2}$ | $R^{C3}$ | H | $R^{A3}$ |
| $L_{A580}$ | $R^{B2}$ | $R^{C3}$ | H | $R^{A34}$ |
| $L_{A581}$ | $R^{B2}$ | $R^{C5}$ | H | $R^{B1}$ |
| $L_{A582}$ | $R^{B2}$ | $R^{C5}$ | H | $R^{B3}$ |
| $L_{A583}$ | $R^{B2}$ | $R^{C5}$ | H | $R^{B4}$ |
| $L_{A584}$ | $R^{B2}$ | $R^{C5}$ | H | $R^{B7}$ |
| $L_{A585}$ | $R^{B2}$ | $R^{C5}$ | H | $R^{B12}$ |
| $L_{A586}$ | $R^{B2}$ | $R^{C5}$ | H | $R^{B18}$ |
| $L_{A587}$ | $R^{B2}$ | $R^{C5}$ | H | $R^{A3}$ |
| $L_{A588}$ | $R^{B2}$ | $R^{C5}$ | H | $R^{A34}$ |
| $L_{A589}$ | $R^{B2}$ | $R^{C17}$ | H | $R^{B1}$ |
| $L_{A590}$ | $R^{B2}$ | $R^{C17}$ | H | $R^{B3}$ |
| $L_{A591}$ | $R^{B2}$ | $R^{C17}$ | H | $R^{B4}$ |
| $L_{A592}$ | $R^{B2}$ | $R^{C17}$ | H | $R^{B7}$ |
| $L_{A593}$ | $R^{B2}$ | $R^{C17}$ | H | $R^{B12}$ |
| $L_{A594}$ | $R^{B2}$ | $R^{C17}$ | H | $R^{B18}$ |
| $L_{A595}$ | $R^{B2}$ | $R^{C17}$ | H | $R^{A3}$ |
| $L_{A596}$ | $R^{B2}$ | $R^{C17}$ | H | $R^{A34}$ |

-continued

| Ligand | $R^1$ | $R^2$ | $R^3$ | $R^4$ |
|---|---|---|---|---|
| $L_{A4597}$ | $R^{B2}$ | $R^{C19}$ | H | $R^{B1}$ |
| $L_{A4598}$ | $R^{B2}$ | $R^{C19}$ | H | $R^{B3}$ |
| $L_{A4599}$ | $R^{B2}$ | $R^{C19}$ | H | $R^{B4}$ |
| $L_{A4600}$ | $R^{B2}$ | $R^{C19}$ | H | $R^{B7}$ |
| $L_{A4601}$ | $R^{B2}$ | $R^{C19}$ | H | $R^{B12}$ |
| $L_{A4602}$ | $R^{B2}$ | $R^{C19}$ | H | $R^{B18}$ |
| $L_{A4603}$ | $R^{B2}$ | $R^{C19}$ | H | $R^{A3}$ |
| $L_{A4604}$ | $R^{B2}$ | $R^{C19}$ | H | $R^{A34}$ |
| $L_{A4605}$ | $R^{B2}$ | $R^{C21}$ | H | $R^{B1}$ |
| $L_{A4606}$ | $R^{B2}$ | $R^{C21}$ | H | $R^{B3}$ |
| $L_{A4607}$ | $R^{B2}$ | $R^{C21}$ | H | $R^{B4}$ |
| $L_{A4608}$ | $R^{B2}$ | $R^{C21}$ | H | $R^{B7}$ |
| $L_{A4609}$ | $R^{B2}$ | $R^{C21}$ | H | $R^{B12}$ |
| $L_{A4610}$ | $R^{B2}$ | $R^{C21}$ | H | $R^{B18}$ |
| $L_{A4611}$ | $R^{B2}$ | $R^{C21}$ | H | $R^{A3}$ |
| $L_{A4612}$ | $R^{B2}$ | $R^{C21}$ | H | $R^{A34}$ |

$L_{A4613}$ through $L_{A4918}$ that are based on a structure of Formula III,

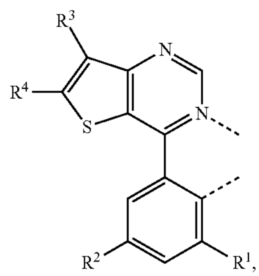

in which $R^1$, $R^2$, $R^3$, and $R^4$ are defined as:

| Ligand | $R^1$ | $R^2$ | $R^3$ | $R^4$ |
|---|---|---|---|---|
| $L_{A4613}$ | $R^{C1}$ | $R^{C1}$ | H | H |
| $L_{A4614}$ | $R^{C1}$ | $R^{C1}$ | $R^{B1}$ | H |
| $L_{A4615}$ | $R^{C1}$ | $R^{C1}$ | $R^{B3}$ | H |
| $L_{A4616}$ | $R^{C1}$ | $R^{C1}$ | $R^{B4}$ | H |
| $L_{A4617}$ | $R^{C1}$ | $R^{C1}$ | $R^{B7}$ | H |
| $L_{A4618}$ | $R^{C1}$ | $R^{C1}$ | $R^{B12}$ | H |
| $L_{A4619}$ | $R^{C1}$ | $R^{C1}$ | $R^{B18}$ | H |
| $L_{A4620}$ | $R^{C1}$ | $R^{C1}$ | $R^{A3}$ | H |
| $L_{A4621}$ | $R^{C1}$ | $R^{C1}$ | $R^{A34}$ | H |
| $L_{A4622}$ | $R^{C3}$ | $R^{C3}$ | H | H |
| $L_{A4623}$ | $R^{C3}$ | $R^{C3}$ | $R^{B1}$ | H |
| $L_{A4624}$ | $R^{C3}$ | $R^{C3}$ | $R^{B3}$ | H |
| $L_{A4625}$ | $R^{C3}$ | $R^{C3}$ | $R^{B4}$ | H |
| $L_{A4626}$ | $R^{C3}$ | $R^{C3}$ | $R^{B7}$ | H |
| $L_{A4627}$ | $R^{C3}$ | $R^{C3}$ | $R^{B12}$ | H |
| $L_{A4628}$ | $R^{C3}$ | $R^{C3}$ | $R^{B18}$ | H |
| $L_{A4629}$ | $R^{C3}$ | $R^{C3}$ | $R^{A3}$ | H |
| $L_{A4630}$ | $R^{C3}$ | $R^{C3}$ | $R^{A34}$ | H |
| $L_{A4631}$ | $R^{C5}$ | $R^{C5}$ | H | H |
| $L_{A4632}$ | $R^{C5}$ | $R^{C5}$ | $R^{B1}$ | H |
| $L_{A4633}$ | $R^{C5}$ | $R^{C5}$ | $R^{B3}$ | H |
| $L_{A4634}$ | $R^{C5}$ | $R^{C5}$ | $R^{B4}$ | H |
| $L_{A4635}$ | $R^{C5}$ | $R^{C5}$ | $R^{B7}$ | H |
| $L_{A4636}$ | $R^{C5}$ | $R^{C5}$ | $R^{B12}$ | H |
| $L_{A4637}$ | $R^{C5}$ | $R^{C5}$ | $R^{B18}$ | H |
| $L_{A4638}$ | $R^{C5}$ | $R^{C5}$ | $R^{A3}$ | H |
| $L_{A4639}$ | $R^{C5}$ | $R^{C5}$ | $R^{A34}$ | H |
| $L_{A4640}$ | $R^{C17}$ | $R^{C17}$ | H | H |
| $L_{A4641}$ | $R^{C17}$ | $R^{C17}$ | $R^{B1}$ | H |
| $L_{A4642}$ | $R^{C17}$ | $R^{C17}$ | $R^{B3}$ | H |
| $L_{A4643}$ | $R^{C17}$ | $R^{C17}$ | $R^{B4}$ | H |
| $L_{A4644}$ | $R^{C17}$ | $R^{C17}$ | $R^{B7}$ | H |
| $L_{A4645}$ | $R^{C17}$ | $R^{C17}$ | $R^{B12}$ | H |
| $L_{A4646}$ | $R^{C17}$ | $R^{C17}$ | $R^{B18}$ | H |
| $L_{A4647}$ | $R^{C17}$ | $R^{C17}$ | $R^{A3}$ | H |
| $L_{A4648}$ | $R^{C17}$ | $R^{C17}$ | $R^{A34}$ | H |
| $L_{A4649}$ | $R^{C19}$ | $R^{C19}$ | H | H |
| $L_{A4650}$ | $R^{C19}$ | $R^{C19}$ | $R^{B1}$ | H |
| $L_{A4651}$ | $R^{C19}$ | $R^{C19}$ | $R^{B3}$ | H |
| $L_{A4652}$ | $R^{C19}$ | $R^{C19}$ | $R^{B4}$ | H |
| $L_{A4653}$ | $R^{C19}$ | $R^{C19}$ | $R^{B7}$ | H |
| $L_{A4654}$ | $R^{C19}$ | $R^{C19}$ | $R^{B12}$ | H |
| $L_{A4655}$ | $R^{C19}$ | $R^{C19}$ | $R^{B18}$ | H |
| $L_{A4656}$ | $R^{C19}$ | $R^{C19}$ | $R^{A3}$ | H |
| $L_{A4657}$ | $R^{C19}$ | $R^{C19}$ | $R^{A34}$ | H |
| $L_{A4658}$ | $R^{C21}$ | $R^{C21}$ | H | H |
| $L_{A4659}$ | $R^{C21}$ | $R^{C21}$ | $R^{B1}$ | H |
| $L_{A4660}$ | $R^{C21}$ | $R^{C21}$ | $R^{B3}$ | H |
| $L_{A4661}$ | $R^{C21}$ | $R^{C21}$ | $R^{B4}$ | H |
| $L_{A4662}$ | $R^{C21}$ | $R^{C21}$ | $R^{B7}$ | H |
| $L_{A4663}$ | $R^{C21}$ | $R^{C21}$ | $R^{B12}$ | H |
| $L_{A4664}$ | $R^{C21}$ | $R^{C21}$ | $R^{B18}$ | H |
| $L_{A4665}$ | $R^{C21}$ | $R^{C21}$ | $R^{A3}$ | H |
| $L_{A4666}$ | $R^{C21}$ | $R^{C21}$ | $R^{A34}$ | H |
| $L_{A4667}$ | $R^{B1}$ | $R^{C1}$ | H | H |
| $L_{A4668}$ | $R^{B1}$ | $R^{C1}$ | $R^{B1}$ | H |
| $L_{A4669}$ | $R^{B1}$ | $R^{C1}$ | $R^{B3}$ | H |
| $L_{A4670}$ | $R^{B1}$ | $R^{C1}$ | $R^{B4}$ | H |
| $L_{A4671}$ | $R^{B1}$ | $R^{C1}$ | $R^{B7}$ | H |
| $L_{A4672}$ | $R^{B1}$ | $R^{C1}$ | $R^{B12}$ | H |
| $L_{A4673}$ | $R^{B1}$ | $R^{C1}$ | $R^{B18}$ | H |
| $L_{A4674}$ | $R^{B1}$ | $R^{C1}$ | $R^{A3}$ | H |
| $L_{A4675}$ | $R^{B1}$ | $R^{C1}$ | $R^{A34}$ | H |
| $L_{A4676}$ | $R^{B1}$ | $R^{C3}$ | H | H |
| $L_{A4677}$ | $R^{B1}$ | $R^{C3}$ | $R^{B1}$ | H |
| $L_{A4678}$ | $R^{B1}$ | $R^{C3}$ | $R^{B3}$ | H |
| $L_{A4679}$ | $R^{B1}$ | $R^{C3}$ | $R^{B4}$ | H |
| $L_{A4680}$ | $R^{B1}$ | $R^{C3}$ | $R^{B7}$ | H |
| $L_{A4681}$ | $R^{B1}$ | $R^{C3}$ | $R^{B12}$ | H |
| $L_{A4682}$ | $R^{B1}$ | $R^{C3}$ | $R^{B18}$ | H |
| $L_{A4683}$ | $R^{B1}$ | $R^{C3}$ | $R^{A3}$ | H |
| $L_{A4684}$ | $R^{B1}$ | $R^{C3}$ | $R^{A34}$ | H |
| $L_{A4685}$ | $R^{B1}$ | $R^{C5}$ | H | H |
| $L_{A4686}$ | $R^{B1}$ | $R^{C5}$ | $R^{B1}$ | H |
| $L_{A4687}$ | $R^{B1}$ | $R^{C5}$ | $R^{B3}$ | H |
| $L_{A4688}$ | $R^{B1}$ | $R^{C5}$ | $R^{B4}$ | H |
| $L_{A4689}$ | $R^{B1}$ | $R^{C5}$ | $R^{B7}$ | H |
| $L_{A4690}$ | $R^{B1}$ | $R^{C5}$ | $R^{B12}$ | H |
| $L_{A4691}$ | $R^{B1}$ | $R^{C5}$ | $R^{B18}$ | H |
| $L_{A4692}$ | $R^{B1}$ | $R^{C5}$ | $R^{A3}$ | H |
| $L_{A4693}$ | $R^{B1}$ | $R^{C5}$ | $R^{A34}$ | H |
| $L_{A4694}$ | $R^{B1}$ | $R^{C17}$ | H | H |
| $L_{A4695}$ | $R^{B1}$ | $R^{C17}$ | $R^{B1}$ | H |
| $L_{A4696}$ | $R^{B1}$ | $R^{C17}$ | $R^{B3}$ | H |
| $L_{A4697}$ | $R^{B1}$ | $R^{C17}$ | $R^{B4}$ | H |
| $L_{A4698}$ | $R^{B1}$ | $R^{C17}$ | $R^{B7}$ | H |
| $L_{A4699}$ | $R^{B1}$ | $R^{C17}$ | $R^{B12}$ | H |
| $L_{A4700}$ | $R^{B1}$ | $R^{C17}$ | $R^{B18}$ | H |
| $L_{A4701}$ | $R^{B1}$ | $R^{C17}$ | $R^{A3}$ | H |
| $L_{A4702}$ | $R^{B1}$ | $R^{C17}$ | $R^{A34}$ | H |
| $L_{A4703}$ | $R^{B1}$ | $R^{C19}$ | H | H |
| $L_{A4704}$ | $R^{B1}$ | $R^{C19}$ | $R^{B1}$ | H |
| $L_{A4705}$ | $R^{B1}$ | $R^{C19}$ | $R^{B3}$ | H |
| $L_{A4706}$ | $R^{B1}$ | $R^{C19}$ | $R^{B4}$ | H |
| $L_{A4707}$ | $R^{B1}$ | $R^{C19}$ | $R^{B7}$ | H |
| $L_{A4708}$ | $R^{B1}$ | $R^{C19}$ | $R^{B12}$ | H |
| $L_{A4709}$ | $R^{B1}$ | $R^{C19}$ | $R^{B18}$ | H |
| $L_{A4710}$ | $R^{B1}$ | $R^{C19}$ | $R^{A3}$ | H |
| $L_{A4711}$ | $R^{B1}$ | $R^{C19}$ | $R^{A34}$ | H |
| $L_{A4712}$ | $R^{B1}$ | $R^{C21}$ | H | H |
| $L_{A4713}$ | $R^{B1}$ | $R^{C21}$ | $R^{B1}$ | H |
| $L_{A4714}$ | $R^{B1}$ | $R^{C21}$ | $R^{B3}$ | H |
| $L_{A4715}$ | $R^{B1}$ | $R^{C21}$ | $R^{B4}$ | H |
| $L_{A4716}$ | $R^{B1}$ | $R^{C21}$ | $R^{B7}$ | H |
| $L_{A4717}$ | $R^{B1}$ | $R^{C21}$ | $R^{B12}$ | H |
| $L_{A4718}$ | $R^{B1}$ | $R^{C21}$ | $R^{B18}$ | H |
| $L_{A4719}$ | $R^{B1}$ | $R^{C21}$ | $R^{A3}$ | H |
| $L_{A4720}$ | $R^{B1}$ | $R^{C21}$ | $R^{A34}$ | H |
| $L_{A4721}$ | $R^{B2}$ | $R^{C1}$ | H | H |
| $L_{A4722}$ | $R^{B2}$ | $R^{C1}$ | $R^{B1}$ | H |
| $L_{A4723}$ | $R^{B2}$ | $R^{C1}$ | $R^{B3}$ | H |
| $L_{A4724}$ | $R^{B2}$ | $R^{C1}$ | $R^{B4}$ | H |

-continued

| Ligand | $R^1$ | $R^2$ | $R^3$ | $R^4$ |
|---|---|---|---|---|
| $L_{A4725}$ | $R^{B2}$ | $R^{C1}$ | $R^{B7}$ | H |
| $L_{A4726}$ | $R^{B2}$ | $R^{C1}$ | $R^{B12}$ | H |
| $L_{A4727}$ | $R^{B2}$ | $R^{C1}$ | $R^{B18}$ | H |
| $L_{A4728}$ | $R^{B2}$ | $R^{C1}$ | $R^{A3}$ | H |
| $L_{A4729}$ | $R^{B2}$ | $R^{C1}$ | $R^{A34}$ | H |
| $L_{A4730}$ | $R^{B2}$ | $R^{C3}$ | H | H |
| $L_{A4731}$ | $R^{B2}$ | $R^{C3}$ | $R^{B1}$ | H |
| $L_{A4732}$ | $R^{B2}$ | $R^{C3}$ | $R^{B3}$ | H |
| $L_{A4733}$ | $R^{B2}$ | $R^{C3}$ | $R^{B4}$ | H |
| $L_{A4734}$ | $R^{B2}$ | $R^{C3}$ | $R^{B7}$ | H |
| $L_{A4735}$ | $R^{B2}$ | $R^{C3}$ | $R^{B12}$ | H |
| $L_{A4736}$ | $R^{B2}$ | $R^{C3}$ | $R^{B18}$ | H |
| $L_{A4737}$ | $R^{B2}$ | $R^{C3}$ | $R^{A3}$ | H |
| $L_{A4738}$ | $R^{B2}$ | $R^{C3}$ | $R^{A34}$ | H |
| $L_{A4739}$ | $R^{B2}$ | $R^{C3}$ | H | H |
| $L_{A4740}$ | $R^{B2}$ | $R^{C5}$ | $R^{B1}$ | H |
| $L_{A4741}$ | $R^{B2}$ | $R^{C5}$ | $R^{B3}$ | H |
| $L_{A4742}$ | $R^{B2}$ | $R^{C5}$ | $R^{B4}$ | H |
| $L_{A4743}$ | $R^{B2}$ | $R^{C5}$ | $R^{B7}$ | H |
| $L_{A4744}$ | $R^{B2}$ | $R^{C5}$ | $R^{B12}$ | H |
| $L_{A4745}$ | $R^{B2}$ | $R^{C5}$ | $R^{B18}$ | H |
| $L_{A4746}$ | $R^{B2}$ | $R^{C5}$ | $R^{A3}$ | H |
| $L_{A4747}$ | $R^{B2}$ | $R^{C5}$ | $R^{A34}$ | H |
| $L_{A4748}$ | $R^{B2}$ | $R^{C17}$ | H | H |
| $L_{A4749}$ | $R^{B2}$ | $R^{C17}$ | $R^{B1}$ | H |
| $L_{A4750}$ | $R^{B2}$ | $R^{C17}$ | $R^{B3}$ | H |
| $L_{A4751}$ | $R^{B2}$ | $R^{C17}$ | $R^{B4}$ | H |
| $L_{A4752}$ | $R^{B2}$ | $R^{C17}$ | $R^{B7}$ | H |
| $L_{A4753}$ | $R^{B2}$ | $R^{C17}$ | $R^{B12}$ | H |
| $L_{A4754}$ | $R^{B2}$ | $R^{C17}$ | $R^{B18}$ | H |
| $L_{A4755}$ | $R^{B2}$ | $R^{C17}$ | $R^{A3}$ | H |
| $L_{A4756}$ | $R^{B2}$ | $R^{C17}$ | $R^{A34}$ | H |
| $L_{A4757}$ | $R^{B2}$ | $R^{C19}$ | H | H |
| $L_{A4758}$ | $R^{B2}$ | $R^{C19}$ | $R^{B1}$ | H |
| $L_{A4759}$ | $R^{B2}$ | $R^{C19}$ | $R^{B3}$ | H |
| $L_{A4760}$ | $R^{B2}$ | $R^{C19}$ | $R^{B4}$ | H |
| $L_{A4761}$ | $R^{B2}$ | $R^{C19}$ | $R^{B7}$ | H |
| $L_{A4762}$ | $R^{B2}$ | $R^{C19}$ | $R^{B12}$ | H |
| $L_{A4763}$ | $R^{B2}$ | $R^{C19}$ | $R^{B18}$ | H |
| $L_{A4764}$ | $R^{B2}$ | $R^{C19}$ | $R^{A3}$ | H |
| $L_{A4765}$ | $R^{B2}$ | $R^{C19}$ | $R^{A34}$ | H |
| $L_{A4766}$ | $R^{B2}$ | $R^{C21}$ | H | H |
| $L_{A4767}$ | $R^{B2}$ | $R^{C21}$ | $R^{B1}$ | H |
| $L_{A4768}$ | $R^{B2}$ | $R^{C21}$ | $R^{B3}$ | H |
| $L_{A4769}$ | $R^{B2}$ | $R^{C21}$ | $R^{B4}$ | H |
| $L_{A4770}$ | $R^{B2}$ | $R^{C21}$ | $R^{B7}$ | H |
| $L_{A4771}$ | $R^{B2}$ | $R^{C21}$ | $R^{B12}$ | H |
| $L_{A4772}$ | $R^{B2}$ | $R^{C21}$ | $R^{B18}$ | H |
| $L_{A4773}$ | $R^{B2}$ | $R^{C21}$ | $R^{A3}$ | H |
| $L_{A4774}$ | $R^{B2}$ | $R^{C21}$ | $R^{A34}$ | H |
| $L_{A4775}$ | $R^{C1}$ | $R^{C1}$ | H | $R^{B1}$ |
| $L_{A4776}$ | $R^{C1}$ | $R^{C}$ | H | $R^{B3}$ |
| $L_{A4777}$ | $R^{C1}$ | $R^{C1}$ | H | $R^{B4}$ |
| $L_{A4778}$ | $R^{C1}$ | $R^{C1}$ | H | $R^{B7}$ |
| $L_{A4779}$ | $R^{C1}$ | $R^{C1}$ | H | $R^{B12}$ |
| $L_{A4780}$ | $R^{C1}$ | $R^{C1}$ | H | $R^{B18}$ |
| $L_{A4781}$ | $R^{C1}$ | $R^{C1}$ | H | $R^{A3}$ |
| $L_{A4782}$ | $R^{C1}$ | $R^{C1}$ | H | $R^{A34}$ |
| $L_{A4783}$ | $R^{C3}$ | $R^{C3}$ | H | $R^{B1}$ |
| $L_{A4784}$ | $R^{C3}$ | $R^{C3}$ | H | $R^{B3}$ |
| $L_{A4785}$ | $R^{C3}$ | $R^{C3}$ | H | $R^{B4}$ |
| $L_{A4786}$ | $R^{C3}$ | $R^{C3}$ | H | $R^{B7}$ |
| $L_{A4787}$ | $R^{C3}$ | $R^{C3}$ | H | $R^{B12}$ |
| $L_{A4788}$ | $R^{C3}$ | $R^{C3}$ | H | $R^{B18}$ |
| $L_{A4789}$ | $R^{C3}$ | $R^{C3}$ | H | $R^{A3}$ |
| $L_{A4790}$ | $R^{C3}$ | $R^{C3}$ | H | $R^{A34}$ |
| $L_{A4791}$ | $R^{C5}$ | $R^{C5}$ | H | $R^{B1}$ |
| $L_{A4792}$ | $R^{C5}$ | $R^{C5}$ | H | $R^{B3}$ |
| $L_{A4793}$ | $R^{C5}$ | $R^{C5}$ | H | $R^{B4}$ |
| $L_{A4794}$ | $R^{C5}$ | $R^{C5}$ | H | $R^{B7}$ |
| $L_{A4795}$ | $R^{C5}$ | $R^{C5}$ | H | $R^{B12}$ |
| $L_{A4796}$ | $R^{C5}$ | $R^{C5}$ | H | $R^{B18}$ |
| $L_{A4797}$ | $R^{C5}$ | $R^{C5}$ | H | $R^{A3}$ |
| $L_{A4798}$ | $R^{C5}$ | $R^{C5}$ | H | $R^{A34}$ |
| $L_{A4799}$ | $R^{C17}$ | $R^{C17}$ | H | $R^{B1}$ |
| $L_{A4800}$ | $R^{C17}$ | $R^{C17}$ | H | $R^{B3}$ |
| $L_{A4801}$ | $R^{C17}$ | $R^{C17}$ | H | $R^{B4}$ |

-continued

| Ligand | $R^1$ | $R^2$ | $R^3$ | $R^4$ |
|---|---|---|---|---|
| $L_{A4802}$ | $R^{C17}$ | $R^{C17}$ | H | $R^{B7}$ |
| $L_{A4803}$ | $R^{C17}$ | $R^{C17}$ | H | $R^{B12}$ |
| $L_{A4804}$ | $R^{C17}$ | $R^{C17}$ | H | $R^{B18}$ |
| $L_{A4805}$ | $R^{C17}$ | $R^{C17}$ | H | $R^{A3}$ |
| $L_{A4806}$ | $R^{C17}$ | $R^{C17}$ | H | $R^{A34}$ |
| $L_{A4807}$ | $R^{C19}$ | $R^{C19}$ | H | $R^{B1}$ |
| $L_{A4808}$ | $R^{C19}$ | $R^{C19}$ | H | $R^{B3}$ |
| $L_{A4809}$ | $R^{C19}$ | $R^{C19}$ | H | $R^{B4}$ |
| $L_{A4810}$ | $R^{C19}$ | $R^{C19}$ | H | $R^{B7}$ |
| $L_{A4811}$ | $R^{C19}$ | $R^{C19}$ | H | $R^{B12}$ |
| $L_{A4812}$ | $R^{C19}$ | $R^{C19}$ | H | $R^{B18}$ |
| $L_{A4813}$ | $R^{C19}$ | $R^{C19}$ | H | $R^{A3}$ |
| $L_{A4814}$ | $R^{C19}$ | $R^{C19}$ | H | $R^{A34}$ |
| $L_{A4815}$ | $R^{C21}$ | $R^{C21}$ | H | $R^{B1}$ |
| $L_{A4816}$ | $R^{C21}$ | $R^{C21}$ | H | $R^{B3}$ |
| $L_{A4817}$ | $R^{C21}$ | $R^{C21}$ | H | $R^{B4}$ |
| $L_{A4818}$ | $R^{C21}$ | $R^{C21}$ | H | $R^{B7}$ |
| $L_{A4819}$ | $R^{C21}$ | $R^{C21}$ | H | $R^{B12}$ |
| $L_{A4820}$ | $R^{C21}$ | $R^{C21}$ | H | $R^{B18}$ |
| $L_{A4821}$ | $R^{C21}$ | $R^{C21}$ | H | $R^{A3}$ |
| $L_{A4822}$ | $R^{C21}$ | $R^{C21}$ | H | $R^{A34}$ |
| $L_{A4823}$ | $R^{B1}$ | $R^{C1}$ | H | $R^{B1}$ |
| $L_{A4824}$ | $R^{B1}$ | $R^{C1}$ | H | $R^{B3}$ |
| $L_{A4825}$ | $R^{B1}$ | $R^{C1}$ | H | $R^{B4}$ |
| $L_{A4826}$ | $R^{B1}$ | $R^{C1}$ | H | $R^{B7}$ |
| $L_{A4827}$ | $R^{B1}$ | $R^{C1}$ | H | $R^{B12}$ |
| $L_{A4828}$ | $R^{B1}$ | $R^{C1}$ | H | $R^{B18}$ |
| $L_{A4829}$ | $R^{B1}$ | $R^{C1}$ | H | $R^{A3}$ |
| $L_{A4830}$ | $R^{B1}$ | $R^{C1}$ | H | $R^{A34}$ |
| $L_{A4831}$ | $R^{B1}$ | $R^{C3}$ | H | $R^{B1}$ |
| $L_{A4832}$ | $R^{B1}$ | $R^{C3}$ | H | $R^{B3}$ |
| $L_{A4833}$ | $R^{B1}$ | $R^{C3}$ | H | $R^{B4}$ |
| $L_{A4834}$ | $R^{B1}$ | $R^{C3}$ | H | $R^{B7}$ |
| $L_{A4835}$ | $R^{B1}$ | $R^{C3}$ | H | $R^{B12}$ |
| $L_{A4836}$ | $R^{B1}$ | $R^{C3}$ | H | $R^{B18}$ |
| $L_{A4837}$ | $R^{B1}$ | $R^{C3}$ | H | $R^{A3}$ |
| $L_{A4838}$ | $R^{B1}$ | $R^{C3}$ | H | $R^{A34}$ |
| $L_{A4839}$ | $R^{B1}$ | $R^{C5}$ | H | $R^{B1}$ |
| $L_{A4840}$ | $R^{B1}$ | $R^{C5}$ | H | $R^{B3}$ |
| $L_{A4841}$ | $R^{B1}$ | $R^{C5}$ | H | $R^{B4}$ |
| $L_{A4842}$ | $R^{B1}$ | $R^{C5}$ | H | $R^{B7}$ |
| $L_{A4843}$ | $R^{B1}$ | $R^{C5}$ | H | $R^{B12}$ |
| $L_{A4844}$ | $R^{B1}$ | $R^{C5}$ | H | $R^{B18}$ |
| $L_{A4845}$ | $R^{B1}$ | $R^{C5}$ | H | $R^{A3}$ |
| $L_{A4846}$ | $R^{B1}$ | $R^{C5}$ | H | $R^{A34}$ |
| $L_{A4847}$ | $R^{B1}$ | $R^{C17}$ | H | $R^{B1}$ |
| $L_{A4848}$ | $R^{B1}$ | $R^{C17}$ | H | $R^{B3}$ |
| $L_{A4849}$ | $R^{B1}$ | $R^{C17}$ | H | $R^{B4}$ |
| $L_{A4850}$ | $R^{B1}$ | $R^{C17}$ | H | $R^{B7}$ |
| $L_{A4851}$ | $R^{B1}$ | $R^{C17}$ | H | $R^{B12}$ |
| $L_{A4852}$ | $R^{B1}$ | $R^{C17}$ | H | $R^{B18}$ |
| $L_{A4853}$ | $R^{B1}$ | $R^{C17}$ | H | $R^{A3}$ |
| $L_{A4854}$ | $R^{B1}$ | $R^{C17}$ | H | $R^{A34}$ |
| $L_{A4855}$ | $R^{B1}$ | $R^{C19}$ | H | $R^{B1}$ |
| $L_{A4856}$ | $R^{B1}$ | $R^{C19}$ | H | $R^{B3}$ |
| $L_{A4857}$ | $R^{B1}$ | $R^{C19}$ | H | $R^{B4}$ |
| $L_{A4858}$ | $R^{B1}$ | $R^{C19}$ | H | $R^{B7}$ |
| $L_{A4859}$ | $R^{B1}$ | $R^{C19}$ | H | $R^{B12}$ |
| $L_{A4860}$ | $R^{B1}$ | $R^{C19}$ | H | $R^{B18}$ |
| $L_{A4861}$ | $R^{B1}$ | $R^{C19}$ | H | $R^{A3}$ |
| $L_{A4862}$ | $R^{B1}$ | $R^{C19}$ | H | $R^{A34}$ |
| $L_{A4863}$ | $R^{B1}$ | $R^{C21}$ | H | $R^{B1}$ |
| $L_{A4864}$ | $R^{B1}$ | $R^{C21}$ | H | $R^{B3}$ |
| $L_{A4865}$ | $R^{B1}$ | $R^{C21}$ | H | $R^{B4}$ |
| $L_{A4866}$ | $R^{B1}$ | $R^{C21}$ | H | $R^{B7}$ |
| $L_{A4867}$ | $R^{B1}$ | $R^{C21}$ | H | $R^{B12}$ |
| $L_{A4868}$ | $R^{B1}$ | $R^{C21}$ | H | $R^{B18}$ |
| $L_{A4869}$ | $R^{B1}$ | $R^{C21}$ | H | $R^{A3}$ |
| $L_{A4870}$ | $R^{B1}$ | $R^{C21}$ | H | $R^{A34}$ |
| $L_{A4871}$ | $R^{B2}$ | $R^{C1}$ | H | $R^{B1}$ |
| $L_{A4872}$ | $R^{B2}$ | $R^{C1}$ | H | $R^{B3}$ |
| $L_{A4873}$ | $R^{B2}$ | $R^{C1}$ | H | $R^{B4}$ |
| $L_{A4874}$ | $R^{B2}$ | $R^{C1}$ | H | $R^{B7}$ |
| $L_{A4875}$ | $R^{B2}$ | $R^{C1}$ | H | $R^{B12}$ |
| $L_{A4876}$ | $R^{B2}$ | $R^{C1}$ | H | $R^{B18}$ |
| $L_{A4877}$ | $R^{B2}$ | $R^{C1}$ | H | $R^{A3}$ |
| $L_{A4878}$ | $R^{B2}$ | $R^{C1}$ | H | $R^{A34}$ |

-continued

| Ligand | $R^1$ | $R^2$ | $R^3$ | $R^4$ |
|---|---|---|---|---|
| $L_{A4879}$ | $R^{B2}$ | $R^{C3}$ | H | $R^{B1}$ |
| $L_{A4880}$ | $R^{B2}$ | $R^{C3}$ | H | $R^{B3}$ |
| $L_{A4881}$ | $R^{B2}$ | $R^{C5}$ | H | $R^{B4}$ |
| $L_{A4882}$ | $R^{B2}$ | $R^{C3}$ | H | $R^{B7}$ |
| $L_{A4883}$ | $R^{B2}$ | $R^{C3}$ | H | $R^{B12}$ |
| $L_{A4884}$ | $R^{B2}$ | $R^{C3}$ | H | $R^{B18}$ |
| $L_{A4885}$ | $R^{B2}$ | $R^{C3}$ | H | $R^{A3}$ |
| $L_{A4886}$ | $R^{B2}$ | $R^{C3}$ | H | $R^{A34}$ |
| $L_{A4887}$ | $R^{B2}$ | $R^{C5}$ | H | $R^{B1}$ |
| $L_{A4888}$ | $R^{B2}$ | $R^{C5}$ | H | $R^{B3}$ |
| $L_{A4889}$ | $R^{B2}$ | $R^{C5}$ | H | $R^{B4}$ |
| $L_{A4890}$ | $R^{B2}$ | $R^{C5}$ | H | $R^{B7}$ |
| $L_{A4891}$ | $R^{B2}$ | $R^{C5}$ | H | $R^{B12}$ |
| $L_{A4892}$ | $R^{B2}$ | $R^{C5}$ | H | $R^{B18}$ |
| $L_{A4893}$ | $R^{B2}$ | $R^{C5}$ | H | $R^{A3}$ |
| $L_{A4894}$ | $R^{B2}$ | $R^{C5}$ | H | $R^{A34}$ |
| $L_{A4895}$ | $R^{B2}$ | $R^{C17}$ | H | $R^{B1}$ |
| $L_{A4896}$ | $R^{B2}$ | $R^{C17}$ | H | $R^{B3}$ |
| $L_{A4897}$ | $R^{B2}$ | $R^{C17}$ | H | $R^{B4}$ |
| $L_{A4898}$ | $R^{B2}$ | $R^{C17}$ | H | $R^{B7}$ |
| $L_{A4899}$ | $R^{B2}$ | $R^{C17}$ | H | $R^{B12}$ |
| $L_{A4900}$ | $R^{B2}$ | $R^{C17}$ | H | $R^{B18}$ |
| $L_{A4901}$ | $R^{B2}$ | $R^{C17}$ | H | $R^{A3}$ |
| $L_{A4902}$ | $R^{B2}$ | $R^{C17}$ | H | $R^{A34}$ |
| $L_{A4903}$ | $R^{B2}$ | $R^{C19}$ | H | $R^{B1}$ |
| $L_{A4904}$ | $R^{B2}$ | $R^{C19}$ | H | $R^{B3}$ |
| $L_{A4905}$ | $R^{B2}$ | $R^{C19}$ | H | $R^{B4}$ |
| $L_{A4906}$ | $R^{B2}$ | $R^{C19}$ | H | $R^{B7}$ |
| $L_{A4907}$ | $R^{B2}$ | $R^{C19}$ | H | $R^{B12}$ |
| $L_{A4908}$ | $R^{B2}$ | $R^{C19}$ | H | $R^{B18}$ |
| $L_{A4909}$ | $R^{B2}$ | $R^{C19}$ | H | $R^{A3}$ |
| $L_{A4910}$ | $R^{B2}$ | $R^{C19}$ | H | $R^{A34}$ |
| $L_{A4911}$ | $R^{B2}$ | $R^{C21}$ | H | $R^{B1}$ |
| $L_{A4912}$ | $R^{B2}$ | $R^{C21}$ | H | $R^{B3}$ |
| $L_{A4913}$ | $R^{B2}$ | $R^{C21}$ | H | $R^{B4}$ |
| $L_{A4914}$ | $R^{B2}$ | $R^{C21}$ | H | $R^{B7}$ |
| $L_{A4915}$ | $R^{B2}$ | $R^{C21}$ | H | $R^{B12}$ |
| $L_{A4916}$ | $R^{B2}$ | $R^{C21}$ | H | $R^{B18}$ |
| $L_{A4917}$ | $R^{B2}$ | $R^{C21}$ | H | $R^{A3}$ |
| $L_{A4918}$ | $R^{B2}$ | $R^{C21}$ | H | $R^{A34}$ |

$L_{A4919}$ through $L_{A1224}$ that are based on a structure of Formula IV,

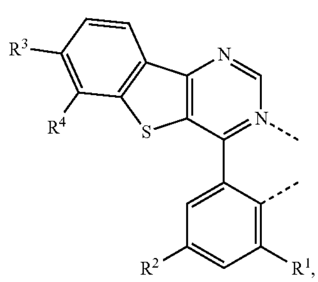

in which $R^1$, $R^2$, $R^3$, and $R^4$ are defined as:

| Ligand | $R^1$ | $R^2$ | $R^3$ | $R^4$ |
|---|---|---|---|---|
| $L_{A4919}$ | $R^{C1}$ | $R^{C1}$ | H | H |
| $L_{A4920}$ | $R^{C1}$ | $R^{C1}$ | $R^{B1}$ | H |
| $L_{A4921}$ | $R^{C1}$ | $R^{C1}$ | $R^{B3}$ | H |
| $L_{A4922}$ | $R^{C1}$ | $R^{C1}$ | $R^{B4}$ | H |
| $L_{A4923}$ | $R^{C1}$ | $R^{C1}$ | $R^{B7}$ | H |
| $L_{A4924}$ | $R^{C1}$ | $R^{C1}$ | $R^{B12}$ | H |
| $L_{A4925}$ | $R^{C1}$ | $R^{C1}$ | $R^{B18}$ | H |
| $L_{A4926}$ | $R^{C1}$ | $R^{C1}$ | $R^{A3}$ | H |
| $L_{A4927}$ | $R^{C1}$ | $R^{C1}$ | $R^{A34}$ | H |
| $L_{A4928}$ | $R^{C3}$ | $R^{C3}$ | H | H |
| $L_{A4929}$ | $R^{C3}$ | $R^{C3}$ | $R^{B1}$ | H |

-continued

| Ligand | $R^1$ | $R^2$ | $R^3$ | $R^4$ |
|---|---|---|---|---|
| $L_{A4930}$ | $R^{C3}$ | $R^{C3}$ | $R^{B3}$ | H |
| $L_{A4931}$ | $R^{C3}$ | $R^{C3}$ | $R^{B4}$ | H |
| $L_{A4932}$ | $R^{C3}$ | $R^{C3}$ | $R^{B7}$ | H |
| $L_{A4933}$ | $R^{C3}$ | $R^{C3}$ | $R^{B12}$ | H |
| $L_{A4934}$ | $R^{C3}$ | $R^{C3}$ | $R^{B18}$ | H |
| $L_{A4935}$ | $R^{C3}$ | $R^{C3}$ | $R^{A3}$ | H |
| $L_{A4936}$ | $R^{C3}$ | $R^{C3}$ | $R^{A34}$ | H |
| $L_{A4937}$ | $R^{C5}$ | $R^{C5}$ | H | H |
| $L_{A4938}$ | $R^{C5}$ | $R^{C5}$ | $R^{B1}$ | H |
| $L_{A4939}$ | $R^{C5}$ | $R^{C5}$ | $R^{B3}$ | H |
| $L_{A4940}$ | $R^{C5}$ | $R^{C5}$ | $R^{B4}$ | H |
| $L_{A4941}$ | $R^{C5}$ | $R^{C5}$ | $R^{B7}$ | H |
| $L_{A4942}$ | $R^{C5}$ | $R^{C5}$ | $R^{B12}$ | H |
| $L_{A4943}$ | $R^{C5}$ | $R^{C5}$ | $R^{B18}$ | H |
| $L_{A4944}$ | $R^{C5}$ | $R^{C5}$ | $R^{A3}$ | H |
| $L_{A4945}$ | $R^{C5}$ | $R^{C5}$ | $R^{A34}$ | H |
| $L_{A4946}$ | $R^{C17}$ | $R^{C17}$ | H | H |
| $L_{A4947}$ | $R^{C17}$ | $R^{C17}$ | $R^{B1}$ | H |
| $L_{A4948}$ | $R^{C17}$ | $R^{C17}$ | $R^{B3}$ | H |
| $L_{A4949}$ | $R^{C17}$ | $R^{C17}$ | $R^{B4}$ | H |
| $L_{A4950}$ | $R^{C17}$ | $R^{C17}$ | $R^{B7}$ | H |
| $L_{A4951}$ | $R^{C17}$ | $R^{C17}$ | $R^{B12}$ | H |
| $L_{A4952}$ | $R^{C17}$ | $R^{C17}$ | $R^{B18}$ | H |
| $L_{A4953}$ | $R^{C17}$ | $R^{C17}$ | $R^{A3}$ | H |
| $L_{A4954}$ | $R^{C17}$ | $R^{C17}$ | $R^{A34}$ | H |
| $L_{A4955}$ | $R^{C19}$ | $R^{C19}$ | H | H |
| $L_{A4956}$ | $R^{C19}$ | $R^{C19}$ | $R^{B1}$ | H |
| $L_{A4957}$ | $R^{C19}$ | $R^{C19}$ | $R^{B3}$ | H |
| $L_{A4958}$ | $R^{C19}$ | $R^{C19}$ | $R^{B4}$ | H |
| $L_{A4959}$ | $R^{C19}$ | $R^{C19}$ | $R^{B7}$ | H |
| $L_{A4960}$ | $R^{C19}$ | $R^{C19}$ | $R^{B12}$ | H |
| $L_{A4961}$ | $R^{C19}$ | $R^{C19}$ | $R^{B18}$ | H |
| $L_{A4962}$ | $R^{C19}$ | $R^{C19}$ | $R^{A3}$ | H |
| $L_{A4963}$ | $R^{C19}$ | $R^{C19}$ | $R^{A34}$ | H |
| $L_{A4964}$ | $R^{C21}$ | $R^{C21}$ | H | H |
| $L_{A4965}$ | $R^{C21}$ | $R^{C21}$ | $R^{B1}$ | H |
| $L_{A4966}$ | $R^{C21}$ | $R^{C21}$ | $R^{B3}$ | H |
| $L_{A4967}$ | $R^{C21}$ | $R^{C21}$ | $R^{B4}$ | H |
| $L_{A4968}$ | $R^{C21}$ | $R^{C21}$ | $R^{B7}$ | H |
| $L_{A4969}$ | $R^{C21}$ | $R^{C21}$ | $R^{B12}$ | H |
| $L_{A4970}$ | $R^{C21}$ | $R^{C21}$ | $R^{B18}$ | H |
| $L_{A4971}$ | $R^{C21}$ | $R^{C21}$ | $R^{A3}$ | H |
| $L_{A4972}$ | $R^{C21}$ | $R^{C21}$ | $R^{A34}$ | H |
| $L_{A4973}$ | $R^{B1}$ | $R^{C1}$ | H | H |
| $L_{A4974}$ | $R^{B1}$ | $R^{C1}$ | $R^{B1}$ | H |
| $L_{A4975}$ | $R^{B1}$ | $R^{C1}$ | $R^{B3}$ | H |
| $L_{A4976}$ | $R^{B1}$ | $R^{C1}$ | $R^{B4}$ | H |
| $L_{A4977}$ | $R^{B1}$ | $R^{C1}$ | $R^{B7}$ | H |
| $L_{A4978}$ | $R^{B1}$ | $R^{C1}$ | $R^{B12}$ | H |
| $L_{A4979}$ | $R^{B1}$ | $R^{C1}$ | $R^{B18}$ | H |
| $L_{A4980}$ | $R^{B1}$ | $R^{C1}$ | $R^{A3}$ | H |
| $L_{A4981}$ | $R^{B1}$ | $R^{C1}$ | $R^{A34}$ | H |
| $L_{A4982}$ | $R^{B1}$ | $R^{C3}$ | H | H |
| $L_{A4983}$ | $R^{B1}$ | $R^{C3}$ | $R^{B1}$ | H |
| $L_{A4984}$ | $R^{B1}$ | $R^{C3}$ | $R^{B3}$ | H |
| $L_{A4985}$ | $R^{B1}$ | $R^{C3}$ | $R^{B4}$ | H |
| $L_{A4986}$ | $R^{B1}$ | $R^{C3}$ | $R^{B7}$ | H |
| $L_{A4987}$ | $R^{B1}$ | $R^{C3}$ | $R^{B12}$ | H |
| $L_{A4988}$ | $R^{B1}$ | $R^{C3}$ | $R^{B18}$ | H |
| $L_{A4989}$ | $R^{B1}$ | $R^{C3}$ | $R^{A3}$ | H |
| $L_{A4990}$ | $R^{B1}$ | $R^{C3}$ | $R^{A34}$ | H |
| $L_{A4991}$ | $R^{B1}$ | $R^{C5}$ | H | H |
| $L_{A4992}$ | $R^{B1}$ | $R^{C5}$ | $R^{B1}$ | H |
| $L_{A4993}$ | $R^{B1}$ | $R^{C5}$ | $R^{B3}$ | H |
| $L_{A4994}$ | $R^{B1}$ | $R^{C5}$ | $R^{B4}$ | H |
| $L_{A4995}$ | $R^{B1}$ | $R^{C5}$ | $R^{B7}$ | H |
| $L_{A4996}$ | $R^{B1}$ | $R^{C5}$ | $R^{B12}$ | H |
| $L_{A4997}$ | $R^{B1}$ | $R^{C5}$ | $R^{B18}$ | H |
| $L_{A4998}$ | $R^{B1}$ | $R^{C5}$ | $R^{A3}$ | H |
| $L_{A4999}$ | $R^{B1}$ | $R^{C5}$ | $R^{A34}$ | H |
| $L_{A1000}$ | $R^{B1}$ | $R^{C17}$ | H | H |
| $L_{A1001}$ | $R^{B1}$ | $R^{C17}$ | $R^{B1}$ | H |
| $L_{A1002}$ | $R^{B1}$ | $R^{C17}$ | $R^{B3}$ | H |
| $L_{A1003}$ | $R^{B1}$ | $R^{C17}$ | $R^{B4}$ | H |
| $L_{A1004}$ | $R^{B1}$ | $R^{C17}$ | $R^{B7}$ | H |
| $L_{A1005}$ | $R^{B1}$ | $R^{C17}$ | $R^{B12}$ | H |
| $L_{A1006}$ | $R^{B1}$ | $R^{C17}$ | $R^{B18}$ | H |

-continued

| Ligand | $R^1$ | $R^2$ | $R^3$ | $R^4$ |
|---|---|---|---|---|
| $L_{A1007}$ | $R^{B1}$ | $R^{C17}$ | $R^{A3}$ | H |
| $L_{A1008}$ | $R^{B1}$ | $R^{C17}$ | $R^{A34}$ | H |
| $L_{A1009}$ | $R^{B1}$ | $R^{C19}$ | H | H |
| $L_{A1010}$ | $R^{B1}$ | $R^{C19}$ | $R^{B1}$ | H |
| $L_{A1011}$ | $R^{B1}$ | $R^{C19}$ | $R^{B3}$ | H |
| $L_{A1012}$ | $R^{B1}$ | $R^{C19}$ | $R^{B4}$ | H |
| $L_{A1013}$ | $R^{B1}$ | $R^{C19}$ | $R^{B7}$ | H |
| $L_{A1014}$ | $R^{B1}$ | $R^{C19}$ | $R^{B12}$ | H |
| $L_{A1015}$ | $R^{B1}$ | $R^{C19}$ | $R^{B18}$ | H |
| $L_{A1016}$ | $R^{B1}$ | $R^{C19}$ | $R^{A3}$ | H |
| $L_{A1017}$ | $R^{B1}$ | $R^{C19}$ | $R^{A34}$ | H |
| $L_{A1018}$ | $R^{B1}$ | $R^{C21}$ | H | H |
| $L_{A1019}$ | $R^{B1}$ | $R^{C21}$ | $R^{B1}$ | H |
| $L_{A1020}$ | $R^{B1}$ | $R^{C21}$ | $R^{B3}$ | H |
| $L_{A1021}$ | $R^{B1}$ | $R^{C21}$ | $R^{B4}$ | H |
| $L_{A1022}$ | $R^{B1}$ | $R^{C21}$ | $R^{B7}$ | H |
| $L_{A1023}$ | $R^{B1}$ | $R^{C21}$ | $R^{B12}$ | H |
| $L_{A1024}$ | $R^{B1}$ | $R^{C21}$ | $R^{B18}$ | H |
| $L_{A1025}$ | $R^{B1}$ | $R^{C21}$ | $R^{A3}$ | H |
| $L_{A1026}$ | $R^{B1}$ | $R^{C21}$ | $R^{A34}$ | H |
| $L_{A1027}$ | $R^{B2}$ | $R^{C1}$ | H | H |
| $L_{A1028}$ | $R^{B2}$ | $R^{C1}$ | $R^{B1}$ | H |
| $L_{A1029}$ | $R^{B2}$ | $R^{C1}$ | $R^{B3}$ | H |
| $L_{A1030}$ | $R^{B2}$ | $R^{C1}$ | $R^{B4}$ | H |
| $L_{A1031}$ | $R^{B2}$ | $R^{C1}$ | $R^{B7}$ | H |
| $L_{A1032}$ | $R^{B2}$ | $R^{C1}$ | $R^{B12}$ | H |
| $L_{A1033}$ | $R^{B2}$ | $R^{C1}$ | $R^{B18}$ | H |
| $L_{A1034}$ | $R^{B2}$ | $R^{C1}$ | $R^{A3}$ | H |
| $L_{A1035}$ | $R^{B2}$ | $R^{C1}$ | $R^{A34}$ | H |
| $L_{A1036}$ | $R^{B2}$ | $R^{C3}$ | H | H |
| $L_{A1037}$ | $R^{B2}$ | $R^{C3}$ | $R^{B1}$ | H |
| $L_{A1038}$ | $R^{B2}$ | $R^{C3}$ | $R^{B3}$ | H |
| $L_{A1039}$ | $R^{B2}$ | $R^{C3}$ | $R^{B4}$ | H |
| $L_{A1040}$ | $R^{B2}$ | $R^{C3}$ | $R^{B7}$ | H |
| $L_{A1041}$ | $R^{B2}$ | $R^{C3}$ | $R^{B12}$ | H |
| $L_{A1042}$ | $R^{B2}$ | $R^{C3}$ | $R^{B18}$ | H |
| $L_{A1043}$ | $R^{B2}$ | $R^{C3}$ | $R^{A3}$ | H |
| $L_{A1044}$ | $R^{B2}$ | $R^{C3}$ | $R^{A34}$ | H |
| $L_{A1045}$ | $R^{B2}$ | $R^{C5}$ | H | H |
| $L_{A1046}$ | $R^{B2}$ | $R^{C5}$ | $R^{B1}$ | H |
| $L_{A1047}$ | $R^{B2}$ | $R^{C5}$ | $R^{B3}$ | H |
| $L_{A1048}$ | $R^{B2}$ | $R^{C5}$ | $R^{B4}$ | H |
| $L_{A1049}$ | $R^{B2}$ | $R^{C5}$ | $R^{B7}$ | H |
| $L_{A1050}$ | $R^{B2}$ | $R^{C5}$ | $R^{B12}$ | H |
| $L_{A1051}$ | $R^{B2}$ | $R^{C5}$ | $R^{B18}$ | H |
| $L_{A1052}$ | $R^{B2}$ | $R^{C5}$ | $R^{A3}$ | H |
| $L_{A1053}$ | $R^{B2}$ | $R^{C5}$ | $R^{A34}$ | H |
| $L_{A1054}$ | $R^{B2}$ | $R^{C17}$ | H | H |
| $L_{A1055}$ | $R^{B2}$ | $R^{C17}$ | $R^{B1}$ | H |
| $L_{A1056}$ | $R^{B2}$ | $R^{C17}$ | $R^{B3}$ | H |
| $L_{A1057}$ | $R^{B2}$ | $R^{C17}$ | $R^{B4}$ | H |
| $L_{A1058}$ | $R^{B2}$ | $R^{C17}$ | $R^{B7}$ | H |
| $L_{A1059}$ | $R^{B2}$ | $R^{C17}$ | $R^{B12}$ | H |
| $L_{A1060}$ | $R^{B2}$ | $R^{C17}$ | $R^{B18}$ | H |
| $L_{A1061}$ | $R^{B2}$ | $R^{C17}$ | $R^{A3}$ | H |
| $L_{A1062}$ | $R^{B2}$ | $R^{C17}$ | $R^{A34}$ | H |
| $L_{A1063}$ | $R^{B2}$ | $R^{C19}$ | H | H |
| $L_{A1064}$ | $R^{B2}$ | $R^{C19}$ | $R^{B1}$ | H |
| $L_{A1065}$ | $R^{B2}$ | $R^{C19}$ | $R^{B3}$ | H |
| $L_{A1066}$ | $R^{B2}$ | $R^{C19}$ | $R^{B4}$ | H |
| $L_{A1067}$ | $R^{B2}$ | $R^{C19}$ | $R^{B7}$ | H |
| $L_{A1068}$ | $R^{B2}$ | $R^{C19}$ | $R^{B12}$ | H |
| $L_{A1069}$ | $R^{B2}$ | $R^{C19}$ | $R^{B18}$ | H |
| $L_{A1070}$ | $R^{B2}$ | $R^{C19}$ | $R^{A3}$ | H |
| $L_{A1071}$ | $R^{B2}$ | $R^{C19}$ | $R^{A34}$ | H |
| $L_{A1072}$ | $R^{B2}$ | $R^{C21}$ | H | H |
| $L_{A1073}$ | $R^{B2}$ | $R^{C21}$ | $R^{B1}$ | H |
| $L_{A1074}$ | $R^{B2}$ | $R^{C21}$ | $R^{B3}$ | H |
| $L_{A1075}$ | $R^{B2}$ | $R^{C21}$ | $R^{B4}$ | H |
| $L_{A1076}$ | $R^{B2}$ | $R^{C21}$ | $R^{B7}$ | H |
| $L_{A1077}$ | $R^{B2}$ | $R^{C21}$ | $R^{B12}$ | H |
| $L_{A1078}$ | $R^{B2}$ | $R^{C21}$ | $R^{B18}$ | H |
| $L_{A1079}$ | $R^{B2}$ | $R^{C21}$ | $R^{A3}$ | H |
| $L_{A1080}$ | $R^{B2}$ | $R^{C21}$ | $R^{A34}$ | H |
| $L_{A1081}$ | $R^{C1}$ | $R^{C1}$ | H | $R^{B1}$ |
| $L_{A1082}$ | $R^{C1}$ | $R^{C1}$ | H | $R^{B3}$ |
| $L_{A1083}$ | $R^{C1}$ | $R^{C1}$ | H | $R^{B4}$ |

-continued

| Ligand | $R^1$ | $R^2$ | $R^3$ | $R^4$ |
|---|---|---|---|---|
| $L_{A1084}$ | $R^{C1}$ | $R^{C1}$ | H | $R^{B7}$ |
| $L_{A1085}$ | $R^{C1}$ | $R^{C1}$ | H | $R^{B12}$ |
| $L_{A1086}$ | $R^{C1}$ | $R^{C1}$ | H | $R^{B18}$ |
| $L_{A1087}$ | $R^{C1}$ | $R^{C1}$ | H | $R^{A3}$ |
| $L_{A1088}$ | $R^{C1}$ | $R^{C1}$ | H | $R^{A34}$ |
| $L_{A1089}$ | $R^{C3}$ | $R^{C3}$ | H | $R^{B1}$ |
| $L_{A1090}$ | $R^{C3}$ | $R^{C3}$ | H | $R^{B3}$ |
| $L_{A1091}$ | $R^{C3}$ | $R^{C3}$ | H | $R^{B4}$ |
| $L_{A1092}$ | $R^{C3}$ | $R^{C3}$ | H | $R^{B7}$ |
| $L_{A1093}$ | $R^{C3}$ | $R^{C3}$ | H | $R^{B12}$ |
| $L_{A1094}$ | $R^{C3}$ | $R^{C3}$ | H | $R^{B18}$ |
| $L_{A1095}$ | $R^{C3}$ | $R^{C3}$ | H | $R^{A3}$ |
| $L_{A1096}$ | $R^{C3}$ | $R^{C3}$ | H | $R^{A34}$ |
| $L_{A1097}$ | $R^{C5}$ | $R^{C5}$ | H | $R^{B1}$ |
| $L_{A1098}$ | $R^{C5}$ | $R^{C5}$ | H | $R^{B3}$ |
| $L_{A1099}$ | $R^{C5}$ | $R^{C5}$ | H | $R^{B4}$ |
| $L_{A1100}$ | $R^{C5}$ | $R^{C5}$ | H | $R^{B7}$ |
| $L_{A1101}$ | $R^{C5}$ | $R^{C5}$ | H | $R^{B12}$ |
| $L_{A1102}$ | $R^{C5}$ | $R^{C5}$ | H | $R^{B18}$ |
| $L_{A1103}$ | $R^{C5}$ | $R^{C5}$ | H | $R^{A3}$ |
| $L_{A1104}$ | $R^{C5}$ | $R^{C5}$ | H | $R^{A34}$ |
| $L_{A1105}$ | $R^{C17}$ | $R^{C17}$ | H | $R^{B1}$ |
| $L_{A1106}$ | $R^{C17}$ | $R^{C17}$ | H | $R^{B3}$ |
| $L_{A1107}$ | $R^{C17}$ | $R^{C17}$ | H | $R^{B4}$ |
| $L_{A1108}$ | $R^{C17}$ | $R^{C17}$ | H | $R^{B7}$ |
| $L_{A1109}$ | $R^{C17}$ | $R^{C17}$ | H | $R^{B12}$ |
| $L_{A1110}$ | $R^{C17}$ | $R^{C17}$ | H | $R^{B18}$ |
| $L_{A1111}$ | $R^{C17}$ | $R^{C17}$ | H | $R^{A3}$ |
| $L_{A1112}$ | $R^{C17}$ | $R^{C17}$ | H | $R^{A34}$ |
| $L_{A1113}$ | $R^{C19}$ | $R^{C19}$ | H | $R^{B1}$ |
| $L_{A1114}$ | $R^{C19}$ | $R^{C19}$ | H | $R^{B3}$ |
| $L_{A1115}$ | $R^{C19}$ | $R^{C19}$ | H | $R^{B4}$ |
| $L_{A1116}$ | $R^{C19}$ | $R^{C19}$ | H | $R^{B7}$ |
| $L_{A1117}$ | $R^{C19}$ | $R^{C19}$ | H | $R^{B12}$ |
| $L_{A1118}$ | $R^{C19}$ | $R^{C19}$ | H | $R^{B18}$ |
| $L_{A1119}$ | $R^{C19}$ | $R^{C19}$ | H | $R^{A3}$ |
| $L_{A1120}$ | $R^{C19}$ | $R^{C19}$ | H | $R^{A34}$ |
| $L_{A1121}$ | $R^{C21}$ | $R^{C21}$ | H | $R^{B1}$ |
| $L_{A1122}$ | $R^{C21}$ | $R^{C21}$ | H | $R^{B3}$ |
| $L_{A1123}$ | $R^{C21}$ | $R^{C21}$ | H | $R^{B4}$ |
| $L_{A1124}$ | $R^{C21}$ | $R^{C21}$ | H | $R^{B7}$ |
| $L_{A1125}$ | $R^{C21}$ | $R^{C21}$ | H | $R^{B12}$ |
| $L_{A1126}$ | $R^{C21}$ | $R^{C21}$ | H | $R^{B18}$ |
| $L_{A1127}$ | $R^{C21}$ | $R^{C21}$ | H | $R^{A3}$ |
| $L_{A1128}$ | $R^{C21}$ | $R^{C21}$ | H | $R^{A34}$ |
| $L_{A1129}$ | $R^{B1}$ | $R^{C1}$ | H | $R^{B1}$ |
| $L_{A1130}$ | $R^{B1}$ | $R^{C1}$ | H | $R^{B3}$ |
| $L_{A1131}$ | $R^{B1}$ | $R^{C1}$ | H | $R^{B4}$ |
| $L_{A1132}$ | $R^{B1}$ | $R^{C1}$ | H | $R^{B7}$ |
| $L_{A1133}$ | $R^{B1}$ | $R^{C1}$ | H | $R^{B12}$ |
| $L_{A1134}$ | $R^{B1}$ | $R^{C1}$ | H | $R^{B18}$ |
| $L_{A1135}$ | $R^{B1}$ | $R^{C1}$ | H | $R^{A3}$ |
| $L_{A1136}$ | $R^{B1}$ | $R^{C1}$ | H | $R^{A34}$ |
| $L_{A1137}$ | $R^{B1}$ | $R^{C3}$ | H | $R^{B1}$ |
| $L_{A1138}$ | $R^{B1}$ | $R^{C3}$ | H | $R^{B3}$ |
| $L_{A1139}$ | $R^{B1}$ | $R^{C3}$ | H | $R^{B4}$ |
| $L_{A1140}$ | $R^{B1}$ | $R^{C3}$ | H | $R^{B7}$ |
| $L_{A1141}$ | $R^{B1}$ | $R^{C3}$ | H | $R^{B12}$ |
| $L_{A1142}$ | $R^{B1}$ | $R^{C3}$ | H | $R^{B18}$ |
| $L_{A1143}$ | $R^{B1}$ | $R^{C3}$ | H | $R^{A3}$ |
| $L_{A1144}$ | $R^{B1}$ | $R^{C3}$ | H | $R^{A34}$ |
| $L_{A1145}$ | $R^{B1}$ | $R^{C5}$ | H | $R^{B1}$ |
| $L_{A1146}$ | $R^{B1}$ | $R^{C5}$ | H | $R^{B3}$ |
| $L_{A1147}$ | $R^{B1}$ | $R^{C5}$ | H | $R^{B4}$ |
| $L_{A1148}$ | $R^{B1}$ | $R^{C5}$ | H | $R^{B7}$ |
| $L_{A1149}$ | $R^{B1}$ | $R^{C5}$ | H | $R^{B12}$ |
| $L_{A1150}$ | $R^{B1}$ | $R^{C5}$ | H | $R^{B18}$ |
| $L_{A1151}$ | $R^{B1}$ | $R^{C5}$ | H | $R^{A3}$ |
| $L_{A1152}$ | $R^{B1}$ | $R^{C5}$ | H | $R^{A34}$ |
| $L_{A1153}$ | $R^{B1}$ | $R^{C17}$ | H | $R^{B1}$ |
| $L_{A1154}$ | $R^{B1}$ | $R^{C17}$ | H | $R^{B3}$ |
| $L_{A1155}$ | $R^{B1}$ | $R^{C17}$ | H | $R^{B4}$ |
| $L_{A1156}$ | $R^{B1}$ | $R^{C17}$ | H | $R^{B7}$ |
| $L_{A1157}$ | $R^{B1}$ | $R^{C17}$ | H | $R^{B12}$ |
| $L_{A1158}$ | $R^{B1}$ | $R^{C17}$ | H | $R^{B18}$ |
| $L_{A1159}$ | $R^{B1}$ | $R^{C17}$ | H | $R^{A3}$ |
| $L_{A1160}$ | $R^{B1}$ | $R^{C17}$ | H | $R^{A34}$ |

-continued

| Ligand | $R^1$ | $R^2$ | $R^3$ | $R^4$ |
|---|---|---|---|---|
| $L_{A1161}$ | $R^{B1}$ | $R^{C19}$ | H | $R^{B1}$ |
| $L_{A1162}$ | $R^{B1}$ | $R^{C19}$ | H | $R^{B3}$ |
| $L_{A1163}$ | $R^{B1}$ | $R^{C19}$ | H | $R^{B4}$ |
| $L_{A1164}$ | $R^{B1}$ | $R^{C19}$ | H | $R^{B7}$ |
| $L_{A1165}$ | $R^{B1}$ | $R^{C19}$ | H | $R^{B12}$ |
| $L_{A1166}$ | $R^{B1}$ | $R^{C19}$ | H | $R^{B18}$ |
| $L_{A1167}$ | $R^{B1}$ | $R^{C19}$ | H | $R^{A3}$ |
| $L_{A1168}$ | $R^{B1}$ | $R^{C19}$ | H | $R^{A34}$ |
| $L_{A1169}$ | $R^{B1}$ | $R^{C21}$ | H | $R^{B1}$ |
| $L_{A1170}$ | $R^{B1}$ | $R^{C21}$ | H | $R^{B3}$ |
| $L_{A1171}$ | $R^{B1}$ | $R^{C21}$ | H | $R^{B4}$ |
| $L_{A1172}$ | $R^{B1}$ | $R^{C21}$ | H | $R^{B7}$ |
| $L_{A1173}$ | $R^{B1}$ | $R^{C21}$ | H | $R^{B12}$ |
| $L_{A1174}$ | $R^{B1}$ | $R^{C21}$ | H | $R^{B18}$ |
| $L_{A1175}$ | $R^{B1}$ | $R^{C21}$ | H | $R^{A3}$ |
| $L_{A1176}$ | $R^{B1}$ | $R^{C21}$ | H | $R^{A34}$ |
| $L_{A1177}$ | $R^{B2}$ | $R^{C1}$ | H | $R^{B1}$ |
| $L_{A1178}$ | $R^{B2}$ | $R^{C1}$ | H | $R^{B3}$ |
| $L_{A1179}$ | $R^{B2}$ | $R^{C1}$ | H | $R^{B4}$ |
| $L_{A1180}$ | $R^{B2}$ | $R^{C1}$ | H | $R^{B7}$ |
| $L_{A1181}$ | $R^{B2}$ | $R^{C1}$ | H | $R^{B12}$ |
| $L_{A1182}$ | $R^{B2}$ | $R^{C1}$ | H | $R^{B18}$ |
| $L_{A1183}$ | $R^{B2}$ | $R^{C1}$ | H | $R^{A3}$ |
| $L_{A1184}$ | $R^{B2}$ | $R^{C1}$ | H | $R^{A34}$ |
| $L_{A1185}$ | $R^{B2}$ | $R^{C3}$ | H | $R^{B1}$ |
| $L_{A1186}$ | $R^{B2}$ | $R^{C3}$ | H | $R^{B3}$ |
| $L_{A1187}$ | $R^{B2}$ | $R^{C3}$ | H | $R^{B4}$ |
| $L_{A1188}$ | $R^{B2}$ | $R^{C3}$ | H | $R^{B7}$ |
| $L_{A1189}$ | $R^{B2}$ | $R^{C3}$ | H | $R^{B12}$ |
| $L_{A1190}$ | $R^{B2}$ | $R^{C3}$ | H | $R^{B18}$ |
| $L_{A1191}$ | $R^{B2}$ | $R^{C3}$ | H | $R^{A3}$ |
| $L_{A1192}$ | $R^{B2}$ | $R^{C3}$ | H | $R^{A34}$ |
| $L_{A1193}$ | $R^{B2}$ | $R^{C5}$ | H | $R^{B1}$ |
| $L_{A1194}$ | $R^{B2}$ | $R^{C5}$ | H | $R^{B3}$ |
| $L_{A1195}$ | $R^{B2}$ | $R^{C5}$ | H | $R^{B4}$ |
| $L_{A1196}$ | $R^{B2}$ | $R^{C5}$ | H | $R^{B7}$ |
| $L_{A1197}$ | $R^{B2}$ | $R^{C5}$ | H | $R^{B12}$ |
| $L_{A1198}$ | $R^{B2}$ | $R^{C5}$ | H | $R^{B18}$ |
| $L_{A1199}$ | $R^{B2}$ | $R^{C5}$ | H | $R^{A3}$ |
| $L_{A1200}$ | $R^{B2}$ | $R^{C5}$ | H | $R^{A34}$ |
| $L_{A1201}$ | $R^{B2}$ | $R^{C17}$ | H | $R^{B1}$ |
| $L_{A1202}$ | $R^{B2}$ | $R^{C17}$ | H | $R^{B3}$ |
| $L_{A1203}$ | $R^{B2}$ | $R^{C17}$ | H | $R^{B4}$ |
| $L_{A1204}$ | $R^{B2}$ | $R^{C17}$ | H | $R^{B7}$ |
| $L_{A1205}$ | $R^{B2}$ | $R^{C17}$ | H | $R^{B12}$ |
| $L_{A1206}$ | $R^{B2}$ | $R^{C17}$ | H | $R^{B8}$ |
| $L_{A1207}$ | $R^{B2}$ | $R^{C17}$ | H | $R^{A3}$ |
| $L_{A1208}$ | $R^{B2}$ | $R^{C17}$ | H | $R^{A34}$ |
| $L_{A1209}$ | $R^{B2}$ | $R^{C19}$ | H | $R^{B1}$ |
| $L_{A1210}$ | $R^{B2}$ | $R^{C19}$ | H | $R^{B3}$ |
| $L_{A1211}$ | $R^{B2}$ | $R^{C19}$ | H | $R^{B4}$ |
| $L_{A1212}$ | $R^{B2}$ | $R^{C19}$ | H | $R^{B7}$ |
| $L_{A1213}$ | $R^{B2}$ | $R^{C19}$ | H | $R^{B12}$ |
| $L_{A1214}$ | $R^{B2}$ | $R^{C19}$ | H | $R^{B18}$ |
| $L_{A1215}$ | $R^{B2}$ | $R^{C19}$ | H | $R^{A3}$ |
| $L_{A1216}$ | $R^{B2}$ | $R^{C19}$ | H | $R^{A34}$ |
| $L_{A1217}$ | $R^{B2}$ | $R^{C21}$ | H | $R^{B1}$ |
| $L_{A1218}$ | $R^{B2}$ | $R^{C21}$ | H | $R^{B3}$ |
| $L_{A1219}$ | $R^{B2}$ | $R^{C21}$ | H | $R^{B4}$ |
| $L_{A1220}$ | $R^{B2}$ | $R^{C21}$ | H | $R^{B7}$ |
| $L_{A1221}$ | $R^{B2}$ | $R^{C21}$ | H | $R^{B12}$ |
| $L_{A1222}$ | $R^{B2}$ | $R^{C21}$ | H | $R^{B18}$ |
| $L_{A1223}$ | $R^{B2}$ | $R^{C21}$ | H | $R^{A3}$ |
| $L_{A1224}$ | $R^{B2}$ | $R^{C21}$ | H | $R^{A34}$ |

$L_{A1225}$ through $L_{A1326}$ that are based on a structure of Formula V,

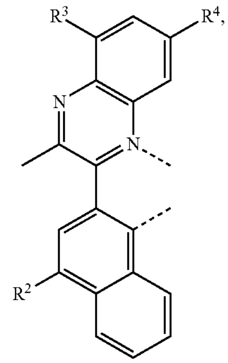

in which $R^2$, $R^3$, and $R^4$ are defined as:

| Ligand | $R^2$ | $R^3$ | $R^4$ |
|---|---|---|---|
| $L_{A1225}$ | $R^{C1}$ | H | H |
| $L_{A1226}$ | $R^{C1}$ | $R^{B1}$ | H |
| $L_{A1227}$ | $R^{C1}$ | $R^{B3}$ | H |
| $L_{A1228}$ | $R^{C1}$ | $R^{B4}$ | H |
| $L_{A1229}$ | $R^{C1}$ | $R^{B7}$ | H |
| $L_{A1230}$ | $R^{C1}$ | $R^{B12}$ | H |
| $L_{A1231}$ | $R^{C1}$ | $R^{B18}$ | H |
| $L_{A1232}$ | $R^{C1}$ | $R^{A3}$ | H |
| $L_{A1233}$ | $R^{C1}$ | $R^{A34}$ | H |
| $L_{A1234}$ | $R^{C3}$ | H | H |
| $L_{A1235}$ | $R^{C3}$ | $R^{B1}$ | H |
| $L_{A1236}$ | $R^{C3}$ | $R^{B3}$ | H |
| $L_{A1237}$ | $R^{C3}$ | $R^{B4}$ | H |
| $L_{A1238}$ | $R^{C3}$ | $R^{B7}$ | H |
| $L_{A1239}$ | $R^{C3}$ | $R^{B12}$ | H |
| $L_{A1240}$ | $R^{C3}$ | $R^{B18}$ | H |
| $L_{A1241}$ | $R^{C3}$ | $R^{A3}$ | H |
| $L_{A1242}$ | $R^{C3}$ | $R^{A34}$ | H |
| $L_{A1243}$ | $R^{C5}$ | H | H |
| $L_{A1244}$ | $R^{C5}$ | $R^{B1}$ | H |
| $L_{A1245}$ | $R^{C5}$ | $R^{B3}$ | H |
| $L_{A1246}$ | $R^{C5}$ | $R^{B4}$ | H |
| $L_{A1247}$ | $R^{C5}$ | $R^{B7}$ | H |
| $L_{A1248}$ | $R^{C5}$ | $R^{B12}$ | H |
| $L_{A1249}$ | $R^{C5}$ | $R^{B18}$ | H |
| $L_{A1250}$ | $R^{C5}$ | $R^{A3}$ | H |
| $L_{A1251}$ | $R^{C5}$ | $R^{A34}$ | H |
| $L_{A1252}$ | $R^{C17}$ | H | H |
| $L_{A1253}$ | $R^{C17}$ | $R^{B1}$ | H |
| $L_{A1254}$ | $R^{C17}$ | $R^{B3}$ | H |
| $L_{A1255}$ | $R^{C17}$ | $R^{B4}$ | H |
| $L_{A1256}$ | $R^{C17}$ | $R^{B7}$ | H |
| $L_{A1257}$ | $R^{C17}$ | $R^{B12}$ | H |
| $L_{A1258}$ | $R^{C17}$ | $R^{B18}$ | H |
| $L_{A1259}$ | $R^{C17}$ | $R^{A3}$ | H |
| $L_{A1260}$ | $R^{C17}$ | $R^{A34}$ | H |
| $L_{A1261}$ | $R^{C19}$ | H | H |
| $L_{A1262}$ | $R^{C19}$ | $R^{B1}$ | H |
| $L_{A1263}$ | $R^{C19}$ | $R^{B3}$ | H |
| $L_{A1264}$ | $R^{C19}$ | $R^{B4}$ | H |
| $L_{A1265}$ | $R^{C19}$ | $R^{B7}$ | H |
| $L_{A1266}$ | $R^{C19}$ | $R^{B12}$ | H |
| $L_{A1267}$ | $R^{C19}$ | $R^{B18}$ | H |
| $L_{A1268}$ | $R^{C19}$ | $R^{A3}$ | H |
| $L_{A1269}$ | $R^{C19}$ | $R^{A34}$ | H |
| $L_{A1270}$ | $R^{C21}$ | H | H |
| $L_{A1271}$ | $R^{C21}$ | $R^{B1}$ | H |
| $L_{A1272}$ | $R^{C21}$ | $R^{B3}$ | H |
| $L_{A1273}$ | $R^{C21}$ | $R^{B4}$ | H |
| $L_{A1274}$ | $R^{C21}$ | $R^{B7}$ | H |
| $L_{A1275}$ | $R^{C21}$ | $R^{B12}$ | H |
| $L_{A1276}$ | $R^{C21}$ | $R^{B18}$ | H |
| $L_{A1277}$ | $R^{C21}$ | $R^{A3}$ | H |
| $L_{A1278}$ | $R^{C21}$ | $R^{A34}$ | H |
| $L_{A1279}$ | $R^{C1}$ | $R^{B1}$ | H |
| $L_{A1280}$ | $R^{C1}$ | $R^{B3}$ | H |

-continued

| Ligand | $R^2$ | $R^3$ | $R^4$ |
|---|---|---|---|
| $L_{A1281}$ | $R^{C1}$ | $R^{B4}$ | H |
| $L_{A1282}$ | $R^{C1}$ | $R^{B7}$ | H |
| $L_{A1283}$ | $R^{C1}$ | $R^{B12}$ | H |
| $L_{A1284}$ | $R^{C1}$ | $R^{B18}$ | H |
| $L_{A1285}$ | $R^{C1}$ | $R^{A3}$ | H |
| $L_{A1286}$ | $R^{C1}$ | $R^{A34}$ | H |
| $L_{A1287}$ | $R^{C3}$ | $R^{B1}$ | H |
| $L_{A1288}$ | $R^{C3}$ | $R^{B3}$ | H |
| $L_{A1289}$ | $R^{C3}$ | $R^{B4}$ | H |
| $L_{A1290}$ | $R^{C3}$ | $R^{B7}$ | H |
| $L_{A1291}$ | $R^{C3}$ | $R^{B12}$ | H |
| $L_{A1292}$ | $R^{C3}$ | $R^{B18}$ | H |
| $L_{A1293}$ | $R^{C3}$ | $R^{A3}$ | H |
| $L_{A1294}$ | $R^{C3}$ | $R^{A34}$ | H |
| $L_{A1295}$ | $R^{C5}$ | $R^{B1}$ | H |
| $L_{A1296}$ | $R^{C5}$ | $R^{B3}$ | H |
| $L_{A1297}$ | $R^{C5}$ | $R^{B4}$ | H |
| $L_{A1298}$ | $R^{C5}$ | $R^{B7}$ | H |
| $L_{A1299}$ | $R^{C5}$ | $R^{B12}$ | H |
| $L_{A1300}$ | $R^{C5}$ | $R^{B18}$ | H |
| $L_{A1301}$ | $R^{C5}$ | $R^{A3}$ | H |
| $L_{A1302}$ | $R^{C5}$ | $R^{A34}$ | H |
| $L_{A1303}$ | $R^{C17}$ | $R^{B1}$ | H |
| $L_{A1304}$ | $R^{C17}$ | $R^{B3}$ | H |
| $L_{A1305}$ | $R^{C17}$ | $R^{B4}$ | H |
| $L_{A1306}$ | $R^{C17}$ | $R^{B7}$ | H |
| $L_{A1307}$ | $R^{C17}$ | $R^{B12}$ | H |
| $L_{A1308}$ | $R^{C17}$ | $R^{B18}$ | H |
| $L_{A1309}$ | $R^{C17}$ | $R^{A3}$ | H |
| $L_{A1310}$ | $R^{C17}$ | $R^{A34}$ | H |
| $L_{A1311}$ | $R^{C19}$ | $R^{B1}$ | H |
| $L_{A1312}$ | $R^{C19}$ | $R^{B3}$ | H |
| $L_{A1313}$ | $R^{C19}$ | $R^{B4}$ | H |
| $L_{A1314}$ | $R^{C19}$ | $R^{B7}$ | H |
| $L_{A1315}$ | $R^{C19}$ | $R^{B12}$ | H |
| $L_{A1316}$ | $R^{C19}$ | $R^{B18}$ | H |
| $L_{A1317}$ | $R^{C19}$ | $R^{A3}$ | H |
| $L_{A1318}$ | $R^{C19}$ | $R^{A34}$ | H |
| $L_{A1319}$ | $R^{C21}$ | $R^{B1}$ | H |
| $L_{A1320}$ | $R^{C21}$ | $R^{B3}$ | H |
| $L_{A1321}$ | $R^{C21}$ | $R^{B4}$ | H |
| $L_{A1322}$ | $R^{C21}$ | $R^{B7}$ | H |
| $L_{A1323}$ | $R^{C21}$ | $R^{B12}$ | H |
| $L_{A1324}$ | $R^{C21}$ | $R^{B18}$ | H |
| $L_{A1325}$ | $R^{C21}$ | $R^{A3}$ | H |
| $L_{A1326}$ | $R^{C21}$ | $R^{A34}$ | H |

$L_{A1327}$ through $L_{A1428}$ that are based on a structure of Formula VI,

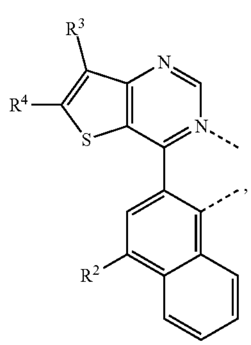

in which $R^2$, $R^3$, and $R^4$ are defined as:

| Ligand | $R^2$ | $R^3$ | $R^4$ |
|---|---|---|---|
| $L_{A1327}$ | $R^{C1}$ | H | H |
| $L_{A1328}$ | $R^{C1}$ | $R^{B1}$ | H |

-continued

| Ligand | $R^2$ | $R^3$ | $R^4$ |
|---|---|---|---|
| $L_{A1329}$ | $R^{C1}$ | $R^{B3}$ | H |
| $L_{A1330}$ | $R^{C1}$ | $R^{B4}$ | H |
| $L_{A1331}$ | $R^{C1}$ | $R^{B7}$ | H |
| $L_{A1332}$ | $R^{C1}$ | $R^{B12}$ | H |
| $L_{A1333}$ | $R^{C1}$ | $R^{B18}$ | H |
| $L_{A1334}$ | $R^{C1}$ | $R^{A3}$ | H |
| $L_{A1335}$ | $R^{C1}$ | $R^{A34}$ | H |
| $L_{A1336}$ | $R^{C3}$ | H | H |
| $L_{A1337}$ | $R^{C3}$ | $R^{B1}$ | H |
| $L_{A1338}$ | $R^{C3}$ | $R^{B3}$ | H |
| $L_{A1339}$ | $R^{C3}$ | $R^{B4}$ | H |
| $L_{A1340}$ | $R^{C3}$ | $R^{B7}$ | H |
| $L_{A1341}$ | $R^{C3}$ | $R^{B12}$ | H |
| $L_{A1342}$ | $R^{C3}$ | $R^{B18}$ | H |
| $L_{A1343}$ | $R^{C3}$ | $R^{A3}$ | H |
| $L_{A1344}$ | $R^{C3}$ | $R^{A34}$ | H |
| $L_{A1345}$ | $R^{C5}$ | H | H |
| $L_{A1346}$ | $R^{C5}$ | $R^{B1}$ | H |
| $L_{A1347}$ | $R^{C5}$ | $R^{B3}$ | H |
| $L_{A1348}$ | $R^{C5}$ | $R^{B4}$ | H |
| $L_{A1349}$ | $R^{C5}$ | $R^{B7}$ | H |
| $L_{A1350}$ | $R^{C5}$ | $R^{B12}$ | H |
| $L_{A1351}$ | $R^{C5}$ | $R^{B18}$ | H |
| $L_{A1352}$ | $R^{C5}$ | $R^{A3}$ | H |
| $L_{A1353}$ | $R^{C5}$ | $R^{A34}$ | H |
| $L_{A1354}$ | $R^{C17}$ | H | H |
| $L_{A1355}$ | $R^{C17}$ | $R^{B1}$ | H |
| $L_{A1356}$ | $R^{C17}$ | $R^{B3}$ | H |
| $L_{A1357}$ | $R^{C17}$ | $R^{B4}$ | H |
| $L_{A1358}$ | $R^{C17}$ | $R^{B7}$ | H |
| $L_{A1359}$ | $R^{C17}$ | $R^{B12}$ | H |
| $L_{A1360}$ | $R^{C17}$ | $R^{B18}$ | H |
| $L_{A1361}$ | $R^{C17}$ | $R^{A3}$ | H |
| $L_{A1362}$ | $R^{C17}$ | $R^{A34}$ | H |
| $L_{A1363}$ | $R^{C19}$ | H | H |
| $L_{A1364}$ | $R^{C19}$ | $R^{B1}$ | H |
| $L_{A1365}$ | $R^{C19}$ | $R^{B3}$ | H |
| $L_{A1366}$ | $R^{C19}$ | $R^{B4}$ | H |
| $L_{A1367}$ | $R^{C19}$ | $R^{B7}$ | H |
| $L_{A1368}$ | $R^{C19}$ | $R^{B12}$ | H |
| $L_{A1369}$ | $R^{C19}$ | $R^{B18}$ | H |
| $L_{A1370}$ | $R^{C19}$ | $R^{A3}$ | H |
| $L_{A1371}$ | $R^{C19}$ | $R^{A34}$ | H |
| $L_{A1372}$ | $R^{C21}$ | H | H |
| $L_{A1373}$ | $R^{C21}$ | $R^{B1}$ | H |
| $L_{A1374}$ | $R^{C21}$ | $R^{B3}$ | H |
| $L_{A1375}$ | $R^{C21}$ | $R^{B4}$ | H |
| $L_{A1376}$ | $R^{C21}$ | $R^{B7}$ | H |
| $L_{A1377}$ | $R^{C21}$ | $R^{B12}$ | H |
| $L_{A1378}$ | $R^{C21}$ | $R^{B18}$ | H |
| $L_{A1379}$ | $R^{C21}$ | $R^{A3}$ | H |
| $L_{A1380}$ | $R^{C21}$ | $R^{A34}$ | H |
| $L_{A1381}$ | $R^{C1}$ | $R^{B1}$ | H |
| $L_{A1382}$ | $R^{C1}$ | $R^{B3}$ | H |
| $L_{A1383}$ | $R^{C1}$ | $R^{B4}$ | H |
| $L_{A1384}$ | $R^{C1}$ | $R^{B7}$ | H |
| $L_{A1385}$ | $R^{C1}$ | $R^{B12}$ | H |
| $L_{A1386}$ | $R^{C}$ | $R^{B18}$ | H |
| $L_{A1387}$ | $R^{C1}$ | $R^{A3}$ | H |
| $L_{A1388}$ | $R^{C1}$ | $R^{A34}$ | H |
| $L_{A1389}$ | $R^{C3}$ | $R^{B1}$ | H |
| $L_{A1390}$ | $R^{C3}$ | $R^{B3}$ | H |
| $L_{A1391}$ | $R^{C3}$ | $R^{B4}$ | H |
| $L_{A1392}$ | $R^{C3}$ | $R^{B7}$ | H |
| $L_{A1393}$ | $R^{C3}$ | $R^{B12}$ | H |
| $L_{A1394}$ | $R^{C3}$ | $R^{B18}$ | H |
| $L_{A1395}$ | $R^{C3}$ | $R^{A3}$ | H |
| $L_{A1396}$ | $R^{C3}$ | $R^{A34}$ | H |
| $L_{A1397}$ | $R^{C5}$ | $R^{B1}$ | H |
| $L_{A1398}$ | $R^{C5}$ | $R^{B3}$ | H |
| $L_{A1399}$ | $R^{C5}$ | $R^{B4}$ | H |
| $L_{A1400}$ | $R^{C5}$ | $R^{B7}$ | H |
| $L_{A1401}$ | $R^{C5}$ | $R^{B12}$ | H |
| $L_{A1402}$ | $R^{C5}$ | $R^{B18}$ | H |
| $L_{A1403}$ | $R^{C5}$ | $R^{A3}$ | H |
| $L_{A1404}$ | $R^{C5}$ | $R^{A34}$ | H |
| $L_{A1405}$ | $R^{C17}$ | $R^{B1}$ | H |

-continued

| Ligand | $R^2$ | $R^3$ | $R^4$ |
|---|---|---|---|
| $L_{A1406}$ | $R^{C17}$ | $R^{B3}$ | H |
| $L_{A1407}$ | $R^{C17}$ | $R^{B4}$ | H |
| $L_{A1408}$ | $R^{C17}$ | $R^{B7}$ | H |
| $L_{A1409}$ | $R^{C17}$ | $R^{B12}$ | H |
| $L_{A1410}$ | $R^{C17}$ | $R^{B18}$ | H |
| $L_{A1411}$ | $R^{C17}$ | $R^{A3}$ | H |
| $L_{A1412}$ | $R^{C17}$ | $R^{A34}$ | H |
| $L_{A1413}$ | $R^{C19}$ | $R^{B1}$ | H |
| $L_{A1414}$ | $R^{C19}$ | $R^{B3}$ | H |
| $L_{A1415}$ | $R^{C19}$ | $R^{B4}$ | H |
| $L_{A1416}$ | $R^{C19}$ | $R^{B7}$ | H |
| $L_{A1417}$ | $R^{C19}$ | $R^{B12}$ | H |
| $L_{A1418}$ | $R^{C19}$ | $R^{B18}$ | H |
| $L_{A1419}$ | $R^{C19}$ | $R^{A3}$ | H |
| $L_{A1420}$ | $R^{C19}$ | $R^{A34}$ | H |
| $L_{A1421}$ | $R^{C21}$ | $R^{B1}$ | H |
| $L_{A1422}$ | $R^{C21}$ | $R^{B3}$ | H |
| $L_{A1423}$ | $R^{C21}$ | $R^{B4}$ | H |
| $L_{A1424}$ | $R^{C21}$ | $R^{B7}$ | H |
| $L_{A1425}$ | $R^{C21}$ | $R^{B12}$ | H |
| $L_{A1426}$ | $R^{C21}$ | $R^{B18}$ | H |
| $L_{A1427}$ | $R^{C21}$ | $R^{A3}$ | H |
| $L_{A1428}$ | $R^{C21}$ | $R^{A34}$ | H |

$L_{A1429}$ through $L_{A1530}$ that are based on a structure of Formula VII,

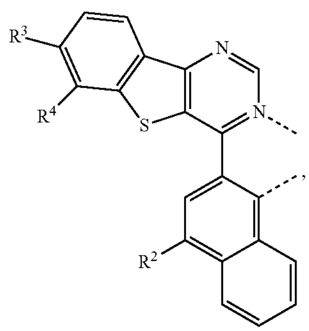

in which $R^2$, $R^3$, and $R^4$ are defined as:

| Ligand | $R^2$ | $R^3$ | $R^4$ |
|---|---|---|---|
| $L_{A1429}$ | $R^{C1}$ | H | H |
| $L_{A1430}$ | $R^{C1}$ | $R^{B1}$ | H |
| $L_{A1431}$ | $R^{C1}$ | $R^{B3}$ | H |
| $L_{A1432}$ | $R^{C1}$ | $R^{B4}$ | H |
| $L_{A1433}$ | $R^{C1}$ | $R^{B7}$ | H |
| $L_{A1434}$ | $R^{C1}$ | $R^{B12}$ | H |
| $L_{A1435}$ | $R^{C1}$ | $R^{B18}$ | H |
| $L_{A1436}$ | $R^{C1}$ | $R^{A3}$ | H |
| $L_{A1437}$ | $R^{C1}$ | $R^{A34}$ | H |
| $L_{A1438}$ | $R^{C3}$ | H | H |
| $L_{A1439}$ | $R^{C3}$ | $R^{B1}$ | H |
| $L_{A1440}$ | $R^{C3}$ | $R^{B3}$ | H |
| $L_{A1441}$ | $R^{C3}$ | $R^{B4}$ | H |
| $L_{A1442}$ | $R^{C3}$ | $R^{B7}$ | H |
| $L_{A1443}$ | $R^{C3}$ | $R^{B12}$ | H |
| $L_{A1444}$ | $R^{C3}$ | $R^{B18}$ | H |
| $L_{A1445}$ | $R^{C3}$ | $R^{A3}$ | H |
| $L_{A1446}$ | $R^{C3}$ | $R^{A34}$ | H |
| $L_{A1447}$ | $R^{C5}$ | H | H |
| $L_{A1448}$ | $R^{C5}$ | $R^{B1}$ | H |
| $L_{A1449}$ | $R^{C5}$ | $R^{B3}$ | H |
| $L_{A1450}$ | $R^{C5}$ | $R^{B4}$ | H |
| $L_{A1451}$ | $R^{C5}$ | $R^{B7}$ | H |
| $L_{A1452}$ | $R^{C5}$ | $R^{B12}$ | H |
| $L_{A1453}$ | $R^{C5}$ | $R^{B18}$ | H |
| $L_{A1454}$ | $R^{C5}$ | $R^{A3}$ | H |
| $L_{A1455}$ | $R^{C5}$ | $R^{A34}$ | H |
| $L_{A1456}$ | $R^{C17}$ | H | H |
| $L_{A1457}$ | $R^{C17}$ | $R^{B1}$ | H |
| $L_{A1458}$ | $R^{C17}$ | $R^{B3}$ | H |
| $L_{A1459}$ | $R^{C17}$ | $R^{B4}$ | H |
| $L_{A1460}$ | $R^{C17}$ | $R^{B7}$ | H |
| $L_{A1461}$ | $R^{C17}$ | $R^{B12}$ | H |
| $L_{A1462}$ | $R^{C17}$ | $R^{B18}$ | H |
| $L_{A1463}$ | $R^{C17}$ | $R^{A3}$ | H |
| $L_{A1464}$ | $R^{C17}$ | $R^{A34}$ | H |
| $L_{A1465}$ | $R^{C19}$ | H | H |
| $L_{A1466}$ | $R^{C19}$ | $R^{B1}$ | H |
| $L_{A1467}$ | $R^{C19}$ | $R^{B3}$ | H |
| $L_{A1468}$ | $R^{C19}$ | $R^{B4}$ | H |
| $L_{A1469}$ | $R^{C19}$ | $R^{B7}$ | H |
| $L_{A1470}$ | $R^{C19}$ | $R^{B12}$ | H |
| $L_{A1471}$ | $R^{C19}$ | $R^{B18}$ | H |
| $L_{A1472}$ | $R^{C19}$ | $R^{A3}$ | H |
| $L_{A1473}$ | $R^{C19}$ | $R^{A34}$ | H |
| $L_{A1474}$ | $R^{C21}$ | H | H |
| $L_{A1475}$ | $R^{C21}$ | $R^{B1}$ | H |
| $L_{A1476}$ | $R^{C21}$ | $R^{B3}$ | H |
| $L_{A1477}$ | $R^{C21}$ | $R^{B4}$ | H |
| $L_{A1478}$ | $R^{C21}$ | $R^{B7}$ | H |
| $L_{A1479}$ | $R^{C21}$ | $R^{B12}$ | H |
| $L_{A1480}$ | $R^{C21}$ | $R^{B18}$ | H |
| $L_{A1481}$ | $R^{C21}$ | $R^{A3}$ | H |
| $L_{A1482}$ | $R^{C21}$ | $R^{A34}$ | H |
| $L_{A1483}$ | $R^{C1}$ | $R^{B1}$ | H |
| $L_{A1484}$ | $R^{C1}$ | $R^{B3}$ | H |
| $L_{A1485}$ | $R^{C1}$ | $R^{B4}$ | H |
| $L_{A1486}$ | $R^{C1}$ | $R^{B7}$ | H |
| $L_{A1487}$ | $R^{C1}$ | $R^{B12}$ | H |
| $L_{A1488}$ | $R^{C1}$ | $R^{B18}$ | H |
| $L_{A1489}$ | $R^{C1}$ | $R^{A3}$ | H |
| $L_{A1490}$ | $R^{C1}$ | $R^{A34}$ | H |
| $L_{A1491}$ | $R^{C3}$ | $R^{B1}$ | H |
| $L_{A1492}$ | $R^{C3}$ | $R^{B3}$ | H |
| $L_{A1493}$ | $R^{C3}$ | $R^{B4}$ | H |
| $L_{A1494}$ | $R^{C3}$ | $R^{B7}$ | H |
| $L_{A1495}$ | $R^{C3}$ | $R^{B12}$ | H |
| $L_{A1496}$ | $R^{C3}$ | $R^{B18}$ | H |
| $L_{A1497}$ | $R^{C3}$ | $R^{A3}$ | H |
| $L_{A1498}$ | $R^{C3}$ | $R^{A34}$ | H |
| $L_{A1499}$ | $R^{C5}$ | $R^{B1}$ | H |
| $L_{A1500}$ | $R^{C5}$ | $R^{B3}$ | H |
| $L_{A1501}$ | $R^{C5}$ | $R^{B4}$ | H |
| $L_{A1502}$ | $R^{C5}$ | $R^{B7}$ | H |
| $L_{A1503}$ | $R^{C5}$ | $R^{B12}$ | H |
| $L_{A1504}$ | $R^{C5}$ | $R^{B18}$ | H |
| $L_{A1505}$ | $R^{C5}$ | $R^{A3}$ | H |
| $L_{A1506}$ | $R^{C5}$ | $R^{A34}$ | H |
| $L_{A1507}$ | $R^{C17}$ | $R^{B1}$ | H |
| $L_{A1508}$ | $R^{C17}$ | $R^{B3}$ | H |
| $L_{A1509}$ | $R^{C17}$ | $R^{B4}$ | H |
| $L_{A1510}$ | $R^{C17}$ | $R^{B7}$ | H |
| $L_{A1511}$ | $R^{C17}$ | $R^{B12}$ | H |
| $L_{A1512}$ | $R^{C17}$ | $R^{B18}$ | H |
| $L_{A1513}$ | $R^{C17}$ | $R^{A3}$ | H |
| $L_{A1514}$ | $R^{C17}$ | $R^{A34}$ | H |
| $L_{A1515}$ | $R^{C19}$ | $R^{B1}$ | H |
| $L_{A1516}$ | $R^{C19}$ | $R^{B3}$ | H |
| $L_{A1517}$ | $R^{C19}$ | $R^{B4}$ | H |
| $L_{A1518}$ | $R^{C19}$ | $R^{B7}$ | H |
| $L_{A1519}$ | $R^{C19}$ | $R^{B12}$ | H |
| $L_{A1520}$ | $R^{C19}$ | $R^{B18}$ | H |
| $L_{A1521}$ | $R^{C19}$ | $R^{A3}$ | H |
| $L_{A1522}$ | $R^{C19}$ | $R^{A34}$ | H |
| $L_{A1523}$ | $R^{C21}$ | $R^{B1}$ | H |
| $L_{A1524}$ | $R^{C21}$ | $R^{B3}$ | H |
| $L_{A1525}$ | $R^{C21}$ | $R^{B4}$ | H |
| $L_{A1526}$ | $R^{C21}$ | $R^{B7}$ | H |
| $L_{A1527}$ | $R^{C21}$ | $R^{B12}$ | H |
| $L_{A1528}$ | $R^{C21}$ | $R^{B18}$ | H |
| $L_{A1529}$ | $R^{C21}$ | $R^{A3}$ | H |
| $L_{A1530}$ | $R^{C21}$ | $R^{A34}$ | H |

$L_{A1531}$ through $L_{A1836}$ that are based on a structure of Formula VIII,

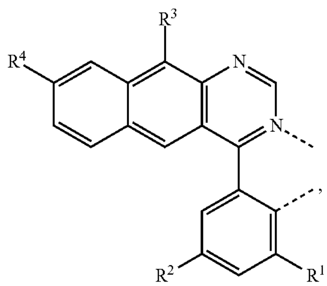

in which $R^1$, $R^2$, $R^3$, and $R^4$ are defined as:

| Ligand | $R^1$ | $R^2$ | $R^3$ | $R^4$ |
|---|---|---|---|---|
| $L_{A1531}$ | $R^{C1}$ | $R^{C1}$ | H | H |
| $L_{A1532}$ | $R^{C1}$ | $R^{C1}$ | $R^{B1}$ | H |
| $L_{A1533}$ | $R^{C1}$ | $R^{C1}$ | $R^{B3}$ | H |
| $L_{A1534}$ | $R^{C1}$ | $R^{C1}$ | $R^{B4}$ | H |
| $L_{A1535}$ | $R^{C1}$ | $R^{C1}$ | $R^{B7}$ | H |
| $L_{A1536}$ | $R^{C1}$ | $R^{C1}$ | $R^{B12}$ | H |
| $L_{A1537}$ | $R^{C1}$ | $R^{C1}$ | $R^{B18}$ | H |
| $L_{A1538}$ | $R^{C1}$ | $R^{C1}$ | $R^{A3}$ | H |
| $L_{A1539}$ | $R^{C1}$ | $R^{C1}$ | $R^{A34}$ | H |
| $L_{A1540}$ | $R^{C3}$ | $R^{C3}$ | H | H |
| $L_{A1541}$ | $R^{C3}$ | $R^{C3}$ | $R^{B1}$ | H |
| $L_{A1542}$ | $R^{C3}$ | $R^{C3}$ | $R^{B3}$ | H |
| $L_{A1543}$ | $R^{C3}$ | $R^{C3}$ | $R^{B4}$ | H |
| $L_{A1544}$ | $R^{C3}$ | $R^{C3}$ | $R^{B7}$ | H |
| $L_{A1545}$ | $R^{C3}$ | $R^{C3}$ | $R^{B12}$ | H |
| $L_{A1546}$ | $R^{C3}$ | $R^{C3}$ | $R^{B18}$ | H |
| $L_{A1547}$ | $R^{C3}$ | $R^{C3}$ | $R^{A3}$ | H |
| $L_{A1548}$ | $R^{C3}$ | $R^{C3}$ | $R^{A34}$ | H |
| $L_{A1549}$ | $R^{C5}$ | $R^{C5}$ | H | H |
| $L_{A1550}$ | $R^{C5}$ | $R^{C5}$ | $R^{B1}$ | H |
| $L_{A1551}$ | $R^{C5}$ | $R^{C5}$ | $R^{B3}$ | H |
| $L_{A1552}$ | $R^{C5}$ | $R^{C5}$ | $R^{B4}$ | H |
| $L_{A1553}$ | $R^{C5}$ | $R^{C5}$ | $R^{B7}$ | H |
| $L_{A1554}$ | $R^{C5}$ | $R^{C5}$ | $R^{B12}$ | H |
| $L_{A1555}$ | $R^{C5}$ | $R^{C5}$ | $R^{B18}$ | H |
| $L_{A1556}$ | $R^{C5}$ | $R^{C5}$ | $R^{A3}$ | H |
| $L_{A1557}$ | $R^{C5}$ | $R^{C5}$ | $R^{A34}$ | H |
| $L_{A1558}$ | $R^{C17}$ | $R^{C17}$ | H | H |
| $L_{A1559}$ | $R^{C17}$ | $R^{C17}$ | $R^{B1}$ | H |
| $L_{A1560}$ | $R^{C17}$ | $R^{C17}$ | $R^{B3}$ | H |
| $L_{A1561}$ | $R^{C17}$ | $R^{C17}$ | $R^{B4}$ | H |
| $L_{A1562}$ | $R^{C17}$ | $R^{C17}$ | $R^{B7}$ | H |
| $L_{A1563}$ | $R^{C17}$ | $R^{C17}$ | $R^{B12}$ | H |
| $L_{A1564}$ | $R^{C17}$ | $R^{C17}$ | $R^{B18}$ | H |
| $L_{A1565}$ | $R^{C17}$ | $R^{C17}$ | $R^{A3}$ | H |
| $L_{A1566}$ | $R^{C17}$ | $R^{C17}$ | $R^{A34}$ | H |
| $L_{A1567}$ | $R^{C19}$ | $R^{C19}$ | H | H |
| $L_{A1568}$ | $R^{C19}$ | $R^{C19}$ | $R^{B1}$ | H |
| $L_{A1569}$ | $R^{C19}$ | $R^{C19}$ | $R^{B3}$ | H |
| $L_{A1570}$ | $R^{C19}$ | $R^{C19}$ | $R^{B4}$ | H |
| $L_{A1571}$ | $R^{C19}$ | $R^{C19}$ | $R^{B7}$ | H |
| $L_{A1572}$ | $R^{C19}$ | $R^{C19}$ | $R^{B12}$ | H |
| $L_{A1573}$ | $R^{C19}$ | $R^{C19}$ | $R^{B18}$ | H |
| $L_{A1574}$ | $R^{C19}$ | $R^{C19}$ | $R^{A3}$ | H |
| $L_{A1575}$ | $R^{C19}$ | $R^{C19}$ | $R^{A34}$ | H |
| $L_{A1576}$ | $R^{C21}$ | $R^{C21}$ | H | H |
| $L_{A1577}$ | $R^{C21}$ | $R^{C21}$ | $R^{B1}$ | H |
| $L_{A1578}$ | $R^{C21}$ | $R^{C21}$ | $R^{B3}$ | H |
| $L_{A1579}$ | $R^{C21}$ | $R^{C21}$ | $R^{B4}$ | H |
| $L_{A1580}$ | $R^{C21}$ | $R^{C21}$ | $R^{B7}$ | H |
| $L_{A1581}$ | $R^{C21}$ | $R^{C21}$ | $R^{B12}$ | H |
| $L_{A1582}$ | $R^{C21}$ | $R^{C21}$ | $R^{B18}$ | H |
| $L_{A1583}$ | $R^{C21}$ | $R^{C21}$ | $R^{A3}$ | H |
| $L_{A1584}$ | $R^{C21}$ | $R^{C21}$ | $R^{A34}$ | H |
| $L_{A1585}$ | $R^{B1}$ | $R^{C1}$ | H | H |
| $L_{A1586}$ | $R^{B1}$ | $R^{C1}$ | $R^{B1}$ | H |
| $L_{A1587}$ | $R^{B1}$ | $R^{C1}$ | $R^{B3}$ | H |

-continued

| Ligand | $R^1$ | $R^2$ | $R^3$ | $R^4$ |
|---|---|---|---|---|
| $L_{A1588}$ | $R^{B1}$ | $R^{C1}$ | $R^{B4}$ | H |
| $L_{A1589}$ | $R^{B1}$ | $R^{C1}$ | $R^{B7}$ | H |
| $L_{A1590}$ | $R^{B1}$ | $R^{C1}$ | $R^{B12}$ | H |
| $L_{A1591}$ | $R^{B1}$ | $R^{C1}$ | $R^{B18}$ | H |
| $L_{A1592}$ | $R^{B1}$ | $R^{C1}$ | $R^{A3}$ | H |
| $L_{A1593}$ | $R^{B1}$ | $R^{C1}$ | $R^{A34}$ | H |
| $L_{A1594}$ | $R^{B1}$ | $R^{C3}$ | H | H |
| $L_{A1595}$ | $R^{B1}$ | $R^{C3}$ | $R^{B1}$ | H |
| $L_{A1596}$ | $R^{B1}$ | $R^{C3}$ | $R^{B3}$ | H |
| $L_{A1597}$ | $R^{B1}$ | $R^{C3}$ | $R^{B4}$ | H |
| $L_{A1598}$ | $R^{B1}$ | $R^{C3}$ | $R^{B7}$ | H |
| $L_{A1599}$ | $R^{B1}$ | $R^{C3}$ | $R^{B12}$ | H |
| $L_{A1600}$ | $R^{B1}$ | $R^{C3}$ | $R^{B18}$ | H |
| $L_{A1601}$ | $R^{B1}$ | $R^{C3}$ | $R^{A}$ | H |
| $L_{A1602}$ | $R^{B1}$ | $R^{C3}$ | $R^{A34}$ | H |
| $L_{A1603}$ | $R^{B1}$ | $R^{C5}$ | H | H |
| $L_{A1604}$ | $R^{B1}$ | $R^{C5}$ | $R^{B1}$ | H |
| $L_{A1605}$ | $R^{B1}$ | $R^{C5}$ | $R^{B3}$ | H |
| $L_{A1606}$ | $R^{B1}$ | $R^{C5}$ | $R^{B4}$ | H |
| $L_{A1607}$ | $R^{B1}$ | $R^{C5}$ | $R^{B7}$ | H |
| $L_{A1608}$ | $R^{B1}$ | $R^{C5}$ | $R^{B12}$ | H |
| $L_{A1609}$ | $R^{B1}$ | $R^{C5}$ | $R^{B18}$ | H |
| $L_{A1610}$ | $R^{B1}$ | $R^{C5}$ | $R^{A3}$ | H |
| $L_{A1611}$ | $R^{B1}$ | $R^{C5}$ | $R^{A34}$ | H |
| $L_{A1612}$ | $R^{B1}$ | $R^{C17}$ | H | H |
| $L_{A1613}$ | $R^{B1}$ | $R^{C17}$ | $R^{B1}$ | H |
| $L_{A1614}$ | $R^{B1}$ | $R^{C17}$ | $R^{B3}$ | H |
| $L_{A1615}$ | $R^{B1}$ | $R^{C17}$ | $R^{B4}$ | H |
| $L_{A1616}$ | $R^{B1}$ | $R^{C17}$ | $R^{B7}$ | H |
| $L_{A1617}$ | $R^{B1}$ | $R^{C17}$ | $R^{B12}$ | H |
| $L_{A1618}$ | $R^{B1}$ | $R^{C17}$ | $R^{B18}$ | H |
| $L_{A1619}$ | $R^{B1}$ | $R^{C17}$ | $R^{A3}$ | H |
| $L_{A1620}$ | $R^{B1}$ | $R^{C17}$ | $R^{A34}$ | H |
| $L_{A1621}$ | $R^{B1}$ | $R^{C19}$ | H | H |
| $L_{A1622}$ | $R^{B1}$ | $R^{C19}$ | $R^{B1}$ | H |
| $L_{A1623}$ | $R^{B1}$ | $R^{C19}$ | $R^{B3}$ | H |
| $L_{A1624}$ | $R^{B1}$ | $R^{C19}$ | $R^{B4}$ | H |
| $L_{A1625}$ | $R^{B1}$ | $R^{C19}$ | $R^{B7}$ | H |
| $L_{A1626}$ | $R^{B1}$ | $R^{C19}$ | $R^{B12}$ | H |
| $L_{A1627}$ | $R^{B1}$ | $R^{C19}$ | $R^{B18}$ | H |
| $L_{A1628}$ | $R^{B1}$ | $R^{C19}$ | $R^{A3}$ | H |
| $L_{A1629}$ | $R^{B1}$ | $R^{C19}$ | $R^{A34}$ | H |
| $L_{A1630}$ | $R^{B1}$ | $R^{C21}$ | H | H |
| $L_{A1631}$ | $R^{B1}$ | $R^{C21}$ | $R^{B1}$ | H |
| $L_{A1632}$ | $R^{B1}$ | $R^{C21}$ | $R^{B3}$ | H |
| $L_{A1633}$ | $R^{B1}$ | $R^{C21}$ | $R^{B4}$ | H |
| $L_{A1634}$ | $R^{B1}$ | $R^{C21}$ | $R^{B7}$ | H |
| $L_{A1635}$ | $R^{B1}$ | $R^{C21}$ | $R^{B12}$ | H |
| $L_{A1636}$ | $R^{B1}$ | $R^{C21}$ | $R^{B18}$ | H |
| $L_{A1637}$ | $R^{B1}$ | $R^{C21}$ | $R^{A3}$ | H |
| $L_{A1638}$ | $R^{B1}$ | $R^{C21}$ | $R^{A34}$ | H |
| $L_{A1639}$ | $R^{B2}$ | $R^{C1}$ | H | H |
| $L_{A1640}$ | $R^{B2}$ | $R^{C1}$ | $R^{B1}$ | H |
| $L_{A1641}$ | $R^{B2}$ | $R^{C1}$ | $R^{B3}$ | H |
| $L_{A1642}$ | $R^{B2}$ | $R^{C1}$ | $R^{B4}$ | H |
| $L_{A1643}$ | $R^{B2}$ | $R^{C1}$ | $R^{B7}$ | H |
| $L_{A1644}$ | $R^{B2}$ | $R^{C1}$ | $R^{B12}$ | H |
| $L_{A1645}$ | $R^{B2}$ | $R^{C1}$ | $R^{B18}$ | H |
| $L_{A1646}$ | $R^{B2}$ | $R^{C1}$ | $R^{A3}$ | H |
| $L_{A1647}$ | $R^{B2}$ | $R^{C1}$ | $R^{A34}$ | H |
| $L_{A1648}$ | $R^{B2}$ | $R^{C3}$ | H | H |
| $L_{A1649}$ | $R^{B2}$ | $R^{C3}$ | $R^{B1}$ | H |
| $L_{A1650}$ | $R^{B2}$ | $R^{C3}$ | $R^{B3}$ | H |
| $L_{A1651}$ | $R^{B2}$ | $R^{C3}$ | $R^{B4}$ | H |
| $L_{A1652}$ | $R^{B2}$ | $R^{C3}$ | $R^{B7}$ | H |
| $L_{A1653}$ | $R^{B2}$ | $R^{C3}$ | $R^{B12}$ | H |
| $L_{A1654}$ | $R^{B2}$ | $R^{C3}$ | $R^{B18}$ | H |
| $L_{A1655}$ | $R^{B2}$ | $R^{C3}$ | $R^{A3}$ | H |
| $L_{A1656}$ | $R^{B2}$ | $R^{C3}$ | $R^{A34}$ | H |
| $L_{A1657}$ | $R^{B2}$ | $R^{C5}$ | H | H |
| $L_{A1658}$ | $R^{B2}$ | $R^{C5}$ | $R^{B1}$ | H |
| $L_{A1659}$ | $R^{B2}$ | $R^{C5}$ | $R^{B3}$ | H |
| $L_{A1660}$ | $R^{B2}$ | $R^{C5}$ | $R^{B4}$ | H |
| $L_{A1661}$ | $R^{B2}$ | $R^{C5}$ | $R^{B7}$ | H |
| $L_{A1662}$ | $R^{B2}$ | $R^{C5}$ | $R^{B12}$ | H |
| $L_{A1663}$ | $R^{B2}$ | $R^{C5}$ | $R^{B18}$ | H |
| $L_{A1664}$ | $R^{B2}$ | $R^{C5}$ | $R^{A3}$ | H |

-continued

| Ligand | $R^1$ | $R^2$ | $R^3$ | $R^4$ |
|---|---|---|---|---|
| $L_{A1665}$ | $R^{B2}$ | $R^{C5}$ | $R^{A34}$ | H |
| $L_{A1666}$ | $R^{B2}$ | $R^{C17}$ | H | H |
| $L_{A1667}$ | $R^{B2}$ | $R^{C17}$ | $R^{B1}$ | H |
| $L_{A1668}$ | $R^{B2}$ | $R^{C17}$ | $R^{B3}$ | H |
| $L_{A1669}$ | $R^{B2}$ | $R^{C17}$ | $R^{B4}$ | H |
| $L_{A1670}$ | $R^{B2}$ | $R^{C17}$ | $R^{B7}$ | H |
| $L_{A1671}$ | $R^{B2}$ | $R^{C17}$ | $R^{B12}$ | H |
| $L_{A1672}$ | $R^{B2}$ | $R^{C17}$ | $R^{B18}$ | H |
| $L_{A1673}$ | $R^{B2}$ | $R^{C17}$ | $R^{A3}$ | H |
| $L_{A1674}$ | $R^{B2}$ | $R^{C17}$ | $R^{A34}$ | H |
| $L_{A1675}$ | $R^{B2}$ | $R^{C19}$ | H | H |
| $L_{A1676}$ | $R^{B2}$ | $R^{C19}$ | $R^{B1}$ | H |
| $L_{A1677}$ | $R^{B2}$ | $R^{C19}$ | $R^{B3}$ | H |
| $L_{A1678}$ | $R^{B2}$ | $R^{C19}$ | $R^{B4}$ | H |
| $L_{A1679}$ | $R^{B2}$ | $R^{C19}$ | $R^{B7}$ | H |
| $L_{A1680}$ | $R^{B2}$ | $R^{C19}$ | $R^{B12}$ | H |
| $L_{A1681}$ | $R^{B2}$ | $R^{C19}$ | $R^{B18}$ | H |
| $L_{A1682}$ | $R^{B2}$ | $R^{C19}$ | $R^{A3}$ | H |
| $L_{A1683}$ | $R^{B2}$ | $R^{C19}$ | $R^{A34}$ | H |
| $L_{A1684}$ | $R^{B2}$ | $R^{C21}$ | H | H |
| $L_{A1685}$ | $R^{B2}$ | $R^{C21}$ | $R^{B1}$ | H |
| $L_{A1686}$ | $R^{B2}$ | $R^{C21}$ | $R^{B3}$ | H |
| $L_{A1687}$ | $R^{B2}$ | $R^{C21}$ | $R^{B4}$ | H |
| $L_{A1688}$ | $R^{B2}$ | $R^{C21}$ | $R^{B7}$ | H |
| $L_{A1689}$ | $R^{B2}$ | $R^{C21}$ | $R^{B12}$ | H |
| $L_{A1690}$ | $R^{B2}$ | $R^{C21}$ | $R^{B18}$ | H |
| $L_{A1691}$ | $R^{B2}$ | $R^{C21}$ | $R^{A3}$ | H |
| $L_{A1692}$ | $R^{B2}$ | $R^{C21}$ | $R^{A34}$ | H |
| $L_{A1693}$ | $R^{C1}$ | $R^{C1}$ | H | $R^{B1}$ |
| $L_{A1694}$ | $R^{C1}$ | $R^{C1}$ | H | $R^{B3}$ |
| $L_{A1695}$ | $R^{C1}$ | $R^{C1}$ | H | $R^{B4}$ |
| $L_{A1696}$ | $R^{C1}$ | $R^{C1}$ | H | $R^{B7}$ |
| $L_{A1697}$ | $R^{C1}$ | $R^{C1}$ | H | $R^{B12}$ |
| $L_{A1698}$ | $R^{C1}$ | $R^{C1}$ | H | $R^{B18}$ |
| $L_{A1699}$ | $R^{C1}$ | $R^{C1}$ | H | $R^{A3}$ |
| $L_{A1700}$ | $R^{C1}$ | $R^{C1}$ | H | $R^{A34}$ |
| $L_{A1701}$ | $R^{C3}$ | $R^{C3}$ | H | $R^{B1}$ |
| $L_{A1702}$ | $R^{C3}$ | $R^{C3}$ | H | $R^{B3}$ |
| $L_{A1703}$ | $R^{C3}$ | $R^{C3}$ | H | $R^{B4}$ |
| $L_{A1704}$ | $R^{C3}$ | $R^{C3}$ | H | $R^{B7}$ |
| $L_{A1705}$ | $R^{C3}$ | $R^{C5}$ | H | $R^{B12}$ |
| $L_{A1706}$ | $R^{C3}$ | $R^{C3}$ | H | $R^{B18}$ |
| $L_{A1707}$ | $R^{C3}$ | $R^{C3}$ | H | $R^{A3}$ |
| $L_{A1708}$ | $R^{C3}$ | $R^{C3}$ | H | $R^{A34}$ |
| $L_{A1709}$ | $R^{C5}$ | $R^{C5}$ | H | $R^{B1}$ |
| $L_{A1710}$ | $R^{C5}$ | $R^{C5}$ | H | $R^{B3}$ |
| $L_{A1711}$ | $R^{C5}$ | $R^{C5}$ | H | $R^{B4}$ |
| $L_{A1712}$ | $R^{C5}$ | $R^{C5}$ | H | $R^{B7}$ |
| $L_{A1713}$ | $R^{C5}$ | $R^{C5}$ | H | $R^{B12}$ |
| $L_{A1714}$ | $R^{C5}$ | $R^{C5}$ | H | $R^{B18}$ |
| $L_{A1715}$ | $R^{C5}$ | $R^{C5}$ | H | $R^{A3}$ |
| $L_{A1716}$ | $R^{C5}$ | $R^{C5}$ | H | $R^{A34}$ |
| $L_{A1717}$ | $R^{C17}$ | $R^{C17}$ | H | $R^{B1}$ |
| $L_{A1718}$ | $R^{C17}$ | $R^{C17}$ | H | $R^{B3}$ |
| $L_{A1719}$ | $R^{C17}$ | $R^{C17}$ | H | $R^{B4}$ |
| $L_{A1720}$ | $R^{C17}$ | $R^{C17}$ | H | $R^{B7}$ |
| $L_{A1721}$ | $R^{C17}$ | $R^{C17}$ | H | $R^{B12}$ |
| $L_{A1722}$ | $R^{C17}$ | $R^{C17}$ | H | $R^{B18}$ |
| $L_{A1723}$ | $R^{C17}$ | $R^{C17}$ | H | $R^{A3}$ |
| $L_{A1724}$ | $R^{C17}$ | $R^{C17}$ | H | $R^{A34}$ |
| $L_{A1725}$ | $R^{C19}$ | $R^{C19}$ | H | $R^{B1}$ |
| $L_{A1726}$ | $R^{C19}$ | $R^{C19}$ | H | $R^{B3}$ |
| $L_{A1727}$ | $R^{C19}$ | $R^{C19}$ | H | $R^{B4}$ |
| $L_{A1728}$ | $R^{C19}$ | $R^{C19}$ | H | $R^{B7}$ |
| $L_{A1729}$ | $R^{C19}$ | $R^{C19}$ | H | $R^{B12}$ |
| $L_{A1730}$ | $R^{C19}$ | $R^{C19}$ | H | $R^{B18}$ |
| $L_{A1731}$ | $R^{C19}$ | $R^{C19}$ | H | $R^{A3}$ |
| $L_{A1732}$ | $R^{C19}$ | $R^{C19}$ | H | $R^{A34}$ |
| $L_{A1733}$ | $R^{C21}$ | $R^{C21}$ | H | $R^{B1}$ |
| $L_{A1734}$ | $R^{C21}$ | $R^{C21}$ | H | $R^{B3}$ |
| $L_{A1735}$ | $R^{C21}$ | $R^{C21}$ | H | $R^{B4}$ |
| $L_{A1736}$ | $R^{C21}$ | $R^{C21}$ | H | $R^{B7}$ |
| $L_{A1737}$ | $R^{C21}$ | $R^{C21}$ | H | $R^{B12}$ |
| $L_{A1738}$ | $R^{C21}$ | $R^{C21}$ | H | $R^{B18}$ |
| $L_{A1739}$ | $R^{C21}$ | $R^{C21}$ | H | $R^{A3}$ |
| $L_{A1740}$ | $R^{C21}$ | $R^{C21}$ | H | $R^{A34}$ |
| $L_{A1741}$ | $R^{B1}$ | $R^{C1}$ | H | $R^{B1}$ |

-continued

| Ligand | $R^1$ | $R^2$ | $R^3$ | $R^4$ |
|---|---|---|---|---|
| $L_{A1742}$ | $R^{B1}$ | $R^{C1}$ | H | $R^{B3}$ |
| $L_{A1743}$ | $R^{B1}$ | $R^{C1}$ | H | $R^{B4}$ |
| $L_{A1744}$ | $R^{B1}$ | $R^{C1}$ | H | $R^{B7}$ |
| $L_{A1745}$ | $R^{B1}$ | $R^{C1}$ | H | $R^{B12}$ |
| $L_{A1746}$ | $R^{B1}$ | $R^{C1}$ | H | $R^{B18}$ |
| $L_{A1747}$ | $R^{B1}$ | $R^{C1}$ | H | $R^{A3}$ |
| $L_{A1748}$ | $R^{B1}$ | $R^{C1}$ | H | $R^{A34}$ |
| $L_{A1749}$ | $R^{B1}$ | $R^{C3}$ | H | $R^{B1}$ |
| $L_{A1750}$ | $R^{B1}$ | $R^{C3}$ | H | $R^{B3}$ |
| $L_{A1751}$ | $R^{B1}$ | $R^{C3}$ | H | $R^{B4}$ |
| $L_{A1752}$ | $R^{B1}$ | $R^{C3}$ | H | $R^{B7}$ |
| $L_{A1753}$ | $R^{B1}$ | $R^{C3}$ | H | $R^{B12}$ |
| $L_{A1754}$ | $R^{B1}$ | $R^{C3}$ | H | $R^{B18}$ |
| $L_{A1755}$ | $R^{B1}$ | $R^{C3}$ | H | $R^{A3}$ |
| $L_{A1756}$ | $R^{B1}$ | $R^{C3}$ | H | $R^{A34}$ |
| $L_{A1757}$ | $R^{B1}$ | $R^{C5}$ | H | $R^{B1}$ |
| $L_{A1758}$ | $R^{B1}$ | $R^{C5}$ | H | $R^{B3}$ |
| $L_{A1759}$ | $R^{B1}$ | $R^{C5}$ | H | $R^{B4}$ |
| $L_{A1760}$ | $R^{B1}$ | $R^{C5}$ | H | $R^{B7}$ |
| $L_{A1761}$ | $R^{B1}$ | $R^{C5}$ | H | $R^{B12}$ |
| $L_{A1762}$ | $R^{B1}$ | $R^{C5}$ | H | $R^{B18}$ |
| $L_{A1763}$ | $R^{B1}$ | $R^{C5}$ | H | $R^{A3}$ |
| $L_{A1764}$ | $R^{B1}$ | $R^{C5}$ | H | $R^{A34}$ |
| $L_{A1765}$ | $R^{B1}$ | $R^{C17}$ | H | $R^{B1}$ |
| $L_{A1766}$ | $R^{B1}$ | $R^{C17}$ | H | $R^{B3}$ |
| $L_{A1767}$ | $R^{B1}$ | $R^{C17}$ | H | $R^{B4}$ |
| $L_{A1768}$ | $R^{B1}$ | $R^{C17}$ | H | $R^{B7}$ |
| $L_{A1769}$ | $R^{B1}$ | $R^{C17}$ | H | $R^{B12}$ |
| $L_{A1770}$ | $R^{B1}$ | $R^{C17}$ | H | $R^{B18}$ |
| $L_{A1771}$ | $R^{B1}$ | $R^{C17}$ | H | $R^{A3}$ |
| $L_{A1772}$ | $R^{B1}$ | $R^{C17}$ | H | $R^{A34}$ |
| $L_{A1773}$ | $R^{B1}$ | $R^{C19}$ | H | $R^{B1}$ |
| $L_{A1774}$ | $R^{B1}$ | $R^{C19}$ | H | $R^{B3}$ |
| $L_{A1775}$ | $R^{B1}$ | $R^{C19}$ | H | $R^{B4}$ |
| $L_{A1776}$ | $R^{B1}$ | $R^{C19}$ | H | $R^{B7}$ |
| $L_{A1777}$ | $R^{B1}$ | $R^{C19}$ | H | $R^{B12}$ |
| $L_{A1778}$ | $R^{B1}$ | $R^{C19}$ | H | $R^{B18}$ |
| $L_{A1779}$ | $R^{B1}$ | $R^{C19}$ | H | $R^{A3}$ |
| $L_{A1780}$ | $R^{B1}$ | $R^{C19}$ | H | $R^{A34}$ |
| $L_{A1781}$ | $R^{B1}$ | $R^{C21}$ | H | $R^{B1}$ |
| $L_{A1782}$ | $R^{B1}$ | $R^{C21}$ | H | $R^{B3}$ |
| $L_{A1783}$ | $R^{B1}$ | $R^{C21}$ | H | $R^{B4}$ |
| $L_{A1784}$ | $R^{B1}$ | $R^{C21}$ | H | $R^{B7}$ |
| $L_{A1785}$ | $R^{B1}$ | $R^{C21}$ | H | $R^{B12}$ |
| $L_{A1786}$ | $R^{B1}$ | $R^{C21}$ | H | $R^{B18}$ |
| $L_{A1787}$ | $R^{B1}$ | $R^{C21}$ | H | $R^{A3}$ |
| $L_{A1788}$ | $R^{B1}$ | $R^{C21}$ | H | $R^{A34}$ |
| $L_{A1789}$ | $R^{B2}$ | $R^{C1}$ | H | $R^{B1}$ |
| $L_{A1790}$ | $R^{B2}$ | $R^{C1}$ | H | $R^{B3}$ |
| $L_{A1791}$ | $R^{B2}$ | $R^{C1}$ | H | $R^{B4}$ |
| $L_{A1792}$ | $R^{B2}$ | $R^{C1}$ | H | $R^{B7}$ |
| $L_{A1793}$ | $R^{B2}$ | $R^{C1}$ | H | $R^{B12}$ |
| $L_{A1794}$ | $R^{B2}$ | $R^{C1}$ | H | $R^{B18}$ |
| $L_{A1795}$ | $R^{B2}$ | $R^{C1}$ | H | $R^{A3}$ |
| $L_{A1796}$ | $R^{B2}$ | $R^{C1}$ | H | $R^{A34}$ |
| $L_{A1797}$ | $R^{B2}$ | $R^{C3}$ | H | $R^{B1}$ |
| $L_{A1798}$ | $R^{B2}$ | $R^{C3}$ | H | $R^{B3}$ |
| $L_{A1799}$ | $R^{B2}$ | $R^{C3}$ | H | $R^{B4}$ |
| $L_{A1800}$ | $R^{B2}$ | $R^{C3}$ | H | $R^{B7}$ |
| $L_{A1801}$ | $R^{B2}$ | $R^{C3}$ | H | $R^{B12}$ |
| $L_{A1802}$ | $R^{B2}$ | $R^{C3}$ | H | $R^{B18}$ |
| $L_{A1803}$ | $R^{B2}$ | $R^{C3}$ | H | $R^{A3}$ |
| $L_{A1804}$ | $R^{B2}$ | $R^{C3}$ | H | $R^{A34}$ |
| $L_{A1805}$ | $R^{B2}$ | $R^{C5}$ | H | $R^{B1}$ |
| $L_{A1806}$ | $R^{B2}$ | $R^{C5}$ | H | $R^{B3}$ |
| $L_{A1807}$ | $R^{B2}$ | $R^{C5}$ | H | $R^{B4}$ |
| $L_{A1808}$ | $R^{B2}$ | $R^{C5}$ | H | $R^{B7}$ |
| $L_{A1809}$ | $R^{B2}$ | $R^{C5}$ | H | $R^{B12}$ |
| $L_{A1810}$ | $R^{B2}$ | $R^{C5}$ | H | $R^{B18}$ |
| $L_{A1811}$ | $R^{B2}$ | $R^{C5}$ | H | $R^{A3}$ |
| $L_{A1812}$ | $R^{B2}$ | $R^{C5}$ | H | $R^{A34}$ |
| $L_{A1813}$ | $R^{B2}$ | $R^{C17}$ | H | $R^{B1}$ |
| $L_{A1814}$ | $R^{B2}$ | $R^{C17}$ | H | $R^{B3}$ |
| $L_{A1815}$ | $R^{B2}$ | $R^{C17}$ | H | $R^{B4}$ |
| $L_{A1816}$ | $R^{B2}$ | $R^{C17}$ | H | $R^{B7}$ |
| $L_{A1817}$ | $R^{B2}$ | $R^{C17}$ | H | $R^{B12}$ |
| $L_{A1818}$ | $R^{B2}$ | $R^{C17}$ | H | $R^{B18}$ |

-continued

| Ligand | $R^1$ | $R^2$ | $R^3$ | $R^4$ |
|---|---|---|---|---|
| $L_{A1819}$ | $R^{B2}$ | $R^{C17}$ | H | $R^{A3}$ |
| $L_{A1820}$ | $R^{B2}$ | $R^{C17}$ | H | $R^{A34}$ |
| $L_{A1821}$ | $R^{B2}$ | $R^{C19}$ | H | $R^{B1}$ |
| $L_{A1822}$ | $R^{B2}$ | $R^{C19}$ | H | $R^{B3}$ |
| $L_{A1823}$ | $R^{B2}$ | $R^{C19}$ | H | $R^{B4}$ |
| $L_{A1824}$ | $R^{B2}$ | $R^{C19}$ | H | $R^{B7}$ |
| $L_{A1825}$ | $R^{B2}$ | $R^{C19}$ | H | $R^{B12}$ |
| $L_{A1826}$ | $R^{B2}$ | $R^{C19}$ | H | $R^{B18}$ |
| $L_{A1827}$ | $R^{B2}$ | $R^{C19}$ | H | $R^{A3}$ |
| $L_{A1828}$ | $R^{B2}$ | $R^{C19}$ | H | $R^{A34}$ |
| $L_{A1829}$ | $R^{B2}$ | $R^{C21}$ | H | $R^{B1}$ |
| $L_{A1830}$ | $R^{B2}$ | $R^{C21}$ | H | $R^{B3}$ |
| $L_{A1831}$ | $R^{B2}$ | $R^{C21}$ | H | $R^{B4}$ |
| $L_{A1832}$ | $R^{B2}$ | $R^{C21}$ | H | $R^{B7}$ |
| $L_{A1833}$ | $R^{B2}$ | $R^{C21}$ | H | $R^{B12}$ |
| $L_{A1834}$ | $R^{B2}$ | $R^{C21}$ | H | $R^{B18}$ |
| $L_{A1835}$ | $R^{B2}$ | $R^{C21}$ | H | $R^{A3}$ |
| $L_{A1836}$ | $R^{B2}$ | $R^{C21}$ | H | $R^{A34}$ |

$L_{A1837}$ through $L_{A1938}$ that are based on a structure of Formula IX,

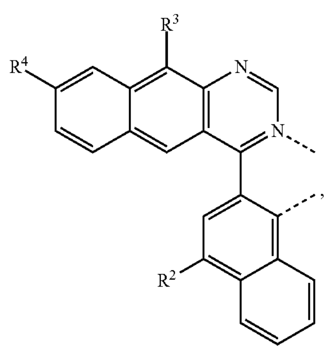

in which $R^1$, $R^2$, $R^3$, and $R^4$ are defined as:

| Ligand | $R^2$ | $R^3$ | $R^4$ |
|---|---|---|---|
| $L_{A1837}$ | $R^{C1}$ | H | H |
| $L_{A1838}$ | $R^{C1}$ | $R^{B1}$ | H |
| $L_{A1839}$ | $R^{C1}$ | $R^{B3}$ | H |
| $L_{A1840}$ | $R^{C1}$ | $R^{B4}$ | H |
| $L_{A1841}$ | $R^{C1}$ | $R^{B7}$ | H |
| $L_{A1842}$ | $R^{C1}$ | $R^{B12}$ | H |
| $L_{A1843}$ | $R^{C1}$ | $R^{B18}$ | H |
| $L_{A1844}$ | $R^{C1}$ | $R^{A3}$ | H |
| $L_{A1845}$ | $R^{C1}$ | $R^{A34}$ | H |
| $L_{A1846}$ | $R^{C3}$ | H | H |
| $L_{A1847}$ | $R^{C3}$ | $R^{B1}$ | H |
| $L_{A1848}$ | $R^{C3}$ | $R^{B3}$ | H |
| $L_{A1849}$ | $R^{C3}$ | $R^{B4}$ | H |
| $L_{A1850}$ | $R^{C3}$ | $R^{B7}$ | H |
| $L_{A1851}$ | $R^{C3}$ | $R^{B12}$ | H |
| $L_{A1852}$ | $R^{C3}$ | $R^{B18}$ | H |
| $L_{A1853}$ | $R^{C3}$ | $R^{A3}$ | H |
| $L_{A1854}$ | $R^{C3}$ | $R^{A34}$ | H |
| $L_{A1855}$ | $R^{C5}$ | H | H |
| $L_{A1856}$ | $R^{C5}$ | $R^{B1}$ | H |
| $L_{A1857}$ | $R^{C5}$ | $R^{B3}$ | H |
| $L_{A1858}$ | $R^{C5}$ | $R^{B4}$ | H |
| $L_{A1859}$ | $R^{C5}$ | $R^{B7}$ | H |
| $L_{A1860}$ | $R^{C5}$ | $R^{B12}$ | H |
| $L_{A1861}$ | $R^{C5}$ | $R^{B18}$ | H |
| $L_{A1862}$ | $R^{C5}$ | $R^{A3}$ | H |
| $L_{A1863}$ | $R^{C5}$ | $R^{A34}$ | H |
| $L_{A1864}$ | $R^{C17}$ | H | H |
| $L_{A1865}$ | $R^{C17}$ | $R^{B1}$ | H |

-continued

| Ligand | $R^2$ | $R^3$ | $R^4$ |
|---|---|---|---|
| $L_{A1866}$ | $R^{C17}$ | $R^{B3}$ | H |
| $L_{A1867}$ | $R^{C17}$ | $R^{B4}$ | H |
| $L_{A1868}$ | $R^{C17}$ | $R^{B7}$ | H |
| $L_{A1869}$ | $R^{C17}$ | $R^{B12}$ | H |
| $L_{A1870}$ | $R^{C17}$ | $R^{B18}$ | H |
| $L_{A1871}$ | $R^{C17}$ | $R^{A3}$ | H |
| $L_{A1872}$ | $R^{C17}$ | $R^{A34}$ | H |
| $L_{A1873}$ | $R^{C19}$ | H | H |
| $L_{A1874}$ | $R^{C19}$ | $R^{B1}$ | H |
| $L_{A1875}$ | $R^{C19}$ | $R^{B3}$ | H |
| $L_{A1876}$ | $R^{C19}$ | $R^{B4}$ | H |
| $L_{A1877}$ | $R^{C19}$ | $R^{B7}$ | H |
| $L_{A1878}$ | $R^{C19}$ | $R^{B12}$ | H |
| $L_{A1879}$ | $R^{C19}$ | $R^{B18}$ | H |
| $L_{A1880}$ | $R^{C19}$ | $R^{A3}$ | H |
| $L_{A1881}$ | $R^{C19}$ | $R^{A34}$ | H |
| $L_{A1882}$ | $R^{C21}$ | H | H |
| $L_{A1883}$ | $R^{C21}$ | $R^{B1}$ | H |
| $L_{A1884}$ | $R^{C21}$ | $R^{B3}$ | H |
| $L_{A1885}$ | $R^{C21}$ | $R^{B4}$ | H |
| $L_{A1886}$ | $R^{C21}$ | $R^{B7}$ | H |
| $L_{A1887}$ | $R^{C21}$ | $R^{B12}$ | H |
| $L_{A1888}$ | $R^{C21}$ | $R^{B18}$ | H |
| $L_{A1889}$ | $R^{C21}$ | $R^{A3}$ | H |
| $L_{A1890}$ | $R^{C21}$ | $R^{A34}$ | H |
| $L_{A1891}$ | $R^{C1}$ | $R^{B1}$ | H |
| $L_{A1892}$ | $R^{C1}$ | $R^{B3}$ | H |
| $L_{A1893}$ | $R^{C1}$ | $R^{B4}$ | H |
| $L_{A1894}$ | $R^{C1}$ | $R^{B7}$ | H |
| $L_{A1895}$ | $R^{C1}$ | $R^{B12}$ | H |
| $L_{A1896}$ | $R^{C1}$ | $R^{B18}$ | H |
| $L_{A1897}$ | $R^{C1}$ | $R^{A3}$ | H |
| $L_{A1898}$ | $R^{C1}$ | $R^{A34}$ | H |
| $L_{A1899}$ | $R^{C3}$ | $R^{B1}$ | H |
| $L_{A1900}$ | $R^{C3}$ | $R^{B3}$ | H |
| $L_{A1901}$ | $R^{C3}$ | $R^{B4}$ | H |
| $L_{A1902}$ | $R^{C3}$ | $R^{B7}$ | H |
| $L_{A1903}$ | $R^{C3}$ | $R^{B12}$ | H |
| $L_{A1904}$ | $R^{C3}$ | $R^{B18}$ | H |
| $L_{A1905}$ | $R^{C3}$ | $R^{A3}$ | H |
| $L_{A1906}$ | $R^{C3}$ | $R^{A34}$ | H |
| $L_{A1907}$ | $R^{C5}$ | $R^{B1}$ | H |
| $L_{A1908}$ | $R^{C5}$ | $R^{B3}$ | H |
| $L_{A1909}$ | $R^{C5}$ | $R^{B4}$ | H |
| $L_{A1910}$ | $R^{C5}$ | $R^{B7}$ | H |
| $L_{A1911}$ | $R^{C5}$ | $R^{B12}$ | H |
| $L_{A1912}$ | $R^{C5}$ | $R^{B18}$ | H |
| $L_{A1913}$ | $R^{C5}$ | $R^{A3}$ | H |
| $L_{A1914}$ | $R^{C5}$ | $R^{A34}$ | H |
| $L_{A1915}$ | $R^{C17}$ | $R^{B1}$ | H |
| $L_{A1916}$ | $R^{C17}$ | $R^{B3}$ | H |
| $L_{A1917}$ | $R^{C17}$ | $R^{B4}$ | H |
| $L_{A1918}$ | $R^{C17}$ | $R^{B7}$ | H |
| $L_{A1919}$ | $R^{C17}$ | $R^{B12}$ | H |
| $L_{A1920}$ | $R^{C17}$ | $R^{B18}$ | H |
| $L_{A1921}$ | $R^{C17}$ | $R^{A3}$ | H |
| $L_{A1922}$ | $R^{C17}$ | $R^{A34}$ | H |
| $L_{A1923}$ | $R^{C19}$ | $R^{B1}$ | H |
| $L_{A1924}$ | $R^{C19}$ | $R^{B3}$ | H |
| $L_{A1925}$ | $R^{C19}$ | $R^{B4}$ | H |
| $L_{A1926}$ | $R^{C19}$ | $R^{B7}$ | H |
| $L_{A1927}$ | $R^{C19}$ | $R^{B12}$ | H |
| $L_{A1928}$ | $R^{C19}$ | $R^{B18}$ | H |
| $L_{A1929}$ | $R^{C19}$ | $R^{A3}$ | H |
| $L_{A1930}$ | $R^{C19}$ | $R^{A34}$ | H |
| $L_{A1931}$ | $R^{C21}$ | $R^{B1}$ | H |
| $L_{A1932}$ | $R^{C21}$ | $R^{B3}$ | H |
| $L_{A1933}$ | $R^{C21}$ | $R^{B4}$ | H |
| $L_{A1934}$ | $R^{C21}$ | $R^{B7}$ | H |
| $L_{A1935}$ | $R^{C21}$ | $R^{B12}$ | H |
| $L_{A1936}$ | $R^{C21}$ | $R^{B18}$ | H |
| $L_{A1937}$ | $R^{C21}$ | $R^{A3}$ | H |
| $L_{A1938}$ | $R^{C21}$ | $R^{A34}$ | H |

$L_{A1969}$ through $L_{A2778}$ that are based on a structure of Formula X,

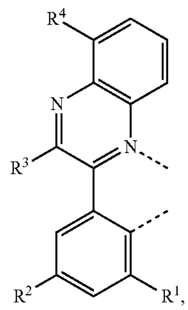

in which $R^1$, $R^2$, $R^3$, and $R^4$ are defined as:

-continued

| Ligand | $R^1$ | $R^2$ | $R^3$ | $R^4$ |
|---|---|---|---|---|
| $L_{A1969}$ | $R^{C1}$ | $R^{C1}$ | $R^{B3}$ | $R^{B3}$ |
| $L_{A1970}$ | $R^{C1}$ | $R^{C1}$ | $R^{B6}$ | $R^{B3}$ |
| $L_{A1971}$ | $R^{C1}$ | $R^{C1}$ | $R^{B7}$ | $R^{B3}$ |
| $L_{A1972}$ | $R^{C1}$ | $R^{C1}$ | $R^{B12}$ | $R^{B3}$ |
| $L_{A1973}$ | $R^{C1}$ | $R^{C1}$ | $R^{B20}$ | $R^{B3}$ |
| $L_{A1974}$ | $R^{C1}$ | $R^{C1}$ | $R^{B25}$ | $R^{B3}$ |
| $L_{A1975}$ | $R^{C1}$ | $R^{C1}$ | $R^{B29}$ | $R^{B3}$ |
| $L_{A1976}$ | $R^{C1}$ | $R^{C1}$ | $R^{A37}$ | $R^{B3}$ |
| $L_{A1977}$ | $R^{C1}$ | $R^{C1}$ | $R^{A43}$ | $R^{B3}$ |
| $L_{A1978}$ | $R^{C1}$ | $R^{C1}$ | $R^{E1}$ | $R^{B3}$ |
| $L_{A1979}$ | $R^{C1}$ | $R^{C1}$ | $R^{E2}$ | $R^{B3}$ |
| $L_{A1980}$ | $R^{C1}$ | $R^{C1}$ | $R^{E3}$ | $R^{B3}$ |
| $L_{A1981}$ | $R^{C1}$ | $R^{C1}$ | $R^{E4}$ | $R^{B3}$ |
| $L_{A1982}$ | $R^{C1}$ | $R^{C1}$ | $R^{E5}$ | $R^{B3}$ |
| $L_{A1983}$ | $R^{C1}$ | $R^{C1}$ | $R^{E6}$ | $R^{B3}$ |
| $L_{A1984}$ | $R^{C1}$ | $R^{C1}$ | $R^{E7}$ | $R^{B3}$ |
| $L_{A1985}$ | $R^{C1}$ | $R^{C1}$ | $R^{E8}$ | $R^{B3}$ |
| $L_{A1986}$ | $R^{C1}$ | $R^{C1}$ | $R^{E9}$ | $R^{B3}$ |
| $L_{A1987}$ | $R^{C1}$ | $R^{C1}$ | $R^{E10}$ | $R^{B3}$ |
| $L_{A1988}$ | $R^{C1}$ | $R^{C1}$ | $R^{E11}$ | $R^{B3}$ |
| $L_{A1989}$ | $R^{C1}$ | $R^{C1}$ | $R^{E12}$ | $R^{B3}$ |
| $L_{A1990}$ | $R^{C1}$ | $R^{C1}$ | $R^{E13}$ | $R^{B3}$ |
| $L_{A1991}$ | $R^{C1}$ | $R^{C1}$ | $R^{E14}$ | $R^{B3}$ |
| $L_{A1992}$ | $R^{C1}$ | $R^{C1}$ | $R^{E15}$ | $R^{B3}$ |
| $L_{A1993}$ | $R^{C1}$ | $R^{C1}$ | $R^{E16}$ | $R^{B3}$ |
| $L_{A1994}$ | $R^{C1}$ | $R^{C1}$ | $R^{E17}$ | $R^{B3}$ |
| $L_{A1995}$ | $R^{C1}$ | $R^{C1}$ | $R^{E18}$ | $R^{B3}$ |
| $L_{A1996}$ | $R^{C1}$ | $R^{C1}$ | $R^{E19}$ | $R^{B3}$ |
| $L_{A1997}$ | $R^{C1}$ | $R^{C1}$ | $R^{E20}$ | $R^{B3}$ |
| $L_{A1998}$ | $R^{C1}$ | $R^{C1}$ | $R^{E21}$ | $R^{B3}$ |
| $L_{A1999}$ | $R^{C1}$ | $R^{C1}$ | $R^{B3}$ | $R^{B4}$ |
| $L_{A2000}$ | $R^{C1}$ | $R^{C1}$ | $R^{B6}$ | $R^{B4}$ |
| $L_{A2001}$ | $R^{C1}$ | $R^{C1}$ | $R^{B7}$ | $R^{B4}$ |
| $L_{A2002}$ | $R^{C1}$ | $R^{C1}$ | $R^{B12}$ | $R^{B4}$ |
| $L_{A2003}$ | $R^{C1}$ | $R^{C1}$ | $R^{B20}$ | $R^{B4}$ |
| $L_{A2004}$ | $R^{C1}$ | $R^{C1}$ | $R^{B25}$ | $R^{B4}$ |
| $L_{A2005}$ | $R^{C1}$ | $R^{C1}$ | $R^{B29}$ | $R^{B4}$ |
| $L_{A2006}$ | $R^{C1}$ | $R^{C1}$ | $R^{A37}$ | $R^{B4}$ |
| $L_{A2007}$ | $R^{C1}$ | $R^{C1}$ | $R^{A43}$ | $R^{B4}$ |
| $L_{A2008}$ | $R^{C1}$ | $R^{C1}$ | $R^{E1}$ | $R^{B4}$ |
| $L_{A2009}$ | $R^{C1}$ | $R^{C1}$ | $R^{E2}$ | $R^{B4}$ |
| $L_{A2010}$ | $R^{C1}$ | $R^{C1}$ | $R^{E3}$ | $R^{B4}$ |
| $L_{A2011}$ | $R^{C1}$ | $R^{C1}$ | $R^{E4}$ | $R^{B4}$ |
| $L_{A2012}$ | $R^{C1}$ | $R^{C1}$ | $R^{E5}$ | $R^{B4}$ |
| $L_{A2013}$ | $R^{C1}$ | $R^{C1}$ | $R^{E6}$ | $R^{B4}$ |
| $L_{A2014}$ | $R^{C1}$ | $R^{C1}$ | $R^{E7}$ | $R^{B4}$ |
| $L_{A2015}$ | $R^{C1}$ | $R^{C1}$ | $R^{E8}$ | $R^{B4}$ |
| $L_{A2016}$ | $R^{C1}$ | $R^{C1}$ | $R^{E9}$ | $R^{B4}$ |
| $L_{A2017}$ | $R^{C1}$ | $R^{C1}$ | $R^{E10}$ | $R^{B4}$ |
| $L_{A2018}$ | $R^{C1}$ | $R^{C1}$ | $R^{E11}$ | $R^{B4}$ |
| $L_{A2019}$ | $R^{C1}$ | $R^{C1}$ | $R^{E12}$ | $R^{B4}$ |
| $L_{A2020}$ | $R^{C1}$ | $R^{C1}$ | $R^{E13}$ | $R^{B4}$ |
| $L_{A2021}$ | $R^{C1}$ | $R^{C1}$ | $R^{E14}$ | $R^{B4}$ |
| $L_{A2022}$ | $R^{C1}$ | $R^{C1}$ | $R^{E15}$ | $R^{B4}$ |
| $L_{A2023}$ | $R^{C1}$ | $R^{C1}$ | $R^{E16}$ | $R^{B4}$ |
| $L_{A2024}$ | $R^{C1}$ | $R^{C1}$ | $R^{E17}$ | $R^{B4}$ |
| $L_{A2025}$ | $R^{C1}$ | $R^{C1}$ | $R^{E18}$ | $R^{B4}$ |
| $L_{A2026}$ | $R^{C1}$ | $R^{C1}$ | $R^{E19}$ | $R^{B4}$ |
| $L_{A2027}$ | $R^{C1}$ | $R^{C1}$ | $R^{E20}$ | $R^{B4}$ |
| $L_{A2028}$ | $R^{C1}$ | $R^{C1}$ | $R^{E21}$ | $R^{B4}$ |
| $L_{A2029}$ | $R^{C1}$ | $R^{C1}$ | $R^{B3}$ | $R^{B18}$ |
| $L_{A2030}$ | $R^{C1}$ | $R^{C1}$ | $R^{B6}$ | $R^{B18}$ |
| $L_{A2031}$ | $R^{C1}$ | $R^{C1}$ | $R^{B7}$ | $R^{B18}$ |
| $L_{A2032}$ | $R^{C1}$ | $R^{C1}$ | $R^{B12}$ | $R^{B18}$ |
| $L_{A2033}$ | $R^{C1}$ | $R^{C1}$ | $R^{B20}$ | $R^{B18}$ |
| $L_{A2034}$ | $R^{C1}$ | $R^{C1}$ | $R^{B25}$ | $R^{B18}$ |
| $L_{A2035}$ | $R^{C1}$ | $R^{C1}$ | $R^{B29}$ | $R^{B18}$ |
| $L_{A2036}$ | $R^{C1}$ | $R^{C1}$ | $R^{A37}$ | $R^{B18}$ |
| $L_{A2037}$ | $R^{C1}$ | $R^{C1}$ | $R^{A43}$ | $R^{B18}$ |
| $L_{A2038}$ | $R^{C1}$ | $R^{C1}$ | $R^{E1}$ | $R^{B18}$ |
| $L_{A2039}$ | $R^{C1}$ | $R^{C1}$ | $R^{E2}$ | $R^{B18}$ |
| $L_{A2040}$ | $R^{C1}$ | $R^{C1}$ | $R^{E3}$ | $R^{B18}$ |
| $L_{A2041}$ | $R^{C1}$ | $R^{C1}$ | $R^{E4}$ | $R^{B18}$ |
| $L_{A2042}$ | $R^{C1}$ | $R^{C1}$ | $R^{E5}$ | $R^{B18}$ |
| $L_{A2043}$ | $R^{C1}$ | $R^{C1}$ | $R^{E6}$ | $R^{B18}$ |
| $L_{A2044}$ | $R^{C1}$ | $R^{C1}$ | $R^{E7}$ | $R^{B18}$ |
| $L_{A2045}$ | $R^{C1}$ | $R^{C1}$ | $R^{E8}$ | $R^{B18}$ |
| $L_{A2046}$ | $R^{C1}$ | $R^{C1}$ | $R^{E9}$ | $R^{B18}$ |
| $L_{A2047}$ | $R^{C1}$ | $R^{C1}$ | $R^{E10}$ | $R^{B18}$ |
| $L_{A2048}$ | $R^{C1}$ | $R^{C1}$ | $R^{E11}$ | $R^{B18}$ |
| $L_{A2049}$ | $R^{C1}$ | $R^{C1}$ | $R^{E12}$ | $R^{B18}$ |
| $L_{A2050}$ | $R^{C1}$ | $R^{C1}$ | $R^{E13}$ | $R^{B18}$ |
| $L_{A2051}$ | $R^{C1}$ | $R^{C1}$ | $R^{E14}$ | $R^{B18}$ |
| $L_{A2052}$ | $R^{C1}$ | $R^{C1}$ | $R^{E15}$ | $R^{B18}$ |
| $L_{A2053}$ | $R^{C1}$ | $R^{C1}$ | $R^{E16}$ | $R^{B18}$ |
| $L_{A2054}$ | $R^{C1}$ | $R^{C1}$ | $R^{E17}$ | $R^{B18}$ |
| $L_{A2055}$ | $R^{C1}$ | $R^{C1}$ | $R^{E18}$ | $R^{B18}$ |
| $L_{A2056}$ | $R^{C1}$ | $R^{C1}$ | $R^{E19}$ | $R^{B18}$ |
| $L_{A2057}$ | $R^{C1}$ | $R^{C1}$ | $R^{E20}$ | $R^{B18}$ |
| $L_{A2058}$ | $R^{C1}$ | $R^{C1}$ | $R^{E21}$ | $R^{B18}$ |
| $L_{A2059}$ | $R^{C1}$ | $R^{C1}$ | $R^{B3}$ | $R^{A3}$ |
| $L_{A2060}$ | $R^{C1}$ | $R^{C1}$ | $R^{B6}$ | $R^{A3}$ |
| $L_{A2061}$ | $R^{C1}$ | $R^{C1}$ | $R^{B7}$ | $R^{A3}$ |
| $L_{A2062}$ | $R^{C1}$ | $R^{C1}$ | $R^{B12}$ | $R^{A3}$ |
| $L_{A2063}$ | $R^{C1}$ | $R^{C1}$ | $R^{B20}$ | $R^{A3}$ |
| $L_{A2064}$ | $R^{C1}$ | $R^{C1}$ | $R^{B25}$ | $R^{A3}$ |
| $L_{A2065}$ | $R^{C1}$ | $R^{C1}$ | $R^{B29}$ | $R^{A3}$ |
| $L_{A2066}$ | $R^{C1}$ | $R^{C1}$ | $R^{A37}$ | $R^{A3}$ |
| $L_{A2067}$ | $R^{C1}$ | $R^{C1}$ | $R^{A43}$ | $R^{A3}$ |
| $L_{A2068}$ | $R^{C1}$ | $R^{C1}$ | $R^{E1}$ | $R^{A3}$ |
| $L_{A2069}$ | $R^{C1}$ | $R^{C1}$ | $R^{E2}$ | $R^{A3}$ |
| $L_{A2070}$ | $R^{C1}$ | $R^{C1}$ | $R^{E3}$ | $R^{A3}$ |
| $L_{A2071}$ | $R^{C1}$ | $R^{C1}$ | $R^{E4}$ | $R^{A3}$ |
| $L_{A2072}$ | $R^{C1}$ | $R^{C1}$ | $R^{E8}$ | $R^{A3}$ |
| $L_{A2073}$ | $R^{C1}$ | $R^{C1}$ | $R^{E6}$ | $R^{A3}$ |
| $L_{A2074}$ | $R^{C1}$ | $R^{C1}$ | $R^{E7}$ | $R^{A3}$ |
| $L_{A2075}$ | $R^{C1}$ | $R^{C1}$ | $R^{E8}$ | $R^{A3}$ |
| $L_{A2076}$ | $R^{C1}$ | $R^{C1}$ | $R^{E9}$ | $R^{A3}$ |
| $L_{A2077}$ | $R^{C1}$ | $R^{C1}$ | $R^{E10}$ | $R^{A3}$ |
| $L_{A2078}$ | $R^{C1}$ | $R^{C1}$ | $R^{E11}$ | $R^{A3}$ |
| $L_{A2079}$ | $R^{C1}$ | $R^{C1}$ | $R^{E12}$ | $R^{A3}$ |
| $L_{A2080}$ | $R^{C1}$ | $R^{C1}$ | $R^{E13}$ | $R^{A3}$ |
| $L_{A2081}$ | $R^{C1}$ | $R^{C1}$ | $R^{E14}$ | $R^{A3}$ |
| $L_{A2082}$ | $R^{C1}$ | $R^{C1}$ | $R^{E15}$ | $R^{A3}$ |
| $L_{A2083}$ | $R^{C1}$ | $R^{C1}$ | $R^{E16}$ | $R^{A3}$ |
| $L_{A2084}$ | $R^{C1}$ | $R^{C1}$ | $R^{E17}$ | $R^{A3}$ |
| $L_{A2085}$ | $R^{C1}$ | $R^{C1}$ | $R^{E18}$ | $R^{A3}$ |
| $L_{A2086}$ | $R^{C1}$ | $R^{C1}$ | $R^{E19}$ | $R^{A3}$ |
| $L_{A2087}$ | $R^{C1}$ | $R^{C1}$ | $R^{E20}$ | $R^{A3}$ |
| $L_{A2088}$ | $R^{C1}$ | $R^{C1}$ | $R^{E21}$ | $R^{A3}$ |
| $L_{A2089}$ | $R^{C1}$ | $R^{C1}$ | $R^{B3}$ | $R^{A34}$ |
| $L_{A2090}$ | $R^{C1}$ | $R^{C1}$ | $R^{B6}$ | $R^{A34}$ |
| $L_{A2091}$ | $R^{C1}$ | $R^{C1}$ | $R^{B7}$ | $R^{A34}$ |
| $L_{A2092}$ | $R^{C1}$ | $R^{C1}$ | $R^{B12}$ | $R^{A34}$ |
| $L_{A2093}$ | $R^{C1}$ | $R^{C1}$ | $R^{B20}$ | $R^{A34}$ |
| $L_{A2094}$ | $R^{C1}$ | $R^{C1}$ | $R^{B25}$ | $R^{A34}$ |
| $L_{A2095}$ | $R^{C1}$ | $R^{C1}$ | $R^{B29}$ | $R^{A34}$ |
| $L_{A2096}$ | $R^{C1}$ | $R^{C1}$ | $R^{A37}$ | $R^{A34}$ |
| $L_{A2097}$ | $R^{C1}$ | $R^{C1}$ | $R^{A43}$ | $R^{A34}$ |
| $L_{A2098}$ | $R^{C1}$ | $R^{C1}$ | $R^{E1}$ | $R^{A34}$ |
| $L_{A2099}$ | $R^{C1}$ | $R^{C1}$ | $R^{E2}$ | $R^{A34}$ |
| $L_{A2100}$ | $R^{C1}$ | $R^{C1}$ | $R^{E3}$ | $R^{A34}$ |
| $L_{A2101}$ | $R^{C1}$ | $R^{C1}$ | $R^{E4}$ | $R^{A34}$ |
| $L_{A2102}$ | $R^{C1}$ | $R^{C1}$ | $R^{E5}$ | $R^{A34}$ |
| $L_{A2103}$ | $R^{C1}$ | $R^{C1}$ | $R^{E6}$ | $R^{A34}$ |
| $L_{A2104}$ | $R^{C1}$ | $R^{C1}$ | $R^{E7}$ | $R^{A34}$ |

-continued

| Ligand | $R^1$ | $R^2$ | $R^3$ | $R^4$ |
|---|---|---|---|---|
| $L_{A2105}$ | $R^{C1}$ | $R^{C1}$ | $R^{E8}$ | $R^{A34}$ |
| $L_{A2106}$ | $R^{C1}$ | $R^{C1}$ | $R^{E9}$ | $R^{A34}$ |
| $L_{A2107}$ | $R^{C1}$ | $R^{C1}$ | $R^{E10}$ | $R^{A34}$ |
| $L_{A2108}$ | $R^{C1}$ | $R^{C1}$ | $R^{E11}$ | $R^{A34}$ |
| $L_{A2109}$ | $R^{C1}$ | $R^{C1}$ | $R^{E12}$ | $R^{A34}$ |
| $L_{A2110}$ | $R^{C1}$ | $R^{C1}$ | $R^{E13}$ | $R^{A34}$ |
| $L_{A2111}$ | $R^{C1}$ | $R^{C1}$ | $R^{E14}$ | $R^{A34}$ |
| $L_{A2112}$ | $R^{C1}$ | $R^{C1}$ | $R^{E15}$ | $R^{A34}$ |
| $L_{A2113}$ | $R^{C1}$ | $R^{C1}$ | $R^{E16}$ | $R^{A34}$ |
| $L_{A2114}$ | $R^{C1}$ | $R^{C1}$ | $R^{E17}$ | $R^{A34}$ |
| $L_{A2115}$ | $R^{C1}$ | $R^{C1}$ | $R^{E18}$ | $R^{A34}$ |
| $L_{A2116}$ | $R^{C1}$ | $R^{C1}$ | $R^{E19}$ | $R^{A34}$ |
| $L_{A2117}$ | $R^{C1}$ | $R^{C1}$ | $R^{E20}$ | $R^{A34}$ |
| $L_{A2118}$ | $R^{C1}$ | $R^{C1}$ | $R^{E21}$ | $R^{A34}$ |
| $L_{A2119}$ | $R^{C1}$ | $R^{C1}$ | $R^{B3}$ | $R^{A52}$ |
| $L_{A2120}$ | $R^{C1}$ | $R^{C1}$ | $R^{B6}$ | $R^{A52}$ |
| $L_{A2121}$ | $R^{C1}$ | $R^{C1}$ | $R^{B7}$ | $R^{A52}$ |
| $L_{A2122}$ | $R^{C1}$ | $R^{C1}$ | $R^{B12}$ | $R^{A52}$ |
| $L_{A2123}$ | $R^{C1}$ | $R^{C1}$ | $R^{B20}$ | $R^{A52}$ |
| $L_{A2124}$ | $R^{C1}$ | $R^{C1}$ | $R^{B25}$ | $R^{A52}$ |
| $L_{A2125}$ | $R^{C1}$ | $R^{C1}$ | $R^{B29}$ | $R^{A52}$ |
| $L_{A2126}$ | $R^{C1}$ | $R^{C1}$ | $R^{A37}$ | $R^{A52}$ |
| $L_{A2127}$ | $R^{C1}$ | $R^{C1}$ | $R^{A43}$ | $R^{A52}$ |
| $L_{A2128}$ | $R^{C1}$ | $R^{C1}$ | $R^{E1}$ | $R^{A52}$ |
| $L_{A2129}$ | $R^{C1}$ | $R^{C1}$ | $R^{E2}$ | $R^{A52}$ |
| $L_{A2130}$ | $R^{C1}$ | $R^{C1}$ | $R^{E3}$ | $R^{A52}$ |
| $L_{A2131}$ | $R^{C1}$ | $R^{C1}$ | $R^{E4}$ | $R^{A52}$ |
| $L_{A2132}$ | $R^{C1}$ | $R^{C1}$ | $R^{E5}$ | $R^{A52}$ |
| $L_{A2133}$ | $R^{C1}$ | $R^{C1}$ | $R^{E6}$ | $R^{A52}$ |
| $L_{A2134}$ | $R^{C1}$ | $R^{C1}$ | $R^{E7}$ | $R^{A52}$ |
| $L_{A2135}$ | $R^{C1}$ | $R^{C1}$ | $R^{E8}$ | $R^{A52}$ |
| $L_{A2136}$ | $R^{C1}$ | $R^{C1}$ | $R^{E9}$ | $R^{A52}$ |
| $L_{A2137}$ | $R^{C1}$ | $R^{C1}$ | $R^{E10}$ | $R^{A52}$ |
| $L_{A2138}$ | $R^{C1}$ | $R^{C1}$ | $R^{E11}$ | $R^{A52}$ |
| $L_{A2139}$ | $R^{C1}$ | $R^{C1}$ | $R^{E12}$ | $R^{A52}$ |
| $L_{A2140}$ | $R^{C1}$ | $R^{C1}$ | $R^{E13}$ | $R^{A52}$ |
| $L_{A2141}$ | $R^{C1}$ | $R^{C1}$ | $R^{E14}$ | $R^{A52}$ |
| $L_{A2142}$ | $R^{C1}$ | $R^{C1}$ | $R^{E15}$ | $R^{A52}$ |
| $L_{A2143}$ | $R^{C1}$ | $R^{C1}$ | $R^{E16}$ | $R^{A52}$ |
| $L_{A2144}$ | $R^{C1}$ | $R^{C1}$ | $R^{E17}$ | $R^{A52}$ |
| $L_{A2145}$ | $R^{C1}$ | $R^{C1}$ | $R^{E18}$ | $R^{A52}$ |
| $L_{A2146}$ | $R^{C1}$ | $R^{C1}$ | $R^{E19}$ | $R^{A52}$ |
| $L_{A2147}$ | $R^{C1}$ | $R^{C1}$ | $R^{E20}$ | $R^{A52}$ |
| $L_{A2148}$ | $R^{C1}$ | $R^{C1}$ | $R^{E21}$ | $R^{A52}$ |
| $L_{A2149}$ | $R^{B1}$ | $R^{C3}$ | $R^{B3}$ | H |
| $L_{A2150}$ | $R^{B1}$ | $R^{C3}$ | $R^{B6}$ | H |
| $L_{A2151}$ | $R^{B1}$ | $R^{C5}$ | $R^{B7}$ | H |
| $L_{A2152}$ | $R^{B1}$ | $R^{C3}$ | $R^{B12}$ | H |
| $L_{A2153}$ | $R^{B1}$ | $R^{C3}$ | $R^{B20}$ | H |
| $L_{A2154}$ | $R^{B1}$ | $R^{C3}$ | $R^{B25}$ | H |
| $L_{A2155}$ | $R^{B1}$ | $R^{C3}$ | $R^{B29}$ | H |
| $L_{A2156}$ | $R^{B1}$ | $R^{C3}$ | $R^{A37}$ | H |
| $L_{A2157}$ | $R^{B1}$ | $R^{C3}$ | $R^{A43}$ | H |
| $L_{A2158}$ | $R^{B1}$ | $R^{C3}$ | $R^{E1}$ | H |
| $L_{A2159}$ | $R^{B1}$ | $R^{C3}$ | $R^{E2}$ | H |
| $L_{A2160}$ | $R^{B1}$ | $R^{C3}$ | $R^{E3}$ | H |
| $L_{A2161}$ | $R^{B1}$ | $R^{C3}$ | $R^{E4}$ | H |
| $L_{A2162}$ | $R^{B1}$ | $R^{C3}$ | $R^{E5}$ | H |
| $L_{A2163}$ | $R^{B1}$ | $R^{C3}$ | $R^{E6}$ | H |
| $L_{A2164}$ | $R^{B1}$ | $R^{C3}$ | $R^{E7}$ | H |
| $L_{A2165}$ | $R^{B1}$ | $R^{C3}$ | $R^{E8}$ | H |
| $L_{A2166}$ | $R^{B1}$ | $R^{C3}$ | $R^{E9}$ | H |
| $L_{A2167}$ | $R^{B1}$ | $R^{C3}$ | $R^{E10}$ | H |
| $L_{A2168}$ | $R^{B1}$ | $R^{C3}$ | $R^{E11}$ | H |
| $L_{A2169}$ | $R^{B1}$ | $R^{C3}$ | $R^{E12}$ | H |
| $L_{A2170}$ | $R^{B1}$ | $R^{C3}$ | $R^{E13}$ | H |
| $L_{A2171}$ | $R^{B1}$ | $R^{C3}$ | $R^{E14}$ | H |
| $L_{A2172}$ | $R^{B1}$ | $R^{C3}$ | $R^{E15}$ | H |
| $L_{A2173}$ | $R^{B1}$ | $R^{C3}$ | $R^{E16}$ | H |
| $L_{A2174}$ | $R^{B1}$ | $R^{C3}$ | $R^{E17}$ | H |
| $L_{A2175}$ | $R^{B1}$ | $R^{C3}$ | $R^{E18}$ | H |
| $L_{A2176}$ | $R^{B1}$ | $R^{C3}$ | $R^{E19}$ | H |
| $L_{A2177}$ | $R^{B1}$ | $R^{C3}$ | $R^{E20}$ | H |
| $L_{A2178}$ | $R^{B1}$ | $R^{C3}$ | $R^{E21}$ | H |
| $L_{A2179}$ | $R^{B1}$ | $R^{C3}$ | $R^{B3}$ | $R^{B3}$ |
| $L_{A2180}$ | $R^{B1}$ | $R^{C3}$ | $R^{B6}$ | $R^{B3}$ |
| $L_{A2181}$ | $R^{B1}$ | $R^{C3}$ | $R^{B7}$ | $R^{B3}$ |

-continued

| Ligand | $R^1$ | $R^2$ | $R^3$ | $R^4$ |
|---|---|---|---|---|
| $L_{A2182}$ | $R^{B1}$ | $R^{C3}$ | $R^{B12}$ | $R^{B3}$ |
| $L_{A2183}$ | $R^{B1}$ | $R^{C3}$ | $R^{B20}$ | $R^{B3}$ |
| $L_{A2184}$ | $R^{B1}$ | $R^{C3}$ | $R^{B25}$ | $R^{B3}$ |
| $L_{A2185}$ | $R^{B1}$ | $R^{C3}$ | $R^{B29}$ | $R^{B3}$ |
| $L_{A2186}$ | $R^{B1}$ | $R^{C3}$ | $R^{A37}$ | $R^{B3}$ |
| $L_{A2187}$ | $R^{B1}$ | $R^{C3}$ | $R^{A43}$ | $R^{B3}$ |
| $L_{A2188}$ | $R^{B1}$ | $R^{C3}$ | $R^{E1}$ | $R^{B3}$ |
| $L_{A2189}$ | $R^{B1}$ | $R^{C3}$ | $R^{E2}$ | $R^{B3}$ |
| $L_{A2190}$ | $R^{B1}$ | $R^{C3}$ | $R^{E3}$ | $R^{B3}$ |
| $L_{A2191}$ | $R^{B1}$ | $R^{C3}$ | $R^{E4}$ | $R^{B3}$ |
| $L_{A2192}$ | $R^{B1}$ | $R^{C3}$ | $R^{E5}$ | $R^{B3}$ |
| $L_{A2193}$ | $R^{B1}$ | $R^{C3}$ | $R^{E6}$ | $R^{B3}$ |
| $L_{A2194}$ | $R^{B1}$ | $R^{C3}$ | $R^{E7}$ | $R^{B3}$ |
| $L_{A2195}$ | $R^{B1}$ | $R^{C3}$ | $R^{E8}$ | $R^{B3}$ |
| $L_{A2196}$ | $R^{B1}$ | $R^{C3}$ | $R^{E9}$ | $R^{B3}$ |
| $L_{A2197}$ | $R^{B1}$ | $R^{C3}$ | $R^{E10}$ | $R^{B3}$ |
| $L_{A2198}$ | $R^{B1}$ | $R^{C3}$ | $R^{E11}$ | $R^{B3}$ |
| $L_{A2199}$ | $R^{B1}$ | $R^{C3}$ | $R^{E12}$ | $R^{B3}$ |
| $L_{A2200}$ | $R^{B1}$ | $R^{C3}$ | $R^{E13}$ | $R^{B3}$ |
| $L_{A2201}$ | $R^{B1}$ | $R^{C3}$ | $R^{E14}$ | $R^{B3}$ |
| $L_{A2202}$ | $R^{B1}$ | $R^{C3}$ | $R^{E15}$ | $R^{B3}$ |
| $L_{A2203}$ | $R^{B1}$ | $R^{C3}$ | $R^{E16}$ | $R^{B3}$ |
| $L_{A2204}$ | $R^{B1}$ | $R^{C3}$ | $R^{E17}$ | $R^{B3}$ |
| $L_{A2205}$ | $R^{B1}$ | $R^{C3}$ | $R^{E18}$ | $R^{B3}$ |
| $L_{A2206}$ | $R^{B1}$ | $R^{C3}$ | $R^{E19}$ | $R^{B3}$ |
| $L_{A2207}$ | $R^{B1}$ | $R^{C3}$ | $R^{E20}$ | $R^{B3}$ |
| $L_{A2208}$ | $R^{B1}$ | $R^{C3}$ | $R^{E21}$ | $R^{B3}$ |
| $L_{A2209}$ | $R^{B1}$ | $R^{C3}$ | $R^{B3}$ | $R^{B4}$ |
| $L_{A2210}$ | $R^{B1}$ | $R^{C3}$ | $R^{B6}$ | $R^{B4}$ |
| $L_{A2211}$ | $R^{B1}$ | $R^{C3}$ | $R^{B7}$ | $R^{B4}$ |
| $L_{A2212}$ | $R^{B1}$ | $R^{C3}$ | $R^{B12}$ | $R^{B4}$ |
| $L_{A2213}$ | $R^{B1}$ | $R^{C3}$ | $R^{B20}$ | $R^{B4}$ |
| $L_{A2214}$ | $R^{B1}$ | $R^{C3}$ | $R^{B25}$ | $R^{B4}$ |
| $L_{A2215}$ | $R^{B1}$ | $R^{C3}$ | $R^{B29}$ | $R^{B4}$ |
| $L_{A2216}$ | $R^{B1}$ | $R^{C3}$ | $R^{A37}$ | $R^{B4}$ |
| $L_{A2217}$ | $R^{B1}$ | $R^{C3}$ | $R^{A43}$ | $R^{B4}$ |
| $L_{A2218}$ | $R^{B1}$ | $R^{C3}$ | $R^{E1}$ | $R^{B4}$ |
| $L_{A2219}$ | $R^{B1}$ | $R^{C3}$ | $R^{E2}$ | $R^{B4}$ |
| $L_{A2220}$ | $R^{B1}$ | $R^{C3}$ | $R^{E3}$ | $R^{B4}$ |
| $L_{A2221}$ | $R^{B1}$ | $R^{C3}$ | $R^{E4}$ | $R^{B4}$ |
| $L_{A2222}$ | $R^{B1}$ | $R^{C3}$ | $R^{E5}$ | $R^{B4}$ |
| $L_{A2223}$ | $R^{B1}$ | $R^{C3}$ | $R^{E6}$ | $R^{B4}$ |
| $L_{A2224}$ | $R^{B1}$ | $R^{C3}$ | $R^{E7}$ | $R^{B4}$ |
| $L_{A2225}$ | $R^{B1}$ | $R^{C3}$ | $R^{E8}$ | $R^{B4}$ |
| $L_{A2226}$ | $R^{B1}$ | $R^{C3}$ | $R^{E9}$ | $R^{B4}$ |
| $L_{A2227}$ | $R^{B1}$ | $R^{C3}$ | $R^{E10}$ | $R^{B4}$ |
| $L_{A2228}$ | $R^{B1}$ | $R^{C3}$ | $R^{E11}$ | $R^{B4}$ |
| $L_{A2229}$ | $R^{B1}$ | $R^{C3}$ | $R^{E12}$ | $R^{B4}$ |
| $L_{A2230}$ | $R^{B1}$ | $R^{C3}$ | $R^{E13}$ | $R^{B4}$ |
| $L_{A2231}$ | $R^{B1}$ | $R^{C3}$ | $R^{E14}$ | $R^{B4}$ |
| $L_{A2232}$ | $R^{B1}$ | $R^{C3}$ | $R^{E15}$ | $R^{B4}$ |
| $L_{A2233}$ | $R^{B1}$ | $R^{C3}$ | $R^{E16}$ | $R^{B4}$ |
| $L_{A2234}$ | $R^{B1}$ | $R^{C3}$ | $R^{E17}$ | $R^{B4}$ |
| $L_{A2235}$ | $R^{B1}$ | $R^{C3}$ | $R^{E18}$ | $R^{B4}$ |
| $L_{A2236}$ | $R^{B1}$ | $R^{C3}$ | $R^{E19}$ | $R^{B4}$ |
| $L_{A2237}$ | $R^{B1}$ | $R^{C3}$ | $R^{E20}$ | $R^{B4}$ |
| $L_{A2238}$ | $R^{B1}$ | $R^{C3}$ | $R^{E21}$ | $R^{B4}$ |
| $L_{A2239}$ | $R^{B1}$ | $R^{C3}$ | $R^{B3}$ | $R^{B18}$ |
| $L_{A2240}$ | $R^{B1}$ | $R^{C3}$ | $R^{B6}$ | $R^{B18}$ |
| $L_{A2241}$ | $R^{B1}$ | $R^{C3}$ | $R^{B7}$ | $R^{B18}$ |
| $L_{A2242}$ | $R^{B1}$ | $R^{C3}$ | $R^{B12}$ | $R^{B18}$ |
| $L_{A2243}$ | $R^{B1}$ | $R^{C3}$ | $R^{B20}$ | $R^{B18}$ |
| $L_{A2244}$ | $R^{B1}$ | $R^{C3}$ | $R^{B25}$ | $R^{B18}$ |
| $L_{A2245}$ | $R^{B1}$ | $R^{C3}$ | $R^{B29}$ | $R^{B18}$ |
| $L_{A2246}$ | $R^{B1}$ | $R^{C3}$ | $R^{A37}$ | $R^{B18}$ |
| $L_{A2247}$ | $R^{B1}$ | $R^{C3}$ | $R^{A43}$ | $R^{B18}$ |
| $L_{A2248}$ | $R^{B1}$ | $R^{C3}$ | $R^{E1}$ | $R^{B18}$ |
| $L_{A2249}$ | $R^{B1}$ | $R^{C3}$ | $R^{E2}$ | $R^{B18}$ |
| $L_{A2250}$ | $R^{B1}$ | $R^{C3}$ | $R^{E3}$ | $R^{B18}$ |
| $L_{A2251}$ | $R^{B1}$ | $R^{C3}$ | $R^{E4}$ | $R^{B18}$ |
| $L_{A2252}$ | $R^{B1}$ | $R^{C3}$ | $R^{E5}$ | $R^{B18}$ |
| $L_{A2253}$ | $R^{B1}$ | $R^{C3}$ | $R^{E6}$ | $R^{B18}$ |
| $L_{A2254}$ | $R^{B1}$ | $R^{C3}$ | $R^{E7}$ | $R^{B18}$ |
| $L_{A2255}$ | $R^{B1}$ | $R^{C3}$ | $R^{E8}$ | $R^{B18}$ |
| $L_{A2256}$ | $R^{B1}$ | $R^{C3}$ | $R^{E9}$ | $R^{B18}$ |
| $L_{A2257}$ | $R^{B1}$ | $R^{C3}$ | $R^{E10}$ | $R^{B18}$ |
| $L_{A2258}$ | $R^{B1}$ | $R^{C3}$ | $R^{E11}$ | $R^{B18}$ |

-continued

| Ligand | $R^1$ | $R^2$ | $R^3$ | $R^4$ |
|---|---|---|---|---|
| $L_{A2259}$ | $R^{B1}$ | $R^{C3}$ | $R^{E12}$ | $R^{B18}$ |
| $L_{A2260}$ | $R^{B1}$ | $R^{C3}$ | $R^{E13}$ | $R^{B18}$ |
| $L_{A2261}$ | $R^{B1}$ | $R^{C3}$ | $R^{E14}$ | $R^{B18}$ |
| $L_{A2262}$ | $R^{B1}$ | $R^{C3}$ | $R^{E15}$ | $R^{B18}$ |
| $L_{A2263}$ | $R^{B1}$ | $R^{C3}$ | $R^{E16}$ | $R^{B18}$ |
| $L_{A2264}$ | $R^{B1}$ | $R^{C3}$ | $R^{E17}$ | $R^{B18}$ |
| $L_{A2265}$ | $R^{B1}$ | $R^{C3}$ | $R^{E18}$ | $R^{B18}$ |
| $L_{A2266}$ | $R^{B1}$ | $R^{C3}$ | $R^{E19}$ | $R^{B18}$ |
| $L_{A2267}$ | $R^{B1}$ | $R^{C3}$ | $R^{E20}$ | $R^{B18}$ |
| $L_{A2268}$ | $R^{B1}$ | $R^{C3}$ | $R^{E21}$ | $R^{B18}$ |
| $L_{A2269}$ | $R^{B1}$ | $R^{C3}$ | $R^{B3}$ | $R^{A3}$ |
| $L_{A2270}$ | $R^{B1}$ | $R^{C3}$ | $R^{B6}$ | $R^{A3}$ |
| $L_{A2271}$ | $R^{B1}$ | $R^{C3}$ | $R^{B7}$ | $R^{A3}$ |
| $L_{A2272}$ | $R^{B1}$ | $R^{C3}$ | $R^{B12}$ | $R^{A3}$ |
| $L_{A2273}$ | $R^{B1}$ | $R^{C3}$ | $R^{B20}$ | $R^{A3}$ |
| $L_{A2274}$ | $R^{B1}$ | $R^{C3}$ | $R^{B25}$ | $R^{A3}$ |
| $L_{A2275}$ | $R^{B1}$ | $R^{C3}$ | $R^{B29}$ | $R^{A3}$ |
| $L_{A2276}$ | $R^{B1}$ | $R^{C3}$ | $R^{A37}$ | $R^{A3}$ |
| $L_{A2277}$ | $R^{B1}$ | $R^{C3}$ | $R^{A43}$ | $R^{A3}$ |
| $L_{A2278}$ | $R^{B1}$ | $R^{C3}$ | $R^{E1}$ | $R^{A3}$ |
| $L_{A2279}$ | $R^{B1}$ | $R^{C3}$ | $R^{E2}$ | $R^{A3}$ |
| $L_{A2280}$ | $R^{B1}$ | $R^{C3}$ | $R^{E3}$ | $R^{A3}$ |
| $L_{A2281}$ | $R^{B1}$ | $R^{C3}$ | $R^{E4}$ | $R^{A3}$ |
| $L_{A2282}$ | $R^{B1}$ | $R^{C3}$ | $R^{E5}$ | $R^{A3}$ |
| $L_{A2283}$ | $R^{B1}$ | $R^{C3}$ | $R^{E6}$ | $R^{A3}$ |
| $L_{A2284}$ | $R^{B1}$ | $R^{C3}$ | $R^{E7}$ | $R^{A3}$ |
| $L_{A2285}$ | $R^{B1}$ | $R^{C3}$ | $R^{E8}$ | $R^{A3}$ |
| $L_{A2286}$ | $R^{B1}$ | $R^{C3}$ | $R^{E9}$ | $R^{A3}$ |
| $L_{A2287}$ | $R^{B1}$ | $R^{C3}$ | $R^{E10}$ | $R^{A3}$ |
| $L_{A2288}$ | $R^{B1}$ | $R^{C3}$ | $R^{E11}$ | $R^{A3}$ |
| $L_{A2289}$ | $R^{B1}$ | $R^{C3}$ | $R^{E12}$ | $R^{A3}$ |
| $L_{A2290}$ | $R^{B1}$ | $R^{C3}$ | $R^{E13}$ | $R^{A3}$ |
| $L_{A2291}$ | $R^{B1}$ | $R^{C3}$ | $R^{E14}$ | $R^{A3}$ |
| $L_{A2292}$ | $R^{B1}$ | $R^{C3}$ | $R^{E15}$ | $R^{A3}$ |
| $L_{A2293}$ | $R^{B1}$ | $R^{C3}$ | $R^{E16}$ | $R^{A3}$ |
| $L_{A2294}$ | $R^{B1}$ | $R^{C3}$ | $R^{E17}$ | $R^{A3}$ |
| $L_{A2295}$ | $R^{B1}$ | $R^{C3}$ | $R^{E18}$ | $R^{A3}$ |
| $L_{A2296}$ | $R^{B1}$ | $R^{C3}$ | $R^{E19}$ | $R^{A3}$ |
| $L_{A2297}$ | $R^{B1}$ | $R^{C3}$ | $R^{E20}$ | $R^{A3}$ |
| $L_{A2298}$ | $R^{B1}$ | $R^{C3}$ | $R^{E21}$ | $R^{A3}$ |
| $L_{A2299}$ | $R^{B1}$ | $R^{C3}$ | $R^{B3}$ | $R^{A34}$ |
| $L_{A2300}$ | $R^{B1}$ | $R^{C3}$ | $R^{B6}$ | $R^{A34}$ |
| $L_{A2301}$ | $R^{B1}$ | $R^{C3}$ | $R^{B7}$ | $R^{A34}$ |
| $L_{A2302}$ | $R^{B1}$ | $R^{C3}$ | $R^{B12}$ | $R^{A34}$ |
| $L_{A2303}$ | $R^{B1}$ | $R^{C3}$ | $R^{B20}$ | $R^{A34}$ |
| $L_{A2304}$ | $R^{B1}$ | $R^{C3}$ | $R^{B25}$ | $R^{A34}$ |
| $L_{A2305}$ | $R^{B1}$ | $R^{C3}$ | $R^{B29}$ | $R^{A34}$ |
| $L_{A2306}$ | $R^{B1}$ | $R^{C3}$ | $R^{A37}$ | $R^{A34}$ |
| $L_{A2307}$ | $R^{B1}$ | $R^{C3}$ | $R^{A43}$ | $R^{A34}$ |
| $L_{A2308}$ | $R^{B1}$ | $R^{C3}$ | $R^{E1}$ | $R^{A34}$ |
| $L_{A2309}$ | $R^{B1}$ | $R^{C3}$ | $R^{E2}$ | $R^{A34}$ |
| $L_{A2310}$ | $R^{B1}$ | $R^{C3}$ | $R^{E3}$ | $R^{A34}$ |
| $L_{A2311}$ | $R^{B1}$ | $R^{C3}$ | $R^{E4}$ | $R^{A34}$ |
| $L_{A2312}$ | $R^{B1}$ | $R^{C3}$ | $R^{E5}$ | $R^{A34}$ |
| $L_{A2313}$ | $R^{B1}$ | $R^{C3}$ | $R^{E6}$ | $R^{A34}$ |
| $L_{A2314}$ | $R^{B1}$ | $R^{C3}$ | $R^{E7}$ | $R^{A34}$ |
| $L_{A2315}$ | $R^{B1}$ | $R^{C3}$ | $R^{E8}$ | $R^{A34}$ |
| $L_{A2316}$ | $R^{B1}$ | $R^{C3}$ | $R^{E9}$ | $R^{A34}$ |
| $L_{A2317}$ | $R^{B1}$ | $R^{C3}$ | $R^{E10}$ | $R^{A34}$ |
| $L_{A2318}$ | $R^{B1}$ | $R^{C3}$ | $R^{E11}$ | $R^{A34}$ |
| $L_{A2319}$ | $R^{B1}$ | $R^{C3}$ | $R^{E12}$ | $R^{A34}$ |
| $L_{A2320}$ | $R^{B1}$ | $R^{C3}$ | $R^{E13}$ | $R^{A34}$ |
| $L_{A2321}$ | $R^{B1}$ | $R^{C3}$ | $R^{E14}$ | $R^{A34}$ |
| $L_{A2322}$ | $R^{B1}$ | $R^{C3}$ | $R^{E15}$ | $R^{A34}$ |
| $L_{A2323}$ | $R^{B1}$ | $R^{C3}$ | $R^{E16}$ | $R^{A34}$ |
| $L_{A2324}$ | $R^{B1}$ | $R^{C3}$ | $R^{E17}$ | $R^{A34}$ |
| $L_{A2325}$ | $R^{B1}$ | $R^{C3}$ | $R^{E18}$ | $R^{A34}$ |
| $L_{A2326}$ | $R^{B1}$ | $R^{C3}$ | $R^{E19}$ | $R^{A34}$ |
| $L_{A2327}$ | $R^{B1}$ | $R^{C3}$ | $R^{E20}$ | $R^{A34}$ |
| $L_{A2328}$ | $R^{B1}$ | $R^{C3}$ | $R^{E21}$ | $R^{A34}$ |
| $L_{A2329}$ | $R^{B1}$ | $R^{C3}$ | $R^{B3}$ | $R^{A52}$ |
| $L_{A2330}$ | $R^{B1}$ | $R^{C3}$ | $R^{B6}$ | $R^{A52}$ |
| $L_{A2331}$ | $R^{B1}$ | $R^{C3}$ | $R^{B7}$ | $R^{A52}$ |
| $L_{A2332}$ | $R^{B1}$ | $R^{C3}$ | $R^{B12}$ | $R^{A52}$ |
| $L_{A2333}$ | $R^{B1}$ | $R^{C3}$ | $R^{B20}$ | $R^{A52}$ |
| $L_{A2334}$ | $R^{B1}$ | $R^{C3}$ | $R^{B25}$ | $R^{A52}$ |
| $L_{A2335}$ | $R^{B1}$ | $R^{C3}$ | $R^{B29}$ | $R^{A52}$ |

-continued

| Ligand | $R^1$ | $R^2$ | $R^3$ | $R^4$ |
|---|---|---|---|---|
| $L_{A2336}$ | $R^{B1}$ | $R^{C3}$ | $R^{A37}$ | $R^{A52}$ |
| $L_{A2337}$ | $R^{B1}$ | $R^{C3}$ | $R^{A43}$ | $R^{A52}$ |
| $L_{A2338}$ | $R^{B1}$ | $R^{C3}$ | $R^{E1}$ | $R^{A52}$ |
| $L_{A2339}$ | $R^{B1}$ | $R^{C3}$ | $R^{E2}$ | $R^{A52}$ |
| $L_{A2340}$ | $R^{B1}$ | $R^{C3}$ | $R^{E3}$ | $R^{A52}$ |
| $L_{A2341}$ | $R^{B1}$ | $R^{C3}$ | $R^{E4}$ | $R^{A52}$ |
| $L_{A2342}$ | $R^{B1}$ | $R^{C3}$ | $R^{E5}$ | $R^{A52}$ |
| $L_{A2343}$ | $R^{B1}$ | $R^{C3}$ | $R^{E6}$ | $R^{A52}$ |
| $L_{A2344}$ | $R^{B1}$ | $R^{C3}$ | $R^{E7}$ | $R^{A52}$ |
| $L_{A2345}$ | $R^{B1}$ | $R^{C3}$ | $R^{E8}$ | $R^{A52}$ |
| $L_{A2346}$ | $R^{B1}$ | $R^{C3}$ | $R^{E9}$ | $R^{A52}$ |
| $L_{A2347}$ | $R^{B1}$ | $R^{C3}$ | $R^{E10}$ | $R^{A52}$ |
| $L_{A2348}$ | $R^{B1}$ | $R^{C3}$ | $R^{E11}$ | $R^{A52}$ |
| $L_{A2349}$ | $R^{B1}$ | $R^{C3}$ | $R^{E12}$ | $R^{A52}$ |
| $L_{A2350}$ | $R^{B1}$ | $R^{C3}$ | $R^{E13}$ | $R^{A52}$ |
| $L_{A2351}$ | $R^{B1}$ | $R^{C3}$ | $R^{E14}$ | $R^{A52}$ |
| $L_{A2352}$ | $R^{B1}$ | $R^{C3}$ | $R^{E15}$ | $R^{A52}$ |
| $L_{A2353}$ | $R^{B1}$ | $R^{C3}$ | $R^{E16}$ | $R^{A52}$ |
| $L_{A2354}$ | $R^{B1}$ | $R^{C3}$ | $R^{E17}$ | $R^{A52}$ |
| $L_{A2355}$ | $R^{B1}$ | $R^{C3}$ | $R^{E18}$ | $R^{A82}$ |
| $L_{A2356}$ | $R^{B1}$ | $R^{C3}$ | $R^{E19}$ | $R^{A52}$ |
| $L_{A2357}$ | $R^{B1}$ | $R^{C3}$ | $R^{E20}$ | $R^{A52}$ |
| $L_{A2358}$ | $R^{B1}$ | $R^{C3}$ | $R^{E21}$ | $R^{A52}$ |
| $L_{A2359}$ | $R^{B1}$ | $R^{C17}$ | $R^{B3}$ | H |
| $L_{A2360}$ | $R^{B1}$ | $R^{C17}$ | $R^{B6}$ | H |
| $L_{A2361}$ | $R^{B1}$ | $R^{C17}$ | $R^{B7}$ | H |
| $L_{A2362}$ | $R^{B1}$ | $R^{C17}$ | $R^{B12}$ | H |
| $L_{A2363}$ | $R^{B1}$ | $R^{C17}$ | $R^{B20}$ | H |
| $L_{A2364}$ | $R^{B1}$ | $R^{C17}$ | $R^{B25}$ | H |
| $L_{A2365}$ | $R^{B1}$ | $R^{C17}$ | $R^{B29}$ | H |
| $L_{A2366}$ | $R^{B1}$ | $R^{C17}$ | $R^{A37}$ | H |
| $L_{A2367}$ | $R^{B1}$ | $R^{C17}$ | $R^{A43}$ | H |
| $L_{A2368}$ | $R^{B1}$ | $R^{C17}$ | $R^{E1}$ | H |
| $L_{A2369}$ | $R^{B1}$ | $R^{C17}$ | $R^{E2}$ | H |
| $L_{A2370}$ | $R^{B1}$ | $R^{C17}$ | $R^{E3}$ | H |
| $L_{A2371}$ | $R^{B1}$ | $R^{C17}$ | $R^{E4}$ | H |
| $L_{A2372}$ | $R^{B1}$ | $R^{C17}$ | $R^{E5}$ | H |
| $L_{A2373}$ | $R^{B1}$ | $R^{C17}$ | $R^{E6}$ | H |
| $L_{A2374}$ | $R^{B1}$ | $R^{C17}$ | $R^{E7}$ | H |
| $L_{A2375}$ | $R^{B1}$ | $R^{C17}$ | $R^{E8}$ | H |
| $L_{A2376}$ | $R^{B1}$ | $R^{C17}$ | $R^{E9}$ | H |
| $L_{A2377}$ | $R^{B1}$ | $R^{C17}$ | $R^{E10}$ | H |
| $L_{A2378}$ | $R^{B1}$ | $R^{C17}$ | $R^{E11}$ | H |
| $L_{A2379}$ | $R^{B1}$ | $R^{C17}$ | $R^{E12}$ | H |
| $L_{A2380}$ | $R^{B1}$ | $R^{C17}$ | $R^{E13}$ | H |
| $L_{A2381}$ | $R^{B1}$ | $R^{C17}$ | $R^{E14}$ | H |
| $L_{A2382}$ | $R^{B1}$ | $R^{C17}$ | $R^{E15}$ | H |
| $L_{A2383}$ | $R^{B1}$ | $R^{C17}$ | $R^{E16}$ | H |
| $L_{A2384}$ | $R^{B1}$ | $R^{C17}$ | $R^{E17}$ | H |
| $L_{A2385}$ | $R^{B1}$ | $R^{C17}$ | $R^{E18}$ | H |
| $L_{A2386}$ | $R^{B1}$ | $R^{C17}$ | $R^{E19}$ | H |
| $L_{A2387}$ | $R^{B1}$ | $R^{C17}$ | $R^{E20}$ | H |
| $L_{A2388}$ | $R^{B1}$ | $R^{C17}$ | $R^{E21}$ | H |
| $L_{A2389}$ | $R^{B1}$ | $R^{C17}$ | $R^{B3}$ | $R^{B3}$ |
| $L_{A2390}$ | $R^{B1}$ | $R^{C17}$ | $R^{B6}$ | $R^{B3}$ |
| $L_{A2391}$ | $R^{B1}$ | $R^{C17}$ | $R^{B7}$ | $R^{B3}$ |
| $L_{A2392}$ | $R^{B1}$ | $R^{C17}$ | $R^{B12}$ | $R^{B3}$ |
| $L_{A2393}$ | $R^{B1}$ | $R^{C17}$ | $R^{B20}$ | $R^{B3}$ |
| $L_{A2394}$ | $R^{B1}$ | $R^{C17}$ | $R^{B25}$ | $R^{B3}$ |
| $L_{A2395}$ | $R^{B1}$ | $R^{C17}$ | $R^{B29}$ | $R^{B3}$ |
| $L_{A2396}$ | $R^{B1}$ | $R^{C17}$ | $R^{A37}$ | $R^{B3}$ |
| $L_{A2397}$ | $R^{B1}$ | $R^{C17}$ | $R^{A43}$ | $R^{B3}$ |
| $L_{A2398}$ | $R^{B1}$ | $R^{C17}$ | $R^{E1}$ | $R^{B3}$ |
| $L_{A2399}$ | $R^{B1}$ | $R^{C17}$ | $R^{E2}$ | $R^{B3}$ |
| $L_{A2400}$ | $R^{B1}$ | $R^{C17}$ | $R^{E3}$ | $R^{B3}$ |
| $L_{A2401}$ | $R^{B1}$ | $R^{C17}$ | $R^{E4}$ | $R^{B3}$ |
| $L_{A2402}$ | $R^{B1}$ | $R^{C17}$ | $R^{E5}$ | $R^{B3}$ |
| $L_{A2403}$ | $R^{B1}$ | $R^{C17}$ | $R^{E6}$ | $R^{B3}$ |
| $L_{A2404}$ | $R^{B1}$ | $R^{C17}$ | $R^{E7}$ | $R^{B3}$ |
| $L_{A2405}$ | $R^{B1}$ | $R^{C17}$ | $R^{E8}$ | $R^{B3}$ |
| $L_{A2406}$ | $R^{B1}$ | $R^{C17}$ | $R^{E9}$ | $R^{B3}$ |
| $L_{A2407}$ | $R^{B1}$ | $R^{C17}$ | $R^{E10}$ | $R^{B3}$ |
| $L_{A2408}$ | $R^{B1}$ | $R^{C17}$ | $R^{E11}$ | $R^{B3}$ |
| $L_{A2409}$ | $R^{B1}$ | $R^{C17}$ | $R^{E12}$ | $R^{B3}$ |
| $L_{A2410}$ | $R^{B1}$ | $R^{C17}$ | $R^{E13}$ | $R^{B3}$ |
| $L_{A2411}$ | $R^{B1}$ | $R^{C17}$ | $R^{E14}$ | $R^{B3}$ |
| $L_{A2412}$ | $R^{B1}$ | $R^{C17}$ | $R^{E15}$ | $R^{B3}$ |

-continued

| Ligand | $R^1$ | $R^2$ | $R^3$ | $R^4$ |
|---|---|---|---|---|
| $L_{42413}$ | $R^{B1}$ | $R^{C17}$ | $R^{E16}$ | $R^{B3}$ |
| $L_{42414}$ | $R^{B1}$ | $R^{C17}$ | $R^{E17}$ | $R^{B3}$ |
| $L_{42415}$ | $R^{B1}$ | $R^{C17}$ | $R^{E18}$ | $R^{B3}$ |
| $L_{42416}$ | $R^{B1}$ | $R^{C17}$ | $R^{E19}$ | $R^{B3}$ |
| $L_{42417}$ | $R^{B1}$ | $R^{C17}$ | $R^{E20}$ | $R^{B3}$ |
| $L_{42418}$ | $R^{B1}$ | $R^{C17}$ | $R^{E21}$ | $R^{B3}$ |
| $L_{42419}$ | $R^{B1}$ | $R^{C17}$ | $R^{B3}$ | $R^{B4}$ |
| $L_{42420}$ | $R^{B1}$ | $R^{C17}$ | $R^{B6}$ | $R^{B4}$ |
| $L_{42421}$ | $R^{B1}$ | $R^{C17}$ | $R^{B7}$ | $R^{B4}$ |
| $L_{42422}$ | $R^{B1}$ | $R^{C17}$ | $R^{B12}$ | $R^{B4}$ |
| $L_{42423}$ | $R^{B1}$ | $R^{C17}$ | $R^{B20}$ | $R^{B4}$ |
| $L_{42424}$ | $R^{B1}$ | $R^{C17}$ | $R^{B25}$ | $R^{B4}$ |
| $L_{42425}$ | $R^{B1}$ | $R^{C17}$ | $R^{B29}$ | $R^{B4}$ |
| $L_{42426}$ | $R^{B1}$ | $R^{C17}$ | $R^{A37}$ | $R^{B4}$ |
| $L_{42427}$ | $R^{B1}$ | $R^{C17}$ | $R^{A43}$ | $R^{B4}$ |
| $L_{42428}$ | $R^{B1}$ | $R^{C17}$ | $R^{E1}$ | $R^{B4}$ |
| $L_{42429}$ | $R^{B1}$ | $R^{C17}$ | $R^{E2}$ | $R^{B4}$ |
| $L_{42430}$ | $R^{B1}$ | $R^{C17}$ | $R^{E3}$ | $R^{B4}$ |
| $L_{42431}$ | $R^{B1}$ | $R^{C17}$ | $R^{E4}$ | $R^{B4}$ |
| $L_{42432}$ | $R^{B1}$ | $R^{C17}$ | $R^{E5}$ | $R^{B4}$ |
| $L_{42433}$ | $R^{B1}$ | $R^{C17}$ | $R^{E6}$ | $R^{B4}$ |
| $L_{42434}$ | $R^{B1}$ | $R^{C17}$ | $R^{E7}$ | $R^{B4}$ |
| $L_{42435}$ | $R^{B1}$ | $R^{C17}$ | $R^{E8}$ | $R^{B4}$ |
| $L_{42436}$ | $R^{B1}$ | $R^{C17}$ | $R^{E9}$ | $R^{B4}$ |
| $L_{42437}$ | $R^{B1}$ | $R^{C17}$ | $R^{E10}$ | $R^{B4}$ |
| $L_{42438}$ | $R^{B1}$ | $R^{C17}$ | $R^{E11}$ | $R^{B4}$ |
| $L_{42439}$ | $R^{B1}$ | $R^{C17}$ | $R^{E12}$ | $R^{B4}$ |
| $L_{42440}$ | $R^{B1}$ | $R^{C17}$ | $R^{E13}$ | $R^{B4}$ |
| $L_{42441}$ | $R^{B1}$ | $R^{C17}$ | $R^{E14}$ | $R^{B4}$ |
| $L_{42442}$ | $R^{B1}$ | $R^{C17}$ | $R^{E15}$ | $R^{B4}$ |
| $L_{42443}$ | $R^{B1}$ | $R^{C17}$ | $R^{E16}$ | $R^{B4}$ |
| $L_{42444}$ | $R^{B1}$ | $R^{C17}$ | $R^{E17}$ | $R^{B4}$ |
| $L_{42445}$ | $R^{B1}$ | $R^{C17}$ | $R^{E18}$ | $R^{B4}$ |
| $L_{42446}$ | $R^{B1}$ | $R^{C17}$ | $R^{E19}$ | $R^{B4}$ |
| $L_{42447}$ | $R^{B1}$ | $R^{C17}$ | $R^{E20}$ | $R^{B4}$ |
| $L_{42448}$ | $R^{B1}$ | $R^{C17}$ | $R^{E21}$ | $R^{B4}$ |
| $L_{42449}$ | $R^{B1}$ | $R^{C17}$ | $R^{B3}$ | $R^{B18}$ |
| $L_{42450}$ | $R^{B1}$ | $R^{C17}$ | $R^{B6}$ | $R^{B18}$ |
| $L_{42451}$ | $R^{B1}$ | $R^{C17}$ | $R^{B7}$ | $R^{B18}$ |
| $L_{42452}$ | $R^{B1}$ | $R^{C17}$ | $R^{B12}$ | $R^{B18}$ |
| $L_{42453}$ | $R^{B1}$ | $R^{C17}$ | $R^{B20}$ | $R^{B18}$ |
| $L_{42454}$ | $R^{B1}$ | $R^{C17}$ | $R^{B25}$ | $R^{B18}$ |
| $L_{42455}$ | $R^{B1}$ | $R^{C17}$ | $R^{B29}$ | $R^{B18}$ |
| $L_{42456}$ | $R^{B1}$ | $R^{C17}$ | $R^{A37}$ | $R^{B18}$ |
| $L_{42457}$ | $R^{B1}$ | $R^{C17}$ | $R^{A43}$ | $R^{B18}$ |
| $L_{42458}$ | $R^{B1}$ | $R^{C17}$ | $R^{E1}$ | $R^{B18}$ |
| $L_{42459}$ | $R^{B1}$ | $R^{C17}$ | $R^{E2}$ | $R^{B18}$ |
| $L_{42460}$ | $R^{B1}$ | $R^{C17}$ | $R^{E3}$ | $R^{B18}$ |
| $L_{42461}$ | $R^{B1}$ | $R^{C17}$ | $R^{E4}$ | $R^{B18}$ |
| $L_{42462}$ | $R^{B1}$ | $R^{C17}$ | $R^{E5}$ | $R^{B18}$ |
| $L_{42463}$ | $R^{B1}$ | $R^{C17}$ | $R^{E6}$ | $R^{B18}$ |
| $L_{42464}$ | $R^{B1}$ | $R^{C17}$ | $R^{E7}$ | $R^{B18}$ |
| $L_{42465}$ | $R^{B1}$ | $R^{C17}$ | $R^{E8}$ | $R^{B18}$ |
| $L_{42466}$ | $R^{B1}$ | $R^{C17}$ | $R^{E9}$ | $R^{B18}$ |
| $L_{42467}$ | $R^{B1}$ | $R^{C17}$ | $R^{E10}$ | $R^{B18}$ |
| $L_{42468}$ | $R^{B1}$ | $R^{C17}$ | $R^{E11}$ | $R^{B18}$ |
| $L_{42469}$ | $R^{B1}$ | $R^{C17}$ | $R^{E12}$ | $R^{B18}$ |
| $L_{42470}$ | $R^{B1}$ | $R^{C17}$ | $R^{E13}$ | $R^{B18}$ |
| $L_{42471}$ | $R^{B1}$ | $R^{C17}$ | $R^{E14}$ | $R^{B18}$ |
| $L_{42472}$ | $R^{B1}$ | $R^{C17}$ | $R^{E15}$ | $R^{B18}$ |
| $L_{42473}$ | $R^{B1}$ | $R^{C17}$ | $R^{E16}$ | $R^{B18}$ |
| $L_{42474}$ | $R^{B1}$ | $R^{C17}$ | $R^{E17}$ | $R^{B18}$ |
| $L_{42475}$ | $R^{B1}$ | $R^{C17}$ | $R^{E18}$ | $R^{B18}$ |
| $L_{42476}$ | $R^{B1}$ | $R^{C17}$ | $R^{E19}$ | $R^{B18}$ |
| $L_{42477}$ | $R^{B1}$ | $R^{C17}$ | $R^{E20}$ | $R^{B18}$ |
| $L_{42478}$ | $R^{B1}$ | $R^{C17}$ | $R^{E21}$ | $R^{B18}$ |
| $L_{42479}$ | $R^{B1}$ | $R^{C17}$ | $R^{B3}$ | $R^{A3}$ |
| $L_{42480}$ | $R^{B1}$ | $R^{C17}$ | $R^{B6}$ | $R^{A3}$ |
| $L_{42481}$ | $R^{B1}$ | $R^{C17}$ | $R^{B7}$ | $R^{A3}$ |
| $L_{42482}$ | $R^{B1}$ | $R^{C17}$ | $R^{B12}$ | $R^{A3}$ |
| $L_{42483}$ | $R^{B1}$ | $R^{C17}$ | $R^{B20}$ | $R^{A3}$ |
| $L_{42484}$ | $R^{B1}$ | $R^{C17}$ | $R^{B25}$ | $R^{A3}$ |
| $L_{42485}$ | $R^{B1}$ | $R^{C17}$ | $R^{B29}$ | $R^{A3}$ |
| $L_{42486}$ | $R^{B1}$ | $R^{C17}$ | $R^{A37}$ | $R^{A3}$ |
| $L_{42487}$ | $R^{B1}$ | $R^{C17}$ | $R^{A43}$ | $R^{A3}$ |
| $L_{42488}$ | $R^{B1}$ | $R^{C17}$ | $R^{E1}$ | $R^{A3}$ |
| $L_{42489}$ | $R^{B1}$ | $R^{C17}$ | $R^{E2}$ | $R^{A3}$ |

-continued

| Ligand | $R^1$ | $R^2$ | $R^3$ | $R^4$ |
|---|---|---|---|---|
| $L_{42490}$ | $R^{B1}$ | $R^{C17}$ | $R^{E3}$ | $R^{A3}$ |
| $L_{42491}$ | $R^{B1}$ | $R^{C17}$ | $R^{E4}$ | $R^{A3}$ |
| $L_{42492}$ | $R^{B1}$ | $R^{C17}$ | $R^{E5}$ | $R^{A3}$ |
| $L_{42493}$ | $R^{B1}$ | $R^{C17}$ | $R^{E6}$ | $R^{A3}$ |
| $L_{42494}$ | $R^{B1}$ | $R^{C17}$ | $R^{E7}$ | $R^{A3}$ |
| $L_{42495}$ | $R^{B1}$ | $R^{C17}$ | $R^{E8}$ | $R^{A3}$ |
| $L_{42496}$ | $R^{B1}$ | $R^{C17}$ | $R^{E9}$ | $R^{A3}$ |
| $L_{42497}$ | $R^{B1}$ | $R^{C17}$ | $R^{E10}$ | $R^{A3}$ |
| $L_{42498}$ | $R^{B1}$ | $R^{C17}$ | $R^{E11}$ | $R^{A3}$ |
| $L_{42499}$ | $R^{B1}$ | $R^{C17}$ | $R^{E12}$ | $R^{A3}$ |
| $L_{42500}$ | $R^{B1}$ | $R^{C17}$ | $R^{E13}$ | $R^{A3}$ |
| $L_{42501}$ | $R^{B1}$ | $R^{C17}$ | $R^{E14}$ | $R^{A3}$ |
| $L_{42502}$ | $R^{B1}$ | $R^{C17}$ | $R^{E15}$ | $R^{A3}$ |
| $L_{42503}$ | $R^{B1}$ | $R^{C17}$ | $R^{E16}$ | $R^{A3}$ |
| $L_{42504}$ | $R^{B1}$ | $R^{C17}$ | $R^{E17}$ | $R^{A3}$ |
| $L_{42505}$ | $R^{B1}$ | $R^{C17}$ | $R^{E18}$ | $R^{A3}$ |
| $L_{42506}$ | $R^{B1}$ | $R^{C17}$ | $R^{E19}$ | $R^{A3}$ |
| $L_{42507}$ | $R^{B1}$ | $R^{C17}$ | $R^{E20}$ | $R^{A3}$ |
| $L_{42508}$ | $R^{B1}$ | $R^{C17}$ | $R^{E21}$ | $R^{A3}$ |
| $L_{42509}$ | $R^{B1}$ | $R^{C17}$ | $R^{B3}$ | $R^{A34}$ |
| $L_{42510}$ | $R^{B1}$ | $R^{C17}$ | $R^{B6}$ | $R^{A34}$ |
| $L_{42511}$ | $R^{B1}$ | $R^{C17}$ | $R^{B7}$ | $R^{A34}$ |
| $L_{42512}$ | $R^{B1}$ | $R^{C17}$ | $R^{B12}$ | $R^{A34}$ |
| $L_{42513}$ | $R^{B1}$ | $R^{C17}$ | $R^{B20}$ | $R^{A34}$ |
| $L_{42514}$ | $R^{B1}$ | $R^{C17}$ | $R^{B25}$ | $R^{A34}$ |
| $L_{42515}$ | $R^{B1}$ | $R^{C17}$ | $R^{B29}$ | $R^{A34}$ |
| $L_{42516}$ | $R^{B1}$ | $R^{C17}$ | $R^{A37}$ | $R^{A34}$ |
| $L_{42517}$ | $R^{B1}$ | $R^{C17}$ | $R^{A43}$ | $R^{A34}$ |
| $L_{42518}$ | $R^{B1}$ | $R^{C17}$ | $R^{E1}$ | $R^{A34}$ |
| $L_{42519}$ | $R^{B1}$ | $R^{C17}$ | $R^{E2}$ | $R^{A34}$ |
| $L_{42520}$ | $R^{B1}$ | $R^{C17}$ | $R^{E3}$ | $R^{A34}$ |
| $L_{42521}$ | $R^{B1}$ | $R^{C17}$ | $R^{E4}$ | $R^{A34}$ |
| $L_{42522}$ | $R^{B1}$ | $R^{C17}$ | $R^{E5}$ | $R^{A34}$ |
| $L_{42523}$ | $R^{B1}$ | $R^{C17}$ | $R^{E6}$ | $R^{A34}$ |
| $L_{42524}$ | $R^{B1}$ | $R^{C17}$ | $R^{E7}$ | $R^{A34}$ |
| $L_{42525}$ | $R^{B1}$ | $R^{C17}$ | $R^{E8}$ | $R^{A34}$ |
| $L_{42526}$ | $R^{B1}$ | $R^{C17}$ | $R^{E9}$ | $R^{A34}$ |
| $L_{42527}$ | $R^{B1}$ | $R^{C17}$ | $R^{E10}$ | $R^{A34}$ |
| $L_{42528}$ | $R^{B1}$ | $R^{C17}$ | $R^{E11}$ | $R^{A34}$ |
| $L_{42529}$ | $R^{B1}$ | $R^{C17}$ | $R^{E12}$ | $R^{A34}$ |
| $L_{42530}$ | $R^{B1}$ | $R^{C17}$ | $R^{E13}$ | $R^{A34}$ |
| $L_{42531}$ | $R^{B1}$ | $R^{C17}$ | $R^{E14}$ | $R^{A34}$ |
| $L_{42532}$ | $R^{B1}$ | $R^{C17}$ | $R^{E15}$ | $R^{A34}$ |
| $L_{42533}$ | $R^{B1}$ | $R^{C17}$ | $R^{E16}$ | $R^{A34}$ |
| $L_{42534}$ | $R^{B1}$ | $R^{C17}$ | $R^{E17}$ | $R^{A34}$ |
| $L_{42535}$ | $R^{B1}$ | $R^{C17}$ | $R^{E18}$ | $R^{A34}$ |
| $L_{42536}$ | $R^{B1}$ | $R^{C17}$ | $R^{E19}$ | $R^{A34}$ |
| $L_{42537}$ | $R^{B1}$ | $R^{C17}$ | $R^{E20}$ | $R^{A34}$ |
| $L_{42538}$ | $R^{B1}$ | $R^{C17}$ | $R^{E21}$ | $R^{A34}$ |
| $L_{42539}$ | $R^{B1}$ | $R^{C17}$ | $R^{B3}$ | $R^{A52}$ |
| $L_{42540}$ | $R^{B1}$ | $R^{C17}$ | $R^{B6}$ | $R^{A52}$ |
| $L_{42841}$ | $R^{B1}$ | $R^{C17}$ | $R^{B7}$ | $R^{A52}$ |
| $L_{42542}$ | $R^{B1}$ | $R^{C17}$ | $R^{B12}$ | $R^{A52}$ |
| $L_{42543}$ | $R^{B1}$ | $R^{C17}$ | $R^{B20}$ | $R^{A52}$ |
| $L_{42544}$ | $R^{B1}$ | $R^{C17}$ | $R^{B25}$ | $R^{A52}$ |
| $L_{42545}$ | $R^{B1}$ | $R^{C17}$ | $R^{B29}$ | $R^{A52}$ |
| $L_{42546}$ | $R^{B1}$ | $R^{C17}$ | $R^{A37}$ | $R^{A52}$ |
| $L_{42547}$ | $R^{B1}$ | $R^{C17}$ | $R^{A43}$ | $R^{A52}$ |
| $L_{42548}$ | $R^{B1}$ | $R^{C17}$ | $R^{E1}$ | $R^{A52}$ |
| $L_{42549}$ | $R^{B1}$ | $R^{C17}$ | $R^{E2}$ | $R^{A52}$ |
| $L_{42550}$ | $R^{B1}$ | $R^{C17}$ | $R^{E3}$ | $R^{A52}$ |
| $L_{42551}$ | $R^{B1}$ | $R^{C17}$ | $R^{E4}$ | $R^{A52}$ |
| $L_{42552}$ | $R^{B1}$ | $R^{C17}$ | $R^{E5}$ | $R^{A52}$ |
| $L_{42553}$ | $R^{B1}$ | $R^{C17}$ | $R^{E6}$ | $R^{A52}$ |
| $L_{42554}$ | $R^{B1}$ | $R^{C17}$ | $R^{E7}$ | $R^{A52}$ |
| $L_{42555}$ | $R^{B1}$ | $R^{C17}$ | $R^{E8}$ | $R^{A52}$ |
| $L_{42556}$ | $R^{B1}$ | $R^{C17}$ | $R^{E9}$ | $R^{A52}$ |
| $L_{42557}$ | $R^{B1}$ | $R^{C17}$ | $R^{E10}$ | $R^{A52}$ |
| $L_{42558}$ | $R^{B1}$ | $R^{C17}$ | $R^{E11}$ | $R^{A52}$ |
| $L_{42559}$ | $R^{B1}$ | $R^{C17}$ | $R^{E12}$ | $R^{A52}$ |
| $L_{42560}$ | $R^{B1}$ | $R^{C17}$ | $R^{E13}$ | $R^{A52}$ |
| $L_{42561}$ | $R^{B1}$ | $R^{C17}$ | $R^{E14}$ | $R^{A52}$ |
| $L_{42562}$ | $R^{B1}$ | $R^{C17}$ | $R^{E15}$ | $R^{A52}$ |
| $L_{42563}$ | $R^{B1}$ | $R^{C17}$ | $R^{E16}$ | $R^{A52}$ |
| $L_{42564}$ | $R^{B1}$ | $R^{C17}$ | $R^{E17}$ | $R^{A52}$ |
| $L_{42565}$ | $R^{B1}$ | $R^{C17}$ | $R^{E18}$ | $R^{A52}$ |
| $L_{42566}$ | $R^{B1}$ | $R^{C17}$ | $R^{E19}$ | $R^{A52}$ |

| Ligand | $R^1$ | $R^2$ | $R^3$ | $R^4$ |
|---|---|---|---|---|
| $L_{A2567}$ | $R^{B1}$ | $R^{C17}$ | $R^{E20}$ | $R^{A52}$ |
| $L_{A2568}$ | $R^{B1}$ | $R^{C17}$ | $R^{E21}$ | $R^{A52}$ |
| $L_{A2569}$ | $R^{B1}$ | $R^{C30}$ | $R^{B3}$ | H |
| $L_{A2570}$ | $R^{B1}$ | $R^{C30}$ | $R^{B6}$ | H |
| $L_{A2571}$ | $R^{B1}$ | $R^{C30}$ | $R^{B7}$ | H |
| $L_{A2572}$ | $R^{B1}$ | $R^{C30}$ | $R^{B12}$ | H |
| $L_{A2573}$ | $R^{B1}$ | $R^{C30}$ | $R^{B20}$ | H |
| $L_{A2574}$ | $R^{B1}$ | $R^{C30}$ | $R^{B25}$ | H |
| $L_{A2575}$ | $R^{B1}$ | $R^{C30}$ | $R^{B29}$ | H |
| $L_{A2576}$ | $R^{B1}$ | $R^{C30}$ | $R^{A37}$ | H |
| $L_{A2577}$ | $R^{B1}$ | $R^{C30}$ | $R^{A43}$ | H |
| $L_{A2578}$ | $R^{B1}$ | $R^{C30}$ | $R^{E1}$ | H |
| $L_{A2579}$ | $R^{B1}$ | $R^{C30}$ | $R^{E2}$ | H |
| $L_{A2580}$ | $R^{B1}$ | $R^{C30}$ | $R^{E3}$ | H |
| $L_{A2581}$ | $R^{B1}$ | $R^{C30}$ | $R^{E4}$ | H |
| $L_{A2582}$ | $R^{B1}$ | $R^{C30}$ | $R^{E5}$ | H |
| $L_{A2583}$ | $R^{B1}$ | $R^{C30}$ | $R^{E6}$ | H |
| $L_{A2584}$ | $R^{B1}$ | $R^{C30}$ | $R^{E7}$ | H |
| $L_{A2585}$ | $R^{B1}$ | $R^{C30}$ | $R^{E8}$ | H |
| $L_{A2586}$ | $R^{B1}$ | $R^{C30}$ | $R^{E9}$ | H |
| $L_{A2587}$ | $R^{B1}$ | $R^{C30}$ | $R^{E10}$ | H |
| $L_{A2588}$ | $R^{B1}$ | $R^{C30}$ | $R^{E11}$ | H |
| $L_{A2589}$ | $R^{B1}$ | $R^{C30}$ | $R^{E12}$ | H |
| $L_{A2590}$ | $R^{B1}$ | $R^{C30}$ | $R^{E13}$ | H |
| $L_{A2591}$ | $R^{B1}$ | $R^{C30}$ | $R^{E14}$ | H |
| $L_{A2592}$ | $R^{B1}$ | $R^{C30}$ | $R^{E15}$ | H |
| $L_{A2593}$ | $R^{B1}$ | $R^{C30}$ | $R^{E16}$ | H |
| $L_{A2594}$ | $R^{B1}$ | $R^{C30}$ | $R^{E17}$ | H |
| $L_{A2595}$ | $R^{B1}$ | $R^{C30}$ | $R^{E18}$ | H |
| $L_{A2596}$ | $R^{B1}$ | $R^{C30}$ | $R^{E19}$ | H |
| $L_{A2597}$ | $R^{B1}$ | $R^{C30}$ | $R^{E20}$ | H |
| $L_{A2598}$ | $R^{B1}$ | $R^{C30}$ | $R^{E21}$ | H |
| $L_{A2599}$ | $R^{B1}$ | $R^{C30}$ | $R^{B3}$ | $R^{B3}$ |
| $L_{A2600}$ | $R^{B1}$ | $R^{C30}$ | $R^{B6}$ | $R^{B3}$ |
| $L_{A2601}$ | $R^{B1}$ | $R^{C30}$ | $R^{B7}$ | $R^{B3}$ |
| $L_{A2602}$ | $R^{B1}$ | $R^{C30}$ | $R^{B12}$ | $R^{B3}$ |
| $L_{A2603}$ | $R^{B1}$ | $R^{C30}$ | $R^{B20}$ | $R^{B3}$ |
| $L_{A2604}$ | $R^{B1}$ | $R^{C30}$ | $R^{B25}$ | $R^{B3}$ |
| $L_{A2605}$ | $R^{B1}$ | $R^{C30}$ | $R^{B29}$ | $R^{B3}$ |
| $L_{A2606}$ | $R^{B1}$ | $R^{C30}$ | $R^{A37}$ | $R^{B3}$ |
| $L_{A2607}$ | $R^{B1}$ | $R^{C30}$ | $R^{A43}$ | $R^{B3}$ |
| $L_{A2608}$ | $R^{B1}$ | $R^{C30}$ | $R^{E1}$ | $R^{B3}$ |
| $L_{A2609}$ | $R^{B1}$ | $R^{C30}$ | $R^{E2}$ | $R^{B3}$ |
| $L_{A2610}$ | $R^{B1}$ | $R^{C30}$ | $R^{E3}$ | $R^{B3}$ |
| $L_{A2611}$ | $R^{B1}$ | $R^{C30}$ | $R^{E4}$ | $R^{B3}$ |
| $L_{A2612}$ | $R^{B1}$ | $R^{C30}$ | $R^{E5}$ | $R^{B3}$ |
| $L_{A2613}$ | $R^{B1}$ | $R^{C30}$ | $R^{E6}$ | $R^{B3}$ |
| $L_{A2614}$ | $R^{B1}$ | $R^{C30}$ | $R^{E7}$ | $R^{B3}$ |
| $L_{A2615}$ | $R^{B1}$ | $R^{C30}$ | $R^{E8}$ | $R^{B3}$ |
| $L_{A2616}$ | $R^{B1}$ | $R^{C30}$ | $R^{E9}$ | $R^{B3}$ |
| $L_{A2617}$ | $R^{B1}$ | $R^{C30}$ | $R^{E10}$ | $R^{B3}$ |
| $L_{A2618}$ | $R^{B1}$ | $R^{C30}$ | $R^{E11}$ | $R^{B3}$ |
| $L_{A2619}$ | $R^{B1}$ | $R^{C30}$ | $R^{E12}$ | $R^{B3}$ |
| $L_{A2620}$ | $R^{B1}$ | $R^{C30}$ | $R^{E13}$ | $R^{B3}$ |
| $L_{A2621}$ | $R^{B1}$ | $R^{C30}$ | $R^{E14}$ | $R^{B3}$ |
| $L_{A2622}$ | $R^{B1}$ | $R^{C30}$ | $R^{E15}$ | $R^{B3}$ |
| $L_{A2623}$ | $R^{B1}$ | $R^{C30}$ | $R^{E16}$ | $R^{B3}$ |
| $L_{A2624}$ | $R^{B1}$ | $R^{C30}$ | $R^{E17}$ | $R^{B3}$ |
| $L_{A2625}$ | $R^{B1}$ | $R^{C30}$ | $R^{E18}$ | $R^{B3}$ |
| $L_{A2626}$ | $R^{B1}$ | $R^{C30}$ | $R^{E19}$ | $R^{B3}$ |
| $L_{A2627}$ | $R^{B1}$ | $R^{C30}$ | $R^{E20}$ | $R^{B3}$ |
| $L_{A2628}$ | $R^{B1}$ | $R^{C30}$ | $R^{E21}$ | $R^{B3}$ |
| $L_{A2629}$ | $R^{B1}$ | $R^{C30}$ | $R^{B3}$ | $R^{B4}$ |
| $L_{A2630}$ | $R^{B1}$ | $R^{C30}$ | $R^{B6}$ | $R^{B4}$ |
| $L_{A2631}$ | $R^{B1}$ | $R^{C30}$ | $R^{B7}$ | $R^{B4}$ |
| $L_{A2632}$ | $R^{B1}$ | $R^{C30}$ | $R^{B12}$ | $R^{B4}$ |
| $L_{A2633}$ | $R^{B1}$ | $R^{C30}$ | $R^{B20}$ | $R^{B4}$ |
| $L_{A2634}$ | $R^{B1}$ | $R^{C30}$ | $R^{B25}$ | $R^{B4}$ |
| $L_{A2635}$ | $R^{B1}$ | $R^{C30}$ | $R^{B29}$ | $R^{B4}$ |
| $L_{A2636}$ | $R^{B1}$ | $R^{C30}$ | $R^{A37}$ | $R^{B4}$ |
| $L_{A2637}$ | $R^{B1}$ | $R^{C30}$ | $R^{A43}$ | $R^{B4}$ |
| $L_{A2638}$ | $R^{B1}$ | $R^{C3}$ | $R^{E1}$ | $R^{B4}$ |
| $L_{A2639}$ | $R^{B1}$ | $R^{C30}$ | $R^{E2}$ | $R^{B4}$ |
| $L_{A2640}$ | $R^{B1}$ | $R^{C30}$ | $R^{E3}$ | $R^{B4}$ |
| $L_{A2641}$ | $R^{B1}$ | $R^{C30}$ | $R^{E4}$ | $R^{B4}$ |
| $L_{A2642}$ | $R^{B1}$ | $R^{C30}$ | $R^{E5}$ | $R^{B4}$ |
| $L_{A2643}$ | $R^{B1}$ | $R^{C30}$ | $R^{E6}$ | $R^{B4}$ |

| Ligand | $R^1$ | $R^2$ | $R^3$ | $R^4$ |
|---|---|---|---|---|
| $L_{A2644}$ | $R^{B1}$ | $R^{C30}$ | $R^{E7}$ | $R^{B4}$ |
| $L_{A2645}$ | $R^{B1}$ | $R^{C30}$ | $R^{E8}$ | $R^{B4}$ |
| $L_{A2646}$ | $R^{B1}$ | $R^{C30}$ | $R^{E9}$ | $R^{B4}$ |
| $L_{A2647}$ | $R^{B1}$ | $R^{C30}$ | $R^{E10}$ | $R^{B4}$ |
| $L_{A2648}$ | $R^{B1}$ | $R^{C30}$ | $R^{E11}$ | $R^{B4}$ |
| $L_{A2649}$ | $R^{B1}$ | $R^{C30}$ | $R^{E12}$ | $R^{B4}$ |
| $L_{A2650}$ | $R^{B1}$ | $R^{C30}$ | $R^{E13}$ | $R^{B4}$ |
| $L_{A2651}$ | $R^{B1}$ | $R^{C30}$ | $R^{E14}$ | $R^{B4}$ |
| $L_{A2652}$ | $R^{B1}$ | $R^{C30}$ | $R^{E15}$ | $R^{B4}$ |
| $L_{A2653}$ | $R^{B1}$ | $R^{C30}$ | $R^{E16}$ | $R^{B4}$ |
| $L_{A2654}$ | $R^{B1}$ | $R^{C30}$ | $R^{E17}$ | $R^{B4}$ |
| $L_{A2655}$ | $R^{B1}$ | $R^{C30}$ | $R^{E18}$ | $R^{B4}$ |
| $L_{A2656}$ | $R^{B1}$ | $R^{C30}$ | $R^{E19}$ | $R^{B4}$ |
| $L_{A2657}$ | $R^{B1}$ | $R^{C30}$ | $R^{E20}$ | $R^{B4}$ |
| $L_{A2658}$ | $R^{B1}$ | $R^{C30}$ | $R^{E21}$ | $R^{B4}$ |
| $L_{A2659}$ | $R^{B1}$ | $R^{C30}$ | $R^{B3}$ | $R^{B18}$ |
| $L_{A2660}$ | $R^{B1}$ | $R^{C30}$ | $R^{B6}$ | $R^{B18}$ |
| $L_{A2661}$ | $R^{B1}$ | $R^{C30}$ | $R^{B7}$ | $R^{B18}$ |
| $L_{A2662}$ | $R^{B1}$ | $R^{C30}$ | $R^{B12}$ | $R^{B18}$ |
| $L_{A2663}$ | $R^{B1}$ | $R^{C30}$ | $R^{B20}$ | $R^{B18}$ |
| $L_{A2664}$ | $R^{B1}$ | $R^{C30}$ | $R^{B25}$ | $R^{B18}$ |
| $L_{A2665}$ | $R^{B1}$ | $R^{C30}$ | $R^{B29}$ | $R^{B18}$ |
| $L_{A2666}$ | $R^{B1}$ | $R^{C30}$ | $R^{A37}$ | $R^{B18}$ |
| $L_{A2667}$ | $R^{B1}$ | $R^{C30}$ | $R^{A43}$ | $R^{B18}$ |
| $L_{A2668}$ | $R^{B1}$ | $R^{C30}$ | $R^{E1}$ | $R^{B18}$ |
| $L_{A2669}$ | $R^{B1}$ | $R^{C30}$ | $R^{E2}$ | $R^{B18}$ |
| $L_{A2670}$ | $R^{B1}$ | $R^{C30}$ | $R^{E3}$ | $R^{B18}$ |
| $L_{A2671}$ | $R^{B1}$ | $R^{C30}$ | $R^{E4}$ | $R^{B18}$ |
| $L_{A2672}$ | $R^{B1}$ | $R^{C30}$ | $R^{E5}$ | $R^{B18}$ |
| $L_{A2673}$ | $R^{B1}$ | $R^{C30}$ | $R^{E6}$ | $R^{B18}$ |
| $L_{A2674}$ | $R^{B1}$ | $R^{C30}$ | $R^{E7}$ | $R^{B18}$ |
| $L_{A2675}$ | $R^{B1}$ | $R^{C30}$ | $R^{E8}$ | $R^{B18}$ |
| $L_{A2676}$ | $R^{B1}$ | $R^{C30}$ | $R^{E9}$ | $R^{B18}$ |
| $L_{A2677}$ | $R^{B1}$ | $R^{C30}$ | $R^{E10}$ | $R^{B18}$ |
| $L_{A2678}$ | $R^{B1}$ | $R^{C30}$ | $R^{E11}$ | $R^{B18}$ |
| $L_{A2679}$ | $R^{B1}$ | $R^{C30}$ | $R^{E12}$ | $R^{B18}$ |
| $L_{A2680}$ | $R^{B1}$ | $R^{C30}$ | $R^{E13}$ | $R^{B18}$ |
| $L_{A2681}$ | $R^{B1}$ | $R^{C30}$ | $R^{E14}$ | $R^{B18}$ |
| $L_{A2682}$ | $R^{B1}$ | $R^{C30}$ | $R^{E15}$ | $R^{B18}$ |
| $L_{A2683}$ | $R^{B1}$ | $R^{C30}$ | $R^{E16}$ | $R^{B18}$ |
| $L_{A2684}$ | $R^{B1}$ | $R^{C30}$ | $R^{E17}$ | $R^{B18}$ |
| $L_{A2685}$ | $R^{B1}$ | $R^{C30}$ | $R^{E18}$ | $R^{B18}$ |
| $L_{A2686}$ | $R^{B1}$ | $R^{C30}$ | $R^{E19}$ | $R^{B18}$ |
| $L_{A2687}$ | $R^{B1}$ | $R^{C30}$ | $R^{E20}$ | $R^{B18}$ |
| $L_{A2688}$ | $R^{B1}$ | $R^{C30}$ | $R^{E21}$ | $R^{B18}$ |
| $L_{A2689}$ | $R^{B1}$ | $R^{C30}$ | $R^{B3}$ | $R^{A3}$ |
| $L_{A2690}$ | $R^{B1}$ | $R^{C30}$ | $R^{B6}$ | $R^{A3}$ |
| $L_{A2691}$ | $R^{B1}$ | $R^{C30}$ | $R^{B7}$ | $R^{A3}$ |
| $L_{A2692}$ | $R^{B1}$ | $R^{C30}$ | $R^{B12}$ | $R^{A3}$ |
| $L_{A2693}$ | $R^{B1}$ | $R^{C30}$ | $R^{B20}$ | $R^{A3}$ |
| $L_{A2694}$ | $R^{B1}$ | $R^{C30}$ | $R^{B25}$ | $R^{A3}$ |
| $L_{A2695}$ | $R^{B1}$ | $R^{C30}$ | $R^{B29}$ | $R^{A3}$ |
| $L_{A2696}$ | $R^{B1}$ | $R^{C30}$ | $R^{A37}$ | $R^{A3}$ |
| $L_{A2697}$ | $R^{B1}$ | $R^{C30}$ | $R^{A43}$ | $R^{A3}$ |
| $L_{A2698}$ | $R^{B1}$ | $R^{C30}$ | $R^{E1}$ | $R^{A3}$ |
| $L_{A2699}$ | $R^{B1}$ | $R^{C30}$ | $R^{E2}$ | $R^{A3}$ |
| $L_{A2700}$ | $R^{B1}$ | $R^{C30}$ | $R^{E3}$ | $R^{A3}$ |
| $L_{A2701}$ | $R^{B1}$ | $R^{C30}$ | $R^{E4}$ | $R^{A3}$ |
| $L_{A2702}$ | $R^{B1}$ | $R^{C30}$ | $R^{E5}$ | $R^{A3}$ |
| $L_{A2703}$ | $R^{B1}$ | $R^{C30}$ | $R^{E6}$ | $R^{A3}$ |
| $L_{A2704}$ | $R^{B1}$ | $R^{C30}$ | $R^{E7}$ | $R^{A3}$ |
| $L_{A2705}$ | $R^{B1}$ | $R^{C30}$ | $R^{E8}$ | $R^{A3}$ |
| $L_{A2706}$ | $R^{B1}$ | $R^{C30}$ | $R^{E9}$ | $R^{A3}$ |
| $L_{A2707}$ | $R^{B1}$ | $R^{C3}$ | $R^{E10}$ | $R^{A3}$ |
| $L_{A2708}$ | $R^{B1}$ | $R^{C30}$ | $R^{E11}$ | $R^{A3}$ |
| $L_{A2709}$ | $R^{B1}$ | $R^{C30}$ | $R^{E12}$ | $R^{A3}$ |
| $L_{A2710}$ | $R^{B1}$ | $R^{C30}$ | $R^{E13}$ | $R^{A3}$ |
| $L_{A2711}$ | $R^{B1}$ | $R^{C30}$ | $R^{E14}$ | $R^{A3}$ |
| $L_{A2712}$ | $R^{B1}$ | $R^{C30}$ | $R^{E15}$ | $R^{A3}$ |
| $L_{A2713}$ | $R^{B1}$ | $R^{C30}$ | $R^{E16}$ | $R^{A3}$ |
| $L_{A2714}$ | $R^{B1}$ | $R^{C30}$ | $R^{E17}$ | $R^{A3}$ |
| $L_{A2715}$ | $R^{B1}$ | $R^{C30}$ | $R^{E18}$ | $R^{A3}$ |
| $L_{A216}$ | $R^{B1}$ | $R^{C30}$ | $R^{E19}$ | $R^{A3}$ |
| $L_{A2717}$ | $R^{B1}$ | $R^{C30}$ | $R^{E20}$ | $R^{A3}$ |
| $L_{A2718}$ | $R^{B1}$ | $R^{C30}$ | $R^{E21}$ | $R^{A3}$ |
| $L_{A2719}$ | $R^{B1}$ | $R^{C30}$ | $R^{B3}$ | $R^{A34}$ |
| $L_{A2720}$ | $R^{B1}$ | $R^{C30}$ | $R^{B6}$ | $R^{A34}$ |

-continued

| Ligand | $R^1$ | $R^2$ | $R^3$ | $R^4$ |
|---|---|---|---|---|
| $L_{A2721}$ | $R^{B1}$ | $R^{C30}$ | $R^{B7}$ | $R^{A34}$ |
| $L_{A2722}$ | $R^{B1}$ | $R^{C30}$ | $R^{B12}$ | $R^{A34}$ |
| $L_{A2723}$ | $R^{B1}$ | $R^{C30}$ | $R^{B20}$ | $R^{A34}$ |
| $L_{A2724}$ | $R^{B1}$ | $R^{C30}$ | $R^{B25}$ | $R^{A34}$ |
| $L_{A2725}$ | $R^{B1}$ | $R^{C30}$ | $R^{B29}$ | $R^{A34}$ |
| $L_{A2726}$ | $R^{B1}$ | $R^{C30}$ | $R^{A37}$ | $R^{A34}$ |
| $L_{A2727}$ | $R^{B1}$ | $R^{C30}$ | $R^{A43}$ | $R^{A34}$ |
| $L_{A2728}$ | $R^{B1}$ | $R^{C30}$ | $R^{E1}$ | $R^{A34}$ |
| $L_{A2729}$ | $R^{B1}$ | $R^{C30}$ | $R^{E2}$ | $R^{A34}$ |
| $L_{A2730}$ | $R^{B1}$ | $R^{C30}$ | $R^{E3}$ | $R^{A34}$ |
| $L_{A2731}$ | $R^{B1}$ | $R^{C30}$ | $R^{E4}$ | $R^{A34}$ |
| $L_{A2732}$ | $R^{B1}$ | $R^{C30}$ | $R^{E5}$ | $R^{A34}$ |
| $L_{A2733}$ | $R^{B1}$ | $R^{C30}$ | $R^{E6}$ | $R^{A34}$ |
| $L_{A2734}$ | $R^{B1}$ | $R^{C30}$ | $R^{E7}$ | $R^{A34}$ |
| $L_{A2735}$ | $R^{B1}$ | $R^{C30}$ | $R^{E8}$ | $R^{A34}$ |
| $L_{A2736}$ | $R^{B1}$ | $R^{C30}$ | $R^{E9}$ | $R^{A34}$ |
| $L_{A2737}$ | $R^{B1}$ | $R^{C30}$ | $R^{E10}$ | $R^{A34}$ |
| $L_{A2738}$ | $R^{B1}$ | $R^{C30}$ | $R^{E11}$ | $R^{A34}$ |
| $L_{A2739}$ | $R^{B1}$ | $R^{C30}$ | $R^{E12}$ | $R^{A34}$ |
| $L_{A2740}$ | $R^{B1}$ | $R^{C30}$ | $R^{E13}$ | $R^{A34}$ |
| $L_{A2741}$ | $R^{B1}$ | $R^{C30}$ | $R^{E14}$ | $R^{A34}$ |
| $L_{A2742}$ | $R^{B1}$ | $R^{C30}$ | $R^{E15}$ | $R^{A34}$ |
| $L_{A2743}$ | $R^{B1}$ | $R^{C30}$ | $R^{E16}$ | $R^{A34}$ |
| $L_{A2744}$ | $R^{B1}$ | $R^{C30}$ | $R^{E17}$ | $R^{A34}$ |
| $L_{A2745}$ | $R^{B1}$ | $R^{C30}$ | $R^{E18}$ | $R^{A34}$ |
| $L_{A2746}$ | $R^{B1}$ | $R^{C30}$ | $R^{E19}$ | $R^{A34}$ |
| $L_{A2747}$ | $R^{B1}$ | $R^{C30}$ | $R^{E20}$ | $R^{A34}$ |
| $L_{A2748}$ | $R^{B1}$ | $R^{C30}$ | $R^{E21}$ | $R^{A34}$ |
| $L_{A2749}$ | $R^{B1}$ | $R^{C30}$ | $R^{B3}$ | $R^{A52}$ |
| $L_{A2750}$ | $R^{B1}$ | $R^{C30}$ | $R^{B6}$ | $R^{A52}$ |
| $L_{A2751}$ | $R^{B1}$ | $R^{C30}$ | $R^{B7}$ | $R^{A52}$ |
| $L_{A2752}$ | $R^{B1}$ | $R^{C30}$ | $R^{B12}$ | $R^{A52}$ |
| $L_{A2753}$ | $R^{B1}$ | $R^{C30}$ | $R^{B20}$ | $R^{A52}$ |
| $L_{A2754}$ | $R^{B1}$ | $R^{C30}$ | $R^{B25}$ | $R^{A52}$ |
| $L_{A2755}$ | $R^{B1}$ | $R^{C30}$ | $R^{B29}$ | $R^{A52}$ |
| $L_{A2756}$ | $R^{B1}$ | $R^{C30}$ | $R^{A37}$ | $R^{A52}$ |
| $L_{A2757}$ | $R^{B1}$ | $R^{C30}$ | $R^{A43}$ | $R^{A52}$ |
| $L_{A2758}$ | $R^{B1}$ | $R^{C30}$ | $R^{E1}$ | $R^{A52}$ |
| $L_{A2759}$ | $R^{B1}$ | $R^{C30}$ | $R^{E2}$ | $R^{A52}$ |
| $L_{A2760}$ | $R^{B1}$ | $R^{C30}$ | $R^{E3}$ | $R^{A52}$ |
| $L_{A2761}$ | $R^{B1}$ | $R^{C30}$ | $R^{E4}$ | $R^{A52}$ |
| $L_{A2762}$ | $R^{B1}$ | $R^{C30}$ | $R^{E5}$ | $R^{A52}$ |
| $L_{A2763}$ | $R^{B1}$ | $R^{C30}$ | $R^{E6}$ | $R^{A52}$ |
| $L_{A2764}$ | $R^{B1}$ | $R^{C30}$ | $R^{E7}$ | $R^{A52}$ |
| $L_{A2765}$ | $R^{B1}$ | $R^{C30}$ | $R^{E8}$ | $R^{A52}$ |
| $L_{A2766}$ | $R^{B1}$ | $R^{C30}$ | $R^{E9}$ | $R^{A52}$ |
| $L_{A2767}$ | $R^{B1}$ | $R^{C30}$ | $R^{E10}$ | $R^{A52}$ |
| $L_{A2768}$ | $R^{B1}$ | $R^{C30}$ | $R^{E11}$ | $R^{A52}$ |
| $L_{A2769}$ | $R^{B1}$ | $R^{C30}$ | $R^{E12}$ | $R^{A52}$ |
| $L_{A2770}$ | $R^{B1}$ | $R^{C30}$ | $R^{E13}$ | $R^{A52}$ |
| $L_{A2771}$ | $R^{B1}$ | $R^{C30}$ | $R^{E14}$ | $R^{A52}$ |
| $L_{A2772}$ | $R^{B1}$ | $R^{C30}$ | $R^{E15}$ | $R^{A52}$ |
| $L_{A2773}$ | $R^{B1}$ | $R^{C30}$ | $R^{E16}$ | $R^{A52}$ |
| $L_{A2774}$ | $R^{B1}$ | $R^{C30}$ | $R^{E17}$ | $R^{A52}$ |
| $L_{A2775}$ | $R^{B1}$ | $R^{C30}$ | $R^{E18}$ | $R^{A52}$ |
| $L_{A2776}$ | $R^{B1}$ | $R^{C30}$ | $R^{E19}$ | $R^{A52}$ |
| $L_{A2777}$ | $R^{B1}$ | $R^{C30}$ | $R^{E20}$ | $R^{A52}$ |
| $L_{A2778}$ | $R^{B1}$ | $R^{C30}$ | $R^{E21}$ | $R^{A52}$ |

$L_{A2779}$ through $L_{A4038}$ that are based on a structure of Formula XI,

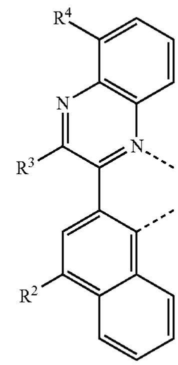

in which $R^2$, $R^3$, and $R^4$ are defined as:

| Ligand | $R^2$ | $R^3$ | $R^4$ |
|---|---|---|---|
| $L_{A2779}$ | $R^{C1}$ | $R^{B3}$ | H |
| $L_{A2780}$ | $R^{C1}$ | $R^{B6}$ | H |
| $L_{A2781}$ | $R^{C1}$ | $R^{B7}$ | H |
| $L_{A2782}$ | $R^{C1}$ | $R^{B12}$ | H |
| $L_{A2783}$ | $R^{C1}$ | $R^{B20}$ | H |
| $L_{A2784}$ | $R^{C1}$ | $R^{B25}$ | H |
| $L_{A2785}$ | $R^{C1}$ | $R^{B29}$ | H |
| $L_{A2786}$ | $R^{C1}$ | $R^{A37}$ | H |
| $L_{A2787}$ | $R^{C1}$ | $R^{A43}$ | H |
| $L_{A2788}$ | $R^{C1}$ | $R^{E1}$ | H |
| $L_{A2789}$ | $R^{C1}$ | $R^{E2}$ | H |
| $L_{A2790}$ | $R^{C1}$ | $R^{E3}$ | H |
| $L_{A2791}$ | $R^{C1}$ | $R^{E4}$ | H |
| $L_{A2792}$ | $R^{C1}$ | $R^{E5}$ | H |
| $L_{A2793}$ | $R^{C1}$ | $R^{E6}$ | H |
| $L_{A2794}$ | $R^{C1}$ | $R^{E7}$ | H |
| $L_{A2795}$ | $R^{C1}$ | $R^{E8}$ | H |
| $L_{A2796}$ | $R^{C1}$ | $R^{E9}$ | H |
| $L_{A2797}$ | $R^{C1}$ | $R^{E10}$ | H |
| $L_{A2798}$ | $R^{C1}$ | $R^{E11}$ | H |
| $L_{A2799}$ | $R^{C1}$ | $R^{E12}$ | H |
| $L_{A2800}$ | $R^{C1}$ | $R^{E13}$ | H |
| $L_{A2801}$ | $R^{C1}$ | $R^{E14}$ | H |
| $L_{A2802}$ | $R^{C1}$ | $R^{E15}$ | H |
| $L_{A2803}$ | $R^{C1}$ | $R^{E16}$ | H |
| $L_{A2804}$ | $R^{C1}$ | $R^{E17}$ | H |
| $L_{A2805}$ | $R^{C1}$ | $R^{E18}$ | H |
| $L_{A2806}$ | $R^{C1}$ | $R^{E19}$ | H |
| $L_{A2807}$ | $R^{C1}$ | $R^{E20}$ | H |
| $L_{A2808}$ | $R^{C1}$ | $R^{E21}$ | H |
| $L_{A2809}$ | $R^{C1}$ | $R^{B3}$ | $R^{B3}$ |
| $L_{A2810}$ | $R^{C1}$ | $R^{B6}$ | $R^{B3}$ |
| $L_{A2811}$ | $R^{C1}$ | $R^{B7}$ | $R^{B3}$ |
| $L_{A2812}$ | $R^{C1}$ | $R^{B12}$ | $R^{B3}$ |
| $L_{A2813}$ | $R^{C1}$ | $R^{B20}$ | $R^{B3}$ |
| $L_{A2814}$ | $R^{C1}$ | $R^{B25}$ | $R^{B3}$ |
| $L_{A2815}$ | $R^{C1}$ | $R^{B29}$ | $R^{B3}$ |
| $L_{A2816}$ | $R^{C1}$ | $R^{A37}$ | $R^{B3}$ |
| $L_{A2817}$ | $R^{C1}$ | $R^{A43}$ | $R^{B3}$ |
| $L_{A2818}$ | $R^{C1}$ | $R^{E1}$ | $R^{B3}$ |
| $L_{A2819}$ | $R^{C1}$ | $R^{E2}$ | $R^{B3}$ |
| $L_{A2820}$ | $R^{C1}$ | $R^{E3}$ | $R^{B3}$ |
| $L_{A2821}$ | $R^{C1}$ | $R^{E4}$ | $R^{B3}$ |
| $L_{A2822}$ | $R^{C1}$ | $R^{E5}$ | $R^{B3}$ |
| $L_{A2823}$ | $R^{C1}$ | $R^{E6}$ | $R^{B3}$ |
| $L_{A2824}$ | $R^{C1}$ | $R^{E7}$ | $R^{B3}$ |
| $L_{A2825}$ | $R^{C1}$ | $R^{E8}$ | $R^{B3}$ |
| $L_{A2826}$ | $R^{C1}$ | $R^{E9}$ | $R^{B3}$ |
| $L_{A2827}$ | $R^{C1}$ | $R^{E10}$ | $R^{B3}$ |
| $L_{A2828}$ | $R^{C1}$ | $R^{E11}$ | $R^{B3}$ |
| $L_{A2829}$ | $R^{C1}$ | $R^{E12}$ | $R^{B3}$ |
| $L_{A2830}$ | $R^{C1}$ | $R^{E13}$ | $R^{B3}$ |
| $L_{A2831}$ | $R^{C1}$ | $R^{E14}$ | $R^{B3}$ |
| $L_{A2832}$ | $R^{C1}$ | $R^{E15}$ | $R^{B3}$ |
| $L_{A2833}$ | $R^{C1}$ | $R^{E16}$ | $R^{B3}$ |
| $L_{A2834}$ | $R^{C1}$ | $R^{E17}$ | $R^{B3}$ |

-continued

| Ligand | $R^2$ | $R^3$ | $R^4$ |
|---|---|---|---|
| $L_{A2835}$ | $R^{C1}$ | $R^{E18}$ | $R^{B3}$ |
| $L_{A2836}$ | $R^{C1}$ | $R^{E19}$ | $R^{B3}$ |
| $L_{A2837}$ | $R^{C1}$ | $R^{E20}$ | $R^{B3}$ |
| $L_{A2838}$ | $R^{C1}$ | $R^{E21}$ | $R^{B3}$ |
| $L_{A2839}$ | $R^{C1}$ | $R^{B3}$ | $R^{B4}$ |
| $L_{A2840}$ | $R^{C1}$ | $R^{B6}$ | $R^{B4}$ |
| $L_{A2841}$ | $R^{C1}$ | $R^{B7}$ | $R^{B4}$ |
| $L_{A2842}$ | $R^{C1}$ | $R^{B12}$ | $R^{B4}$ |
| $L_{A2843}$ | $R^{C1}$ | $R^{B20}$ | $R^{B4}$ |
| $L_{A2844}$ | $R^{C1}$ | $R^{B25}$ | $R^{B4}$ |
| $L_{A2845}$ | $R^{C1}$ | $R^{B29}$ | $R^{B4}$ |
| $L_{A2846}$ | $R^{C1}$ | $R^{A37}$ | $R^{B4}$ |
| $L_{A2847}$ | $R^{C1}$ | $R^{A43}$ | $R^{B4}$ |
| $L_{A2848}$ | $R^{C1}$ | $R^{E1}$ | $R^{B4}$ |
| $L_{A2849}$ | $R^{C1}$ | $R^{E2}$ | $R^{B4}$ |
| $L_{A2850}$ | $R^{C1}$ | $R^{E3}$ | $R^{B4}$ |
| $L_{A2851}$ | $R^{C1}$ | $R^{E4}$ | $R^{B4}$ |
| $L_{A2852}$ | $R^{C1}$ | $R^{E5}$ | $R^{B4}$ |
| $L_{A2853}$ | $R^{C1}$ | $R^{E6}$ | $R^{B4}$ |
| $L_{A2854}$ | $R^{C1}$ | $R^{E7}$ | $R^{B4}$ |
| $L_{A2855}$ | $R^{C1}$ | $R^{E8}$ | $R^{B4}$ |
| $L_{A2856}$ | $R^{C1}$ | $R^{E9}$ | $R^{B4}$ |
| $L_{A2857}$ | $R^{C1}$ | $R^{E10}$ | $R^{B4}$ |
| $L_{A2858}$ | $R^{C1}$ | $R^{E11}$ | $R^{B4}$ |
| $L_{A2859}$ | $R^{C1}$ | $R^{E12}$ | $R^{B4}$ |
| $L_{A2860}$ | $R^{C1}$ | $R^{E13}$ | $R^{B4}$ |
| $L_{A2861}$ | $R^{C1}$ | $R^{E14}$ | $R^{B4}$ |
| $L_{A2862}$ | $R^{C1}$ | $R^{E15}$ | $R^{B4}$ |
| $L_{A2863}$ | $R^{C1}$ | $R^{E16}$ | $R^{B4}$ |
| $L_{A2864}$ | $R^{C1}$ | $R^{E17}$ | $R^{B4}$ |
| $L_{A2865}$ | $R^{C1}$ | $R^{E18}$ | $R^{B4}$ |
| $L_{A2866}$ | $R^{C1}$ | $R^{E19}$ | $R^{B4}$ |
| $L_{A2867}$ | $R^{C1}$ | $R^{E20}$ | $R^{B4}$ |
| $L_{A2868}$ | $R^{C1}$ | $R^{E21}$ | $R^{B4}$ |
| $L_{A2869}$ | $R^{C1}$ | $R^{B3}$ | $R^{B18}$ |
| $L_{A2870}$ | $R^{C1}$ | $R^{B6}$ | $R^{B18}$ |
| $L_{A2871}$ | $R^{C1}$ | $R^{B7}$ | $R^{B18}$ |
| $L_{A2872}$ | $R^{C1}$ | $R^{B12}$ | $R^{B18}$ |
| $L_{A2873}$ | $R^{C1}$ | $R^{B20}$ | $R^{B18}$ |
| $L_{A2874}$ | $R^{C1}$ | $R^{B25}$ | $R^{B18}$ |
| $L_{A2875}$ | $R^{C1}$ | $R^{B29}$ | $R^{B18}$ |
| $L_{A2876}$ | $R^{C1}$ | $R^{A37}$ | $R^{B18}$ |
| $L_{A2877}$ | $R^{C1}$ | $R^{A43}$ | $R^{B18}$ |
| $L_{A2878}$ | $R^{C1}$ | $R^{E1}$ | $R^{B18}$ |
| $L_{A2879}$ | $R^{C1}$ | $R^{E2}$ | $R^{B18}$ |
| $L_{A2880}$ | $R^{C1}$ | $R^{E3}$ | $R^{B18}$ |
| $L_{A2881}$ | $R^{C1}$ | $R^{E4}$ | $R^{B18}$ |
| $L_{A2882}$ | $R^{C1}$ | $R^{E5}$ | $R^{B18}$ |
| $L_{A2883}$ | $R^{C1}$ | $R^{E6}$ | $R^{B18}$ |
| $L_{A2884}$ | $R^{C1}$ | $R^{E7}$ | $R^{B18}$ |
| $L_{A2885}$ | $R^{C1}$ | $R^{E8}$ | $R^{B18}$ |
| $L_{A2886}$ | $R^{C1}$ | $R^{E9}$ | $R^{B18}$ |
| $L_{A2887}$ | $R^{C1}$ | $R^{E10}$ | $R^{B18}$ |
| $L_{A2888}$ | $R^{C1}$ | $R^{E11}$ | $R^{B18}$ |
| $L_{A2889}$ | $R^{C1}$ | $R^{E12}$ | $R^{B18}$ |
| $L_{A2890}$ | $R^{C1}$ | $R^{E13}$ | $R^{B18}$ |
| $L_{A2891}$ | $R^{C1}$ | $R^{E14}$ | $R^{B18}$ |
| $L_{A2892}$ | $R^{C1}$ | $R^{E15}$ | $R^{B18}$ |
| $L_{A2893}$ | $R^{C1}$ | $R^{E16}$ | $R^{B18}$ |
| $L_{A2894}$ | $R^{C1}$ | $R^{E17}$ | $R^{B18}$ |
| $L_{A2895}$ | $R^{C1}$ | $R^{E18}$ | $R^{B18}$ |
| $L_{A2896}$ | $R^{C1}$ | $R^{E19}$ | $R^{B18}$ |
| $L_{A2897}$ | $R^{C1}$ | $R^{E20}$ | $R^{B18}$ |
| $L_{A2898}$ | $R^{C1}$ | $R^{E21}$ | $R^{B18}$ |
| $L_{A2899}$ | $R^{C1}$ | $R^{B3}$ | $R^{A3}$ |
| $L_{A2900}$ | $R^{C1}$ | $R^{B6}$ | $R^{A3}$ |
| $L_{A2901}$ | $R^{C1}$ | $R^{B7}$ | $R^{A3}$ |
| $L_{A2902}$ | $R^{C1}$ | $R^{B12}$ | $R^{A3}$ |
| $L_{A2903}$ | $R^{C1}$ | $R^{B20}$ | $R^{A3}$ |
| $L_{A2904}$ | $R^{C1}$ | $R^{B25}$ | $R^{A3}$ |
| $L_{A2905}$ | $R^{C1}$ | $R^{B29}$ | $R^{A3}$ |
| $L_{A2906}$ | $R^{C1}$ | $R^{A37}$ | $R^{A3}$ |
| $L_{A2907}$ | $R^{C1}$ | $R^{A43}$ | $R^{A3}$ |
| $L_{A2908}$ | $R^{C1}$ | $R^{E1}$ | $R^{A3}$ |
| $L_{A2909}$ | $R^{C1}$ | $R^{E2}$ | $R^{A3}$ |
| $L_{A2910}$ | $R^{C1}$ | $R^{E3}$ | $R^{A3}$ |
| $L_{A2911}$ | $R^{C1}$ | $R^{E4}$ | $R^{A3}$ |

-continued

| Ligand | $R^2$ | $R^3$ | $R^4$ |
|---|---|---|---|
| $L_{A2912}$ | $R^{C1}$ | $R^{E5}$ | $R^{A3}$ |
| $L_{A2913}$ | $R^{C1}$ | $R^{E6}$ | $R^{A3}$ |
| $L_{A2914}$ | $R^{C1}$ | $R^{E7}$ | $R^{A3}$ |
| $L_{A2915}$ | $R^{C1}$ | $R^{E8}$ | $R^{A3}$ |
| $L_{A2916}$ | $R^{C1}$ | $R^{E9}$ | $R^{A3}$ |
| $L_{A2917}$ | $R^{C1}$ | $R^{E10}$ | $R^{A3}$ |
| $L_{A2918}$ | $R^{C1}$ | $R^{E11}$ | $R^{A3}$ |
| $L_{A2919}$ | $R^{C1}$ | $R^{E12}$ | $R^{A3}$ |
| $L_{A2920}$ | $R^{C1}$ | $R^{E13}$ | $R^{A3}$ |
| $L_{A2921}$ | $R^{C1}$ | $R^{E14}$ | $R^{A3}$ |
| $L_{A2922}$ | $R^{C1}$ | $R^{E15}$ | $R^{A3}$ |
| $L_{A2923}$ | $R^{C1}$ | $R^{E16}$ | $R^{A3}$ |
| $L_{A2924}$ | $R^{C1}$ | $R^{E17}$ | $R^{A3}$ |
| $L_{A2925}$ | $R^{C1}$ | $R^{E18}$ | $R^{A3}$ |
| $L_{A2926}$ | $R^{C1}$ | $R^{E19}$ | $R^{A3}$ |
| $L_{A2927}$ | $R^{C1}$ | $R^{E20}$ | $R^{A3}$ |
| $L_{A2928}$ | $R^{C1}$ | $R^{E21}$ | $R^{A3}$ |
| $L_{A2929}$ | $R^{C1}$ | $R^{B3}$ | $R^{A34}$ |
| $L_{A2930}$ | $R^{C1}$ | $R^{B6}$ | $R^{A34}$ |
| $L_{A2931}$ | $R^{C1}$ | $R^{B7}$ | $R^{A34}$ |
| $L_{A2932}$ | $R^{C1}$ | $R^{B12}$ | $R^{A34}$ |
| $L_{A2933}$ | $R^{C1}$ | $R^{B20}$ | $R^{A34}$ |
| $L_{A2934}$ | $R^{C1}$ | $R^{B25}$ | $R^{A34}$ |
| $L_{A2935}$ | $R^{C1}$ | $R^{B29}$ | $R^{A34}$ |
| $L_{A2936}$ | $R^{C1}$ | $R^{A37}$ | $R^{A34}$ |
| $L_{A2937}$ | $R^{C1}$ | $R^{A43}$ | $R^{A34}$ |
| $L_{A2938}$ | $R^{C1}$ | $R^{E1}$ | $R^{A34}$ |
| $L_{A2939}$ | $R^{C1}$ | $R^{E2}$ | $R^{A34}$ |
| $L_{A2940}$ | $R^{C1}$ | $R^{E3}$ | $R^{A34}$ |
| $L_{A2941}$ | $R^{C1}$ | $R^{E4}$ | $R^{A34}$ |
| $L_{A2942}$ | $R^{C1}$ | $R^{E5}$ | $R^{A34}$ |
| $L_{A2943}$ | $R^{C1}$ | $R^{E6}$ | $R^{A34}$ |
| $L_{A2944}$ | $R^{C1}$ | $R^{E7}$ | $R^{A34}$ |
| $L_{A2945}$ | $R^{C1}$ | $R^{E8}$ | $R^{A34}$ |
| $L_{A2946}$ | $R^{C1}$ | $R^{E9}$ | $R^{A34}$ |
| $L_{A2947}$ | $R^{C1}$ | $R^{E10}$ | $R^{A34}$ |
| $L_{A2948}$ | $R^{C1}$ | $R^{E11}$ | $R^{A34}$ |
| $L_{A2949}$ | $R^{C1}$ | $R^{E12}$ | $R^{A34}$ |
| $L_{A2950}$ | $R^{C1}$ | $R^{E13}$ | $R^{A34}$ |
| $L_{A2951}$ | $R^{C1}$ | $R^{E14}$ | $R^{A34}$ |
| $L_{A2952}$ | $R^{C1}$ | $R^{E15}$ | $R^{A34}$ |
| $L_{A2953}$ | $R^{C1}$ | $R^{E16}$ | $R^{A34}$ |
| $L_{A2954}$ | $R^{C1}$ | $R^{E17}$ | $R^{A34}$ |
| $L_{A2955}$ | $R^{C1}$ | $R^{E18}$ | $R^{A34}$ |
| $L_{A2956}$ | $R^{C1}$ | $R^{E19}$ | $R^{A34}$ |
| $L_{A2957}$ | $R^{C1}$ | $R^{E20}$ | $R^{A34}$ |
| $L_{A2958}$ | $R^{C1}$ | $R^{E21}$ | $R^{A34}$ |
| $L_{A2959}$ | $R^{C1}$ | $R^{B3}$ | $R^{A52}$ |
| $L_{A2960}$ | $R^{C1}$ | $R^{B6}$ | $R^{A52}$ |
| $L_{A2961}$ | $R^{C1}$ | $R^{B7}$ | $R^{A52}$ |
| $L_{A2962}$ | $R^{C1}$ | $R^{B12}$ | $R^{A52}$ |
| $L_{A2963}$ | $R^{C1}$ | $R^{B20}$ | $R^{A52}$ |
| $L_{A2964}$ | $R^{C1}$ | $R^{B25}$ | $R^{A52}$ |
| $L_{A2965}$ | $R^{C1}$ | $R^{B29}$ | $R^{A52}$ |
| $L_{A2966}$ | $R^{C1}$ | $R^{A37}$ | $R^{A52}$ |
| $L_{A2967}$ | $R^{C1}$ | $R^{A43}$ | $R^{A52}$ |
| $L_{A2968}$ | $R^{C1}$ | $R^{E1}$ | $R^{A52}$ |
| $L_{A2969}$ | $R^{C1}$ | $R^{E2}$ | $R^{A52}$ |
| $L_{A2970}$ | $R^{C1}$ | $R^{E3}$ | $R^{A52}$ |
| $L_{A2971}$ | $R^{C1}$ | $R^{E4}$ | $R^{A52}$ |
| $L_{A2972}$ | $R^{C1}$ | $R^{E5}$ | $R^{A52}$ |
| $L_{A2973}$ | $R^{C1}$ | $R^{E6}$ | $R^{A52}$ |
| $L_{A2974}$ | $R^{C1}$ | $R^{E7}$ | $R^{A52}$ |
| $L_{A2975}$ | $R^{C1}$ | $R^{E8}$ | $R^{A52}$ |
| $L_{A2976}$ | $R^{C1}$ | $R^{E9}$ | $R^{A52}$ |
| $L_{A2977}$ | $R^{C1}$ | $R^{E10}$ | $R^{A52}$ |
| $L_{A2978}$ | $R^{C1}$ | $R^{E11}$ | $R^{A52}$ |
| $L_{A2979}$ | $R^{C1}$ | $R^{E12}$ | $R^{A52}$ |
| $L_{A2980}$ | $R^{C1}$ | $R^{E13}$ | $R^{A52}$ |
| $L_{A2981}$ | $R^{C1}$ | $R^{E14}$ | $R^{A52}$ |
| $L_{A2982}$ | $R^{C1}$ | $R^{E15}$ | $R^{A52}$ |
| $L_{A2983}$ | $R^{C1}$ | $R^{E16}$ | $R^{A52}$ |
| $L_{A2984}$ | $R^{C1}$ | $R^{E17}$ | $R^{A52}$ |
| $L_{A2985}$ | $R^{C1}$ | $R^{E18}$ | $R^{A52}$ |
| $L_{A2986}$ | $R^{C1}$ | $R^{E19}$ | $R^{A52}$ |
| $L_{A2987}$ | $R^{C1}$ | $R^{E20}$ | $R^{A52}$ |
| $L_{A2988}$ | $R^{C1}$ | $R^{E21}$ | $R^{A52}$ |

-continued

| Ligand | $R^2$ | $R^3$ | $R^4$ |
|---|---|---|---|
| $L_{A2989}$ | $R^{C3}$ | $R^{B3}$ | H |
| $L_{A2990}$ | $R^{C3}$ | $R^{B6}$ | H |
| $L_{A2991}$ | $R^{C3}$ | $R^{B7}$ | H |
| $L_{A2992}$ | $R^{C3}$ | $R^{B12}$ | H |
| $L_{A2993}$ | $R^{C3}$ | $R^{B20}$ | H |
| $L_{A2994}$ | $R^{C3}$ | $R^{B25}$ | H |
| $L_{A2995}$ | $R^{C3}$ | $R^{B29}$ | H |
| $L_{A2996}$ | $R^{C3}$ | $R^{A37}$ | H |
| $L_{A2997}$ | $R^{C3}$ | $R^{A43}$ | H |
| $L_{A2998}$ | $R^{C3}$ | $R^{E1}$ | H |
| $L_{A2999}$ | $R^{C3}$ | $R^{E2}$ | H |
| $L_{A3000}$ | $R^{C3}$ | $R^{E3}$ | H |
| $L_{A3001}$ | $R^{C3}$ | $R^{E4}$ | H |
| $L_{A3002}$ | $R^{C3}$ | $R^{E5}$ | H |
| $L_{A3003}$ | $R^{C3}$ | $R^{E6}$ | H |
| $L_{A3004}$ | $R^{C3}$ | $R^{E7}$ | H |
| $L_{A3005}$ | $R^{C3}$ | $R^{E8}$ | H |
| $L_{A3006}$ | $R^{C3}$ | $R^{E9}$ | H |
| $L_{A3007}$ | $R^{C3}$ | $R^{E10}$ | H |
| $L_{A3008}$ | $R^{C3}$ | $R^{E11}$ | H |
| $L_{A3009}$ | $R^{C3}$ | $R^{E12}$ | H |
| $L_{A3010}$ | $R^{C3}$ | $R^{E13}$ | H |
| $L_{A3011}$ | $R^{C3}$ | $R^{E14}$ | H |
| $L_{A3012}$ | $R^{C3}$ | $R^{E15}$ | H |
| $L_{A3013}$ | $R^{C3}$ | $R^{E16}$ | H |
| $L_{A3014}$ | $R^{C3}$ | $R^{E17}$ | H |
| $L_{A3015}$ | $R^{C3}$ | $R^{E18}$ | H |
| $L_{A3016}$ | $R^{C3}$ | $R^{E19}$ | H |
| $L_{A3017}$ | $R^{C3}$ | $R^{E20}$ | H |
| $L_{A3018}$ | $R^{C3}$ | $R^{E21}$ | H |
| $L_{A3019}$ | $R^{C3}$ | $R^{B3}$ | $R^{B3}$ |
| $L_{A3020}$ | $R^{C3}$ | $R^{B6}$ | $R^{B3}$ |
| $L_{A3021}$ | $R^{C3}$ | $R^{B7}$ | $R^{B3}$ |
| $L_{A3022}$ | $R^{C3}$ | $R^{B12}$ | $R^{B3}$ |
| $L_{A3023}$ | $R^{C3}$ | $R^{B20}$ | $R^{B3}$ |
| $L_{A3024}$ | $R^{C3}$ | $R^{B25}$ | $R^{B3}$ |
| $L_{A3025}$ | $R^{C3}$ | $R^{B29}$ | $R^{B3}$ |
| $L_{A3026}$ | $R^{C3}$ | $R^{A37}$ | $R^{B3}$ |
| $L_{A3027}$ | $R^{C3}$ | $R^{A43}$ | $R^{B3}$ |
| $L_{A3028}$ | $R^{C3}$ | $R^{E1}$ | $R^{B3}$ |
| $L_{A3029}$ | $R^{C3}$ | $R^{E2}$ | $R^{B3}$ |
| $L_{A3030}$ | $R^{C3}$ | $R^{E3}$ | $R^{B3}$ |
| $L_{A3031}$ | $R^{C3}$ | $R^{E4}$ | $R^{B3}$ |
| $L_{A3032}$ | $R^{C3}$ | $R^{E5}$ | $R^{B3}$ |
| $L_{A3033}$ | $R^{C3}$ | $R^{E6}$ | $R^{B3}$ |
| $L_{A3034}$ | $R^{C3}$ | $R^{E7}$ | $R^{B3}$ |
| $L_{A3035}$ | $R^{C3}$ | $R^{E8}$ | $R^{B3}$ |
| $L_{A3036}$ | $R^{C3}$ | $R^{E9}$ | $R^{B3}$ |
| $L_{A3037}$ | $R^{C3}$ | $R^{E10}$ | $R^{B3}$ |
| $L_{A3038}$ | $R^{C3}$ | $R^{E11}$ | $R^{B3}$ |
| $L_{A3039}$ | $R^{C3}$ | $R^{E12}$ | $R^{B3}$ |
| $L_{A3040}$ | $R^{C3}$ | $R^{E13}$ | $R^{B3}$ |
| $L_{A3041}$ | $R^{C3}$ | $R^{E14}$ | $R^{B3}$ |
| $L_{A3042}$ | $R^{C3}$ | $R^{E15}$ | $R^{B3}$ |
| $L_{A3043}$ | $R^{C3}$ | $R^{E16}$ | $R^{B3}$ |
| $L_{A3044}$ | $R^{C3}$ | $R^{E17}$ | $R^{B3}$ |
| $L_{A3045}$ | $R^{C3}$ | $R^{E18}$ | $R^{B3}$ |
| $L_{A3046}$ | $R^{C3}$ | $R^{E19}$ | $R^{B3}$ |
| $L_{A3047}$ | $R^{C3}$ | $R^{E20}$ | $R^{B3}$ |
| $L_{A3048}$ | $R^{C3}$ | $R^{E21}$ | $R^{B3}$ |
| $L_{A3049}$ | $R^{C3}$ | $R^{B3}$ | $R^{B4}$ |
| $L_{A3050}$ | $R^{C3}$ | $R^{B6}$ | $R^{B4}$ |
| $L_{A3051}$ | $R^{C3}$ | $R^{B7}$ | $R^{B4}$ |
| $L_{A3052}$ | $R^{C3}$ | $R^{B12}$ | $R^{B4}$ |
| $L_{A3053}$ | $R^{C3}$ | $R^{B20}$ | $R^{B4}$ |
| $L_{A3054}$ | $R^{C3}$ | $R^{B25}$ | $R^{B4}$ |
| $L_{A3055}$ | $R^{C3}$ | $R^{B29}$ | $R^{B4}$ |
| $L_{A3056}$ | $R^{C3}$ | $R^{A37}$ | $R^{B4}$ |
| $L_{A3057}$ | $R^{C3}$ | $R^{A43}$ | $R^{B4}$ |
| $L_{A3058}$ | $R^{C3}$ | $R^{E1}$ | $R^{B4}$ |
| $L_{A3059}$ | $R^{C3}$ | $R^{E2}$ | $R^{B4}$ |
| $L_{A3060}$ | $R^{C3}$ | $R^{E3}$ | $R^{B4}$ |
| $L_{A3061}$ | $R^{C3}$ | $R^{E4}$ | $R^{B4}$ |
| $L_{A3062}$ | $R^{C3}$ | $R^{E5}$ | $R^{B4}$ |
| $L_{A3063}$ | $R^{C3}$ | $R^{E6}$ | $R^{B4}$ |
| $L_{A3064}$ | $R^{C3}$ | $R^{E7}$ | $R^{B4}$ |
| $L_{A3065}$ | $R^{C3}$ | $R^{E8}$ | $R^{B4}$ |
| $L_{A3066}$ | $R^{C3}$ | $R^{E9}$ | $R^{B4}$ |
| $L_{A3067}$ | $R^{C3}$ | $R^{E10}$ | $R^{B4}$ |
| $L_{A3068}$ | $R^{C3}$ | $R^{E11}$ | $R^{B4}$ |
| $L_{A3069}$ | $R^{C3}$ | $R^{E12}$ | $R^{B4}$ |
| $L_{A3070}$ | $R^{C3}$ | $R^{E13}$ | $R^{B4}$ |
| $L_{A3071}$ | $R^{C3}$ | $R^{E14}$ | $R^{B4}$ |
| $L_{A3072}$ | $R^{C3}$ | $R^{E15}$ | $R^{B4}$ |
| $L_{A3073}$ | $R^{C3}$ | $R^{E16}$ | $R^{B4}$ |
| $L_{A3074}$ | $R^{C3}$ | $R^{E17}$ | $R^{B4}$ |
| $L_{A3075}$ | $R^{C3}$ | $R^{E18}$ | $R^{B4}$ |
| $L_{A3076}$ | $R^{C3}$ | $R^{E19}$ | $R^{B4}$ |
| $L_{A3077}$ | $R^{C3}$ | $R^{E20}$ | $R^{B4}$ |
| $L_{A3078}$ | $R^{C3}$ | $R^{E21}$ | $R^{B4}$ |
| $L_{A3079}$ | $R^{C3}$ | $R^{B3}$ | $R^{B18}$ |
| $L_{A3080}$ | $R^{C3}$ | $R^{B6}$ | $R^{B18}$ |
| $L_{A3081}$ | $R^{C3}$ | $R^{B7}$ | $R^{B18}$ |
| $L_{A3082}$ | $R^{C3}$ | $R^{B12}$ | $R^{B18}$ |
| $L_{A3083}$ | $R^{C3}$ | $R^{B20}$ | $R^{B18}$ |
| $L_{A3084}$ | $R^{C3}$ | $R^{B25}$ | $R^{B18}$ |
| $L_{A3085}$ | $R^{C3}$ | $R^{B29}$ | $R^{B18}$ |
| $L_{A3086}$ | $R^{C3}$ | $R^{A37}$ | $R^{B18}$ |
| $L_{A3087}$ | $R^{C3}$ | $R^{A43}$ | $R^{B18}$ |
| $L_{A3088}$ | $R^{C3}$ | $R^{E1}$ | $R^{B18}$ |
| $L_{A3089}$ | $R^{C3}$ | $R^{E2}$ | $R^{B18}$ |
| $L_{A3090}$ | $R^{C3}$ | $R^{E3}$ | $R^{B18}$ |
| $L_{A3091}$ | $R^{C3}$ | $R^{E4}$ | $R^{B18}$ |
| $L_{A3092}$ | $R^{C3}$ | $R^{E5}$ | $R^{B18}$ |
| $L_{A3093}$ | $R^{C3}$ | $R^{E6}$ | $R^{B18}$ |
| $L_{A3094}$ | $R^{C3}$ | $R^{E7}$ | $R^{B18}$ |
| $L_{A3095}$ | $R^{C3}$ | $R^{E8}$ | $R^{B18}$ |
| $L_{A3096}$ | $R^{C3}$ | $R^{E9}$ | $R^{B18}$ |
| $L_{A3097}$ | $R^{C3}$ | $R^{E10}$ | $R^{B18}$ |
| $L_{A3098}$ | $R^{C3}$ | $R^{E11}$ | $R^{B18}$ |
| $L_{A3099}$ | $R^{C3}$ | $R^{E12}$ | $R^{B18}$ |
| $L_{A3100}$ | $R^{C3}$ | $R^{E13}$ | $R^{B18}$ |
| $L_{A3101}$ | $R^{C3}$ | $R^{E14}$ | $R^{B18}$ |
| $L_{A3102}$ | $R^{C3}$ | $R^{E15}$ | $R^{B18}$ |
| $L_{A3103}$ | $R^{C3}$ | $R^{E16}$ | $R^{B18}$ |
| $L_{A3104}$ | $R^{C3}$ | $R^{E17}$ | $R^{B18}$ |
| $L_{A3105}$ | $R^{C3}$ | $R^{E18}$ | $R^{B18}$ |
| $L_{A3106}$ | $R^{C3}$ | $R^{E19}$ | $R^{B18}$ |
| $L_{A3107}$ | $R^{C3}$ | $R^{E20}$ | $R^{B18}$ |
| $L_{A3108}$ | $R^{C3}$ | $R^{E21}$ | $R^{B18}$ |
| $L_{A3109}$ | $R^{C3}$ | $R^{B3}$ | $R^{A3}$ |
| $L_{A3110}$ | $R^{C3}$ | $R^{B6}$ | $R^{A3}$ |
| $L_{A3111}$ | $R^{C3}$ | $R^{B7}$ | $R^{A3}$ |
| $L_{A3112}$ | $R^{C3}$ | $R^{B12}$ | $R^{A3}$ |
| $L_{A3113}$ | $R^{C3}$ | $R^{B20}$ | $R^{A3}$ |
| $L_{A3114}$ | $R^{C3}$ | $R^{B25}$ | $R^{A3}$ |
| $L_{A3115}$ | $R^{C3}$ | $R^{B29}$ | $R^{A3}$ |
| $L_{A3116}$ | $R^{C3}$ | $R^{A37}$ | $R^{A3}$ |
| $L_{A3117}$ | $R^{C3}$ | $R^{A43}$ | $R^{A3}$ |
| $L_{A3118}$ | $R^{C3}$ | $R^{E1}$ | $R^{A3}$ |
| $L_{A3119}$ | $R^{C3}$ | $R^{E2}$ | $R^{A3}$ |
| $L_{A3120}$ | $R^{C3}$ | $R^{E3}$ | $R^{A3}$ |
| $L_{A3121}$ | $R^{C3}$ | $R^{E4}$ | $R^{A3}$ |
| $L_{A3122}$ | $R^{C3}$ | $R^{E5}$ | $R^{A3}$ |
| $L_{A3123}$ | $R^{C3}$ | $R^{E6}$ | $R^{A3}$ |
| $L_{A3124}$ | $R^{C3}$ | $R^{E7}$ | $R^{A3}$ |
| $L_{A3125}$ | $R^{C3}$ | $R^{E8}$ | $R^{A3}$ |
| $L_{A3126}$ | $R^{C3}$ | $R^{E9}$ | $R^{A3}$ |
| $L_{A3127}$ | $R^{C3}$ | $R^{E10}$ | $R^{A3}$ |
| $L_{A3128}$ | $R^{C3}$ | $R^{E11}$ | $R^{A3}$ |
| $L_{A3129}$ | $R^{C3}$ | $R^{E12}$ | $R^{A3}$ |
| $L_{A3130}$ | $R^{C3}$ | $R^{E13}$ | $R^{A3}$ |
| $L_{A3131}$ | $R^{C3}$ | $R^{E14}$ | $R^{A3}$ |
| $L_{A3132}$ | $R^{C3}$ | $R^{E15}$ | $R^{A3}$ |
| $L_{A3133}$ | $R^{C3}$ | $R^{E16}$ | $R^{A3}$ |
| $L_{A3134}$ | $R^{C3}$ | $R^{E17}$ | $R^{A3}$ |
| $L_{A3135}$ | $R^{C3}$ | $R^{E18}$ | $R^{A3}$ |
| $L_{A3136}$ | $R^{C3}$ | $R^{E19}$ | $R^{A3}$ |
| $L_{A3137}$ | $R^{C3}$ | $R^{E20}$ | $R^{A3}$ |
| $L_{A3138}$ | $R^{C3}$ | $R^{E21}$ | $R^{A3}$ |
| $L_{A3139}$ | $R^{C3}$ | $R^{B3}$ | $R^{A34}$ |
| $L_{A3140}$ | $R^{C3}$ | $R^{B6}$ | $R^{A34}$ |
| $L_{A3141}$ | $R^{C3}$ | $R^{B7}$ | $R^{A34}$ |
| $L_{A3142}$ | $R^{C3}$ | $R^{B12}$ | $R^{A34}$ |

-continued

| Ligand | $R^2$ | $R^3$ | $R^4$ |
|---|---|---|---|
| $L_{A3143}$ | $R^{C3}$ | $R^{B20}$ | $R^{A34}$ |
| $L_{A3144}$ | $R^{C3}$ | $R^{B25}$ | $R^{A34}$ |
| $L_{A3145}$ | $R^{C3}$ | $R^{B29}$ | $R^{A34}$ |
| $L_{A3146}$ | $R^{C3}$ | $R^{A37}$ | $R^{A34}$ |
| $L_{A3147}$ | $R^{C3}$ | $R^{A43}$ | $R^{A34}$ |
| $L_{A3148}$ | $R^{C3}$ | $R^{E1}$ | $R^{A34}$ |
| $L_{A3149}$ | $R^{C3}$ | $R^{E2}$ | $R^{A34}$ |
| $L_{A3150}$ | $R^{C3}$ | $R^{E3}$ | $R^{A34}$ |
| $L_{A3151}$ | $R^{C3}$ | $R^{E4}$ | $R^{A34}$ |
| $L_{A3152}$ | $R^{C3}$ | $R^{E5}$ | $R^{A34}$ |
| $L_{A3153}$ | $R^{C3}$ | $R^{E6}$ | $R^{A34}$ |
| $L_{A3154}$ | $R^{C3}$ | $R^{E7}$ | $R^{A34}$ |
| $L_{A3155}$ | $R^{C3}$ | $R^{E8}$ | $R^{A34}$ |
| $L_{A3156}$ | $R^{C3}$ | $R^{E9}$ | $R^{A34}$ |
| $L_{A3157}$ | $R^{C3}$ | $R^{E10}$ | $R^{A34}$ |
| $L_{A3158}$ | $R^{C3}$ | $R^{E11}$ | $R^{A34}$ |
| $L_{A3159}$ | $R^{C3}$ | $R^{E12}$ | $R^{A34}$ |
| $L_{A3160}$ | $R^{C3}$ | $R^{E13}$ | $R^{A34}$ |
| $L_{A3161}$ | $R^{C3}$ | $R^{E14}$ | $R^{A34}$ |
| $L_{A3162}$ | $R^{C3}$ | $R^{E15}$ | $R^{A34}$ |
| $L_{A3163}$ | $R^{C3}$ | $R^{E16}$ | $R^{A34}$ |
| $L_{A3164}$ | $R^{C3}$ | $R^{E17}$ | $R^{A34}$ |
| $L_{A3165}$ | $R^{C3}$ | $R^{E18}$ | $R^{A34}$ |
| $L_{A3166}$ | $R^{C3}$ | $R^{E19}$ | $R^{A34}$ |
| $L_{A3167}$ | $R^{C3}$ | $R^{E20}$ | $R^{A34}$ |
| $L_{A3168}$ | $R^{C3}$ | $R^{E21}$ | $R^{A34}$ |
| $L_{A3169}$ | $R^{C3}$ | $R^{B3}$ | $R^{A52}$ |
| $L_{A3170}$ | $R^{C3}$ | $R^{B6}$ | $R^{A52}$ |
| $L_{A3171}$ | $R^{C3}$ | $R^{B7}$ | $R^{A52}$ |
| $L_{A3172}$ | $R^{C3}$ | $R^{B12}$ | $R^{A52}$ |
| $L_{A3173}$ | $R^{C3}$ | $R^{B20}$ | $R^{A52}$ |
| $L_{A3174}$ | $R^{C3}$ | $R^{B25}$ | $R^{A52}$ |
| $L_{A3175}$ | $R^{C3}$ | $R^{B29}$ | $R^{A52}$ |
| $L_{A3176}$ | $R^{C3}$ | $R^{A37}$ | $R^{A52}$ |
| $L_{A3177}$ | $R^{C3}$ | $R^{A43}$ | $R^{A52}$ |
| $L_{A3178}$ | $R^{C3}$ | $R^{E1}$ | $R^{A52}$ |
| $L_{A3179}$ | $R^{C3}$ | $R^{E2}$ | $R^{A52}$ |
| $L_{A3180}$ | $R^{C3}$ | $R^{E3}$ | $R^{A52}$ |
| $L_{A3181}$ | $R^{C3}$ | $R^{E4}$ | $R^{A52}$ |
| $L_{A3182}$ | $R^{C3}$ | $R^{E5}$ | $R^{A52}$ |
| $L_{A3183}$ | $R^{C3}$ | $R^{E6}$ | $R^{A52}$ |
| $L_{A3184}$ | $R^{C3}$ | $R^{E7}$ | $R^{A52}$ |
| $L_{A3185}$ | $R^{C3}$ | $R^{E8}$ | $R^{A52}$ |
| $L_{A3186}$ | $R^{C3}$ | $R^{E9}$ | $R^{A52}$ |
| $L_{A3187}$ | $R^{C3}$ | $R^{E10}$ | $R^{A52}$ |
| $L_{A3188}$ | $R^{C3}$ | $R^{E11}$ | $R^{A52}$ |
| $L_{A3189}$ | $R^{C3}$ | $R^{E12}$ | $R^{A52}$ |
| $L_{A3190}$ | $R^{C3}$ | $R^{E13}$ | $R^{A52}$ |
| $L_{A3191}$ | $R^{C3}$ | $R^{E14}$ | $R^{A52}$ |
| $L_{A3192}$ | $R^{C3}$ | $R^{E15}$ | $R^{A52}$ |
| $L_{A3193}$ | $R^{C3}$ | $R^{E16}$ | $R^{A52}$ |
| $L_{A3194}$ | $R^{C3}$ | $R^{E17}$ | $R^{A52}$ |
| $L_{A3195}$ | $R^{C3}$ | $R^{E18}$ | $R^{A52}$ |
| $L_{A3196}$ | $R^{C3}$ | $R^{E19}$ | $R^{A52}$ |
| $L_{A3197}$ | $R^{C3}$ | $R^{E20}$ | $R^{A52}$ |
| $L_{A3198}$ | $R^{C3}$ | $R^{E21}$ | $R^{A52}$ |
| $L_{A3199}$ | $R^{C31}$ | $R^{B3}$ | H |
| $L_{A3200}$ | $R^{C31}$ | $R^{B6}$ | H |
| $L_{A3201}$ | $R^{C31}$ | $R^{B7}$ | H |
| $L_{A3202}$ | $R^{C31}$ | $R^{B12}$ | H |
| $L_{A3203}$ | $R^{C31}$ | $R^{B20}$ | H |
| $L_{A3204}$ | $R^{C31}$ | $R^{B25}$ | H |
| $L_{A3205}$ | $R^{C31}$ | $R^{B29}$ | H |
| $L_{A3206}$ | $R^{C31}$ | $R^{A37}$ | H |
| $L_{A3207}$ | $R^{C31}$ | $R^{A43}$ | H |
| $L_{A3208}$ | $R^{C31}$ | $R^{E1}$ | H |
| $L_{A3209}$ | $R^{C31}$ | $R^{E2}$ | H |
| $L_{A3210}$ | $R^{C31}$ | $R^{E3}$ | H |
| $L_{A3211}$ | $R^{C31}$ | $R^{E4}$ | H |
| $L_{A3212}$ | $R^{C31}$ | $R^{E5}$ | H |
| $L_{A3213}$ | $R^{C31}$ | $R^{E6}$ | H |
| $L_{A3214}$ | $R^{C31}$ | $R^{E7}$ | H |
| $L_{A3215}$ | $R^{C31}$ | $R^{E8}$ | H |
| $L_{A3216}$ | $R^{C31}$ | $R^{E9}$ | H |
| $L_{A3217}$ | $R^{C31}$ | $R^{E10}$ | H |
| $L_{A3218}$ | $R^{C31}$ | $R^{E11}$ | H |
| $L_{A3219}$ | $R^{C31}$ | $R^{E12}$ | H |

-continued

| Ligand | $R^2$ | $R^3$ | $R^4$ |
|---|---|---|---|
| $L_{A3220}$ | $R^{C31}$ | $R^{E13}$ | H |
| $L_{A3221}$ | $R^{C31}$ | $R^{E14}$ | H |
| $L_{A3222}$ | $R^{C31}$ | $R^{E15}$ | H |
| $L_{A3223}$ | $R^{C31}$ | $R^{E16}$ | H |
| $L_{A3224}$ | $R^{C31}$ | $R^{E17}$ | H |
| $L_{A3225}$ | $R^{C31}$ | $R^{E18}$ | H |
| $L_{A3226}$ | $R^{C31}$ | $R^{E19}$ | H |
| $L_{A3227}$ | $R^{C31}$ | $R^{E20}$ | H |
| $L_{A3228}$ | $R^{C31}$ | $R^{E21}$ | H |
| $L_{A3229}$ | $R^{C31}$ | $R^{B3}$ | $R^{B3}$ |
| $L_{A3230}$ | $R^{C31}$ | $R^{B6}$ | $R^{B3}$ |
| $L_{A3231}$ | $R^{C31}$ | $R^{B7}$ | $R^{B3}$ |
| $L_{A3232}$ | $R^{C31}$ | $R^{B12}$ | $R^{B3}$ |
| $L_{A3233}$ | $R^{C31}$ | $R^{B20}$ | $R^{B3}$ |
| $L_{A3234}$ | $R^{C31}$ | $R^{B25}$ | $R^{B3}$ |
| $L_{A3235}$ | $R^{C31}$ | $R^{B29}$ | $R^{B3}$ |
| $L_{A3236}$ | $R^{C31}$ | $R^{A37}$ | $R^{B3}$ |
| $L_{A3237}$ | $R^{C31}$ | $R^{A43}$ | $R^{B3}$ |
| $L_{A3238}$ | $R^{C31}$ | $R^{E1}$ | $R^{B3}$ |
| $L_{A3239}$ | $R^{C31}$ | $R^{E2}$ | $R^{B3}$ |
| $L_{A3240}$ | $R^{C31}$ | $R^{E3}$ | $R^{B3}$ |
| $L_{A3241}$ | $R^{C31}$ | $R^{E4}$ | $R^{B3}$ |
| $L_{A3242}$ | $R^{C31}$ | $R^{E5}$ | $R^{B3}$ |
| $L_{A3243}$ | $R^{C31}$ | $R^{E6}$ | $R^{B3}$ |
| $L_{A3244}$ | $R^{C31}$ | $R^{E7}$ | $R^{B3}$ |
| $L_{A3245}$ | $R^{C31}$ | $R^{E8}$ | $R^{B3}$ |
| $L_{A3246}$ | $R^{C31}$ | $R^{E9}$ | $R^{B3}$ |
| $L_{A3247}$ | $R^{C31}$ | $R^{E10}$ | $R^{B3}$ |
| $L_{A3248}$ | $R^{C31}$ | $R^{E11}$ | $R^{B3}$ |
| $L_{A3249}$ | $R^{C31}$ | $R^{E12}$ | $R^{B3}$ |
| $L_{A3250}$ | $R^{C31}$ | $R^{E13}$ | $R^{B3}$ |
| $L_{A3251}$ | $R^{C31}$ | $R^{E14}$ | $R^{B3}$ |
| $L_{A3252}$ | $R^{C31}$ | $R^{E15}$ | $R^{B3}$ |
| $L_{A3253}$ | $R^{C31}$ | $R^{E16}$ | $R^{B3}$ |
| $L_{A3254}$ | $R^{C31}$ | $R^{E17}$ | $R^{B3}$ |
| $L_{A3255}$ | $R^{C31}$ | $R^{E18}$ | $R^{B3}$ |
| $L_{A3256}$ | $R^{C31}$ | $R^{E19}$ | $R^{B3}$ |
| $L_{A3257}$ | $R^{C31}$ | $R^{E20}$ | $R^{B3}$ |
| $L_{A3258}$ | $R^{C31}$ | $R^{E21}$ | $R^{B3}$ |
| $L_{A3259}$ | $R^{C31}$ | $R^{B3}$ | $R^{B4}$ |
| $L_{A3260}$ | $R^{C31}$ | $R^{B6}$ | $R^{B4}$ |
| $L_{A3261}$ | $R^{C31}$ | $R^{B7}$ | $R^{B4}$ |
| $L_{A3262}$ | $R^{C31}$ | $R^{B12}$ | $R^{B4}$ |
| $L_{A3263}$ | $R^{C31}$ | $R^{B20}$ | $R^{B4}$ |
| $L_{A3264}$ | $R^{C31}$ | $R^{B25}$ | $R^{B4}$ |
| $L_{A3265}$ | $R^{C31}$ | $R^{B29}$ | $R^{B4}$ |
| $L_{A3266}$ | $R^{C31}$ | $R^{A37}$ | $R^{B4}$ |
| $L_{A3267}$ | $R^{C31}$ | $R^{A43}$ | $R^{B4}$ |
| $L_{A3268}$ | $R^{C31}$ | $R^{E1}$ | $R^{B4}$ |
| $L_{A3269}$ | $R^{C31}$ | $R^{E2}$ | $R^{B4}$ |
| $L_{A3270}$ | $R^{C31}$ | $R^{E3}$ | $R^{B4}$ |
| $L_{A3271}$ | $R^{C31}$ | $R^{E4}$ | $R^{B4}$ |
| $L_{A3272}$ | $R^{C31}$ | $R^{E5}$ | $R^{B4}$ |
| $L_{A3273}$ | $R^{C31}$ | $R^{E6}$ | $R^{B4}$ |
| $L_{A3274}$ | $R^{C31}$ | $R^{E7}$ | $R^{B4}$ |
| $L_{A3275}$ | $R^{C31}$ | $R^{E8}$ | $R^{B4}$ |
| $L_{A3276}$ | $R^{C31}$ | $R^{E9}$ | $R^{B4}$ |
| $L_{A3277}$ | $R^{C31}$ | $R^{E10}$ | $R^{B4}$ |
| $L_{A3278}$ | $R^{C31}$ | $R^{E11}$ | $R^{B4}$ |
| $L_{A3279}$ | $R^{C31}$ | $R^{E12}$ | $R^{B4}$ |
| $L_{A3280}$ | $R^{C31}$ | $R^{E13}$ | $R^{B4}$ |
| $L_{A3281}$ | $R^{C31}$ | $R^{E14}$ | $R^{B4}$ |
| $L_{A3282}$ | $R^{C31}$ | $R^{E15}$ | $R^{B4}$ |
| $L_{A3283}$ | $R^{C31}$ | $R^{E16}$ | $R^{B4}$ |
| $L_{A3284}$ | $R^{C31}$ | $R^{E17}$ | $R^{B4}$ |
| $L_{A3285}$ | $R^{C31}$ | $R^{E18}$ | $R^{B4}$ |
| $L_{A3286}$ | $R^{C31}$ | $R^{E19}$ | $R^{B4}$ |
| $L_{A3287}$ | $R^{C31}$ | $R^{E20}$ | $R^{B4}$ |
| $L_{A3288}$ | $R^{C31}$ | $R^{E21}$ | $R^{B4}$ |
| $L_{A3289}$ | $R^{C31}$ | $R^{B3}$ | $R^{B18}$ |
| $L_{A3290}$ | $R^{C31}$ | $R^{B6}$ | $R^{B18}$ |
| $L_{A3291}$ | $R^{C31}$ | $R^{B7}$ | $R^{B18}$ |
| $L_{A3292}$ | $R^{C31}$ | $R^{B12}$ | $R^{B18}$ |
| $L_{A3293}$ | $R^{C31}$ | $R^{B20}$ | $R^{B18}$ |
| $L_{A3294}$ | $R^{C31}$ | $R^{B25}$ | $R^{B18}$ |
| $L_{A3295}$ | $R^{C31}$ | $R^{B29}$ | $R^{B18}$ |
| $L_{A3296}$ | $R^{C31}$ | $R^{A37}$ | $R^{B18}$ |

-continued

| Ligand | $R^2$ | $R^3$ | $R^4$ |
|---|---|---|---|
| $L_{A3297}$ | $R^{C31}$ | $R^{A43}$ | $R^{B18}$ |
| $L_{A3298}$ | $R^{C31}$ | $R^{E1}$ | $R^{B18}$ |
| $L_{A3299}$ | $R^{C31}$ | $R^{E2}$ | $R^{B18}$ |
| $L_{A3300}$ | $R^{C31}$ | $R^{E3}$ | $R^{B18}$ |
| $L_{A3301}$ | $R^{C31}$ | $R^{E4}$ | $R^{B18}$ |
| $L_{A3302}$ | $R^{C31}$ | $R^{E5}$ | $R^{B18}$ |
| $L_{A3303}$ | $R^{C31}$ | $R^{E6}$ | $R^{B18}$ |
| $L_{A3304}$ | $R^{C31}$ | $R^{E7}$ | $R^{B18}$ |
| $L_{A3305}$ | $R^{C31}$ | $R^{E8}$ | $R^{B18}$ |
| $L_{A3306}$ | $R^{C31}$ | $R^{E9}$ | $R^{B18}$ |
| $L_{A3307}$ | $R^{C31}$ | $R^{E10}$ | $R^{B18}$ |
| $L_{A3308}$ | $R^{C31}$ | $R^{E11}$ | $R^{B18}$ |
| $L_{A3309}$ | $R^{C31}$ | $R^{E12}$ | $R^{B18}$ |
| $L_{A3310}$ | $R^{C31}$ | $R^{E13}$ | $R^{B18}$ |
| $L_{A3311}$ | $R^{C31}$ | $R^{E14}$ | $R^{B18}$ |
| $L_{A3312}$ | $R^{C31}$ | $R^{E15}$ | $R^{B18}$ |
| $L_{A3313}$ | $R^{C31}$ | $R^{E16}$ | $R^{B18}$ |
| $L_{A3314}$ | $R^{C31}$ | $R^{E17}$ | $R^{B18}$ |
| $L_{A3315}$ | $R^{C31}$ | $R^{E18}$ | $R^{B18}$ |
| $L_{A3316}$ | $R^{C31}$ | $R^{E19}$ | $R^{B18}$ |
| $L_{A3317}$ | $R^{C31}$ | $R^{E20}$ | $R^{B18}$ |
| $L_{A3318}$ | $R^{C31}$ | $R^{E21}$ | $R^{B18}$ |
| $L_{A3319}$ | $R^{C31}$ | $R^{B3}$ | $R^{A3}$ |
| $L_{A3320}$ | $R^{C31}$ | $R^{B6}$ | $R^{A3}$ |
| $L_{A3321}$ | $R^{C31}$ | $R^{B7}$ | $R^{A3}$ |
| $L_{A3322}$ | $R^{C31}$ | $R^{B12}$ | $R^{A3}$ |
| $L_{A3323}$ | $R^{C31}$ | $R^{B20}$ | $R^{A3}$ |
| $L_{A3324}$ | $R^{C31}$ | $R^{B25}$ | $R^{A3}$ |
| $L_{A3325}$ | $R^{C31}$ | $R^{B29}$ | $R^{A3}$ |
| $L_{A3326}$ | $R^{C31}$ | $R^{A37}$ | $R^{A3}$ |
| $L_{A3327}$ | $R^{C31}$ | $R^{A43}$ | $R^{A3}$ |
| $L_{A3328}$ | $R^{C31}$ | $R^{E1}$ | $R^{A3}$ |
| $L_{A3329}$ | $R^{C31}$ | $R^{E2}$ | $R^{A3}$ |
| $L_{A3330}$ | $R^{C31}$ | $R^{E3}$ | $R^{A3}$ |
| $L_{A3331}$ | $R^{C31}$ | $R^{E4}$ | $R^{A3}$ |
| $L_{A3332}$ | $R^{C31}$ | $R^{E5}$ | $R^{A3}$ |
| $L_{A3333}$ | $R^{C31}$ | $R^{E6}$ | $R^{A3}$ |
| $L_{A3334}$ | $R^{C31}$ | $R^{E7}$ | $R^{A3}$ |
| $L_{A3335}$ | $R^{C31}$ | $R^{E8}$ | $R^{A3}$ |
| $L_{A3336}$ | $R^{C31}$ | $R^{E9}$ | $R^{A3}$ |
| $L_{A3337}$ | $R^{C31}$ | $R^{E10}$ | $R^{A3}$ |
| $L_{A3338}$ | $R^{C31}$ | $R^{E11}$ | $R^{A3}$ |
| $L_{A3339}$ | $R^{C31}$ | $R^{E12}$ | $R^{A3}$ |
| $L_{A3340}$ | $R^{C31}$ | $R^{E13}$ | $R^{A3}$ |
| $L_{A3341}$ | $R^{C31}$ | $R^{E14}$ | $R^{A3}$ |
| $L_{A3342}$ | $R^{C31}$ | $R^{E15}$ | $R^{A3}$ |
| $L_{A3343}$ | $R^{C31}$ | $R^{E16}$ | $R^{A3}$ |
| $L_{A3344}$ | $R^{C31}$ | $R^{E17}$ | $R^{A3}$ |
| $L_{A3345}$ | $R^{C31}$ | $R^{E18}$ | $R^{A3}$ |
| $L_{A3346}$ | $R^{C31}$ | $R^{E19}$ | $R^{A3}$ |
| $L_{A3347}$ | $R^{C31}$ | $R^{E20}$ | $R^{A3}$ |
| $L_{A3348}$ | $R^{C31}$ | $R^{E21}$ | $R^{A3}$ |
| $L_{A3349}$ | $R^{C31}$ | $R^{B3}$ | $R^{A34}$ |
| $L_{A3350}$ | $R^{C31}$ | $R^{B6}$ | $R^{A34}$ |
| $L_{A3351}$ | $R^{C31}$ | $R^{B7}$ | $R^{A34}$ |
| $L_{A3352}$ | $R^{C31}$ | $R^{B12}$ | $R^{A34}$ |
| $L_{A3353}$ | $R^{C31}$ | $R^{B20}$ | $R^{A34}$ |
| $L_{A3354}$ | $R^{C31}$ | $R^{B25}$ | $R^{A34}$ |
| $L_{A3355}$ | $R^{C31}$ | $R^{B29}$ | $R^{A34}$ |
| $L_{A3356}$ | $R^{C31}$ | $R^{A37}$ | $R^{A34}$ |
| $L_{A3357}$ | $R^{C31}$ | $R^{A43}$ | $R^{A34}$ |
| $L_{A3358}$ | $R^{C31}$ | $R^{E1}$ | $R^{A34}$ |
| $L_{A3359}$ | $R^{C31}$ | $R^{E2}$ | $R^{A34}$ |
| $L_{A3360}$ | $R^{C31}$ | $R^{E3}$ | $R^{A34}$ |
| $L_{A3361}$ | $R^{C31}$ | $R^{E4}$ | $R^{A34}$ |
| $L_{A3362}$ | $R^{C31}$ | $R^{E5}$ | $R^{A34}$ |
| $L_{A3363}$ | $R^{C31}$ | $R^{E6}$ | $R^{A34}$ |
| $L_{A3364}$ | $R^{C31}$ | $R^{E7}$ | $R^{A34}$ |
| $L_{A3365}$ | $R^{C31}$ | $R^{E8}$ | $R^{A34}$ |
| $L_{A3366}$ | $R^{C31}$ | $R^{E9}$ | $R^{A34}$ |
| $L_{A3367}$ | $R^{C31}$ | $R^{E10}$ | $R^{A34}$ |
| $L_{A3368}$ | $R^{C31}$ | $R^{E11}$ | $R^{A34}$ |
| $L_{A3369}$ | $R^{C31}$ | $R^{E12}$ | $R^{A34}$ |
| $L_{A3370}$ | $R^{C31}$ | $R^{E13}$ | $R^{A34}$ |
| $L_{A3371}$ | $R^{C31}$ | $R^{E14}$ | $R^{A34}$ |
| $L_{A3372}$ | $R^{C31}$ | $R^{E15}$ | $R^{A34}$ |
| $L_{A3373}$ | $R^{C31}$ | $R^{E16}$ | $R^{A34}$ |

-continued

| Ligand | $R^2$ | $R^3$ | $R^4$ |
|---|---|---|---|
| $L_{A3374}$ | $R^{C31}$ | $R^{E17}$ | $R^{A34}$ |
| $L_{A3375}$ | $R^{C31}$ | $R^{E18}$ | $R^{A34}$ |
| $L_{A3376}$ | $R^{C31}$ | $R^{E19}$ | $R^{A34}$ |
| $L_{A3377}$ | $R^{C31}$ | $R^{E20}$ | $R^{A34}$ |
| $L_{A3378}$ | $R^{C31}$ | $R^{E21}$ | $R^{A34}$ |
| $L_{A3379}$ | $R^{C31}$ | $R^{B3}$ | $R^{A52}$ |
| $L_{A3380}$ | $R^{C31}$ | $R^{B6}$ | $R^{A52}$ |
| $L_{A3381}$ | $R^{C31}$ | $R^{B7}$ | $R^{A52}$ |
| $L_{A3382}$ | $R^{C31}$ | $R^{B12}$ | $R^{A52}$ |
| $L_{A3383}$ | $R^{C31}$ | $R^{B20}$ | $R^{A52}$ |
| $L_{A3384}$ | $R^{C31}$ | $R^{B25}$ | $R^{A52}$ |
| $L_{A3385}$ | $R^{C31}$ | $R^{B29}$ | $R^{A52}$ |
| $L_{A3386}$ | $R^{C31}$ | $R^{A37}$ | $R^{A52}$ |
| $L_{A3387}$ | $R^{C31}$ | $R^{A43}$ | $R^{A52}$ |
| $L_{A3388}$ | $R^{C31}$ | $R^{E1}$ | $R^{A52}$ |
| $L_{A3389}$ | $R^{C31}$ | $R^{E2}$ | $R^{A52}$ |
| $L_{A3390}$ | $R^{C31}$ | $R^{E3}$ | $R^{A52}$ |
| $L_{A3391}$ | $R^{C31}$ | $R^{E4}$ | $R^{A52}$ |
| $L_{A3392}$ | $R^{C31}$ | $R^{E5}$ | $R^{A52}$ |
| $L_{A3393}$ | $R^{C31}$ | $R^{E6}$ | $R^{A52}$ |
| $L_{A3394}$ | $R^{C31}$ | $R^{E7}$ | $R^{A52}$ |
| $L_{A3395}$ | $R^{C31}$ | $R^{E8}$ | $R^{A52}$ |
| $L_{A3396}$ | $R^{C31}$ | $R^{E9}$ | $R^{A52}$ |
| $L_{A3397}$ | $R^{C31}$ | $R^{E10}$ | $R^{A52}$ |
| $L_{A3398}$ | $R^{C31}$ | $R^{E11}$ | $R^{A52}$ |
| $L_{A3399}$ | $R^{C31}$ | $R^{E12}$ | $R^{A52}$ |
| $L_{A3400}$ | $R^{C31}$ | $R^{E13}$ | $R^{A52}$ |
| $L_{A3401}$ | $R^{C31}$ | $R^{E14}$ | $R^{A52}$ |
| $L_{A3402}$ | $R^{C31}$ | $R^{E15}$ | $R^{A52}$ |
| $L_{A3403}$ | $R^{C31}$ | $R^{E16}$ | $R^{A52}$ |
| $L_{A3404}$ | $R^{C31}$ | $R^{E17}$ | $R^{A52}$ |
| $L_{A3405}$ | $R^{C31}$ | $R^{E18}$ | $R^{A52}$ |
| $L_{A3406}$ | $R^{C31}$ | $R^{E19}$ | $R^{A52}$ |
| $L_{A3407}$ | $R^{C31}$ | $R^{E20}$ | $R^{A52}$ |
| $L_{A3408}$ | $R^{C31}$ | $R^{E21}$ | $R^{A52}$ |
| $L_{A3409}$ | $R^{C17}$ | $R^{B3}$ | H |
| $L_{A3410}$ | $R^{C17}$ | $R^{B6}$ | H |
| $L_{A3411}$ | $R^{C17}$ | $R^{B7}$ | H |
| $L_{A3412}$ | $R^{C17}$ | $R^{B12}$ | H |
| $L_{A3413}$ | $R^{C17}$ | $R^{B20}$ | H |
| $L_{A3414}$ | $R^{C17}$ | $R^{B25}$ | H |
| $L_{A3415}$ | $R^{C17}$ | $R^{B29}$ | H |
| $L_{A3416}$ | $R^{C17}$ | $R^{A37}$ | H |
| $L_{A3417}$ | $R^{C17}$ | $R^{A43}$ | H |
| $L_{A3418}$ | $R^{C17}$ | $R^{E1}$ | H |
| $L_{A3419}$ | $R^{C17}$ | $R^{E2}$ | H |
| $L_{A3420}$ | $R^{C17}$ | $R^{E3}$ | H |
| $L_{A3421}$ | $R^{C17}$ | $R^{E4}$ | H |
| $L_{A3422}$ | $R^{C17}$ | $R^{E5}$ | H |
| $L_{A3423}$ | $R^{C17}$ | $R^{E6}$ | H |
| $L_{A3424}$ | $R^{C17}$ | $R^{E7}$ | H |
| $L_{A3425}$ | $R^{C17}$ | $R^{E8}$ | H |
| $L_{A3426}$ | $R^{C17}$ | $R^{E9}$ | H |
| $L_{A3427}$ | $R^{C17}$ | $R^{E10}$ | H |
| $L_{A3428}$ | $R^{C17}$ | $R^{E11}$ | H |
| $L_{A3429}$ | $R^{C17}$ | $R^{E12}$ | H |
| $L_{A3430}$ | $R^{C17}$ | $R^{E13}$ | H |
| $L_{A3431}$ | $R^{C17}$ | $R^{E14}$ | H |
| $L_{A3432}$ | $R^{C17}$ | $R^{E15}$ | H |
| $L_{A3433}$ | $R^{C17}$ | $R^{E16}$ | H |
| $L_{A3434}$ | $R^{C17}$ | $R^{E17}$ | H |
| $L_{A3435}$ | $R^{C17}$ | $R^{E18}$ | H |
| $L_{A3436}$ | $R^{C17}$ | $R^{E19}$ | H |
| $L_{A3437}$ | $R^{C17}$ | $R^{E20}$ | H |
| $L_{A3438}$ | $R^{C17}$ | $R^{E21}$ | H |
| $L_{A3439}$ | $R^{C17}$ | $R^{B3}$ | $R^{B3}$ |
| $L_{A3440}$ | $R^{C17}$ | $R^{B6}$ | $R^{B3}$ |
| $L_{A3441}$ | $R^{C17}$ | $R^{B7}$ | $R^{B3}$ |
| $L_{A3442}$ | $R^{C17}$ | $R^{B12}$ | $R^{B3}$ |
| $L_{A3443}$ | $R^{C17}$ | $R^{B20}$ | $R^{B3}$ |
| $L_{A3444}$ | $R^{C17}$ | $R^{B25}$ | $R^{B3}$ |
| $L_{A3445}$ | $R^{C17}$ | $R^{B29}$ | $R^{B3}$ |
| $L_{A3446}$ | $R^{C17}$ | $R^{A37}$ | $R^{B3}$ |
| $L_{A3447}$ | $R^{C17}$ | $R^{A43}$ | $R^{B3}$ |
| $L_{A3448}$ | $R^{C17}$ | $R^{E1}$ | $R^{B3}$ |
| $L_{A3449}$ | $R^{C17}$ | $R^{E2}$ | $R^{B3}$ |
| $L_{A3450}$ | $R^{C17}$ | $R^{E3}$ | $R^{B3}$ |

-continued

| Ligand | $R^2$ | $R^3$ | $R^4$ |
|---|---|---|---|
| $L_{A3451}$ | $R^{C17}$ | $R^{E4}$ | $R^{B3}$ |
| $L_{A3452}$ | $R^{C17}$ | $R^{E5}$ | $R^{B3}$ |
| $L_{A3453}$ | $R^{C17}$ | $R^{E6}$ | $R^{B3}$ |
| $L_{A3454}$ | $R^{C17}$ | $R^{E7}$ | $R^{B3}$ |
| $L_{A3455}$ | $R^{C17}$ | $R^{E8}$ | $R^{B3}$ |
| $L_{A3456}$ | $R^{C17}$ | $R^{E9}$ | $R^{B3}$ |
| $L_{A3457}$ | $R^{C17}$ | $R^{E10}$ | $R^{B3}$ |
| $L_{A3458}$ | $R^{C17}$ | $R^{E11}$ | $R^{B3}$ |
| $L_{A3459}$ | $R^{C17}$ | $R^{E12}$ | $R^{B3}$ |
| $L_{A3460}$ | $R^{C17}$ | $R^{E13}$ | $R^{B3}$ |
| $L_{A3461}$ | $R^{C17}$ | $R^{E14}$ | $R^{B3}$ |
| $L_{A3462}$ | $R^{C17}$ | $R^{E15}$ | $R^{B3}$ |
| $L_{A3463}$ | $R^{C17}$ | $R^{E16}$ | $R^{B3}$ |
| $L_{A3464}$ | $R^{C17}$ | $R^{E17}$ | $R^{B3}$ |
| $L_{A3465}$ | $R^{C17}$ | $R^{E18}$ | $R^{B3}$ |
| $L_{A3466}$ | $R^{C17}$ | $R^{E19}$ | $R^{B3}$ |
| $L_{A3467}$ | $R^{C17}$ | $R^{E20}$ | $R^{B3}$ |
| $L_{A3468}$ | $R^{C17}$ | $R^{E21}$ | $R^{B3}$ |
| $L_{A3469}$ | $R^{C17}$ | $R^{B3}$ | $R^{B4}$ |
| $L_{A3470}$ | $R^{C17}$ | $R^{B6}$ | $R^{B4}$ |
| $L_{A3471}$ | $R^{C17}$ | $R^{B7}$ | $R^{B4}$ |
| $L_{A3472}$ | $R^{C17}$ | $R^{B12}$ | $R^{B4}$ |
| $L_{A3473}$ | $R^{C17}$ | $R^{B20}$ | $R^{B4}$ |
| $L_{A3474}$ | $R^{C17}$ | $R^{B25}$ | $R^{B4}$ |
| $L_{A3475}$ | $R^{C17}$ | $R^{B29}$ | $R^{B4}$ |
| $L_{A3476}$ | $R^{C17}$ | $R^{A37}$ | $R^{B4}$ |
| $L_{A3477}$ | $R^{C17}$ | $R^{A43}$ | $R^{B4}$ |
| $L_{A3478}$ | $R^{C17}$ | $R^{E1}$ | $R^{B4}$ |
| $L_{A3479}$ | $R^{C17}$ | $R^{E2}$ | $R^{B4}$ |
| $L_{A3480}$ | $R^{C17}$ | $R^{E3}$ | $R^{B4}$ |
| $L_{A3481}$ | $R^{C17}$ | $R^{E4}$ | $R^{B4}$ |
| $L_{A3482}$ | $R^{C17}$ | $R^{E5}$ | $R^{B4}$ |
| $L_{A3483}$ | $R^{C17}$ | $R^{E6}$ | $R^{B4}$ |
| $L_{A3484}$ | $R^{C17}$ | $R^{E7}$ | $R^{B4}$ |
| $L_{A3485}$ | $R^{C17}$ | $R^{E8}$ | $R^{B4}$ |
| $L_{A3486}$ | $R^{C17}$ | $R^{E9}$ | $R^{B4}$ |
| $L_{A3487}$ | $R^{C17}$ | $R^{E10}$ | $R^{B4}$ |
| $L_{A3488}$ | $R^{C17}$ | $R^{E11}$ | $R^{B4}$ |
| $L_{A3489}$ | $R^{C17}$ | $R^{E12}$ | $R^{B4}$ |
| $L_{A3490}$ | $R^{C17}$ | $R^{E13}$ | $R^{B4}$ |
| $L_{A3491}$ | $R^{C17}$ | $R^{E14}$ | $R^{B4}$ |
| $L_{A3492}$ | $R^{C17}$ | $R^{E15}$ | $R^{B4}$ |
| $L_{A3493}$ | $R^{C17}$ | $R^{E16}$ | $R^{B4}$ |
| $L_{A3494}$ | $R^{C17}$ | $R^{E17}$ | $R^{B4}$ |
| $L_{A3495}$ | $R^{C17}$ | $R^{E18}$ | $R^{B4}$ |
| $L_{A3496}$ | $R^{C17}$ | $R^{E19}$ | $R^{B4}$ |
| $L_{A3497}$ | $R^{C17}$ | $R^{E20}$ | $R^{B4}$ |
| $L_{A3498}$ | $R^{C17}$ | $R^{E21}$ | $R^{B4}$ |
| $L_{A3499}$ | $R^{C17}$ | $R^{B3}$ | $R^{B18}$ |
| $L_{A3500}$ | $R^{C17}$ | $R^{B6}$ | $R^{B18}$ |
| $L_{A3501}$ | $R^{C17}$ | $R^{B7}$ | $R^{B18}$ |
| $L_{A3502}$ | $R^{C17}$ | $R^{B12}$ | $R^{B18}$ |
| $L_{A3503}$ | $R^{C17}$ | $R^{B20}$ | $R^{B18}$ |
| $L_{A3504}$ | $R^{C17}$ | $R^{B25}$ | $R^{B18}$ |
| $L_{A3505}$ | $R^{C17}$ | $R^{B29}$ | $R^{B18}$ |
| $L_{A3506}$ | $R^{C17}$ | $R^{A37}$ | $R^{B18}$ |
| $L_{A3507}$ | $R^{C17}$ | $R^{A43}$ | $R^{B18}$ |
| $L_{A3508}$ | $R^{C17}$ | $R^{E1}$ | $R^{B18}$ |
| $L_{A3509}$ | $R^{C17}$ | $R^{E2}$ | $R^{B18}$ |
| $L_{A3510}$ | $R^{C17}$ | $R^{E3}$ | $R^{B18}$ |
| $L_{A3511}$ | $R^{C17}$ | $R^{E4}$ | $R^{B18}$ |
| $L_{A3512}$ | $R^{C17}$ | $R^{E5}$ | $R^{B18}$ |
| $L_{A3513}$ | $R^{C17}$ | $R^{E6}$ | $R^{B18}$ |
| $L_{A3514}$ | $R^{C17}$ | $R^{E7}$ | $R^{B18}$ |
| $L_{A3515}$ | $R^{C17}$ | $R^{E8}$ | $R^{B18}$ |
| $L_{A3516}$ | $R^{C17}$ | $R^{E9}$ | $R^{B18}$ |
| $L_{A3517}$ | $R^{C17}$ | $R^{E10}$ | $R^{B18}$ |
| $L_{A3518}$ | $R^{C17}$ | $R^{E11}$ | $R^{B18}$ |
| $L_{A3519}$ | $R^{C17}$ | $R^{E12}$ | $R^{B18}$ |
| $L_{A3520}$ | $R^{C17}$ | $R^{E13}$ | $R^{B18}$ |
| $L_{A3521}$ | $R^{C17}$ | $R^{E14}$ | $R^{B18}$ |
| $L_{A3522}$ | $R^{C17}$ | $R^{E15}$ | $R^{B18}$ |
| $L_{A3523}$ | $R^{C17}$ | $R^{E16}$ | $R^{B18}$ |
| $L_{A3524}$ | $R^{C17}$ | $R^{E17}$ | $R^{B18}$ |
| $L_{A3525}$ | $R^{C17}$ | $R^{E18}$ | $R^{B18}$ |
| $L_{A3526}$ | $R^{C17}$ | $R^{E19}$ | $R^{B18}$ |
| $L_{A3527}$ | $R^{C17}$ | $R^{E20}$ | $R^{B18}$ |

-continued

| Ligand | $R^2$ | $R^3$ | $R^4$ |
|---|---|---|---|
| $L_{A3528}$ | $R^{C17}$ | $R^{E21}$ | $R^{B18}$ |
| $L_{A3529}$ | $R^{C17}$ | $R^{B3}$ | $R^{A3}$ |
| $L_{A3530}$ | $R^{C17}$ | $R^{B6}$ | $R^{A3}$ |
| $L_{A3531}$ | $R^{C17}$ | $R^{B7}$ | $R^{A3}$ |
| $L_{A3532}$ | $R^{C17}$ | $R^{B12}$ | $R^{A3}$ |
| $L_{A3533}$ | $R^{C17}$ | $R^{B20}$ | $R^{A3}$ |
| $L_{A3534}$ | $R^{C17}$ | $R^{B25}$ | $R^{A3}$ |
| $L_{A3535}$ | $R^{C17}$ | $R^{B29}$ | $R^{A3}$ |
| $L_{A3536}$ | $R^{C17}$ | $R^{A37}$ | $R^{A3}$ |
| $L_{A3537}$ | $R^{C17}$ | $R^{A43}$ | $R^{A3}$ |
| $L_{A3538}$ | $R^{C17}$ | $R^{E1}$ | $R^{A3}$ |
| $L_{A3539}$ | $R^{C17}$ | $R^{E2}$ | $R^{A3}$ |
| $L_{A3540}$ | $R^{C17}$ | $R^{E3}$ | $R^{A3}$ |
| $L_{A3541}$ | $R^{C17}$ | $R^{E4}$ | $R^{A3}$ |
| $L_{A3542}$ | $R^{C17}$ | $R^{E5}$ | $R^{A3}$ |
| $L_{A3543}$ | $R^{C17}$ | $R^{E6}$ | $R^{A3}$ |
| $L_{A3544}$ | $R^{C17}$ | $R^{E7}$ | $R^{A3}$ |
| $L_{A3545}$ | $R^{C17}$ | $R^{E8}$ | $R^{A3}$ |
| $L_{A3546}$ | $R^{C17}$ | $R^{E9}$ | $R^{A3}$ |
| $L_{A3547}$ | $R^{C17}$ | $R^{E10}$ | $R^{A3}$ |
| $L_{A3548}$ | $R^{C17}$ | $R^{E11}$ | $R^{A3}$ |
| $L_{A3549}$ | $R^{C17}$ | $R^{E12}$ | $R^{A3}$ |
| $L_{A3550}$ | $R^{C17}$ | $R^{E13}$ | $R^{A3}$ |
| $L_{A3551}$ | $R^{C17}$ | $R^{E14}$ | $R^{A3}$ |
| $L_{A3552}$ | $R^{C17}$ | $R^{E15}$ | $R^{A3}$ |
| $L_{A3553}$ | $R^{C17}$ | $R^{E16}$ | $R^{A3}$ |
| $L_{A3554}$ | $R^{C17}$ | $R^{E17}$ | $R^{A3}$ |
| $L_{A3555}$ | $R^{C17}$ | $R^{E18}$ | $R^{A3}$ |
| $L_{A3556}$ | $R^{C17}$ | $R^{E19}$ | $R^{A3}$ |
| $L_{A3557}$ | $R^{C17}$ | $R^{E20}$ | $R^{A3}$ |
| $L_{A3558}$ | $R^{C17}$ | $R^{E21}$ | $R^{A3}$ |
| $L_{A3559}$ | $R^{C17}$ | $R^{B3}$ | $R^{A34}$ |
| $L_{A3560}$ | $R^{C17}$ | $R^{B6}$ | $R^{A34}$ |
| $L_{A3561}$ | $R^{C17}$ | $R^{B7}$ | $R^{A34}$ |
| $L_{A3562}$ | $R^{C17}$ | $R^{B12}$ | $R^{A34}$ |
| $L_{A3563}$ | $R^{C17}$ | $R^{B20}$ | $R^{A34}$ |
| $L_{A3564}$ | $R^{C17}$ | $R^{B25}$ | $R^{A34}$ |
| $L_{A3565}$ | $R^{C17}$ | $R^{B29}$ | $R^{A34}$ |
| $L_{A3566}$ | $R^{C17}$ | $R^{A37}$ | $R^{A34}$ |
| $L_{A3567}$ | $R^{C17}$ | $R^{A43}$ | $R^{A34}$ |
| $L_{A3568}$ | $R^{C17}$ | $R^{E1}$ | $R^{A34}$ |
| $L_{A3569}$ | $R^{C17}$ | $R^{E2}$ | $R^{A34}$ |
| $L_{A3570}$ | $R^{C17}$ | $R^{E3}$ | $R^{A34}$ |
| $L_{A3571}$ | $R^{C17}$ | $R^{E4}$ | $R^{A34}$ |
| $L_{A3572}$ | $R^{C17}$ | $R^{E5}$ | $R^{A34}$ |
| $L_{A3573}$ | $R^{C17}$ | $R^{E6}$ | $R^{A34}$ |
| $L_{A3574}$ | $R^{C17}$ | $R^{E7}$ | $R^{A34}$ |
| $L_{A3575}$ | $R^{C17}$ | $R^{E8}$ | $R^{A34}$ |
| $L_{A3576}$ | $R^{C17}$ | $R^{E9}$ | $R^{A34}$ |
| $L_{A3577}$ | $R^{C17}$ | $R^{E10}$ | $R^{A34}$ |
| $L_{A3578}$ | $R^{C17}$ | $R^{B11}$ | $R^{A34}$ |
| $L_{A3579}$ | $R^{C17}$ | $R^{E12}$ | $R^{A34}$ |
| $L_{A3580}$ | $R^{C17}$ | $R^{E13}$ | $R^{A34}$ |
| $L_{A3581}$ | $R^{C17}$ | $R^{E14}$ | $R^{A34}$ |
| $L_{A3582}$ | $R^{C17}$ | $R^{E15}$ | $R^{A34}$ |
| $L_{A3583}$ | $R^{C17}$ | $R^{E16}$ | $R^{A34}$ |
| $L_{A3584}$ | $R^{C17}$ | $R^{E17}$ | $R^{A34}$ |
| $L_{A3585}$ | $R^{C17}$ | $R^{E18}$ | $R^{A34}$ |
| $L_{A3586}$ | $R^{C17}$ | $R^{E19}$ | $R^{A34}$ |
| $L_{A3587}$ | $R^{C17}$ | $R^{E20}$ | $R^{A34}$ |
| $L_{A3588}$ | $R^{C17}$ | $R^{E21}$ | $R^{A34}$ |
| $L_{A3589}$ | $R^{C17}$ | $R^{B3}$ | $R^{A52}$ |
| $L_{A3590}$ | $R^{C17}$ | $R^{B6}$ | $R^{A52}$ |
| $L_{A3591}$ | $R^{C17}$ | $R^{B7}$ | $R^{A52}$ |
| $L_{A3592}$ | $R^{C17}$ | $R^{B12}$ | $R^{A52}$ |
| $L_{A3593}$ | $R^{C17}$ | $R^{B20}$ | $R^{A52}$ |
| $L_{A3594}$ | $R^{C17}$ | $R^{B25}$ | $R^{A52}$ |
| $L_{A3595}$ | $R^{C17}$ | $R^{B29}$ | $R^{A52}$ |
| $L_{A3596}$ | $R^{C17}$ | $R^{A37}$ | $R^{A52}$ |
| $L_{A3597}$ | $R^{C17}$ | $R^{A43}$ | $R^{A52}$ |
| $L_{A3598}$ | $R^{C17}$ | $R^{E1}$ | $R^{A52}$ |
| $L_{A3599}$ | $R^{C17}$ | $R^{E2}$ | $R^{A52}$ |
| $L_{A3600}$ | $R^{C17}$ | $R^{E3}$ | $R^{A52}$ |
| $L_{A3601}$ | $R^{C17}$ | $R^{E4}$ | $R^{A52}$ |
| $L_{A3602}$ | $R^{C17}$ | $R^{E5}$ | $R^{A52}$ |
| $L_{A3603}$ | $R^{C17}$ | $R^{E6}$ | $R^{A52}$ |
| $L_{A3604}$ | $R^{C17}$ | $R^{E7}$ | $R^{A52}$ |

-continued

| Ligand | $R^2$ | $R^3$ | $R^4$ |
|---|---|---|---|
| $L_{A3605}$ | $R^{C17}$ | $R^{E8}$ | $R^{A52}$ |
| $L_{A3606}$ | $R^{C17}$ | $R^{E9}$ | $R^{A52}$ |
| $L_{A3607}$ | $R^{C17}$ | $R^{E10}$ | $R^{A52}$ |
| $L_{A3608}$ | $R^{C17}$ | $R^{E11}$ | $R^{A52}$ |
| $L_{A3609}$ | $R^{C17}$ | $R^{E12}$ | $R^{A52}$ |
| $L_{A3610}$ | $R^{C17}$ | $R^{E13}$ | $R^{A52}$ |
| $L_{A3611}$ | $R^{C17}$ | $R^{E14}$ | $R^{A52}$ |
| $L_{A3612}$ | $R^{C17}$ | $R^{E15}$ | $R^{A52}$ |
| $L_{A3613}$ | $R^{C17}$ | $R^{E16}$ | $R^{A52}$ |
| $L_{A3614}$ | $R^{C17}$ | $R^{E17}$ | $R^{A52}$ |
| $L_{A3615}$ | $R^{C17}$ | $R^{E18}$ | $R^{A52}$ |
| $L_{A3616}$ | $R^{C17}$ | $R^{E19}$ | $R^{A52}$ |
| $L_{A3617}$ | $R^{C17}$ | $R^{E20}$ | $R^{A52}$ |
| $L_{A3618}$ | $R^{C17}$ | $R^{E21}$ | $R^{A52}$ |
| $L_{A3619}$ | $R^{C19}$ | $R^{B3}$ | H |
| $L_{A3620}$ | $R^{C19}$ | $R^{B6}$ | H |
| $L_{A3621}$ | $R^{C19}$ | $R^{B7}$ | H |
| $L_{A3622}$ | $R^{C19}$ | $R^{B12}$ | H |
| $L_{A3623}$ | $R^{C19}$ | $R^{B20}$ | H |
| $L_{A3624}$ | $R^{C19}$ | $R^{B25}$ | H |
| $L_{A3625}$ | $R^{C19}$ | $R^{B29}$ | H |
| $L_{A3626}$ | $R^{C19}$ | $R^{A37}$ | H |
| $L_{A3627}$ | $R^{C19}$ | $R^{A43}$ | H |
| $L_{A3628}$ | $R^{C19}$ | $R^{E1}$ | H |
| $L_{A3629}$ | $R^{C19}$ | $R^{E2}$ | H |
| $L_{A3630}$ | $R^{C19}$ | $R^{E3}$ | H |
| $L_{A3631}$ | $R^{C19}$ | $R^{E4}$ | H |
| $L_{A3632}$ | $R^{C19}$ | $R^{E5}$ | H |
| $L_{A3633}$ | $R^{C19}$ | $R^{E6}$ | H |
| $L_{A3634}$ | $R^{C19}$ | $R^{E7}$ | H |
| $L_{A3635}$ | $R^{C19}$ | $R^{E8}$ | H |
| $L_{A3636}$ | $R^{C19}$ | $R^{E9}$ | H |
| $L_{A3637}$ | $R^{C19}$ | $R^{E10}$ | H |
| $L_{A3638}$ | $R^{C19}$ | $R^{E11}$ | H |
| $L_{A3639}$ | $R^{C19}$ | $R^{E12}$ | H |
| $L_{A3640}$ | $R^{C19}$ | $R^{E13}$ | H |
| $L_{A3641}$ | $R^{C19}$ | $R^{E14}$ | H |
| $L_{A3642}$ | $R^{C19}$ | $R^{E15}$ | H |
| $L_{A3643}$ | $R^{C19}$ | $R^{E16}$ | H |
| $L_{A3644}$ | $R^{C19}$ | $R^{E17}$ | H |
| $L_{A3645}$ | $R^{C19}$ | $R^{E18}$ | H |
| $L_{A3646}$ | $R^{C19}$ | $R^{E19}$ | H |
| $L_{A3647}$ | $R^{C19}$ | $R^{E20}$ | H |
| $L_{A3648}$ | $R^{C19}$ | $R^{E21}$ | H |
| $L_{A3649}$ | $R^{C19}$ | $R^{B3}$ | $R^{B3}$ |
| $L_{A3650}$ | $R^{C19}$ | $R^{B6}$ | $R^{B3}$ |
| $L_{A3651}$ | $R^{C19}$ | $R^{B7}$ | $R^{B3}$ |
| $L_{A3652}$ | $R^{C19}$ | $R^{B12}$ | $R^{B3}$ |
| $L_{A3653}$ | $R^{C19}$ | $R^{B20}$ | $R^{B3}$ |
| $L_{A3654}$ | $R^{C19}$ | $R^{B25}$ | $R^{B3}$ |
| $L_{A3655}$ | $R^{C19}$ | $R^{B29}$ | $R^{B3}$ |
| $L_{A3656}$ | $R^{C19}$ | $R^{A37}$ | $R^{B3}$ |
| $L_{A3657}$ | $R^{C19}$ | $R^{A43}$ | $R^{B3}$ |
| $L_{A3658}$ | $R^{C19}$ | $R^{E1}$ | $R^{B3}$ |
| $L_{A3659}$ | $R^{C19}$ | $R^{E2}$ | $R^{B3}$ |
| $L_{A3660}$ | $R^{C19}$ | $R^{E3}$ | $R^{B3}$ |
| $L_{A3661}$ | $R^{C19}$ | $R^{E4}$ | $R^{B3}$ |
| $L_{A3662}$ | $R^{C19}$ | $R^{E5}$ | $R^{B3}$ |
| $L_{A3663}$ | $R^{C19}$ | $R^{E6}$ | $R^{B3}$ |
| $L_{A3664}$ | $R^{C19}$ | $R^{E7}$ | $R^{B3}$ |
| $L_{A3665}$ | $R^{C19}$ | $R^{E8}$ | $R^{B3}$ |
| $L_{A3666}$ | $R^{C19}$ | $R^{E9}$ | $R^{B3}$ |
| $L_{A3667}$ | $R^{C19}$ | $R^{E10}$ | $R^{B3}$ |
| $L_{A3668}$ | $R^{C19}$ | $R^{E11}$ | $R^{B3}$ |
| $L_{A3669}$ | $R^{C19}$ | $R^{E12}$ | $R^{B3}$ |
| $L_{A3670}$ | $R^{C19}$ | $R^{E13}$ | $R^{B3}$ |
| $L_{A3671}$ | $R^{C19}$ | $R^{E14}$ | $R^{B3}$ |
| $L_{A3672}$ | $R^{C19}$ | $R^{E15}$ | $R^{B3}$ |
| $L_{A3673}$ | $R^{C19}$ | $R^{E16}$ | $R^{B3}$ |
| $L_{A3674}$ | $R^{C19}$ | $R^{E17}$ | $R^{B3}$ |
| $L_{A3675}$ | $R^{C19}$ | $R^{E18}$ | $R^{B3}$ |
| $L_{A3676}$ | $R^{C19}$ | $R^{E19}$ | $R^{B3}$ |
| $L_{A3677}$ | $R^{C19}$ | $R^{E20}$ | $R^{B3}$ |
| $L_{A3678}$ | $R^{C19}$ | $R^{E21}$ | $R^{B3}$ |
| $L_{A3679}$ | $R^{C19}$ | $R^{B3}$ | $R^{B4}$ |
| $L_{A3680}$ | $R^{C19}$ | $R^{B6}$ | $R^{B4}$ |
| $L_{A3681}$ | $R^{C19}$ | $R^{B7}$ | $R^{B4}$ |

-continued

| Ligand | $R^2$ | $R^3$ | $R^4$ |
|---|---|---|---|
| $L_{A3682}$ | $R^{C19}$ | $R^{B12}$ | $R^{B4}$ |
| $L_{A3683}$ | $R^{C19}$ | $R^{B20}$ | $R^{B4}$ |
| $L_{A3684}$ | $R^{C19}$ | $R^{B25}$ | $R^{B4}$ |
| $L_{A3685}$ | $R^{C19}$ | $R^{B29}$ | $R^{B4}$ |
| $L_{A3686}$ | $R^{C19}$ | $R^{A37}$ | $R^{B4}$ |
| $L_{A3687}$ | $R^{C19}$ | $R^{A43}$ | $R^{B4}$ |
| $L_{A3688}$ | $R^{C19}$ | $R^{E1}$ | $R^{B4}$ |
| $L_{A3689}$ | $R^{C19}$ | $R^{E2}$ | $R^{B4}$ |
| $L_{A3690}$ | $R^{C19}$ | $R^{E3}$ | $R^{B4}$ |
| $L_{A3691}$ | $R^{C19}$ | $R^{E4}$ | $R^{B4}$ |
| $L_{A3692}$ | $R^{C19}$ | $R^{E5}$ | $R^{B4}$ |
| $L_{A3693}$ | $R^{C19}$ | $R^{E6}$ | $R^{B4}$ |
| $L_{A3694}$ | $R^{C19}$ | $R^{E7}$ | $R^{B4}$ |
| $L_{A3695}$ | $R^{C19}$ | $R^{E8}$ | $R^{B4}$ |
| $L_{A3696}$ | $R^{C19}$ | $R^{E9}$ | $R^{B4}$ |
| $L_{A3697}$ | $R^{C19}$ | $R^{E10}$ | $R^{B4}$ |
| $L_{A3698}$ | $R^{C19}$ | $R^{E11}$ | $R^{B4}$ |
| $L_{A3699}$ | $R^{C19}$ | $R^{E12}$ | $R^{B4}$ |
| $L_{A3700}$ | $R^{C19}$ | $R^{E13}$ | $R^{B4}$ |
| $L_{A3701}$ | $R^{C19}$ | $R^{E14}$ | $R^{B4}$ |
| $L_{A3702}$ | $R^{C19}$ | $R^{E15}$ | $R^{B4}$ |
| $L_{A3703}$ | $R^{C19}$ | $R^{E16}$ | $R^{B4}$ |
| $L_{A3704}$ | $R^{C19}$ | $R^{E17}$ | $R^{B4}$ |
| $L_{A3705}$ | $R^{C19}$ | $R^{E18}$ | $R^{B4}$ |
| $L_{A3706}$ | $R^{C19}$ | $R^{E19}$ | $R^{B4}$ |
| $L_{A3707}$ | $R^{C19}$ | $R^{E20}$ | $R^{B4}$ |
| $L_{A3708}$ | $R^{C19}$ | $R^{E21}$ | $R^{B4}$ |
| $L_{A3709}$ | $R^{C19}$ | $R^{B3}$ | $R^{B18}$ |
| $L_{A3710}$ | $R^{C19}$ | $R^{B6}$ | $R^{B18}$ |
| $L_{A3711}$ | $R^{C19}$ | $R^{B7}$ | $R^{B18}$ |
| $L_{A3712}$ | $R^{C19}$ | $R^{B12}$ | $R^{B18}$ |
| $L_{A3713}$ | $R^{C19}$ | $R^{B20}$ | $R^{B18}$ |
| $L_{A3714}$ | $R^{C19}$ | $R^{B25}$ | $R^{B18}$ |
| $L_{A3715}$ | $R^{C19}$ | $R^{B29}$ | $R^{B18}$ |
| $L_{A3716}$ | $R^{C19}$ | $R^{A37}$ | $R^{B18}$ |
| $L_{A3717}$ | $R^{C19}$ | $R^{A43}$ | $R^{B18}$ |
| $L_{A3718}$ | $R^{C19}$ | $R^{E1}$ | $R^{B18}$ |
| $L_{A3719}$ | $R^{C19}$ | $R^{E2}$ | $R^{B18}$ |
| $L_{A3720}$ | $R^{C19}$ | $R^{E3}$ | $R^{B18}$ |
| $L_{A3721}$ | $R^{C19}$ | $R^{E4}$ | $R^{B18}$ |
| $L_{A3722}$ | $R^{C19}$ | $R^{E5}$ | $R^{B18}$ |
| $L_{A3723}$ | $R^{C19}$ | $R^{E6}$ | $R^{B18}$ |
| $L_{A3724}$ | $R^{C19}$ | $R^{E7}$ | $R^{B18}$ |
| $L_{A3725}$ | $R^{C19}$ | $R^{E8}$ | $R^{B18}$ |
| $L_{A3726}$ | $R^{C19}$ | $R^{E9}$ | $R^{B18}$ |
| $L_{A3727}$ | $R^{C19}$ | $R^{E10}$ | $R^{B18}$ |
| $L_{A3728}$ | $R^{C19}$ | $R^{E11}$ | $R^{B18}$ |
| $L_{A3729}$ | $R^{C19}$ | $R^{E12}$ | $R^{B18}$ |
| $L_{A3730}$ | $R^{C19}$ | $R^{E13}$ | $R^{B18}$ |
| $L_{A3731}$ | $R^{C19}$ | $R^{E14}$ | $R^{B18}$ |
| $L_{A3732}$ | $R^{C19}$ | $R^{E15}$ | $R^{B18}$ |
| $L_{A3733}$ | $R^{C19}$ | $R^{E16}$ | $R^{B18}$ |
| $L_{A3734}$ | $R^{C19}$ | $R^{E17}$ | $R^{B18}$ |
| $L_{A3735}$ | $R^{C19}$ | $R^{E18}$ | $R^{B18}$ |
| $L_{A3736}$ | $R^{C19}$ | $R^{E19}$ | $R^{B18}$ |
| $L_{A3737}$ | $R^{C19}$ | $R^{E20}$ | $R^{B18}$ |
| $L_{A3738}$ | $R^{C19}$ | $R^{E21}$ | $R^{B18}$ |
| $L_{A3739}$ | $R^{C19}$ | $R^{B3}$ | $R^{A3}$ |
| $L_{A3740}$ | $R^{C19}$ | $R^{B6}$ | $R^{A3}$ |
| $L_{A3741}$ | $R^{C19}$ | $R^{B7}$ | $R^{A3}$ |
| $L_{A3742}$ | $R^{C19}$ | $R^{B12}$ | $R^{A3}$ |
| $L_{A3743}$ | $R^{C19}$ | $R^{B20}$ | $R^{A3}$ |
| $L_{A3744}$ | $R^{C19}$ | $R^{B25}$ | $R^{A3}$ |
| $L_{A3745}$ | $R^{C19}$ | $R^{B29}$ | $R^{A3}$ |
| $L_{A3746}$ | $R^{C19}$ | $R^{A37}$ | $R^{A3}$ |
| $L_{A3747}$ | $R^{C19}$ | $R^{A43}$ | $R^{A3}$ |
| $L_{A3748}$ | $R^{C19}$ | $R^{E1}$ | $R^{A3}$ |
| $L_{A3749}$ | $R^{C19}$ | $R^{E2}$ | $R^{A3}$ |
| $L_{A3750}$ | $R^{C19}$ | $R^{E3}$ | $R^{A3}$ |
| $L_{A3751}$ | $R^{C19}$ | $R^{E4}$ | $R^{A3}$ |
| $L_{A3752}$ | $R^{C19}$ | $R^{E5}$ | $R^{A3}$ |
| $L_{A3753}$ | $R^{C19}$ | $R^{E6}$ | $R^{A3}$ |
| $L_{A3754}$ | $R^{C19}$ | $R^{E7}$ | $R^{A3}$ |
| $L_{A3755}$ | $R^{C19}$ | $R^{E8}$ | $R^{A3}$ |
| $L_{A3756}$ | $R^{C19}$ | $R^{E9}$ | $R^{A3}$ |
| $L_{A3757}$ | $R^{C19}$ | $R^{E10}$ | $R^{A3}$ |
| $L_{A3758}$ | $R^{C19}$ | $R^{E11}$ | $R^{A3}$ |

-continued

| Ligand | $R^2$ | $R^3$ | $R^4$ |
|---|---|---|---|
| $L_{A3759}$ | $R^{C19}$ | $R^{E12}$ | $R^{A3}$ |
| $L_{A3760}$ | $R^{C19}$ | $R^{E13}$ | $R^{A3}$ |
| $L_{A3761}$ | $R^{C19}$ | $R^{E14}$ | $R^{A3}$ |
| $L_{A3762}$ | $R^{C19}$ | $R^{E15}$ | $R^{A3}$ |
| $L_{A3763}$ | $R^{C19}$ | $R^{E16}$ | $R^{A3}$ |
| $L_{A3764}$ | $R^{C19}$ | $R^{E17}$ | $R^{A3}$ |
| $L_{A3765}$ | $R^{C19}$ | $R^{E18}$ | $R^{A3}$ |
| $L_{A3766}$ | $R^{C19}$ | $R^{E19}$ | $R^{A3}$ |
| $L_{A3767}$ | $R^{C19}$ | $R^{E20}$ | $R^{A3}$ |
| $L_{A3768}$ | $R^{C19}$ | $R^{E21}$ | $R^{A3}$ |
| $L_{A3769}$ | $R^{C19}$ | $R^{B3}$ | $R^{A34}$ |
| $L_{A3770}$ | $R^{C19}$ | $R^{B6}$ | $R^{A34}$ |
| $L_{A3771}$ | $R^{C19}$ | $R^{B7}$ | $R^{A34}$ |
| $L_{A3772}$ | $R^{C19}$ | $R^{B12}$ | $R^{A34}$ |
| $L_{A3773}$ | $R^{C19}$ | $R^{B20}$ | $R^{A34}$ |
| $L_{A3774}$ | $R^{C19}$ | $R^{B25}$ | $R^{A34}$ |
| $L_{A3775}$ | $R^{C19}$ | $R^{B29}$ | $R^{A34}$ |
| $L_{A3776}$ | $R^{C19}$ | $R^{A37}$ | $R^{A34}$ |
| $L_{A3777}$ | $R^{C19}$ | $R^{A43}$ | $R^{A34}$ |
| $L_{A3778}$ | $R^{C19}$ | $R^{E1}$ | $R^{A34}$ |
| $L_{A3779}$ | $R^{C19}$ | $R^{E2}$ | $R^{A34}$ |
| $L_{A3780}$ | $R^{C19}$ | $R^{E3}$ | $R^{A34}$ |
| $L_{A3781}$ | $R^{C19}$ | $R^{E4}$ | $R^{A34}$ |
| $L_{A3782}$ | $R^{C19}$ | $R^{E5}$ | $R^{A34}$ |
| $L_{A3783}$ | $R^{C19}$ | $R^{E6}$ | $R^{A34}$ |
| $L_{A3784}$ | $R^{C19}$ | $R^{E7}$ | $R^{A34}$ |
| $L_{A3785}$ | $R^{C19}$ | $R^{E8}$ | $R^{A34}$ |
| $L_{A3786}$ | $R^{C19}$ | $R^{E9}$ | $R^{A34}$ |
| $L_{A3787}$ | $R^{C19}$ | $R^{E10}$ | $R^{A34}$ |
| $L_{A3788}$ | $R^{C19}$ | $R^{E11}$ | $R^{A34}$ |
| $L_{A3789}$ | $R^{C19}$ | $R^{E12}$ | $R^{A34}$ |
| $L_{A3790}$ | $R^{C19}$ | $R^{E13}$ | $R^{A34}$ |
| $L_{A3791}$ | $R^{C19}$ | $R^{E14}$ | $R^{A34}$ |
| $L_{A3792}$ | $R^{C19}$ | $R^{E15}$ | $R^{A34}$ |
| $L_{A3793}$ | $R^{C19}$ | $R^{E16}$ | $R^{A34}$ |
| $L_{A3794}$ | $R^{C19}$ | $R^{E17}$ | $R^{A34}$ |
| $L_{A3795}$ | $R^{C19}$ | $R^{E18}$ | $R^{A34}$ |
| $L_{A3796}$ | $R^{C19}$ | $R^{E19}$ | $R^{A34}$ |
| $L_{A3797}$ | $R^{C19}$ | $R^{E20}$ | $R^{A34}$ |
| $L_{A3798}$ | $R^{C19}$ | $R^{E21}$ | $R^{A34}$ |
| $L_{A3799}$ | $R^{C19}$ | $R^{B3}$ | $R^{A52}$ |
| $L_{A3800}$ | $R^{C19}$ | $R^{B6}$ | $R^{A52}$ |
| $L_{A3801}$ | $R^{C19}$ | $R^{B7}$ | $R^{A52}$ |
| $L_{A3802}$ | $R^{C19}$ | $R^{B12}$ | $R^{A52}$ |
| $L_{A3803}$ | $R^{C19}$ | $R^{B20}$ | $R^{A52}$ |
| $L_{A3804}$ | $R^{C19}$ | $R^{B25}$ | $R^{A52}$ |
| $L_{A3805}$ | $R^{C19}$ | $R^{B29}$ | $R^{A52}$ |
| $L_{A3806}$ | $R^{C19}$ | $R^{A37}$ | $R^{A52}$ |
| $L_{A3807}$ | $R^{C19}$ | $R^{A43}$ | $R^{A52}$ |
| $L_{A3808}$ | $R^{C19}$ | $R^{E1}$ | $R^{A52}$ |
| $L_{A3809}$ | $R^{C19}$ | $R^{E2}$ | $R^{A52}$ |
| $L_{A3810}$ | $R^{C19}$ | $R^{E3}$ | $R^{A52}$ |
| $L_{A3811}$ | $R^{C19}$ | $R^{E4}$ | $R^{A52}$ |
| $L_{A3812}$ | $R^{C19}$ | $R^{E5}$ | $R^{A52}$ |
| $L_{A3813}$ | $R^{C19}$ | $R^{E6}$ | $R^{A52}$ |
| $L_{A3814}$ | $R^{C19}$ | $R^{E7}$ | $R^{A52}$ |
| $L_{A3815}$ | $R^{C19}$ | $R^{E8}$ | $R^{A52}$ |
| $L_{A3816}$ | $R^{C19}$ | $R^{E9}$ | $R^{A52}$ |
| $L_{A3817}$ | $R^{C19}$ | $R^{E10}$ | $R^{A52}$ |
| $L_{A3818}$ | $R^{C19}$ | $R^{E11}$ | $R^{A52}$ |
| $L_{A3819}$ | $R^{C19}$ | $R^{E12}$ | $R^{A52}$ |
| $L_{A3820}$ | $R^{C19}$ | $R^{E13}$ | $R^{A52}$ |
| $L_{A3821}$ | $R^{C19}$ | $R^{E14}$ | $R^{A52}$ |
| $L_{A3822}$ | $R^{C19}$ | $R^{E15}$ | $R^{A52}$ |
| $L_{A3823}$ | $R^{C19}$ | $R^{E16}$ | $R^{A52}$ |
| $L_{A3824}$ | $R^{C19}$ | $R^{E17}$ | $R^{A52}$ |
| $L_{A3825}$ | $R^{C19}$ | $R^{E18}$ | $R^{A52}$ |
| $L_{A3826}$ | $R^{C19}$ | $R^{E19}$ | $R^{A52}$ |
| $L_{A3827}$ | $R^{C19}$ | $R^{E20}$ | $R^{A52}$ |
| $L_{A3828}$ | $R^{C19}$ | $R^{E21}$ | $R^{A52}$ |
| $L_{A3829}$ | $R^{C30}$ | $R^{B3}$ | H |
| $L_{A3830}$ | $R^{C30}$ | $R^{B6}$ | H |
| $L_{A3831}$ | $R^{C30}$ | $R^{B7}$ | H |
| $L_{A3832}$ | $R^{C30}$ | $R^{B12}$ | H |
| $L_{A3833}$ | $R^{C30}$ | $R^{B20}$ | H |
| $L_{A3834}$ | $R^{C30}$ | $R^{B25}$ | H |
| $L_{A3835}$ | $R^{C30}$ | $R^{B29}$ | H |
| $L_{A3836}$ | $R^{C30}$ | $R^{A37}$ | H |
| $L_{A3837}$ | $R^{C30}$ | $R^{A43}$ | H |
| $L_{A3838}$ | $R^{C30}$ | $R^{E1}$ | H |
| $L_{A3839}$ | $R^{C30}$ | $R^{E2}$ | H |
| $L_{A3840}$ | $R^{C30}$ | $R^{E3}$ | H |
| $L_{A3841}$ | $R^{C30}$ | $R^{E4}$ | H |
| $L_{A3842}$ | $R^{C30}$ | $R^{E5}$ | H |
| $L_{A3843}$ | $R^{C30}$ | $R^{E6}$ | H |
| $L_{A3844}$ | $R^{C30}$ | $R^{E7}$ | H |
| $L_{A3845}$ | $R^{C30}$ | $R^{E8}$ | H |
| $L_{A3846}$ | $R^{C30}$ | $R^{E9}$ | H |
| $L_{A3847}$ | $R^{C30}$ | $R^{E10}$ | H |
| $L_{A3848}$ | $R^{C30}$ | $R^{E11}$ | H |
| $L_{A3849}$ | $R^{C30}$ | $R^{E12}$ | H |
| $L_{A3850}$ | $R^{C30}$ | $R^{E13}$ | H |
| $L_{A3851}$ | $R^{C30}$ | $R^{E14}$ | H |
| $L_{A3852}$ | $R^{C30}$ | $R^{E15}$ | H |
| $L_{A3853}$ | $R^{C30}$ | $R^{E16}$ | H |
| $L_{A3854}$ | $R^{C30}$ | $R^{E17}$ | H |
| $L_{A3855}$ | $R^{C30}$ | $R^{E18}$ | H |
| $L_{A3856}$ | $R^{C30}$ | $R^{E19}$ | H |
| $L_{A3857}$ | $R^{C30}$ | $R^{E20}$ | H |
| $L_{A3858}$ | $R^{C30}$ | $R^{E21}$ | H |
| $L_{A3859}$ | $R^{C30}$ | $R^{B3}$ | $R^{B3}$ |
| $L_{A3860}$ | $R^{C30}$ | $R^{B6}$ | $R^{B3}$ |
| $L_{A3861}$ | $R^{C30}$ | $R^{B7}$ | $R^{B3}$ |
| $L_{A3862}$ | $R^{C30}$ | $R^{B12}$ | $R^{B3}$ |
| $L_{A3863}$ | $R^{C30}$ | $R^{B20}$ | $R^{B3}$ |
| $L_{A3864}$ | $R^{C30}$ | $R^{B25}$ | $R^{B3}$ |
| $L_{A3865}$ | $R^{C30}$ | $R^{B29}$ | $R^{B3}$ |
| $L_{A3866}$ | $R^{C30}$ | $R^{A37}$ | $R^{B3}$ |
| $L_{A3867}$ | $R^{C30}$ | $R^{A43}$ | $R^{B3}$ |
| $L_{A3868}$ | $R^{C30}$ | $R^{E1}$ | $R^{B3}$ |
| $L_{A3869}$ | $R^{C30}$ | $R^{E2}$ | $R^{B3}$ |
| $L_{A3870}$ | $R^{C30}$ | $R^{E3}$ | $R^{B3}$ |
| $L_{A3871}$ | $R^{C30}$ | $R^{E4}$ | $R^{B3}$ |
| $L_{A3872}$ | $R^{C30}$ | $R^{E5}$ | $R^{B3}$ |
| $L_{A3873}$ | $R^{C30}$ | $R^{E6}$ | $R^{B3}$ |
| $L_{A3874}$ | $R^{C30}$ | $R^{E7}$ | $R^{B3}$ |
| $L_{A3875}$ | $R^{C30}$ | $R^{E8}$ | $R^{B3}$ |
| $L_{A3876}$ | $R^{C30}$ | $R^{E9}$ | $R^{B3}$ |
| $L_{A3877}$ | $R^{C30}$ | $R^{E10}$ | $R^{B3}$ |
| $L_{A3878}$ | $R^{C30}$ | $R^{E11}$ | $R^{B3}$ |
| $L_{A3879}$ | $R^{C30}$ | $R^{E12}$ | $R^{B3}$ |
| $L_{A3880}$ | $R^{C30}$ | $R^{E13}$ | $R^{B3}$ |
| $L_{A3881}$ | $R^{C30}$ | $R^{E14}$ | $R^{B3}$ |
| $L_{A3882}$ | $R^{C30}$ | $R^{E15}$ | $R^{B3}$ |
| $L_{A3883}$ | $R^{C30}$ | $R^{E16}$ | $R^{B3}$ |
| $L_{A3884}$ | $R^{C30}$ | $R^{E17}$ | $R^{B3}$ |
| $L_{A3885}$ | $R^{C30}$ | $R^{E18}$ | $R^{B3}$ |
| $L_{A3886}$ | $R^{C30}$ | $R^{E19}$ | $R^{B3}$ |
| $L_{A3887}$ | $R^{C30}$ | $R^{E20}$ | $R^{B3}$ |
| $L_{A3888}$ | $R^{C30}$ | $R^{E21}$ | $R^{B3}$ |
| $L_{A3889}$ | $R^{C30}$ | $R^{B3}$ | $R^{B4}$ |
| $L_{A3890}$ | $R^{C30}$ | $R^{B6}$ | $R^{B4}$ |
| $L_{A3891}$ | $R^{C30}$ | $R^{B7}$ | $R^{B4}$ |
| $L_{A3892}$ | $R^{C30}$ | $R^{B12}$ | $R^{B4}$ |
| $L_{A3893}$ | $R^{C30}$ | $R^{B20}$ | $R^{B4}$ |
| $L_{A3894}$ | $R^{C30}$ | $R^{B25}$ | $R^{B4}$ |
| $L_{A3895}$ | $R^{C30}$ | $R^{B29}$ | $R^{B4}$ |
| $L_{A3896}$ | $R^{C30}$ | $R^{A37}$ | $R^{B4}$ |
| $L_{A3897}$ | $R^{C30}$ | $R^{A43}$ | $R^{B4}$ |
| $L_{A3898}$ | $R^{C30}$ | $R^{E1}$ | $R^{B4}$ |
| $L_{A3899}$ | $R^{C30}$ | $R^{E2}$ | $R^{B4}$ |
| $L_{A3900}$ | $R^{C30}$ | $R^{E3}$ | $R^{B4}$ |
| $L_{A3901}$ | $R^{C30}$ | $R^{E4}$ | $R^{B4}$ |
| $L_{A3902}$ | $R^{C30}$ | $R^{E5}$ | $R^{B4}$ |
| $L_{A3903}$ | $R^{C30}$ | $R^{E6}$ | $R^{B4}$ |
| $L_{A3904}$ | $R^{C30}$ | $R^{E7}$ | $R^{B4}$ |
| $L_{A3905}$ | $R^{C30}$ | $R^{E8}$ | $R^{B4}$ |
| $L_{A3906}$ | $R^{C30}$ | $R^{E9}$ | $R^{B4}$ |
| $L_{A3907}$ | $R^{C30}$ | $R^{E10}$ | $R^{B4}$ |
| $L_{A3908}$ | $R^{C30}$ | $R^{E11}$ | $R^{B4}$ |
| $L_{A3909}$ | $R^{C30}$ | $R^{E12}$ | $R^{B4}$ |
| $L_{A3910}$ | $R^{C30}$ | $R^{E13}$ | $R^{B4}$ |
| $L_{A3911}$ | $R^{C30}$ | $R^{E14}$ | $R^{B4}$ |
| $L_{A3912}$ | $R^{C30}$ | $R^{E15}$ | $R^{B4}$ |

-continued

| Ligand | $R^2$ | $R^3$ | $R^4$ |
|---|---|---|---|
| $L_{A3913}$ | $R^{C30}$ | $R^{E16}$ | $R^{B4}$ |
| $L_{A3914}$ | $R^{C30}$ | $R^{E17}$ | $R^{B4}$ |
| $L_{A3915}$ | $R^{C30}$ | $R^{E18}$ | $R^{B4}$ |
| $L_{A3916}$ | $R^{C30}$ | $R^{E19}$ | $R^{B4}$ |
| $L_{A3917}$ | $R^{C30}$ | $R^{E20}$ | $R^{B4}$ |
| $L_{A3918}$ | $R^{C30}$ | $R^{E21}$ | $R^{B4}$ |
| $L_{A3919}$ | $R^{C30}$ | $R^{B3}$ | $R^{B18}$ |
| $L_{A3920}$ | $R^{C30}$ | $R^{B6}$ | $R^{B18}$ |
| $L_{A3921}$ | $R^{C30}$ | $R^{B7}$ | $R^{B18}$ |
| $L_{A3922}$ | $R^{C30}$ | $R^{B12}$ | $R^{B18}$ |
| $L_{A3923}$ | $R^{C30}$ | $R^{B20}$ | $R^{B18}$ |
| $L_{A3924}$ | $R^{C30}$ | $R^{B25}$ | $R^{B18}$ |
| $L_{A3925}$ | $R^{C30}$ | $R^{B29}$ | $R^{B18}$ |
| $L_{A3926}$ | $R^{C30}$ | $R^{A37}$ | $R^{B18}$ |
| $L_{A3927}$ | $R^{C30}$ | $R^{A43}$ | $R^{B18}$ |
| $L_{A3928}$ | $R^{C30}$ | $R^{E1}$ | $R^{B18}$ |
| $L_{A3929}$ | $R^{C30}$ | $R^{E2}$ | $R^{B18}$ |
| $L_{A3930}$ | $R^{C30}$ | $R^{E3}$ | $R^{B18}$ |
| $L_{A3931}$ | $R^{C30}$ | $R^{E4}$ | $R^{B18}$ |
| $L_{A3932}$ | $R^{C30}$ | $R^{E5}$ | $R^{B18}$ |
| $L_{A3933}$ | $R^{C30}$ | $R^{E6}$ | $R^{B18}$ |
| $L_{A3934}$ | $R^{C30}$ | $R^{E7}$ | $R^{B18}$ |
| $L_{A3935}$ | $R^{C30}$ | $R^{E8}$ | $R^{B18}$ |
| $L_{A3936}$ | $R^{C30}$ | $R^{E9}$ | $R^{B18}$ |
| $L_{A3937}$ | $R^{C30}$ | $R^{E10}$ | $R^{B18}$ |
| $L_{A3938}$ | $R^{C30}$ | $R^{E11}$ | $R^{B18}$ |
| $L_{A3939}$ | $R^{C30}$ | $R^{E12}$ | $R^{B18}$ |
| $L_{A3940}$ | $R^{C30}$ | $R^{E13}$ | $R^{B18}$ |
| $L_{A3941}$ | $R^{C30}$ | $R^{E14}$ | $R^{B18}$ |
| $L_{A3942}$ | $R^{C30}$ | $R^{E15}$ | $R^{B18}$ |
| $L_{A3943}$ | $R^{C30}$ | $R^{E16}$ | $R^{B18}$ |
| $L_{A3944}$ | $R^{C30}$ | $R^{E17}$ | $R^{B18}$ |
| $L_{A3945}$ | $R^{C30}$ | $R^{E18}$ | $R^{B18}$ |
| $L_{A3946}$ | $R^{C30}$ | $R^{E19}$ | $R^{B18}$ |
| $L_{A3947}$ | $R^{C30}$ | $R^{E20}$ | $R^{B18}$ |
| $L_{A3948}$ | $R^{C30}$ | $R^{E21}$ | $R^{B18}$ |
| $L_{A3949}$ | $R^{C30}$ | $R^{B3}$ | $R^{A3}$ |
| $L_{A3950}$ | $R^{C30}$ | $R^{B6}$ | $R^{A3}$ |
| $L_{A3951}$ | $R^{C30}$ | $R^{B7}$ | $R^{A3}$ |
| $L_{A3952}$ | $R^{C30}$ | $R^{B12}$ | $R^{A3}$ |
| $L_{A3953}$ | $R^{C30}$ | $R^{B20}$ | $R^{A3}$ |
| $L_{A3954}$ | $R^{C30}$ | $R^{B25}$ | $R^{A3}$ |
| $L_{A3955}$ | $R^{C30}$ | $R^{B29}$ | $R^{A3}$ |
| $L_{A3956}$ | $R^{C30}$ | $R^{A37}$ | $R^{A3}$ |
| $L_{A3957}$ | $R^{C30}$ | $R^{A43}$ | $R^{A3}$ |
| $L_{A3958}$ | $R^{C30}$ | $R^{E1}$ | $R^{A3}$ |
| $L_{A3959}$ | $R^{C30}$ | $R^{E2}$ | $R^{A3}$ |
| $L_{A3960}$ | $R^{C30}$ | $R^{E3}$ | $R^{A3}$ |
| $L_{A3961}$ | $R^{C30}$ | $R^{E4}$ | $R^{A3}$ |
| $L_{A3962}$ | $R^{C30}$ | $R^{E5}$ | $R^{A3}$ |
| $L_{A3963}$ | $R^{C30}$ | $R^{E6}$ | $R^{A3}$ |
| $L_{A3964}$ | $R^{C30}$ | $R^{E7}$ | $R^{A3}$ |
| $L_{A3965}$ | $R^{C30}$ | $R^{E8}$ | $R^{A3}$ |
| $L_{A3966}$ | $R^{C30}$ | $R^{E9}$ | $R^{A3}$ |
| $L_{A3967}$ | $R^{C30}$ | $R^{E10}$ | $R^{A3}$ |
| $L_{A3968}$ | $R^{C30}$ | $R^{E11}$ | $R^{A3}$ |
| $L_{A3969}$ | $R^{C30}$ | $R^{E12}$ | $R^{A3}$ |
| $L_{A3970}$ | $R^{C30}$ | $R^{E13}$ | $R^{A3}$ |
| $L_{A3971}$ | $R^{C30}$ | $R^{E14}$ | $R^{A3}$ |
| $L_{A3972}$ | $R^{C30}$ | $R^{E15}$ | $R^{A3}$ |
| $L_{A3973}$ | $R^{C30}$ | $R^{E16}$ | $R^{A3}$ |
| $L_{A3974}$ | $R^{C30}$ | $R^{E17}$ | $R^{A3}$ |
| $L_{A3975}$ | $R^{C30}$ | $R^{E18}$ | $R^{A3}$ |
| $L_{A3976}$ | $R^{C30}$ | $R^{E19}$ | $R^{A3}$ |
| $L_{A3977}$ | $R^{C30}$ | $R^{E20}$ | $R^{A3}$ |
| $L_{A3978}$ | $R^{C30}$ | $R^{E21}$ | $R^{A3}$ |
| $L_{A3979}$ | $R^{C30}$ | $R^{B3}$ | $R^{A34}$ |
| $L_{A3980}$ | $R^{C30}$ | $R^{B6}$ | $R^{A34}$ |
| $L_{A3981}$ | $R^{C30}$ | $R^{B7}$ | $R^{A34}$ |
| $L_{A3982}$ | $R^{C30}$ | $R^{B12}$ | $R^{A34}$ |
| $L_{A3983}$ | $R^{C30}$ | $R^{B20}$ | $R^{A34}$ |
| $L_{A3984}$ | $R^{C30}$ | $R^{B25}$ | $R^{A34}$ |
| $L_{A3985}$ | $R^{C30}$ | $R^{B29}$ | $R^{A34}$ |
| $L_{A3986}$ | $R^{C30}$ | $R^{A37}$ | $R^{A34}$ |
| $L_{A3987}$ | $R^{C30}$ | $R^{A43}$ | $R^{A34}$ |
| $L_{A3988}$ | $R^{C30}$ | $R^{E1}$ | $R^{A34}$ |
| $L_{A3989}$ | $R^{C30}$ | $R^{E2}$ | $R^{A34}$ |
| $L_{A3990}$ | $R^{C30}$ | $R^{E3}$ | $R^{A34}$ |
| $L_{A3991}$ | $R^{C30}$ | $R^{E4}$ | $R^{A34}$ |
| $L_{A3992}$ | $R^{C30}$ | $R^{E5}$ | $R^{A34}$ |
| $L_{A3993}$ | $R^{C30}$ | $R^{E6}$ | $R^{A34}$ |
| $L_{A3994}$ | $R^{C30}$ | $R^{E7}$ | $R^{A34}$ |
| $L_{A3995}$ | $R^{C30}$ | $R^{E8}$ | $R^{A34}$ |
| $L_{A3996}$ | $R^{C30}$ | $R^{E9}$ | $R^{A34}$ |
| $L_{A3997}$ | $R^{C30}$ | $R^{E10}$ | $R^{A34}$ |
| $L_{A3998}$ | $R^{C30}$ | $R^{E11}$ | $R^{A34}$ |
| $L_{A3999}$ | $R^{C30}$ | $R^{E12}$ | $R^{A34}$ |
| $L_{A4000}$ | $R^{C30}$ | $R^{E13}$ | $R^{A34}$ |
| $L_{A4001}$ | $R^{C30}$ | $R^{E14}$ | $R^{A34}$ |
| $L_{A4002}$ | $R^{C30}$ | $R^{E15}$ | $R^{A34}$ |
| $L_{A4003}$ | $R^{C30}$ | $R^{E16}$ | $R^{A34}$ |
| $L_{A4004}$ | $R^{C30}$ | $R^{E17}$ | $R^{A34}$ |
| $L_{A4005}$ | $R^{C30}$ | $R^{E18}$ | $R^{A34}$ |
| $L_{A4006}$ | $R^{C30}$ | $R^{E19}$ | $R^{A34}$ |
| $L_{A4007}$ | $R^{C30}$ | $R^{E20}$ | $R^{A34}$ |
| $L_{A4008}$ | $R^{C30}$ | $R^{E21}$ | $R^{A34}$ |
| $L_{A4009}$ | $R^{C30}$ | $R^{B3}$ | $R^{A52}$ |
| $L_{A4010}$ | $R^{C30}$ | $R^{B6}$ | $R^{A52}$ |
| $L_{A4011}$ | $R^{C30}$ | $R^{B7}$ | $R^{A52}$ |
| $L_{A4012}$ | $R^{C30}$ | $R^{B12}$ | $R^{A52}$ |
| $L_{A4013}$ | $R^{C30}$ | $R^{B20}$ | $R^{A52}$ |
| $L_{A4014}$ | $R^{C30}$ | $R^{B25}$ | $R^{A52}$ |
| $L_{A4015}$ | $R^{C30}$ | $R^{B29}$ | $R^{A52}$ |
| $L_{A4016}$ | $R^{C30}$ | $R^{A37}$ | $R^{A52}$ |
| $L_{A4017}$ | $R^{C30}$ | $R^{A43}$ | $R^{A52}$ |
| $L_{A4018}$ | $R^{C30}$ | $R^{E1}$ | $R^{A52}$ |
| $L_{A4019}$ | $R^{C30}$ | $R^{E2}$ | $R^{A52}$ |
| $L_{A4020}$ | $R^{C30}$ | $R^{E3}$ | $R^{A52}$ |
| $L_{A4021}$ | $R^{C30}$ | $R^{E4}$ | $R^{A52}$ |
| $L_{A4022}$ | $R^{C30}$ | $R^{E5}$ | $R^{A52}$ |
| $L_{A4023}$ | $R^{C30}$ | $R^{E6}$ | $R^{A52}$ |
| $L_{A4024}$ | $R^{C30}$ | $R^{E7}$ | $R^{A52}$ |
| $L_{A4025}$ | $R^{C30}$ | $R^{E8}$ | $R^{A52}$ |
| $L_{A4026}$ | $R^{C30}$ | $R^{E9}$ | $R^{A52}$ |
| $L_{A4027}$ | $R^{C30}$ | $R^{E10}$ | $R^{A52}$ |
| $L_{A4028}$ | $R^{C30}$ | $R^{E11}$ | $R^{A52}$ |
| $L_{A4029}$ | $R^{C30}$ | $R^{E12}$ | $R^{A52}$ |
| $L_{A4030}$ | $R^{C30}$ | $R^{E13}$ | $R^{A52}$ |
| $L_{A4031}$ | $R^{C30}$ | $R^{E14}$ | $R^{A52}$ |
| $L_{A4032}$ | $R^{C30}$ | $R^{E15}$ | $R^{A52}$ |
| $L_{A4033}$ | $R^{C30}$ | $R^{E16}$ | $R^{A52}$ |
| $L_{A4034}$ | $R^{C30}$ | $R^{E17}$ | $R^{A52}$ |
| $L_{A4035}$ | $R^{C30}$ | $R^{E18}$ | $R^{A52}$ |
| $L_{A4036}$ | $R^{C30}$ | $R^{E19}$ | $R^{A52}$ |
| $L_{A4037}$ | $R^{C30}$ | $R^{E20}$ | $R^{A52}$ |
| $L_{A4038}$ | $R^{C30}$ | $R^{E21}$ | $R^{A52}$ |

$L_{A4039}$ through $L_{A4878}$ that are based on a structure of Formula XII,

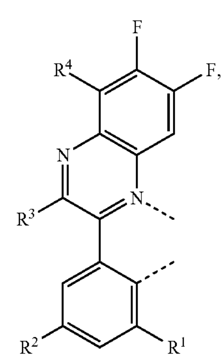

in which $R^1$, $R^2$, $R^3$, and $R^4$ are defined as:

| Ligand | $R^1$ | $R^2$ | $R^3$ | $R^4$ |
|---|---|---|---|---|
| $L_{44039}$ | $R^{C1}$ | $R^{C1}$ | $R^{B3}$ | H |
| $L_{44040}$ | $R^{C1}$ | $R^{C1}$ | $R^{B6}$ | H |
| $L_{44041}$ | $R^{C1}$ | $R^{C1}$ | $R^{B7}$ | H |
| $L_{44042}$ | $R^{C1}$ | $R^{C1}$ | $R^{B12}$ | H |
| $L_{44043}$ | $R^{C1}$ | $R^{C1}$ | $R^{B20}$ | H |
| $L_{44044}$ | $R^{C1}$ | $R^{C1}$ | $R^{B25}$ | H |
| $L_{44045}$ | $R^{C1}$ | $R^{C1}$ | $R^{B29}$ | H |
| $L_{44046}$ | $R^{C1}$ | $R^{C1}$ | $R^{A37}$ | H |
| $L_{44047}$ | $R^{C1}$ | $R^{C1}$ | $R^{A43}$ | H |
| $L_{44048}$ | $R^{C1}$ | $R^{C1}$ | $R^{E1}$ | H |
| $L_{44049}$ | $R^{C1}$ | $R^{C1}$ | $R^{E2}$ | H |
| $L_{44050}$ | $R^{C1}$ | $R^{C1}$ | $R^{E3}$ | H |
| $L_{44051}$ | $R^{C1}$ | $R^{C1}$ | $R^{E4}$ | H |
| $L_{44052}$ | $R^{C1}$ | $R^{C1}$ | $R^{E5}$ | H |
| $L_{44053}$ | $R^{C1}$ | $R^{C1}$ | $R^{E6}$ | H |
| $L_{44054}$ | $R^{C1}$ | $R^{C1}$ | $R^{E7}$ | H |
| $L_{44055}$ | $R^{C1}$ | $R^{C1}$ | $R^{E8}$ | H |
| $L_{44056}$ | $R^{C1}$ | $R^{C1}$ | $R^{E9}$ | H |
| $L_{44057}$ | $R^{C1}$ | $R^{C1}$ | $R^{E10}$ | H |
| $L_{44058}$ | $R^{C1}$ | $R^{C1}$ | $R^{E11}$ | H |
| $L_{44059}$ | $R^{C1}$ | $R^{C1}$ | $R^{E12}$ | H |
| $L_{44060}$ | $R^{C1}$ | $R^{C1}$ | $R^{E13}$ | H |
| $L_{44061}$ | $R^{C1}$ | $R^{C1}$ | $R^{E14}$ | H |
| $L_{44062}$ | $R^{C1}$ | $R^{C1}$ | $R^{E15}$ | H |
| $L_{44063}$ | $R^{C1}$ | $R^{C1}$ | $R^{E16}$ | H |
| $L_{44064}$ | $R^{C1}$ | $R^{C1}$ | $R^{E17}$ | H |
| $L_{44065}$ | $R^{C1}$ | $R^{C1}$ | $R^{E18}$ | H |
| $L_{44066}$ | $R^{C1}$ | $R^{C1}$ | $R^{E19}$ | H |
| $L_{44067}$ | $R^{C1}$ | $R^{C1}$ | $R^{E20}$ | H |
| $L_{44068}$ | $R^{C1}$ | $R^{C1}$ | $R^{E21}$ | H |
| $L_{44069}$ | $R^{C1}$ | $R^{C1}$ | $R^{B3}$ | $R^{B3}$ |
| $L_{44070}$ | $R^{C1}$ | $R^{C1}$ | $R^{B6}$ | $R^{B3}$ |
| $L_{44071}$ | $R^{C1}$ | $R^{C1}$ | $R^{B7}$ | $R^{B3}$ |
| $L_{44072}$ | $R^{C1}$ | $R^{C1}$ | $R^{B12}$ | $R^{B3}$ |
| $L_{44073}$ | $R^{C1}$ | $R^{C1}$ | $R^{B20}$ | $R^{B3}$ |
| $L_{44074}$ | $R^{C1}$ | $R^{C1}$ | $R^{B25}$ | $R^{B3}$ |
| $L_{44075}$ | $R^{C1}$ | $R^{C1}$ | $R^{B29}$ | $R^{B3}$ |
| $L_{44076}$ | $R^{C1}$ | $R^{C1}$ | $R^{A37}$ | $R^{B3}$ |
| $L_{44077}$ | $R^{C1}$ | $R^{C1}$ | $R^{A43}$ | $R^{B3}$ |
| $L_{44078}$ | $R^{C1}$ | $R^{C1}$ | $R^{E1}$ | $R^{B3}$ |
| $L_{44079}$ | $R^{C1}$ | $R^{C1}$ | $R^{E2}$ | $R^{B3}$ |
| $L_{44080}$ | $R^{C1}$ | $R^{C1}$ | $R^{E3}$ | $R^{B3}$ |
| $L_{44081}$ | $R^{C1}$ | $R^{C1}$ | $R^{E4}$ | $R^{B3}$ |
| $L_{44082}$ | $R^{C1}$ | $R^{C1}$ | $R^{E5}$ | $R^{B3}$ |
| $L_{44083}$ | $R^{C1}$ | $R^{C1}$ | $R^{E6}$ | $R^{B3}$ |
| $L_{44084}$ | $R^{C1}$ | $R^{C1}$ | $R^{E7}$ | $R^{B3}$ |
| $L_{44085}$ | $R^{C1}$ | $R^{C1}$ | $R^{E8}$ | $R^{B3}$ |
| $L_{44086}$ | $R^{C1}$ | $R^{C1}$ | $R^{E9}$ | $R^{B3}$ |
| $L_{44087}$ | $R^{C1}$ | $R^{C1}$ | $R^{E10}$ | $R^{B3}$ |
| $L_{44088}$ | $R^{C1}$ | $R^{C1}$ | $R^{E11}$ | $R^{B3}$ |
| $L_{44089}$ | $R^{C1}$ | $R^{C1}$ | $R^{E12}$ | $R^{B3}$ |
| $L_{44090}$ | $R^{C1}$ | $R^{C1}$ | $R^{E13}$ | $R^{B3}$ |
| $L_{44091}$ | $R^{C1}$ | $R^{C1}$ | $R^{E14}$ | $R^{B3}$ |
| $L_{44092}$ | $R^{C1}$ | $R^{C1}$ | $R^{E15}$ | $R^{B3}$ |
| $L_{44093}$ | $R^{C1}$ | $R^{C1}$ | $R^{E16}$ | $R^{B3}$ |
| $L_{44094}$ | $R^{C1}$ | $R^{C1}$ | $R^{E17}$ | $R^{B3}$ |
| $L_{44095}$ | $R^{C1}$ | $R^{C1}$ | $R^{E18}$ | $R^{B3}$ |
| $L_{44096}$ | $R^{C1}$ | $R^{C1}$ | $R^{E19}$ | $R^{B3}$ |
| $L_{44097}$ | $R^{C1}$ | $R^{C1}$ | $R^{E20}$ | $R^{B3}$ |
| $L_{44098}$ | $R^{C1}$ | $R^{C1}$ | $R^{E21}$ | $R^{B3}$ |
| $L_{44099}$ | $R^{C1}$ | $R^{C1}$ | $R^{B3}$ | $R^{B4}$ |
| $L_{44100}$ | $R^{C1}$ | $R^{C1}$ | $R^{B6}$ | $R^{B4}$ |
| $L_{44101}$ | $R^{C1}$ | $R^{C1}$ | $R^{B7}$ | $R^{B4}$ |
| $L_{44102}$ | $R^{C1}$ | $R^{C1}$ | $R^{B12}$ | $R^{B4}$ |
| $L_{44103}$ | $R^{C1}$ | $R^{C1}$ | $R^{B20}$ | $R^{B4}$ |
| $L_{44104}$ | $R^{C1}$ | $R^{C1}$ | $R^{B25}$ | $R^{B4}$ |
| $L_{44105}$ | $R^{C1}$ | $R^{C1}$ | $R^{B29}$ | $R^{B4}$ |
| $L_{44106}$ | $R^{C1}$ | $R^{C1}$ | $R^{A37}$ | $R^{B4}$ |
| $L_{44107}$ | $R^{C1}$ | $R^{C1}$ | $R^{A43}$ | $R^{B4}$ |
| $L_{44108}$ | $R^{C1}$ | $R^{C1}$ | $R^{E1}$ | $R^{B4}$ |
| $L_{44109}$ | $R^{C1}$ | $R^{C1}$ | $R^{E2}$ | $R^{B4}$ |
| $L_{44110}$ | $R^{C1}$ | $R^{C1}$ | $R^{E3}$ | $R^{B4}$ |
| $L_{44111}$ | $R^{C1}$ | $R^{C1}$ | $R^{E4}$ | $R^{B4}$ |
| $L_{44112}$ | $R^{C1}$ | $R^{C1}$ | $R^{E5}$ | $R^{B4}$ |
| $L_{44113}$ | $R^{C1}$ | $R^{C1}$ | $R^{E6}$ | $R^{B4}$ |
| $L_{44114}$ | $R^{C1}$ | $R^{C1}$ | $R^{E7}$ | $R^{B4}$ |
| $L_{44115}$ | $R^{C1}$ | $R^{C1}$ | $R^{E8}$ | $R^{B4}$ |
| $L_{44116}$ | $R^{C1}$ | $R^{C1}$ | $R^{E9}$ | $R^{B4}$ |
| $L_{44117}$ | $R^{C1}$ | $R^{C1}$ | $R^{E10}$ | $R^{B4}$ |
| $L_{44118}$ | $R^{C1}$ | $R^{C1}$ | $R^{E11}$ | $R^{B4}$ |
| $L_{44119}$ | $R^{C1}$ | $R^{C1}$ | $R^{E12}$ | $R^{B4}$ |
| $L_{44120}$ | $R^{C1}$ | $R^{C1}$ | $R^{E13}$ | $R^{B4}$ |
| $L_{44121}$ | $R^{C1}$ | $R^{C1}$ | $R^{E14}$ | $R^{B4}$ |
| $L_{44122}$ | $R^{C1}$ | $R^{C1}$ | $R^{E15}$ | $R^{B4}$ |
| $L_{44123}$ | $R^{C1}$ | $R^{C1}$ | $R^{E16}$ | $R^{B4}$ |
| $L_{44124}$ | $R^{C1}$ | $R^{C1}$ | $R^{E17}$ | $R^{B4}$ |
| $L_{44125}$ | $R^{C1}$ | $R^{C1}$ | $R^{E18}$ | $R^{B4}$ |
| $L_{44126}$ | $R^{C1}$ | $R^{C1}$ | $R^{E19}$ | $R^{B4}$ |
| $L_{44127}$ | $R^{C1}$ | $R^{C1}$ | $R^{E20}$ | $R^{B4}$ |
| $L_{44128}$ | $R^{C1}$ | $R^{C1}$ | $R^{E21}$ | $R^{B4}$ |
| $L_{44129}$ | $R^{C1}$ | $R^{C1}$ | $R^{B3}$ | $R^{B18}$ |
| $L_{44130}$ | $R^{C1}$ | $R^{C1}$ | $R^{B6}$ | $R^{B18}$ |
| $L_{44131}$ | $R^{C1}$ | $R^{C1}$ | $R^{B7}$ | $R^{B18}$ |
| $L_{44132}$ | $R^{C1}$ | $R^{C1}$ | $R^{B12}$ | $R^{B18}$ |
| $L_{44133}$ | $R^{C1}$ | $R^{C1}$ | $R^{B20}$ | $R^{B18}$ |
| $L_{44134}$ | $R^{C1}$ | $R^{C1}$ | $R^{B25}$ | $R^{B18}$ |
| $L_{44135}$ | $R^{C1}$ | $R^{C1}$ | $R^{B29}$ | $R^{B18}$ |
| $L_{44136}$ | $R^{C1}$ | $R^{C1}$ | $R^{A37}$ | $R^{B18}$ |
| $L_{44137}$ | $R^{C1}$ | $R^{C1}$ | $R^{A43}$ | $R^{B18}$ |
| $L_{44138}$ | $R^{C1}$ | $R^{C1}$ | $R^{E1}$ | $R^{B18}$ |
| $L_{44139}$ | $R^{C1}$ | $R^{C1}$ | $R^{E2}$ | $R^{B18}$ |
| $L_{44140}$ | $R^{C1}$ | $R^{C1}$ | $R^{E3}$ | $R^{B18}$ |
| $L_{44141}$ | $R^{C1}$ | $R^{C1}$ | $R^{E4}$ | $R^{B18}$ |
| $L_{44142}$ | $R^{C1}$ | $R^{C1}$ | $R^{E5}$ | $R^{B18}$ |
| $L_{44143}$ | $R^{C1}$ | $R^{C1}$ | $R^{E6}$ | $R^{B18}$ |
| $L_{44144}$ | $R^{C1}$ | $R^{C1}$ | $R^{E7}$ | $R^{B18}$ |
| $L_{44145}$ | $R^{C1}$ | $R^{C1}$ | $R^{E8}$ | $R^{B18}$ |
| $L_{44146}$ | $R^{C1}$ | $R^{C1}$ | $R^{E9}$ | $R^{B18}$ |
| $L_{44147}$ | $R^{C1}$ | $R^{C1}$ | $R^{E10}$ | $R^{B18}$ |
| $L_{44148}$ | $R^{C1}$ | $R^{C1}$ | $R^{E11}$ | $R^{B18}$ |
| $L_{44149}$ | $R^{C1}$ | $R^{C1}$ | $R^{E12}$ | $R^{B18}$ |
| $L_{44150}$ | $R^{C1}$ | $R^{C1}$ | $R^{E13}$ | $R^{B18}$ |
| $L_{44151}$ | $R^{C1}$ | $R^{C1}$ | $R^{E14}$ | $R^{B18}$ |
| $L_{44152}$ | $R^{C1}$ | $R^{C1}$ | $R^{E15}$ | $R^{B18}$ |
| $L_{44153}$ | $R^{C1}$ | $R^{C1}$ | $R^{E16}$ | $R^{B18}$ |
| $L_{44154}$ | $R^{C1}$ | $R^{C1}$ | $R^{E17}$ | $R^{B18}$ |
| $L_{44155}$ | $R^{C1}$ | $R^{C1}$ | $R^{E18}$ | $R^{B18}$ |
| $L_{44156}$ | $R^{C1}$ | $R^{C1}$ | $R^{E19}$ | $R^{B18}$ |
| $L_{44157}$ | $R^{C1}$ | $R^{C1}$ | $R^{E20}$ | $R^{B18}$ |
| $L_{44158}$ | $R^{C1}$ | $R^{C1}$ | $R^{E21}$ | $R^{B18}$ |
| $L_{44159}$ | $R^{C1}$ | $R^{C1}$ | $R^{B3}$ | $R^{A3}$ |
| $L_{44160}$ | $R^{C1}$ | $R^{C1}$ | $R^{B6}$ | $R^{A3}$ |
| $L_{44161}$ | $R^{C1}$ | $R^{C1}$ | $R^{B7}$ | $R^{A3}$ |
| $L_{44162}$ | $R^{C1}$ | $R^{C1}$ | $R^{B12}$ | $R^{A3}$ |
| $L_{44163}$ | $R^{C1}$ | $R^{C1}$ | $R^{B20}$ | $R^{A3}$ |
| $L_{44164}$ | $R^{C1}$ | $R^{C1}$ | $R^{B25}$ | $R^{A3}$ |
| $L_{44165}$ | $R^{C1}$ | $R^{C1}$ | $R^{B29}$ | $R^{A3}$ |
| $L_{44166}$ | $R^{C1}$ | $R^{C1}$ | $R^{A37}$ | $R^{A3}$ |
| $L_{44167}$ | $R^{C1}$ | $R^{C1}$ | $R^{A43}$ | $R^{A3}$ |
| $L_{44168}$ | $R^{C1}$ | $R^{C1}$ | $R^{E1}$ | $R^{A3}$ |
| $L_{44169}$ | $R^{C1}$ | $R^{C1}$ | $R^{E2}$ | $R^{A3}$ |
| $L_{44170}$ | $R^{C1}$ | $R^{C1}$ | $R^{E3}$ | $R^{A3}$ |
| $L_{44171}$ | $R^{C1}$ | $R^{C1}$ | $R^{E4}$ | $R^{A3}$ |
| $L_{44172}$ | $R^{C1}$ | $R^{C1}$ | $R^{E5}$ | $R^{A3}$ |
| $L_{44173}$ | $R^{C1}$ | $R^{C1}$ | $R^{E6}$ | $R^{A3}$ |
| $L_{44174}$ | $R^{C1}$ | $R^{C1}$ | $R^{E7}$ | $R^{A3}$ |
| $L_{44175}$ | $R^{C1}$ | $R^{C1}$ | $R^{E8}$ | $R^{A3}$ |
| $L_{44176}$ | $R^{C1}$ | $R^{C1}$ | $R^{E9}$ | $R^{A3}$ |
| $L_{44177}$ | $R^{C1}$ | $R^{C1}$ | $R^{E10}$ | $R^{A3}$ |
| $L_{44178}$ | $R^{C1}$ | $R^{C1}$ | $R^{E11}$ | $R^{A3}$ |
| $L_{44179}$ | $R^{C1}$ | $R^{C1}$ | $R^{E12}$ | $R^{A3}$ |
| $L_{44180}$ | $R^{C1}$ | $R^{C1}$ | $R^{E13}$ | $R^{A3}$ |
| $L_{44181}$ | $R^{C1}$ | $R^{C1}$ | $R^{E14}$ | $R^{A3}$ |
| $L_{44182}$ | $R^{C1}$ | $R^{C1}$ | $R^{E15}$ | $R^{A3}$ |
| $L_{44183}$ | $R^{C1}$ | $R^{C1}$ | $R^{E16}$ | $R^{A3}$ |
| $L_{44184}$ | $R^{C1}$ | $R^{C1}$ | $R^{E17}$ | $R^{A3}$ |
| $L_{44185}$ | $R^{C1}$ | $R^{C1}$ | $R^{E18}$ | $R^{A3}$ |
| $L_{44186}$ | $R^{C1}$ | $R^{C1}$ | $R^{E19}$ | $R^{A3}$ |
| $L_{44187}$ | $R^{C1}$ | $R^{C1}$ | $R^{E20}$ | $R^{A3}$ |
| $L_{44188}$ | $R^{C1}$ | $R^{C1}$ | $R^{E21}$ | $R^{A3}$ |
| $L_{44189}$ | $R^{C1}$ | $R^{C1}$ | $R^{B3}$ | $R^{A34}$ |
| $L_{44190}$ | $R^{C1}$ | $R^{C1}$ | $R^{B6}$ | $R^{A34}$ |
| $L_{44191}$ | $R^{C1}$ | $R^{C1}$ | $R^{B7}$ | $R^{A34}$ |

-continued

| Ligand | $R^1$ | $R^2$ | $R^3$ | $R^4$ |
|---|---|---|---|---|
| $L_{A4192}$ | $R^{C1}$ | $R^{C1}$ | $R^{B12}$ | $R^{A34}$ |
| $L_{A4193}$ | $R^{C1}$ | $R^{C1}$ | $R^{B20}$ | $R^{A34}$ |
| $L_{A4194}$ | $R^{C1}$ | $R^{C1}$ | $R^{B25}$ | $R^{A34}$ |
| $L_{A4195}$ | $R^{C1}$ | $R^{C1}$ | $R^{B29}$ | $R^{A34}$ |
| $L_{A4196}$ | $R^{C1}$ | $R^{C1}$ | $R^{A37}$ | $R^{A34}$ |
| $L_{A4197}$ | $R^{C1}$ | $R^{C1}$ | $R^{A43}$ | $R^{A34}$ |
| $L_{A4198}$ | $R^{C1}$ | $R^{C1}$ | $R^{E1}$ | $R^{A34}$ |
| $L_{A4199}$ | $R^{C1}$ | $R^{C1}$ | $R^{E2}$ | $R^{A34}$ |
| $L_{A4200}$ | $R^{C1}$ | $R^{C1}$ | $R^{E3}$ | $R^{A34}$ |
| $L_{A4201}$ | $R^{C1}$ | $R^{C1}$ | $R^{E4}$ | $R^{A34}$ |
| $L_{A4202}$ | $R^{C1}$ | $R^{C1}$ | $R^{E5}$ | $R^{A34}$ |
| $L_{A4203}$ | $R^{C1}$ | $R^{C1}$ | $R^{E6}$ | $R^{A34}$ |
| $L_{A4204}$ | $R^{C1}$ | $R^{C1}$ | $R^{E7}$ | $R^{A34}$ |
| $L_{A4205}$ | $R^{C1}$ | $R^{C1}$ | $R^{E8}$ | $R^{A34}$ |
| $L_{A4206}$ | $R^{C1}$ | $R^{C1}$ | $R^{E9}$ | $R^{A34}$ |
| $L_{A4207}$ | $R^{C1}$ | $R^{C1}$ | $R^{E10}$ | $R^{A34}$ |
| $L_{A4208}$ | $R^{C1}$ | $R^{C1}$ | $R^{E11}$ | $R^{A34}$ |
| $L_{A4209}$ | $R^{C1}$ | $R^{C1}$ | $R^{E12}$ | $R^{A34}$ |
| $L_{A4210}$ | $R^{C1}$ | $R^{C1}$ | $R^{E13}$ | $R^{A34}$ |
| $L_{A4211}$ | $R^{C1}$ | $R^{C1}$ | $R^{E14}$ | $R^{A34}$ |
| $L_{A4212}$ | $R^{C1}$ | $R^{C1}$ | $R^{E15}$ | $R^{A34}$ |
| $L_{A4213}$ | $R^{C1}$ | $R^{C1}$ | $R^{E16}$ | $R^{A34}$ |
| $L_{A4214}$ | $R^{C1}$ | $R^{C1}$ | $R^{E17}$ | $R^{A34}$ |
| $L_{A4215}$ | $R^{C1}$ | $R^{C1}$ | $R^{E18}$ | $R^{A34}$ |
| $L_{A4216}$ | $R^{C1}$ | $R^{C1}$ | $R^{E19}$ | $R^{A34}$ |
| $L_{A4217}$ | $R^{C1}$ | $R^{C1}$ | $R^{E20}$ | $R^{A34}$ |
| $L_{A4218}$ | $R^{C1}$ | $R^{C1}$ | $R^{E21}$ | $R^{A34}$ |
| $L_{A4219}$ | $R^{C1}$ | $R^{C1}$ | $R^{B3}$ | $R^{A52}$ |
| $L_{A4220}$ | $R^{C1}$ | $R^{C1}$ | $R^{B6}$ | $R^{A52}$ |
| $L_{A4221}$ | $R^{C1}$ | $R^{C1}$ | $R^{B7}$ | $R^{A52}$ |
| $L_{A4222}$ | $R^{C1}$ | $R^{C1}$ | $R^{B12}$ | $R^{A52}$ |
| $L_{A4223}$ | $R^{C1}$ | $R^{C1}$ | $R^{B20}$ | $R^{A52}$ |
| $L_{A4224}$ | $R^{C1}$ | $R^{C1}$ | $R^{B25}$ | $R^{A52}$ |
| $L_{A4225}$ | $R^{C1}$ | $R^{C1}$ | $R^{B29}$ | $R^{A52}$ |
| $L_{A4226}$ | $R^{C1}$ | $R^{C1}$ | $R^{A37}$ | $R^{A52}$ |
| $L_{A4227}$ | $R^{C1}$ | $R^{C1}$ | $R^{A43}$ | $R^{A52}$ |
| $L_{A4228}$ | $R^{C1}$ | $R^{C1}$ | $R^{E1}$ | $R^{A52}$ |
| $L_{A4229}$ | $R^{C1}$ | $R^{C1}$ | $R^{E2}$ | $R^{A52}$ |
| $L_{A4230}$ | $R^{C1}$ | $R^{C1}$ | $R^{E3}$ | $R^{A52}$ |
| $L_{A4231}$ | $R^{C1}$ | $R^{C1}$ | $R^{E4}$ | $R^{A52}$ |
| $L_{A4232}$ | $R^{C1}$ | $R^{C1}$ | $R^{E5}$ | $R^{A52}$ |
| $L_{A4233}$ | $R^{C1}$ | $R^{C1}$ | $R^{E6}$ | $R^{A52}$ |
| $L_{A4234}$ | $R^{C1}$ | $R^{C1}$ | $R^{E7}$ | $R^{A52}$ |
| $L_{A4235}$ | $R^{C1}$ | $R^{C1}$ | $R^{E8}$ | $R^{A52}$ |
| $L_{A4236}$ | $R^{C1}$ | $R^{C1}$ | $R^{E9}$ | $R^{A52}$ |
| $L_{A4237}$ | $R^{C1}$ | $R^{C1}$ | $R^{E10}$ | $R^{A52}$ |
| $L_{A4238}$ | $R^{C1}$ | $R^{C1}$ | $R^{E11}$ | $R^{A52}$ |
| $L_{A4239}$ | $R^{C1}$ | $R^{C1}$ | $R^{E12}$ | $R^{A52}$ |
| $L_{A4240}$ | $R^{C1}$ | $R^{C1}$ | $R^{E13}$ | $R^{A52}$ |
| $L_{A4241}$ | $R^{C1}$ | $R^{C1}$ | $R^{E14}$ | $R^{A52}$ |
| $L_{A4242}$ | $R^{C1}$ | $R^{C1}$ | $R^{E15}$ | $R^{A52}$ |
| $L_{A4243}$ | $R^{C1}$ | $R^{C1}$ | $R^{E16}$ | $R^{A52}$ |
| $L_{A4244}$ | $R^{C1}$ | $R^{C1}$ | $R^{E17}$ | $R^{A52}$ |
| $L_{A4245}$ | $R^{C1}$ | $R^{C1}$ | $R^{E18}$ | $R^{A52}$ |
| $L_{A4246}$ | $R^{C1}$ | $R^{C1}$ | $R^{E19}$ | $R^{A52}$ |
| $L_{A4247}$ | $R^{C1}$ | $R^{C1}$ | $R^{E20}$ | $R^{A52}$ |
| $L_{A4248}$ | $R^{C1}$ | $R^{C1}$ | $R^{E21}$ | $R^{A52}$ |
| $L_{A4249}$ | $R^{B1}$ | $R^{C3}$ | $R^{B3}$ | H |
| $L_{A4250}$ | $R^{B1}$ | $R^{C3}$ | $R^{B6}$ | H |
| $L_{A4251}$ | $R^{B1}$ | $R^{C3}$ | $R^{B7}$ | H |
| $L_{A4252}$ | $R^{B1}$ | $R^{C3}$ | $R^{B12}$ | H |
| $L_{A4253}$ | $R^{B1}$ | $R^{C3}$ | $R^{B20}$ | H |
| $L_{A4254}$ | $R^{B1}$ | $R^{C3}$ | $R^{B25}$ | H |
| $L_{A4255}$ | $R^{B1}$ | $R^{C3}$ | $R^{B29}$ | H |
| $L_{A4256}$ | $R^{B1}$ | $R^{C3}$ | $R^{A37}$ | H |
| $L_{A4257}$ | $R^{B1}$ | $R^{C3}$ | $R^{A43}$ | H |
| $L_{A4258}$ | $R^{B1}$ | $R^{C3}$ | $R^{E1}$ | H |
| $L_{A4259}$ | $R^{B1}$ | $R^{C3}$ | $R^{E2}$ | H |
| $L_{A4260}$ | $R^{B1}$ | $R^{C3}$ | $R^{E3}$ | H |
| $L_{A4261}$ | $R^{B1}$ | $R^{C3}$ | $R^{E4}$ | H |
| $L_{A4262}$ | $R^{B1}$ | $R^{C3}$ | $R^{E5}$ | H |
| $L_{A4263}$ | $R^{B1}$ | $R^{C3}$ | $R^{E6}$ | H |
| $L_{A4264}$ | $R^{B1}$ | $R^{C3}$ | $R^{E7}$ | H |
| $L_{A4265}$ | $R^{B1}$ | $R^{C3}$ | $R^{E8}$ | H |
| $L_{A4266}$ | $R^{B1}$ | $R^{C3}$ | $R^{E9}$ | H |
| $L_{A4267}$ | $R^{B1}$ | $R^{C3}$ | $R^{E10}$ | H |
| $L_{A4268}$ | $R^{B1}$ | $R^{C3}$ | $R^{E11}$ | H |

-continued

| Ligand | $R^1$ | $R^2$ | $R^3$ | $R^4$ |
|---|---|---|---|---|
| $L_{A4269}$ | $R^{B1}$ | $R^{C3}$ | $R^{E12}$ | H |
| $L_{A4270}$ | $R^{B1}$ | $R^{C3}$ | $R^{E13}$ | H |
| $L_{A4271}$ | $R^{B1}$ | $R^{C3}$ | $R^{E14}$ | H |
| $L_{A4272}$ | $R^{B1}$ | $R^{C3}$ | $R^{E15}$ | H |
| $L_{A4273}$ | $R^{B1}$ | $R^{C3}$ | $R^{E16}$ | H |
| $L_{A4274}$ | $R^{B1}$ | $R^{C3}$ | $R^{E17}$ | H |
| $L_{A4275}$ | $R^{B1}$ | $R^{C3}$ | $R^{E18}$ | H |
| $L_{A4276}$ | $R^{B1}$ | $R^{C3}$ | $R^{E19}$ | H |
| $L_{A4277}$ | $R^{B1}$ | $R^{C3}$ | $R^{E20}$ | H |
| $L_{A4278}$ | $R^{B1}$ | $R^{C3}$ | $R^{E21}$ | H |
| $L_{A4279}$ | $R^{B1}$ | $R^{C3}$ | $R^{B3}$ | $R^{B3}$ |
| $L_{A4280}$ | $R^{B1}$ | $R^{C3}$ | $R^{B6}$ | $R^{B3}$ |
| $L_{A4281}$ | $R^{B1}$ | $R^{C3}$ | $R^{B7}$ | $R^{B3}$ |
| $L_{A4282}$ | $R^{B1}$ | $R^{C3}$ | $R^{B12}$ | $R^{B3}$ |
| $L_{A4283}$ | $R^{B1}$ | $R^{C3}$ | $R^{B20}$ | $R^{B3}$ |
| $L_{A4284}$ | $R^{B1}$ | $R^{C3}$ | $R^{B25}$ | $R^{B3}$ |
| $L_{A4285}$ | $R^{B1}$ | $R^{C3}$ | $R^{B29}$ | $R^{B3}$ |
| $L_{A4286}$ | $R^{B1}$ | $R^{C3}$ | $R^{A37}$ | $R^{B3}$ |
| $L_{A4287}$ | $R^{B1}$ | $R^{C3}$ | $R^{A43}$ | $R^{B3}$ |
| $L_{A4288}$ | $R^{B1}$ | $R^{C3}$ | $R^{E1}$ | $R^{B3}$ |
| $L_{A4289}$ | $R^{B1}$ | $R^{C3}$ | $R^{E2}$ | $R^{B3}$ |
| $L_{A4290}$ | $R^{B1}$ | $R^{C3}$ | $R^{E3}$ | $R^{B3}$ |
| $L_{A4291}$ | $R^{B1}$ | $R^{C3}$ | $R^{E4}$ | $R^{B3}$ |
| $L_{A4292}$ | $R^{B1}$ | $R^{C3}$ | $R^{E5}$ | $R^{B3}$ |
| $L_{A4293}$ | $R^{B1}$ | $R^{C3}$ | $R^{E6}$ | $R^{B3}$ |
| $L_{A4294}$ | $R^{B1}$ | $R^{C3}$ | $R^{E7}$ | $R^{B3}$ |
| $L_{A4295}$ | $R^{B1}$ | $R^{C3}$ | $R^{E8}$ | $R^{B3}$ |
| $L_{A4296}$ | $R^{B1}$ | $R^{C3}$ | $R^{E9}$ | $R^{B3}$ |
| $L_{A4297}$ | $R^{B1}$ | $R^{C3}$ | $R^{E10}$ | $R^{B3}$ |
| $L_{A4298}$ | $R^{B1}$ | $R^{C3}$ | $R^{E11}$ | $R^{B3}$ |
| $L_{A4299}$ | $R^{B1}$ | $R^{C3}$ | $R^{E12}$ | $R^{B3}$ |
| $L_{A4300}$ | $R^{B1}$ | $R^{C3}$ | $R^{E13}$ | $R^{B3}$ |
| $L_{A4301}$ | $R^{B1}$ | $R^{C3}$ | $R^{E14}$ | $R^{B3}$ |
| $L_{A4302}$ | $R^{B1}$ | $R^{C3}$ | $R^{E15}$ | $R^{B3}$ |
| $L_{A4303}$ | $R^{B1}$ | $R^{C3}$ | $R^{E16}$ | $R^{B3}$ |
| $L_{A4304}$ | $R^{B1}$ | $R^{C3}$ | $R^{E17}$ | $R^{B3}$ |
| $L_{A4305}$ | $R^{B1}$ | $R^{C3}$ | $R^{E18}$ | $R^{B3}$ |
| $L_{A4306}$ | $R^{B1}$ | $R^{C3}$ | $R^{E19}$ | $R^{B3}$ |
| $L_{A4307}$ | $R^{B1}$ | $R^{C3}$ | $R^{E20}$ | $R^{B3}$ |
| $L_{A4308}$ | $R^{B1}$ | $R^{C3}$ | $R^{E21}$ | $R^{B3}$ |
| $L_{A4309}$ | $R^{B1}$ | $R^{C3}$ | $R^{B3}$ | $R^{B4}$ |
| $L_{A4310}$ | $R^{B1}$ | $R^{C3}$ | $R^{B6}$ | $R^{B4}$ |
| $L_{A4311}$ | $R^{B1}$ | $R^{C3}$ | $R^{B7}$ | $R^{B4}$ |
| $L_{A4312}$ | $R^{B1}$ | $R^{C3}$ | $R^{B12}$ | $R^{B4}$ |
| $L_{A4313}$ | $R^{B1}$ | $R^{C3}$ | $R^{B20}$ | $R^{B4}$ |
| $L_{A4314}$ | $R^{B1}$ | $R^{C3}$ | $R^{B25}$ | $R^{B4}$ |
| $L_{A4315}$ | $R^{B1}$ | $R^{C3}$ | $R^{B29}$ | $R^{B4}$ |
| $L_{A4316}$ | $R^{B1}$ | $R^{C3}$ | $R^{A37}$ | $R^{B4}$ |
| $L_{A4317}$ | $R^{B1}$ | $R^{C3}$ | $R^{A43}$ | $R^{B4}$ |
| $L_{A4318}$ | $R^{B1}$ | $R^{C3}$ | $R^{E1}$ | $R^{B4}$ |
| $L_{A4319}$ | $R^{B1}$ | $R^{C3}$ | $R^{E2}$ | $R^{B4}$ |
| $L_{A4320}$ | $R^{B1}$ | $R^{C3}$ | $R^{E3}$ | $R^{B4}$ |
| $L_{A4321}$ | $R^{B1}$ | $R^{C3}$ | $R^{E4}$ | $R^{B4}$ |
| $L_{A4322}$ | $R^{B1}$ | $R^{C3}$ | $R^{E5}$ | $R^{B4}$ |
| $L_{A4323}$ | $R^{B1}$ | $R^{C3}$ | $R^{E6}$ | $R^{B4}$ |
| $L_{A4324}$ | $R^{B1}$ | $R^{C3}$ | $R^{E7}$ | $R^{B4}$ |
| $L_{A4325}$ | $R^{B1}$ | $R^{C3}$ | $R^{E8}$ | $R^{B4}$ |
| $L_{A4326}$ | $R^{B1}$ | $R^{C3}$ | $R^{E9}$ | $R^{B4}$ |
| $L_{A4327}$ | $R^{B1}$ | $R^{C3}$ | $R^{E10}$ | $R^{B4}$ |
| $L_{A4328}$ | $R^{B1}$ | $R^{C3}$ | $R^{E11}$ | $R^{B4}$ |
| $L_{A4329}$ | $R^{B1}$ | $R^{C3}$ | $R^{E12}$ | $R^{B4}$ |
| $L_{A4330}$ | $R^{B1}$ | $R^{C3}$ | $R^{E13}$ | $R^{B4}$ |
| $L_{A4331}$ | $R^{B1}$ | $R^{C3}$ | $R^{E14}$ | $R^{B4}$ |
| $L_{A4332}$ | $R^{B1}$ | $R^{C3}$ | $R^{E15}$ | $R^{B4}$ |
| $L_{A4333}$ | $R^{B1}$ | $R^{C3}$ | $R^{E16}$ | $R^{B4}$ |
| $L_{A4334}$ | $R^{B1}$ | $R^{C3}$ | $R^{E17}$ | $R^{B4}$ |
| $L_{A4335}$ | $R^{B1}$ | $R^{C3}$ | $R^{E18}$ | $R^{B4}$ |
| $L_{A4336}$ | $R^{B1}$ | $R^{C3}$ | $R^{E19}$ | $R^{B4}$ |
| $L_{A4337}$ | $R^{B1}$ | $R^{C3}$ | $R^{E20}$ | $R^{B4}$ |
| $L_{A4338}$ | $R^{B1}$ | $R^{C3}$ | $R^{E21}$ | $R^{B4}$ |
| $L_{A4339}$ | $R^{B1}$ | $R^{C3}$ | $R^{B3}$ | $R^{B18}$ |
| $L_{A4340}$ | $R^{B1}$ | $R^{C3}$ | $R^{B6}$ | $R^{B18}$ |
| $L_{A4341}$ | $R^{B1}$ | $R^{C3}$ | $R^{B7}$ | $R^{B18}$ |
| $L_{A4342}$ | $R^{B1}$ | $R^{C3}$ | $R^{B12}$ | $R^{B18}$ |
| $L_{A4343}$ | $R^{B1}$ | $R^{C3}$ | $R^{B20}$ | $R^{B18}$ |
| $L_{A4344}$ | $R^{B1}$ | $R^{C3}$ | $R^{B25}$ | $R^{B18}$ |
| $L_{A4345}$ | $R^{B1}$ | $R^{C3}$ | $R^{B29}$ | $R^{B18}$ |

-continued

| Ligand | $R^1$ | $R^2$ | $R^3$ | $R^4$ |
|---|---|---|---|---|
| $L_{44346}$ | $R^{B1}$ | $R^{C3}$ | $R^{A37}$ | $R^{B18}$ |
| $L_{44347}$ | $R^{B1}$ | $R^{C3}$ | $R^{A43}$ | $R^{B18}$ |
| $L_{44348}$ | $R^{B1}$ | $R^{C3}$ | $R^{E1}$ | $R^{B18}$ |
| $L_{44349}$ | $R^{B1}$ | $R^{C3}$ | $R^{E2}$ | $R^{B18}$ |
| $L_{44350}$ | $R^{B1}$ | $R^{C3}$ | $R^{E3}$ | $R^{B18}$ |
| $L_{44351}$ | $R^{B1}$ | $R^{C3}$ | $R^{E4}$ | $R^{B18}$ |
| $L_{44352}$ | $R^{B1}$ | $R^{C3}$ | $R^{E5}$ | $R^{B18}$ |
| $L_{44353}$ | $R^{B1}$ | $R^{C3}$ | $R^{E6}$ | $R^{B18}$ |
| $L_{44354}$ | $R^{B1}$ | $R^{C3}$ | $R^{E7}$ | $R^{B18}$ |
| $L_{44355}$ | $R^{B1}$ | $R^{C3}$ | $R^{E8}$ | $R^{B18}$ |
| $L_{44356}$ | $R^{B1}$ | $R^{C3}$ | $R^{E9}$ | $R^{B18}$ |
| $L_{44357}$ | $R^{B1}$ | $R^{C3}$ | $R^{E10}$ | $R^{B18}$ |
| $L_{44358}$ | $R^{B1}$ | $R^{C3}$ | $R^{E11}$ | $R^{B18}$ |
| $L_{44359}$ | $R^{B1}$ | $R^{C3}$ | $R^{E12}$ | $R^{B18}$ |
| $L_{44360}$ | $R^{B1}$ | $R^{C3}$ | $R^{E13}$ | $R^{B18}$ |
| $L_{44361}$ | $R^{B1}$ | $R^{C3}$ | $R^{E14}$ | $R^{B18}$ |
| $L_{44362}$ | $R^{B1}$ | $R^{C3}$ | $R^{E15}$ | $R^{B18}$ |
| $L_{44363}$ | $R^{B1}$ | $R^{C3}$ | $R^{E16}$ | $R^{B18}$ |
| $L_{44364}$ | $R^{B1}$ | $R^{C3}$ | $R^{E17}$ | $R^{B18}$ |
| $L_{44365}$ | $R^{B1}$ | $R^{C3}$ | $R^{E18}$ | $R^{B18}$ |
| $L_{44366}$ | $R^{B1}$ | $R^{C3}$ | $R^{E19}$ | $R^{B18}$ |
| $L_{44367}$ | $R^{B1}$ | $R^{C3}$ | $R^{E20}$ | $R^{B18}$ |
| $L_{44368}$ | $R^{B1}$ | $R^{C3}$ | $R^{E21}$ | $R^{B18}$ |
| $L_{44369}$ | $R^{B1}$ | $R^{C3}$ | $R^{B3}$ | $R^{A3}$ |
| $L_{44370}$ | $R^{B1}$ | $R^{C3}$ | $R^{B6}$ | $R^{A3}$ |
| $L_{44371}$ | $R^{B1}$ | $R^{C3}$ | $R^{B7}$ | $R^{A3}$ |
| $L_{44372}$ | $R^{B1}$ | $R^{C3}$ | $R^{B12}$ | $R^{A3}$ |
| $L_{44373}$ | $R^{B1}$ | $R^{C3}$ | $R^{B20}$ | $R^{A3}$ |
| $L_{44374}$ | $R^{B1}$ | $R^{C3}$ | $R^{B25}$ | $R^{A3}$ |
| $L_{44375}$ | $R^{B1}$ | $R^{C3}$ | $R^{B29}$ | $R^{A3}$ |
| $L_{44376}$ | $R^{B1}$ | $R^{C3}$ | $R^{A37}$ | $R^{A3}$ |
| $L_{44377}$ | $R^{B1}$ | $R^{C3}$ | $R^{A43}$ | $R^{A3}$ |
| $L_{44378}$ | $R^{B1}$ | $R^{C3}$ | $R^{E1}$ | $R^{A3}$ |
| $L_{44379}$ | $R^{B1}$ | $R^{C3}$ | $R^{E2}$ | $R^{A3}$ |
| $L_{44380}$ | $R^{B1}$ | $R^{C3}$ | $R^{E3}$ | $R^{A3}$ |
| $L_{44381}$ | $R^{B1}$ | $R^{C3}$ | $R^{E4}$ | $R^{A3}$ |
| $L_{44382}$ | $R^{B1}$ | $R^{C3}$ | $R^{E5}$ | $R^{A3}$ |
| $L_{44383}$ | $R^{B1}$ | $R^{C3}$ | $R^{E6}$ | $R^{A3}$ |
| $L_{44384}$ | $R^{B1}$ | $R^{C3}$ | $R^{E7}$ | $R^{A3}$ |
| $L_{44385}$ | $R^{B1}$ | $R^{C3}$ | $R^{E8}$ | $R^{A3}$ |
| $L_{44386}$ | $R^{B1}$ | $R^{C3}$ | $R^{E9}$ | $R^{A3}$ |
| $L_{44387}$ | $R^{B1}$ | $R^{C3}$ | $R^{E10}$ | $R^{A3}$ |
| $L_{44388}$ | $R^{B1}$ | $R^{C3}$ | $R^{E11}$ | $R^{A3}$ |
| $L_{44389}$ | $R^{B1}$ | $R^{C3}$ | $R^{E12}$ | $R^{A3}$ |
| $L_{44390}$ | $R^{B1}$ | $R^{C3}$ | $R^{E13}$ | $R^{A3}$ |
| $L_{44391}$ | $R^{B1}$ | $R^{C3}$ | $R^{E14}$ | $R^{A3}$ |
| $L_{44392}$ | $R^{B1}$ | $R^{C3}$ | $R^{E15}$ | $R^{A3}$ |
| $L_{44393}$ | $R^{B1}$ | $R^{C3}$ | $R^{E16}$ | $R^{A3}$ |
| $L_{44394}$ | $R^{B1}$ | $R^{C3}$ | $R^{E17}$ | $R^{A3}$ |
| $L_{44395}$ | $R^{B1}$ | $R^{C3}$ | $R^{E18}$ | $R^{A3}$ |
| $L_{44396}$ | $R^{B1}$ | $R^{C3}$ | $R^{E19}$ | $R^{A3}$ |
| $L_{44397}$ | $R^{B1}$ | $R^{C3}$ | $R^{E20}$ | $R^{A3}$ |
| $L_{44398}$ | $R^{B1}$ | $R^{C3}$ | $R^{E21}$ | $R^{A3}$ |
| $L_{44399}$ | $R^{B1}$ | $R^{C3}$ | $R^{B3}$ | $R^{A34}$ |
| $L_{44400}$ | $R^{B1}$ | $R^{C3}$ | $R^{B6}$ | $R^{A34}$ |
| $L_{44401}$ | $R^{B1}$ | $R^{C3}$ | $R^{B7}$ | $R^{A34}$ |
| $L_{44402}$ | $R^{B1}$ | $R^{C3}$ | $R^{B12}$ | $R^{A34}$ |
| $L_{44403}$ | $R^{B1}$ | $R^{C3}$ | $R^{B20}$ | $R^{A34}$ |
| $L_{44404}$ | $R^{B1}$ | $R^{C3}$ | $R^{B25}$ | $R^{A34}$ |
| $L_{44405}$ | $R^{B1}$ | $R^{C3}$ | $R^{B29}$ | $R^{A34}$ |
| $L_{44406}$ | $R^{B1}$ | $R^{C3}$ | $R^{A37}$ | $R^{A34}$ |
| $L_{44407}$ | $R^{B1}$ | $R^{C3}$ | $R^{A43}$ | $R^{A34}$ |
| $L_{44408}$ | $R^{B1}$ | $R^{C3}$ | $R^{E1}$ | $R^{A34}$ |
| $L_{44409}$ | $R^{B1}$ | $R^{C3}$ | $R^{E2}$ | $R^{A34}$ |
| $L_{44410}$ | $R^{B1}$ | $R^{C3}$ | $R^{E3}$ | $R^{A34}$ |
| $L_{44411}$ | $R^{B1}$ | $R^{C3}$ | $R^{E4}$ | $R^{A34}$ |
| $L_{44412}$ | $R^{B1}$ | $R^{C3}$ | $R^{E5}$ | $R^{A34}$ |
| $L_{44413}$ | $R^{B1}$ | $R^{C3}$ | $R^{E6}$ | $R^{A34}$ |
| $L_{44414}$ | $R^{B1}$ | $R^{C3}$ | $R^{E7}$ | $R^{A34}$ |
| $L_{44415}$ | $R^{B1}$ | $R^{C3}$ | $R^{E8}$ | $R^{A34}$ |
| $L_{44416}$ | $R^{B1}$ | $R^{C3}$ | $R^{E9}$ | $R^{A34}$ |
| $L_{44417}$ | $R^{B1}$ | $R^{C3}$ | $R^{E10}$ | $R^{A34}$ |
| $L_{44418}$ | $R^{B1}$ | $R^{C3}$ | $R^{E11}$ | $R^{A34}$ |
| $L_{44419}$ | $R^{B1}$ | $R^{C3}$ | $R^{E12}$ | $R^{A34}$ |
| $L_{44420}$ | $R^{B1}$ | $R^{C3}$ | $R^{E13}$ | $R^{A34}$ |
| $L_{44421}$ | $R^{B1}$ | $R^{C3}$ | $R^{E14}$ | $R^{A34}$ |
| $L_{44422}$ | $R^{B1}$ | $R^{C3}$ | $R^{E15}$ | $R^{A34}$ |

-continued

| Ligand | $R^1$ | $R^2$ | $R^3$ | $R^4$ |
|---|---|---|---|---|
| $L_{44423}$ | $R^{B1}$ | $R^{C3}$ | $R^{E16}$ | $R^{A34}$ |
| $L_{44424}$ | $R^{B1}$ | $R^{C3}$ | $R^{E17}$ | $R^{A34}$ |
| $L_{44425}$ | $R^{B1}$ | $R^{C3}$ | $R^{E18}$ | $R^{A34}$ |
| $L_{44426}$ | $R^{B1}$ | $R^{C3}$ | $R^{E19}$ | $R^{A34}$ |
| $L_{44427}$ | $R^{B1}$ | $R^{C3}$ | $R^{E20}$ | $R^{A34}$ |
| $L_{44428}$ | $R^{B1}$ | $R^{C3}$ | $R^{E21}$ | $R^{A34}$ |
| $L_{44429}$ | $R^{B1}$ | $R^{C3}$ | $R^{B3}$ | $R^{A52}$ |
| $L_{44430}$ | $R^{B1}$ | $R^{C3}$ | $R^{B6}$ | $R^{A52}$ |
| $L_{44431}$ | $R^{B1}$ | $R^{C3}$ | $R^{B7}$ | $R^{A52}$ |
| $L_{44432}$ | $R^{B1}$ | $R^{C3}$ | $R^{B12}$ | $R^{A52}$ |
| $L_{44433}$ | $R^{B1}$ | $R^{C3}$ | $R^{B20}$ | $R^{A52}$ |
| $L_{44434}$ | $R^{B1}$ | $R^{C3}$ | $R^{B25}$ | $R^{A52}$ |
| $L_{44435}$ | $R^{B1}$ | $R^{C3}$ | $R^{B29}$ | $R^{A52}$ |
| $L_{44436}$ | $R^{B1}$ | $R^{C3}$ | $R^{A37}$ | $R^{A52}$ |
| $L_{44437}$ | $R^{B1}$ | $R^{C3}$ | $R^{A43}$ | $R^{A52}$ |
| $L_{44438}$ | $R^{B1}$ | $R^{C3}$ | $R^{E1}$ | $R^{A52}$ |
| $L_{44439}$ | $R^{B1}$ | $R^{C3}$ | $R^{E2}$ | $R^{A52}$ |
| $L_{44440}$ | $R^{B1}$ | $R^{C3}$ | $R^{E3}$ | $R^{A52}$ |
| $L_{44441}$ | $R^{B1}$ | $R^{C3}$ | $R^{E4}$ | $R^{A52}$ |
| $L_{44442}$ | $R^{B1}$ | $R^{C3}$ | $R^{E5}$ | $R^{A52}$ |
| $L_{44443}$ | $R^{B1}$ | $R^{C3}$ | $R^{E6}$ | $R^{A52}$ |
| $L_{44444}$ | $R^{B1}$ | $R^{C3}$ | $R^{E7}$ | $R^{A52}$ |
| $L_{44445}$ | $R^{B1}$ | $R^{C3}$ | $R^{E8}$ | $R^{A52}$ |
| $L_{44446}$ | $R^{B1}$ | $R^{C3}$ | $R^{E9}$ | $R^{A52}$ |
| $L_{44447}$ | $R^{B1}$ | $R^{C3}$ | $R^{E10}$ | $R^{A52}$ |
| $L_{44448}$ | $R^{B1}$ | $R^{C3}$ | $R^{E11}$ | $R^{A52}$ |
| $L_{44449}$ | $R^{B1}$ | $R^{C3}$ | $R^{E12}$ | $R^{A52}$ |
| $L_{44450}$ | $R^{B1}$ | $R^{C3}$ | $R^{E13}$ | $R^{A52}$ |
| $L_{44451}$ | $R^{B1}$ | $R^{C3}$ | $R^{E14}$ | $R^{A52}$ |
| $L_{44452}$ | $R^{B1}$ | $R^{C3}$ | $R^{E15}$ | $R^{A52}$ |
| $L_{44453}$ | $R^{B1}$ | $R^{C3}$ | $R^{E16}$ | $R^{A52}$ |
| $L_{44454}$ | $R^{B1}$ | $R^{C3}$ | $R^{E17}$ | $R^{A52}$ |
| $L_{44455}$ | $R^{B1}$ | $R^{C3}$ | $R^{E18}$ | $R^{A52}$ |
| $L_{44456}$ | $R^{B1}$ | $R^{C3}$ | $R^{E19}$ | $R^{A52}$ |
| $L_{44457}$ | $R^{B1}$ | $R^{C3}$ | $R^{E20}$ | $R^{A52}$ |
| $L_{44458}$ | $R^{B1}$ | $R^{C3}$ | $R^{E21}$ | $R^{A52}$ |
| $L_{44459}$ | $R^{B1}$ | $R^{C17}$ | $R^{B3}$ | H |
| $L_{44460}$ | $R^{B1}$ | $R^{C17}$ | $R^{B6}$ | H |
| $L_{44461}$ | $R^{B1}$ | $R^{C17}$ | $R^{B7}$ | H |
| $L_{44462}$ | $R^{B1}$ | $R^{C17}$ | $R^{B12}$ | H |
| $L_{44463}$ | $R^{B1}$ | $R^{C17}$ | $R^{B20}$ | H |
| $L_{44464}$ | $R^{B1}$ | $R^{C17}$ | $R^{B25}$ | H |
| $L_{44465}$ | $R^{B1}$ | $R^{C17}$ | $R^{B29}$ | H |
| $L_{44466}$ | $R^{B1}$ | $R^{C17}$ | $R^{A37}$ | H |
| $L_{44467}$ | $R^{B1}$ | $R^{C17}$ | $R^{A43}$ | H |
| $L_{44468}$ | $R^{B1}$ | $R^{C17}$ | $R^{E1}$ | H |
| $L_{44469}$ | $R^{B1}$ | $R^{C17}$ | $R^{E2}$ | H |
| $L_{44470}$ | $R^{B1}$ | $R^{C17}$ | $R^{E3}$ | H |
| $L_{44471}$ | $R^{B1}$ | $R^{C17}$ | $R^{E4}$ | H |
| $L_{44472}$ | $R^{B1}$ | $R^{C17}$ | $R^{E5}$ | H |
| $L_{44473}$ | $R^{B1}$ | $R^{C17}$ | $R^{E6}$ | H |
| $L_{44474}$ | $R^{B1}$ | $R^{C17}$ | $R^{E7}$ | H |
| $L_{44475}$ | $R^{B1}$ | $R^{C17}$ | $R^{E8}$ | H |
| $L_{44476}$ | $R^{B1}$ | $R^{C17}$ | $R^{E9}$ | H |
| $L_{44477}$ | $R^{B1}$ | $R^{C17}$ | $R^{E10}$ | H |
| $L_{44478}$ | $R^{B1}$ | $R^{C17}$ | $R^{E11}$ | H |
| $L_{44479}$ | $R^{B1}$ | $R^{C17}$ | $R^{E12}$ | H |
| $L_{44480}$ | $R^{B1}$ | $R^{C17}$ | $R^{E13}$ | H |
| $L_{44481}$ | $R^{B1}$ | $R^{C17}$ | $R^{E14}$ | H |
| $L_{44482}$ | $R^{B1}$ | $R^{C17}$ | $R^{E15}$ | H |
| $L_{44483}$ | $R^{B1}$ | $R^{C17}$ | $R^{E16}$ | H |
| $L_{44484}$ | $R^{B1}$ | $R^{C17}$ | $R^{E17}$ | H |
| $L_{44485}$ | $R^{B1}$ | $R^{C17}$ | $R^{E18}$ | H |
| $L_{44486}$ | $R^{B1}$ | $R^{C17}$ | $R^{E19}$ | H |
| $L_{44487}$ | $R^{B1}$ | $R^{C17}$ | $R^{E20}$ | H |
| $L_{44488}$ | $R^{B1}$ | $R^{C17}$ | $R^{E21}$ | H |
| $L_{44489}$ | $R^{B1}$ | $R^{C17}$ | $R^{B3}$ | $R^{B3}$ |
| $L_{44490}$ | $R^{B1}$ | $R^{C17}$ | $R^{B6}$ | $R^{B3}$ |
| $L_{44491}$ | $R^{B1}$ | $R^{C17}$ | $R^{B7}$ | $R^{B3}$ |
| $L_{44492}$ | $R^{B1}$ | $R^{C17}$ | $R^{B12}$ | $R^{B3}$ |
| $L_{44493}$ | $R^{B1}$ | $R^{C17}$ | $R^{B20}$ | $R^{B3}$ |
| $L_{44494}$ | $R^{B1}$ | $R^{C17}$ | $R^{B25}$ | $R^{B3}$ |
| $L_{44495}$ | $R^{B1}$ | $R^{C17}$ | $R^{B29}$ | $R^{B3}$ |
| $L_{44496}$ | $R^{B1}$ | $R^{C17}$ | $R^{A37}$ | $R^{B3}$ |
| $L_{44497}$ | $R^{B1}$ | $R^{C17}$ | $R^{A43}$ | $R^{B3}$ |
| $L_{44498}$ | $R^{B1}$ | $R^{C17}$ | $R^{E1}$ | $R^{B3}$ |
| $L_{44499}$ | $R^{B1}$ | $R^{C17}$ | $R^{E2}$ | $R^{B3}$ |

-continued

| Ligand | $R^1$ | $R^2$ | $R^3$ | $R^4$ |
|---|---|---|---|---|
| $L_{A4500}$ | $R^{B1}$ | $R^{C17}$ | $R^{E3}$ | $R^{B3}$ |
| $L_{A4501}$ | $R^{B1}$ | $R^{C17}$ | $R^{E4}$ | $R^{B3}$ |
| $L_{A4502}$ | $R^{B1}$ | $R^{C17}$ | $R^{E5}$ | $R^{B3}$ |
| $L_{A4503}$ | $R^{B1}$ | $R^{C17}$ | $R^{E6}$ | $R^{B3}$ |
| $L_{A4504}$ | $R^{B1}$ | $R^{C17}$ | $R^{E7}$ | $R^{B3}$ |
| $L_{A4505}$ | $R^{B1}$ | $R^{C17}$ | $R^{E8}$ | $R^{B3}$ |
| $L_{A4506}$ | $R^{B1}$ | $R^{C17}$ | $R^{E9}$ | $R^{B3}$ |
| $L_{A4507}$ | $R^{B1}$ | $R^{C17}$ | $R^{E10}$ | $R^{B3}$ |
| $L_{A4508}$ | $R^{B1}$ | $R^{C17}$ | $R^{E11}$ | $R^{B3}$ |
| $L_{A4509}$ | $R^{B1}$ | $R^{C17}$ | $R^{E12}$ | $R^{B3}$ |
| $L_{A4510}$ | $R^{B1}$ | $R^{C17}$ | $R^{E13}$ | $R^{B3}$ |
| $L_{A4511}$ | $R^{B1}$ | $R^{C17}$ | $R^{E14}$ | $R^{B3}$ |
| $L_{A4512}$ | $R^{B1}$ | $R^{C17}$ | $R^{E15}$ | $R^{B3}$ |
| $L_{A4513}$ | $R^{B1}$ | $R^{C17}$ | $R^{E16}$ | $R^{B3}$ |
| $L_{A4514}$ | $R^{B1}$ | $R^{C17}$ | $R^{E17}$ | $R^{B3}$ |
| $L_{A4515}$ | $R^{B1}$ | $R^{C17}$ | $R^{E18}$ | $R^{B3}$ |
| $L_{A4516}$ | $R^{B1}$ | $R^{C17}$ | $R^{E19}$ | $R^{B3}$ |
| $L_{A4517}$ | $R^{B1}$ | $R^{C17}$ | $R^{E20}$ | $R^{B3}$ |
| $L_{A4518}$ | $R^{B1}$ | $R^{C17}$ | $R^{E21}$ | $R^{B3}$ |
| $L_{A4519}$ | $R^{B1}$ | $R^{C17}$ | $R^{B3}$ | $R^{B4}$ |
| $L_{A4520}$ | $R^{B1}$ | $R^{C17}$ | $R^{B6}$ | $R^{B4}$ |
| $L_{A4521}$ | $R^{B1}$ | $R^{C17}$ | $R^{B7}$ | $R^{B4}$ |
| $L_{A4522}$ | $R^{B1}$ | $R^{C17}$ | $R^{B12}$ | $R^{B4}$ |
| $L_{A4523}$ | $R^{B1}$ | $R^{C17}$ | $R^{B20}$ | $R^{B4}$ |
| $L_{A4524}$ | $R^{B1}$ | $R^{C17}$ | $R^{B25}$ | $R^{B4}$ |
| $L_{A4525}$ | $R^{B1}$ | $R^{C17}$ | $R^{B29}$ | $R^{B4}$ |
| $L_{A4526}$ | $R^{B1}$ | $R^{C17}$ | $R^{A37}$ | $R^{B4}$ |
| $L_{A4527}$ | $R^{B1}$ | $R^{C17}$ | $R^{A43}$ | $R^{B4}$ |
| $L_{A4528}$ | $R^{B1}$ | $R^{C17}$ | $R^{E1}$ | $R^{B4}$ |
| $L_{A4529}$ | $R^{B1}$ | $R^{C17}$ | $R^{E2}$ | $R^{B4}$ |
| $L_{A4530}$ | $R^{B1}$ | $R^{C17}$ | $R^{E3}$ | $R^{B4}$ |
| $L_{A4531}$ | $R^{B1}$ | $R^{C17}$ | $R^{E4}$ | $R^{B4}$ |
| $L_{A4532}$ | $R^{B1}$ | $R^{C17}$ | $R^{E5}$ | $R^{B4}$ |
| $L_{A4533}$ | $R^{B1}$ | $R^{C17}$ | $R^{E6}$ | $R^{B4}$ |
| $L_{A4534}$ | $R^{B1}$ | $R^{C17}$ | $R^{E7}$ | $R^{B4}$ |
| $L_{A4535}$ | $R^{B1}$ | $R^{C17}$ | $R^{E8}$ | $R^{B4}$ |
| $L_{A4536}$ | $R^{B1}$ | $R^{C17}$ | $R^{E9}$ | $R^{B4}$ |
| $L_{A4537}$ | $R^{B1}$ | $R^{C17}$ | $R^{E10}$ | $R^{B4}$ |
| $L_{A4538}$ | $R^{B1}$ | $R^{C17}$ | $R^{E11}$ | $R^{B4}$ |
| $L_{A4539}$ | $R^{B1}$ | $R^{C17}$ | $R^{E12}$ | $R^{B4}$ |
| $L_{A4540}$ | $R^{B1}$ | $R^{C17}$ | $R^{E13}$ | $R^{B4}$ |
| $L_{A4541}$ | $R^{B1}$ | $R^{C17}$ | $R^{E14}$ | $R^{B4}$ |
| $L_{A4542}$ | $R^{B1}$ | $R^{C17}$ | $R^{E15}$ | $R^{B4}$ |
| $L_{A4543}$ | $R^{B1}$ | $R^{C17}$ | $R^{E16}$ | $R^{B4}$ |
| $L_{A4544}$ | $R^{B1}$ | $R^{C17}$ | $R^{E17}$ | $R^{B4}$ |
| $L_{A4545}$ | $R^{B1}$ | $R^{C17}$ | $R^{E18}$ | $R^{B4}$ |
| $L_{A4546}$ | $R^{B1}$ | $R^{C17}$ | $R^{E19}$ | $R^{B4}$ |
| $L_{A4547}$ | $R^{B1}$ | $R^{C17}$ | $R^{E20}$ | $R^{B4}$ |
| $L_{A4548}$ | $R^{B1}$ | $R^{C17}$ | $R^{E21}$ | $R^{B4}$ |
| $L_{A4549}$ | $R^{B1}$ | $R^{C17}$ | $R^{B3}$ | $R^{B18}$ |
| $L_{A4550}$ | $R^{B1}$ | $R^{C17}$ | $R^{B6}$ | $R^{B18}$ |
| $L_{A4551}$ | $R^{B1}$ | $R^{C17}$ | $R^{B7}$ | $R^{B18}$ |
| $L_{A4552}$ | $R^{B1}$ | $R^{C17}$ | $R^{B12}$ | $R^{B18}$ |
| $L_{A4553}$ | $R^{B1}$ | $R^{C17}$ | $R^{B20}$ | $R^{B18}$ |
| $L_{A4554}$ | $R^{B1}$ | $R^{C17}$ | $R^{B25}$ | $R^{B18}$ |
| $L_{A4555}$ | $R^{B1}$ | $R^{C17}$ | $R^{B29}$ | $R^{B18}$ |
| $L_{A4556}$ | $R^{B1}$ | $R^{C17}$ | $R^{A37}$ | $R^{B18}$ |
| $L_{A4557}$ | $R^{B1}$ | $R^{C17}$ | $R^{A43}$ | $R^{B18}$ |
| $L_{A4558}$ | $R^{B1}$ | $R^{C17}$ | $R^{E1}$ | $R^{B18}$ |
| $L_{A4559}$ | $R^{B1}$ | $R^{C17}$ | $R^{E2}$ | $R^{B18}$ |
| $L_{A4560}$ | $R^{B1}$ | $R^{C17}$ | $R^{E3}$ | $R^{B18}$ |
| $L_{A4561}$ | $R^{B1}$ | $R^{C17}$ | $R^{E4}$ | $R^{B18}$ |
| $L_{A4562}$ | $R^{B1}$ | $R^{C17}$ | $R^{E5}$ | $R^{B18}$ |
| $L_{A4563}$ | $R^{B1}$ | $R^{C17}$ | $R^{E6}$ | $R^{B18}$ |
| $L_{A4564}$ | $R^{B1}$ | $R^{C17}$ | $R^{E7}$ | $R^{B18}$ |
| $L_{A4565}$ | $R^{B1}$ | $R^{C17}$ | $R^{E8}$ | $R^{B18}$ |
| $L_{A4566}$ | $R^{B1}$ | $R^{C17}$ | $R^{E9}$ | $R^{B18}$ |
| $L_{A4567}$ | $R^{B1}$ | $R^{C17}$ | $R^{E10}$ | $R^{B18}$ |
| $L_{A4568}$ | $R^{B1}$ | $R^{C17}$ | $R^{E11}$ | $R^{B18}$ |
| $L_{A4569}$ | $R^{B1}$ | $R^{C17}$ | $R^{E12}$ | $R^{B18}$ |
| $L_{A4570}$ | $R^{B1}$ | $R^{C17}$ | $R^{E13}$ | $R^{B18}$ |
| $L_{A4571}$ | $R^{B1}$ | $R^{C17}$ | $R^{E14}$ | $R^{B18}$ |
| $L_{A4572}$ | $R^{B1}$ | $R^{C17}$ | $R^{E15}$ | $R^{B18}$ |
| $L_{A4573}$ | $R^{B1}$ | $R^{C17}$ | $R^{E16}$ | $R^{B18}$ |
| $L_{A4574}$ | $R^{B1}$ | $R^{C17}$ | $R^{E17}$ | $R^{B18}$ |
| $L_{A4575}$ | $R^{B1}$ | $R^{C17}$ | $R^{E18}$ | $R^{B18}$ |
| $L_{A4576}$ | $R^{B1}$ | $R^{C17}$ | $R^{E19}$ | $R^{B18}$ |

-continued

| Ligand | $R^1$ | $R^2$ | $R^3$ | $R^4$ |
|---|---|---|---|---|
| $L_{A4577}$ | $R^{B1}$ | $R^{C17}$ | $R^{E20}$ | $R^{B18}$ |
| $L_{A4578}$ | $R^{B1}$ | $R^{C17}$ | $R^{E21}$ | $R^{B18}$ |
| $L_{A4579}$ | $R^{B1}$ | $R^{C17}$ | $R^{B3}$ | $R^{A3}$ |
| $L_{A4580}$ | $R^{B1}$ | $R^{C17}$ | $R^{B6}$ | $R^{A3}$ |
| $L_{A4581}$ | $R^{B1}$ | $R^{C17}$ | $R^{B7}$ | $R^{A3}$ |
| $L_{A4582}$ | $R^{B1}$ | $R^{C17}$ | $R^{B12}$ | $R^{A3}$ |
| $L_{A4583}$ | $R^{B1}$ | $R^{C17}$ | $R^{B20}$ | $R^{A3}$ |
| $L_{A4584}$ | $R^{B1}$ | $R^{C17}$ | $R^{B25}$ | $R^{A3}$ |
| $L_{A4585}$ | $R^{B1}$ | $R^{C17}$ | $R^{B29}$ | $R^{A3}$ |
| $L_{A4586}$ | $R^{B1}$ | $R^{C17}$ | $R^{A37}$ | $R^{A3}$ |
| $L_{A4587}$ | $R^{B1}$ | $R^{C17}$ | $R^{A43}$ | $R^{A3}$ |
| $L_{A4588}$ | $R^{B1}$ | $R^{C17}$ | $R^{E1}$ | $R^{A3}$ |
| $L_{A4589}$ | $R^{B1}$ | $R^{C17}$ | $R^{E2}$ | $R^{A3}$ |
| $L_{A4590}$ | $R^{B1}$ | $R^{C17}$ | $R^{E3}$ | $R^{A3}$ |
| $L_{A4591}$ | $R^{B1}$ | $R^{C17}$ | $R^{E4}$ | $R^{A3}$ |
| $L_{A4592}$ | $R^{B1}$ | $R^{C17}$ | $R^{E5}$ | $R^{A3}$ |
| $L_{A4593}$ | $R^{B1}$ | $R^{C17}$ | $R^{E6}$ | $R^{A3}$ |
| $L_{A4594}$ | $R^{B1}$ | $R^{C17}$ | $R^{E7}$ | $R^{A3}$ |
| $L_{A4595}$ | $R^{B1}$ | $R^{C17}$ | $R^{E8}$ | $R^{A3}$ |
| $L_{A4596}$ | $R^{B1}$ | $R^{C17}$ | $R^{E9}$ | $R^{A3}$ |
| $L_{A4597}$ | $R^{B1}$ | $R^{C17}$ | $R^{E10}$ | $R^{A3}$ |
| $L_{A4598}$ | $R^{B1}$ | $R^{C17}$ | $R^{E11}$ | $R^{A3}$ |
| $L_{A4599}$ | $R^{B1}$ | $R^{C17}$ | $R^{E12}$ | $R^{A3}$ |
| $L_{A4600}$ | $R^{B1}$ | $R^{C17}$ | $R^{E13}$ | $R^{A3}$ |
| $L_{A4601}$ | $R^{B1}$ | $R^{C17}$ | $R^{E14}$ | $R^{A3}$ |
| $L_{A4602}$ | $R^{B1}$ | $R^{C17}$ | $R^{E15}$ | $R^{A3}$ |
| $L_{A4603}$ | $R^{B1}$ | $R^{C17}$ | $R^{E16}$ | $R^{A3}$ |
| $L_{A4604}$ | $R^{B1}$ | $R^{C17}$ | $R^{E17}$ | $R^{A3}$ |
| $L_{A4605}$ | $R^{B1}$ | $R^{C17}$ | $R^{E18}$ | $R^{A3}$ |
| $L_{A4606}$ | $R^{B1}$ | $R^{C17}$ | $R^{E19}$ | $R^{A3}$ |
| $L_{A4607}$ | $R^{B1}$ | $R^{C17}$ | $R^{E20}$ | $R^{A3}$ |
| $L_{A4608}$ | $R^{B1}$ | $R^{C17}$ | $R^{E21}$ | $R^{A3}$ |
| $L_{A4609}$ | $R^{B1}$ | $R^{C17}$ | $R^{B3}$ | $R^{A34}$ |
| $L_{A4610}$ | $R^{B1}$ | $R^{C17}$ | $R^{B6}$ | $R^{A34}$ |
| $L_{A4611}$ | $R^{B1}$ | $R^{C17}$ | $R^{B7}$ | $R^{A34}$ |
| $L_{A4612}$ | $R^{B1}$ | $R^{C17}$ | $R^{B12}$ | $R^{A34}$ |
| $L_{A4613}$ | $R^{B1}$ | $R^{C17}$ | $R^{B20}$ | $R^{A34}$ |
| $L_{A4614}$ | $R^{B1}$ | $R^{C17}$ | $R^{B25}$ | $R^{A34}$ |
| $L_{A4615}$ | $R^{B1}$ | $R^{C17}$ | $R^{B29}$ | $R^{A34}$ |
| $L_{A4616}$ | $R^{B1}$ | $R^{C17}$ | $R^{A37}$ | $R^{A34}$ |
| $L_{A4617}$ | $R^{B1}$ | $R^{C17}$ | $R^{A43}$ | $R^{A34}$ |
| $L_{A4618}$ | $R^{B1}$ | $R^{C17}$ | $R^{E1}$ | $R^{A34}$ |
| $L_{A4619}$ | $R^{B1}$ | $R^{C17}$ | $R^{E2}$ | $R^{A34}$ |
| $L_{A4620}$ | $R^{B1}$ | $R^{C17}$ | $R^{E3}$ | $R^{A34}$ |
| $L_{A4621}$ | $R^{B1}$ | $R^{C17}$ | $R^{E4}$ | $R^{A34}$ |
| $L_{A4622}$ | $R^{B1}$ | $R^{C17}$ | $R^{E5}$ | $R^{A34}$ |
| $L_{A4623}$ | $R^{B1}$ | $R^{C17}$ | $R^{E6}$ | $R^{A34}$ |
| $L_{A4624}$ | $R^{B1}$ | $R^{C17}$ | $R^{E7}$ | $R^{A34}$ |
| $L_{A4625}$ | $R^{B1}$ | $R^{C17}$ | $R^{E8}$ | $R^{A34}$ |
| $L_{A4626}$ | $R^{B1}$ | $R^{C17}$ | $R^{E9}$ | $R^{A34}$ |
| $L_{A4627}$ | $R^{B1}$ | $R^{C17}$ | $R^{E10}$ | $R^{A34}$ |
| $L_{A4628}$ | $R^{B1}$ | $R^{C17}$ | $R^{E11}$ | $R^{A34}$ |
| $L_{A4629}$ | $R^{B1}$ | $R^{C17}$ | $R^{E12}$ | $R^{A34}$ |
| $L_{A4630}$ | $R^{B1}$ | $R^{C17}$ | $R^{E13}$ | $R^{A34}$ |
| $L_{A4631}$ | $R^{B1}$ | $R^{C17}$ | $R^{E14}$ | $R^{A34}$ |
| $L_{A4632}$ | $R^{B1}$ | $R^{C17}$ | $R^{E15}$ | $R^{A34}$ |
| $L_{A4633}$ | $R^{B1}$ | $R^{C17}$ | $R^{E16}$ | $R^{A34}$ |
| $L_{A4634}$ | $R^{B1}$ | $R^{C17}$ | $R^{E17}$ | $R^{A34}$ |
| $L_{A4635}$ | $R^{B1}$ | $R^{C17}$ | $R^{E18}$ | $R^{A34}$ |
| $L_{A4636}$ | $R^{B1}$ | $R^{C17}$ | $R^{E19}$ | $R^{A34}$ |
| $L_{A4637}$ | $R^{B1}$ | $R^{C17}$ | $R^{E20}$ | $R^{A34}$ |
| $L_{A4638}$ | $R^{B1}$ | $R^{C17}$ | $R^{E21}$ | $R^{A34}$ |
| $L_{A4639}$ | $R^{B1}$ | $R^{C17}$ | $R^{B3}$ | $R^{A52}$ |
| $L_{A4640}$ | $R^{B1}$ | $R^{C17}$ | $R^{B6}$ | $R^{A52}$ |
| $L_{A4641}$ | $R^{B1}$ | $R^{C17}$ | $R^{B7}$ | $R^{A52}$ |
| $L_{A4642}$ | $R^{B1}$ | $R^{C17}$ | $R^{B12}$ | $R^{A52}$ |
| $L_{A4643}$ | $R^{B1}$ | $R^{C17}$ | $R^{B20}$ | $R^{A52}$ |
| $L_{A4644}$ | $R^{B1}$ | $R^{C17}$ | $R^{B25}$ | $R^{A52}$ |
| $L_{A4645}$ | $R^{B1}$ | $R^{C17}$ | $R^{B29}$ | $R^{A52}$ |
| $L_{A4646}$ | $R^{B1}$ | $R^{C17}$ | $R^{A37}$ | $R^{A52}$ |
| $L_{A4647}$ | $R^{B1}$ | $R^{C17}$ | $R^{A43}$ | $R^{A52}$ |
| $L_{A4648}$ | $R^{B1}$ | $R^{C17}$ | $R^{E1}$ | $R^{A52}$ |
| $L_{A4649}$ | $R^{B1}$ | $R^{C17}$ | $R^{E2}$ | $R^{A52}$ |
| $L_{A4650}$ | $R^{B1}$ | $R^{C17}$ | $R^{E3}$ | $R^{A52}$ |
| $L_{A4651}$ | $R^{B1}$ | $R^{C17}$ | $R^{E4}$ | $R^{A52}$ |
| $L_{A4652}$ | $R^{B1}$ | $R^{C17}$ | $R^{E5}$ | $R^{A52}$ |
| $L_{A4653}$ | $R^{B1}$ | $R^{C17}$ | $R^{E6}$ | $R^{A52}$ |

-continued

| Ligand | $R^1$ | $R^2$ | $R^3$ | $R^4$ |
|---|---|---|---|---|
| $L_{A4654}$ | $R^{B1}$ | $R^{C17}$ | $R^{E7}$ | $R^{A52}$ |
| $L_{A4655}$ | $R^{B1}$ | $R^{C17}$ | $R^{E8}$ | $R^{A52}$ |
| $L_{A4656}$ | $R^{B1}$ | $R^{C17}$ | $R^{E9}$ | $R^{A52}$ |
| $L_{A4657}$ | $R^{B1}$ | $R^{C17}$ | $R^{E10}$ | $R^{A52}$ |
| $L_{A4658}$ | $R^{B1}$ | $R^{C17}$ | $R^{E11}$ | $R^{A52}$ |
| $L_{A4659}$ | $R^{B1}$ | $R^{C17}$ | $R^{E12}$ | $R^{A52}$ |
| $L_{A4660}$ | $R^{B1}$ | $R^{C17}$ | $R^{E13}$ | $R^{A52}$ |
| $L_{A4661}$ | $R^{B1}$ | $R^{C17}$ | $R^{E14}$ | $R^{A52}$ |
| $L_{A4662}$ | $R^{B1}$ | $R^{C17}$ | $R^{E15}$ | $R^{A52}$ |
| $L_{A4663}$ | $R^{B1}$ | $R^{C17}$ | $R^{E16}$ | $R^{A52}$ |
| $L_{A4664}$ | $R^{B1}$ | $R^{C17}$ | $R^{E17}$ | $R^{A52}$ |
| $L_{A4665}$ | $R^{B1}$ | $R^{C17}$ | $R^{E18}$ | $R^{A52}$ |
| $L_{A4666}$ | $R^{B1}$ | $R^{C17}$ | $R^{E19}$ | $R^{A52}$ |
| $L_{A4667}$ | $R^{B1}$ | $R^{C17}$ | $R^{E20}$ | $R^{A52}$ |
| $L_{A4668}$ | $R^{B1}$ | $R^{C17}$ | $R^{E21}$ | $R^{A52}$ |
| $L_{A4669}$ | $R^{B1}$ | $R^{C30}$ | $R^{B3}$ | H |
| $L_{A4670}$ | $R^{B1}$ | $R^{C30}$ | $R^{B6}$ | H |
| $L_{A4671}$ | $R^{B1}$ | $R^{C30}$ | $R^{B7}$ | H |
| $L_{A4672}$ | $R^{B1}$ | $R^{C30}$ | $R^{B12}$ | H |
| $L_{A4673}$ | $R^{B1}$ | $R^{C30}$ | $R^{B20}$ | H |
| $L_{A4674}$ | $R^{B1}$ | $R^{C30}$ | $R^{B25}$ | H |
| $L_{A4675}$ | $R^{B1}$ | $R^{C30}$ | $R^{B29}$ | H |
| $L_{A4676}$ | $R^{B1}$ | $R^{C30}$ | $R^{A37}$ | H |
| $L_{A4677}$ | $R^{B1}$ | $R^{C30}$ | $R^{A43}$ | H |
| $L_{A4678}$ | $R^{B1}$ | $R^{C30}$ | $R^{E1}$ | H |
| $L_{A4679}$ | $R^{B1}$ | $R^{C30}$ | $R^{E2}$ | H |
| $L_{A4680}$ | $R^{B1}$ | $R^{C30}$ | $R^{E3}$ | H |
| $L_{A4681}$ | $R^{B1}$ | $R^{C30}$ | $R^{E4}$ | H |
| $L_{A4682}$ | $R^{B1}$ | $R^{C30}$ | $R^{E5}$ | H |
| $L_{A4683}$ | $R^{B1}$ | $R^{C30}$ | $R^{E6}$ | H |
| $L_{A4684}$ | $R^{B1}$ | $R^{C30}$ | $R^{E7}$ | H |
| $L_{A4685}$ | $R^{B1}$ | $R^{C30}$ | $R^{E8}$ | H |
| $L_{A4686}$ | $R^{B1}$ | $R^{C30}$ | $R^{E9}$ | H |
| $L_{A4687}$ | $R^{B1}$ | $R^{C30}$ | $R^{E10}$ | H |
| $L_{A4688}$ | $R^{B1}$ | $R^{C30}$ | $R^{E11}$ | H |
| $L_{A4689}$ | $R^{B1}$ | $R^{C30}$ | $R^{E12}$ | H |
| $L_{A4690}$ | $R^{B1}$ | $R^{C30}$ | $R^{E13}$ | H |
| $L_{A4691}$ | $R^{B1}$ | $R^{C30}$ | $R^{E14}$ | H |
| $L_{A4692}$ | $R^{B1}$ | $R^{C30}$ | $R^{E15}$ | H |
| $L_{A4693}$ | $R^{B1}$ | $R^{C30}$ | $R^{E16}$ | H |
| $L_{A4694}$ | $R^{B1}$ | $R^{C30}$ | $R^{E17}$ | H |
| $L_{A4695}$ | $R^{B1}$ | $R^{C30}$ | $R^{E18}$ | H |
| $L_{A4696}$ | $R^{B1}$ | $R^{C30}$ | $R^{E19}$ | H |
| $L_{A4697}$ | $R^{B1}$ | $R^{C30}$ | $R^{E20}$ | H |
| $L_{A4698}$ | $R^{B1}$ | $R^{C30}$ | $R^{E21}$ | H |
| $L_{A4699}$ | $R^{B1}$ | $R^{C30}$ | $R^{B3}$ | $R^{B3}$ |
| $L_{A4700}$ | $R^{B1}$ | $R^{C30}$ | $R^{B6}$ | $R^{B3}$ |
| $L_{A4701}$ | $R^{B1}$ | $R^{C30}$ | $R^{B7}$ | $R^{B3}$ |
| $L_{A4702}$ | $R^{B1}$ | $R^{C30}$ | $R^{B12}$ | $R^{B3}$ |
| $L_{A4703}$ | $R^{B1}$ | $R^{C30}$ | $R^{B20}$ | $R^{B3}$ |
| $L_{A4704}$ | $R^{B1}$ | $R^{C30}$ | $R^{B25}$ | $R^{B3}$ |
| $L_{A4705}$ | $R^{B1}$ | $R^{C30}$ | $R^{B29}$ | $R^{B3}$ |
| $L_{A4706}$ | $R^{B1}$ | $R^{C30}$ | $R^{A37}$ | $R^{B3}$ |
| $L_{A4707}$ | $R^{B1}$ | $R^{C30}$ | $R^{A43}$ | $R^{B3}$ |
| $L_{A4708}$ | $R^{B1}$ | $R^{C30}$ | $R^{E1}$ | $R^{B3}$ |
| $L_{A4709}$ | $R^{B1}$ | $R^{C30}$ | $R^{E2}$ | $R^{B3}$ |
| $L_{A4710}$ | $R^{B1}$ | $R^{C30}$ | $R^{E3}$ | $R^{B3}$ |
| $L_{A4711}$ | $R^{B1}$ | $R^{C30}$ | $R^{E4}$ | $R^{B3}$ |
| $L_{A4712}$ | $R^{B1}$ | $R^{C30}$ | $R^{E5}$ | $R^{B3}$ |
| $L_{A4713}$ | $R^{B1}$ | $R^{C30}$ | $R^{E6}$ | $R^{B3}$ |
| $L_{A4714}$ | $R^{B1}$ | $R^{C30}$ | $R^{E7}$ | $R^{B3}$ |
| $L_{A4715}$ | $R^{B1}$ | $R^{C30}$ | $R^{E8}$ | $R^{B3}$ |
| $L_{A4716}$ | $R^{B1}$ | $R^{C30}$ | $R^{E9}$ | $R^{B3}$ |
| $L_{A4717}$ | $R^{B1}$ | $R^{C30}$ | $R^{E10}$ | $R^{B3}$ |
| $L_{A4718}$ | $R^{B1}$ | $R^{C30}$ | $R^{E11}$ | $R^{B3}$ |
| $L_{A4719}$ | $R^{B1}$ | $R^{C30}$ | $R^{E12}$ | $R^{B3}$ |
| $L_{A4720}$ | $R^{B1}$ | $R^{C30}$ | $R^{E13}$ | $R^{B3}$ |
| $L_{A4721}$ | $R^{B1}$ | $R^{C30}$ | $R^{E14}$ | $R^{B3}$ |
| $L_{A4722}$ | $R^{B1}$ | $R^{C30}$ | $R^{E15}$ | $R^{B3}$ |
| $L_{A4723}$ | $R^{B1}$ | $R^{C30}$ | $R^{E16}$ | $R^{B3}$ |
| $L_{A4724}$ | $R^{B1}$ | $R^{C30}$ | $R^{E17}$ | $R^{B3}$ |
| $L_{A4725}$ | $R^{B1}$ | $R^{C30}$ | $R^{E18}$ | $R^{B3}$ |
| $L_{A4726}$ | $R^{B1}$ | $R^{C30}$ | $R^{E19}$ | $R^{B3}$ |
| $L_{A4727}$ | $R^{B1}$ | $R^{C30}$ | $R^{E20}$ | $R^{B3}$ |
| $L_{A4728}$ | $R^{B1}$ | $R^{C30}$ | $R^{E21}$ | $R^{B3}$ |
| $L_{A4729}$ | $R^{B1}$ | $R^{C30}$ | $R^{B3}$ | $R^{B4}$ |
| $L_{A4730}$ | $R^{B1}$ | $R^{C30}$ | $R^{B6}$ | $R^{B4}$ |

-continued

| Ligand | $R^1$ | $R^2$ | $R^3$ | $R^4$ |
|---|---|---|---|---|
| $L_{A4731}$ | $R^{B1}$ | $R^{C30}$ | $R^{B7}$ | $R^{B4}$ |
| $L_{A4732}$ | $R^{B1}$ | $R^{C30}$ | $R^{B12}$ | $R^{B4}$ |
| $L_{A4733}$ | $R^{B1}$ | $R^{C30}$ | $R^{B20}$ | $R^{B4}$ |
| $L_{A4734}$ | $R^{B1}$ | $R^{C30}$ | $R^{B25}$ | $R^{B4}$ |
| $L_{A4735}$ | $R^{B1}$ | $R^{C30}$ | $R^{B29}$ | $R^{B4}$ |
| $L_{A4736}$ | $R^{B1}$ | $R^{C30}$ | $R^{A37}$ | $R^{B4}$ |
| $L_{A4737}$ | $R^{B1}$ | $R^{C30}$ | $R^{A43}$ | $R^{B4}$ |
| $L_{A4738}$ | $R^{B1}$ | $R^{C30}$ | $R^{E1}$ | $R^{B4}$ |
| $L_{A4739}$ | $R^{B1}$ | $R^{C30}$ | $R^{E2}$ | $R^{B4}$ |
| $L_{A4740}$ | $R^{B1}$ | $R^{C30}$ | $R^{E3}$ | $R^{B4}$ |
| $L_{A4741}$ | $R^{B1}$ | $R^{C30}$ | $R^{E4}$ | $R^{B4}$ |
| $L_{A4742}$ | $R^{B1}$ | $R^{C30}$ | $R^{E5}$ | $R^{B4}$ |
| $L_{A4743}$ | $R^{B1}$ | $R^{C30}$ | $R^{E6}$ | $R^{B4}$ |
| $L_{A4744}$ | $R^{B1}$ | $R^{C30}$ | $R^{E7}$ | $R^{B4}$ |
| $L_{A4745}$ | $R^{B1}$ | $R^{C30}$ | $R^{E8}$ | $R^{B4}$ |
| $L_{A4746}$ | $R^{B1}$ | $R^{C30}$ | $R^{E9}$ | $R^{B4}$ |
| $L_{A4747}$ | $R^{B1}$ | $R^{C30}$ | $R^{E10}$ | $R^{B4}$ |
| $L_{A4748}$ | $R^{B1}$ | $R^{C30}$ | $R^{E11}$ | $R^{B4}$ |
| $L_{A4749}$ | $R^{B1}$ | $R^{C30}$ | $R^{E12}$ | $R^{B4}$ |
| $L_{A4750}$ | $R^{B1}$ | $R^{C30}$ | $R^{E13}$ | $R^{B4}$ |
| $L_{A4751}$ | $R^{B1}$ | $R^{C30}$ | $R^{E14}$ | $R^{B4}$ |
| $L_{A4752}$ | $R^{B1}$ | $R^{C30}$ | $R^{E15}$ | $R^{B4}$ |
| $L_{A4753}$ | $R^{B1}$ | $R^{C30}$ | $R^{E16}$ | $R^{B4}$ |
| $L_{A4754}$ | $R^{B1}$ | $R^{C30}$ | $R^{E17}$ | $R^{B4}$ |
| $L_{A4755}$ | $R^{B1}$ | $R^{C30}$ | $R^{E18}$ | $R^{B4}$ |
| $L_{A4756}$ | $R^{B1}$ | $R^{C30}$ | $R^{E19}$ | $R^{B4}$ |
| $L_{A4757}$ | $R^{B1}$ | $R^{C30}$ | $R^{E20}$ | $R^{B4}$ |
| $L_{A4758}$ | $R^{B1}$ | $R^{C30}$ | $R^{E21}$ | $R^{B4}$ |
| $L_{A4759}$ | $R^{B1}$ | $R^{C30}$ | $R^{B3}$ | $R^{B18}$ |
| $L_{A4760}$ | $R^{B1}$ | $R^{C30}$ | $R^{B6}$ | $R^{B18}$ |
| $L_{A4761}$ | $R^{B1}$ | $R^{C30}$ | $R^{B7}$ | $R^{B18}$ |
| $L_{A4762}$ | $R^{B1}$ | $R^{C30}$ | $R^{B12}$ | $R^{B18}$ |
| $L_{A4763}$ | $R^{B1}$ | $R^{C30}$ | $R^{B20}$ | $R^{B18}$ |
| $L_{A4764}$ | $R^{B1}$ | $R^{C30}$ | $R^{B25}$ | $R^{B18}$ |
| $L_{A4765}$ | $R^{B1}$ | $R^{C30}$ | $R^{B29}$ | $R^{B18}$ |
| $L_{A4766}$ | $R^{B1}$ | $R^{C30}$ | $R^{A37}$ | $R^{B18}$ |
| $L_{A4767}$ | $R^{B1}$ | $R^{C30}$ | $R^{A43}$ | $R^{B18}$ |
| $L_{A4768}$ | $R^{B1}$ | $R^{C30}$ | $R^{E1}$ | $R^{B18}$ |
| $L_{A4769}$ | $R^{B1}$ | $R^{C30}$ | $R^{E2}$ | $R^{B18}$ |
| $L_{A4770}$ | $R^{B1}$ | $R^{C30}$ | $R^{E3}$ | $R^{B18}$ |
| $L_{A4771}$ | $R^{B1}$ | $R^{C30}$ | $R^{E4}$ | $R^{B18}$ |
| $L_{A4772}$ | $R^{B1}$ | $R^{C30}$ | $R^{E5}$ | $R^{B18}$ |
| $L_{A4773}$ | $R^{B1}$ | $R^{C30}$ | $R^{E6}$ | $R^{B18}$ |
| $L_{A4774}$ | $R^{B1}$ | $R^{C30}$ | $R^{E7}$ | $R^{B18}$ |
| $L_{A4775}$ | $R^{B1}$ | $R^{C30}$ | $R^{E8}$ | $R^{B18}$ |
| $L_{A4776}$ | $R^{B1}$ | $R^{C30}$ | $R^{E9}$ | $R^{B18}$ |
| $L_{A4777}$ | $R^{B1}$ | $R^{C30}$ | $R^{E10}$ | $R^{B18}$ |
| $L_{A4778}$ | $R^{B1}$ | $R^{C30}$ | $R^{E11}$ | $R^{B18}$ |
| $L_{A4779}$ | $R^{B1}$ | $R^{C30}$ | $R^{E12}$ | $R^{B18}$ |
| $L_{A4780}$ | $R^{B1}$ | $R^{C30}$ | $R^{E13}$ | $R^{B18}$ |
| $L_{A4781}$ | $R^{B1}$ | $R^{C30}$ | $R^{E14}$ | $R^{B18}$ |
| $L_{A4782}$ | $R^{B1}$ | $R^{C30}$ | $R^{E15}$ | $R^{B18}$ |
| $L_{A4783}$ | $R^{B1}$ | $R^{C30}$ | $R^{E16}$ | $R^{B18}$ |
| $L_{A4784}$ | $R^{B1}$ | $R^{C30}$ | $R^{E17}$ | $R^{B18}$ |
| $L_{A4785}$ | $R^{B1}$ | $R^{C30}$ | $R^{E18}$ | $R^{B18}$ |
| $L_{A4786}$ | $R^{B1}$ | $R^{C30}$ | $R^{E19}$ | $R^{B18}$ |
| $L_{A4787}$ | $R^{B1}$ | $R^{C30}$ | $R^{E20}$ | $R^{B18}$ |
| $L_{A4788}$ | $R^{B1}$ | $R^{C30}$ | $R^{E21}$ | $R^{B18}$ |
| $L_{A4789}$ | $R^{B1}$ | $R^{C30}$ | $R^{B3}$ | $R^{A3}$ |
| $L_{A4790}$ | $R^{B1}$ | $R^{C30}$ | $R^{B6}$ | $R^{A3}$ |
| $L_{A4791}$ | $R^{B1}$ | $R^{C30}$ | $R^{B7}$ | $R^{A3}$ |
| $L_{A4792}$ | $R^{B1}$ | $R^{C30}$ | $R^{B12}$ | $R^{A3}$ |
| $L_{A4793}$ | $R^{B1}$ | $R^{C30}$ | $R^{B20}$ | $R^{A3}$ |
| $L_{A4794}$ | $R^{B1}$ | $R^{C30}$ | $R^{B25}$ | $R^{A3}$ |
| $L_{A4795}$ | $R^{B1}$ | $R^{C30}$ | $R^{B29}$ | $R^{A3}$ |
| $L_{A4796}$ | $R^{B1}$ | $R^{C30}$ | $R^{A37}$ | $R^{A3}$ |
| $L_{A4797}$ | $R^{B1}$ | $R^{C30}$ | $R^{A43}$ | $R^{A3}$ |
| $L_{A4798}$ | $R^{B1}$ | $R^{C30}$ | $R^{E1}$ | $R^{A3}$ |
| $L_{A4799}$ | $R^{B1}$ | $R^{C30}$ | $R^{E2}$ | $R^{A3}$ |
| $L_{A4800}$ | $R^{B1}$ | $R^{C30}$ | $R^{E3}$ | $R^{A3}$ |
| $L_{A4801}$ | $R^{B1}$ | $R^{C30}$ | $R^{E4}$ | $R^{A3}$ |
| $L_{A4802}$ | $R^{B1}$ | $R^{C30}$ | $R^{E5}$ | $R^{A3}$ |
| $L_{A4803}$ | $R^{B1}$ | $R^{C30}$ | $R^{E6}$ | $R^{A3}$ |
| $L_{A4804}$ | $R^{B1}$ | $R^{C30}$ | $R^{E7}$ | $R^{A3}$ |
| $L_{A4805}$ | $R^{B1}$ | $R^{C30}$ | $R^{E8}$ | $R^{A3}$ |
| $L_{A4806}$ | $R^{B1}$ | $R^{C30}$ | $R^{E9}$ | $R^{A3}$ |
| $L_{A4807}$ | $R^{B1}$ | $R^{C30}$ | $R^{E10}$ | $R^{A3}$ |

-continued

| Ligand | $R^1$ | $R^2$ | $R^3$ | $R^4$ |
|---|---|---|---|---|
| $L_{A4808}$ | $R^{B1}$ | $R^{C30}$ | $R^{E11}$ | $R^{A3}$ |
| $L_{A4809}$ | $R^{B1}$ | $R^{C30}$ | $R^{E12}$ | $R^{A3}$ |
| $L_{A4810}$ | $R^{B1}$ | $R^{C30}$ | $R^{E13}$ | $R^{A3}$ |
| $L_{A4811}$ | $R^{B1}$ | $R^{C30}$ | $R^{E14}$ | $R^{A3}$ |
| $L_{A4812}$ | $R^{B1}$ | $R^{C30}$ | $R^{E15}$ | $R^{A3}$ |
| $L_{A4813}$ | $R^{B1}$ | $R^{C30}$ | $R^{E16}$ | $R^{A3}$ |
| $L_{A4814}$ | $R^{B1}$ | $R^{C30}$ | $R^{E17}$ | $R^{A3}$ |
| $L_{A4815}$ | $R^{B1}$ | $R^{C30}$ | $R^{E18}$ | $R^{A3}$ |
| $L_{A4816}$ | $R^{B1}$ | $R^{C30}$ | $R^{E19}$ | $R^{A3}$ |
| $L_{A4817}$ | $R^{B1}$ | $R^{C30}$ | $R^{E20}$ | $R^{A3}$ |
| $L_{A4818}$ | $R^{B1}$ | $R^{C30}$ | $R^{E21}$ | $R^{A3}$ |
| $L_{A4819}$ | $R^{B1}$ | $R^{C30}$ | $R^{B3}$ | $R^{A34}$ |
| $L_{A4820}$ | $R^{B1}$ | $R^{C30}$ | $R^{B6}$ | $R^{A34}$ |
| $L_{A4821}$ | $R^{B1}$ | $R^{C30}$ | $R^{B7}$ | $R^{A34}$ |
| $L_{A4822}$ | $R^{B1}$ | $R^{C30}$ | $R^{B12}$ | $R^{A34}$ |
| $L_{A4823}$ | $R^{B1}$ | $R^{C30}$ | $R^{B20}$ | $R^{A34}$ |
| $L_{A4824}$ | $R^{B1}$ | $R^{C30}$ | $R^{B25}$ | $R^{A34}$ |
| $L_{A4825}$ | $R^{B1}$ | $R^{C30}$ | $R^{B29}$ | $R^{A34}$ |
| $L_{A4826}$ | $R^{B1}$ | $R^{C30}$ | $R^{A37}$ | $R^{A34}$ |
| $L_{A4827}$ | $R^{B1}$ | $R^{C30}$ | $R^{A43}$ | $R^{A34}$ |
| $L_{A4828}$ | $R^{B1}$ | $R^{C30}$ | $R^{E1}$ | $R^{A34}$ |
| $L_{A4829}$ | $R^{B1}$ | $R^{C30}$ | $R^{E2}$ | $R^{A34}$ |
| $L_{A4830}$ | $R^{B1}$ | $R^{C30}$ | $R^{E3}$ | $R^{A34}$ |
| $L_{A4831}$ | $R^{B1}$ | $R^{C30}$ | $R^{E4}$ | $R^{A34}$ |
| $L_{A4832}$ | $R^{B1}$ | $R^{C30}$ | $R^{E5}$ | $R^{A34}$ |
| $L_{A4833}$ | $R^{B1}$ | $R^{C30}$ | $R^{E6}$ | $R^{A34}$ |
| $L_{A4834}$ | $R^{B1}$ | $R^{C30}$ | $R^{E7}$ | $R^{A34}$ |
| $L_{A4835}$ | $R^{B1}$ | $R^{C30}$ | $R^{E8}$ | $R^{A34}$ |
| $L_{A4836}$ | $R^{B1}$ | $R^{C30}$ | $R^{E9}$ | $R^{A34}$ |
| $L_{A4837}$ | $R^{B1}$ | $R^{C30}$ | $R^{E10}$ | $R^{A34}$ |
| $L_{A4838}$ | $R^{B1}$ | $R^{C30}$ | $R^{E11}$ | $R^{A34}$ |
| $L_{A4839}$ | $R^{B1}$ | $R^{C30}$ | $R^{E12}$ | $R^{A34}$ |
| $L_{A4840}$ | $R^{B1}$ | $R^{C30}$ | $R^{E13}$ | $R^{A34}$ |
| $L_{A4841}$ | $R^{B1}$ | $R^{C30}$ | $R^{E14}$ | $R^{A34}$ |
| $L_{A4842}$ | $R^{B1}$ | $R^{C30}$ | $R^{E15}$ | $R^{A34}$ |
| $L_{A4843}$ | $R^{B1}$ | $R^{C30}$ | $R^{E16}$ | $R^{A34}$ |
| $L_{A4844}$ | $R^{B1}$ | $R^{C30}$ | $R^{E17}$ | $R^{A34}$ |
| $L_{A4845}$ | $R^{B1}$ | $R^{C30}$ | $R^{E18}$ | $R^{A34}$ |
| $L_{A4846}$ | $R^{B1}$ | $R^{C30}$ | $R^{E19}$ | $R^{A34}$ |
| $L_{A4847}$ | $R^{B1}$ | $R^{C30}$ | $R^{E20}$ | $R^{A34}$ |
| $L_{A4848}$ | $R^{B1}$ | $R^{C30}$ | $R^{E21}$ | $R^{A34}$ |
| $L_{A4849}$ | $R^{B1}$ | $R^{C30}$ | $R^{B3}$ | $R^{A52}$ |
| $L_{A4850}$ | $R^{B1}$ | $R^{C30}$ | $R^{B6}$ | $R^{A52}$ |
| $L_{A4851}$ | $R^{B1}$ | $R^{C30}$ | $R^{B7}$ | $R^{A52}$ |
| $L_{A4852}$ | $R^{B1}$ | $R^{C30}$ | $R^{B12}$ | $R^{A52}$ |
| $L_{A4853}$ | $R^{B1}$ | $R^{C30}$ | $R^{B20}$ | $R^{A52}$ |
| $L_{A4854}$ | $R^{B1}$ | $R^{C30}$ | $R^{B25}$ | $R^{A52}$ |
| $L_{A4855}$ | $R^{B1}$ | $R^{C30}$ | $R^{B29}$ | $R^{A52}$ |
| $L_{A4856}$ | $R^{B1}$ | $R^{C30}$ | $R^{A37}$ | $R^{A52}$ |
| $L_{A4857}$ | $R^{B1}$ | $R^{C30}$ | $R^{A43}$ | $R^{A52}$ |
| $L_{A4858}$ | $R^{B1}$ | $R^{C30}$ | $R^{E1}$ | $R^{A52}$ |
| $L_{A4859}$ | $R^{B1}$ | $R^{C30}$ | $R^{E2}$ | $R^{A52}$ |
| $L_{A4860}$ | $R^{B1}$ | $R^{C30}$ | $R^{E3}$ | $R^{A52}$ |
| $L_{A4861}$ | $R^{B1}$ | $R^{C30}$ | $R^{E4}$ | $R^{A52}$ |
| $L_{A4862}$ | $R^{B1}$ | $R^{C30}$ | $R^{E5}$ | $R^{A52}$ |
| $L_{A4863}$ | $R^{B1}$ | $R^{C30}$ | $R^{E6}$ | $R^{A52}$ |
| $L_{A4864}$ | $R^{B1}$ | $R^{C30}$ | $R^{E7}$ | $R^{A52}$ |
| $L_{A4865}$ | $R^{B1}$ | $R^{C30}$ | $R^{E8}$ | $R^{A52}$ |
| $L_{A4866}$ | $R^{B1}$ | $R^{C30}$ | $R^{E9}$ | $R^{A52}$ |
| $L_{A4867}$ | $R^{B1}$ | $R^{C30}$ | $R^{E10}$ | $R^{A52}$ |
| $L_{A4868}$ | $R^{B1}$ | $R^{C30}$ | $R^{E11}$ | $R^{A52}$ |
| $L_{A4869}$ | $R^{B1}$ | $R^{C30}$ | $R^{E12}$ | $R^{A52}$ |
| $L_{A4870}$ | $R^{B1}$ | $R^{C30}$ | $R^{E13}$ | $R^{A52}$ |
| $L_{A4871}$ | $R^{B1}$ | $R^{C30}$ | $R^{E14}$ | $R^{A52}$ |
| $L_{A4872}$ | $R^{B1}$ | $R^{C30}$ | $R^{E15}$ | $R^{A52}$ |
| $L_{A4873}$ | $R^{B1}$ | $R^{C30}$ | $R^{E16}$ | $R^{A52}$ |
| $L_{A4874}$ | $R^{B1}$ | $R^{C30}$ | $R^{E17}$ | $R^{A52}$ |
| $L_{A4875}$ | $R^{B1}$ | $R^{C30}$ | $R^{E18}$ | $R^{A52}$ |
| $L_{A4876}$ | $R^{B1}$ | $R^{C30}$ | $R^{E19}$ | $R^{A52}$ |
| $L_{A4877}$ | $R^{B1}$ | $R^{C30}$ | $R^{E20}$ | $R^{A52}$ |
| $L_{A4878}$ | $R^{B1}$ | $R^{C30}$ | $R^{E21}$ | $R^{A52}$ |

$L_{A4879}$ through $L_{A6138}$ that are based on a structure of Formula XIII,

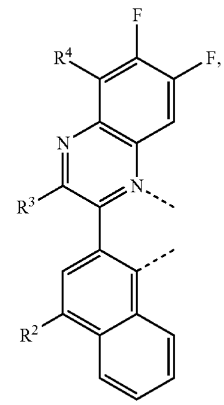

in which $R^2$, $R^3$, and $R^4$ are defined as:

| Ligand | $R^2$ | $R^3$ | $R^4$ |
|---|---|---|---|
| $L_{A4879}$ | $R^{C1}$ | $R^{B3}$ | H |
| $L_{A4880}$ | $R^{C1}$ | $R^{B6}$ | H |
| $L_{A4881}$ | $R^{C1}$ | $R^{B7}$ | H |
| $L_{A4882}$ | $R^{C1}$ | $R^{B12}$ | H |
| $L_{A4883}$ | $R^{C1}$ | $R^{B20}$ | H |
| $L_{A4884}$ | $R^{C1}$ | $R^{B25}$ | H |
| $L_{A4885}$ | $R^{C1}$ | $R^{B29}$ | H |
| $L_{A4886}$ | $R^{C1}$ | $R^{A37}$ | H |
| $L_{A4887}$ | $R^{C1}$ | $R^{A43}$ | H |
| $L_{A4888}$ | $R^{C1}$ | $R^{E1}$ | H |
| $L_{A4889}$ | $R^{C1}$ | $R^{E2}$ | H |
| $L_{A4890}$ | $R^{C1}$ | $R^{E3}$ | H |
| $L_{A4891}$ | $R^{C1}$ | $R^{E4}$ | H |
| $L_{A4892}$ | $R^{C1}$ | $R^{E5}$ | H |
| $L_{A4893}$ | $R^{C1}$ | $R^{E6}$ | H |
| $L_{A4894}$ | $R^{C1}$ | $R^{E7}$ | H |
| $L_{A4895}$ | $R^{C1}$ | $R^{E8}$ | H |
| $L_{A4896}$ | $R^{C1}$ | $R^{E9}$ | H |
| $L_{A4897}$ | $R^{C1}$ | $R^{E10}$ | H |
| $L_{A4898}$ | $R^{C1}$ | $R^{E11}$ | H |
| $L_{A4899}$ | $R^{C1}$ | $R^{E12}$ | H |
| $L_{A4900}$ | $R^{C1}$ | $R^{E13}$ | H |
| $L_{A4901}$ | $R^{C1}$ | $R^{E14}$ | H |
| $L_{A4902}$ | $R^{C1}$ | $R^{E15}$ | H |
| $L_{A4903}$ | $R^{C1}$ | $R^{E16}$ | H |
| $L_{A4904}$ | $R^{C1}$ | $R^{E17}$ | H |
| $L_{A4905}$ | $R^{C1}$ | $R^{E18}$ | H |
| $L_{A4906}$ | $R^{C1}$ | $R^{E19}$ | H |
| $L_{A4907}$ | $R^{C1}$ | $R^{E20}$ | H |
| $L_{A4908}$ | $R^{C1}$ | $R^{E21}$ | H |
| $L_{A4909}$ | $R^{C1}$ | $R^{B3}$ | $R^{B3}$ |
| $L_{A4910}$ | $R^{C1}$ | $R^{B6}$ | $R^{B3}$ |
| $L_{A4911}$ | $R^{C1}$ | $R^{B7}$ | $R^{B3}$ |
| $L_{A4912}$ | $R^{C1}$ | $R^{B12}$ | $R^{B3}$ |
| $L_{A4913}$ | $R^{C1}$ | $R^{B20}$ | $R^{B3}$ |
| $L_{A4914}$ | $R^{C1}$ | $R^{B25}$ | $R^{B3}$ |
| $L_{A4915}$ | $R^{C1}$ | $R^{B29}$ | $R^{B3}$ |
| $L_{A4916}$ | $R^{C1}$ | $R^{A37}$ | $R^{B3}$ |
| $L_{A4917}$ | $R^{C1}$ | $R^{A43}$ | $R^{B3}$ |
| $L_{A4918}$ | $R^{C1}$ | $R^{E1}$ | $R^{B3}$ |
| $L_{A4919}$ | $R^{C1}$ | $R^{E2}$ | $R^{B3}$ |
| $L_{A4920}$ | $R^{C1}$ | $R^{E3}$ | $R^{B3}$ |
| $L_{A4921}$ | $R^{C1}$ | $R^{E4}$ | $R^{B3}$ |
| $L_{A4922}$ | $R^{C1}$ | $R^{E5}$ | $R^{B3}$ |
| $L_{A4923}$ | $R^{C1}$ | $R^{E6}$ | $R^{B3}$ |
| $L_{A4924}$ | $R^{C1}$ | $R^{E7}$ | $R^{B3}$ |
| $L_{A4925}$ | $R^{C1}$ | $R^{E8}$ | $R^{B3}$ |
| $L_{A4926}$ | $R^{C1}$ | $R^{E9}$ | $R^{B3}$ |
| $L_{A4927}$ | $R^{C1}$ | $R^{E10}$ | $R^{B3}$ |
| $L_{A4928}$ | $R^{C1}$ | $R^{E11}$ | $R^{B3}$ |
| $L_{A4929}$ | $R^{C1}$ | $R^{E12}$ | $R^{B3}$ |
| $L_{A4930}$ | $R^{C1}$ | $R^{E13}$ | $R^{B3}$ |
| $L_{A4931}$ | $R^{C1}$ | $R^{E14}$ | $R^{B3}$ |
| $L_{A4932}$ | $R^{C1}$ | $R^{E15}$ | $R^{B3}$ |

-continued

| Ligand | $R^2$ | $R^3$ | $R^4$ |
|---|---|---|---|
| $L_{A4933}$ | $R^{C1}$ | $R^{E16}$ | $R^{B3}$ |
| $L_{A4934}$ | $R^{C1}$ | $R^{E17}$ | $R^{B3}$ |
| $L_{A4935}$ | $R^{C1}$ | $R^{E18}$ | $R^{B3}$ |
| $L_{A4936}$ | $R^{C1}$ | $R^{E19}$ | $R^{B3}$ |
| $L_{A4937}$ | $R^{C1}$ | $R^{E20}$ | $R^{B3}$ |
| $L_{A4938}$ | $R^{C1}$ | $R^{E21}$ | $R^{B3}$ |
| $L_{A4939}$ | $R^{C1}$ | $R^{B3}$ | $R^{B4}$ |
| $L_{A4940}$ | $R^{C1}$ | $R^{B6}$ | $R^{B4}$ |
| $L_{A4941}$ | $R^{C1}$ | $R^{B7}$ | $R^{B4}$ |
| $L_{A4942}$ | $R^{C1}$ | $R^{B12}$ | $R^{B4}$ |
| $L_{A4943}$ | $R^{C1}$ | $R^{B20}$ | $R^{B4}$ |
| $L_{A4944}$ | $R^{C1}$ | $R^{B25}$ | $R^{B4}$ |
| $L_{A4945}$ | $R^{C1}$ | $R^{B29}$ | $R^{B4}$ |
| $L_{A4946}$ | $R^{C1}$ | $R^{A37}$ | $R^{B4}$ |
| $L_{A4947}$ | $R^{C1}$ | $R^{A43}$ | $R^{B4}$ |
| $L_{A4948}$ | $R^{C1}$ | $R^{E1}$ | $R^{B4}$ |
| $L_{A4949}$ | $R^{C1}$ | $R^{E2}$ | $R^{B4}$ |
| $L_{A4950}$ | $R^{C1}$ | $R^{E3}$ | $R^{B4}$ |
| $L_{A4951}$ | $R^{C1}$ | $R^{E4}$ | $R^{B4}$ |
| $L_{A4952}$ | $R^{C1}$ | $R^{E5}$ | $R^{B4}$ |
| $L_{A4953}$ | $R^{C1}$ | $R^{E6}$ | $R^{B4}$ |
| $L_{A4954}$ | $R^{C1}$ | $R^{E7}$ | $R^{B4}$ |
| $L_{A4955}$ | $R^{C1}$ | $R^{E8}$ | $R^{B4}$ |
| $L_{A4956}$ | $R^{C1}$ | $R^{E9}$ | $R^{B4}$ |
| $L_{A4957}$ | $R^{C1}$ | $R^{E10}$ | $R^{B4}$ |
| $L_{A4958}$ | $R^{C1}$ | $R^{E11}$ | $R^{B4}$ |
| $L_{A4959}$ | $R^{C1}$ | $R^{E12}$ | $R^{B4}$ |
| $L_{A4960}$ | $R^{C1}$ | $R^{E13}$ | $R^{B4}$ |
| $L_{A4961}$ | $R^{C1}$ | $R^{E14}$ | $R^{B4}$ |
| $L_{A4962}$ | $R^{C1}$ | $R^{E15}$ | $R^{B4}$ |
| $L_{A4963}$ | $R^{C1}$ | $R^{E16}$ | $R^{B4}$ |
| $L_{A4964}$ | $R^{C1}$ | $R^{E17}$ | $R^{B4}$ |
| $L_{A4965}$ | $R^{C1}$ | $R^{E18}$ | $R^{B4}$ |
| $L_{A4966}$ | $R^{C1}$ | $R^{E19}$ | $R^{B4}$ |
| $L_{A4967}$ | $R^{C1}$ | $R^{E20}$ | $R^{B4}$ |
| $L_{A4968}$ | $R^{C1}$ | $R^{E21}$ | $R^{B4}$ |
| $L_{A4969}$ | $R^{C1}$ | $R^{B3}$ | $R^{B18}$ |
| $L_{A4970}$ | $R^{C1}$ | $R^{B6}$ | $R^{B18}$ |
| $L_{A4971}$ | $R^{C1}$ | $R^{B7}$ | $R^{B18}$ |
| $L_{A4972}$ | $R^{C1}$ | $R^{B12}$ | $R^{B18}$ |
| $L_{A4973}$ | $R^{C1}$ | $R^{B20}$ | $R^{B18}$ |
| $L_{A4974}$ | $R^{C1}$ | $R^{B25}$ | $R^{B18}$ |
| $L_{A4975}$ | $R^{C1}$ | $R^{B29}$ | $R^{B18}$ |
| $L_{A4976}$ | $R^{C1}$ | $R^{A37}$ | $R^{B18}$ |
| $L_{A4977}$ | $R^{C1}$ | $R^{A43}$ | $R^{B18}$ |
| $L_{A4978}$ | $R^{C1}$ | $R^{E1}$ | $R^{B18}$ |
| $L_{A4979}$ | $R^{C1}$ | $R^{E2}$ | $R^{B18}$ |
| $L_{A4980}$ | $R^{C1}$ | $R^{E3}$ | $R^{B18}$ |
| $L_{A4981}$ | $R^{C1}$ | $R^{E4}$ | $R^{B18}$ |
| $L_{A4982}$ | $R^{C1}$ | $R^{E5}$ | $R^{B18}$ |
| $L_{A4983}$ | $R^{C1}$ | $R^{E6}$ | $R^{B18}$ |
| $L_{A4984}$ | $R^{C1}$ | $R^{E7}$ | $R^{B18}$ |
| $L_{A4985}$ | $R^{C1}$ | $R^{E8}$ | $R^{B18}$ |
| $L_{A4986}$ | $R^{C1}$ | $R^{E9}$ | $R^{B18}$ |
| $L_{A4987}$ | $R^{C1}$ | $R^{E10}$ | $R^{B18}$ |
| $L_{A4988}$ | $R^{C1}$ | $R^{E11}$ | $R^{B18}$ |
| $L_{A4989}$ | $R^{C1}$ | $R^{E12}$ | $R^{B18}$ |
| $L_{A4990}$ | $R^{C1}$ | $R^{E13}$ | $R^{B18}$ |
| $L_{A4991}$ | $R^{C1}$ | $R^{E14}$ | $R^{B18}$ |
| $L_{A4992}$ | $R^{C1}$ | $R^{E15}$ | $R^{B18}$ |
| $L_{A4993}$ | $R^{C1}$ | $R^{E16}$ | $R^{B18}$ |
| $L_{A4994}$ | $R^{C1}$ | $R^{E17}$ | $R^{B18}$ |
| $L_{A4995}$ | $R^{C1}$ | $R^{E18}$ | $R^{B18}$ |
| $L_{A4996}$ | $R^{C1}$ | $R^{E19}$ | $R^{B18}$ |
| $L_{A4997}$ | $R^{C1}$ | $R^{E20}$ | $R^{B18}$ |
| $L_{A4998}$ | $R^{C1}$ | $R^{E21}$ | $R^{B18}$ |
| $L_{A4999}$ | $R^{C1}$ | $R^{B3}$ | $R^{A3}$ |
| $L_{A5000}$ | $R^{C1}$ | $R^{B6}$ | $R^{A3}$ |
| $L_{A5001}$ | $R^{C1}$ | $R^{B7}$ | $R^{A3}$ |
| $L_{A5002}$ | $R^{C1}$ | $R^{B12}$ | $R^{A3}$ |
| $L_{A5003}$ | $R^{C1}$ | $R^{B20}$ | $R^{A3}$ |
| $L_{A5004}$ | $R^{C1}$ | $R^{B25}$ | $R^{A3}$ |
| $L_{A5005}$ | $R^{C1}$ | $R^{B29}$ | $R^{A3}$ |
| $L_{A5006}$ | $R^{C1}$ | $R^{A37}$ | $R^{A3}$ |
| $L_{A5007}$ | $R^{C1}$ | $R^{A43}$ | $R^{A3}$ |
| $L_{A5008}$ | $R^{C1}$ | $R^{E1}$ | $R^{A3}$ |
| $L_{A5009}$ | $R^{C1}$ | $R^{E2}$ | $R^{A3}$ |

-continued

| Ligand | $R^2$ | $R^3$ | $R^4$ |
|---|---|---|---|
| $L_{A5010}$ | $R^{C1}$ | $R^{E3}$ | $R^{A3}$ |
| $L_{A5011}$ | $R^{C1}$ | $R^{E4}$ | $R^{A3}$ |
| $L_{A5012}$ | $R^{C1}$ | $R^{E5}$ | $R^{A3}$ |
| $L_{A5013}$ | $R^{C1}$ | $R^{E6}$ | $R^{A3}$ |
| $L_{A5014}$ | $R^{C1}$ | $R^{E7}$ | $R^{A3}$ |
| $L_{A5015}$ | $R^{C1}$ | $R^{E8}$ | $R^{A3}$ |
| $L_{A5016}$ | $R^{C1}$ | $R^{E9}$ | $R^{A3}$ |
| $L_{A5017}$ | $R^{C1}$ | $R^{E10}$ | $R^{A3}$ |
| $L_{A5018}$ | $R^{C1}$ | $R^{E11}$ | $R^{A3}$ |
| $L_{A5019}$ | $R^{C1}$ | $R^{E12}$ | $R^{A3}$ |
| $L_{A5020}$ | $R^{C1}$ | $R^{E13}$ | $R^{A3}$ |
| $L_{A5021}$ | $R^{C1}$ | $R^{E14}$ | $R^{A3}$ |
| $L_{A5022}$ | $R^{C1}$ | $R^{E15}$ | $R^{A3}$ |
| $L_{A5023}$ | $R^{C1}$ | $R^{E16}$ | $R^{A3}$ |
| $L_{A5024}$ | $R^{C1}$ | $R^{E17}$ | $R^{A3}$ |
| $L_{A5025}$ | $R^{C1}$ | $R^{E18}$ | $R^{A3}$ |
| $L_{A5026}$ | $R^{C1}$ | $R^{E19}$ | $R^{A3}$ |
| $L_{A5027}$ | $R^{C1}$ | $R^{E20}$ | $R^{A3}$ |
| $L_{A5028}$ | $R^{C1}$ | $R^{E21}$ | $R^{A3}$ |
| $L_{A5029}$ | $R^{C1}$ | $R^{B3}$ | $R^{A34}$ |
| $L_{A5030}$ | $R^{C1}$ | $R^{B6}$ | $R^{A34}$ |
| $L_{A5031}$ | $R^{C1}$ | $R^{B7}$ | $R^{A34}$ |
| $L_{A5032}$ | $R^{C1}$ | $R^{B12}$ | $R^{A34}$ |
| $L_{A5033}$ | $R^{C1}$ | $R^{B20}$ | $R^{A34}$ |
| $L_{A5034}$ | $R^{C1}$ | $R^{B25}$ | $R^{A34}$ |
| $L_{A5035}$ | $R^{C1}$ | $R^{B29}$ | $R^{A34}$ |
| $L_{A5036}$ | $R^{C1}$ | $R^{A37}$ | $R^{A34}$ |
| $L_{A5037}$ | $R^{C1}$ | $R^{A43}$ | $R^{A34}$ |
| $L_{A5038}$ | $R^{C1}$ | $R^{E1}$ | $R^{A34}$ |
| $L_{A5039}$ | $R^{C1}$ | $R^{E2}$ | $R^{A34}$ |
| $L_{A5040}$ | $R^{C1}$ | $R^{E3}$ | $R^{A34}$ |
| $L_{A5041}$ | $R^{C1}$ | $R^{E4}$ | $R^{A34}$ |
| $L_{A5042}$ | $R^{C1}$ | $R^{E5}$ | $R^{A34}$ |
| $L_{A5043}$ | $R^{C1}$ | $R^{E6}$ | $R^{A34}$ |
| $L_{A5044}$ | $R^{C1}$ | $R^{E7}$ | $R^{A34}$ |
| $L_{A5045}$ | $R^{C1}$ | $R^{E8}$ | $R^{A34}$ |
| $L_{A5046}$ | $R^{C1}$ | $R^{E9}$ | $R^{A34}$ |
| $L_{A5047}$ | $R^{C1}$ | $R^{E10}$ | $R^{A34}$ |
| $L_{A5048}$ | $R^{C1}$ | $R^{E11}$ | $R^{A34}$ |
| $L_{A5049}$ | $R^{C1}$ | $R^{E12}$ | $R^{A34}$ |
| $L_{A5050}$ | $R^{C1}$ | $R^{E13}$ | $R^{A34}$ |
| $L_{A5051}$ | $R^{C1}$ | $R^{E14}$ | $R^{A34}$ |
| $L_{A5052}$ | $R^{C1}$ | $R^{E15}$ | $R^{A34}$ |
| $L_{A5053}$ | $R^{C1}$ | $R^{E16}$ | $R^{A34}$ |
| $L_{A5054}$ | $R^{C1}$ | $R^{E17}$ | $R^{A34}$ |
| $L_{A5055}$ | $R^{C1}$ | $R^{E18}$ | $R^{A34}$ |
| $L_{A5056}$ | $R^{C1}$ | $R^{E19}$ | $R^{A34}$ |
| $L_{A5057}$ | $R^{C1}$ | $R^{E20}$ | $R^{A34}$ |
| $L_{A5058}$ | $R^{C1}$ | $R^{E21}$ | $R^{A34}$ |
| $L_{A5059}$ | $R^{C1}$ | $R^{B3}$ | $R^{A52}$ |
| $L_{A5060}$ | $R^{C1}$ | $R^{B6}$ | $R^{A52}$ |
| $L_{A5061}$ | $R^{C1}$ | $R^{B7}$ | $R^{A52}$ |
| $L_{A5062}$ | $R^{C1}$ | $R^{B12}$ | $R^{A52}$ |
| $L_{A5063}$ | $R^{C1}$ | $R^{B20}$ | $R^{A52}$ |
| $L_{A5064}$ | $R^{C1}$ | $R^{B25}$ | $R^{A52}$ |
| $L_{A5065}$ | $R^{C1}$ | $R^{B29}$ | $R^{A52}$ |
| $L_{A5066}$ | $R^{C1}$ | $R^{A37}$ | $R^{A52}$ |
| $L_{A5067}$ | $R^{C1}$ | $R^{A43}$ | $R^{A52}$ |
| $L_{A5068}$ | $R^{C1}$ | $R^{E1}$ | $R^{A52}$ |
| $L_{A5069}$ | $R^{C1}$ | $R^{E2}$ | $R^{A52}$ |
| $L_{A5070}$ | $R^{C1}$ | $R^{E3}$ | $R^{A52}$ |
| $L_{A5071}$ | $R^{C1}$ | $R^{E4}$ | $R^{A52}$ |
| $L_{A5072}$ | $R^{C1}$ | $R^{E5}$ | $R^{A52}$ |
| $L_{A5073}$ | $R^{C1}$ | $R^{E6}$ | $R^{A52}$ |
| $L_{A5074}$ | $R^{C1}$ | $R^{E7}$ | $R^{A52}$ |
| $L_{A5075}$ | $R^{C1}$ | $R^{E8}$ | $R^{A52}$ |
| $L_{A5076}$ | $R^{C1}$ | $R^{E9}$ | $R^{A52}$ |
| $L_{A5077}$ | $R^{C1}$ | $R^{E10}$ | $R^{A52}$ |
| $L_{A5078}$ | $R^{C1}$ | $R^{E11}$ | $R^{A52}$ |
| $L_{A5079}$ | $R^{C1}$ | $R^{E12}$ | $R^{A52}$ |
| $L_{A5080}$ | $R^{C1}$ | $R^{E13}$ | $R^{A52}$ |
| $L_{A5081}$ | $R^{C1}$ | $R^{E14}$ | $R^{A52}$ |
| $L_{A5082}$ | $R^{C1}$ | $R^{E15}$ | $R^{A52}$ |
| $L_{A5083}$ | $R^{C1}$ | $R^{E16}$ | $R^{A52}$ |
| $L_{A5084}$ | $R^{C1}$ | $R^{E17}$ | $R^{A52}$ |
| $L_{A5085}$ | $R^{C1}$ | $R^{E18}$ | $R^{A52}$ |
| $L_{A5086}$ | $R^{C1}$ | $R^{E19}$ | $R^{A52}$ |

-continued

| Ligand | $R^2$ | $R^3$ | $R^4$ |
|---|---|---|---|
| $L_{A5087}$ | $R^{C1}$ | $R^{E20}$ | $R^{A52}$ |
| $L_{A5088}$ | $R^{C1}$ | $R^{E21}$ | $R^{A52}$ |
| $L_{A5089}$ | $R^{C3}$ | $R^{B3}$ | H |
| $L_{A5090}$ | $R^{C3}$ | $R^{B6}$ | H |
| $L_{A5091}$ | $R^{C3}$ | $R^{B7}$ | H |
| $L_{A5092}$ | $R^{C3}$ | $R^{B12}$ | H |
| $L_{A5093}$ | $R^{C3}$ | $R^{B20}$ | H |
| $L_{A5094}$ | $R^{C3}$ | $R^{B25}$ | H |
| $L_{A5095}$ | $R^{C3}$ | $R^{B29}$ | H |
| $L_{A5096}$ | $R^{C3}$ | $R^{A37}$ | H |
| $L_{A5097}$ | $R^{C3}$ | $R^{A43}$ | H |
| $L_{A5098}$ | $R^{C3}$ | $R^{E1}$ | H |
| $L_{A5099}$ | $R^{C3}$ | $R^{E2}$ | H |
| $L_{A5100}$ | $R^{C3}$ | $R^{E3}$ | H |
| $L_{A5101}$ | $R^{C3}$ | $R^{E4}$ | H |
| $L_{A5102}$ | $R^{C3}$ | $R^{E5}$ | H |
| $L_{A5103}$ | $R^{C3}$ | $R^{E6}$ | H |
| $L_{A5104}$ | $R^{C3}$ | $R^{E7}$ | H |
| $L_{A5105}$ | $R^{C3}$ | $R^{E8}$ | H |
| $L_{A5106}$ | $R^{C3}$ | $R^{E9}$ | H |
| $L_{A5107}$ | $R^{C3}$ | $R^{E10}$ | H |
| $L_{A5108}$ | $R^{C3}$ | $R^{E11}$ | H |
| $L_{A5109}$ | $R^{C3}$ | $R^{E12}$ | H |
| $L_{A5110}$ | $R^{C3}$ | $R^{E13}$ | H |
| $L_{A5111}$ | $R^{C3}$ | $R^{E14}$ | H |
| $L_{A5112}$ | $R^{C3}$ | $R^{E15}$ | H |
| $L_{A5113}$ | $R^{C3}$ | $R^{E16}$ | H |
| $L_{A5114}$ | $R^{C3}$ | $R^{E17}$ | H |
| $L_{A5115}$ | $R^{C3}$ | $R^{E18}$ | H |
| $L_{A5116}$ | $R^{C3}$ | $R^{E19}$ | H |
| $L_{A5117}$ | $R^{C3}$ | $R^{E20}$ | H |
| $L_{A5118}$ | $R^{C3}$ | $R^{E21}$ | H |
| $L_{A5119}$ | $R^{C3}$ | $R^{B3}$ | $R^{B3}$ |
| $L_{A5120}$ | $R^{C3}$ | $R^{B6}$ | $R^{B3}$ |
| $L_{A5121}$ | $R^{C3}$ | $R^{B7}$ | $R^{B3}$ |
| $L_{A5122}$ | $R^{C3}$ | $R^{B12}$ | $R^{B3}$ |
| $L_{A5123}$ | $R^{C3}$ | $R^{B20}$ | $R^{B3}$ |
| $L_{A5124}$ | $R^{C3}$ | $R^{B25}$ | $R^{B3}$ |
| $L_{A5125}$ | $R^{C3}$ | $R^{B29}$ | $R^{B3}$ |
| $L_{A5126}$ | $R^{C3}$ | $R^{A37}$ | $R^{B3}$ |
| $L_{A5127}$ | $R^{C3}$ | $R^{A43}$ | $R^{B3}$ |
| $L_{A5128}$ | $R^{C3}$ | $R^{E1}$ | $R^{B3}$ |
| $L_{A5129}$ | $R^{C3}$ | $R^{E2}$ | $R^{B3}$ |
| $L_{A5130}$ | $R^{C3}$ | $R^{E3}$ | $R^{B3}$ |
| $L_{A5131}$ | $R^{C3}$ | $R^{E4}$ | $R^{B3}$ |
| $L_{A5132}$ | $R^{C3}$ | $R^{E5}$ | $R^{B3}$ |
| $L_{A5133}$ | $R^{C3}$ | $R^{E6}$ | $R^{B3}$ |
| $L_{A5134}$ | $R^{C3}$ | $R^{E7}$ | $R^{B3}$ |
| $L_{A5135}$ | $R^{C3}$ | $R^{E8}$ | $R^{B3}$ |
| $L_{A5136}$ | $R^{C3}$ | $R^{E9}$ | $R^{B3}$ |
| $L_{A5137}$ | $R^{C3}$ | $R^{E10}$ | $R^{B3}$ |
| $L_{A5138}$ | $R^{C3}$ | $R^{E11}$ | $R^{B3}$ |
| $L_{A5139}$ | $R^{C3}$ | $R^{E12}$ | $R^{B3}$ |
| $L_{A5140}$ | $R^{C3}$ | $R^{E13}$ | $R^{B3}$ |
| $L_{A5141}$ | $R^{C3}$ | $R^{E14}$ | $R^{B3}$ |
| $L_{A5142}$ | $R^{C3}$ | $R^{E15}$ | $R^{B3}$ |
| $L_{A5143}$ | $R^{C3}$ | $R^{E16}$ | $R^{B3}$ |
| $L_{A5144}$ | $R^{C3}$ | $R^{E17}$ | $R^{B3}$ |
| $L_{A5145}$ | $R^{C3}$ | $R^{E18}$ | $R^{B3}$ |
| $L_{A5146}$ | $R^{C3}$ | $R^{E19}$ | $R^{B3}$ |
| $L_{A5147}$ | $R^{C3}$ | $R^{E20}$ | $R^{B3}$ |
| $L_{A5148}$ | $R^{C3}$ | $R^{E21}$ | $R^{B3}$ |
| $L_{A5149}$ | $R^{C3}$ | $R^{B3}$ | $R^{B4}$ |
| $L_{A5150}$ | $R^{C3}$ | $R^{B6}$ | $R^{B4}$ |
| $L_{A5151}$ | $R^{C3}$ | $R^{B7}$ | $R^{B4}$ |
| $L_{A5152}$ | $R^{C3}$ | $R^{B12}$ | $R^{B4}$ |
| $L_{A5153}$ | $R^{C3}$ | $R^{B20}$ | $R^{B4}$ |
| $L_{A5154}$ | $R^{C3}$ | $R^{B25}$ | $R^{B4}$ |
| $L_{A5155}$ | $R^{C3}$ | $R^{B29}$ | $R^{B4}$ |
| $L_{A5156}$ | $R^{C3}$ | $R^{A37}$ | $R^{B4}$ |
| $L_{A5157}$ | $R^{C3}$ | $R^{A43}$ | $R^{B4}$ |
| $L_{A5158}$ | $R^{C3}$ | $R^{E1}$ | $R^{B4}$ |
| $L_{A5159}$ | $R^{C3}$ | $R^{E2}$ | $R^{B4}$ |
| $L_{A5160}$ | $R^{C3}$ | $R^{E3}$ | $R^{B4}$ |
| $L_{A5161}$ | $R^{C3}$ | $R^{E4}$ | $R^{B4}$ |
| $L_{A5162}$ | $R^{C3}$ | $R^{E5}$ | $R^{B4}$ |
| $L_{A5163}$ | $R^{C3}$ | $R^{E6}$ | $R^{B4}$ |

-continued

| Ligand | $R^2$ | $R^3$ | $R^4$ |
|---|---|---|---|
| $L_{A5164}$ | $R^{C3}$ | $R^{E7}$ | $R^{B4}$ |
| $L_{A5165}$ | $R^{C3}$ | $R^{E8}$ | $R^{B4}$ |
| $L_{A5166}$ | $R^{C3}$ | $R^{E9}$ | $R^{B4}$ |
| $L_{A5167}$ | $R^{C3}$ | $R^{E10}$ | $R^{B4}$ |
| $L_{A5168}$ | $R^{C3}$ | $R^{E11}$ | $R^{B4}$ |
| $L_{A5169}$ | $R^{C3}$ | $R^{E12}$ | $R^{B4}$ |
| $L_{A5170}$ | $R^{C3}$ | $R^{E13}$ | $R^{B4}$ |
| $L_{A5171}$ | $R^{C3}$ | $R^{E14}$ | $R^{B4}$ |
| $L_{A5172}$ | $R^{C3}$ | $R^{E15}$ | $R^{B4}$ |
| $L_{A5173}$ | $R^{C3}$ | $R^{E16}$ | $R^{B4}$ |
| $L_{A5174}$ | $R^{C3}$ | $R^{E17}$ | $R^{B4}$ |
| $L_{A5175}$ | $R^{C3}$ | $R^{E18}$ | $R^{B4}$ |
| $L_{A5176}$ | $R^{C3}$ | $R^{E19}$ | $R^{B4}$ |
| $L_{A5177}$ | $R^{C3}$ | $R^{E20}$ | $R^{B4}$ |
| $L_{A5178}$ | $R^{C3}$ | $R^{E21}$ | $R^{B4}$ |
| $L_{A5179}$ | $R^{C3}$ | $R^{B3}$ | $R^{B18}$ |
| $L_{A5180}$ | $R^{C3}$ | $R^{B6}$ | $R^{B18}$ |
| $L_{A5181}$ | $R^{C3}$ | $R^{B7}$ | $R^{B18}$ |
| $L_{A5182}$ | $R^{C3}$ | $R^{B12}$ | $R^{B18}$ |
| $L_{A5183}$ | $R^{C3}$ | $R^{B20}$ | $R^{B18}$ |
| $L_{A5184}$ | $R^{C3}$ | $R^{B25}$ | $R^{B18}$ |
| $L_{A5185}$ | $R^{C3}$ | $R^{B29}$ | $R^{B18}$ |
| $L_{A5186}$ | $R^{C3}$ | $R^{A37}$ | $R^{B18}$ |
| $L_{A5187}$ | $R^{C3}$ | $R^{A43}$ | $R^{B18}$ |
| $L_{A5188}$ | $R^{C3}$ | $R^{E1}$ | $R^{B18}$ |
| $L_{A5189}$ | $R^{C3}$ | $R^{E2}$ | $R^{B18}$ |
| $L_{A5190}$ | $R^{C3}$ | $R^{E3}$ | $R^{B18}$ |
| $L_{A5191}$ | $R^{C3}$ | $R^{E4}$ | $R^{B18}$ |
| $L_{A5192}$ | $R^{C3}$ | $R^{E5}$ | $R^{B18}$ |
| $L_{A5193}$ | $R^{C3}$ | $R^{E6}$ | $R^{B18}$ |
| $L_{A5194}$ | $R^{C3}$ | $R^{E7}$ | $R^{B18}$ |
| $L_{A5195}$ | $R^{C3}$ | $R^{E8}$ | $R^{B18}$ |
| $L_{A5196}$ | $R^{C3}$ | $R^{E9}$ | $R^{B18}$ |
| $L_{A5197}$ | $R^{C3}$ | $R^{E10}$ | $R^{B18}$ |
| $L_{A5198}$ | $R^{C3}$ | $R^{E11}$ | $R^{B18}$ |
| $L_{A5199}$ | $R^{C3}$ | $R^{E12}$ | $R^{B18}$ |
| $L_{A5200}$ | $R^{C3}$ | $R^{E13}$ | $R^{B18}$ |
| $L_{A5201}$ | $R^{C3}$ | $R^{E14}$ | $R^{B18}$ |
| $L_{A5202}$ | $R^{C3}$ | $R^{E15}$ | $R^{B18}$ |
| $L_{A5203}$ | $R^{C3}$ | $R^{E16}$ | $R^{B18}$ |
| $L_{A5204}$ | $R^{C3}$ | $R^{E17}$ | $R^{B18}$ |
| $L_{A5205}$ | $R^{C3}$ | $R^{E18}$ | $R^{B18}$ |
| $L_{A5206}$ | $R^{C3}$ | $R^{E19}$ | $R^{B18}$ |
| $L_{A5207}$ | $R^{C3}$ | $R^{E20}$ | $R^{B18}$ |
| $L_{A5208}$ | $R^{C3}$ | $R^{E21}$ | $R^{B18}$ |
| $L_{A5209}$ | $R^{C3}$ | $R^{B3}$ | $R^{A3}$ |
| $L_{A5210}$ | $R^{C3}$ | $R^{B6}$ | $R^{A3}$ |
| $L_{A5211}$ | $R^{C3}$ | $R^{B7}$ | $R^{A3}$ |
| $L_{A5212}$ | $R^{C3}$ | $R^{B12}$ | $R^{A3}$ |
| $L_{A5213}$ | $R^{C3}$ | $R^{B20}$ | $R^{A3}$ |
| $L_{A5214}$ | $R^{C3}$ | $R^{B25}$ | $R^{A3}$ |
| $L_{A5215}$ | $R^{C3}$ | $R^{B29}$ | $R^{A3}$ |
| $L_{A5216}$ | $R^{C3}$ | $R^{A37}$ | $R^{A3}$ |
| $L_{A5217}$ | $R^{C3}$ | $R^{A43}$ | $R^{A3}$ |
| $L_{A5218}$ | $R^{C3}$ | $R^{E1}$ | $R^{A3}$ |
| $L_{A5219}$ | $R^{C3}$ | $R^{E2}$ | $R^{A3}$ |
| $L_{A5220}$ | $R^{C3}$ | $R^{E3}$ | $R^{A3}$ |
| $L_{A5221}$ | $R^{C3}$ | $R^{E4}$ | $R^{A3}$ |
| $L_{A5222}$ | $R^{C3}$ | $R^{E5}$ | $R^{A3}$ |
| $L_{A5223}$ | $R^{C3}$ | $R^{E6}$ | $R^{A3}$ |
| $L_{A5224}$ | $R^{C3}$ | $R^{E7}$ | $R^{A3}$ |
| $L_{A5225}$ | $R^{C3}$ | $R^{E8}$ | $R^{A3}$ |
| $L_{A5226}$ | $R^{C3}$ | $R^{E9}$ | $R^{A3}$ |
| $L_{A5227}$ | $R^{C3}$ | $R^{E10}$ | $R^{A3}$ |
| $L_{A5228}$ | $R^{C3}$ | $R^{E11}$ | $R^{A3}$ |
| $L_{A5229}$ | $R^{C3}$ | $R^{E12}$ | $R^{A3}$ |
| $L_{A5230}$ | $R^{C3}$ | $R^{E13}$ | $R^{A3}$ |
| $L_{A5231}$ | $R^{C3}$ | $R^{E14}$ | $R^{A3}$ |
| $L_{A5232}$ | $R^{C3}$ | $R^{E15}$ | $R^{A3}$ |
| $L_{A5233}$ | $R^{C3}$ | $R^{E16}$ | $R^{A3}$ |
| $L_{A5234}$ | $R^{C3}$ | $R^{E17}$ | $R^{A3}$ |
| $L_{A5235}$ | $R^{C3}$ | $R^{E18}$ | $R^{A3}$ |
| $L_{A5236}$ | $R^{C3}$ | $R^{E19}$ | $R^{A3}$ |
| $L_{A5237}$ | $R^{C3}$ | $R^{E20}$ | $R^{A3}$ |
| $L_{A5238}$ | $R^{C3}$ | $R^{E21}$ | $R^{A3}$ |
| $L_{A5239}$ | $R^{C3}$ | $R^{B3}$ | $R^{A34}$ |
| $L_{A5240}$ | $R^{C3}$ | $R^{B6}$ | $R^{A34}$ |

-continued

| Ligand | $R^2$ | $R^3$ | $R^4$ |
|---|---|---|---|
| $L_{A5241}$ | $R^{C3}$ | $R^{B7}$ | $R^{A34}$ |
| $L_{A5242}$ | $R^{C3}$ | $R^{B12}$ | $R^{A34}$ |
| $L_{A5243}$ | $R^{C3}$ | $R^{B20}$ | $R^{A34}$ |
| $L_{A5244}$ | $R^{C3}$ | $R^{B25}$ | $R^{A34}$ |
| $L_{A5245}$ | $R^{C3}$ | $R^{B29}$ | $R^{A34}$ |
| $L_{A5246}$ | $R^{C3}$ | $R^{A37}$ | $R^{A34}$ |
| $L_{A5247}$ | $R^{C3}$ | $R^{A43}$ | $R^{A34}$ |
| $L_{A5248}$ | $R^{C3}$ | $R^{E1}$ | $R^{A34}$ |
| $L_{A5249}$ | $R^{C3}$ | $R^{E2}$ | $R^{A34}$ |
| $L_{A5250}$ | $R^{C3}$ | $R^{E3}$ | $R^{A34}$ |
| $L_{A5251}$ | $R^{C3}$ | $R^{E4}$ | $R^{A34}$ |
| $L_{A5252}$ | $R^{C3}$ | $R^{E5}$ | $R^{A34}$ |
| $L_{A5253}$ | $R^{C3}$ | $R^{E6}$ | $R^{A34}$ |
| $L_{A5254}$ | $R^{C3}$ | $R^{E7}$ | $R^{A34}$ |
| $L_{A5255}$ | $R^{C3}$ | $R^{E8}$ | $R^{A34}$ |
| $L_{A5256}$ | $R^{C3}$ | $R^{E9}$ | $R^{A34}$ |
| $L_{A5257}$ | $R^{C3}$ | $R^{E10}$ | $R^{A34}$ |
| $L_{A5258}$ | $R^{C3}$ | $R^{E11}$ | $R^{A34}$ |
| $L_{A5259}$ | $R^{C3}$ | $R^{E12}$ | $R^{A34}$ |
| $L_{A5260}$ | $R^{C3}$ | $R^{E13}$ | $R^{A34}$ |
| $L_{A5261}$ | $R^{C3}$ | $R^{E14}$ | $R^{A34}$ |
| $L_{A5262}$ | $R^{C3}$ | $R^{E15}$ | $R^{A34}$ |
| $L_{A5263}$ | $R^{C3}$ | $R^{E16}$ | $R^{A34}$ |
| $L_{A5264}$ | $R^{C3}$ | $R^{E17}$ | $R^{A34}$ |
| $L_{A5265}$ | $R^{C3}$ | $R^{E18}$ | $R^{A34}$ |
| $L_{A5266}$ | $R^{C3}$ | $R^{E19}$ | $R^{A34}$ |
| $L_{A5267}$ | $R^{C3}$ | $R^{E20}$ | $R^{A34}$ |
| $L_{A5268}$ | $R^{C3}$ | $R^{E21}$ | $R^{A34}$ |
| $L_{A5269}$ | $R^{C3}$ | $R^{B3}$ | $R^{A52}$ |
| $L_{A5270}$ | $R^{C3}$ | $R^{B6}$ | $R^{A52}$ |
| $L_{A5271}$ | $R^{C3}$ | $R^{B7}$ | $R^{A52}$ |
| $L_{A5272}$ | $R^{C3}$ | $R^{B12}$ | $R^{A52}$ |
| $L_{A5273}$ | $R^{C3}$ | $R^{B20}$ | $R^{A52}$ |
| $L_{A5274}$ | $R^{C3}$ | $R^{B25}$ | $R^{A52}$ |
| $L_{A5275}$ | $R^{C3}$ | $R^{B29}$ | $R^{A52}$ |
| $L_{A5276}$ | $R^{C3}$ | $R^{A37}$ | $R^{A52}$ |
| $L_{A5277}$ | $R^{C3}$ | $R^{A43}$ | $R^{A52}$ |
| $L_{A5278}$ | $R^{C3}$ | $R^{E1}$ | $R^{A52}$ |
| $L_{A5279}$ | $R^{C3}$ | $R^{E2}$ | $R^{A52}$ |
| $L_{A5280}$ | $R^{C3}$ | $R^{E3}$ | $R^{A52}$ |
| $L_{A5281}$ | $R^{C3}$ | $R^{E4}$ | $R^{A52}$ |
| $L_{A5282}$ | $R^{C3}$ | $R^{E5}$ | $R^{A52}$ |
| $L_{A5283}$ | $R^{C3}$ | $R^{E6}$ | $R^{A52}$ |
| $L_{A5284}$ | $R^{C3}$ | $R^{E7}$ | $R^{A52}$ |
| $L_{A5285}$ | $R^{C3}$ | $R^{E8}$ | $R^{A52}$ |
| $L_{A5286}$ | $R^{C3}$ | $R^{E9}$ | $R^{A52}$ |
| $L_{A5287}$ | $R^{C3}$ | $R^{E10}$ | $R^{A52}$ |
| $L_{A5288}$ | $R^{C3}$ | $R^{E11}$ | $R^{A52}$ |
| $L_{A5289}$ | $R^{C3}$ | $R^{E12}$ | $R^{A52}$ |
| $L_{A5290}$ | $R^{C3}$ | $R^{E13}$ | $R^{A52}$ |
| $L_{A5291}$ | $R^{C3}$ | $R^{E14}$ | $R^{A52}$ |
| $L_{A5292}$ | $R^{C3}$ | $R^{E15}$ | $R^{A52}$ |
| $L_{A5293}$ | $R^{C3}$ | $R^{E16}$ | $R^{A52}$ |
| $L_{A5294}$ | $R^{C3}$ | $R^{E17}$ | $R^{A52}$ |
| $L_{A5295}$ | $R^{C3}$ | $R^{E18}$ | $R^{A52}$ |
| $L_{A5296}$ | $R^{C3}$ | $R^{E19}$ | $R^{A52}$ |
| $L_{A5297}$ | $R^{C3}$ | $R^{E20}$ | $R^{A52}$ |
| $L_{A5298}$ | $R^{C3}$ | $R^{E21}$ | $R^{A52}$ |
| $L_{A5299}$ | $R^{C31}$ | $R^{B3}$ | H |
| $L_{A5300}$ | $R^{C31}$ | $R^{B6}$ | H |
| $L_{A5301}$ | $R^{C31}$ | $R^{B7}$ | H |
| $L_{A5302}$ | $R^{C31}$ | $R^{B12}$ | H |
| $L_{A5303}$ | $R^{C31}$ | $R^{B20}$ | H |
| $L_{A5304}$ | $R^{C31}$ | $R^{B25}$ | H |
| $L_{A5305}$ | $R^{C31}$ | $R^{B29}$ | H |
| $L_{A5306}$ | $R^{C31}$ | $R^{A37}$ | H |
| $L_{A5307}$ | $R^{C31}$ | $R^{A43}$ | H |
| $L_{A5308}$ | $R^{C31}$ | $R^{E1}$ | H |
| $L_{A5309}$ | $R^{C31}$ | $R^{E2}$ | H |
| $L_{A5310}$ | $R^{C31}$ | $R^{E3}$ | H |
| $L_{A5311}$ | $R^{C31}$ | $R^{E4}$ | H |
| $L_{A5312}$ | $R^{C31}$ | $R^{E5}$ | H |
| $L_{A5313}$ | $R^{C31}$ | $R^{E6}$ | H |
| $L_{A5314}$ | $R^{C31}$ | $R^{E7}$ | H |
| $L_{A5315}$ | $R^{C31}$ | $R^{E8}$ | H |
| $L_{A5316}$ | $R^{C31}$ | $R^{E9}$ | H |
| $L_{A5317}$ | $R^{C31}$ | $R^{E10}$ | H |

-continued

| Ligand | $R^2$ | $R^3$ | $R^4$ |
|---|---|---|---|
| $L_{A5318}$ | $R^{C31}$ | $R^{E11}$ | H |
| $L_{A5319}$ | $R^{C31}$ | $R^{E12}$ | H |
| $L_{A5320}$ | $R^{C31}$ | $R^{E13}$ | H |
| $L_{A5321}$ | $R^{C31}$ | $R^{E14}$ | H |
| $L_{A5322}$ | $R^{C31}$ | $R^{E15}$ | H |
| $L_{A5323}$ | $R^{C31}$ | $R^{E16}$ | H |
| $L_{A5324}$ | $R^{C31}$ | $R^{E17}$ | H |
| $L_{A5325}$ | $R^{C31}$ | $R^{E18}$ | H |
| $L_{A5326}$ | $R^{C31}$ | $R^{E19}$ | H |
| $L_{A5327}$ | $R^{C31}$ | $R^{E20}$ | H |
| $L_{A5328}$ | $R^{C31}$ | $R^{E21}$ | H |
| $L_{A5329}$ | $R^{C31}$ | $R^{B3}$ | $R^{B3}$ |
| $L_{A5330}$ | $R^{C31}$ | $R^{B6}$ | $R^{B3}$ |
| $L_{A5331}$ | $R^{C31}$ | $R^{B7}$ | $R^{B3}$ |
| $L_{A5332}$ | $R^{C31}$ | $R^{B12}$ | $R^{B3}$ |
| $L_{A5333}$ | $R^{C31}$ | $R^{B20}$ | $R^{B3}$ |
| $L_{A5334}$ | $R^{C31}$ | $R^{B25}$ | $R^{B3}$ |
| $L_{A5335}$ | $R^{C31}$ | $R^{B29}$ | $R^{B3}$ |
| $L_{A5336}$ | $R^{C31}$ | $R^{A37}$ | $R^{B3}$ |
| $L_{A5337}$ | $R^{C31}$ | $R^{A43}$ | $R^{B3}$ |
| $L_{A5338}$ | $R^{C31}$ | $R^{E1}$ | $R^{B3}$ |
| $L_{A5339}$ | $R^{C31}$ | $R^{E2}$ | $R^{B3}$ |
| $L_{A5340}$ | $R^{C31}$ | $R^{E3}$ | $R^{B3}$ |
| $L_{A5341}$ | $R^{C31}$ | $R^{E4}$ | $R^{B3}$ |
| $L_{A5342}$ | $R^{C31}$ | $R^{E5}$ | $R^{B3}$ |
| $L_{A5343}$ | $R^{C31}$ | $R^{E6}$ | $R^{B3}$ |
| $L_{A5344}$ | $R^{C31}$ | $R^{E7}$ | $R^{B3}$ |
| $L_{A5345}$ | $R^{C31}$ | $R^{E8}$ | $R^{B3}$ |
| $L_{A5346}$ | $R^{C31}$ | $R^{E9}$ | $R^{B3}$ |
| $L_{A5347}$ | $R^{C31}$ | $R^{E10}$ | $R^{B3}$ |
| $L_{A5348}$ | $R^{C31}$ | $R^{E11}$ | $R^{B3}$ |
| $L_{A5349}$ | $R^{C31}$ | $R^{E12}$ | $R^{B3}$ |
| $L_{A5350}$ | $R^{C31}$ | $R^{E13}$ | $R^{B3}$ |
| $L_{A5351}$ | $R^{C31}$ | $R^{E14}$ | $R^{B3}$ |
| $L_{A5352}$ | $R^{C31}$ | $R^{E15}$ | $R^{B3}$ |
| $L_{A5353}$ | $R^{C31}$ | $R^{E16}$ | $R^{B3}$ |
| $L_{A5354}$ | $R^{C31}$ | $R^{E17}$ | $R^{B3}$ |
| $L_{A5355}$ | $R^{C31}$ | $R^{E18}$ | $R^{B3}$ |
| $L_{A5356}$ | $R^{C31}$ | $R^{E19}$ | $R^{B3}$ |
| $L_{A5357}$ | $R^{C31}$ | $R^{E20}$ | $R^{B3}$ |
| $L_{A5358}$ | $R^{C31}$ | $R^{E21}$ | $R^{B3}$ |
| $L_{A5359}$ | $R^{C31}$ | $R^{B3}$ | $R^{B4}$ |
| $L_{A5360}$ | $R^{C31}$ | $R^{B6}$ | $R^{B4}$ |
| $L_{A5361}$ | $R^{C31}$ | $R^{B7}$ | $R^{B4}$ |
| $L_{A5362}$ | $R^{C31}$ | $R^{B12}$ | $R^{B4}$ |
| $L_{A5363}$ | $R^{C31}$ | $R^{B20}$ | $R^{B4}$ |
| $L_{A5364}$ | $R^{C31}$ | $R^{B25}$ | $R^{B4}$ |
| $L_{A5365}$ | $R^{C31}$ | $R^{B29}$ | $R^{B4}$ |
| $L_{A5366}$ | $R^{C31}$ | $R^{A37}$ | $R^{B4}$ |
| $L_{A5367}$ | $R^{C31}$ | $R^{A43}$ | $R^{B4}$ |
| $L_{A5368}$ | $R^{C31}$ | $R^{E1}$ | $R^{B4}$ |
| $L_{A5369}$ | $R^{C31}$ | $R^{E2}$ | $R^{B4}$ |
| $L_{A5370}$ | $R^{C31}$ | $R^{E3}$ | $R^{B4}$ |
| $L_{A5371}$ | $R^{C31}$ | $R^{E4}$ | $R^{B4}$ |
| $L_{A5372}$ | $R^{C31}$ | $R^{E5}$ | $R^{B4}$ |
| $L_{A5373}$ | $R^{C31}$ | $R^{E6}$ | $R^{B4}$ |
| $L_{A5374}$ | $R^{C31}$ | $R^{E7}$ | $R^{B4}$ |
| $L_{A5375}$ | $R^{C31}$ | $R^{E8}$ | $R^{B4}$ |
| $L_{A5376}$ | $R^{C31}$ | $R^{E9}$ | $R^{B4}$ |
| $L_{A5377}$ | $R^{C31}$ | $R^{E10}$ | $R^{B4}$ |
| $L_{A5378}$ | $R^{C31}$ | $R^{E11}$ | $R^{B4}$ |
| $L_{A5379}$ | $R^{C31}$ | $R^{E12}$ | $R^{B4}$ |
| $L_{A5380}$ | $R^{C31}$ | $R^{E13}$ | $R^{B4}$ |
| $L_{A5381}$ | $R^{C31}$ | $R^{E14}$ | $R^{B4}$ |
| $L_{A5382}$ | $R^{C31}$ | $R^{E15}$ | $R^{B4}$ |
| $L_{A5383}$ | $R^{C31}$ | $R^{E16}$ | $R^{B4}$ |
| $L_{A5384}$ | $R^{C31}$ | $R^{E17}$ | $R^{B4}$ |
| $L_{A5385}$ | $R^{C31}$ | $R^{E18}$ | $R^{B4}$ |
| $L_{A5386}$ | $R^{C31}$ | $R^{E19}$ | $R^{B4}$ |
| $L_{A5387}$ | $R^{C31}$ | $R^{E20}$ | $R^{B4}$ |
| $L_{A5388}$ | $R^{C31}$ | $R^{E21}$ | $R^{B4}$ |
| $L_{A5389}$ | $R^{C31}$ | $R^{B3}$ | $R^{B18}$ |
| $L_{A5390}$ | $R^{C31}$ | $R^{B6}$ | $R^{B18}$ |
| $L_{A5391}$ | $R^{C31}$ | $R^{B7}$ | $R^{B18}$ |
| $L_{A5392}$ | $R^{C31}$ | $R^{B12}$ | $R^{B18}$ |
| $L_{A5393}$ | $R^{C31}$ | $R^{B20}$ | $R^{B18}$ |
| $L_{A5394}$ | $R^{C31}$ | $R^{B25}$ | $R^{B18}$ |

| Ligand | $R^2$ | $R^3$ | $R^4$ |
|---|---|---|---|
| $L_{A5395}$ | $R^{C31}$ | $R^{B29}$ | $R^{B18}$ |
| $L_{A5396}$ | $R^{C31}$ | $R^{A37}$ | $R^{B18}$ |
| $L_{A5397}$ | $R^{C31}$ | $R^{A43}$ | $R^{B18}$ |
| $L_{A5398}$ | $R^{C31}$ | $R^{E1}$ | $R^{B18}$ |
| $L_{A5399}$ | $R^{C31}$ | $R^{E2}$ | $R^{B18}$ |
| $L_{A5400}$ | $R^{C31}$ | $R^{E3}$ | $R^{B18}$ |
| $L_{A5401}$ | $R^{C31}$ | $R^{E4}$ | $R^{B18}$ |
| $L_{A5402}$ | $R^{C31}$ | $R^{E5}$ | $R^{B18}$ |
| $L_{A5403}$ | $R^{C31}$ | $R^{E6}$ | $R^{B18}$ |
| $L_{A5404}$ | $R^{C31}$ | $R^{E7}$ | $R^{B18}$ |
| $L_{A5405}$ | $R^{C31}$ | $R^{E8}$ | $R^{B18}$ |
| $L_{A5406}$ | $R^{C31}$ | $R^{E9}$ | $R^{B18}$ |
| $L_{A5407}$ | $R^{C31}$ | $R^{E10}$ | $R^{B18}$ |
| $L_{A5408}$ | $R^{C31}$ | $R^{E11}$ | $R^{B18}$ |
| $L_{A5409}$ | $R^{C31}$ | $R^{E12}$ | $R^{B18}$ |
| $L_{A5410}$ | $R^{C31}$ | $R^{E13}$ | $R^{B18}$ |
| $L_{A5411}$ | $R^{C31}$ | $R^{E14}$ | $R^{B18}$ |
| $L_{A5412}$ | $R^{C31}$ | $R^{E15}$ | $R^{B18}$ |
| $L_{A5413}$ | $R^{C31}$ | $R^{E16}$ | $R^{B18}$ |
| $L_{A5414}$ | $R^{C31}$ | $R^{E17}$ | $R^{B18}$ |
| $L_{A5415}$ | $R^{C31}$ | $R^{E18}$ | $R^{B18}$ |
| $L_{A5416}$ | $R^{C31}$ | $R^{E19}$ | $R^{B18}$ |
| $L_{A5417}$ | $R^{C31}$ | $R^{E20}$ | $R^{B18}$ |
| $L_{A5418}$ | $R^{C31}$ | $R^{E21}$ | $R^{B18}$ |
| $L_{A5419}$ | $R^{C31}$ | $R^{B3}$ | $R^{A3}$ |
| $L_{A5420}$ | $R^{C31}$ | $R^{B6}$ | $R^{A3}$ |
| $L_{A5421}$ | $R^{C31}$ | $R^{B7}$ | $R^{A3}$ |
| $L_{A5422}$ | $R^{C31}$ | $R^{B12}$ | $R^{A3}$ |
| $L_{A5423}$ | $R^{C31}$ | $R^{B20}$ | $R^{A3}$ |
| $L_{A5424}$ | $R^{C31}$ | $R^{B25}$ | $R^{A3}$ |
| $L_{A5425}$ | $R^{C31}$ | $R^{B29}$ | $R^{A3}$ |
| $L_{A5426}$ | $R^{C31}$ | $R^{A37}$ | $R^{A3}$ |
| $L_{A5427}$ | $R^{C31}$ | $R^{A43}$ | $R^{A3}$ |
| $L_{A5428}$ | $R^{C31}$ | $R^{E1}$ | $R^{A3}$ |
| $L_{A5429}$ | $R^{C31}$ | $R^{E2}$ | $R^{A3}$ |
| $L_{A5430}$ | $R^{C31}$ | $R^{E3}$ | $R^{A3}$ |
| $L_{A5431}$ | $R^{C31}$ | $R^{E4}$ | $R^{A3}$ |
| $L_{A5432}$ | $R^{C31}$ | $R^{E5}$ | $R^{A3}$ |
| $L_{A5433}$ | $R^{C31}$ | $R^{E6}$ | $R^{A3}$ |
| $L_{A5434}$ | $R^{C31}$ | $R^{E7}$ | $R^{A3}$ |
| $L_{A5435}$ | $R^{C31}$ | $R^{E8}$ | $R^{A3}$ |
| $L_{A5436}$ | $R^{C31}$ | $R^{E9}$ | $R^{A3}$ |
| $L_{A5437}$ | $R^{C31}$ | $R^{E10}$ | $R^{A3}$ |
| $L_{A5438}$ | $R^{C31}$ | $R^{E11}$ | $R^{A3}$ |
| $L_{A5439}$ | $R^{C31}$ | $R^{E12}$ | $R^{A3}$ |
| $L_{A5440}$ | $R^{C31}$ | $R^{E13}$ | $R^{A3}$ |
| $L_{A5441}$ | $R^{C31}$ | $R^{E14}$ | $R^{A3}$ |
| $L_{A5442}$ | $R^{C31}$ | $R^{E15}$ | $R^{A3}$ |
| $L_{A5443}$ | $R^{C31}$ | $R^{E16}$ | $R^{A3}$ |
| $L_{A5444}$ | $R^{C31}$ | $R^{E17}$ | $R^{A3}$ |
| $L_{A5445}$ | $R^{C31}$ | $R^{E18}$ | $R^{A3}$ |
| $L_{A5446}$ | $R^{C31}$ | $R^{E19}$ | $R^{A3}$ |
| $L_{A5447}$ | $R^{C31}$ | $R^{E20}$ | $R^{A3}$ |
| $L_{A5448}$ | $R^{C31}$ | $R^{E21}$ | $R^{A3}$ |
| $L_{A5449}$ | $R^{C31}$ | $R^{B3}$ | $R^{A34}$ |
| $L_{A5450}$ | $R^{C31}$ | $R^{B6}$ | $R^{A34}$ |
| $L_{A5451}$ | $R^{C31}$ | $R^{B7}$ | $R^{A34}$ |
| $L_{A5452}$ | $R^{C31}$ | $R^{B12}$ | $R^{A34}$ |
| $L_{A5453}$ | $R^{C31}$ | $R^{B20}$ | $R^{A34}$ |
| $L_{A5454}$ | $R^{C31}$ | $R^{B25}$ | $R^{A34}$ |
| $L_{A5455}$ | $R^{C31}$ | $R^{B29}$ | $R^{A34}$ |
| $L_{A5456}$ | $R^{C31}$ | $R^{A37}$ | $R^{A34}$ |
| $L_{A5457}$ | $R^{C31}$ | $R^{A43}$ | $R^{A34}$ |
| $L_{A5458}$ | $R^{C31}$ | $R^{E1}$ | $R^{A34}$ |
| $L_{A5459}$ | $R^{C31}$ | $R^{E2}$ | $R^{A34}$ |
| $L_{A5460}$ | $R^{C31}$ | $R^{E3}$ | $R^{A34}$ |
| $L_{A5461}$ | $R^{C31}$ | $R^{E4}$ | $R^{A34}$ |
| $L_{A5462}$ | $R^{C31}$ | $R^{E5}$ | $R^{A34}$ |
| $L_{A5463}$ | $R^{C31}$ | $R^{E6}$ | $R^{A34}$ |
| $L_{A5464}$ | $R^{C31}$ | $R^{E7}$ | $R^{A34}$ |
| $L_{A5465}$ | $R^{C31}$ | $R^{E8}$ | $R^{A34}$ |
| $L_{A5466}$ | $R^{C31}$ | $R^{E9}$ | $R^{A34}$ |
| $L_{A5467}$ | $R^{C31}$ | $R^{E10}$ | $R^{A34}$ |
| $L_{A5468}$ | $R^{C31}$ | $R^{E11}$ | $R^{A34}$ |
| $L_{A5469}$ | $R^{C31}$ | $R^{E12}$ | $R^{A34}$ |
| $L_{A5470}$ | $R^{C31}$ | $R^{E13}$ | $R^{A34}$ |
| $L_{A5471}$ | $R^{C31}$ | $R^{E14}$ | $R^{A34}$ |
| $L_{A5472}$ | $R^{C31}$ | $R^{E15}$ | $R^{A34}$ |
| $L_{A5473}$ | $R^{C31}$ | $R^{E16}$ | $R^{A34}$ |
| $L_{A5474}$ | $R^{C31}$ | $R^{E17}$ | $R^{A34}$ |
| $L_{A5475}$ | $R^{C31}$ | $R^{E18}$ | $R^{A34}$ |
| $L_{A5476}$ | $R^{C31}$ | $R^{E19}$ | $R^{A34}$ |
| $L_{A5477}$ | $R^{C31}$ | $R^{E20}$ | $R^{A34}$ |
| $L_{A5478}$ | $R^{C31}$ | $R^{E21}$ | $R^{A34}$ |
| $L_{A5479}$ | $R^{C31}$ | $R^{B3}$ | $R^{A52}$ |
| $L_{A5480}$ | $R^{C31}$ | $R^{B6}$ | $R^{A52}$ |
| $L_{A5481}$ | $R^{C31}$ | $R^{B7}$ | $R^{A52}$ |
| $L_{A5482}$ | $R^{C31}$ | $R^{B12}$ | $R^{A52}$ |
| $L_{A5483}$ | $R^{C31}$ | $R^{B20}$ | $R^{A52}$ |
| $L_{A5484}$ | $R^{C31}$ | $R^{B25}$ | $R^{A52}$ |
| $L_{A5485}$ | $R^{C31}$ | $R^{B29}$ | $R^{A52}$ |
| $L_{A5486}$ | $R^{C31}$ | $R^{A37}$ | $R^{A52}$ |
| $L_{A5487}$ | $R^{C31}$ | $R^{A43}$ | $R^{A52}$ |
| $L_{A5488}$ | $R^{C31}$ | $R^{E1}$ | $R^{A52}$ |
| $L_{A5489}$ | $R^{C31}$ | $R^{E2}$ | $R^{A52}$ |
| $L_{A5490}$ | $R^{C31}$ | $R^{E3}$ | $R^{A52}$ |
| $L_{A5491}$ | $R^{C31}$ | $R^{E4}$ | $R^{A52}$ |
| $L_{A5492}$ | $R^{C31}$ | $R^{E5}$ | $R^{A52}$ |
| $L_{A5493}$ | $R^{C31}$ | $R^{E6}$ | $R^{A52}$ |
| $L_{A5494}$ | $R^{C31}$ | $R^{E7}$ | $R^{A52}$ |
| $L_{A5495}$ | $R^{C31}$ | $R^{E8}$ | $R^{A52}$ |
| $L_{A5496}$ | $R^{C31}$ | $R^{E9}$ | $R^{A52}$ |
| $L_{A5497}$ | $R^{C31}$ | $R^{E10}$ | $R^{A52}$ |
| $L_{A5498}$ | $R^{C31}$ | $R^{E11}$ | $R^{A52}$ |
| $L_{A5499}$ | $R^{C31}$ | $R^{E12}$ | $R^{A52}$ |
| $L_{A5500}$ | $R^{C31}$ | $R^{E13}$ | $R^{A52}$ |
| $L_{A5501}$ | $R^{C31}$ | $R^{E14}$ | $R^{A52}$ |
| $L_{A5502}$ | $R^{C31}$ | $R^{E15}$ | $R^{A52}$ |
| $L_{A5503}$ | $R^{C31}$ | $R^{E16}$ | $R^{A52}$ |
| $L_{A5504}$ | $R^{C31}$ | $R^{E17}$ | $R^{A52}$ |
| $L_{A5505}$ | $R^{C31}$ | $R^{E18}$ | $R^{A52}$ |
| $L_{A5506}$ | $R^{C31}$ | $R^{E19}$ | $R^{A52}$ |
| $L_{A5507}$ | $R^{C31}$ | $R^{E20}$ | $R^{A52}$ |
| $L_{A5508}$ | $R^{C31}$ | $R^{E21}$ | $R^{A52}$ |
| $L_{A5509}$ | $R^{C17}$ | $R^{B3}$ | H |
| $L_{A5510}$ | $R^{C17}$ | $R^{B6}$ | H |
| $L_{A5511}$ | $R^{C17}$ | $R^{B7}$ | H |
| $L_{A5512}$ | $R^{C17}$ | $R^{B12}$ | H |
| $L_{A5513}$ | $R^{C17}$ | $R^{B20}$ | H |
| $L_{A5514}$ | $R^{C17}$ | $R^{B25}$ | H |
| $L_{A5515}$ | $R^{C17}$ | $R^{B29}$ | H |
| $L_{A5516}$ | $R^{C17}$ | $R^{A37}$ | H |
| $L_{A5517}$ | $R^{C17}$ | $R^{A43}$ | H |
| $L_{A5518}$ | $R^{C17}$ | $R^{E1}$ | H |
| $L_{A5519}$ | $R^{C17}$ | $R^{E2}$ | H |
| $L_{A5520}$ | $R^{C17}$ | $R^{E3}$ | H |
| $L_{A5521}$ | $R^{C17}$ | $R^{E4}$ | H |
| $L_{A5522}$ | $R^{C17}$ | $R^{E5}$ | H |
| $L_{A5523}$ | $R^{C17}$ | $R^{E6}$ | H |
| $L_{A5524}$ | $R^{C17}$ | $R^{E7}$ | H |
| $L_{A5525}$ | $R^{C17}$ | $R^{E8}$ | H |
| $L_{A5526}$ | $R^{C17}$ | $R^{E9}$ | H |
| $L_{A5527}$ | $R^{C17}$ | $R^{E10}$ | H |
| $L_{A5528}$ | $R^{C17}$ | $R^{E11}$ | H |
| $L_{A5529}$ | $R^{C17}$ | $R^{E12}$ | H |
| $L_{A5530}$ | $R^{C17}$ | $R^{E13}$ | H |
| $L_{A5531}$ | $R^{C17}$ | $R^{E14}$ | H |
| $L_{A5532}$ | $R^{C17}$ | $R^{E15}$ | H |
| $L_{A5533}$ | $R^{C17}$ | $R^{E16}$ | H |
| $L_{A5534}$ | $R^{C17}$ | $R^{E17}$ | H |
| $L_{A5535}$ | $R^{C17}$ | $R^{E18}$ | H |
| $L_{A5536}$ | $R^{C17}$ | $R^{E19}$ | H |
| $L_{A5537}$ | $R^{C17}$ | $R^{E20}$ | H |
| $L_{A5538}$ | $R^{C17}$ | $R^{E21}$ | H |
| $L_{A5539}$ | $R^{C17}$ | $R^{B3}$ | $R^{B3}$ |
| $L_{A5540}$ | $R^{C17}$ | $R^{B6}$ | $R^{B3}$ |
| $L_{A5541}$ | $R^{C17}$ | $R^{B7}$ | $R^{B3}$ |
| $L_{A5542}$ | $R^{C17}$ | $R^{B12}$ | $R^{B3}$ |
| $L_{A5543}$ | $R^{C17}$ | $R^{B20}$ | $R^{B3}$ |
| $L_{A5544}$ | $R^{C17}$ | $R^{B25}$ | $R^{B3}$ |
| $L_{A5545}$ | $R^{C17}$ | $R^{B29}$ | $R^{B3}$ |
| $L_{A5546}$ | $R^{C17}$ | $R^{A37}$ | $R^{B3}$ |
| $L_{A5547}$ | $R^{C17}$ | $R^{A43}$ | $R^{B3}$ |
| $L_{A5548}$ | $R^{C17}$ | $R^{E1}$ | $R^{B3}$ |

-continued

| Ligand | $R^2$ | $R^3$ | $R^4$ |
|---|---|---|---|
| $L_{A5549}$ | $R^{C17}$ | $R^{E2}$ | $R^{B3}$ |
| $L_{A5550}$ | $R^{C17}$ | $R^{E3}$ | $R^{B3}$ |
| $L_{A5551}$ | $R^{C17}$ | $R^{E4}$ | $R^{B3}$ |
| $L_{A5552}$ | $R^{C17}$ | $R^{E5}$ | $R^{B3}$ |
| $L_{A5553}$ | $R^{C17}$ | $R^{E6}$ | $R^{B3}$ |
| $L_{A5554}$ | $R^{C17}$ | $R^{E7}$ | $R^{B3}$ |
| $L_{A5555}$ | $R^{C17}$ | $R^{E8}$ | $R^{B3}$ |
| $L_{A5556}$ | $R^{C17}$ | $R^{E9}$ | $R^{B3}$ |
| $L_{A5557}$ | $R^{C17}$ | $R^{E10}$ | $R^{B3}$ |
| $L_{A5558}$ | $R^{C17}$ | $R^{E11}$ | $R^{B3}$ |
| $L_{A5559}$ | $R^{C17}$ | $R^{E12}$ | $R^{B3}$ |
| $L_{A5560}$ | $R^{C17}$ | $R^{E13}$ | $R^{B3}$ |
| $L_{A5561}$ | $R^{C17}$ | $R^{E14}$ | $R^{B3}$ |
| $L_{A5562}$ | $R^{C17}$ | $R^{E15}$ | $R^{B3}$ |
| $L_{A5563}$ | $R^{C17}$ | $R^{E16}$ | $R^{B3}$ |
| $L_{A5564}$ | $R^{C17}$ | $R^{E17}$ | $R^{B3}$ |
| $L_{A5565}$ | $R^{C17}$ | $R^{E18}$ | $R^{B3}$ |
| $L_{A5566}$ | $R^{C17}$ | $R^{E19}$ | $R^{B3}$ |
| $L_{A5567}$ | $R^{C17}$ | $R^{E20}$ | $R^{B3}$ |
| $L_{A5568}$ | $R^{C17}$ | $R^{E21}$ | $R^{B3}$ |
| $L_{A5569}$ | $R^{C17}$ | $R^{B3}$ | $R^{B4}$ |
| $L_{A5570}$ | $R^{C17}$ | $R^{B6}$ | $R^{B4}$ |
| $L_{A5571}$ | $R^{C17}$ | $R^{B7}$ | $R^{B4}$ |
| $L_{A5572}$ | $R^{C17}$ | $R^{B12}$ | $R^{B4}$ |
| $L_{A5573}$ | $R^{C17}$ | $R^{B20}$ | $R^{B4}$ |
| $L_{A5574}$ | $R^{C17}$ | $R^{B25}$ | $R^{B4}$ |
| $L_{A5575}$ | $R^{C17}$ | $R^{B29}$ | $R^{B4}$ |
| $L_{A5576}$ | $R^{C17}$ | $R^{A37}$ | $R^{B4}$ |
| $L_{A5577}$ | $R^{C17}$ | $R^{A43}$ | $R^{B4}$ |
| $L_{A5578}$ | $R^{C17}$ | $R^{E1}$ | $R^{B4}$ |
| $L_{A5579}$ | $R^{C17}$ | $R^{E2}$ | $R^{B4}$ |
| $L_{A5580}$ | $R^{C17}$ | $R^{E3}$ | $R^{B4}$ |
| $L_{A5581}$ | $R^{C17}$ | $R^{E4}$ | $R^{B4}$ |
| $L_{A5582}$ | $R^{C17}$ | $R^{E5}$ | $R^{B4}$ |
| $L_{A5583}$ | $R^{C17}$ | $R^{E6}$ | $R^{B4}$ |
| $L_{A5584}$ | $R^{C17}$ | $R^{E7}$ | $R^{B4}$ |
| $L_{A5585}$ | $R^{C17}$ | $R^{E8}$ | $R^{B4}$ |
| $L_{A5586}$ | $R^{C17}$ | $R^{E9}$ | $R^{B4}$ |
| $L_{A5587}$ | $R^{C17}$ | $R^{E10}$ | $R^{B4}$ |
| $L_{A5588}$ | $R^{C17}$ | $R^{E11}$ | $R^{B4}$ |
| $L_{A5589}$ | $R^{C17}$ | $R^{E12}$ | $R^{B4}$ |
| $L_{A5590}$ | $R^{C17}$ | $R^{E13}$ | $R^{B4}$ |
| $L_{A5591}$ | $R^{C17}$ | $R^{E14}$ | $R^{B4}$ |
| $L_{A5592}$ | $R^{C17}$ | $R^{E15}$ | $R^{B4}$ |
| $L_{A5593}$ | $R^{C17}$ | $R^{E16}$ | $R^{B4}$ |
| $L_{A5594}$ | $R^{C17}$ | $R^{E17}$ | $R^{B4}$ |
| $L_{A5595}$ | $R^{C17}$ | $R^{E18}$ | $R^{B4}$ |
| $L_{A5596}$ | $R^{C17}$ | $R^{E19}$ | $R^{B4}$ |
| $L_{A5597}$ | $R^{C17}$ | $R^{E20}$ | $R^{B4}$ |
| $L_{A5598}$ | $R^{C17}$ | $R^{E21}$ | $R^{B4}$ |
| $L_{A5599}$ | $R^{C17}$ | $R^{B3}$ | $R^{B18}$ |
| $L_{A5600}$ | $R^{C17}$ | $R^{B6}$ | $R^{B18}$ |
| $L_{A5601}$ | $R^{C17}$ | $R^{B7}$ | $R^{B18}$ |
| $L_{A5602}$ | $R^{C17}$ | $R^{B12}$ | $R^{B18}$ |
| $L_{A5603}$ | $R^{C17}$ | $R^{B20}$ | $R^{B18}$ |
| $L_{A5604}$ | $R^{C17}$ | $R^{B25}$ | $R^{B18}$ |
| $L_{A5605}$ | $R^{C17}$ | $R^{B29}$ | $R^{B18}$ |
| $L_{A5606}$ | $R^{C17}$ | $R^{A37}$ | $R^{B18}$ |
| $L_{A5607}$ | $R^{C17}$ | $R^{A43}$ | $R^{B18}$ |
| $L_{A5608}$ | $R^{C17}$ | $R^{E1}$ | $R^{B18}$ |
| $L_{A5609}$ | $R^{C17}$ | $R^{E2}$ | $R^{B18}$ |
| $L_{A5610}$ | $R^{C17}$ | $R^{E3}$ | $R^{B18}$ |
| $L_{A5611}$ | $R^{C17}$ | $R^{E4}$ | $R^{B18}$ |
| $L_{A5612}$ | $R^{C17}$ | $R^{E5}$ | $R^{B18}$ |
| $L_{A5613}$ | $R^{C17}$ | $R^{E6}$ | $R^{B18}$ |
| $L_{A5614}$ | $R^{C17}$ | $R^{E7}$ | $R^{B18}$ |
| $L_{A5615}$ | $R^{C17}$ | $R^{E8}$ | $R^{B18}$ |
| $L_{A5616}$ | $R^{C17}$ | $R^{E9}$ | $R^{B18}$ |
| $L_{A5617}$ | $R^{C17}$ | $R^{E10}$ | $R^{B18}$ |
| $L_{A5618}$ | $R^{C17}$ | $R^{E11}$ | $R^{B18}$ |
| $L_{A5619}$ | $R^{C17}$ | $R^{E12}$ | $R^{B18}$ |
| $L_{A5620}$ | $R^{C17}$ | $R^{E13}$ | $R^{B18}$ |
| $L_{A5621}$ | $R^{C17}$ | $R^{E14}$ | $R^{B18}$ |
| $L_{A5622}$ | $R^{C17}$ | $R^{E15}$ | $R^{B18}$ |
| $L_{A5623}$ | $R^{C17}$ | $R^{E16}$ | $R^{B18}$ |
| $L_{A5624}$ | $R^{C17}$ | $R^{E17}$ | $R^{B18}$ |
| $L_{A5625}$ | $R^{C17}$ | $R^{E18}$ | $R^{B18}$ |

-continued

| Ligand | $R^2$ | $R^3$ | $R^4$ |
|---|---|---|---|
| $L_{A5626}$ | $R^{C17}$ | $R^{E19}$ | $R^{B18}$ |
| $L_{A5627}$ | $R^{C17}$ | $R^{E20}$ | $R^{B18}$ |
| $L_{A5628}$ | $R^{C17}$ | $R^{E21}$ | $R^{B18}$ |
| $L_{A5629}$ | $R^{C17}$ | $R^{B3}$ | $R^{A3}$ |
| $L_{A5630}$ | $R^{C17}$ | $R^{B6}$ | $R^{A3}$ |
| $L_{A5631}$ | $R^{C17}$ | $R^{B7}$ | $R^{A3}$ |
| $L_{A5632}$ | $R^{C17}$ | $R^{B12}$ | $R^{A3}$ |
| $L_{A5633}$ | $R^{C17}$ | $R^{B20}$ | $R^{A3}$ |
| $L_{A5634}$ | $R^{C17}$ | $R^{B25}$ | $R^{A3}$ |
| $L_{A5635}$ | $R^{C17}$ | $R^{B29}$ | $R^{A3}$ |
| $L_{A5636}$ | $R^{C17}$ | $R^{A37}$ | $R^{A3}$ |
| $L_{A5637}$ | $R^{C17}$ | $R^{A43}$ | $R^{A3}$ |
| $L_{A5638}$ | $R^{C17}$ | $R^{E1}$ | $R^{A3}$ |
| $L_{A5639}$ | $R^{C17}$ | $R^{E2}$ | $R^{A3}$ |
| $L_{A5640}$ | $R^{C17}$ | $R^{E3}$ | $R^{A3}$ |
| $L_{A5641}$ | $R^{C17}$ | $R^{E4}$ | $R^{A3}$ |
| $L_{A5642}$ | $R^{C17}$ | $R^{E5}$ | $R^{A3}$ |
| $L_{A5643}$ | $R^{C17}$ | $R^{E6}$ | $R^{A3}$ |
| $L_{A5644}$ | $R^{C17}$ | $R^{E7}$ | $R^{A3}$ |
| $L_{A5645}$ | $R^{C17}$ | $R^{E8}$ | $R^{A3}$ |
| $L_{A5646}$ | $R^{C17}$ | $R^{E9}$ | $R^{A3}$ |
| $L_{A5647}$ | $R^{C17}$ | $R^{E10}$ | $R^{A3}$ |
| $L_{A5648}$ | $R^{C17}$ | $R^{E11}$ | $R^{A3}$ |
| $L_{A5649}$ | $R^{C17}$ | $R^{E12}$ | $R^{A3}$ |
| $L_{A5650}$ | $R^{C17}$ | $R^{E13}$ | $R^{A3}$ |
| $L_{A5651}$ | $R^{C17}$ | $R^{E14}$ | $R^{A3}$ |
| $L_{A5652}$ | $R^{C17}$ | $R^{E15}$ | $R^{A3}$ |
| $L_{A5653}$ | $R^{C17}$ | $R^{E16}$ | $R^{A3}$ |
| $L_{A5654}$ | $R^{C17}$ | $R^{E17}$ | $R^{A3}$ |
| $L_{A5655}$ | $R^{C17}$ | $R^{E18}$ | $R^{A3}$ |
| $L_{A5656}$ | $R^{C17}$ | $R^{E19}$ | $R^{A3}$ |
| $L_{A5657}$ | $R^{C17}$ | $R^{E20}$ | $R^{A3}$ |
| $L_{A5658}$ | $R^{C17}$ | $R^{E21}$ | $R^{A3}$ |
| $L_{A5659}$ | $R^{C17}$ | $R^{B3}$ | $R^{A34}$ |
| $L_{A5660}$ | $R^{C17}$ | $R^{B6}$ | $R^{A34}$ |
| $L_{A5661}$ | $R^{C17}$ | $R^{B7}$ | $R^{A34}$ |
| $L_{A5662}$ | $R^{C17}$ | $R^{B12}$ | $R^{A34}$ |
| $L_{A5663}$ | $R^{C17}$ | $R^{B20}$ | $R^{A34}$ |
| $L_{A5664}$ | $R^{C17}$ | $R^{B25}$ | $R^{A34}$ |
| $L_{A5665}$ | $R^{C17}$ | $R^{B29}$ | $R^{A34}$ |
| $L_{A5666}$ | $R^{C17}$ | $R^{A37}$ | $R^{A34}$ |
| $L_{A5667}$ | $R^{C17}$ | $R^{A43}$ | $R^{A34}$ |
| $L_{A5668}$ | $R^{C17}$ | $R^{E1}$ | $R^{A34}$ |
| $L_{A5669}$ | $R^{C17}$ | $R^{E2}$ | $R^{A34}$ |
| $L_{A5670}$ | $R^{C17}$ | $R^{E3}$ | $R^{A34}$ |
| $L_{A5671}$ | $R^{C17}$ | $R^{E4}$ | $R^{A34}$ |
| $L_{A5672}$ | $R^{C17}$ | $R^{E5}$ | $R^{A34}$ |
| $L_{A5673}$ | $R^{C17}$ | $R^{E6}$ | $R^{A34}$ |
| $L_{A5674}$ | $R^{C17}$ | $R^{E7}$ | $R^{A34}$ |
| $L_{A5675}$ | $R^{C17}$ | $R^{E8}$ | $R^{A34}$ |
| $L_{A5676}$ | $R^{C17}$ | $R^{E9}$ | $R^{A34}$ |
| $L_{A5677}$ | $R^{C17}$ | $R^{E10}$ | $R^{A34}$ |
| $L_{A5678}$ | $R^{C17}$ | $R^{E11}$ | $R^{A34}$ |
| $L_{A5679}$ | $R^{C17}$ | $R^{E12}$ | $R^{A34}$ |
| $L_{A5680}$ | $R^{C17}$ | $R^{E13}$ | $R^{A34}$ |
| $L_{A5681}$ | $R^{C17}$ | $R^{E14}$ | $R^{A34}$ |
| $L_{A5682}$ | $R^{C17}$ | $R^{E15}$ | $R^{A34}$ |
| $L_{A5683}$ | $R^{C17}$ | $R^{E16}$ | $R^{A34}$ |
| $L_{A5684}$ | $R^{C17}$ | $R^{E17}$ | $R^{A34}$ |
| $L_{A5685}$ | $R^{C17}$ | $R^{E18}$ | $R^{A34}$ |
| $L_{A5686}$ | $R^{C17}$ | $R^{E19}$ | $R^{A34}$ |
| $L_{A5687}$ | $R^{C17}$ | $R^{E20}$ | $R^{A34}$ |
| $L_{A5688}$ | $R^{C17}$ | $R^{E21}$ | $R^{A34}$ |
| $L_{A5689}$ | $R^{C17}$ | $R^{B3}$ | $R^{A52}$ |
| $L_{A5690}$ | $R^{C17}$ | $R^{B6}$ | $R^{A52}$ |
| $L_{A5691}$ | $R^{C17}$ | $R^{B7}$ | $R^{A52}$ |
| $L_{A5692}$ | $R^{C17}$ | $R^{B12}$ | $R^{A52}$ |
| $L_{A5693}$ | $R^{C17}$ | $R^{B20}$ | $R^{A52}$ |
| $L_{A5694}$ | $R^{C17}$ | $R^{B25}$ | $R^{A52}$ |
| $L_{A5695}$ | $R^{C17}$ | $R^{B29}$ | $R^{A52}$ |
| $L_{A5696}$ | $R^{C17}$ | $R^{A37}$ | $R^{A52}$ |
| $L_{A5697}$ | $R^{C17}$ | $R^{A43}$ | $R^{A52}$ |
| $L_{A5698}$ | $R^{C17}$ | $R^{E1}$ | $R^{A52}$ |
| $L_{A5699}$ | $R^{C17}$ | $R^{E2}$ | $R^{A52}$ |
| $L_{A5700}$ | $R^{C17}$ | $R^{E3}$ | $R^{A52}$ |
| $L_{A5701}$ | $R^{C17}$ | $R^{E4}$ | $R^{A52}$ |
| $L_{A5702}$ | $R^{C17}$ | $R^{E5}$ | $R^{A52}$ |

-continued

| Ligand | $R^2$ | $R^3$ | $R^4$ |
|---|---|---|---|
| $L_{A5703}$ | $R^{C17}$ | $R^{E6}$ | $R^{A52}$ |
| $L_{A5704}$ | $R^{C17}$ | $R^{E7}$ | $R^{A52}$ |
| $L_{A5705}$ | $R^{C17}$ | $R^{E8}$ | $R^{A52}$ |
| $L_{A5706}$ | $R^{C17}$ | $R^{E9}$ | $R^{A52}$ |
| $L_{A5707}$ | $R^{C17}$ | $R^{E10}$ | $R^{A52}$ |
| $L_{A5708}$ | $R^{C17}$ | $R^{E11}$ | $R^{A52}$ |
| $L_{A5709}$ | $R^{C17}$ | $R^{E12}$ | $R^{A52}$ |
| $L_{A5710}$ | $R^{C17}$ | $R^{E13}$ | $R^{A52}$ |
| $L_{A5711}$ | $R^{C17}$ | $R^{E14}$ | $R^{A52}$ |
| $L_{A5712}$ | $R^{C17}$ | $R^{E15}$ | $R^{A52}$ |
| $L_{A5713}$ | $R^{C17}$ | $R^{E16}$ | $R^{A52}$ |
| $L_{A5714}$ | $R^{C17}$ | $R^{E17}$ | $R^{A52}$ |
| $L_{A5715}$ | $R^{C17}$ | $R^{E18}$ | $R^{A52}$ |
| $L_{A5716}$ | $R^{C17}$ | $R^{E19}$ | $R^{A52}$ |
| $L_{A5717}$ | $R^{C17}$ | $R^{E20}$ | $R^{A52}$ |
| $L_{A5718}$ | $R^{C17}$ | $R^{E21}$ | $R^{A52}$ |
| $L_{A5719}$ | $R^{C19}$ | $R^{B3}$ | H |
| $L_{A5720}$ | $R^{C19}$ | $R^{B6}$ | H |
| $L_{A5721}$ | $R^{C19}$ | $R^{B7}$ | H |
| $L_{A5722}$ | $R^{C19}$ | $R^{B12}$ | H |
| $L_{A5723}$ | $R^{C19}$ | $R^{B20}$ | H |
| $L_{A5724}$ | $R^{C19}$ | $R^{B25}$ | H |
| $L_{A5725}$ | $R^{C19}$ | $R^{B29}$ | H |
| $L_{A5726}$ | $R^{C19}$ | $R^{A37}$ | H |
| $L_{A5727}$ | $R^{C19}$ | $R^{A43}$ | H |
| $L_{A5728}$ | $R^{C19}$ | $R^{E1}$ | H |
| $L_{A5729}$ | $R^{C19}$ | $R^{E2}$ | H |
| $L_{A5730}$ | $R^{C19}$ | $R^{E3}$ | H |
| $L_{A5731}$ | $R^{C19}$ | $R^{E4}$ | H |
| $L_{A5732}$ | $R^{C19}$ | $R^{E5}$ | H |
| $L_{A5733}$ | $R^{C19}$ | $R^{E6}$ | H |
| $L_{A5734}$ | $R^{C19}$ | $R^{E7}$ | H |
| $L_{A5735}$ | $R^{C19}$ | $R^{E8}$ | H |
| $L_{A5736}$ | $R^{C19}$ | $R^{E9}$ | H |
| $L_{A5737}$ | $R^{C19}$ | $R^{E10}$ | H |
| $L_{A5738}$ | $R^{C19}$ | $R^{E11}$ | H |
| $L_{A5739}$ | $R^{C19}$ | $R^{E12}$ | H |
| $L_{A5740}$ | $R^{C19}$ | $R^{E13}$ | H |
| $L_{A5741}$ | $R^{C19}$ | $R^{E14}$ | H |
| $L_{A5742}$ | $R^{C19}$ | $R^{E15}$ | H |
| $L_{A5743}$ | $R^{C19}$ | $R^{E16}$ | H |
| $L_{A5744}$ | $R^{C19}$ | $R^{E17}$ | H |
| $L_{A5745}$ | $R^{C19}$ | $R^{E18}$ | H |
| $L_{A5746}$ | $R^{C19}$ | $R^{E19}$ | H |
| $L_{A5747}$ | $R^{C19}$ | $R^{E20}$ | H |
| $L_{A5748}$ | $R^{C19}$ | $R^{E21}$ | H |
| $L_{A5749}$ | $R^{C19}$ | $R^{B3}$ | $R^{B3}$ |
| $L_{A5750}$ | $R^{C19}$ | $R^{B6}$ | $R^{B3}$ |
| $L_{A5751}$ | $R^{C19}$ | $R^{B7}$ | $R^{B3}$ |
| $L_{A5752}$ | $R^{C19}$ | $R^{B12}$ | $R^{B3}$ |
| $L_{A5753}$ | $R^{C19}$ | $R^{B20}$ | $R^{B3}$ |
| $L_{A5754}$ | $R^{C19}$ | $R^{B25}$ | $R^{B3}$ |
| $L_{A5755}$ | $R^{C19}$ | $R^{B29}$ | $R^{B3}$ |
| $L_{A5756}$ | $R^{C19}$ | $R^{A37}$ | $R^{B3}$ |
| $L_{A5757}$ | $R^{C19}$ | $R^{A43}$ | $R^{B3}$ |
| $L_{A5758}$ | $R^{C19}$ | $R^{E1}$ | $R^{B3}$ |
| $L_{A5759}$ | $R^{C19}$ | $R^{E2}$ | $R^{B3}$ |
| $L_{A5760}$ | $R^{C19}$ | $R^{E3}$ | $R^{B3}$ |
| $L_{A5761}$ | $R^{C19}$ | $R^{E4}$ | $R^{B3}$ |
| $L_{A5762}$ | $R^{C19}$ | $R^{E5}$ | $R^{B3}$ |
| $L_{A5763}$ | $R^{C19}$ | $R^{E6}$ | $R^{B3}$ |
| $L_{A5764}$ | $R^{C19}$ | $R^{E7}$ | $R^{B3}$ |
| $L_{A5765}$ | $R^{C19}$ | $R^{E8}$ | $R^{B3}$ |
| $L_{A5766}$ | $R^{C19}$ | $R^{E9}$ | $R^{B3}$ |
| $L_{A5767}$ | $R^{C19}$ | $R^{E10}$ | $R^{B3}$ |
| $L_{A5768}$ | $R^{C19}$ | $R^{E11}$ | $R^{B3}$ |
| $L_{A5769}$ | $R^{C19}$ | $R^{E12}$ | $R^{B3}$ |
| $L_{A5770}$ | $R^{C19}$ | $R^{E13}$ | $R^{B3}$ |
| $L_{A5771}$ | $R^{C19}$ | $R^{E14}$ | $R^{B3}$ |
| $L_{A5772}$ | $R^{C19}$ | $R^{E15}$ | $R^{B3}$ |
| $L_{A5773}$ | $R^{C19}$ | $R^{E16}$ | $R^{B3}$ |
| $L_{A5774}$ | $R^{C19}$ | $R^{E17}$ | $R^{B3}$ |
| $L_{A5775}$ | $R^{C19}$ | $R^{E18}$ | $R^{B3}$ |
| $L_{A5776}$ | $R^{C19}$ | $R^{E19}$ | $R^{B3}$ |
| $L_{A5777}$ | $R^{C19}$ | $R^{E20}$ | $R^{B3}$ |
| $L_{A5778}$ | $R^{C19}$ | $R^{E21}$ | $R^{B3}$ |
| $L_{A5779}$ | $R^{C19}$ | $R^{B3}$ | $R^{B4}$ |

-continued

| Ligand | $R^2$ | $R^3$ | $R^4$ |
|---|---|---|---|
| $L_{A5780}$ | $R^{C19}$ | $R^{B6}$ | $R^{B4}$ |
| $L_{A5781}$ | $R^{C19}$ | $R^{B7}$ | $R^{B4}$ |
| $L_{A5782}$ | $R^{C19}$ | $R^{B12}$ | $R^{B4}$ |
| $L_{A5783}$ | $R^{C19}$ | $R^{B20}$ | $R^{B4}$ |
| $L_{A5784}$ | $R^{C19}$ | $R^{B25}$ | $R^{B4}$ |
| $L_{A5785}$ | $R^{C19}$ | $R^{B29}$ | $R^{B4}$ |
| $L_{A5786}$ | $R^{C19}$ | $R^{A37}$ | $R^{B4}$ |
| $L_{A5787}$ | $R^{C19}$ | $R^{A43}$ | $R^{B4}$ |
| $L_{A5788}$ | $R^{C19}$ | $R^{E1}$ | $R^{B4}$ |
| $L_{A5789}$ | $R^{C19}$ | $R^{E2}$ | $R^{B4}$ |
| $L_{A5790}$ | $R^{C19}$ | $R^{E3}$ | $R^{B4}$ |
| $L_{A5791}$ | $R^{C19}$ | $R^{E4}$ | $R^{B4}$ |
| $L_{A5792}$ | $R^{C19}$ | $R^{E5}$ | $R^{B4}$ |
| $L_{A5793}$ | $R^{C19}$ | $R^{E6}$ | $R^{B4}$ |
| $L_{A5794}$ | $R^{C19}$ | $R^{E7}$ | $R^{B4}$ |
| $L_{A5795}$ | $R^{C19}$ | $R^{E8}$ | $R^{B4}$ |
| $L_{A5796}$ | $R^{C19}$ | $R^{E9}$ | $R^{B4}$ |
| $L_{A5797}$ | $R^{C19}$ | $R^{E10}$ | $R^{B4}$ |
| $L_{A5798}$ | $R^{C19}$ | $R^{E11}$ | $R^{B4}$ |
| $L_{A5799}$ | $R^{C19}$ | $R^{E12}$ | $R^{B4}$ |
| $L_{A5800}$ | $R^{C19}$ | $R^{E13}$ | $R^{B4}$ |
| $L_{A5801}$ | $R^{C19}$ | $R^{E14}$ | $R^{B4}$ |
| $L_{A5802}$ | $R^{C19}$ | $R^{E15}$ | $R^{B4}$ |
| $L_{A5803}$ | $R^{C19}$ | $R^{E16}$ | $R^{B4}$ |
| $L_{A5804}$ | $R^{C19}$ | $R^{E17}$ | $R^{B4}$ |
| $L_{A5805}$ | $R^{C19}$ | $R^{E18}$ | $R^{B4}$ |
| $L_{A5806}$ | $R^{C19}$ | $R^{E19}$ | $R^{B4}$ |
| $L_{A5807}$ | $R^{C19}$ | $R^{E20}$ | $R^{B4}$ |
| $L_{A5808}$ | $R^{C19}$ | $R^{E21}$ | $R^{B4}$ |
| $L_{A5809}$ | $R^{C19}$ | $R^{B3}$ | $R^{B18}$ |
| $L_{A5810}$ | $R^{C19}$ | $R^{B6}$ | $R^{B18}$ |
| $L_{A5811}$ | $R^{C19}$ | $R^{B7}$ | $R^{B18}$ |
| $L_{A5812}$ | $R^{C19}$ | $R^{B12}$ | $R^{B18}$ |
| $L_{A5813}$ | $R^{C19}$ | $R^{B20}$ | $R^{B18}$ |
| $L_{A5814}$ | $R^{C19}$ | $R^{B25}$ | $R^{B18}$ |
| $L_{A5815}$ | $R^{C19}$ | $R^{B29}$ | $R^{B18}$ |
| $L_{A5816}$ | $R^{C19}$ | $R^{A37}$ | $R^{B18}$ |
| $L_{A5817}$ | $R^{C19}$ | $R^{A43}$ | $R^{B18}$ |
| $L_{A5818}$ | $R^{C19}$ | $R^{E1}$ | $R^{B18}$ |
| $L_{A5819}$ | $R^{C19}$ | $R^{E2}$ | $R^{B18}$ |
| $L_{A5820}$ | $R^{C19}$ | $R^{E3}$ | $R^{B18}$ |
| $L_{A5821}$ | $R^{C19}$ | $R^{E4}$ | $R^{B18}$ |
| $L_{A5822}$ | $R^{C19}$ | $R^{E5}$ | $R^{B18}$ |
| $L_{A5823}$ | $R^{C19}$ | $R^{E6}$ | $R^{B18}$ |
| $L_{A5824}$ | $R^{C19}$ | $R^{E7}$ | $R^{B18}$ |
| $L_{A5825}$ | $R^{C19}$ | $R^{E8}$ | $R^{B18}$ |
| $L_{A5826}$ | $R^{C19}$ | $R^{E9}$ | $R^{B18}$ |
| $L_{A5827}$ | $R^{C19}$ | $R^{E10}$ | $R^{B18}$ |
| $L_{A5828}$ | $R^{C19}$ | $R^{E11}$ | $R^{B18}$ |
| $L_{A5829}$ | $R^{C19}$ | $R^{E12}$ | $R^{B18}$ |
| $L_{A5830}$ | $R^{C19}$ | $R^{E13}$ | $R^{B18}$ |
| $L_{A5831}$ | $R^{C19}$ | $R^{E14}$ | $R^{B18}$ |
| $L_{A5832}$ | $R^{C19}$ | $R^{E15}$ | $R^{B18}$ |
| $L_{A5833}$ | $R^{C19}$ | $R^{E16}$ | $R^{B18}$ |
| $L_{A5834}$ | $R^{C19}$ | $R^{E17}$ | $R^{B18}$ |
| $L_{A5835}$ | $R^{C19}$ | $R^{E18}$ | $R^{B18}$ |
| $L_{A5836}$ | $R^{C19}$ | $R^{E19}$ | $R^{B18}$ |
| $L_{A5837}$ | $R^{C19}$ | $R^{E20}$ | $R^{B18}$ |
| $L_{A5838}$ | $R^{C19}$ | $R^{E21}$ | $R^{B18}$ |
| $L_{A5839}$ | $R^{C19}$ | $R^{B3}$ | $R^{A3}$ |
| $L_{A5840}$ | $R^{C19}$ | $R^{B6}$ | $R^{A3}$ |
| $L_{A5841}$ | $R^{C19}$ | $R^{B7}$ | $R^{A3}$ |
| $L_{A5842}$ | $R^{C19}$ | $R^{B12}$ | $R^{A3}$ |
| $L_{A5843}$ | $R^{C19}$ | $R^{B20}$ | $R^{A3}$ |
| $L_{A5844}$ | $R^{C19}$ | $R^{B25}$ | $R^{A3}$ |
| $L_{A5845}$ | $R^{C19}$ | $R^{B29}$ | $R^{A3}$ |
| $L_{A5846}$ | $R^{C19}$ | $R^{A37}$ | $R^{A3}$ |
| $L_{A5847}$ | $R^{C19}$ | $R^{A43}$ | $R^{A3}$ |
| $L_{A5848}$ | $R^{C19}$ | $R^{E1}$ | $R^{A3}$ |
| $L_{A5849}$ | $R^{C19}$ | $R^{E2}$ | $R^{A3}$ |
| $L_{A5850}$ | $R^{C19}$ | $R^{E3}$ | $R^{A3}$ |
| $L_{A5851}$ | $R^{C19}$ | $R^{E4}$ | $R^{A3}$ |
| $L_{A5852}$ | $R^{C19}$ | $R^{E5}$ | $R^{A3}$ |
| $L_{A5853}$ | $R^{C19}$ | $R^{E6}$ | $R^{A3}$ |
| $L_{A5854}$ | $R^{C19}$ | $R^{E7}$ | $R^{A3}$ |
| $L_{A5855}$ | $R^{C19}$ | $R^{E8}$ | $R^{A3}$ |
| $L_{A5856}$ | $R^{C19}$ | $R^{E9}$ | $R^{A3}$ |

-continued

| Ligand | $R^2$ | $R^3$ | $R^4$ |
|---|---|---|---|
| $L_{A45857}$ | $R^{C19}$ | $R^{E10}$ | $R^{A43}$ |
| $L_{A45858}$ | $R^{C19}$ | $R^{E11}$ | $R^{A43}$ |
| $L_{A45859}$ | $R^{C19}$ | $R^{E12}$ | $R^{A43}$ |
| $L_{A45860}$ | $R^{C19}$ | $R^{E13}$ | $R^{A43}$ |
| $L_{A45861}$ | $R^{C19}$ | $R^{E14}$ | $R^{A43}$ |
| $L_{A45862}$ | $R^{C19}$ | $R^{E15}$ | $R^{A43}$ |
| $L_{A45863}$ | $R^{C19}$ | $R^{E16}$ | $R^{A43}$ |
| $L_{A45864}$ | $R^{C19}$ | $R^{E17}$ | $R^{A43}$ |
| $L_{A45865}$ | $R^{C19}$ | $R^{E18}$ | $R^{A43}$ |
| $L_{A45866}$ | $R^{C19}$ | $R^{E19}$ | $R^{A43}$ |
| $L_{A45867}$ | $R^{C19}$ | $R^{E20}$ | $R^{A43}$ |
| $L_{A45868}$ | $R^{C19}$ | $R^{E21}$ | $R^{A43}$ |
| $L_{A45869}$ | $R^{C19}$ | $R^{B3}$ | $R^{A34}$ |
| $L_{A45870}$ | $R^{C19}$ | $R^{B6}$ | $R^{A34}$ |
| $L_{A45871}$ | $R^{C19}$ | $R^{B7}$ | $R^{A34}$ |
| $L_{A45872}$ | $R^{C19}$ | $R^{B12}$ | $R^{A34}$ |
| $L_{A45873}$ | $R^{C19}$ | $R^{B2}0$ | $R^{A34}$ |
| $L_{A45874}$ | $R^{C19}$ | $R^{B25}$ | $R^{A34}$ |
| $L_{A45875}$ | $R^{C19}$ | $R^{B29}$ | $R^{A34}$ |
| $L_{A45876}$ | $R^{C19}$ | $R^{A37}$ | $R^{A34}$ |
| $L_{A45877}$ | $R^{C19}$ | $R^{A43}$ | $R^{A34}$ |
| $L_{A45878}$ | $R^{C19}$ | $R^{E1}$ | $R^{A34}$ |
| $L_{A45879}$ | $R^{C19}$ | $R^{E2}$ | $R^{A34}$ |
| $L_{A45880}$ | $R^{C19}$ | $R^{E3}$ | $R^{A34}$ |
| $L_{A45881}$ | $R^{C19}$ | $R^{E4}$ | $R^{A34}$ |
| $L_{A45882}$ | $R^{C19}$ | $R^{E5}$ | $R^{A34}$ |
| $L_{A45883}$ | $R^{C19}$ | $R^{E6}$ | $R^{A34}$ |
| $L_{A45884}$ | $R^{C19}$ | $R^{E7}$ | $R^{A34}$ |
| $L_{A45885}$ | $R^{C19}$ | $R^{E8}$ | $R^{A34}$ |
| $L_{A45886}$ | $R^{C19}$ | $R^{E9}$ | $R^{A34}$ |
| $L_{A45887}$ | $R^{C19}$ | $R^{E10}$ | $R^{A34}$ |
| $L_{A45888}$ | $R^{C19}$ | $R^{E11}$ | $R^{A34}$ |
| $L_{A45889}$ | $R^{C19}$ | $R^{E12}$ | $R^{A34}$ |
| $L_{A45890}$ | $R^{C19}$ | $R^{E13}$ | $R^{A34}$ |
| $L_{A45891}$ | $R^{C19}$ | $R^{E14}$ | $R^{A34}$ |
| $L_{A45892}$ | $R^{C19}$ | $R^{E15}$ | $R^{A34}$ |
| $L_{A45893}$ | $R^{C19}$ | $R^{E16}$ | $R^{A34}$ |
| $L_{A45894}$ | $R^{C19}$ | $R^{E17}$ | $R^{A34}$ |
| $L_{A45895}$ | $R^{C19}$ | $R^{E18}$ | $R^{A34}$ |
| $L_{A45896}$ | $R^{C19}$ | $R^{E19}$ | $R^{A34}$ |
| $L_{A45897}$ | $R^{C19}$ | $R^{E20}$ | $R^{A34}$ |
| $L_{A45898}$ | $R^{C19}$ | $R^{E21}$ | $R^{A34}$ |
| $L_{A45899}$ | $R^{C19}$ | $R^{B3}$ | $R^{A52}$ |
| $L_{A45900}$ | $R^{C19}$ | $R^{B6}$ | $R^{A52}$ |
| $L_{A45901}$ | $R^{C19}$ | $R^{B7}$ | $R^{A52}$ |
| $L_{A45902}$ | $R^{C19}$ | $R^{B12}$ | $R^{A52}$ |
| $L_{A45903}$ | $R^{C19}$ | $R^{B20}$ | $R^{A52}$ |
| $L_{A45904}$ | $R^{C19}$ | $R^{B25}$ | $R^{A52}$ |
| $L_{A45905}$ | $R^{C19}$ | $R^{B29}$ | $R^{A52}$ |
| $L_{A45906}$ | $R^{C19}$ | $R^{A37}$ | $R^{A52}$ |
| $L_{A45907}$ | $R^{C19}$ | $R^{A43}$ | $R^{A52}$ |
| $L_{A45908}$ | $R^{C19}$ | $R^{E1}$ | $R^{A52}$ |
| $L_{A45909}$ | $R^{C19}$ | $R^{E2}$ | $R^{A52}$ |
| $L_{A45910}$ | $R^{C19}$ | $R^{E3}$ | $R^{A52}$ |
| $L_{A45911}$ | $R^{C19}$ | $R^{E4}$ | $R^{A52}$ |
| $L_{A45912}$ | $R^{C19}$ | $R^{E5}$ | $R^{A52}$ |
| $L_{A45913}$ | $R^{C19}$ | $R^{E6}$ | $R^{A52}$ |
| $L_{A45914}$ | $R^{C19}$ | $R^{E7}$ | $R^{A52}$ |
| $L_{A45915}$ | $R^{C19}$ | $R^{E8}$ | $R^{A52}$ |
| $L_{A45916}$ | $R^{C19}$ | $R^{E9}$ | $R^{A52}$ |
| $L_{A45917}$ | $R^{C19}$ | $R^{E10}$ | $R^{A52}$ |
| $L_{A45918}$ | $R^{C19}$ | $R^{E11}$ | $R^{A52}$ |
| $L_{A45919}$ | $R^{C19}$ | $R^{E12}$ | $R^{A52}$ |
| $L_{A45920}$ | $R^{C19}$ | $R^{E13}$ | $R^{A52}$ |
| $L_{A45921}$ | $R^{C19}$ | $R^{E14}$ | $R^{A52}$ |
| $L_{A45922}$ | $R^{C19}$ | $R^{E15}$ | $R^{A52}$ |
| $L_{A45923}$ | $R^{C19}$ | $R^{E16}$ | $R^{A52}$ |
| $L_{A45924}$ | $R^{C19}$ | $R^{E17}$ | $R^{A52}$ |
| $L_{A45925}$ | $R^{C19}$ | $R^{E18}$ | $R^{A52}$ |
| $L_{A45926}$ | $R^{C19}$ | $R^{E19}$ | $R^{A52}$ |
| $L_{A45927}$ | $R^{C19}$ | $R^{E20}$ | $R^{A52}$ |
| $L_{A45928}$ | $R^{C19}$ | $R^{E21}$ | $R^{A52}$ |
| $L_{A45929}$ | $R^{C30}$ | $R^{B3}$ | H |
| $L_{A45930}$ | $R^{C30}$ | $R^{B6}$ | H |
| $L_{A45931}$ | $R^{C30}$ | $R^{B7}$ | H |
| $L_{A45932}$ | $R^{C30}$ | $R^{B12}$ | H |
| $L_{A45933}$ | $R^{C30}$ | $R^{B20}$ | H |

-continued

| Ligand | $R^2$ | $R^3$ | $R^4$ |
|---|---|---|---|
| $L_{A45934}$ | $R^{C30}$ | $R^{B25}$ | H |
| $L_{A45935}$ | $R^{C30}$ | $R^{B29}$ | H |
| $L_{A45936}$ | $R^{C30}$ | $R^{A37}$ | H |
| $L_{A45937}$ | $R^{C30}$ | $R^{A43}$ | H |
| $L_{A45938}$ | $R^{C30}$ | $R^{E1}$ | H |
| $L_{A45939}$ | $R^{C30}$ | $R^{E2}$ | H |
| $L_{A45940}$ | $R^{C30}$ | $R^{E3}$ | H |
| $L_{A45941}$ | $R^{C30}$ | $R^{E4}$ | H |
| $L_{A45942}$ | $R^{C30}$ | $R^{E5}$ | H |
| $L_{A45943}$ | $R^{C30}$ | $R^{E6}$ | H |
| $L_{A45944}$ | $R^{C30}$ | $R^{E7}$ | H |
| $L_{A45945}$ | $R^{C30}$ | $R^{E8}$ | H |
| $L_{A45946}$ | $R^{C30}$ | $R^{E9}$ | H |
| $L_{A45947}$ | $R^{C30}$ | $R^{E10}$ | H |
| $L_{A45948}$ | $R^{C30}$ | $R^{E11}$ | H |
| $L_{A45949}$ | $R^{C30}$ | $R^{E12}$ | H |
| $L_{A45950}$ | $R^{C30}$ | $R^{E13}$ | H |
| $L_{A45951}$ | $R^{C30}$ | $R^{E14}$ | H |
| $L_{A45952}$ | $R^{C30}$ | $R^{E15}$ | H |
| $L_{A45953}$ | $R^{C30}$ | $R^{E16}$ | H |
| $L_{A45954}$ | $R^{C30}$ | $R^{E17}$ | H |
| $L_{A45955}$ | $R^{C30}$ | $R^{E18}$ | H |
| $L_{A45956}$ | $R^{C30}$ | $R^{E19}$ | H |
| $L_{A45957}$ | $R^{C30}$ | $R^{E20}$ | H |
| $L_{A45958}$ | $R^{C30}$ | $R^{E21}$ | H |
| $L_{A45959}$ | $R^{C30}$ | $R^{B3}$ | $R^{B3}$ |
| $L_{A45960}$ | $R^{C30}$ | $R^{B6}$ | $R^{B3}$ |
| $L_{A45961}$ | $R^{C30}$ | $R^{B7}$ | $R^{B3}$ |
| $L_{A45962}$ | $R^{C30}$ | $R^{B12}$ | $R^{B3}$ |
| $L_{A45963}$ | $R^{C30}$ | $R^{B20}$ | $R^{B3}$ |
| $L_{A45964}$ | $R^{C30}$ | $R^{B25}$ | $R^{B3}$ |
| $L_{A45965}$ | $R^{C30}$ | $R^{B29}$ | $R^{B3}$ |
| $L_{A45966}$ | $R^{C30}$ | $R^{A37}$ | $R^{B3}$ |
| $L_{A45967}$ | $R^{C30}$ | $R^{A43}$ | $R^{B3}$ |
| $L_{A45968}$ | $R^{C30}$ | $R^{E1}$ | $R^{B3}$ |
| $L_{A45969}$ | $R^{C30}$ | $R^{E2}$ | $R^{B3}$ |
| $L_{A45970}$ | $R^{C30}$ | $R^{E3}$ | $R^{B3}$ |
| $L_{A45971}$ | $R^{C30}$ | $R^{E4}$ | $R^{B3}$ |
| $L_{A45972}$ | $R^{C30}$ | $R^{E5}$ | $R^{B3}$ |
| $L_{A45973}$ | $R^{C30}$ | $R^{E6}$ | $R^{B3}$ |
| $L_{A45974}$ | $R^{C30}$ | $R^{E7}$ | $R^{B3}$ |
| $L_{A45975}$ | $R^{C30}$ | $R^{E8}$ | $R^{B3}$ |
| $L_{A45976}$ | $R^{C30}$ | $R^{E9}$ | $R^{B3}$ |
| $L_{A45977}$ | $R^{C30}$ | $R^{E10}$ | $R^{B3}$ |
| $L_{A45978}$ | $R^{C30}$ | $R^{E11}$ | $R^{B3}$ |
| $L_{A45979}$ | $R^{C30}$ | $R^{E12}$ | $R^{B3}$ |
| $L_{A45980}$ | $R^{C30}$ | $R^{E13}$ | $R^{B3}$ |
| $L_{A45981}$ | $R^{C30}$ | $R^{E14}$ | $R^{B3}$ |
| $L_{A45982}$ | $R^{C30}$ | $R^{E15}$ | $R^{B3}$ |
| $L_{A45983}$ | $R^{C30}$ | $R^{E16}$ | $R^{B3}$ |
| $L_{A45984}$ | $R^{C30}$ | $R^{E17}$ | $R^{B3}$ |
| $L_{A45985}$ | $R^{C30}$ | $R^{E18}$ | $R^{B3}$ |
| $L_{A45986}$ | $R^{C30}$ | $R^{E19}$ | $R^{B3}$ |
| $L_{A45987}$ | $R^{C30}$ | $R^{E20}$ | $R^{B3}$ |
| $L_{A45988}$ | $R^{C30}$ | $R^{E21}$ | $R^{B3}$ |
| $L_{A45989}$ | $R^{C30}$ | $R^{B3}$ | $R^{B4}$ |
| $L_{A45990}$ | $R^{C30}$ | $R^{B6}$ | $R^{B4}$ |
| $L_{A45991}$ | $R^{C30}$ | $R^{B7}$ | $R^{B4}$ |
| $L_{A45992}$ | $R^{C30}$ | $R^{B12}$ | $R^{B4}$ |
| $L_{A45993}$ | $R^{C30}$ | $R^{B20}$ | $R^{B4}$ |
| $L_{A45994}$ | $R^{C30}$ | $R^{B25}$ | $R^{B4}$ |
| $L_{A45995}$ | $R^{C30}$ | $R^{B29}$ | $R^{B4}$ |
| $L_{A45996}$ | $R^{C30}$ | $R^{A37}$ | $R^{B4}$ |
| $L_{A45997}$ | $R^{C30}$ | $R^{A43}$ | $R^{B4}$ |
| $L_{A45998}$ | $R^{C30}$ | $R^{E1}$ | $R^{B4}$ |
| $L_{A45999}$ | $R^{C30}$ | $R^{E2}$ | $R^{B4}$ |
| $L_{A46000}$ | $R^{C30}$ | $R^{E3}$ | $R^{B4}$ |
| $L_{A46001}$ | $R^{C30}$ | $R^{E4}$ | $R^{B4}$ |
| $L_{A46002}$ | $R^{C30}$ | $R^{E5}$ | $R^{B4}$ |
| $L_{A46003}$ | $R^{C30}$ | $R^{E6}$ | $R^{B4}$ |
| $L_{A46004}$ | $R^{C30}$ | $R^{E7}$ | $R^{B4}$ |
| $L_{A46005}$ | $R^{C30}$ | $R^{E8}$ | $R^{B4}$ |
| $L_{A46006}$ | $R^{C30}$ | $R^{E9}$ | $R^{B4}$ |
| $L_{A46007}$ | $R^{C30}$ | $R^{E10}$ | $R^{B4}$ |
| $L_{A46008}$ | $R^{C30}$ | $R^{E11}$ | $R^{B4}$ |
| $L_{A46009}$ | $R^{C30}$ | $R^{E12}$ | $R^{B4}$ |
| $L_{A46010}$ | $R^{C30}$ | $R^{E13}$ | $R^{B4}$ |

-continued

| Ligand | $R^2$ | $R^3$ | $R^4$ |
|---|---|---|---|
| $L_{A6011}$ | $R^{C30}$ | $R^{E14}$ | $R^{B4}$ |
| $L_{A6012}$ | $R^{C30}$ | $R^{E15}$ | $R^{B4}$ |
| $L_{A6013}$ | $R^{C30}$ | $R^{E16}$ | $R^{B4}$ |
| $L_{A6014}$ | $R^{C30}$ | $R^{E17}$ | $R^{B4}$ |
| $L_{A6015}$ | $R^{C30}$ | $R^{E18}$ | $R^{B4}$ |
| $L_{A6016}$ | $R^{C30}$ | $R^{E19}$ | $R^{B4}$ |
| $L_{A6017}$ | $R^{C30}$ | $R^{E20}$ | $R^{B4}$ |
| $L_{A6018}$ | $R^{C30}$ | $R^{E21}$ | $R^{B4}$ |
| $L_{A6019}$ | $R^{C30}$ | $R^{B3}$ | $R^{B18}$ |
| $L_{A6020}$ | $R^{C30}$ | $R^{B6}$ | $R^{B18}$ |
| $L_{A6021}$ | $R^{C30}$ | $R^{B7}$ | $R^{B18}$ |
| $L_{A6022}$ | $R^{C30}$ | $R^{B12}$ | $R^{B18}$ |
| $L_{A6023}$ | $R^{C30}$ | $R^{B20}$ | $R^{B18}$ |
| $L_{A6024}$ | $R^{C30}$ | $R^{B25}$ | $R^{B18}$ |
| $L_{A6025}$ | $R^{C30}$ | $R^{B29}$ | $R^{B18}$ |
| $L_{A6026}$ | $R^{C30}$ | $R^{A37}$ | $R^{B18}$ |
| $L_{A6027}$ | $R^{C30}$ | $R^{A43}$ | $R^{B18}$ |
| $L_{A6028}$ | $R^{C30}$ | $R^{E1}$ | $R^{B18}$ |
| $L_{A6029}$ | $R^{C30}$ | $R^{E2}$ | $R^{B18}$ |
| $L_{A6030}$ | $R^{C30}$ | $R^{E3}$ | $R^{B18}$ |
| $L_{A6031}$ | $R^{C30}$ | $R^{E4}$ | $R^{B18}$ |
| $L_{A6032}$ | $R^{C30}$ | $R^{E5}$ | $R^{B18}$ |
| $L_{A6033}$ | $R^{C30}$ | $R^{E6}$ | $R^{B18}$ |
| $L_{A6034}$ | $R^{C30}$ | $R^{E7}$ | $R^{B18}$ |
| $L_{A6035}$ | $R^{C30}$ | $R^{E8}$ | $R^{B18}$ |
| $L_{A6036}$ | $R^{C30}$ | $R^{E9}$ | $R^{B18}$ |
| $L_{A6037}$ | $R^{C30}$ | $R^{E10}$ | $R^{B18}$ |
| $L_{A6038}$ | $R^{C30}$ | $R^{E11}$ | $R^{B18}$ |
| $L_{A6039}$ | $R^{C30}$ | $R^{E12}$ | $R^{B18}$ |
| $L_{A6040}$ | $R^{C30}$ | $R^{E13}$ | $R^{B18}$ |
| $L_{A6041}$ | $R^{C30}$ | $R^{E14}$ | $R^{B18}$ |
| $L_{A6042}$ | $R^{C30}$ | $R^{E15}$ | $R^{B18}$ |
| $L_{A6043}$ | $R^{C30}$ | $R^{E16}$ | $R^{B18}$ |
| $L_{A6044}$ | $R^{C30}$ | $R^{E17}$ | $R^{B18}$ |
| $L_{A6045}$ | $R^{C30}$ | $R^{E18}$ | $R^{B18}$ |
| $L_{A6046}$ | $R^{C30}$ | $R^{E19}$ | $R^{B18}$ |
| $L_{A6047}$ | $R^{C30}$ | $R^{E20}$ | $R^{B18}$ |
| $L_{A6048}$ | $R^{C30}$ | $R^{E21}$ | $R^{B18}$ |
| $L_{A6049}$ | $R^{C30}$ | $R^{B3}$ | $R^{A3}$ |
| $L_{A6050}$ | $R^{C30}$ | $R^{B6}$ | $R^{A3}$ |
| $L_{A6051}$ | $R^{C30}$ | $R^{B7}$ | $R^{A3}$ |
| $L_{A6052}$ | $R^{C30}$ | $R^{B12}$ | $R^{A3}$ |
| $L_{A6053}$ | $R^{C30}$ | $R^{B20}$ | $R^{A3}$ |
| $L_{A6054}$ | $R^{C30}$ | $R^{B25}$ | $R^{A3}$ |
| $L_{A6055}$ | $R^{C30}$ | $R^{B29}$ | $R^{A3}$ |
| $L_{A6056}$ | $R^{C30}$ | $R^{A37}$ | $R^{A3}$ |
| $L_{A6057}$ | $R^{C30}$ | $R^{A43}$ | $R^{A3}$ |
| $L_{A6058}$ | $R^{C30}$ | $R^{E1}$ | $R^{A3}$ |
| $L_{A6059}$ | $R^{C30}$ | $R^{E2}$ | $R^{A3}$ |
| $L_{A6060}$ | $R^{C30}$ | $R^{E3}$ | $R^{A3}$ |
| $L_{A6061}$ | $R^{C30}$ | $R^{E4}$ | $R^{A3}$ |
| $L_{A6062}$ | $R^{C30}$ | $R^{E5}$ | $R^{A3}$ |
| $L_{A6063}$ | $R^{C30}$ | $R^{E6}$ | $R^{A3}$ |
| $L_{A6064}$ | $R^{C30}$ | $R^{E7}$ | $R^{A3}$ |
| $L_{A6065}$ | $R^{C30}$ | $R^{E8}$ | $R^{A3}$ |
| $L_{A6066}$ | $R^{C30}$ | $R^{E9}$ | $R^{A3}$ |
| $L_{A6067}$ | $R^{C30}$ | $R^{E10}$ | $R^{A3}$ |
| $L_{A6068}$ | $R^{C30}$ | $R^{E11}$ | $R^{A3}$ |
| $L_{A6069}$ | $R^{C30}$ | $R^{E12}$ | $R^{A3}$ |
| $L_{A6070}$ | $R^{C30}$ | $R^{E13}$ | $R^{A3}$ |
| $L_{A6071}$ | $R^{C30}$ | $R^{E14}$ | $R^{A3}$ |
| $L_{A6072}$ | $R^{C30}$ | $R^{E15}$ | $R^{A3}$ |
| $L_{A6073}$ | $R^{C30}$ | $R^{E16}$ | $R^{A3}$ |
| $L_{A6074}$ | $R^{C30}$ | $R^{E17}$ | $R^{A3}$ |
| $L_{A6075}$ | $R^{C30}$ | $R^{E18}$ | $R^{A3}$ |
| $L_{A6076}$ | $R^{C30}$ | $R^{E19}$ | $R^{A3}$ |
| $L_{A6077}$ | $R^{C30}$ | $R^{E20}$ | $R^{A3}$ |
| $L_{A6078}$ | $R^{C30}$ | $R^{E21}$ | $R^{A3}$ |
| $L_{A6079}$ | $R^{C30}$ | $R^{B3}$ | $R^{A34}$ |
| $L_{A6080}$ | $R^{C30}$ | $R^{B6}$ | $R^{A34}$ |
| $L_{A6081}$ | $R^{C30}$ | $R^{B7}$ | $R^{A34}$ |
| $L_{A6082}$ | $R^{C30}$ | $R^{B12}$ | $R^{A34}$ |
| $L_{A6083}$ | $R^{C30}$ | $R^{B20}$ | $R^{A34}$ |
| $L_{A6084}$ | $R^{C30}$ | $R^{B25}$ | $R^{A34}$ |
| $L_{A6085}$ | $R^{C30}$ | $R^{B29}$ | $R^{A34}$ |
| $L_{A6086}$ | $R^{C30}$ | $R^{A37}$ | $R^{A34}$ |
| $L_{A6087}$ | $R^{C30}$ | $R^{A43}$ | $R^{A34}$ |

-continued

| Ligand | $R^2$ | $R^3$ | $R^4$ |
|---|---|---|---|
| $L_{A6088}$ | $R^{C30}$ | $R^{E1}$ | $R^{A34}$ |
| $L_{A6089}$ | $R^{C30}$ | $R^{E2}$ | $R^{A34}$ |
| $L_{A6090}$ | $R^{C30}$ | $R^{E3}$ | $R^{A34}$ |
| $L_{A6091}$ | $R^{C30}$ | $R^{E4}$ | $R^{A34}$ |
| $L_{A6092}$ | $R^{C30}$ | $R^{E5}$ | $R^{A34}$ |
| $L_{A6093}$ | $R^{C30}$ | $R^{E6}$ | $R^{A34}$ |
| $L_{A6094}$ | $R^{C30}$ | $R^{E7}$ | $R^{A34}$ |
| $L_{A6095}$ | $R^{C30}$ | $R^{E8}$ | $R^{A34}$ |
| $L_{A6096}$ | $R^{C30}$ | $R^{E9}$ | $R^{A34}$ |
| $L_{A6097}$ | $R^{C30}$ | $R^{E10}$ | $R^{A34}$ |
| $L_{A6098}$ | $R^{C30}$ | $R^{E11}$ | $R^{A34}$ |
| $L_{A6099}$ | $R^{C30}$ | $R^{E12}$ | $R^{A34}$ |
| $L_{A6100}$ | $R^{C30}$ | $R^{E13}$ | $R^{A34}$ |
| $L_{A6101}$ | $R^{C30}$ | $R^{E14}$ | $R^{A34}$ |
| $L_{A6102}$ | $R^{C30}$ | $R^{E15}$ | $R^{A34}$ |
| $L_{A6103}$ | $R^{C30}$ | $R^{E16}$ | $R^{A34}$ |
| $L_{A6104}$ | $R^{C30}$ | $R^{E17}$ | $R^{A34}$ |
| $L_{A6105}$ | $R^{C30}$ | $R^{E18}$ | $R^{A34}$ |
| $L_{A6106}$ | $R^{C30}$ | $R^{E19}$ | $R^{A34}$ |
| $L_{A6107}$ | $R^{C30}$ | $R^{E20}$ | $R^{A34}$ |
| $L_{A6108}$ | $R^{C30}$ | $R^{E21}$ | $R^{A34}$ |
| $L_{A6109}$ | $R^{C30}$ | $R^{B3}$ | $R^{A52}$ |
| $L_{A6110}$ | $R^{C30}$ | $R^{B6}$ | $R^{A52}$ |
| $L_{A6111}$ | $R^{C30}$ | $R^{B7}$ | $R^{A52}$ |
| $L_{A6112}$ | $R^{C30}$ | $R^{B12}$ | $R^{A52}$ |
| $L_{A6113}$ | $R^{C30}$ | $R^{B20}$ | $R^{A52}$ |
| $L_{A6114}$ | $R^{C30}$ | $R^{B25}$ | $R^{A52}$ |
| $L_{A6115}$ | $R^{C30}$ | $R^{B29}$ | $R^{A52}$ |
| $L_{A6116}$ | $R^{C30}$ | $R^{A37}$ | $R^{A52}$ |
| $L_{A6117}$ | $R^{C30}$ | $R^{A43}$ | $R^{A52}$ |
| $L_{A6118}$ | $R^{C30}$ | $R^{E1}$ | $R^{A52}$ |
| $L_{A6119}$ | $R^{C30}$ | $R^{E2}$ | $R^{A52}$ |
| $L_{A6120}$ | $R^{C30}$ | $R^{E3}$ | $R^{A52}$ |
| $L_{A6121}$ | $R^{C30}$ | $R^{E4}$ | $R^{A52}$ |
| $L_{A6122}$ | $R^{C30}$ | $R^{E5}$ | $R^{A52}$ |
| $L_{A6123}$ | $R^{C30}$ | $R^{E6}$ | $R^{A52}$ |
| $L_{A6124}$ | $R^{C30}$ | $R^{E7}$ | $R^{A52}$ |
| $L_{A6125}$ | $R^{C30}$ | $R^{E8}$ | $R^{A52}$ |
| $L_{A6126}$ | $R^{C30}$ | $R^{E9}$ | $R^{A52}$ |
| $L_{A6127}$ | $R^{C30}$ | $R^{E10}$ | $R^{A52}$ |
| $L_{A6128}$ | $R^{C30}$ | $R^{E11}$ | $R^{A52}$ |
| $L_{A6129}$ | $R^{C30}$ | $R^{E12}$ | $R^{A52}$ |
| $L_{A6130}$ | $R^{C30}$ | $R^{E13}$ | $R^{A52}$ |
| $L_{A6131}$ | $R^{C30}$ | $R^{E14}$ | $R^{A52}$ |
| $L_{A6132}$ | $R^{C30}$ | $R^{E15}$ | $R^{A52}$ |
| $L_{A6133}$ | $R^{C30}$ | $R^{E16}$ | $R^{A52}$ |
| $L_{A6134}$ | $R^{C30}$ | $R^{E17}$ | $R^{A52}$ |
| $L_{A6135}$ | $R^{C30}$ | $R^{E18}$ | $R^{A52}$ |
| $L_{A6136}$ | $R^{C30}$ | $R^{E19}$ | $R^{A52}$ |
| $L_{A6137}$ | $R^{C30}$ | $R^{E20}$ | $R^{A52}$ |
| $L_{A6138}$ | $R^{C30}$ | $R^{E21}$ | $R^{A52}$ |

wherein $R^{B1}$ to $R^{B44}$ have the following structures:

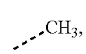

$R^{B1}$

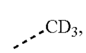

$R^{B2}$

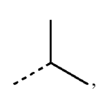

$R^{B3}$

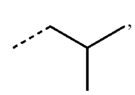

$R^{B4}$

-continued
$R^{B5}$
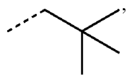
$R^{B6}$
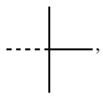
$R^{B7}$
$R^{B8}$
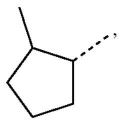
$R^{B9}$
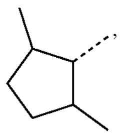
$R^{B10}$
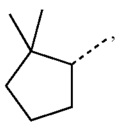
$R^{B11}$
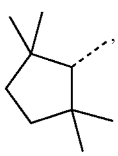
$R^{B12}$
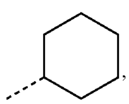
$R^{B13}$
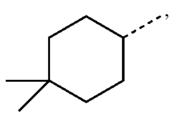
$R^{B14}$
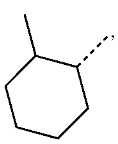
$R^{B15}$
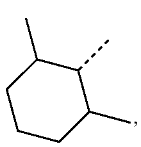
$R^{B16}$
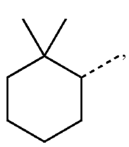
-continued
$R^{B17}$
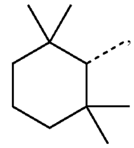
$R^{B18}$
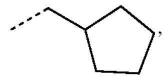
$R^{B19}$
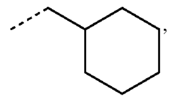
$R^{B20}$
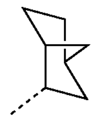
$R^{B21}$
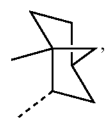
$R^{B22}$
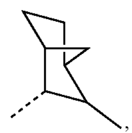
$R^{B23}$
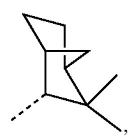
$R^{B24}$
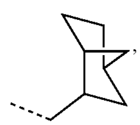
$R^{B25}$
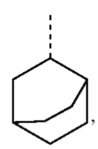
$R^{B26}$
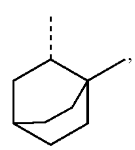
$R^{B27}$
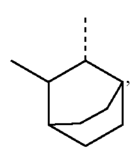

-continued
$R^{B28}$
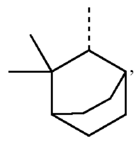
$R^{B29}$
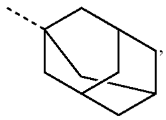
$R^{B30}$
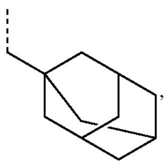
$R^{B31}$
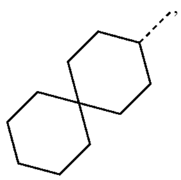
$R^{B32}$
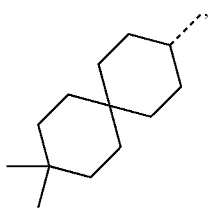
$R^{B33}$
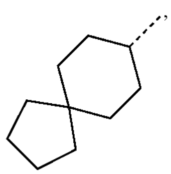
$R^{B34}$
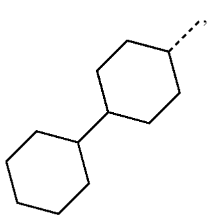
$R^{B35}$
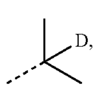
$R^{B36}$
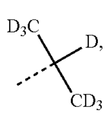
-continued
$R^{B37}$
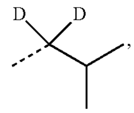
$R^{B38}$
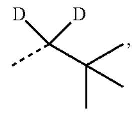
$R^{B39}$
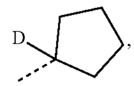
$R^{B40}$
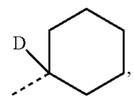
$R^{B41}$
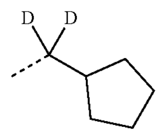
$R^{B42}$
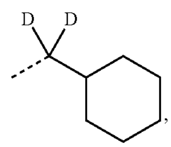
$R^{B43}$
$R^{B44}$
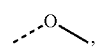
and
$R^{B44}$
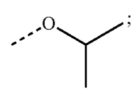
wherein $R^{A1}$ to $R^{A52}$ have the following structures:
$R^{A1}$
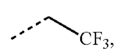
$R^{A2}$
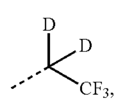
$R^{A3}$
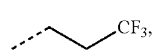
$R^{A4}$
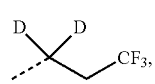
$R^{A5}$
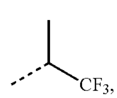

-continued
$R^{A6}$
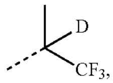
$R^{A7}$
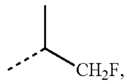
$R^{A8}$
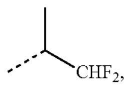
$R^{A9}$
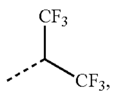
$R^{A10}$
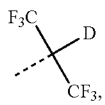
$R^{A11}$
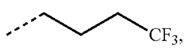
$R^{A12}$
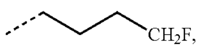
$R^{A13}$
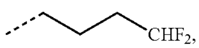
$R^{A14}$
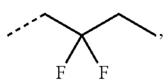
$R^{A15}$
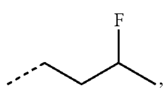
$R^{A16}$
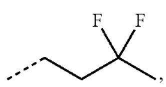
$R^{A17}$
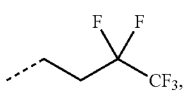
$R^{A18}$
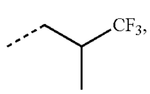
$R^{A19}$
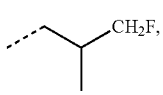
$R^{A20}$
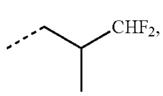
$R^{A21}$
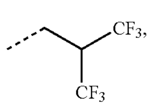
-continued
$R^{A22}$
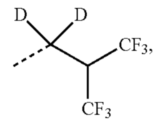
$R^{A23}$
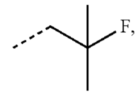
$R^{A24}$
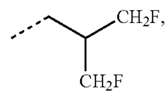
$R^{A25}$
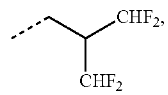
$R^{A26}$
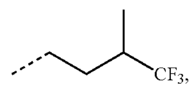
$R^{A27}$
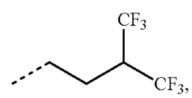
$R^{A28}$
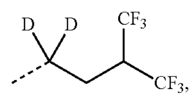
$R^{A29}$
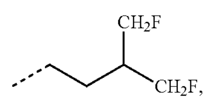
$R^{A30}$
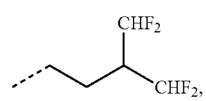
$R^{A31}$
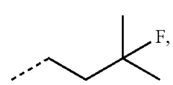
$R^{A32}$
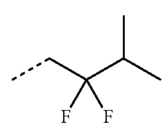
$R^{A33}$
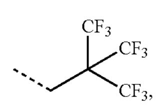
$R^{A34}$
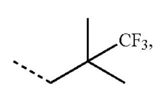
$R^{A35}$
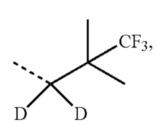

-continued
$R^{A36}$
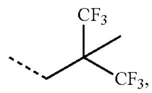
$R^{A37}$
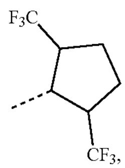
$R^{A38}$
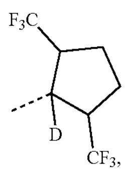
$R^{A39}$
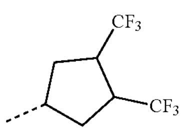
$R^{A40}$
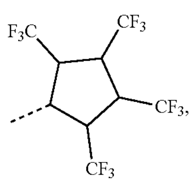
$R^{A41}$
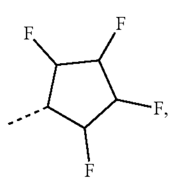
$R^{A42}$
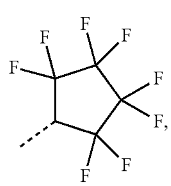
$R^{A43}$
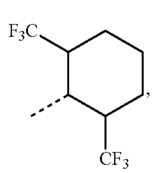
$R^{A44}$
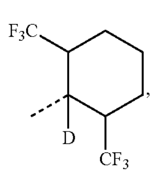
-continued
$R^{A45}$
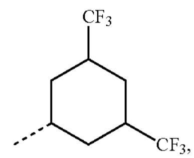
$R^{A46}$
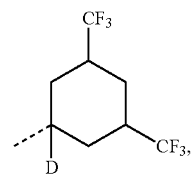
$R^{A47}$
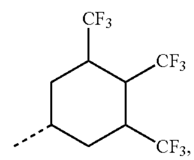
$R^{A48}$
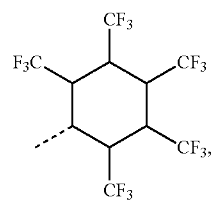
$R^{A49}$
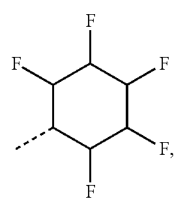
$R^{A50}$
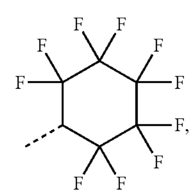
$R^{A51}$
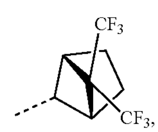
and
$R^{A52}$
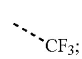
wherein $R^{C1}$, $R^{C3}$, $R^{C5}$, $R^{C17}$, $R^{C19}$, $R^{C21}$, $R^{C30}$, and $R^{C11}$ have the following structures:
$R^{C1}$
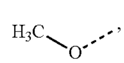

-continued
$R^{C3}$
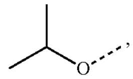
$R^{C5}$
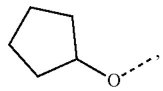
$R^{C17}$
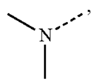
$R^{C19}$
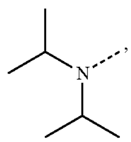
$R^{C21}$
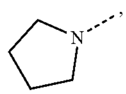
$R^{C30}$
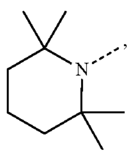
and
$R^{C31}$
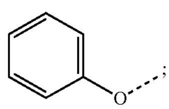
wherein $R^{E1}$ to $R^{E21}$ have the following structures:
$R^{E1}$
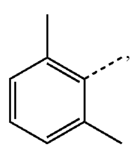
$R^{E2}$
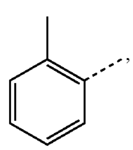
$R^{E3}$
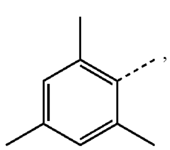
$R^{E4}$
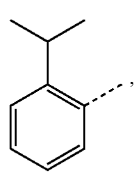
-continued
$R^{E5}$
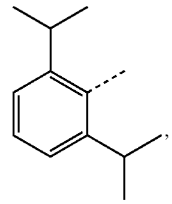
$R^{E6}$
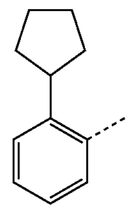
$R^{E7}$
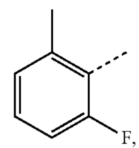
$R^{E8}$
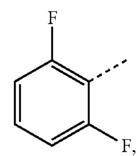
$R^{E9}$
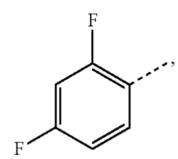
$R^{E10}$
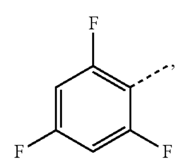
$R^{E11}$
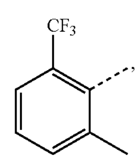
$R^{E12}$
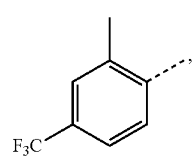
$R^{E13}$
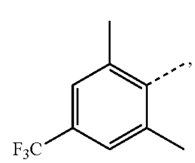

-continued
$R^{E14}$
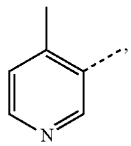
$R^{E15}$
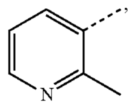
$R^{E16}$
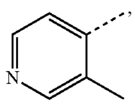
$R^{E17}$
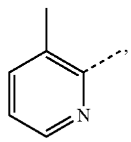
$R^{E18}$
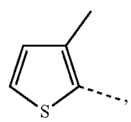
$R^{E19}$
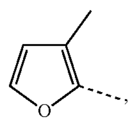
$R^{E20}$
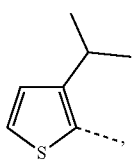
$R^{E21}$
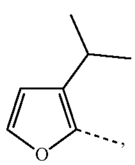
wherein $L_{A6139}$ through $L_{A6154}$ have the following structures:
$L_{A6139}$
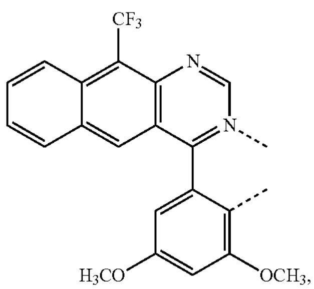
-continued
$L_{A6140}$
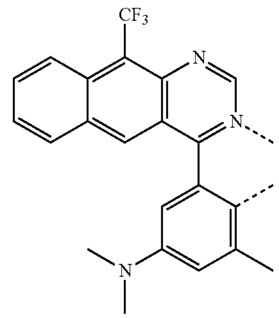
$L_{A6141}$
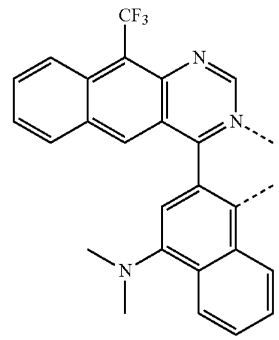
$L_{A6142}$
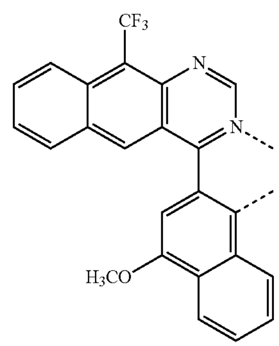
$L_{A6143}$
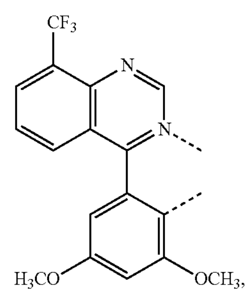
$L_{A6144}$
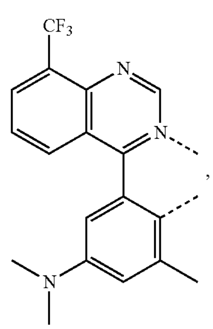

$L_{A6145}$
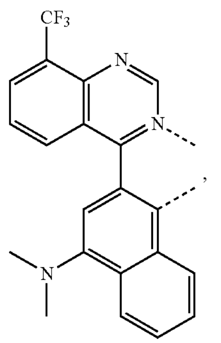
$L_{A6146}$
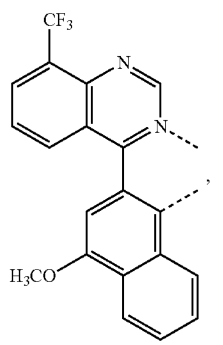
$L_{A6147}$
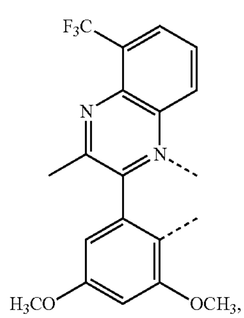
$L_{A6148}$
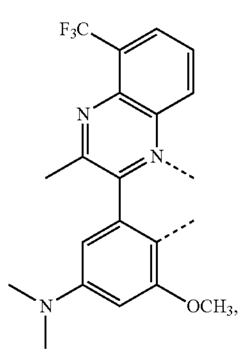
$L_{A6149}$
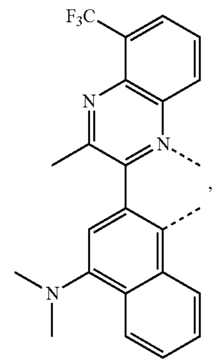
$L_{A6150}$
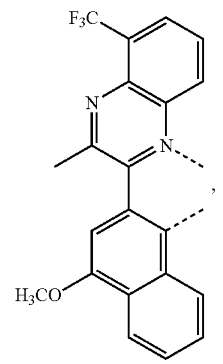
$L_{A6151}$
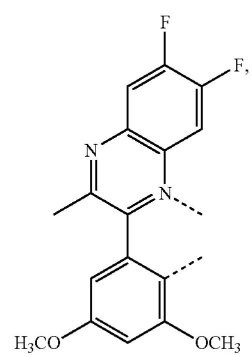
$L_{A6152}$
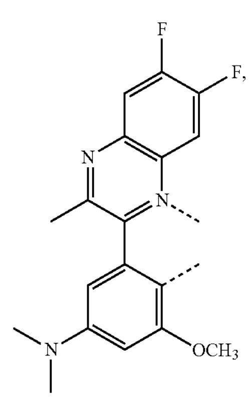

-continued

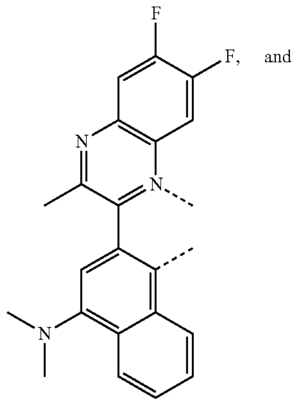

$L_{A6153}$

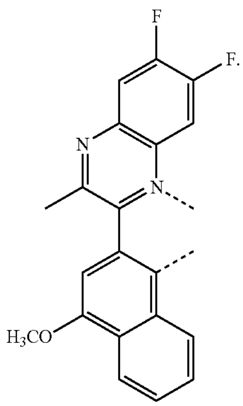

$L_{A6154}$

13. The compound of claim 12, wherein the compound is selected from the group consisting of Compound x having the formula $Ir(L_{Ai})_2(L_{Cj})$; wherein x is an integer defined by x=12601+j−1260; wherein i is an integer from 1 to 306, 308 to 315, 317 to 324, 326 to 333, 335 to 342, 344 to 351, 353 to 1938, 1941 to 1947, 1954 to 1938, and 1969 to 6154, and j is an integer from 1 to 1260; wherein $L_{C1}$ through $L_{C1260}$ have the following structures:

$L_{C1}$ through $L_{C1260}$ are based on a structure of Formula XV,

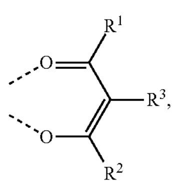

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |

-continued

| Ligand | $R^1$ | $R^2$ | $R^3$ |
|---|---|---|---|
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |

-continued

| Ligand | $R^1$ | $R^2$ | $R^3$ |
|---|---|---|---|
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D11}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |

-continued

| Ligand | $R^1$ | $R^2$ | $R^3$ |
|---|---|---|---|
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |

-continued

| Ligand | $R^1$ | $R^2$ | $R^3$ |
|---|---|---|---|
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |

-continued

| Ligand | $R^1$ | $R^2$ | $R^3$ |
|---|---|---|---|
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |

-continued

| Ligand | $R^1$ | $R^2$ | $R^3$ |
|---|---|---|---|
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |

-continued

| Ligand | $R^1$ | $R^2$ | $R^3$ |
|---|---|---|---|
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D70}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |

-continued

| Ligand | $R^1$ | $R^2$ | $R^3$ |
|---|---|---|---|
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |

-continued

| Ligand | $R^1$ | $R^2$ | $R^3$ |
|---|---|---|---|
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |
| $L_{C680}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |

-continued

| Ligand | $R^1$ | $R^2$ | $R^3$ |
|---|---|---|---|
| $L_{C703}$ | $R^{D1}$ | $R^{D32}$ | $R^{D}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |

-continued

| Ligand | $R^1$ | $R^2$ | $R^3$ |
|---|---|---|---|
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |

-continued

| Ligand | $R^1$ | $R^2$ | $R^3$ |
|---|---|---|---|
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |

-continued

| Ligand | $R^1$ | $R^2$ | $R^3$ |
|---|---|---|---|
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D8}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |

-continued

| Ligand | $R^1$ | $R^2$ | $R^3$ |
|---|---|---|---|
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |

-continued

| Ligand | $R^1$ | $R^2$ | $R^3$ |
|---|---|---|---|
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D2}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |

-continued

| Ligand | $R^1$ | $R^2$ | $R^3$ |
|---|---|---|---|
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |

-continued

| Ligand | $R^1$ | $R^2$ | $R^3$ |
|---|---|---|---|
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$ |

wherein $R^{D1}$ to $R^{D81}$ has the following structures:

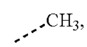

$R^{D1}$

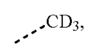

$R^{D2}$

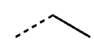

$R^{D3}$

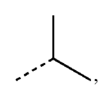

$R^{D4}$

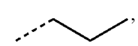

$R^{D5}$

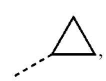

$R^{D6}$

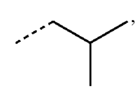

$R^{D7}$

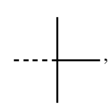

$R^{D8}$

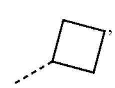

$R^{D9}$

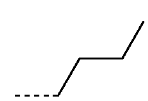

$R^{D10}$

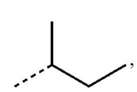

$R^{D11}$

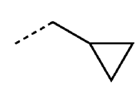

$R^{D12}$

-continued
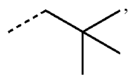
$R^{D13}$
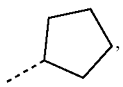
$R^{D14}$
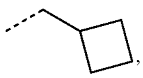
$R^{D15}$
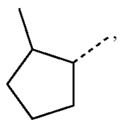
$R^{D16}$
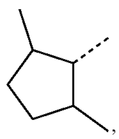
$R^{D17}$
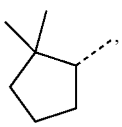
$R^{D18}$
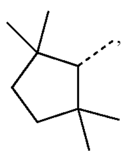
$R^{D19}$
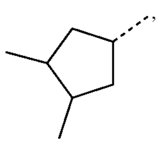
$R^{D20}$
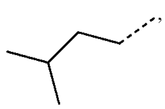
$R^{D21}$
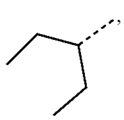
$R^{D22}$
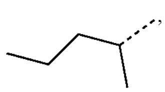
$R^{D23}$
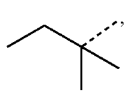
$R^{D24}$
-continued
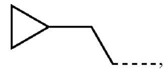
$R^{D25}$
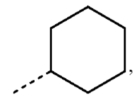
$R^{D26}$
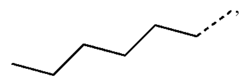
$R^{D27}$
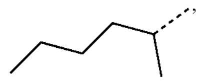
$R^{D28}$
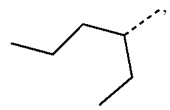
$R^{D29}$
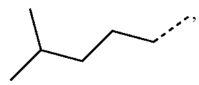
$R^{D30}$
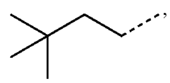
$R^{D31}$
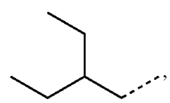
$R^{D32}$
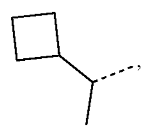
$R^{D33}$
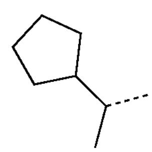
$R^{D34}$
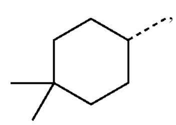
$R^{D35}$
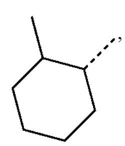
$R^{D36}$
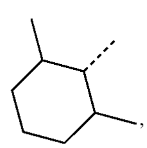
$R^{D37}$ $R^{D38}$
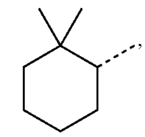
$R^{D39}$
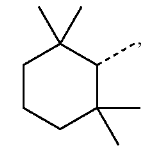
$R^{D40}$
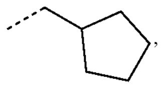
$R^{D41}$
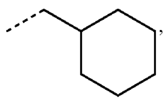
$R^{D42}$
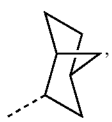
$R^{D43}$
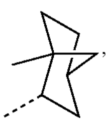
$R^{D44}$
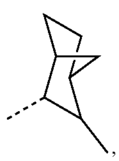
$R^{D45}$
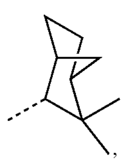
$R^{D46}$
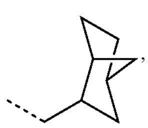
$R^{D47}$
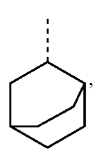
$R^{D48}$
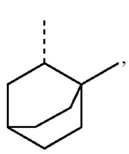
$R^{D49}$
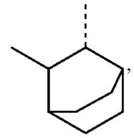
$R^{D50}$
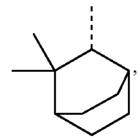
$R^{D51}$
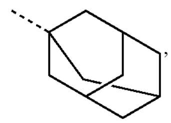
$R^{D52}$
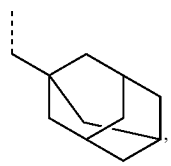
$R^{D53}$
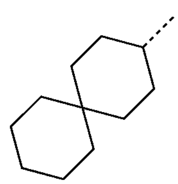
$R^{D54}$
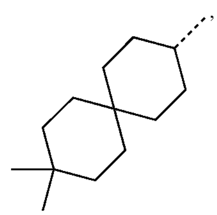
$R^{D55}$
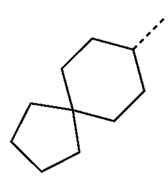
$R^{D56}$
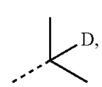
$R^{D57}$
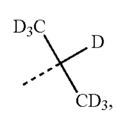
$R^{D58}$
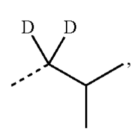

-continued
$R^{D59}$
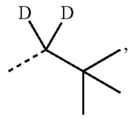
$R^{D60}$
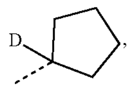
$R^{D61}$
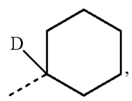
$R^{D62}$
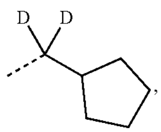
$R^{D63}$
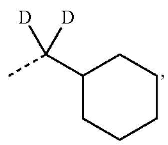
$R^{D64}$
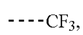
$R^{D65}$
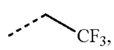
$R^{D66}$
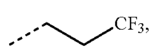
$R^{D67}$
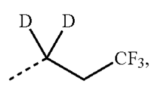
$R^{D68}$
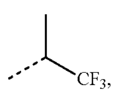
$R^{D69}$
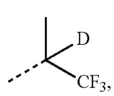
$R^{D70}$
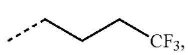
$R^{D71}$
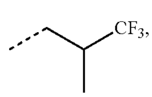
$R^{D72}$
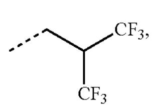
$R^{D73}$
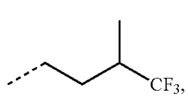
$R^{D74}$
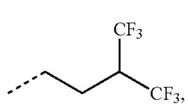
-continued
$R^{D75}$
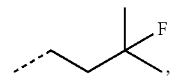
$R^{D76}$
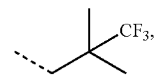
$R^{D77}$
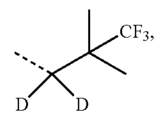
$R^{D78}$
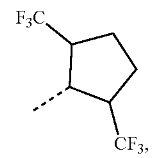
$R^{D79}$
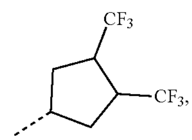
$R^{D80}$
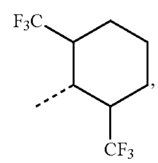
and
$R^{D81}$
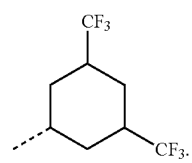
14. The compound of claim 1, wherein the ligand $L_B$ is selected from the group consisting of:
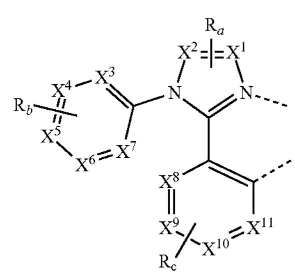
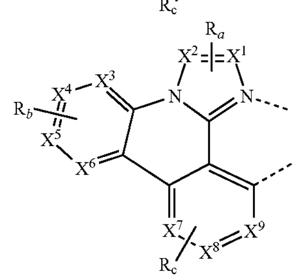

-continued

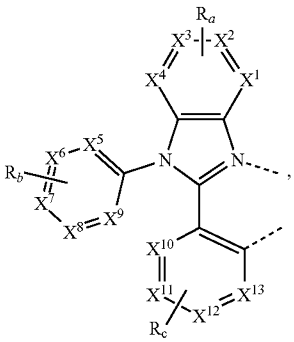

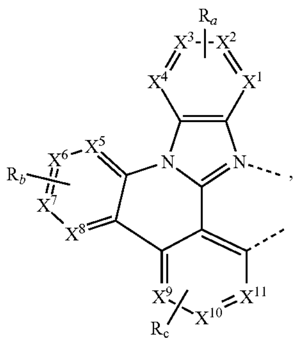

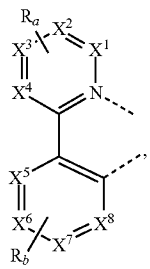

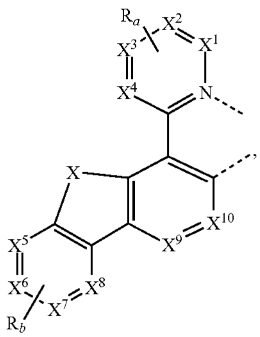

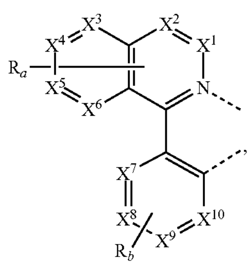

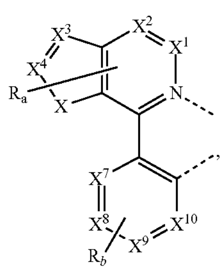

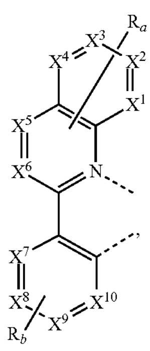

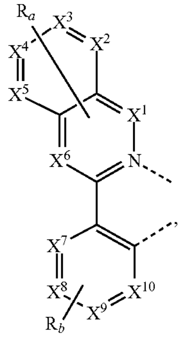

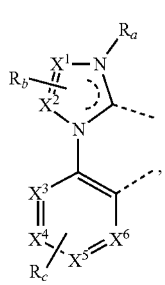

-continued

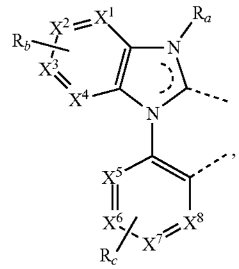

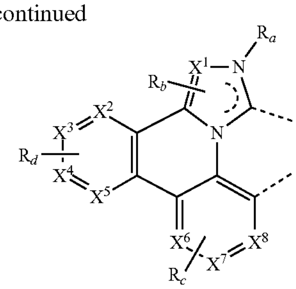

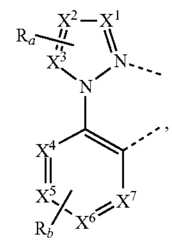

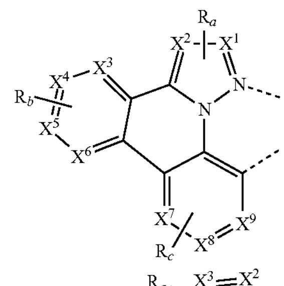

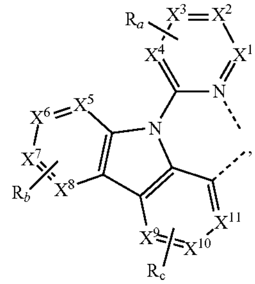

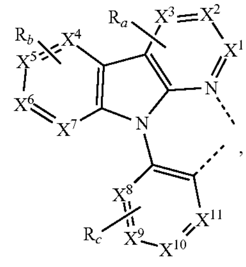

and

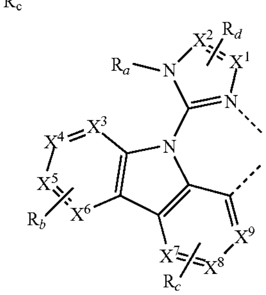

wherein each $X^1$ to $X^{13}$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each of $R_a$, $R_b$, $R_c$, and $R_d$ represents from a mono substitution to a maximum possible number of substitutions, or no substitution;

wherein R', R", $R_a$, $R_b$, $R_c$, and $R_d$ are each independently selected from the group consisting of hydrogen, deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein any two adjacent substitutents of $R_a$, $R_b$, $R_c$, and $R_d$ are optionally fused or joined to form a ring or form a multidentate ligand.

15. The compound of claim 1, wherein the ligand $L_C$ is selected from the group consisting of:

$L_{C1}$ through $L_{C1260}$ are based on a structure of Formula XIV,

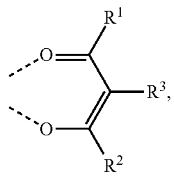

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |
| $L_{C64}$ | $R^{D1}$ | $R^{D23}$ | H |
| $L_{C65}$ | $R^{D1}$ | $R^{D24}$ | H |

-continued

| Ligand | $R^1$ | $R^2$ | $R^3$ |
|---|---|---|---|
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D11}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |
| $L_{C141}$ | $R^{D3}$ | $R^{D20}$ | H |
| $L_{C142}$ | $R^{D3}$ | $R^{D21}$ | H |

-continued

| Ligand | $R^1$ | $R^2$ | $R^3$ |
|---|---|---|---|
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |
| $L_{C218}$ | $R^{D7}$ | $R^{D21}$ | H |
| $L_{C219}$ | $R^{D7}$ | $R^{D22}$ | H |

-continued

| Ligand | $R^1$ | $R^2$ | $R^3$ |
|---|---|---|---|
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |
| $L_{C295}$ | $R^{D11}$ | $R^{D27}$ | H |
| $L_{C296}$ | $R^{D11}$ | $R^{D28}$ | H |

| Ligand | $R^1$ | $R^2$ | $R^3$ |
|---|---|---|---|
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |
| $L_{C372}$ | $R^{D14}$ | $R^{D41}$ | H |
| $L_{C373}$ | $R^{D14}$ | $R^{D42}$ | H |

| Ligand | $R^1$ | $R^2$ | $R^3$ |
|---|---|---|---|
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |
| $L_{C449}$ | $R^{D35}$ | $R^{D18}$ | H |
| $L_{C450}$ | $R^{D35}$ | $R^{D19}$ | H |

-continued

| Ligand | $R^1$ | $R^2$ | $R^3$ |
|---|---|---|---|
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D70}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |
| $L_{C526}$ | $R^{D41}$ | $R^{D68}$ | H |
| $L_{C527}$ | $R^{D41}$ | $R^{D76}$ | H |

-continued

| Ligand | $R^1$ | $R^2$ | $R^3$ |
|---|---|---|---|
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |
| $L_{C603}$ | $R^{D68}$ | $R^{D33}$ | H |
| $L_{C604}$ | $R^{D68}$ | $R^{D34}$ | H |

-continued

| Ligand | $R^1$ | $R^2$ | $R^3$ |
|---|---|---|---|
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |
| $L_{C680}$ | $R^{D1}$ | $R^{D9}$ | $R^{D1}$ |
| $L_{C681}$ | $R^{D1}$ | $R^{D10}$ | $R^{D1}$ |

-continued

| Ligand | $R^1$ | $R^2$ | $R^3$ |
|---|---|---|---|
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D18}$ | $R^{D1}$ |
| $L_{C690}$ | $R^{D1}$ | $R^{D19}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |
| $L_{C757}$ | $R^{D3}$ | $R^{D6}$ | $R^{D1}$ |
| $L_{C758}$ | $R^{D3}$ | $R^{D7}$ | $R^{D1}$ |

| Ligand | $R^1$ | $R^2$ | $R^3$ |
|---|---|---|---|
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D16}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |
| $L_{C834}$ | $R^{D7}$ | $R^{D6}$ | $R^{D1}$ |
| $L_{C835}$ | $R^{D7}$ | $R^{D8}$ | $R^{D1}$ |

| Ligand | $R^1$ | $R^2$ | $R^3$ |
|---|---|---|---|
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |
| $L_{C911}$ | $R^{D11}$ | $R^{D13}$ | $R^{D1}$ |
| $L_{C912}$ | $R^{D11}$ | $R^{D14}$ | $R^{D1}$ |

-continued

| Ligand | $R^1$ | $R^2$ | $R^3$ |
|---|---|---|---|
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D8}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |
| $L_{C988}$ | $R^{D14}$ | $R^{D23}$ | $R^{D1}$ |
| $L_{C989}$ | $R^{D14}$ | $R^{D24}$ | $R^{D1}$ |

-continued

| Ligand | $R^1$ | $R^2$ | $R^3$ |
|---|---|---|---|
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |
| $L_{C1065}$ | $R^{D26}$ | $R^{D41}$ | $R^{D1}$ |
| $L_{C1066}$ | $R^{D26}$ | $R^{D42}$ | $R^{D1}$ |

-continued

| Ligand | $R^1$ | $R^2$ | $R^3$ |
|---|---|---|---|
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D18}$ | $R^{D1}$ |
| $L_{C1110}$ | $R^{D40}$ | $R^{D19}$ | $R^{D1}$ |
| $L_{C1111}$ | $R^{D40}$ | $R^{D2}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |
| $L_{C1142}$ | $R^{D41}$ | $R^{D23}$ | $R^{D1}$ |
| $L_{C1143}$ | $R^{D41}$ | $R^{D24}$ | $R^{D1}$ |

-continued

| Ligand | $R^1$ | $R^2$ | $R^3$ |
|---|---|---|---|
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |
| $L_{C1219}$ | $R^{D68}$ | $R^{D17}$ | $R^{D1}$ |
| $L_{C1220}$ | $R^{D68}$ | $R^{D18}$ | $R^{D1}$ |

-continued

| Ligand | $R^1$ | $R^2$ | $R^3$ |
|---|---|---|---|
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$ |

wherein $R^{D1}$ to $R^{D81}$ has the following structures $R^{D1}$

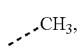

$R^{D2}$

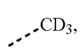

$R^{D3}$

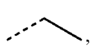

$R^{D4}$

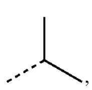

$R^{D5}$

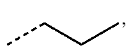

$R^{D6}$

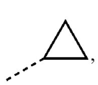

$R^{D7}$

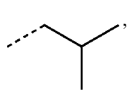

-continued $R^{D8}$

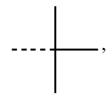

$R^{D9}$

$R^{D10}$

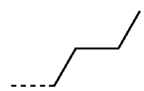

$R^{D11}$

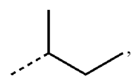

$R^{D12}$

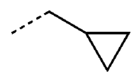

$R^{D13}$

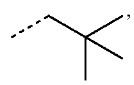

$R^{D14}$

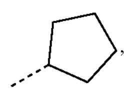

$R^{D15}$

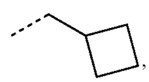

$R^{D16}$

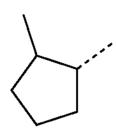

$R^{D17}$

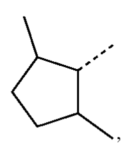

$R^{D18}$

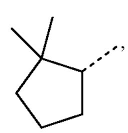

$R^{D19}$

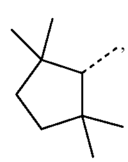

$R^{D20}$

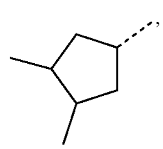

$R^{D21}$
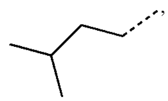
$R^{D22}$
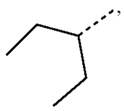
$R^{D23}$
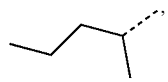
$R^{D24}$
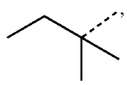
$R^{D25}$
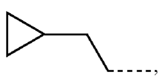
$R^{D26}$
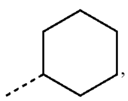
$R^{D27}$
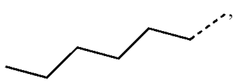
$R^{D28}$
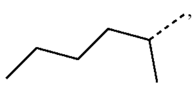
$R^{D29}$
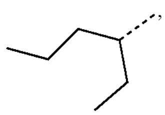
$R^{D30}$
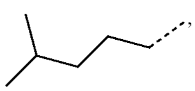
$R^{D31}$
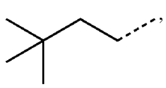
$R^{D32}$
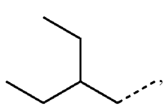
$R^{D33}$
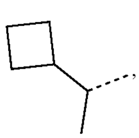
$R^{D34}$
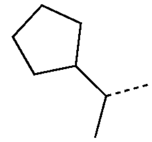
$R^{D35}$
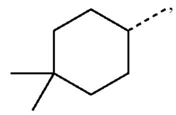
$R^{D36}$
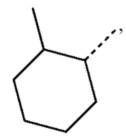
$R^{D37}$
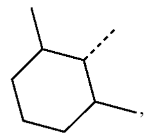
$R^{D38}$
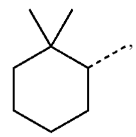
$R^{D39}$
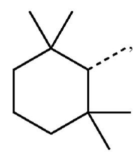
$R^{D40}$
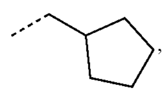
$R^{D41}$
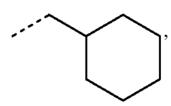
$R^{D42}$
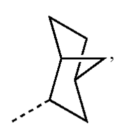
$R^{D43}$
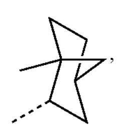
$R^{D44}$
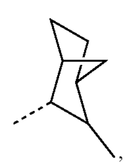

-continued
$R^{D45}$
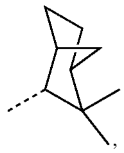
$R^{D46}$
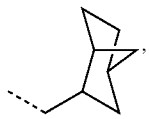
$R^{D47}$
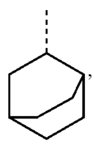
$R^{D48}$
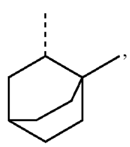
$R^{D49}$
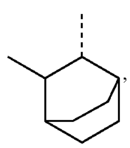
$R^{D50}$
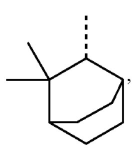
$R^{D51}$
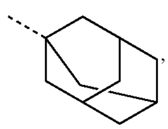
$R^{D52}$
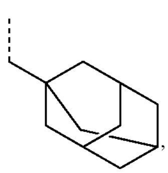
$R^{D53}$
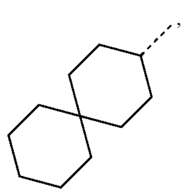
-continued
$R^{D54}$
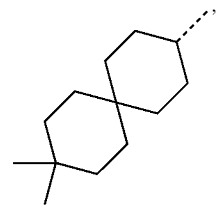
$R^{D55}$
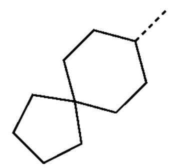
$R^{D56}$
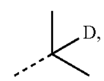
$R^{D57}$
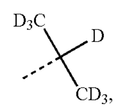
$R^{D58}$
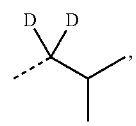
$R^{D59}$
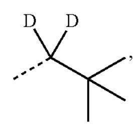
$R^{D60}$
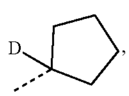
$R^{D61}$
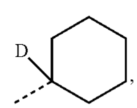
$R^{D62}$
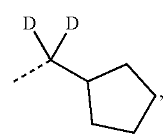
$R^{D63}$
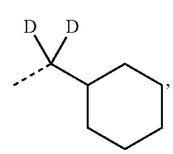
$R^{D64}$
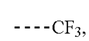
$R^{D65}$
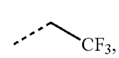
$R^{D66}$
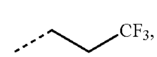

-continued $R^{D67}$

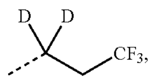

$R^{D68}$

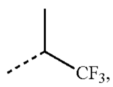

$R^{D69}$

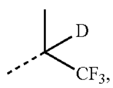

$R^{D70}$

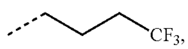

$R^{D71}$

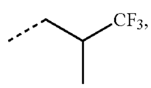

$R^{D72}$

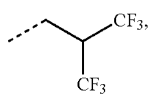

$R^{D73}$

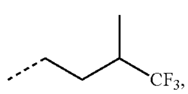

$R^{D74}$

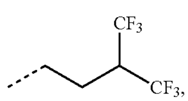

$R^{D75}$

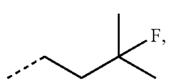

$R^{D76}$

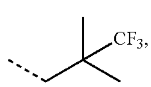

$R^{D77}$

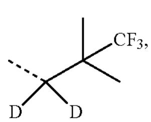

$R^{D78}$

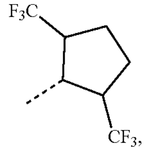

$R^{D879}$

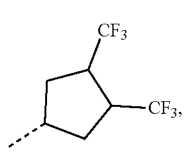

-continued $R^{D80}$

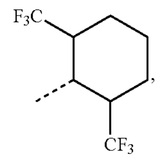

and $R^{D81}$

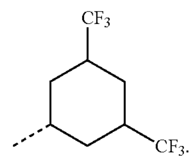

16. A first device comprising a first organic light emitting device (OLED), the first OLED comprising:

an anode;

a cathode; and an organic layer, disposed between the anode and the cathode, comprising a compound having a formula $M(L_A)_x(L_B)_y(L_C)_z$:

wherein the ligand $L_A$ is selected from the group consisting of

Format A1

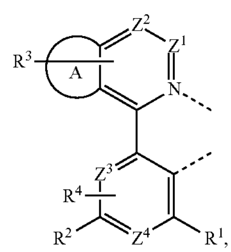

Format A2

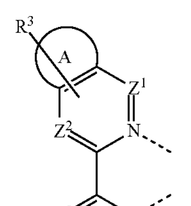

and

Format A3

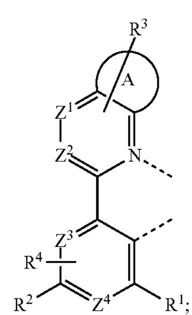

wherein the ligand $L_B$ is

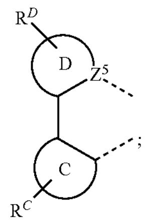

wherein the ligand $L_C$ is

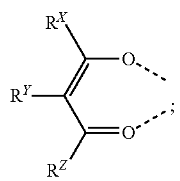

wherein M is a metal having an atomic weight greater than 40;
wherein x is 1, 2, or 3;
wherein y is 0, 1, or 2;
wherein z is 0, 1, or 2;
wherein x+y+z is the oxidation state of the metal M;
wherein $Z^1$ to $Z^5$ are each independently a carbon or nitrogen;
wherein ring A is a 5- or 6-membered aromatic ring fused to the ring having $Z^1$;
wherein rings C, and D are each independently a 5 or 6-membered carbocyclic or heterocyclic ring;
wherein $R^3$, $R^4$, $R^C$, and $R^D$ each independently represents no substitution to a maximum possible number of substitutions;
wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;
wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;
wherein any plurality of $R^1$, $R^2$, $R^3$, $R^4$, $R^C$, $R^D$, $R^X$, $R^Y$, and $R^Z$ are optionally joined or fused into a ring,
provided that when ring A is a 6-membered aromatic ring, at least one of $Z^1$, $Z^2$, and the ring atoms in ring A is nitrogen; and
wherein at least one of the following is true:
(1) exactly one of $R^1$, $R^2$, and $R^4$ comprises a moiety selected from the group consisting of alkoxy, aryloxy, and amino;
(2) one substituent $R^4$ and either $R^1$ or $R^2$ are joined or fused into an aromatic ring, or
(3)(a) at least one of $Z^1$ and $Z^2$ is N, and (b) at least one of the following is true: (i) ring A is a substituted ring, a heteroaryl ring, a 5-membered ring, or a combination thereof, (ii) at least one $R^3$ or $R^4$ comprises halide, (iii) $L_A$ is either Formula A1 or Formula A2, or (iv) $L_A$ is Formula A3 and $Z^2$ is N.

17. The first device of claim 16, wherein the organic layer is an emissive layer and the compound is an emissive dopant or a non-emissive dopant.

18. The first device of claim 16, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

19. The first device of claim 16, wherein the organic layer further comprises a host, wherein the host is selected from the group consisting of:

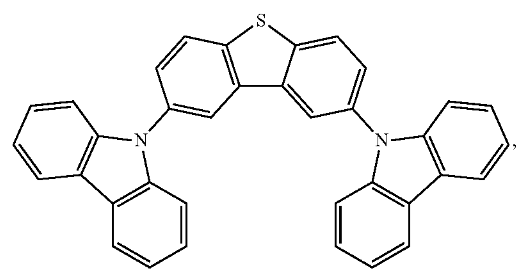

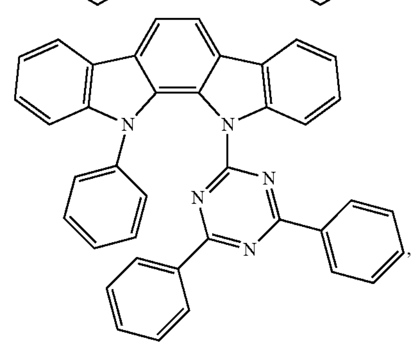

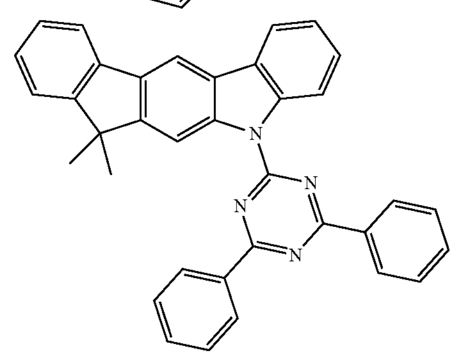

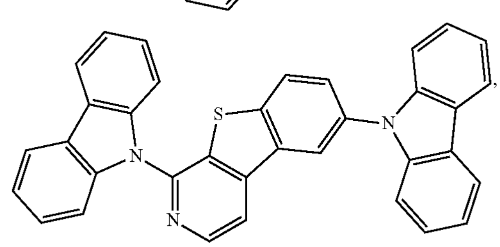

-continued
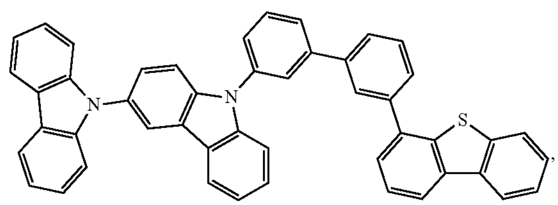
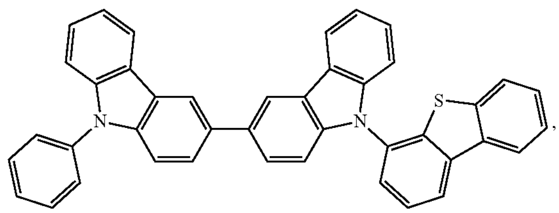
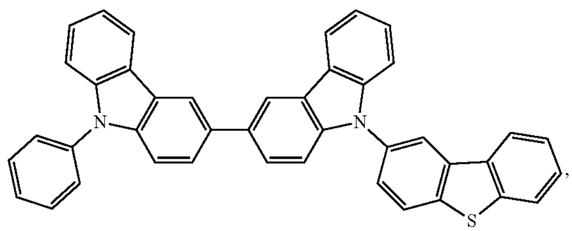
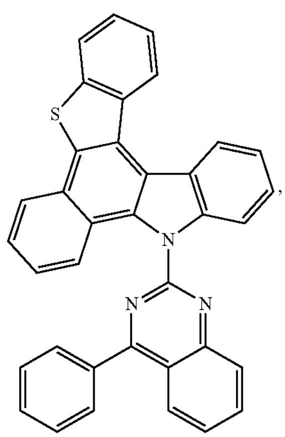
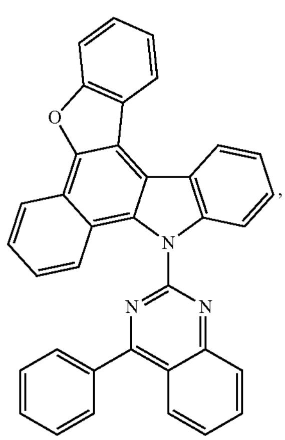
-continued
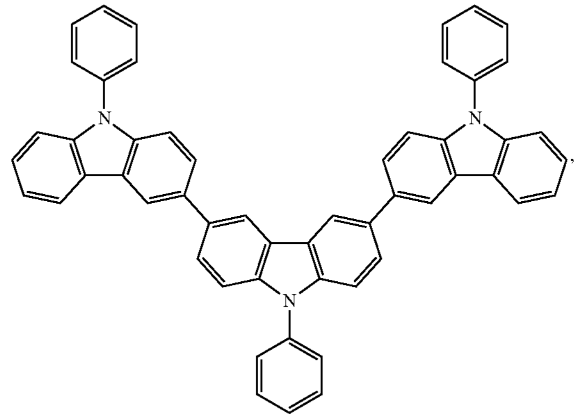
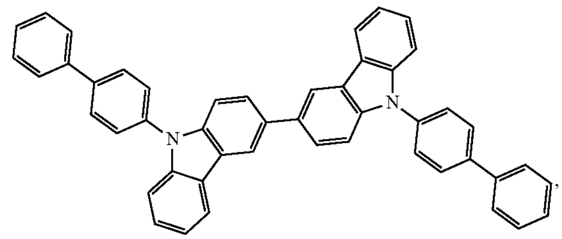
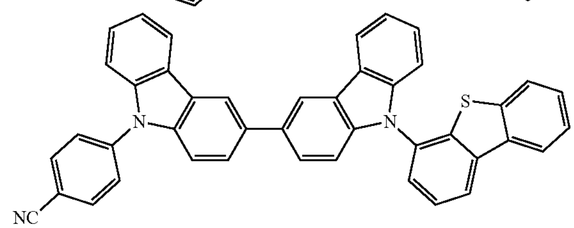
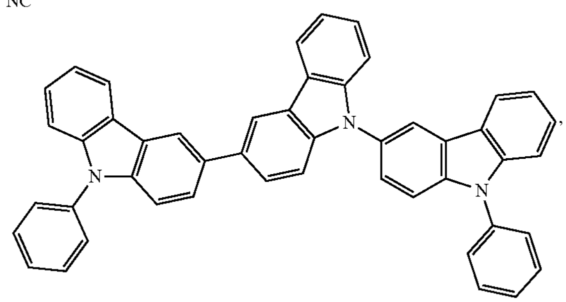
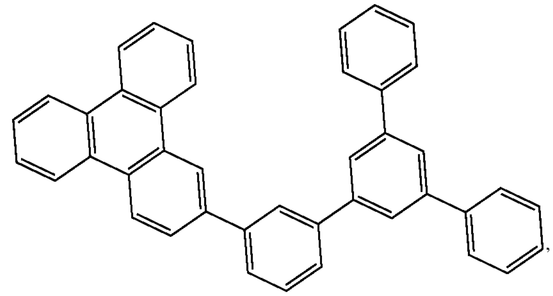
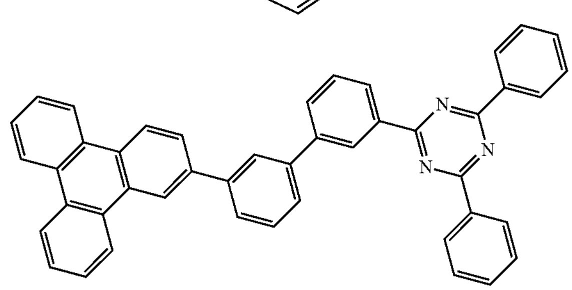

-continued

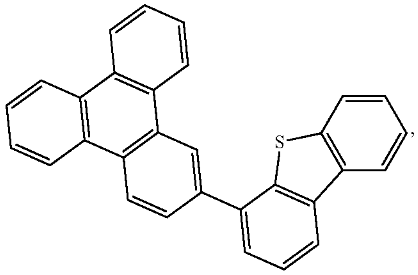

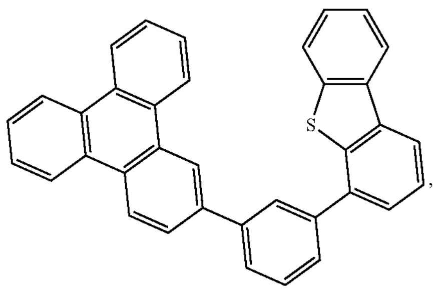

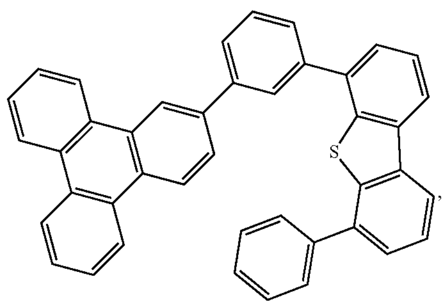

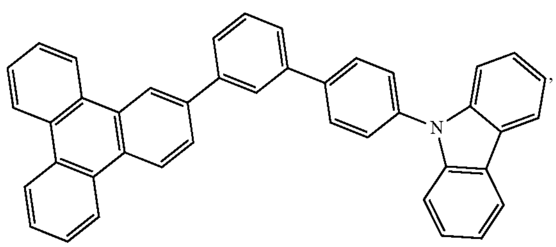

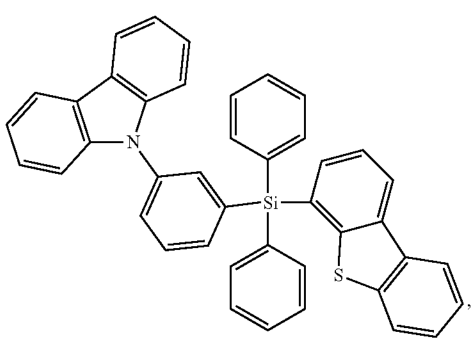

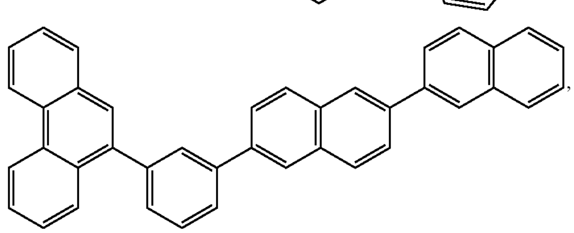

and combinations thereof.

20. A consumer product comprising an organic light-emitting device (OLED) comprising:

an anode;

a cathode; and an organic layer, disposed between the anode and the cathode, comprising a compound having a formula $M(L_A)_x(L_B)_y(L_C)_z$:

wherein the ligand $L_A$ is selected from the group consisting of

Format A1

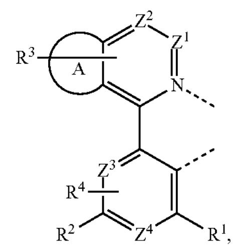

Format A2

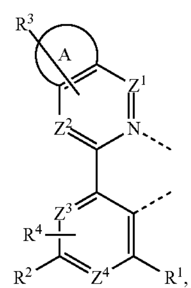

and

Format A3

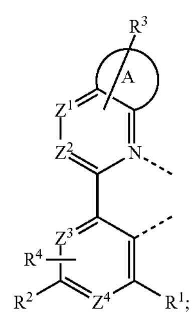

wherein the ligand $L_B$ is

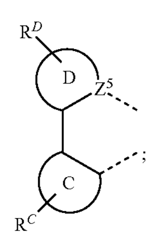

wherein the ligand $L_C$ is

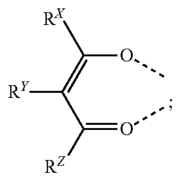

wherein M is a metal having an atomic weight greater than 40;

wherein x is 1, 2, or 3;

wherein y is 0, 1, or 2;

wherein z is 0, 1, or 2;

wherein x+y+z is the oxidation state of the metal M;

wherein $Z^1$ to $Z^5$ are each independently a carbon or nitrogen;

wherein ring A is a 5- or 6-membered aromatic ring fused to the ring having $Z^1$;

wherein rings C, and D are each independently a 5 or 6-membered carbocyclic or heterocyclic ring;

wherein $R^3$, $R^4$, $R^C$, and $R^D$ each independently represents no substitution to a maximum possible number of substitutions;

wherein one of $R^1$ and $R^2$ is an electron donating group having Hammett constant $\sigma_p$ less than 0, the other one of $R^1$ and $R^2$ is selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, partially or fully deuterated variants thereof, and combinations thereof;

wherein each of $R^3$, $R^4$, $R^C$, $R^D$, $R^X$, $R^Y$, and $R^Z$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any plurality of $R^1$, $R^2$, $R^3$, $R^4$, $R^C$, $R^D$, $R^X$, $R^Y$, and $R^Z$ are optionally joined or fused into a ring, provided that when ring A is a 6-membered aromatic ring, at least one of $Z^1$, $Z^2$, and the ring atoms in ring A is nitrogen; and wherein at least one of the following is true:

(1) exactly one of $R^1$, $R^2$, and $R^4$ comprises a moiety selected from the group consisting of alkoxy, aryloxy, and amino;

(2) one substituent $R^4$ and either $R^1$ or $R^2$ are joined or fused into an aromatic ring, or (3)(a) at least one of $Z^1$ and $Z^2$ is N, and (b) at least one of the following is true: (i) ring A is a substituted ring, a heteroaryl ring, a 5-membered ring, or a combination thereof, (ii) at least one $R^3$ or $R^4$ comprises halide, (iii) $L_A$ is either Formula A1 or Formula A2, or (iv) $L_A$ is Formula A3 and $Z^2$ is N.

* * * * *